US011489128B1

(12) United States Patent
Tasaki et al.

(10) Patent No.: US 11,489,128 B1
(45) Date of Patent: Nov. 1, 2022

(54) ORGANIC ELECTROLUMINESCENT ELEMENT EMITTING LIGHT AT HIGH LUMINOUS EFFIENCY AND ELECTRONIC DEVICE

(71) Applicant: IDEMITSU KOSAN CO., LTD., Tokyo (JP)

(72) Inventors: Satomi Tasaki, Sodegaura (JP); Kazuki Nishimura, Sodegaura (JP); Tasuku Haketa, Sodegaura (JP); Ryoji Maeda, Sodegaura (JP); Yuki Nakano, Sodegaura (JP); Hiroaki Toyoshima, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 17/461,842

(22) Filed: Aug. 30, 2021

Related U.S. Application Data

(63) Continuation of application No. PCT/JP2020/041598, filed on Nov. 6, 2020.

(30) Foreign Application Priority Data

Nov. 8, 2019 (JP) ............................ JP2019-203327

(51) Int. Cl.
*H01L 29/08* (2006.01)
*H01L 51/50* (2006.01)
*H01L 51/00* (2006.01)

(52) U.S. Cl.
CPC ........ *H01L 51/5004* (2013.01); *H01L 51/006* (2013.01); *H01L 51/0058* (2013.01);
(Continued)

(58) Field of Classification Search
CPC ............. H01L 51/5004; H01L 51/0058; H01L 51/0061; H01L 51/0072; H01L 51/5012
(Continued)

(56) References Cited

U.S. PATENT DOCUMENTS

2010/0187517 A1* 7/2010 Nishimura ............ C09B 57/008 257/40
2012/0080585 A1* 4/2012 Fukuzaki .......... H01L 27/14647 250/214.1
(Continued)

FOREIGN PATENT DOCUMENTS

JP 2007-294261 A 11/2007
JP 2009-249551 A 10/2009
(Continued)

OTHER PUBLICATIONS

International Searching Authority, "International Search Report," issued in connection with International Patent Application No. PCT/JP2020/041598, dated Jan. 26, 2021.
(Continued)

*Primary Examiner* — Phuc T Dang
(74) *Attorney, Agent, or Firm* — Foley & Lardner LLP

(57) ABSTRACT

An organic electroluminescence device includes: a first emitting layer disposed between an anode and a cathode; a second emitting layer disposed between the first emitting layer and the cathode; and an electron blocking layer disposed between the first emitting layer and the anode, in which the first emitting layer and the second emitting layer are in direct contact with each other; the first emitting layer and the electron blocking layer are in direct contact with each other; the first emitting layer includes a first compound represented by a formula (1) below; the first compound includes at least one group represented by a formula (11)
(Continued)

below; the second emitting layer includes a second compound represented by a formula (2); the electron blocking layer includes a third compound; and the third compound satisfies a formula (M1) below.

$$Ip(HT) \geq 5.67 \text{ eV} \tag{M1}$$

(1)

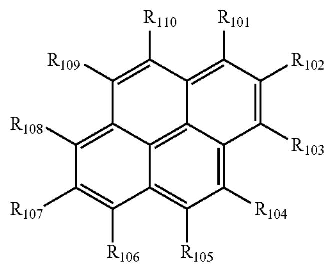

$$*\!-\!\left(L_{101}\right)_{mx}\!-\!Ar_{101} \tag{11}$$

(2)

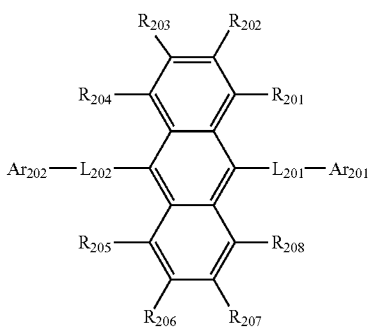

32 Claims, 1 Drawing Sheet

(52) U.S. Cl.
CPC ...... *H01L 51/0061* (2013.01); *H01L 51/0067* (2013.01); *H01L 51/0072* (2013.01); *H01L 51/0073* (2013.01); *H01L 51/5012* (2013.01); *H01L 51/5096* (2013.01)

(58) Field of Classification Search
USPC ........................................................... 257/40
See application file for complete search history.

(56) References Cited

U.S. PATENT DOCUMENTS

| | | | | |
|---|---|---|---|---|
| 2014/0183500 | A1 | 7/2014 | Ikeda et al. | |
| 2015/0349284 | A1* | 12/2015 | Seo | H01L 51/504 257/40 |
| 2016/0248033 | A1* | 8/2016 | Uesaka | H01L 51/504 |
| 2017/0324043 | A1 | 11/2017 | Ikeda et al. | |
| 2018/0323396 | A1* | 11/2018 | Tsukamoto | H01L 51/5028 |
| 2020/0136059 | A1* | 4/2020 | Hong | C07D 409/14 |

FOREIGN PATENT DOCUMENTS

| | | | |
|---|---|---|---|
| JP | 2011-153201 | A | 8/2011 |
| JP | 4804289 | B2 | 11/2011 |
| JP | 2012-224618 | A | 11/2012 |
| JP | 2013-067586 | A | 4/2013 |
| JP | 2014-027041 | A | 2/2014 |
| JP | 2019-161218 | A | 9/2019 |
| WO | WO-2007/100010 | A1 | 9/2007 |
| WO | WO-2014/104144 | A1 | 7/2014 |
| WO | WO-2018/139662 | A1 | 8/2018 |

OTHER PUBLICATIONS

International Searching Authority, "Written Opinion," issued in connection witn International Patent Application No. PCT/JP2020/041598, dated Jan. 26, 2021.

* cited by examiner

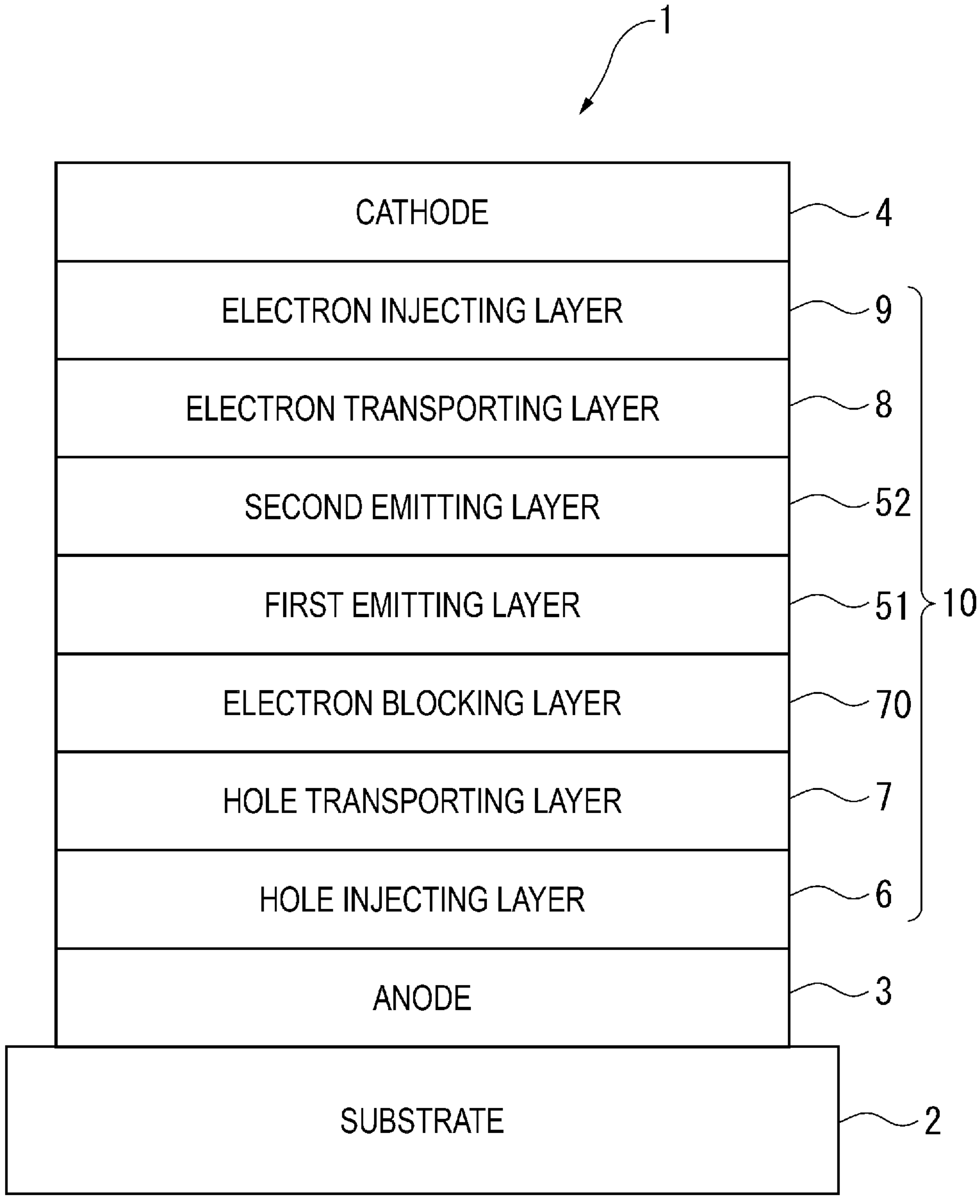
1
CATHODE
4
ELECTRON INJECTING LAYER
9
ELECTRON TRANSPORTING LAYER
8
SECOND EMITTING LAYER
52
FIRST EMITTING LAYER
51
10
ELECTRON BLOCKING LAYER
70
HOLE TRANSPORTING LAYER
7
HOLE INJECTING LAYER
6
ANODE
3
SUBSTRATE
2

ORGANIC ELECTROLUMINESCENT ELEMENT EMITTING LIGHT AT HIGH LUMINOUS EFFIENCY AND ELECTRONIC DEVICE

CROSS-REFERENCE TO RELATED APPLICATIONS

This application claims priority to Application No. PCT/JP2020/041598 filed on Nov. 6, 2020, which application claims priority to Japanese Application No. 2019-203327, filed on Nov. 8, 2019. The entire contents of the above applications are incorporated herein by reference in their entireties.

TECHNICAL FIELD

The present invention relates to an organic electroluminescence device and an electronic device.

BACKGROUND ART

An organic electroluminescence device (hereinafter, occasionally referred to as "organic EL device") has found its application in a full-color display for mobile phones, televisions and the like. When a voltage is applied to an organic EL device, holes are injected from an anode and electrons are injected from a cathode into an emitting layer. The injected electrons and holes are recombined in the emitting layer to form excitons. Specifically, according to the electron spin statistics theory, singlet excitons and triplet excitons are generated at a ratio of 25%:75%.

Various studies have been made for compounds to be used for the organic EL device in order to enhance the performance of the organic EL device. The performance of the organic EL device is evaluable in terms of, for instance, luminance, emission wavelength, chromaticity, luminous efficiency, drive voltage, and lifetime.

For example, Patent Literature 1 describes an organic electroluminescence device including: an emitting layer containing a pyrene derivative as a host material and provided close to an anode; and an emitting layer containing an anthracene derivative as a host material and provided close to a cathode.

For example, Patent Literature 2 describes an organic electroluminescence device including: an emitting layer containing a pyrene derivative and provided close to an anode; and an emitting layer containing on an anthracene derivative and provided close to a cathode.

CITATION LIST

Patent Literature(s)

Patent Literature 1: JP No. 2019-161218

Patent Literature 2: JP No. 2007-294261

SUMMARY OF THE INVENTION

Problems to be Solved by the Invention

An object of the invention is to provide an organic electroluminescence device that emits light at high luminous efficiency and an electronic device including the organic electroluminescence device.

Means for Solving the Problems

According to an aspect of the invention, an organic electroluminescence device includes: an anode; a cathode; a first emitting layer disposed between the anode and the cathode; a second emitting layer disposed between the first emitting layer and the cathode; and an electron blocking layer disposed between the first emitting layer and the anode, in which: the first emitting layer and the second emitting layer are in direct contact with each other; the first emitting layer and the electron blocking layer are in direct contact with each other; the first emitting layer includes a first host material in a form of a first compound represented by a formula (1) below; the first compound includes at least one group represented by a formula (11) below; the second emitting layer includes a second host material in a form of a second compound represented by a formula (2) below; the electron blocking layer includes a third compound; and an ionization potential Ip(HT) of the third compound satisfies a numerical formula (M1) below, Ip(HT) 5.67 eV (M1).

[Formula 1]

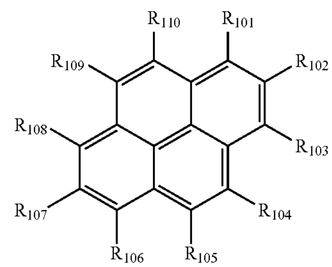

(1)

$$*\!-\!\left(L_{101}\right)_{mx}\!-\!Ar_{101} \quad (11)$$

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by the formula (11);

at least one of $R_{101}$ to $R_{110}$ is the group represented by the formula (11); when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring represented by the formula (1).

[Formula 2]

(2)

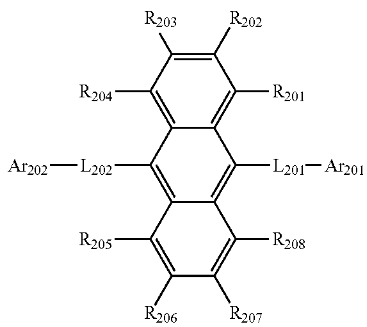

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the first compound represented by the formula (1) and the second compound represented by the formula (2), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

According to another aspect of the invention, an organic electroluminescence device includes: an anode; a cathode; a first emitting layer disposed between the anode and the cathode; a second emitting layer disposed between the first emitting layer and the cathode; and an electron blocking layer disposed between the first emitting layer and the anode, in which: the first emitting layer and the second emitting layer are in direct contact with each other; the first emitting layer and the electron blocking layer are in direct contact with each other; the first emitting layer includes a first host material in a form of a first compound represented by a formula (1) below; the first compound includes at least one group represented by a formula (11) below; the second emitting layer includes a second host material in a form of a second compound represented by a formula (2) below; the electron blocking layer includes a third compound; the third compound is at least one compound selected from the group consisting of a compound represented by a formula (31) below and a compound represented by a formula (32) below; when the third compound is represented by a formula (31) below and includes two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms; and when the compound represented by the formula (31) includes a 4-dibenzofuran structure in a molecule, the 4-dibenzofuran structure is one in number.

[Formula 3]

(1)

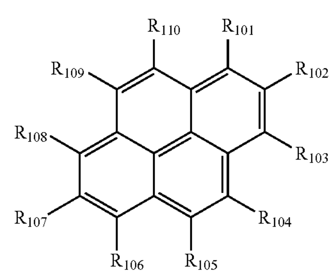

(11)

$$*\!-\!\left(L_{101}\right)_{mx}\!-\!Ar_{101}$$

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by the formula (11);

at least one of Rios to Rico is the group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5; and when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring represented by the formula (1).

[Formula 4]

(2)

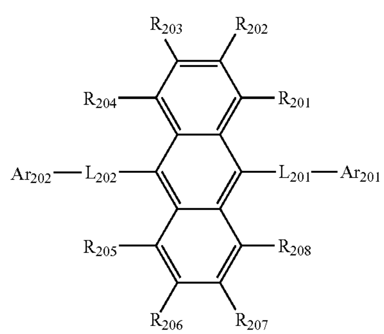

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

[Formula 5]

(31)

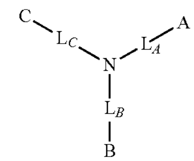

In the formula (31):

$L_A$, $L_B$, and $L_C$ are each independently a single bond, or a substituted or unsubstituted arylene group having 6 to 18 ring carbon atoms;

A, B, and C are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)($R'_{903}$), $R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different; and a substituted or unsubstituted heterocyclic group having 5 to 30 ring atoms as A, B and C is each independently at least one group selected from the group consisting of groups represented by the formulae (31A), (31B), (31C), (31D), (31E) and (31F).

[Formula 6]

(31A)

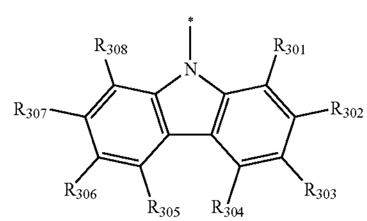

(31B)

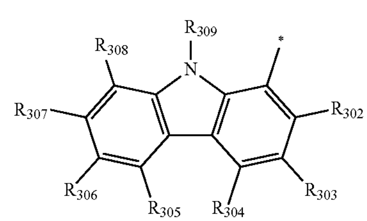

-continued (31C)

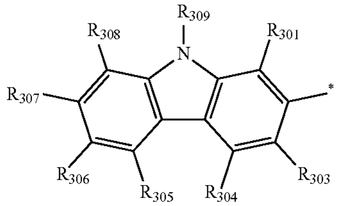

(31D)

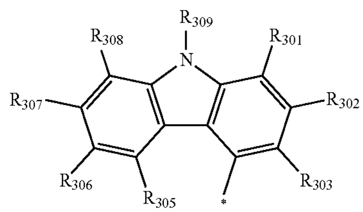

[Formula 7]

(31E)

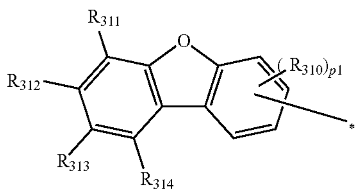

(31F)

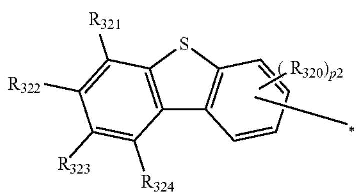

In the formulae (31A), (31B), (31C), (31D), (31E) and (31F):

at least one combination of adjacent two or more of $R_{301}$ to $R_{309}$ are mutually bonded to form a substituted or unsubstituted monocyclic ring, mutually bonded to form a substituted or unsubstituted fused ring, or not mutually bonded; at least one combination of adjacent two or more of $R_{310}$ to $R_{314}$ are mutually bonded to form a substituted or unsubstituted monocyclic ring, mutually bonded to form a substituted or unsubstituted fused ring, or not mutually bonded;

at least one combination of adjacent two or more of $R_{320}$ to $R_{324}$ are mutually bonded to form a substituted or unsubstituted monocyclic ring, mutually bonded to form a substituted or unsubstituted fused ring, or not mutually bonded;

$R_{301}$ to $R_{309}$, $R_{310}$, $R_{311}$ to $R_{314}$, $R_{320}$ and $R_{321}$ to $R_{324}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

p1 is 3, and a plurality of $R_{310}$ are mutually the same or different;

p2 is 3, and a plurality of $R_{320}$ are mutually the same or different; and

* in the formulae (31A), (31B), (31C), (31D), (31E) and (31F) is each independently bonded to any of $L_A$, $L_B$, and $L_C$.

[Formula 8]

(32)

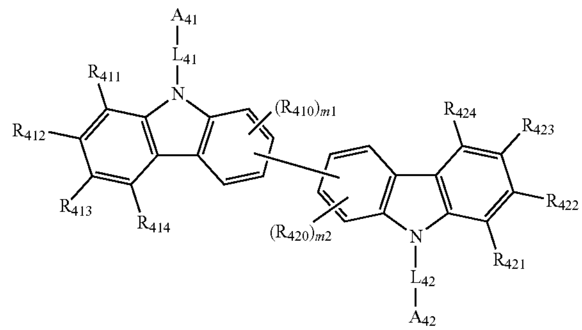

In the formula (32):

$A_{41}$ and $A_{42}$ are each independently a substituted or unsubstituted aryl group having 6 to 30 ring carbon atoms, or a substituted or unsubstituted heterocyclic group having 5 to 30 ring atoms;

at least one combination of adjacent two or more of $R_{410}$ to $R_{414}$ are mutually bonded to form a substituted or unsubstituted monocyclic ring, mutually bonded to form a substituted or unsubstituted fused ring, or not mutually bonded;

at least one combination of adjacent two or more of $R_{420}$ to $R_{424}$ are mutually bonded to form a substituted or unsubstituted monocyclic ring, mutually bonded to form a substituted or unsubstituted fused ring, or not mutually bonded;

$R_{410}$ to $R_{414}$ and $R_{420}$ to $R_{424}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

m1 is 3, and three $R_{410}$ are mutually the same or different;

m2 is 3, and three $R_{420}$ are mutually the same or different; and $L_{41}$ and $L_{42}$ are each independently a single bond, a substituted or unsubstituted arylene group having 6 to 30 ring carbon atoms, or a substituted or unsubstituted divalent heterocyclic group having 5 to 30 ring atoms.

In the first compound represented by the formula (1), the second compound represented by the formula (2), and the third compound represented by the formula (31) or (32), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

According to still another aspect of the invention, an organic electroluminescence device includes: an anode; a cathode; a first emitting layer disposed between the anode and the cathode; a second emitting layer disposed between the first emitting layer and the cathode; and an electron blocking layer disposed between the first emitting layer and the anode, in which: the first emitting layer and the second emitting layer are in direct contact with each other; the first emitting layer and the electron blocking layer are in direct contact with each other; the first emitting layer includes a first host material; the second emitting layer includes a second host material; the first host material is different from the second host material; the first emitting layer at least includes a compound that emits light having a maximum peak wavelength of 500 nm or less; the second emitting layer at least includes a compound that emits light having a maximum peak wavelength of 500 nm or less; the compound that emits light having the maximum peak wavelength of 500 nm or less and is contained in the first emitting layer and the compound that emits light having the maximum peak wavelength of 500 nm or less and is contained in the second emitting layer are mutually the same or different; a triplet energy $T_1$(H1) of the first host material and a triplet energy $T_1$(H2) of the second host material satisfy a relationship of a numerical formula (Numerical Formula 1A) below; the electron blocking layer includes a third compound; and an ionization potential Ip(HT) of the third compound satisfies a numerical formula (M1) below, $$T_1(H1)>T_1(H2) \quad \text{(Numerical Formula 1A)}$$

$$\mathrm{Ip}(HT)\geq 5.67\ \mathrm{eV} \quad \text{(M1).}$$

According to yet another aspect of the invention, an organic electroluminescence device includes: an anode; a cathode; a first emitting layer disposed between the anode and the cathode; a second emitting layer disposed between the first emitting layer and the cathode; and an electron blocking layer disposed between the first emitting layer and the anode, in which: the first emitting layer and the second emitting layer are in direct contact with each other; the first emitting layer and the electron blocking layer are in direct contact with each other; the first emitting layer includes a first host material; the second emitting layer includes a second host material; the first host material is different from the second host material; the first emitting layer at least includes a compound that emits light having a maximum peak wavelength of 500 nm or less; the second emitting layer at least includes a compound that emits light having a maximum peak wavelength of 500 nm or less; the compound that emits light having the maximum peak wavelength of 500 nm or less and is contained in the first emitting layer and the compound that emits light having the maximum peak wavelength of 500 nm or less and is contained in the second emitting layer are mutually the same or different; a triplet energy $T_1$(H1) of the first host material and a triplet energy $T_1$(H2) of the second host material satisfy a relationship of a numerical formula (Numerical Formula 1A) below; the electron blocking layer includes a third compound; the third compound is at least one compound selected from the group consisting of a compound represented by the formula (31) and a compound represented by the formula (32); when the third compound is represented by the formula (31) and has two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms; when the compound represented by the formula (31) includes a 4-dibenzofuran structure in a molecule, the 4-dibenzofuran structure is one in number.

According to a further aspect of the invention, an electronic device provided with the organic electroluminescence device according to the above aspect of the invention is provided.

According to the above aspects of the invention, an organic electroluminescence device that emits light at high luminous efficiency can be provided. According to a still further aspect of the invention, an electronic device including the organic electroluminescence device can be provided.

BRIEF EXPLANATION OF DRAWING(S)

The FIGURE schematically shows an exemplary arrangement of an organic electroluminescence device according to an exemplary embodiment of the invention.

DESCRIPTION OF EMBODIMENTS

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, crosslinking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituents Mentioned Herein Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group," and a substituted aryl group refers to a "substituted aryl group" in a "substituted or unsubstituted aryl group." A simply termed "aryl group" herein includes both of an "unsubstituted aryl group" and a "substituted aryl group.")

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A): a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, a perylenyl group, and a monovalent aryl group derived by removing one hydrogen atom from cyclic structures represented by formulae (TEMP-1) to (TEMP-15) below.
[Formula 9]
(TEMP-1)
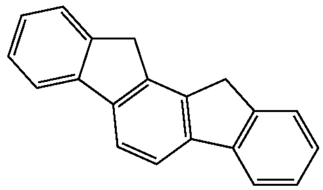
(TEMP-2)
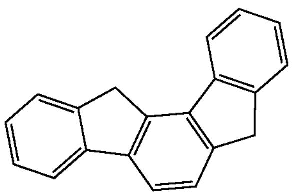
(TEMP-3)
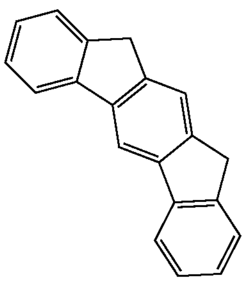
(TEMP-4)
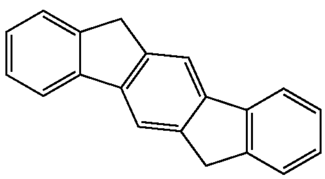
(TEMP-5)
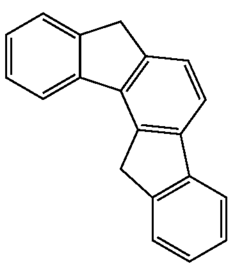
(TEMP-6)
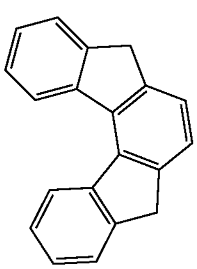
-continued
(TEMP-7)
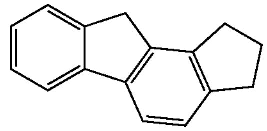
(TEMP-8)
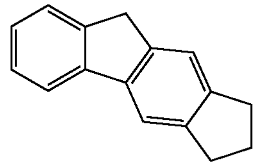
(TEMP-9)
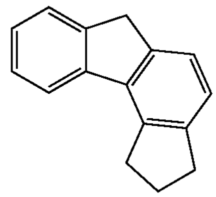
[Formula 10]
(TEMP-10)
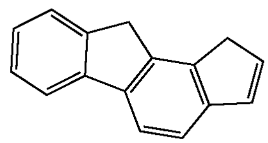
(TEMP-11)
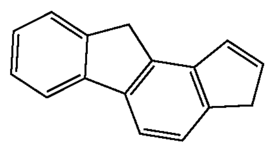
(TEMP-12)
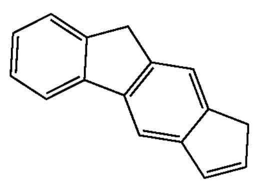
(TEMP-13)
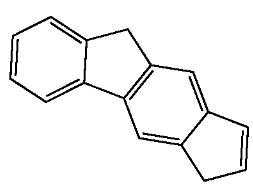
(TEMP-14)
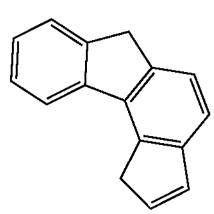

-continued (TEMP-15)

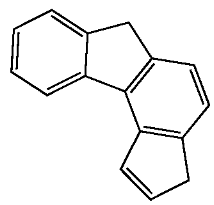

Substituted Aryl Group (Specific Example Group G1B):

o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group." A simply termed "heterocyclic group" herein includes both of "unsubstituted heterocyclic group" and "substituted heterocyclic group.")

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, a pyridyl group, pyridazynyl group, a pyrimidinyl group, pyrazinyl group, a triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, a carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

[Formula 11]
(TEMP-16)
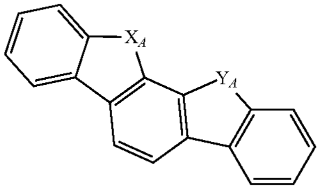
(TEMP-17)
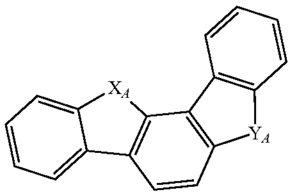
(TEMP-18)
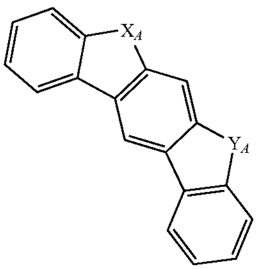
(TEMP-19)
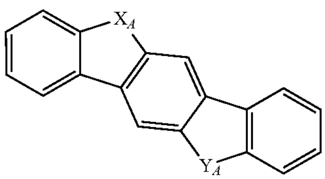
(TEMP-20)
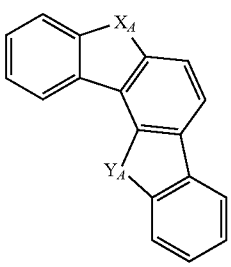
(TEMP-21)
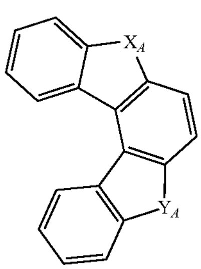
(TEMP-22)
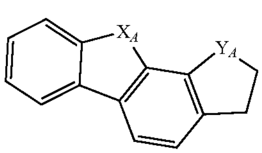
-continued
(TEMP-23)
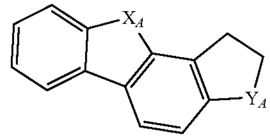
(TEMP-24)
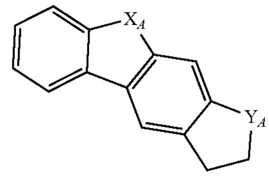
[Formula 12]
(TEMP-25)
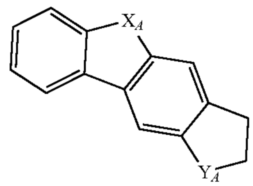
(TEMP-26)
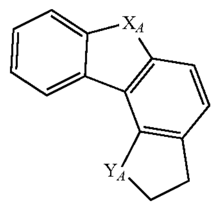
(TEMP-27)
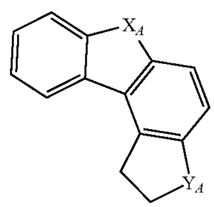
(TEMP-28)
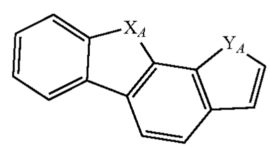
(TEMP-29)
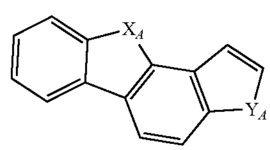
(TEMP-30)
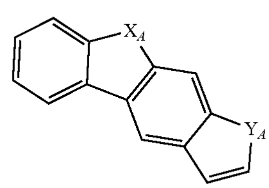

-continued (TEMP-31)

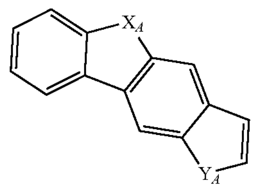

(TEMP-32)

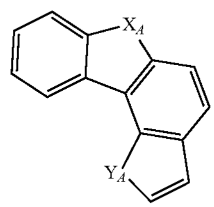

(TEMP-33)

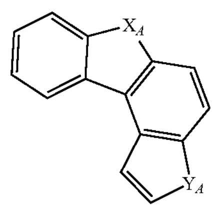

In the formulae (TEMP-16) to (TEMP-33), $X_A$ and $Y_A$ are each independently an oxygen atom, a sulfur atom, NH, or $CH_2$. However, at least one of $X_A$ and $Y_A$ is an oxygen atom, a sulfur atom, or NH.

When at least one of $X_A$ and $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH, or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

phenyldibenzothiophenyl group, methyldibenzothiophenyl group, t-butyldibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B below). (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group." A simply termed "alkyl group" herein includes both of "unsubstituted alkyl group" and "substituted alkyl group.")

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom bonded to a carbon atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

methyl group, ethyl group, n-propyl group, isopropyl group, n-butyl group, isobutyl group, s-butyl group, and t-butyl group.

Substituted Alkyl Group (Specific Example Group G3B):

heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group." A simply termed "alkenyl group" herein includes both of "unsubstituted alkenyl group" and "substituted alkenyl group.")

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

vinyl group, allyl group, 1-butenyl group, 2-butenyl group, and 3-butenyl group.

Substituted Alkenyl Group (Specific Example Group G4B):

1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group." A simply termed "alkynyl roup" herein includes both of "unsubstituted alkynyl group" and "substituted alkynyl group.")

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

ethynyl group

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group." A simply termed "cycloalkyl group" herein includes both of "unsubstituted cycloalkyl group" and "substituted cycloalkyl group.")

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

4-methylcyclohexyl group

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —Si(G1)(G1)(G1) are mutually the same or different.

A plurality of G2 in —Si(G1)(G2)(G2) are mutually the same or different.

A plurality of G1 in —Si(G1)(G1)(G2) are mutually the same or different.

A plurality of G2 in —Si(G2)(G2)(G2) are mutually the same or different.

A plurality of G3 in —Si(G3)(G3)(G3) are mutually the same or different.

A plurality of G6 in —Si(G6)(G6)(G6) are mutually the same or different.

Group Represented by —O—($R_{904}$)

Specific examples (specific example group G8) of a group represented by —O—($R_{904}$) herein include —O(G1); —O(G2); —O(G3); and —O(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —N(G1)(G1) are mutually the same or different.

A plurality of G2 in —N(G2)(G2) are mutually the same or different.

A plurality of G3 in —N(G3)(G3) are mutually the same or different.

A plurality of G6 in —N(G6)(G6)) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein includes a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein includes a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of the "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of the "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of the "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of the "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of the "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of the "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" includes benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 13]

(TEMP-Cz1)

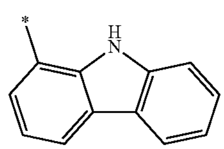

(TEMP-Cz2)

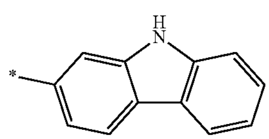

(TEMP-Cz3)

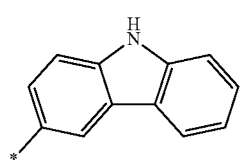

(TEMP-Cz4)

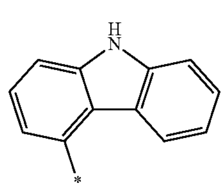

(TEMP-Cz5)

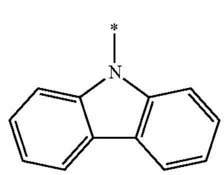

The (9-phenyl)carbazolyl group mentioned herein is, unless otherwise specified herein, specifically a group represented by one of formulae below.

[Formula 14]

(TEMP-Cz6)

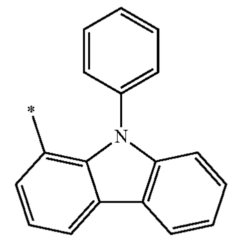

(TEMP-Cz7)

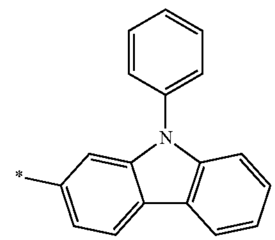

(TEMP-Cz8)

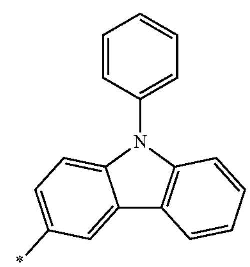

(TEMP-Cz9)

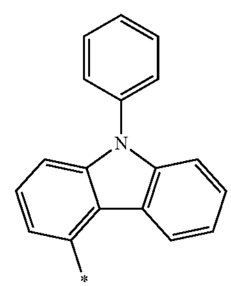

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 15]

(TEMP-34)

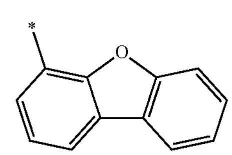

(TEMP-35)

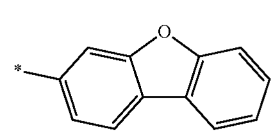

-continued (TEMP-36)

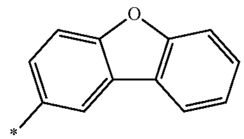

(TEMP-37)

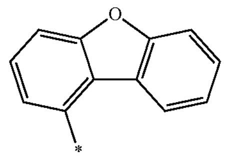

(TEMP-38)

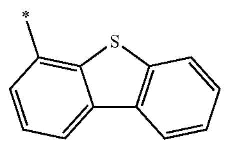

(TEMP-39)

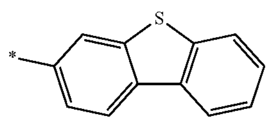

(TEMP-40)

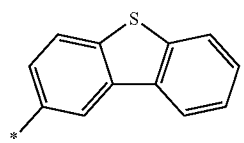

(TEMP-41)

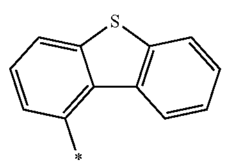

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocyclic ring of the "substituted or unsubstituted heterocyclic group." Specific examples of the "substituted or unsubstituted heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl ring of the "substituted or unsubstituted alkyl group." Specific examples of the "substituted or unsubstituted alkylene group" (specific example group G14) include a divalent group derived by removing one hydrogen atom on an alkyl ring of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

[Formula 16]

(TEMP-42)

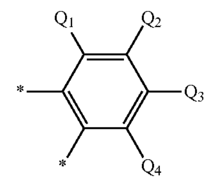

(TEMP-43)

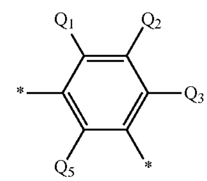

(TEMP-44)

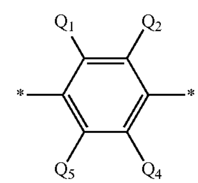

(TEMP-45)

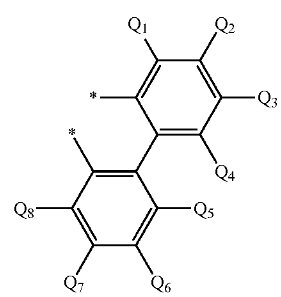

(TEMP-46)

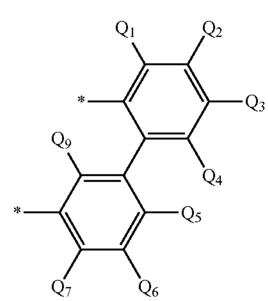

-continued
(TEMP-47)
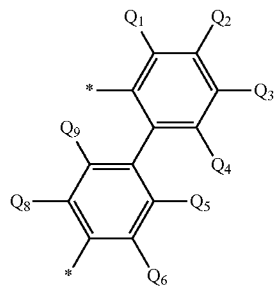
[Formula 17]
(TEMP-48)
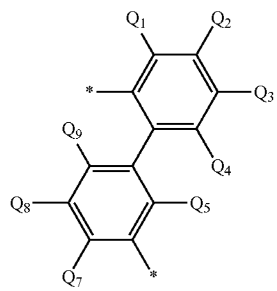
(TEMP-49)
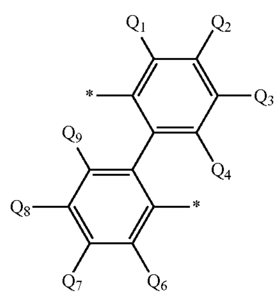
(TEMP-50)
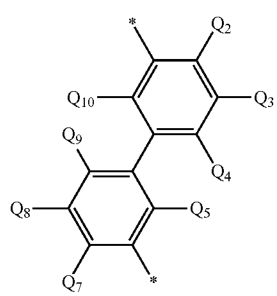
(TEMP-51)
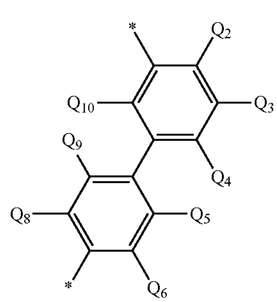
-continued
(TEMP-52)
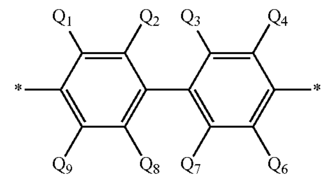
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
[Formula 18]
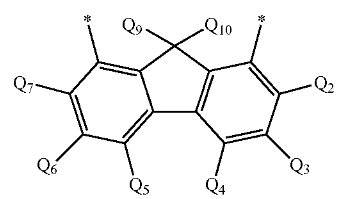
(TEMP-53)
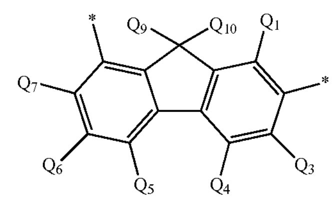
(TEMP-54)
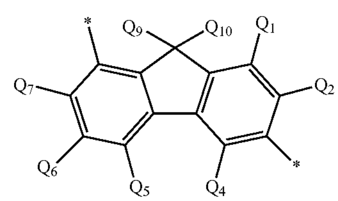
(TEMP-55)
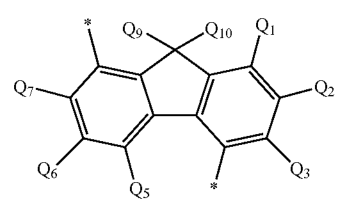
(TEMP-56)
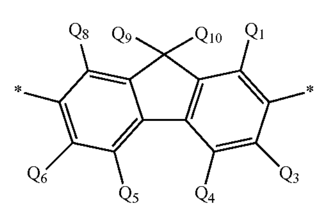
(TEMP-57)

-continued

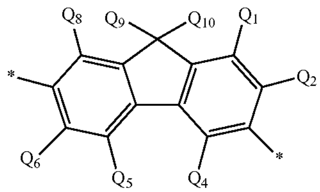

(TEMP-58)

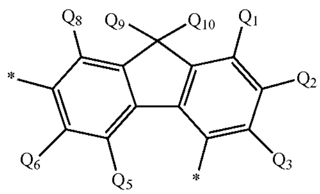

(TEMP-59)

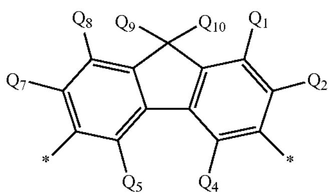

(TEMP-60)

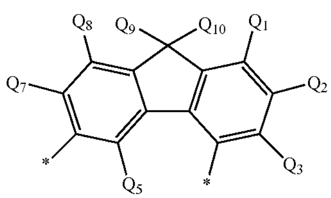

(TEMP-61)

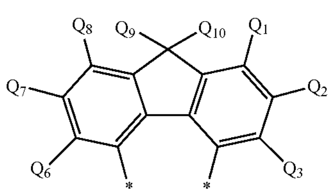

(TEMP-62)

In the formulae (TEMP-53) to (TEMP-62), $Q_1$ to $Q_{10}$ each independently are a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

[Formula 19]

(TEMP-63)

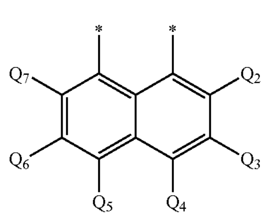

-continued (TEMP-64)

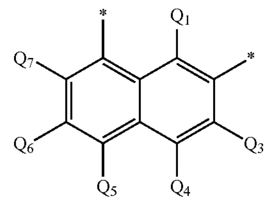

(TEMP-65)

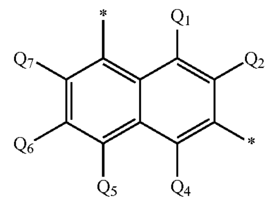

(TEMP-66)

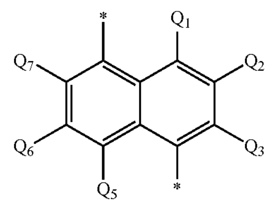

(TEMP-67)

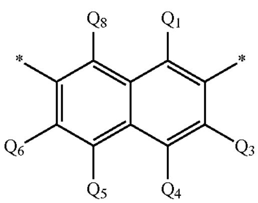

(TEMP-68)

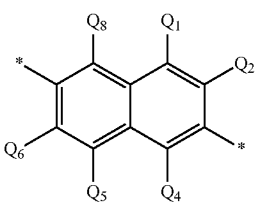

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 20]

(TEMP-69)

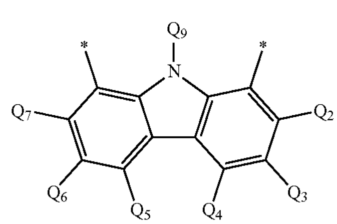

-continued
(TEMP-70)
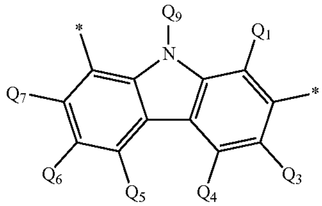
(TEMP-71)
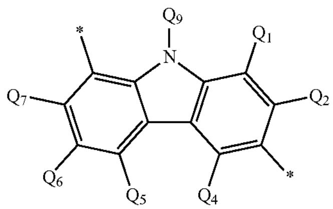
(TEMP-72)
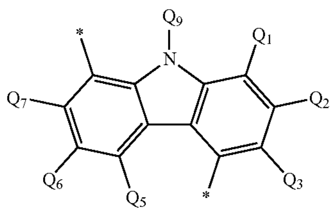
(TEMP-73)
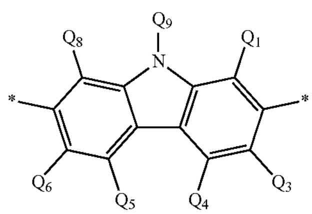
(TEMP-74)
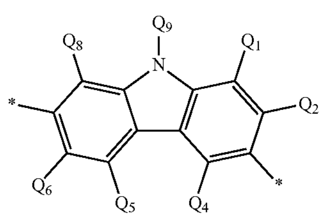
[Formula 21]
(TEMP-75)
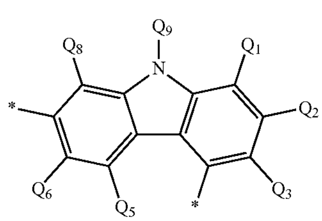
(TEMP-76)
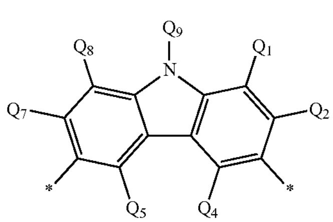
-continued
(TEMP-77)
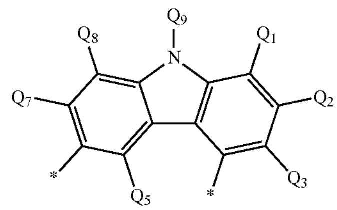
(TEMP-78)
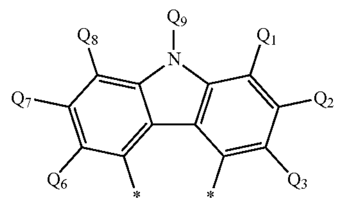
(TEMP-79)
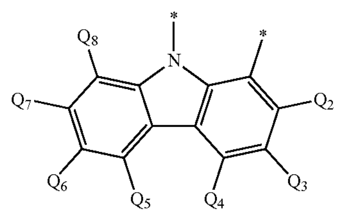
(TEMP-80)
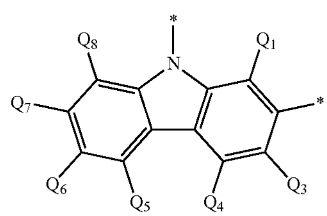
[Formula 22]
(TEMP-81)
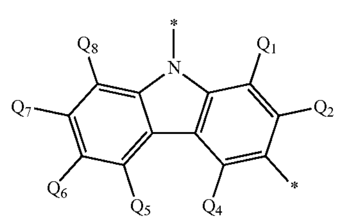
(TEMP-82)
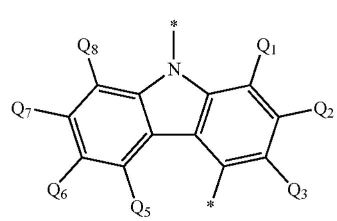
In the formulae (TEMP-69) to (TEMP-82), $Q_1$ to $Q_9$ each independently are a hydrogen atom or a substituent.

[Formula 23]
(TEMP-83)
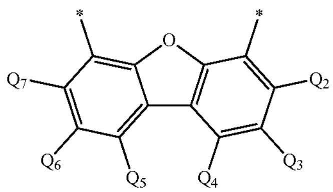
(TEMP-84)
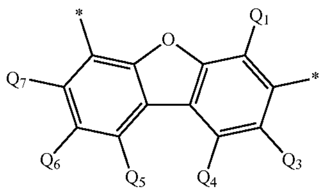
(TEMP-85)
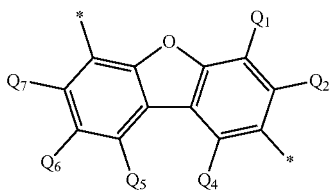
(TEMP-86)
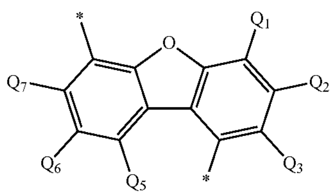
(TEMP-87)
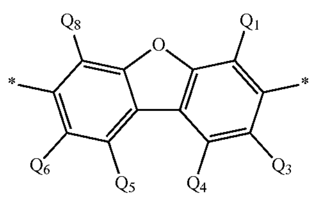
(TEMP-88)
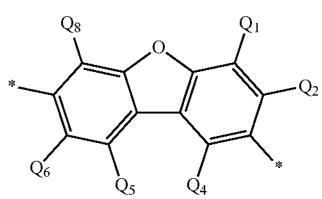
[Formula 24]
(TEMP-89)
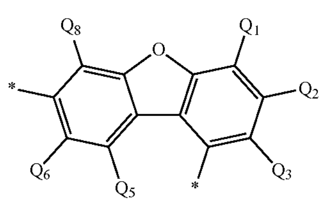
-continued
(TEMP-90)
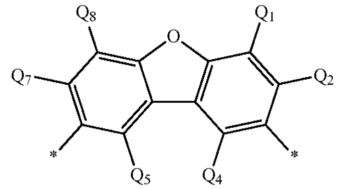
(TEMP-91)
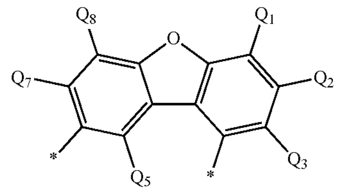
(TEMP-92)
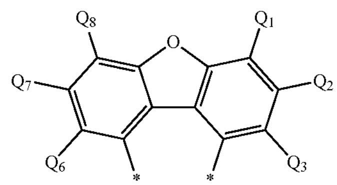
[Formula 25]
(TEMP-93)
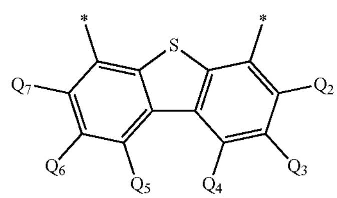
(TEMP-94)
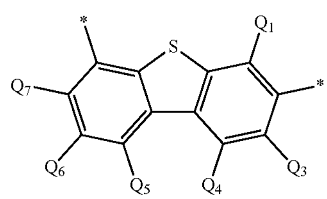
(TEMP-95)
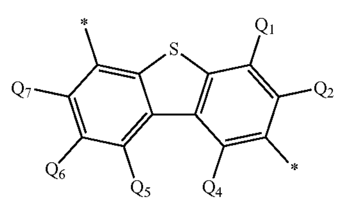
(TEMP-96)
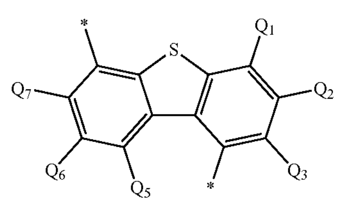

-continued (TEMP-97)

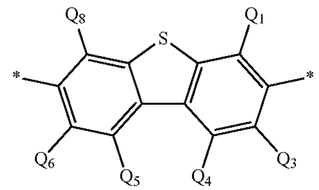

(TEMP-98)

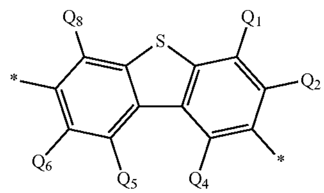

[Formula 26]

(TEMP-99)

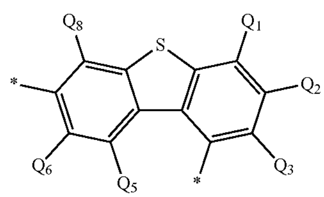

(TEMP-100)

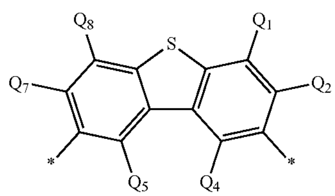

(TEMP-101)

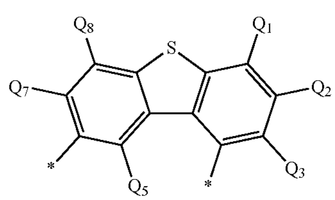

(TEMP-102)

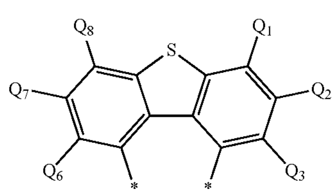

In the formulae (TEMP-83) to (TEMP-102), $Q_1$ to $Q_8$ each independently are a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

[Formula 27]

(TEMP-103)

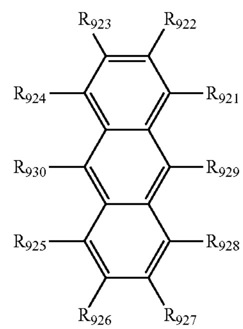

For instance, when "at least one combination of adjacent two or more of" $R_{921}$ to $R_{930}$ "are mutually bonded to form a ring," the pair of adjacent ones of $R_{921}$ to $R_{930}$ (i.e. the combination at issue) is a pair of $R_{921}$ and a pair of $R_{922}$, $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, or a pair of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 28]

(TEMP-104)

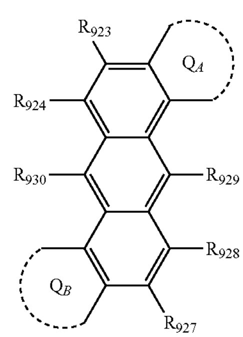

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$, $R_{923}$ are mutually bonded to form a ring Qc, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring Qc share $R_{922}$.

[Formula 29]

(TEMP-105)

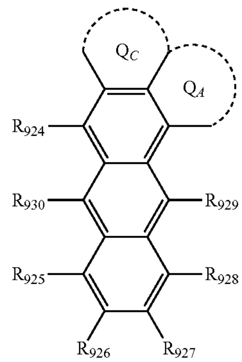

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring Qc formed in the formula (TEMP-105) are each a "fused ring." The ring $Q_A$ and the ring Qc in the formula (TEMP-105) are fused to form a fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocyclic ring include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituents Mentioned Herein."

When the "saturated ring" or the "unsaturated ring" has a substituent, the substituent is, for instance, the substituent described in later-described "optional substituent." When the "monocyclic ring" or the "fused ring" has a substituent, specific examples of the substituent are the substituents described in the above under the subtitle "Substituents Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring".

Substituent for Substituted or Unsubstituted Group

In an exemplary embodiment herein, a substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms;

herein, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, a substituent for the substituted or unsubstituted group is selected from the group consisting of an alkyl group having 1 to 50 carbon atoms, an aryl group having 6 to 50 ring carbon atoms, and a heterocyclic group having 5 to 50 ring atoms.

In an exemplary embodiment, a substituent for the substituted or unsubstituted group is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted saturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

First Exemplary Embodiment

Organic Electroluminescence Device

In the exemplary embodiment, an "organic EL device according to the exemplary embodiment" at least includes an "organic EL device according to a first aspect" and an "organic EL device according to a second aspect" below, and may further include an organic EL device according to any other aspect.

An organic EL device according to the first aspect of the exemplary embodiment includes an anode, a cathode, a first emitting layer disposed between the anode and the cathode, a second emitting layer disposed between the first emitting layer and the cathode, and an electron blocking layer disposed between the first emitting layer and the anode. In the organic EL device according to the first aspect, the first emitting layer and the second emitting layer are in direct contact with each other. The first emitting layer and the electron blocking layer are in direct contact with each other. In the organic EL device according to the first aspect, the first emitting layer includes a first host material in a form of the first compound represented by the formula (1), and the first compound has at least one group represented by the formula (11). In the organic EL device according to the first aspect, the second emitting layer includes a second host material in a form of a second compound represented by the formula (2). In the organic EL device according to the first aspect, the electron blocking layer contains a third compound, and an ionization potential Ip(HT) of the third compound satisfies a numerical formula (M1) below.

$$\mathrm{Ip}(HT) \geq 5.67\ \mathrm{eV} \tag{M1}$$

In the organic EL device according to the first aspect, the ionization potential of the third compound is preferably 5.70 eV or more (i.e., Ip(HT) 5.70 eV), more preferably greater than 5.7 eV (i.e., Ip(HT)>5.7 eV).

In the organic EL device according to the first aspect, the ionization potential of the third compound is further preferably 5.74 eV or more (i.e., Ip(HT) 5.74 eV).

A arithmetic symbol "≥" in the numerical formula (M1) means that the ionization potential of the third compound is 5.67 eV or more. The same applies to other numerical formulae.

Herein, the ionization potential is measured using a photoelectron spectroscope under atmosphere. Specifically, the ionization potential is measurable according to the method described in Examples.

An organic EL device according to the second aspect of the exemplary embodiment includes an anode, a cathode, a first emitting layer disposed between the anode and the cathode, a second emitting layer disposed between the first emitting layer and the cathode, and an electron blocking layer disposed between the first emitting layer and the anode. In the organic EL device according to the second aspect, the first emitting layer and the second emitting layer are in direct contact with each other, and the first emitting layer and the electron blocking layer are in direct contact with each other. In the organic EL device according to the second aspect, the first emitting layer includes a first host material in a form of a first compound represented by the formula (1), and the first compound has at least one group represented by the formula (11). In the organic EL device according to the second aspect, the second emitting layer includes a second host material in a form of a second compound represented by the formula (2). In the organic EL device according to the second aspect, the electron blocking layer contains a third compound, and the third compound is at least one compound selected from the group consisting of a compound represented by a formula (31) below and a compound represented by a formula (32) below. In the organic EL device according to the second aspect, when the third compound is represented by the formula (31) and contains two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms. In the organic EL device according to the second aspect, when the compound represented by the formula (31) as the third compound includes a 4-dibenzofuran structure in a molecule, the number of the 4-dibenzofuran structures is one.

In the organic EL device according to the second aspect, an ionization potential Ip(HT) of the third compound preferably satisfies a numerical formula (M1) below.

$$Ip(HT) \geq 5.67\ eV \qquad (M1)$$

In the organic EL device according to the second aspect, the ionization potential of the third compound is preferably 5.70 eV or more (i.e., Ip(HT) 5.70 eV), more preferably greater than 5.7 eV (i.e., Ip(HT)>5.7 eV).

In the organic EL device according to the second aspect, the ionization potential of the third compound is further preferably 5.74 eV or more (i.e., Ip(HT) 5.74 eV).

The organic EL device according to the exemplary embodiment may include one or more organic layers in addition to the first emitting layer, the second emitting layer, and the electron blocking layer. The organic layer is, for instance, at least one layer selected from the group consisting of a hole injecting layer, a hole transporting layer, an emitting layer, an electron injecting layer, an electron transporting layer, and a hole blocking layer.

In the organic EL device according to the exemplary embodiment, the organic layer, which may consist solely of the first emitting layer, the second emitting layer and the electron blocking layer, may further include, for instance, at least one layer selected from the group consisting of the hole injecting layer, the hole transporting layer, the electron injecting layer, the electron transporting layer, and the hole blocking layer.

Electron Transporting Layer

In the organic EL device according to the exemplary embodiment, the electron transporting layer is preferably provided between the second emitting layer and the cathode.

Hole Transporting Layer

In the organic EL device according to the exemplary embodiment, the hole transporting layer is preferably provided between the anode and the electron blocking layer.

Schematic Structure of Organic EL Device

The FIGURE schematically shows an exemplary structure of the organic EL device of the exemplary embodiment.

The organic EL device 1 includes a light-transmissive substrate 2, an anode 3, a cathode 4, and an organic layer 10 provided between the anode 3 and the cathode 4. The organic layer 10 includes a hole injecting layer 6, a hole transporting layer 7, an electron blocking layer 70, a first emitting layer 51, a second emitting layer 52, an electron transporting layer 8, and an electron injecting layer 9, these layers being layered in this order from the anode 3.

First Emitting Layer

The first emitting layer and the second emitting layer are in direct contact with each other, and the first emitting layer and the electron blocking layer are also in direct contact with each other. The first emitting layer includes a first host material in a form of the first compound represented by the formula (1). The first compound has at least one group represented by the formula (11).

Herein, the "host material" refers to, for instance, a material that accounts for "50 mass % or more of the layer." Accordingly, for instance, the first emitting layer contains 50 mass % or more of the first compound represented by the formula (1) below with respect to a total mass of the first emitting layer. The second emitting layer contains 50 mass % or more of the second compound represented by the formula (2) below with respect to a total mass of the second emitting layer. Moreover, for instance, the "host material" may account for 60 mass % or more of the layer, 70 mass % or more of the layer, 80 mass % or more of the layer, 90 mass % or more of the layer, or 95 mass % or more of the layer.

The first emitting layer preferably contains a compound that emits light having a maximum peak wavelength in a range from 430 nm to 480 nm.

It is preferable that the first emitting layer further contains a fifth compound that emits fluorescence.

The fifth compound is preferably a compound that emits light having a maximum peak wavelength in a range from 430 nm to 480 nm.

In the organic EL device according to the exemplary embodiment, when the first emitting layer contains the first compound and the fifth compound, the first compound is preferably a host material (occasionally also referred to as a matrix material) and the fifth compound is preferably a dopant material (occasionally also referred to as a guest material, emitter or a luminescent material).

It is preferable that the first emitting layer does not contain a phosphorescent material as a dopant material.

It is preferable that the first emitting layer does not contain a heavy-metal complex and a phosphorescent rare-earth metal complex. Examples of the heavy metal complex herein include iridium complex, osmium complex, and platinum complex.

It is also preferable that the first emitting layer does not contain a metal complex.

First Compound

The first compound is a compound represented by the formula (1). The first compound has at least one group represented by the formula (11).

[Formula 30]

(1)

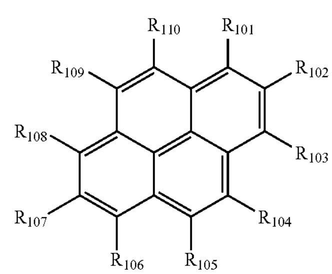

$$*\!-\!\left(L_{101}\right)_{mx}\!-\!Ar_{101} \qquad (11)$$

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is the group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring represented by the formula (1).

$R_{901}$, $R_{902}$, $R_{903}$, $R_{904}$, $R_{905}$, $R_{906}$, $R_{907}$, $R_{801}$, and $R_{802}$ in the first compound represented by the formula (1) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

The group represented by the formula (11) is preferably a group represented by a formula (111) below.

[Formula 31]

(111)

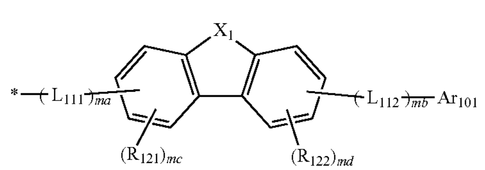

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4, mb is 0, 1, 2, 3, or 4, ma+mb is 0, 1, 2, 3, or 4;

$Ar_{101}$ represents the same as $Ar_{101}$ in the formula (11);

$R_{121}$, $R_{122}$, $R_{123}$, $R_{124}$, and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3; three $R_{121}$ are mutually the same or different; and and is 3; and three $R_{122}$ are mutually the same or different.

Among positions *1 to *8 of carbon atoms in the cyclic structure represented by a formula (111a) below in the group represented by the formula (111), $L_{111}$ is bonded to one of positions *1 to *4, $R_{121}$ is bonded to three positions of the rest of *1 to *4, $L_{112}$ is bonded to one of positions *5 to *8, and $R_{122}$ is bonded to three positions of the rest of *5 to *8.

[Formula 32]

(111a)

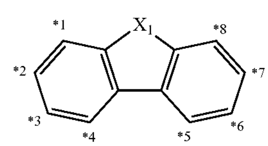

For instance, in the group represented by the formula (111), when $L_{111}$ and $L_{112}$ are bonded to *2 and *7 positions, respectively, of the carbon atom of the cyclic structure represented by the formula (111a), the group represented by the formula (111) is represented by a formula (111b) below.

[Formula 33]

(111b)

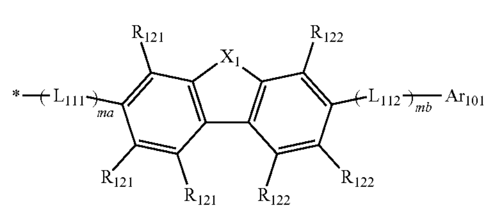

In the formula (111b): $X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device according to the exemplary embodiment, the group represented by the formula (111) is preferably a group represented by the formula (111b).

In the organic EL device according to the exemplary embodiment, ma is preferably 0, 1, or 2; and mb is preferably 0, 1, or 2.

In the organic EL device according to the exemplary embodiment, ma is preferably 0 or 1; and mb is preferably 0 or 1.

In the group represented by the formula (111), when ma is 0 and mb is 1, the group represented by the formula (111) is represented by a formula (111c) below.

[Formula 34]

(111c)

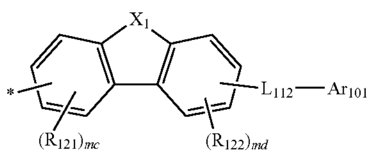

In the formula (111c), $X_1$, $L_{112}$, mc, md, $Ar_{101}$, $R_{121}$, and $R_{122}$ each independently represent the same as $X_1$, $L_{112}$, mc, md, $Ar_{101}$, $R_{121}$, and $R_{122}$ in the formula (111).

In the organic EL device according to the exemplary embodiment, $Ar_{101}$ is preferably a substituted or unsubstituted aryl group having 6 to 50 ring carbon atoms.

In the organic EL device according to the exemplary embodiment, $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to the exemplary embodiment, $Ar_{101}$ is also preferably a group represented by a formula (12), a formula (13), or a formula (14) below.

[Formula 35]

(12)

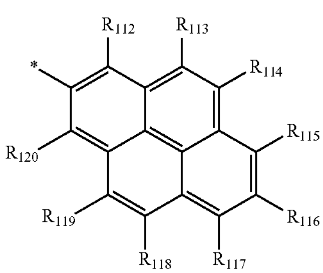

-continued (13)

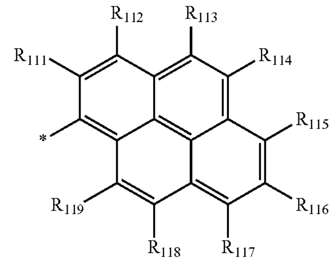

(14)

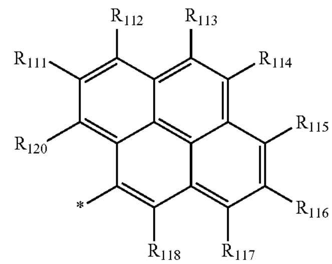

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(=O)R_{124}$, a group represented by $—COOR_{125}$, a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formulae (12), (13), and (14) represents a bonding position to $L_{101}$ in the formula (11), a bonding position to $L_{112}$ in the formula (111), or a bonding position to $L_{112}$ in the formula (111b).

It is also preferable that $R_{124}$ and $R_{125}$ in the formulae (12), (13), and (14) each independently represent the same as the above-described $R_{801}$ and $R_{802}$.

The first compound is preferably represented by a formula (101) below.

[Formula 36]

(101)

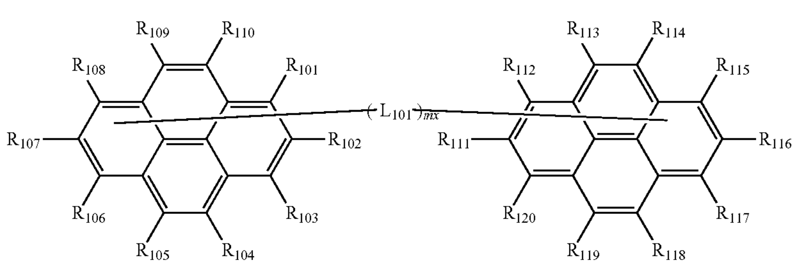

In the formula (101): $R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4, or 5; and when two or more $L_{101}$ are present, the two or more $L_{101}$ are mutually the same or different.

In the formula (101), when $R_{103}$ is a bonding position to $L_{101}$ and $R_{120}$ is a bonding position to $L_{101}$, the compound represented by the formula (101) is represented by a formula (101A) below.

[Formula 37]

(101A)

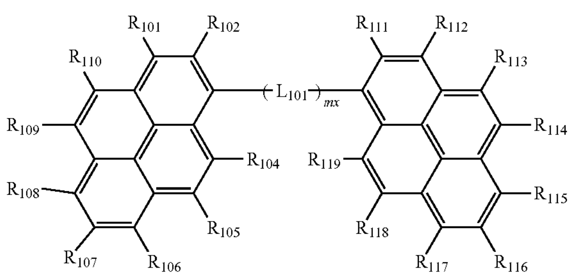

In the formula (101A), $R_{101}$, $R_{102}$, $R_{104}$ to $R_{119}$, $L_{101}$ and mx respectively represent the same as $R_{101}$, $R_{102}$, $R_{104}$ to $R_{119}$, $L_{101}$ and mx in the formula (101).

In the organic EL device according to the exemplary embodiment, $L_{101}$ is preferably a single bond, or a substituted or unsubstituted arylene group having 6 to 50 ring carbon atoms.

In the organic EL device according to the exemplary embodiment, the first compound is preferably represented by a formula (102) below.

In the formula (102): $R_{101}$ to $R_{120}$ each independently represent the same as $R_{101}$ to $R_{120}$ of the formula (101);

one of $R_{101}$ to $R_{110}$ represents a bonding position to $L_{111}$, and one of $R_{111}$ to $R_{120}$ represents a bonding position to $L_{112}$, $X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4, mb is 0, 1, 2, 3, or 4, ma+mb is 0, 1, 2, 3, or 4;

$R_{121}$, $R_{122}$, $R_{123}$, $R_{124}$, and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

and is 3; and three $R_{122}$ are mutually the same or different.

In the compound represented by the formula (102), it is preferable that ma is 0, 1, or 2; and mb is 0, 1, or 2.

In the compound represented by the formula (102), it is preferable that ma is 0 or 1; and mb is 0 or 1.

In the organic EL device according to the exemplary embodiment, two or more of $R_{101}$ to $R_{110}$ are preferably groups represented by the formula (11).

In the organic EL device according to the exemplary embodiment, it is preferable that two or more of $R_{101}$ to $R_{110}$ are groups represented by the formula (11) and $Ar_{101}$ is a substituted or unsubstituted aryl group having 6 to 50 ring carbon atoms.

In the organic EL device according to the exemplary embodiment, it is preferable that $Ar_{101}$ is not a substituted or unsubstituted pyrenyl group;

$L_{101}$ is not a substituted or unsubstituted pyrenylene group; and the substituted or unsubstituted aryl group having 6 to 50 ring carbon atoms as $R_{101}$ to $R_{110}$ not being the group represented by the formula (11) is not a substituted or unsubstituted pyrenyl group.

[Formula 38]

(102)

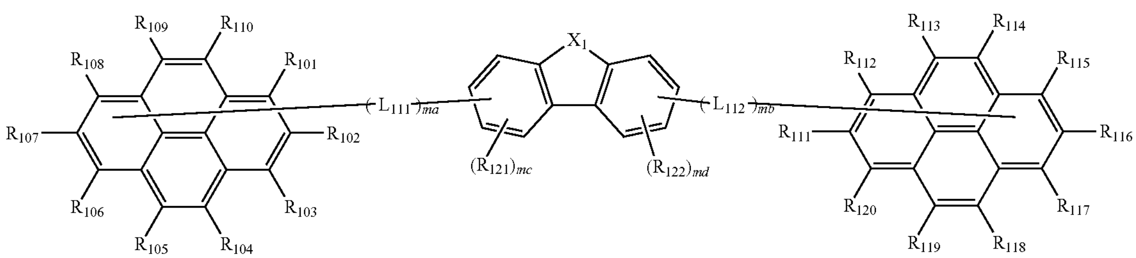

In the organic EL device according to the exemplary embodiment, it is preferable that $R_{101}$ to $R_{110}$ that are not the group represented by the formula (11) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that $R_{101}$ to $R_{110}$ that are not the group represented by the formula (11) are each independently a hydrogen atom, or a substituted or unsubstituted alkyl group having 1 to 50 carbon atoms, or a substituted or unsubstituted cycloalkyl group having 3 to 50 ring carbon atoms.

In the organic EL device according to the exemplary embodiment, $R_{101}$ to $R_{110}$ not being the group represented by the formula (11) are each preferably a hydrogen atom.

In the organic EL device according to the exemplary embodiment, $X_1$ is preferably $CR_{123}R_{124}$. For example, when $X_1$ is $CR_{123}R_{124}$, the group represented by the formula (111) is represented by a formula (111d) below.

[Formula 39]

(111d)

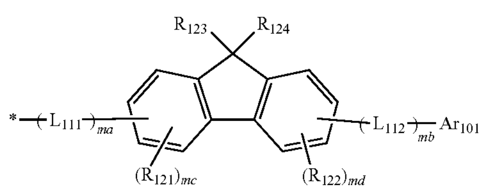

In the formula (111d), $L_{111}$, $L_{112}$, ma, mb, ma+mb, $Ar_{101}$, $R_{121}$, $R_{122}$, $R_{123}$, $R_{124}$, $R_{125}$, mc and md each represent the same as $L_{111}$, $L_{112}$, ma, mb, ma+mb, $A_{101}$, $R_{121}$, $R_{122}$, $R_{123}$, $R_{124}$, $R_{125}$, mc and md defined in the formula (111).

In the organic EL device according to the exemplary embodiment, it is preferable that $R_{123}$ and $R_{124}$ are not mutually bonded.

In the organic EL device according to the exemplary embodiment, at least one of $L_{111}$ and $L_{112}$ is preferably a substituted or unsubstituted arylene group having 6 to 50 ring carbon atoms, or a substituted or unsubstituted divalent heterocyclic group having 5 to 50 ring atoms.

In the first compound, the groups specified to be "substituted or unsubstituted" are each preferably an "unsubstituted" group.

Method of Manufacturing First Compound

The first compound can be manufactured by a known method. The first compound can also be manufactured based on a known method through a known alternative reaction using a known material(s) tailored for the target compound.

Specific Examples of First Compound

Specific examples of the first compound include, for example, the following compounds. It should however be noted that the invention is not limited by the specific examples of the first compound.

[Formula 40]

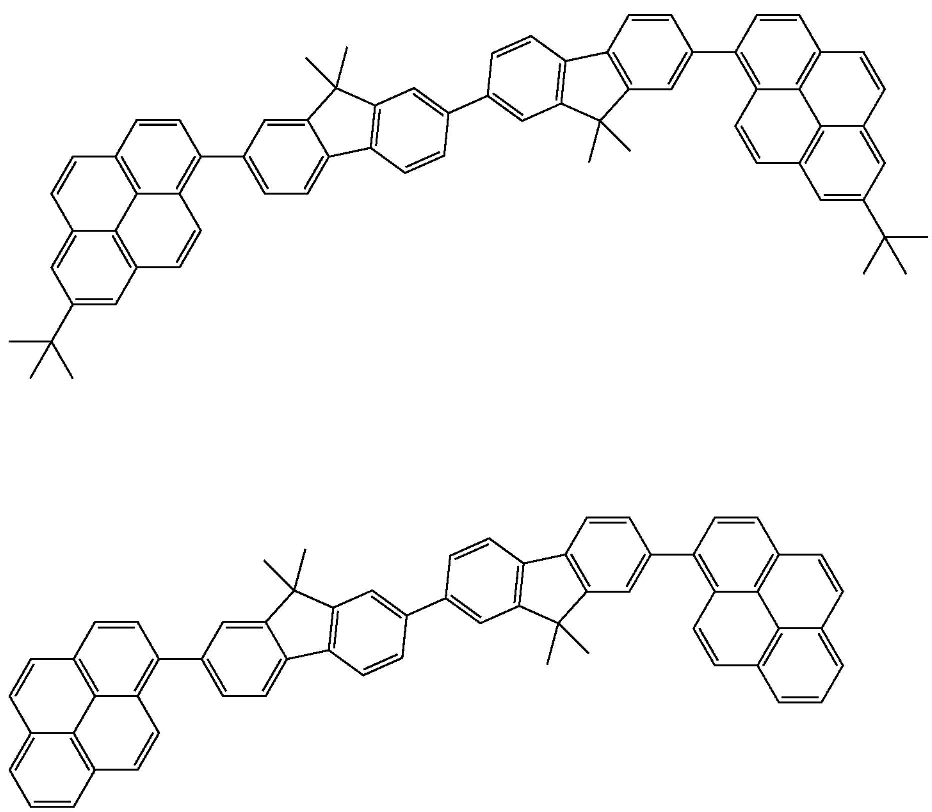

-continued
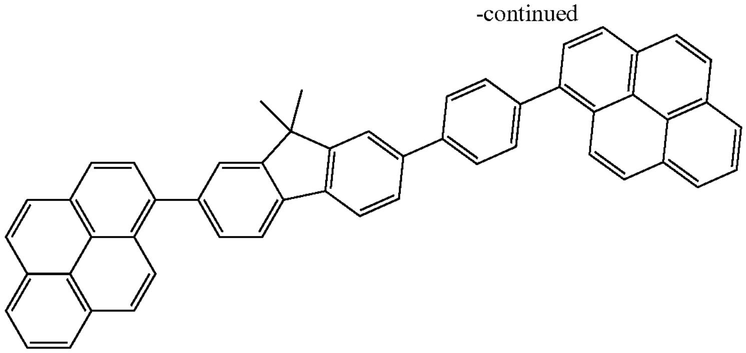
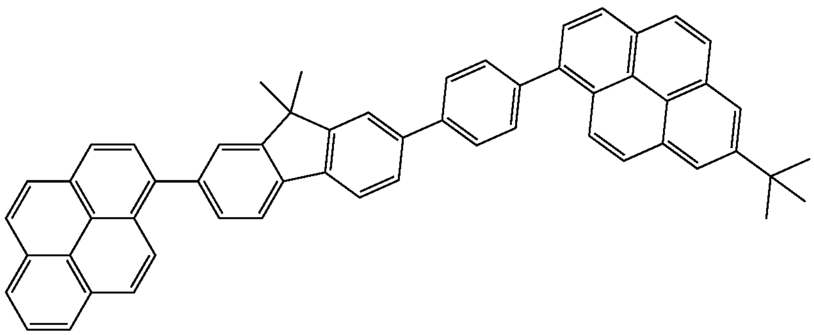
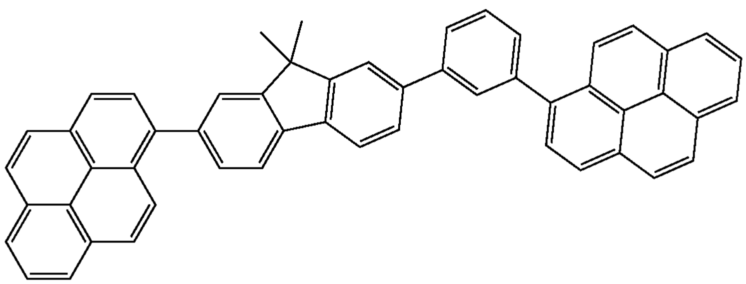
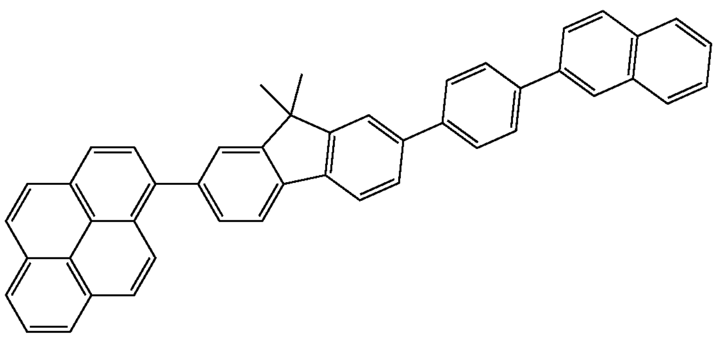
[Formula 41]
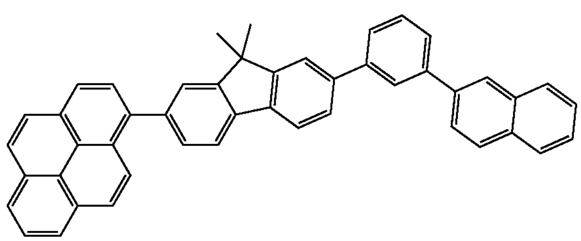
-continued
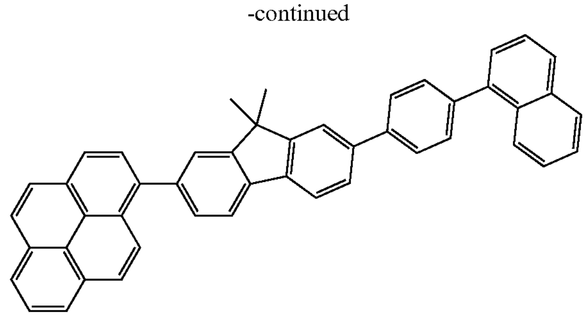

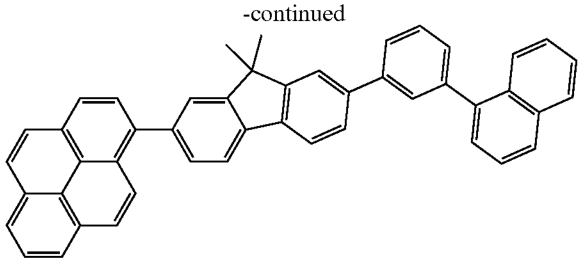
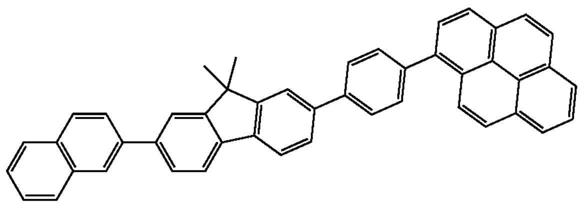
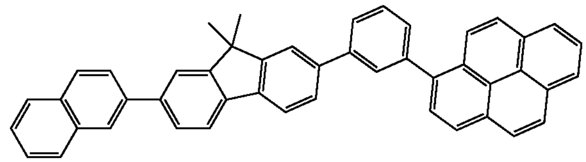
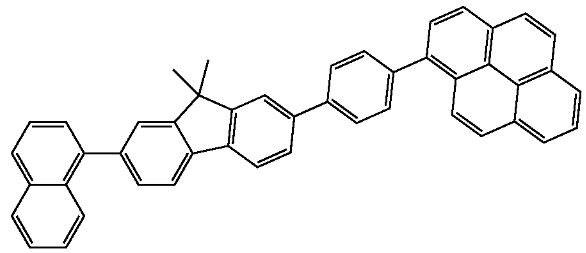
[Formula 42]
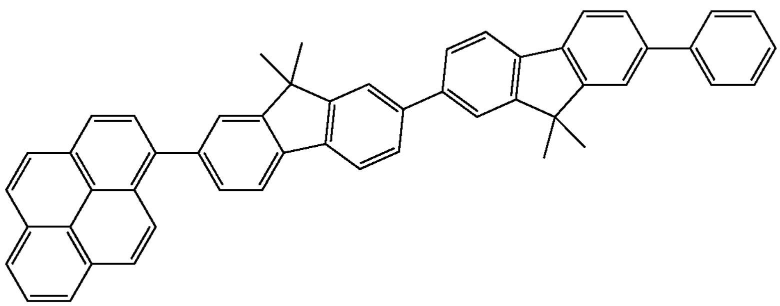
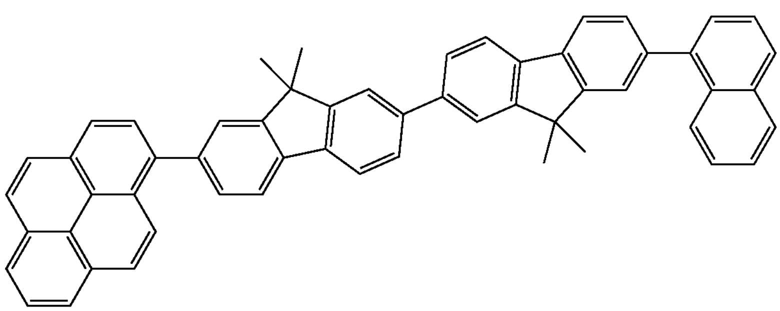
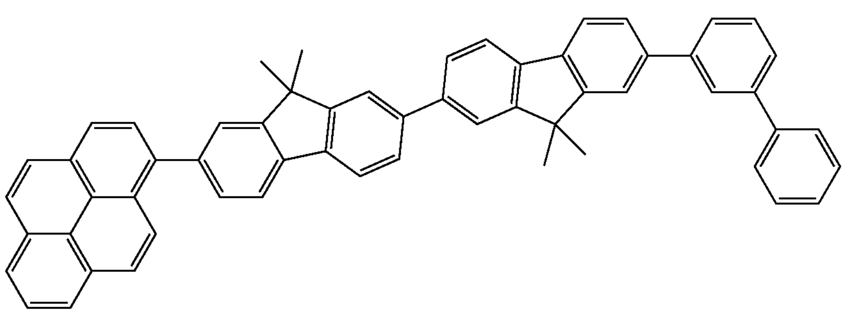

-continued
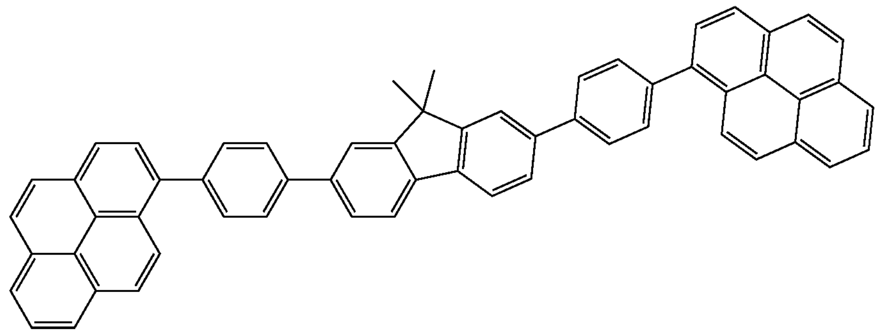
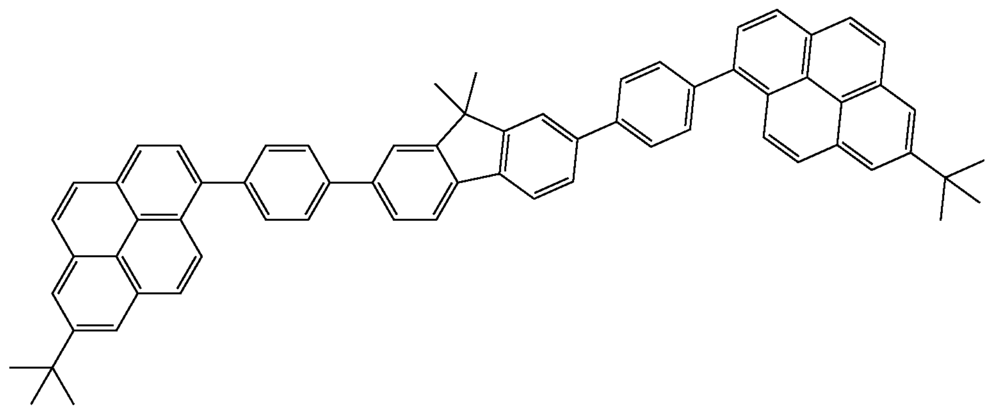
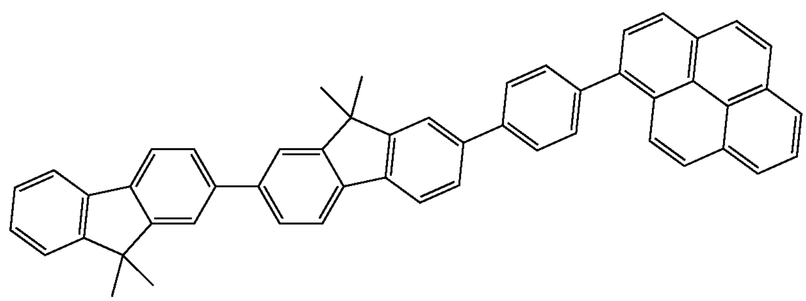 [SMILES: CC1(C)c2ccccc2-c2ccc(-c3ccc4c(c3)C(C)(C)c3cc(-c5ccc(-c6ccc7ccc8cccc9ccc6c7c89)cc5)ccc3-4)cc21]
[Formula 43]
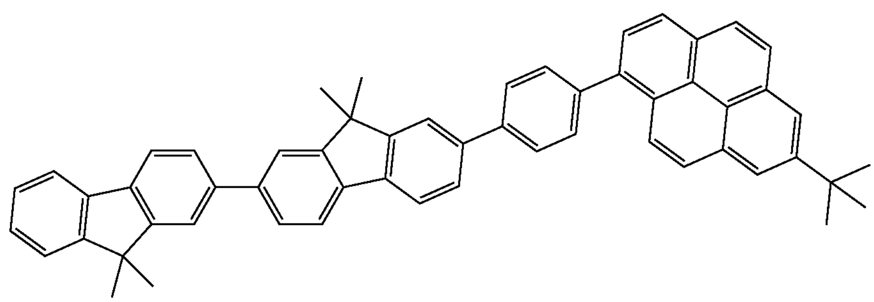
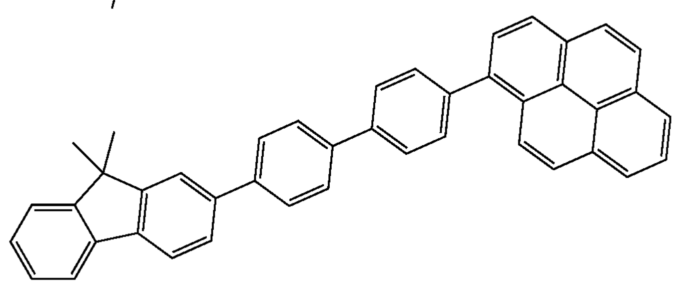

-continued
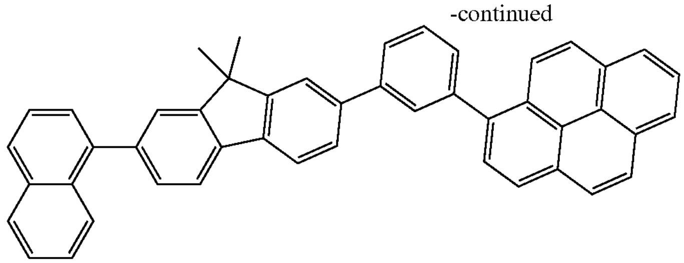
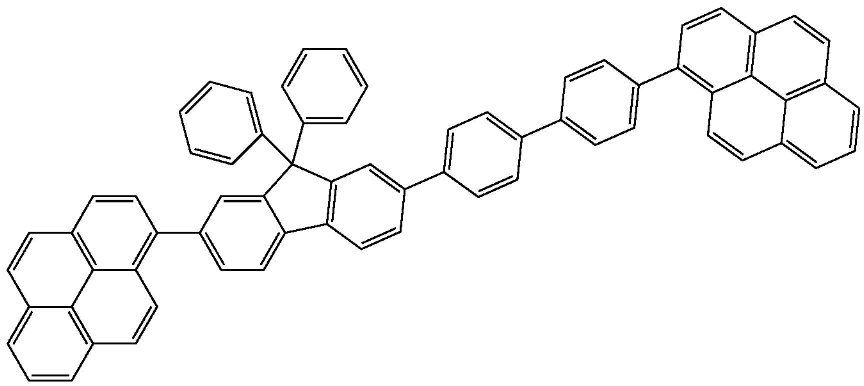
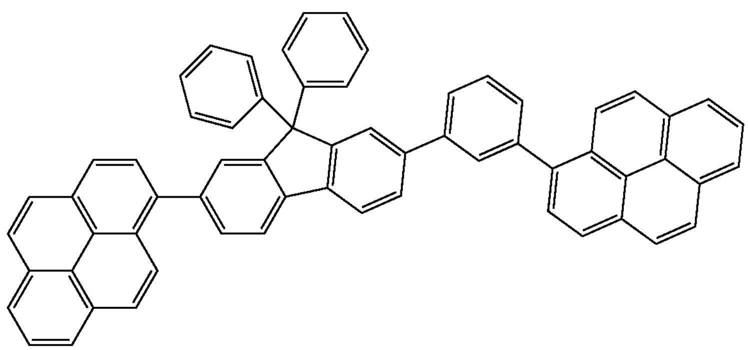
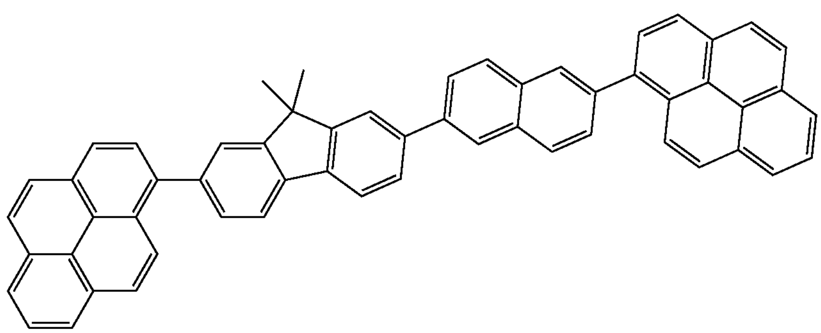 [SMILES: CC1(C)c2cc(-c3ccc4cc(-c5ccc6ccc7cccc8ccc5c6c78)ccc4c3)ccc2-c2ccc(-c3ccc4ccc5cccc6ccc3c4c56)cc21]
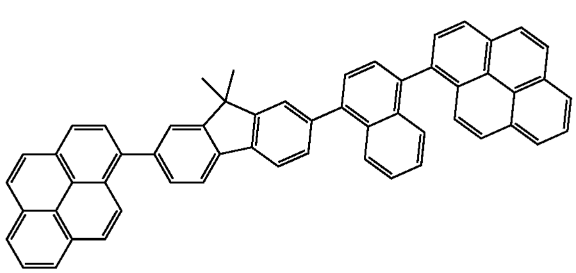
-continued
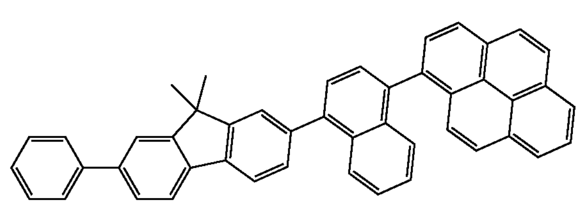

-continued
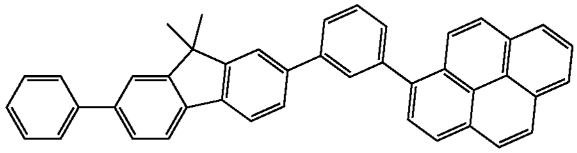
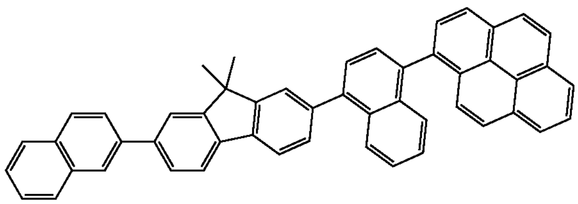
-continued
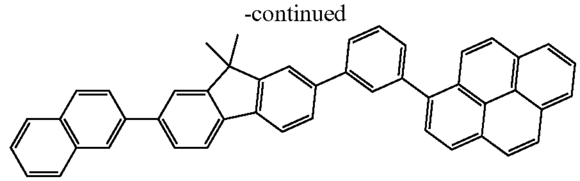
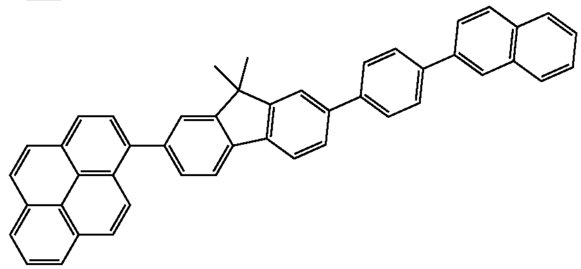
[Formula 45]
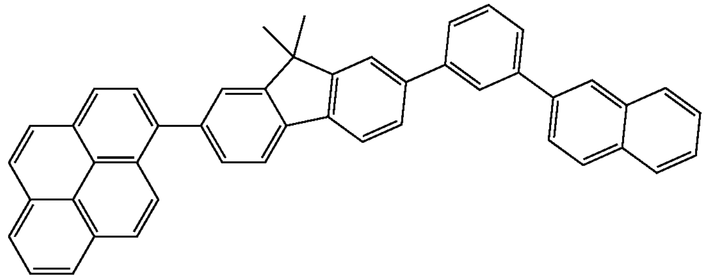
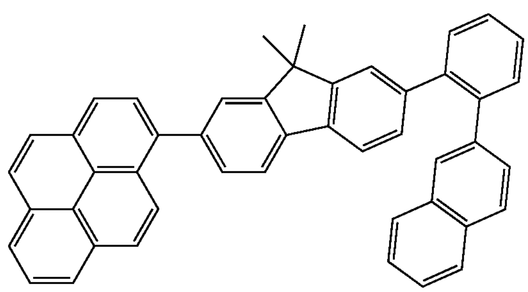
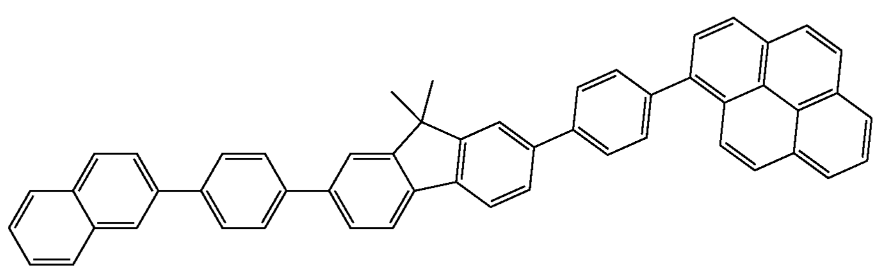
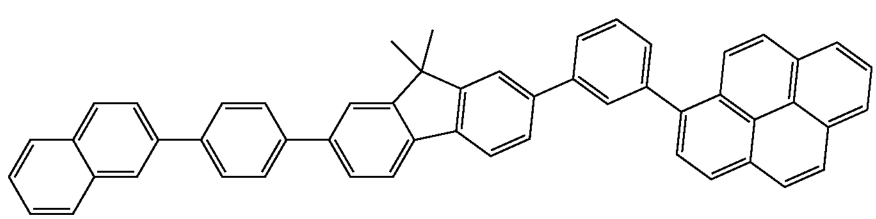

-continued
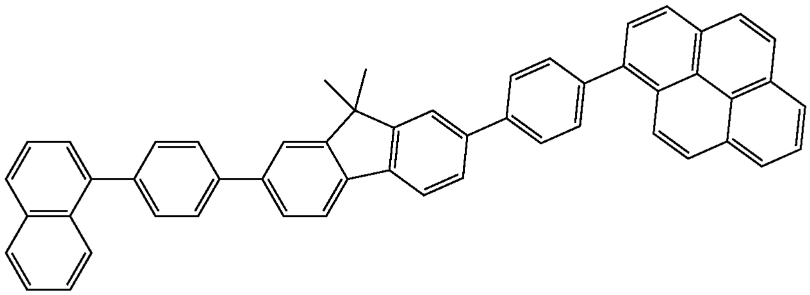
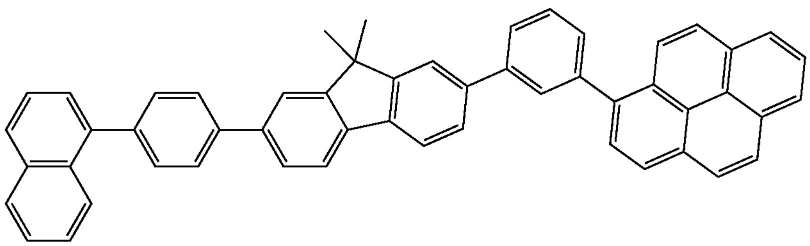
[Formula 46]
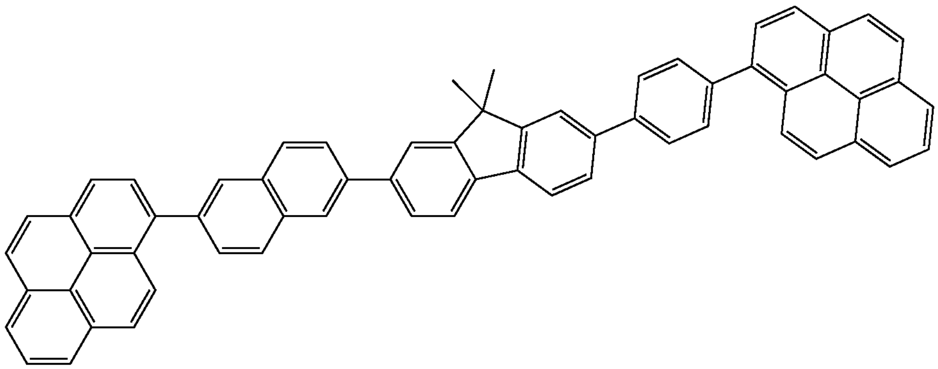
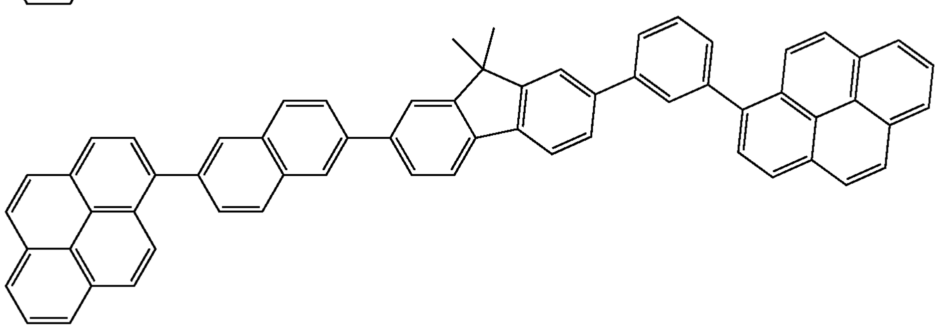
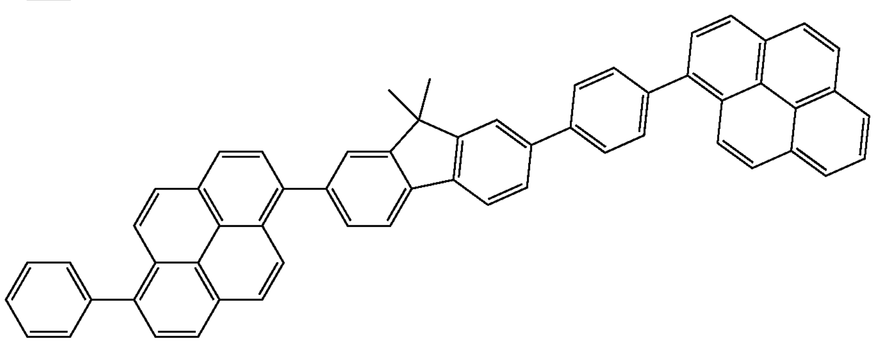

-continued
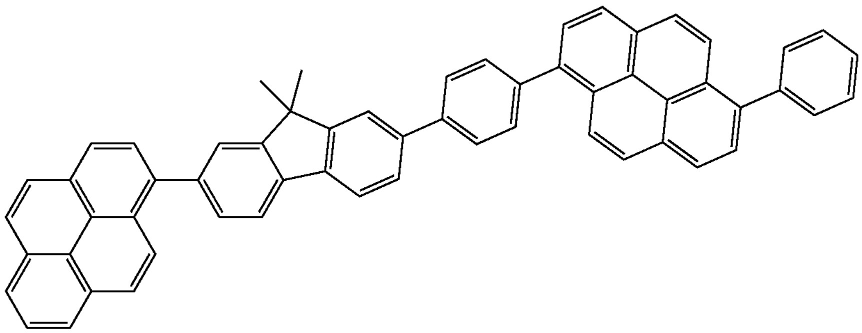
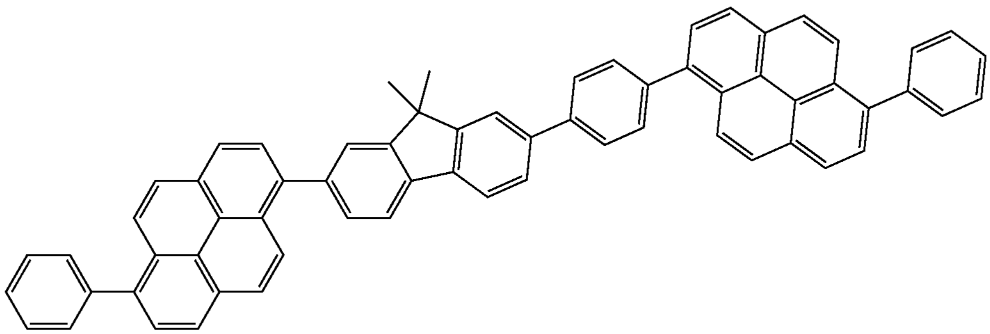
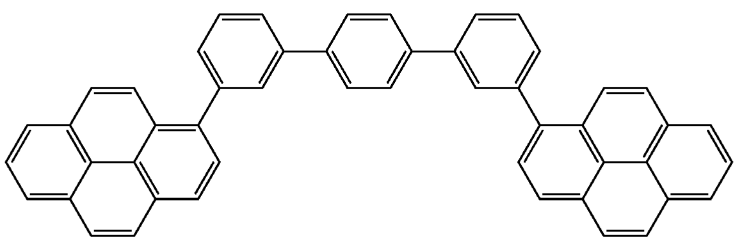 [SMILES: c1cc(-c2ccc(-c3cccc(-c4ccc5ccc6cccc7ccc4c5c67)c3)cc2)cc(-c2ccc3ccc4cccc5ccc2c3c45)c1]
[Formula 47]
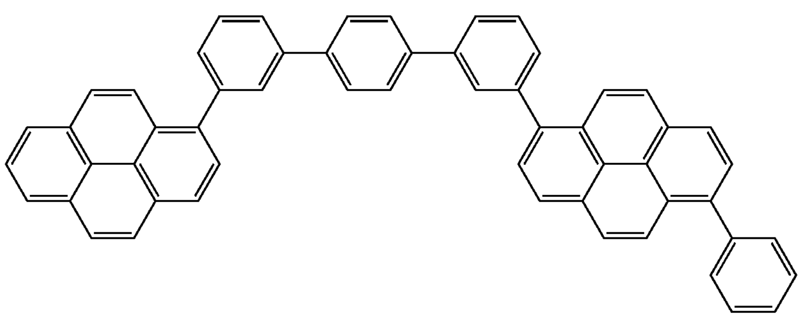
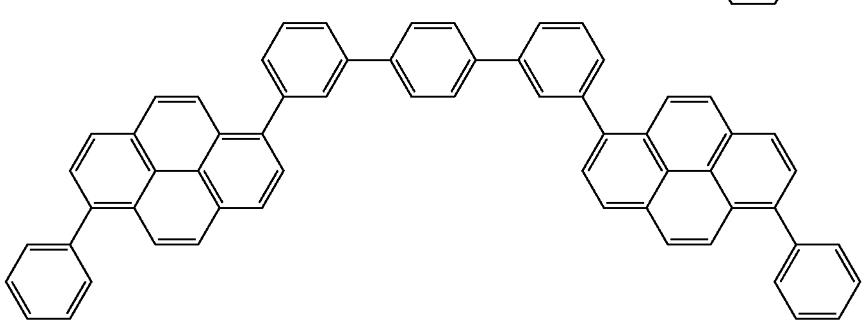

-continued
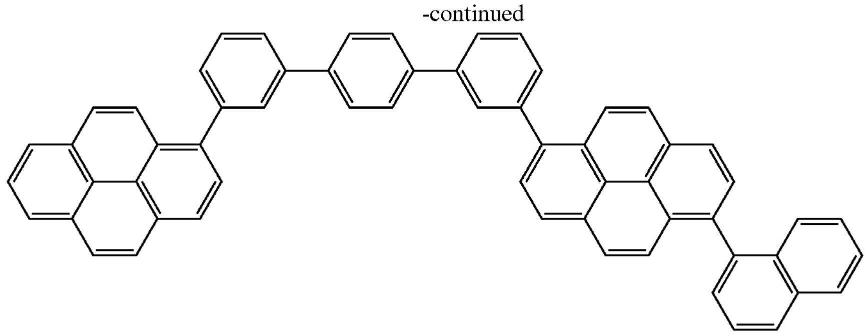
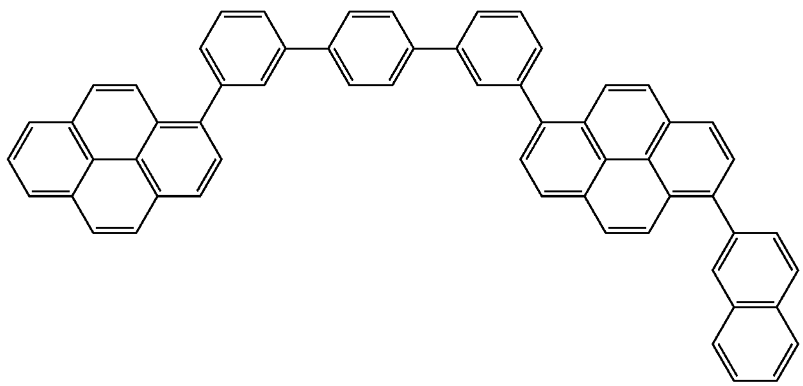
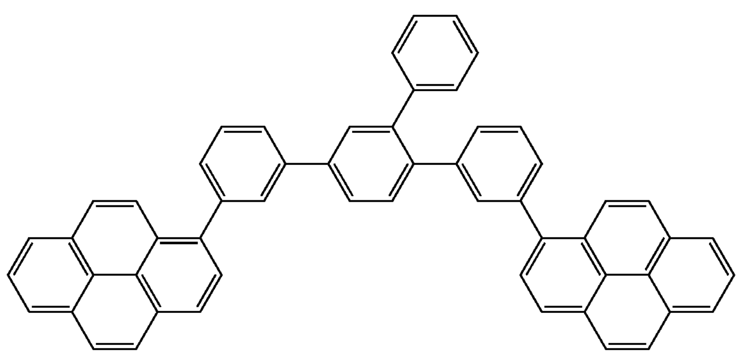
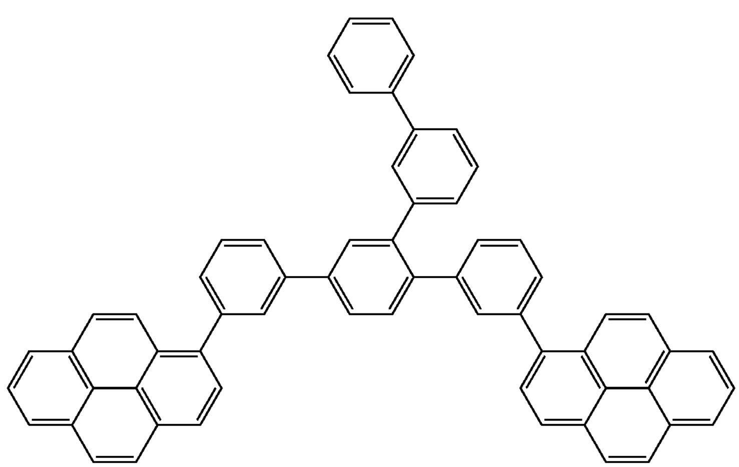 [SMILES: c1ccc(-c2cccc(-c3cc(-c4cccc(-c5ccc6ccc7cccc8ccc5c6c78)c4)ccc3-c3cccc(-c4ccc5ccc6cccc7ccc4c5c67)c3)c2)cc1]

[Formula 48]
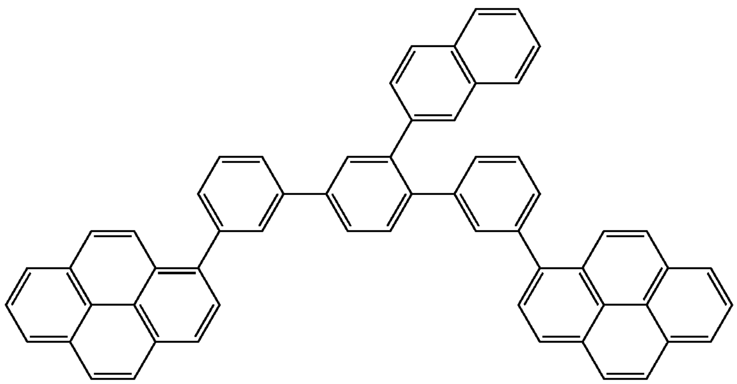
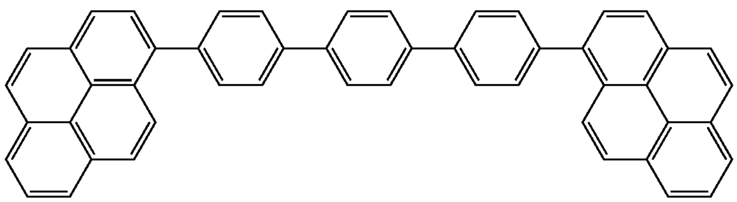
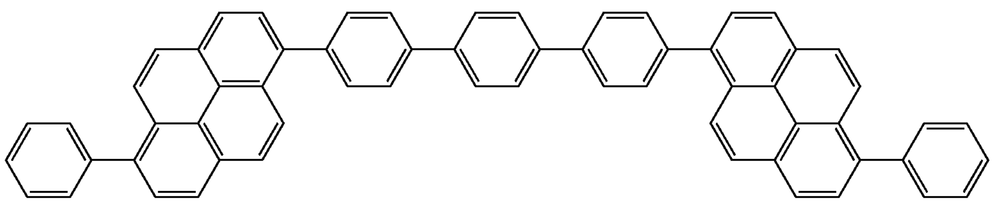
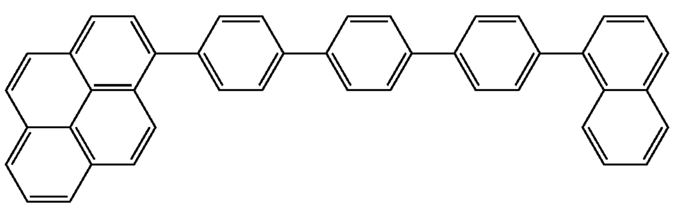
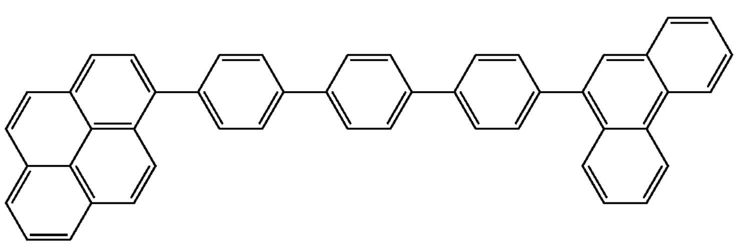
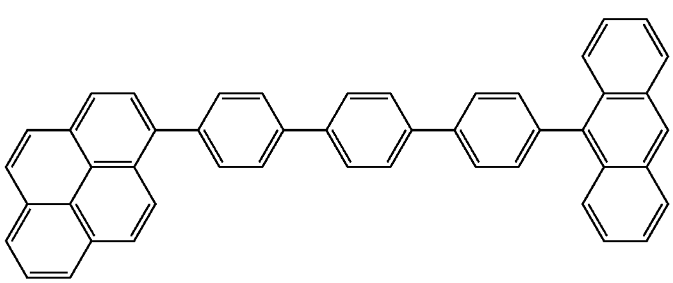

[Formula 49]
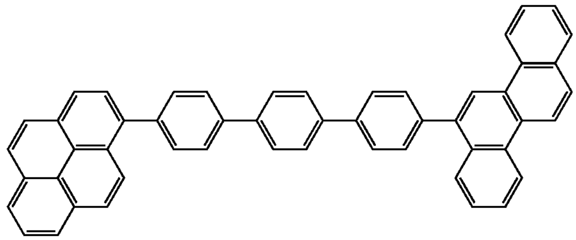
-continued
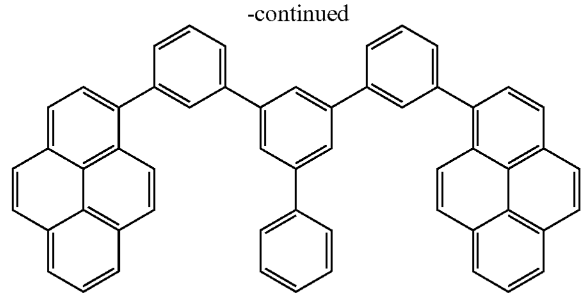
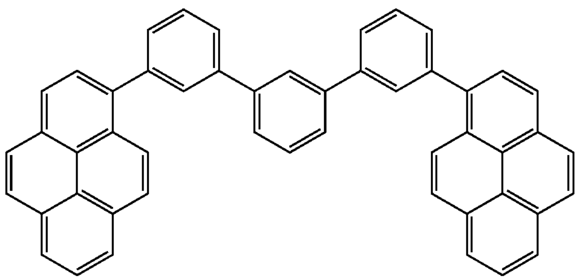
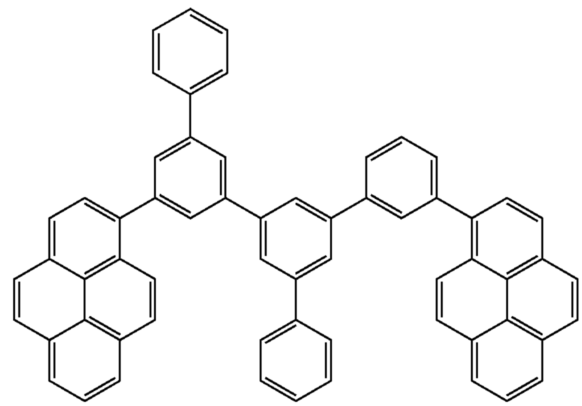
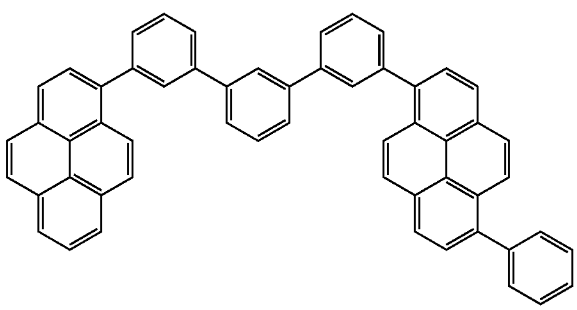
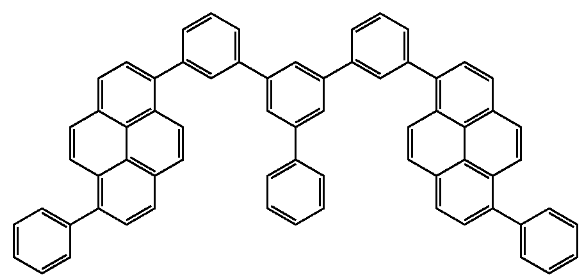 [SMILES: c1ccc(-c2cc(-c3cccc(-c4ccc5ccc6c(-c7ccccc7)ccc7ccc4c5c76)c3)cc(-c3cccc(-c4ccc5ccc6c(-c7ccccc7)ccc7ccc4c5c76)c3)c2)cc1]
[Formula 50]
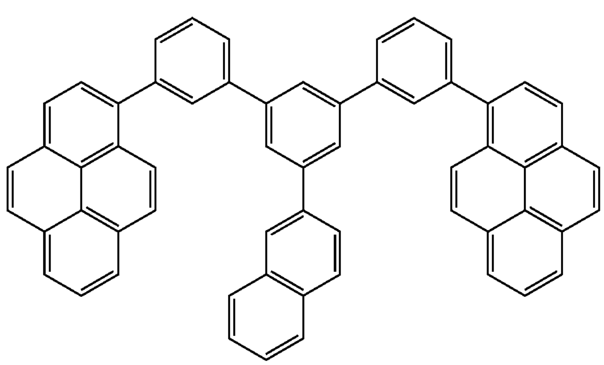

-continued
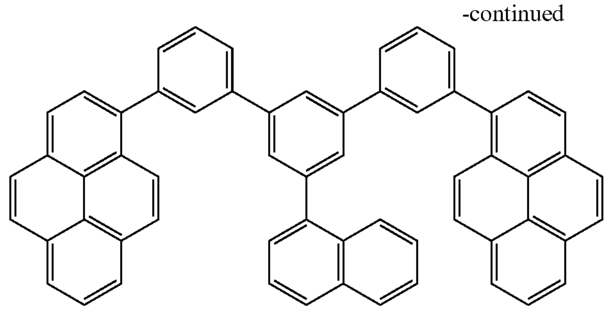
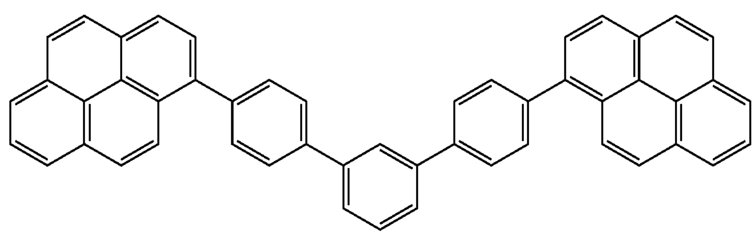
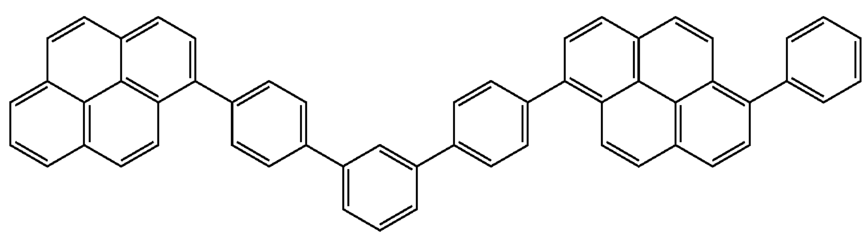
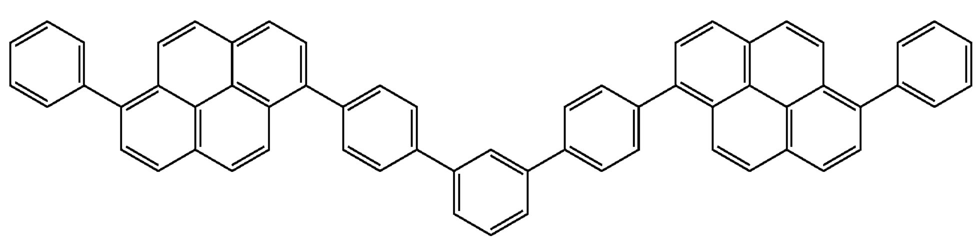
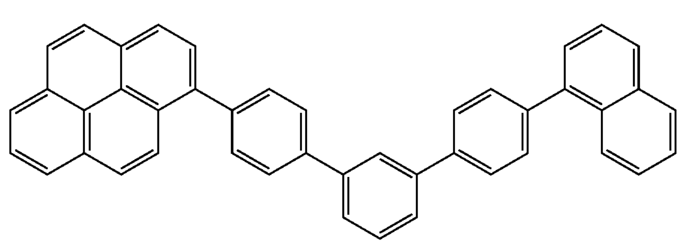

[Formula 51]
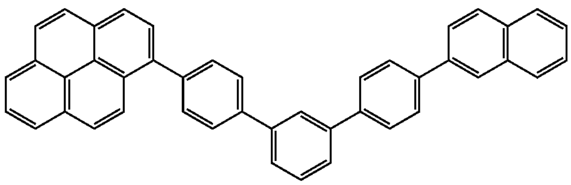
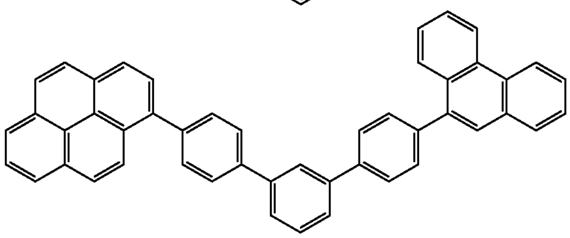
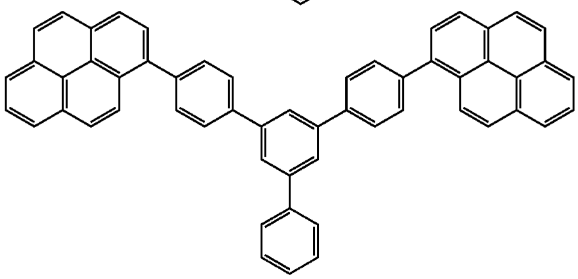
-continued
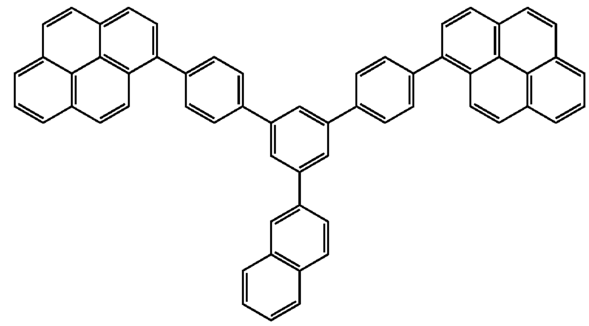
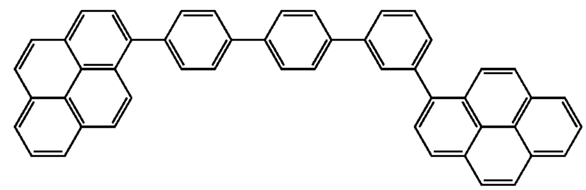
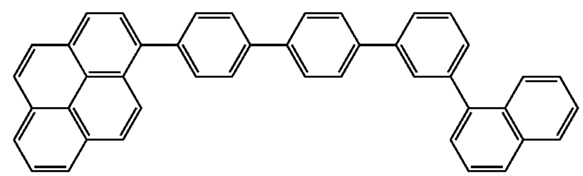 [SMILES: c1cc(-c2ccc(-c3ccc(-c4ccc5ccc6cccc7ccc4c5c67)cc3)cc2)cc(-c2cccc3ccccc23)c1]
[Formula 52]
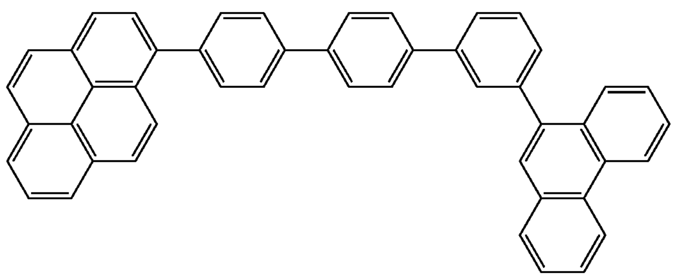
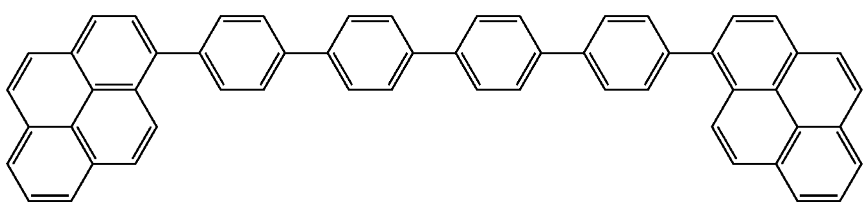
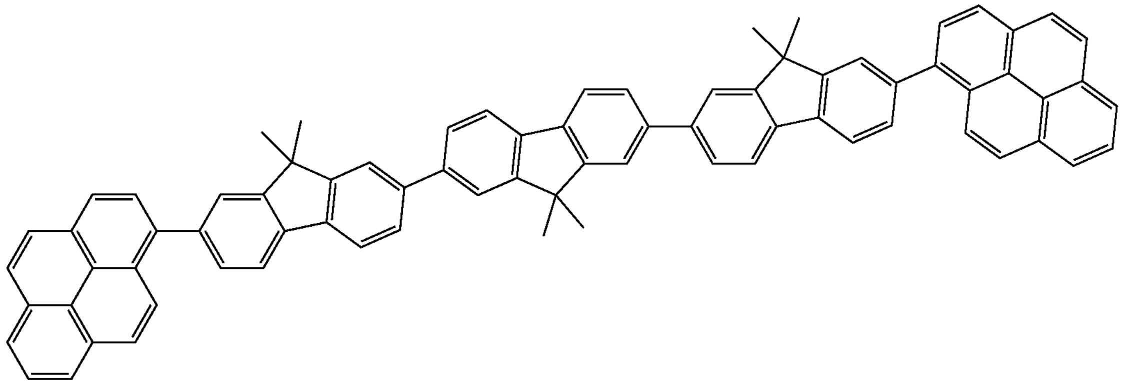

[Formula 53]
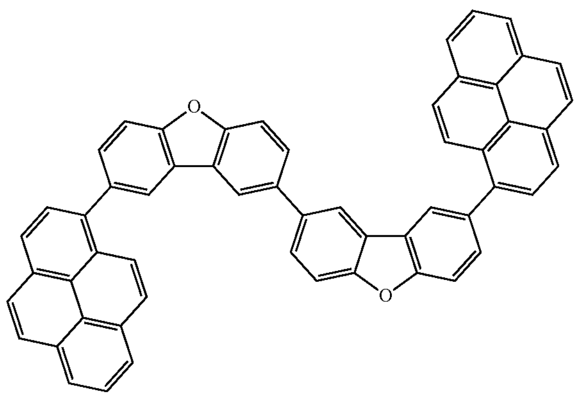
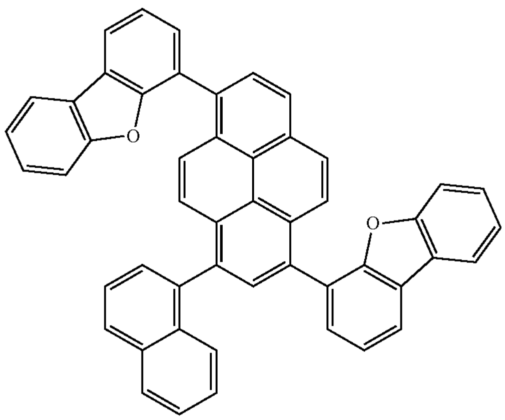
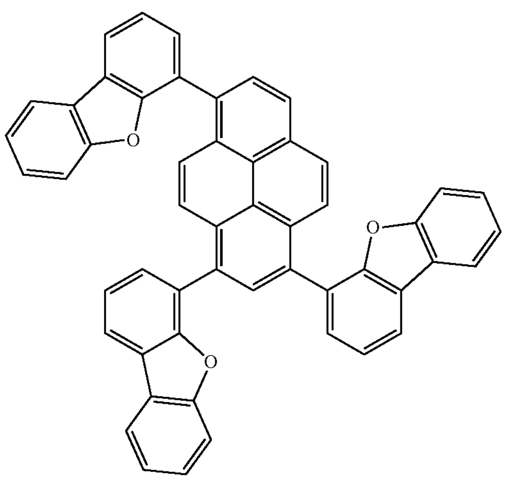
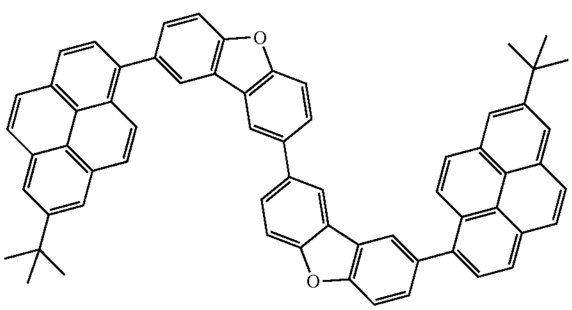
-continued
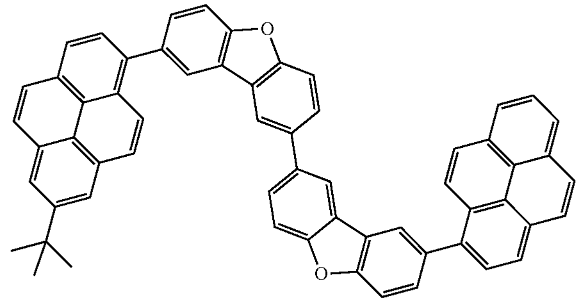
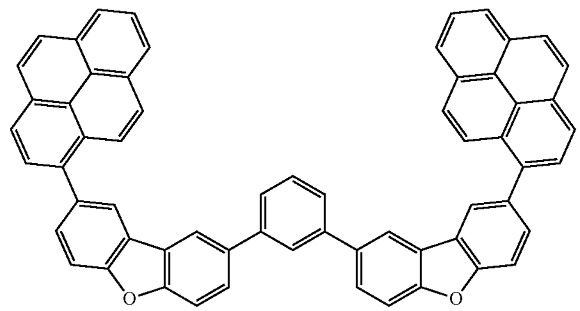
[Formula 54]
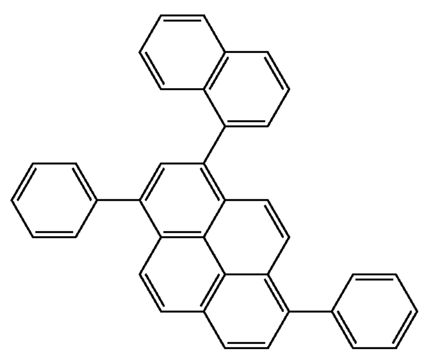
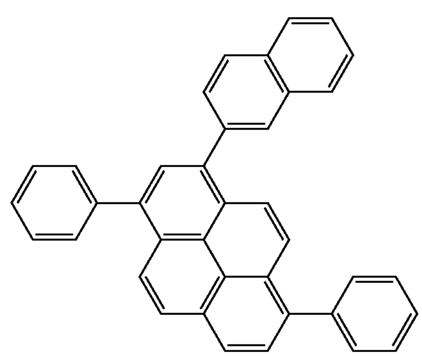

-continued
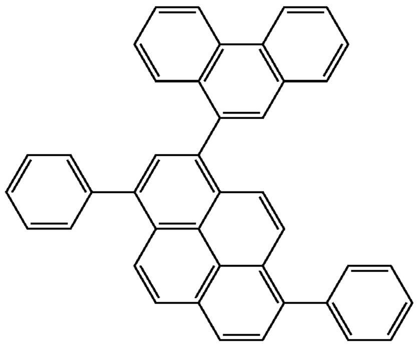
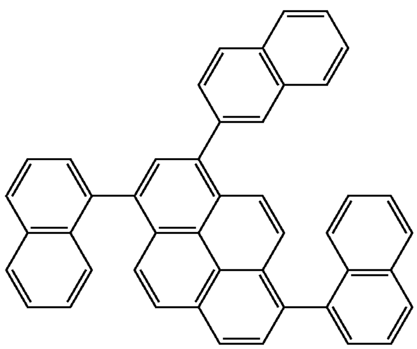
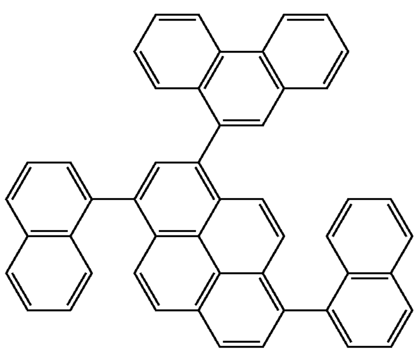
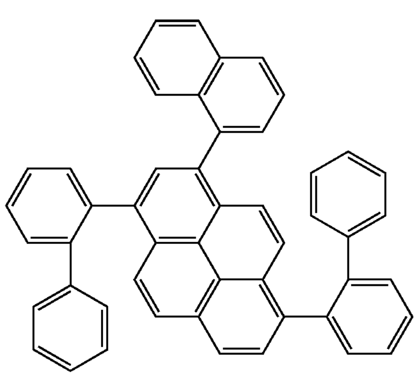
[Formula 55]
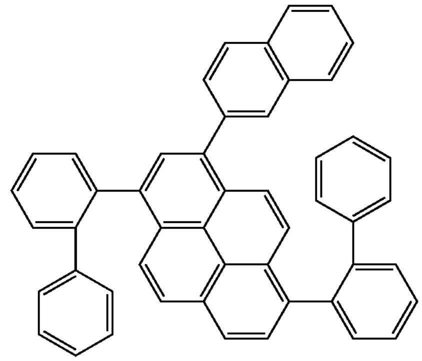
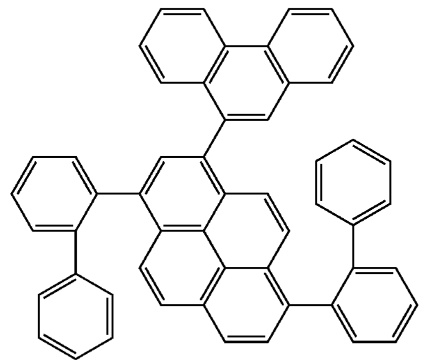
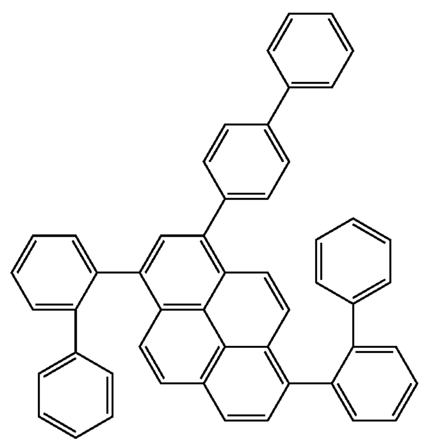
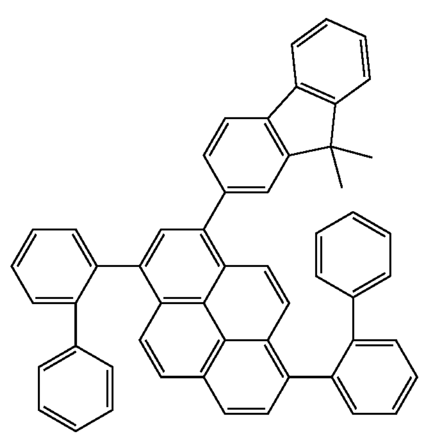

-continued
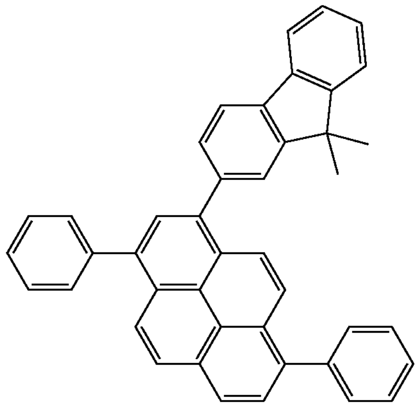
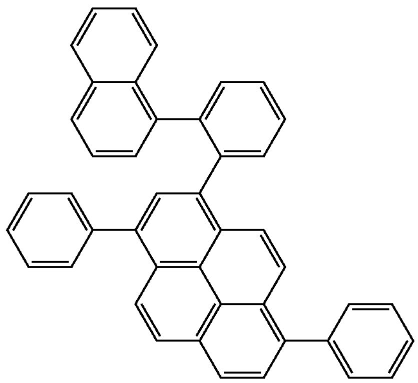
[Formula 56]
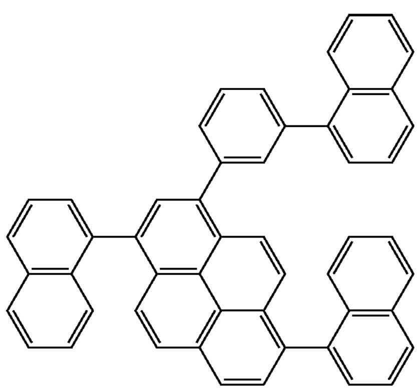
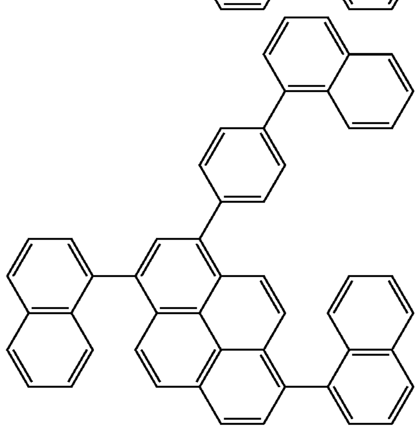
-continued
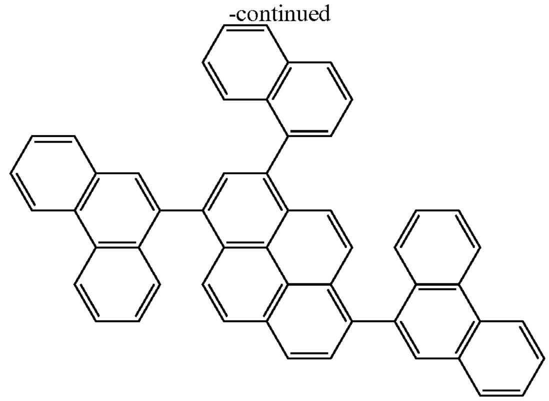
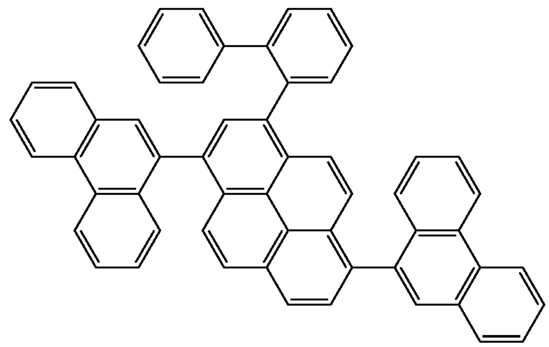
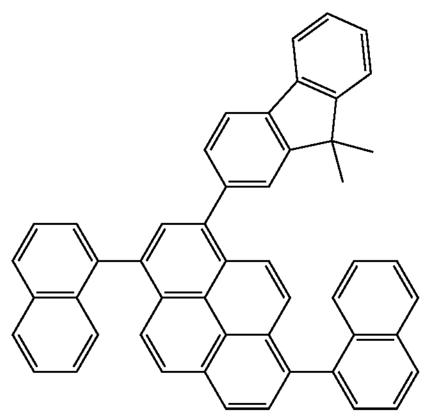
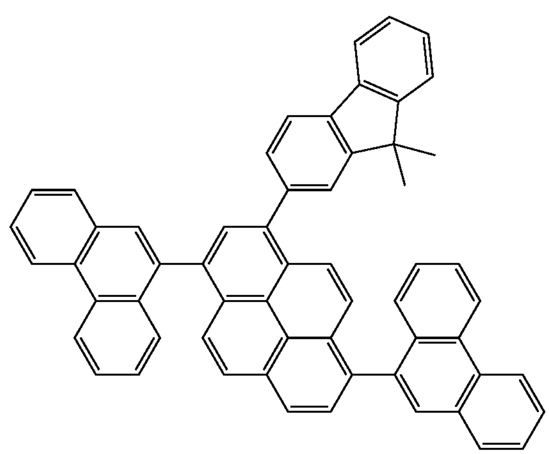

[Formula 57]
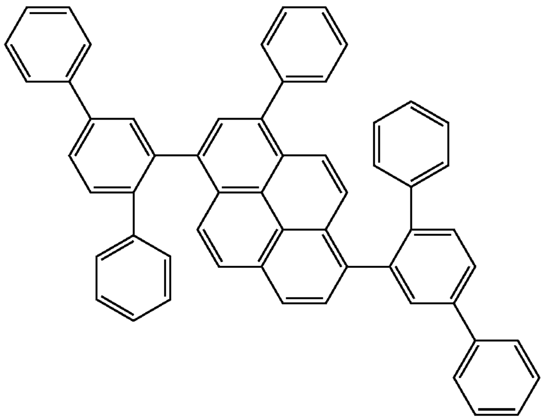
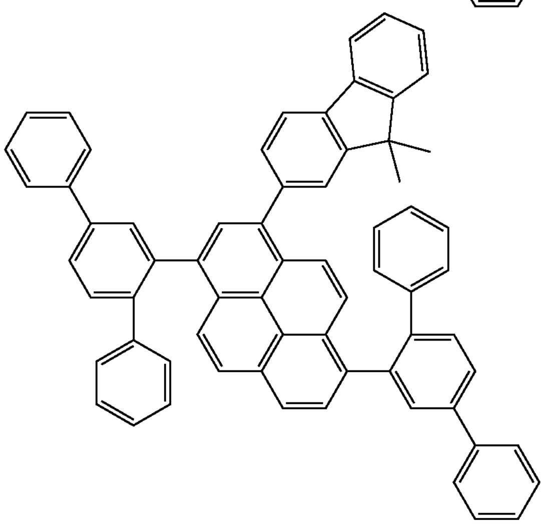
-continued
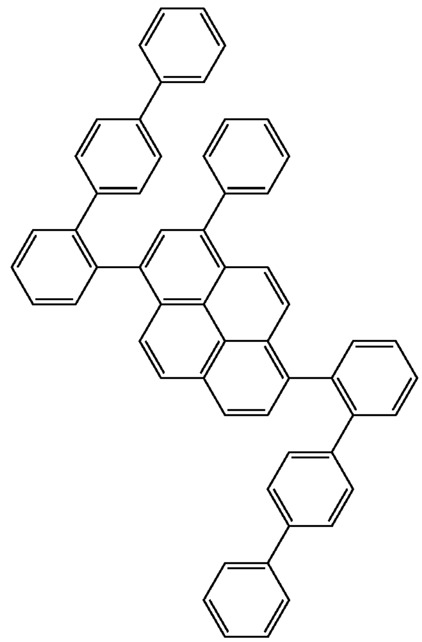
[Formula 58]
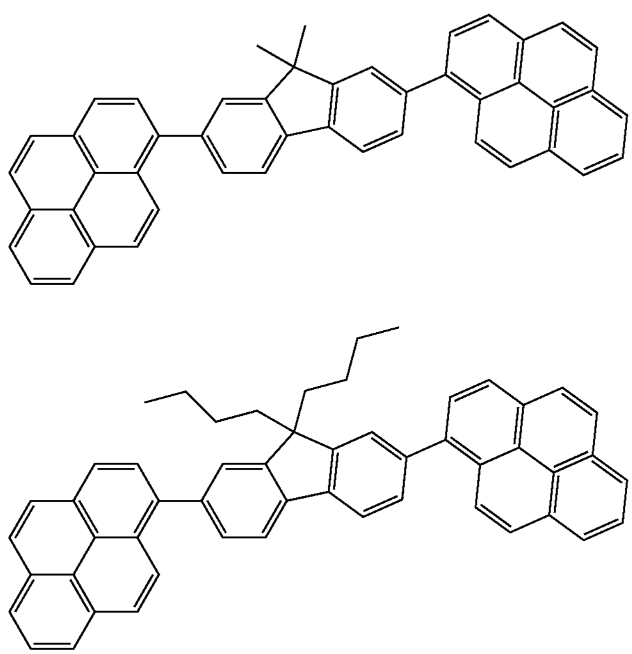

-continued
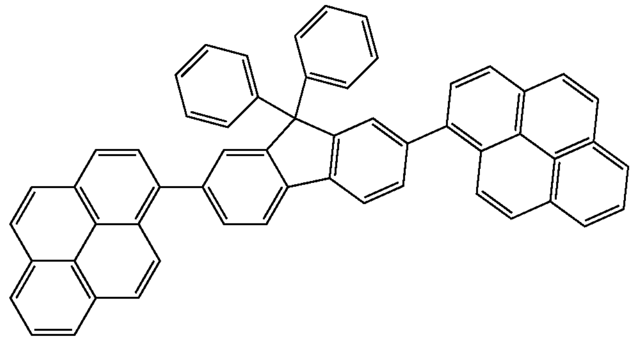
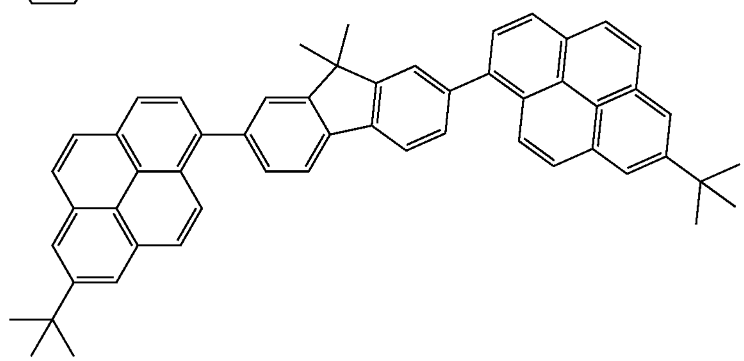
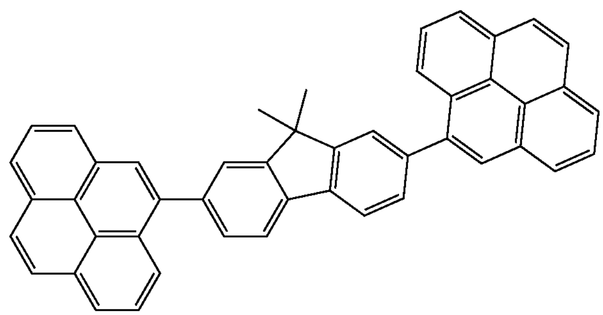
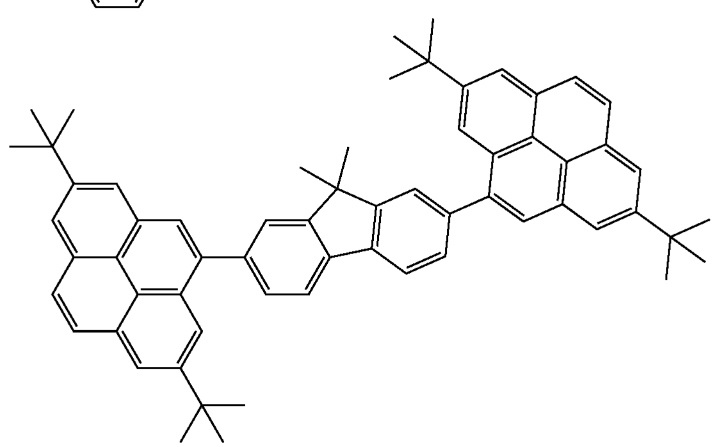
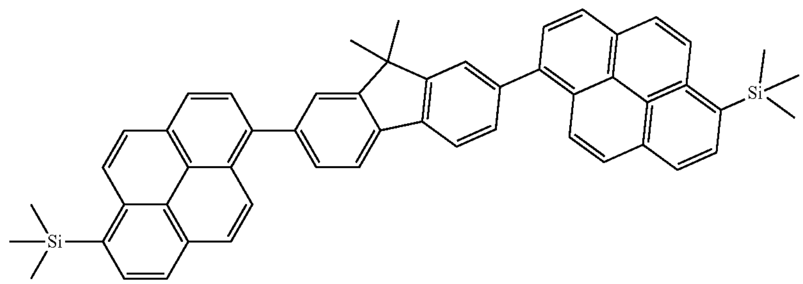

-continued
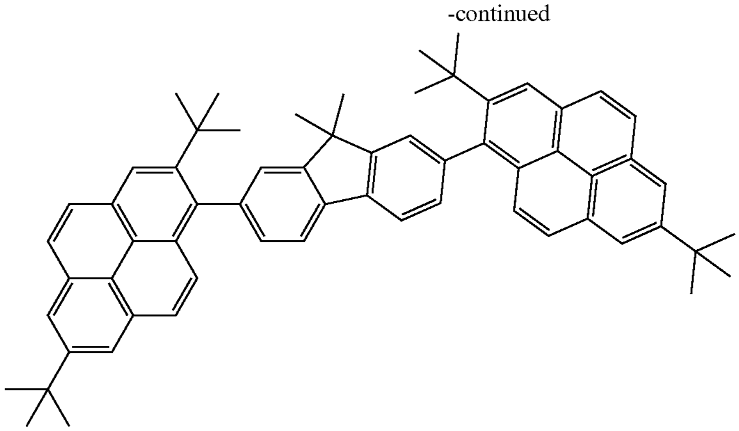
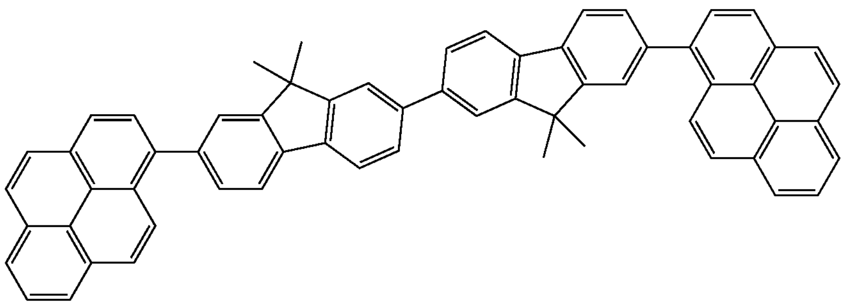
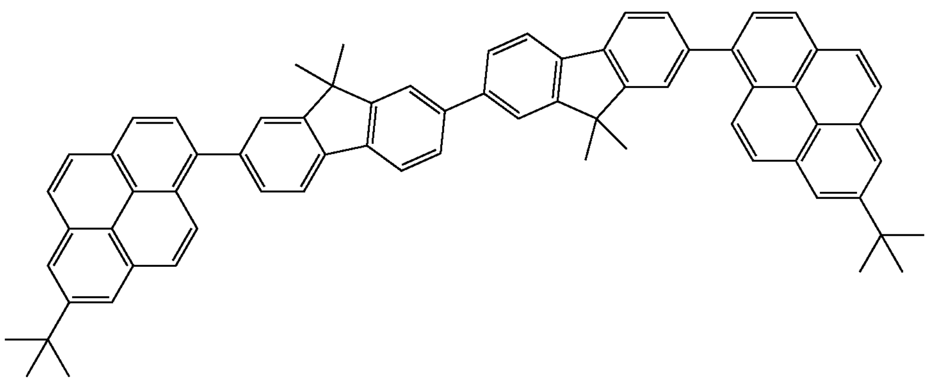
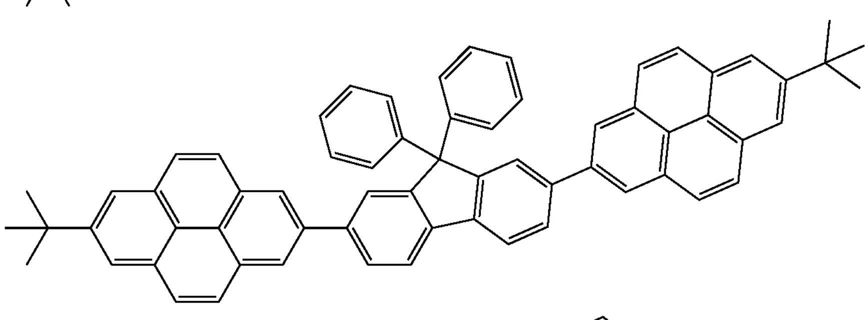
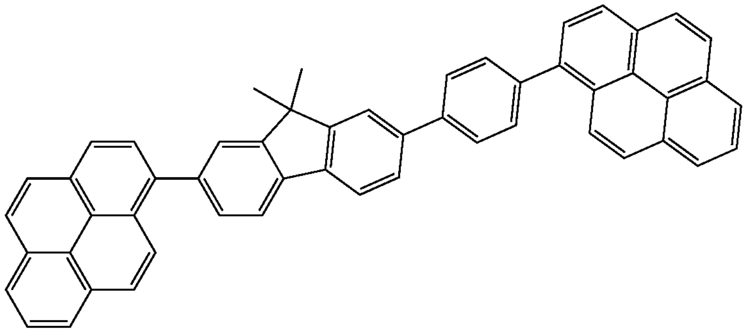

-continued
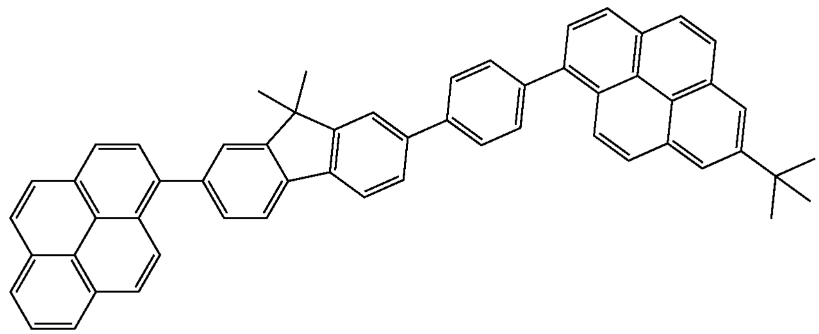
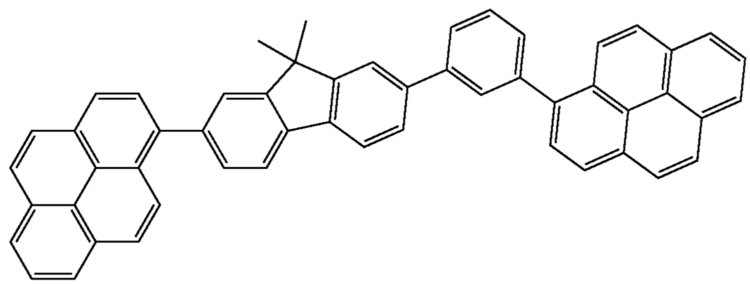
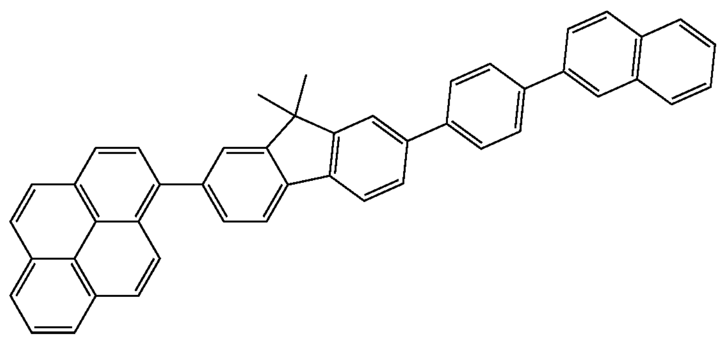
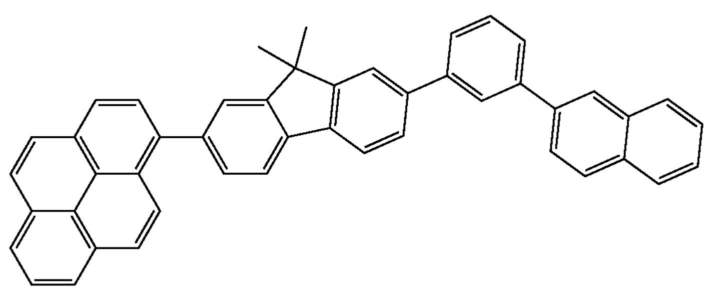
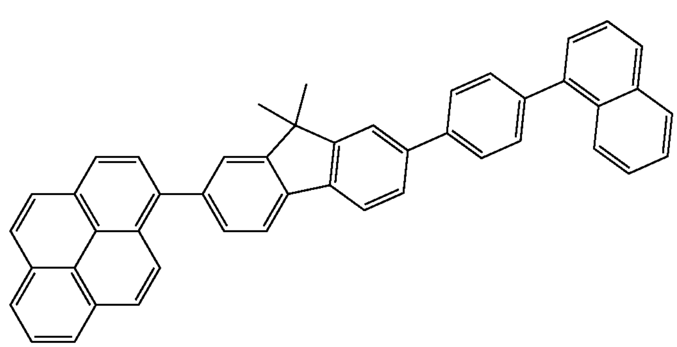

-continued
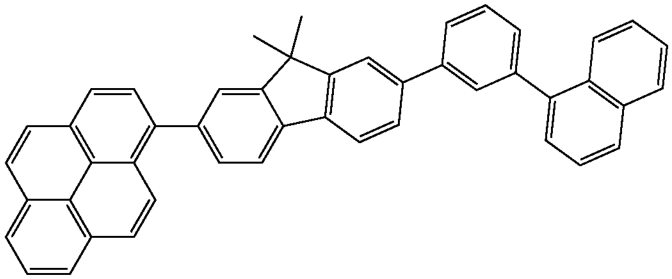
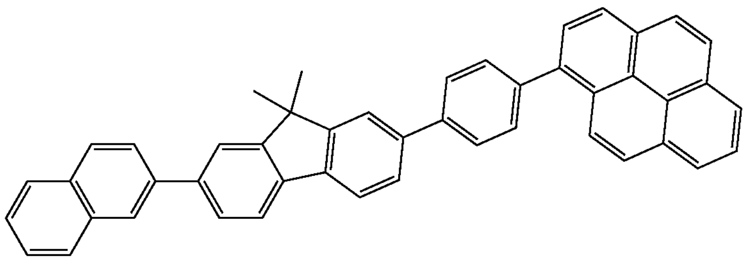
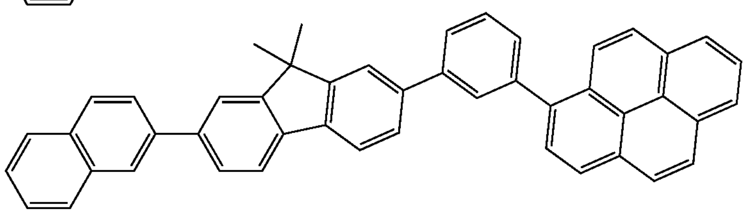
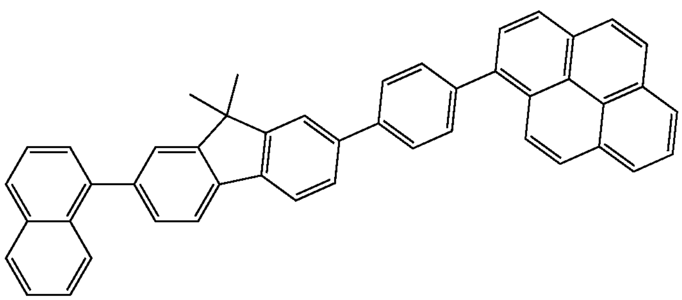
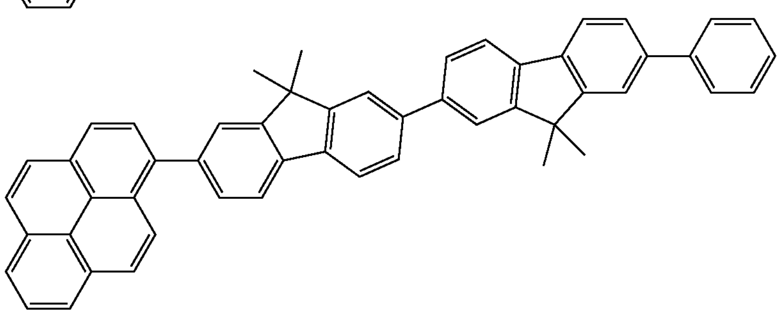
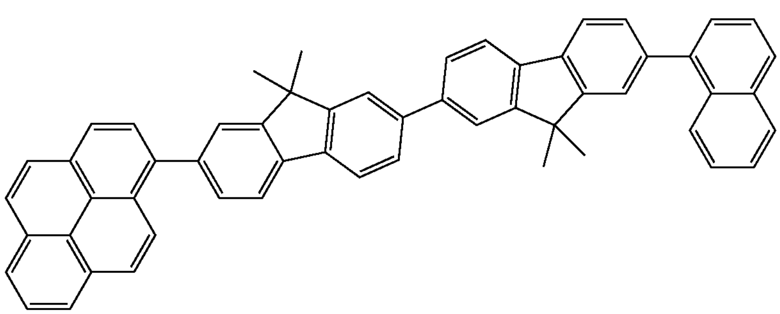

-continued
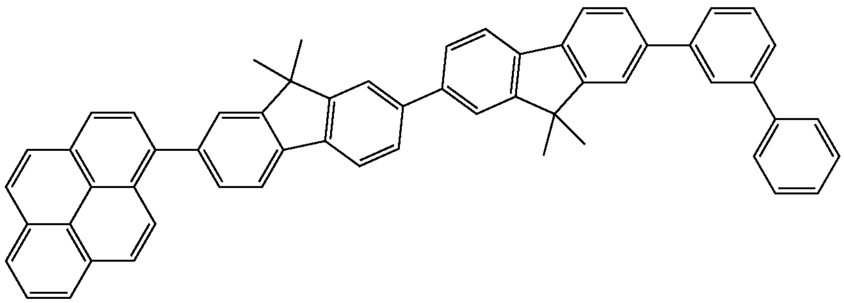
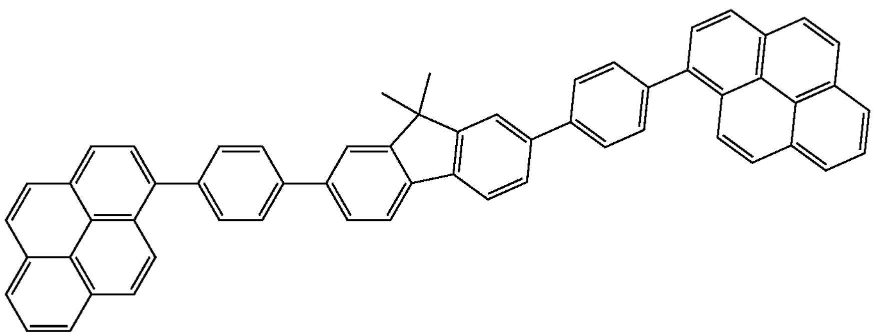
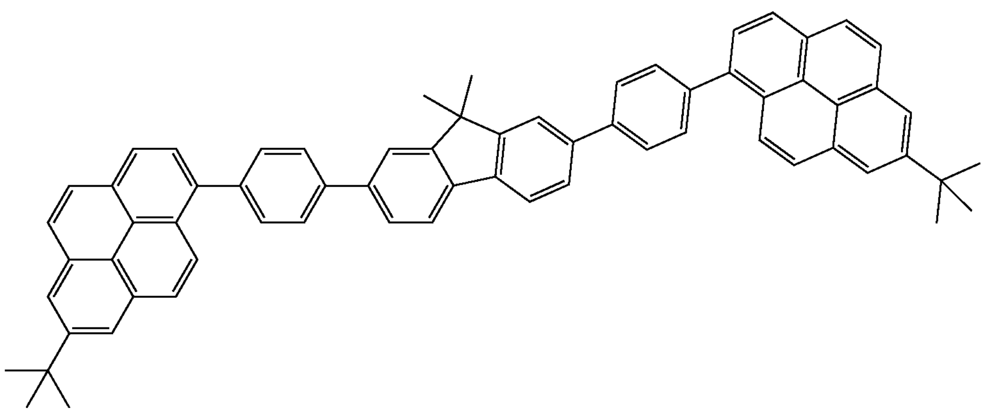
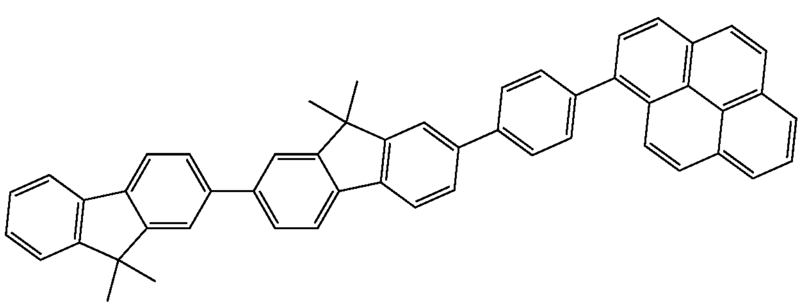 [SMILES: CC1(C)c2ccccc2-c2ccc(-c3ccc4c(c3)C(C)(C)c3cc(-c5ccc(-c6ccc7ccc8cccc9ccc6c7c89)cc5)ccc3-4)cc21]

[Formula 59]
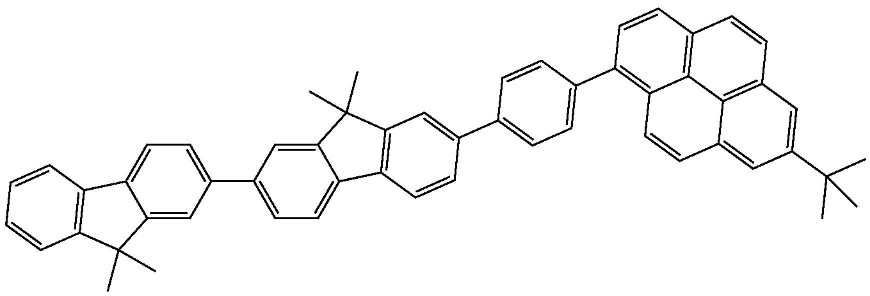
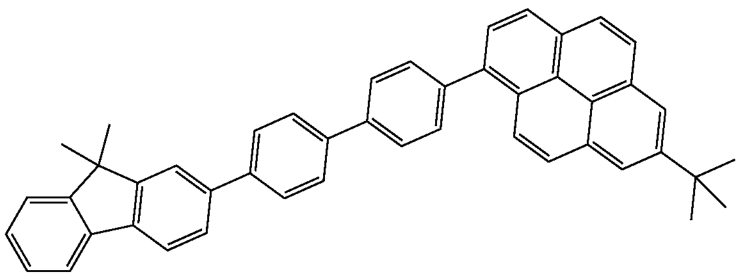
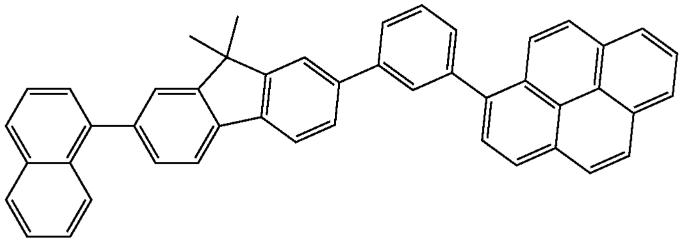
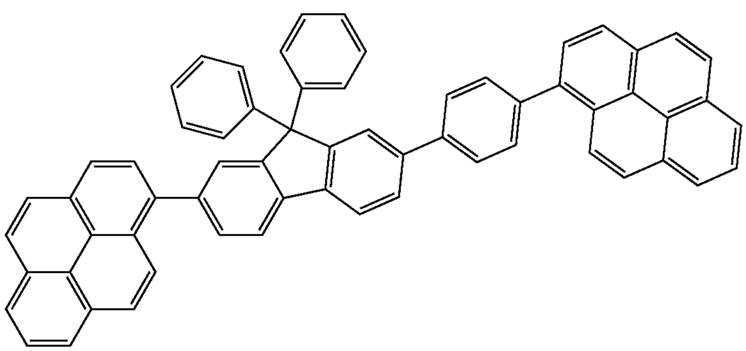
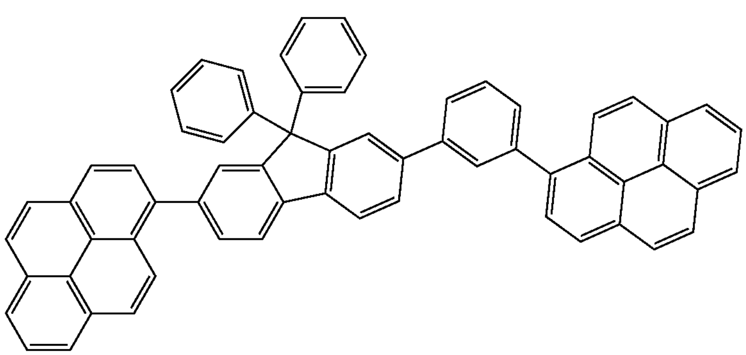

-continued
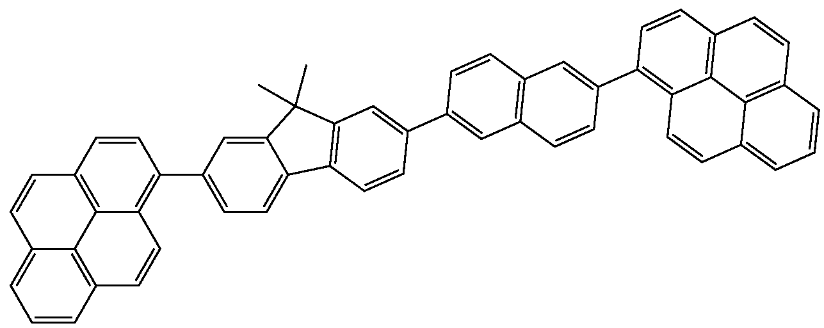
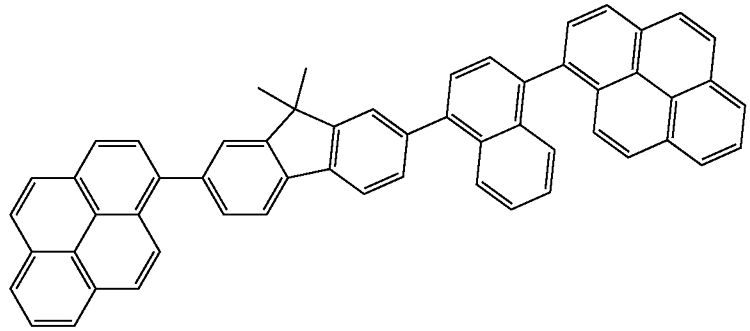
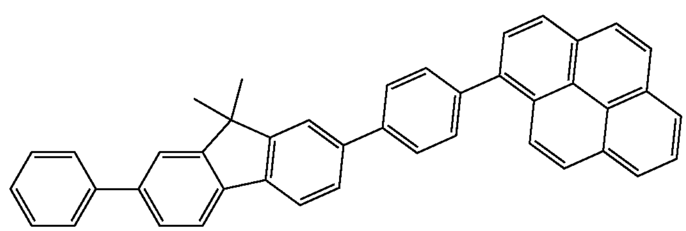
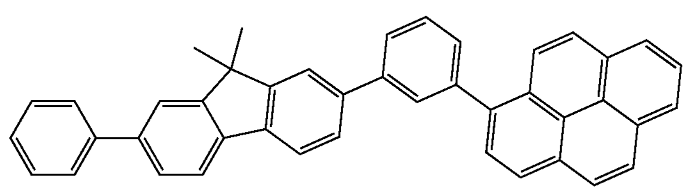
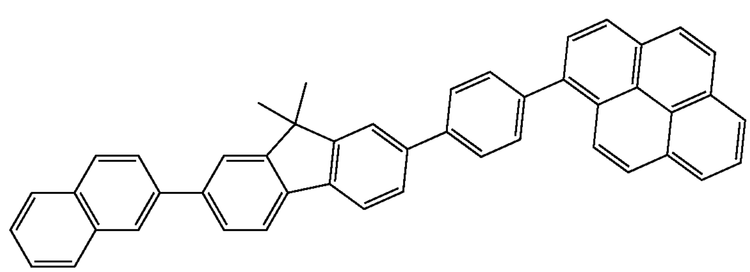
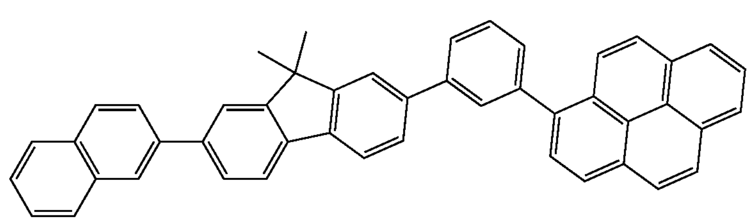

-continued
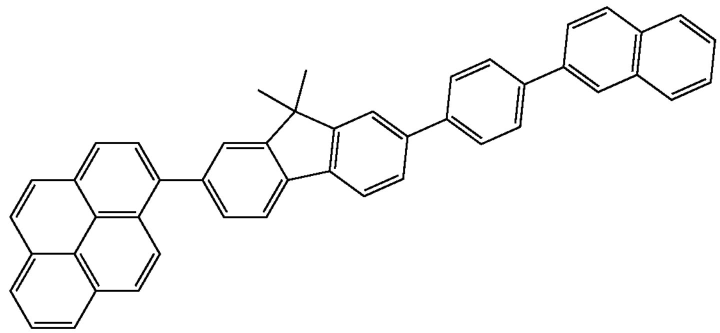
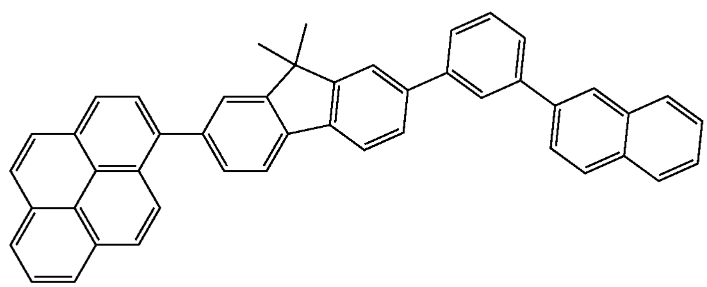
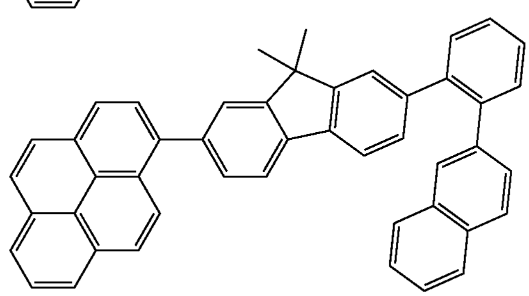
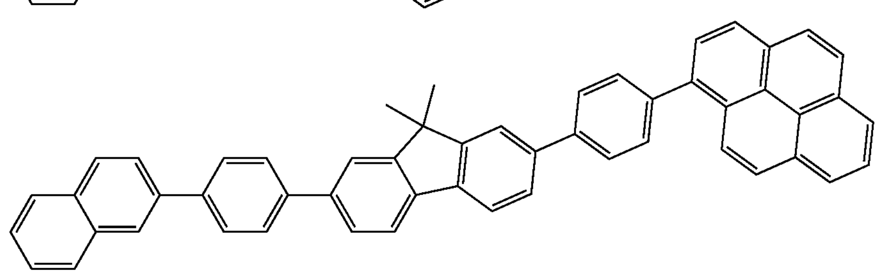
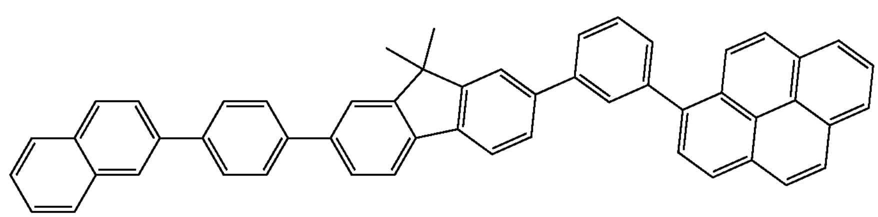
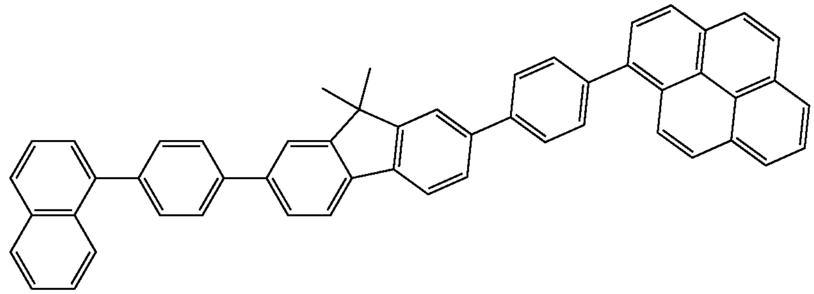

-continued
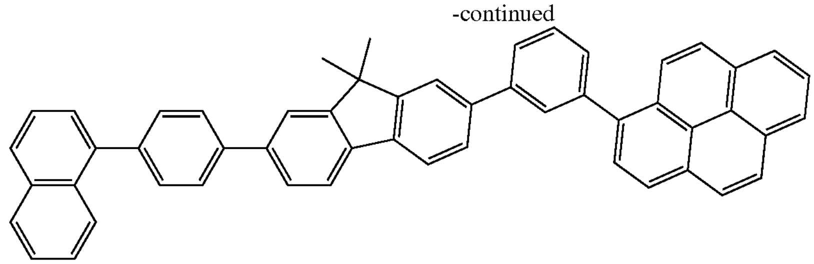
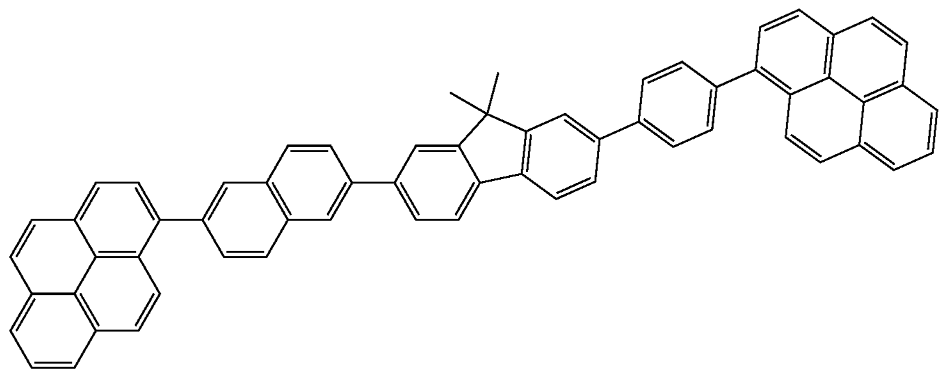
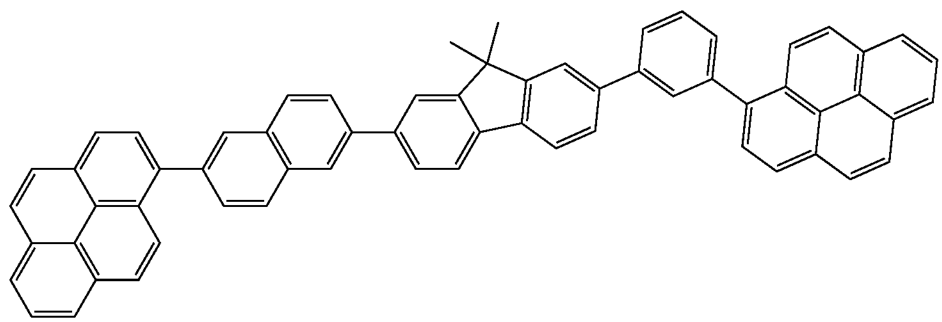
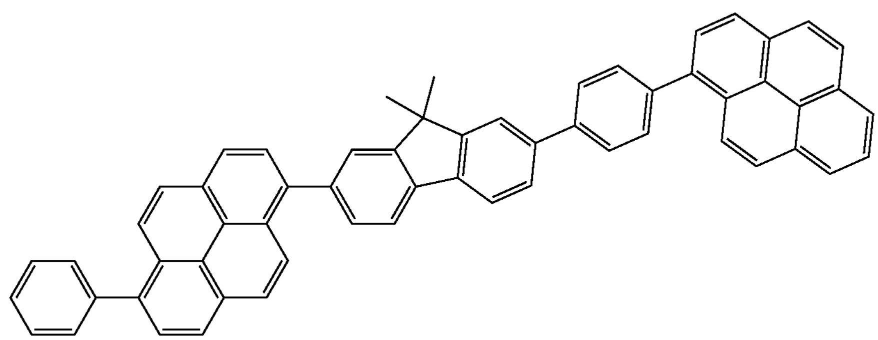
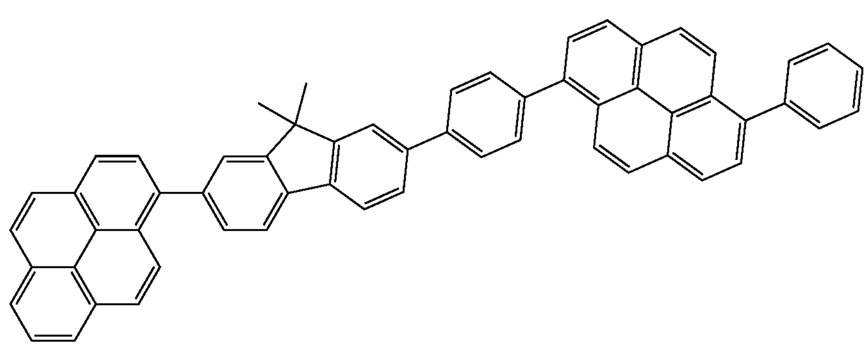

-continued
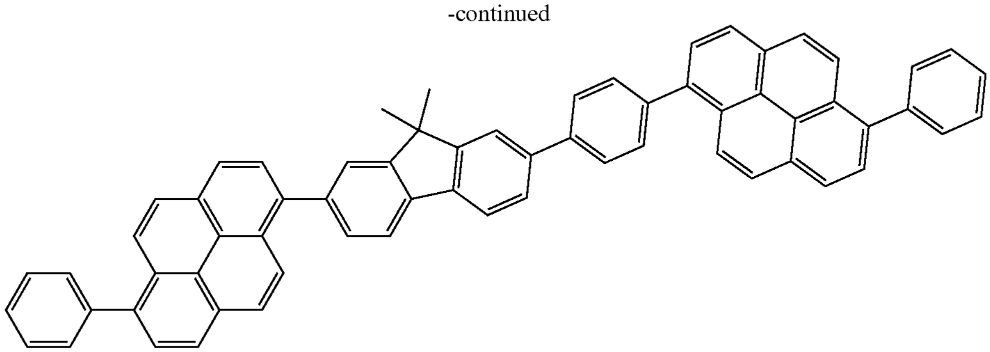
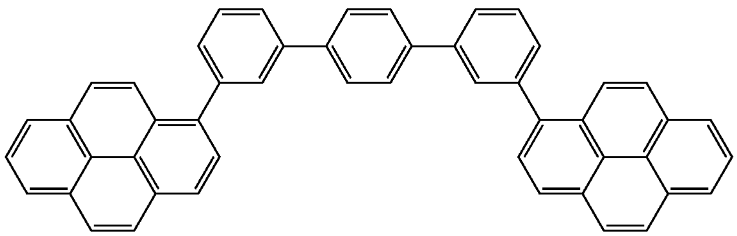
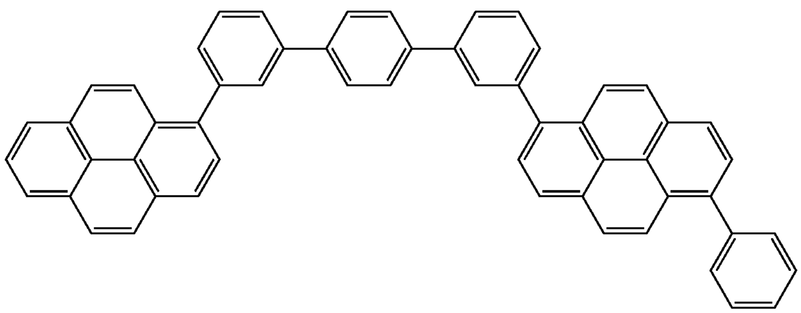
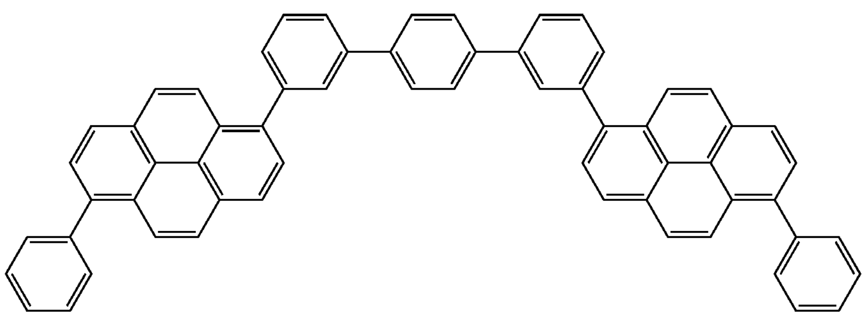
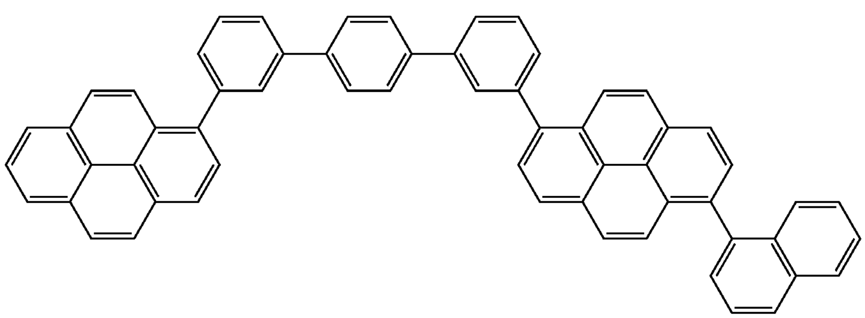

-continued
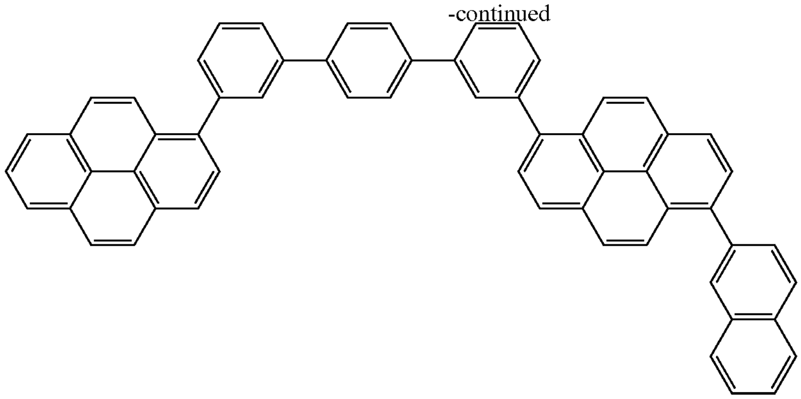
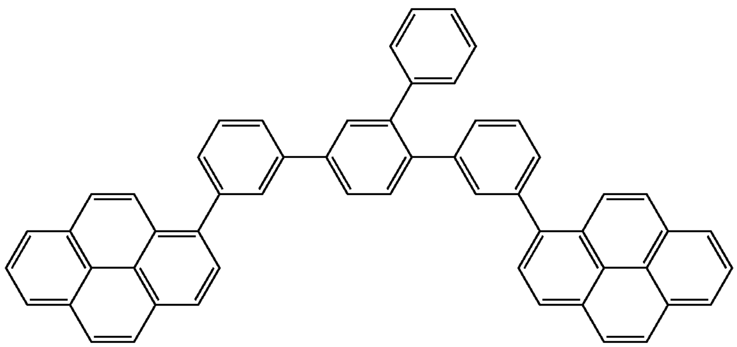
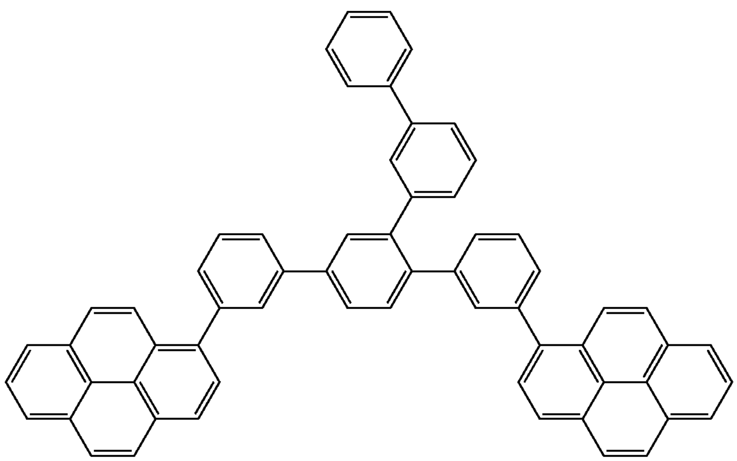
[Formula 60]
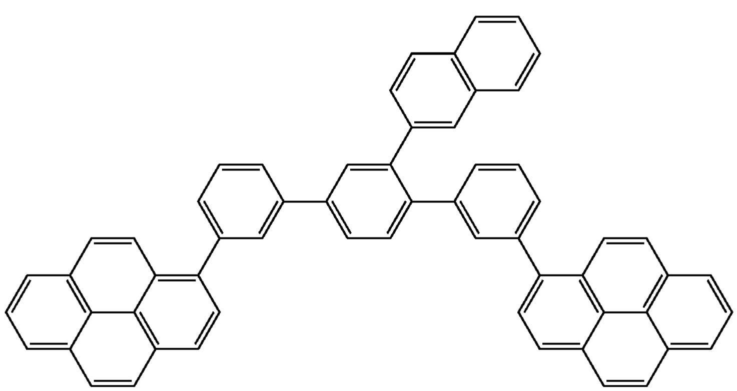

-continued
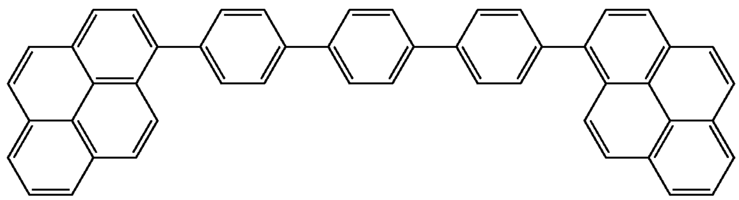
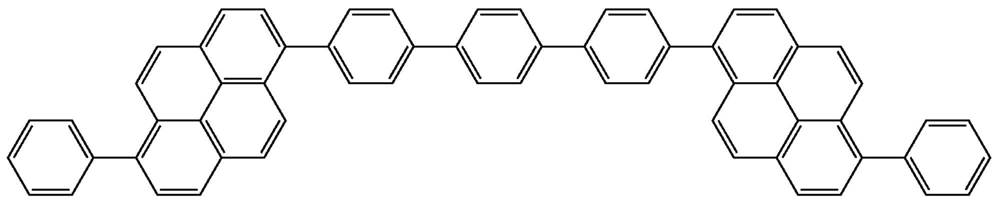
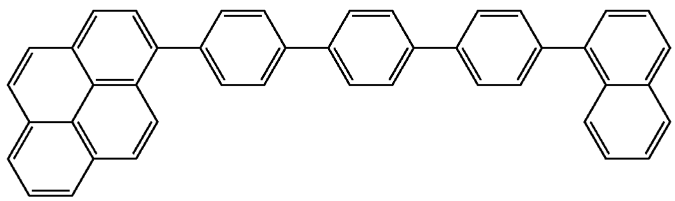
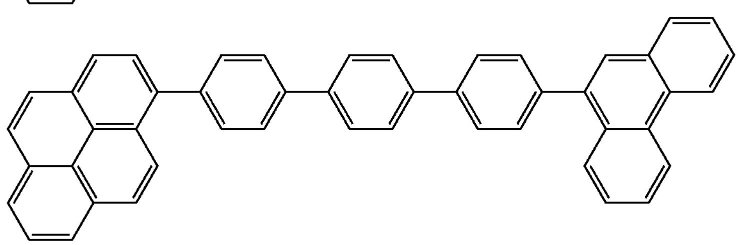
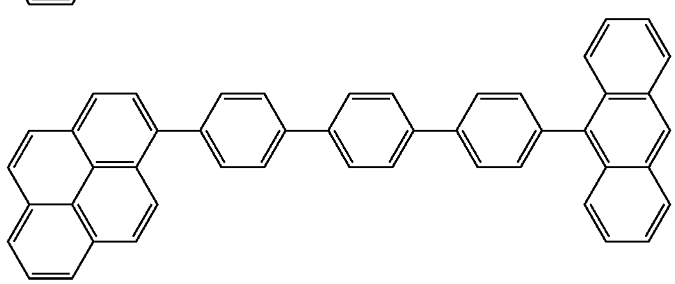
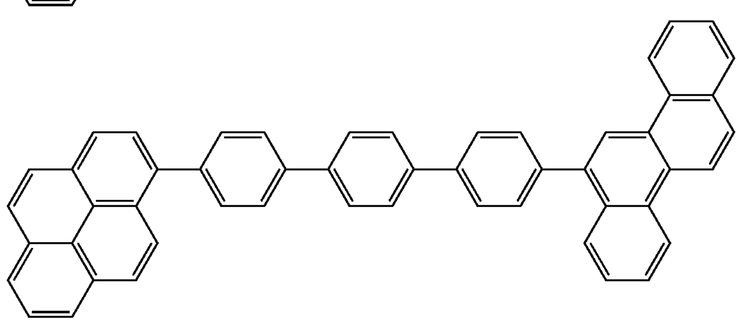
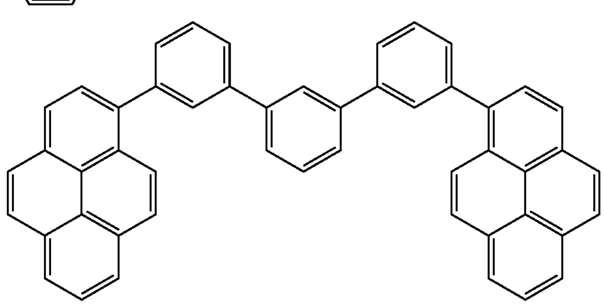

-continued
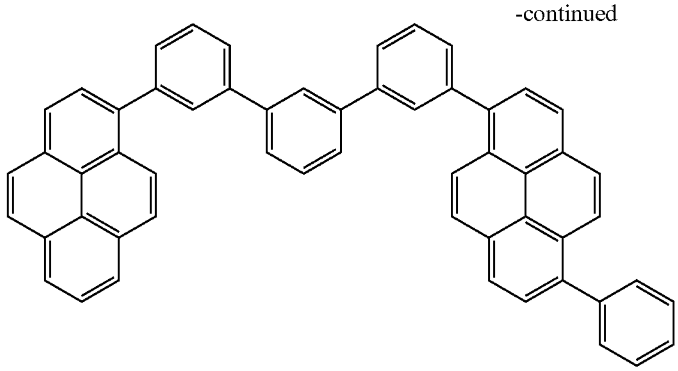
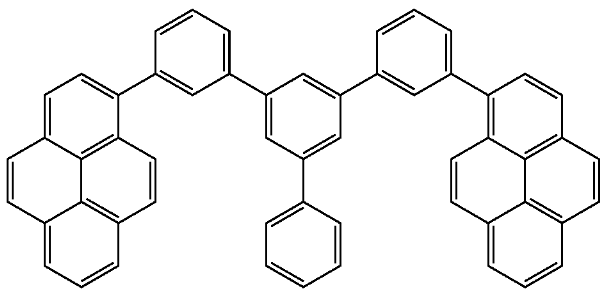
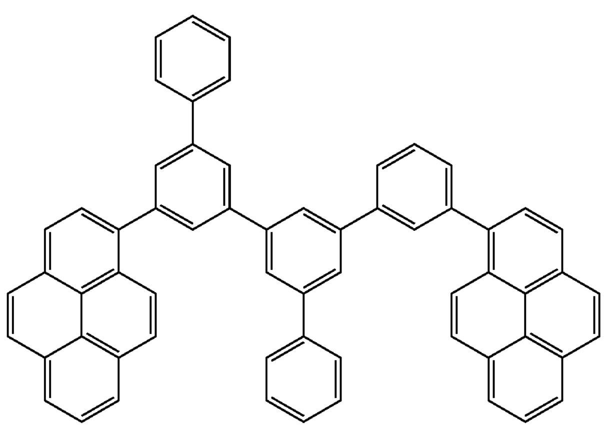
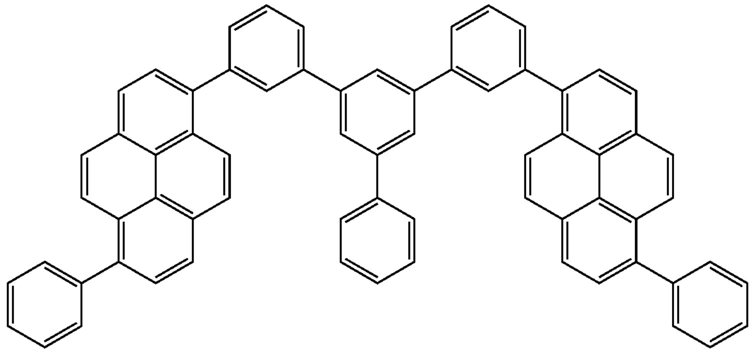

-continued
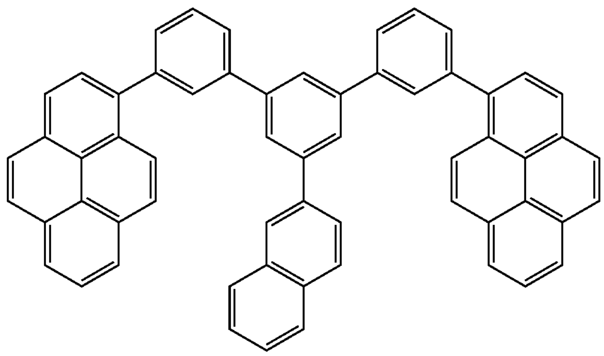
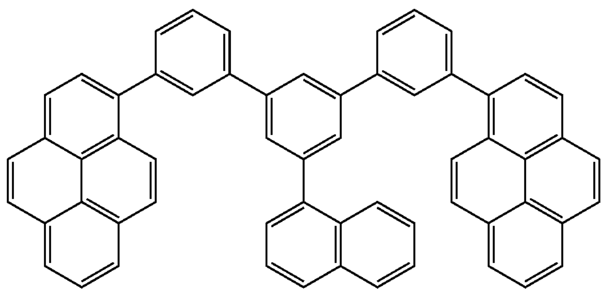
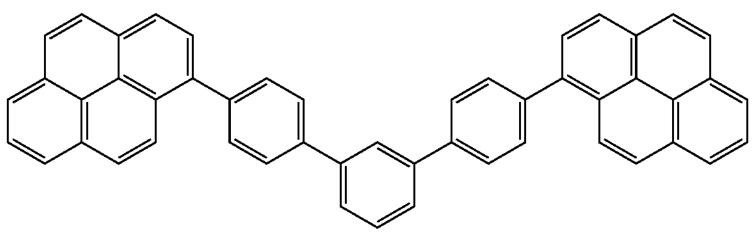
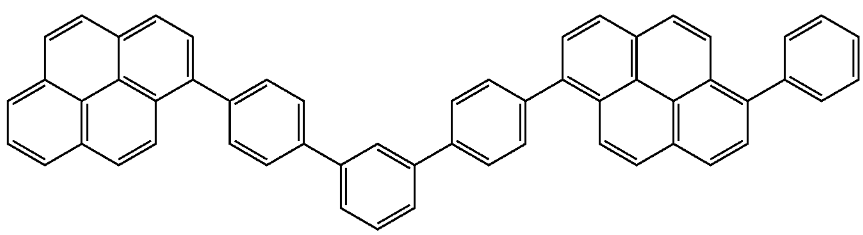
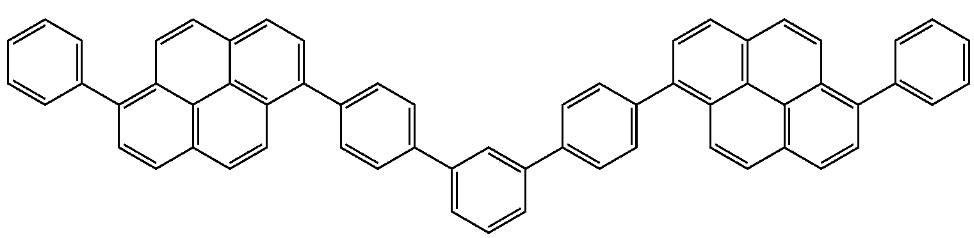
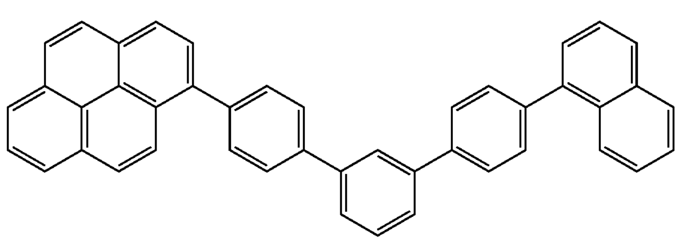

-continued
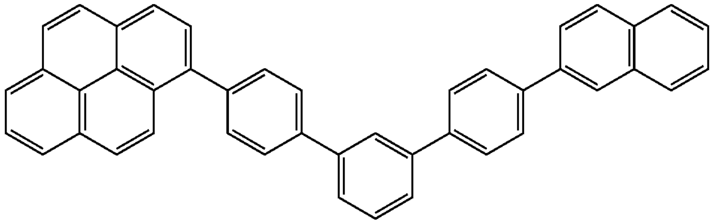
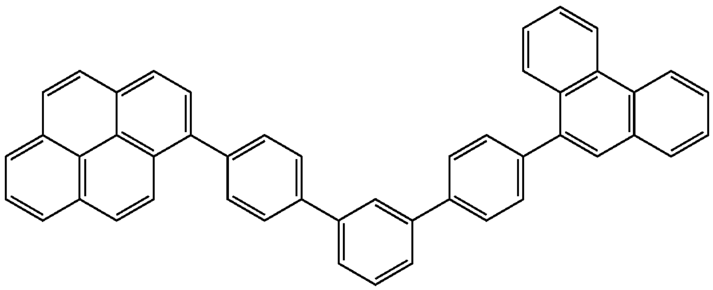
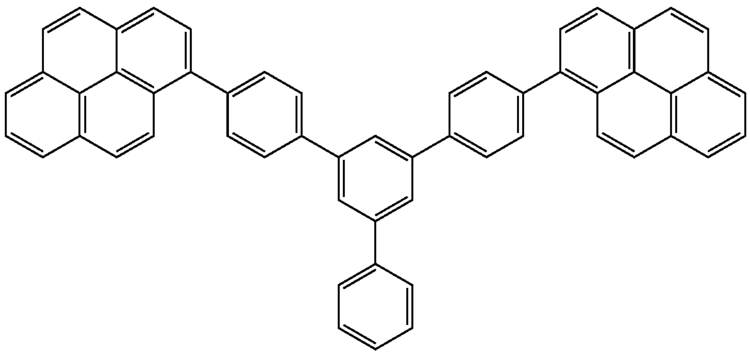
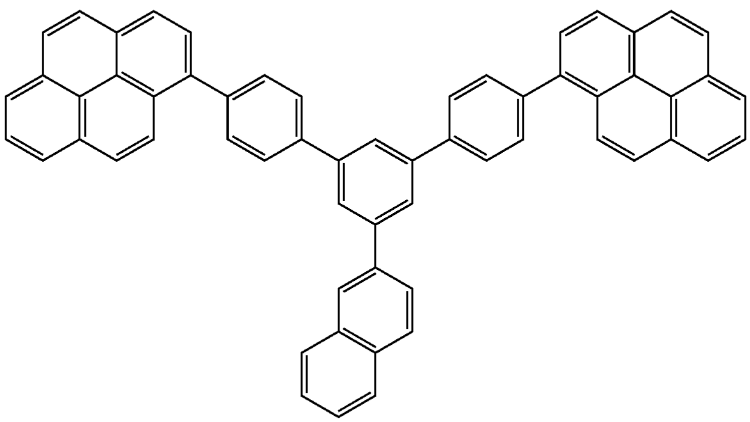
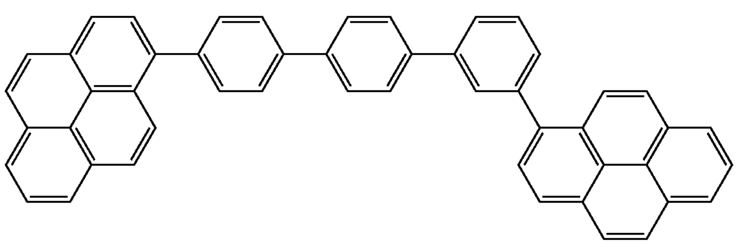
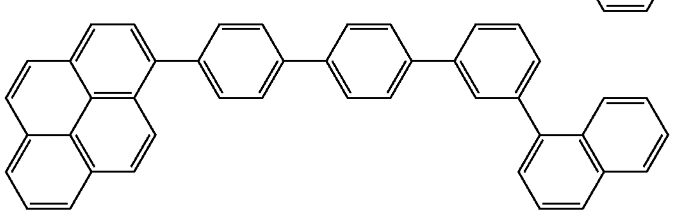

-continued
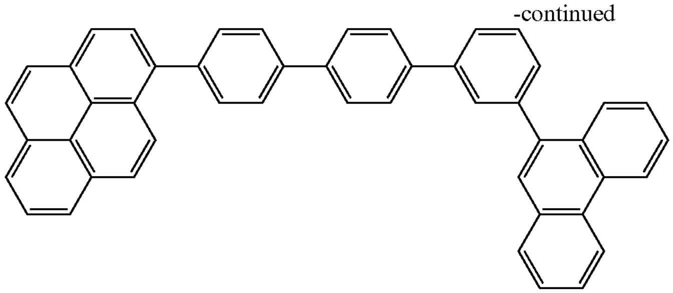
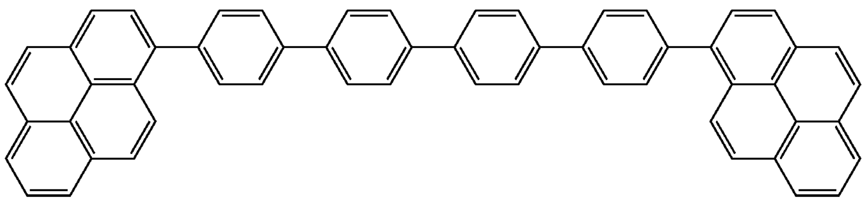
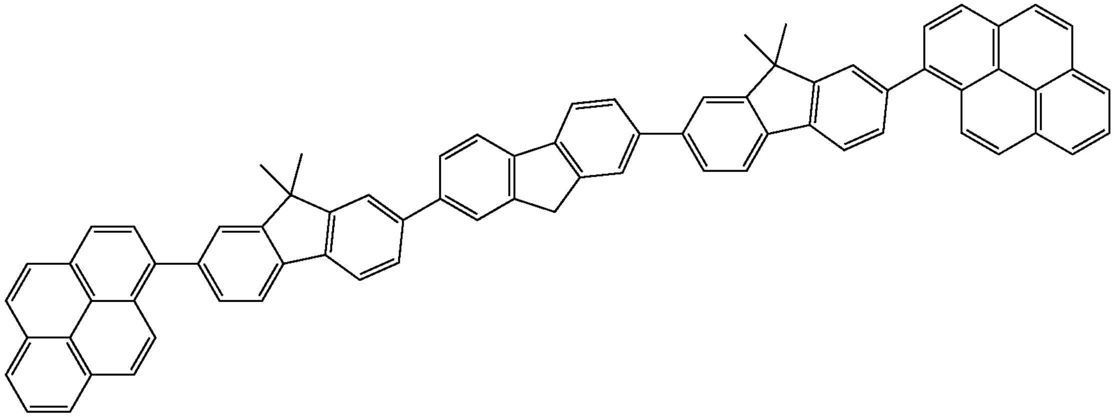
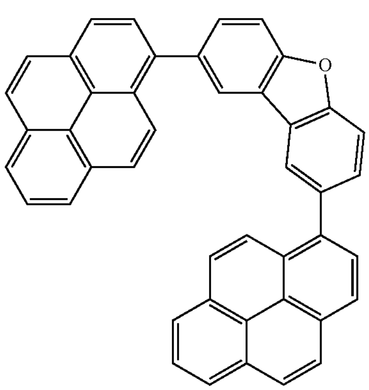
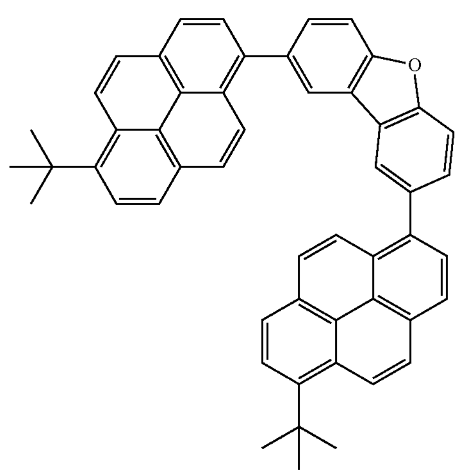

-continued
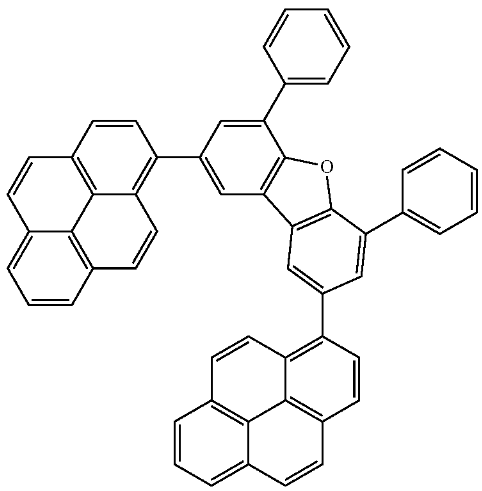
[Formula 61]
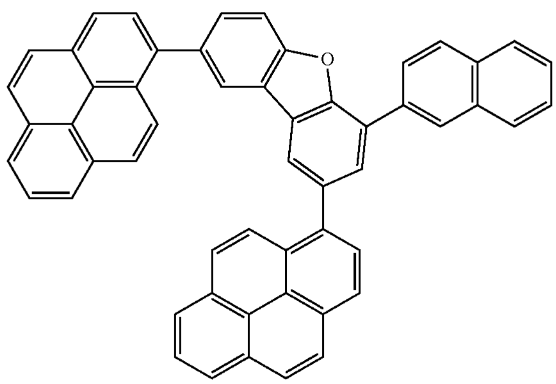
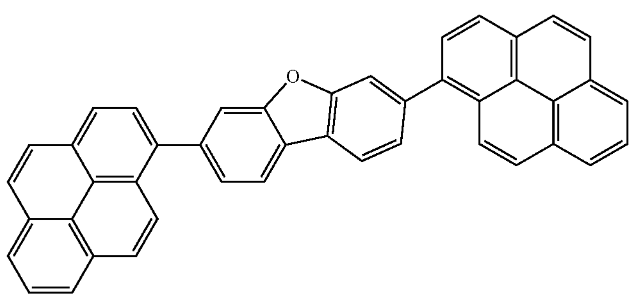
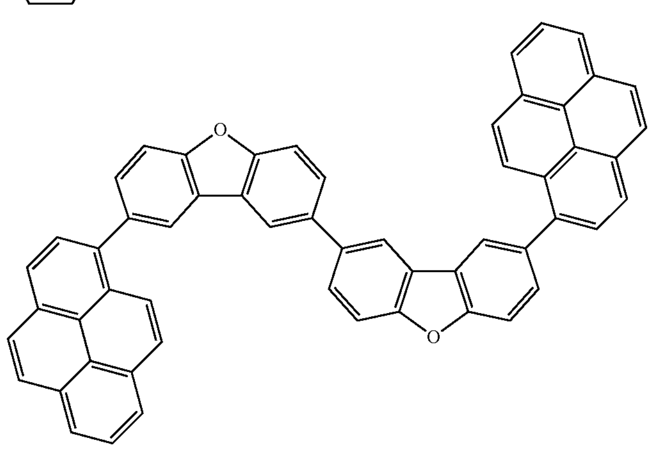
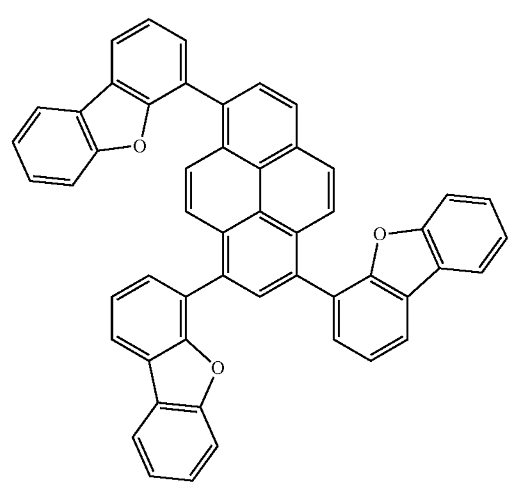

-continued
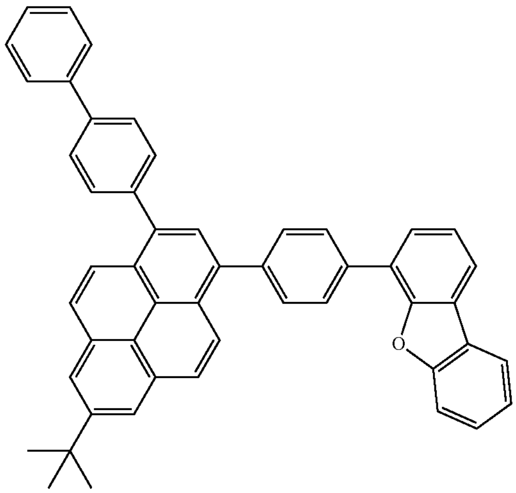
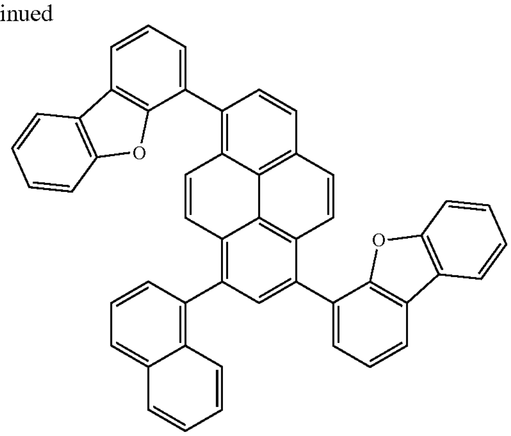
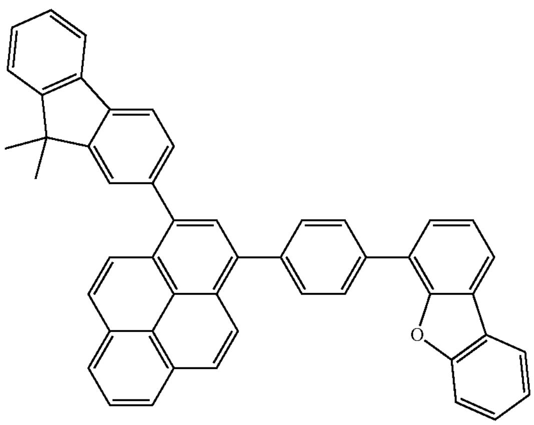
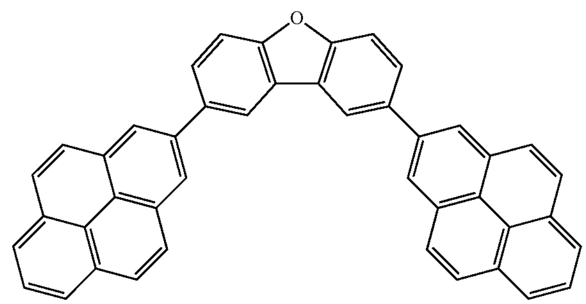
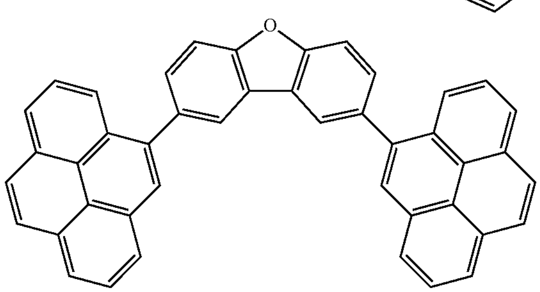
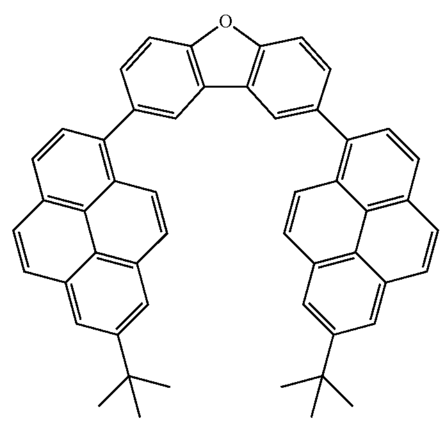
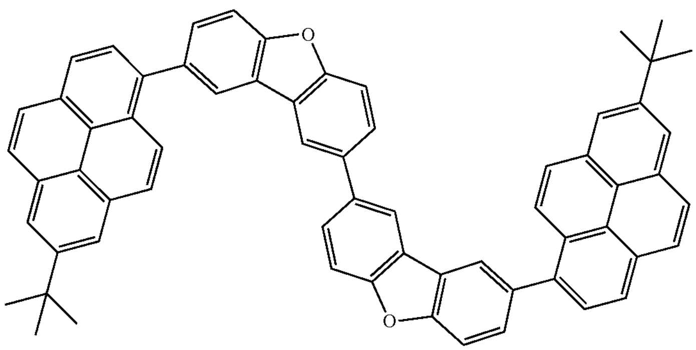

-continued
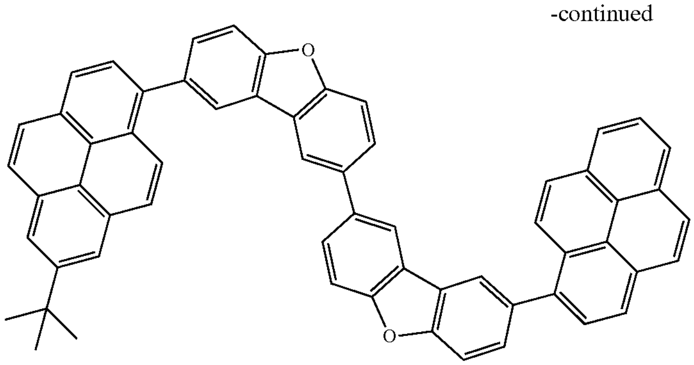
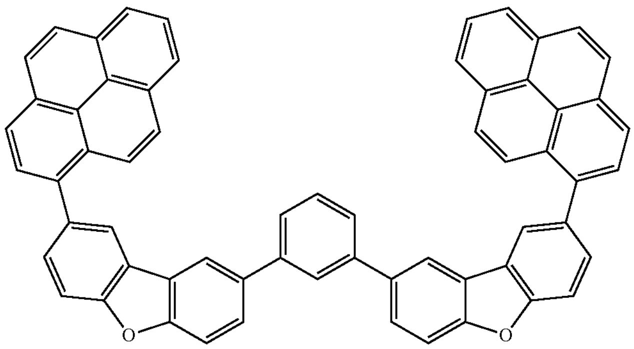
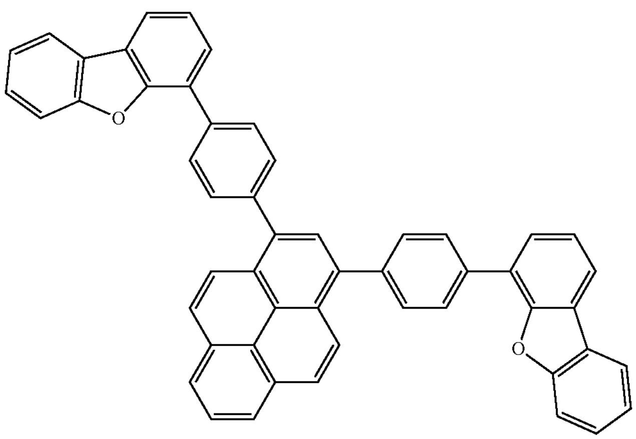
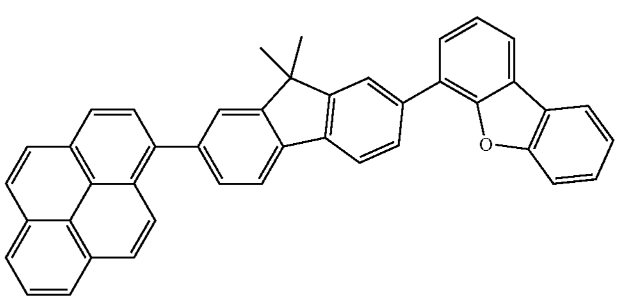
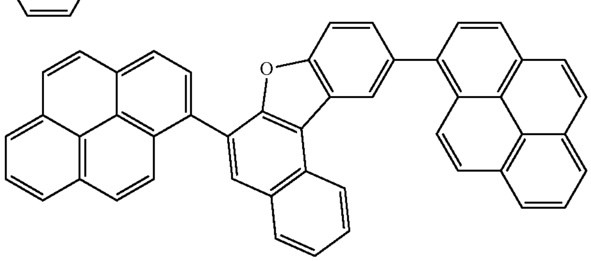

-continued
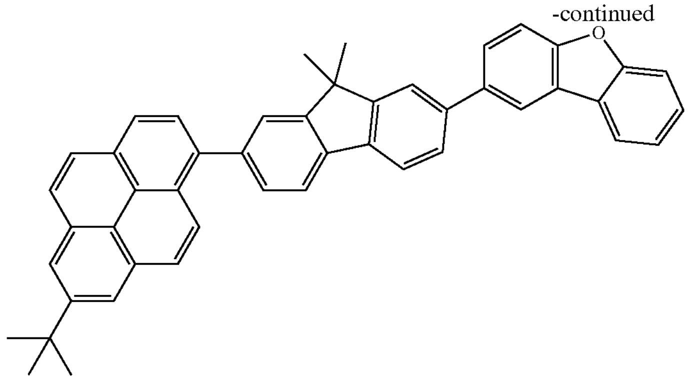
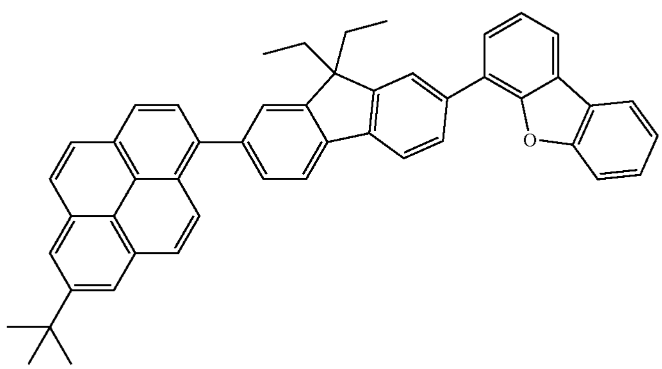
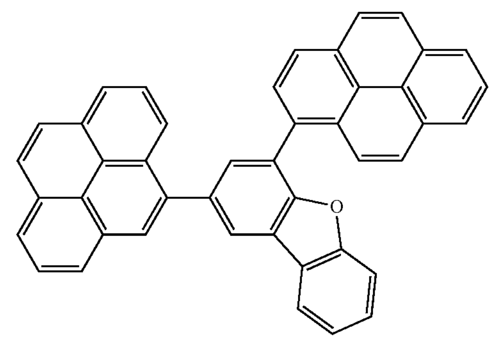
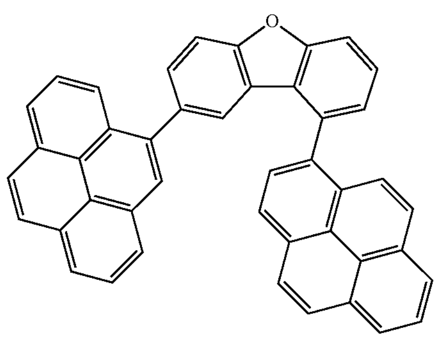
[Formula 62]
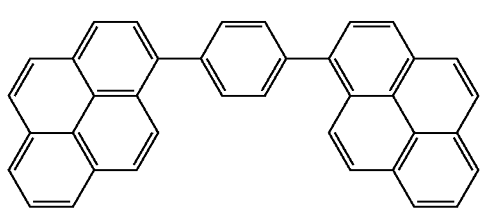
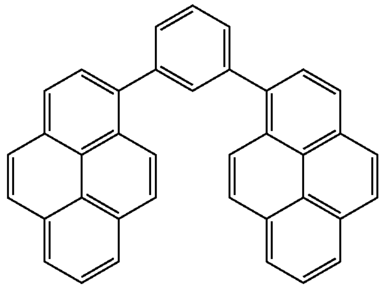
-continued
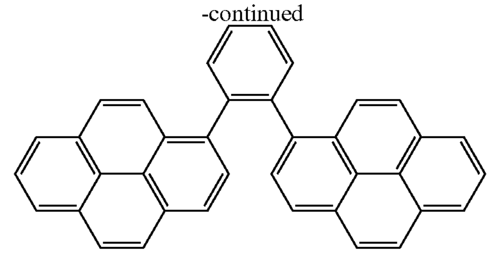
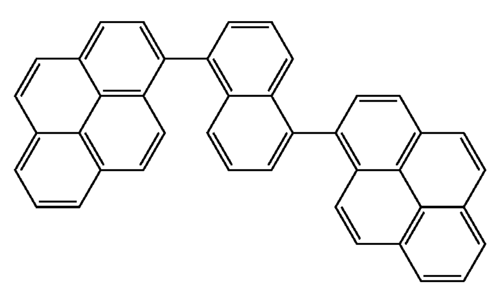

-continued
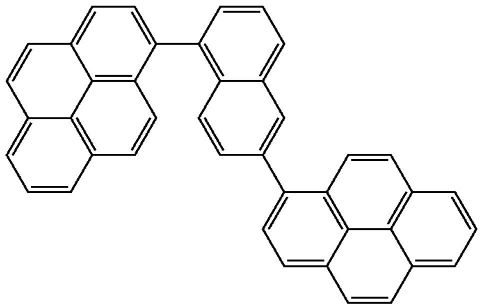
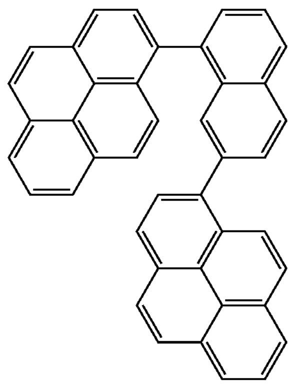
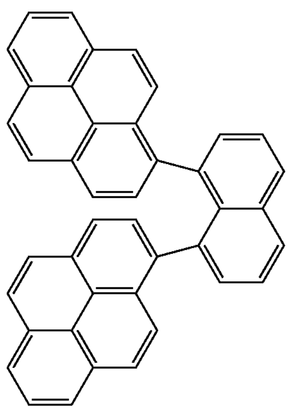
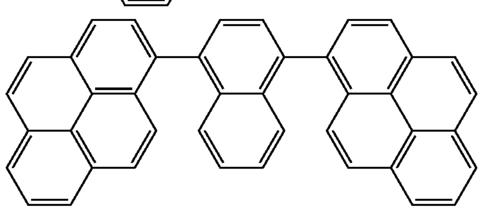
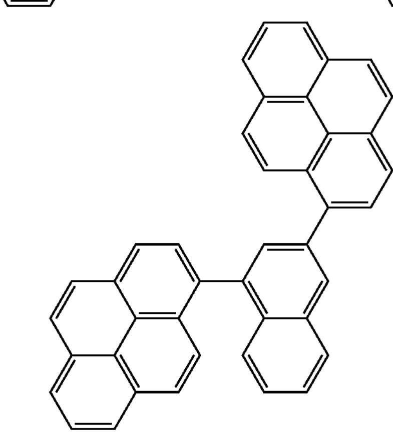
-continued
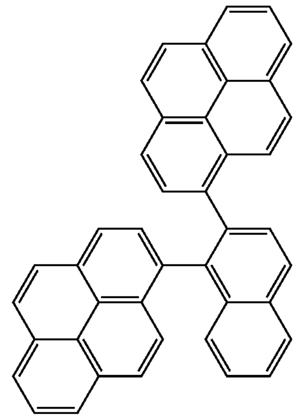
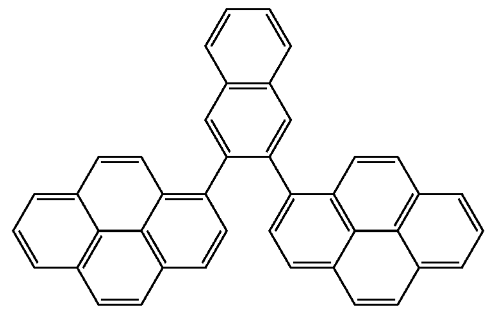
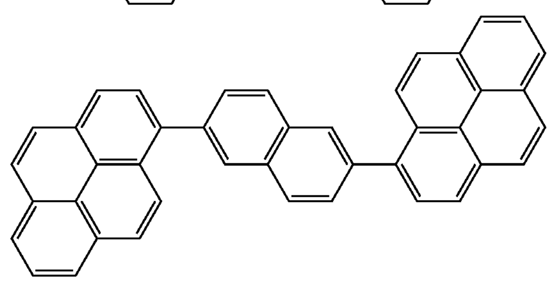
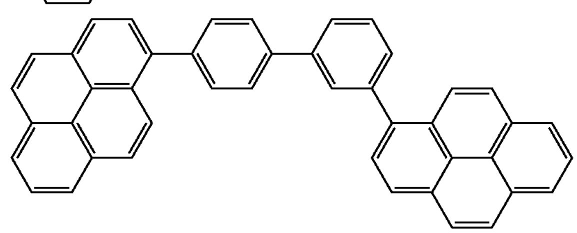
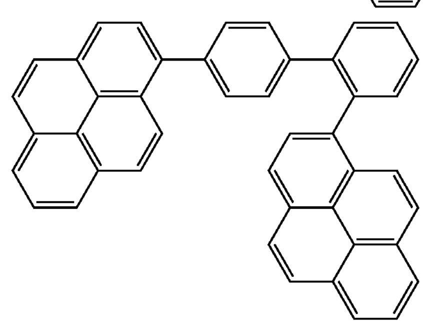
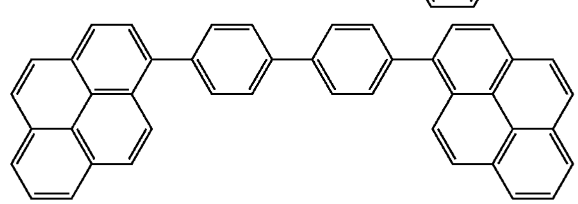

-continued
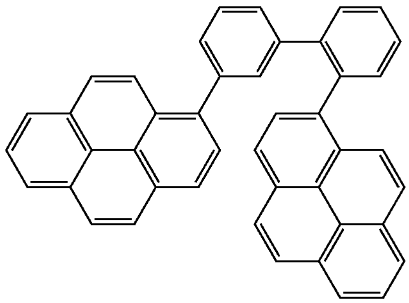
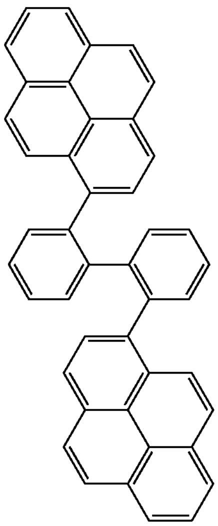
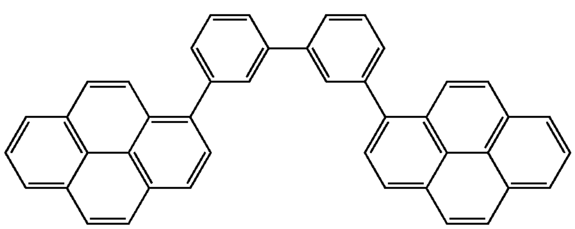
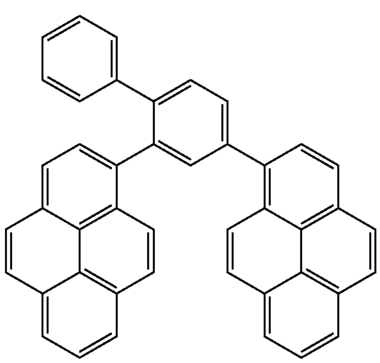
-continued
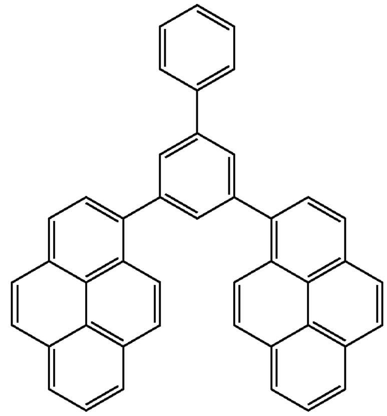
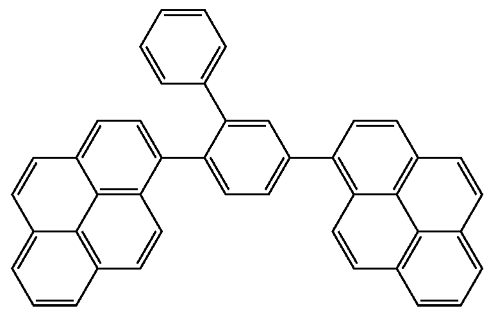
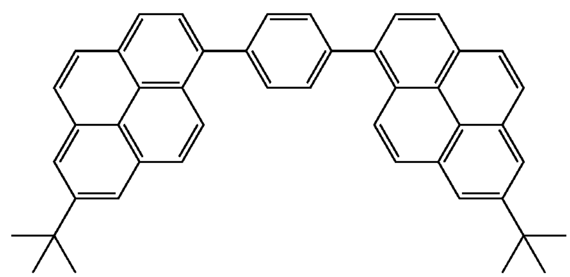
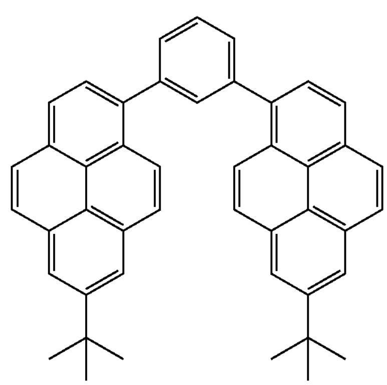

-continued
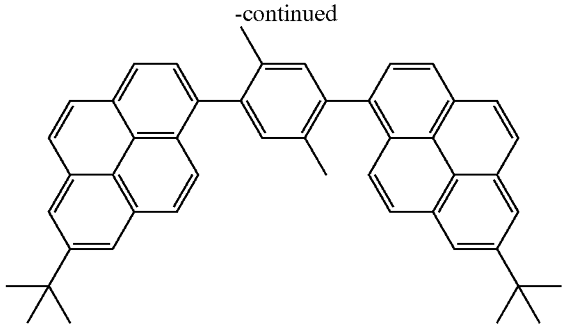
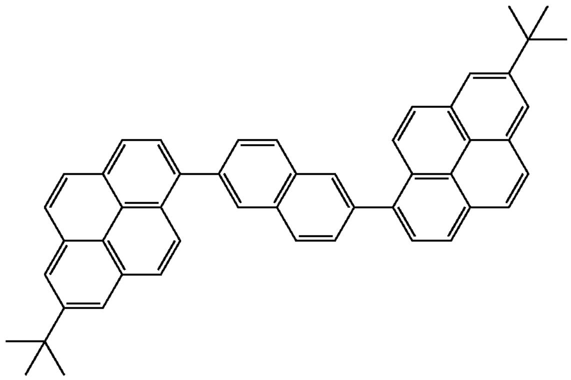
-continued
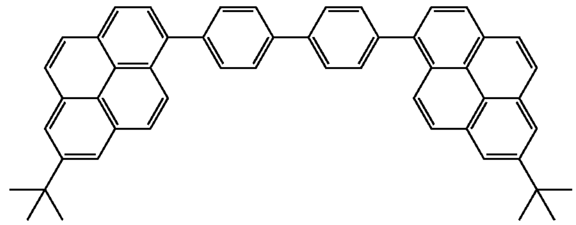
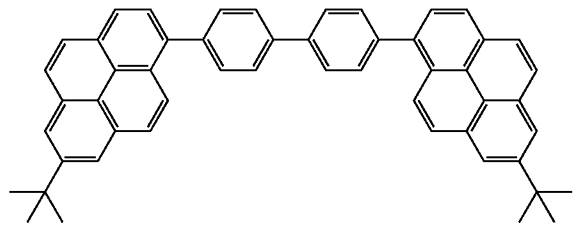
[Formula 63]
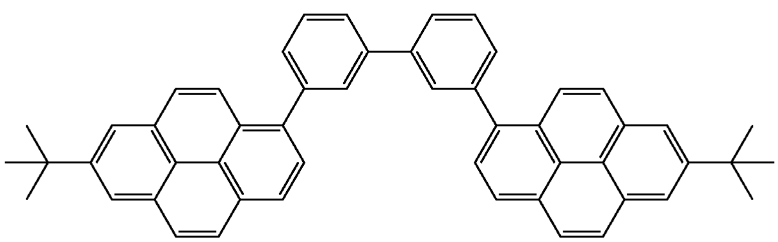
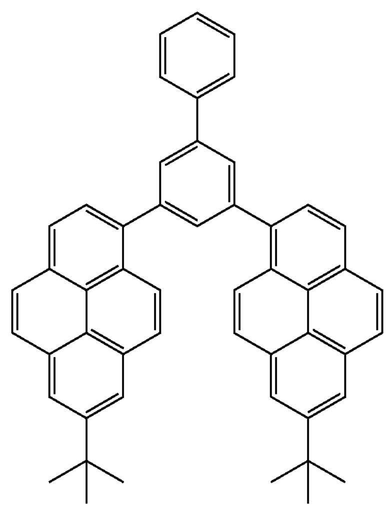
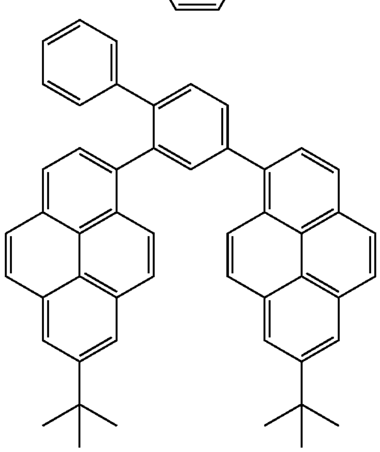
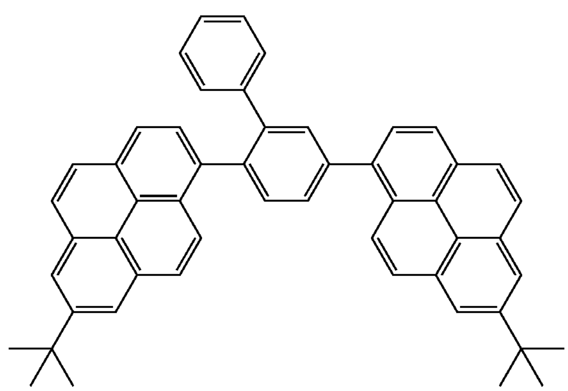

-continued
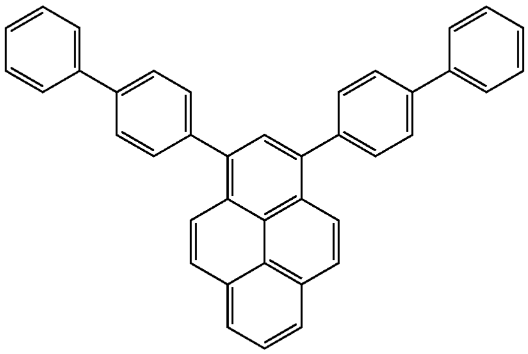
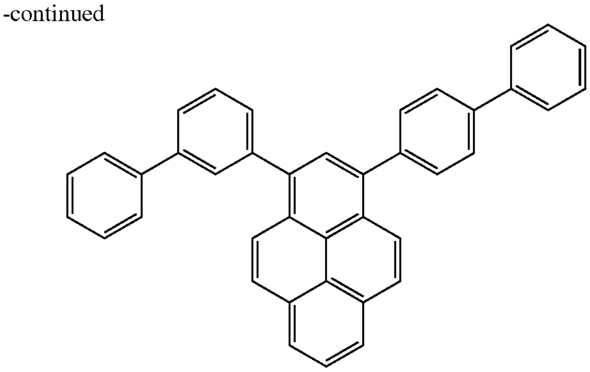
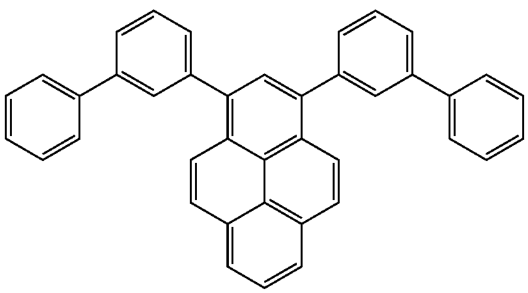
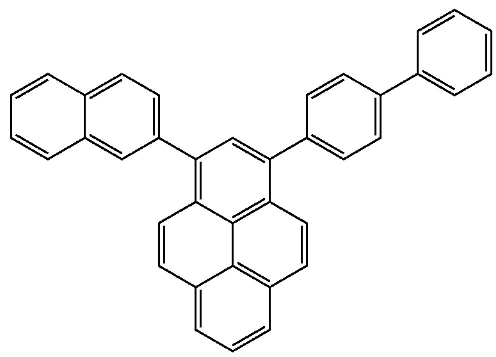
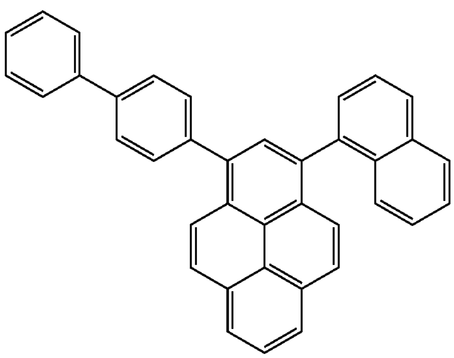
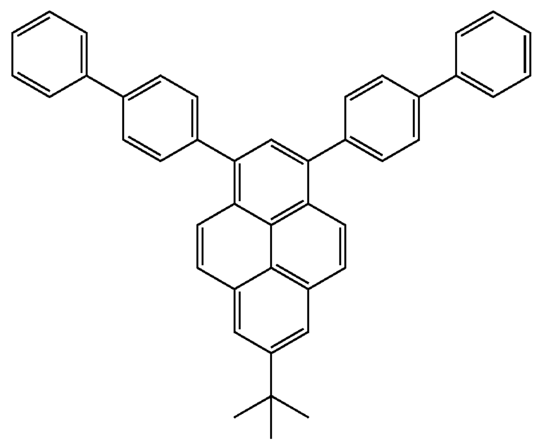
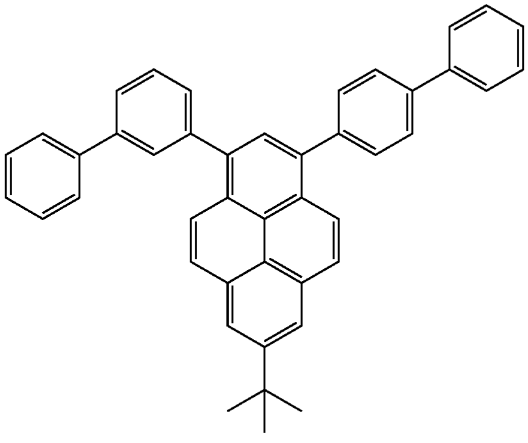
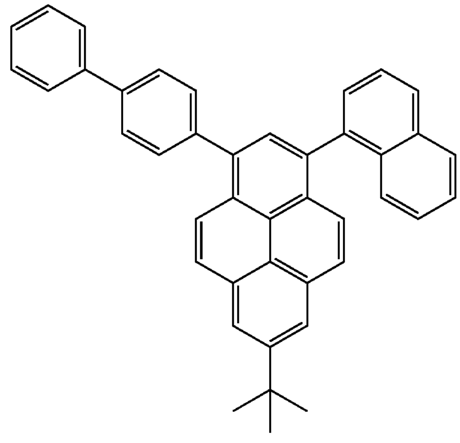

-continued

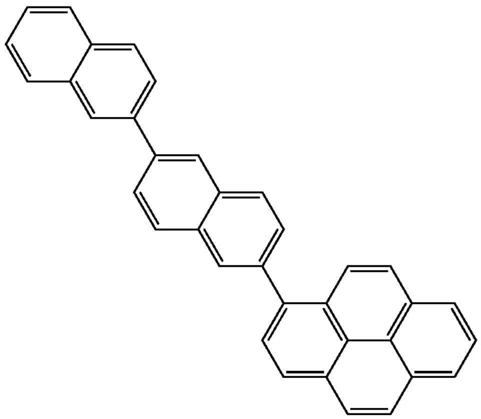

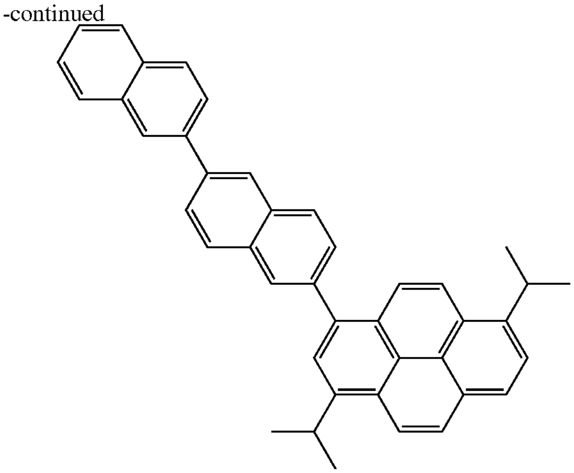

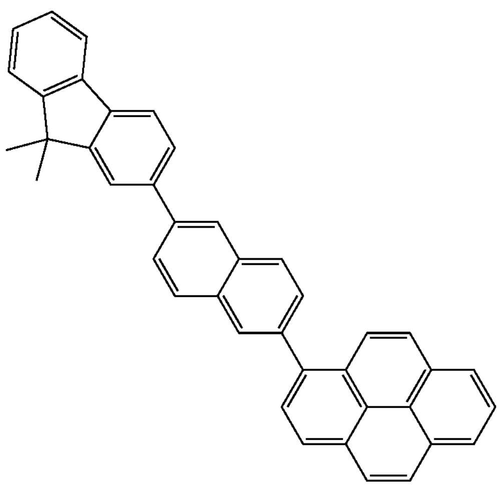

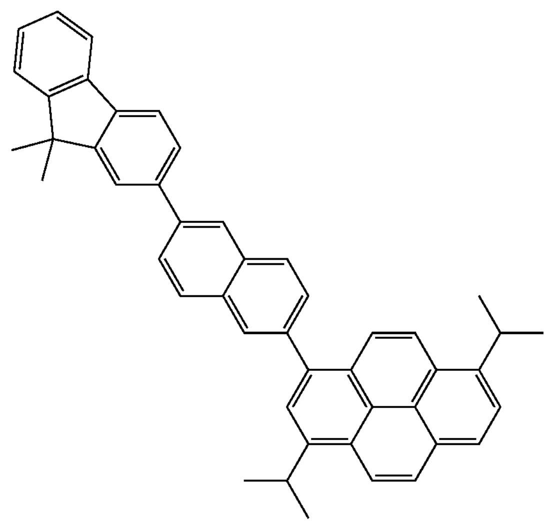

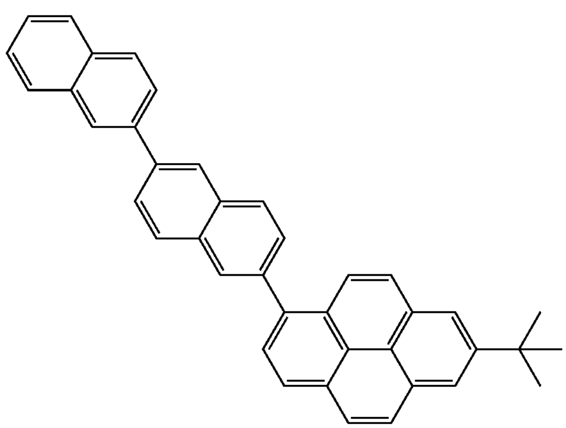

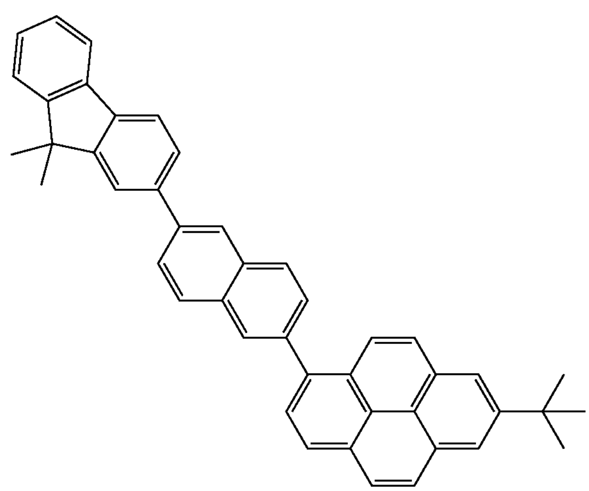

Second Emitting Layer

The second emitting layer and the first emitting layer are in direct contact with each other. The second emitting layer includes a second host material in a form of the second compound represented by the formula (2).

The second emitting layer preferably contains a compound that emits light having a maximum peak wavelength in a range from 430 nm to 480 nm.

It is preferable that the second emitting layer further contains a fourth compound that emits fluorescence.

The fourth compound is preferably a compound that emits light having a maximum peak wavelength in a range from 430 nm to 480 nm.

In the organic EL device according to the exemplary embodiment, when the second emitting layer contains the second compound and the fourth compound, the second compound is preferably a host material (occasionally also referred to as a matrix material) and the fourth compound is preferably a dopant material (occasionally also referred to as a guest material, emitter or a luminescent material).

It is preferable that the second emitting layer does not contain a phosphorescent material as a dopant material.

It is preferable that the second emitting layer does not contain a heavy-metal complex and a phosphorescent rare-earth metal complex. Examples of the heavy metal complex herein include iridium complex, osmium complex, and platinum complex.

It is also preferable that the second emitting layer does not contain a metal complex.

Second Compound

The second compound represented by the formula (2) according to the exemplary embodiment will be described below.

[Formula 64]

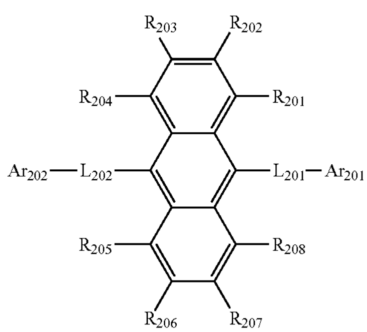

(2)

In the formula (2): $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the exemplary embodiment, $R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, $R_{201}$ to $R_{208}$ are preferably each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —C(═O)$R_{801}$, a group represented by —$COOR_{802}$, a halogen atom, a cyano group, or a nitro group;

$L_{201}$ and $L_{202}$ are preferably each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are preferably each independently a substituted or unsubstituted aryl group having 6 to 50 ring carbon atoms, or a substituted or unsubstituted heterocyclic group having 5 to 50 ring atoms.

In the organic EL device according to the exemplary embodiment, $L_{201}$ and $L_{202}$ are preferably each independently a single bond, or a substituted or unsubstituted arylene group having 6 to 50 ring carbon atoms; and $Ar_{201}$ and $Ar_{202}$ are preferably each independently a substituted or unsubstituted aryl group having 6 to 50 ring carbon atoms.

In the organic EL device according to the exemplary embodiment, $Ar_{201}$ and $Ar_{202}$ are preferably each independently a phenyl group, a naphthyl group, phenanthryl group, a biphenyl group, a terphenyl group, a diphenylfluorenyl group, a dimethylfluorenyl group, a benzodiphenylfluorenyl group, a benzodimethylfluorenyl group, a dibenzofuranyl group, a dibenzothienyl group, a naphthobenzofuranyl group, or a naphthobenzothienyl group.

In the organic EL device according to the exemplary embodiment, the second compound represented by the formula (2) is preferably a compound represented by a formula (201), a formula (202), a formula (203), a formula (204), a formula (205), a formula (206), a formula (207), a formula (208), a formula (209), or a formula (210) below.
[Formula 65]
(201)
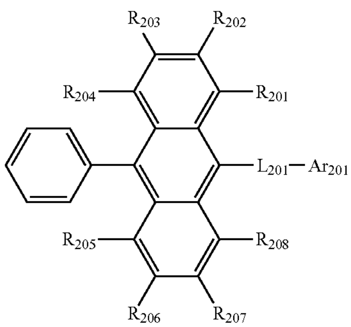
[Formula 66]
(202)
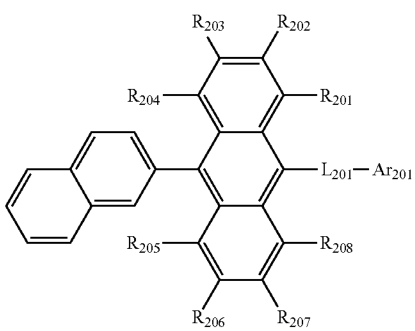
[Formula 67]
(203)
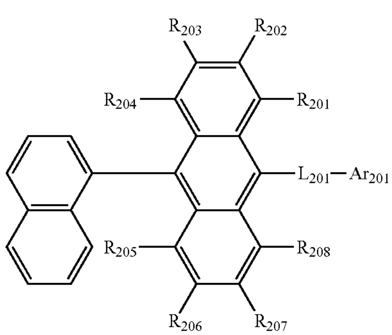
[Formula 68]
(204)
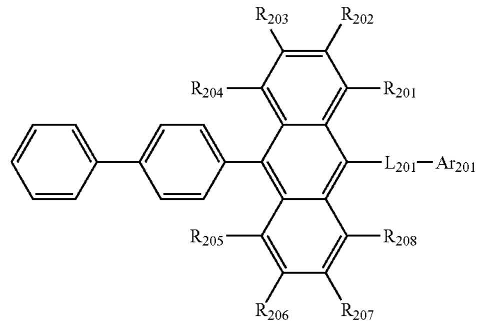
[Formula 69]
(205)
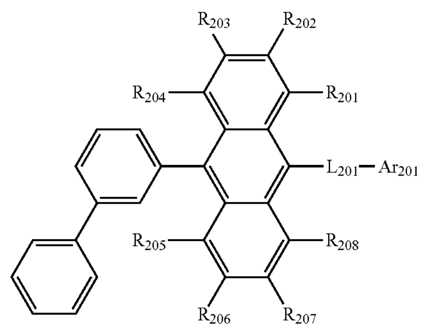
[Formula 70]
(206)
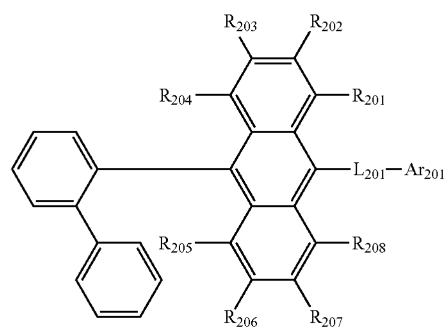
[Formula 71]
(207)
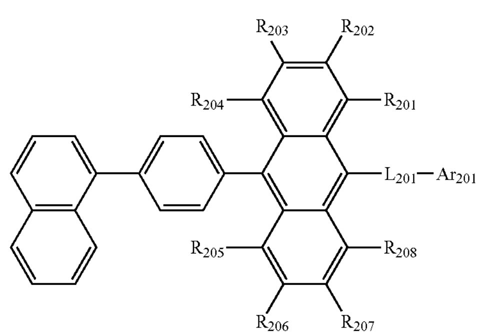

[Formula 72]

(208)

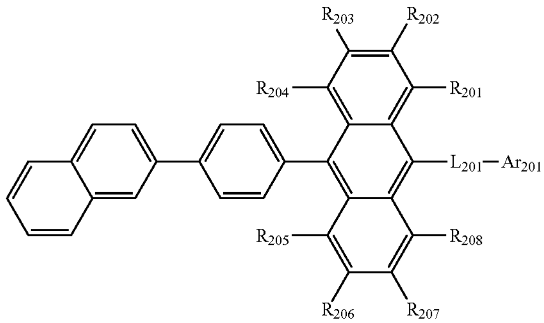

[Formula 73]

(209)

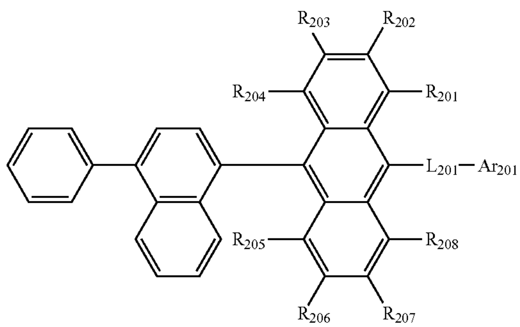

[Formula 74]

(210)

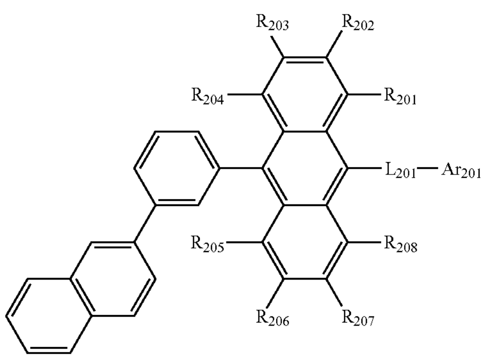

In the formulae (201) to (210): $L_{201}$ and Arm represent the same as $L_{201}$ and Arm in the formula (2); and $R_{201}$ to $R_{208}$ each independently represent the same as $R_{201}$ to $R_{208}$ in the formula (2).

It is also preferable that the second compound represented by the formula (2) is a compound represented by a formula (221), a formula (222), a formula (223), a formula (224), a formula (225), a formula (226), a formula (227), a formula (228), or a formula (229) below.

[Formula 75]

(221)

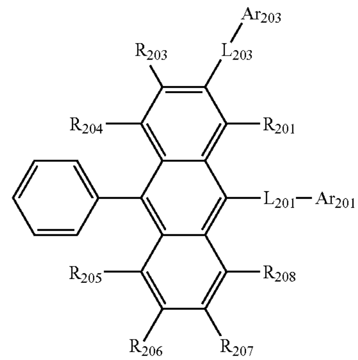

[Formula 76]

(222)

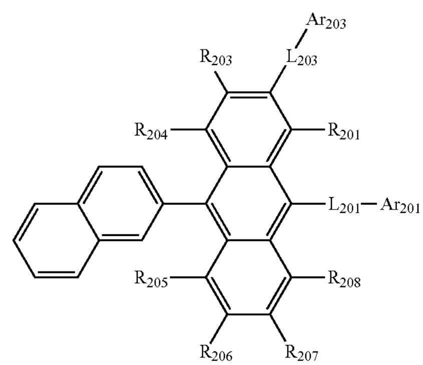

[Formula 77]

(223)

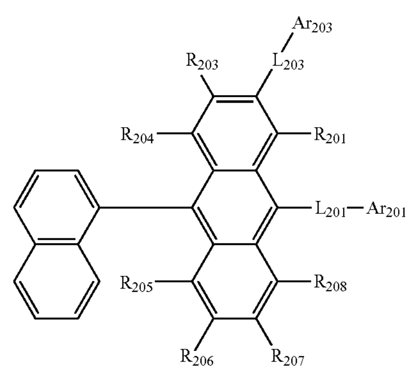

[Formula 78]

(224)

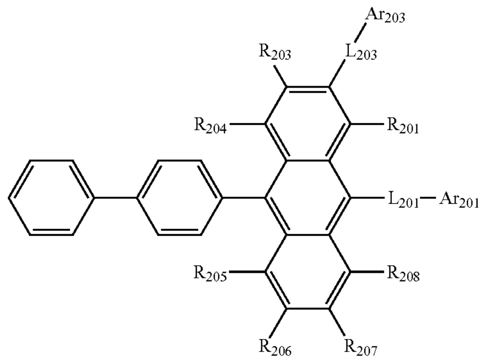

[Formula 79]

(225)

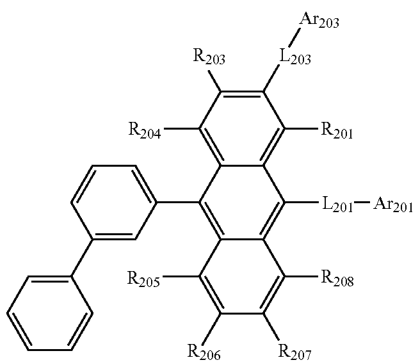

[Formula 80]

(226)

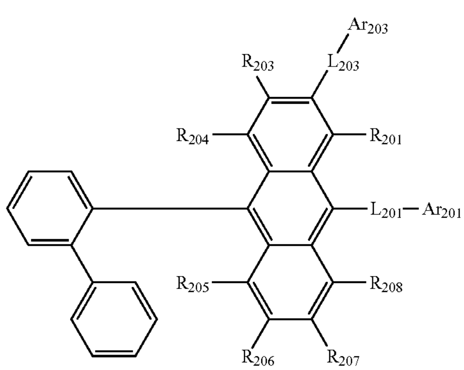

[Formula 81]

(227)

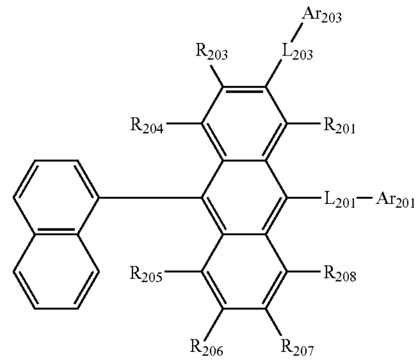

[Formula 82]

(228)

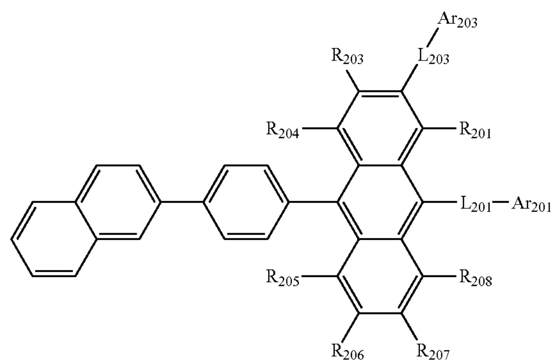

[Formula 83]

(229)

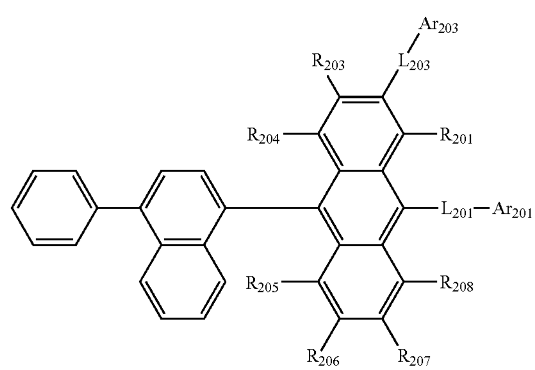

In the formulae (221), (222), (223), (224), (225), (226), (227), (228), and (229):

$R_{201}$ and $R_{203}$ to $R_{208}$ each independently represent the same as $R_{201}$ and $R_{203}$ to $R_{208}$ in the formula (2);

$L_{201}$ and Arm each represent the same as $L_{201}$ and Arm in the formula (2);

$L_{203}$ represents the same as $L_{201}$ in the formula (2);

$L_{203}$ and $L_{201}$ are mutually the same or different;

$Ar_{203}$ represents the same as Arm in the formula (2); and $Ar_{203}$ and Arm are mutually the same or different.

It is also preferable that the second compound represented by the formula (2) is a compound represented by a formula (241), a formula (242), a formula (243), a formula (244), a formula (245), a formula (246), a formula (247), a formula (248), or a formula (249) below.
[Formula 84]
(241)
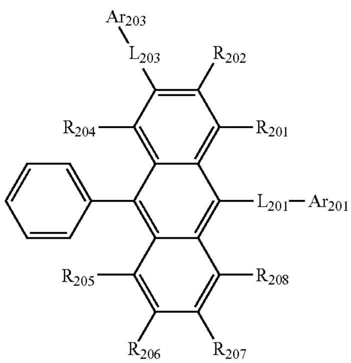
[Formula 85]
(242)
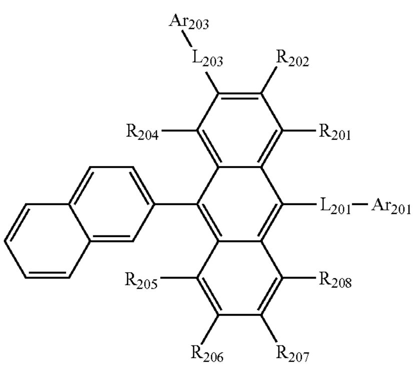
[Formula 86]
(243)
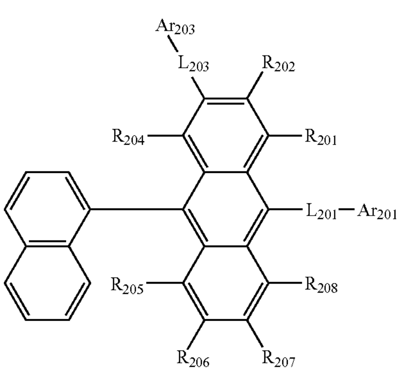
[Formula 87]
(244)
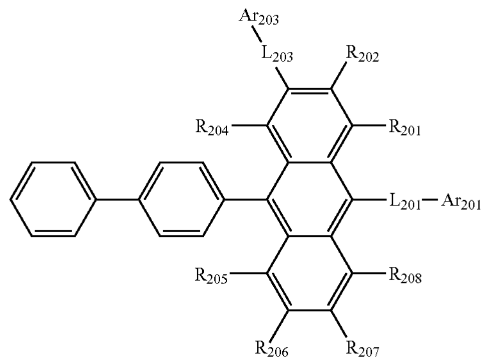
[Formula 88]
(245)
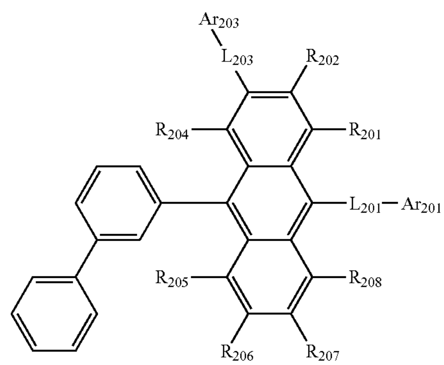
[Formula 89]
(246)
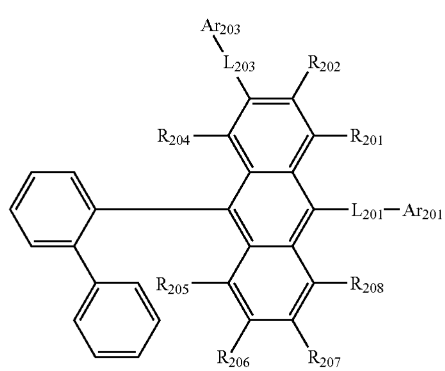

[Formula 90]

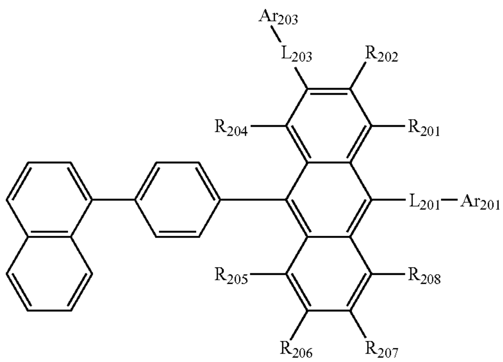

(247)

[Formula 91]

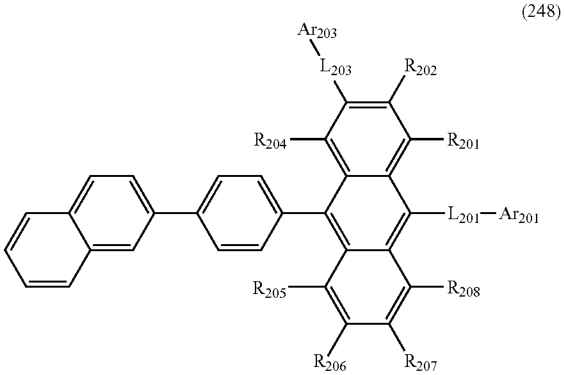

(248)

[Formula 92]

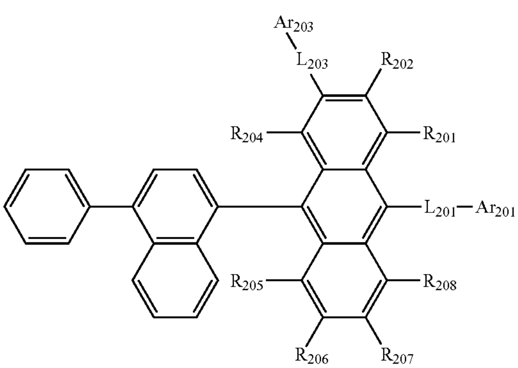

(249)

In the formulae (241), (242), (243), (244), (245), (246), (247), (248), and (249):

$R_{201}$, $R_{202}$, and $R_{204}$ to $R_{208}$ each independently represent the same as $R_{201}$, $R_{202}$, and $R_{204}$ to $R_{208}$ in the formula (2);

$L_{201}$ and Arm each represent the same as $L_{201}$ and Arm in the formula (2);

$L_{203}$ represents the same as $L_{201}$ in the formula (2);

$L_{203}$ and $L_{201}$ are mutually the same or different;

$Ar_{203}$ represents the same as Arm in the formula (2); and $Ar_{203}$ and Arm are mutually the same or different.

In the second compound represented by the formula (2), $R_{201}$ to $R_{208}$ not being the group represented by the formula (21) are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —$Si(R_{901})(R_{902})(R_{903})$.

$L_{101}$ is preferably a single bond, or an unsubstituted arylene group having 6 to 22 ring carbon atoms, and $Ar_{101}$ is preferably a substituted or unsubstituted aryl group having 6 to 22 ring carbon atoms.

In the organic EL device according to the exemplary embodiment, in the second compound represented by the formula (2), $R_{201}$ to $R_{208}$ are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —$Si(R_{901})(R_{902})(R_{903})$.

In the organic EL device according to the exemplary embodiment, $R_{201}$ to $R_{208}$ in the second compound represented by the formula (2) are each preferably a hydrogen atom.

In the second compound, the groups specified to be "substituted or unsubstituted" are each preferably an "unsubstituted" group.

Method of Manufacturing Second Compound

The second compound can be manufactured by a known method. The second compound can also be manufactured based on a known method through a known alternative reaction using a known material(s) tailored for the target compound.

Specific Examples of Second Compound

Specific examples of the second compound include, for example, the following compounds. It should however be noted that the invention is not limited by the specific examples of the second compound.

[Formula 93]

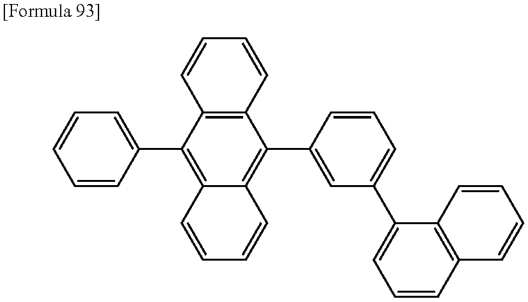

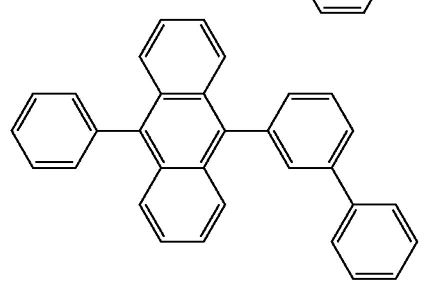

-continued
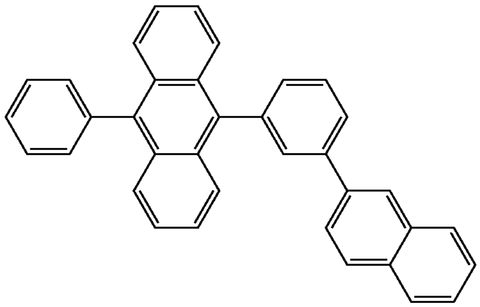
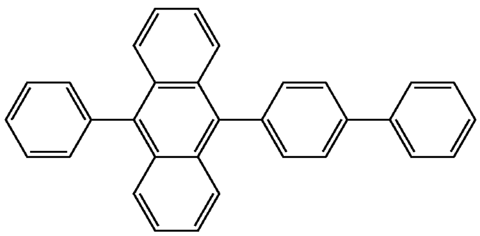
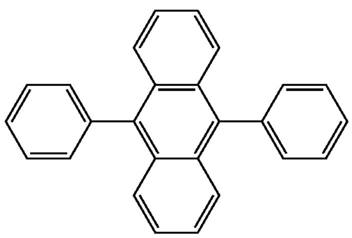
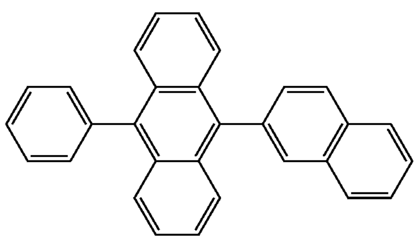
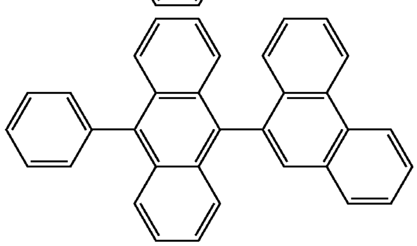
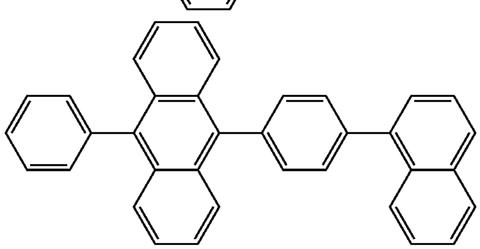
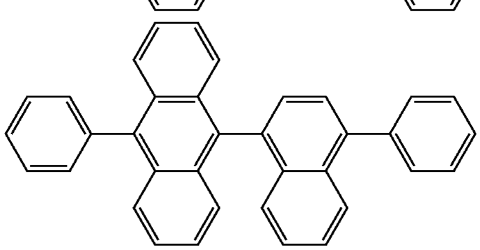
-continued
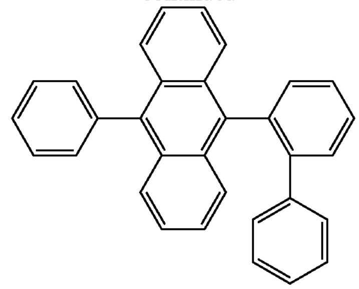
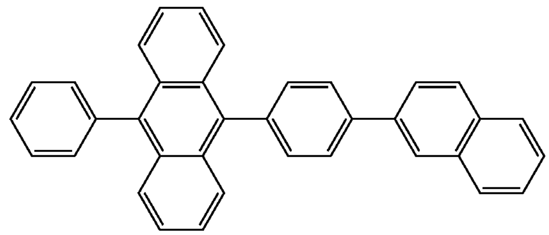
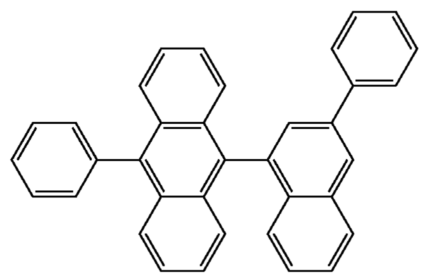
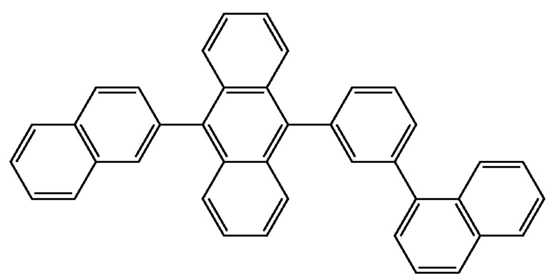
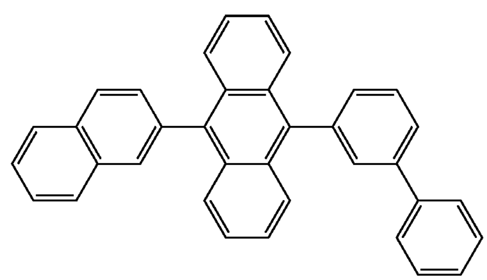
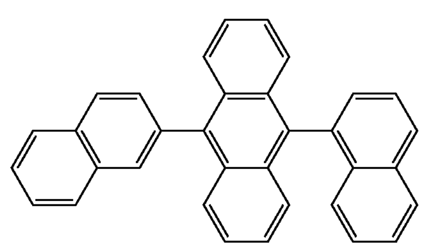

-continued
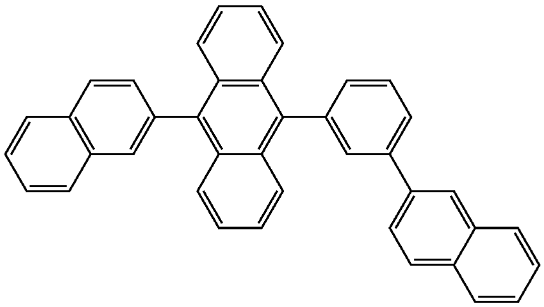
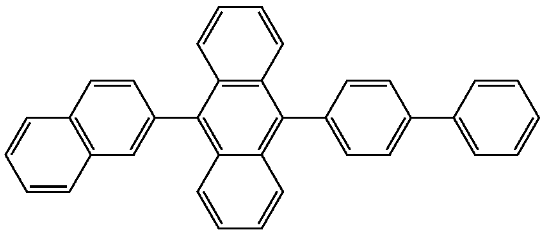
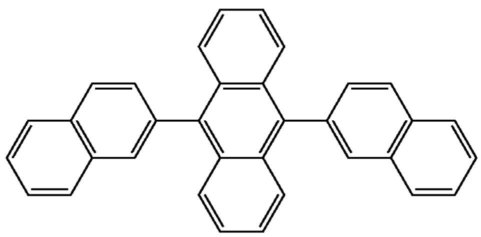
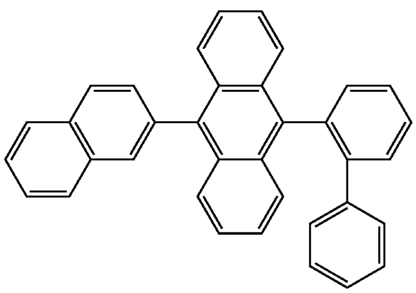
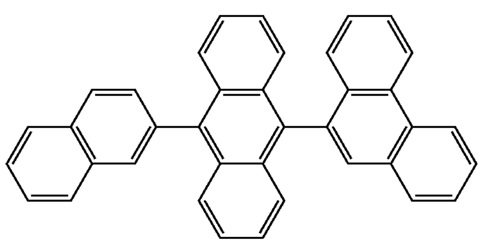
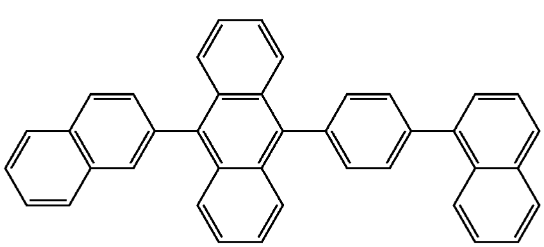
-continued
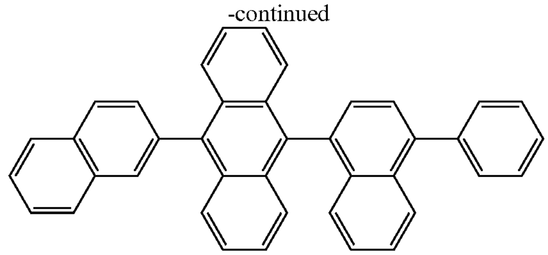
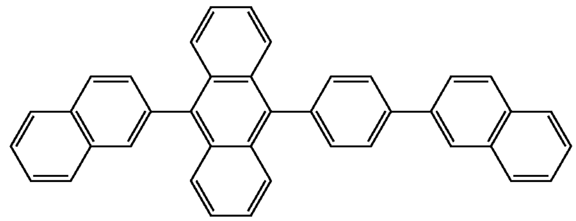
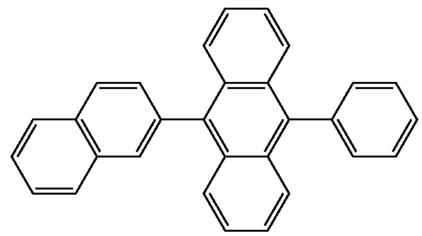
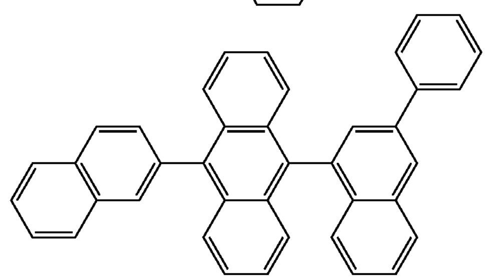
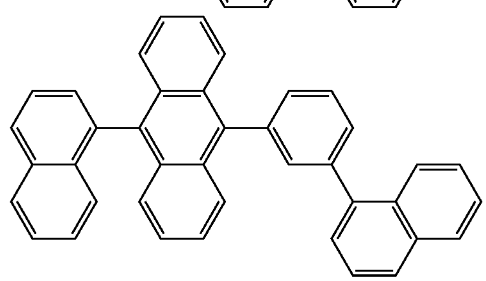
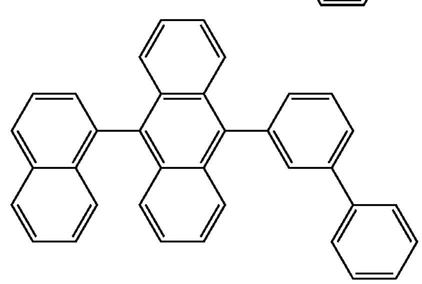
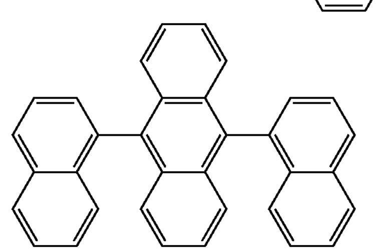

-continued
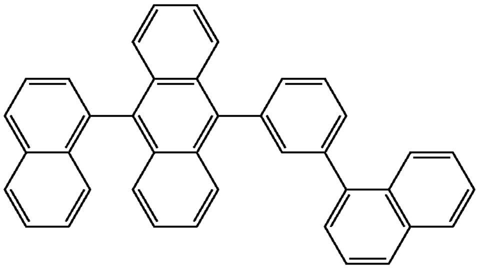
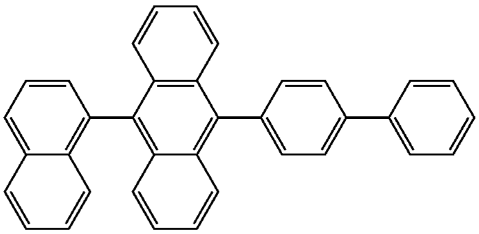
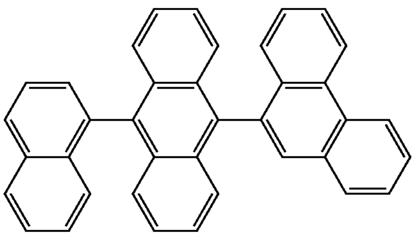
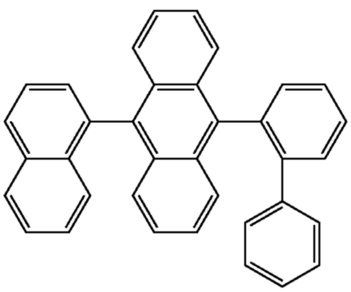
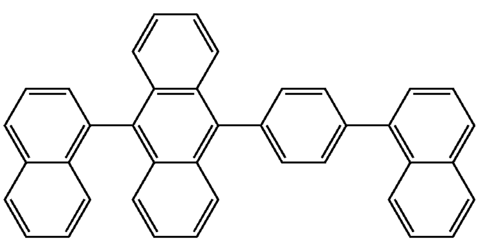
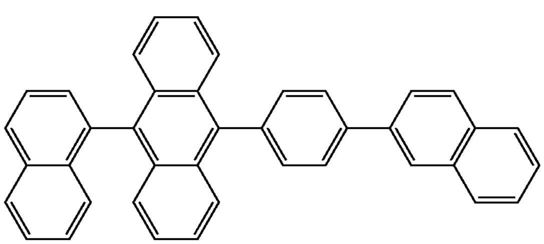
-continued
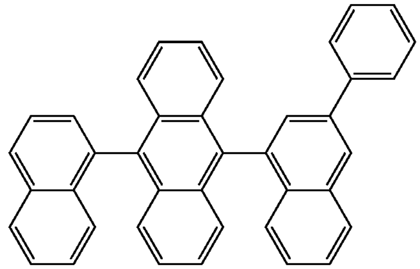
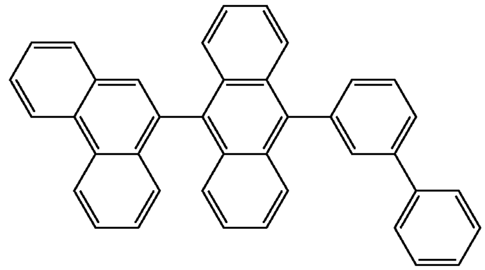
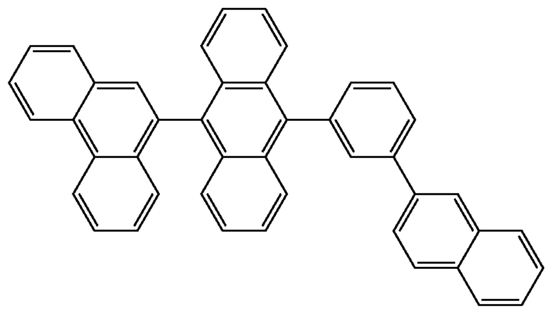
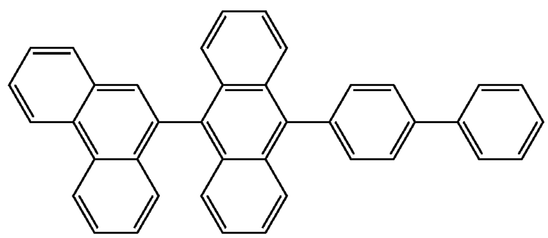
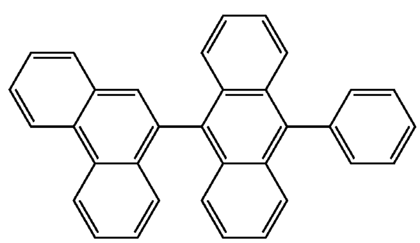
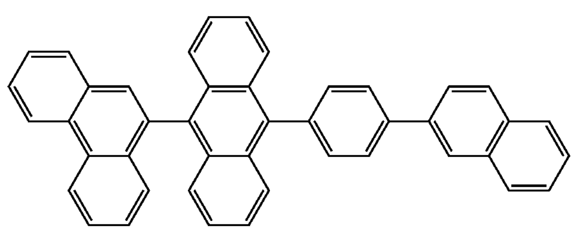

[Formula 94]
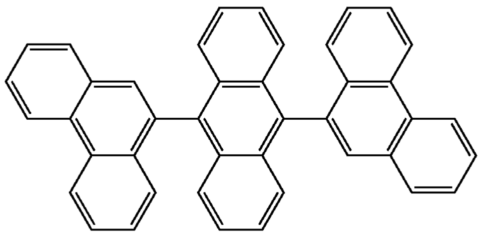
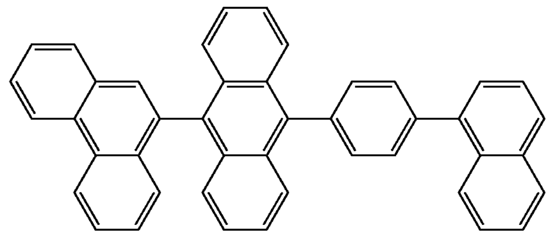
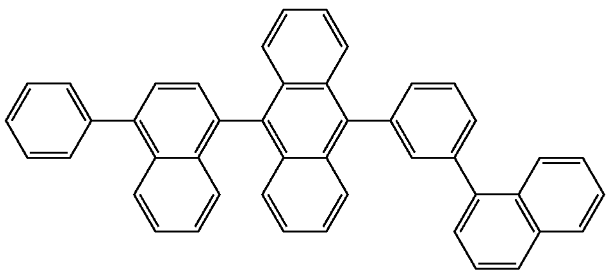
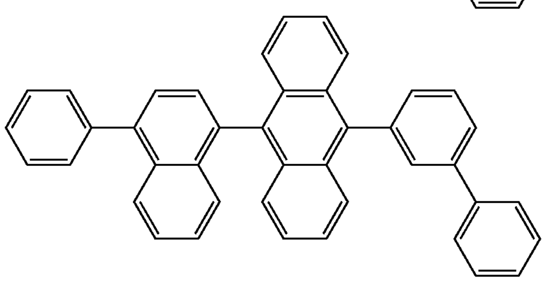
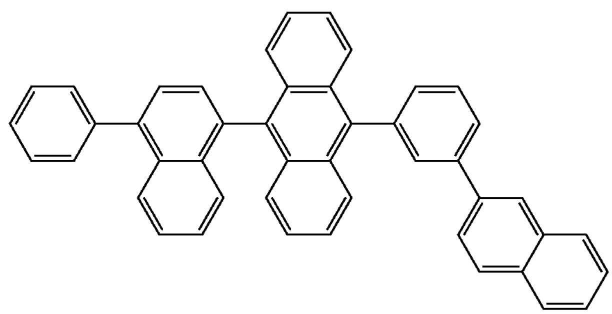
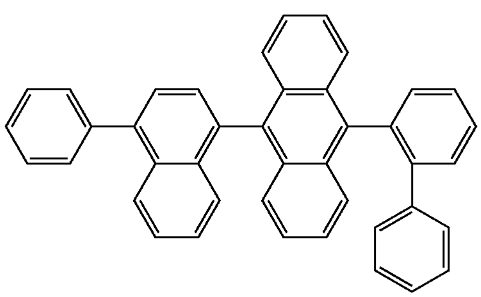
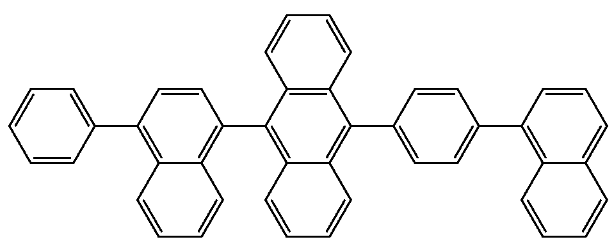
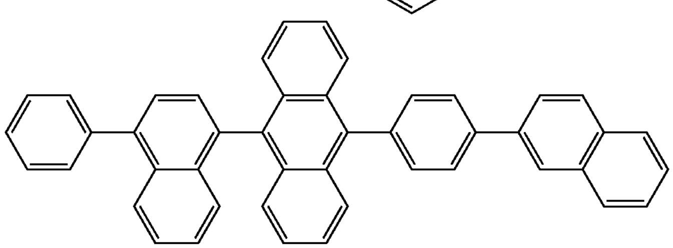
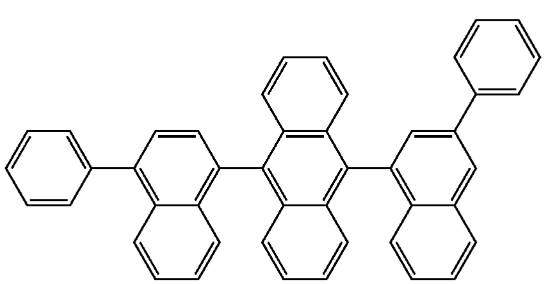
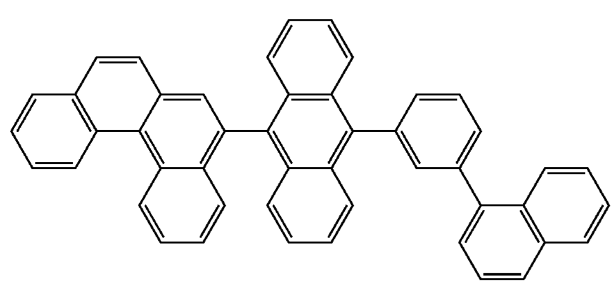

-continued
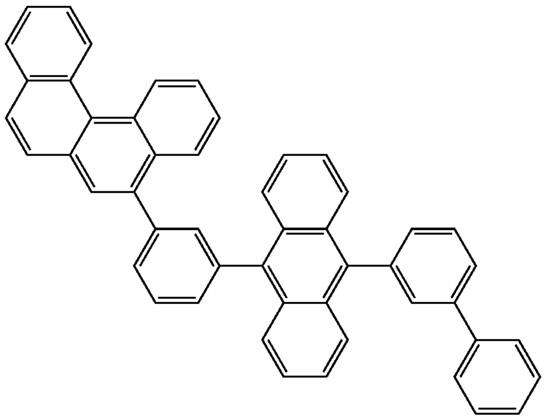
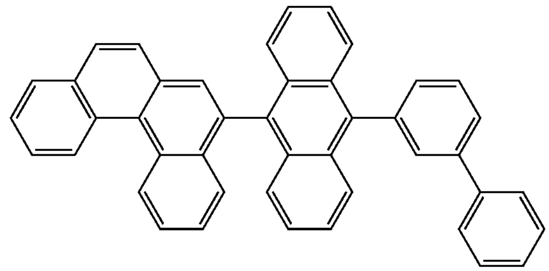
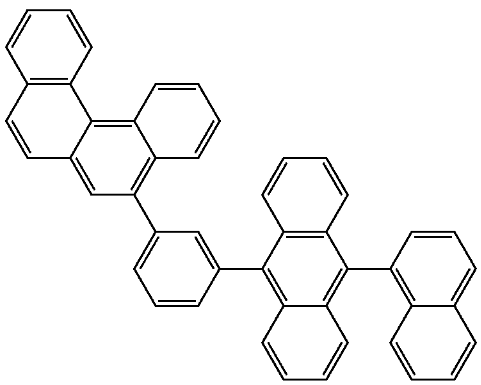
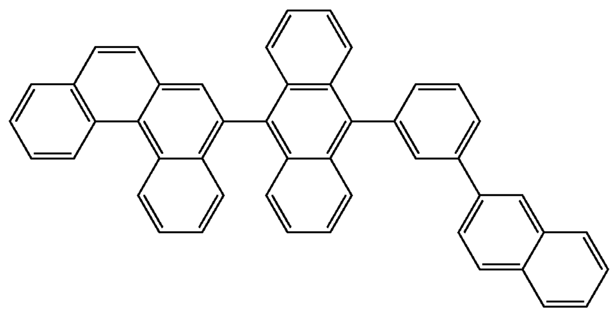
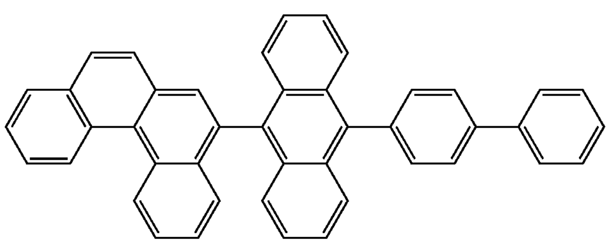
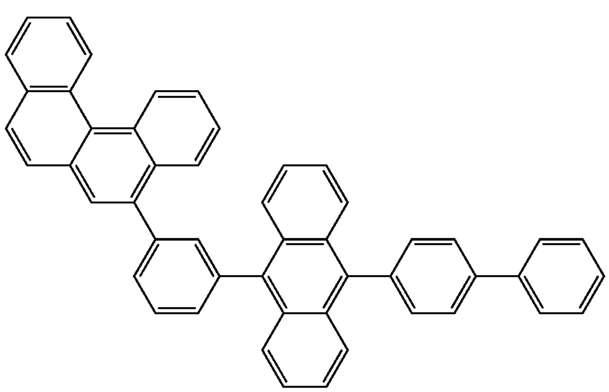
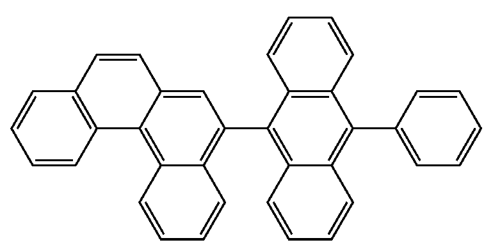

-continued
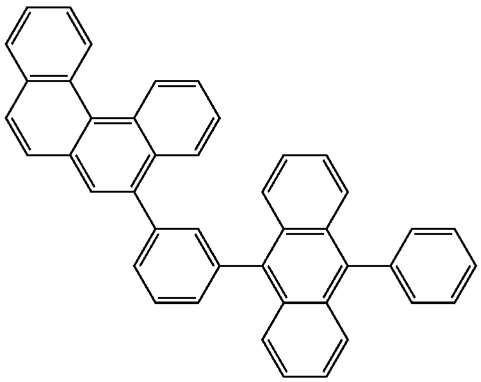
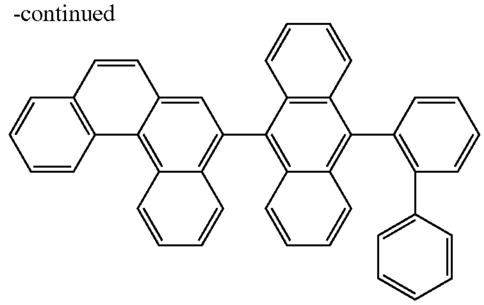
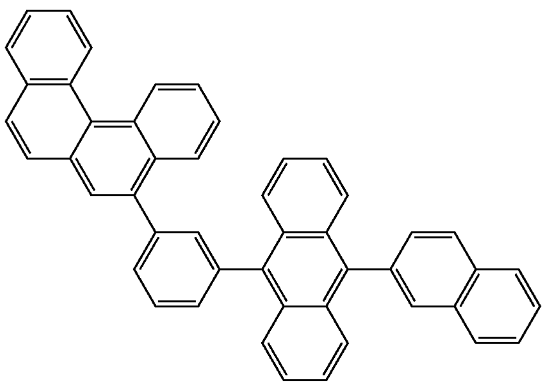
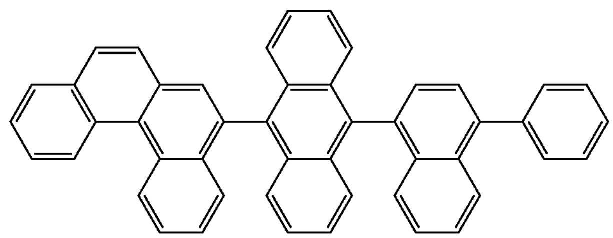
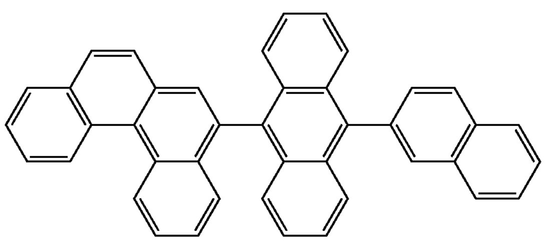
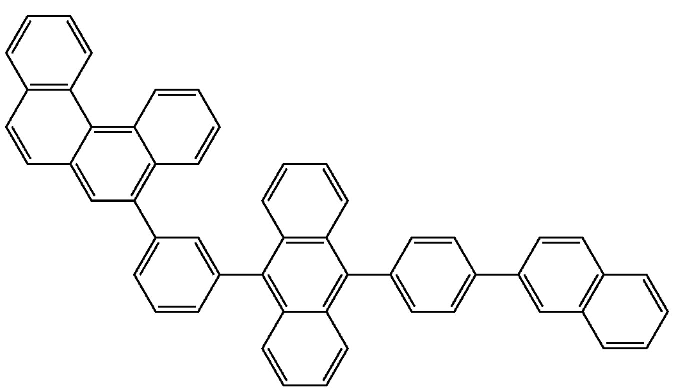
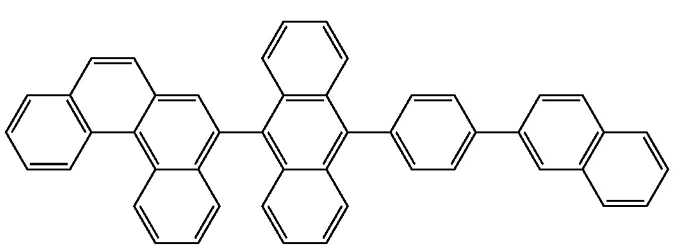

-continued
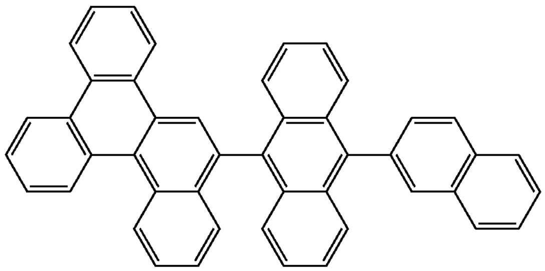
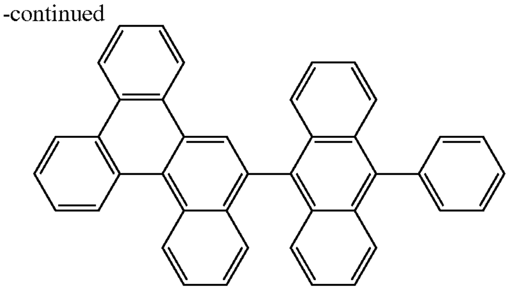
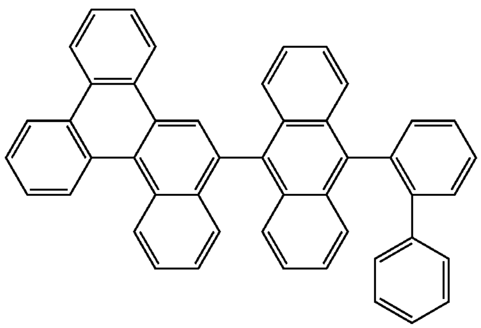
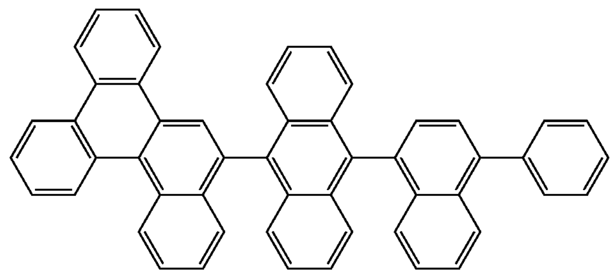
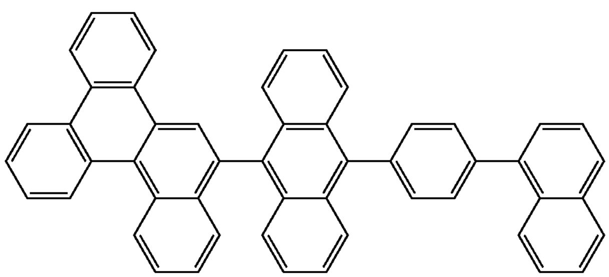
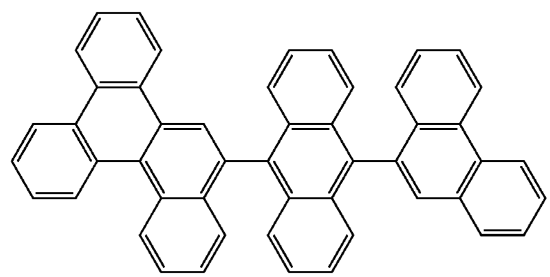
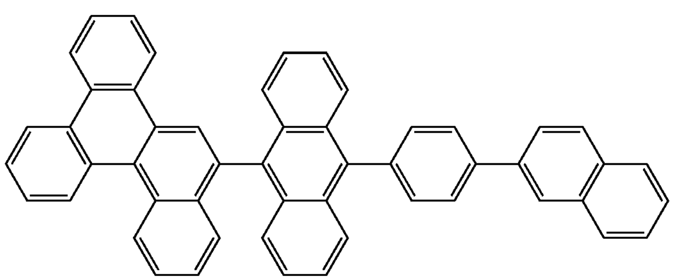
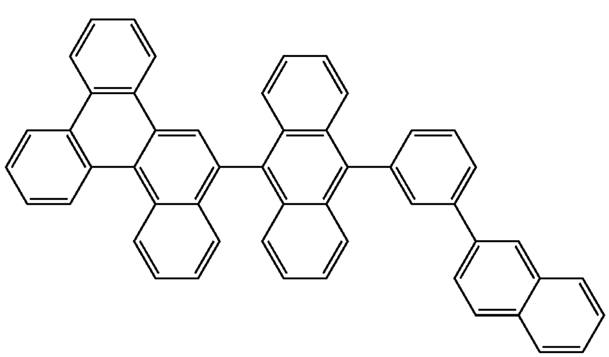
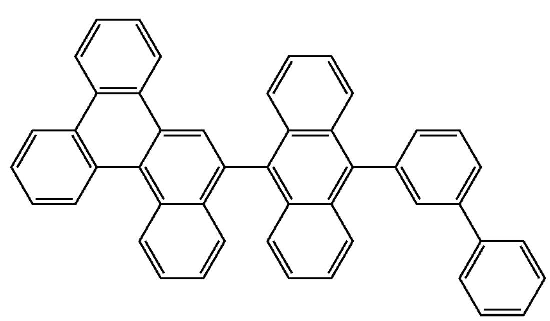

-continued
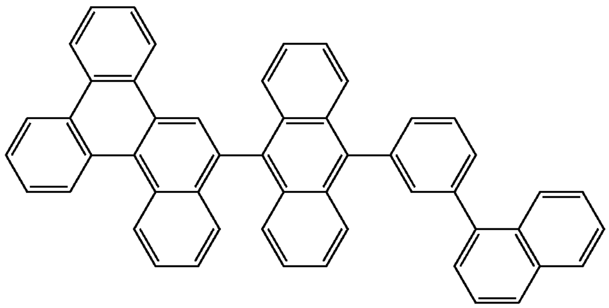
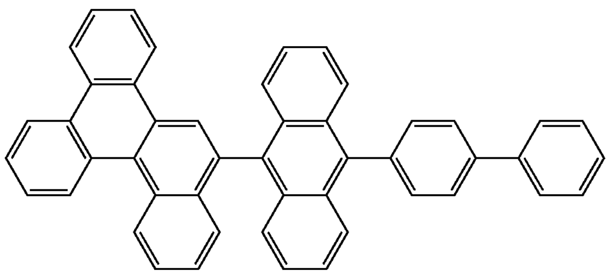
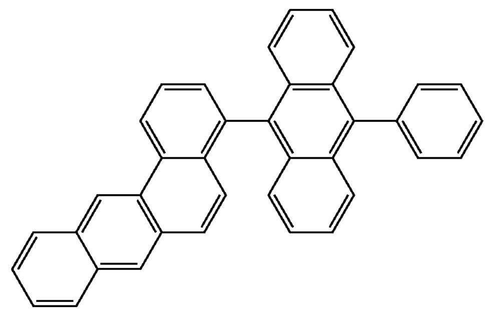
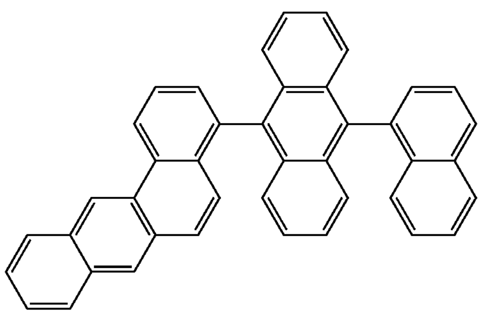
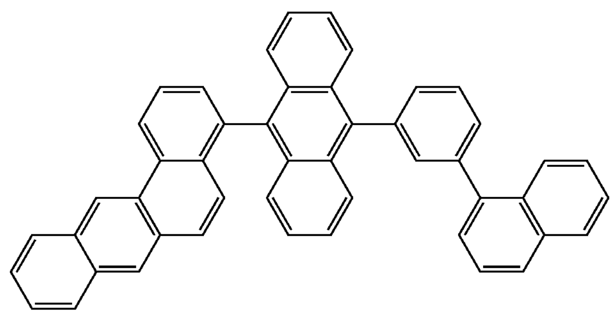
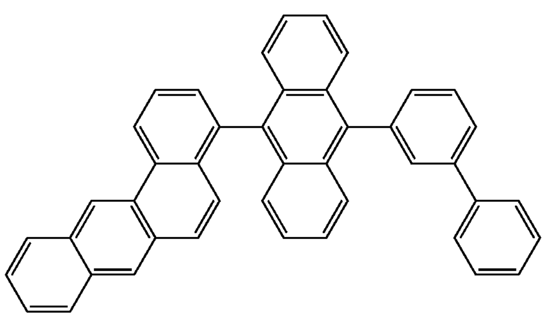
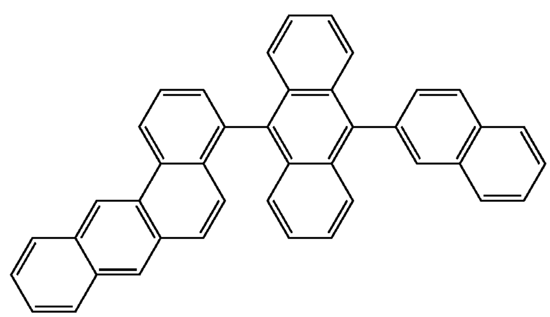
[Formula 95]
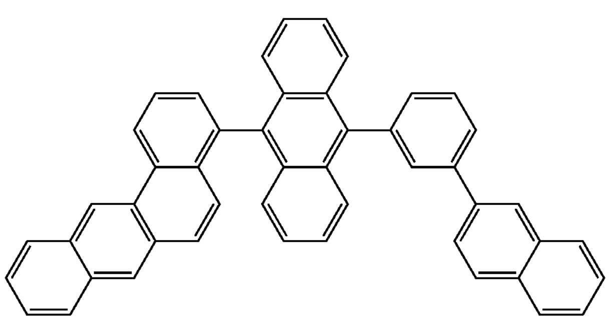

-continued
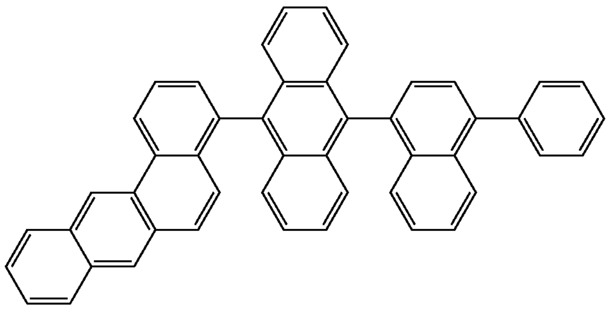
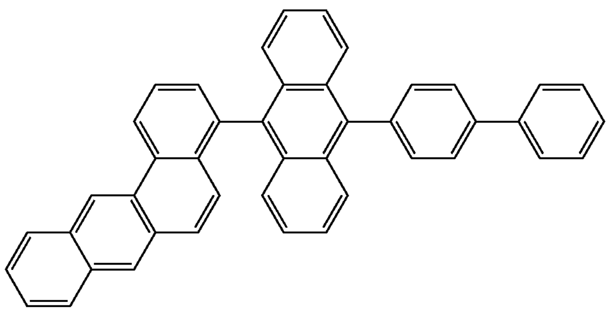
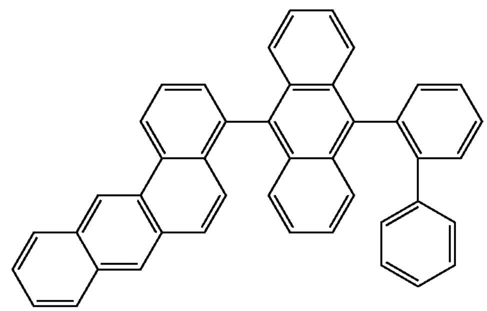
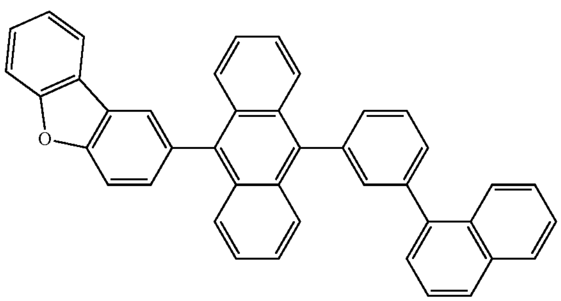
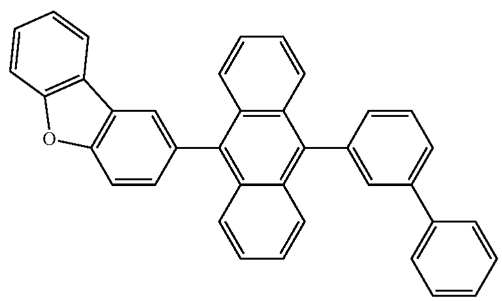
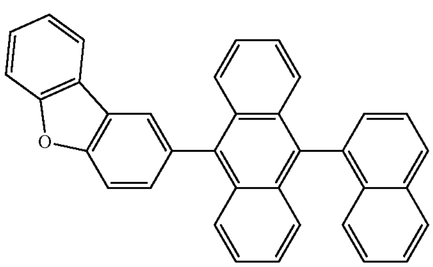
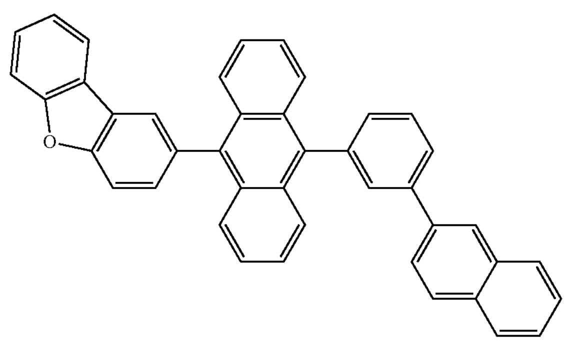
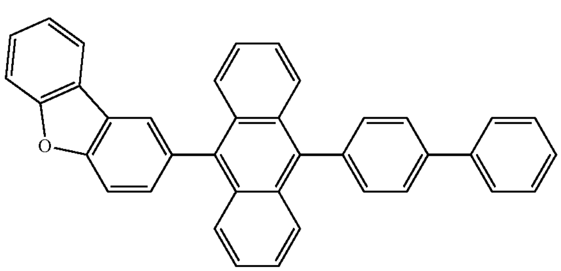
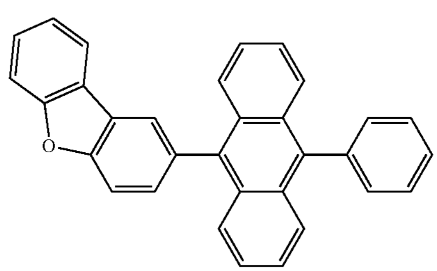

-continued
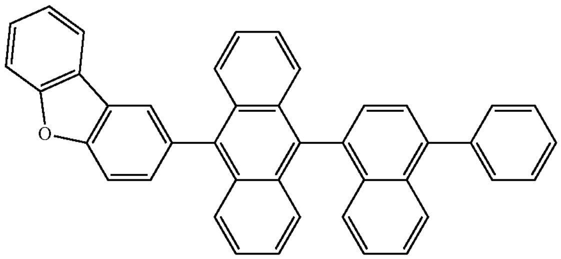
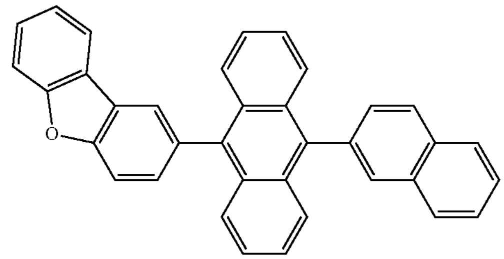
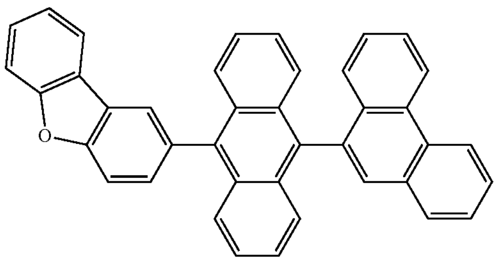
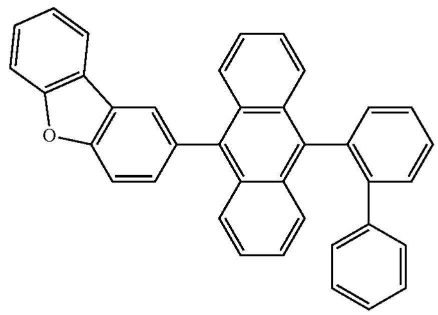
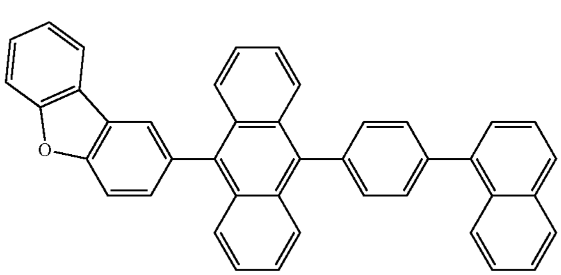
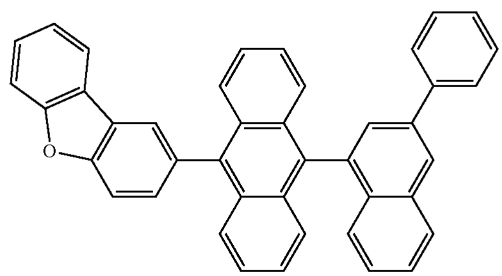
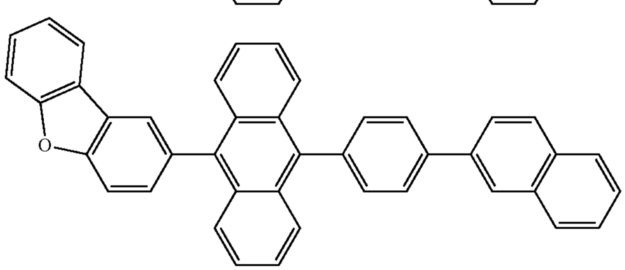
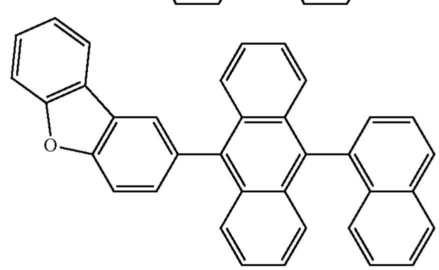
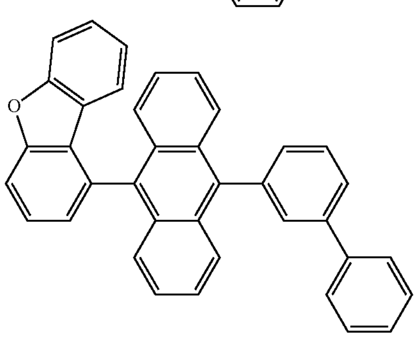
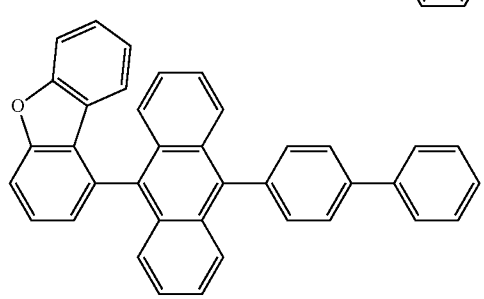
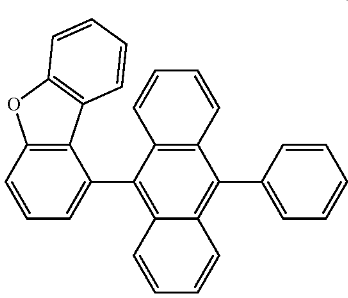
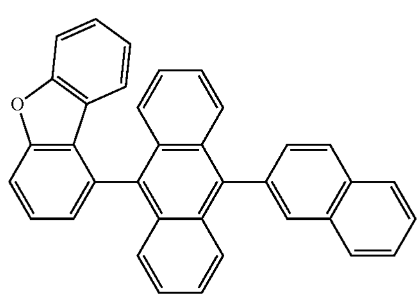

-continued
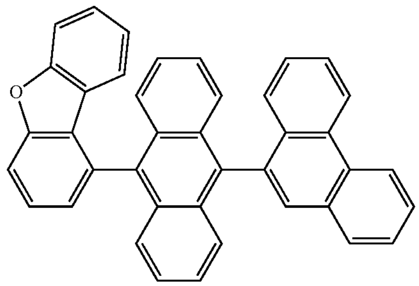
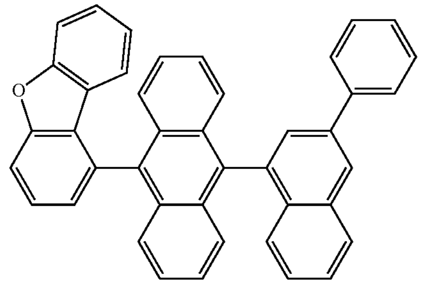
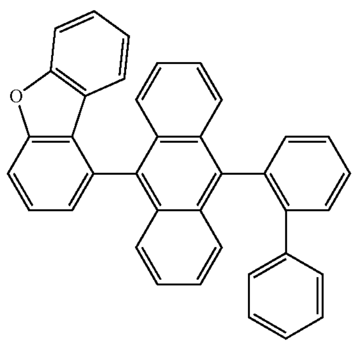
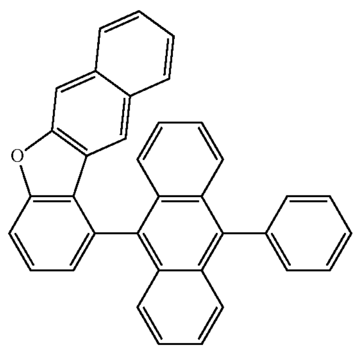
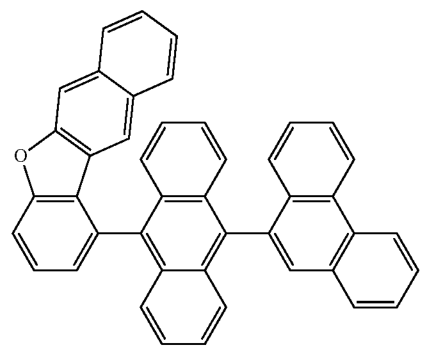
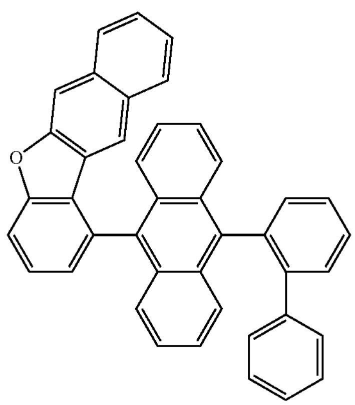
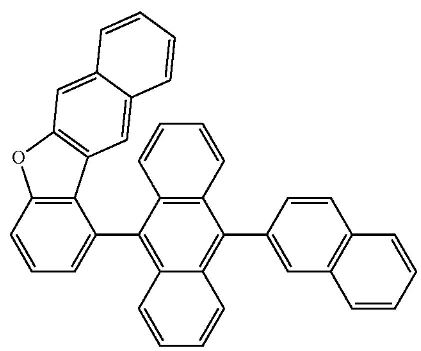
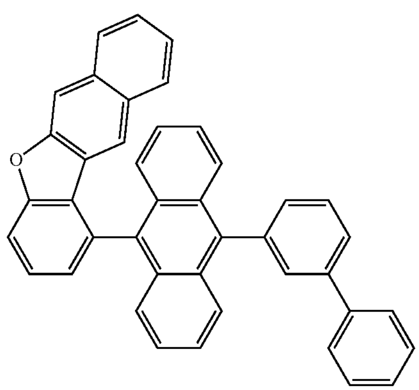
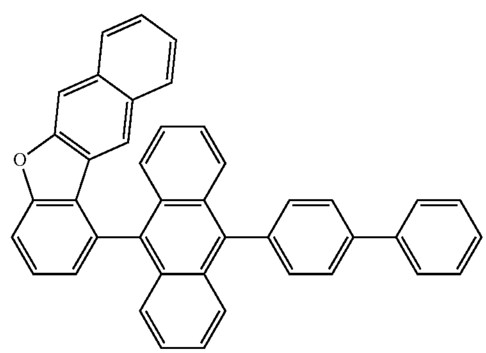

-continued
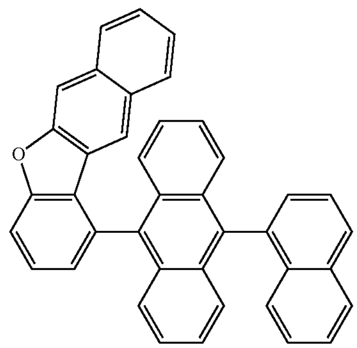
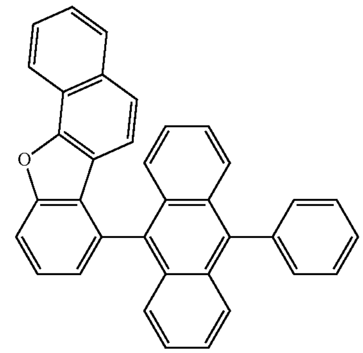
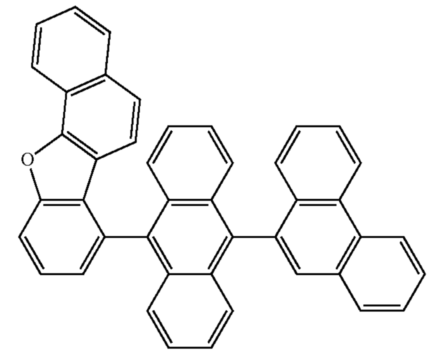
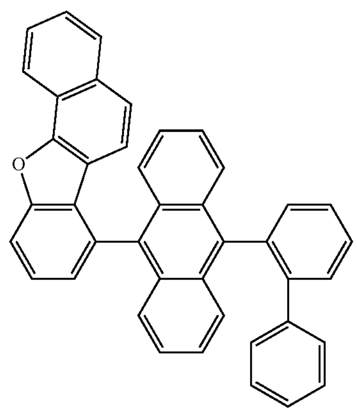
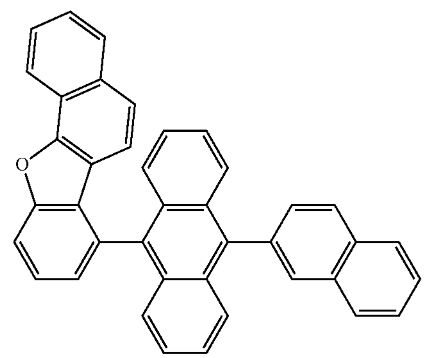
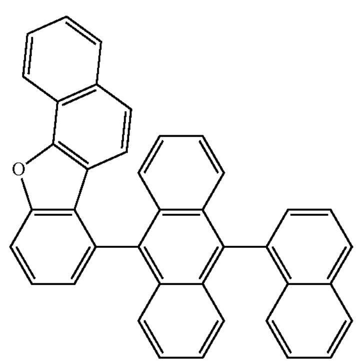
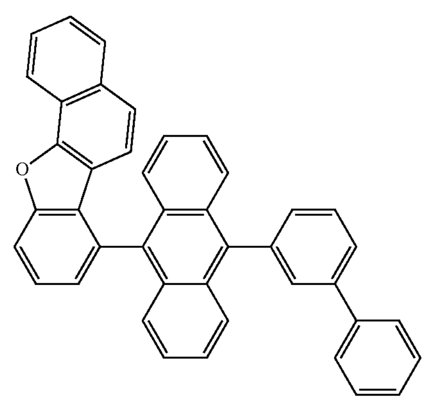
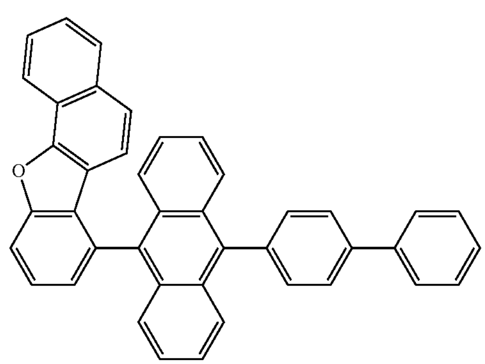
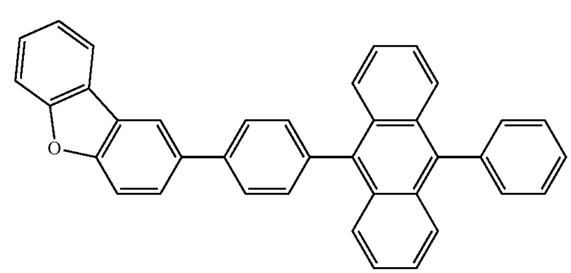

[Formula 96]
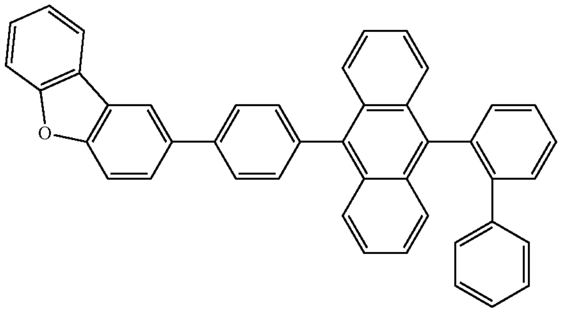
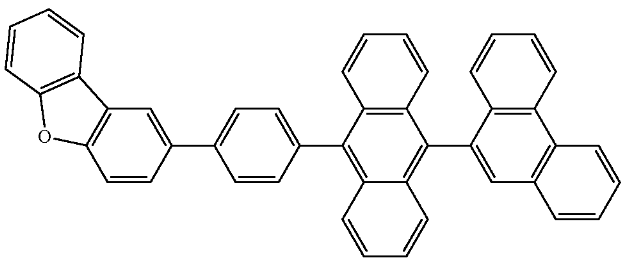
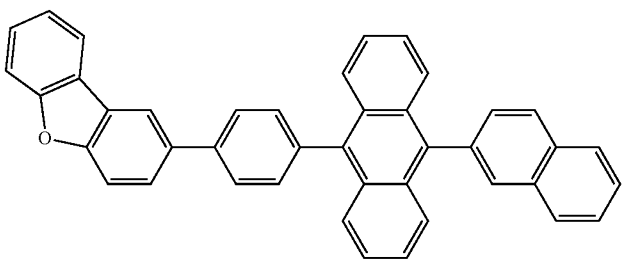
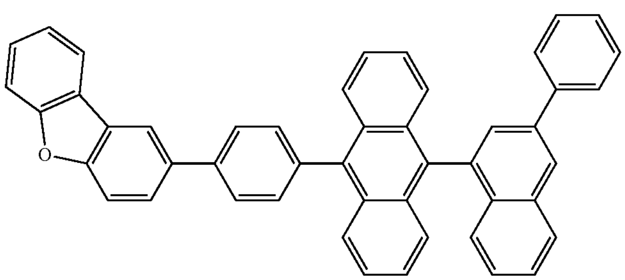
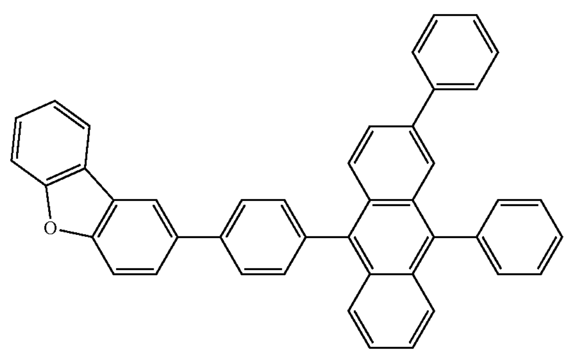
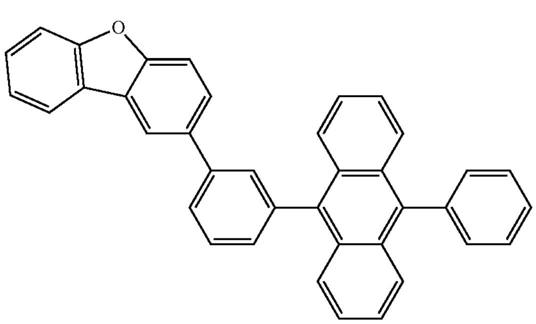
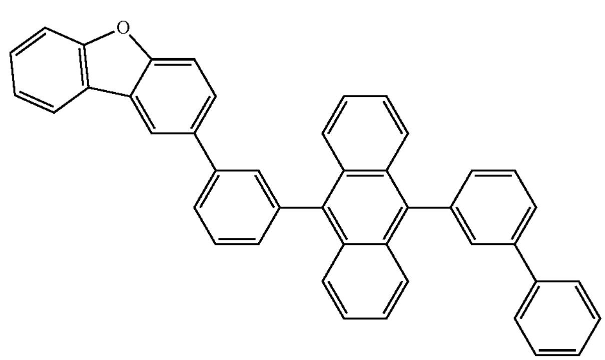

-continued
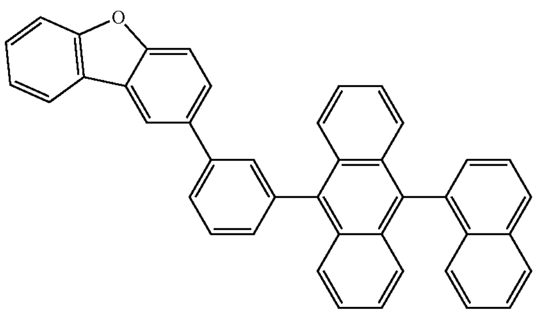
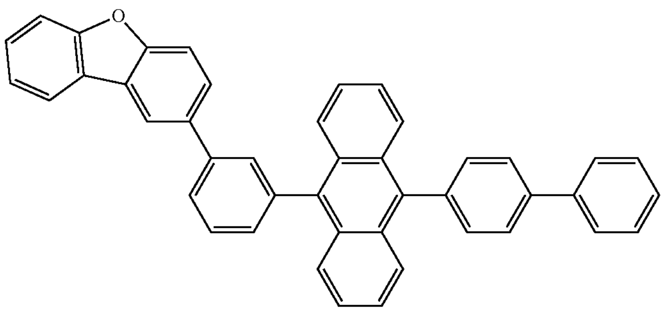
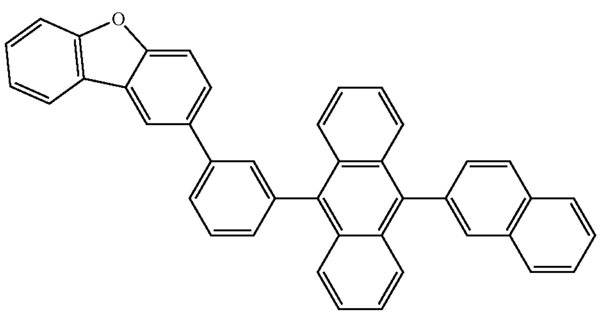
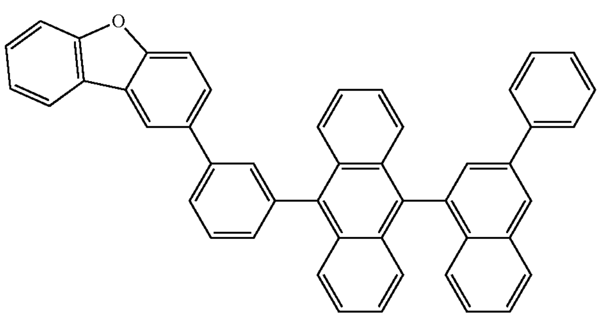
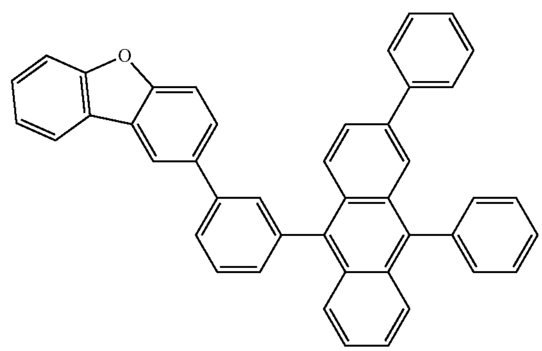
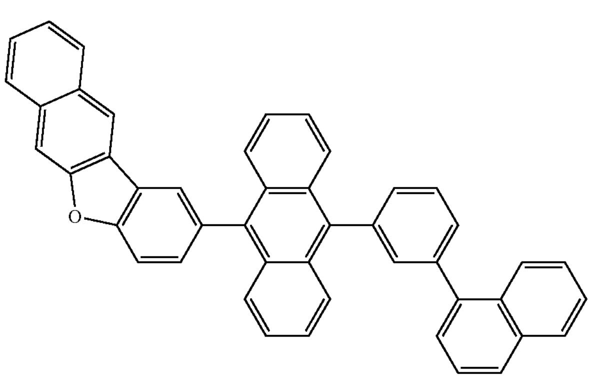
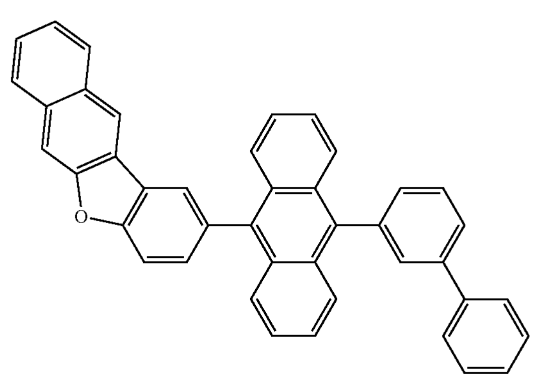

-continued
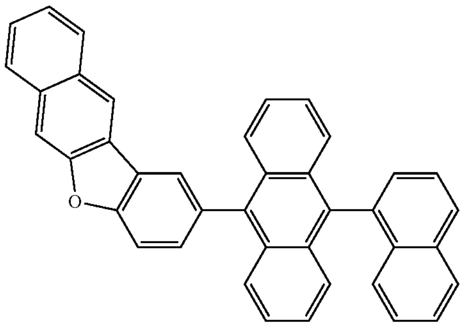
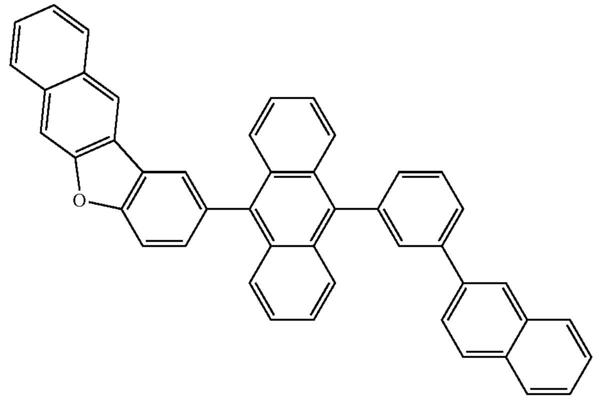
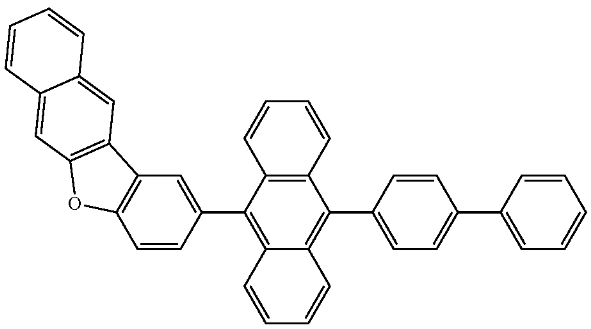
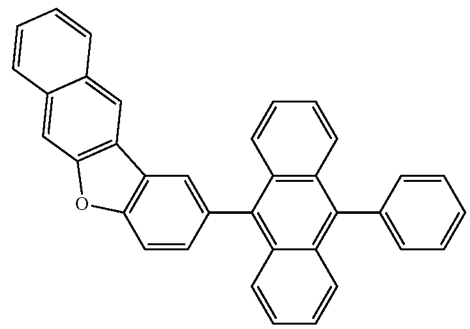
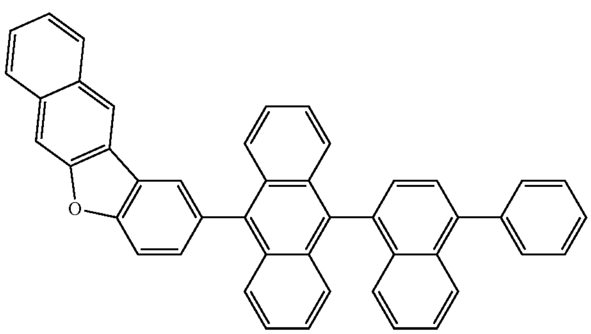
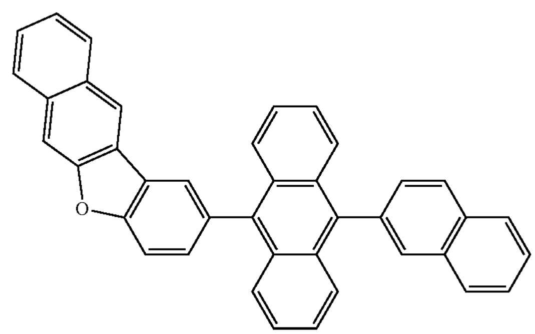
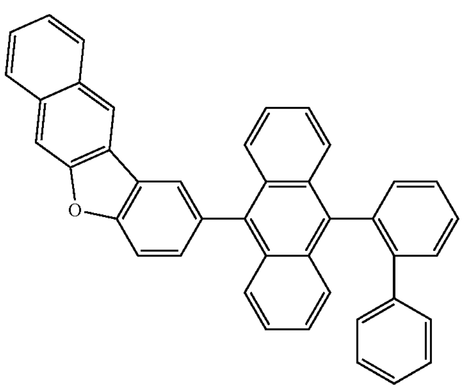
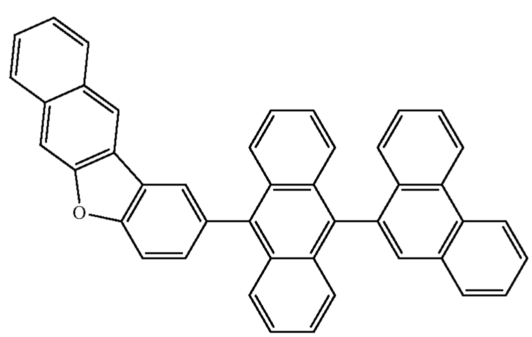

-continued
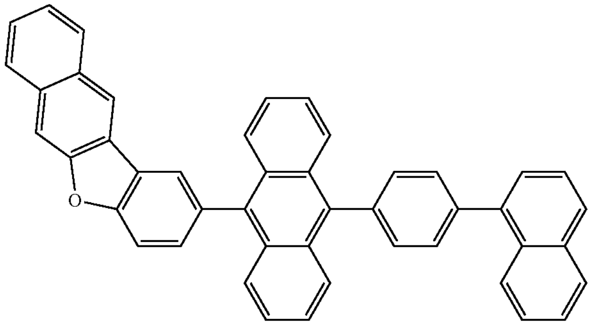
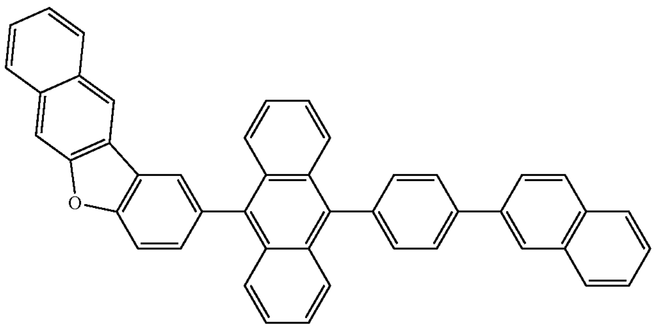
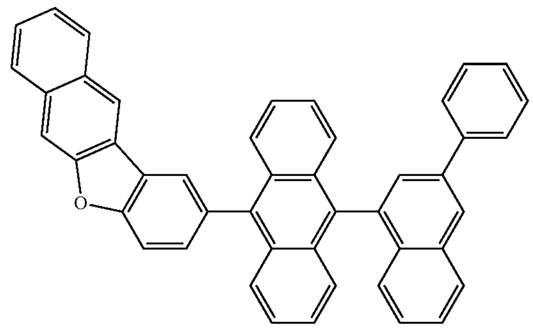
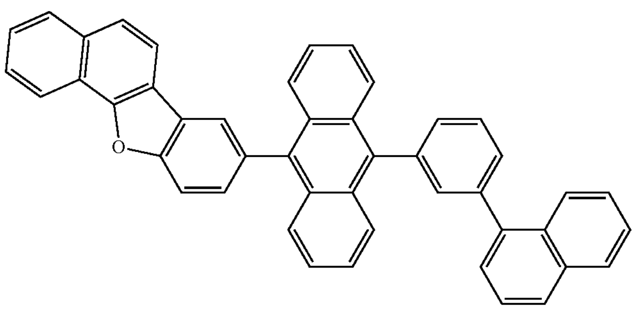
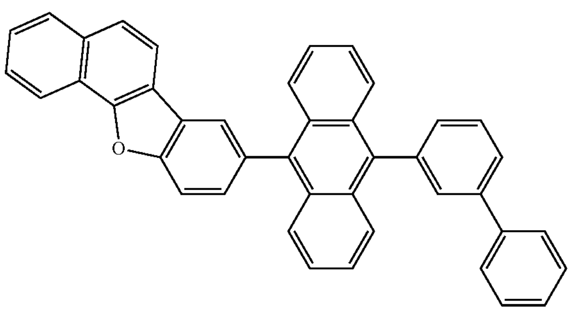
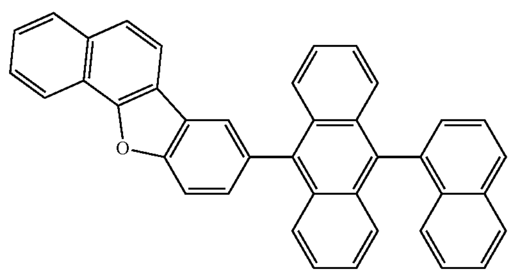
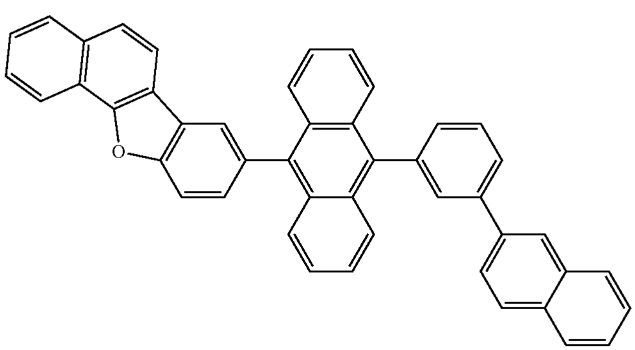

-continued
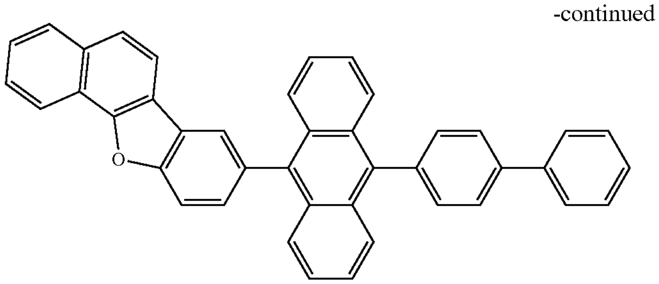
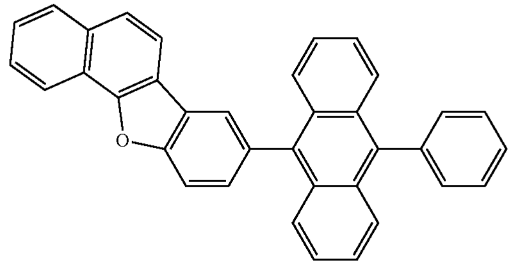
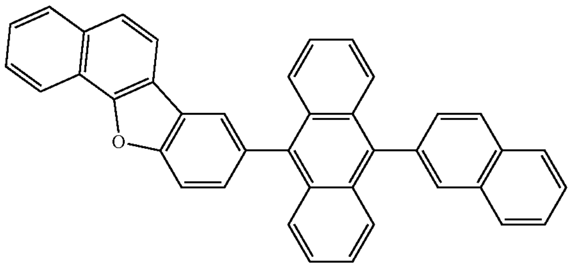
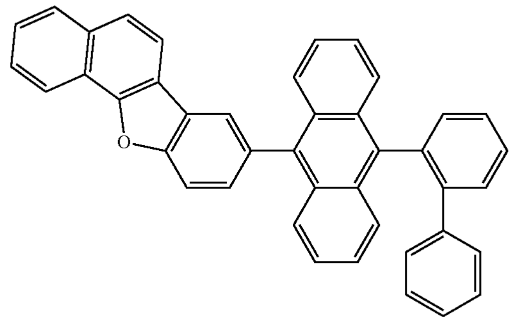
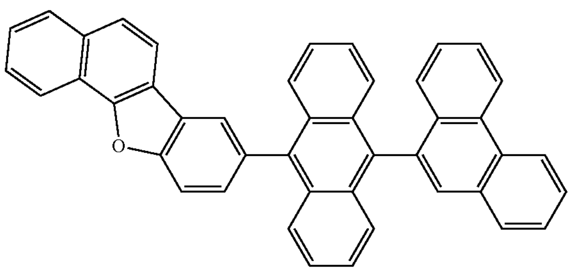
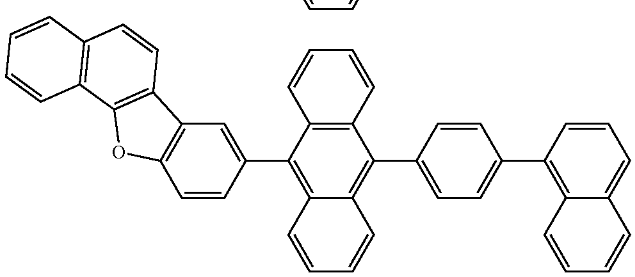
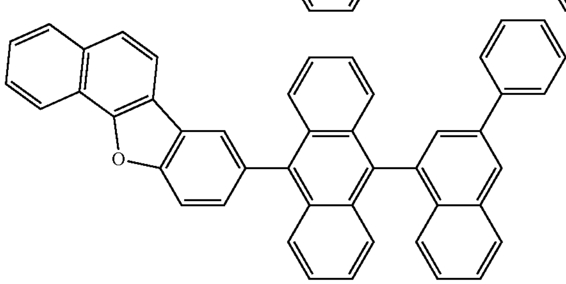
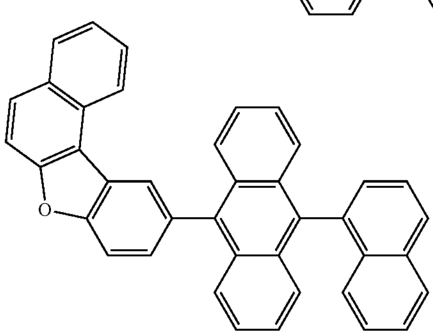
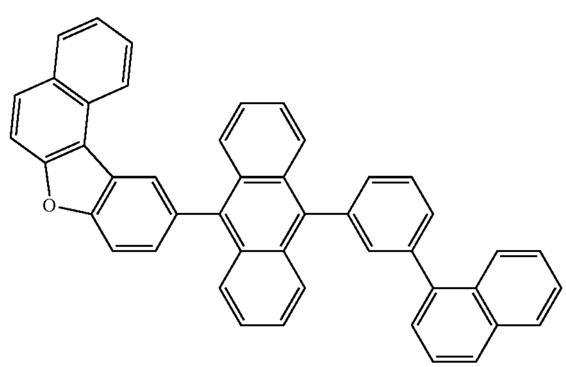

-continued
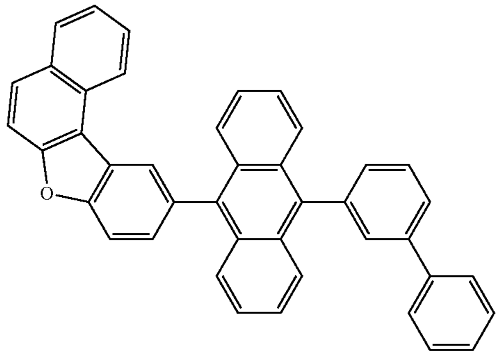
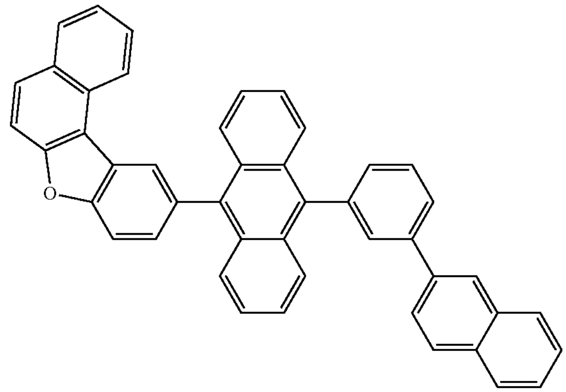
[Formula 97]
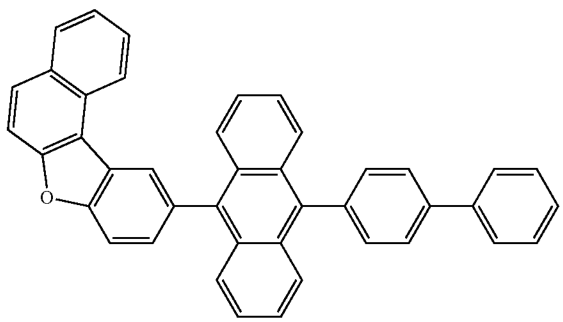
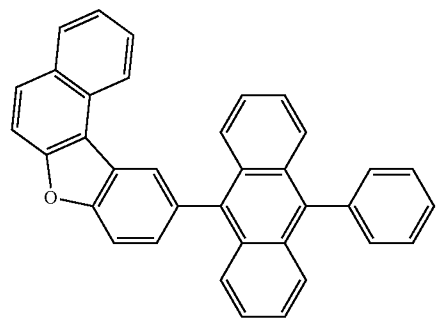
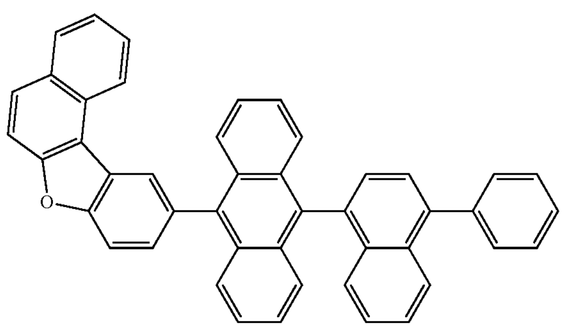
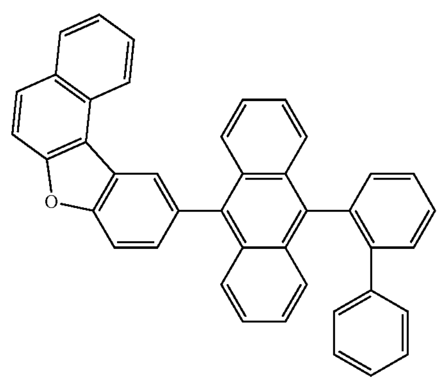
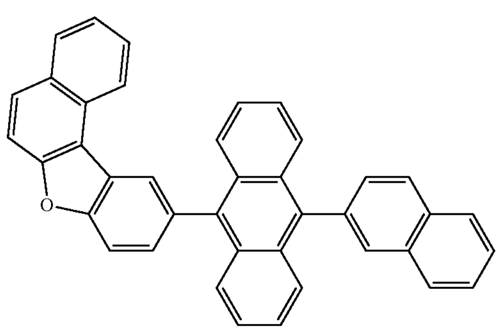
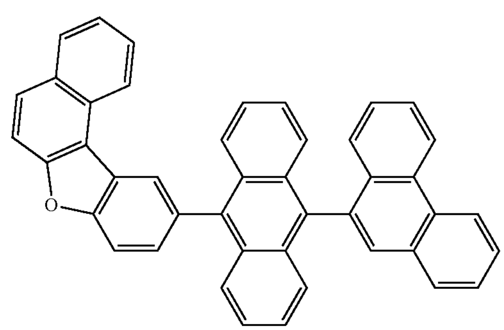

-continued
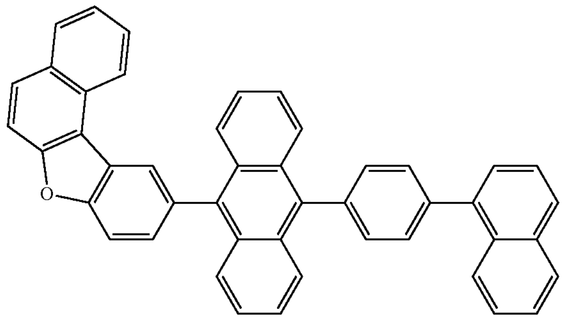
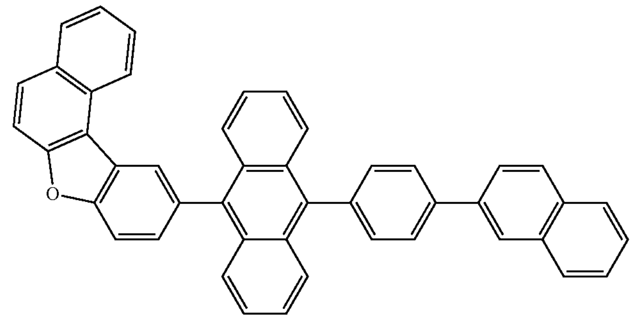
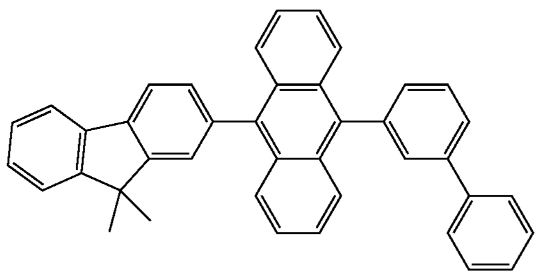
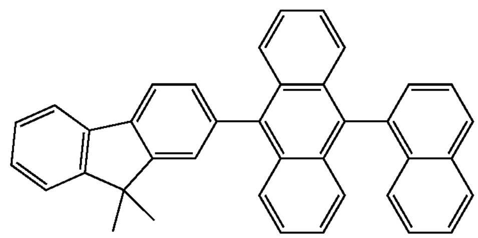
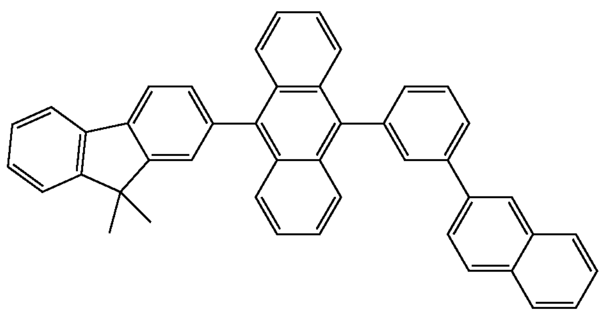
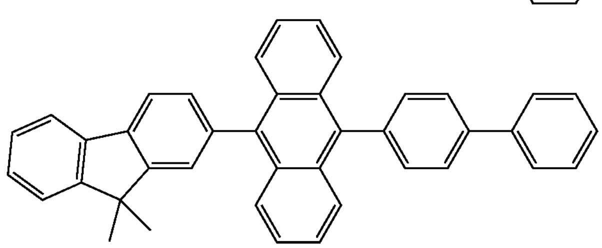
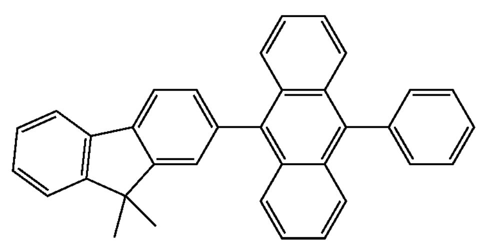
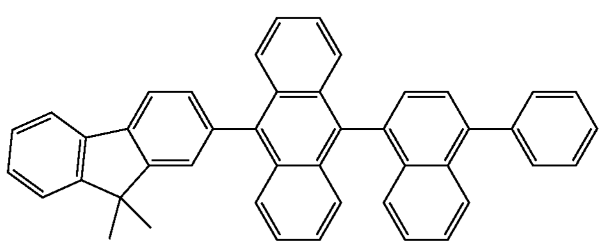
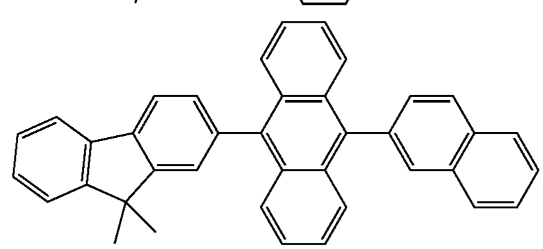
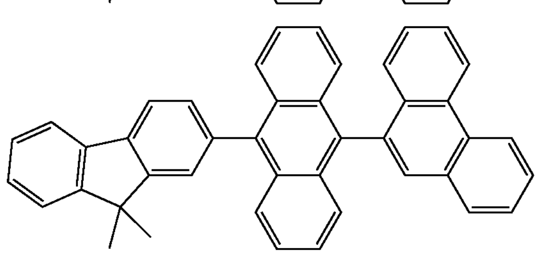
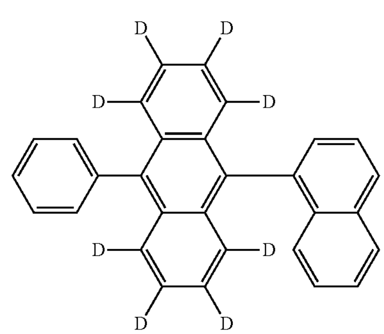

-continued
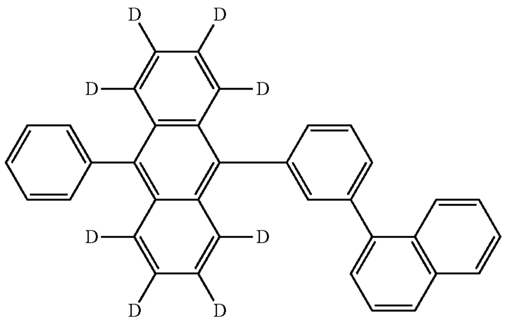
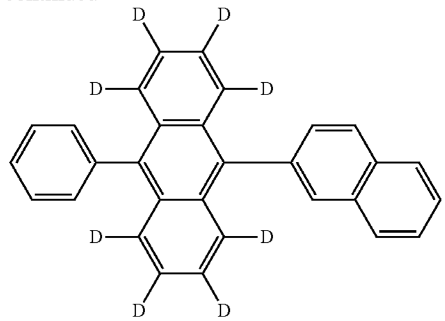
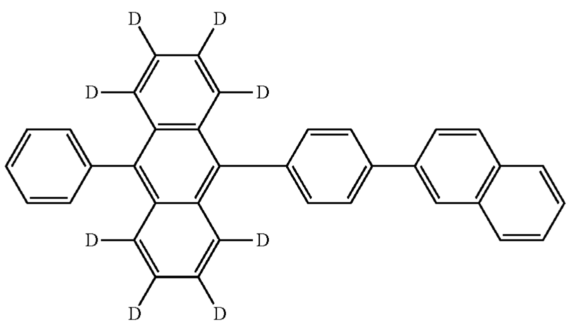
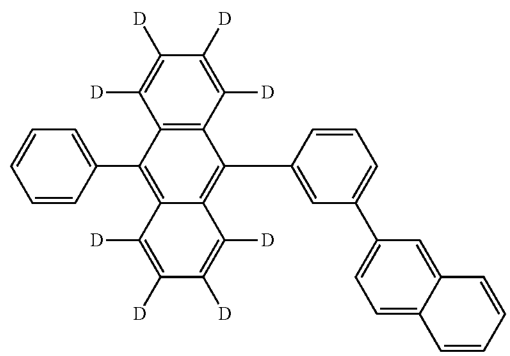
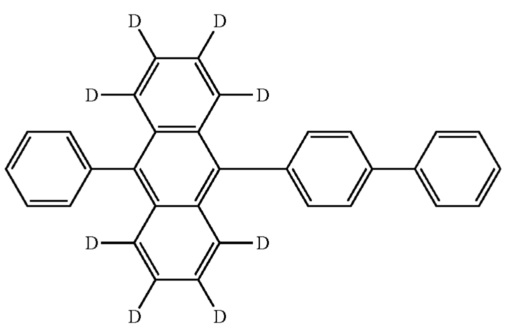
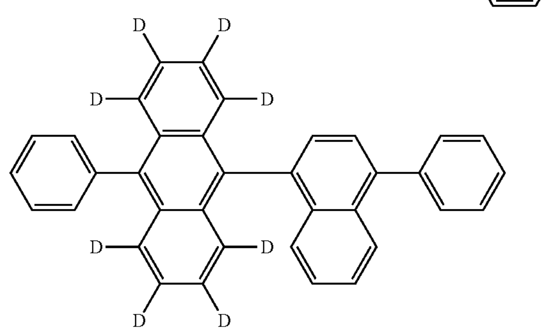
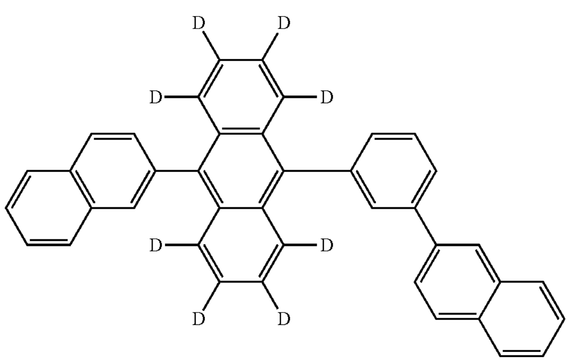
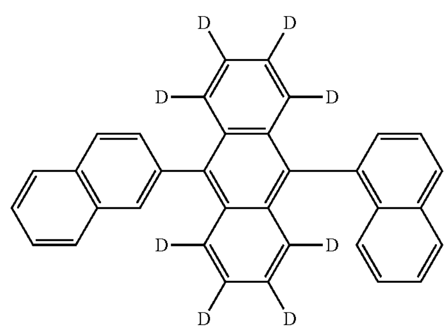
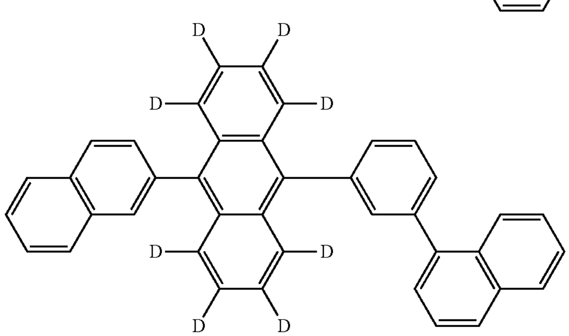
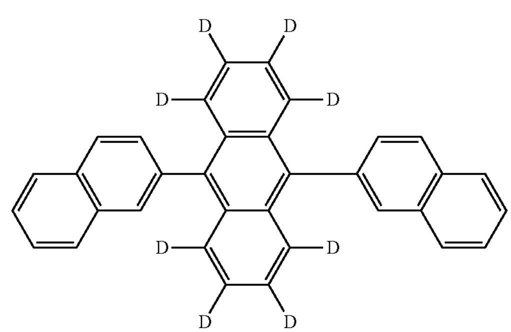

-continued
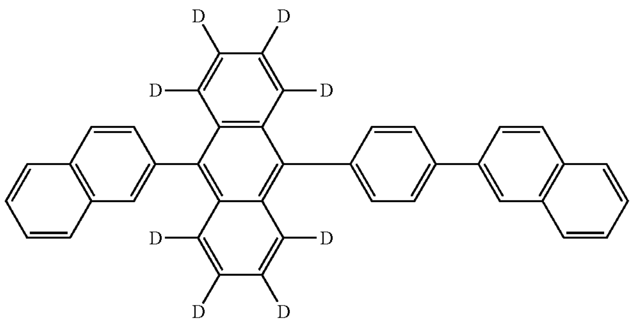
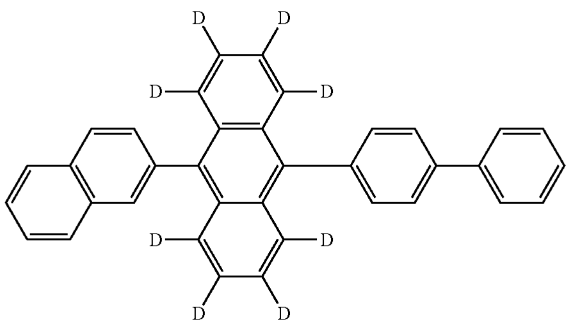
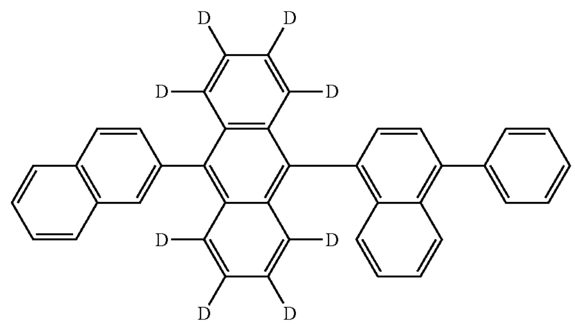
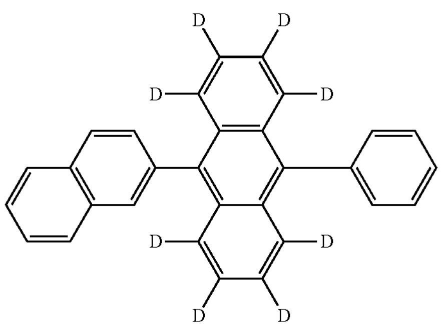
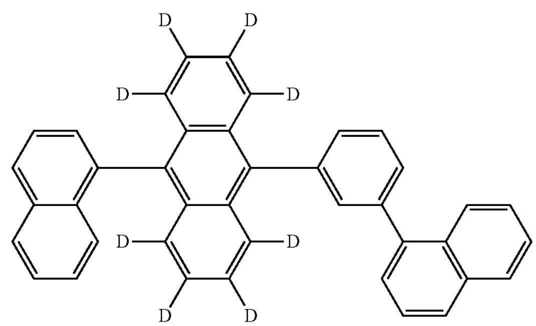
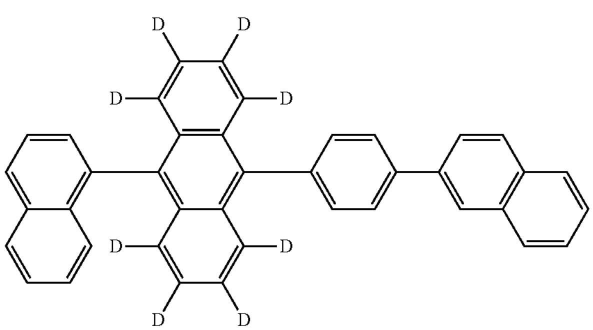
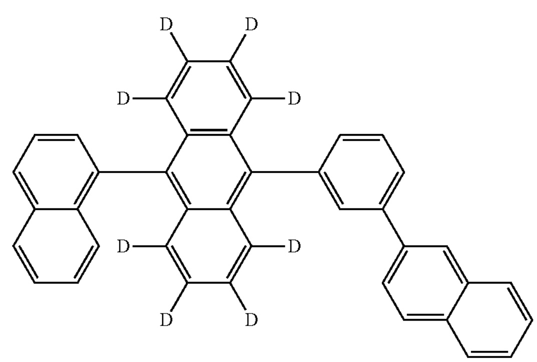
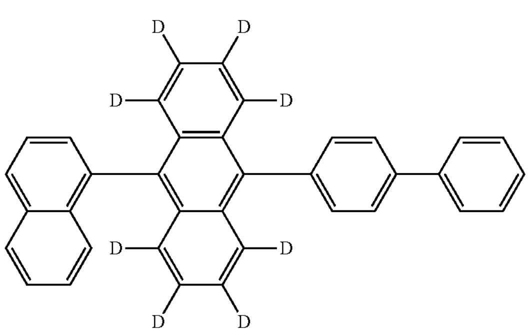
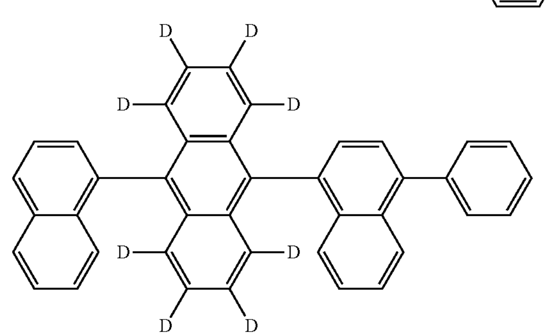

-continued
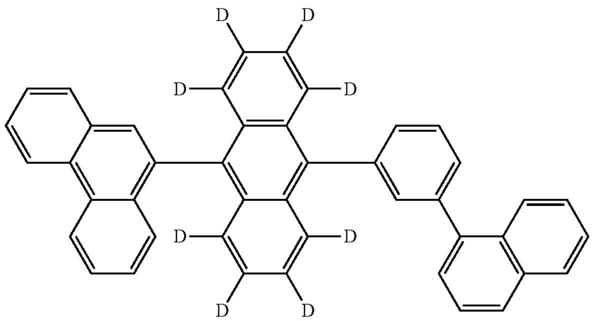
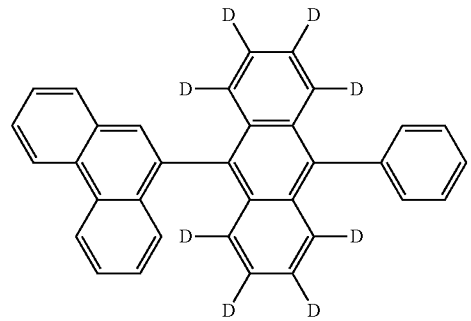
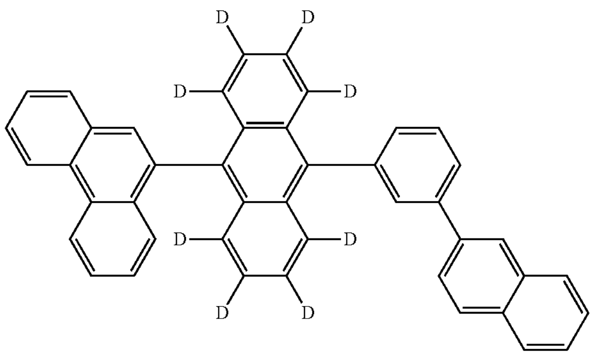
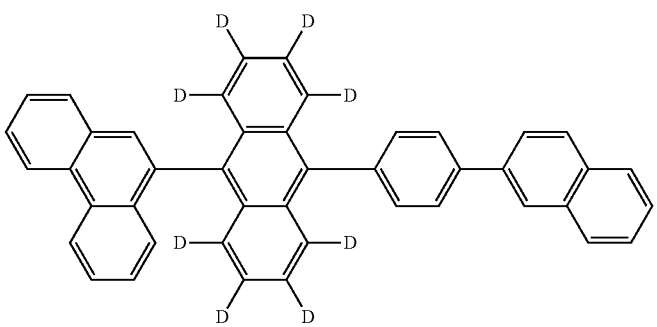
[Formula 98]
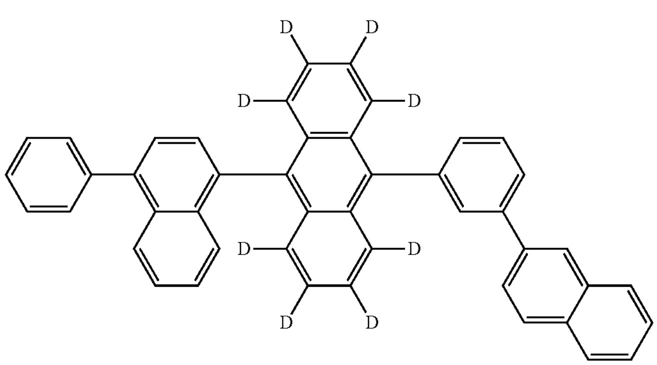

-continued
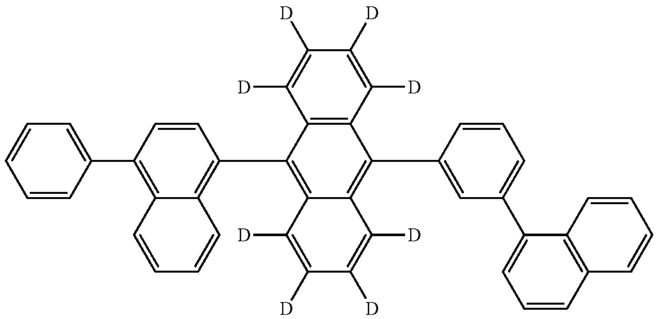
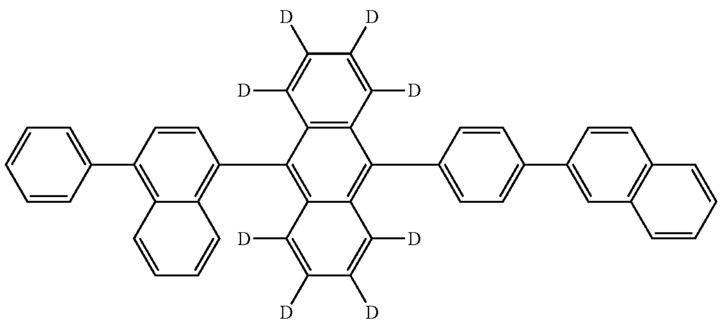
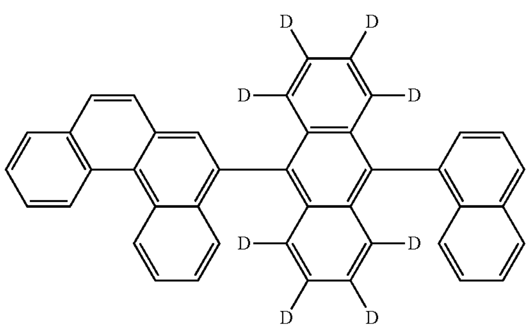
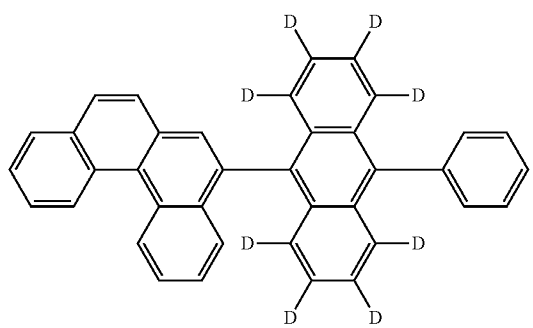
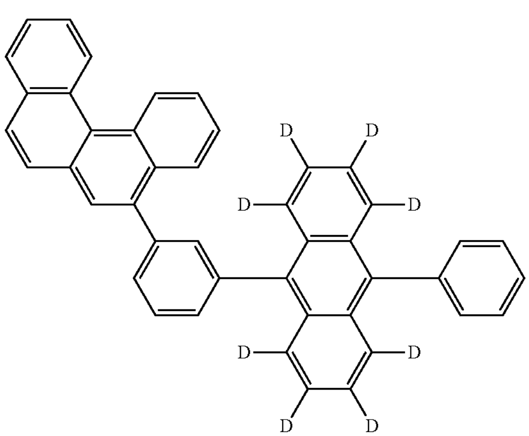
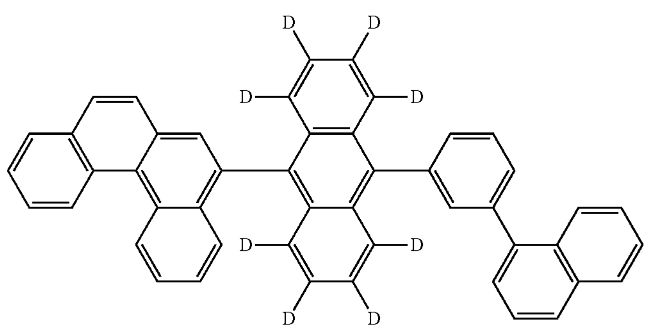

-continued
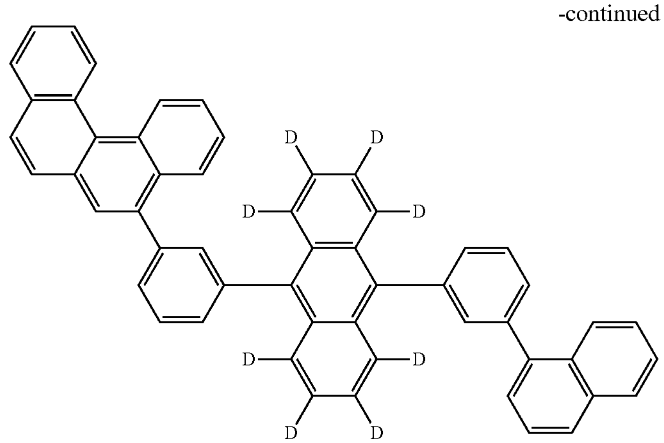
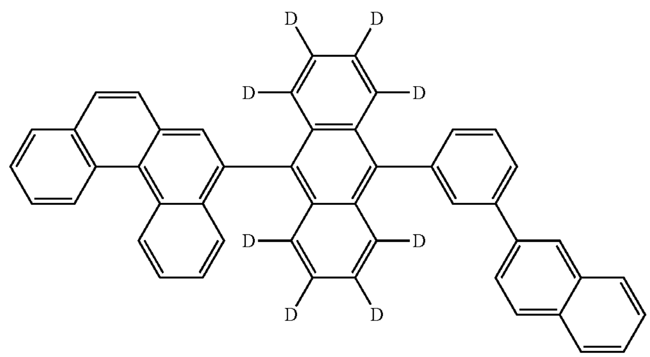
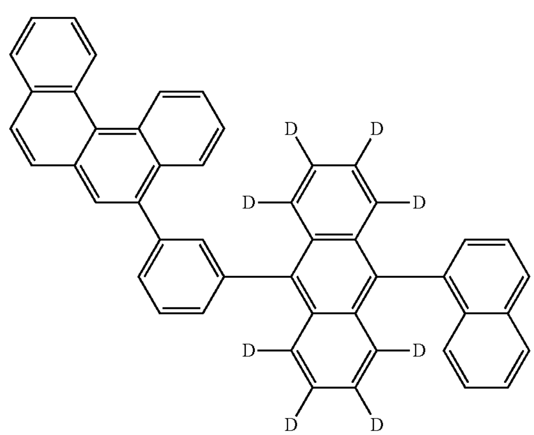
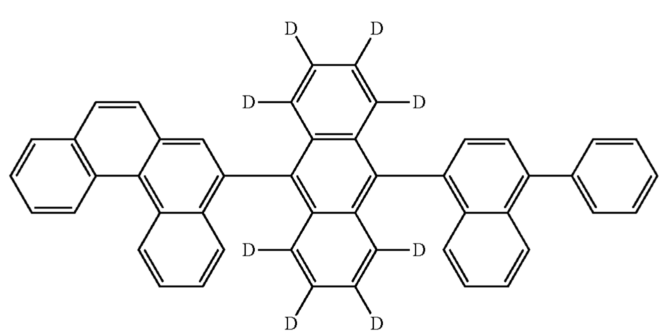

-continued
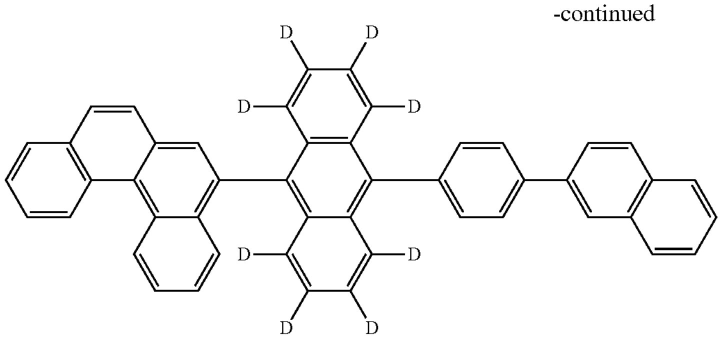
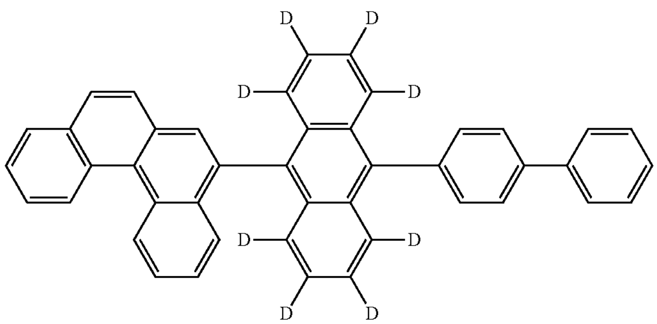
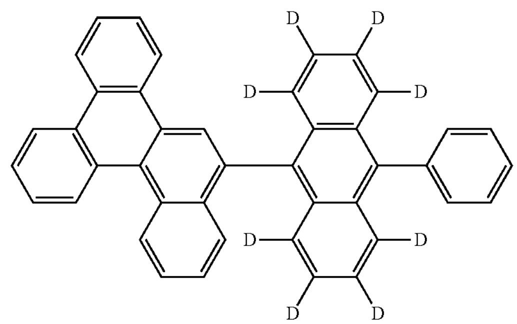
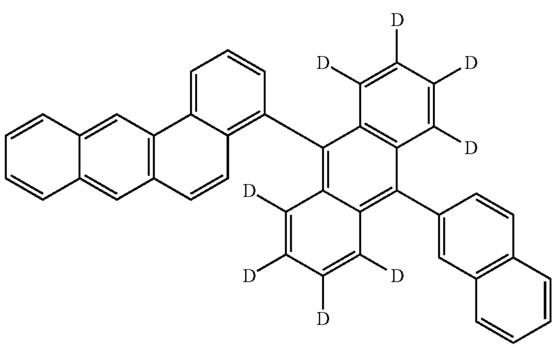
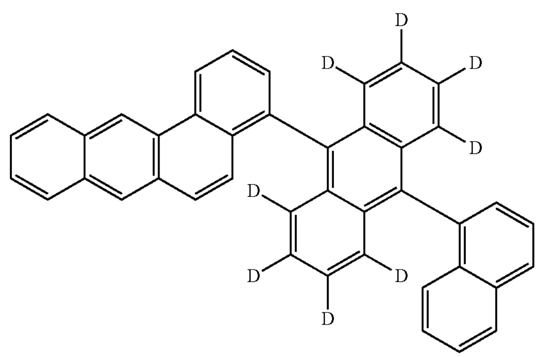
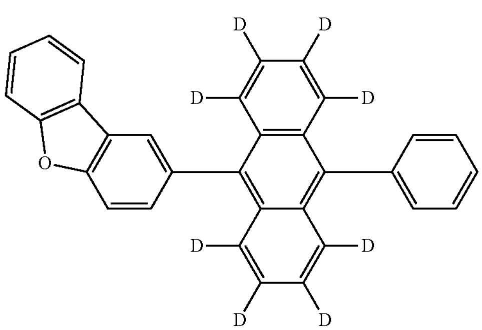
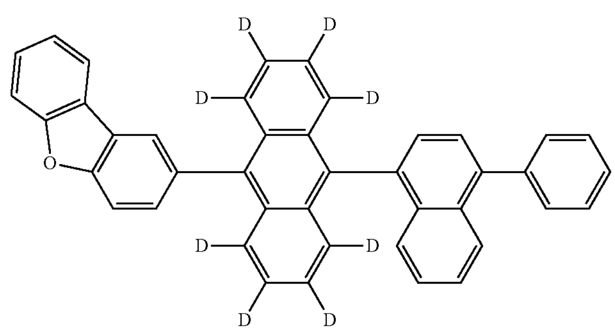
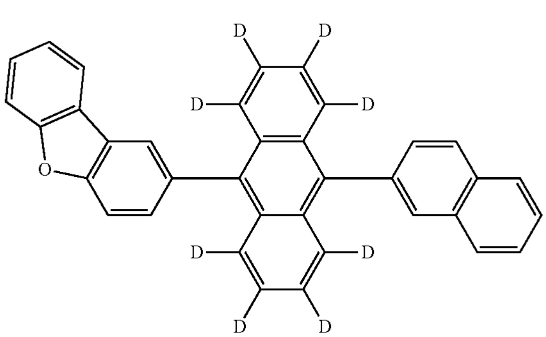
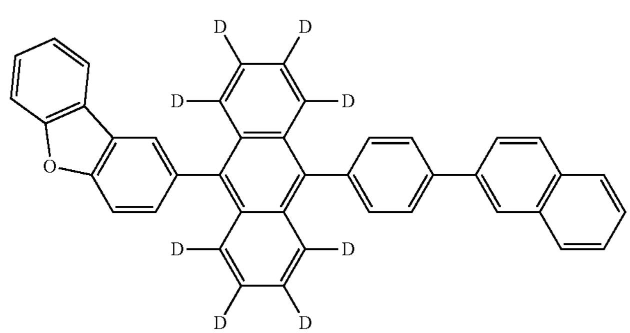

-continued
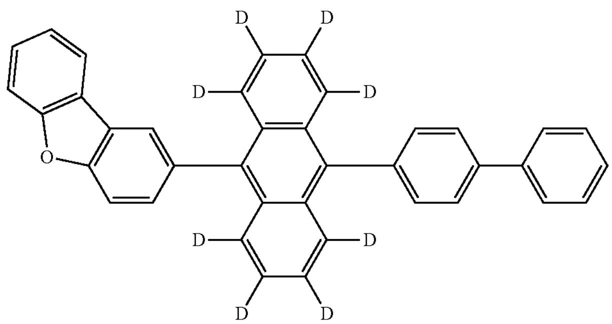
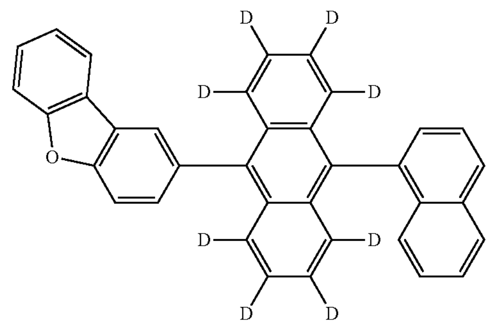
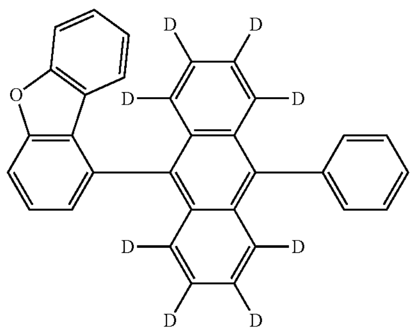
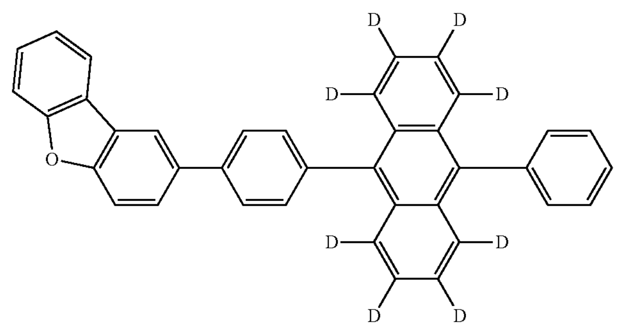
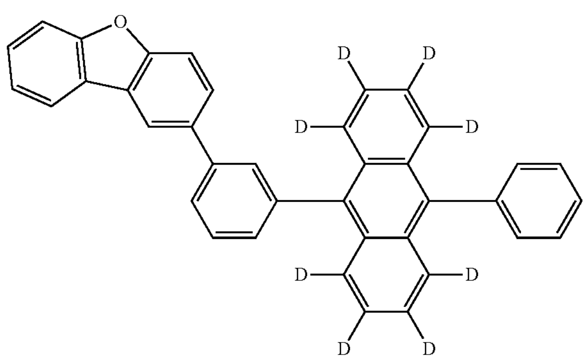
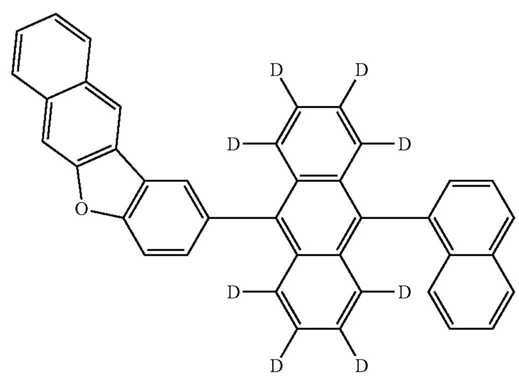
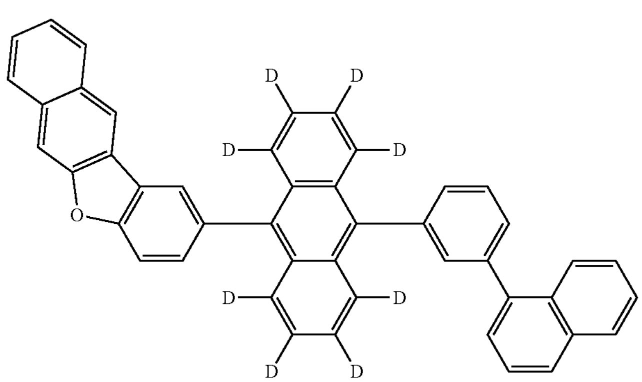

-continued
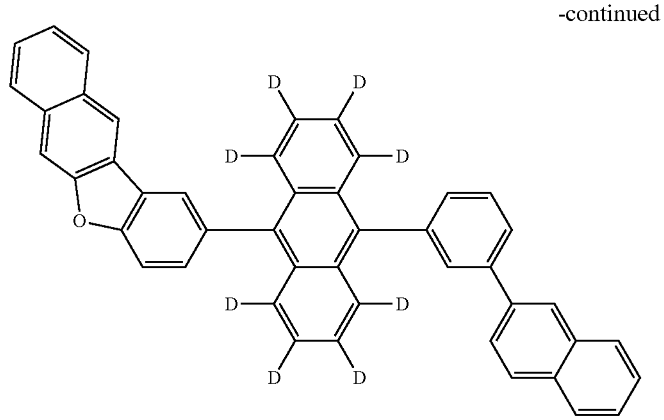
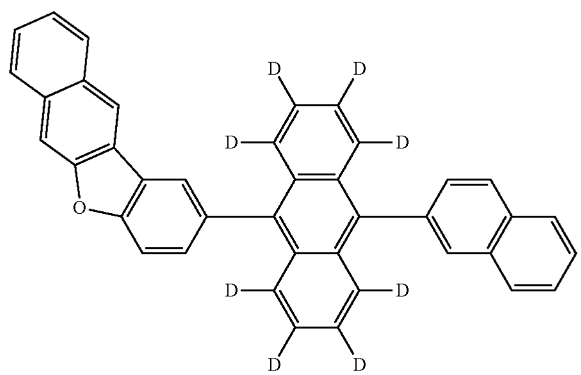
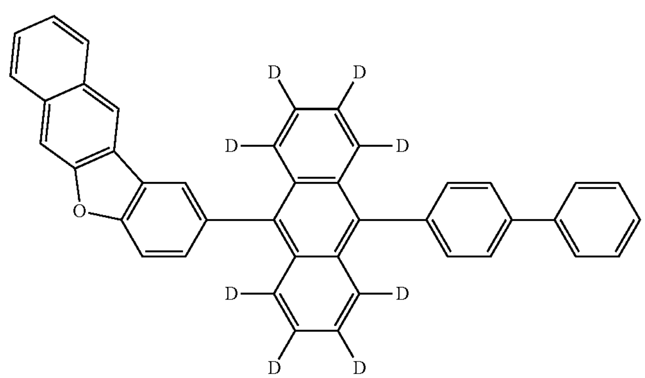
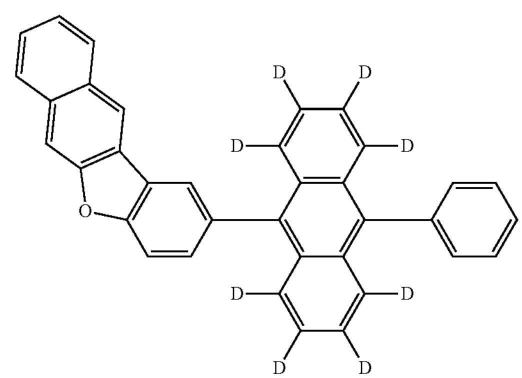
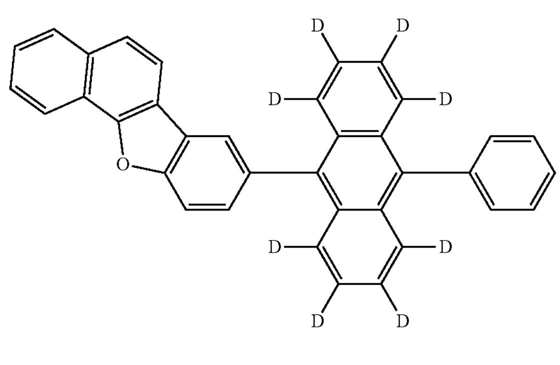
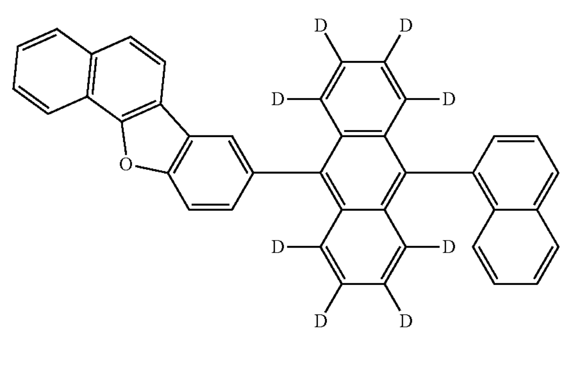

-continued
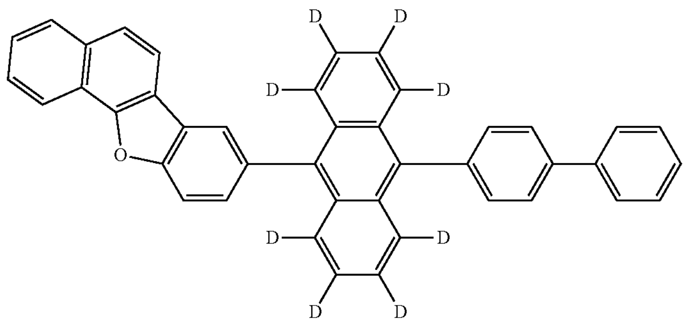
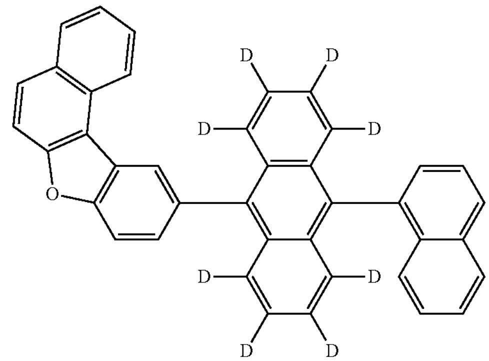
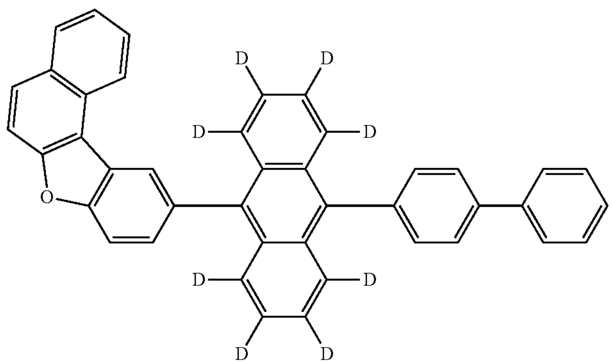
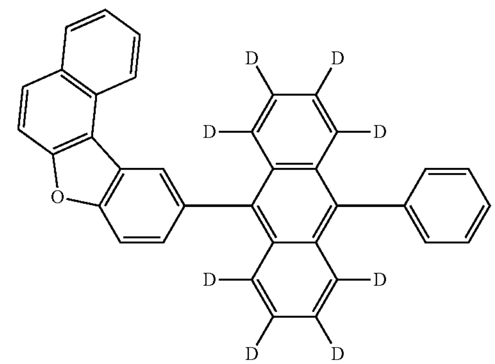
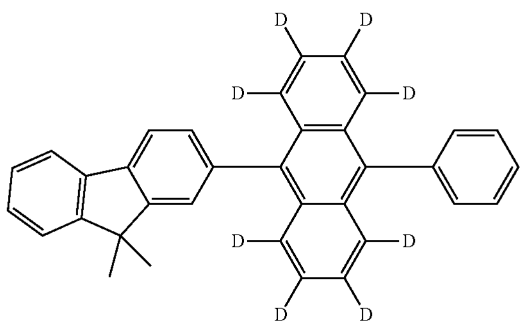
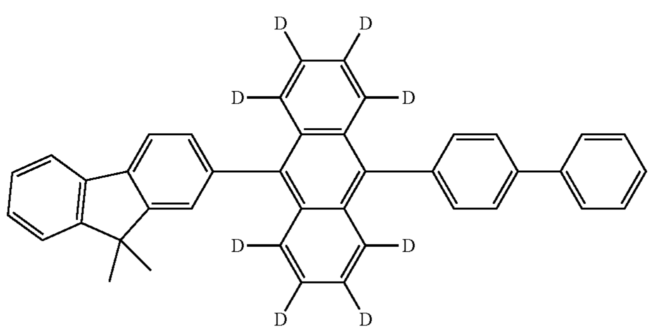
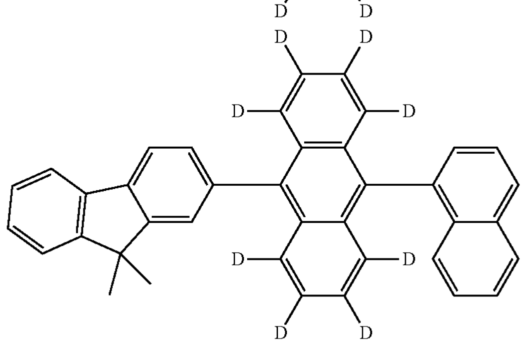

[Formula 99]
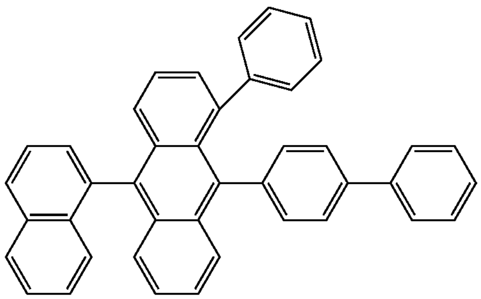
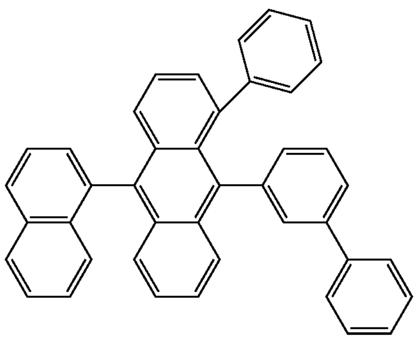
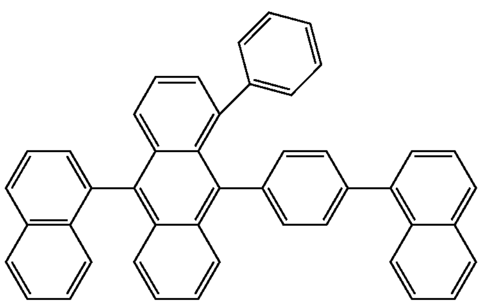
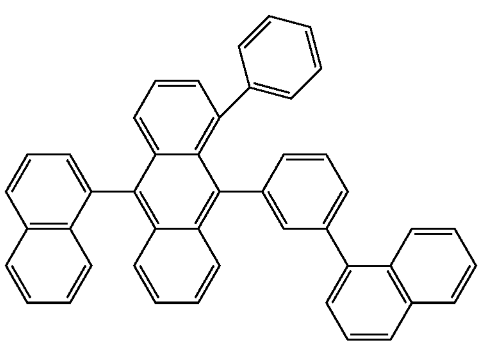
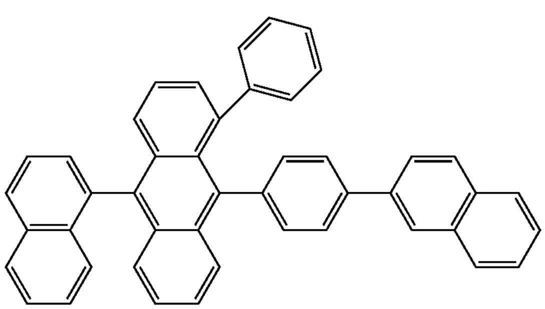
-continued
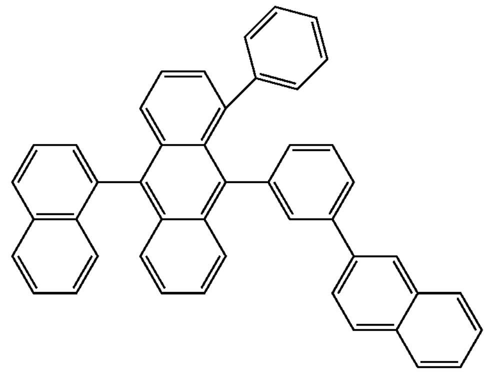
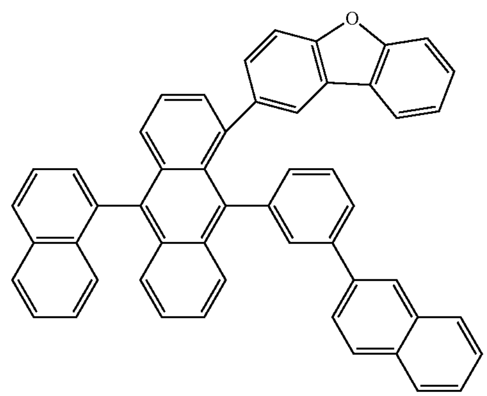
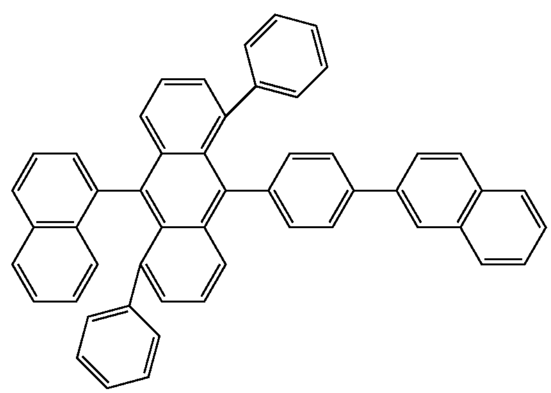
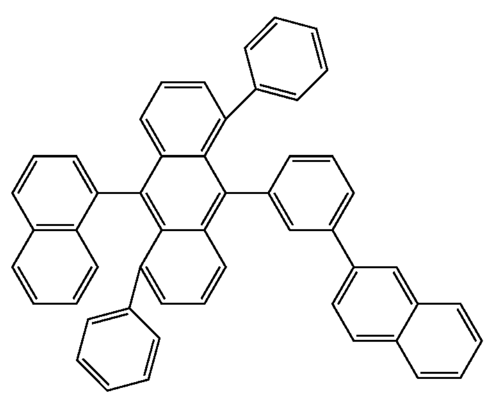

-continued
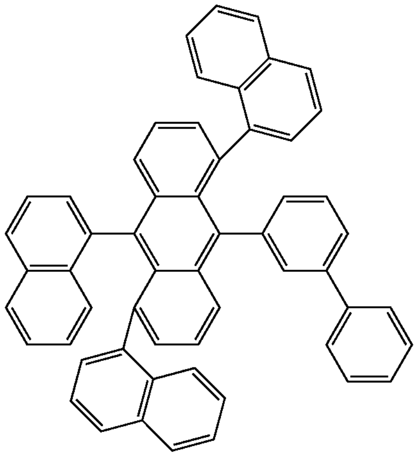
[Formula 100]
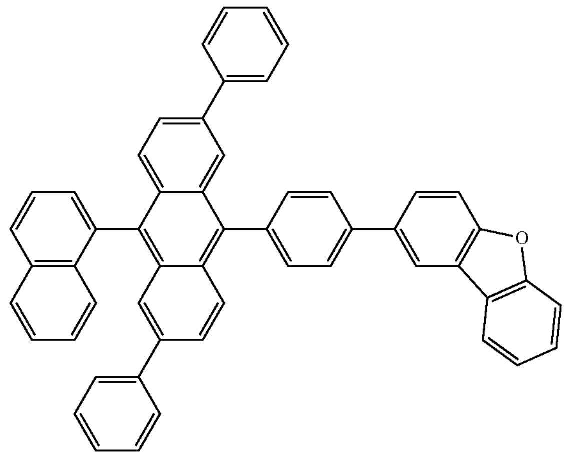
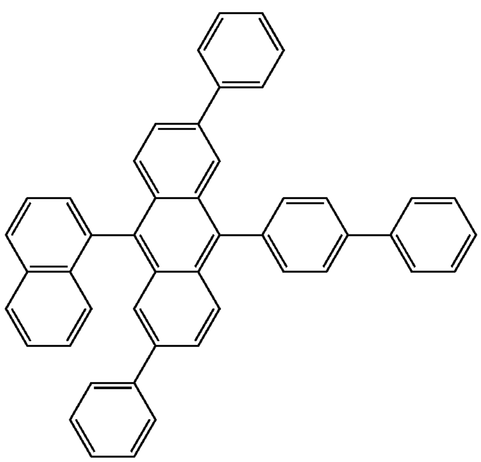
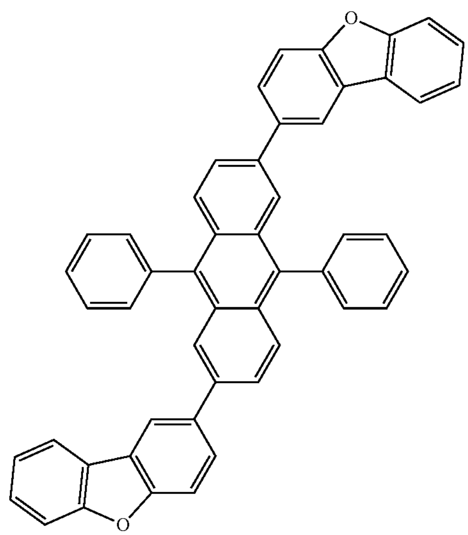
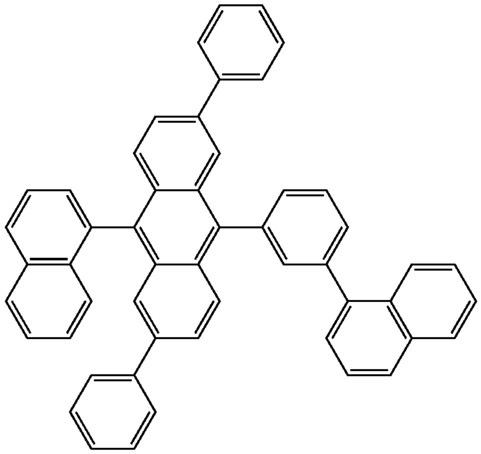
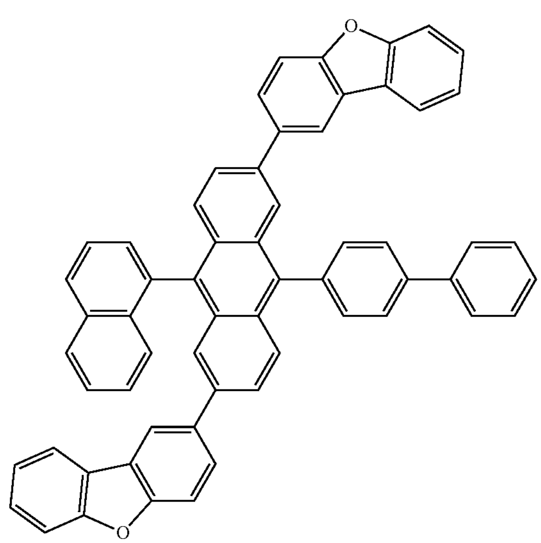

-continued
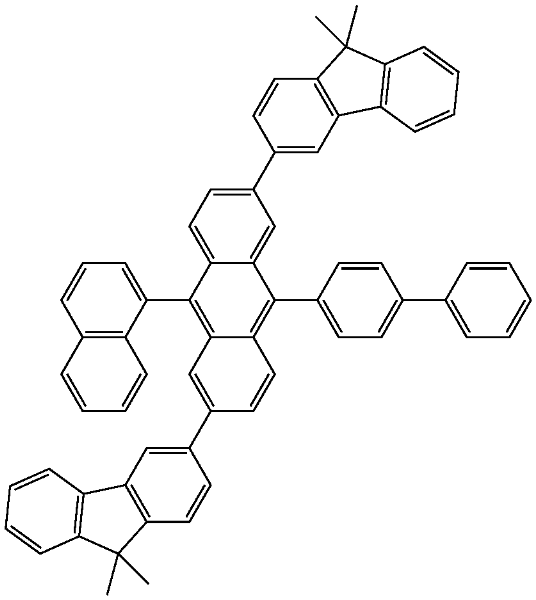
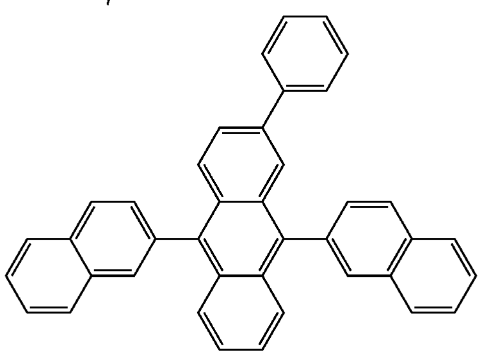
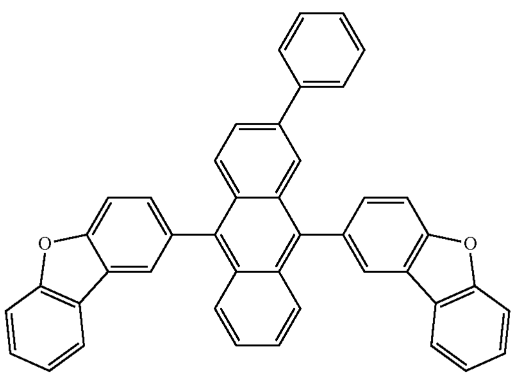 [SMILES: c1ccc(-c2ccc3c(-c4ccc5sc6ccccc6c5c4)c4ccccc4c(-c4ccc5sc6ccccc6c5c4)c3c2)cc1]
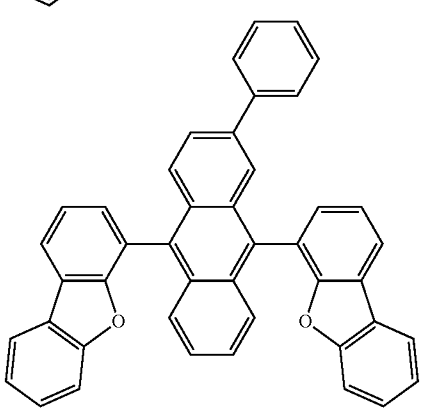
-continued
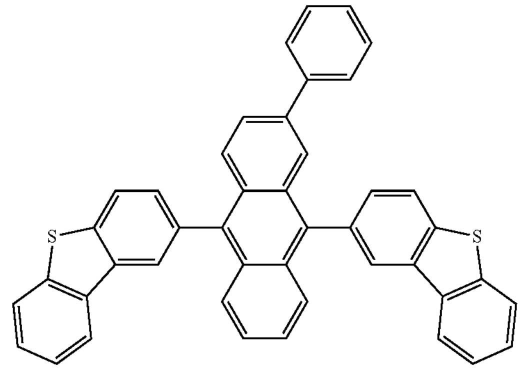
[Formula 101]
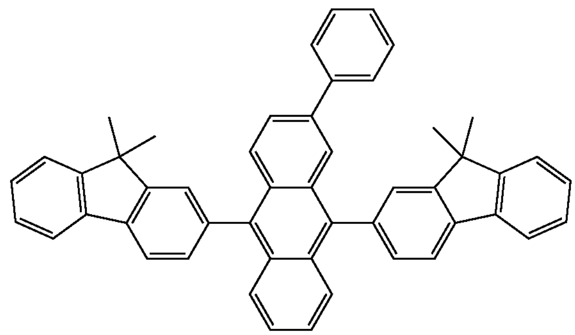
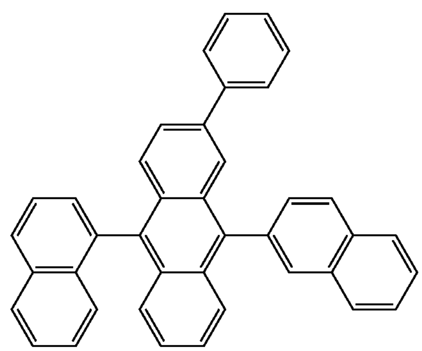
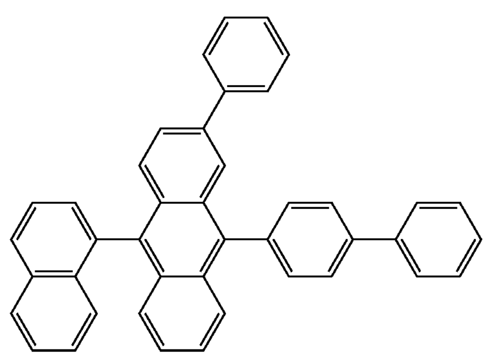

-continued
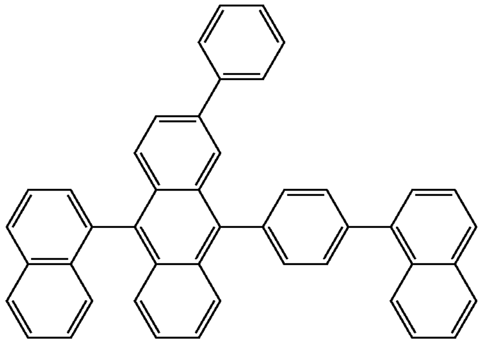
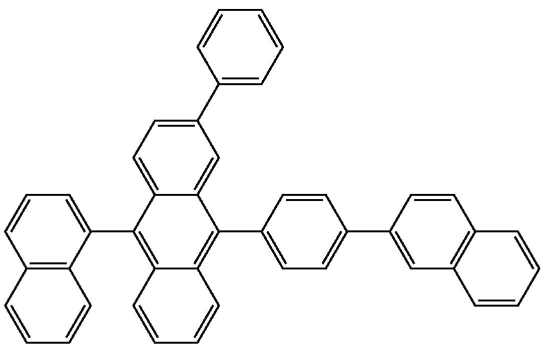
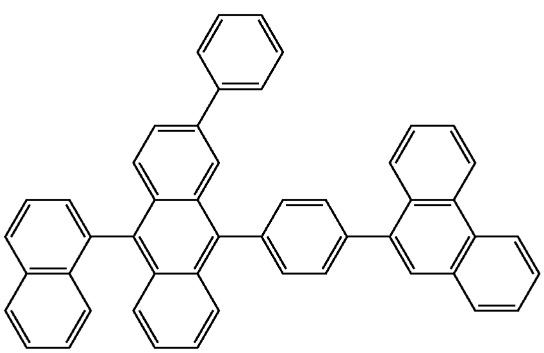
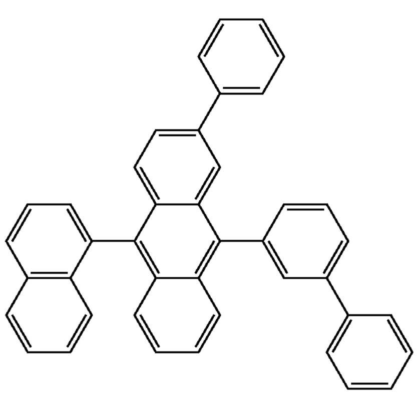
-continued
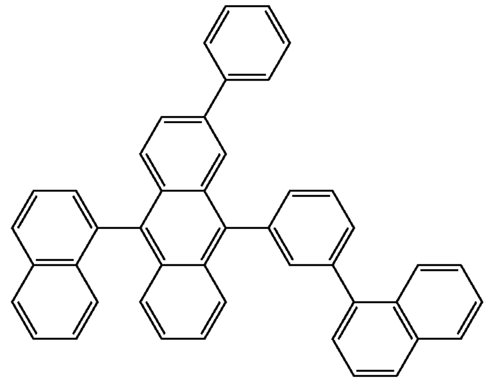
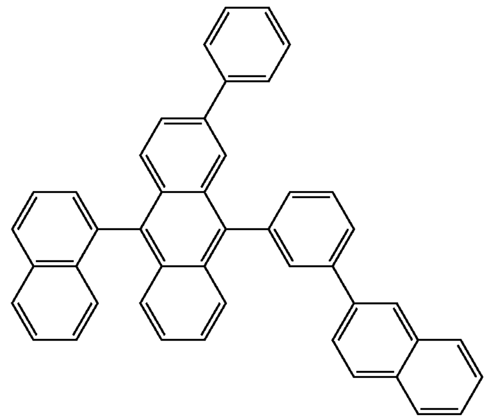
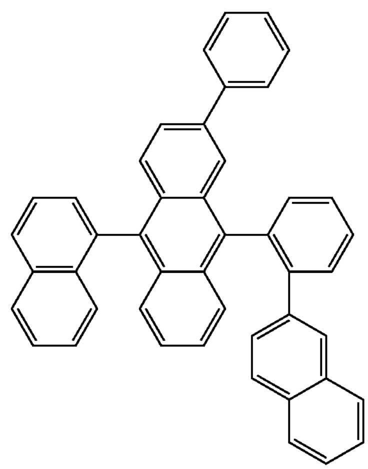
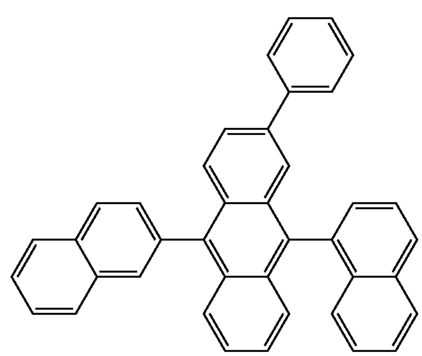

-continued
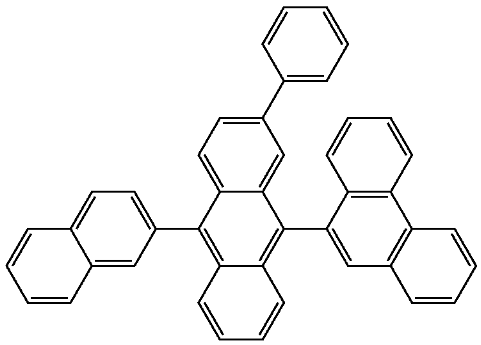
[Formula 102]
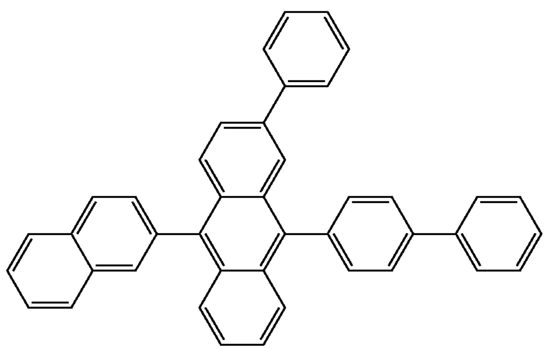
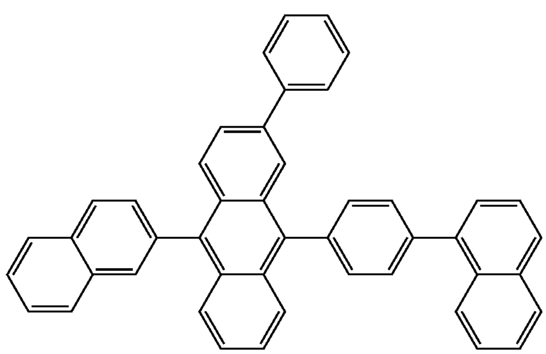
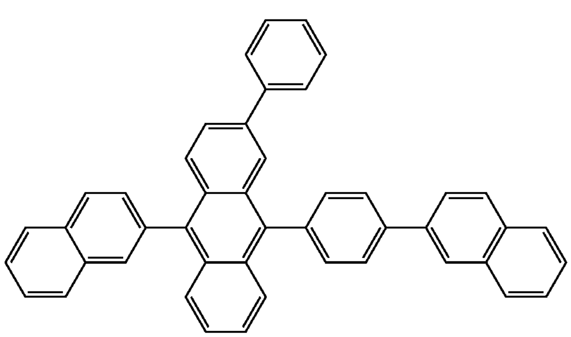
-continued
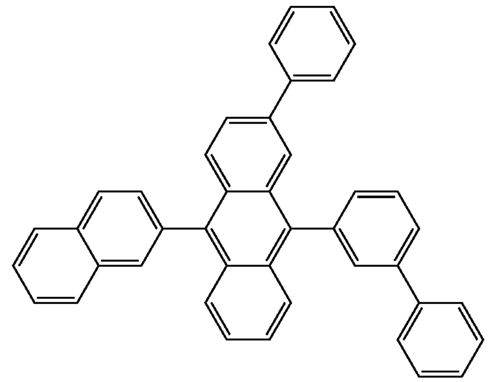
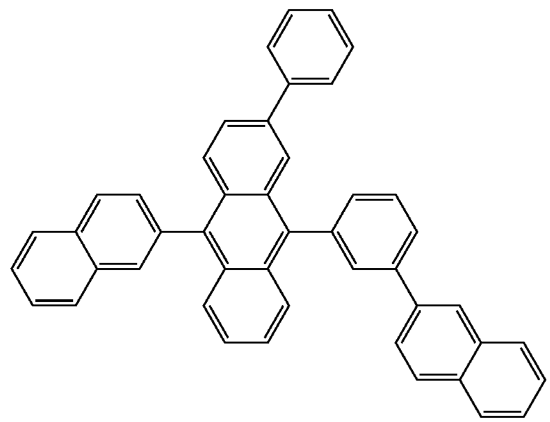
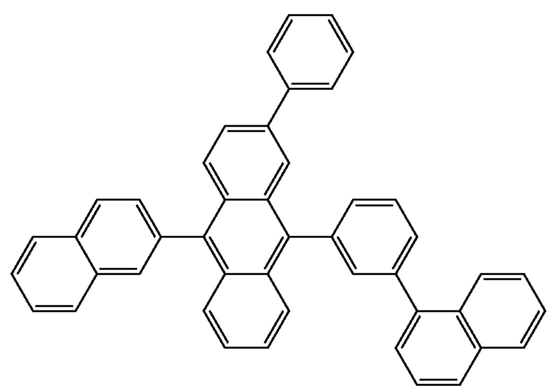
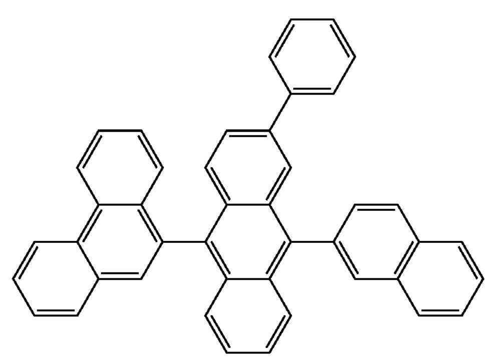

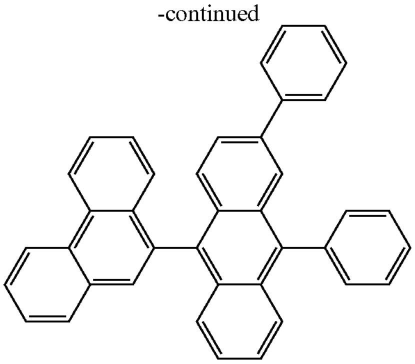
[Formula 103]
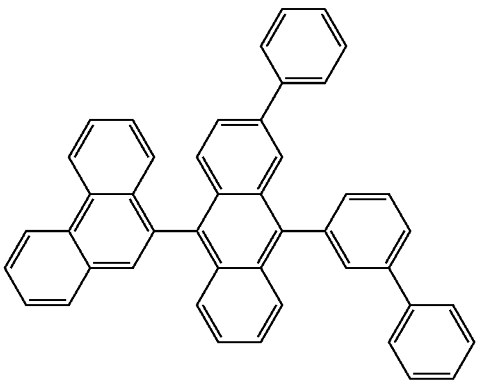
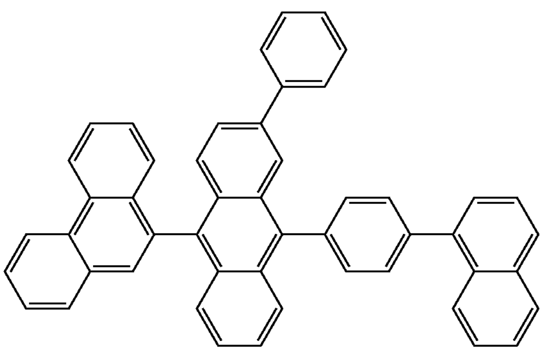
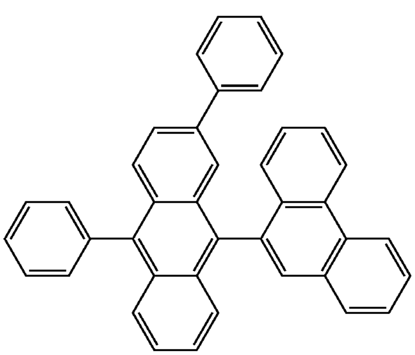
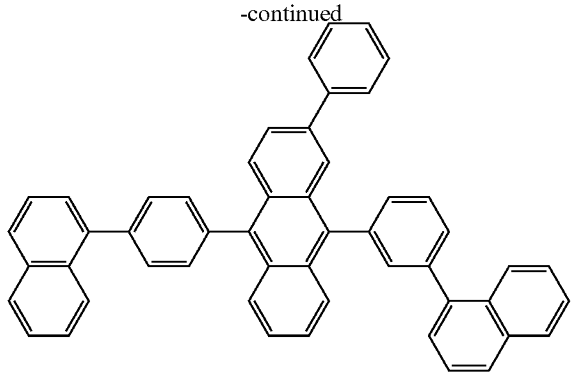
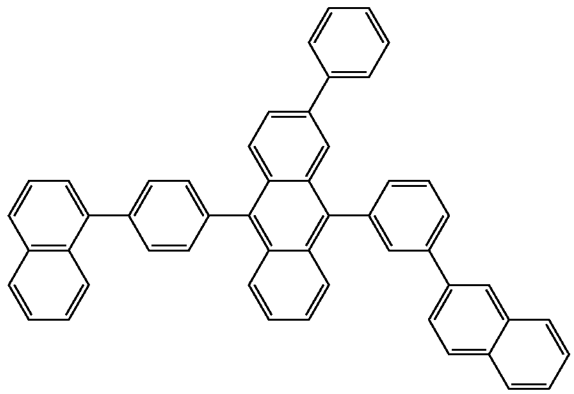
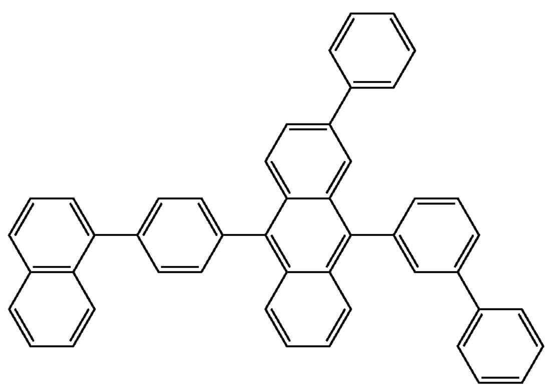
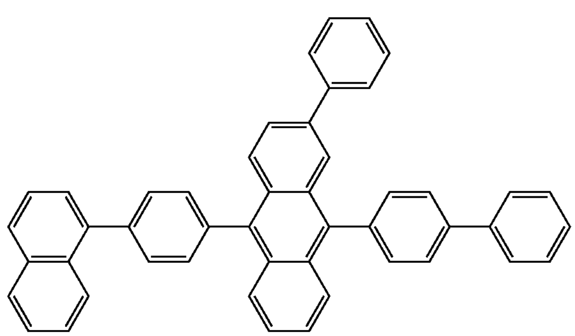

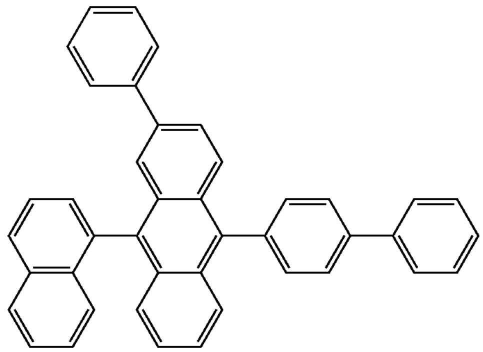
[Formula 104]
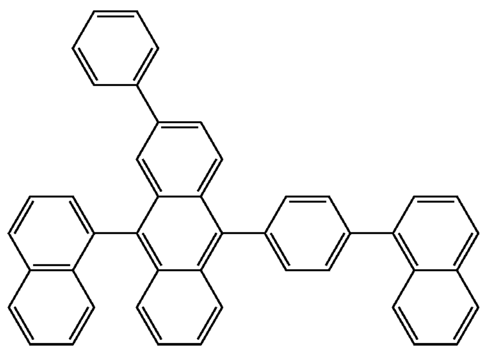
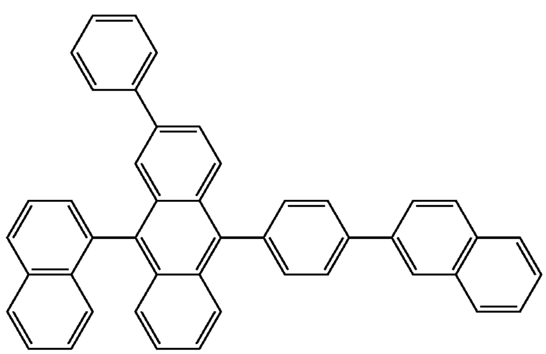
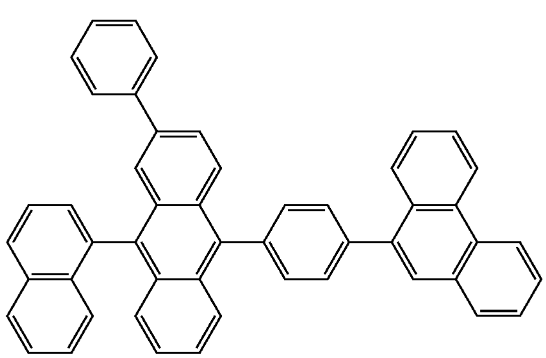
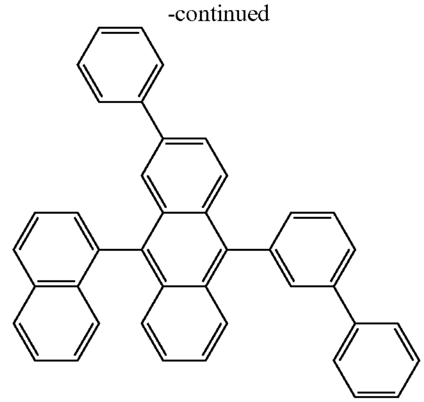
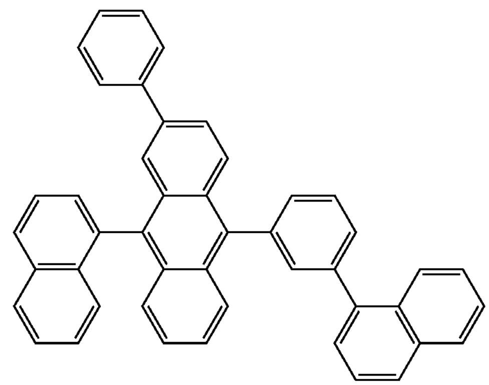
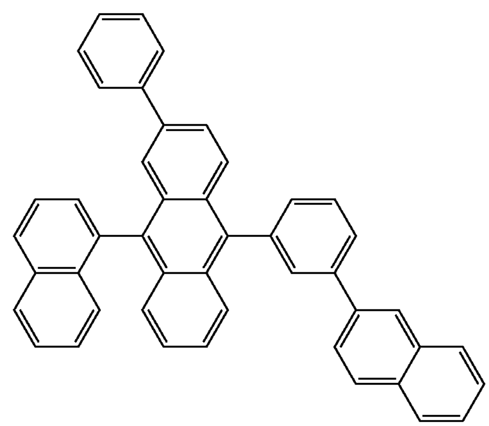
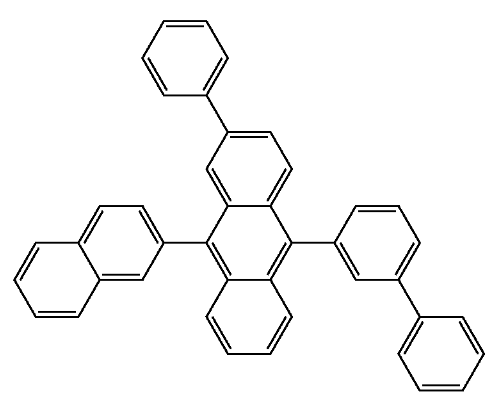

-continued
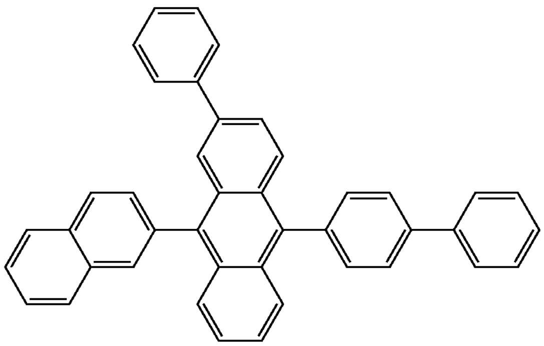
[Formula 105]
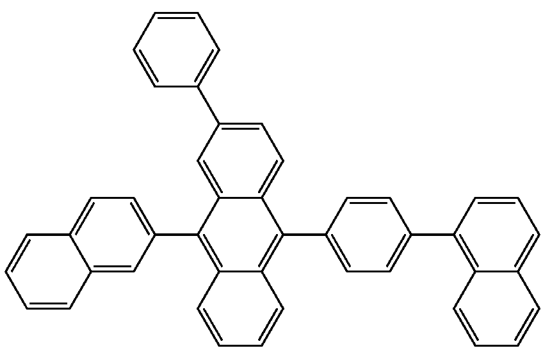
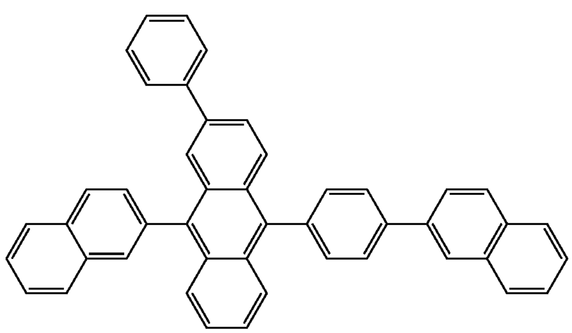
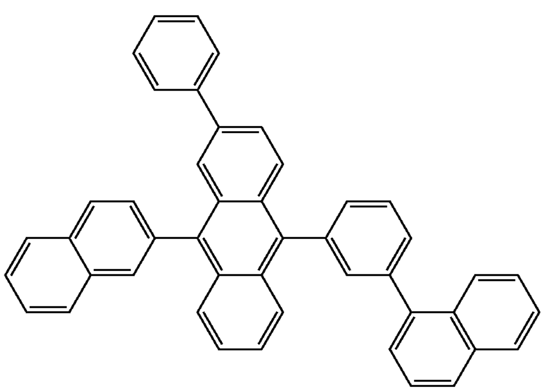
-continued
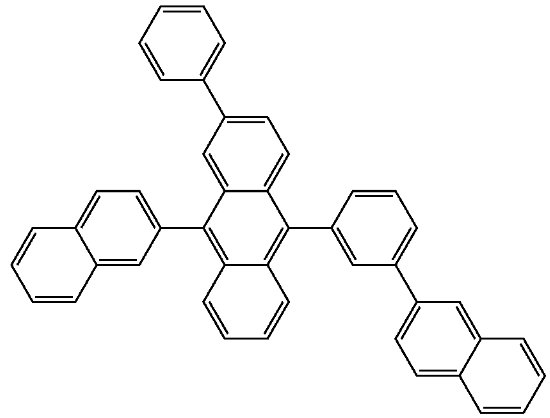
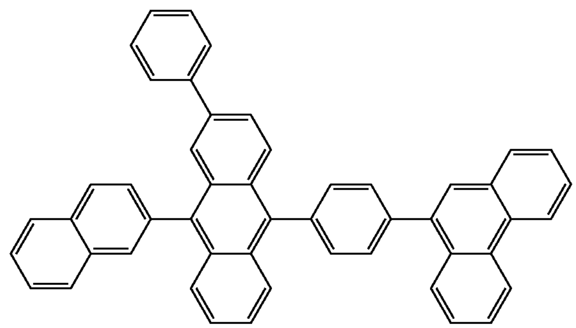
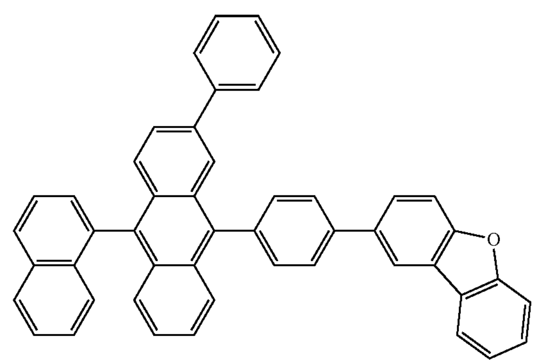
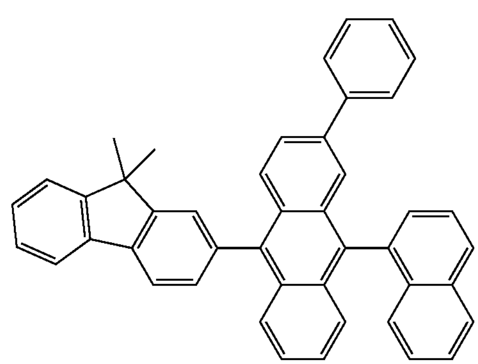

-continued
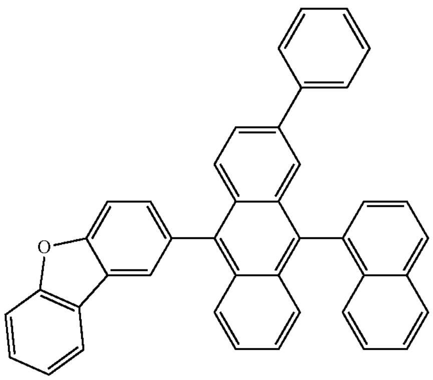
[Formula 106]
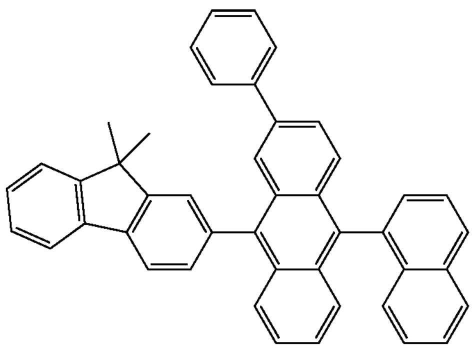
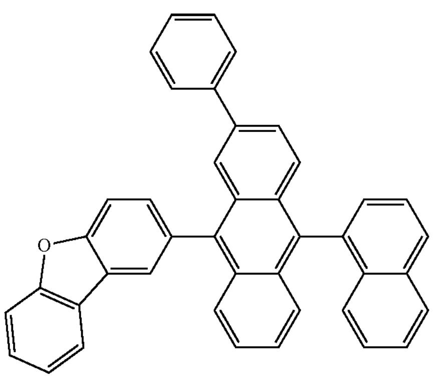
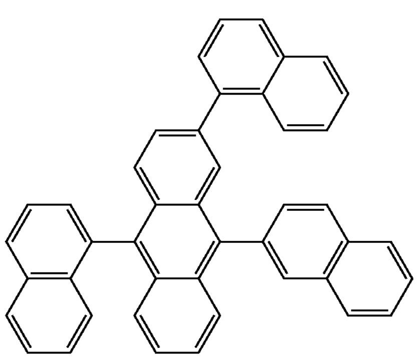
-continued
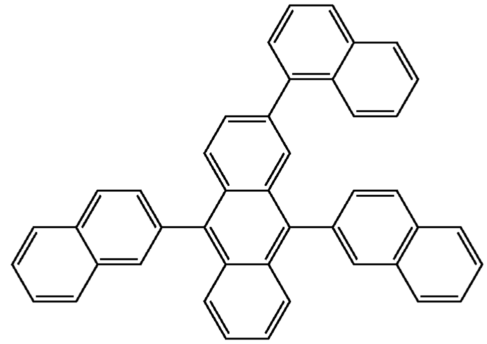
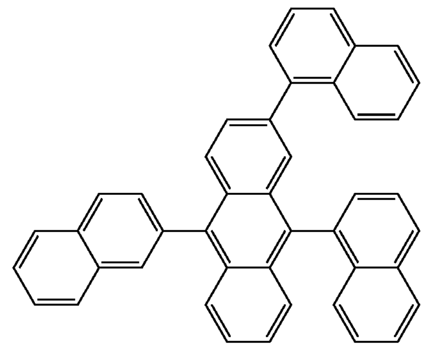
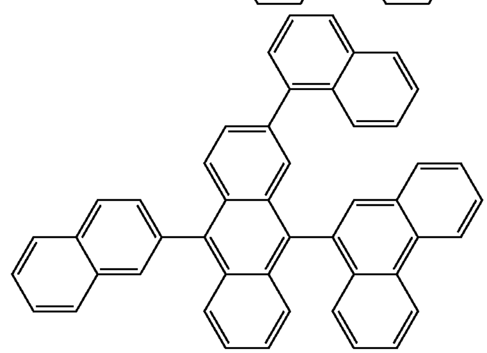
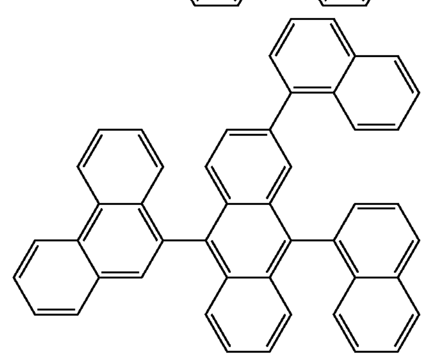
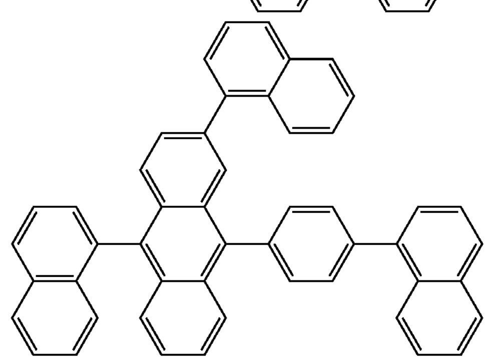

[Formula 107]
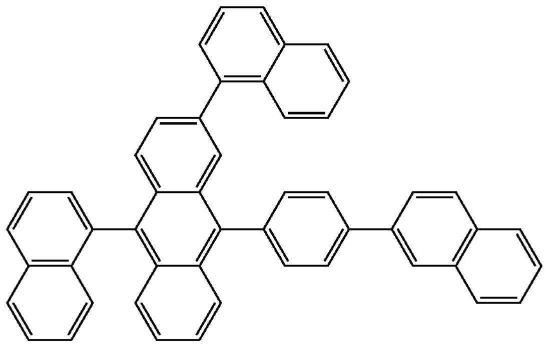
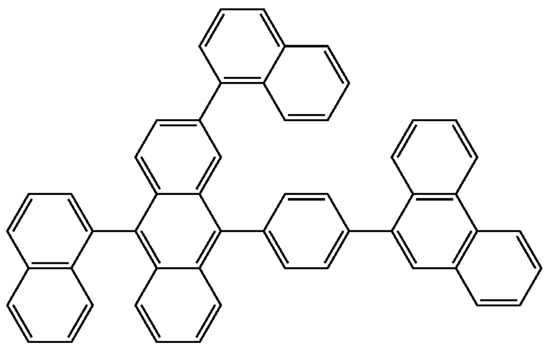
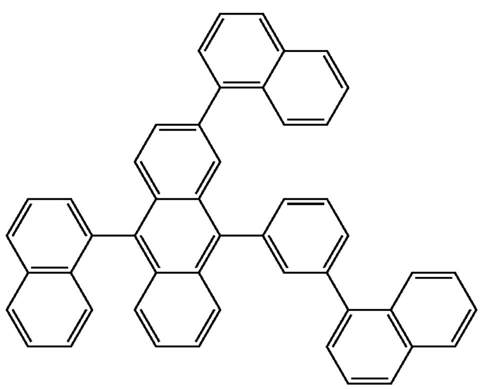
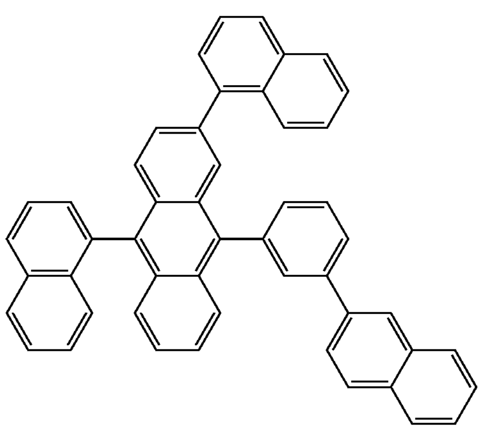
-continued
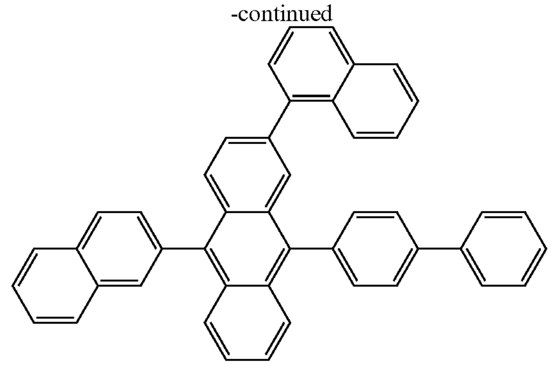
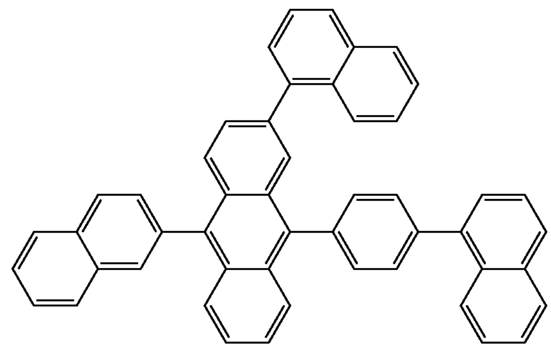
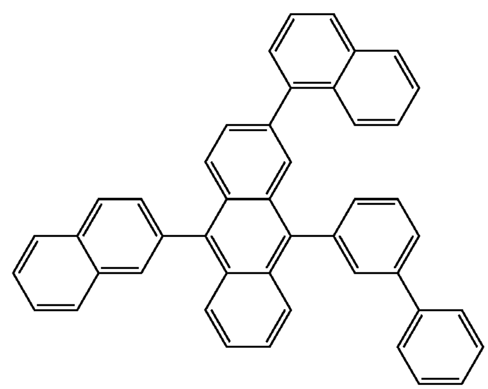
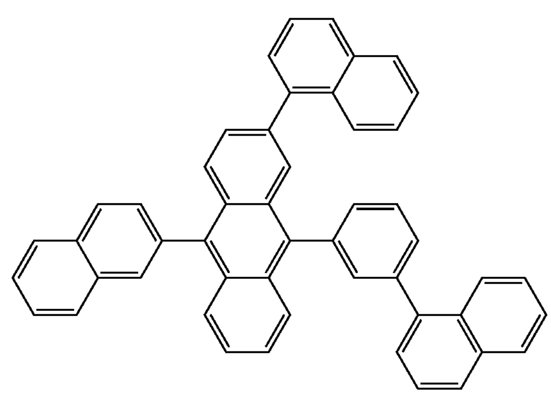

[Formula 108]
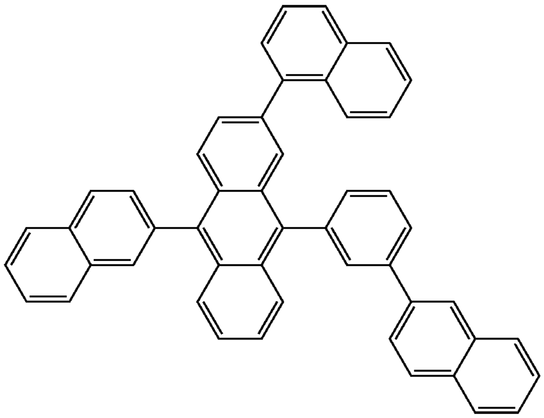
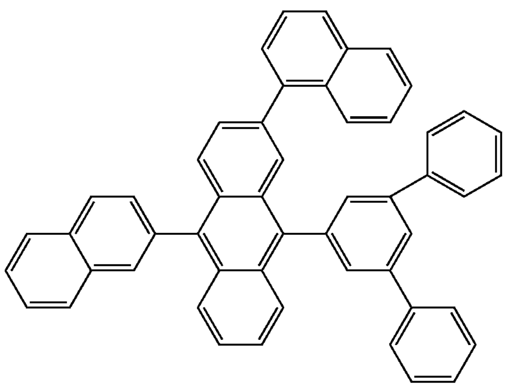
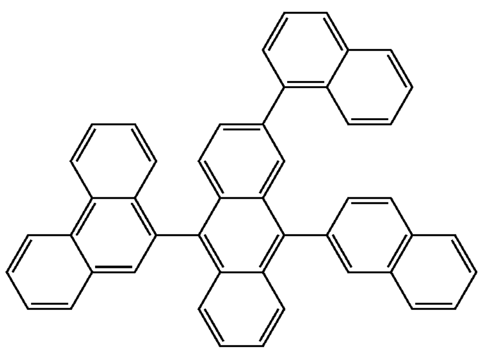
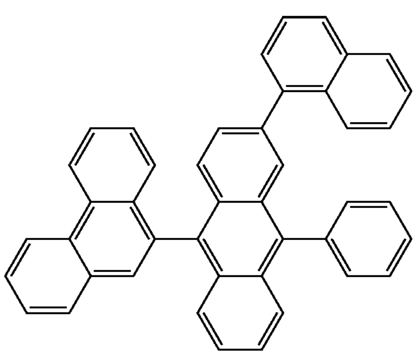
-continued
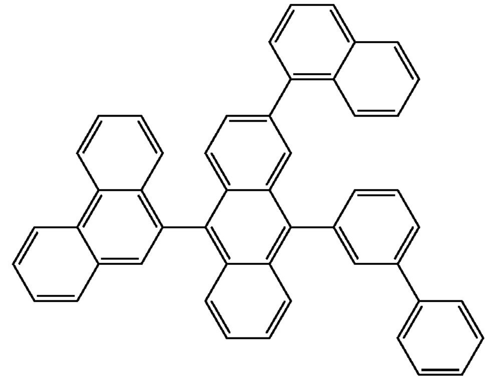
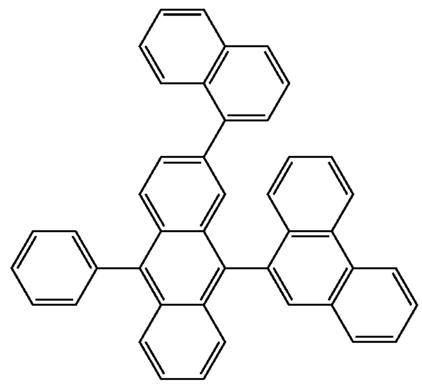
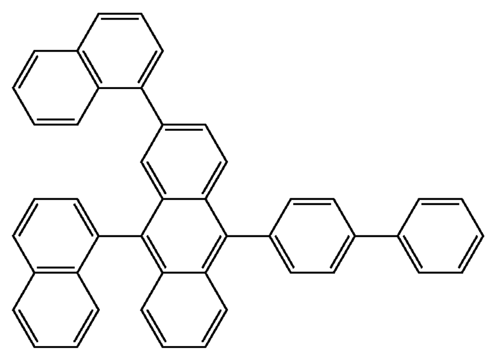
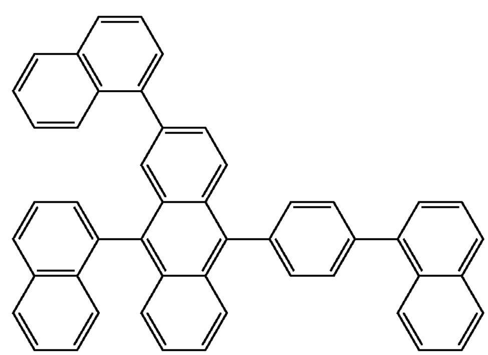

[Formula 109]
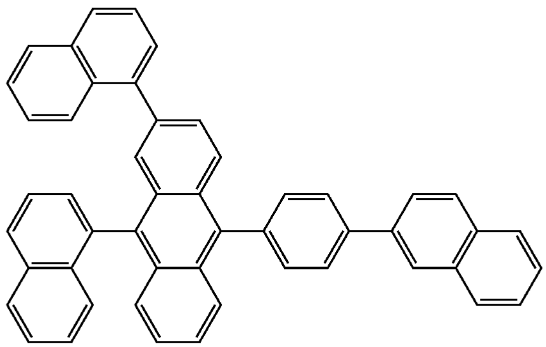
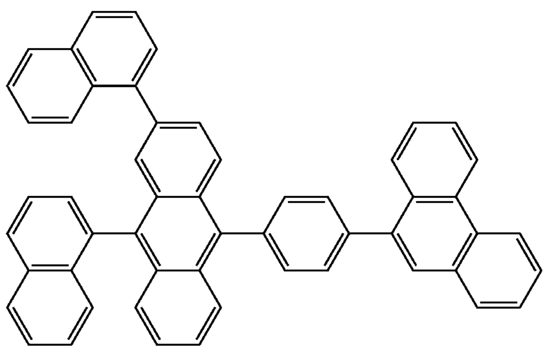
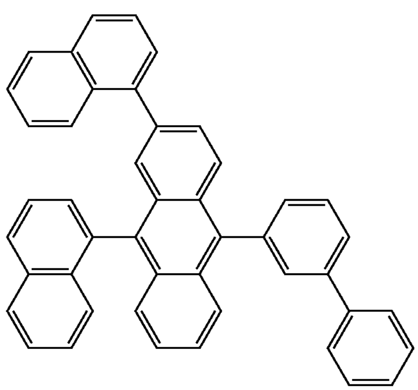
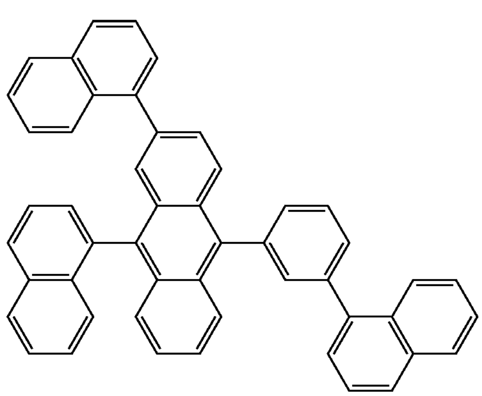
-continued
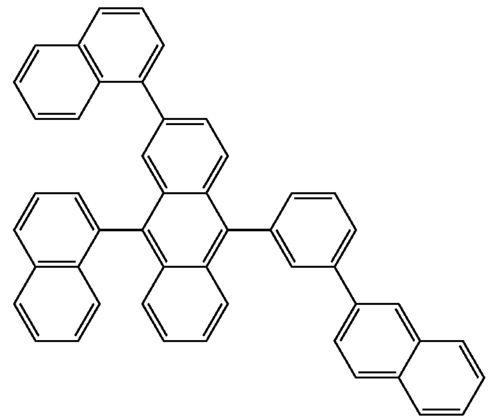
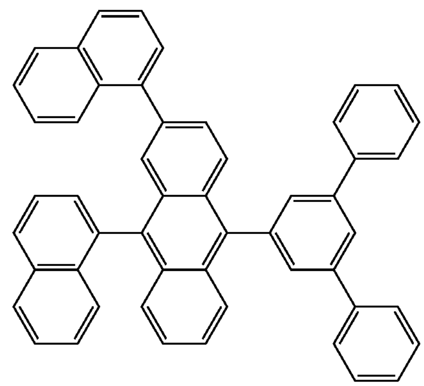
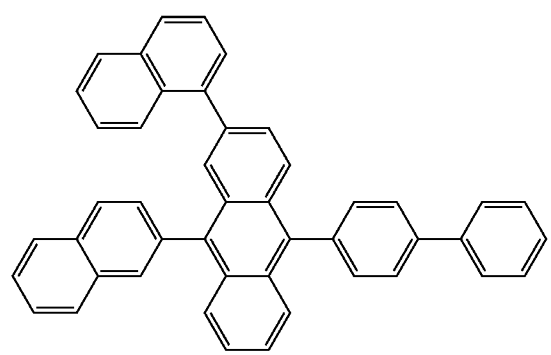
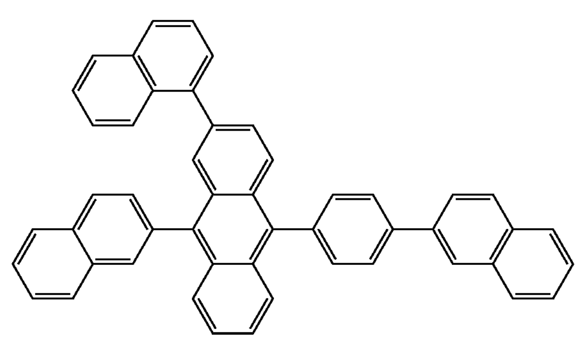

[Formula 110]
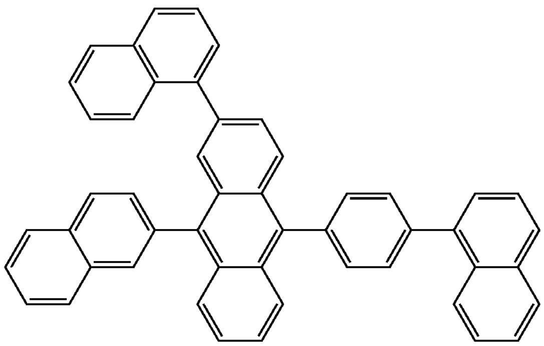
-continued
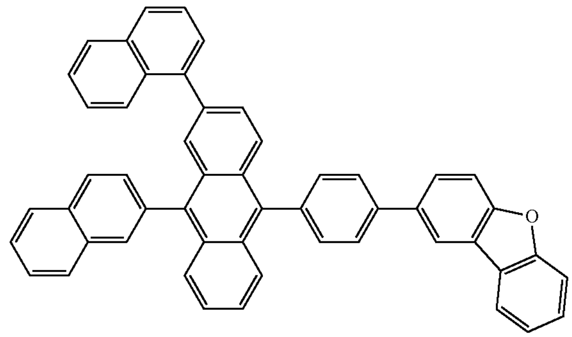
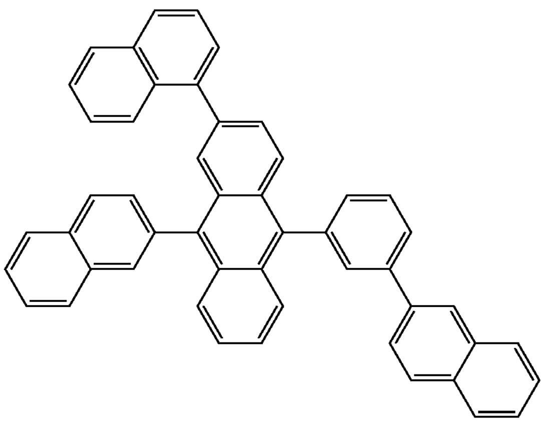
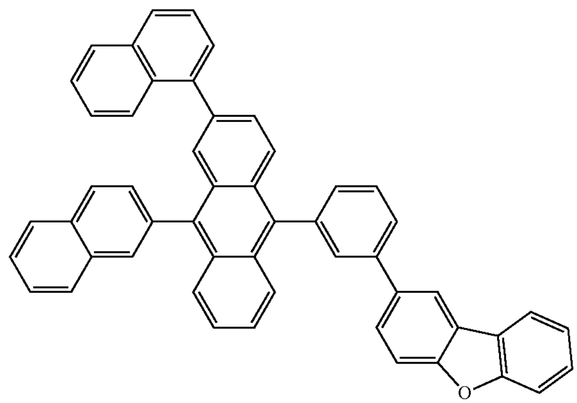
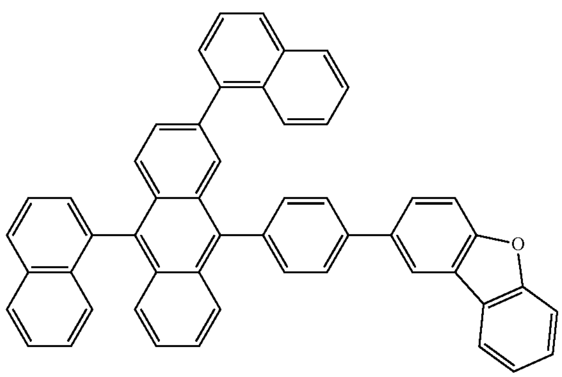
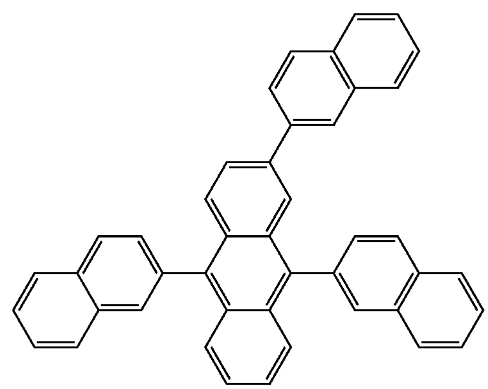
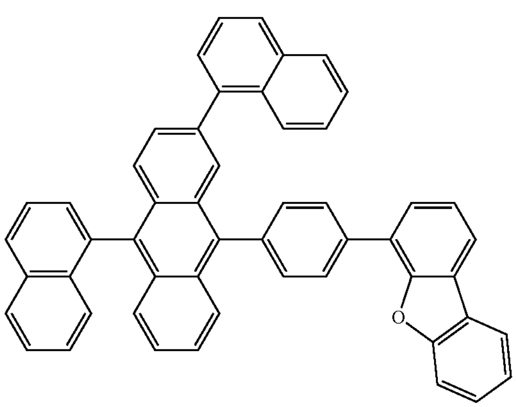
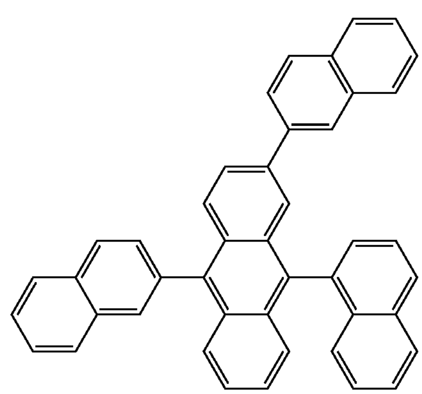

[Formula 111]
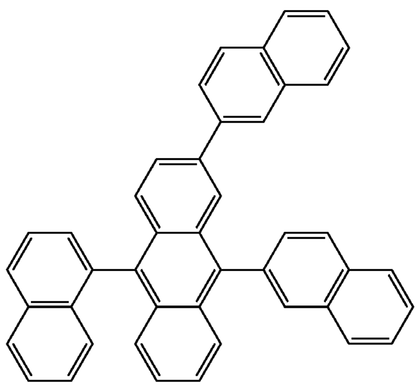
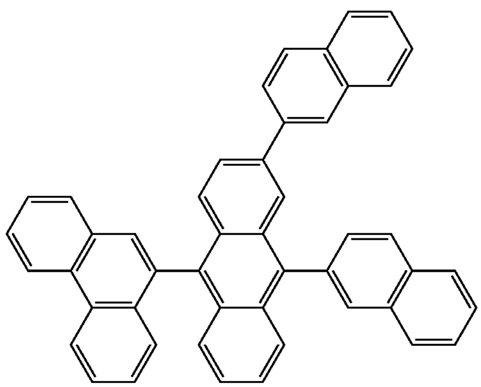
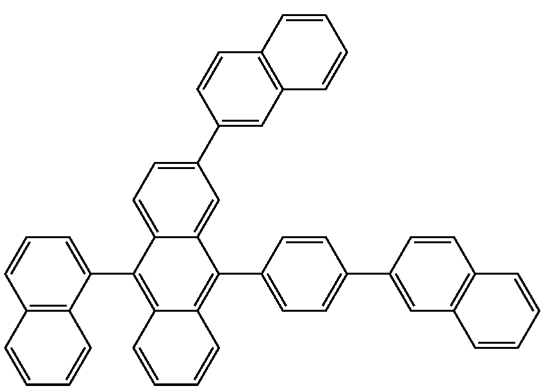
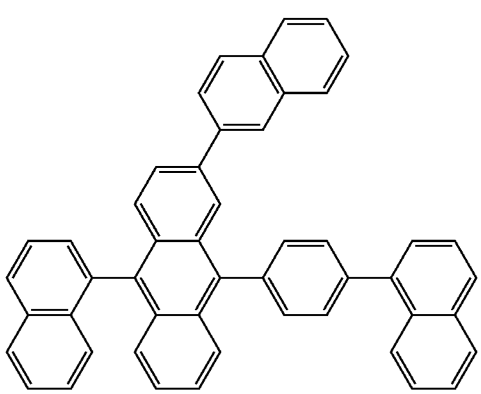
-continued
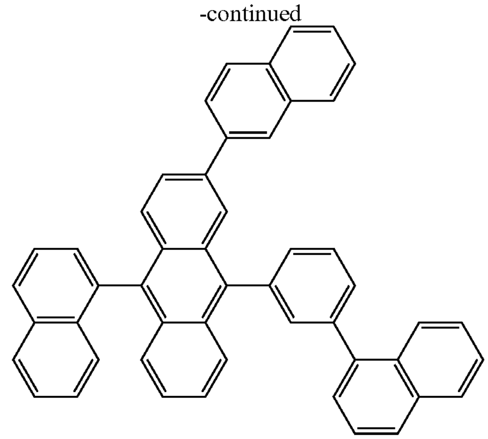
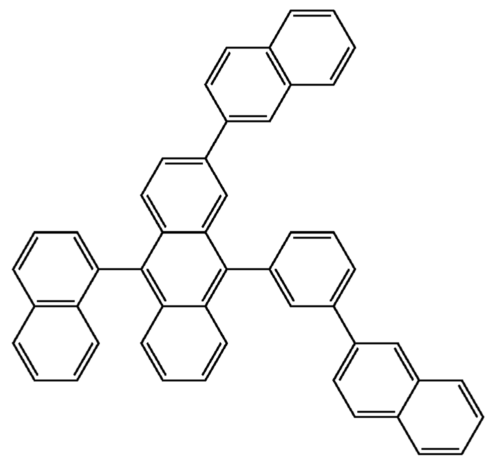
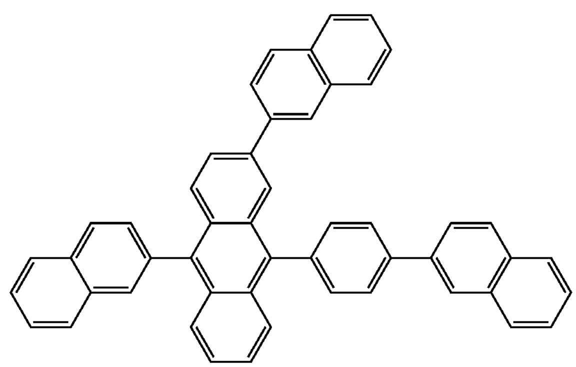
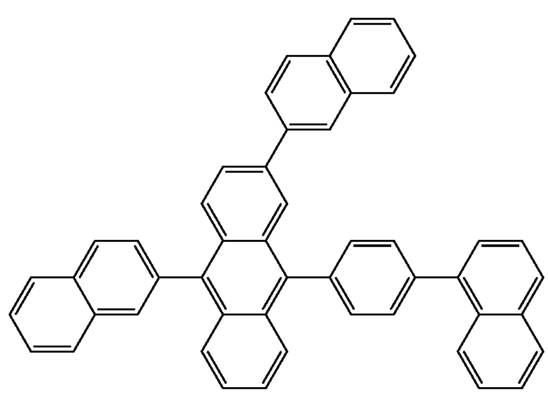

[Formula 112]
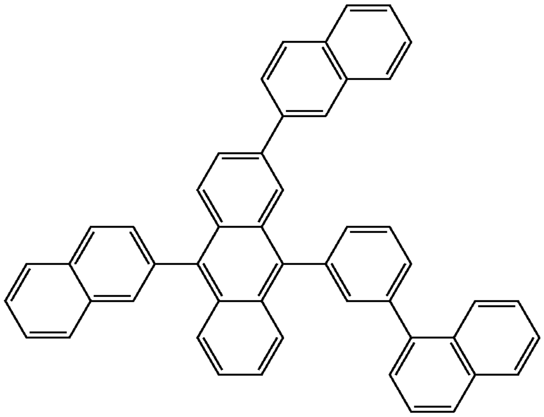
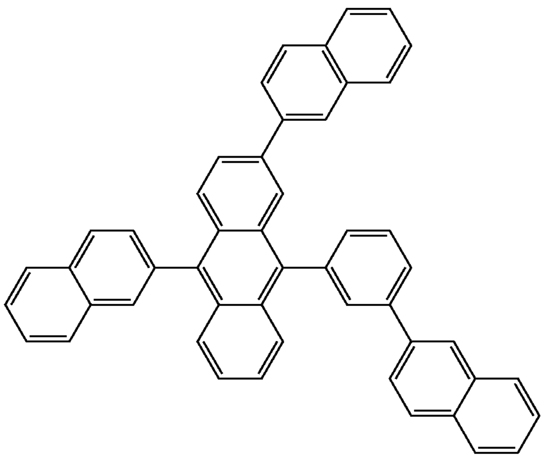
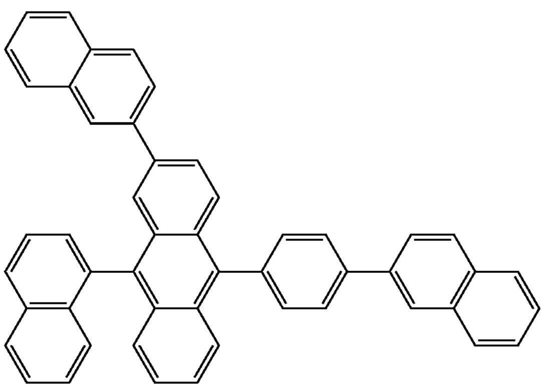
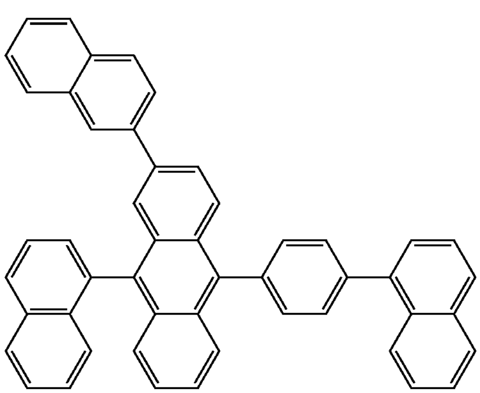
-continued
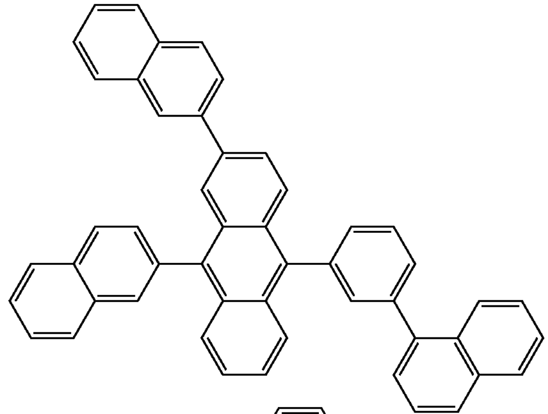
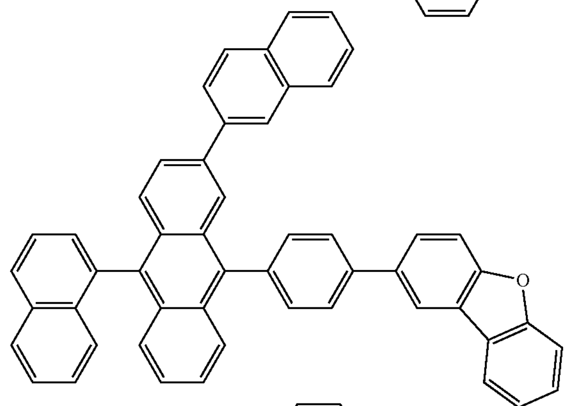
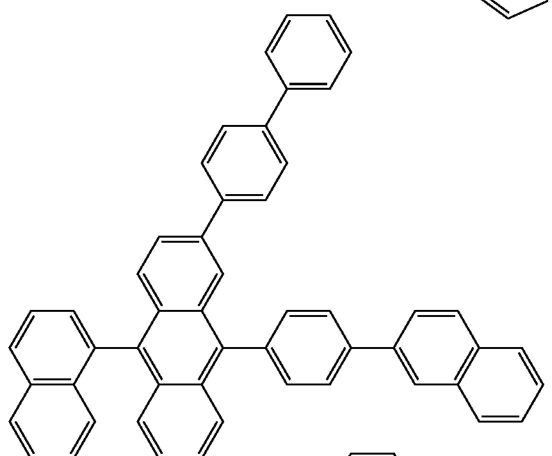
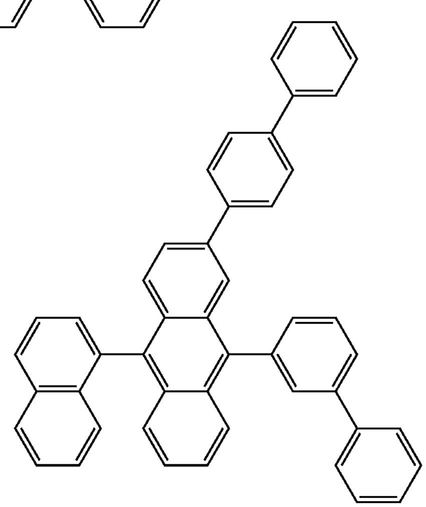

[Formula 113]
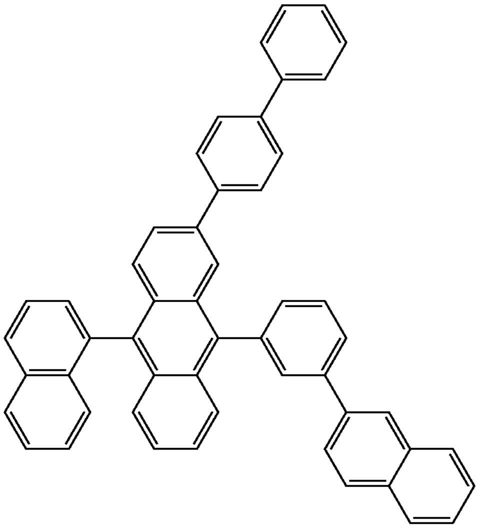
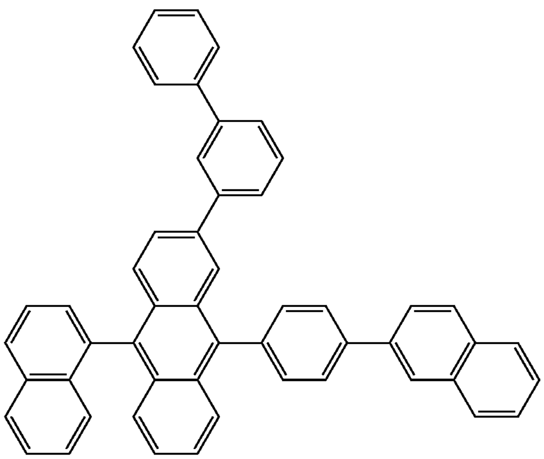
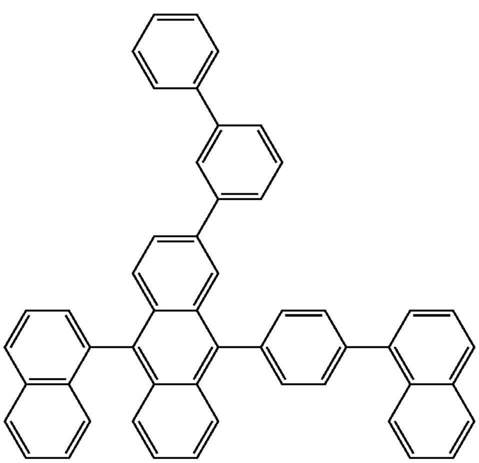
-continued
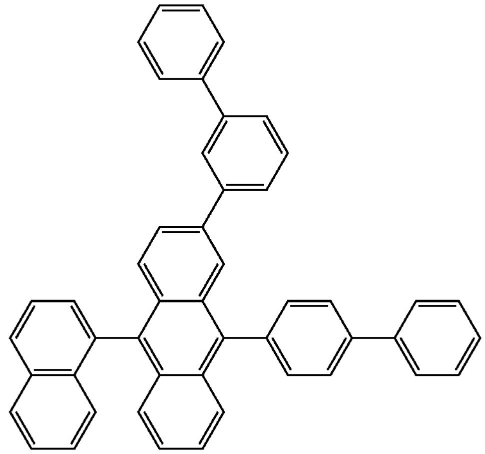
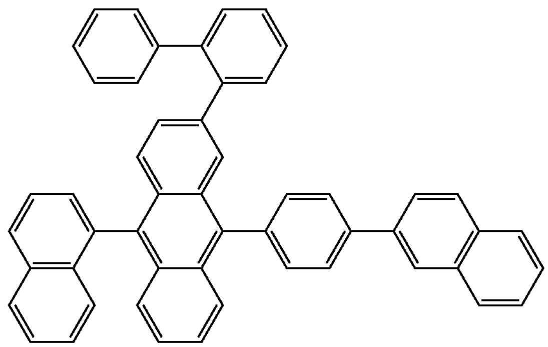
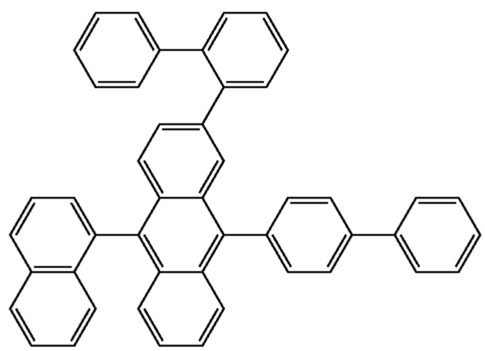
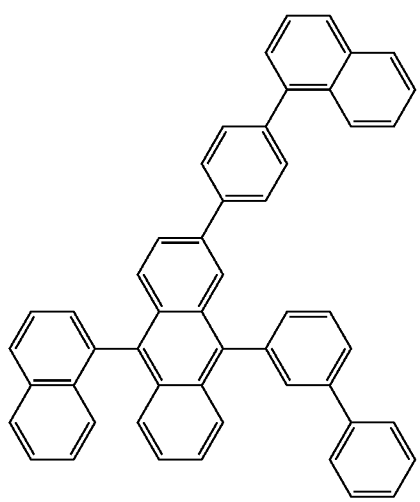

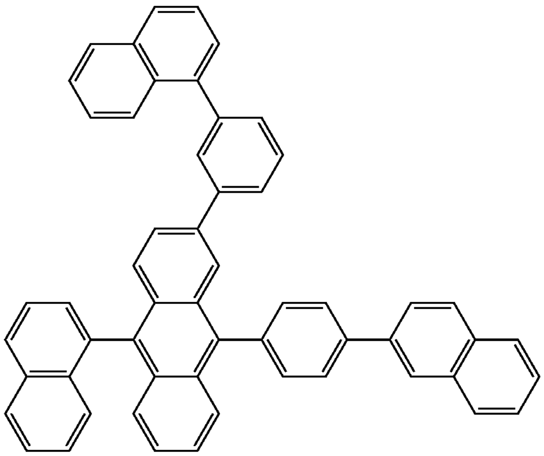 [SMILES: c1cc(-c2ccc3c(-c4cccc5ccccc45)c4ccccc4c(-c4ccc(-c5ccc6ccccc6c5)cc4)c3c2)cc(-c2cccc3ccccc23)c1]
[Formula 114]
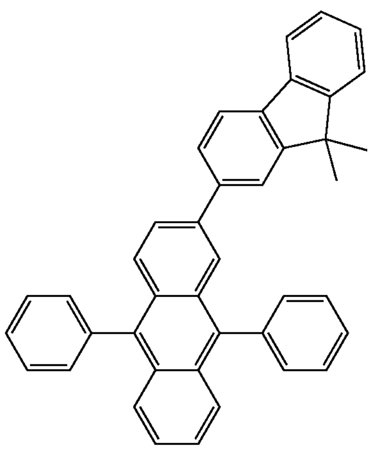
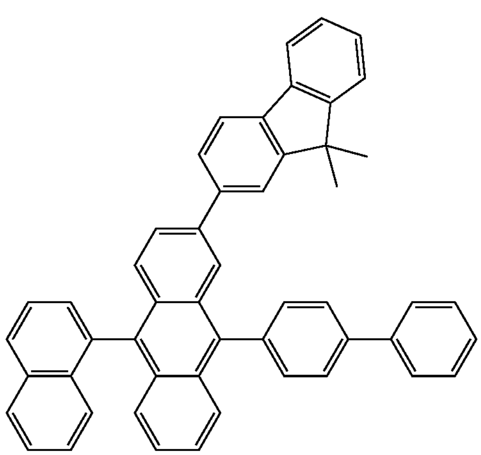
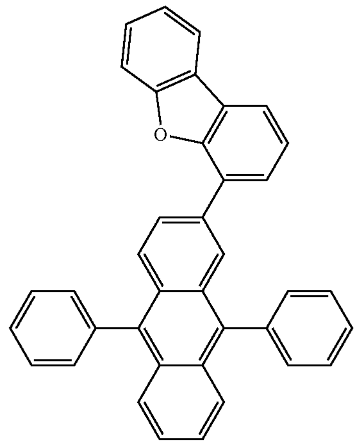
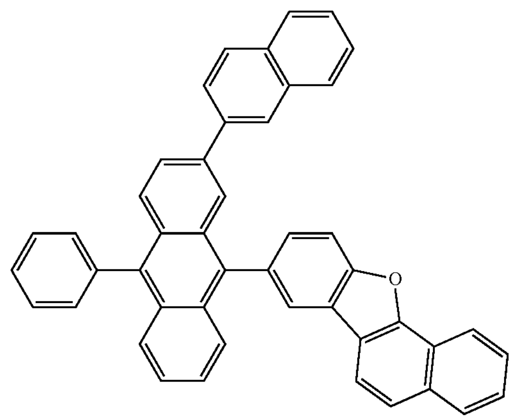
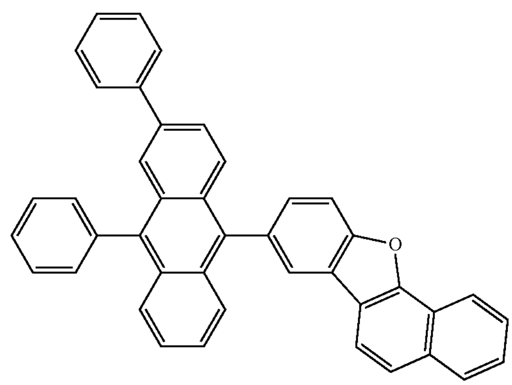
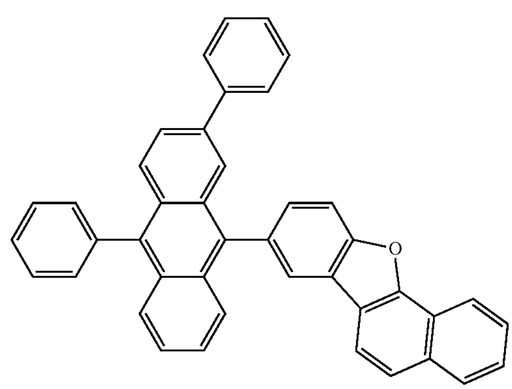

-continued
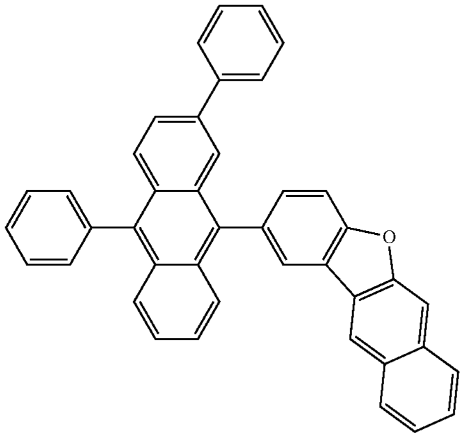
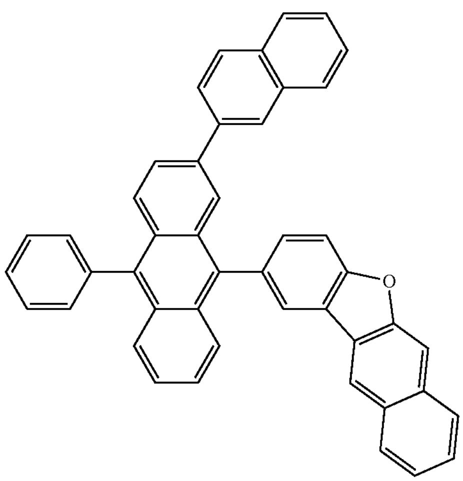
[Formula 115]
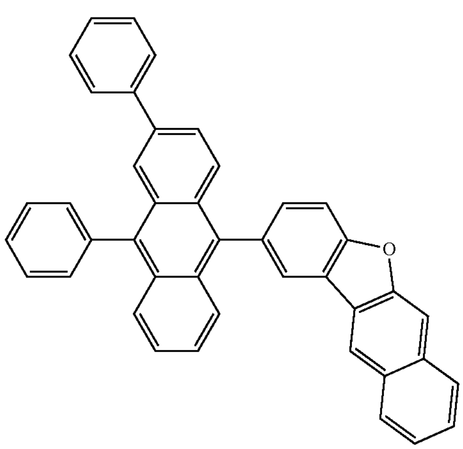
-continued
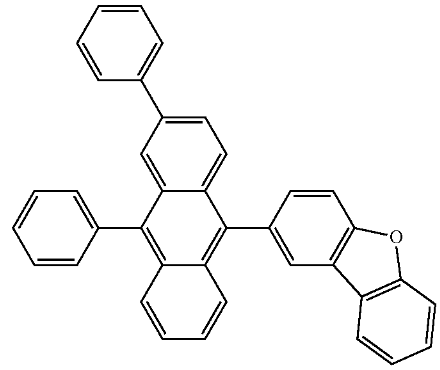
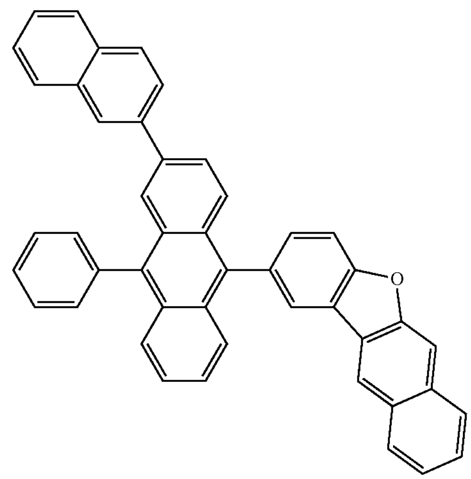
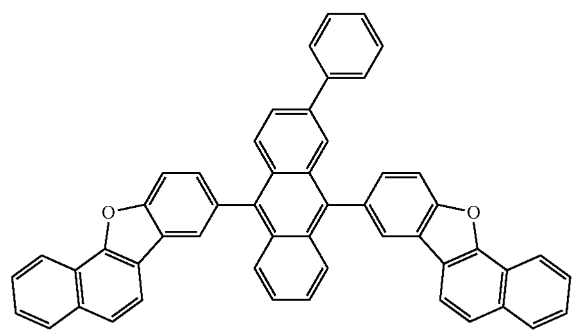
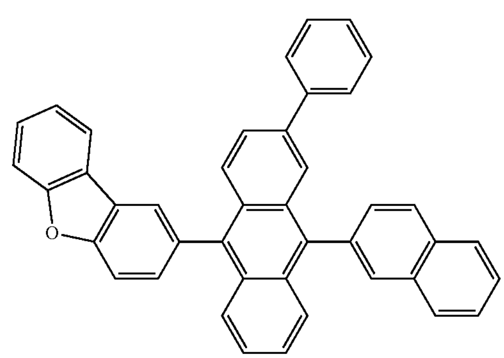

-continued
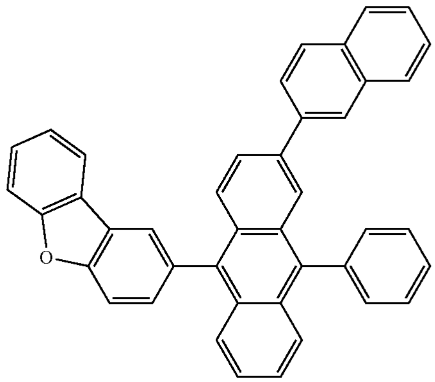
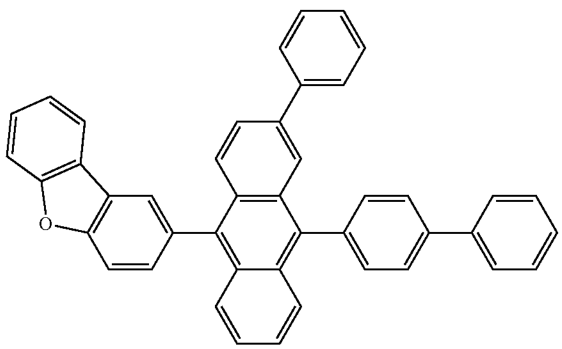
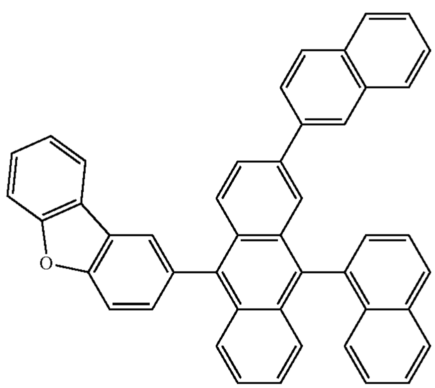
[Formula 116]
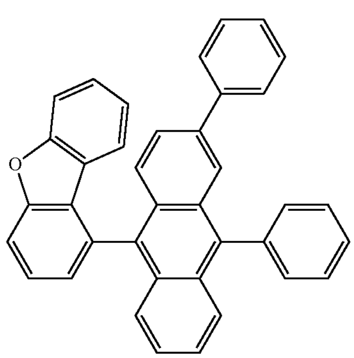
-continued
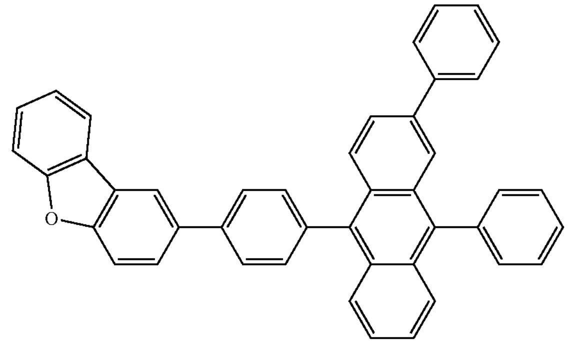
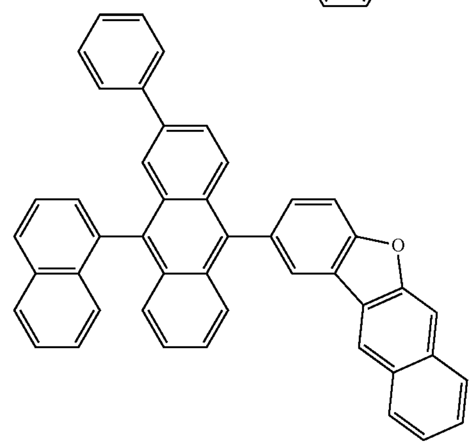
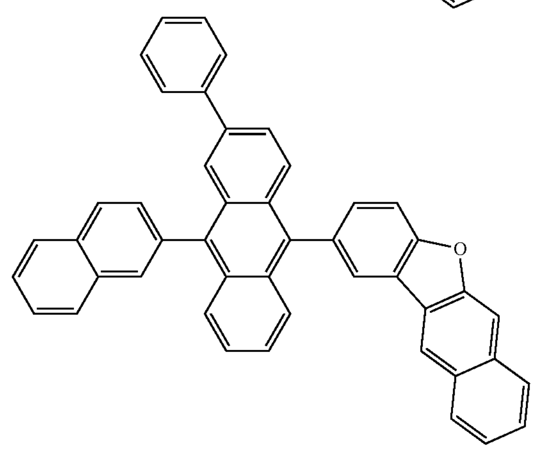
[Formula 117]
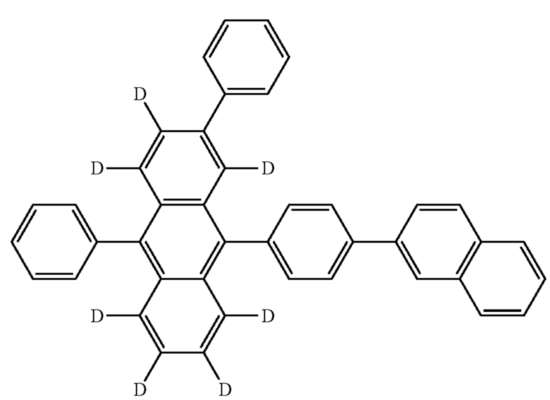

-continued

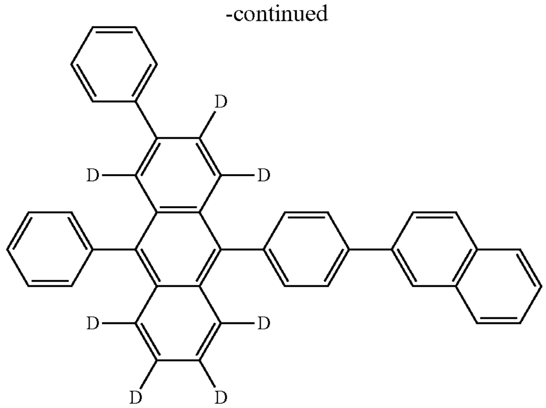

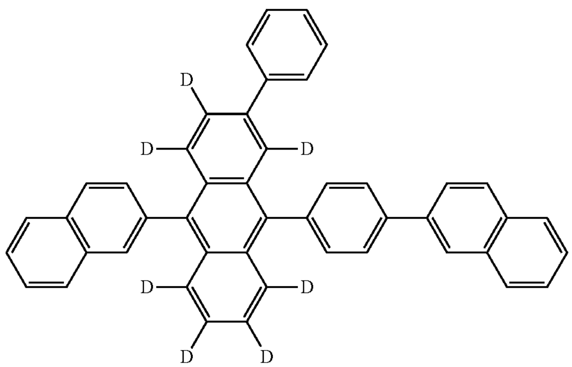

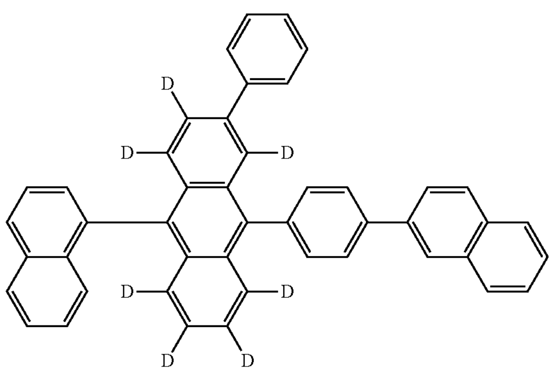

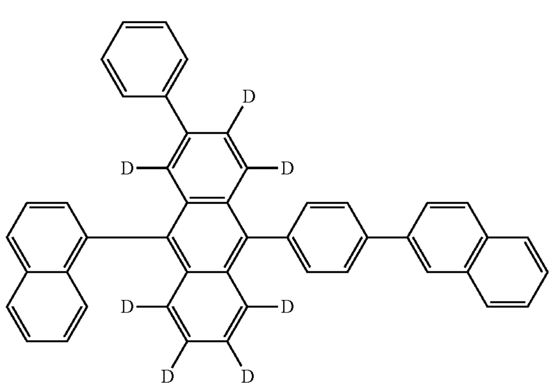

-continued

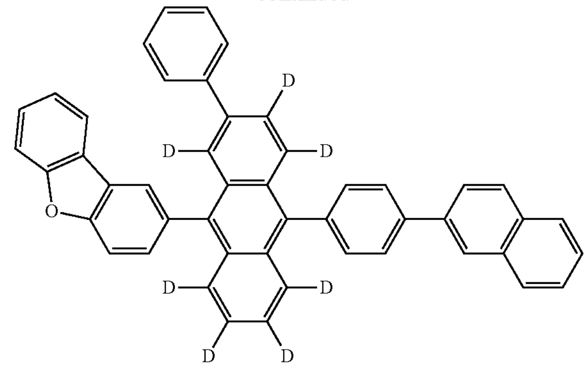

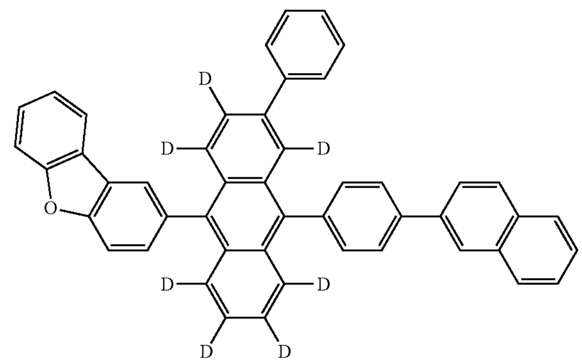

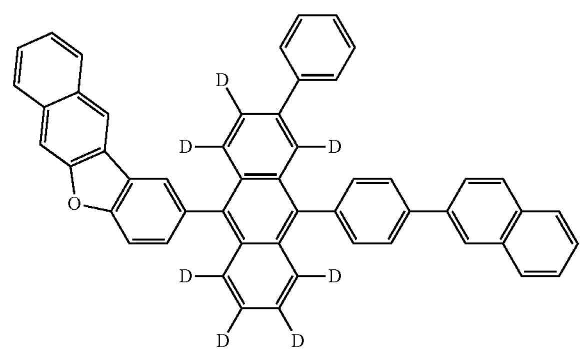

Fourth Compound and Fifth Compound

The fourth compound and the fifth compound are each independently at least one compound selected from the group consisting of a compound represented by a formula (3A) below, a compound represented by a formula (4) below, a compound represented by a formula (5) below, a compound represented by a formula (6) below, a compound represented by a formula (7) below, a compound represented by a formula (8) below, a compound represented by a formula (9) below, and a compound represented by a formula (10) below.

Compound Represented by Formula (3A)

The compound represented by formula (3A) will be described below.

[Formula 118]

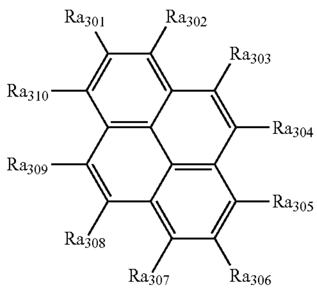

(3A)

In the formula (3A), at least one combination of adjacent two or more of $Ra_{301}$, $Ra_{302}$, $Ra_{303}$, $Ra_{304}$, $Ra_{305}$, $Ra_{306}$, $Ra_{307}$, $Ra_{308}$, $Ra_{309}$ and $Ra_{310}$ are mutually bonded to form a substituted or unsubstituted monocyclic ring, mutually bonded to form a substituted or unsubstituted fused ring, or not mutually bonded; and at least one of $Ra_{301}$ to $Ra_{310}$ is a monovalent group represented by a formula (31A) below, $Ra_{301}$ to $Ra_{310}$ forming neither the monocyclic ring nor the fused ring and not being the monovalent group represented by the formula (31A) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 119]

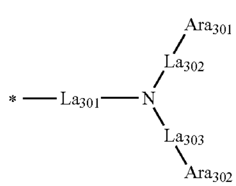

In the formula (31A), $Ara_{301}$ and $Ara_{302}$ are each independently a substituted or unsubstituted aryl group having 6 to 50 ring carbon atoms, or a substituted or unsubstituted heterocyclic group having 5 to 50 ring atoms;

$La_{301}$, $La_{302}$, and $La_{303}$ are each independently a single bond, a substituted or unsubstituted arylene group having 6 to 30 ring carbon atoms, or a substituted or unsubstituted divalent heterocyclic group having 5 to 30 ring atoms; and

* represents a bonding position to a pyrene ring in the formula (3A).

In the fourth compound and the fifth compound, $R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the formula (3A), two of $Ra_{301}$ to $Ra_{310}$ are preferably groups represented by the formula (31A).

In an exemplary embodiment, the compound represented by the formula (3A) is a compound represented by a formula (33A).

[Formula 120]

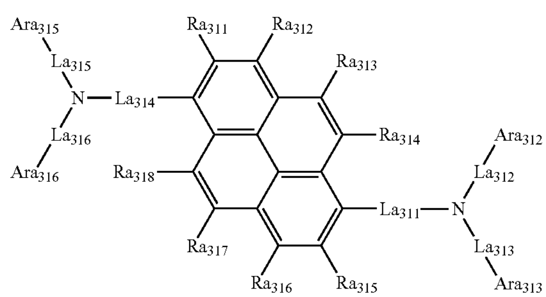

(33A)

In the formula (33A): $Ra_{311}$, $Ra_{312}$, $Ra_{313}$, $Ra_{314}$, $Ra_{315}$, $Ra_{316}$, $Ra_{317}$ and $Ra_{318}$ each independently represent the same as $Ra_{301}$ to $Ra_{310}$ in the formula (3A) that are not the monovalent group represented by the formula (31A);

$La_{311}$, $La_{312}$, $La_{313}$, $La_{314}$, $La_{315}$ and $La_{316}$ are each independently a single bond, a substituted or unsubstituted arylene group having 6 to 30 ring carbon atoms, or a substituted or unsubstituted divalent heterocyclic group having 5 to 30 ring atoms; and $Ara_{312}$, $Ara_{313}$, $Ara_{315}$ and $Ara_{316}$ are each independently a substituted or unsubstituted aryl group having 6 to 50 ring carbon atoms, or a substituted or unsubstituted heterocyclic group having 5 to 50 ring atoms.

In the formula (31A), $La_{301}$ is preferably a single bond, and $La_{302}$ and $La_{303}$ are preferably single bonds.

In an exemplary embodiment, the compound represented by the formula (3A) is represented by a formula (34A) or a formula (35A) below.

[Formula 121]

(34A)

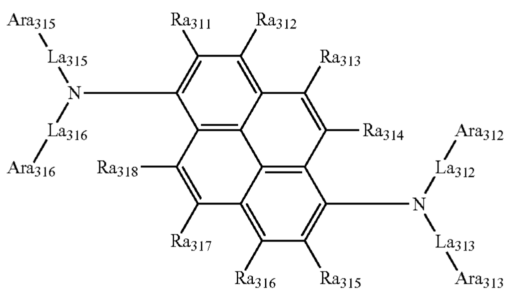

In the formula (34A), $Ra_{311}$ to $Ra_{318}$ each independently represent the same as $Ra_{301}$ to $Ra_{310}$ in the formula (3A) that are not the monovalent group represented by the formula (31A);

$La_{312}$, $La_{313}$, $La_{315}$ and $La_{316}$ each independently represent the same as $La_{312}$, $La_{313}$, $La_{315}$ and $La_{316}$ in the formula (33A); and $Ara_{312}$, $Ara_{313}$, $Ara_{315}$ and $Ara_{316}$ each independently represent the same as $Ara_{312}$, $Ara_{313}$, $Ara_{315}$ and $Ara_{316}$ in the formula (33A).

[Formula 122]

(35A)

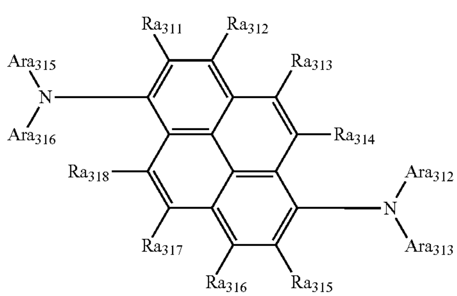

In the formula (35A), $Ra_{311}$ to $Ra_{318}$ each independently represent the same as $Ra_{301}$ to $Ra_{310}$ in the formula (3A) that are not the monovalent group represented by the formula (31A); and $Ara_{312}$, $Ara_{313}$, $Ara_{315}$ and $Ara_{316}$ each independently represent the same as $Ara_{312}$, $Ara_{313}$, $Ara_{315}$ and $Ara_{316}$ in the formula (33A).

In the formula (31A), at least one of $Ara_{301}$ and $Ara_{302}$ is preferably a group represented by a formula (36A) below.

In the formulae (33A) to (35A), at least one of $Ara_{312}$ and $Ara_{313}$ is preferably a group represented by the formula (36A).

In the formulae (33A) to (35A), at least one of $Ara_{315}$ and $Ara_{316}$ is preferably a group represented by the formula (36A).

[Formula 123]

(36A)

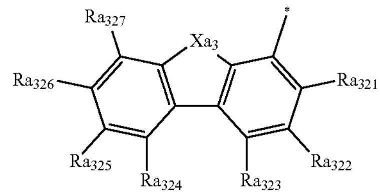

In the formula (36A), $Xa_3$ represents an oxygen atom or a sulfur atom; at least one combination of adjacent two or more of $Ra_{321}$ to $Ra_{327}$ are mutually bonded to form a substituted or unsubstituted monocyclic ring, mutually bonded to form a substituted or unsubstituted fused ring, or not mutually bonded;

$Ra_{321}$, $Ra_{322}$, $Ra_{323}$, $Ra_{324}$, $Ra_{325}$, $Ra_{326}$ and $Ra_{327}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and

* represents a bonding position to $La_{302}$, $La_{303}$, $La_{312}$, $La_{313}$, $La_{315}$ or $La_{316}$.

$Xa_3$ is preferably an oxygen atom.

At least one of $Ra_{321}$ to $Ra_{327}$ is preferably a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the formula (31A), $Ara_{301}$ is preferably a group represented by the formula (36A) and $Ara_{302}$ is preferably a substituted or unsubstituted aryl group having 6 to 50 ring carbon atoms.

In the formulae (33A) to (35A), $Ara_{312}$ is preferably a group represented by the formula (36A) and $Ara_{313}$ is preferably a substituted or unsubstituted aryl group having 6 to 50 ring carbon atoms.

In the formulae (33A) to (35A), $Ara_{315}$ is preferably a group represented by the formula (36A) and $Ara_{316}$ is preferably a substituted or unsubstituted aryl group having 6 to 50 ring carbon atoms.

In an exemplary embodiment, the compound represented by the formula (3A) is represented by a formula (37A).

[Formula 124]

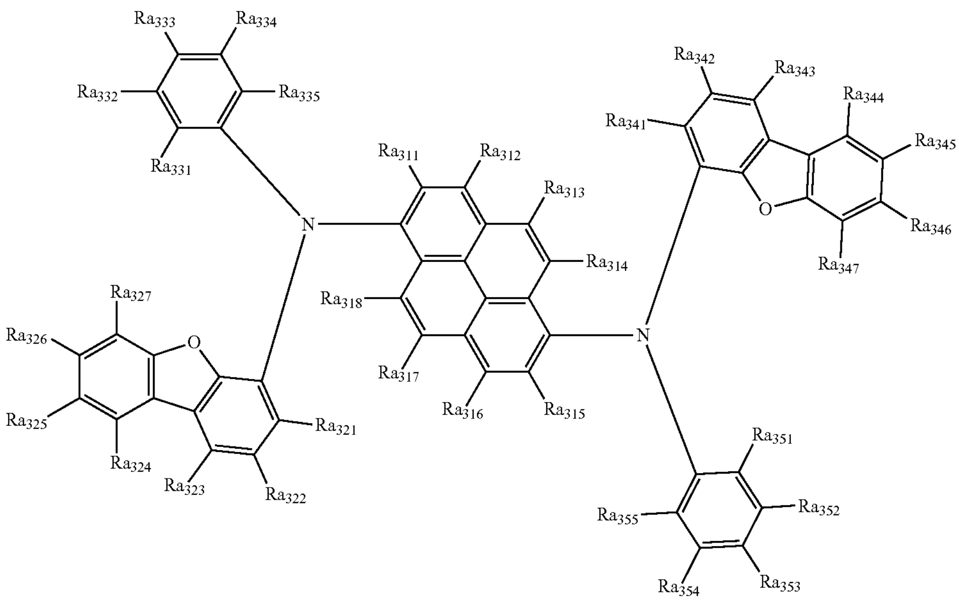

(37A)

In the formula (37A), $Ra_{311}$ to $Ra_{318}$ each independently represent the same as $Ra_{301}$ to $Ra_{310}$ in the formula (3A) that are not the monovalent group represented by the formula (31A);

at least one combination of adjacent two or more of $Ra_{321}$ to $Ra_{327}$ are mutually bonded to form a substituted or unsubstituted monocyclic ring, mutually bonded to form a substituted or unsubstituted fused ring, or not mutually bonded;

at least one combination of adjacent two or more of $Ra_{341}$ to $Ra_{347}$ are mutually bonded to form a substituted or unsubstituted monocyclic ring, mutually bonded to form a substituted or unsubstituted fused ring, or not mutually bonded;

$Ra_{321}$ to $Ra_{327}$ and $Ra_{341}$ to $Ra_{347}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $Ra_{331}$ to $Ra_{335}$ and $Ra_{351}$ to $Ra_{355}$ are each independently a hydrogen atom, or a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (3A)

Specific examples of the compound represented by the formula (3A) include compounds shown below.

[Formula 125]

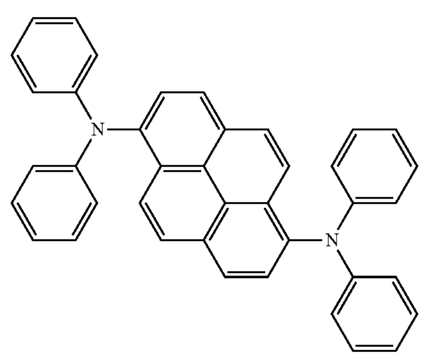

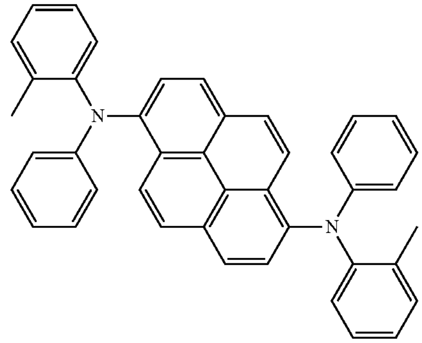

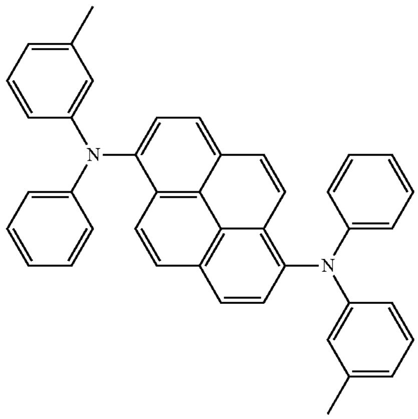
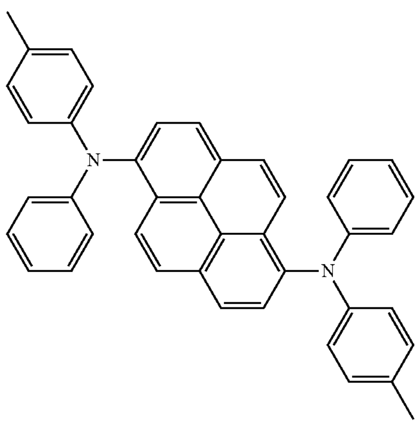
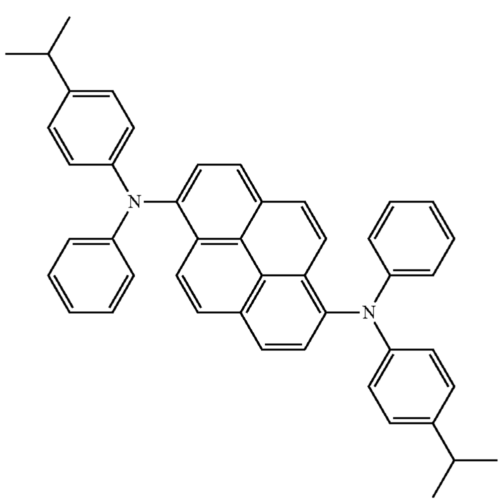
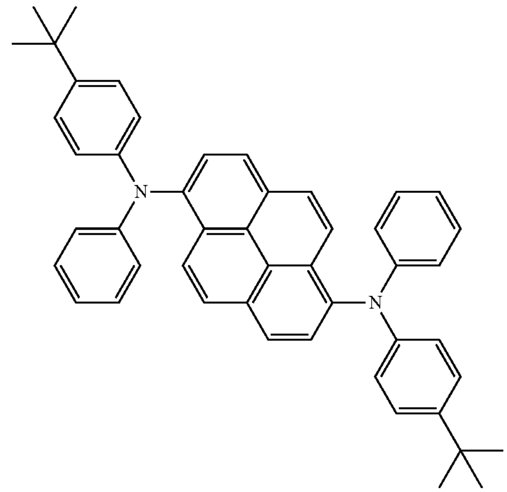
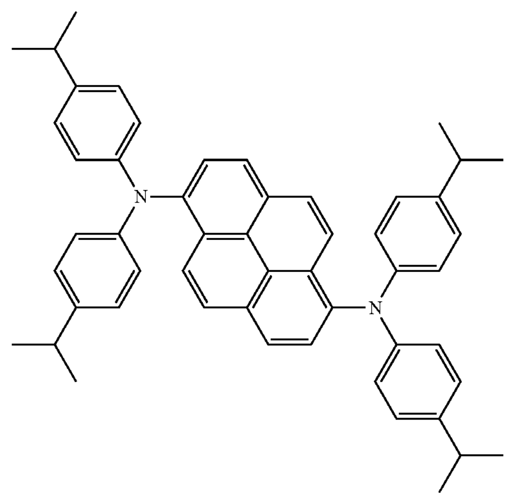
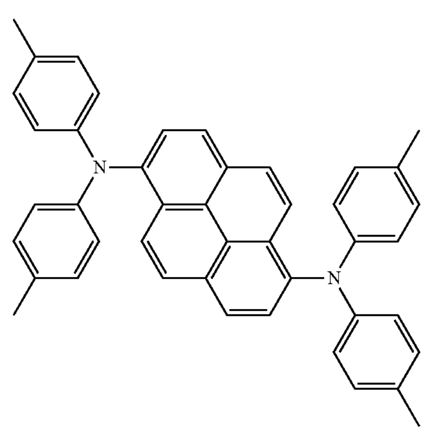

-continued
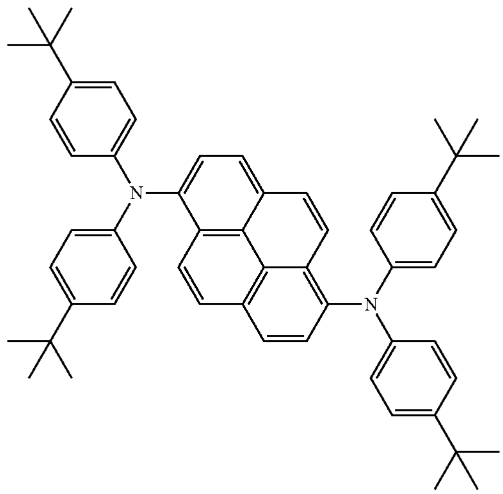
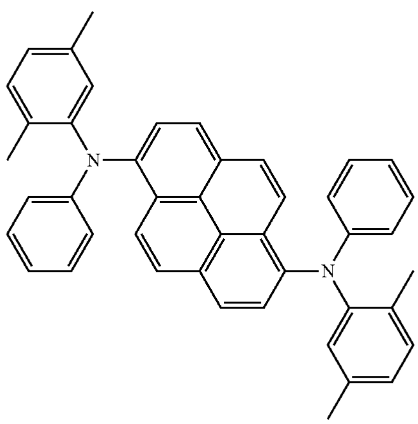
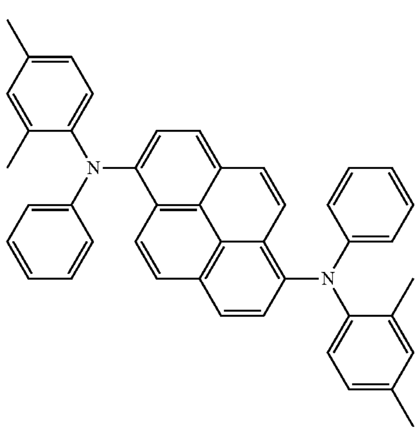
-continued
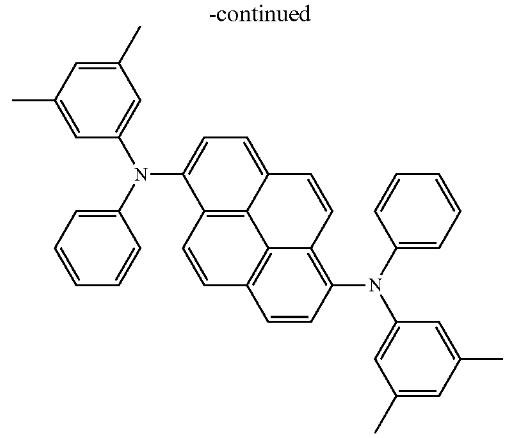
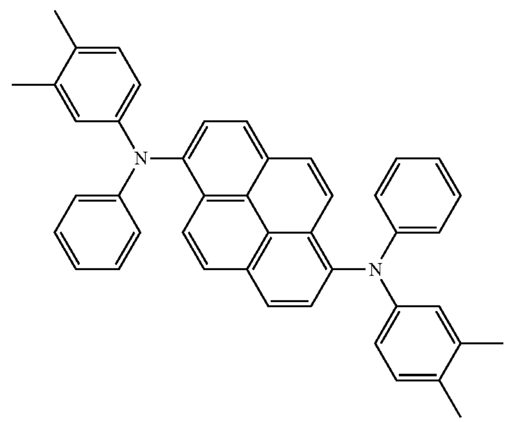
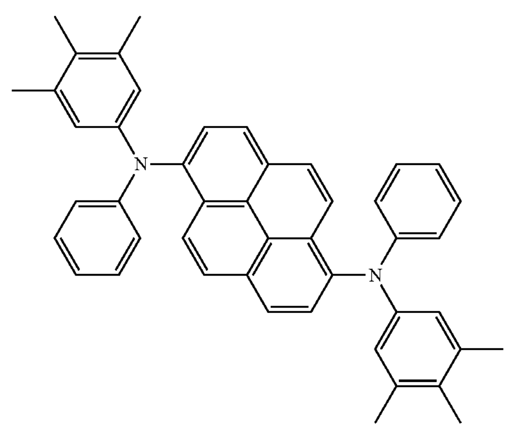

-continued
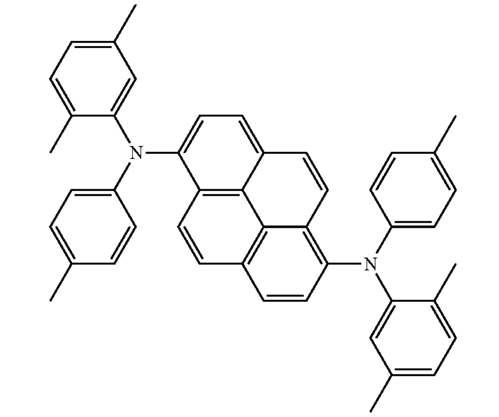
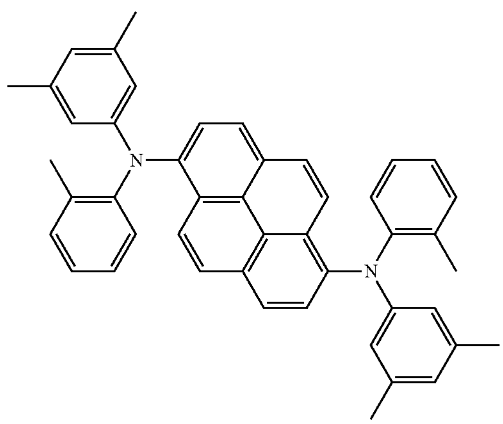
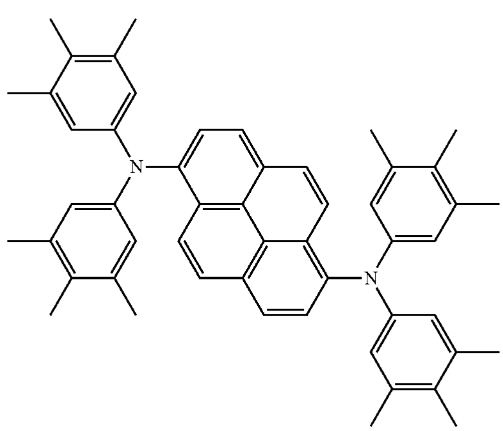
-continued
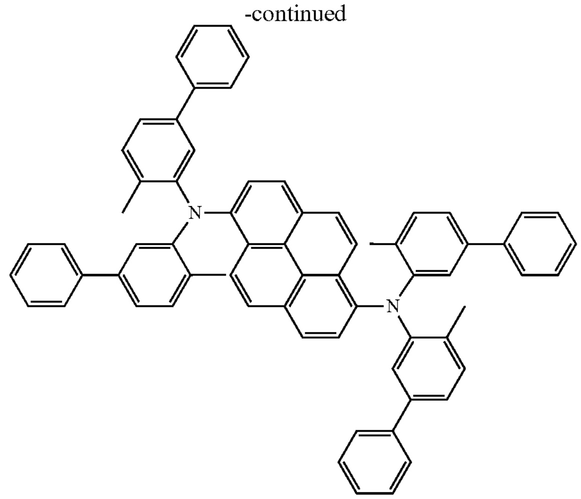
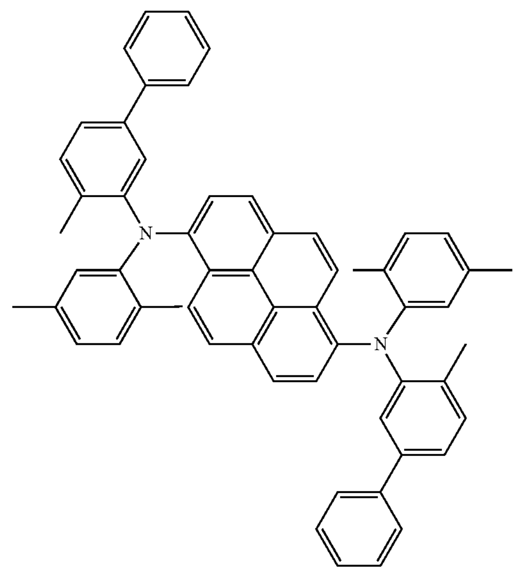
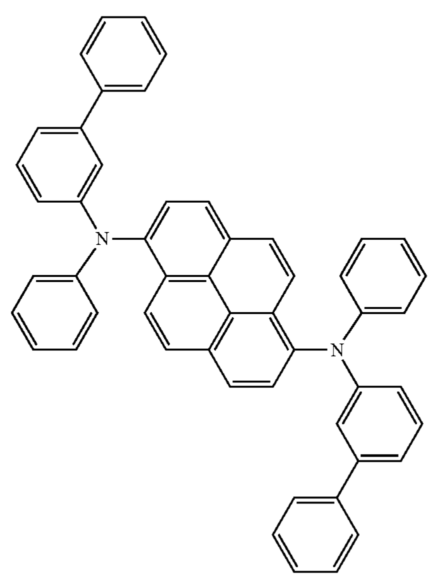

[Formula 126]
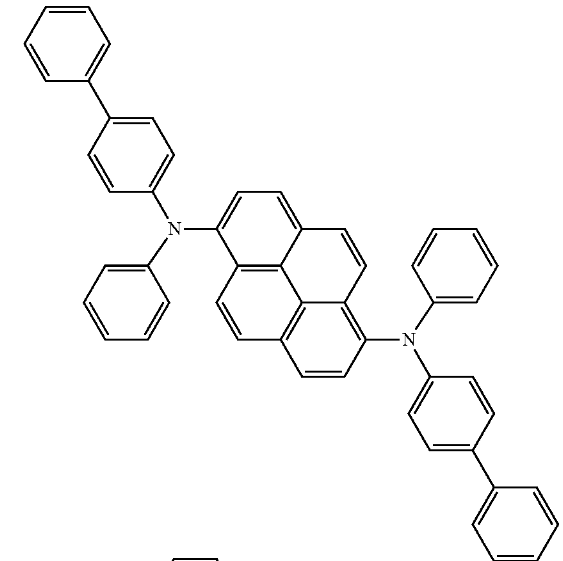
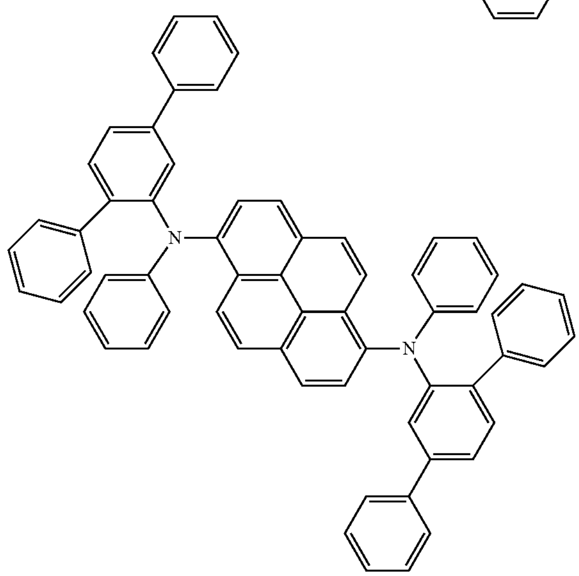
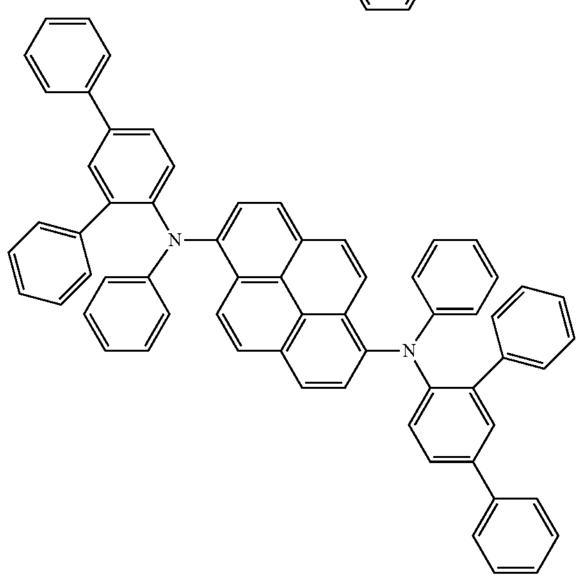
-continued
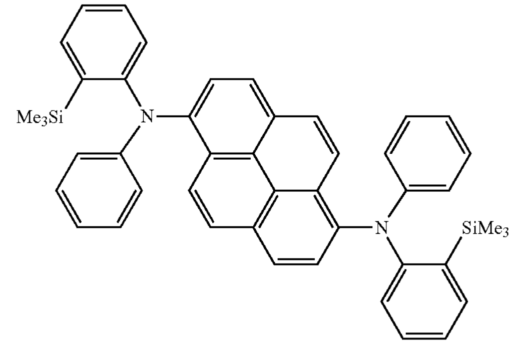
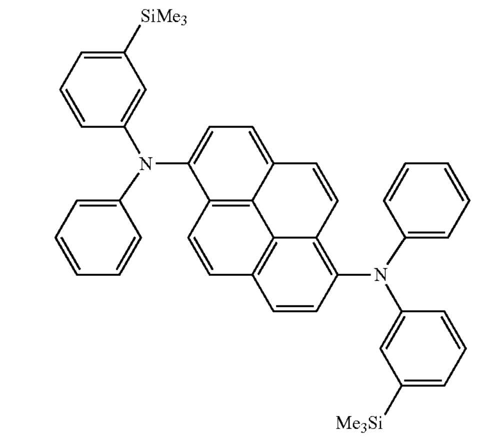
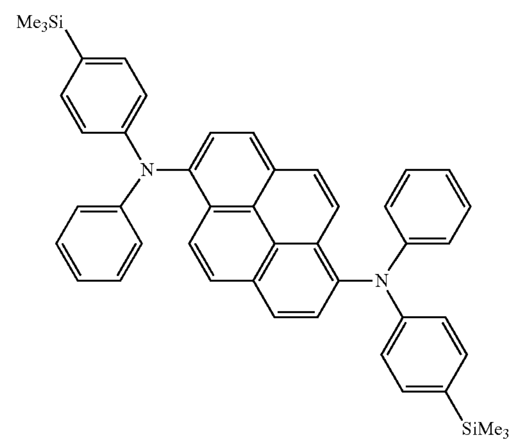
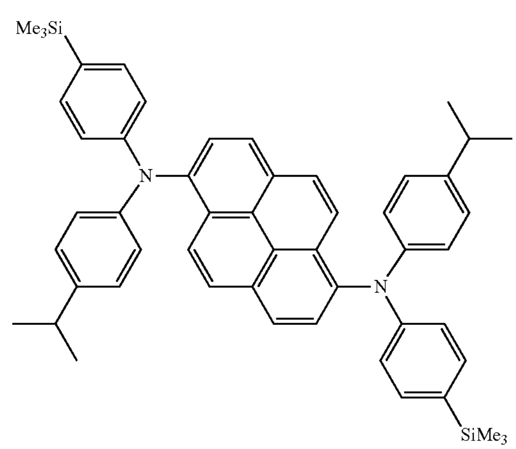

-continued
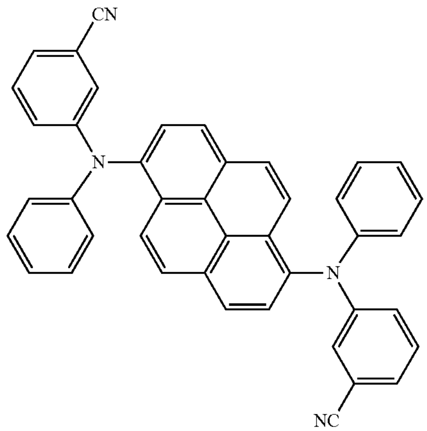
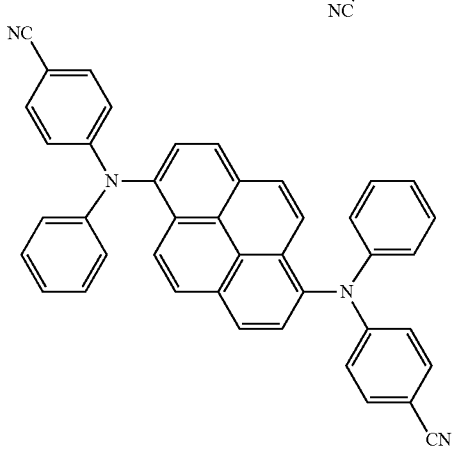
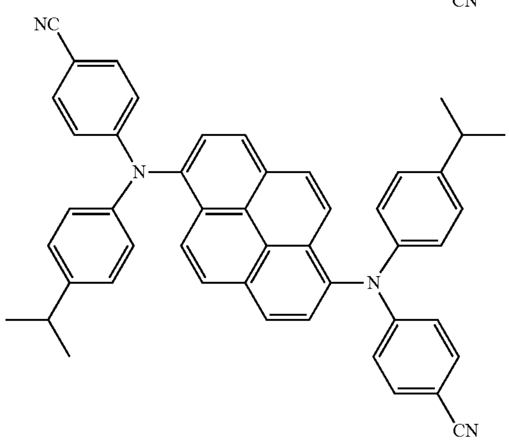
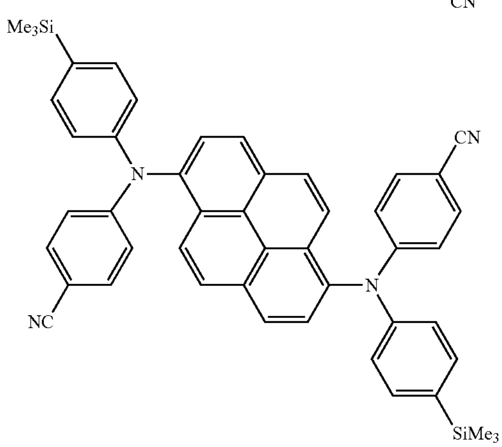
-continued
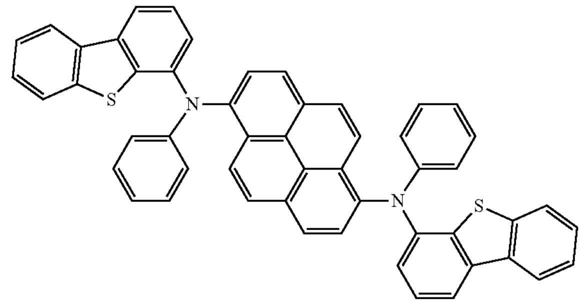 [SMILES: c1ccc(N(c2ccc3ccc4c(N(c5ccccc5)c5cccc6c5oc5ccccc56)ccc5ccc2c3c54)c2cccc3c2oc2ccccc23)cc1]
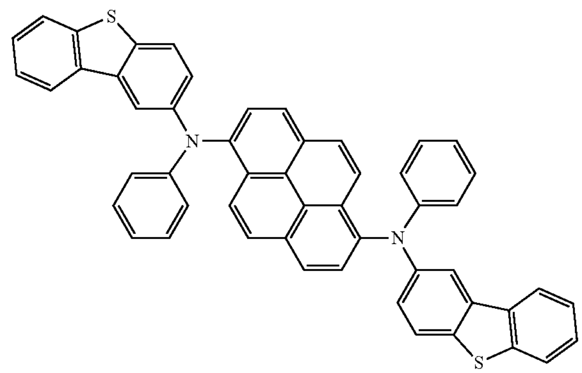
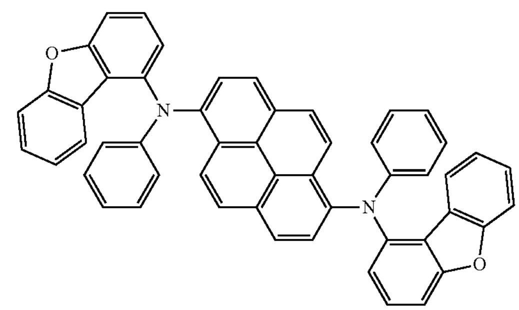
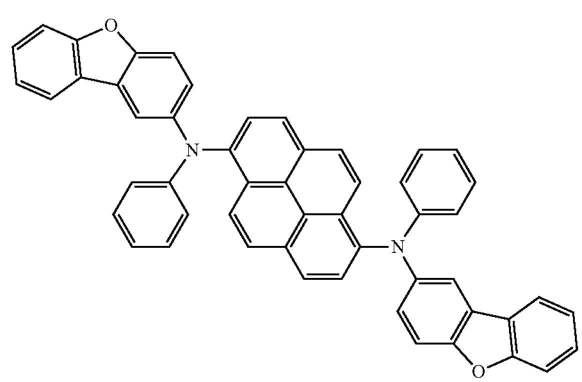
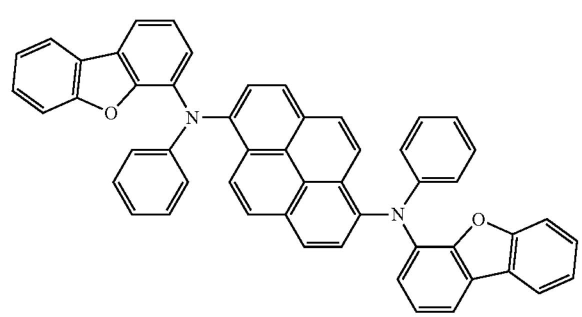

[Formula 127]
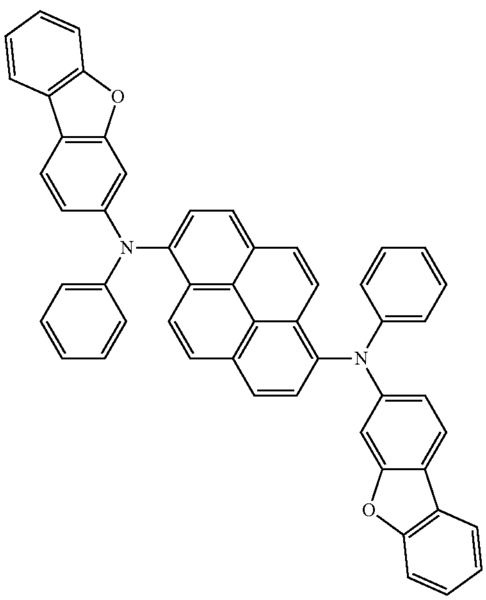
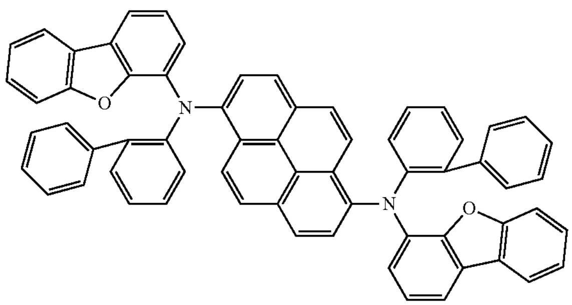
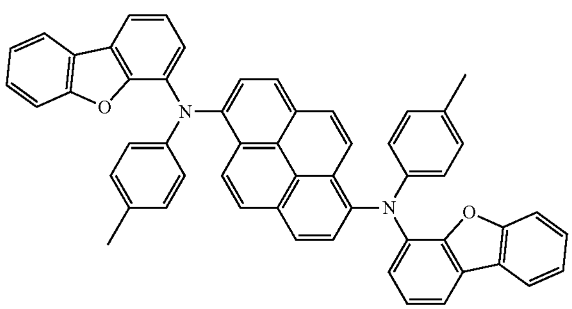
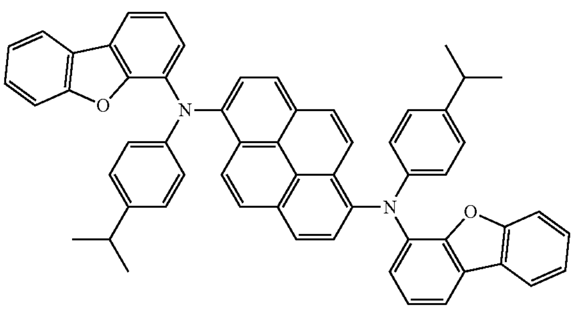
-continued
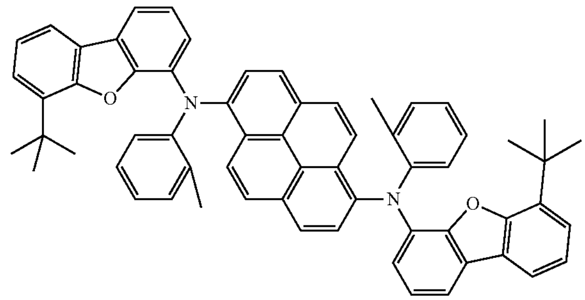
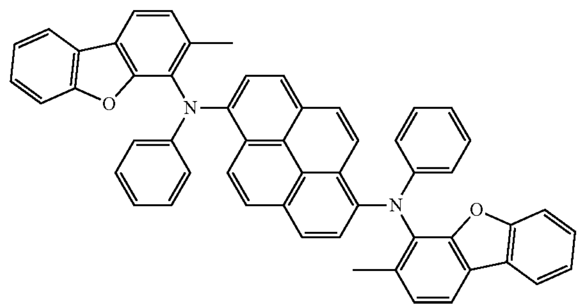
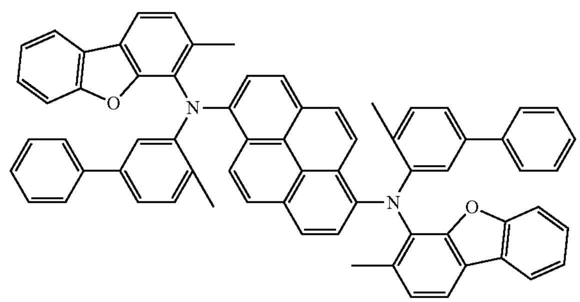
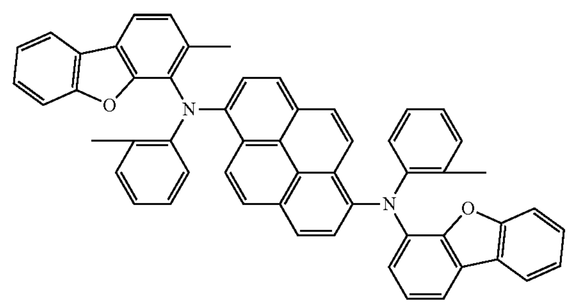
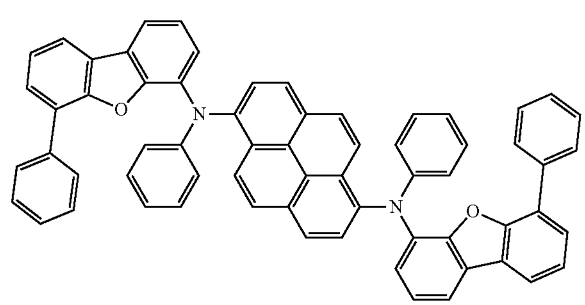

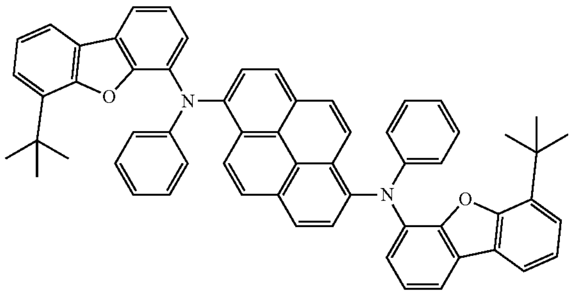
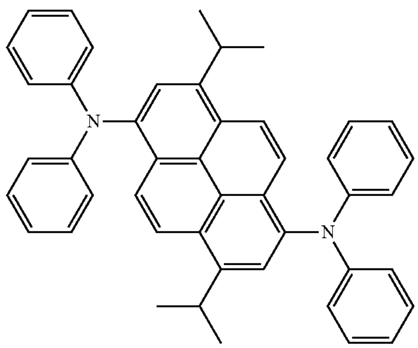
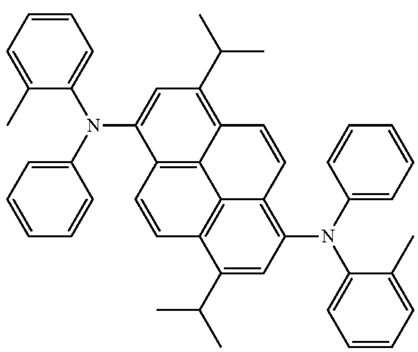
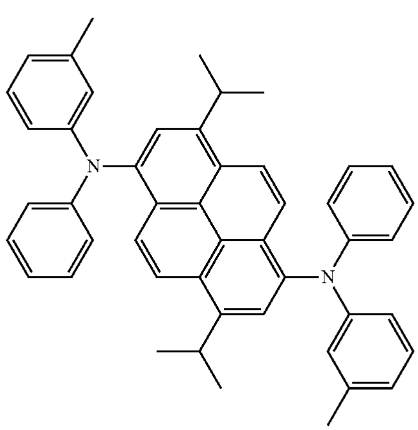
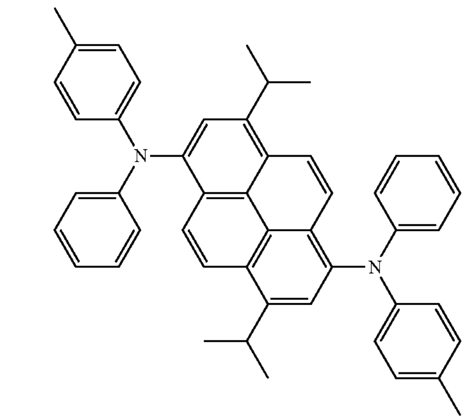
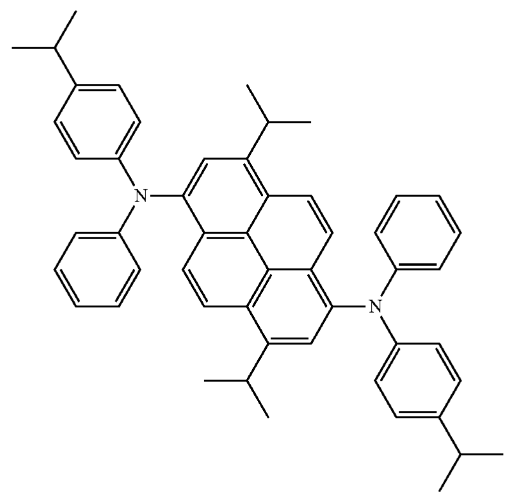
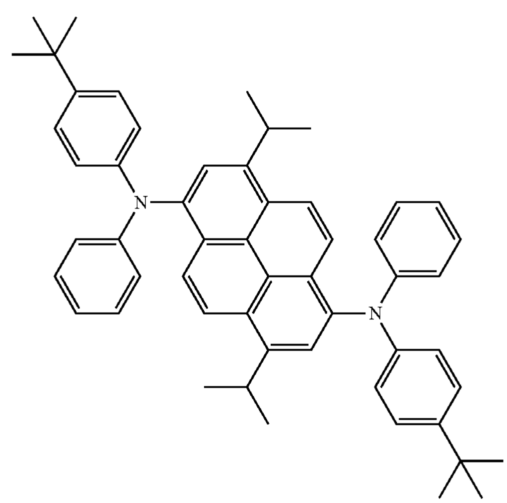

-continued
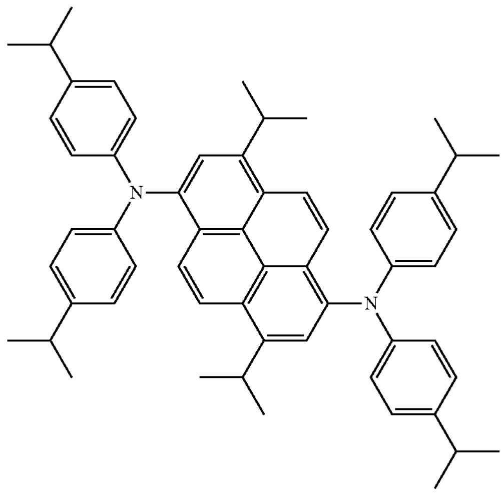
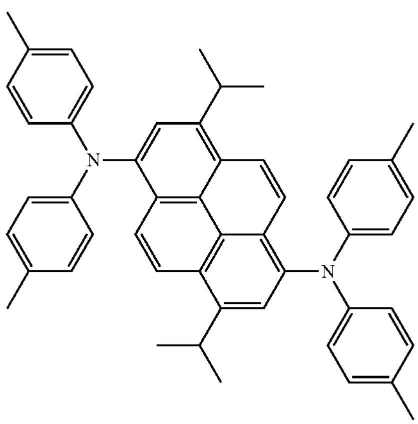
[Formula 128]
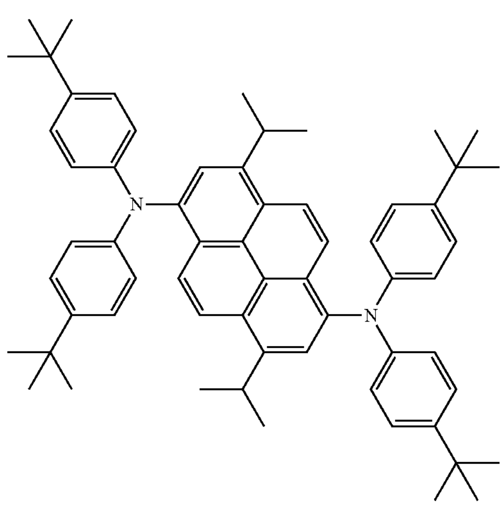
-continued
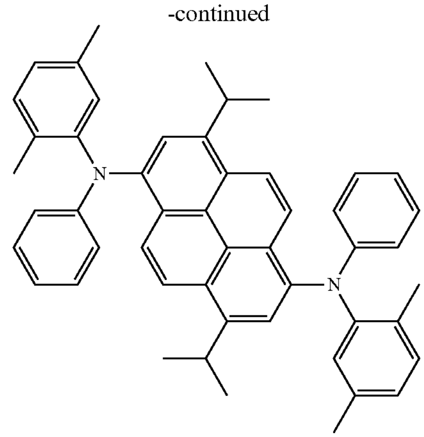
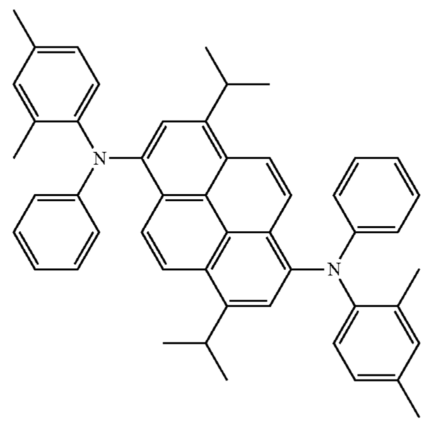
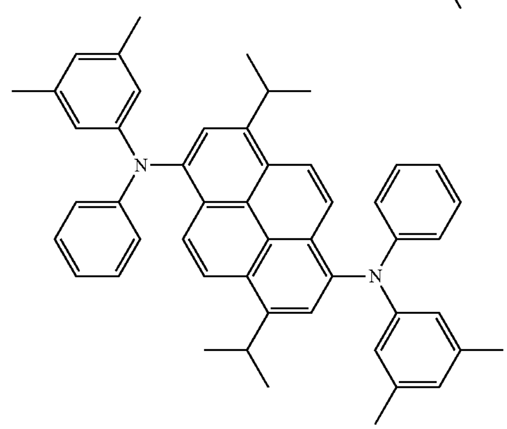
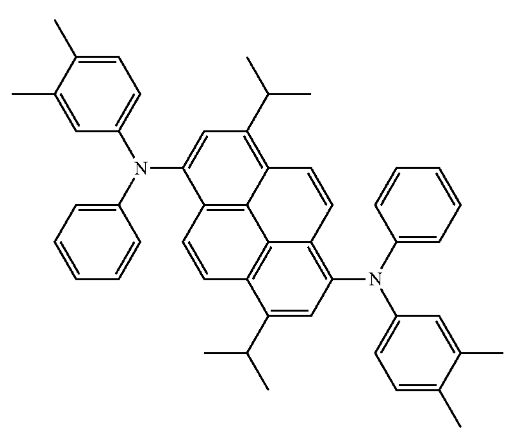

-continued
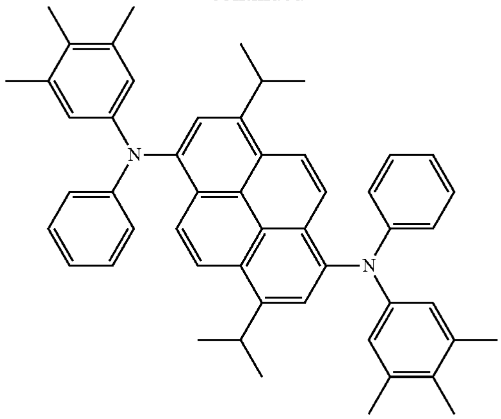
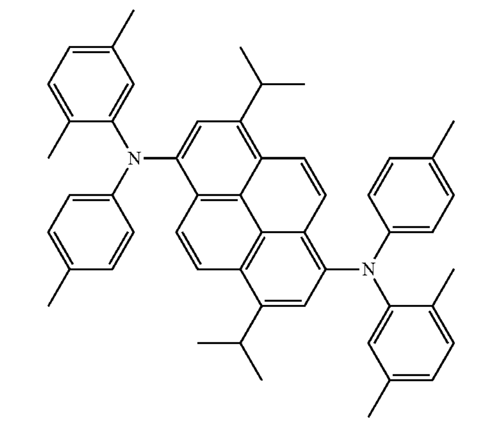
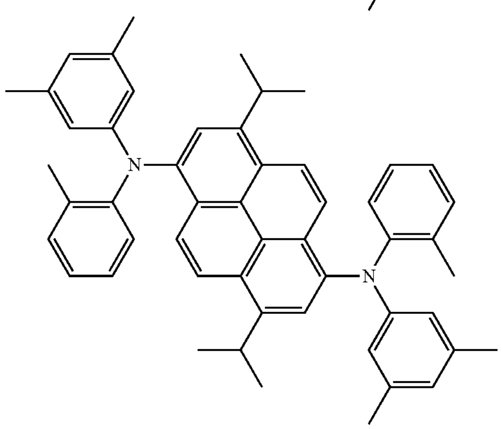
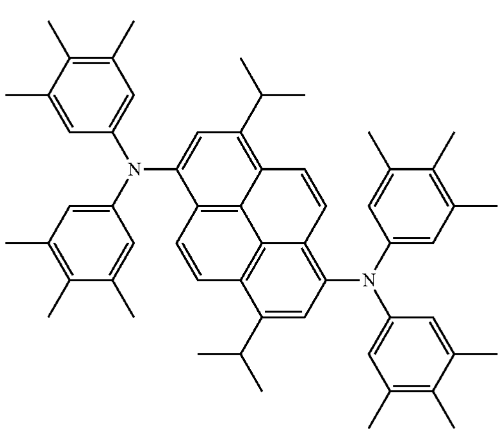
-continued
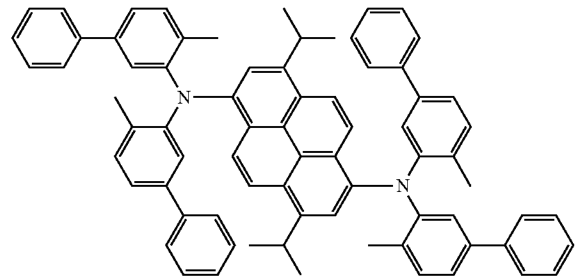
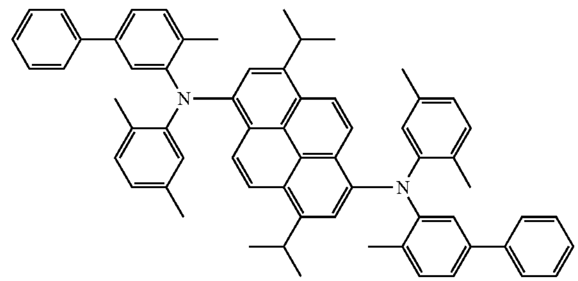
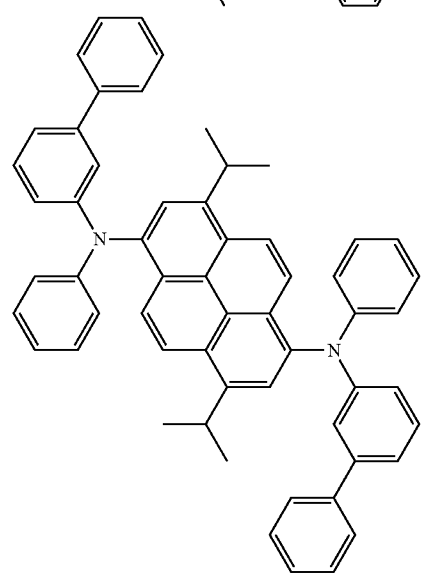
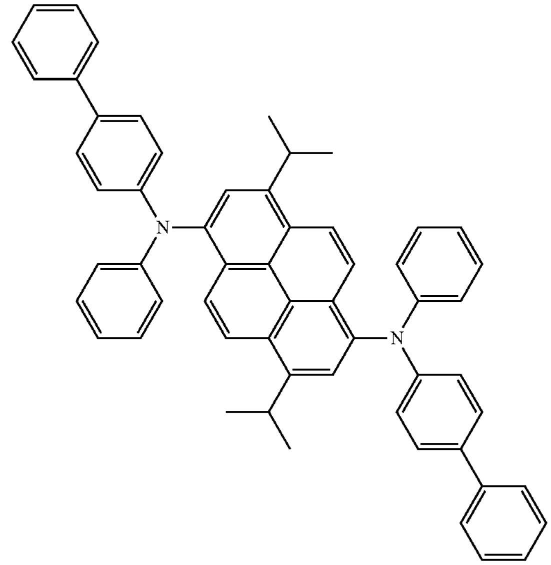

-continued
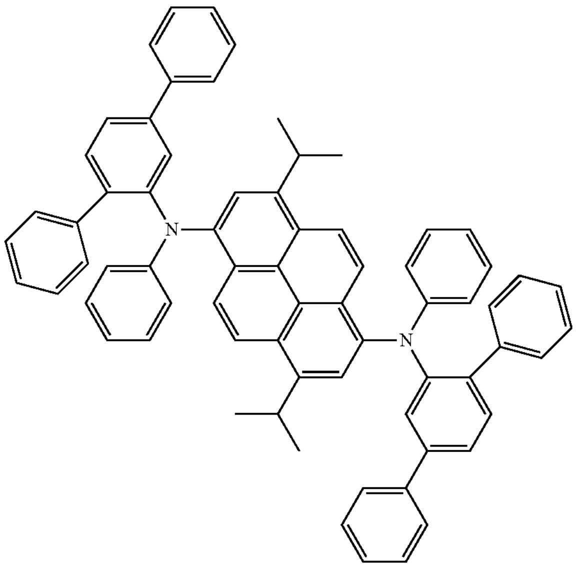
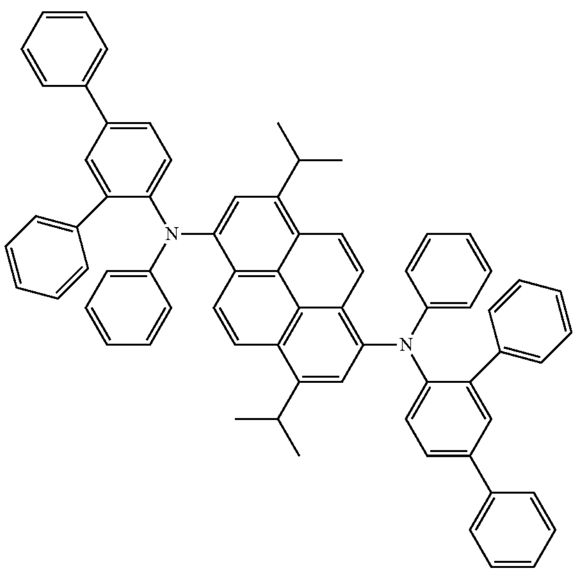
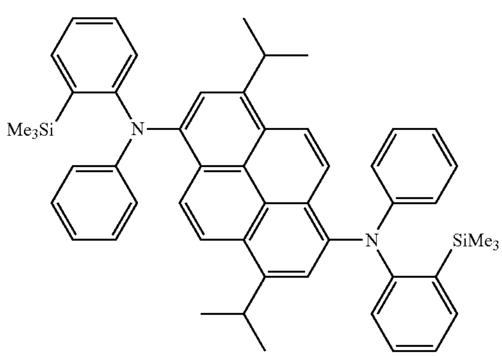
-continued
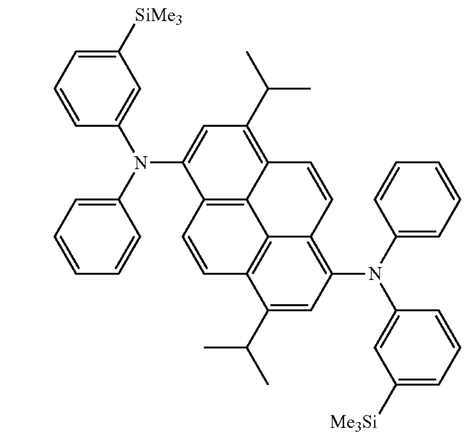
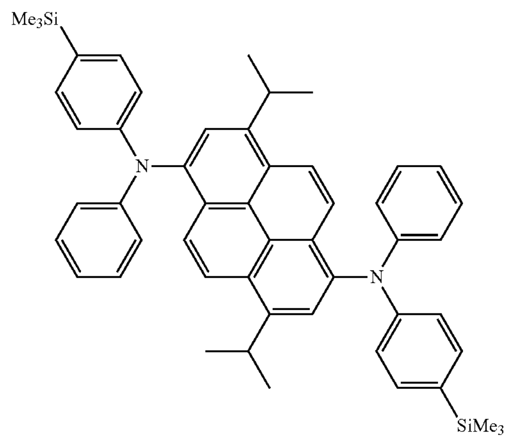
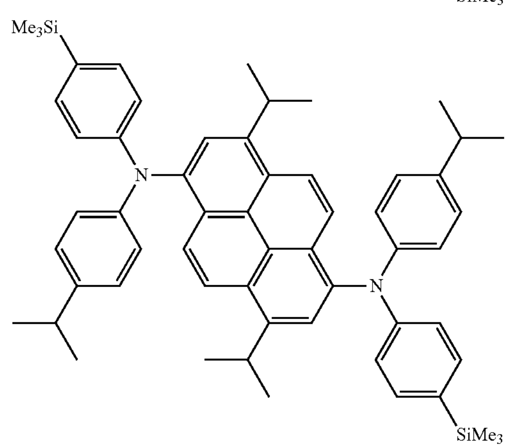
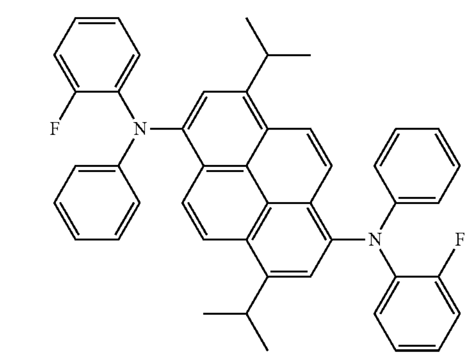

-continued
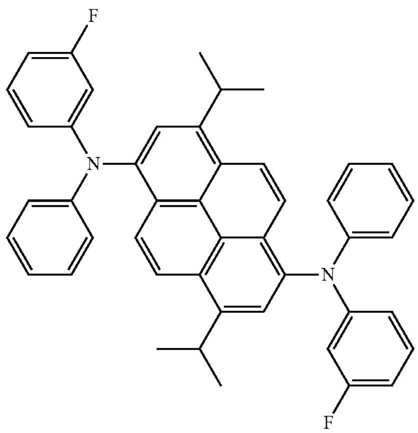
[Formula 129]
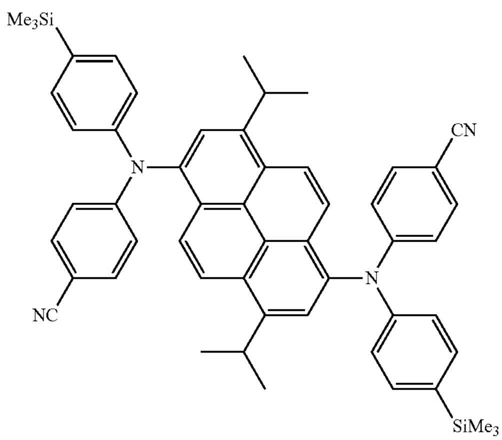
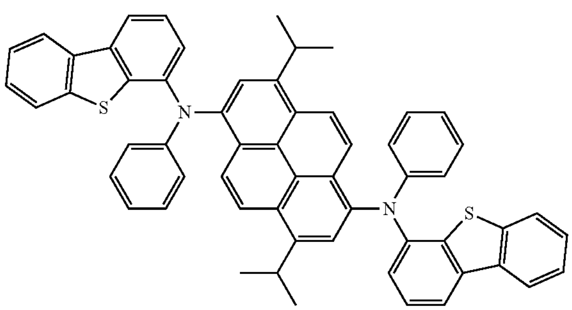
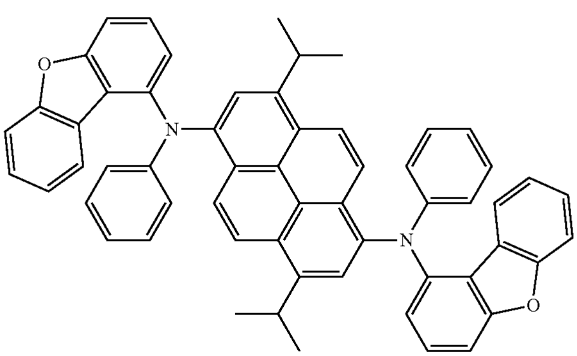
-continued
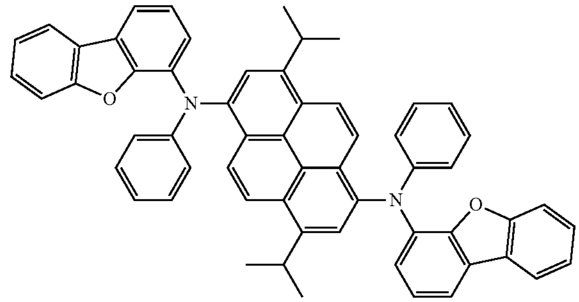
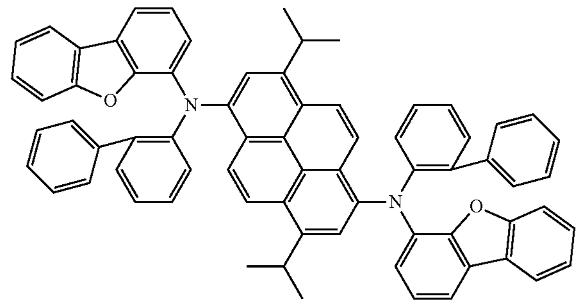
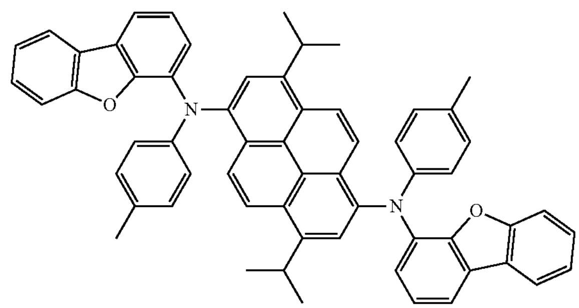
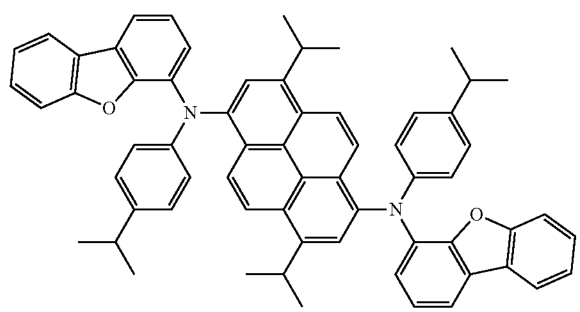
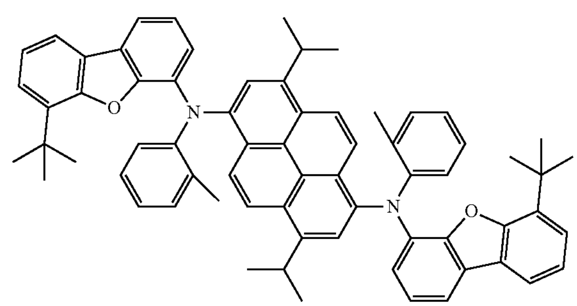

-continued

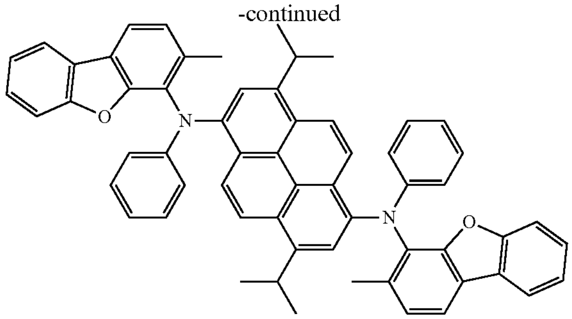

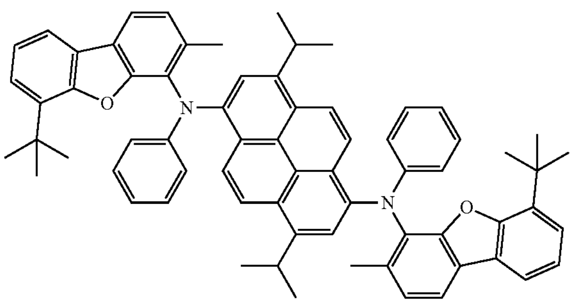

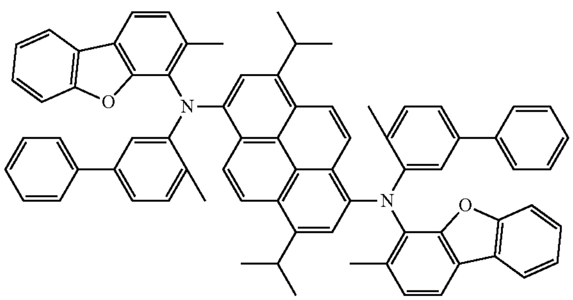

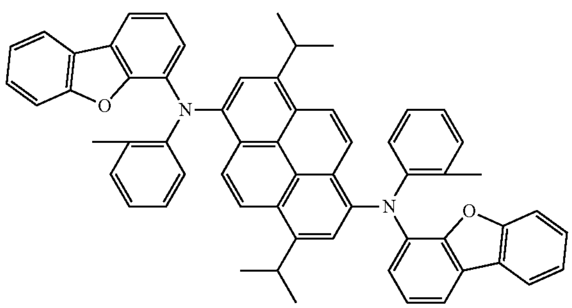

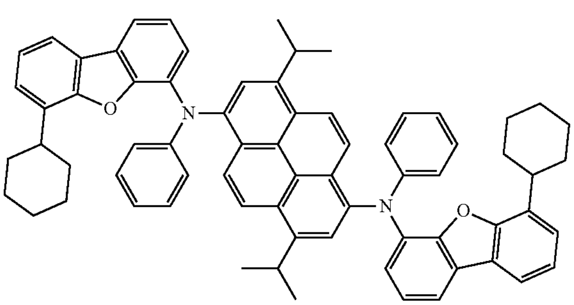

-continued

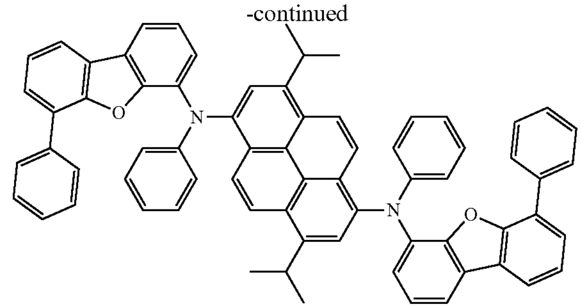

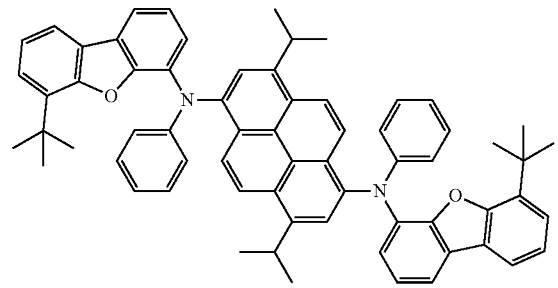 [SMILES: CC(C)c1cc(N(c2ccccc2)c2cccc3c2oc2c(C(C)(C)C)cccc23)c2ccc3c(C(C)C)cc(N(c4ccccc4)c4cccc5c4oc4c(C(C)(C)C)cccc45)c4ccc1c2c34]

Compound Represented by Formula (4)

The compound represented by the formula (4) will be described below.

[Formula 130]

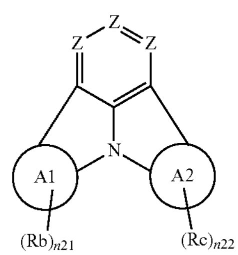

(4)

In the formula (4): Z are each independently CRa or a nitrogen atom;

A1 ring and A2 ring are each independently a substituted or unsubstituted aromatic hydrocarbon ring having 6 to 50 ring carbon atoms or a substituted or unsubstituted heterocycle having 5 to 50 ring atoms;

when a plurality of Ra are present, at least one combination of adjacent two or more of Ra are mutually bonded to form a substituted or unsubstituted monocyclic ring, mutually bonded to form a substituted or unsubstituted fused ring, or not mutually bonded;

n21 and n22 are each independently u 0, 1, 2, 3 or 4;

when a plurality of Rb are present, at least one combination of adjacent two or more of the plurality of Rb are mutually bonded to form a substituted or unsubstituted monocyclic ring, mutually bonded to form a substituted or unsubstituted fused ring, or not mutually bonded;

when a plurality of Rc are present, at least one combination of adjacent two or more of plurality of Rc are mutually bonded to form a substituted or unsubstituted monocyclic ring, mutually bonded to form a substituted or unsubstituted fused ring, or not mutually bonded; and Ra, Rb, and Rc not forming the monocyclic ring and not forming the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

The "aromatic hydrocarbon ring" for the A1 ring and A2 ring has the same structure as the compound formed by introducing a hydrogen atom to the "aryl group" described above.

Ring atoms of the "aromatic hydrocarbon ring" for the A1 ring and the A2 ring include two carbon atoms on a fused bicyclic structure at the center of the formula (4).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the A1 ring and A2 ring has the same structure as the compound formed by introducing a hydrogen atom to the "heterocyclic group" described above.

Ring atoms of the "heterocycle" for the A1 ring and the A2 ring include two carbon atoms on a fused bicyclic structure at the center of the formula (4).

Specific examples of the "substituted or unsubstituted heterocycle having 5 to 50 ring atoms" include a compound formed by introducing a hydrogen atom to the "heterocyclic group" described in the specific example group G2.

Rb is bonded to any one of carbon atoms forming the aromatic hydrocarbon ring as the A1 ring or any one of the atoms forming the heterocycle as the A1 ring.

Rc is bonded to any one of carbon atoms forming the aromatic hydrocarbon ring as the A2 ring or any one of the atoms forming the heterocycle as the A2 ring.

At least one of Ra, Rb, and Rc is preferably a group represented by the formula (4a) below. More preferably, at least two of Ra, Rb, and Rc are groups represented by the formula (4a).

[Formula 131]

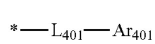

(4a)

In the formula (4a): $L_{401}$ is a single bond, a substituted or unsubstituted arylene group having 6 to 30 ring carbon atoms, or a substituted or unsubstituted divalent heterocyclic group having 5 to 30 ring atoms; and $Ar_{401}$ is a substituted or unsubstituted aryl group having 6 to 50 ring carbon atoms, a substituted or unsubstituted heterocyclic group having 5 to 50 ring atoms, or a group represented by the formula (4b).

[Formula 132]

(4b)

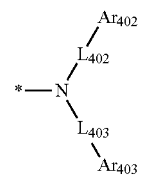

In the formula (4b): $L_{402}$ and $L_{403}$ are each independently a single bond, a substituted or unsubstituted arylene group having 6 to 30 ring carbon atoms, or a substituted or unsubstituted divalent heterocyclic group having 5 to 30 ring atoms;

a combination of $Ar_{402}$ and $Ar_{403}$ is mutually bonded to form a substituted or unsubstituted monocyclic ring, mutually bonded to form a substituted or unsubstituted fused ring, or not mutually bonded; and $Ar_{402}$ and $Ar_{403}$ not forming the monocyclic ring and not forming the fused ring are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is represented by a formula (42) below.

[Formula 133]

(42)

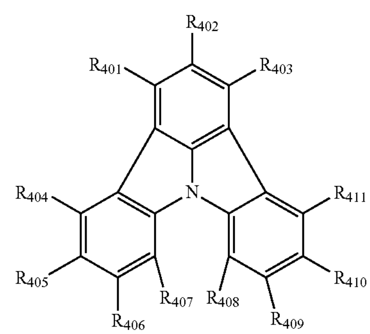

In the formula (42): at least one combination of adjacent two or more of $R_{401}$ to $R_{411}$ are mutually bonded to form a substituted or unsubstituted monocyclic ring, mutually bonded to form a substituted or unsubstituted fused ring, or not mutually bonded; and $R_{401}$ to $R_{411}$ not forming the monocyclic ring and not forming the fused ring are each independently a hydrogen atom, or a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $R_{401}$ to $R_{411}$ is preferably a group represented by the formula (4a). More preferably, at least two of $R_{401}$ to $R_{411}$ are groups represented by the formula (4a).

$R_{404}$ and $R_{411}$ are preferably groups represented by the formula (4a).

In an exemplary embodiment, the compound represented by the formula (4) is a compound formed by bonding a moiety represented by a formula (4-1) or a formula (4-2) below to the A1 ring.

Further, in an exemplary embodiment, the compound represented by the formula (42) is a compound formed by bonding the moiety represented by the formula (4-1) or the formula (4-2) to the ring bonded with $R_{404}$ to $R_{407}$.

[Formula 134]

(4-1)

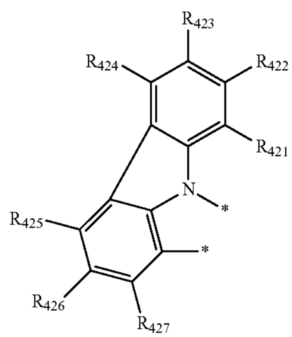

(4-2)

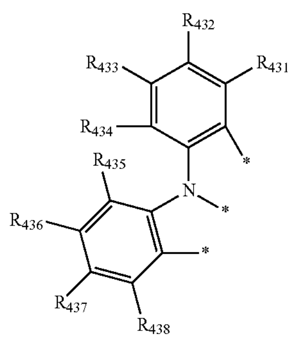

In the formula (4-1), two bonds * are each independently bonded to the ring-forming carbon atom of the aromatic hydrocarbon ring or the ring atom of the heterocycle as the A1 ring in the formula (4) or bonded to one of $R_{404}$ to $R_{407}$ in the formula (42);

in the formula (4-2), three bonds * are each independently bonded to the ring-forming carbon atom of the aromatic hydrocarbon ring or the ring atom of the heterocycle as the A1 ring in the formula (4) or bonded to one of $R_{404}$ to $R_{407}$ in the formula (42);

at least one combination of adjacent two or more of $R_{421}$ to $R_{427}$ are mutually bonded to form a substituted or unsubstituted monocyclic ring, mutually bonded to form a substituted or unsubstituted fused ring, or not mutually bonded;

at least one combination of adjacent two or more of $R_{431}$ to $R_{438}$ are mutually bonded to form a substituted or unsubstituted monocyclic ring, mutually bonded to form a substituted or unsubstituted fused ring, or not mutually bonded; and $R_{421}$ to $R_{427}$ and $R_{431}$ to $R_{438}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by a formula (41-3), a formula (41-4) or a formula (41-5) below.

[Formula 135]

(41-3)

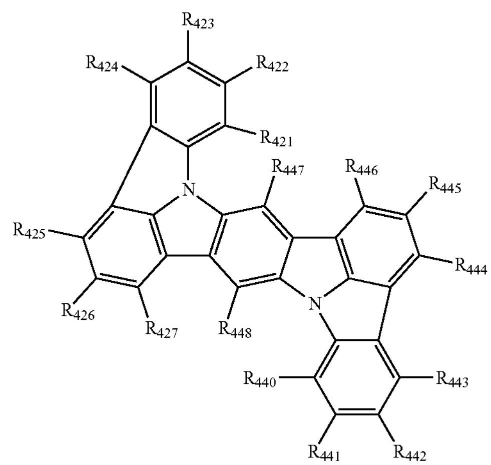

[Formula 136]

(41-4)

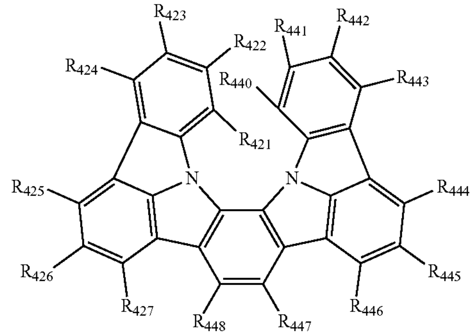

[Formula 137]

(41-5)

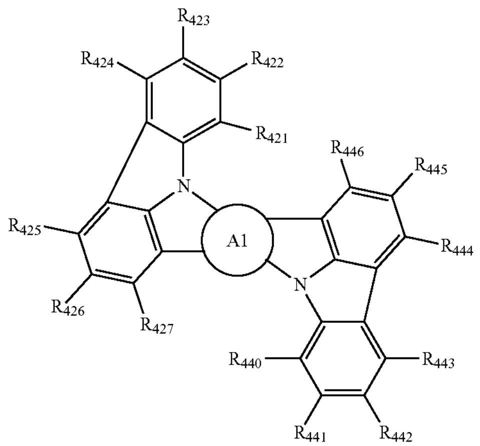

In the formulae (41-3), (41-4), and (41-5):

A1 ring is as defined for the formula (4);

$R_{421}$ to $R_{427}$ each independently represent the same as $R_{421}$ to $R_{427}$ in the formula (4-1); and $R_{440}$ to $R_{448}$ each independently represent the same as $R_{401}$ to $R_{411}$ in the formula (42).

In an exemplary embodiment, a substituted or unsubstituted aromatic hydrocarbon ring having 6 to 50 ring carbon atoms as the A1 ring in the formula (41-5) is a substituted or unsubstituted naphthalene ring, or a substituted or unsubstituted fluorene ring.

In an exemplary embodiment, a substituted or unsubstituted heterocycle having 5 to 50 ring atoms as the A1 ring in the formula (41-5) is a substituted or unsubstituted dibenzofuran ring, a substituted or unsubstituted carbazole ring, or a substituted or unsubstituted dibenzothiophene ring.

In an exemplary embodiment, the compound represented by the formula (4) or the formula (42) is selected from the group consisting of compounds represented by formulae (461) to (467) below.

[Formula 138]

(461)

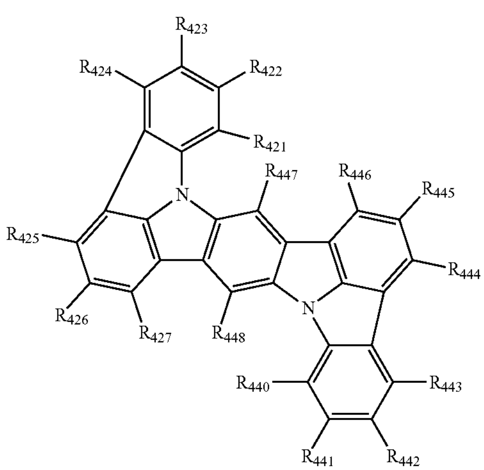

-continued (462)

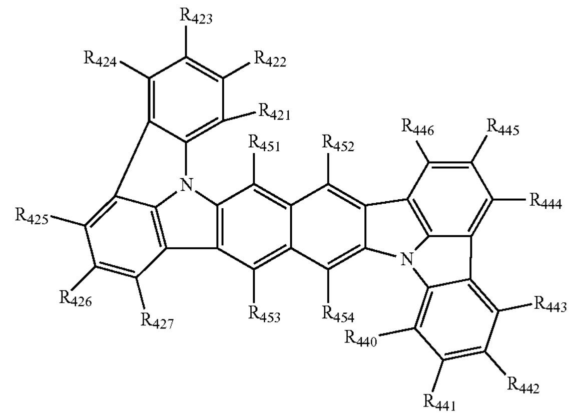

[Formula 139]

(463)

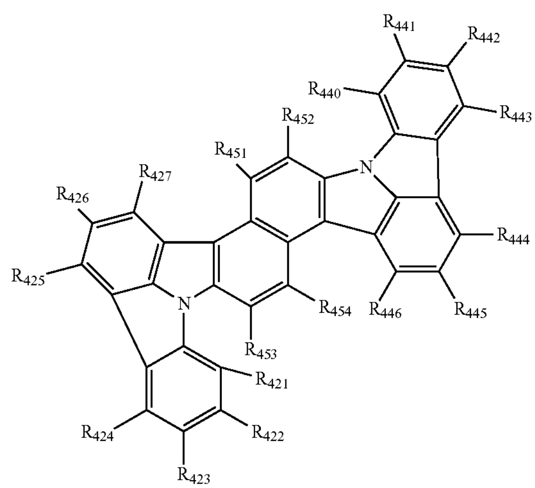

(464)

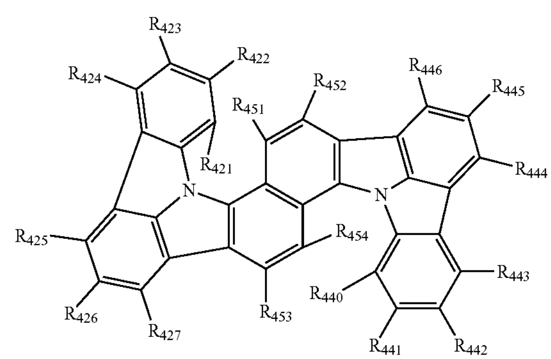

[Formula 140]

(465)

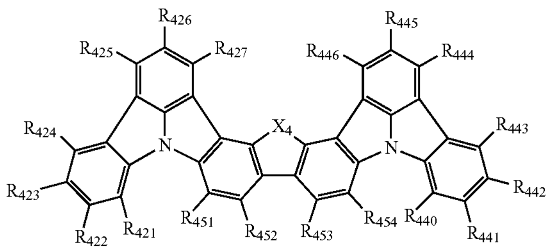

[Formula 141]

(466)

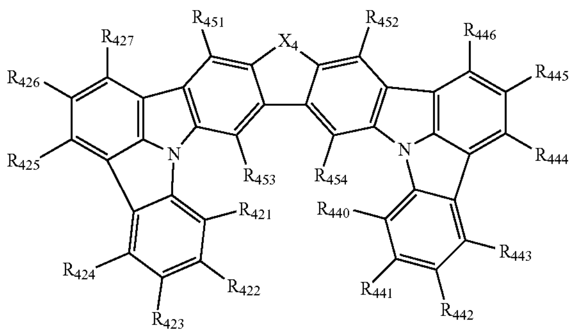

[Formula 142]

(467)

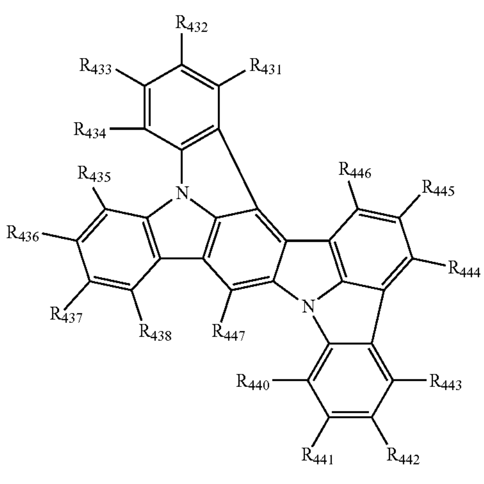

In the formulae (461), (462), (463), (464), (465), (466), and (467):

$R_{421}$ to $R_{427}$ each independently represent the same as $R_{421}$ to $R_{427}$ in the formula (4-1);

$R_{431}$ to $R_{438}$ each independently represent the same as $R_{431}$ to $R_{438}$ in the formula (4-2);

$R_{440}$ to $R_{448}$ and $R_{451}$ to $R_{454}$ each independently represent the same as $R_{401}$ to $R_{411}$ in the formula (42);

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, at least one combination of adjacent two or more of $R_{401}$ to $R_{411}$ in the compound represented by the formula (42) are mutually bonded to form a substituted or unsubstituted monocyclic ring, or mutually bonded to form a substituted or unsubstituted fused ring. This embodiment will be described in detail below as a compound represented by a formula (45).

Compound Represented by Formula (45)

The compound represented by the formula (45) will be described below.

[Formula 143]

(45)

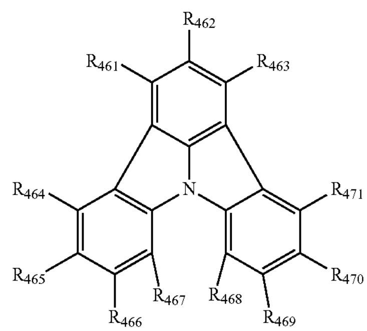

In the formula (45): two or more of combinations selected from the group consisting of a combination of $R_{461}$ and $R_{462}$, a combination of $R_{462}$ and $R_{463}$, a combination of $R_{464}$ and $R_{465}$, a combination of $R_{465}$ and $R_{466}$, a combination of $R_{466}$ and $R_{467}$, a combination of $R_{468}$ and $R_{469}$, a combination of $R_{469}$ and $R_{470}$, and a combination of $R_{470}$ and $R_{471}$ are mutually bonded to form a substituted or unsubstituted monocyclic ring or mutually bonded to form a substituted or unsubstituted fused ring.

However, the combination of $R_{461}$ and $R_{462}$ and the combination of $R_{462}$ and $R_{463}$; the combination of $R_{464}$ and $R_{465}$ and the combination of $R_{465}$ and $R_{466}$; the combination of $R_{465}$ and $R_{466}$ and the combination of $R_{466}$ and $R_{467}$; the combination of $R_{468}$ and $R_{469}$ and the combination of $R_{469}$ and $R_{470}$; and the combination of $R_{469}$ and $R_{470}$ and the combination of $R_{470}$ and $R_{471}$ do not simultaneously form a ring;

the two or more rings formed by $R_{461}$ to $R_{471}$ are mutually the same or different; and $R_{461}$ to $R_{471}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), or —N($R_{906}$)($R_{907}$); a halogen atom, a cyano group, a nitro group, a substituted or unsubstituted aryl group having 6 to 50 ring carbon atoms, or a substituted or unsubstituted heterocyclic group having 5 to 50 ring atoms.

In the formula (45), $R_n$ and $R_{n+1}$ (n being an integer selected from 461, 462, 464 to 466, and 468 to 470) are mutually bonded to form a substituted or unsubstituted monocyclic ring or fused ring together with two ring-forming carbon atoms bonded with $R_n$ and $R_{n+1}$. The ring is preferably formed of atoms selected from the group consisting of a carbon atom, an oxygen atom, a sulfur atom, and a nitrogen atom, and is made of 3 to 7, more preferably 5 or 6 atoms.

The number of the above cyclic structures in the compound represented by the formula (45) is, for instance, 2, 3, or 4. The two or more of the cyclic structures may be present on the same benzene ring on the basic skeleton represented by the formula (45) or may be present on different benzene rings. For instance, when three cyclic structures are present, each of the cyclic structures may be present on corresponding one of the three benzene rings of the formula (45).

Examples of the above cyclic structures in the compound represented by the formula (45) include structures represented by formulae (451) to (460) below.

[Formula 144]

(451)

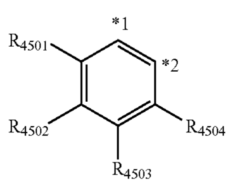

(452)

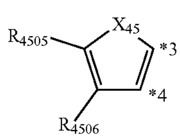

(453)

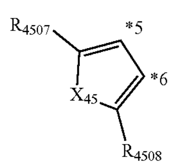

(454)

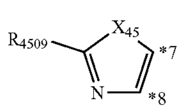

(455)

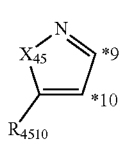

(456)

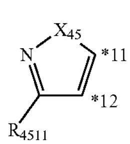

-continued (457)

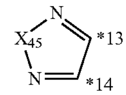

In the formulae (451) to (457):

each combination of *1 and *2, *3 and *4, *5 and *6, *7 and *8, *9 and *10, *11 and *12, and *13 and *14 represent the two ring-forming carbon atoms respectively bonded with $R_n$ and $R_{n+1}$;

the ring-forming carbon atom bonded with $R_n$ may be any one of the two ring-forming carbon atoms represented by *1 and *2, *3 and *4, *5 and *6, *7 and *8, *9 and *10, *11 and *12, and *13 and *14;

$X_{45}$ is C($R_{4512}$)($R_{4513}$), $NR_{4514}$, an oxygen atom, or a sulfur atom;

at least one combination of adjacent two or more of $R_{4501}$ to $R_{4506}$ and $R_{4512}$ to $R_{4513}$ are mutually bonded to form a substituted or unsubstituted monocyclic ring, mutually bonded to form a substituted or unsubstituted fused ring, or not mutually bonded; and $R_{4501}$ to $R_{4514}$ not forming the monocyclic ring and not forming the fused ring each independently represent the same as $R_{461}$ to $R_{471}$ in the formula (45).

[Formula 145]

(458)

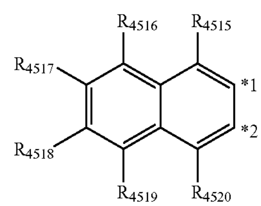

(459)

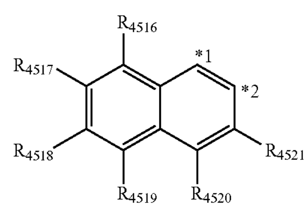

(460)

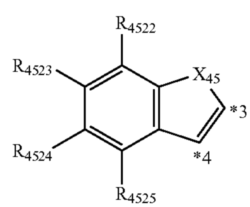

In the formulae (458) to (460):

each combination of *1 and *2, and *3 and *4 represent the two ring-forming carbon atoms each bonded with $R_n$ and $R_{n+1}$;

the ring-forming carbon atom bonded with $R_n$ may be any one of the two ring-forming carbon atoms represented by *1 and *2, or *3 and *4;

$X_{45}$ is C($R_{4512}$)($R_{4513}$), $NR_{4514}$, an oxygen atom, or a sulfur atom;

at least one combination of adjacent two or more of $R_{4512}$ to $R_{4513}$ and $R_{4515}$ to $R_{4525}$ are mutually bonded to form a substituted or unsubstituted monocyclic ring, mutually bonded to form a substituted or unsubstituted fused ring, or not mutually bonded; and $R_{4512}$ to $R_{4513}$, $R_{4515}$ to $R_{4521}$ and $R_{4522}$ to $R_{4525}$, and $R_{4514}$ not forming the monocyclic ring and not forming the fused ring each independently represent the same as $R_{461}$ to $R_{471}$ in the formula (45).

In the formula (45), it is preferable that at least one of $R_{462}$, $R_{464}$, $R_{465}$, $R_{470}$ or $R_{471}$ (preferably, at least one of $R_{462}$, $R_{465}$ and $R_{470}$, more preferably $R_{462}$) is a group not forming the cyclic structure.

(i) A substituent, if present, of the cyclic structure formed by $R_n$ and $R_n$+1 of the formula (45), (ii) $R_{461}$ to $R_{471}$ not forming the cyclic structure in the formula (45), and iii) $R_{4501}$ to $R_{4514}$, $R_{4515}$ to $R_{4525}$ in the formulae (451) to (460) are preferably each independently any one of group selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —N($R_{906}$)($R_{907}$), a substituted or unsubstituted aryl group having 6 to 50 ring carbon atoms, a substituted or unsubstituted heterocyclic group having 5 to 50 ring atoms, or a group represented by formulae (461) to (464) below.

[Formula 146]

(461)

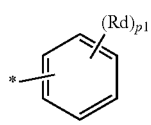

(462)

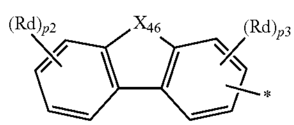

(463)

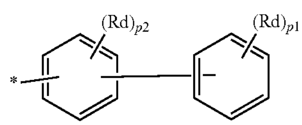

(464)

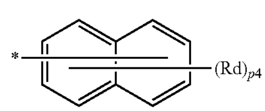

In the formulae (461) to (464):

$R_d$ is each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_{46}$ is C($R_{801}$)($R_{802}$), $NR_{803}$, an oxygen atom or a sulfur atom;

$R_{801}$, $R_{802}$, and $R_{803}$ are each independently a hydrogen atom, or a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different, when a plurality of $R_{802}$ are present, the plurality of $R_{802}$ are mutually the same or different; and when a plurality of $R_{803}$ are present, the plurality of $R_{803}$ are mutually the same or different;

p1 is 5, p2 is 4, p3 is 3, p4 is 7;

in the formulae (461) to (464), * each independently represents a bonding position to a cyclic structure.

In the fourth and fifth compounds, $R_{901}$ to $R_{907}$ represent the same as $R_{901}$ to $R_{907}$ as described above.

In an exemplary embodiment, the compound represented by the formula (45) is represented by one of formulae (45-1) to (45-6) below.

[Formula 147]

(45-1)

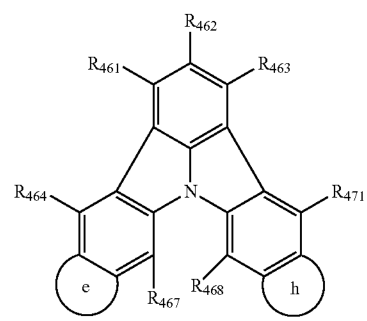

(45-2)

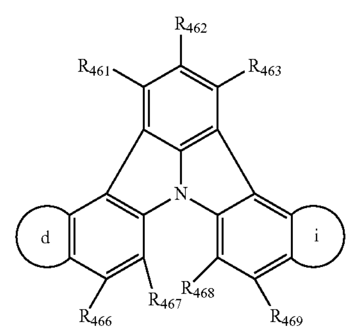

(45-3)

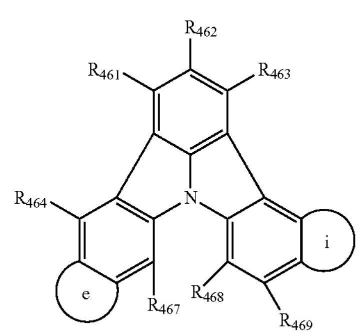

[Formula 148]

(45-4)

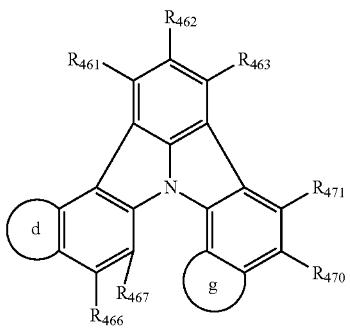

(45-5)

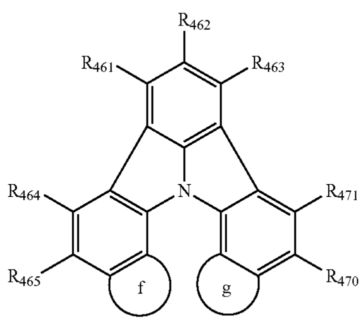

(45-6)

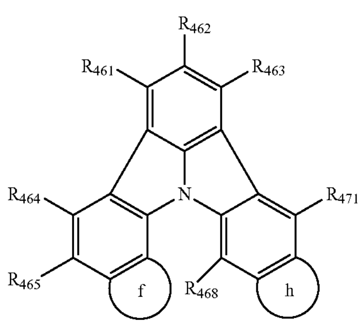

In the formulae (45-1) to (45-6):

rings d to i are each dependently a substituted or unsubstituted monocyclic ring or a substituted or unsubstituted fused ring; and $R_{461}$ to $R_{471}$ each independently represent the same as $R_{461}$ to $R_{471}$ in the formula (45).

In an exemplary embodiment, the compound represented by the formula (45) is represented by one of formulae (45-7) to (45-12) below.

[Formula 149]

(45-7)

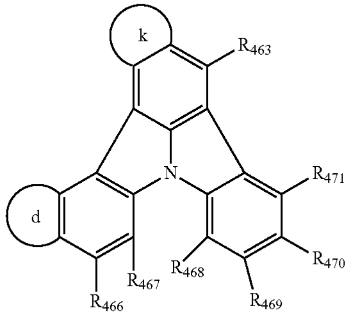

-continued (45-8)

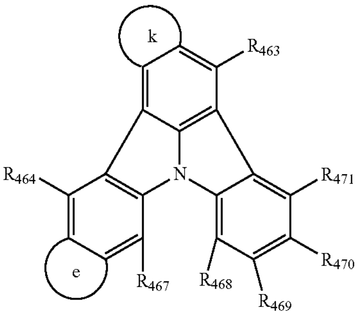

(45-9)

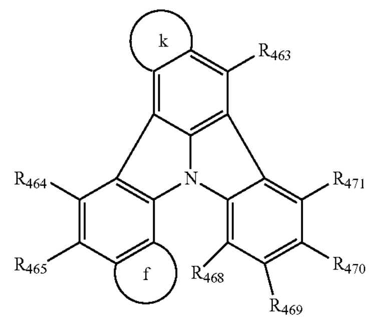

[Formula 150]

(45-10)

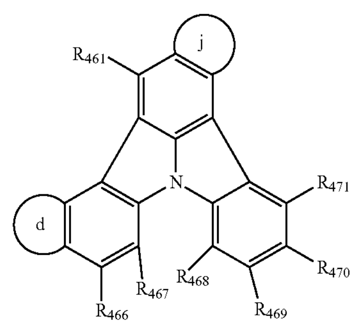

(45-11)

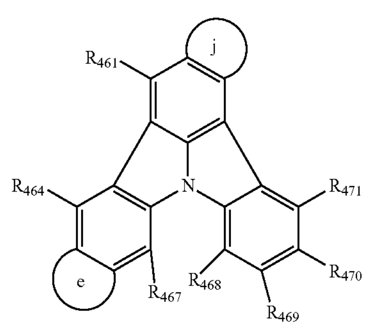

-continued (45-12)

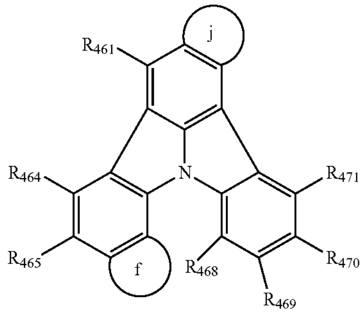

In the formulae (45-7) to (45-12):

rings d to f, k and j are each dependently a substituted or unsubstituted monocyclic ring or a substituted or unsubstituted fused ring; and $R_{461}$ to $R_{471}$ each independently represent the same as $R_{461}$ to $R_{471}$ in the formula (45).

In an exemplary embodiment, the compound represented by the formula (45) is represented by one of formulae (45-13) to (45-21) below.

[Formula 151]

(45-13)

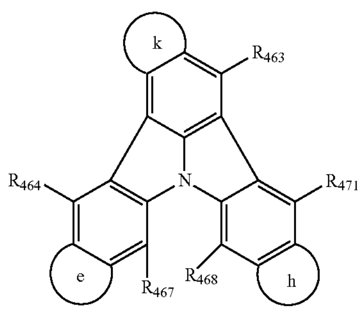

(45-14)

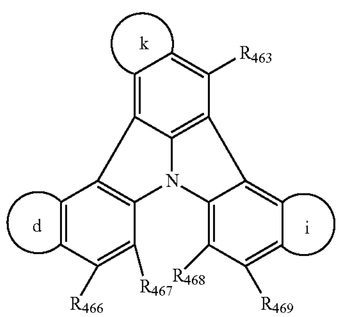

(45-15)

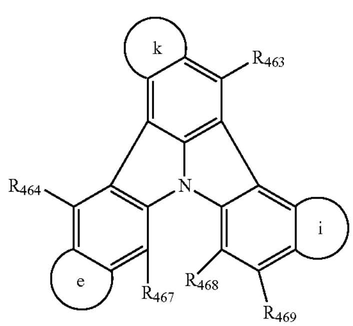

[Formula 152]

(45-16)

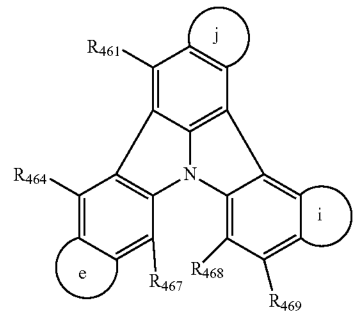

(45-17)

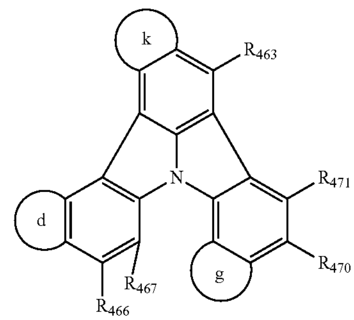

(45-18)

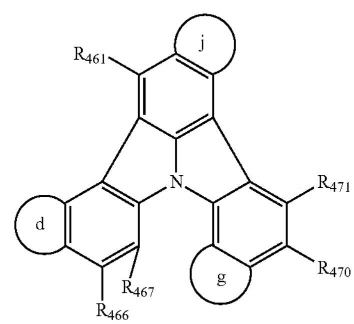

[Formula 153]

(45-19)

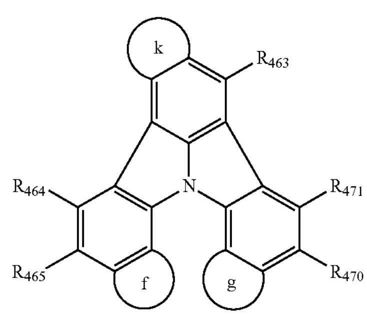

-continued (45-20)

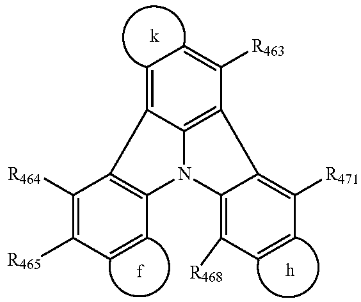

(45-21)

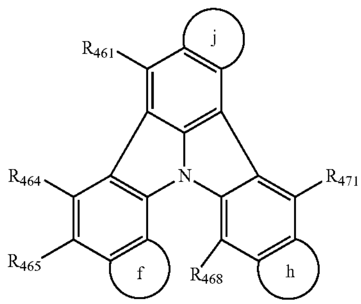

In the formulae (45-13) to (45-21):

rings d to k are each dependently a substituted or unsubstituted monocyclic ring or a substituted or unsubstituted fused ring; and $R_{461}$ to $R_{471}$ each independently represent the same as $R_{461}$ to $R_{471}$ in the formula (45).

When the ring g or the ring h further has a substituent, examples of the substituent include a substituted or unsubstituted alkyl group having 1 to 50 carbon atoms, a substituted or unsubstituted aryl group having 6 to 50 ring carbon atoms, a group represented by the formula (461), a group represented by the formula (463), or a group represented by the formula (464).

In an exemplary embodiment, the compound represented by the formula (45) is represented by one of formulae (45-22) to (45-25) below.

[Formula 154]

(45-22)

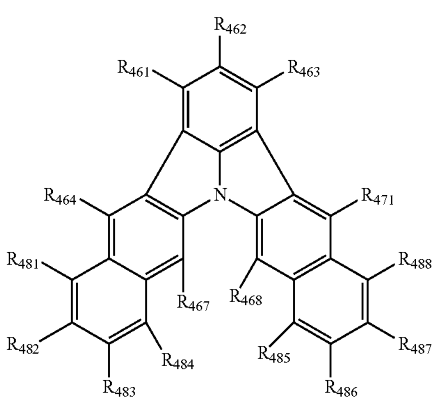

-continued (45-23)

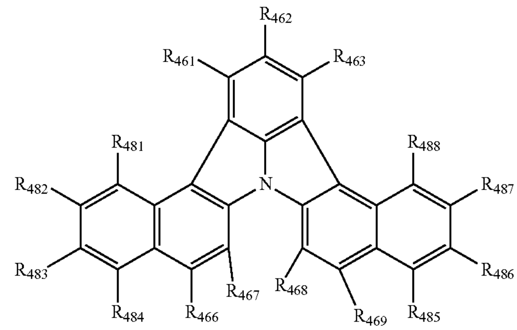

(45-24)

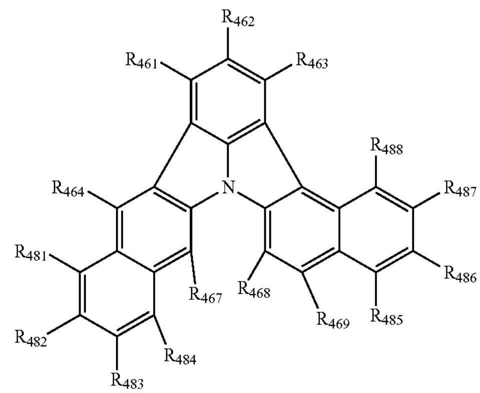

(45-25)

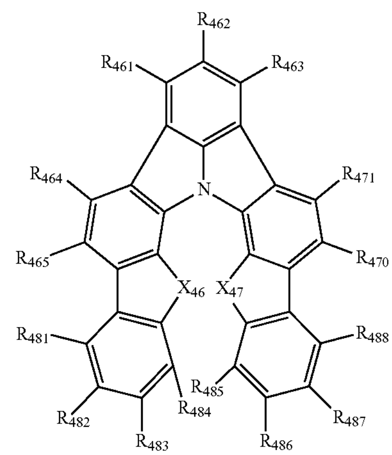

In the formulae (45-22) to (45-25):

$X_{46}$ and $X_{47}$ are each independently $C(R_{801})(R_{802})$, $NR_{803}$, an oxygen atom or a sulfur atom;

$R_{461}$ to $R_{471}$ and $R_{481}$ to $R_{488}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different, when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, the compound represented by the formula (45) is represented by a formula (45-26) below.

[Formula 155]

(45-26)

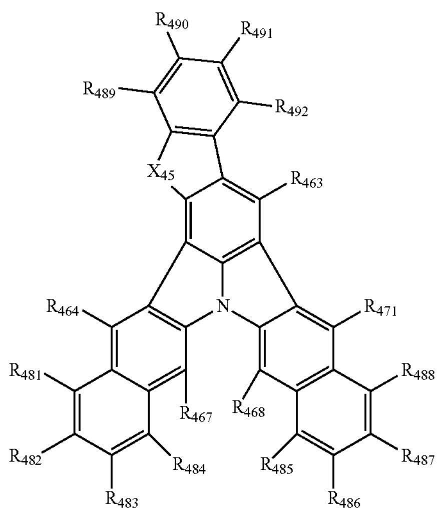

In the formula (45-26): $X_{46}$ is $C(R_{801})(R_{802})$, $NR_{803}$, an oxygen atom or a sulfur atom;

$R_{463}$, $R_{464}$, $R_{467}$, $R_{468}$, $R_{471}$, and $R_{481}$ to $R_{492}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different, when a plurality of $R_{802}$ are present, the plurality of $R_{802}$ are mutually the same or different; and when a plurality of $R_{803}$ are present, the plurality of $R_{803}$ are mutually the same or different.

Specific Examples of Compound Represented by Formula (4)

Specific examples of the compound represented by the formula (4) include compounds shown below. In the specific examples below, Ph represents a phenyl group, and D represents a deuterium atom.

[Formula 156]

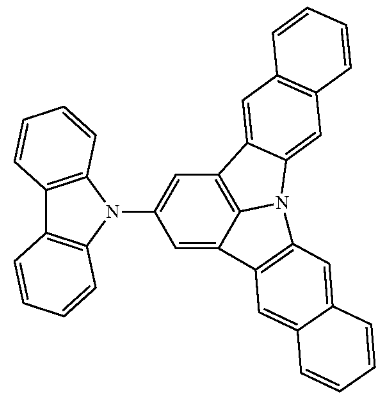

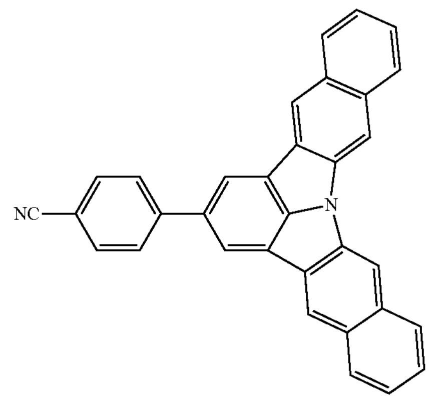

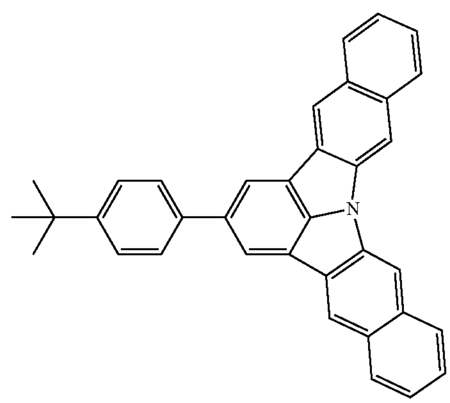

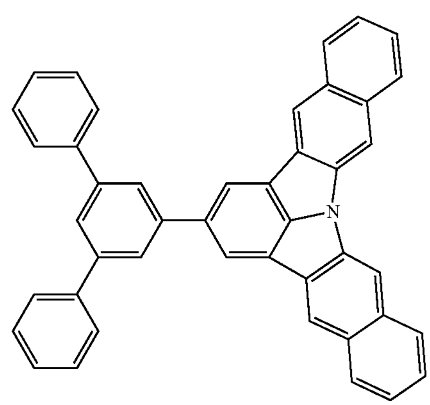

-continued
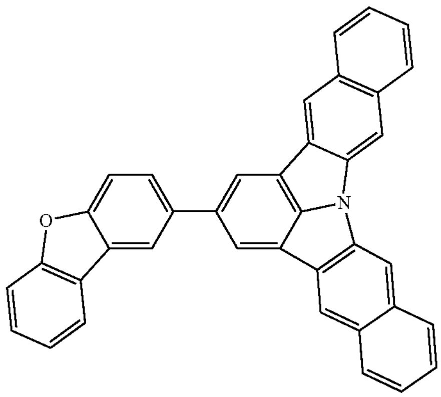
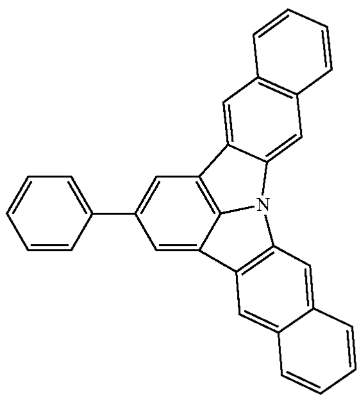
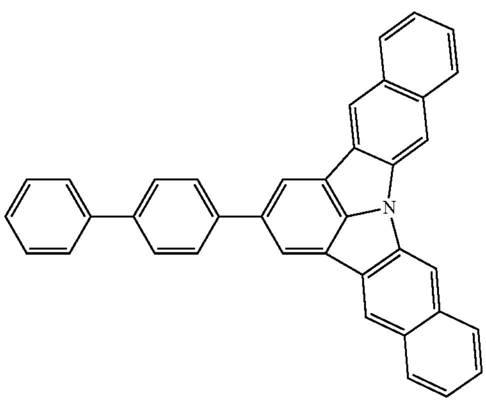
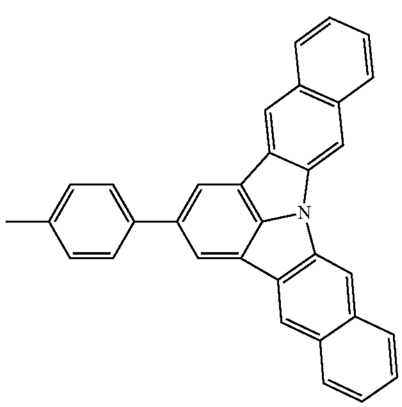
-continued
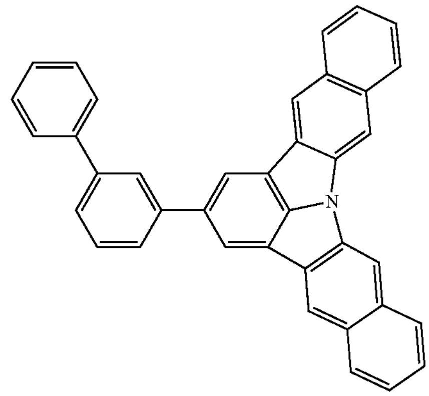
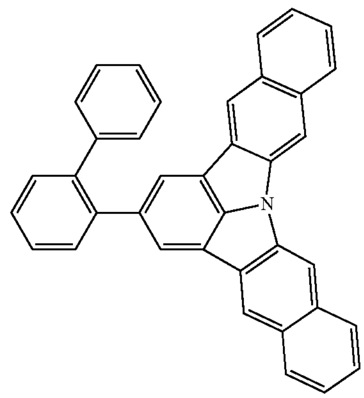
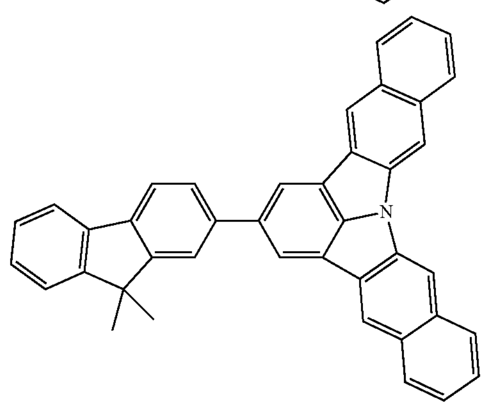
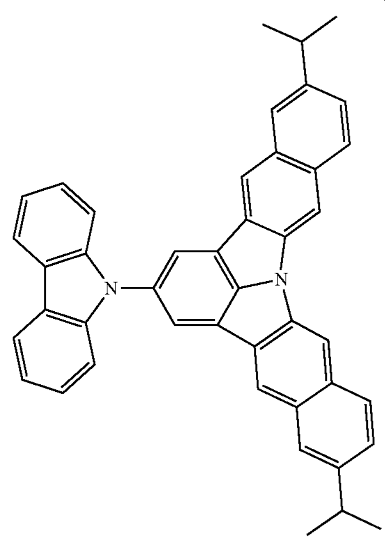

-continued
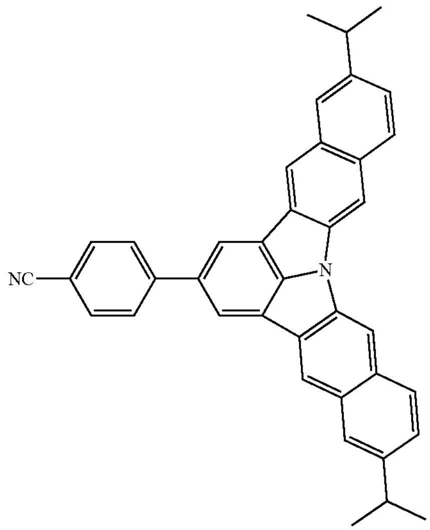
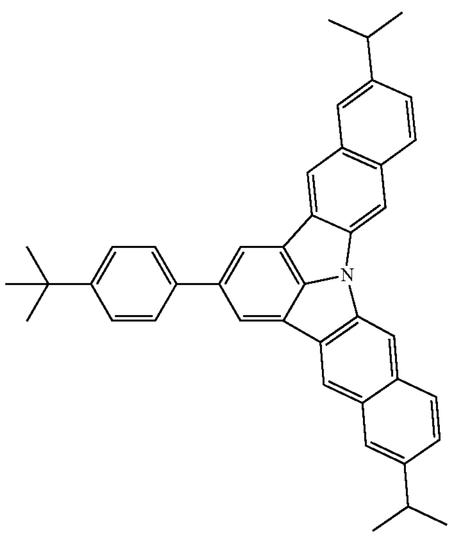
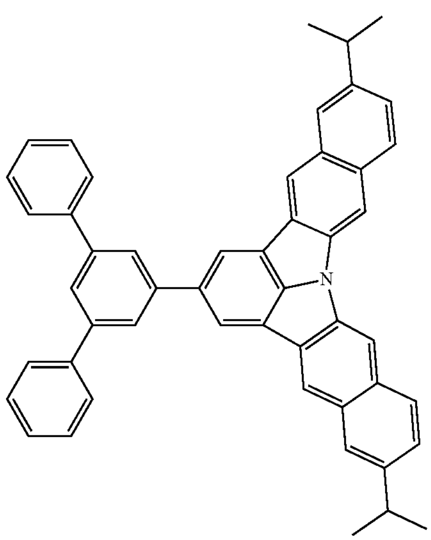
-continued
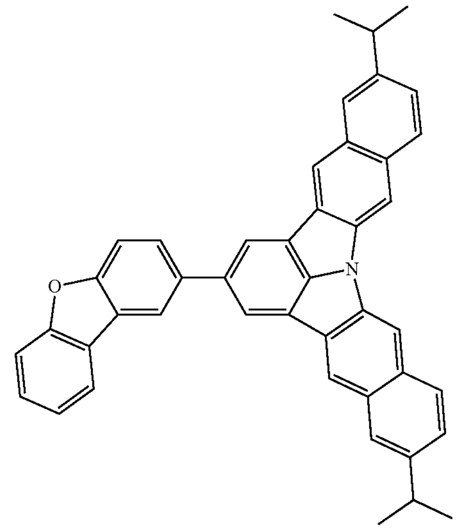
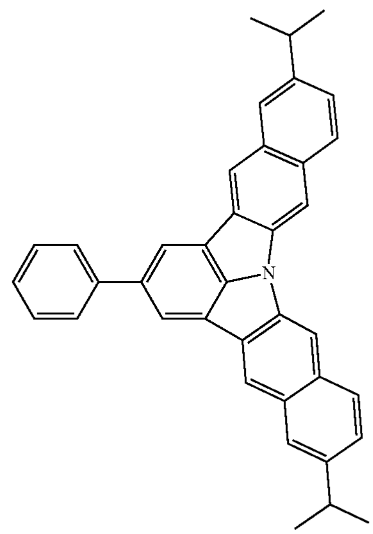
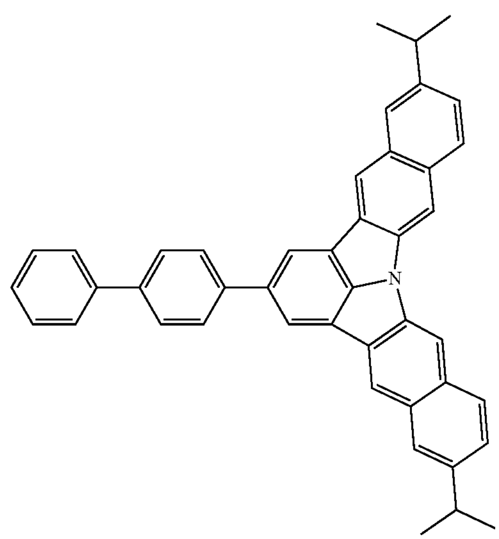

[Formula 157]
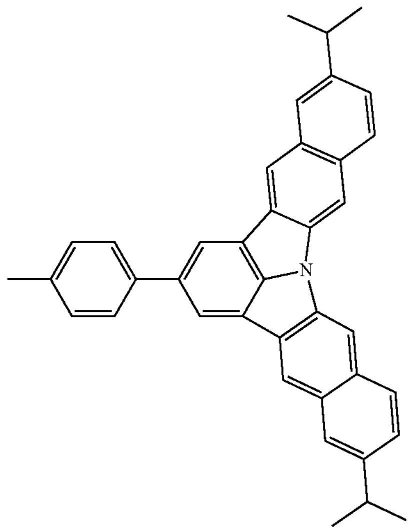
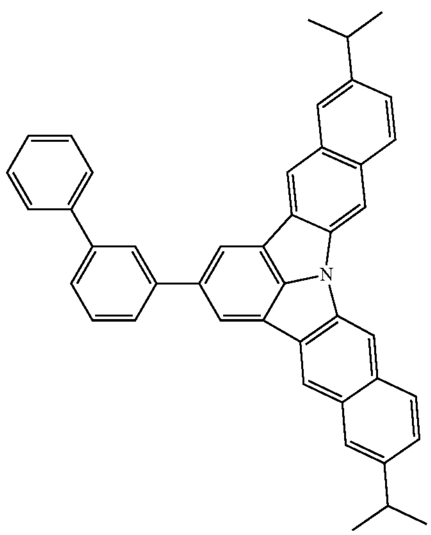
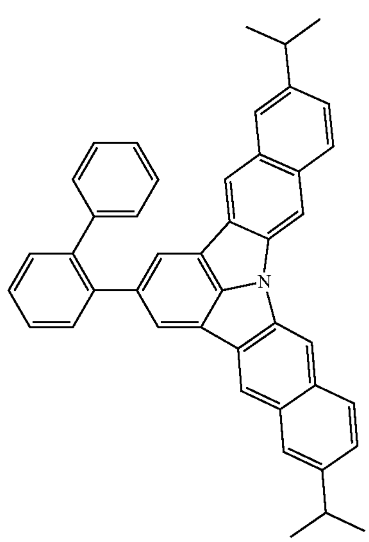
-continued
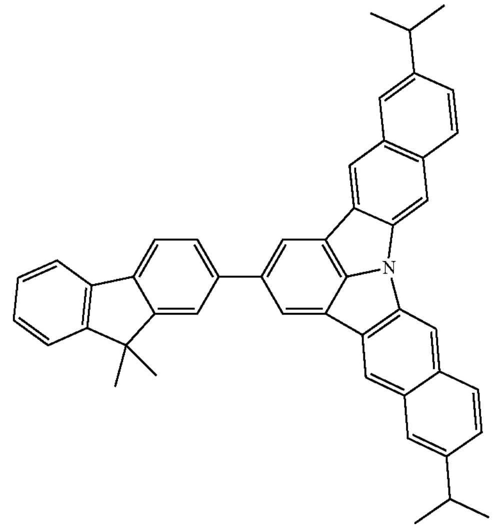
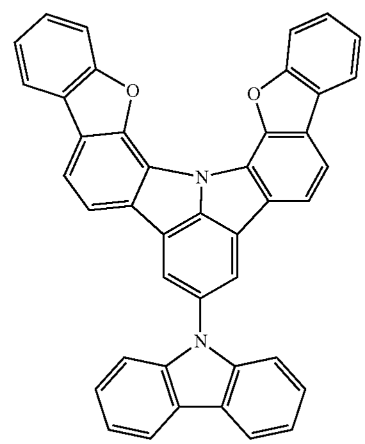
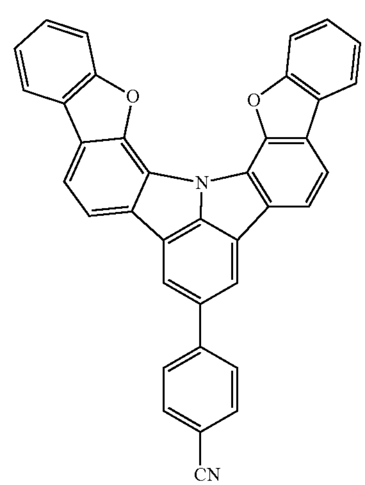

-continued
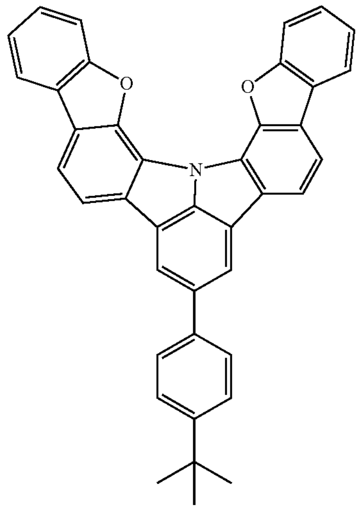
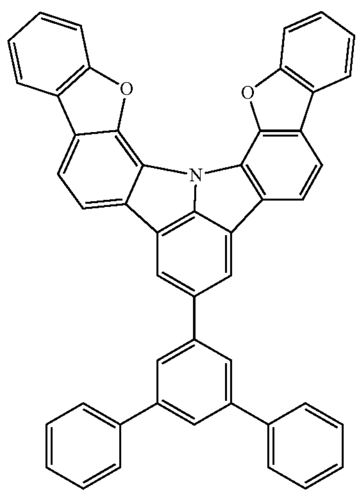
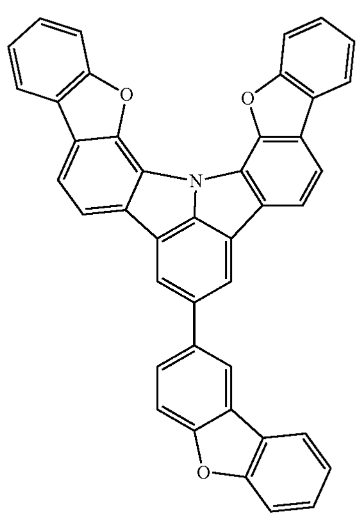
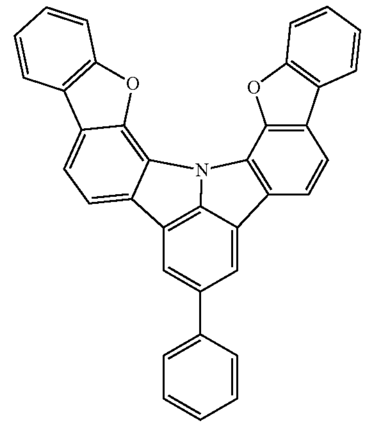
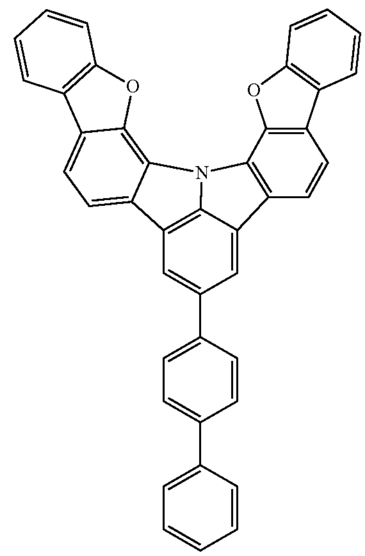
-continued
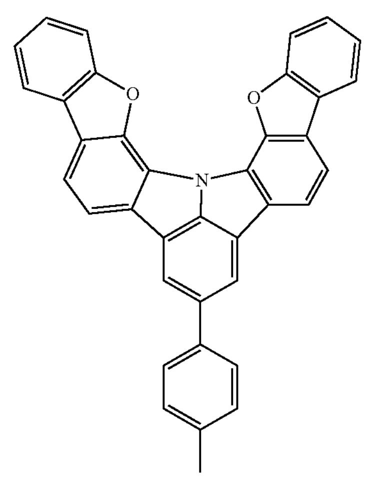

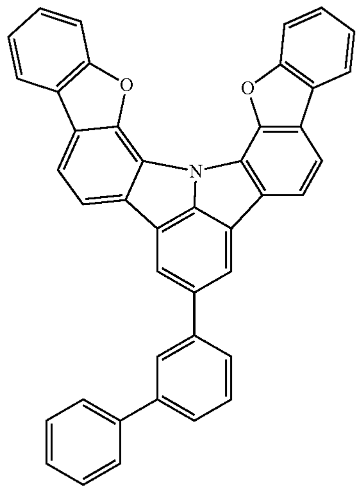
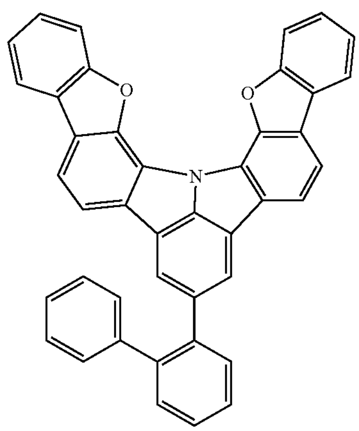
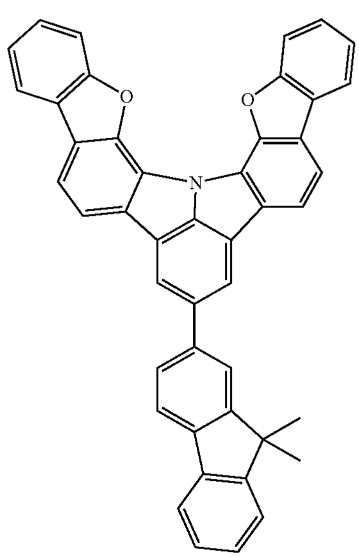
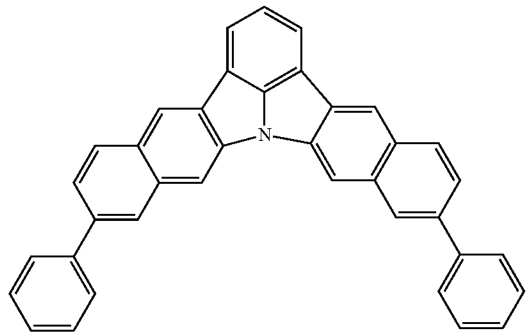
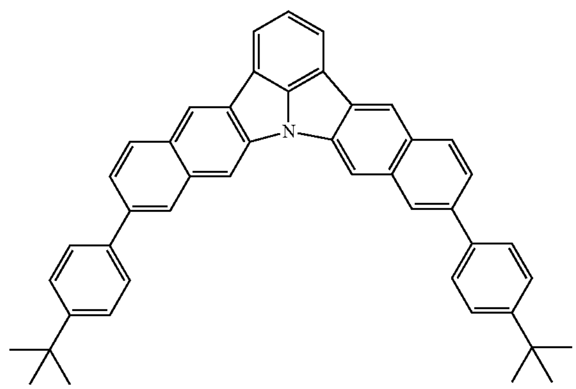
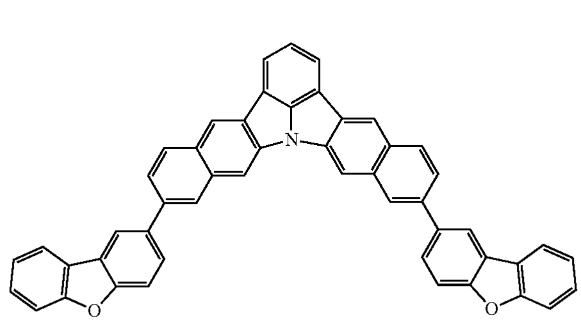

[Formula 158]
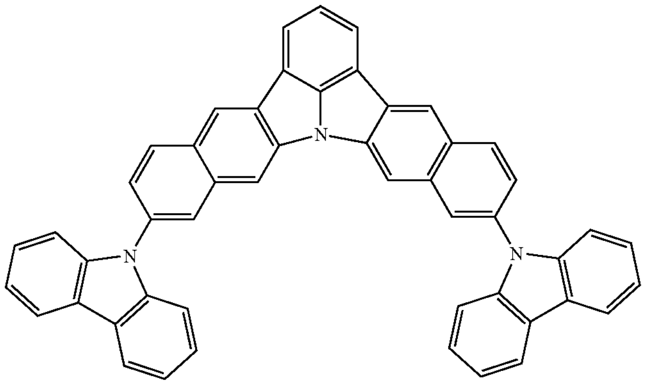
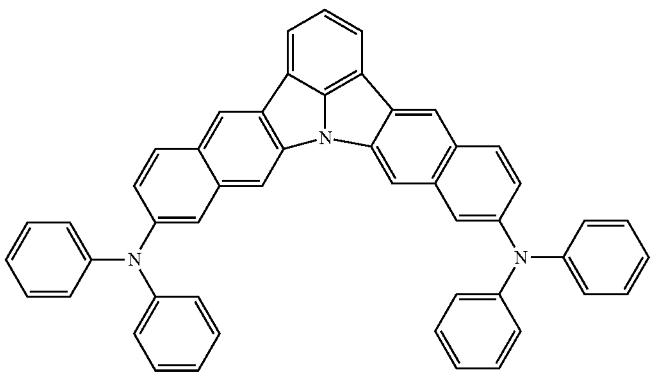
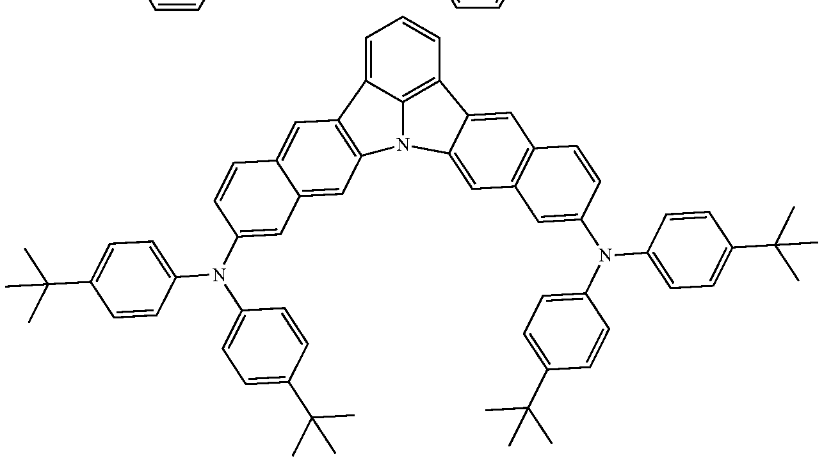
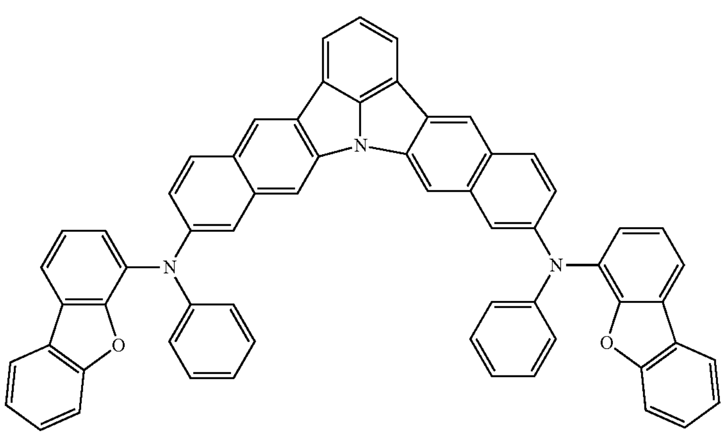

-continued
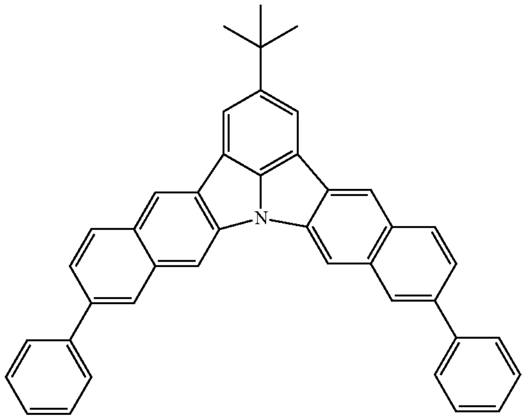
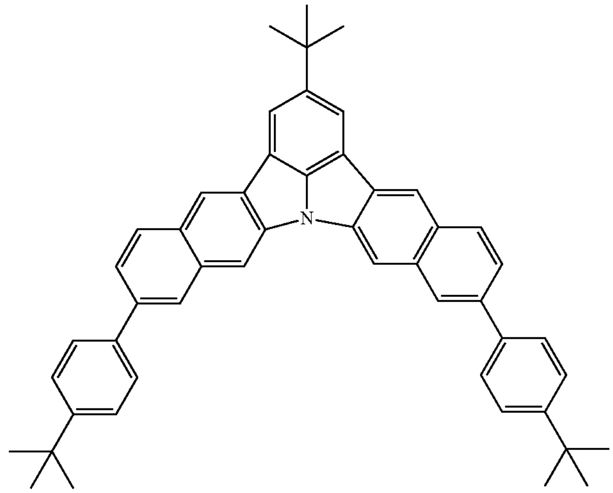
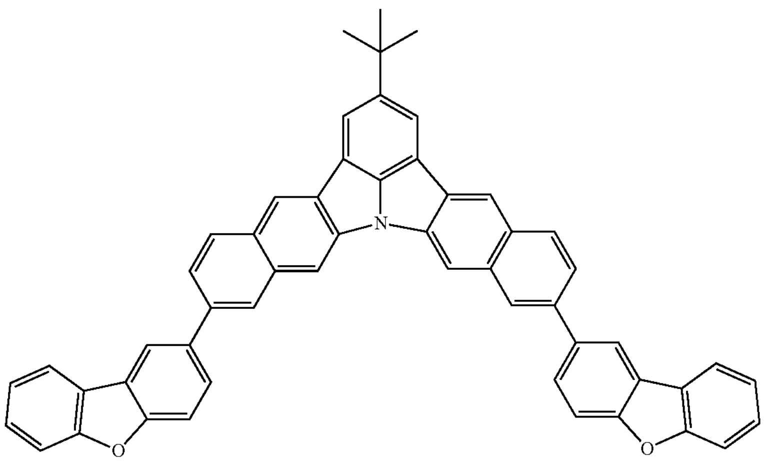
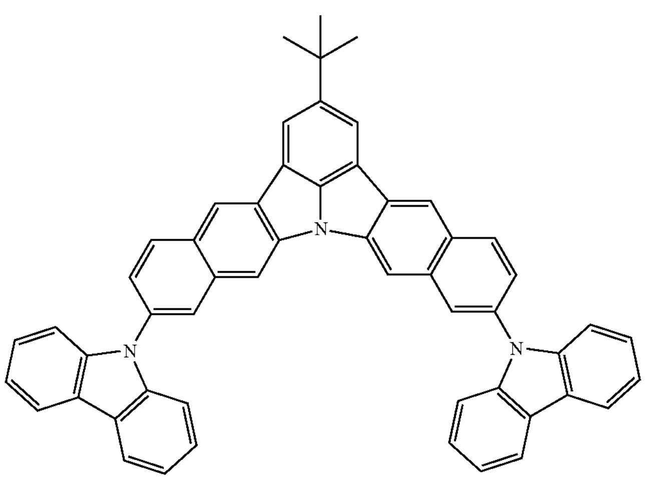

-continued
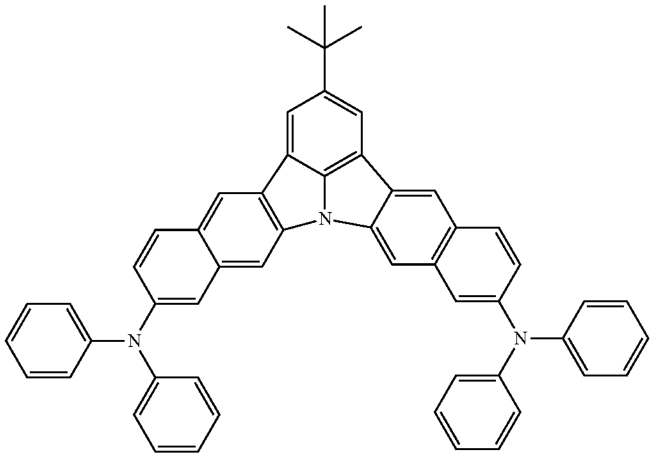
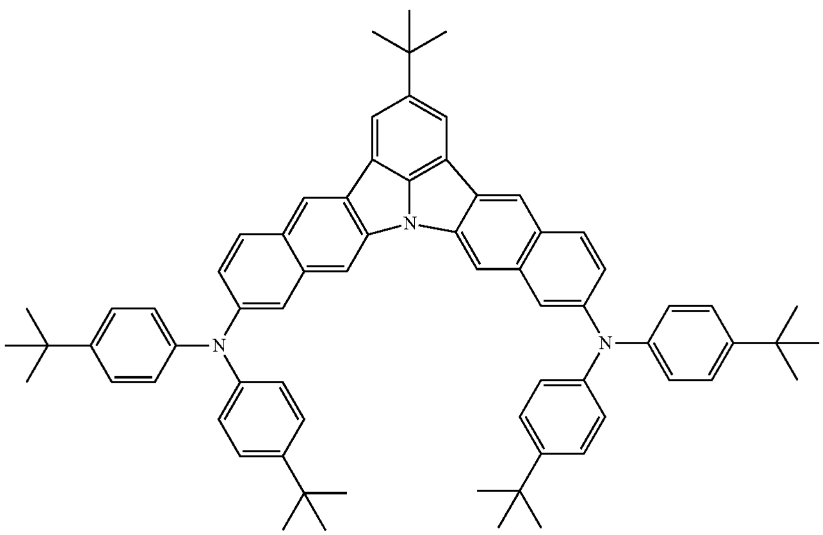
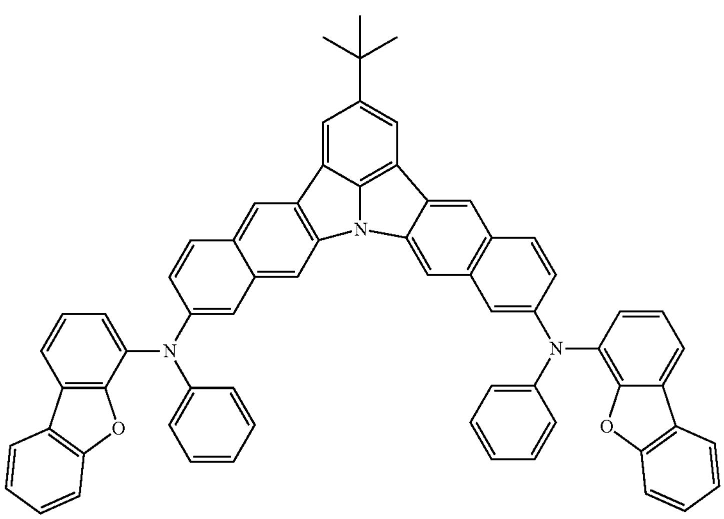

-continued
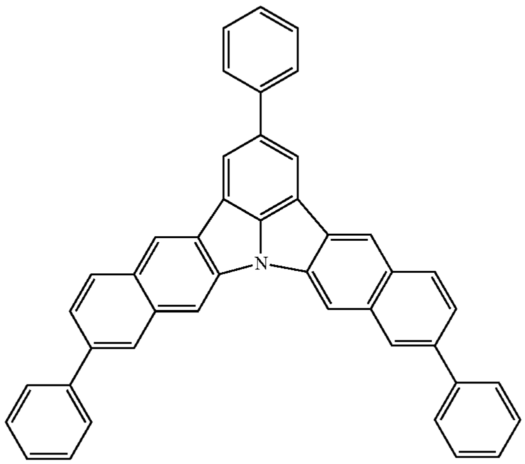
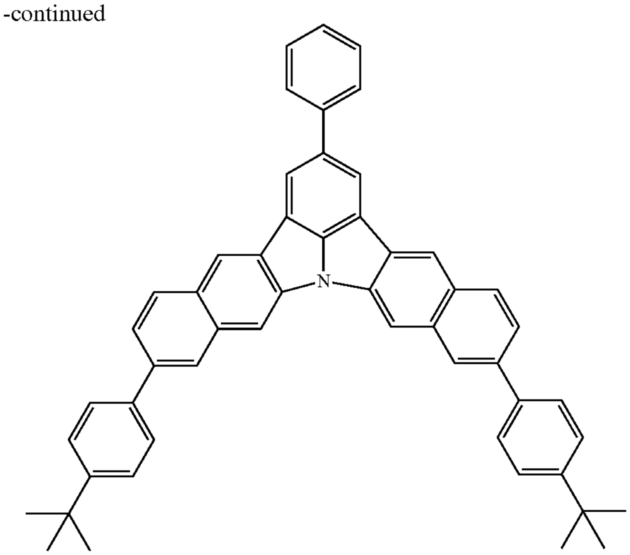
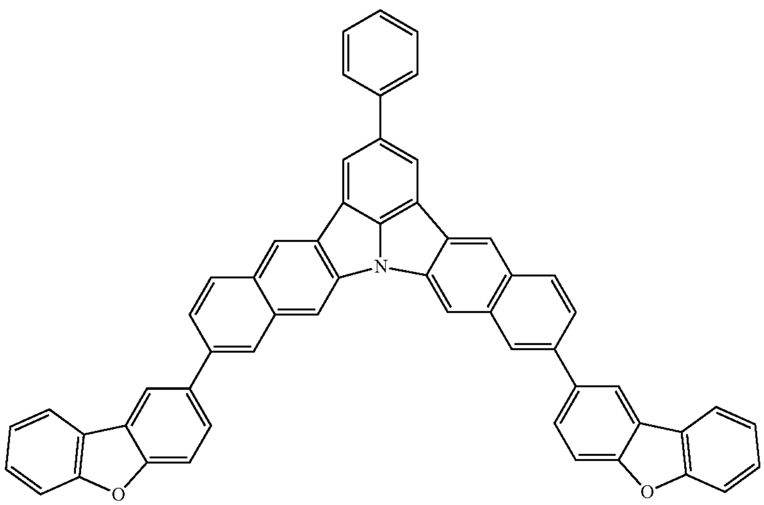
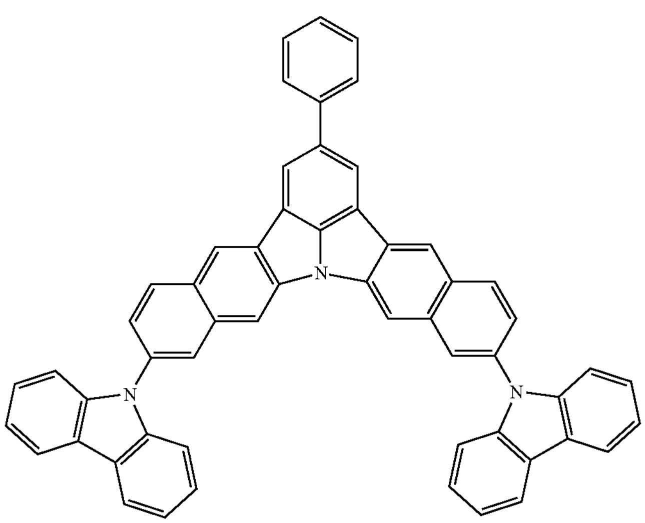

-continued
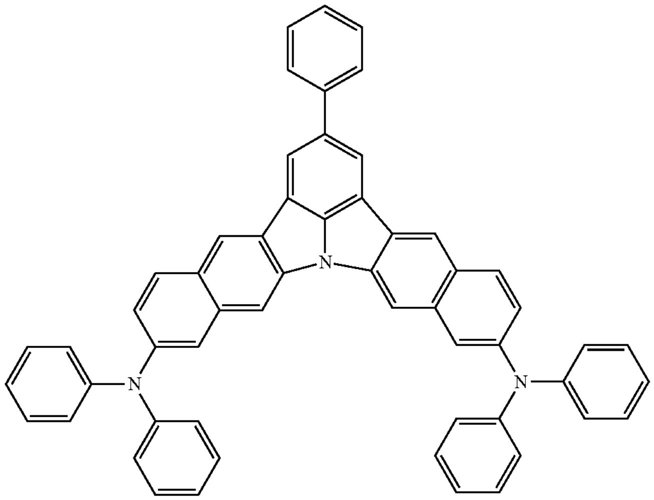
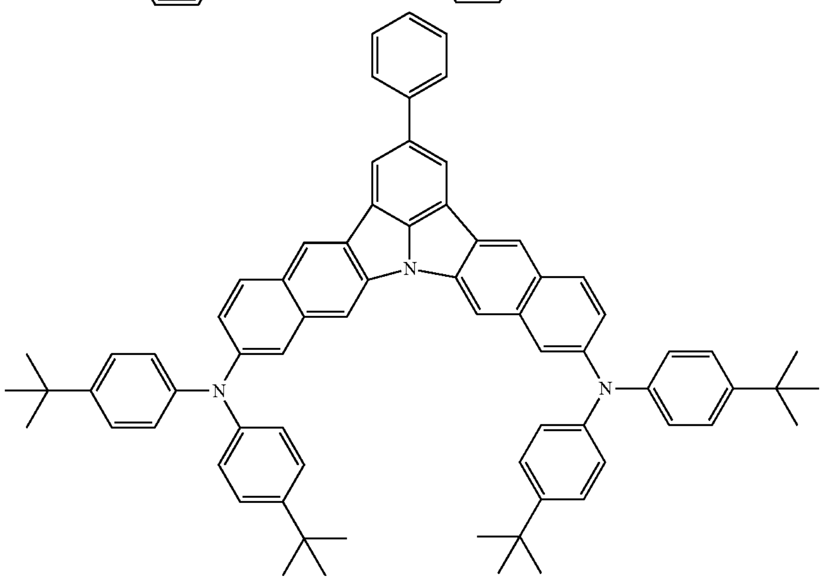
[Formula 159]
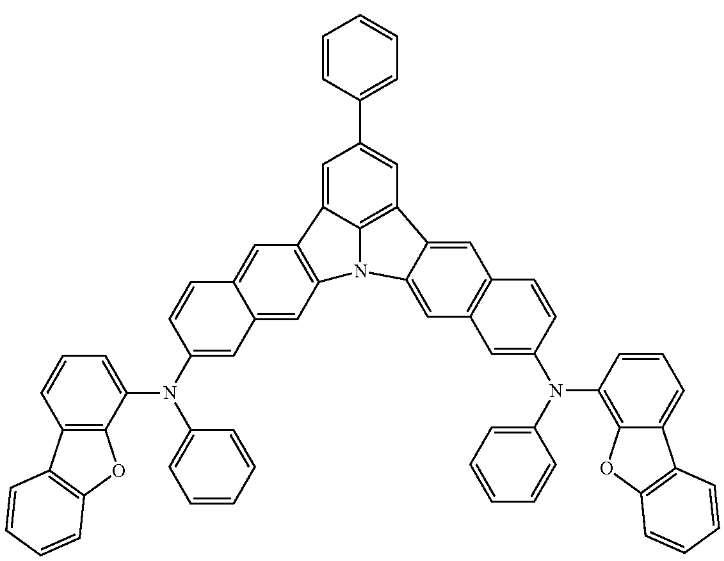

-continued
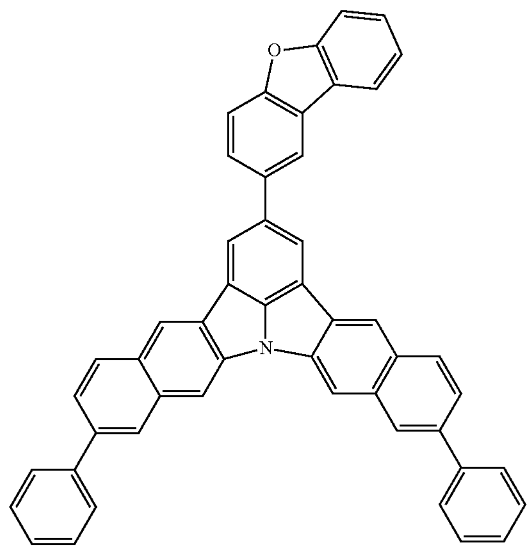
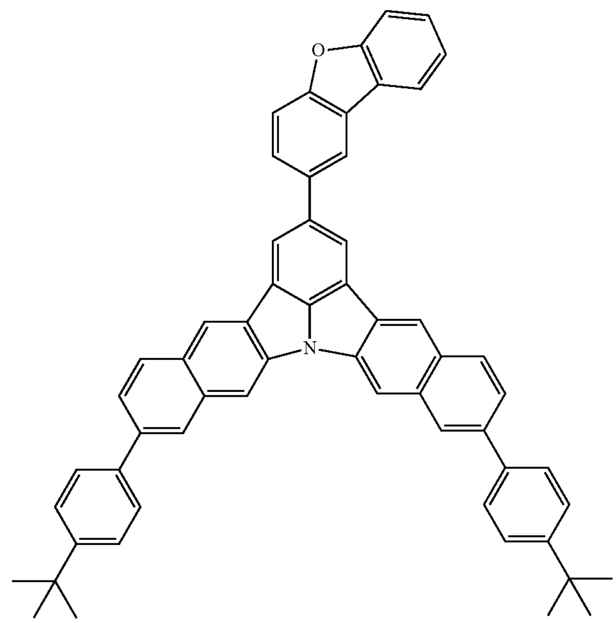
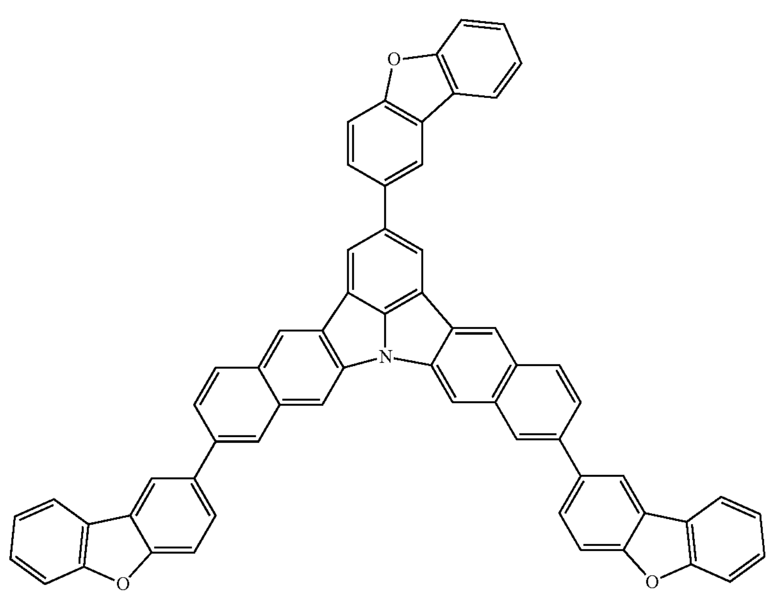

-continued
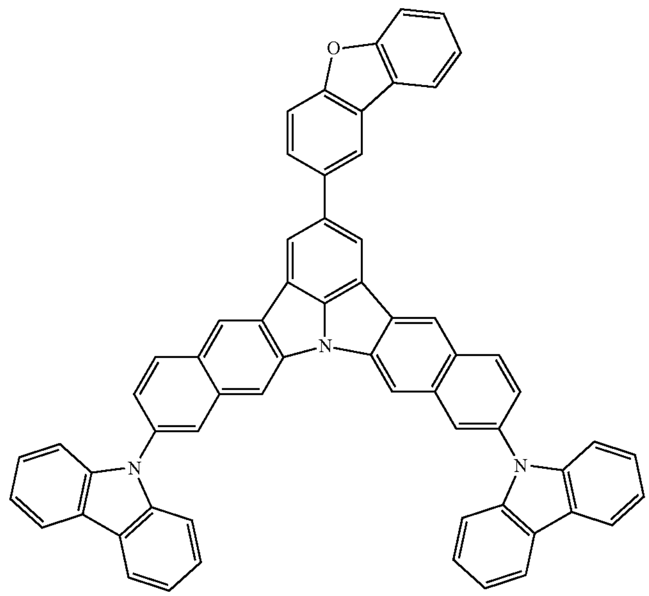
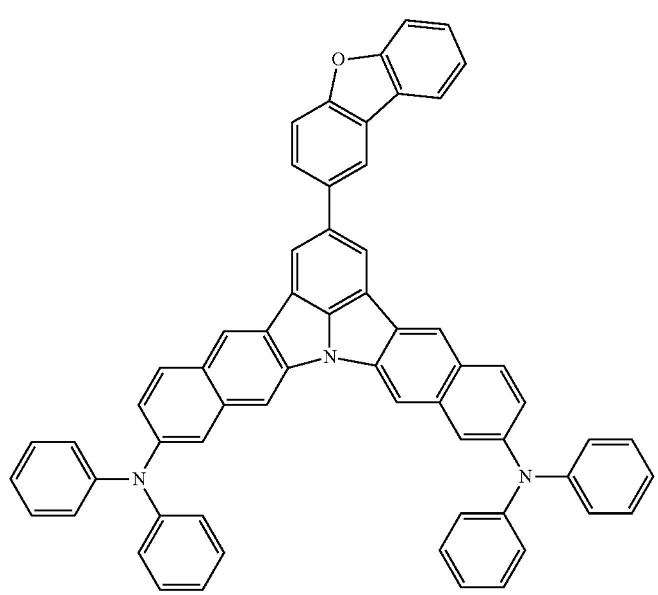

-continued
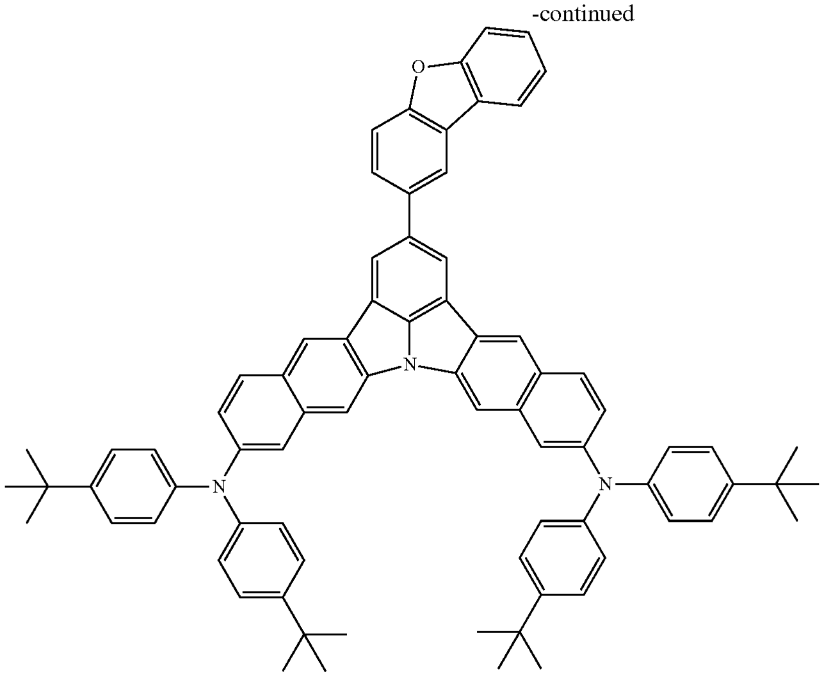
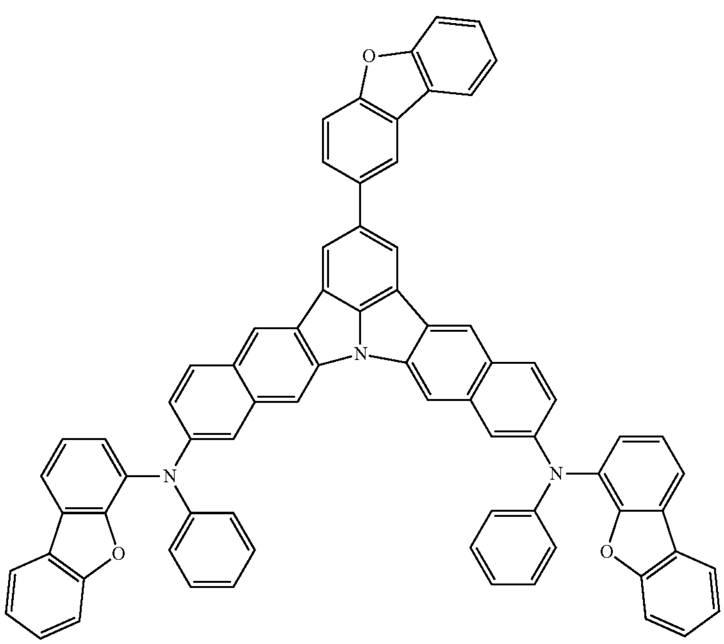

-continued
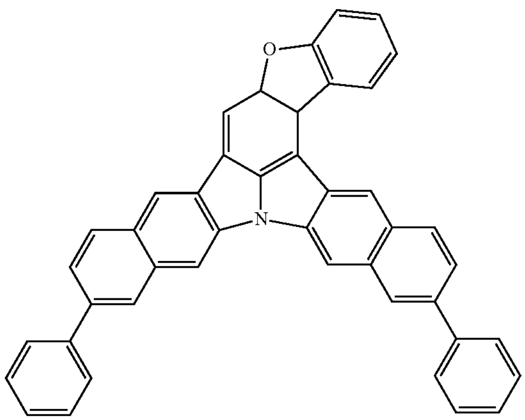
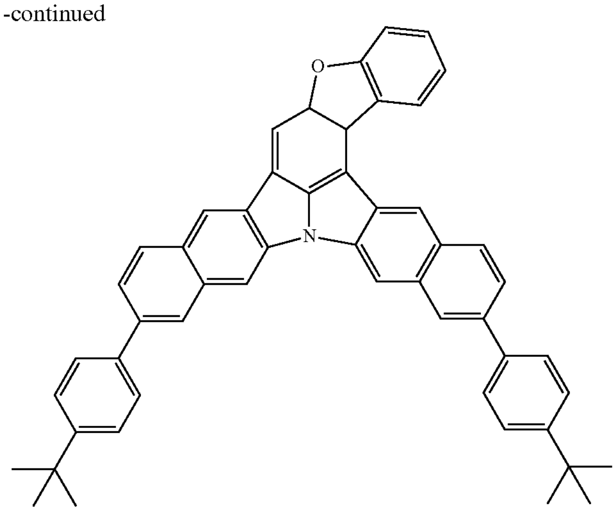
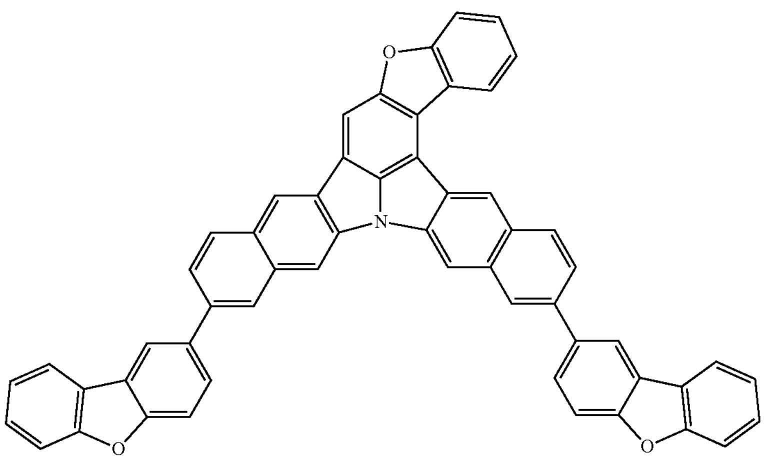
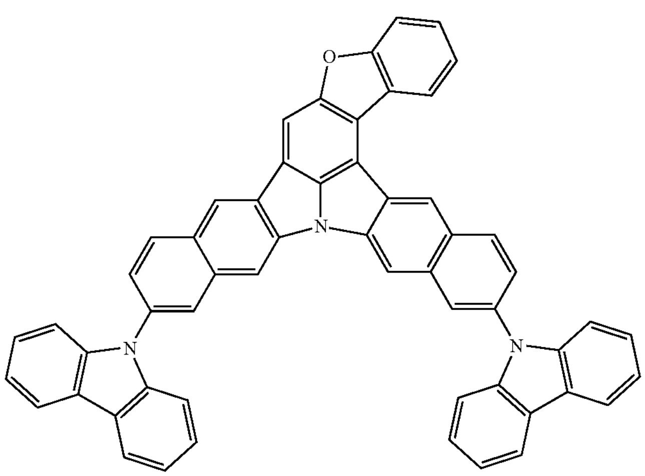

-continued
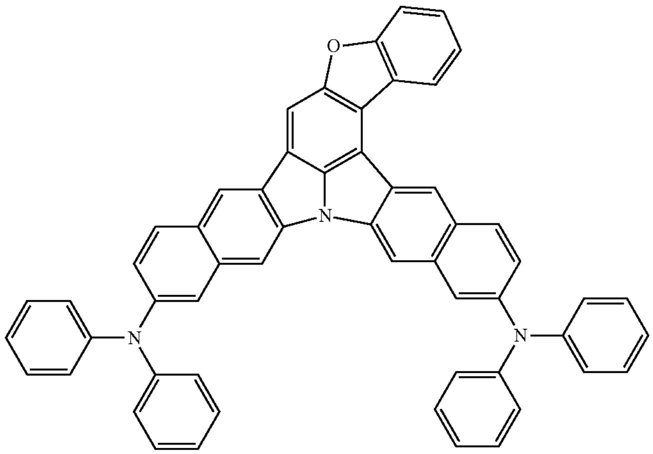
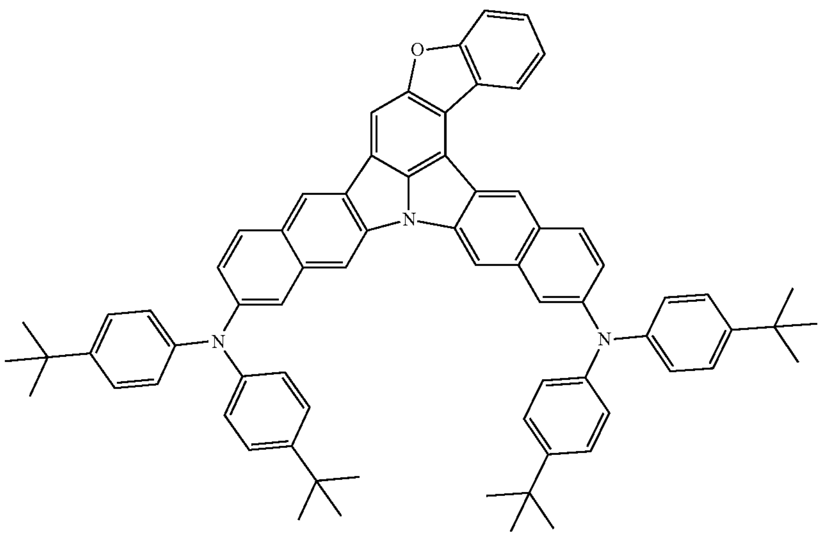
[Formula 160]
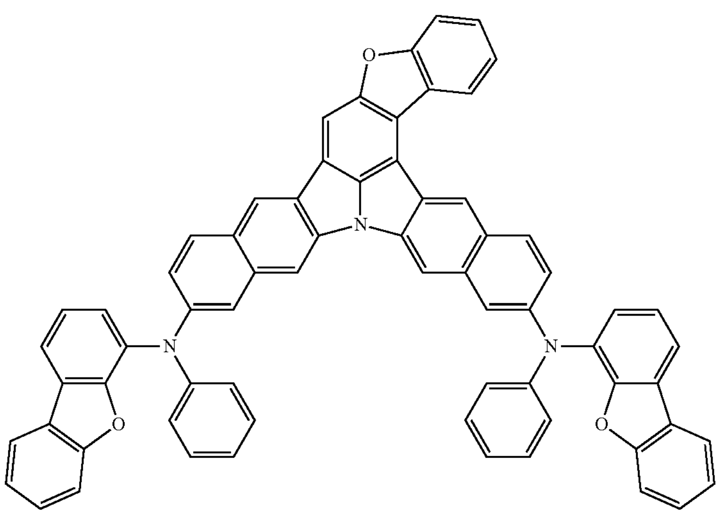

-continued
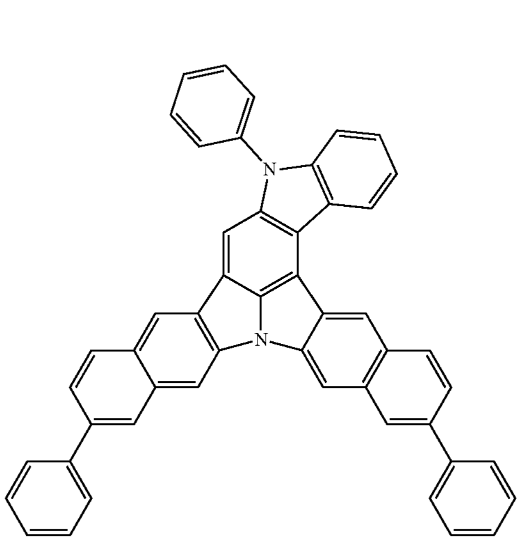
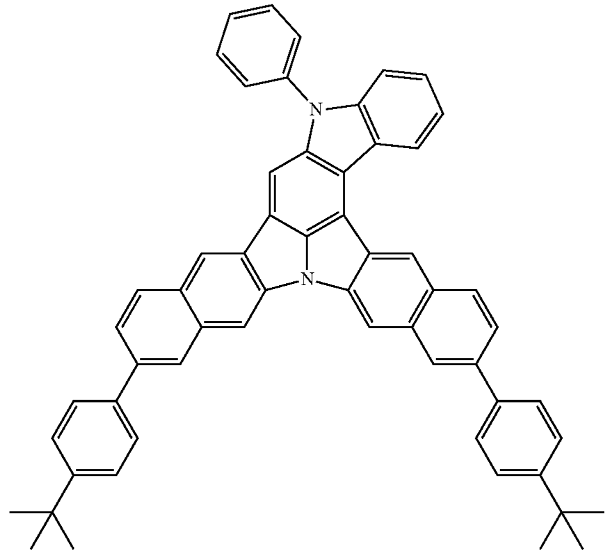
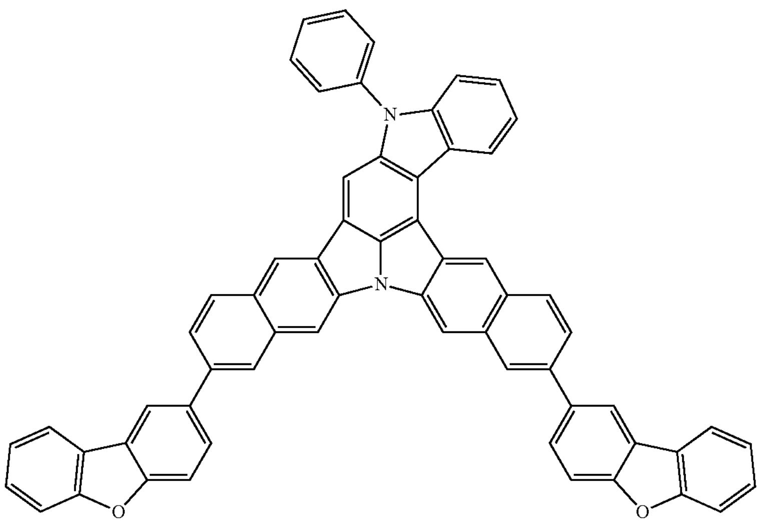
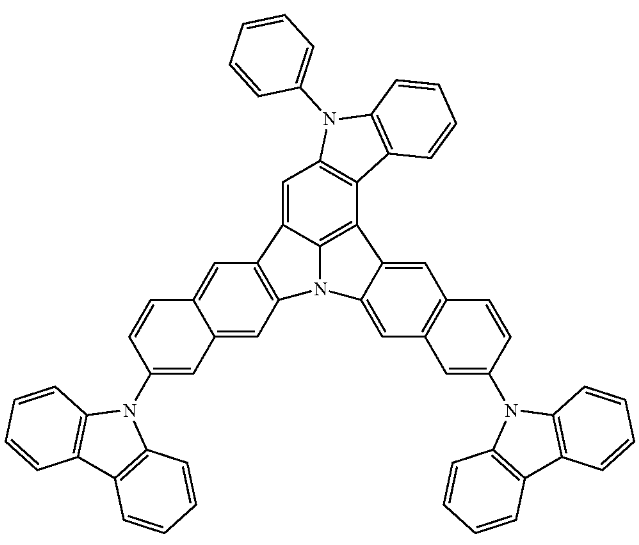

-continued
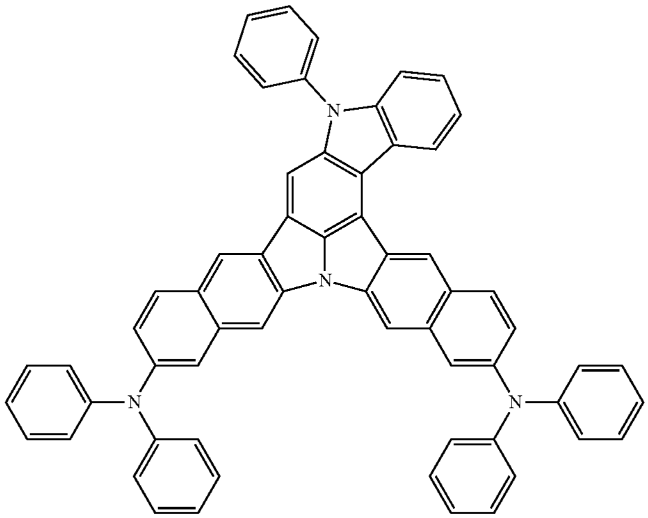
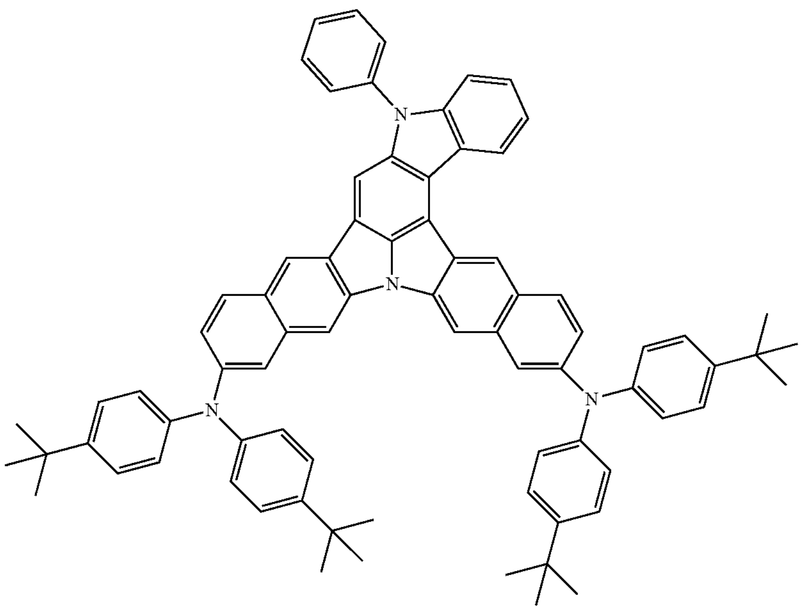
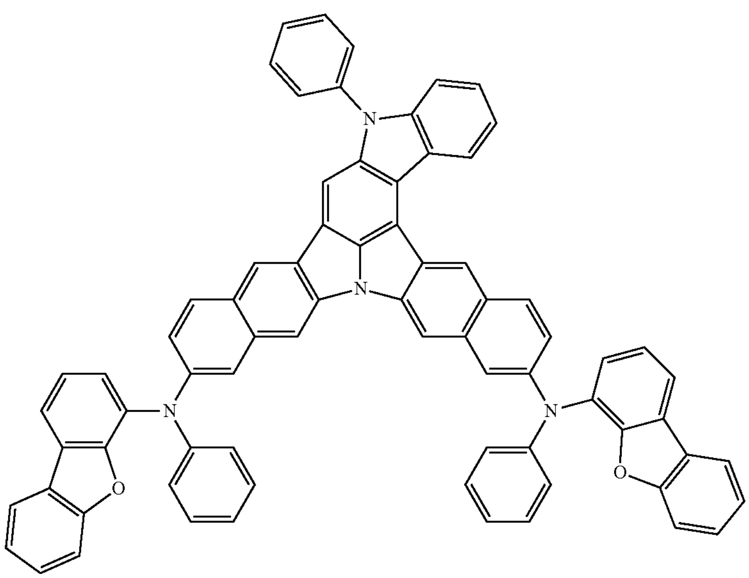

-continued
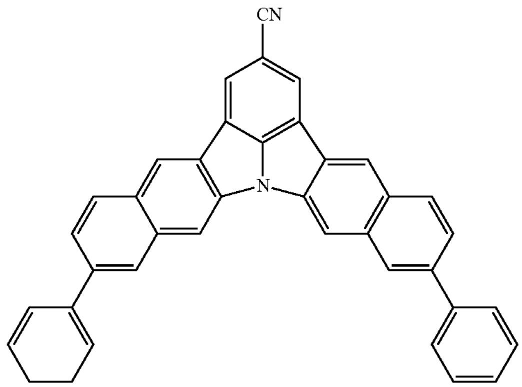
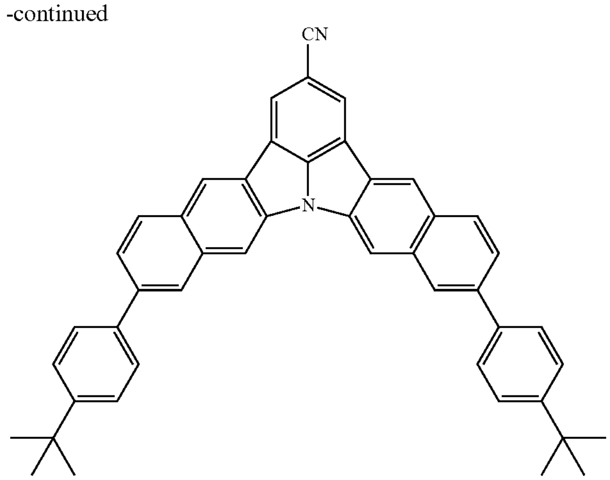
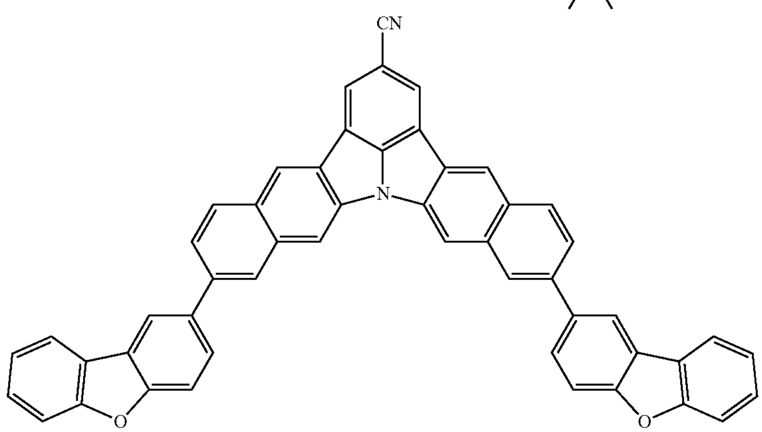
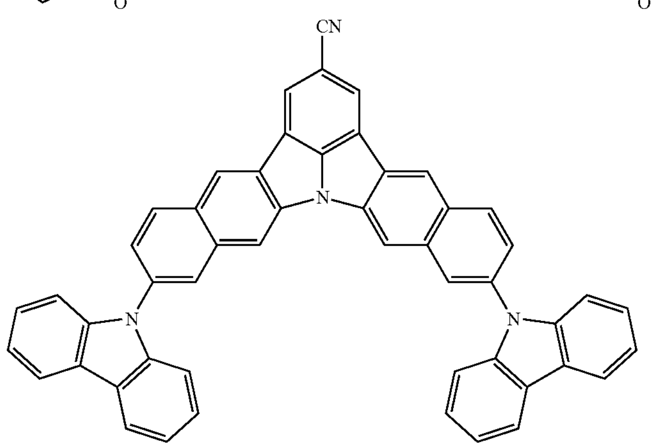
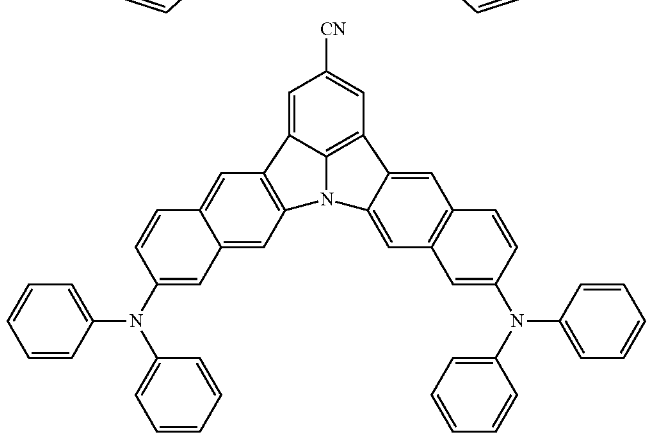

-continued
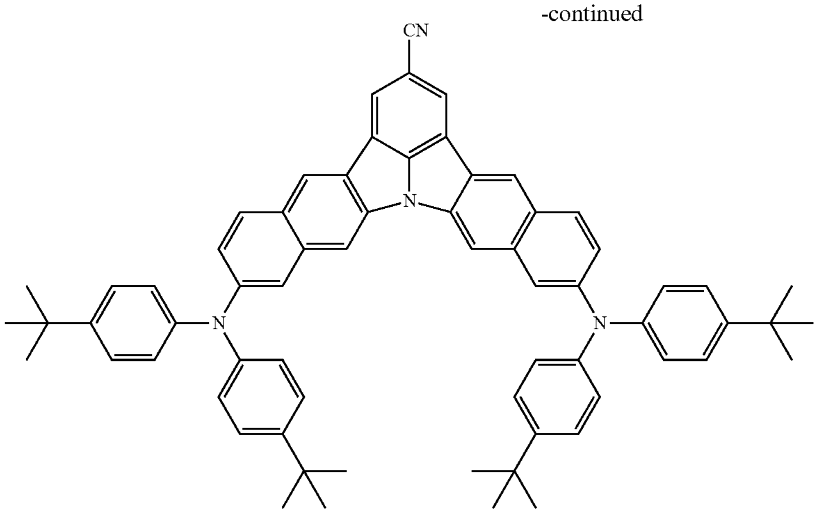
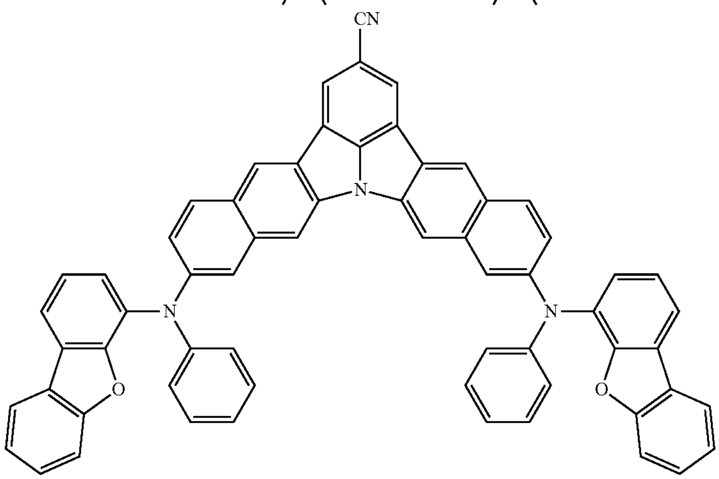
[Formula 161]
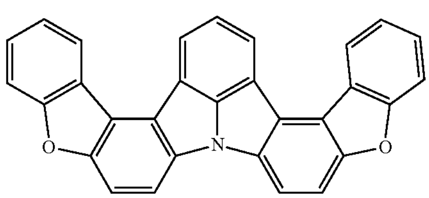
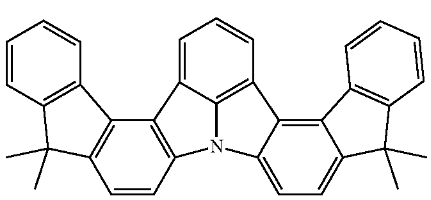
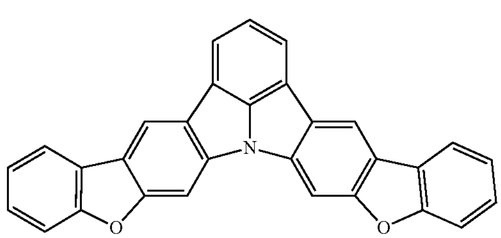
-continued
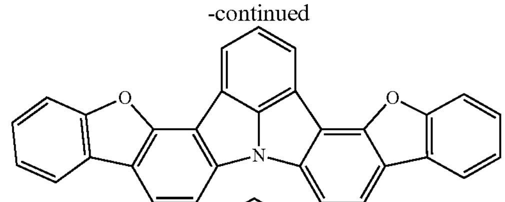
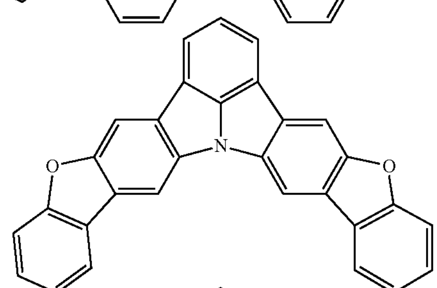
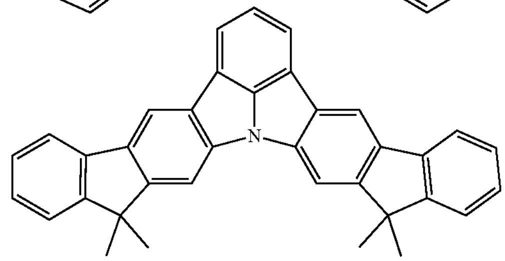

-continued
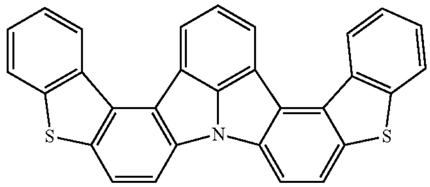
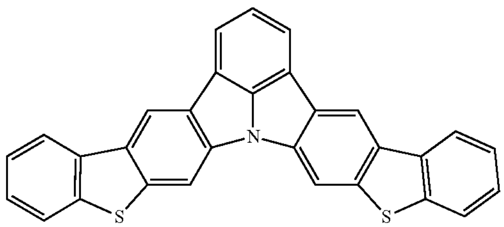
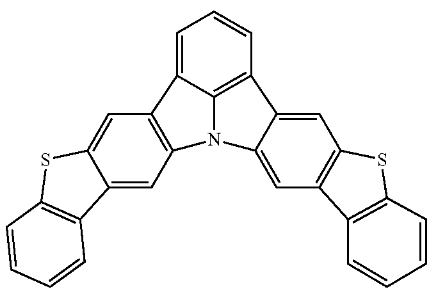
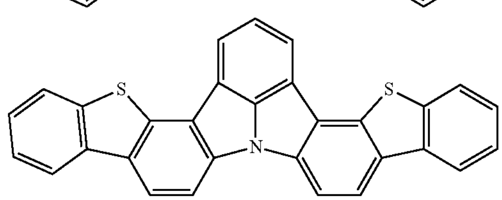
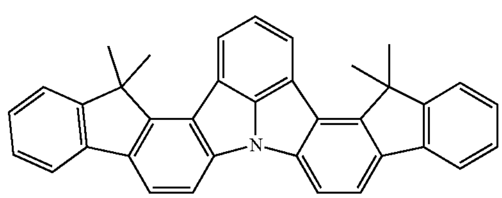
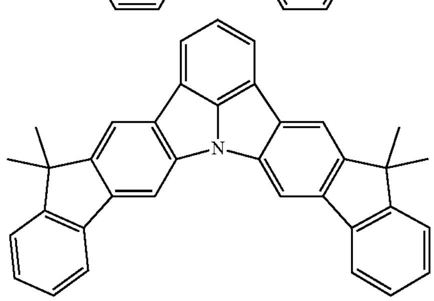
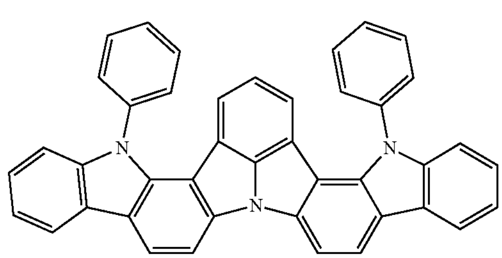
-continued
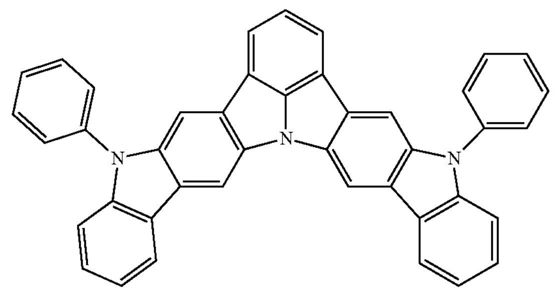
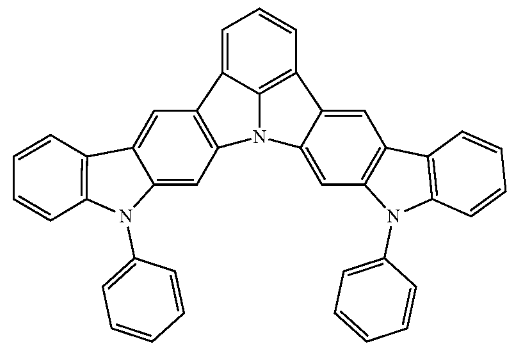
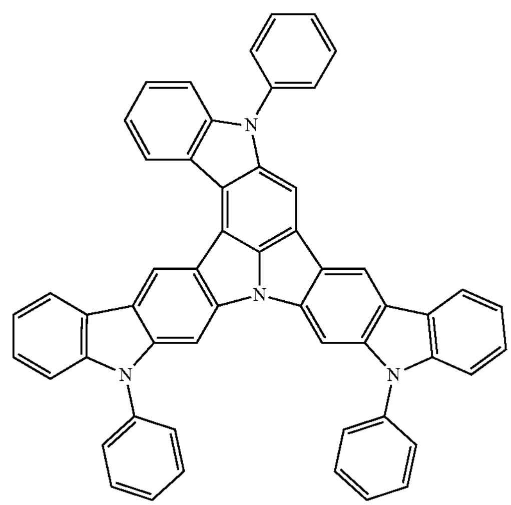
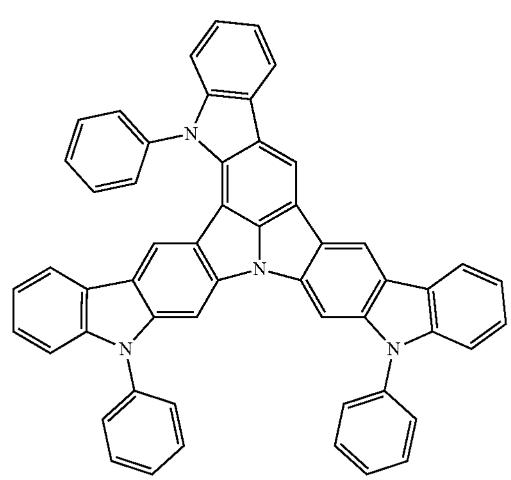

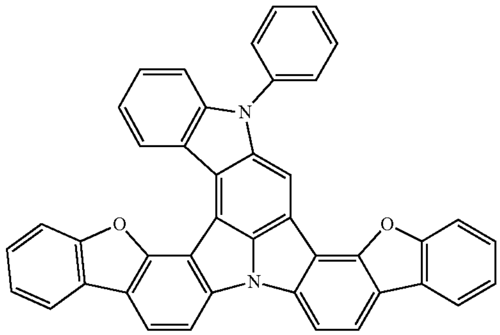
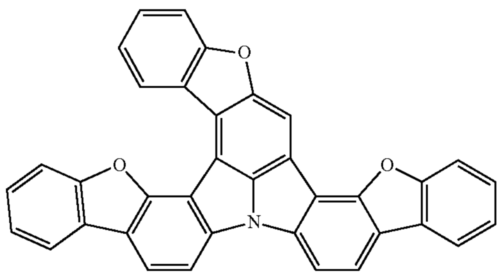
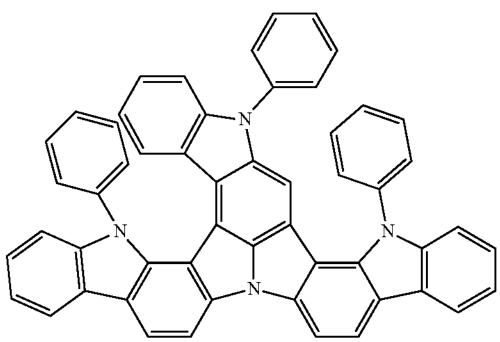
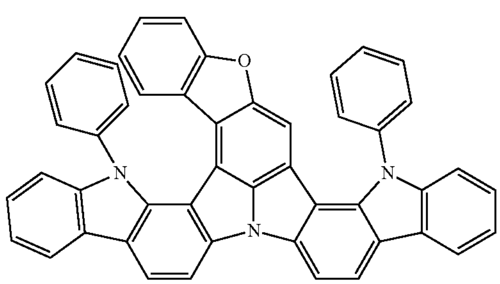
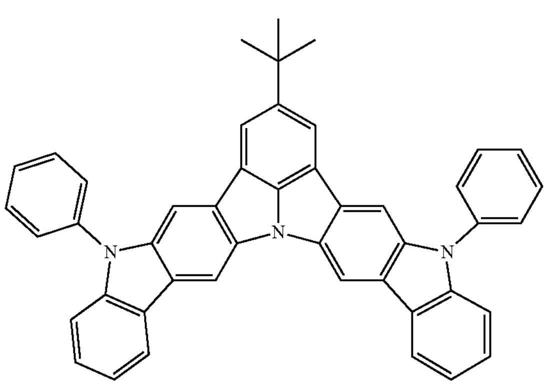
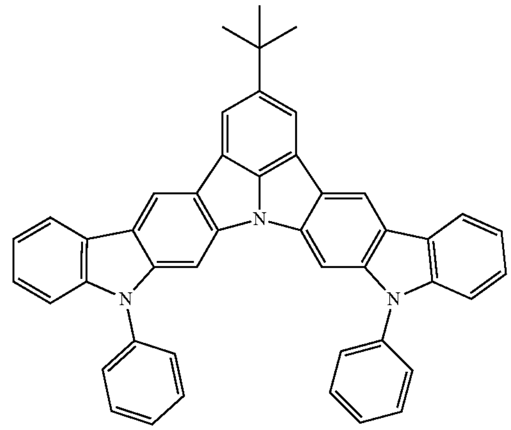
[Formula 162]
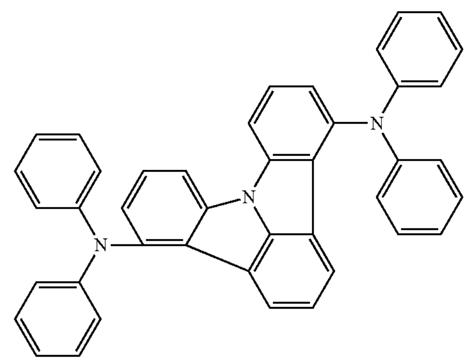
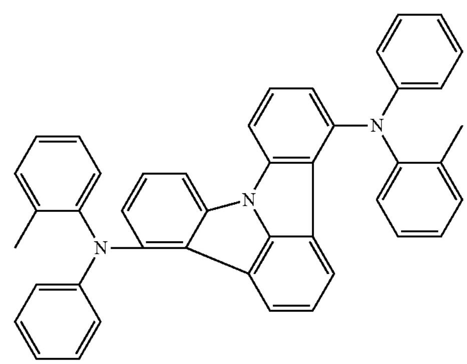
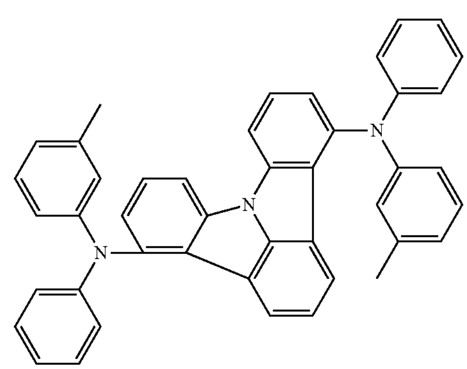

-continued
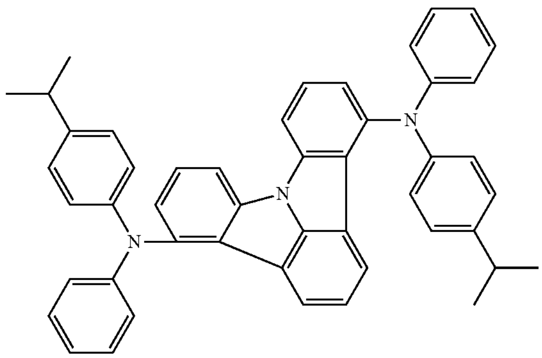
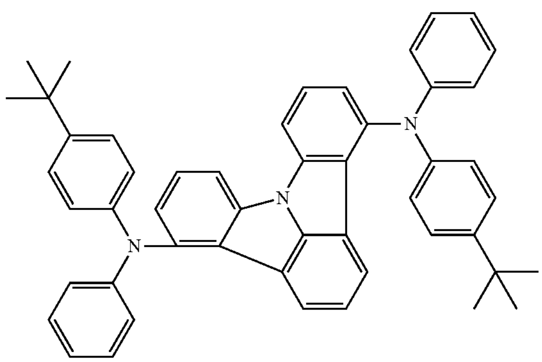
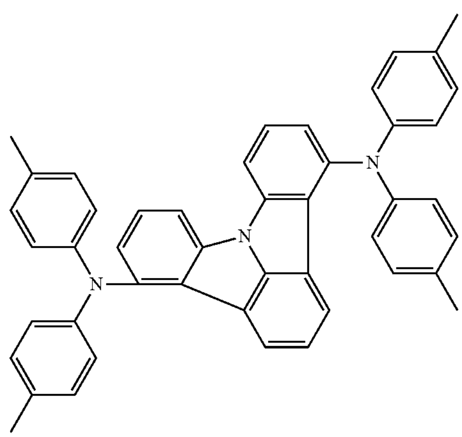
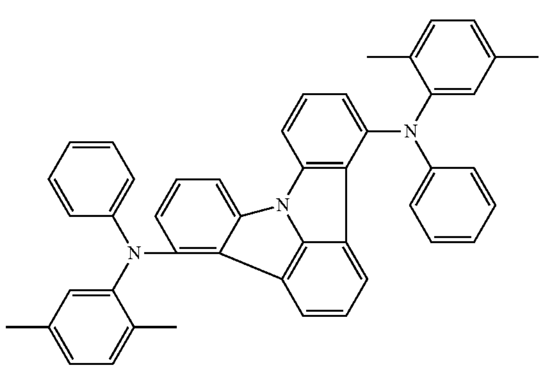
-continued
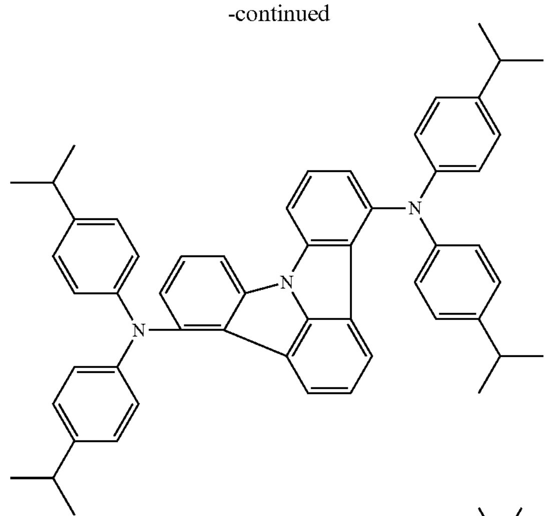
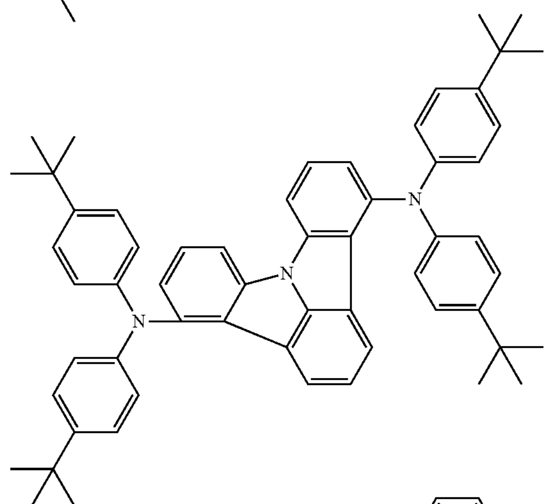
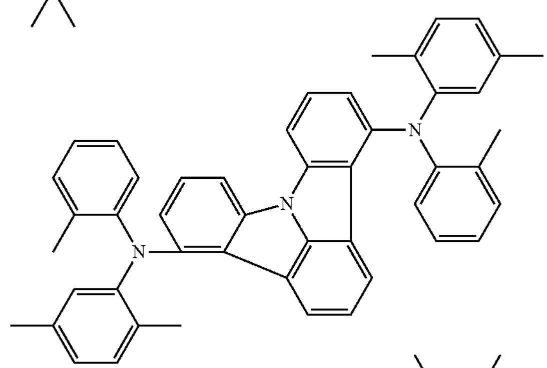
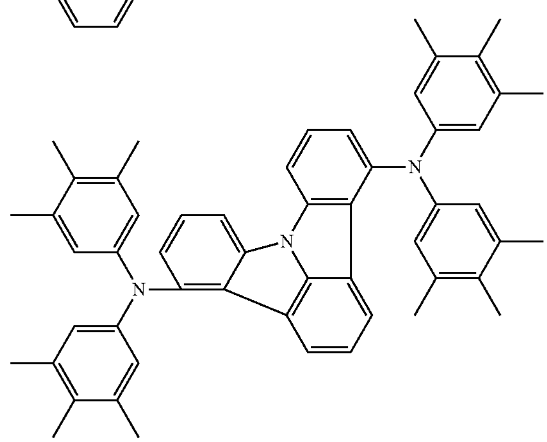

-continued
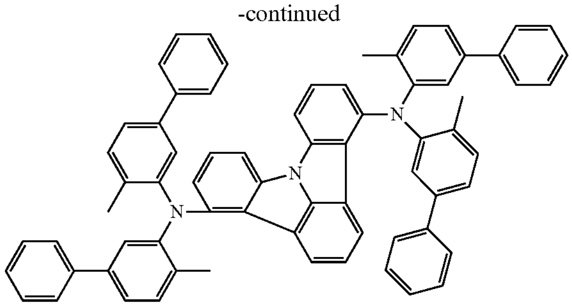
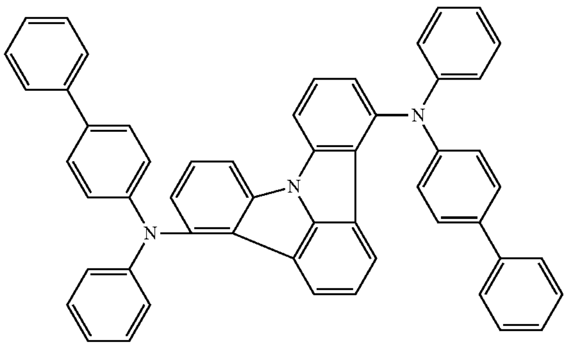
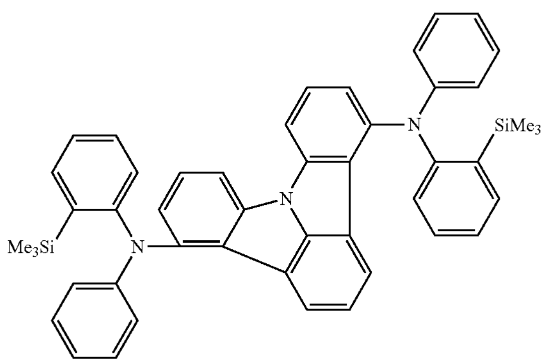
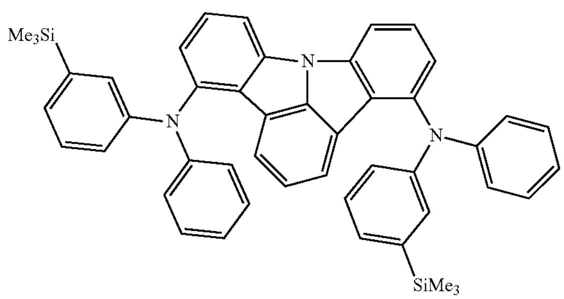
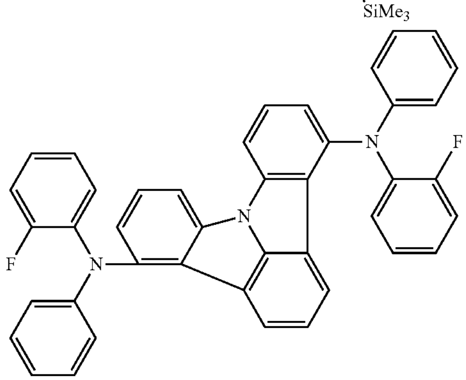
-continued
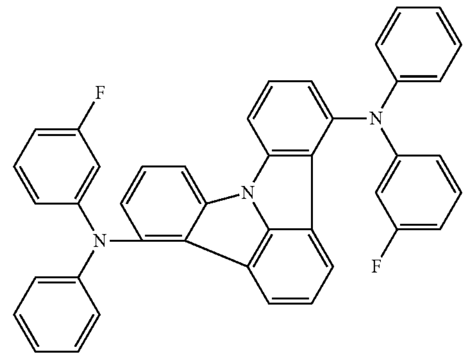
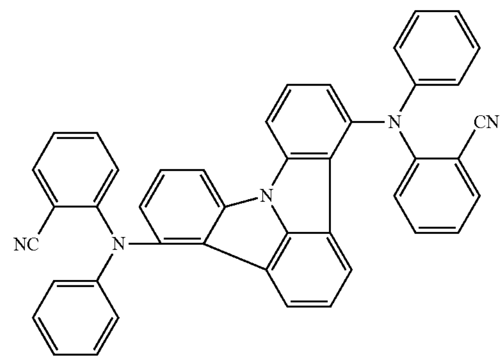
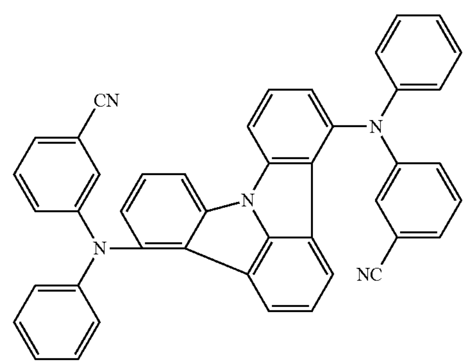
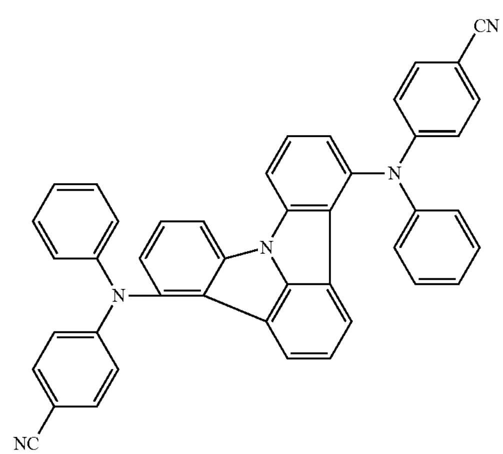

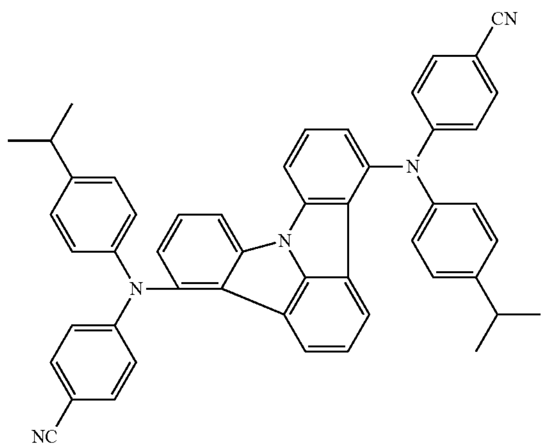 [SMILES: CC(C)c1ccc(N(c2ccc(C#N)cc2)c2cccc3c2c2cccc4c5c(N(c6ccc(C#N)cc6)c6ccc(C(C)C)cc6)cccc5n3c24)cc1]
[Formula 163]
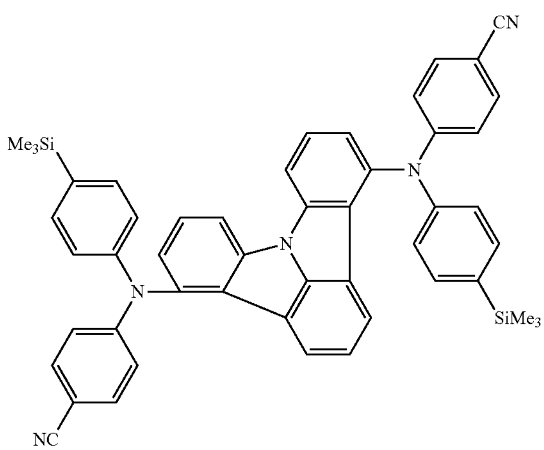
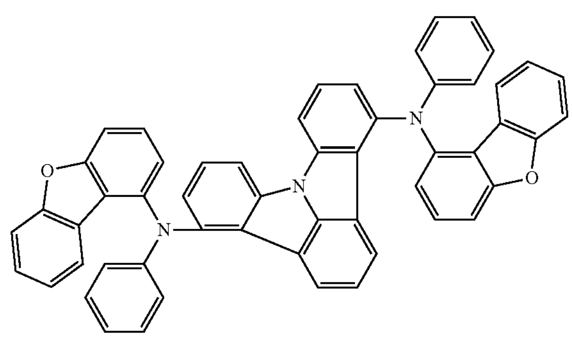
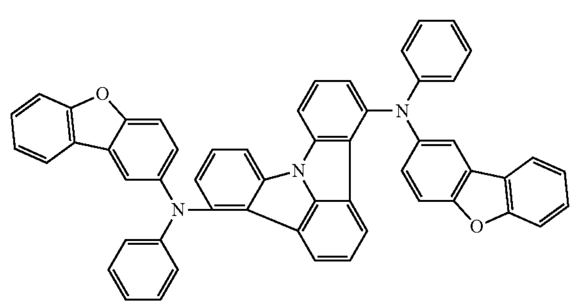
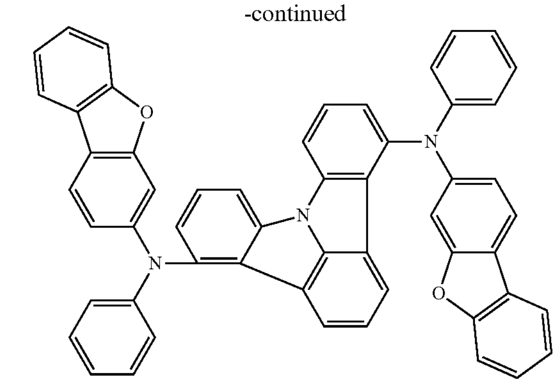
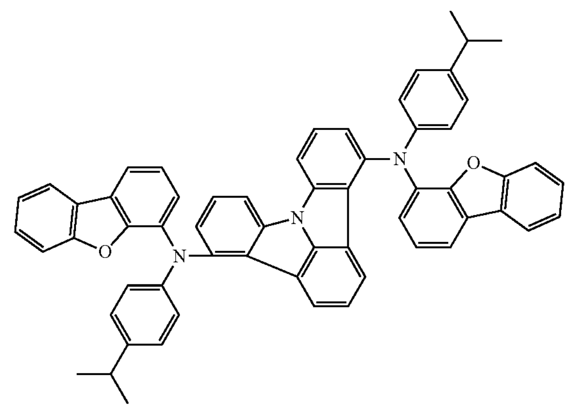
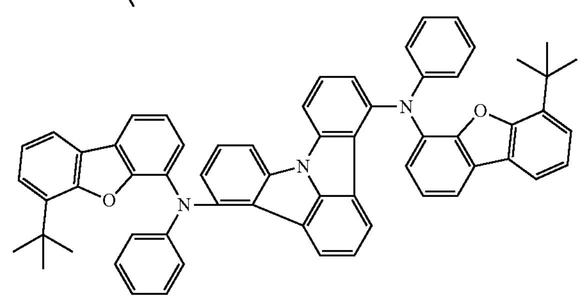
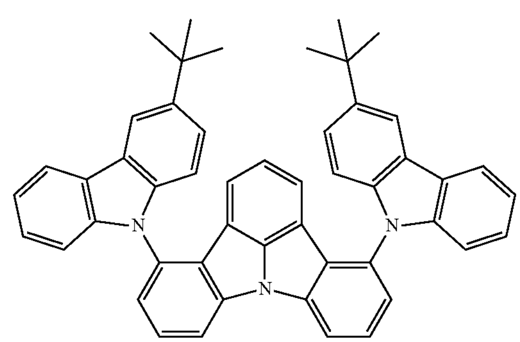
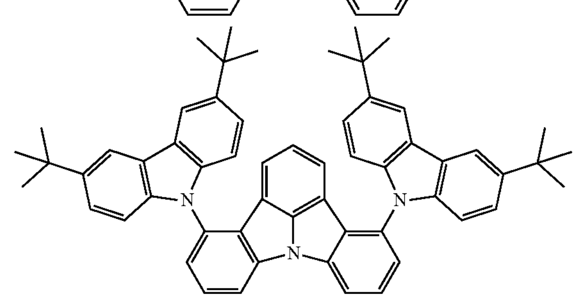

-continued
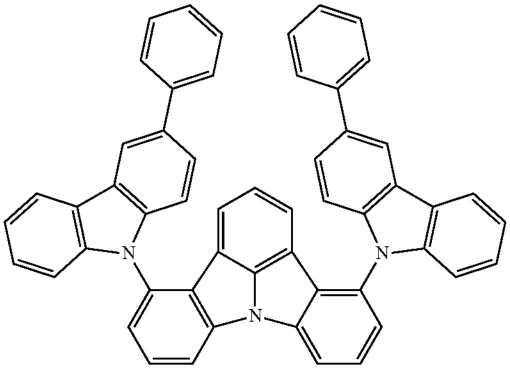
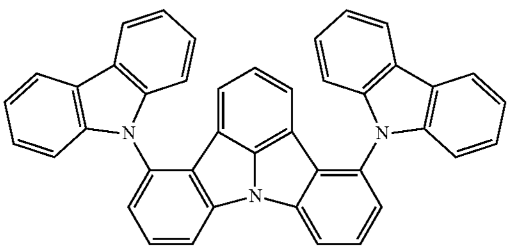
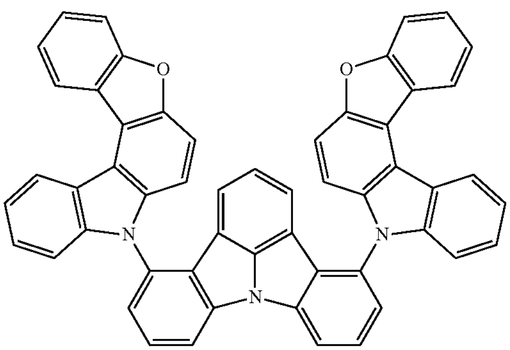
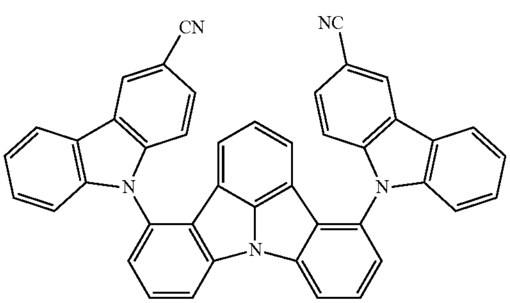
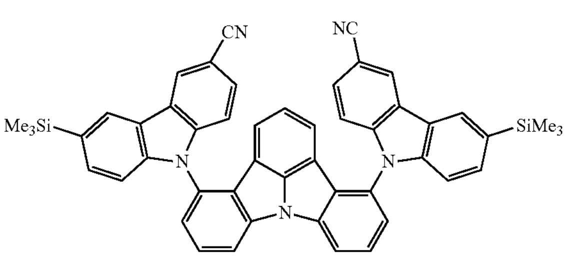
-continued
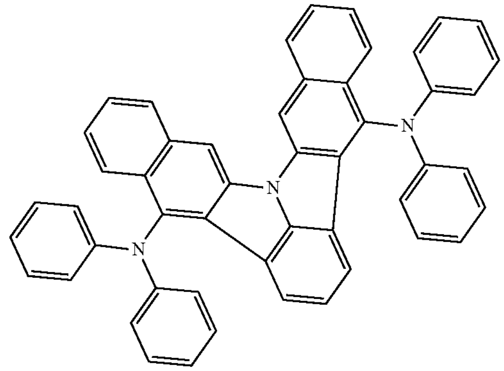
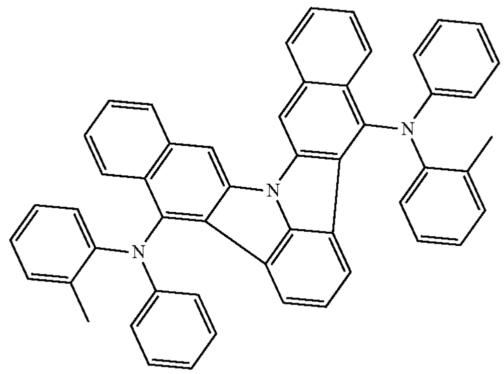
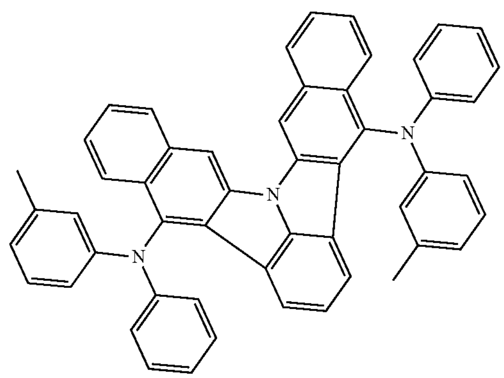
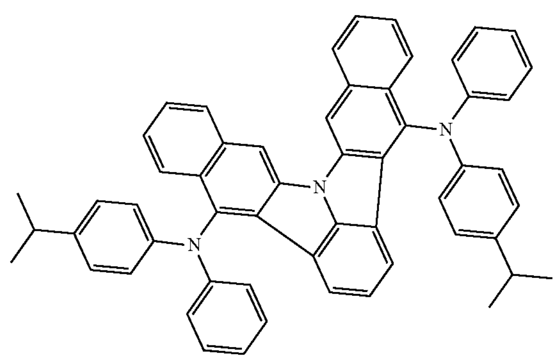

-continued
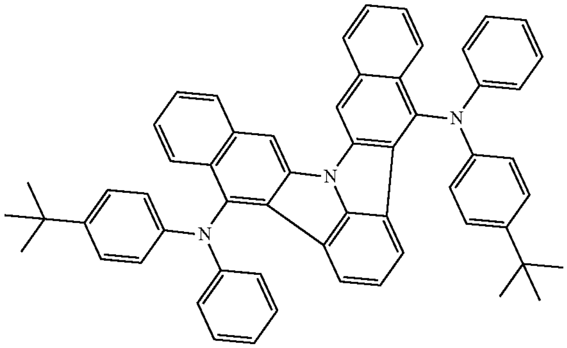
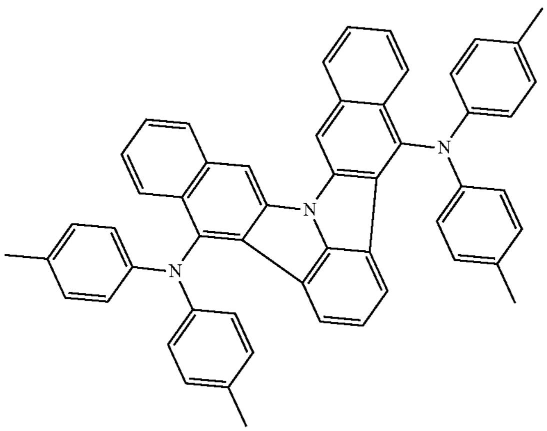
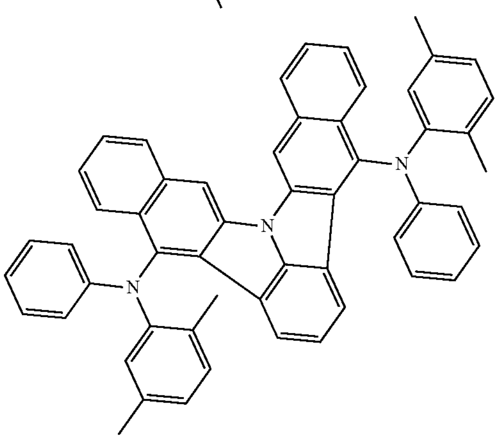
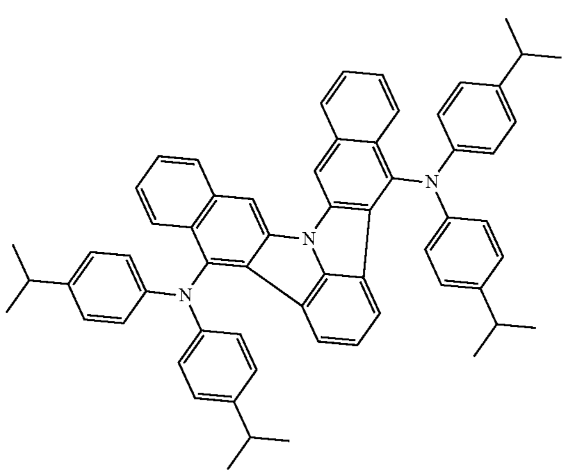
-continued
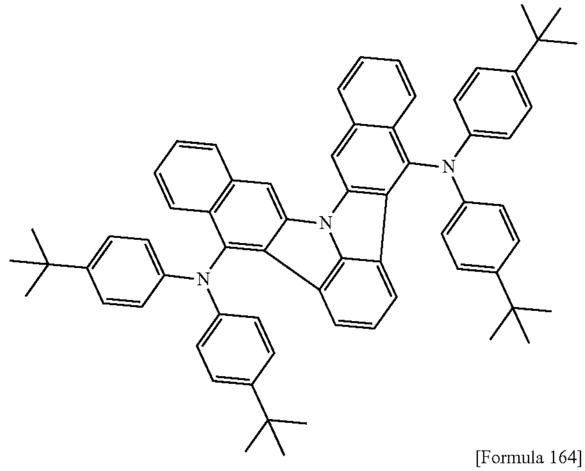
[Formula 164]
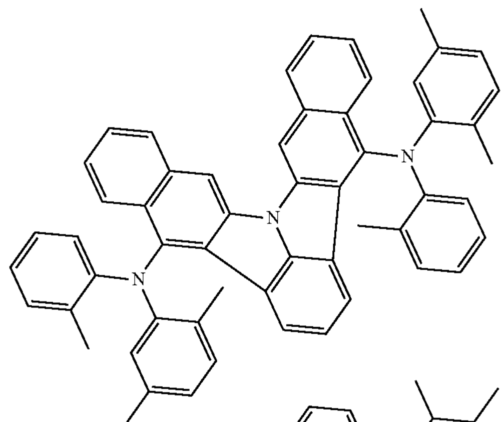
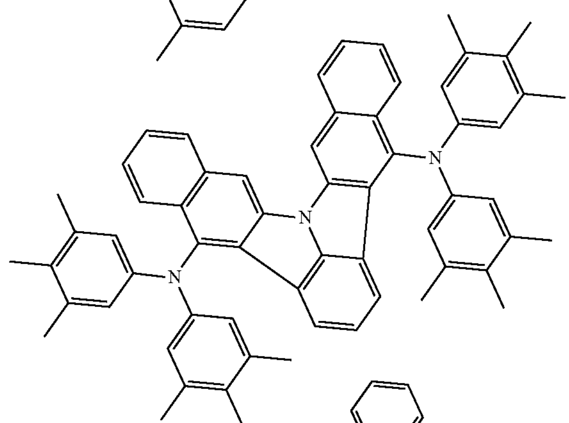
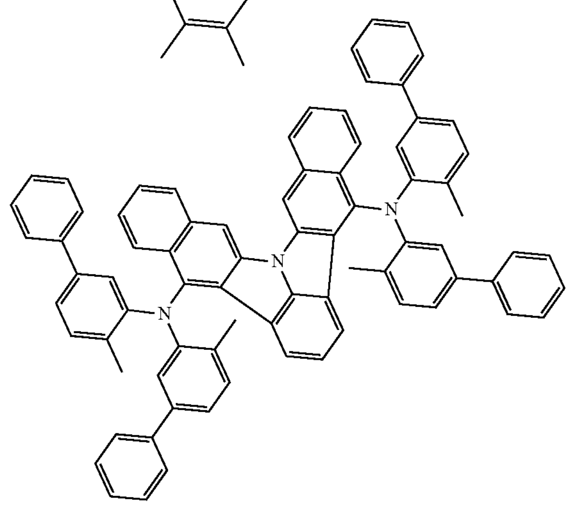

-continued
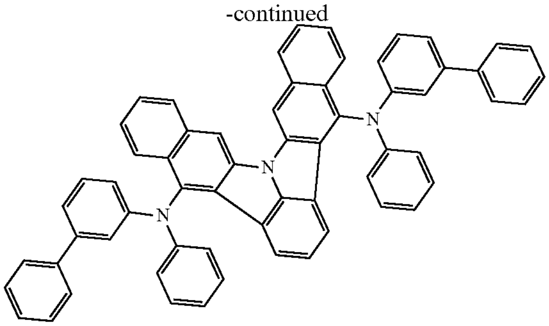
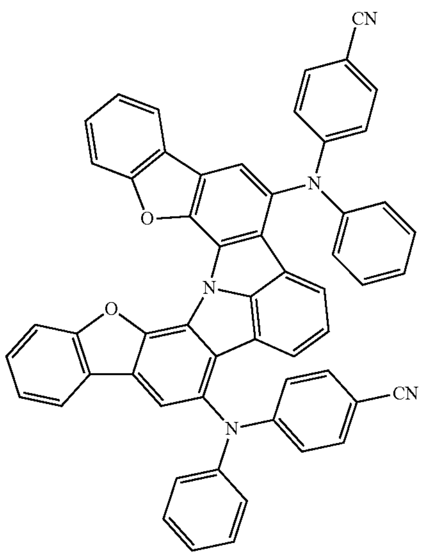
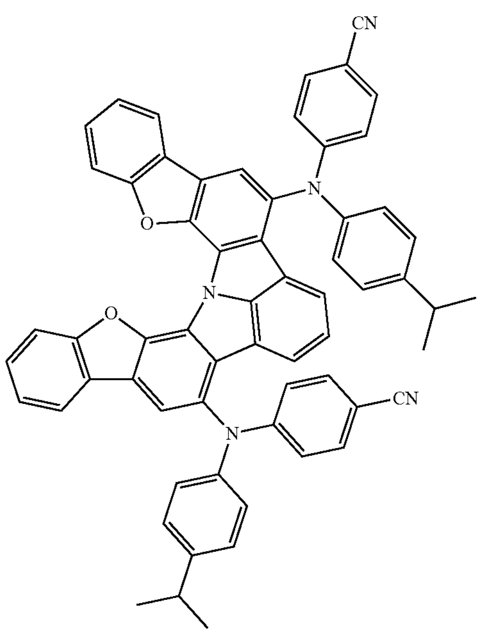
-continued
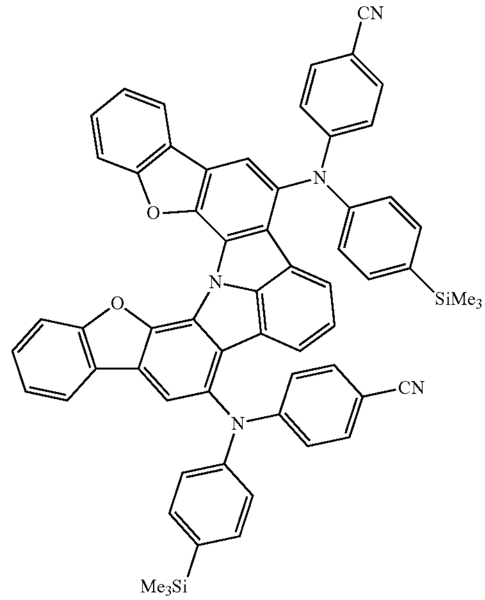
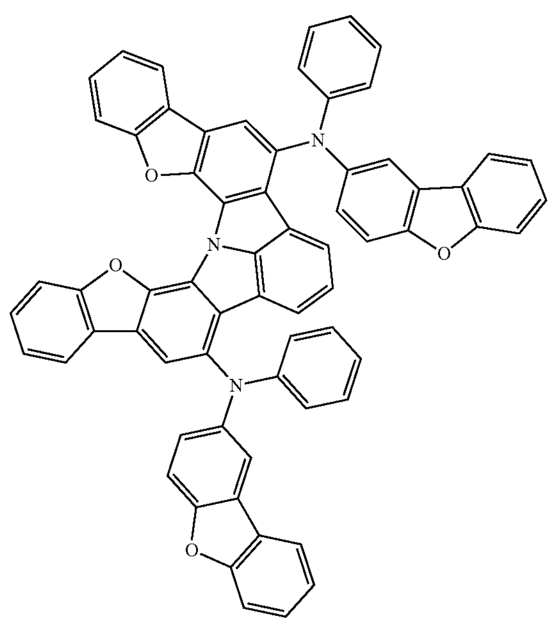

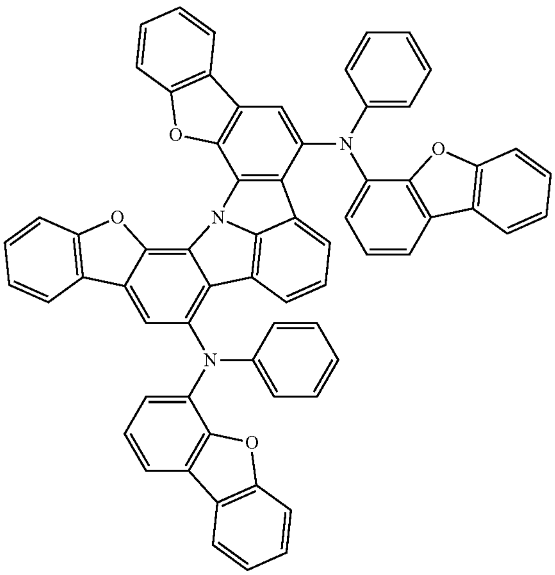
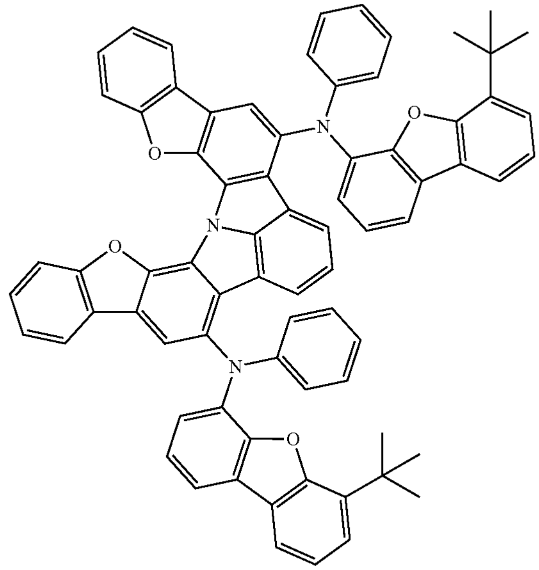
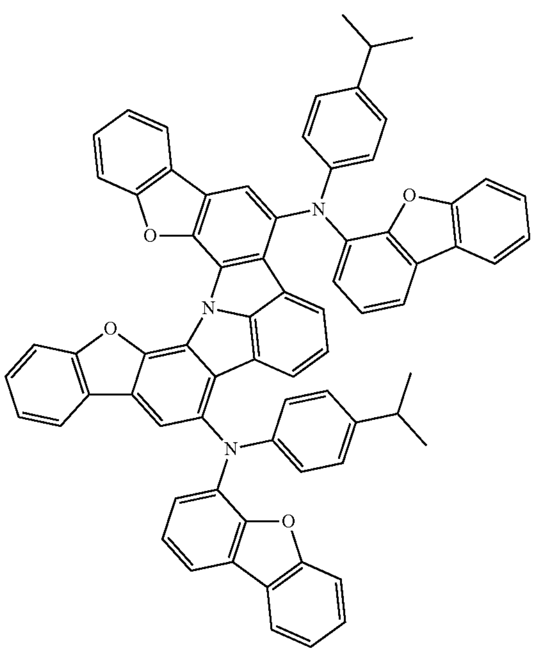
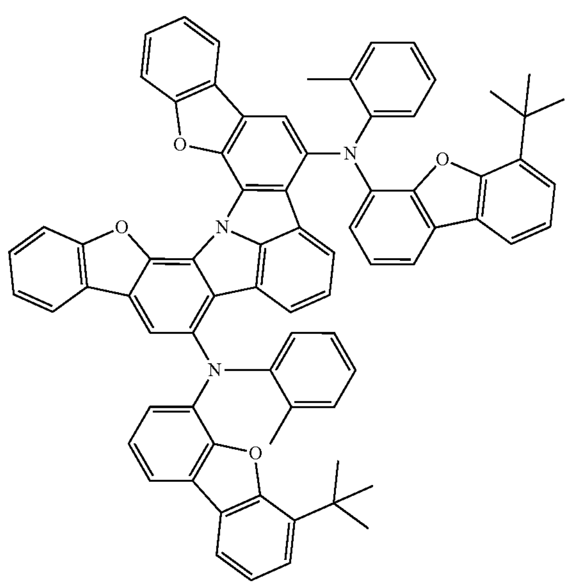
O
N

-continued
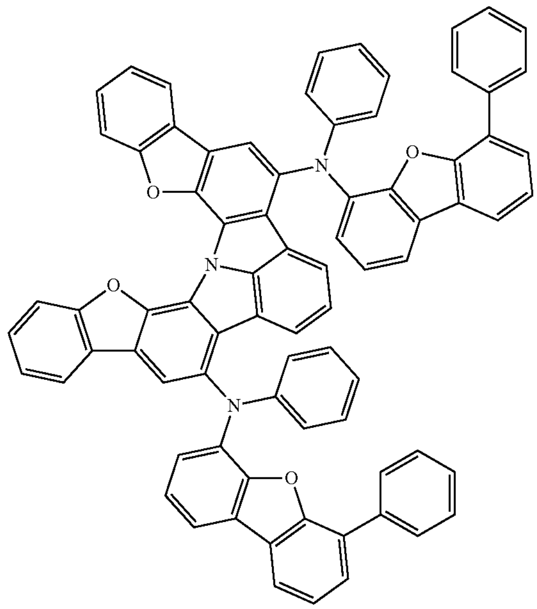
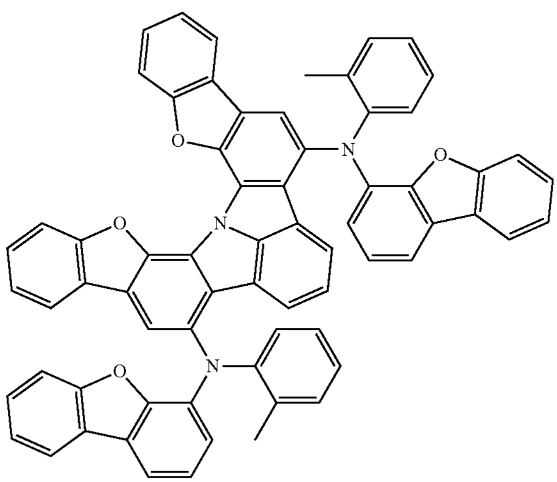 [SMILES: Cc1ccccc1N(c1cccc2c1oc1ccccc12)c1cc2c3ccccc3oc2c2c1c1cccc3c4c(N(c5ccccc5C)c5cccc6c5oc5ccccc56)cc5c6ccccc6oc5c4n2c13]
[Formula 165]
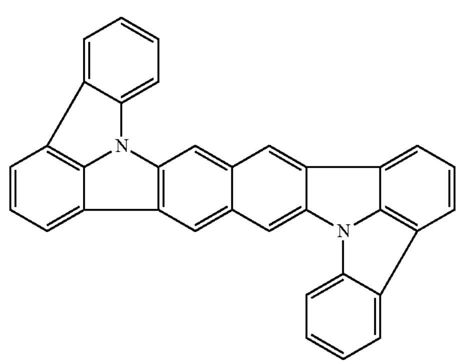
-continued
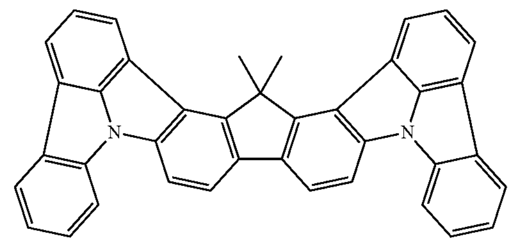
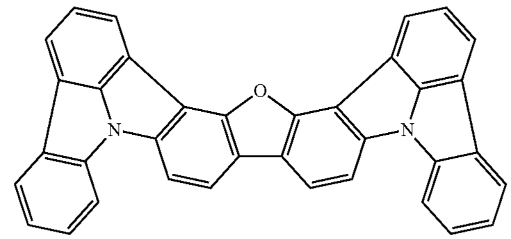
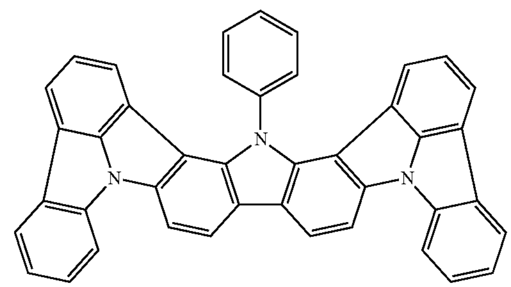
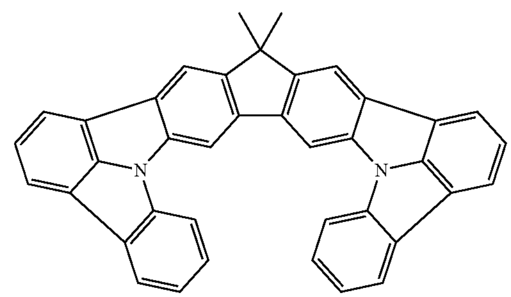
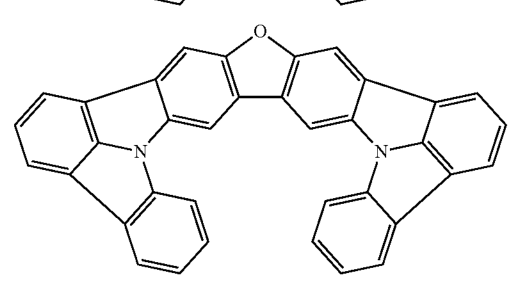
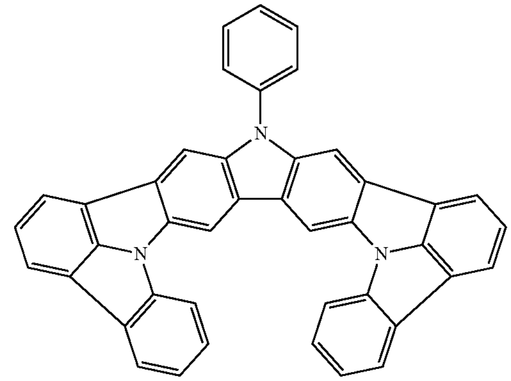

-continued

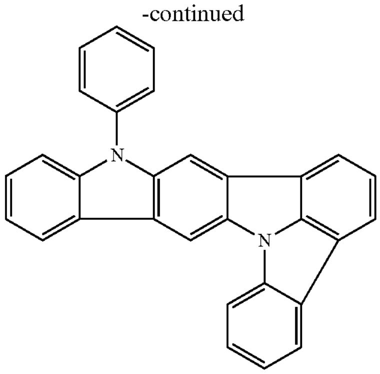

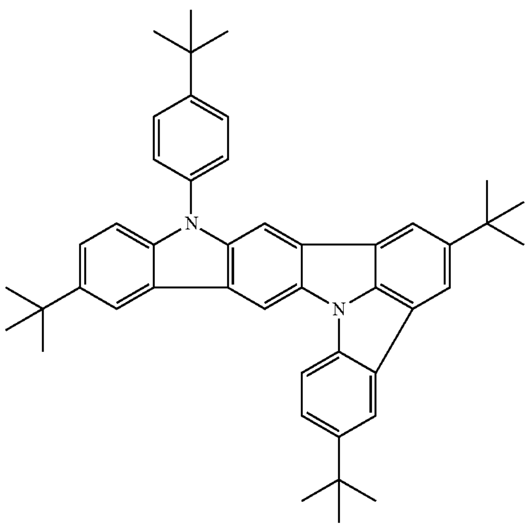

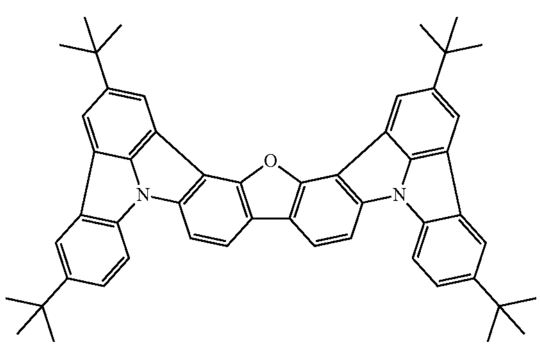 [SMILES: CC(C)(C)c1ccc2c(c1)c1cc(C(C)(C)C)cc3c4c5oc6c(ccc7c6c6cc(C(C)(C)C)cc8c9cc(C(C)(C)C)ccc9n7c86)c5ccc4n2c13]

Compound Represented by Formula (5)

The compound represented by the formula (5) will be described below. The compound represented by the formula (5) corresponds to the compound represented by the above-described formula (41-3).

[Formula 166]

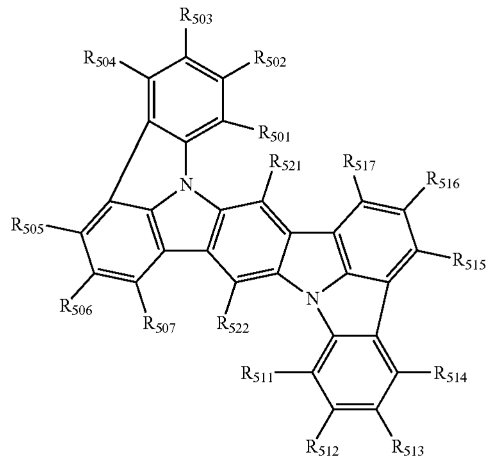

(5)

In the formula (5): at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded;

$R_{501}$ to $R_{507}$ and $R_{511}$ to $R_{517}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{521}$ and $R_{522}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

"A combination of adjacent two or more of $R_{501}$ to $R_{507}$ and $R_{511}$ to $R_{517}$" refers to, for instance, a pair of $R_{501}$ and $R_{502}$, a pair of $R_{502}$ and $R_{503}$, a pair of $R_{503}$ and $R_{504}$, a pair of $R_{505}$ and $R_{506}$, a pair of $R_{506}$ and $R_{507}$, and a combination of $R_{501}$, $R_{502}$, and $R_{503}$.

In an exemplary embodiment, at least one, preferably two of $R_{501}$ to $R_{507}$ and $R_{511}$ to $R_{517}$ are groups represented by —N($R_{906}$)($R_{907}$).

In an exemplary embodiment, $R_{501}$ to $R_{507}$ and $R_{511}$ to $R_{517}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (52) below.

[Formula 167]

(52)

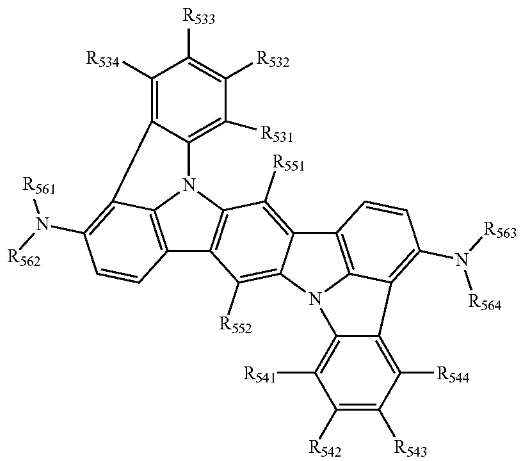

In the formula (52): at least one combination of adjacent two or more of $R_{531}$ to $R_{534}$ and $R_{541}$ to $R_{544}$ are mutually bonded to form a substituted or unsubstituted monocyclic ring, mutually bonded to form a substituted or unsubstituted fused ring, or not mutually bonded;

$R_{531}$ to $R_{534}$, $R_{541}$ to $R_{544}$, and $R_{551}$ to 8552 not forming the monocyclic ring and not forming the fused ring are each independently a hydrogen atom, a substituted or unsubstituted aryl group having 6 to 50 ring carbon atoms, or a substituted or unsubstituted heterocyclic group having 5 to 50 ring atoms; and $R_{561}$ to $R_{564}$ are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (53) below.

[Formula 168]

(53)

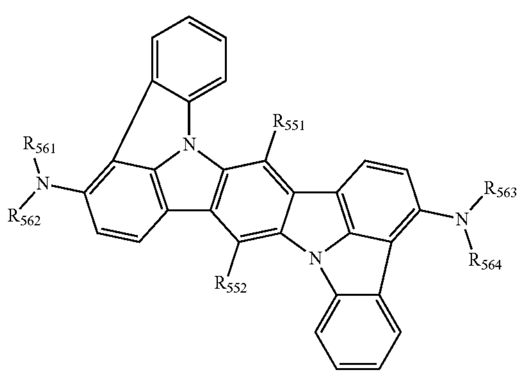

In the formula (53), $R_{551}$, $R_{552}$ and $R_{561}$ to $R_{564}$ each independently represent the same as $R_{551}$, $R_{552}$ and $R_{561}$ to $R_{564}$ in the formula (52).

In an exemplary embodiment, $R_{561}$ to $R_{564}$ in the formulae (52) and (53) are each independently a substituted or unsubstituted aryl group having 6 to 50 ring carbon atoms (preferably a phenyl group).

In an exemplary embodiment, $R_{521}$ and $R_{522}$ in the formula (5), and $R_{551}$ and $R_{552}$ in the formulae (52) and (53) are each a hydrogen atom.

In an exemplary embodiment, a substituent for the substituted or unsubstituted group in the formulae (5), (52) and (53) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

Specific Examples of Compound Represented by Formula (5)

Specific examples of the compound represented by the formula (5) include compounds shown below.

[Formula 169]

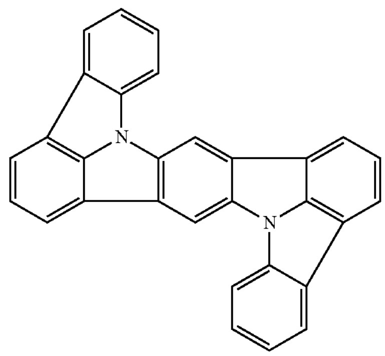

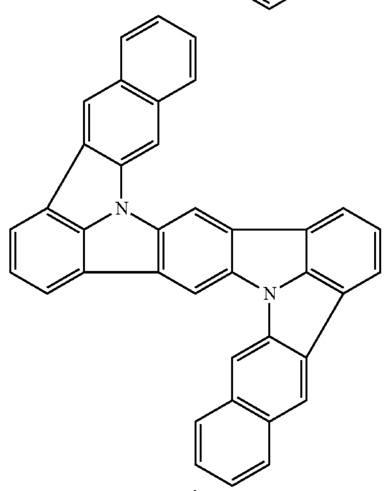

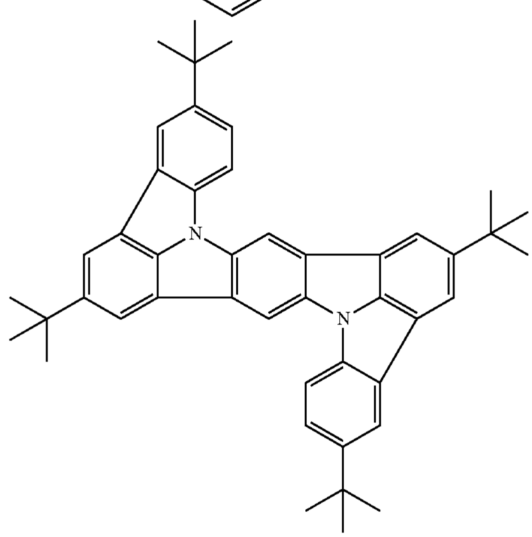

-continued
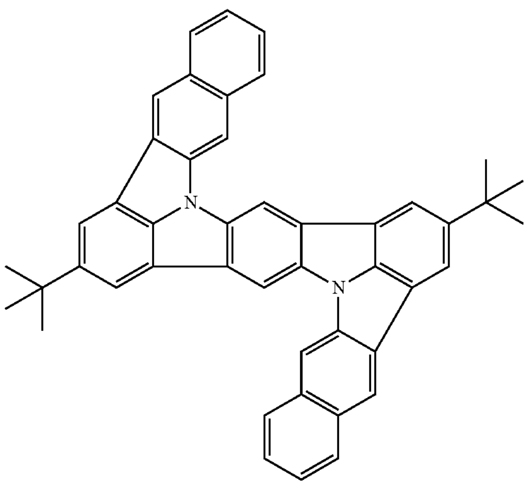
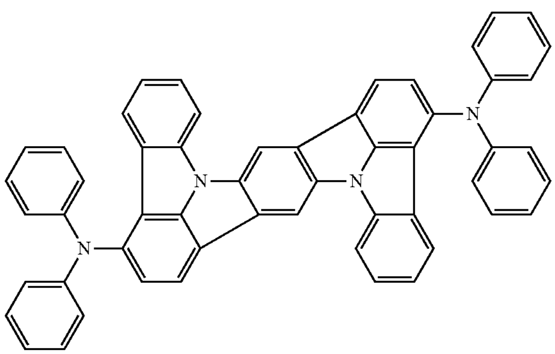
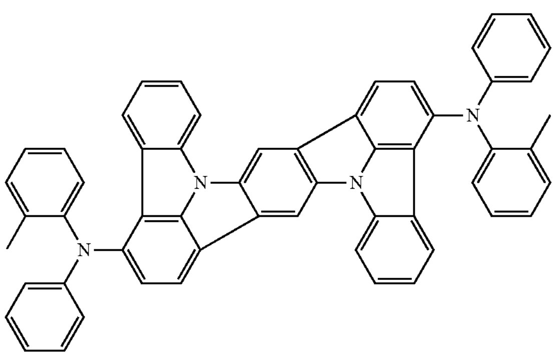
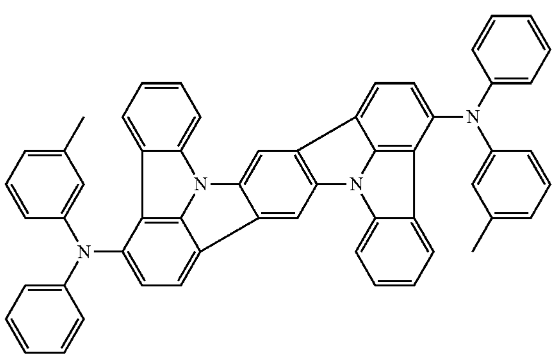
-continued
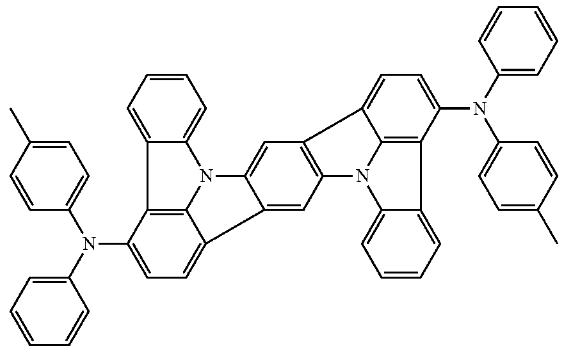
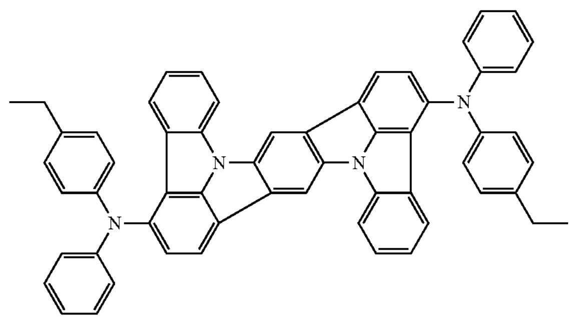
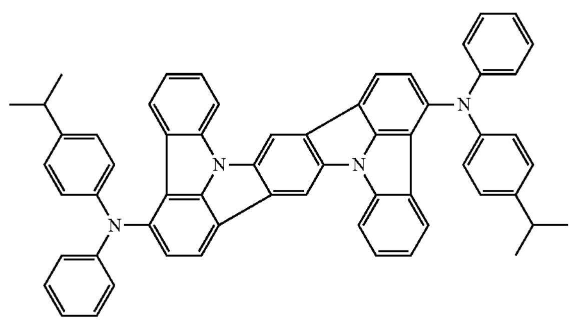
[Formula 170]
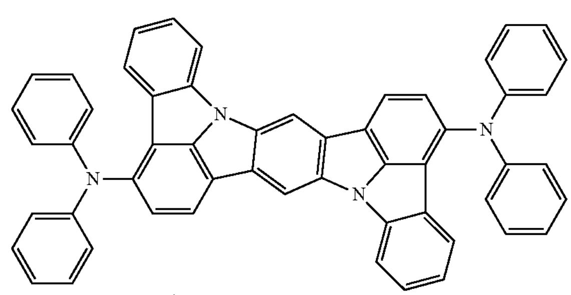
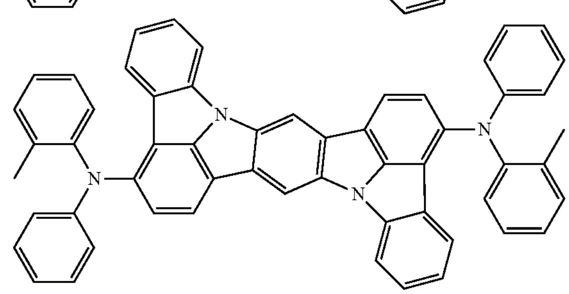

-continued
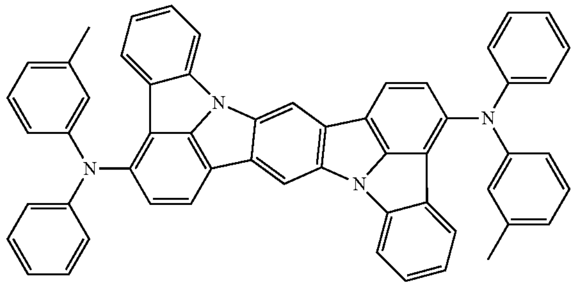
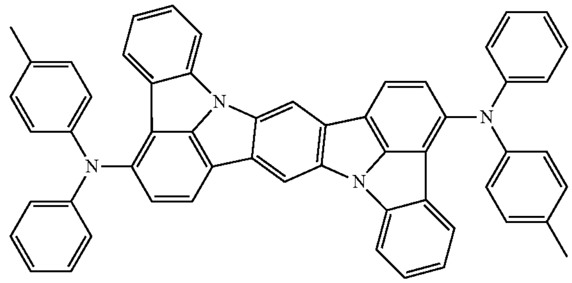
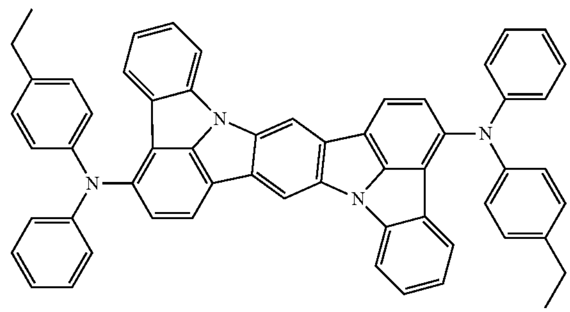
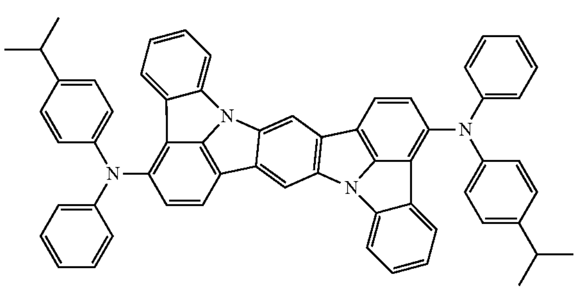
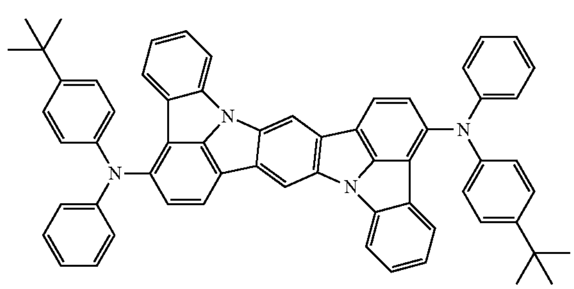
-continued
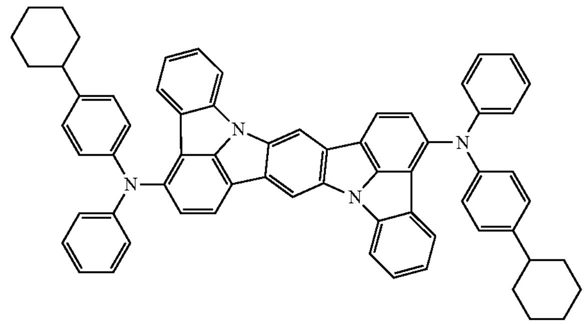
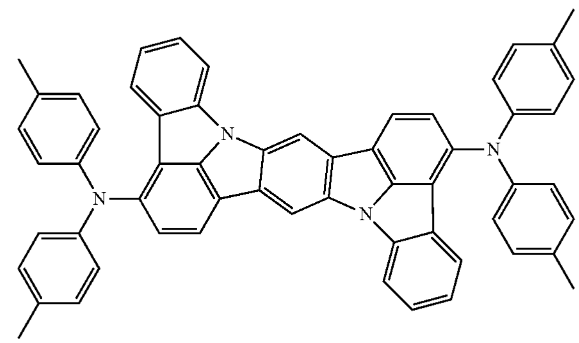
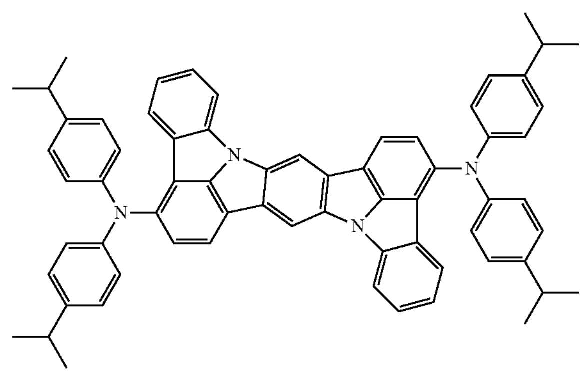
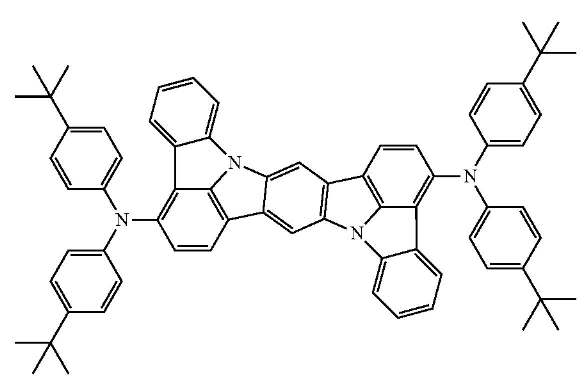

-continued
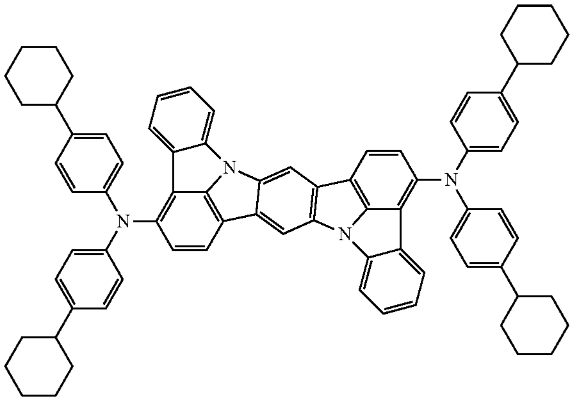
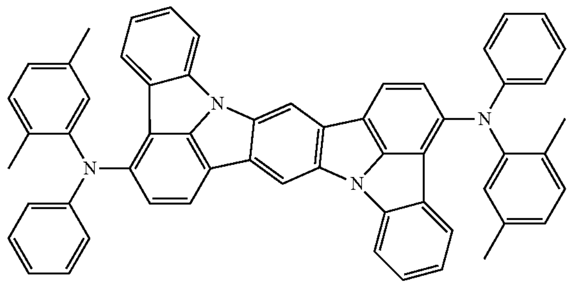
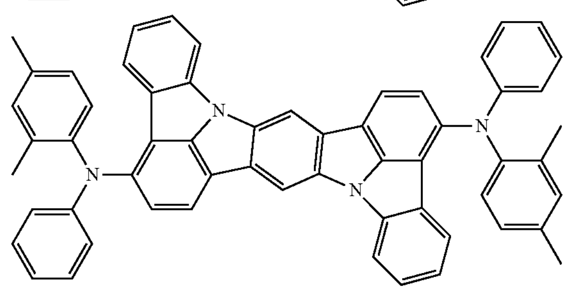
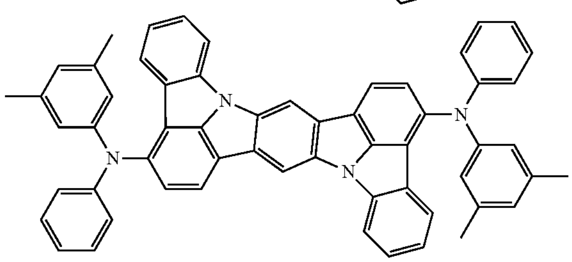
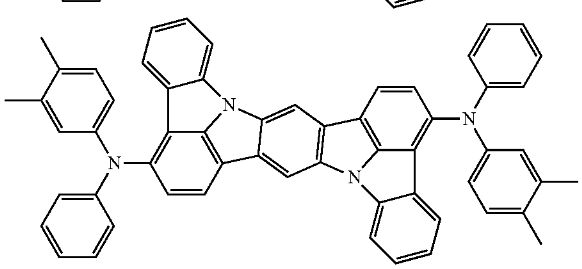
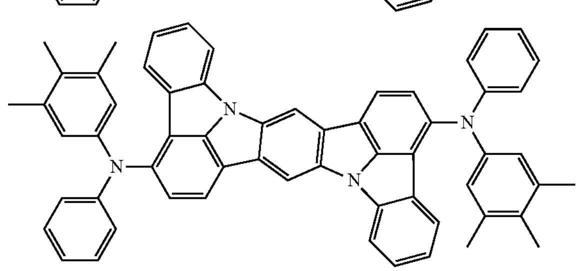
-continued
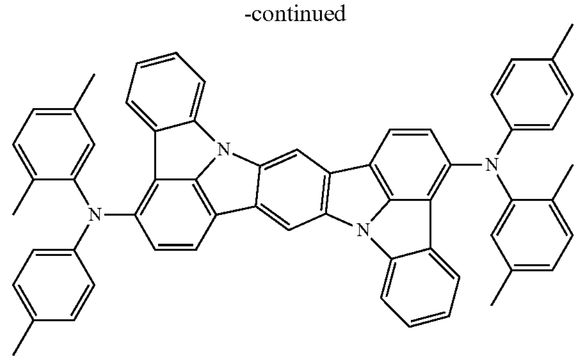
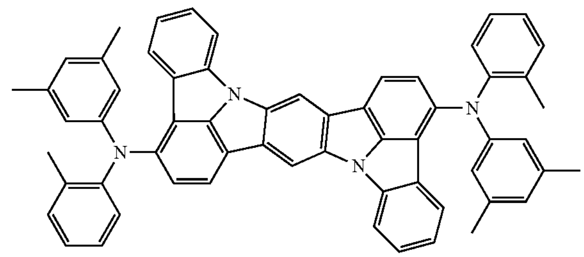
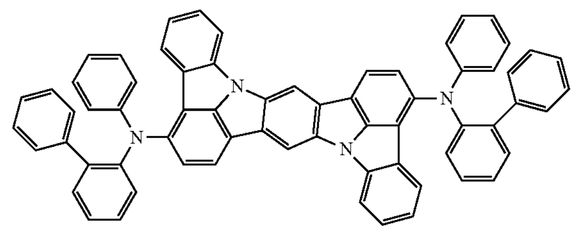
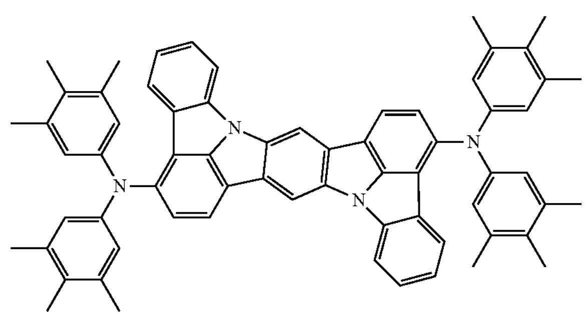
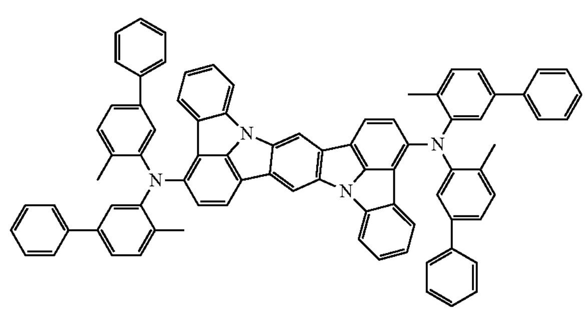

-continued
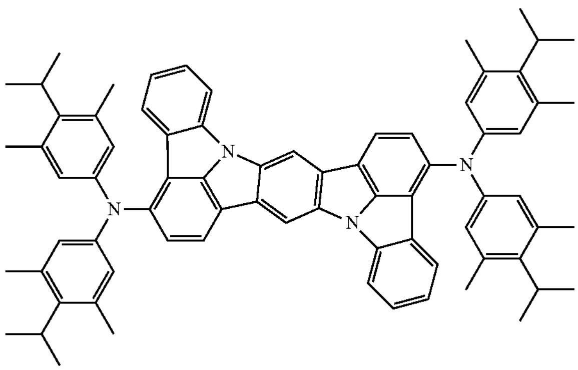
-continued
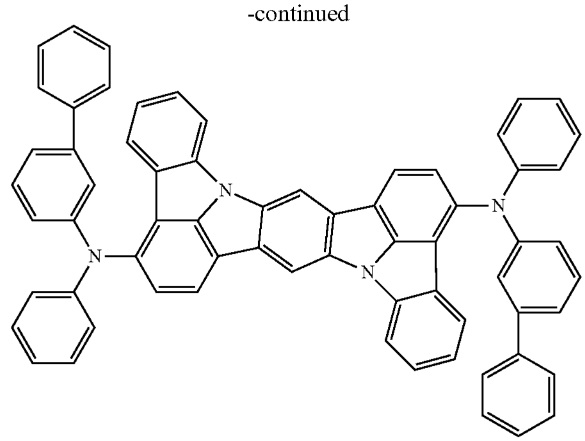
[Formula 171]
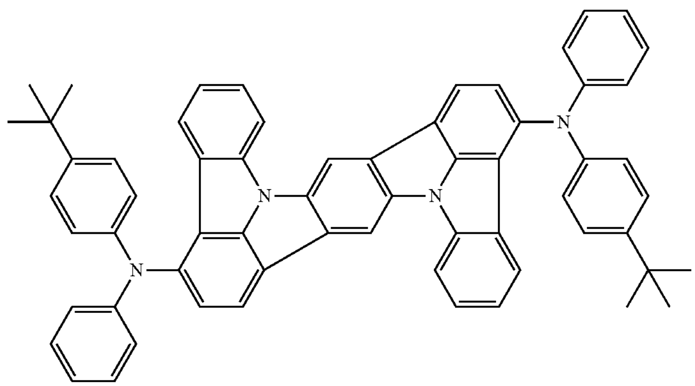
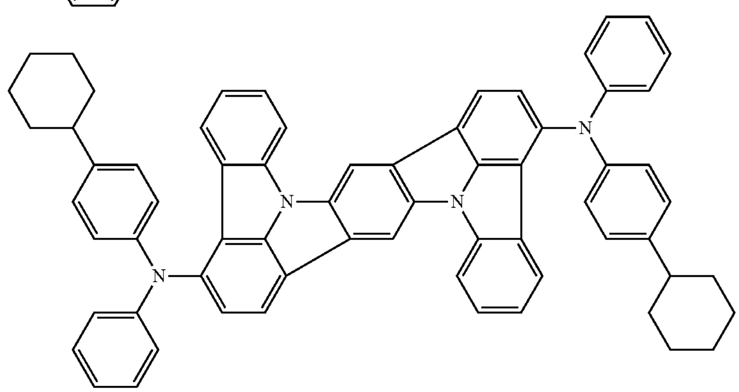
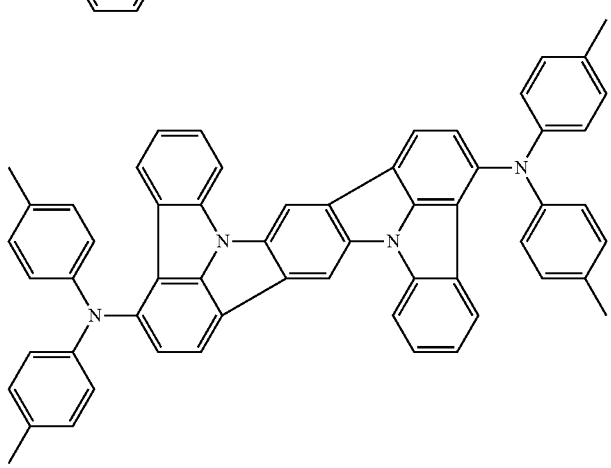

-continued
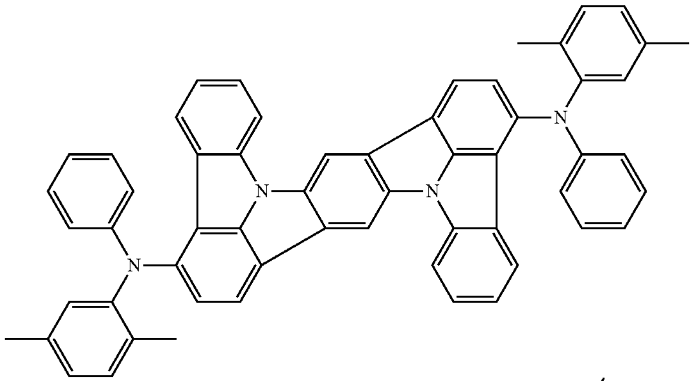
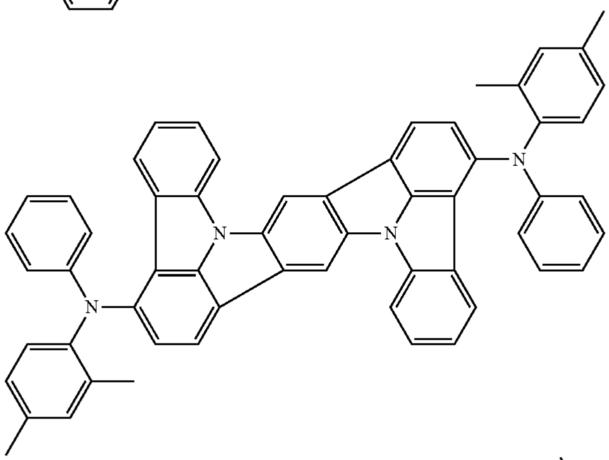
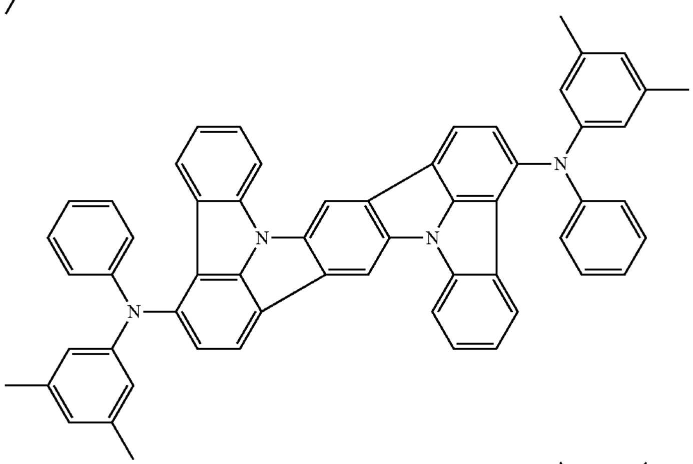
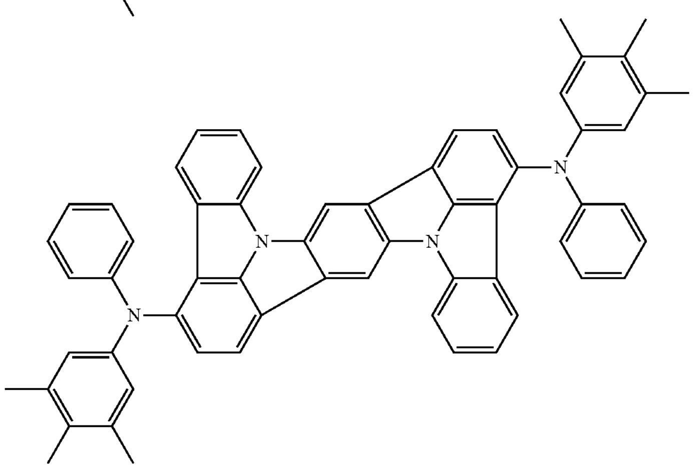

-continued
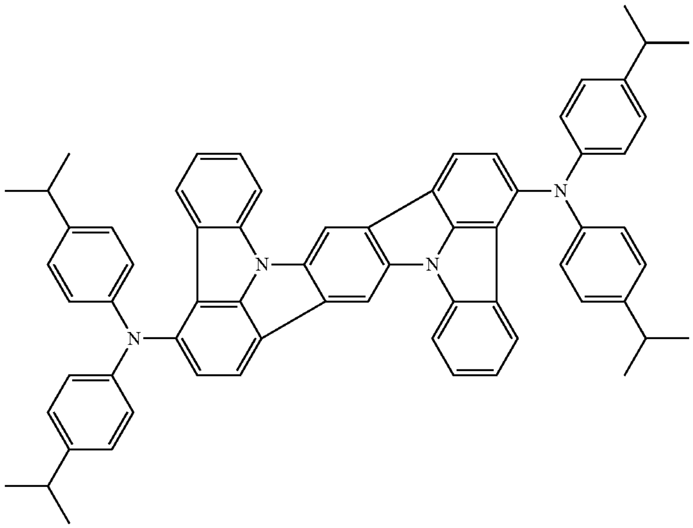
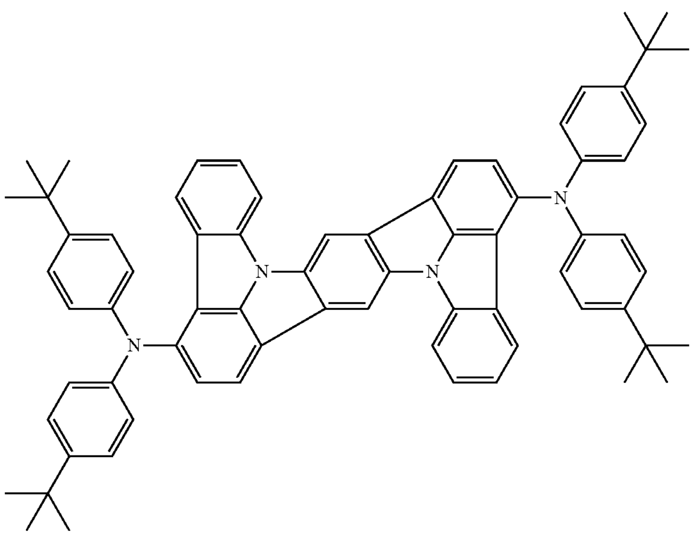
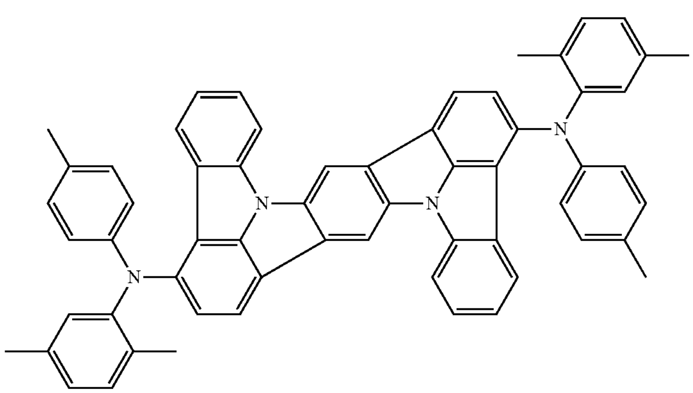

-continued
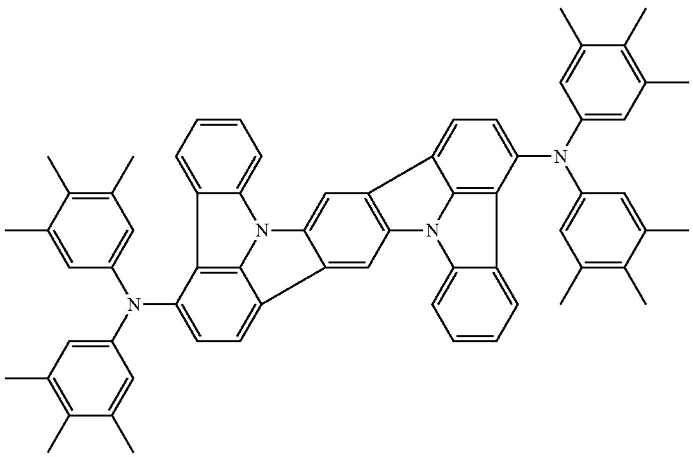
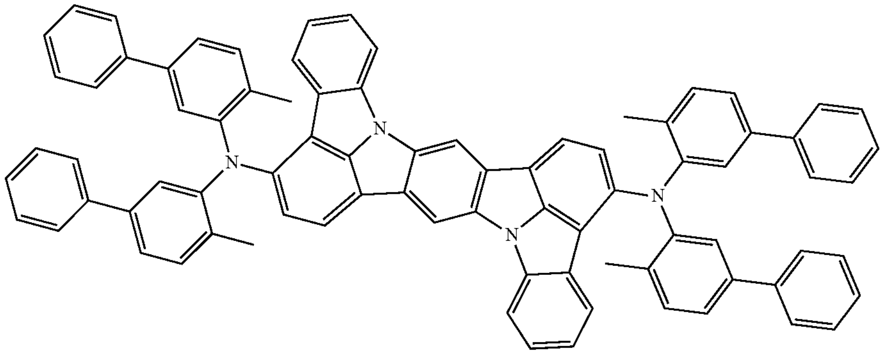
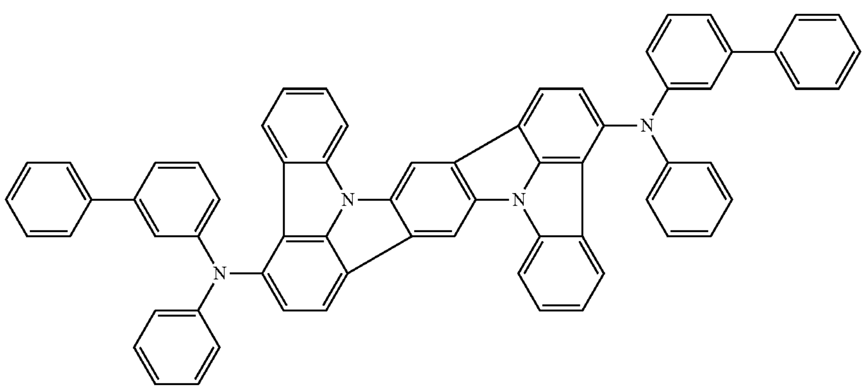
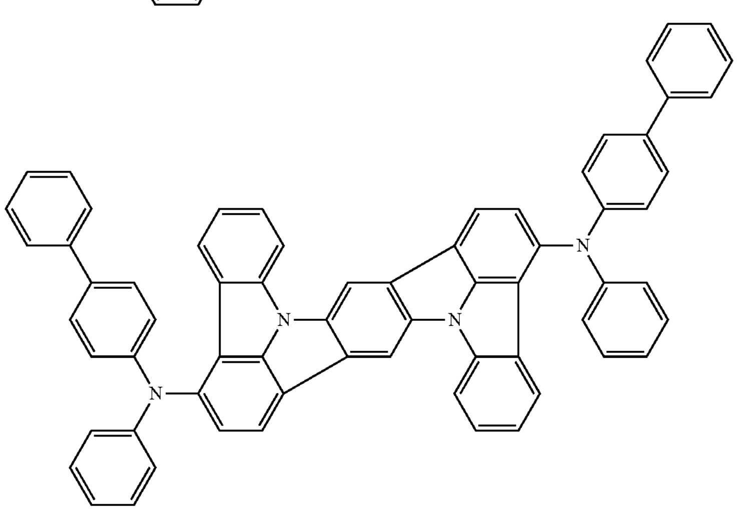

-continued
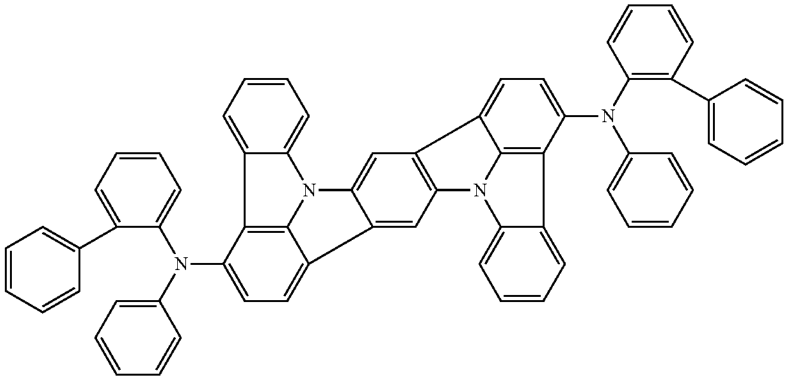
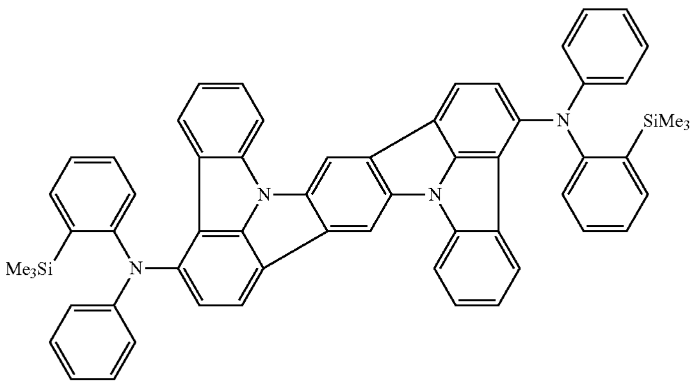
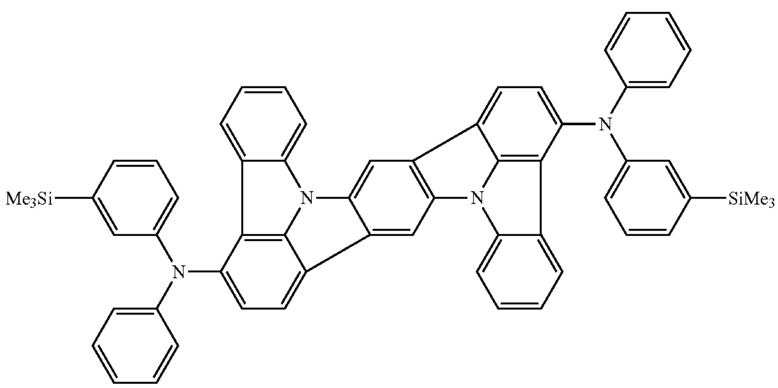
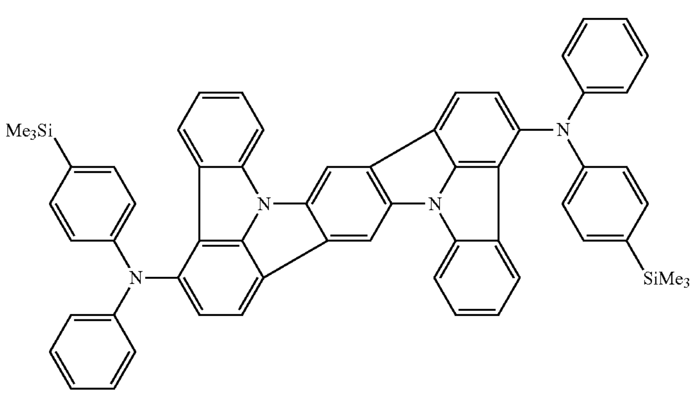

-continued
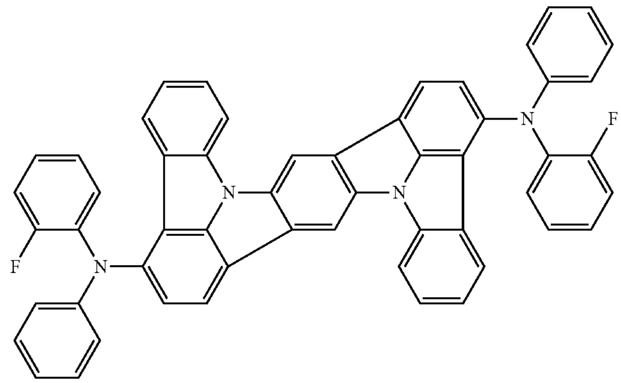
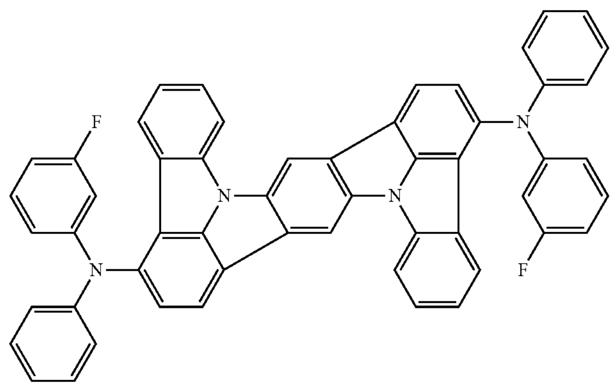
[Formula 172]
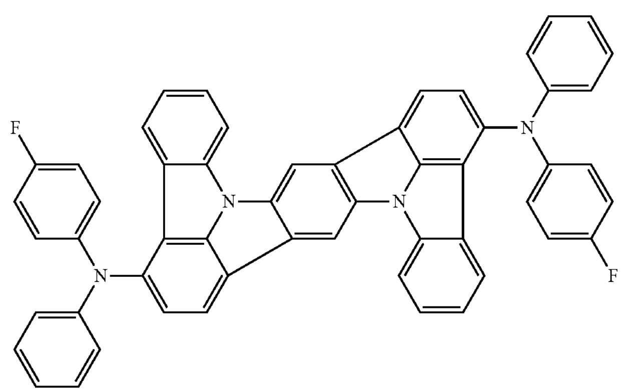
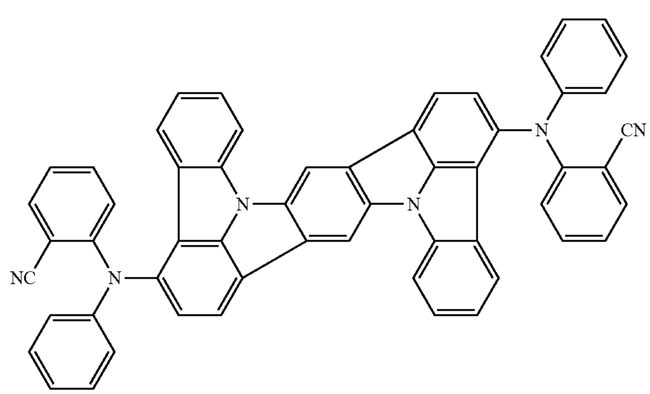

-continued
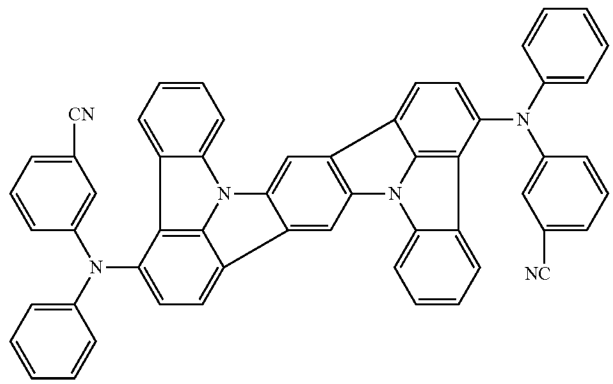
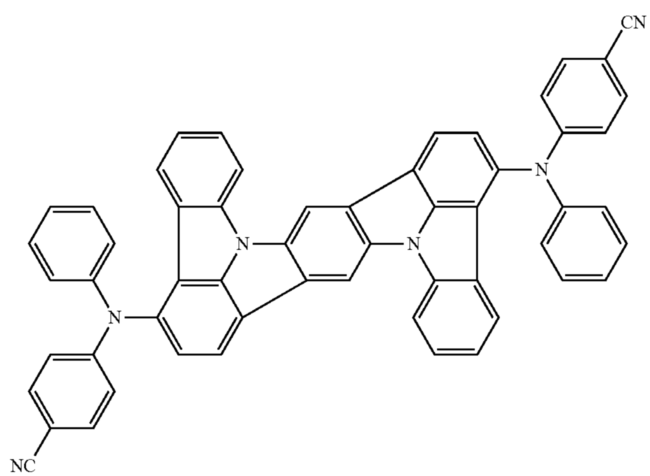
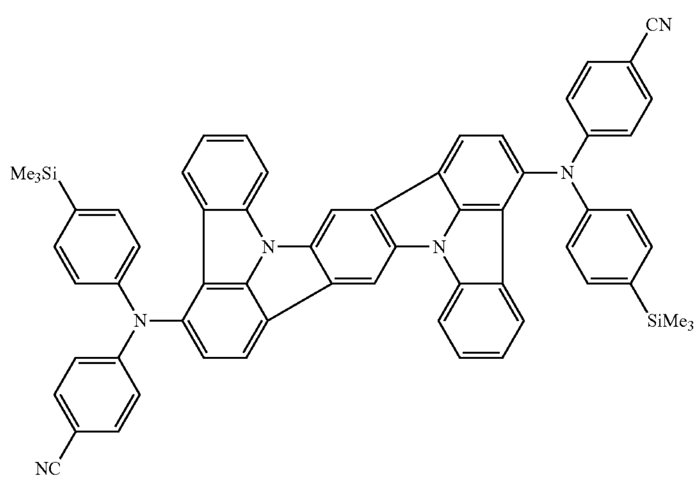

-continued
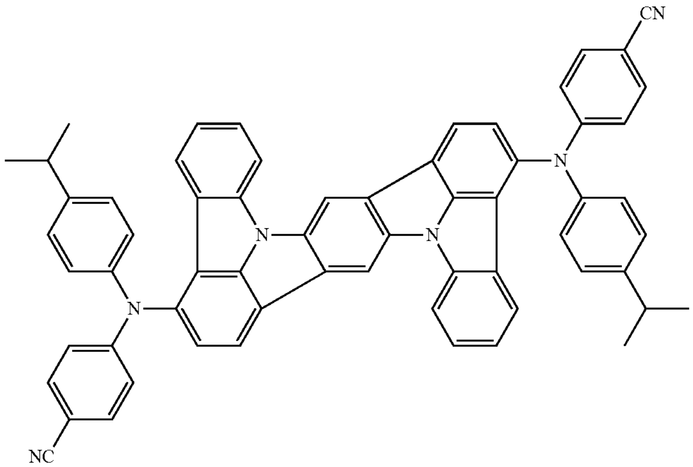
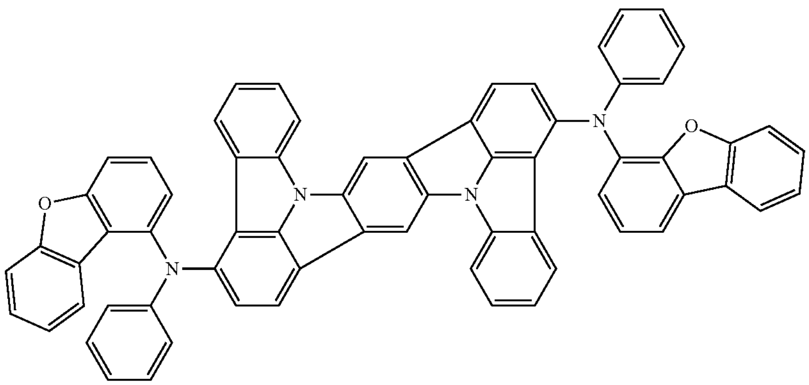
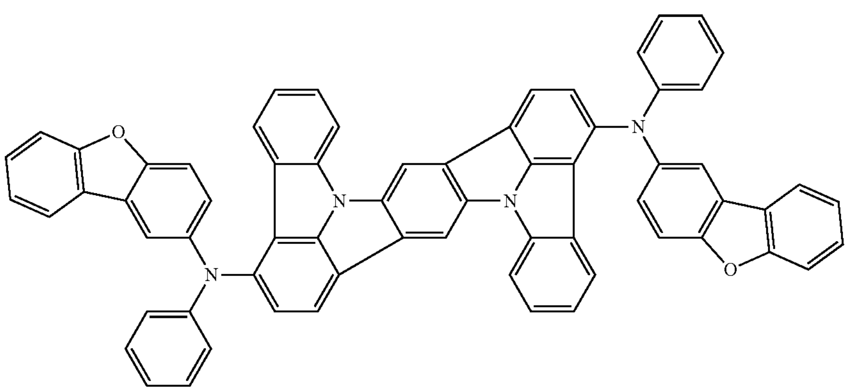
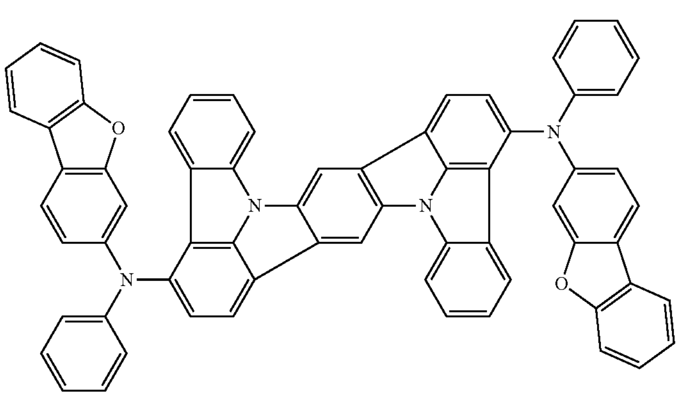

-continued
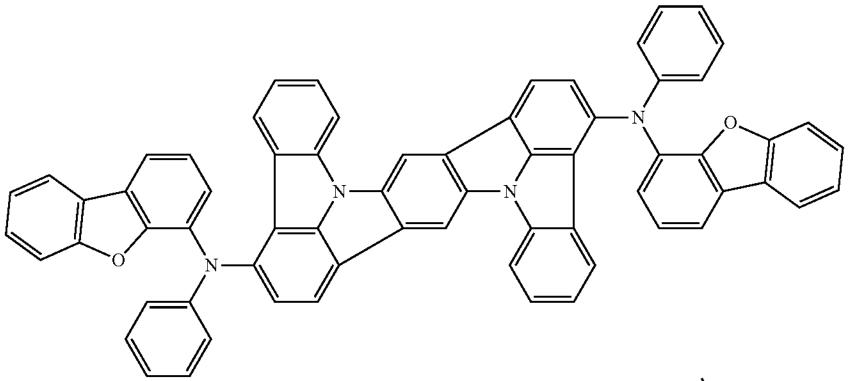
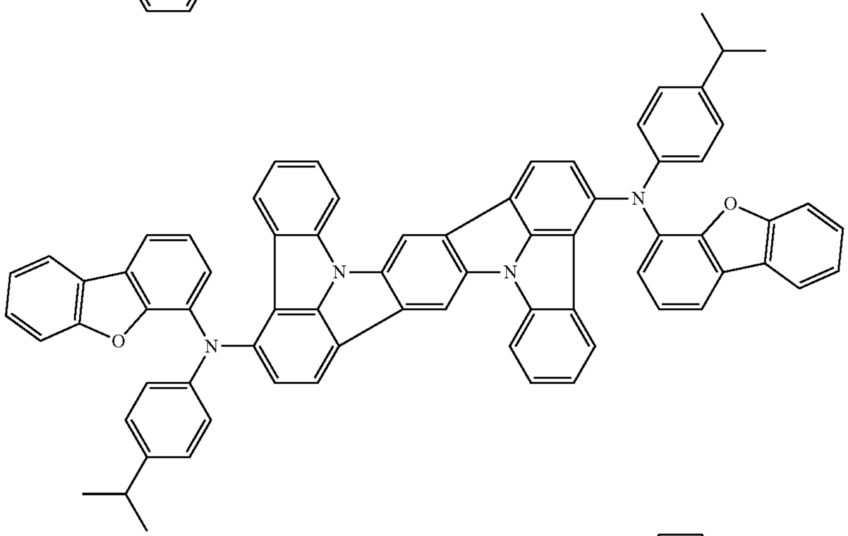
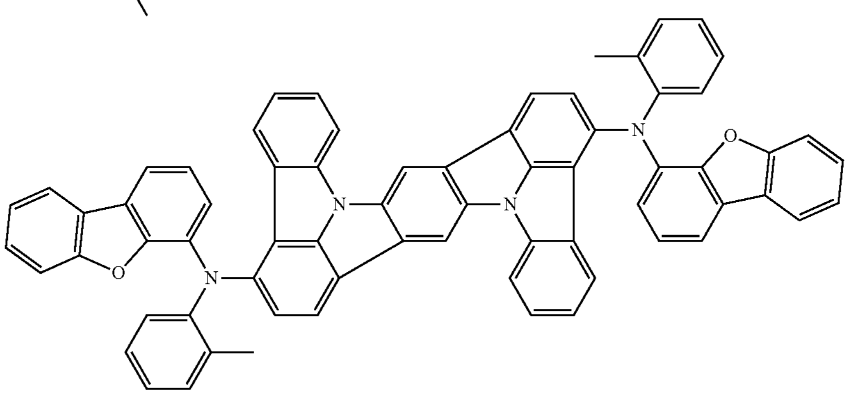
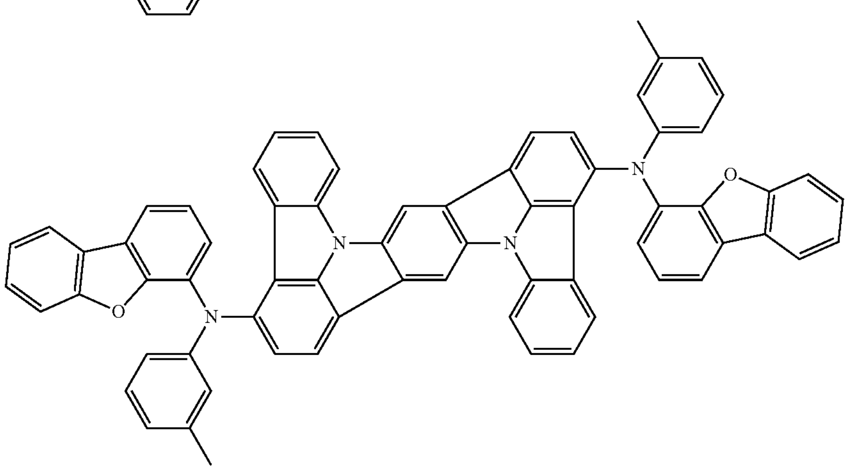

-continued
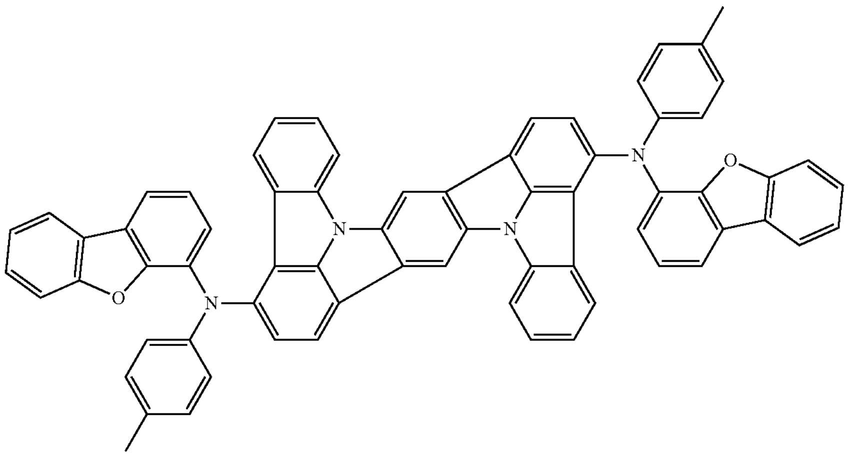
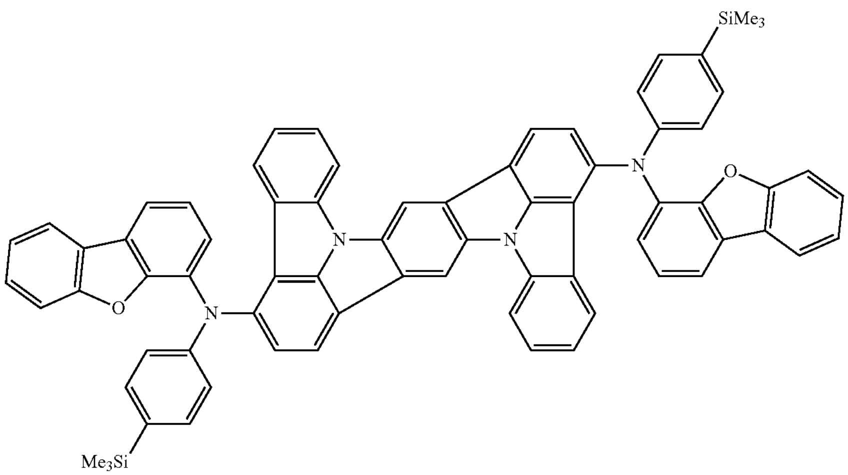
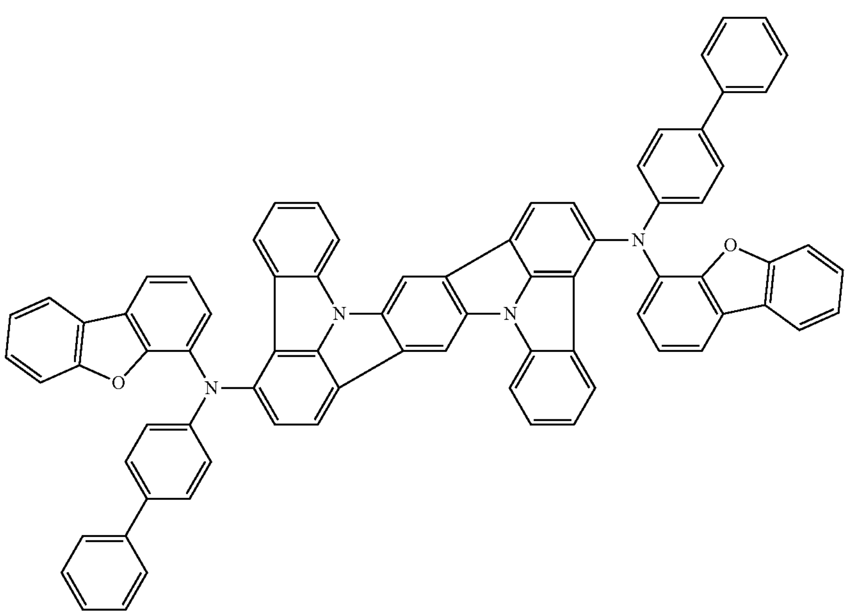

-continued
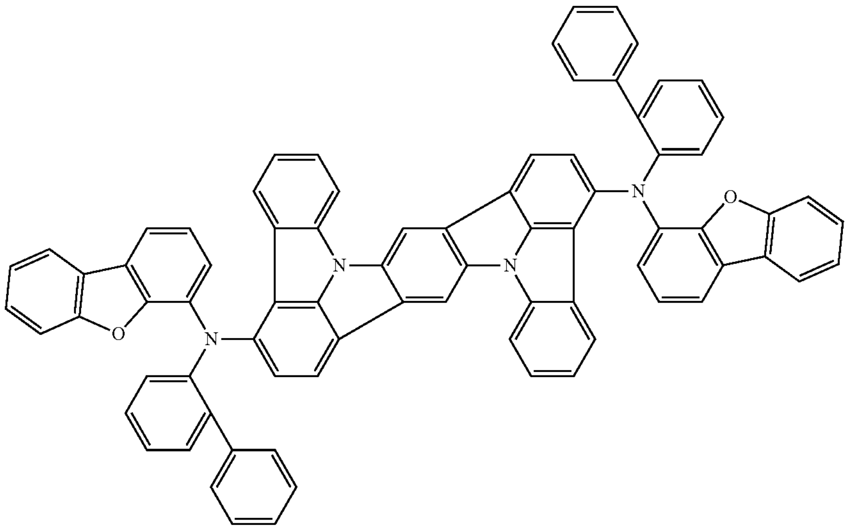
[Formula 173]
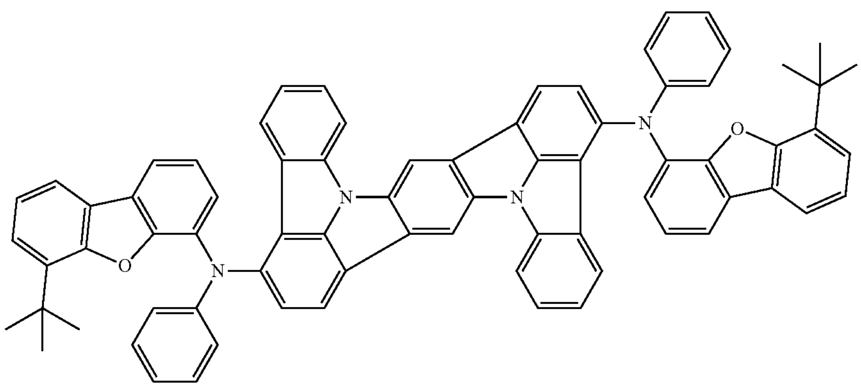
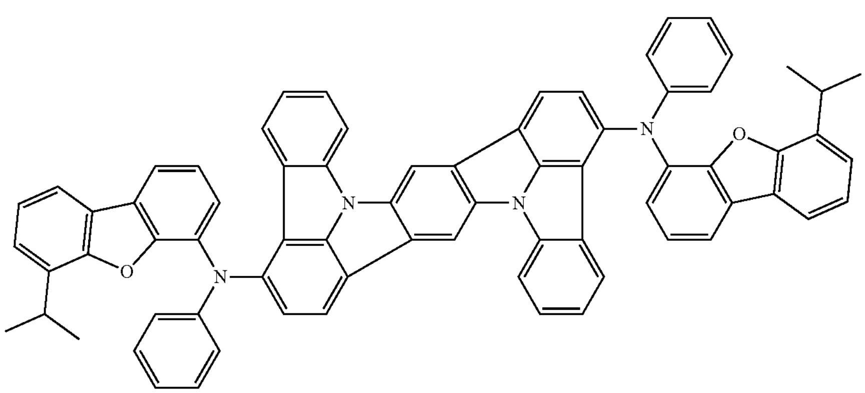

-continued
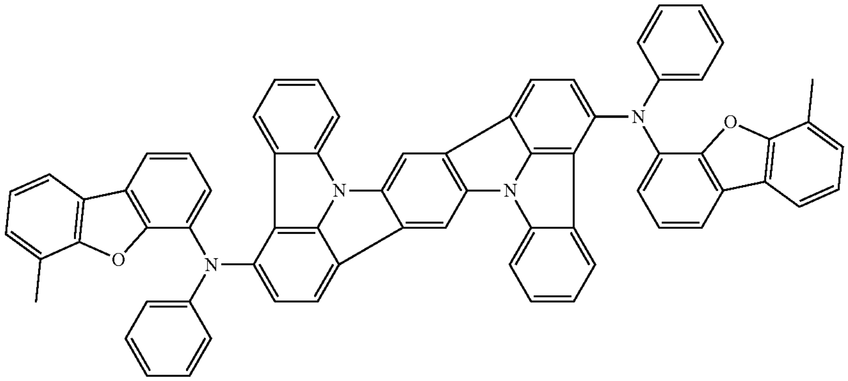
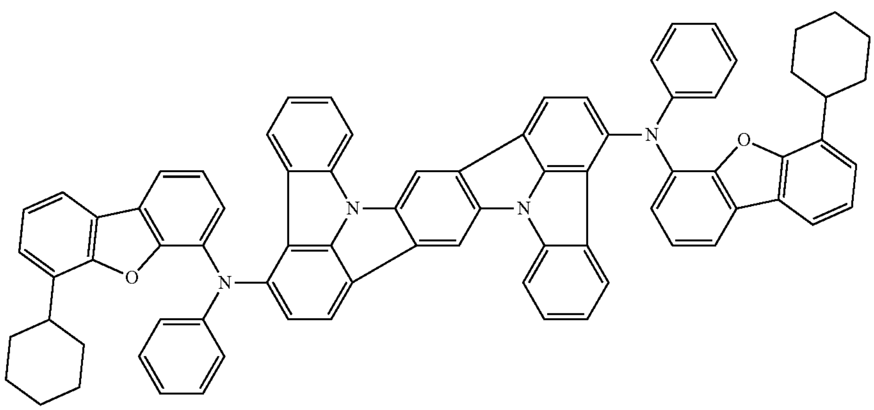
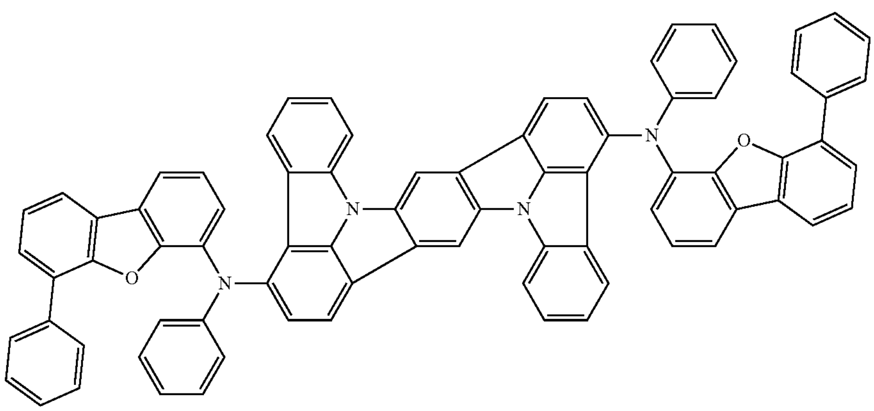
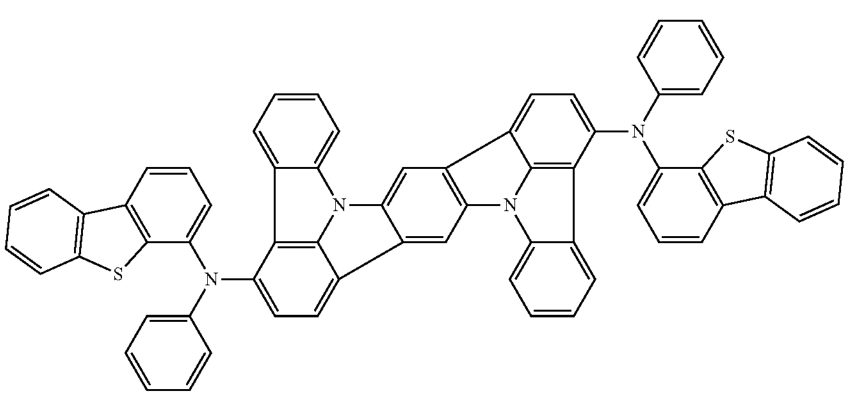

-continued
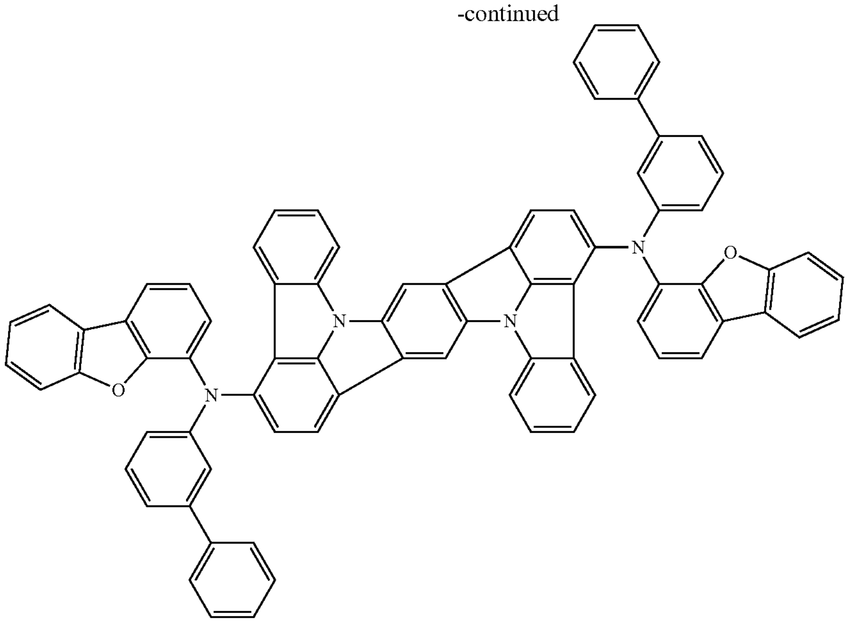
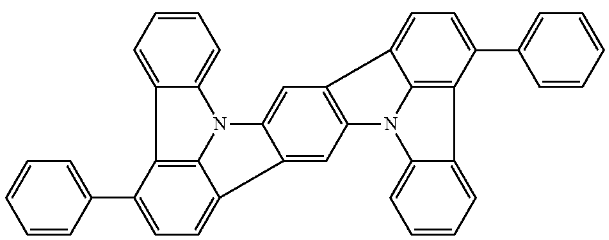
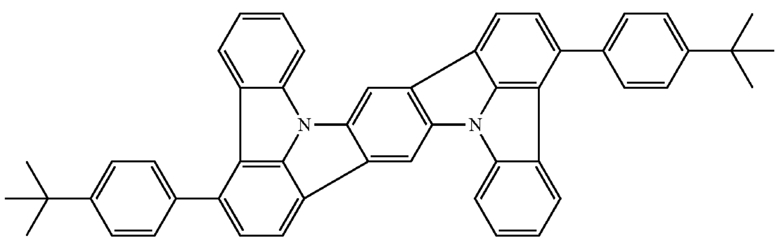
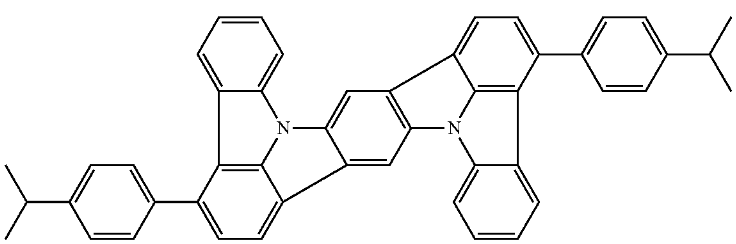
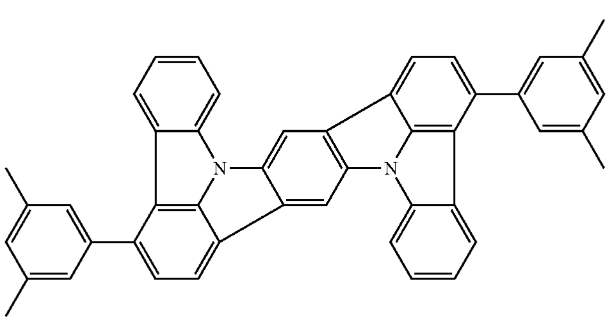

-continued
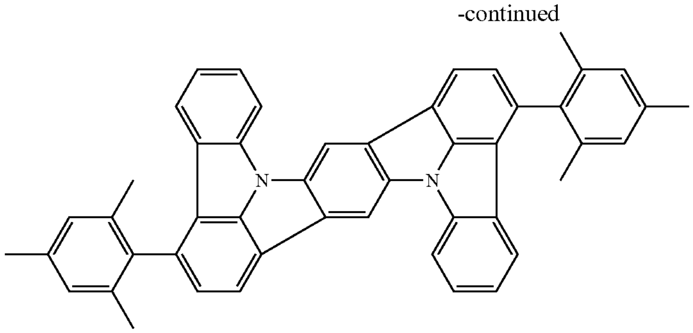
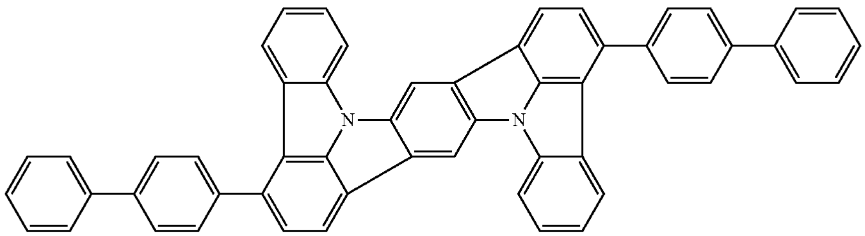
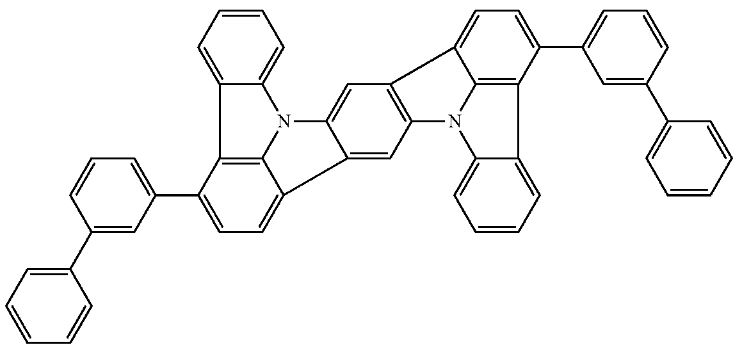
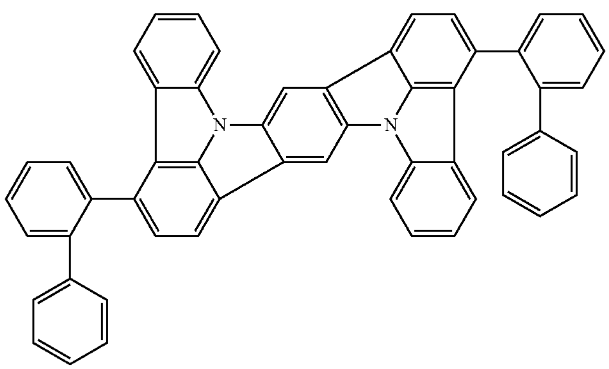
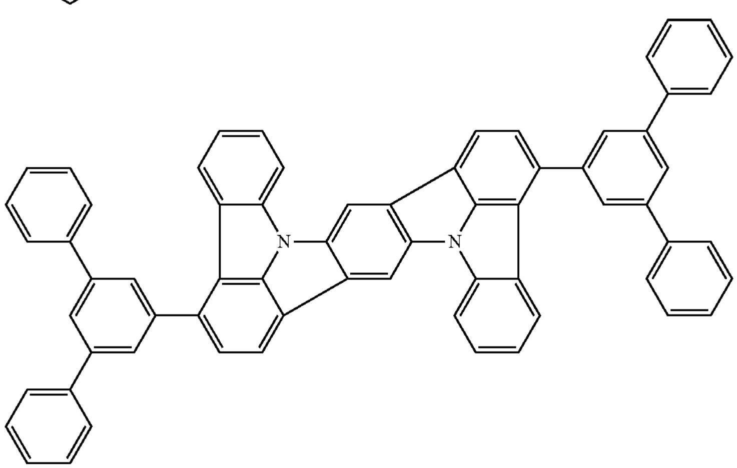

-continued
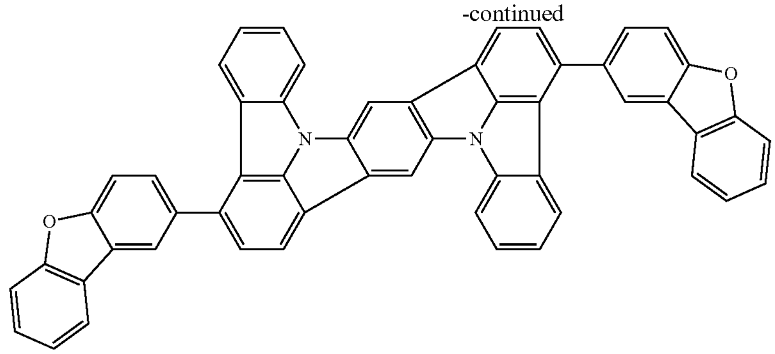
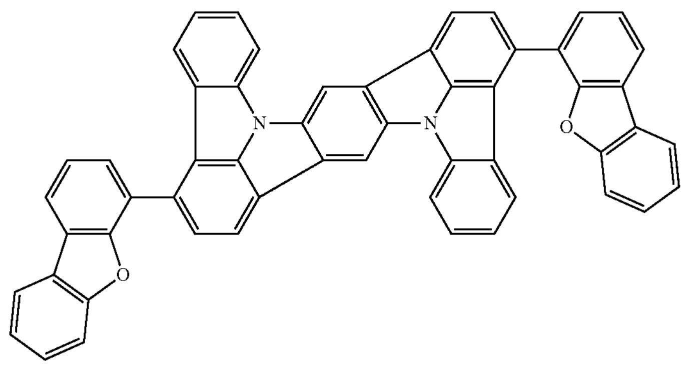
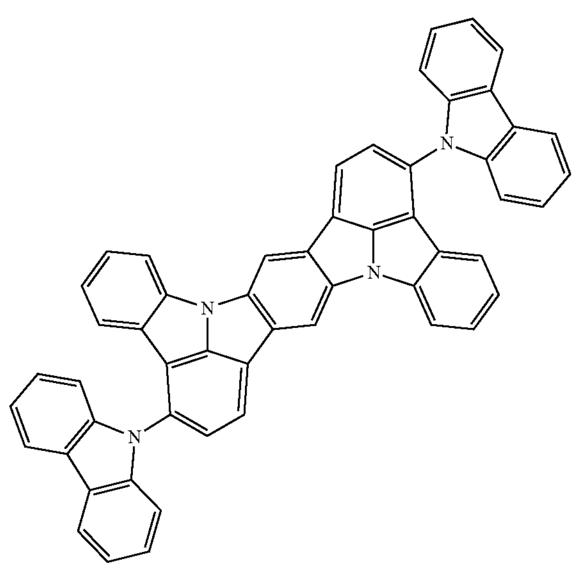

[Formula 174]
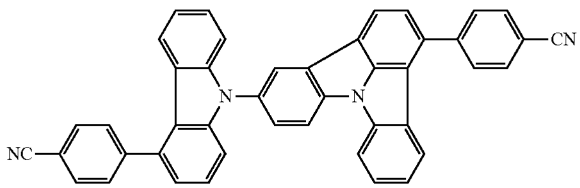
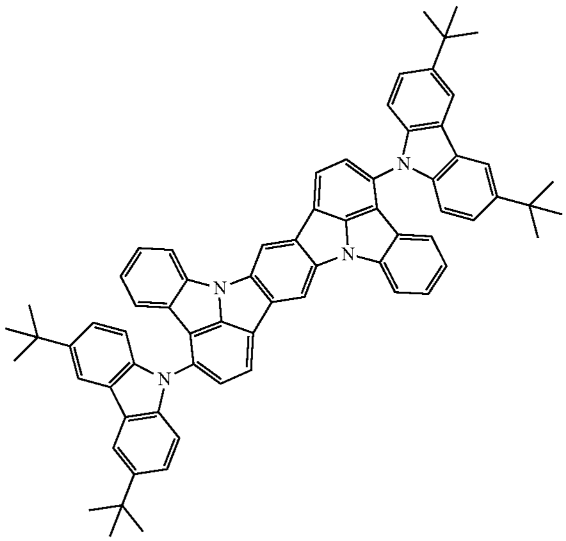
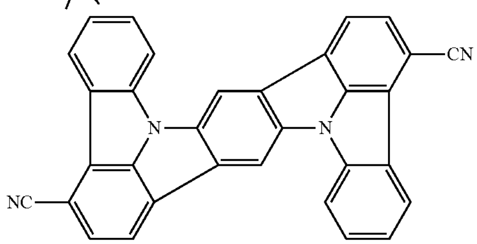
[Formula 175]
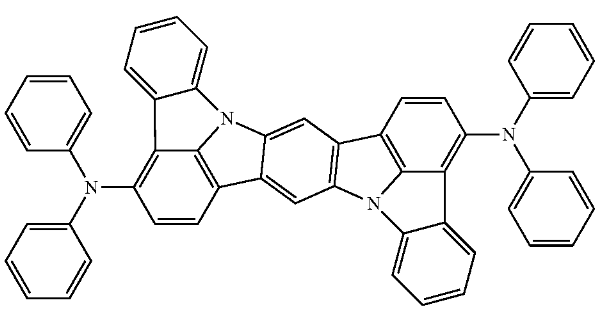
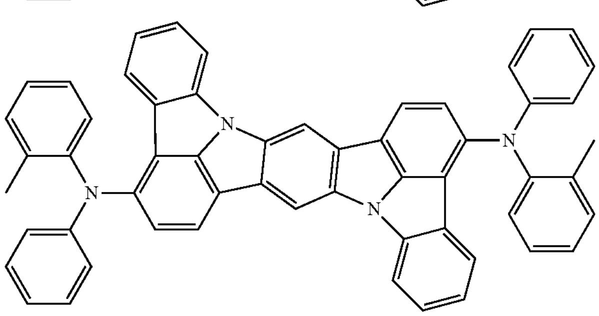

-continued
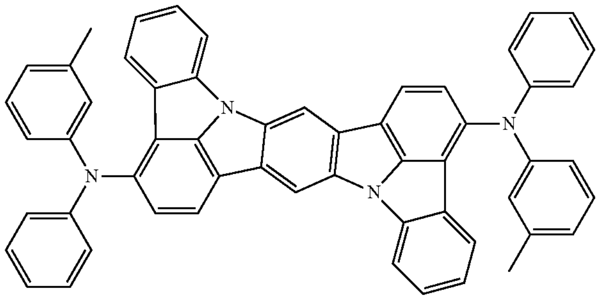
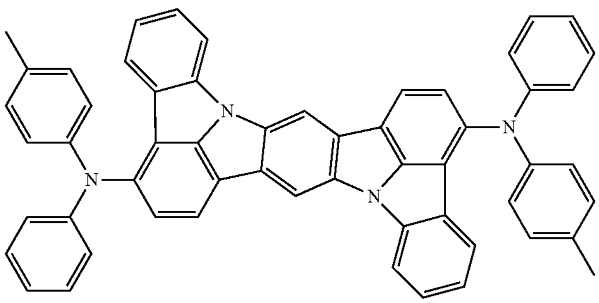
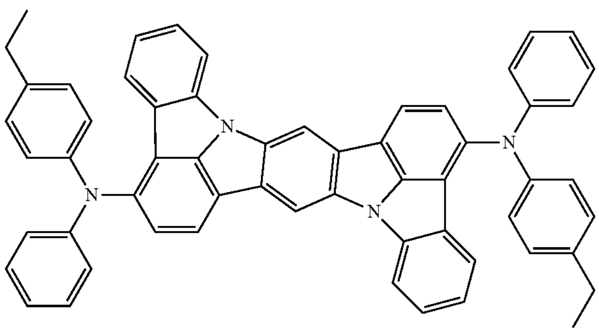
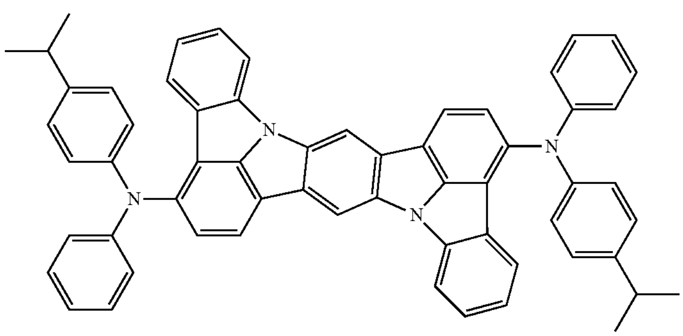
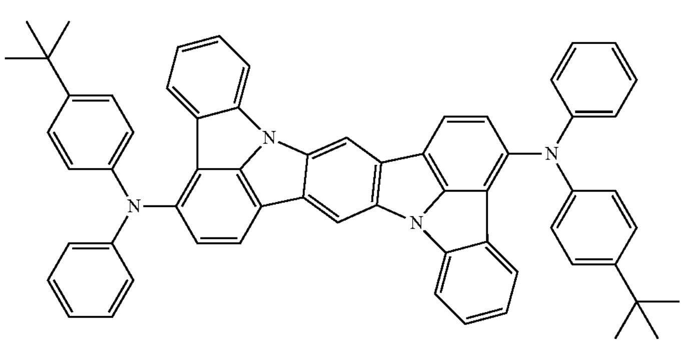

-continued
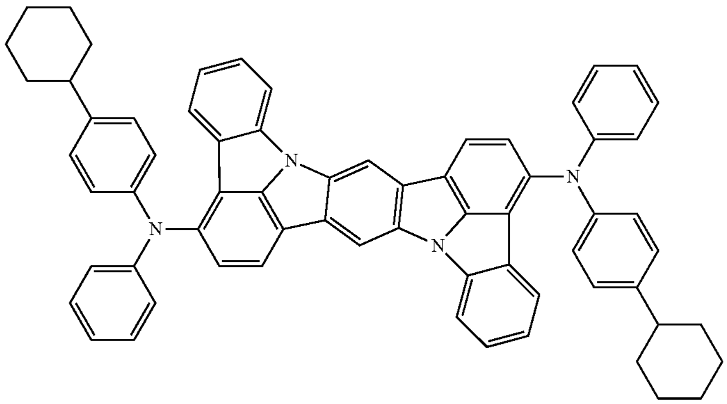
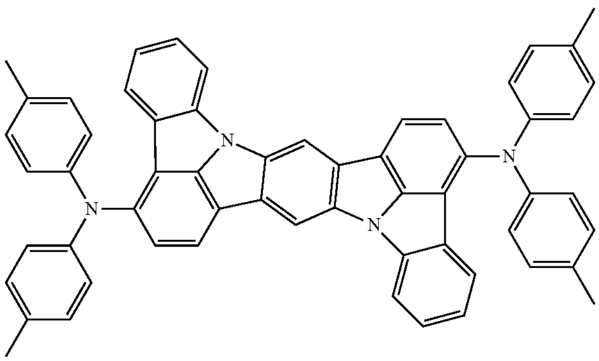
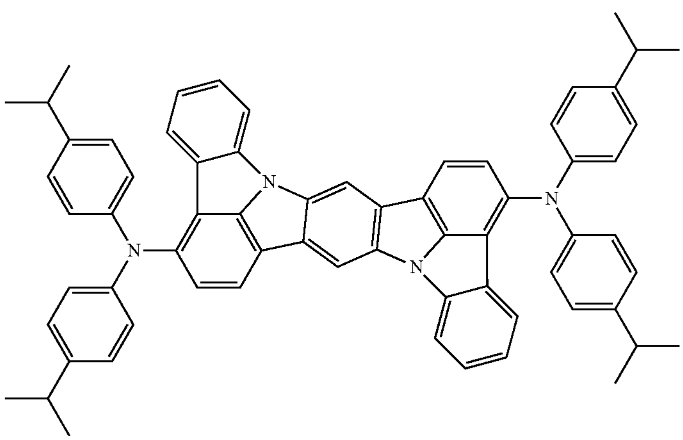
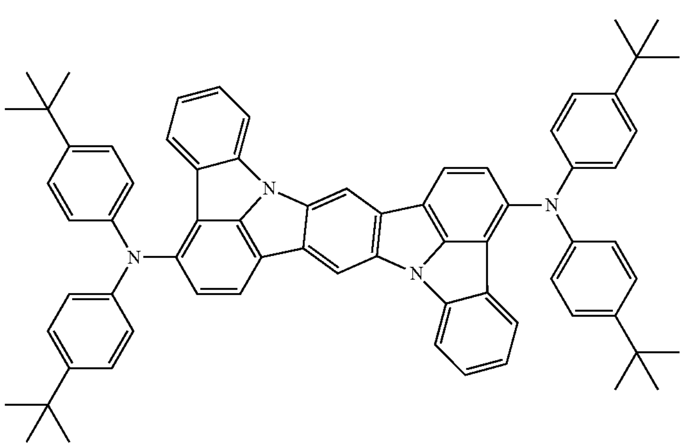

-continued
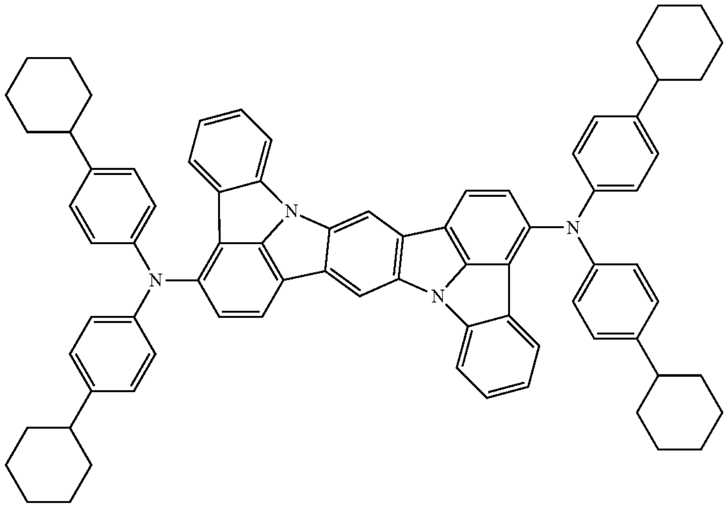
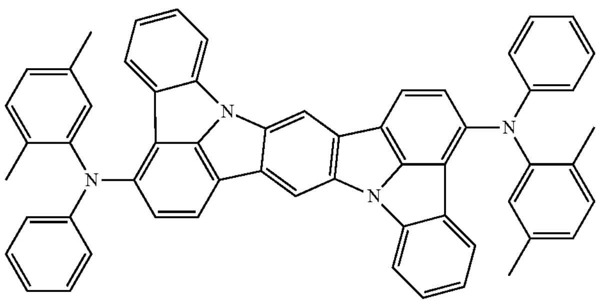
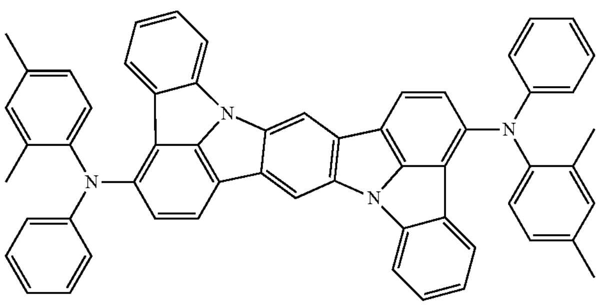
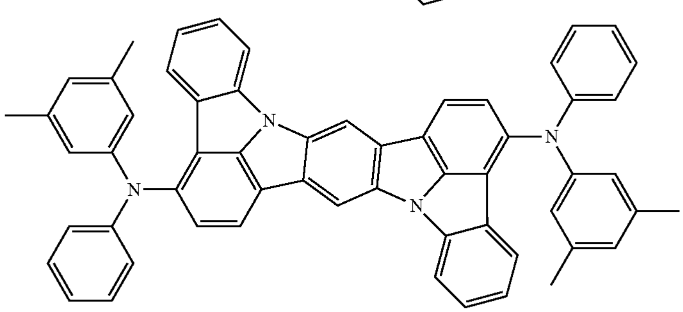
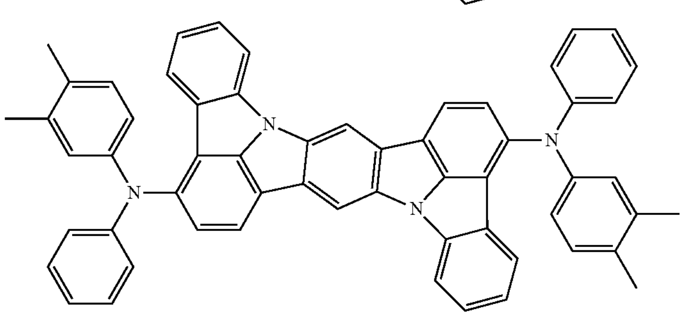

-continued
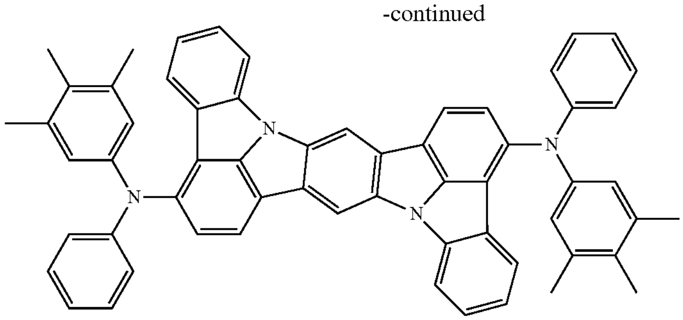
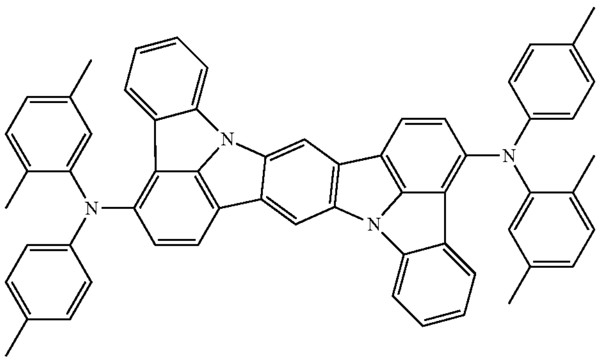
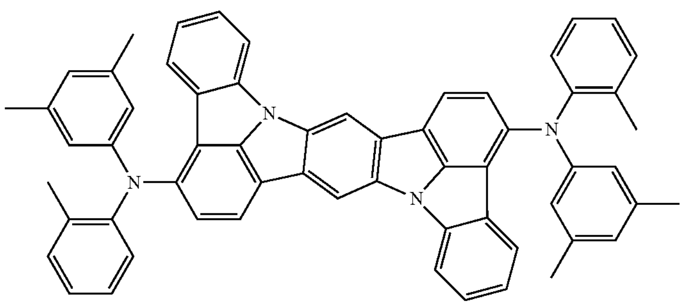
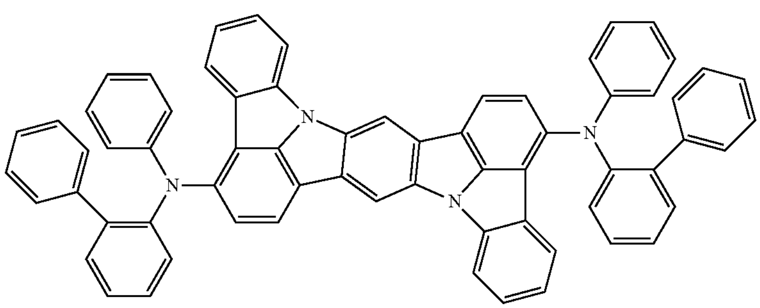
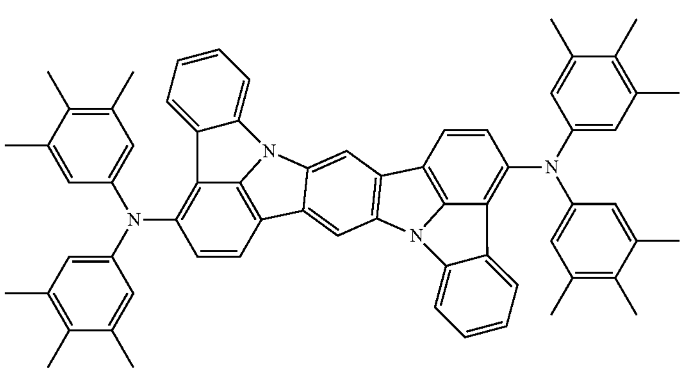

-continued
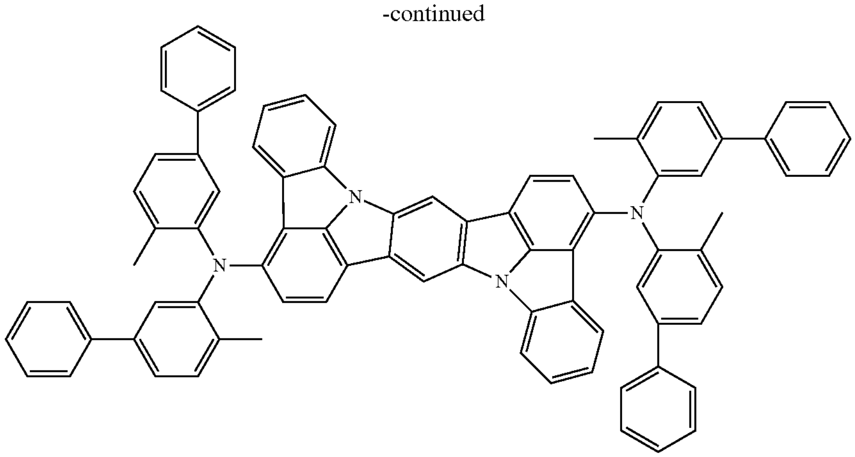
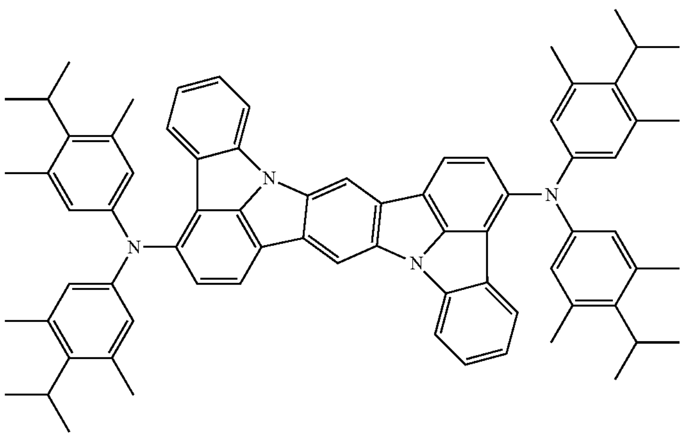
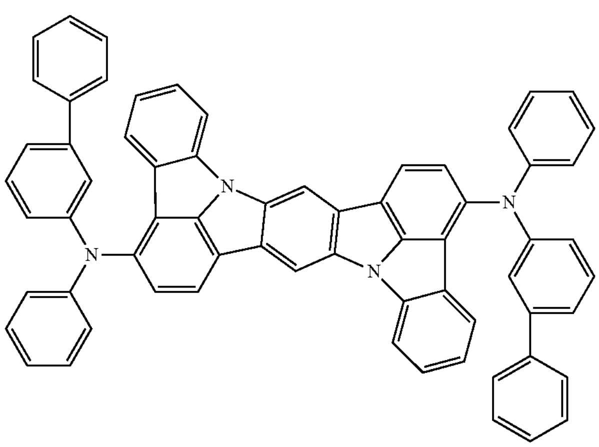

[Formula 176]
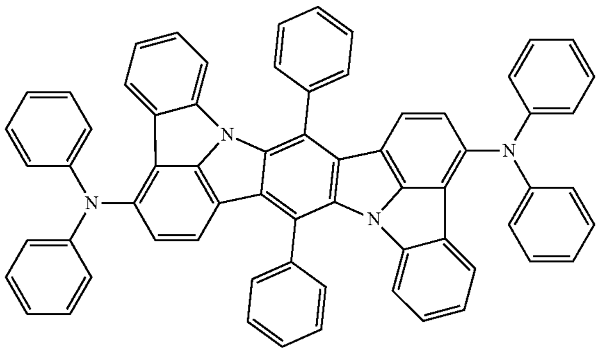
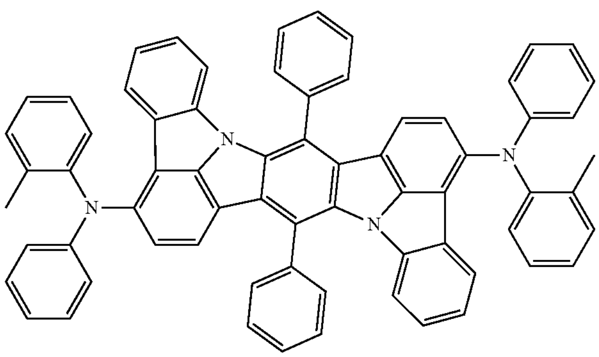
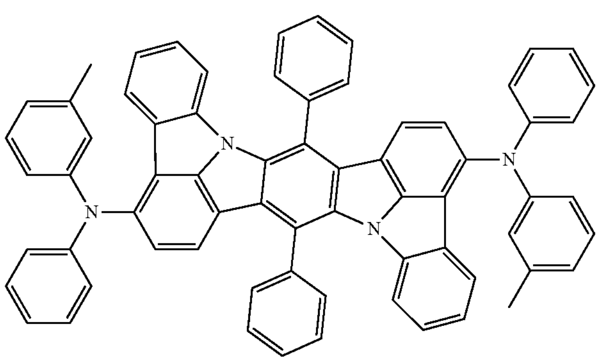
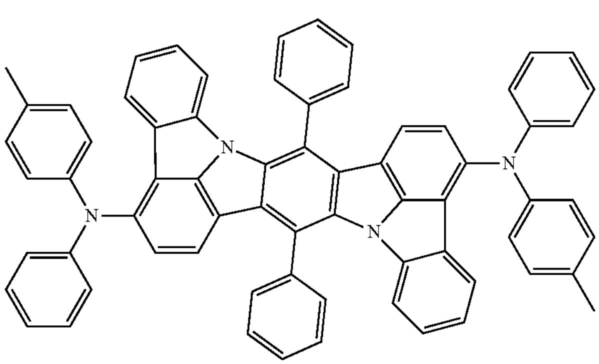

-continued
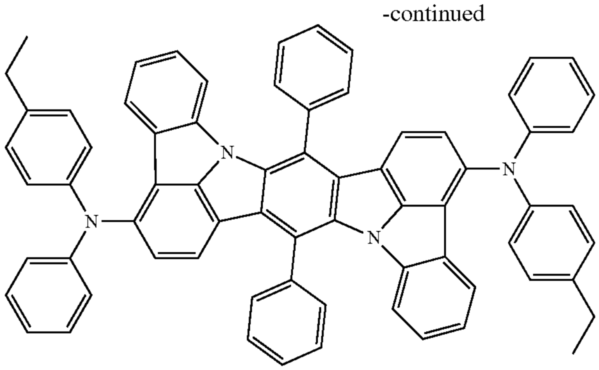
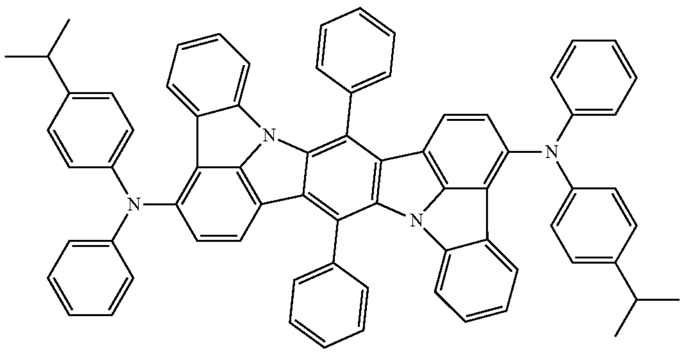
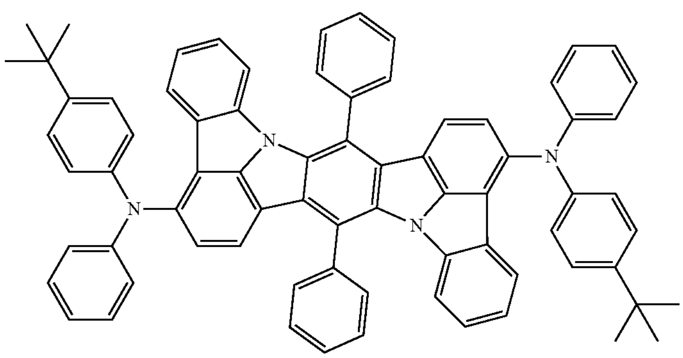
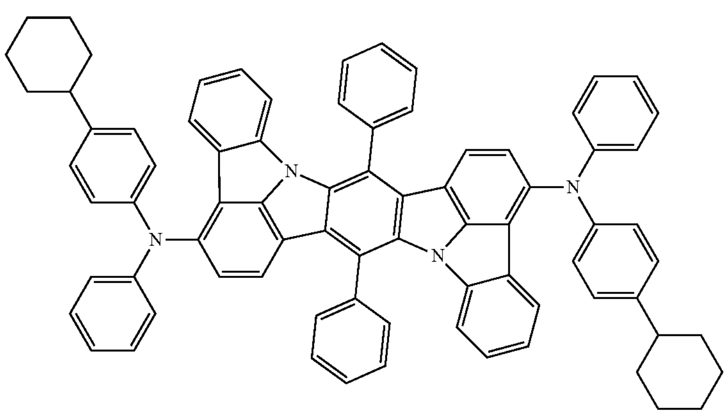

-continued
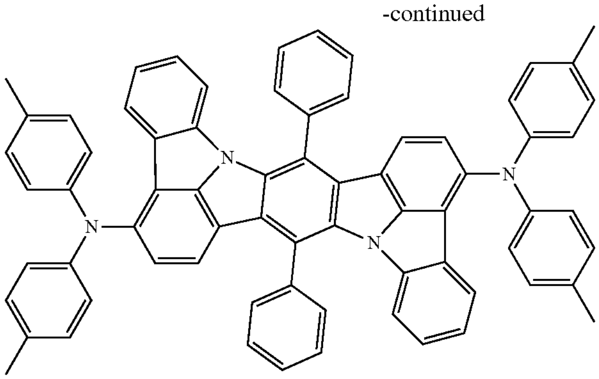
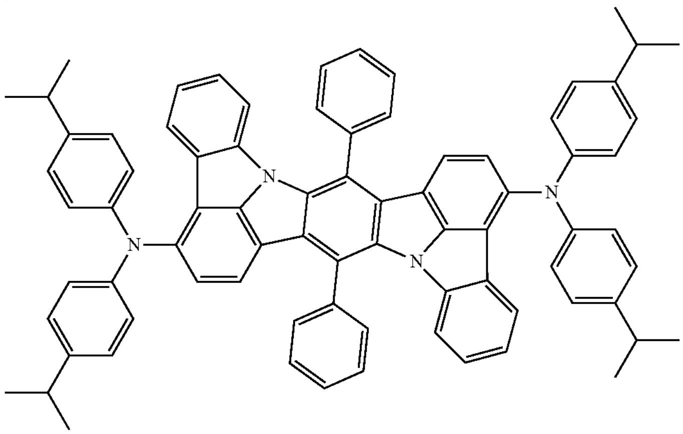
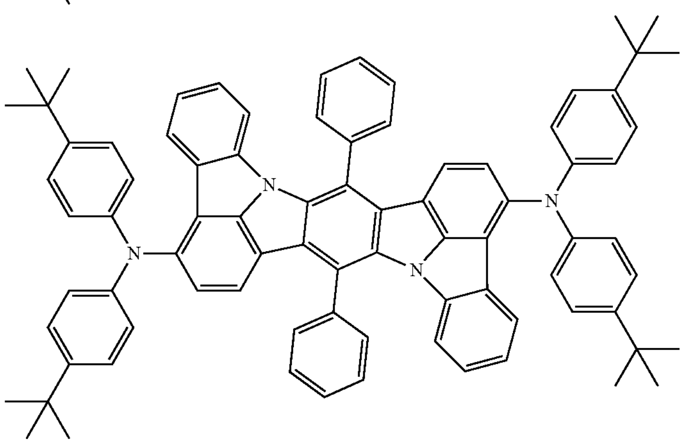
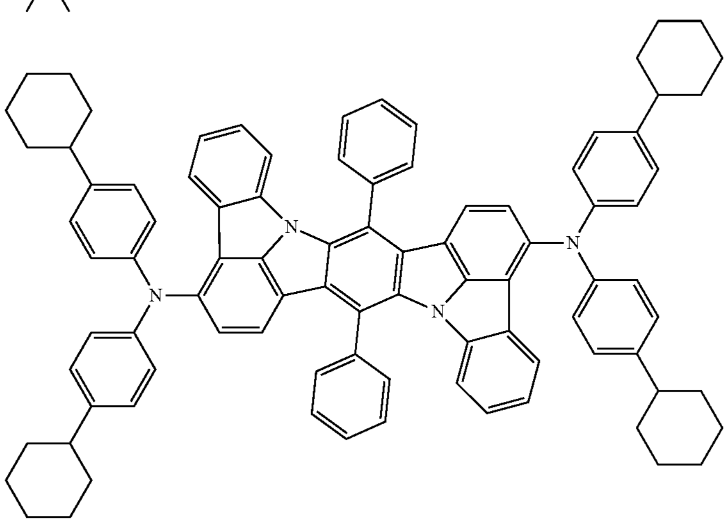

-continued
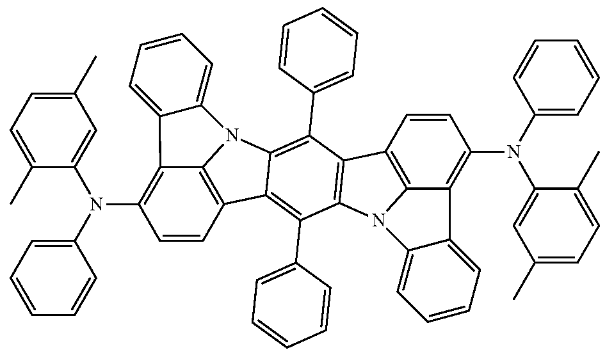
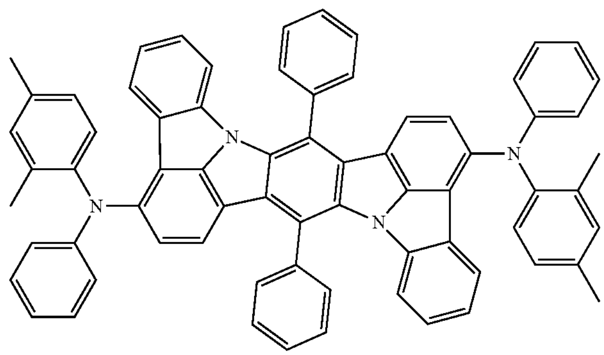
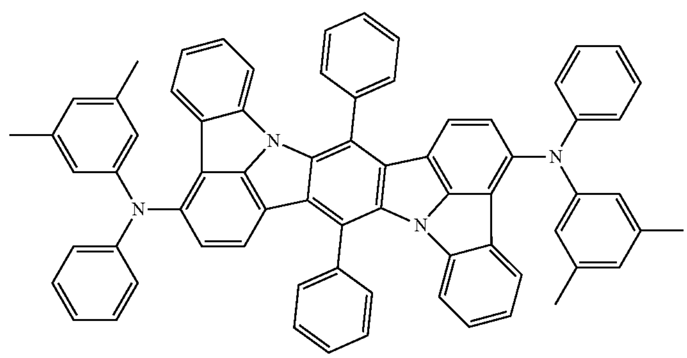
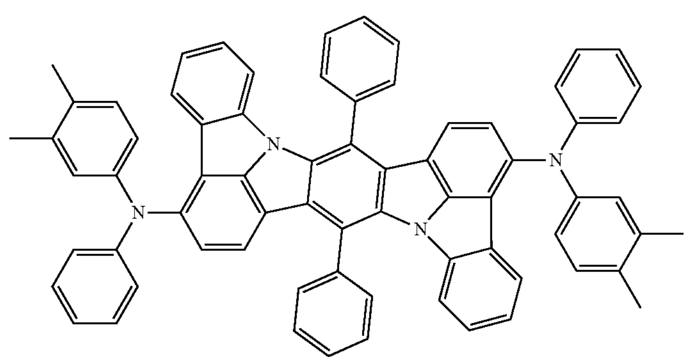

-continued
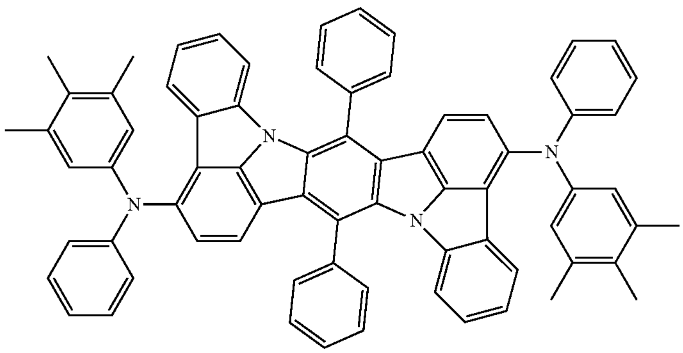
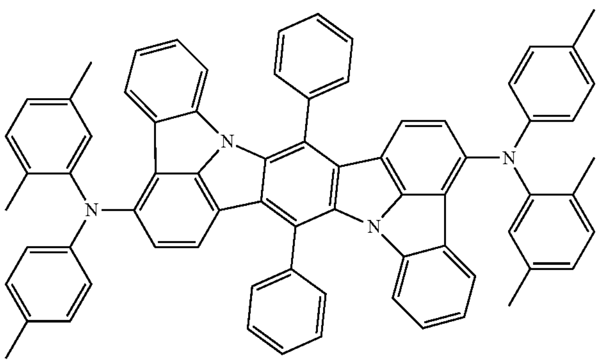
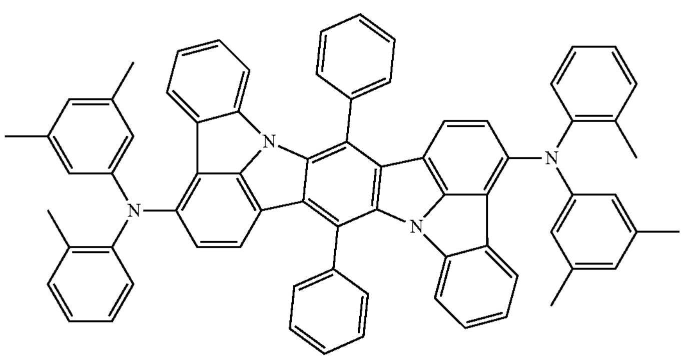
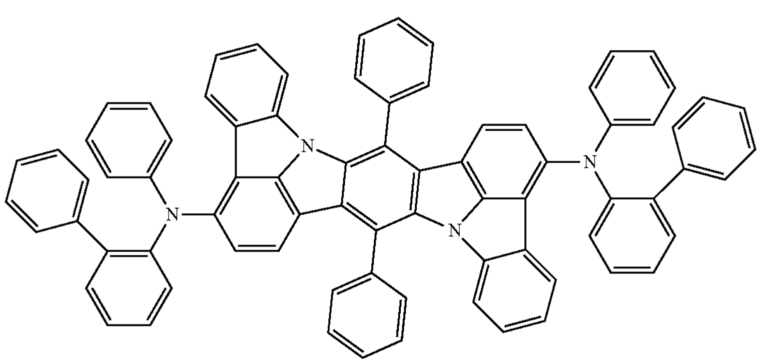

-continued
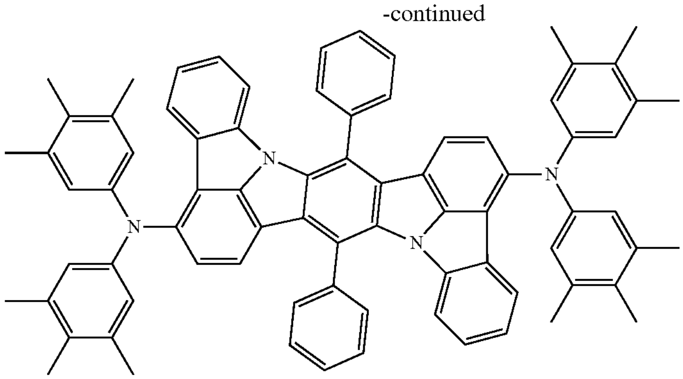
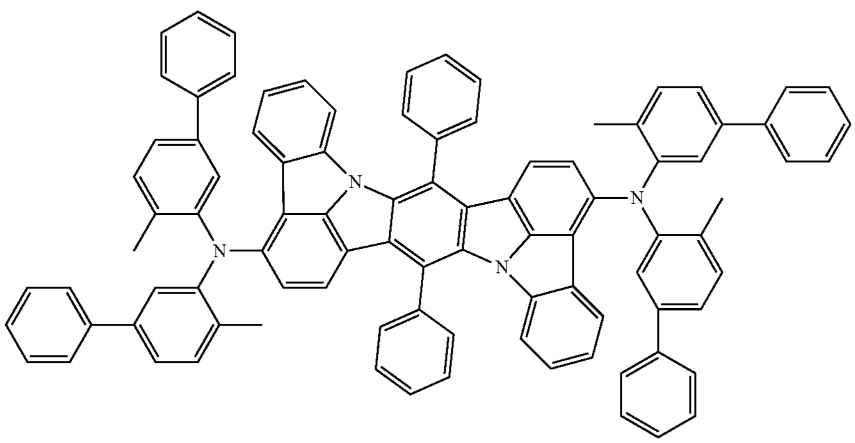
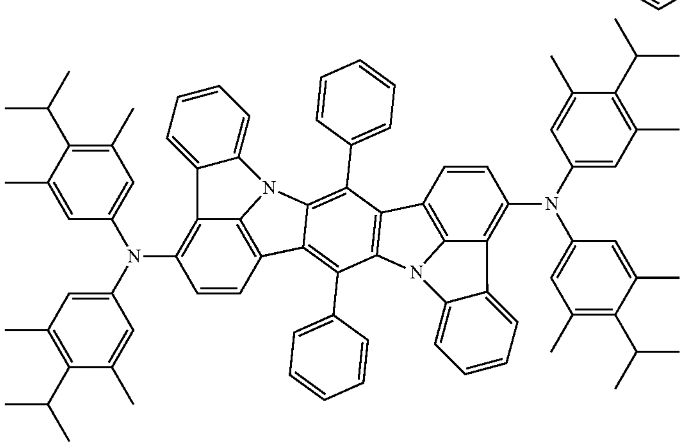
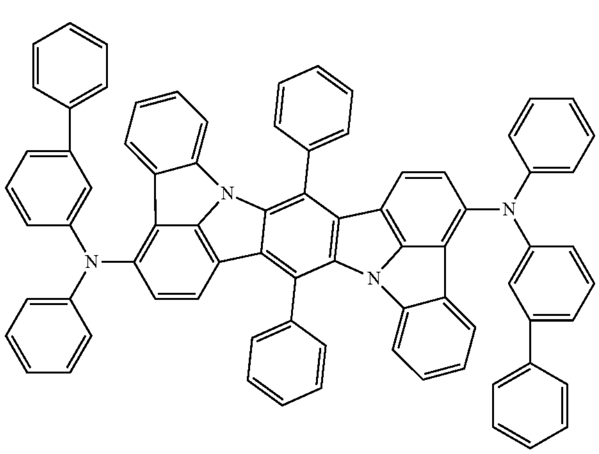 [SMILES: c1ccc(-c2cccc(N(c3ccccc3)c3ccc4c5c(-c6ccccc6)c6c(c(-c7ccccc7)c5n5c7ccccc7c3c45)c3ccc(N(c4ccccc4)c4cccc(-c5ccccc5)c4)c4c5ccccc5n6c34)c2)cc1]

[Formula 177]
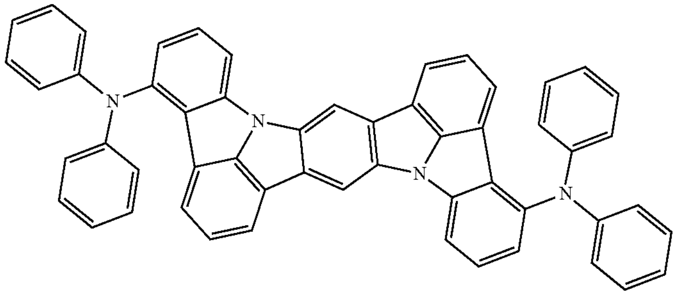
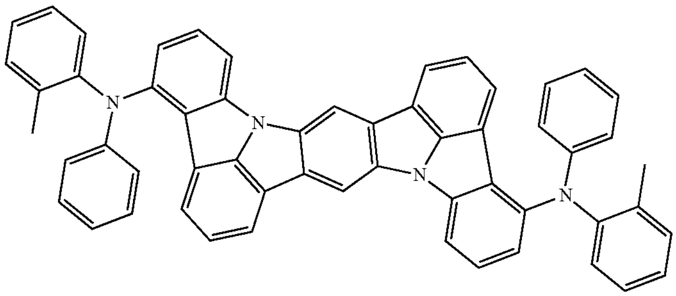
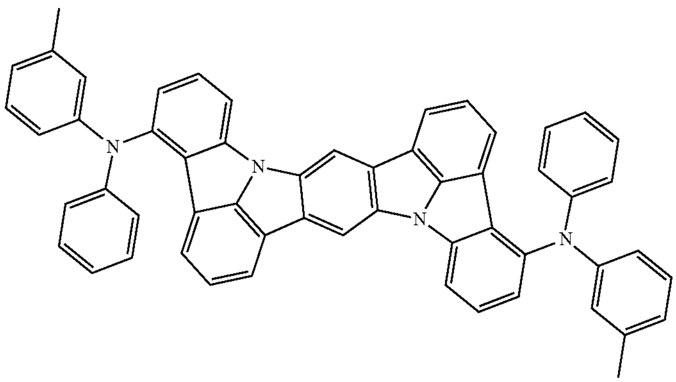
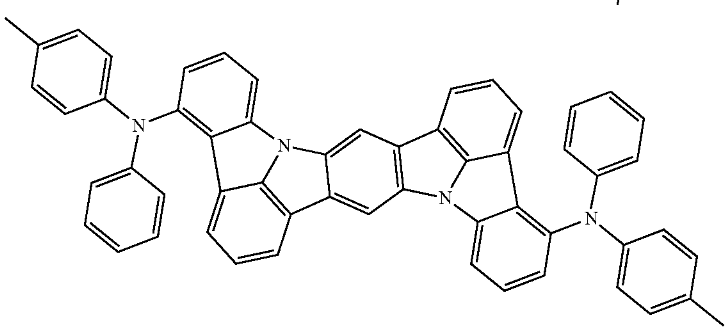
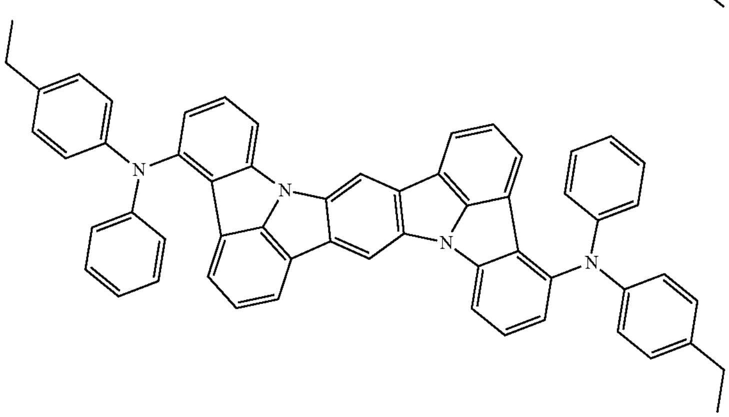

-continued
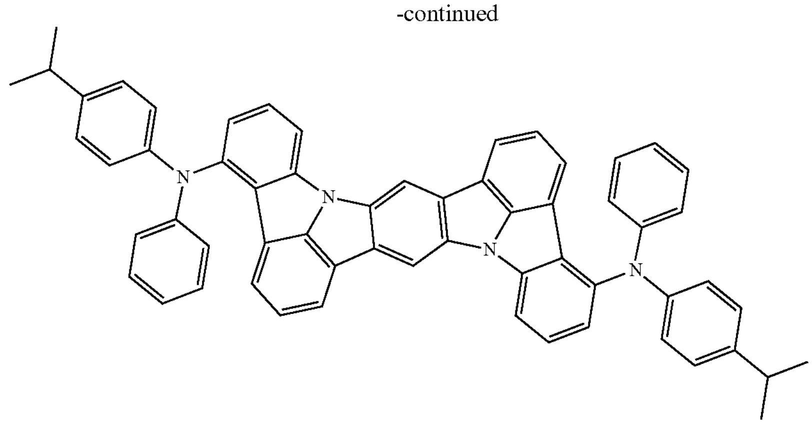
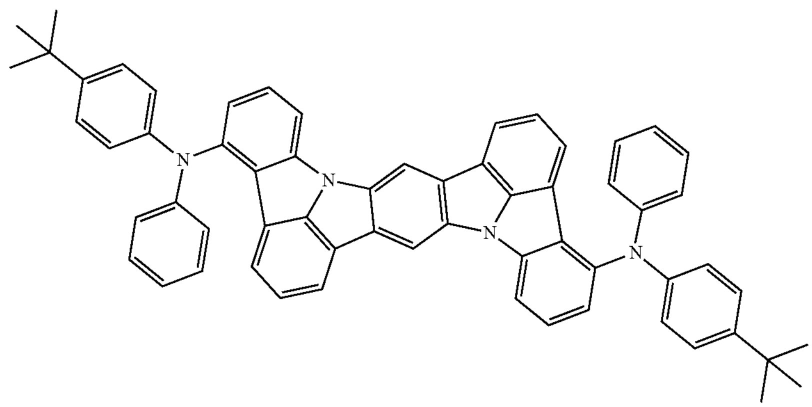
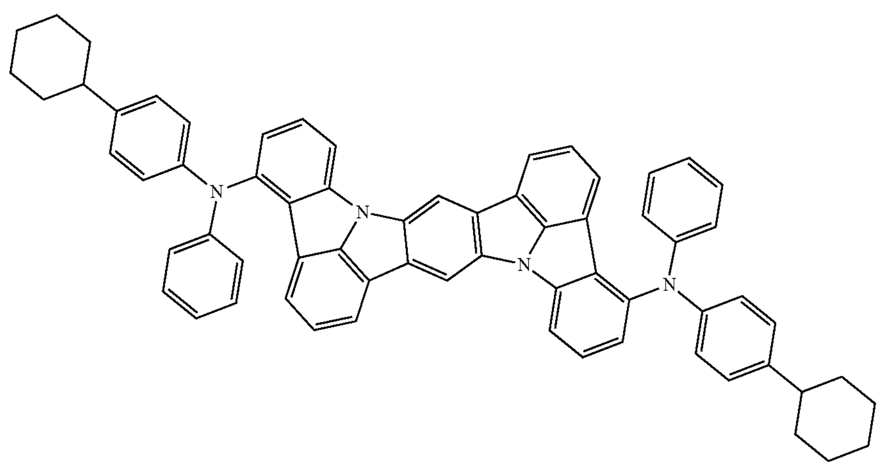
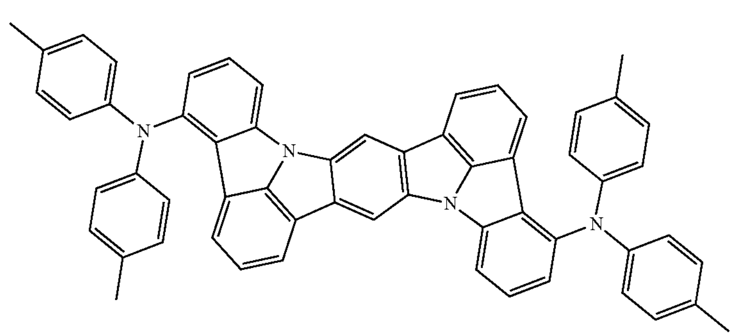

-continued
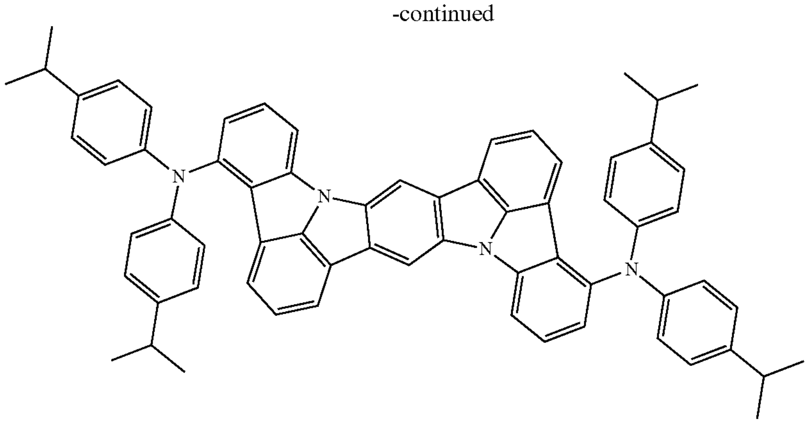
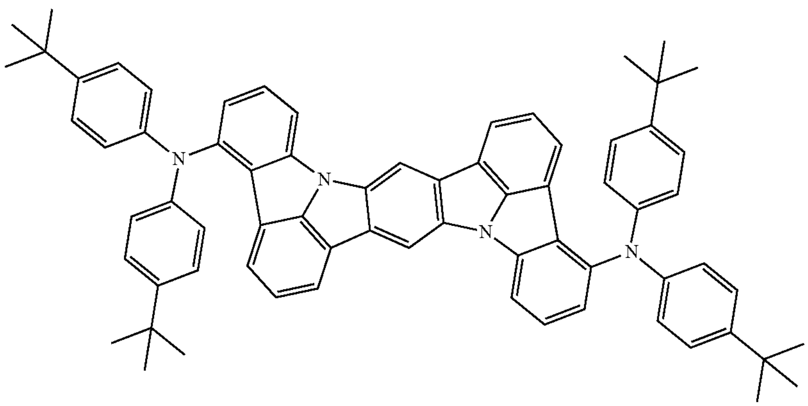
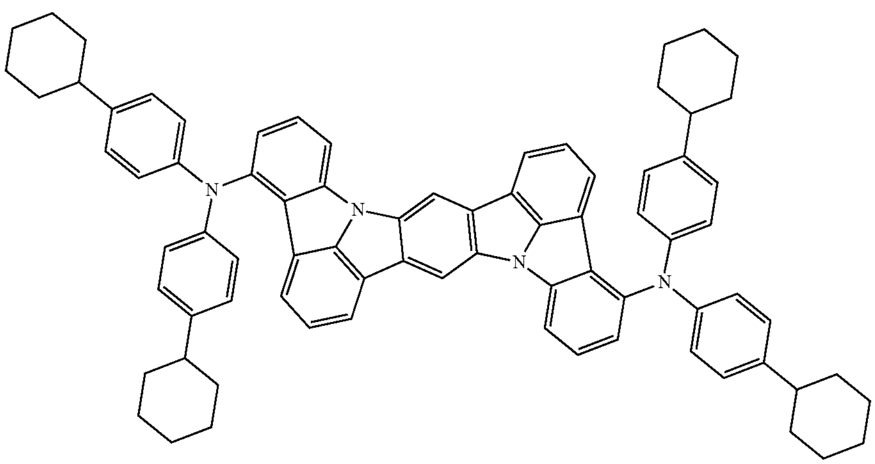
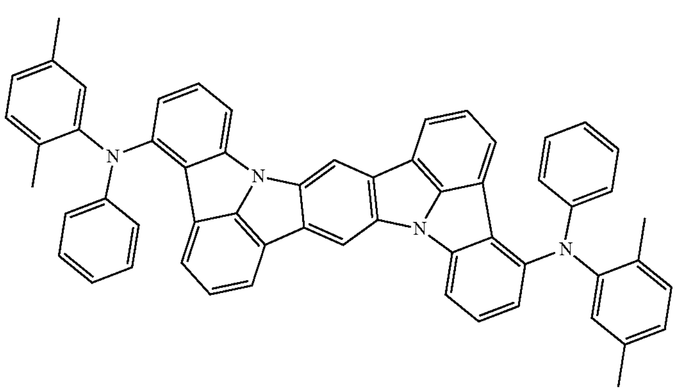

-continued
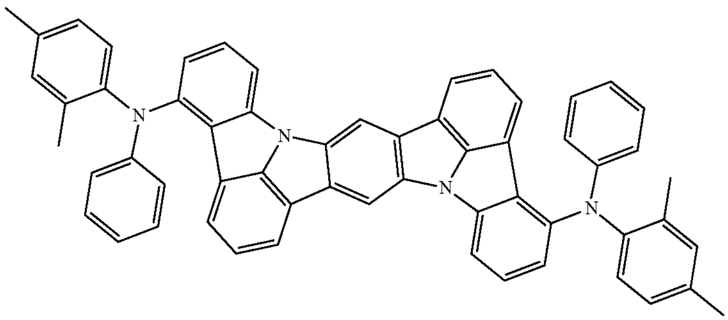
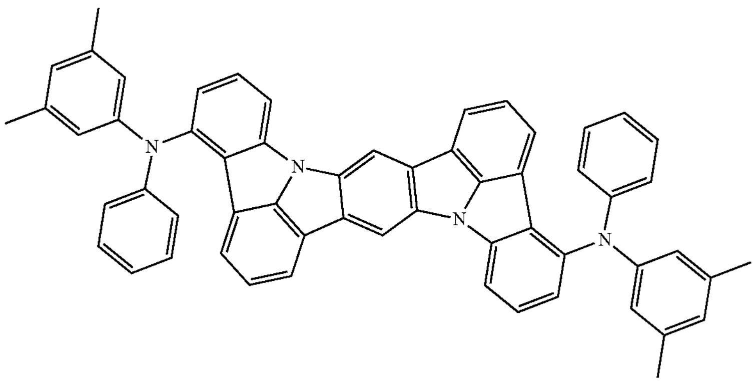
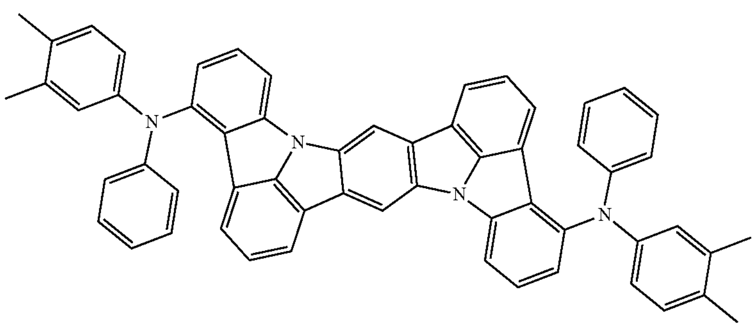
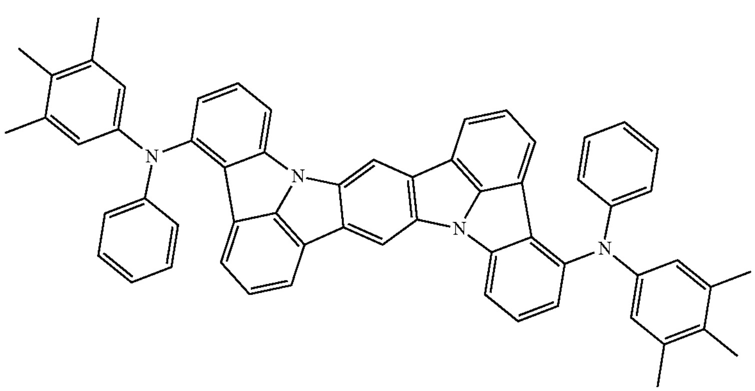

-continued
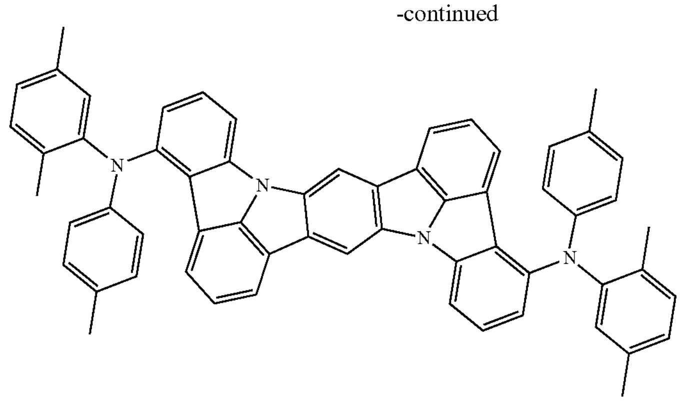
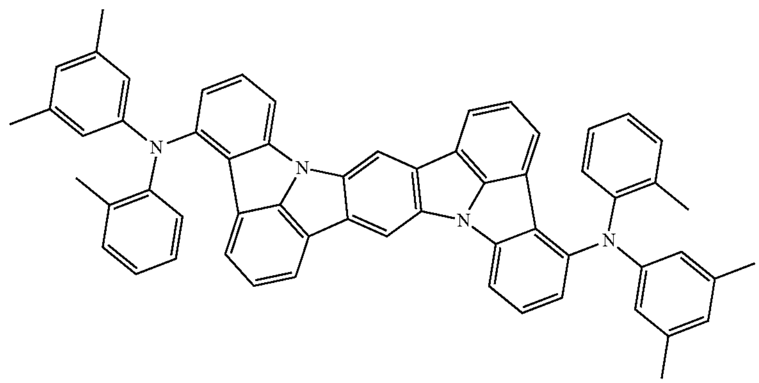
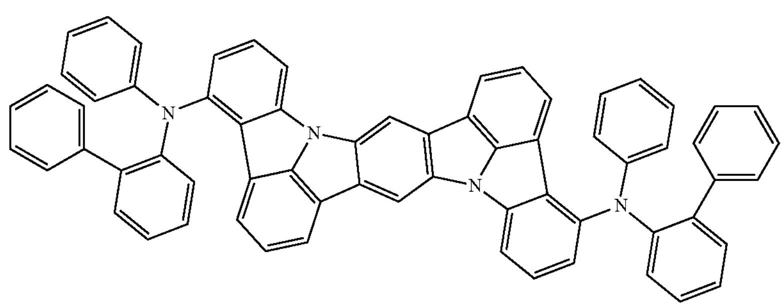
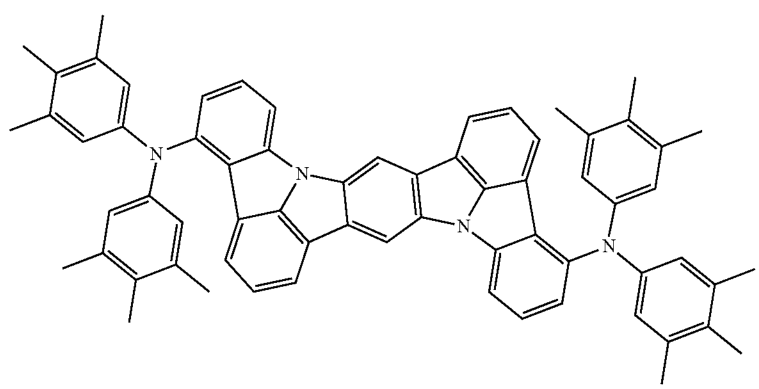

-continued
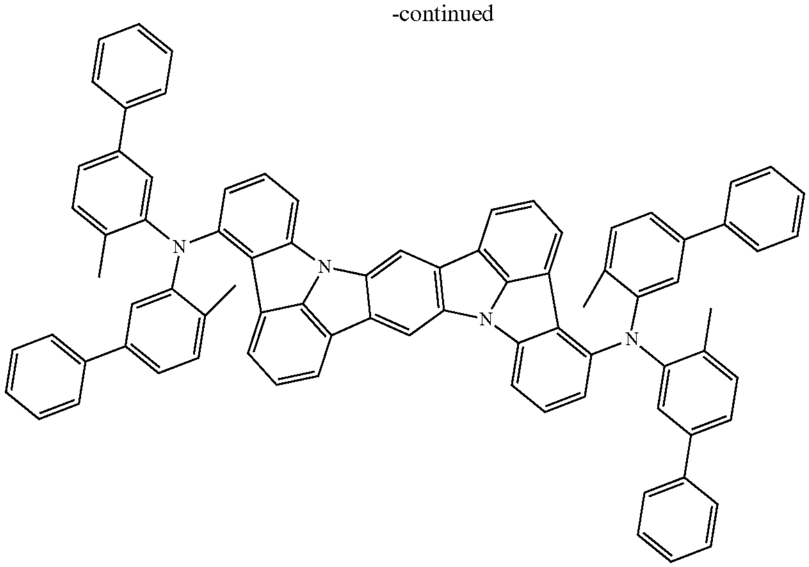
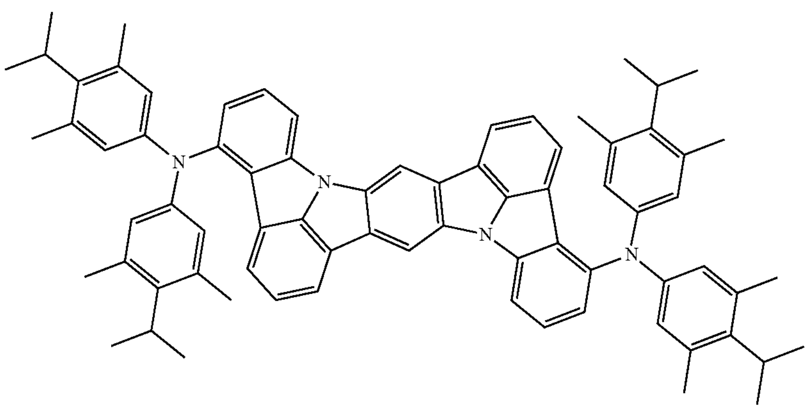
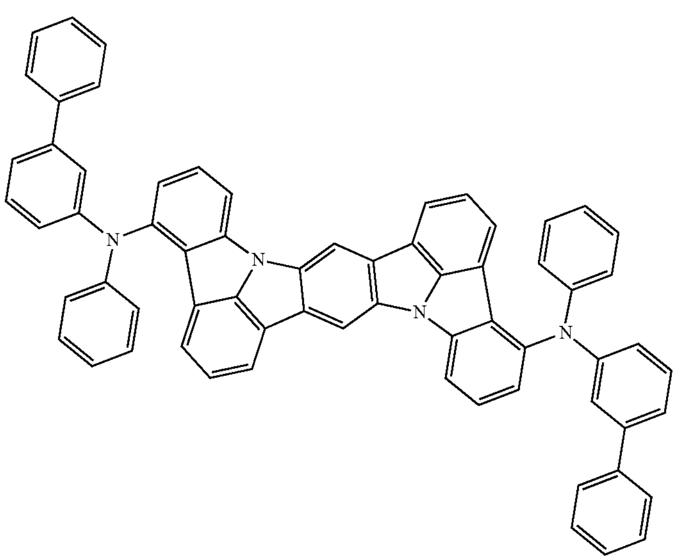

[Formula 178]
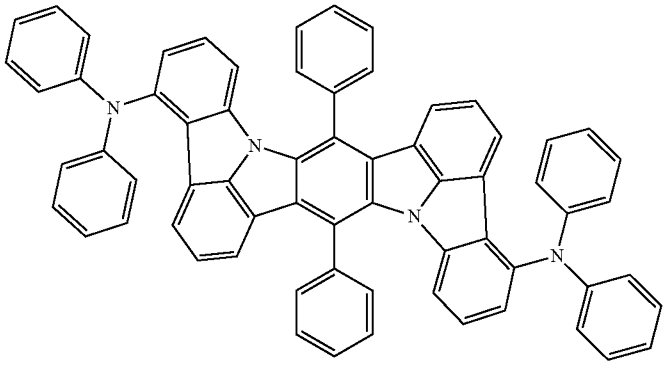
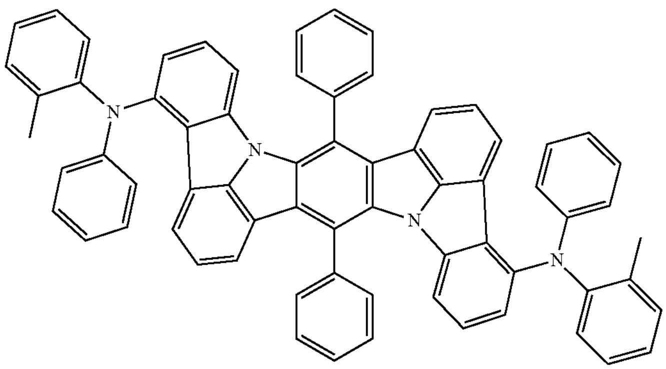
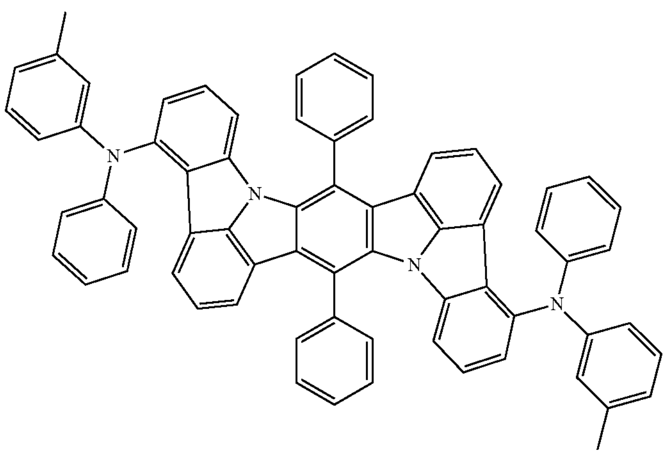
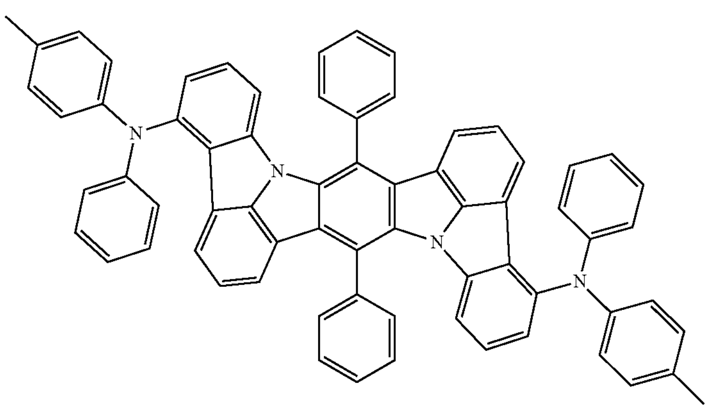

-continued
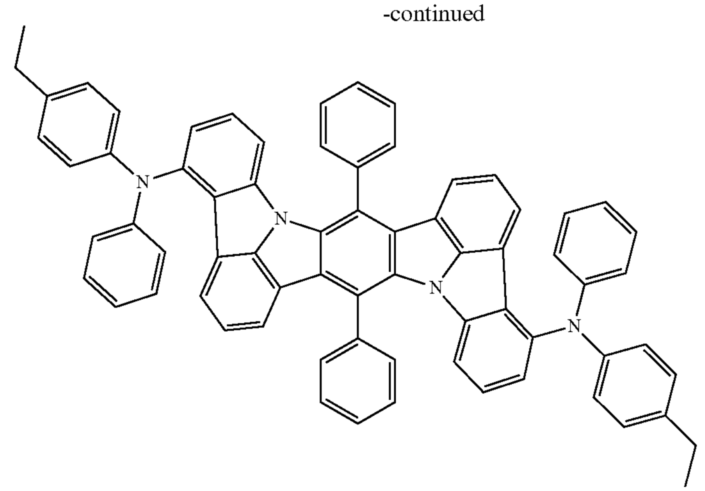
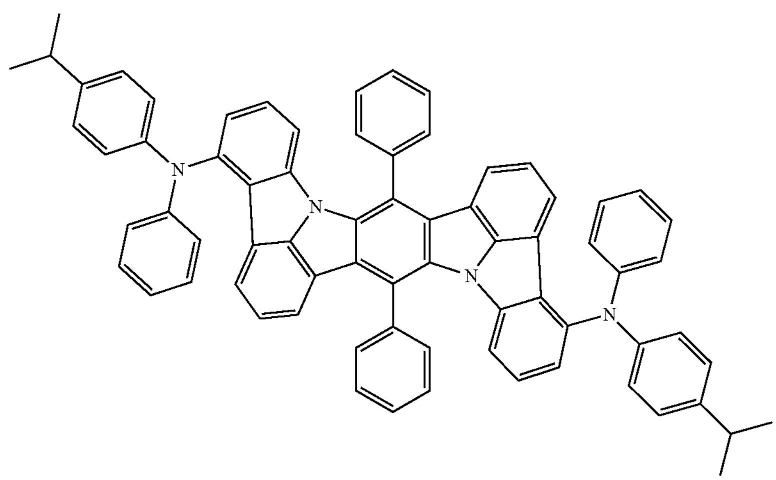
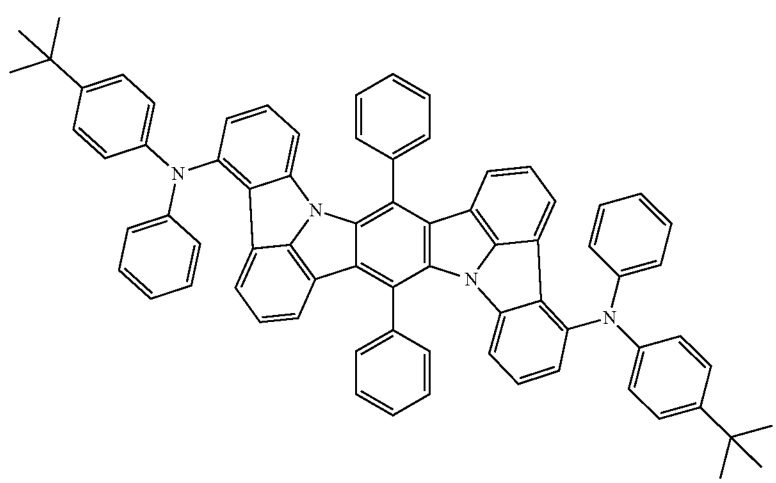

-continued
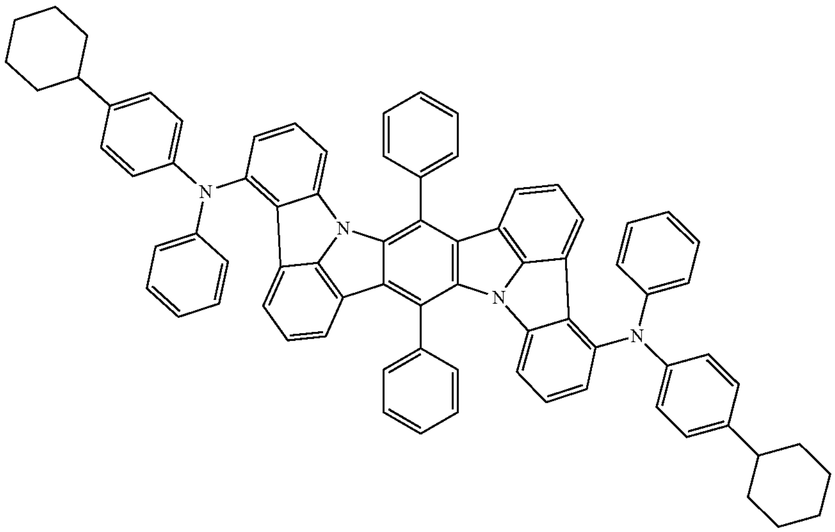
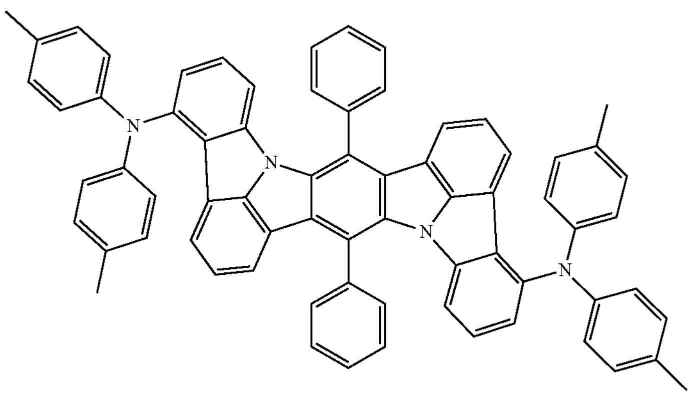
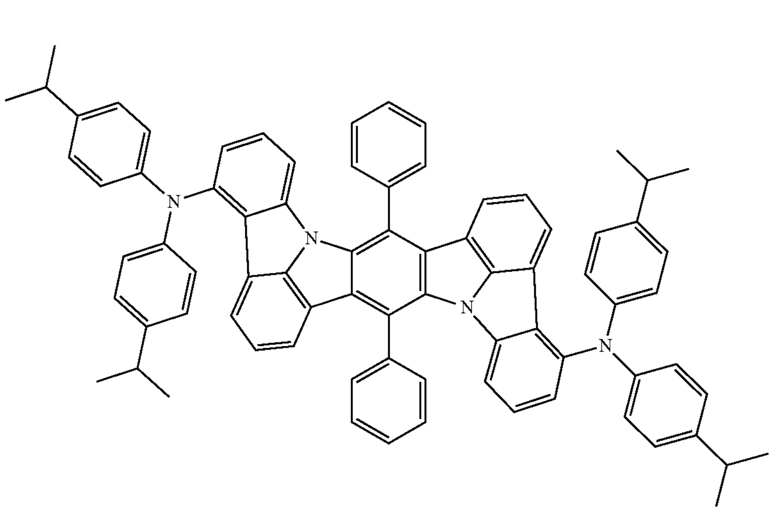

-continued
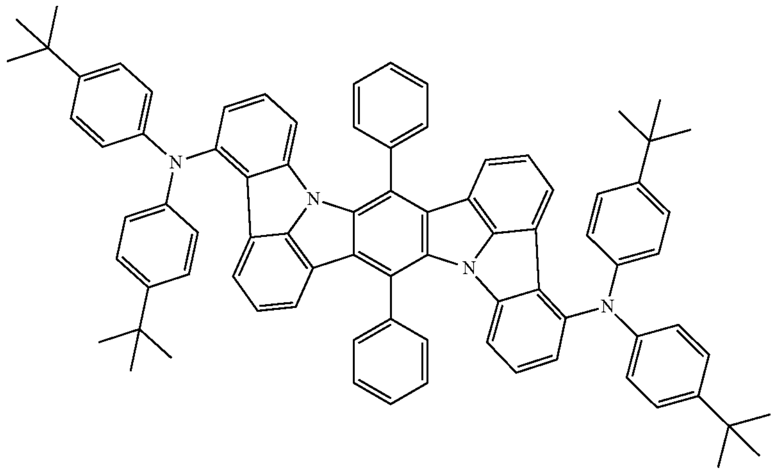
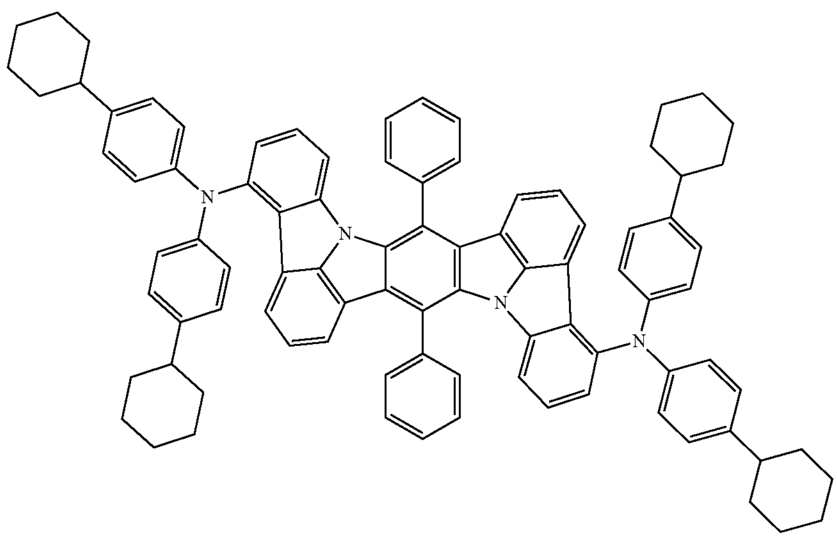
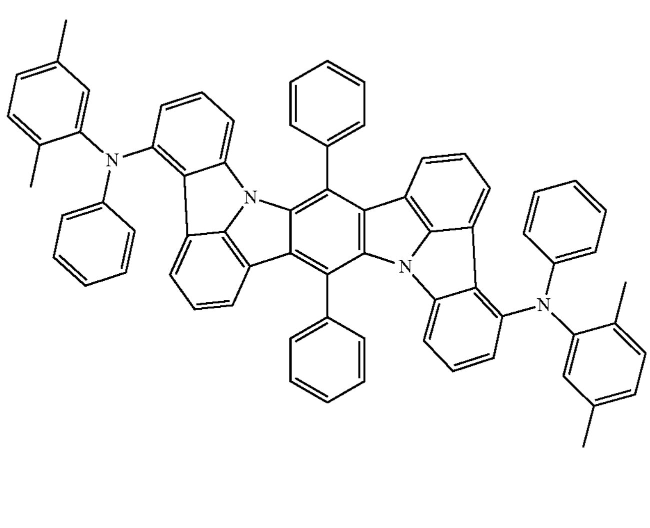

-continued
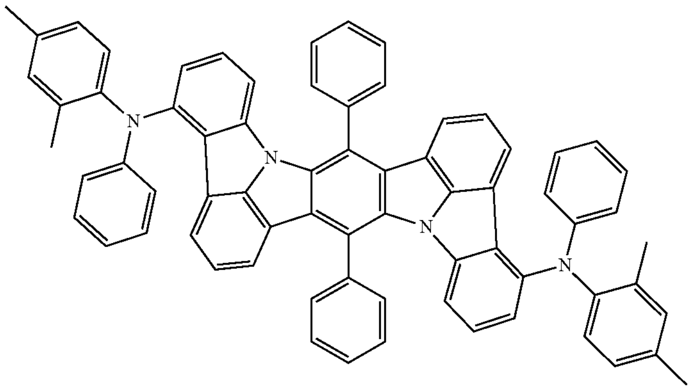
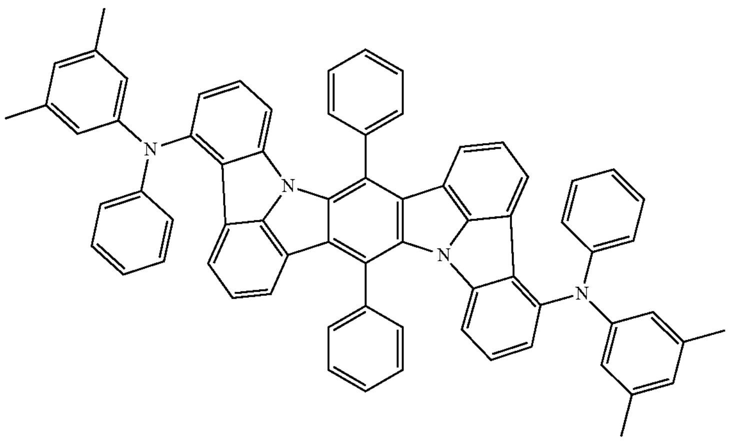
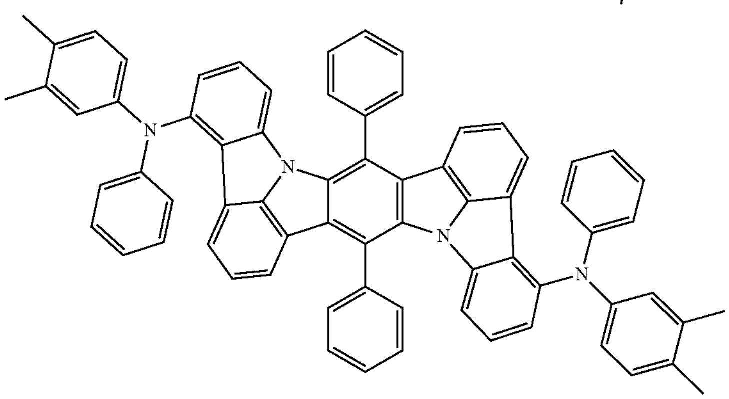
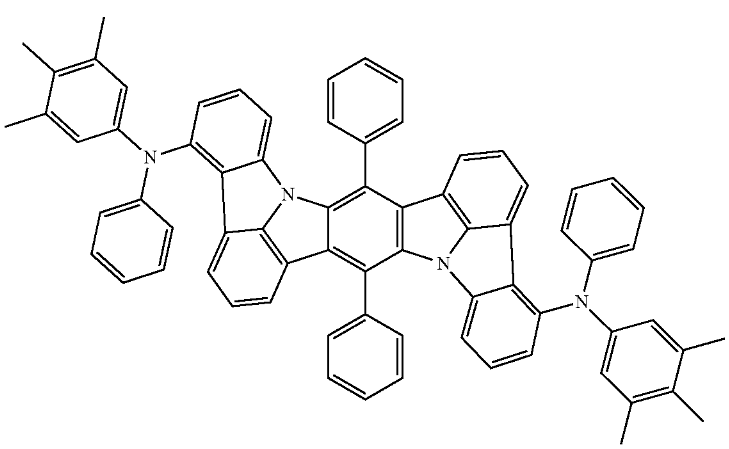

-continued
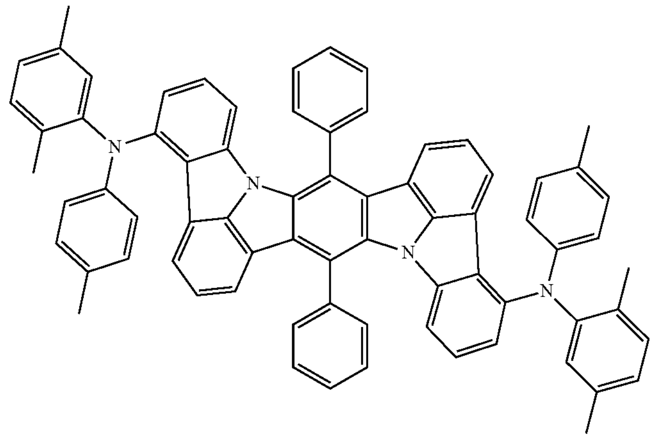
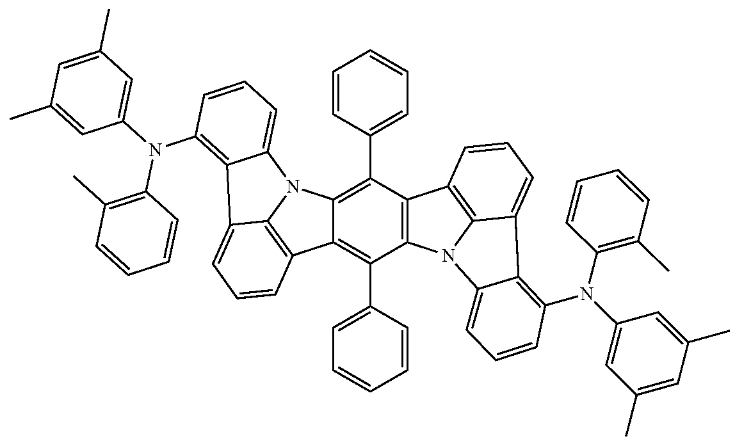
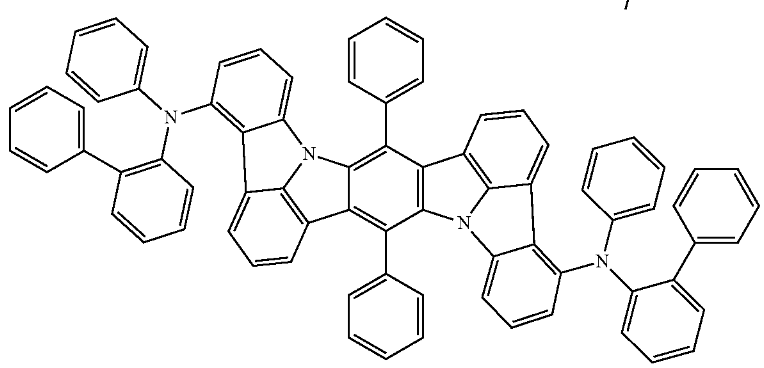
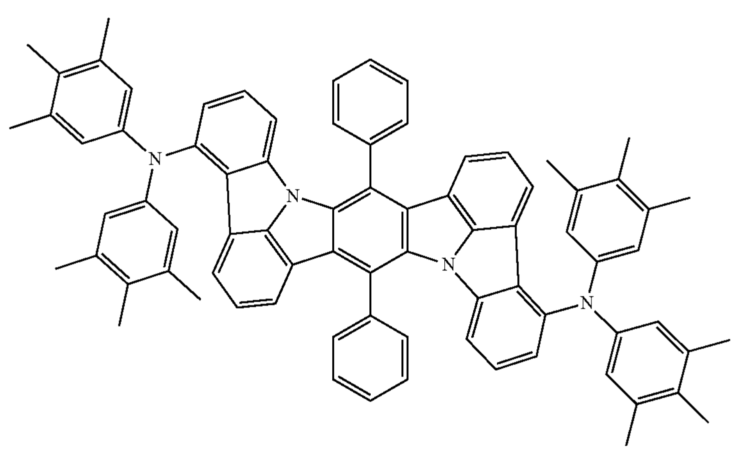

-continued
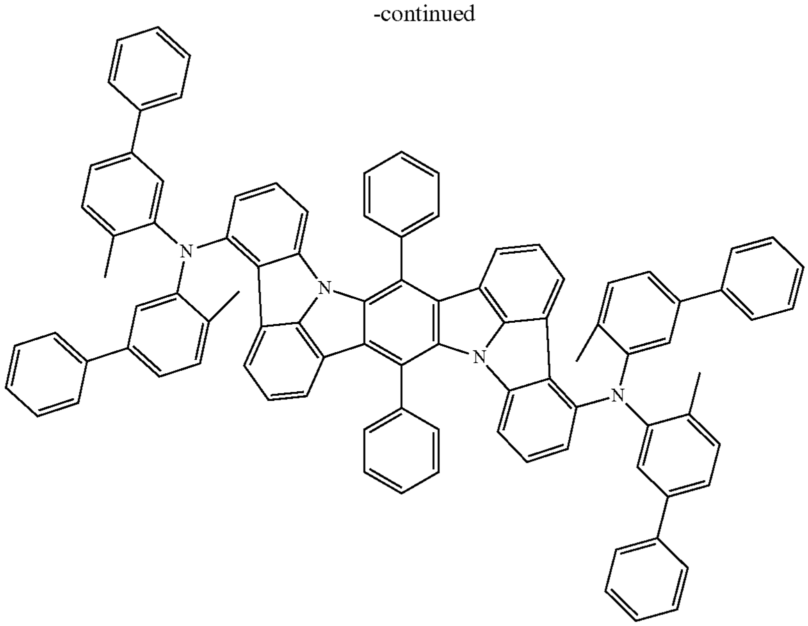
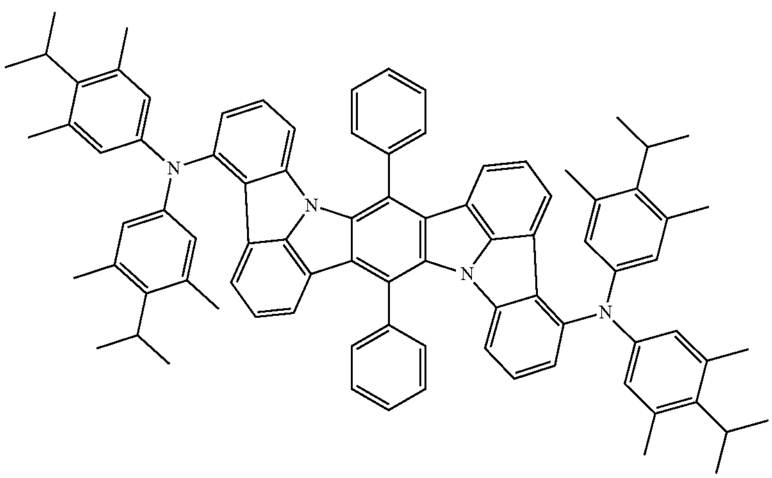
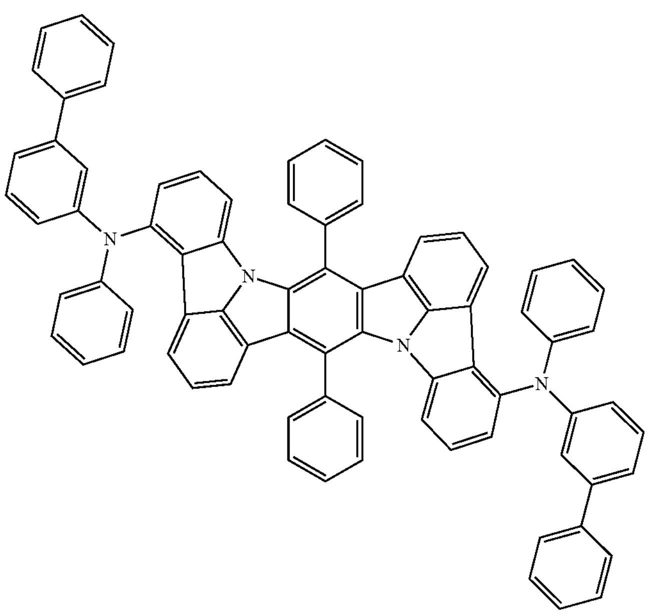

[Formula 179]
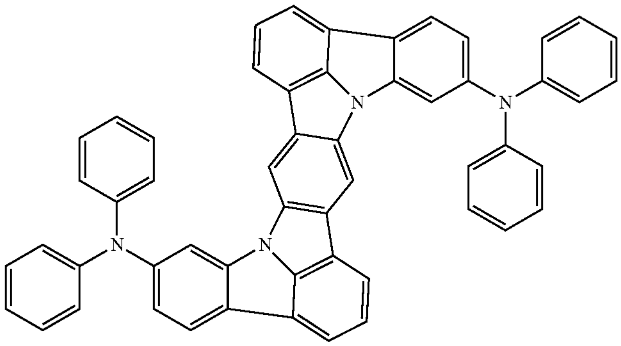
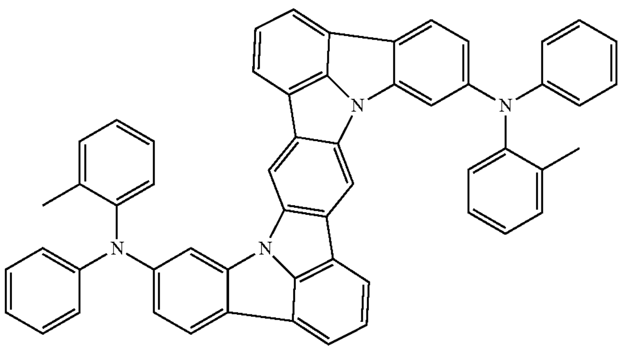
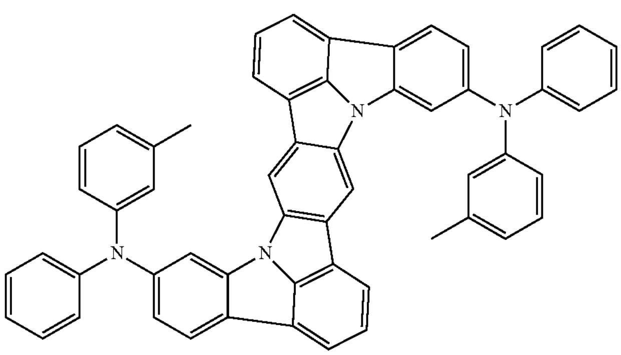
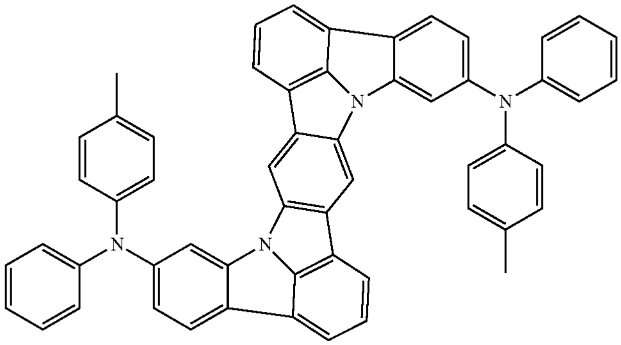

-continued
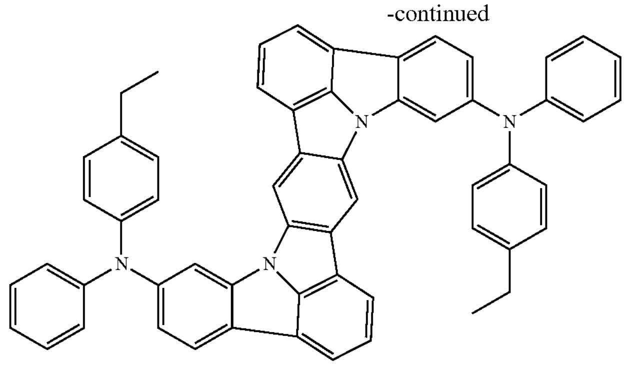
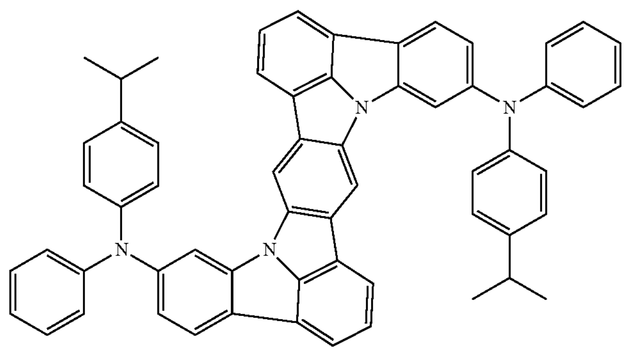
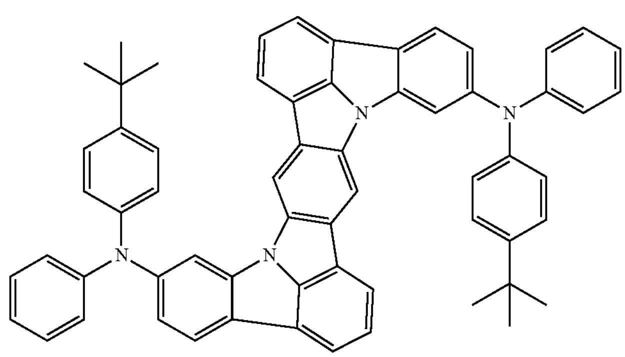
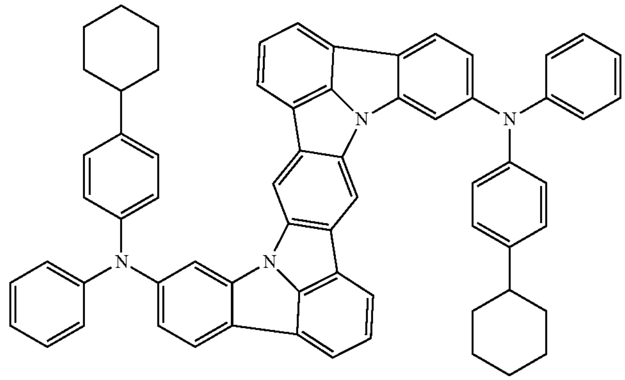

-continued
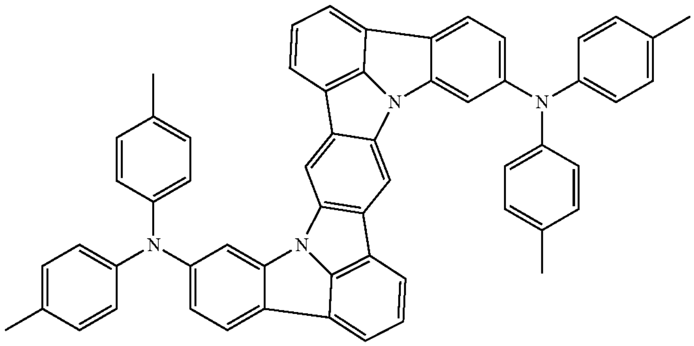
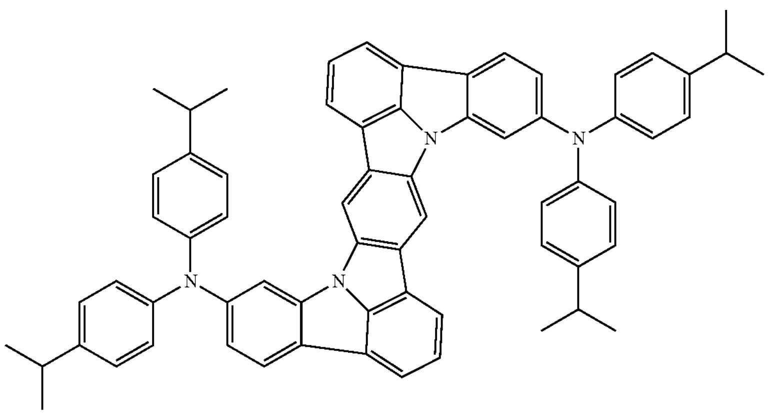
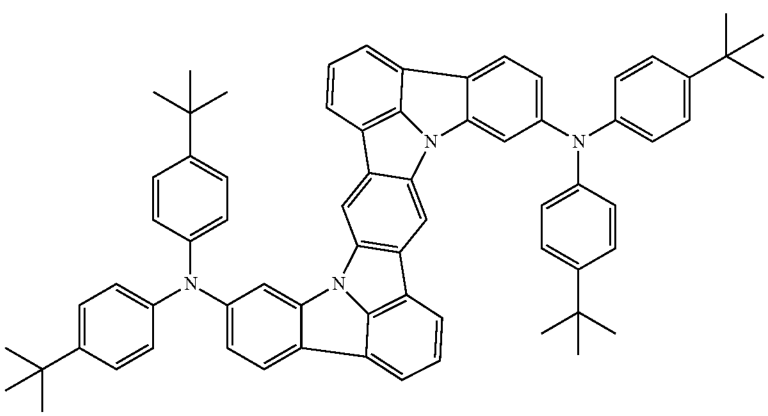
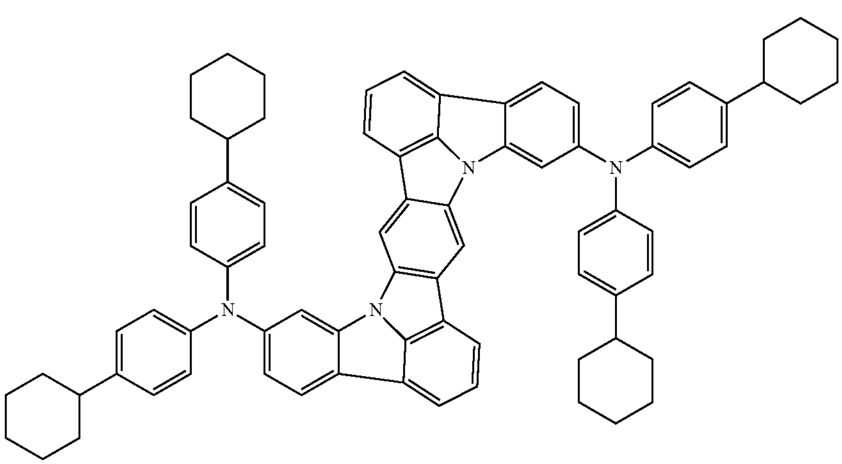

-continued
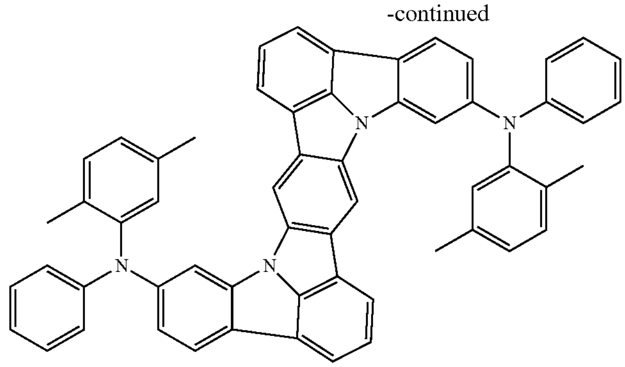
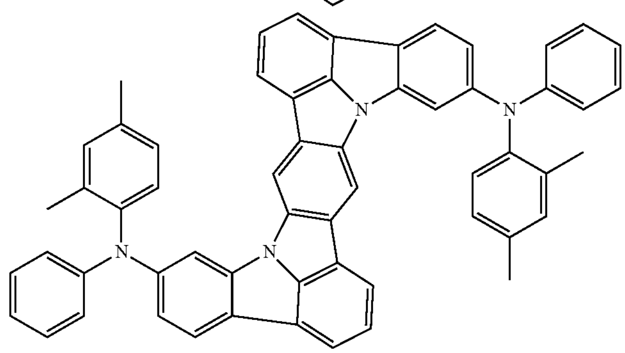
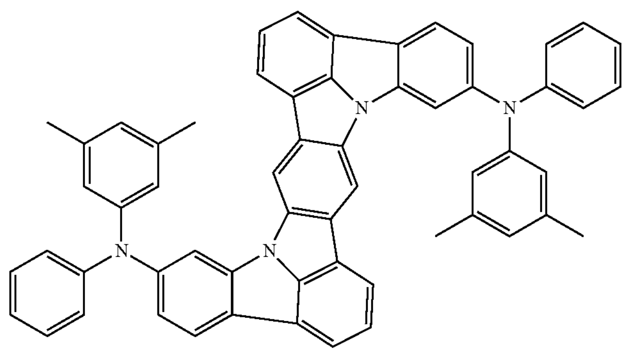
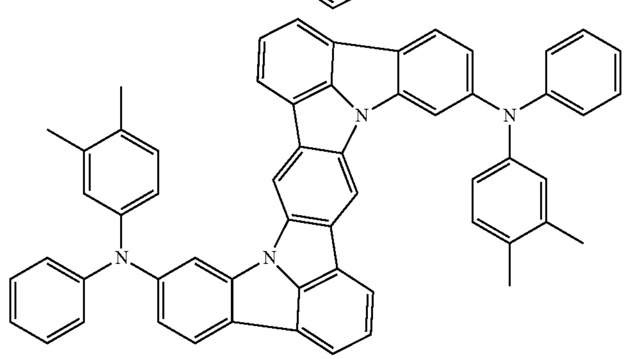
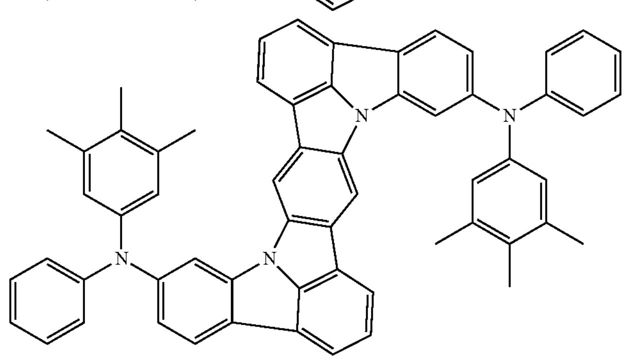

-continued
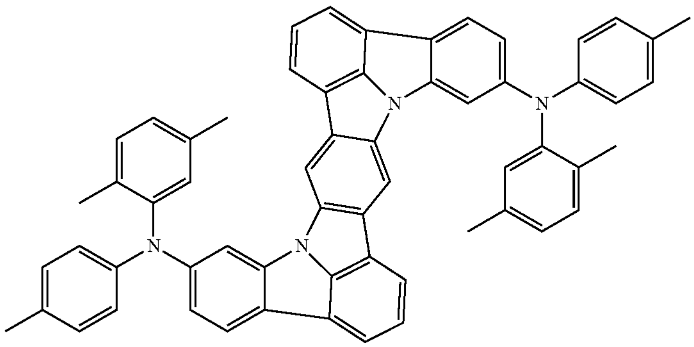
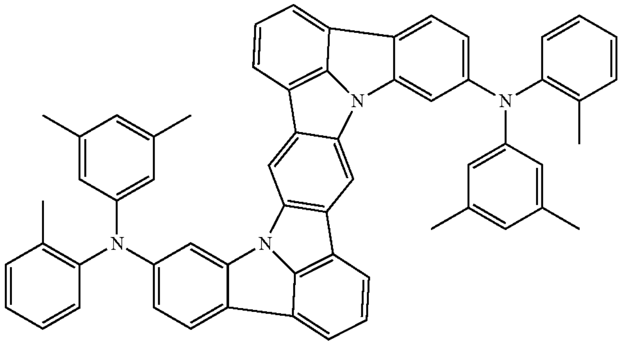
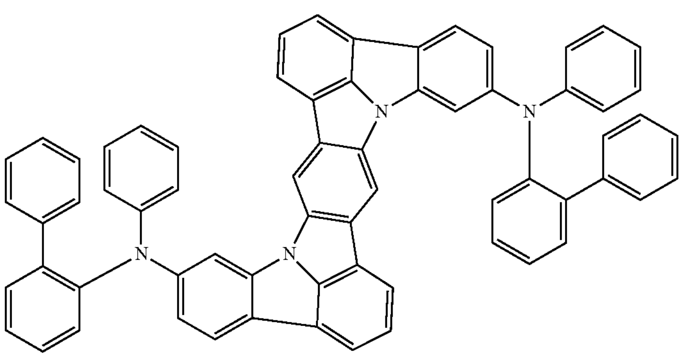
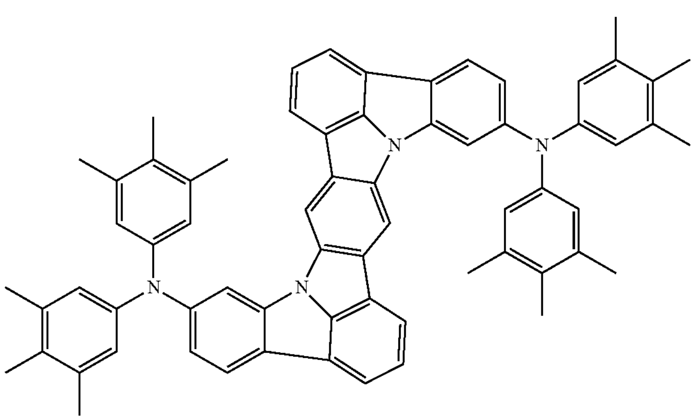

-continued
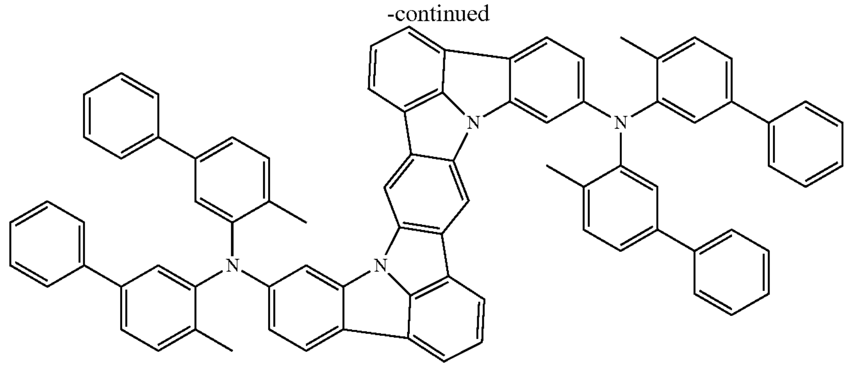
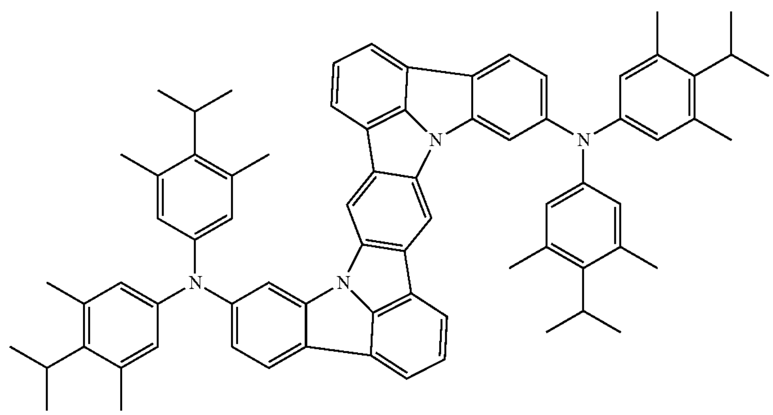
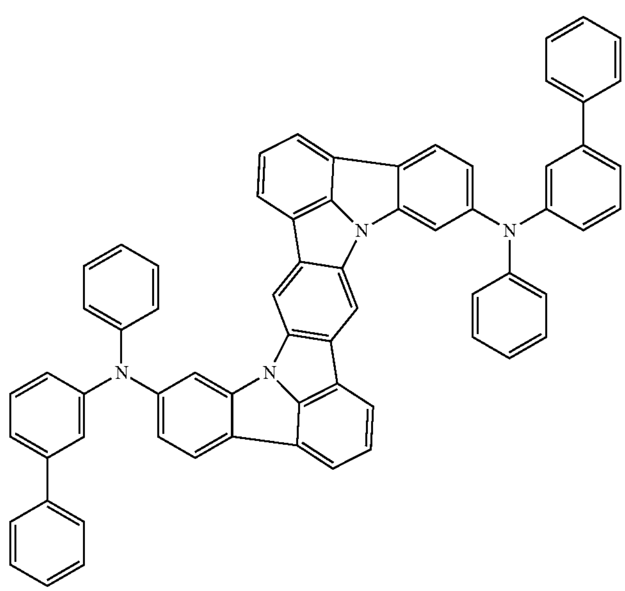 [SMILES: c1ccc(-c2cccc(N(c3ccccc3)c3ccc4c5cccc6c7cc8c(cc7n(c4c3)c56)c3cccc4c5ccc(N(c6ccccc6)c6cccc(-c7ccccc7)c6)cc5n8c43)c2)cc1]

[Formula 180]
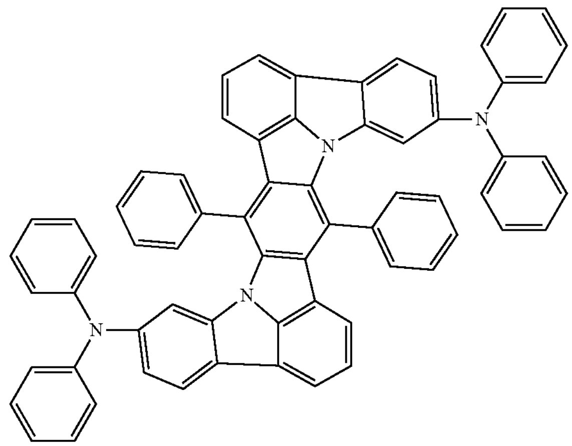
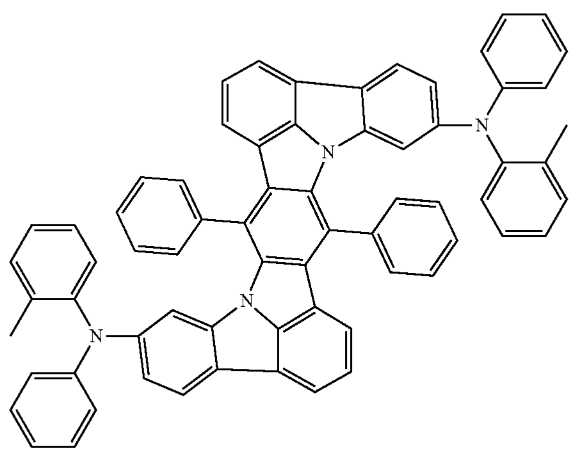
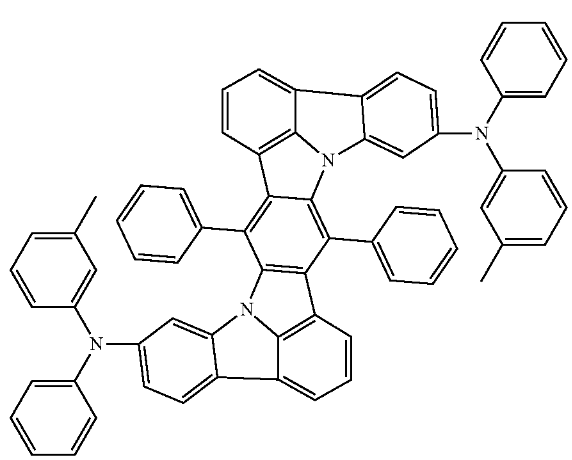

-continued
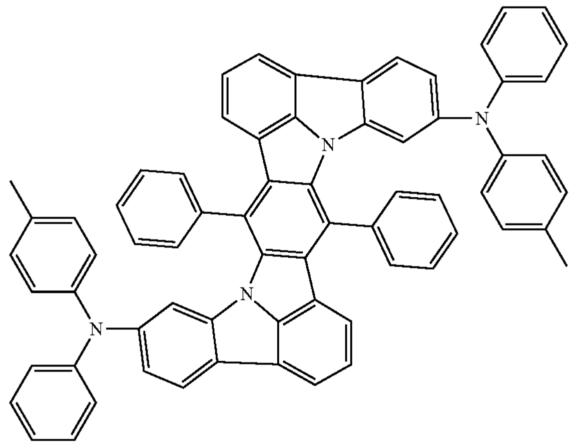
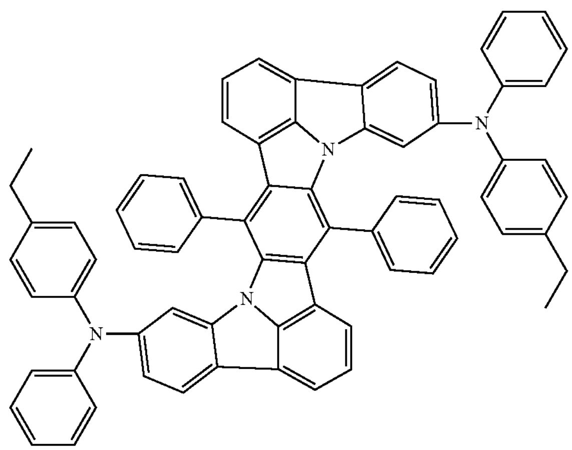
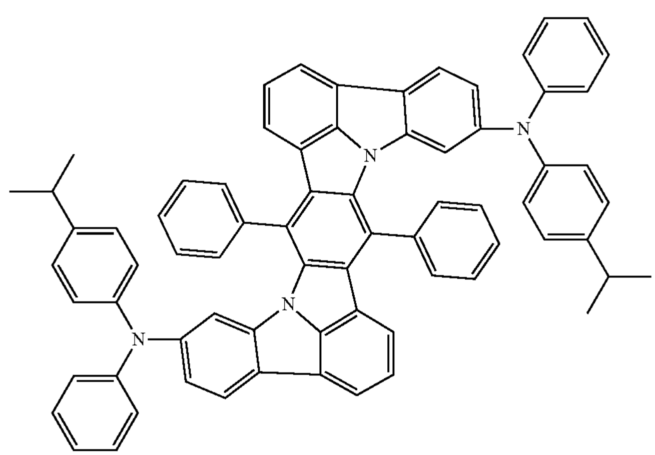

-continued
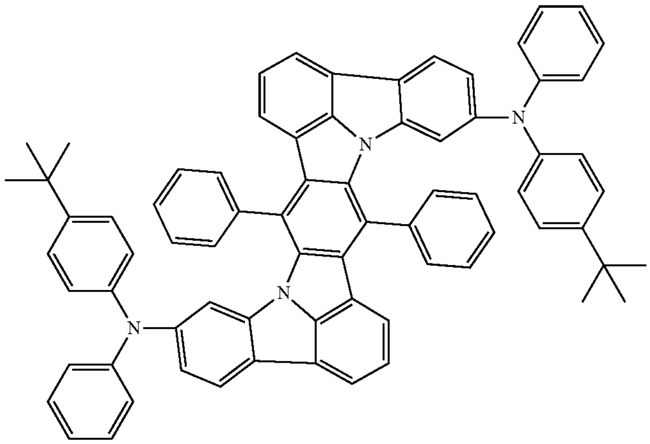
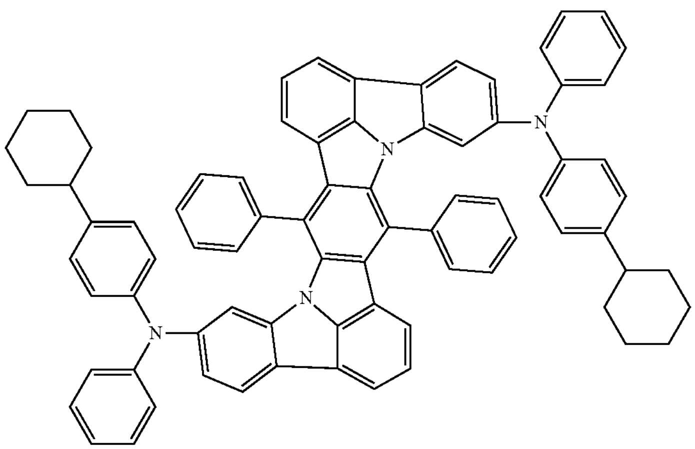
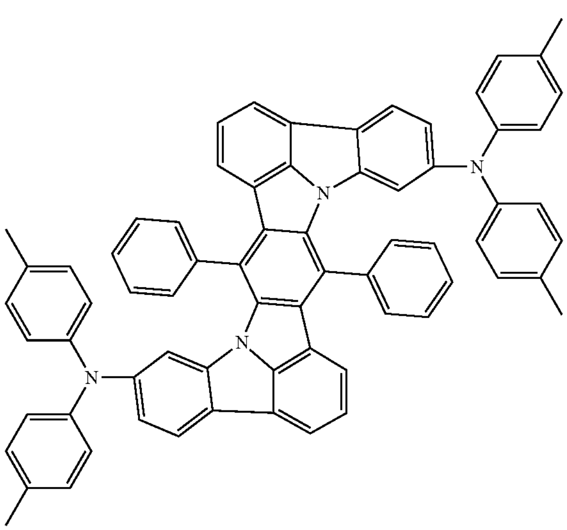

-continued
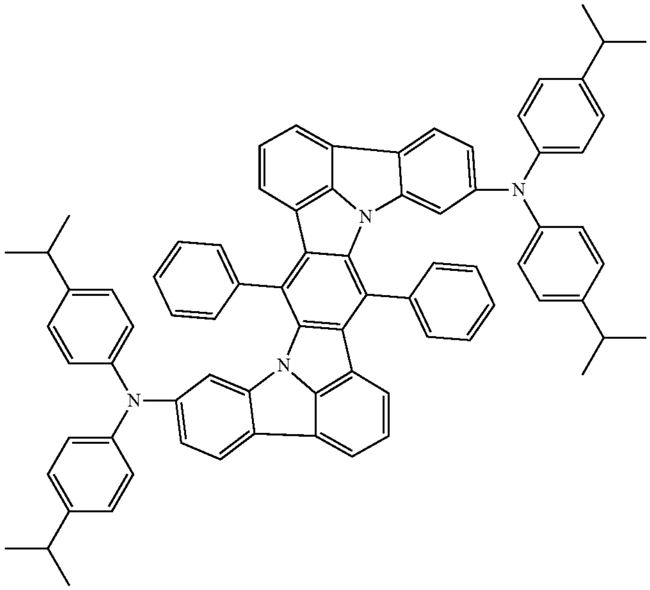
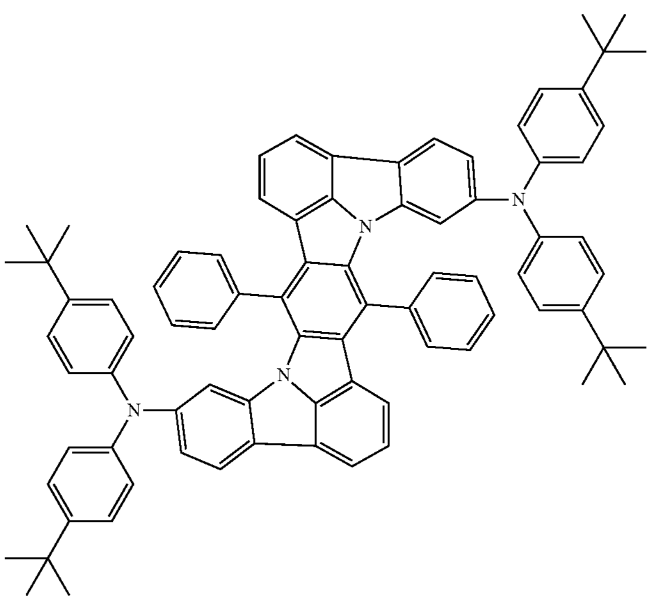

-continued
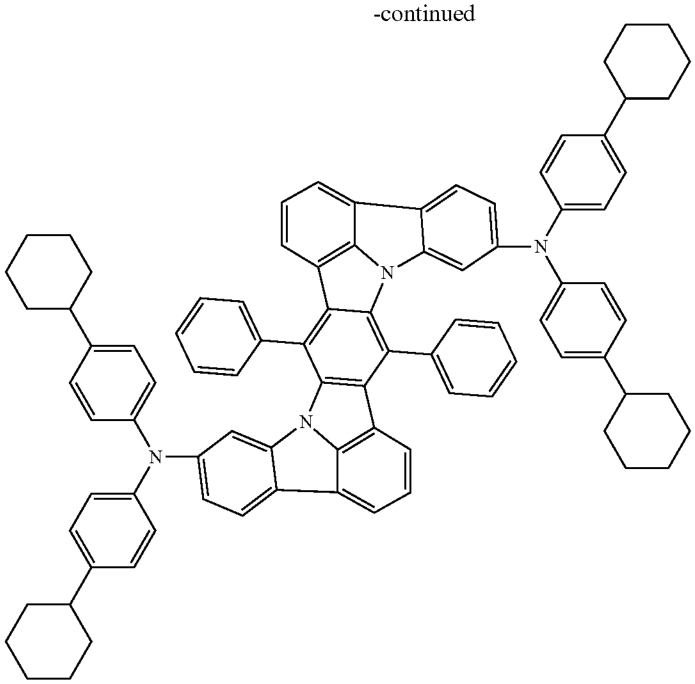
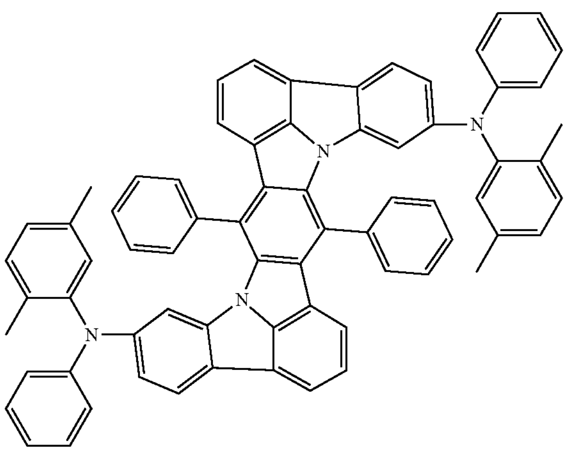
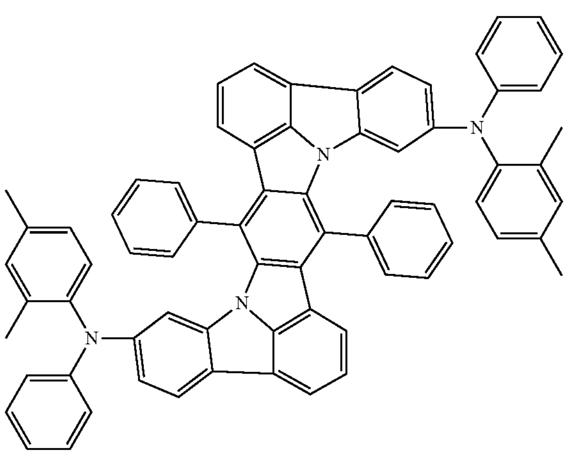

-continued
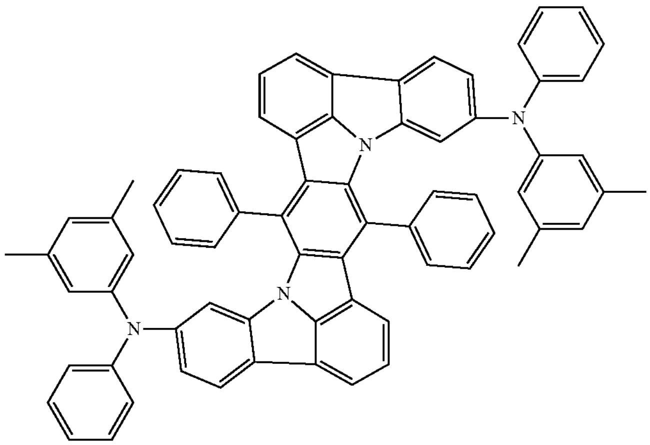
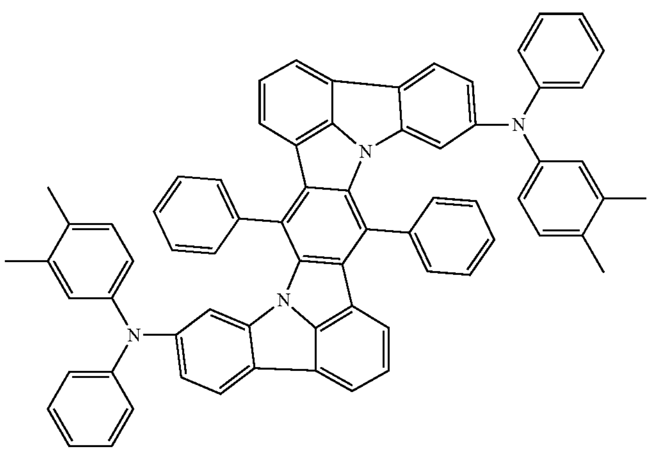
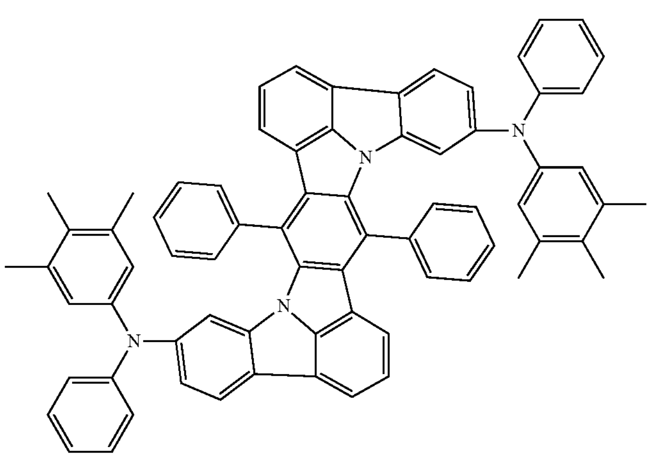

-continued
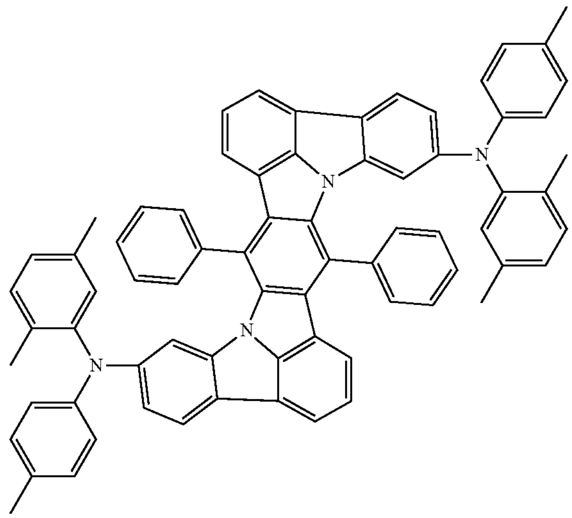
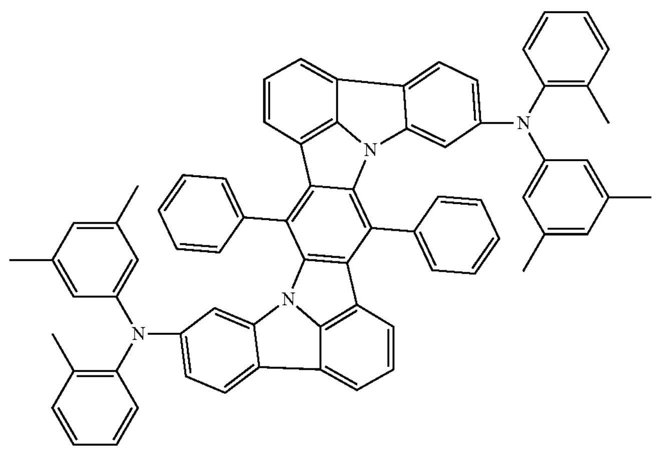
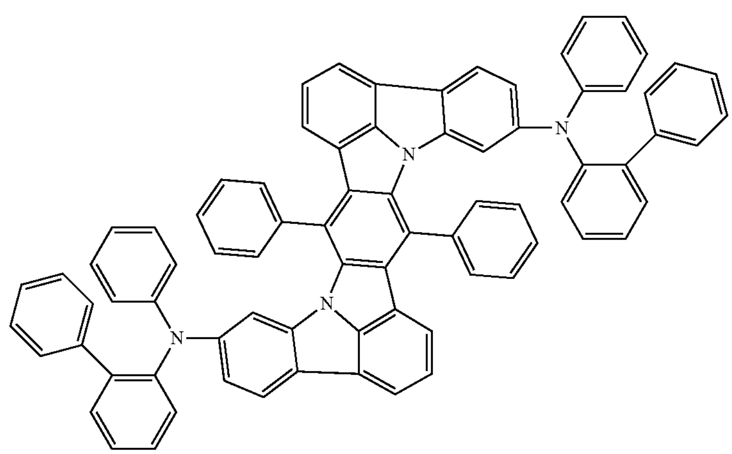

-continued
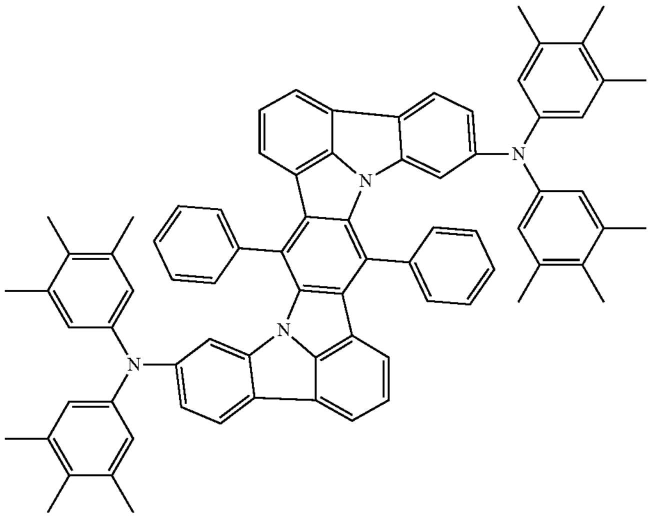
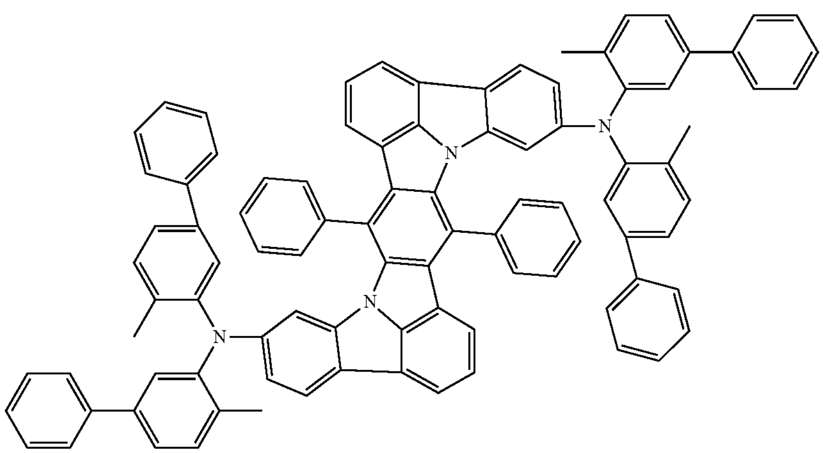
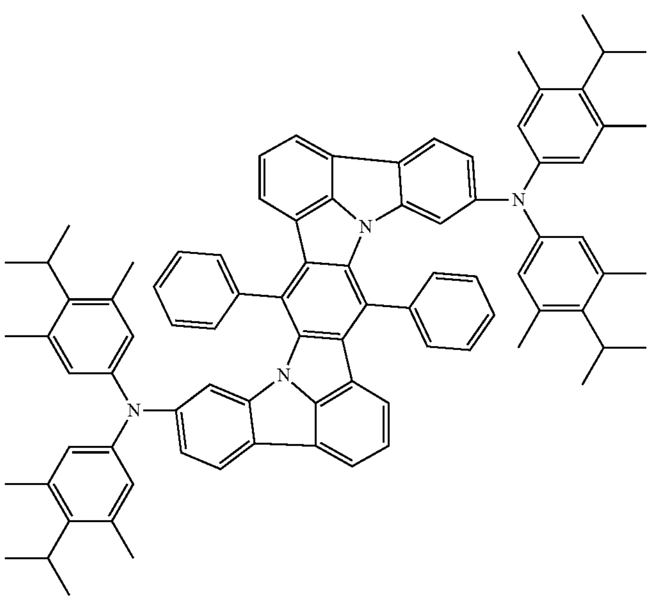

-continued
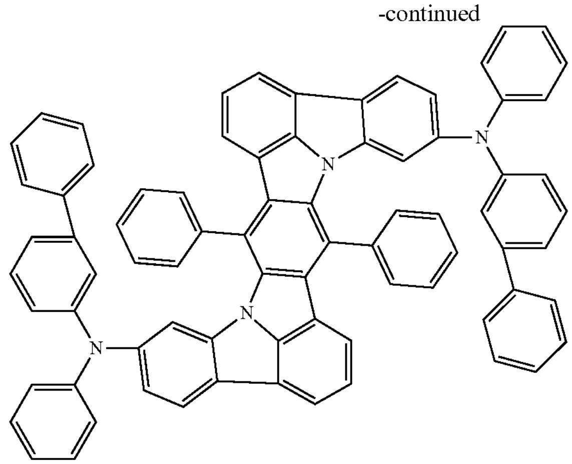
[Formula 181]
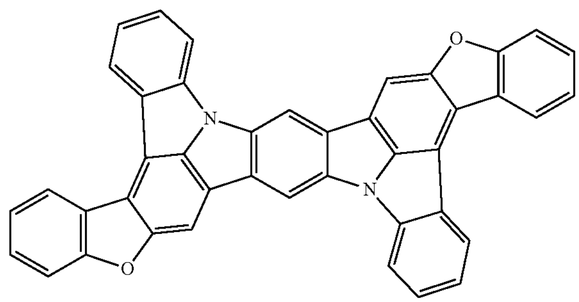
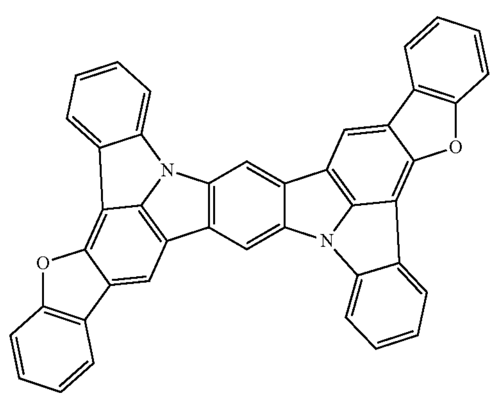
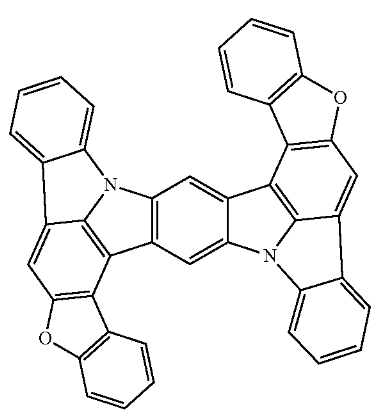
-continued
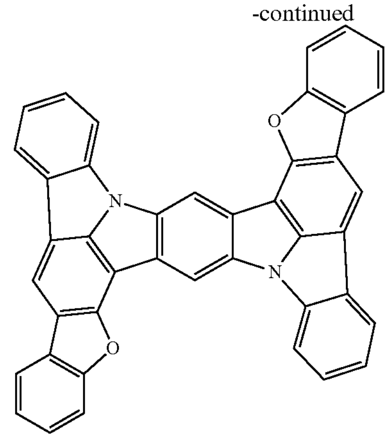
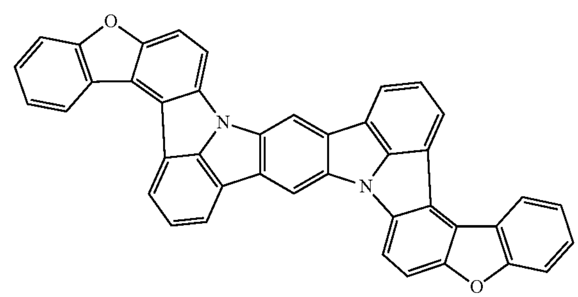
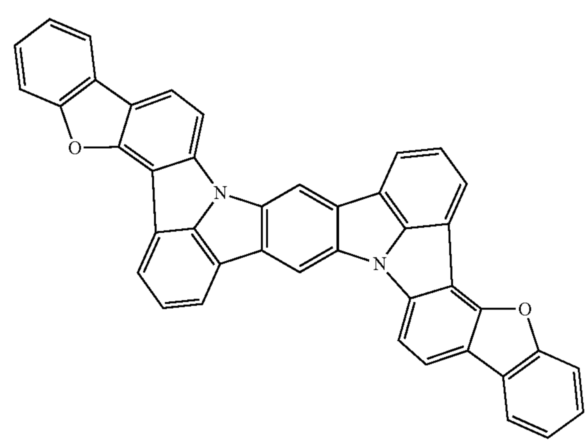

-continued
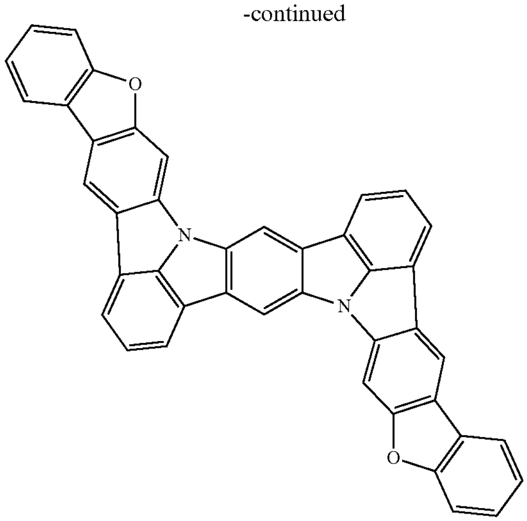
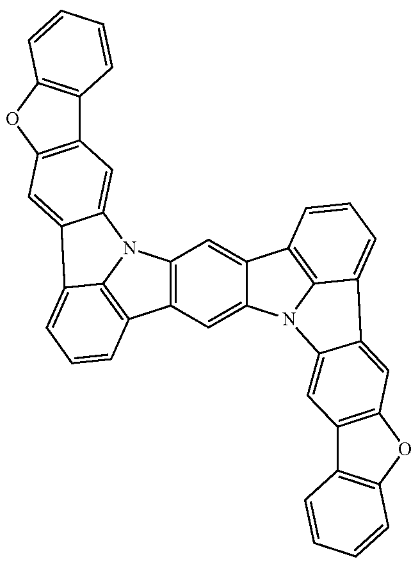
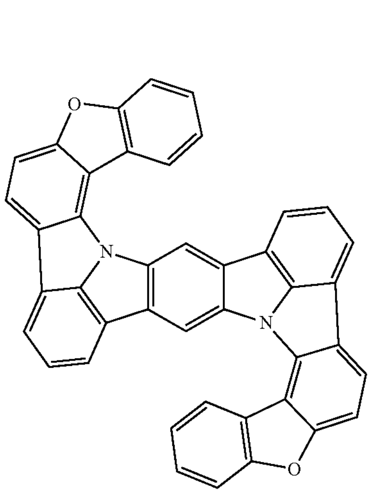
-continued
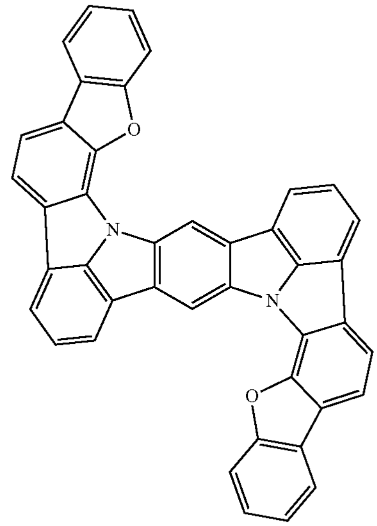
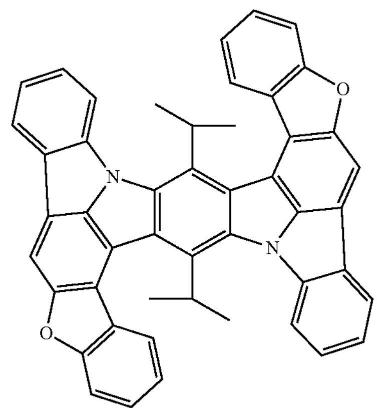
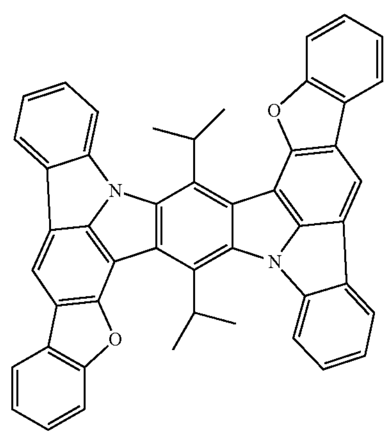
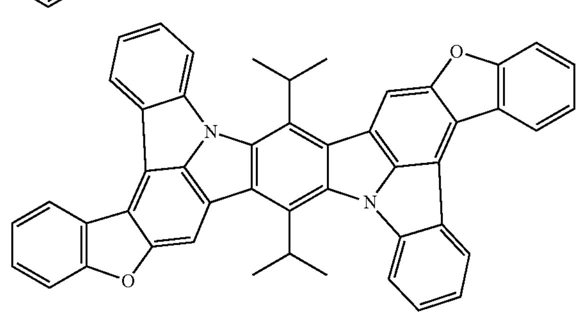

-continued
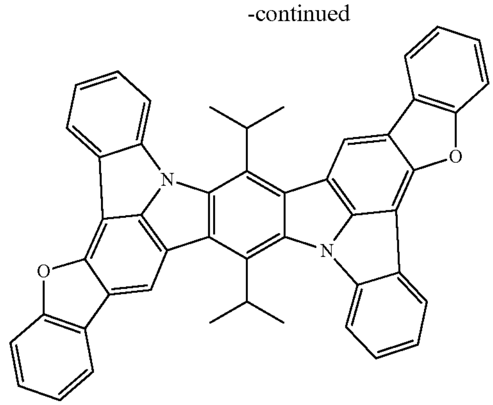
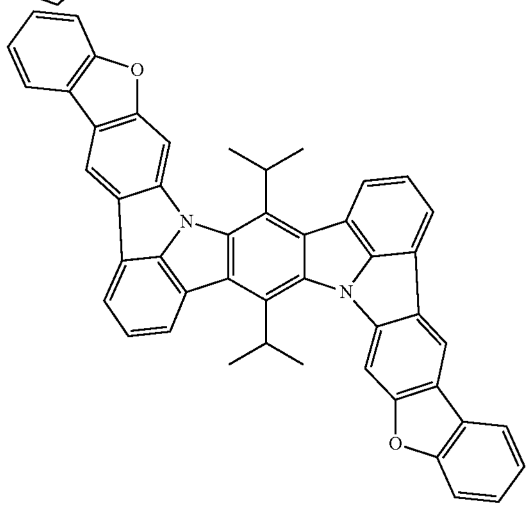
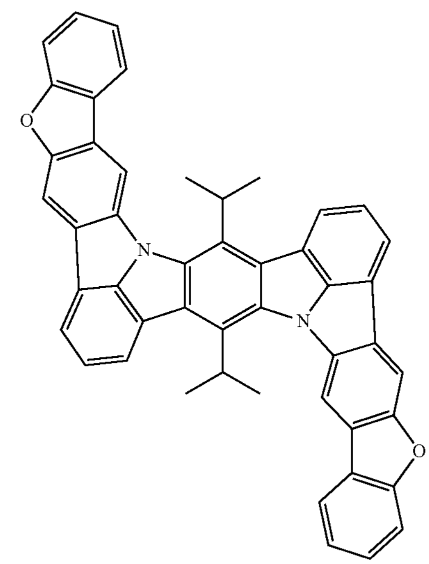
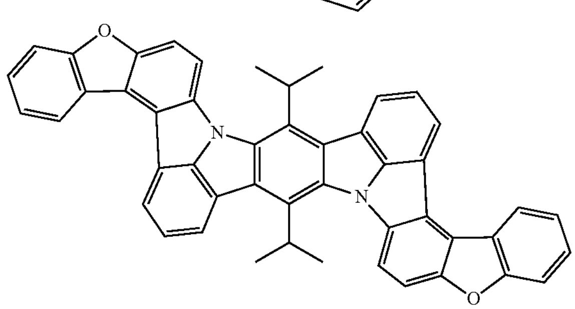
-continued
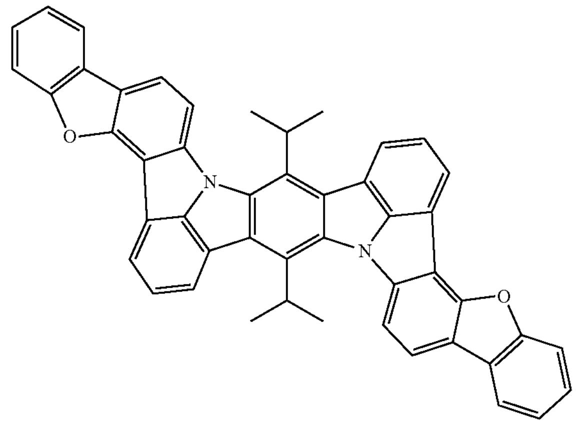
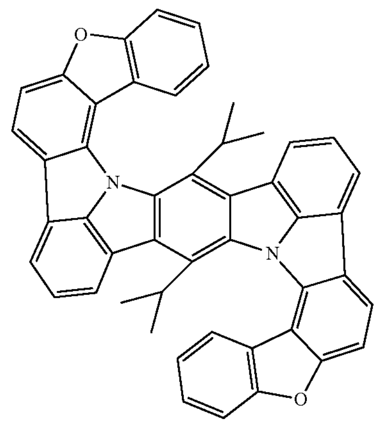
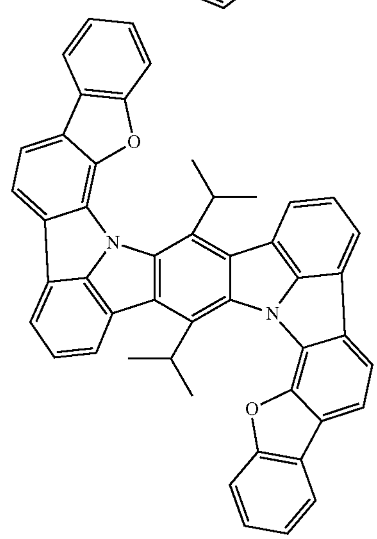
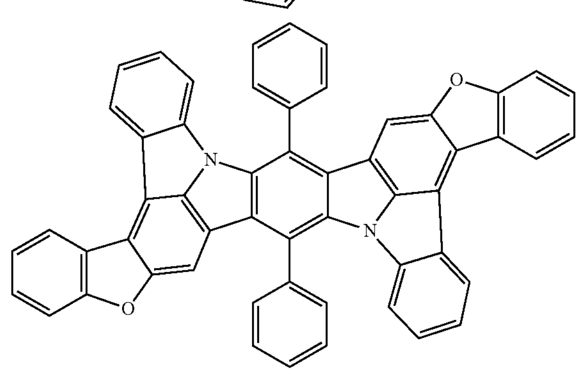

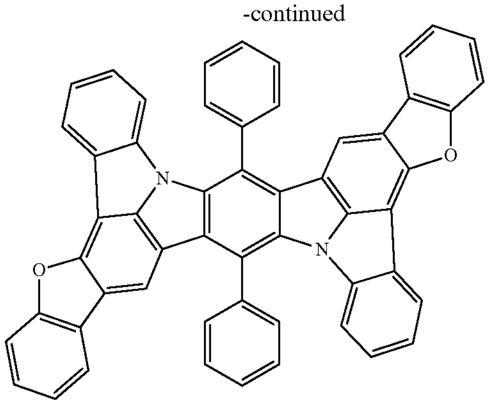
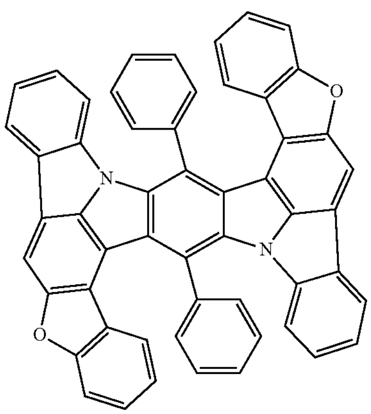
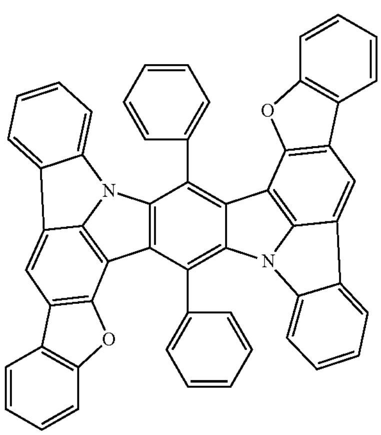
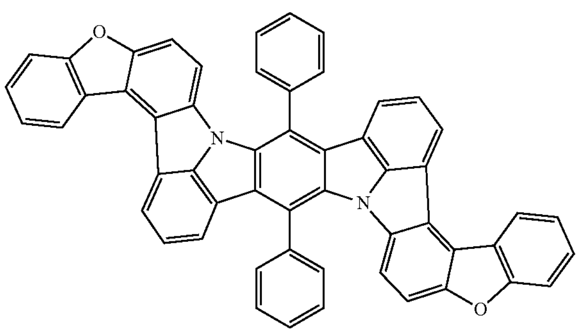
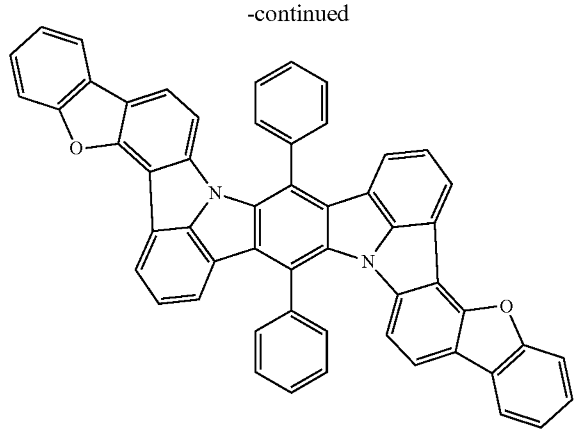
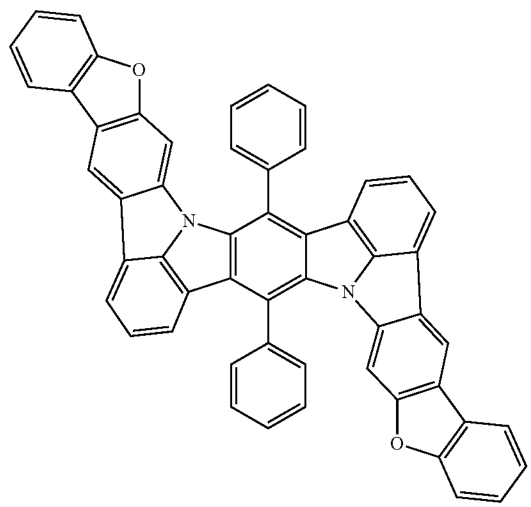
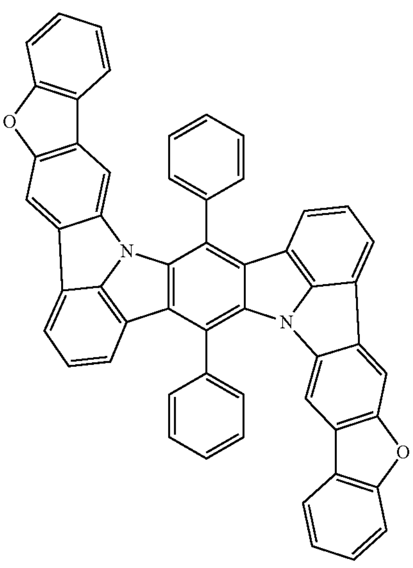 [SMILES: c1ccc(-c2c3c4cccc5c6cc7oc8ccccc8c7cc6n(c3c(-c3ccccc3)c3c6cccc7c8cc9oc%10ccccc%10c9cc8n(c23)c76)c54)cc1]

[Formula 182]
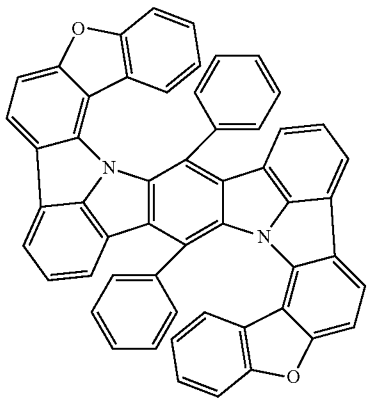
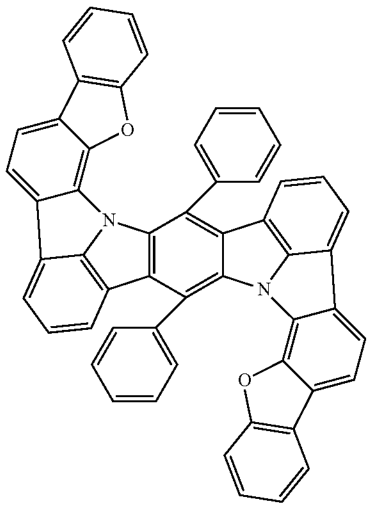
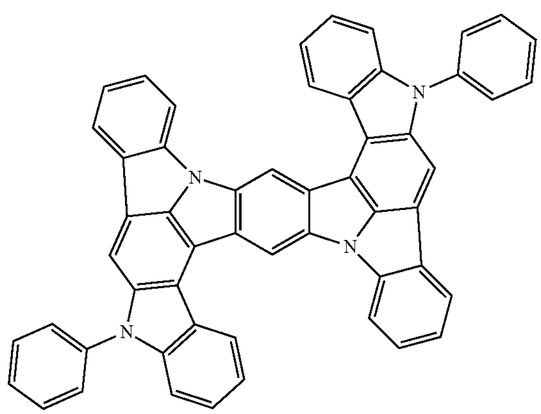
-continued
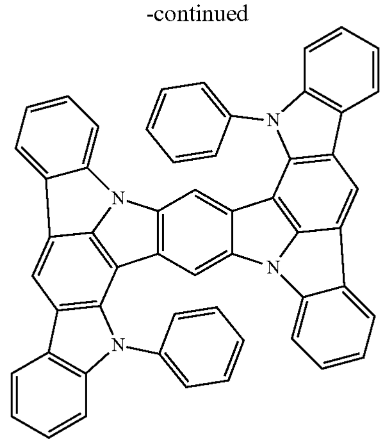
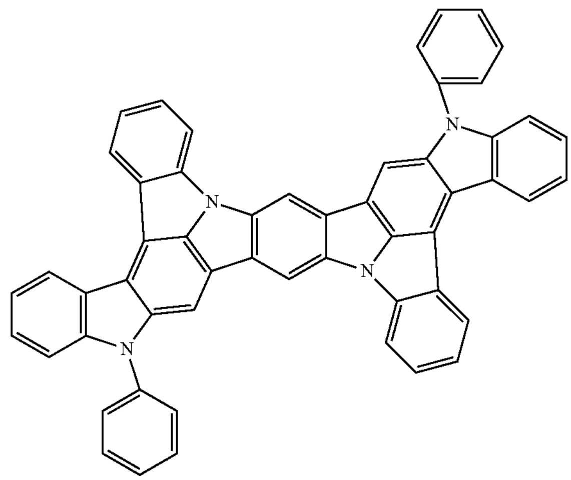
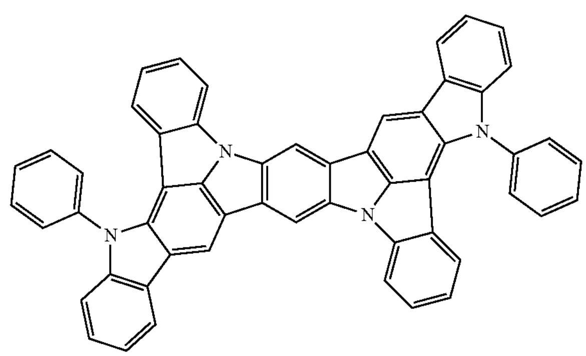

-continued
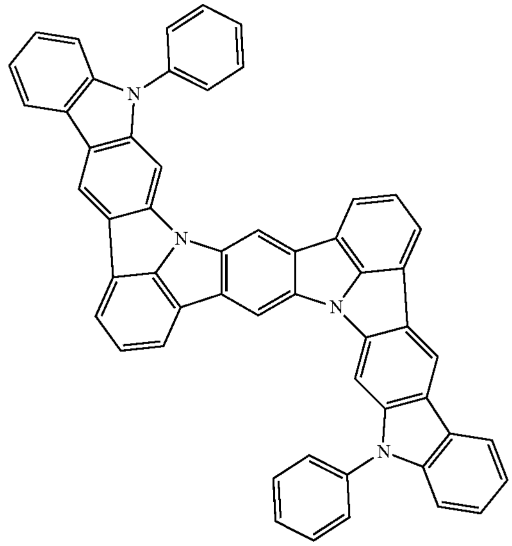
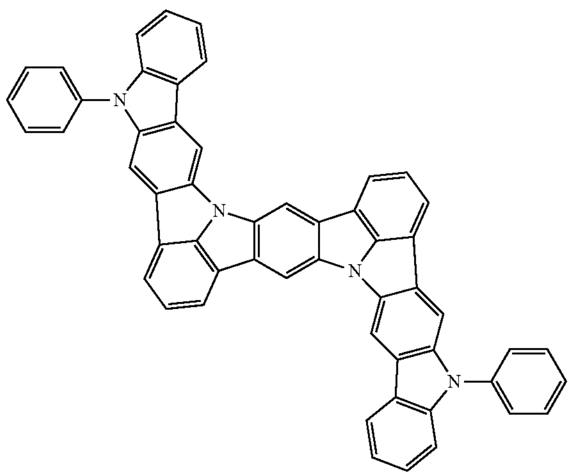
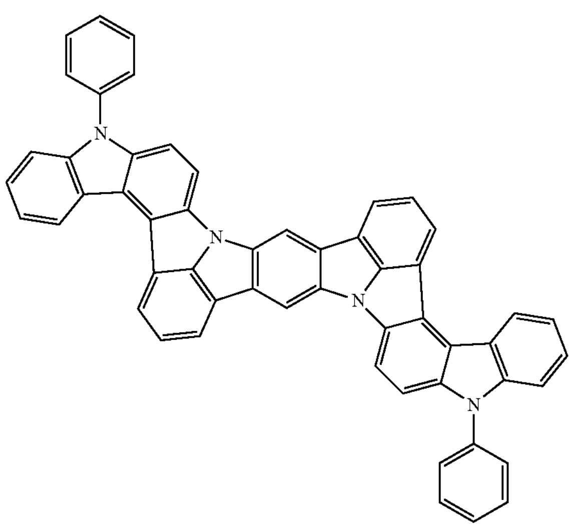
-continued
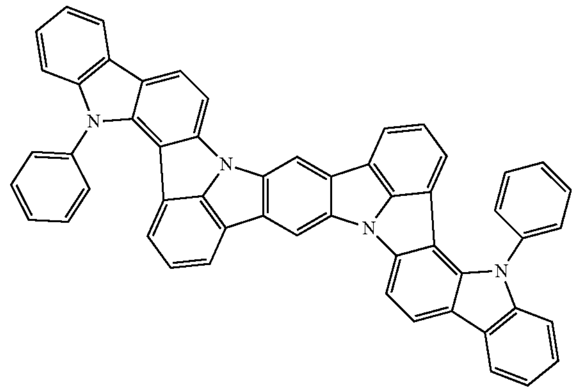
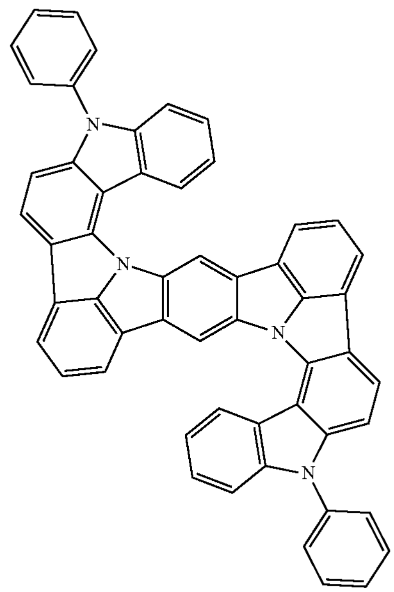
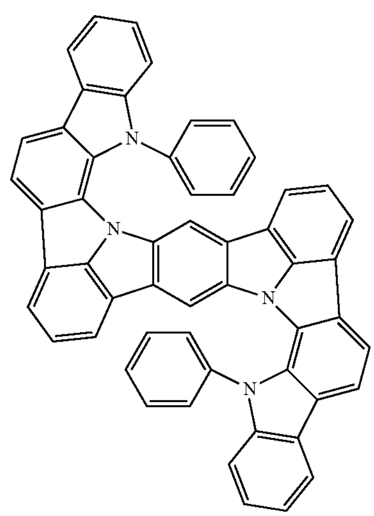

-continued
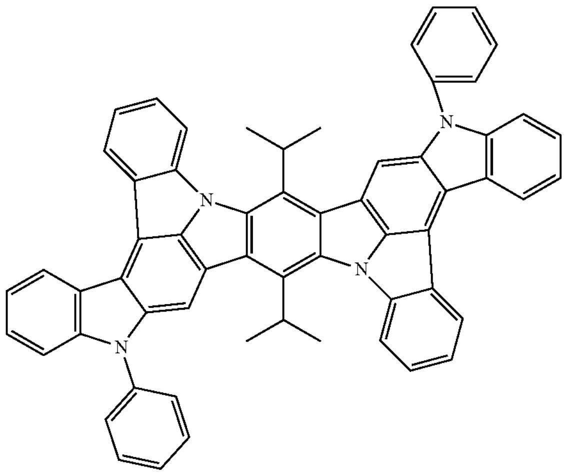
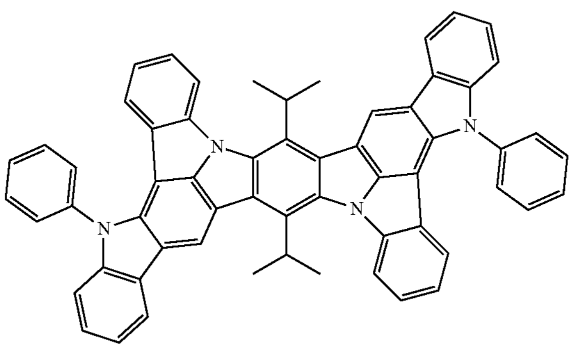
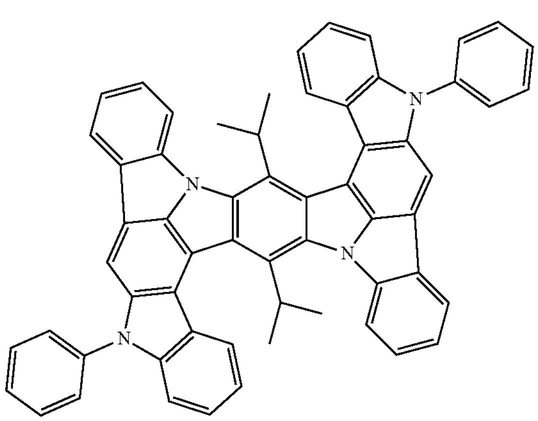
-continued
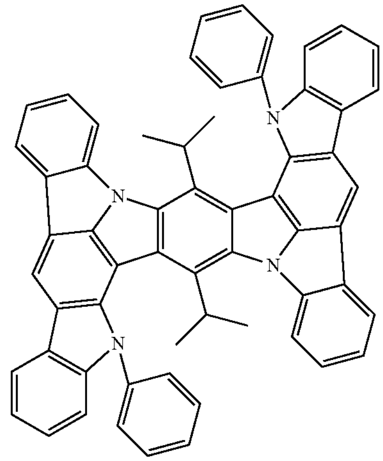
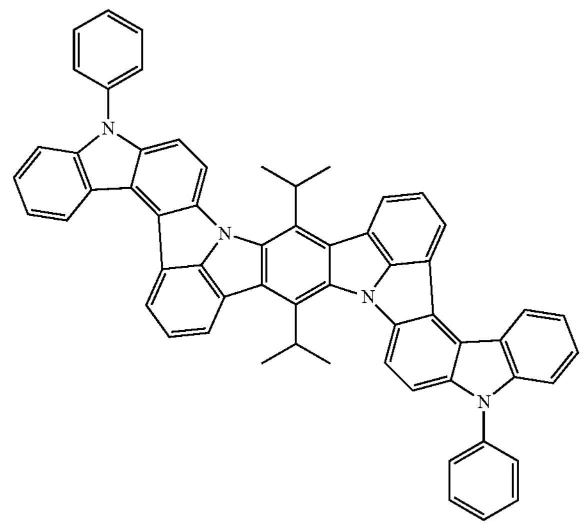
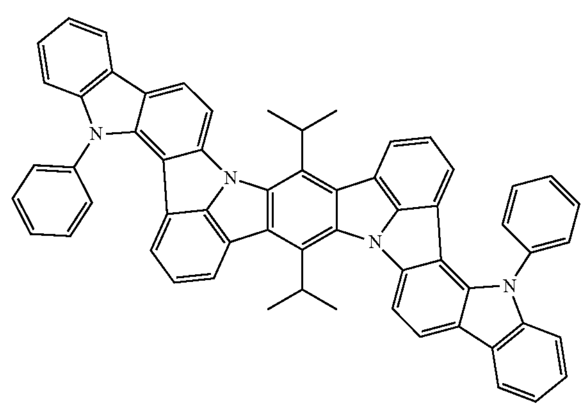

-continued
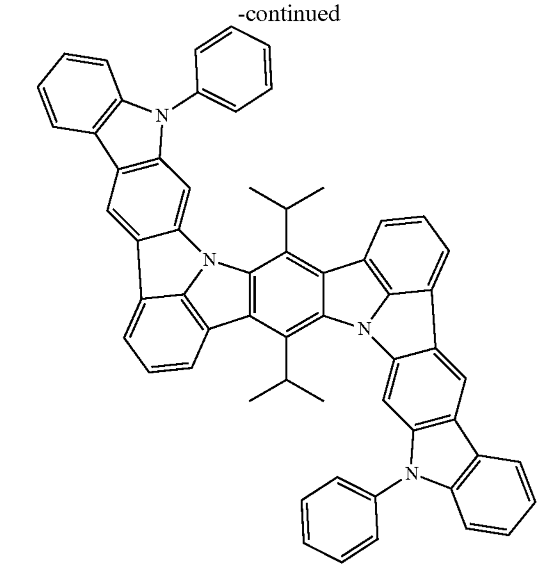
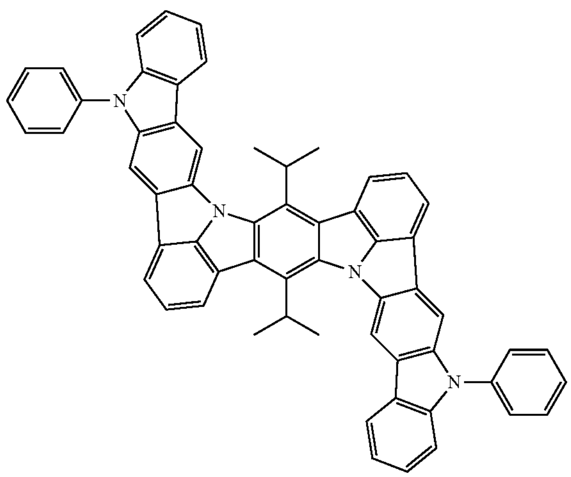
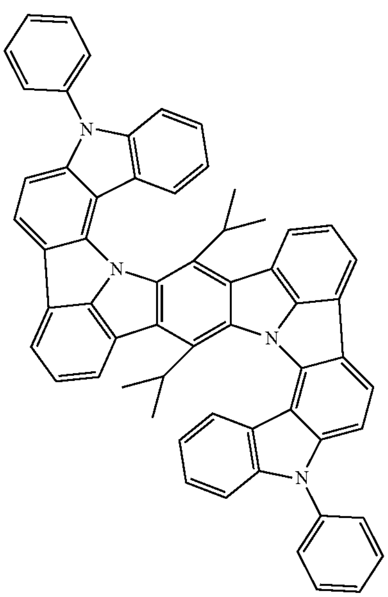
-continued
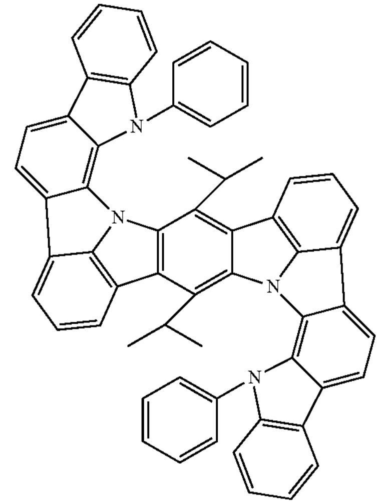
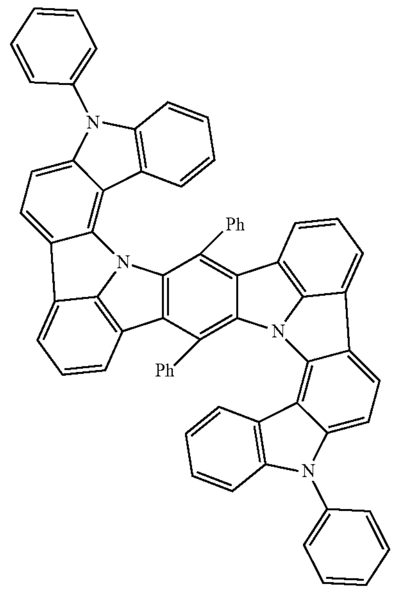
In the formula, Ph is a phenyl group
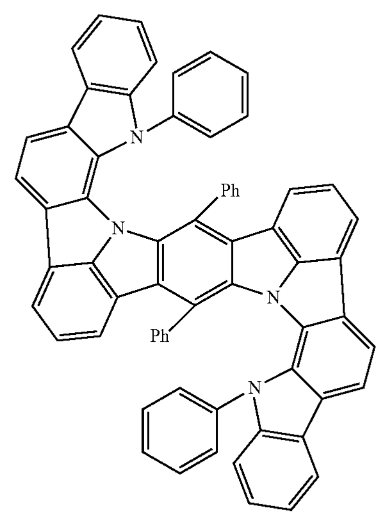

[Formula 183]
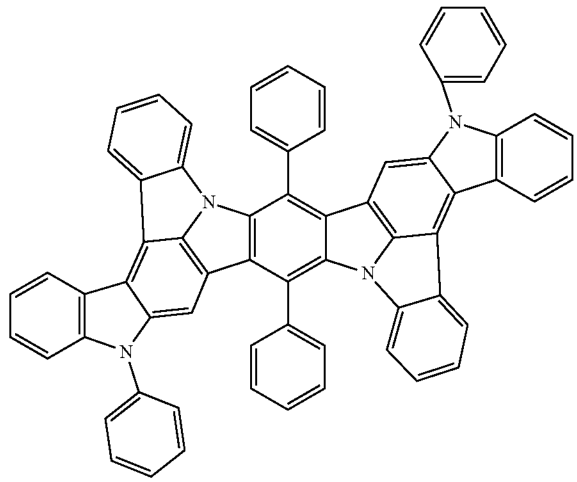
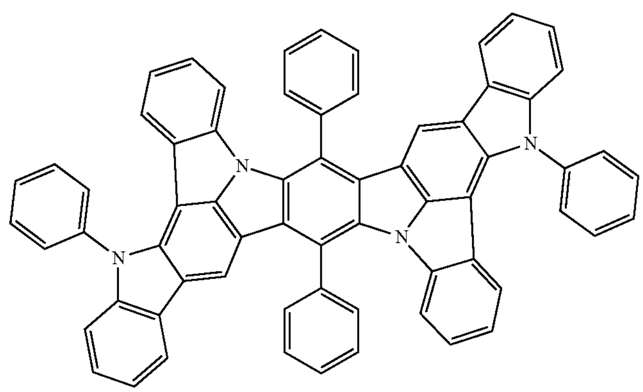
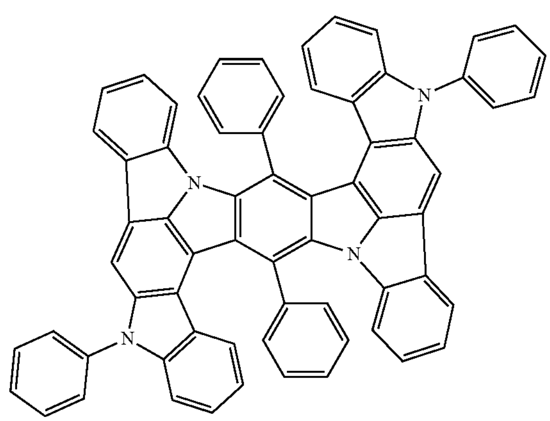

-continued
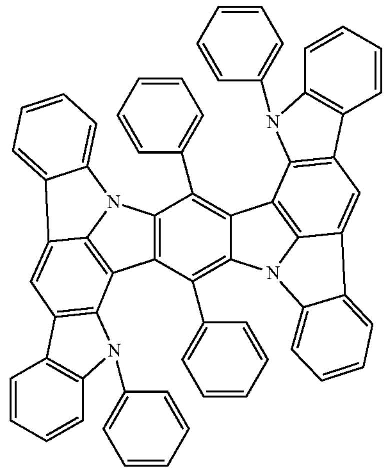
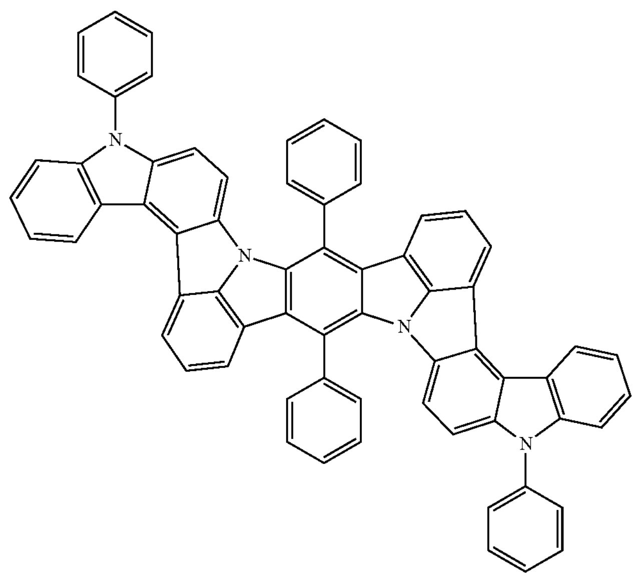
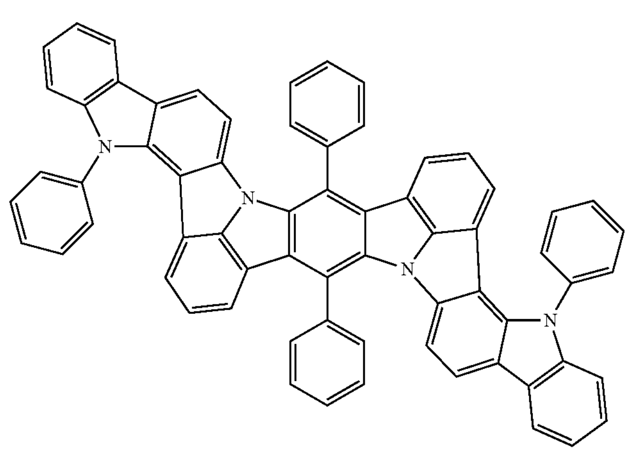

-continued
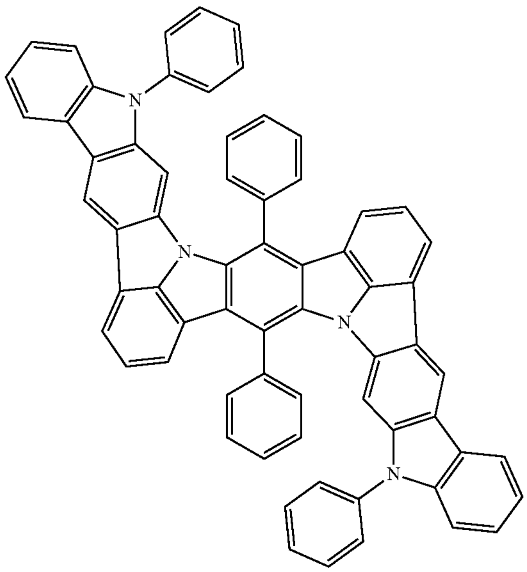
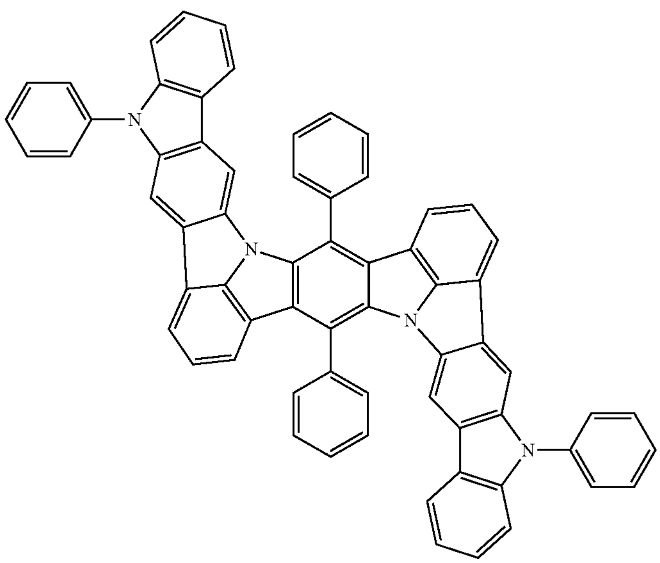
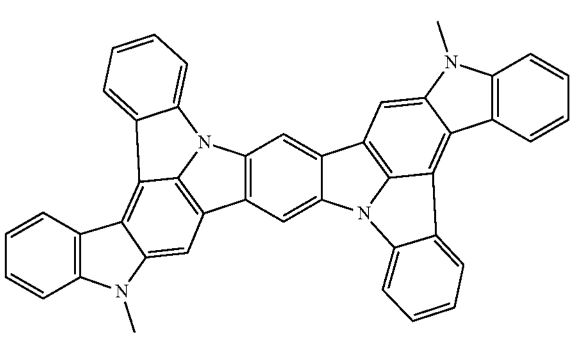
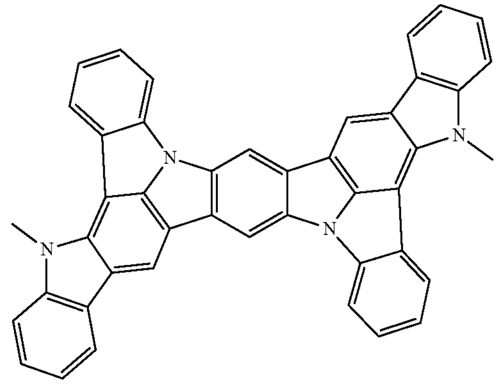

-continued
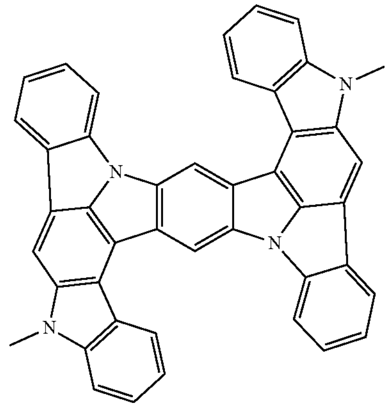
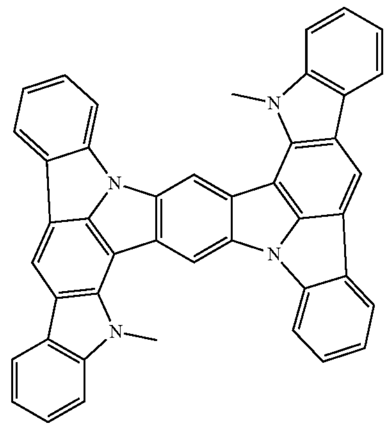
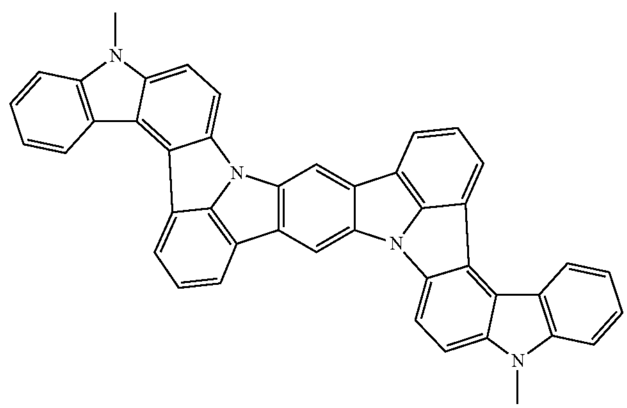
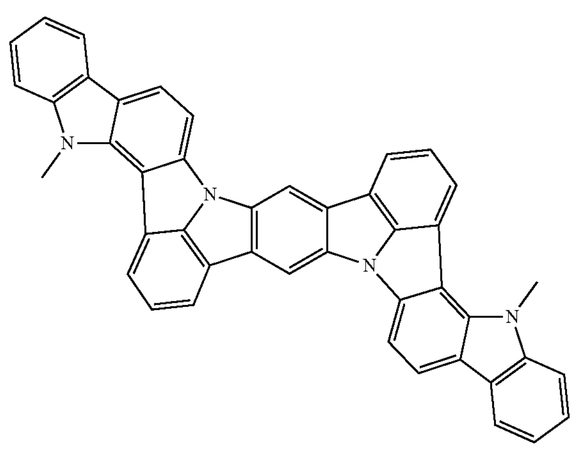
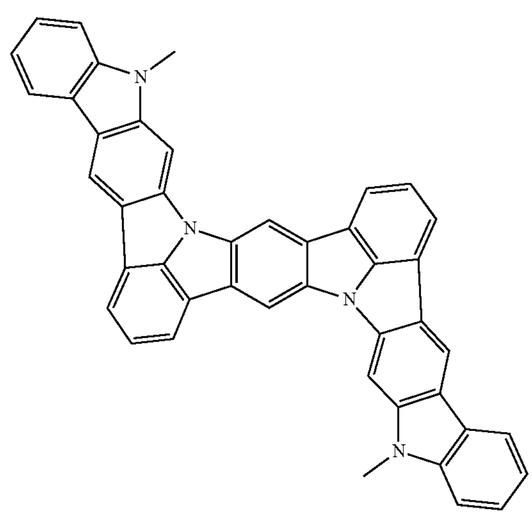

-continued
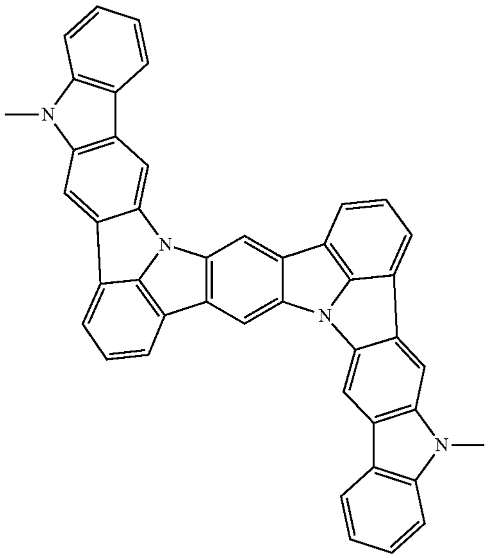
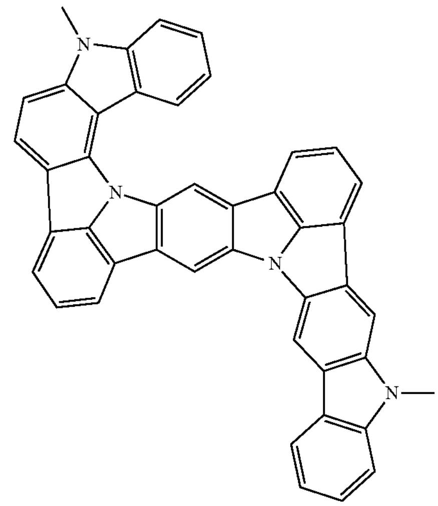
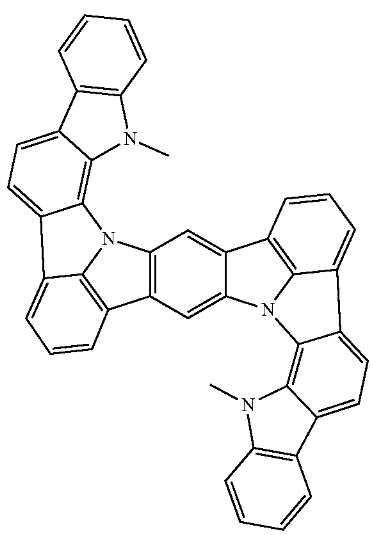
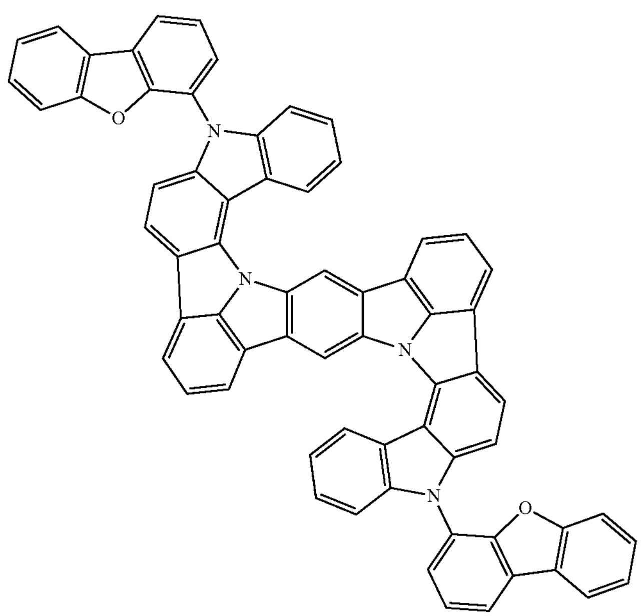

-continued
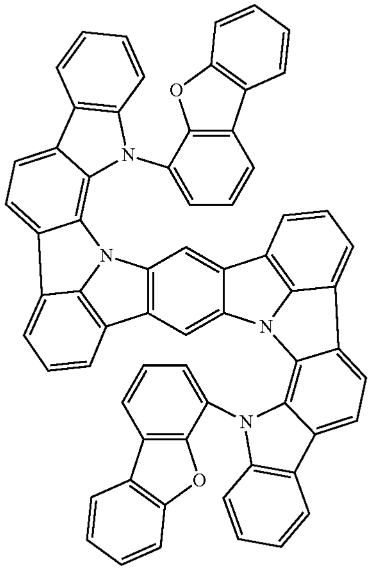
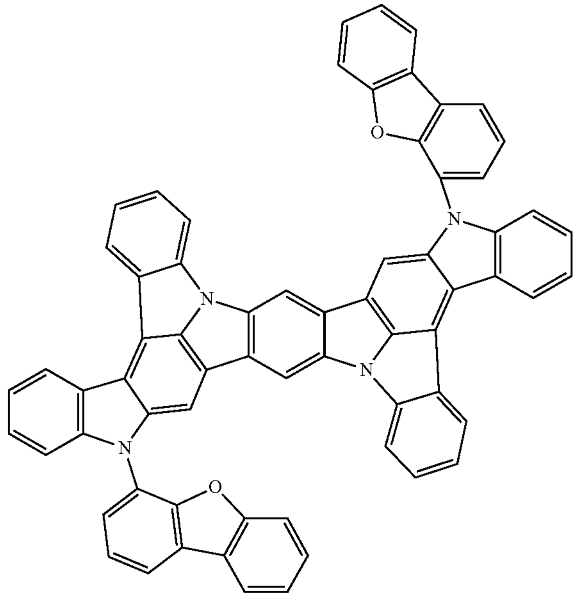
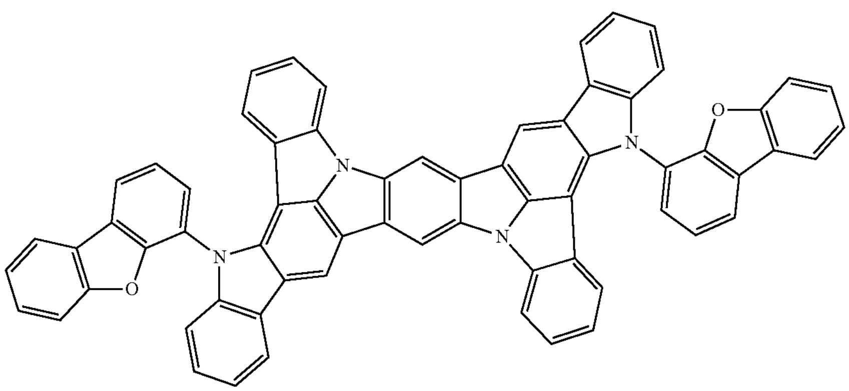
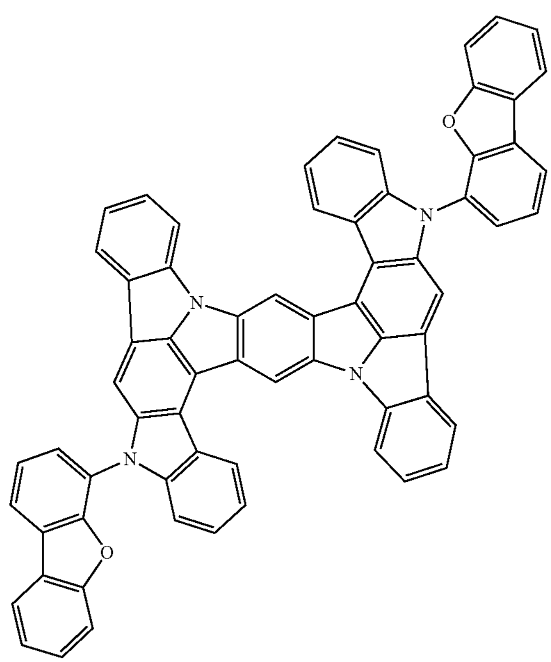
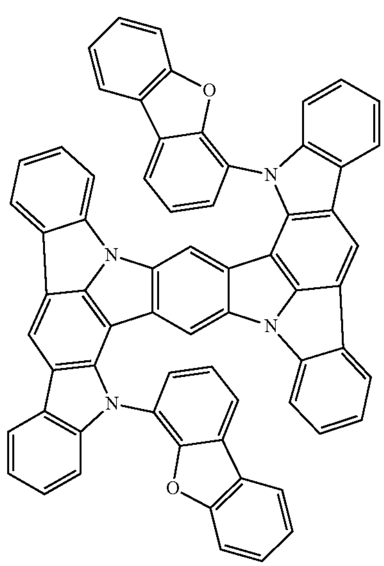

-continued
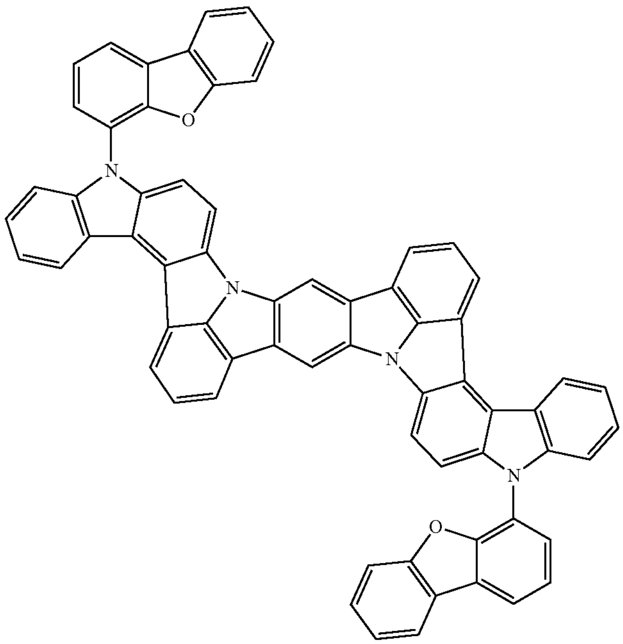
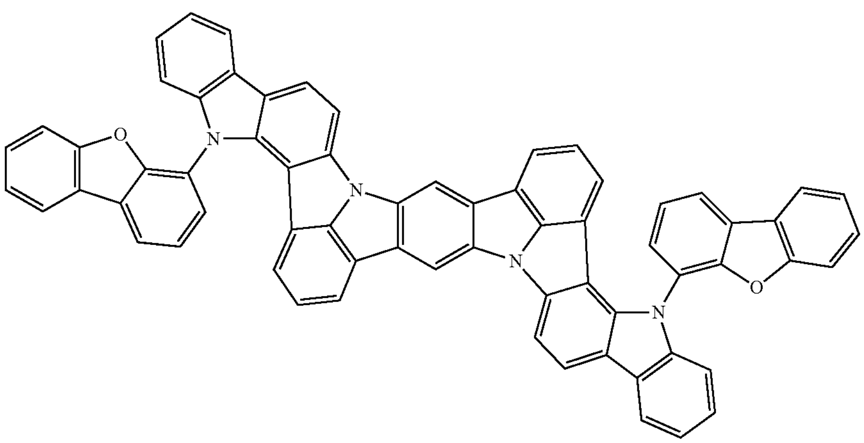
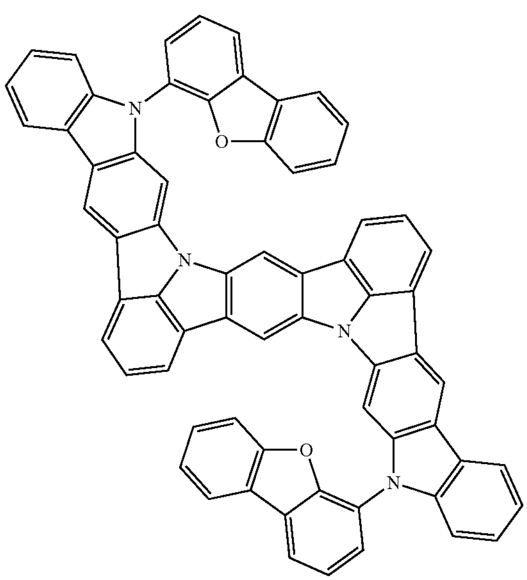

-continued
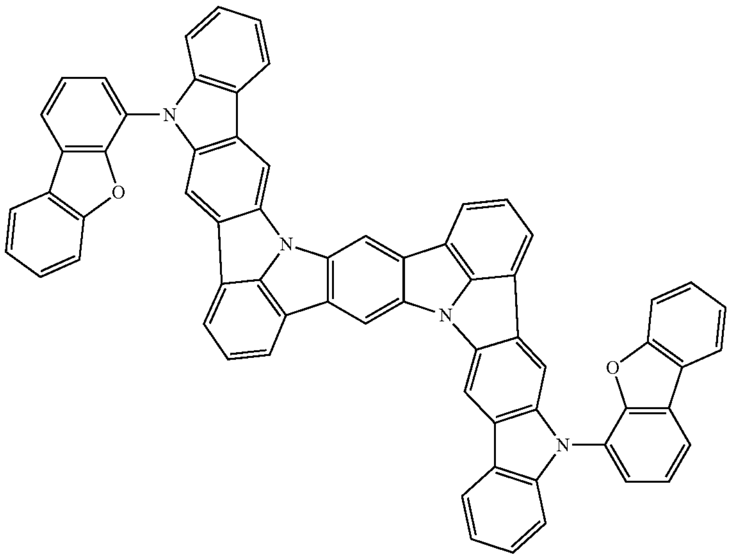 [SMILES: c1ccc2c(c1)oc1c(-n3c4ccccc4c4cc5c(cc43)c3cccc4c6cc7c(cc6n5c34)c3cccc4c5cc6c(cc5n7c43)c3ccccc3n6-c3cccc4c3oc3ccccc34)cccc12]
[Formula 184]
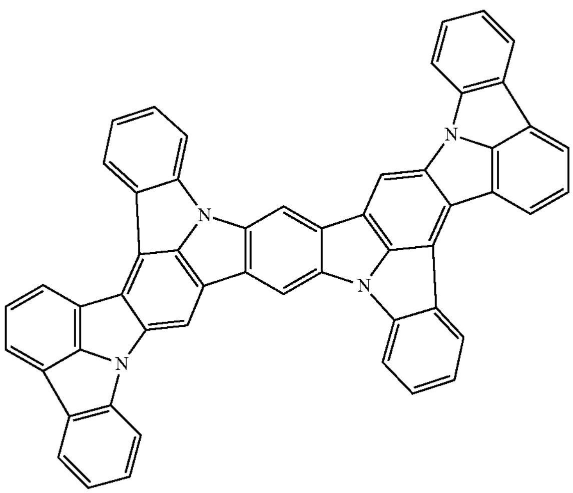
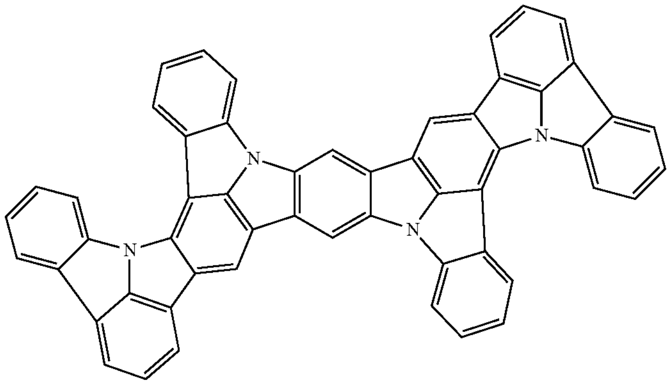

-continued
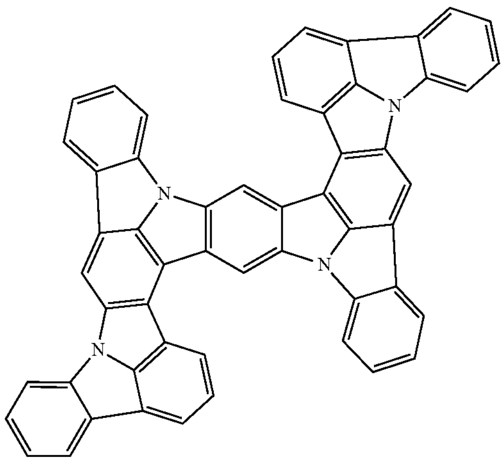
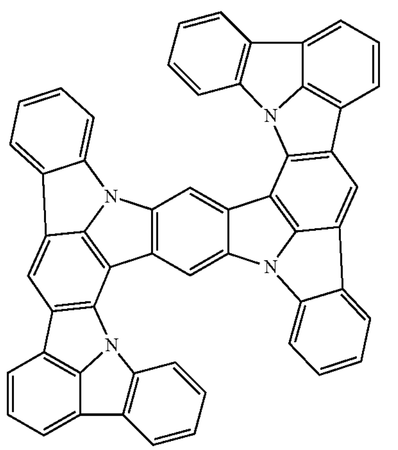
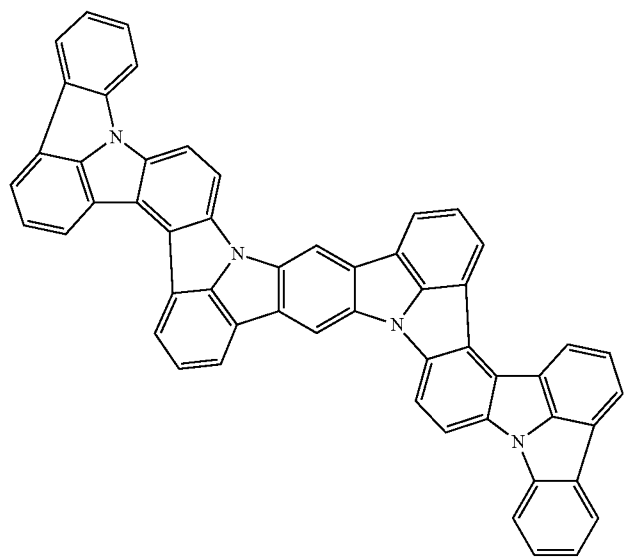
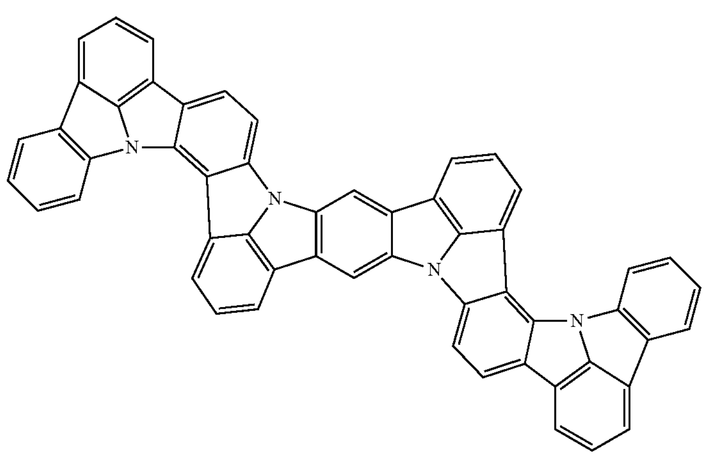

-continued
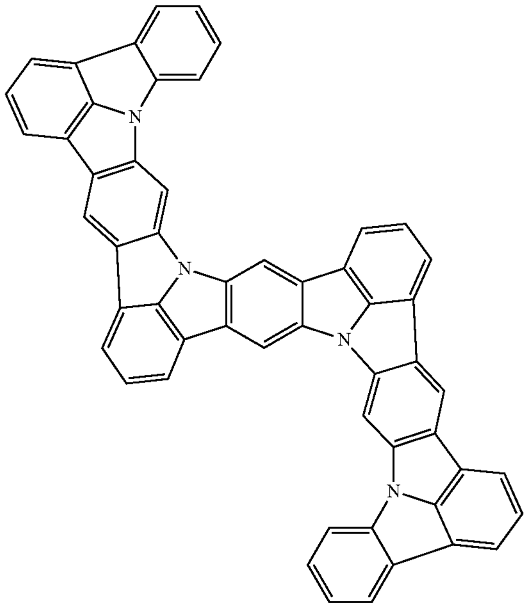
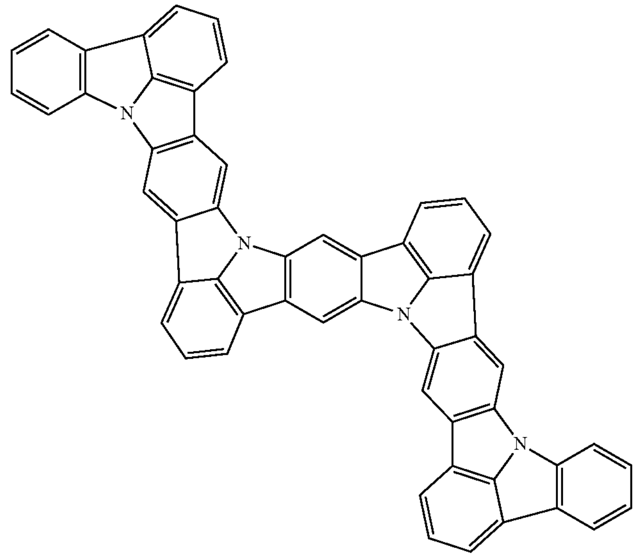
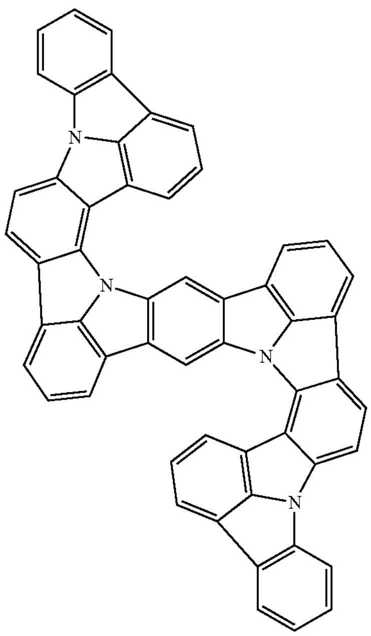
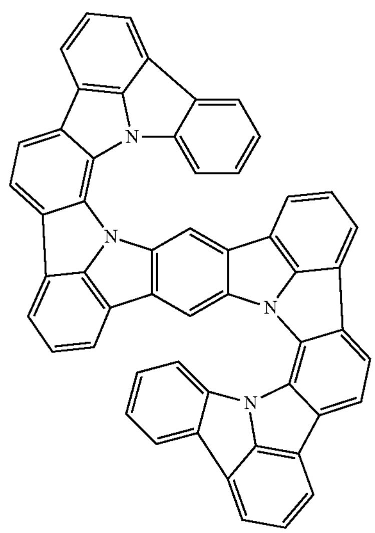
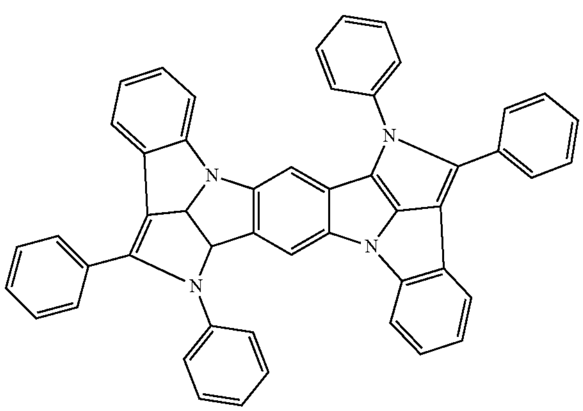
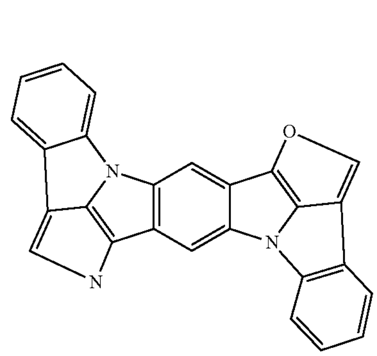

-continued
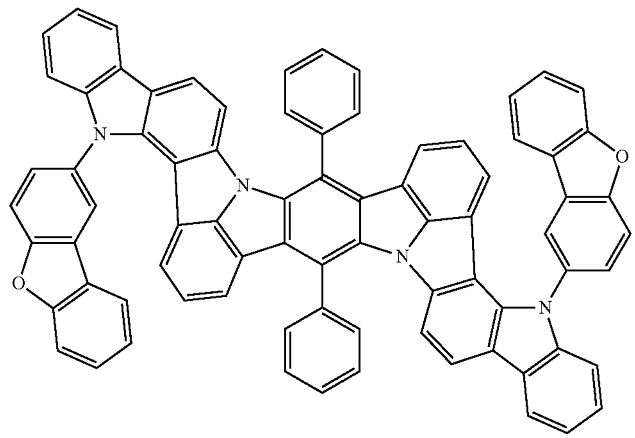
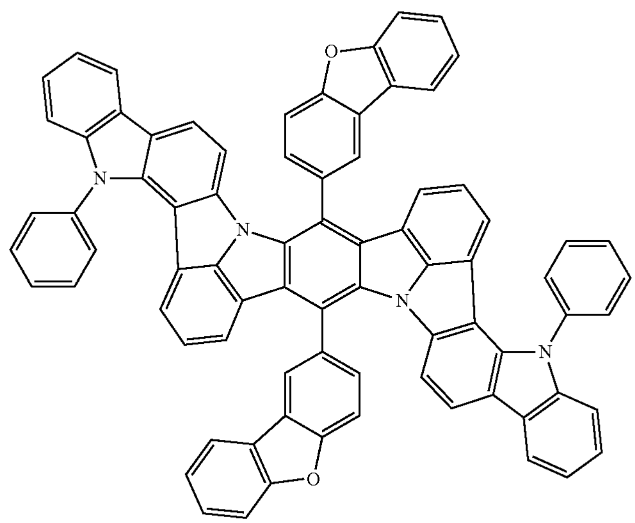
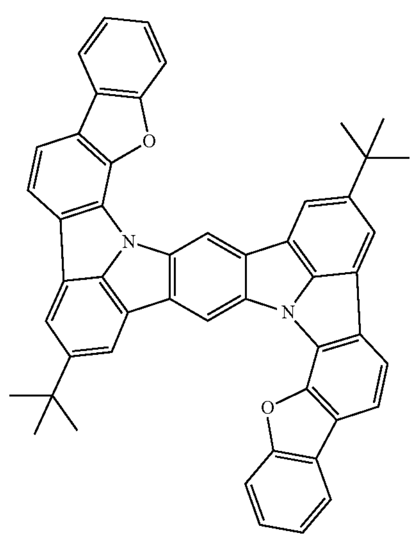
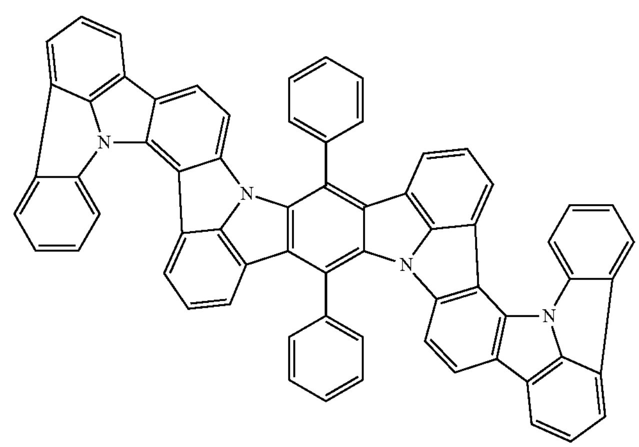

-continued
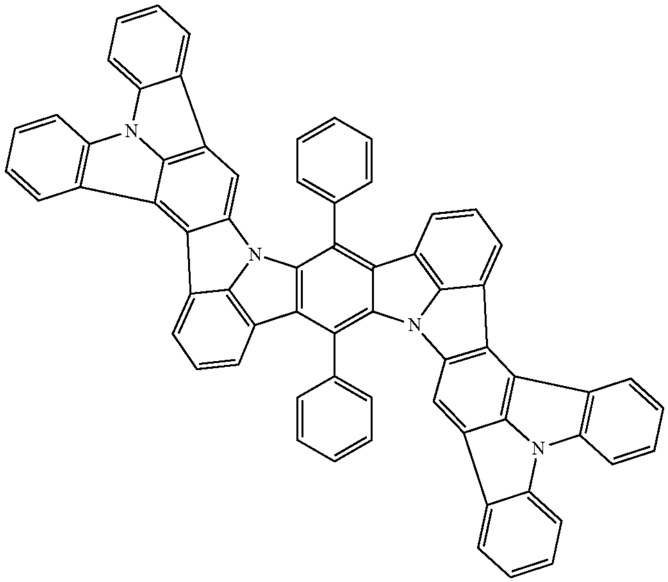
[Formula 185]
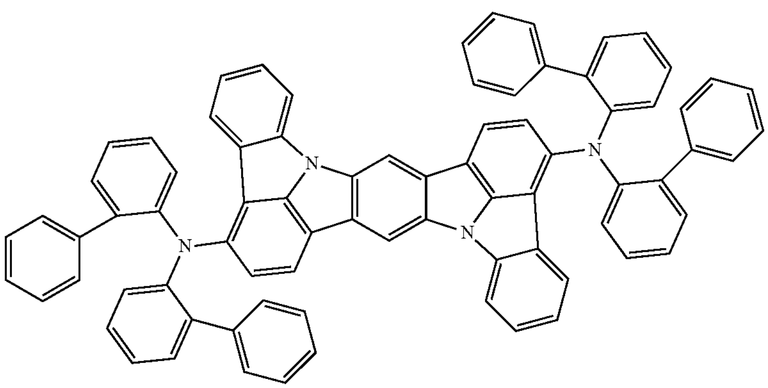
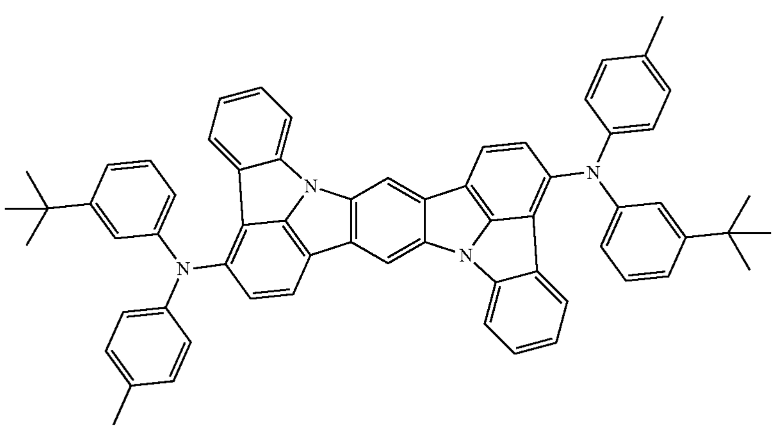

-continued

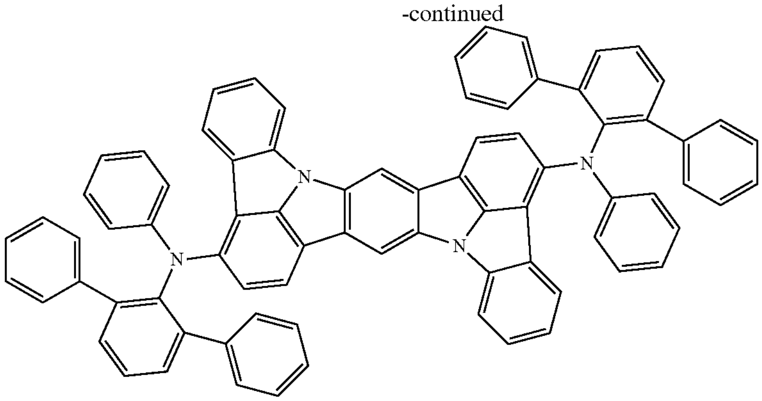

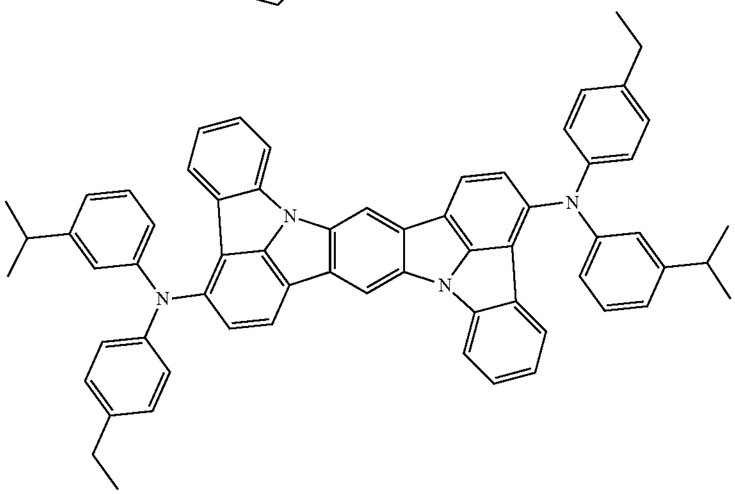

Compound Represented by Formula (6)

The compound represented by the formula (6) will be described below.

[Formula 186]

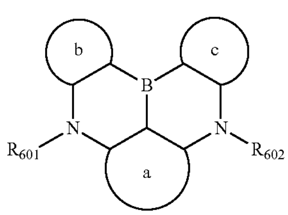

(6)

In the formula (6): a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{601}$ and $R_{602}$ are each independently bonded with the a ring, b ring, or c ring to form a substituted or unsubstituted heterocycle or to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The a ring, b ring and c ring are each a ring (a substituted or unsubstituted aromatic hydrocarbon ring having 6 to 50 ring carbon atoms, or a substituted or unsubstituted heterocycle having 5 to 50 ring atoms) fused with the fused bicyclic moiety formed of a boron atom and two nitrogen atoms at the center of the formula (6).

The "aromatic hydrocarbon ring" for the a, b, and c rings has the same structure as the compound formed by introducing a hydrogen atom to the "aryl group" described above.

Ring atoms of the "aromatic hydrocarbon ring" for the a ring include three carbon atoms on the fused bicyclic structure at the center of the formula (6).

Ring atoms of the "aromatic hydrocarbon ring" for the b ring and the c ring include two carbon atoms on a fused bicyclic structure at the center of the formula (6).

Specific examples of the "substituted or unsubstituted aromatic hydrocarbon ring having 6 to 50 ring carbon atoms" include a compound formed by introducing a hydrogen atom to the "aryl group" described in the specific example group The "heterocycle" for the a, b, and c rings has the same structure as the compound formed by introducing a hydrogen atom to the "heterocyclic group" described above.

Ring atoms of the "heterocycle" for the a ring include three carbon atoms on the fused bicyclic structure at the center of the formula (6). Ring atoms of the "heterocycle" for the b ring and the c ring include two carbon atoms on a fused bicyclic structure at the center of the formula (6).

Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ are optionally each independently bonded with the a ring, b ring, or c ring to form a substituted or unsubstituted heterocycle. The "heterocycle" in this arrangement includes the nitrogen atom on the fused bicyclic structure at the center of the formula (6). The heterocycle in the above arrangement optionally include a hetero atom other than the nitrogen atom. $R_{601}$ and $R_{602}$ bonded with the a ring, b ring, or c ring specifically means that atoms forming $R_{601}$ and $R_{602}$ are bonded with atoms forming the a ring, b ring, or c ring. For instance, $R_{601}$ may be bonded to the a ring to form a bicyclic (or tri-or-more cyclic) fused nitrogen-containing heterocycle, in which the ring including $R_{601}$ and the a ring are fused. Specific examples of the nitrogen-containing heterocycle include a compound corresponding to the nitrogen-containing bi(or-more)cyclic fused heterocyclic group in the specific example group G2.

The same applies to $R_{601}$ bonded with the b ring, $R_{602}$ bonded with the a ring, and $R_{602}$ bonded with the c ring.

In an exemplary embodiment, the a ring, b ring and c ring in the formula (6) are each independently a substituted or unsubstituted aromatic hydrocarbon ring having 6 to 50 ring carbon atoms.

In an exemplary embodiment, the a ring, b ring and c ring in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms, preferably a substituted or unsubstituted aryl group having 6 to 50 ring carbon atoms.

In an exemplary embodiment, the compound represented by the formula (6) is a compound represented by a formula (62) below.

[Formula 187]

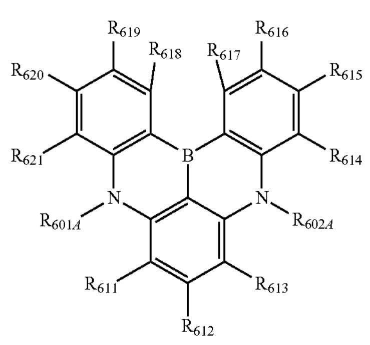

(62)

In the formula (62): $R_{601A}$ is bonded with at least one of $R_{611}$ or $R_{621}$ to form a substituted or unsubstituted heterocycle or to form no substituted or unsubstituted heterocycle;

$R_{602A}$ is bonded with at least one of $R_{613}$ or $R_{614}$ to form a substituted or unsubstituted heterocycle or to form no substituted or unsubstituted heterocycle;

$R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded; and $R_{611}$ to $R_{621}$ not forming the substituted or unsubstituted heterocycle, not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

$R_{601A}$ and $R_{602A}$ in the formula (62) are groups corresponding to $R_{601}$ and $R_{602}$ in the formula (6), respectively.

For instance, $R_{601A}$ and $R_{611}$ are optionally bonded with each other to form a bicyclic (or tri-or-more cyclic) fused nitrogen-containing heterocycle, in which the ring including $R_{601A}$ and $R_{611}$ and a benzene ring corresponding to the a ring are fused. Specific examples of the nitrogen-containing heterocycle include a compound corresponding to the nitrogen-containing bi(or-more)cyclic fused heterocyclic group in the specific example group G2. The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ are optionally mutually bonded to form a substituted or unsubstituted monocyclic ring, or mutually bonded to form a substituted or unsubstituted fused ring.

For instance, $R_{611}$ and $R_{612}$ are optionally mutually bonded to form a structure in which a benzene ring, indole ring, pyrrole ring, benzofuran ring, benzothiophene ring or the like is fused to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$, which do not contribute to ring formation, are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$, which do not contribute to ring formation, are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$, which do not contribute to ring formation, are each independently a hydrogen atom, or a substituted or unsubstituted alkyl group having 1 to 50 carbon atoms.

In an exemplary embodiment, $R_{611}$ to $R_{621}$, which do not contribute to ring formation, are each independently a hydrogen atom, or a substituted or unsubstituted alkyl group having 1 to 50 carbon atoms, and at least one of $R_{611}$ to $R_{621}$ is a substituted or unsubstituted alkyl group having 1 to 50 carbon atoms.

In an exemplary embodiment, the compound represented by the formula (62) is a compound represented by a formula (63) below.

[Formula 188]

(63)

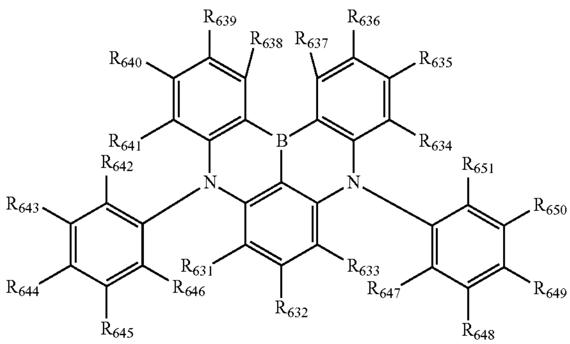

In the formula (63): $R_{631}$ is bonded with $R_{646}$ to form a substituted or unsubstituted heterocycle or to form no substituted or unsubstituted heterocycle;

$R_{633}$ is bonded with $R_{647}$ to form a substituted or unsubstituted heterocycle or to form no substituted or unsubstituted heterocycle;

$R_{634}$ is bonded with $R_{651}$ to form a substituted or unsubstituted heterocycle or to form no substituted or unsubstituted heterocycle;

$R_{641}$ is bonded with $R_{642}$ to form a substituted or unsubstituted heterocycle or to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded; and $R_{631}$ to $R_{651}$ not forming the substituted or unsubstituted heterocycle, not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

$R_{631}$ are optionally mutually bonded with $R_{646}$ to form a substituted or unsubstituted heterocycle. For instance, $R_{631}$ and $R_{646}$ are optionally bonded with each other to form a tri-or-more cyclic fused nitrogen-containing heterocycle, in which a benzene ring bonded with $R_{646}$, a ring including a nitrogen atom, and a benzene ring corresponding to the a ring are fused. Specific examples of the nitrogen-containing heterocycle include a compound corresponding to the nitrogen-containing tri(-or-more)cyclic fused heterocyclic group in the specific example group G2. The same applies to $R_{633}$ bonded with $R_{647}$, $R_{634}$ bonded with $R_{651}$, and $R_{641}$ bonded with $R_{642}$.

In an exemplary embodiment, $R_{631}$ to $R_{651}$, which do not contribute to ring formation, are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$, which do not contribute to ring formation, are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$, which do not contribute to ring formation, are each independently a hydrogen atom, or a substituted or unsubstituted alkyl group having 1 to 50 carbon atoms.

In an exemplary embodiment, $R_{631}$ to $R_{651}$, which do not contribute to ring formation, are each independently a hydrogen atom, or a substituted or unsubstituted alkyl group having 1 to 50 carbon atoms, and at least one of $R_{631}$ to $R_{651}$ is a substituted or unsubstituted alkyl group having 1 to 50 carbon atoms.

In an exemplary embodiment, the compound represented by the formula (63) is a compound represented by a formula (63A) below.

[Formula 189]

(63A)

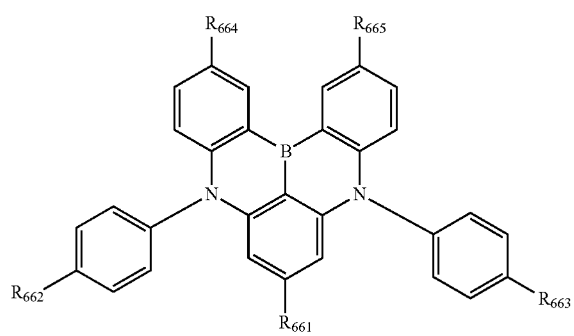

In the formula (63A): $R_{661}$ is a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms;

$R_{662}$ to $R_{665}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms.

In an exemplary embodiment, the compound represented by the formula (63) is a compound represented by a formula (63B) below.

[Formula 190]

(63B)

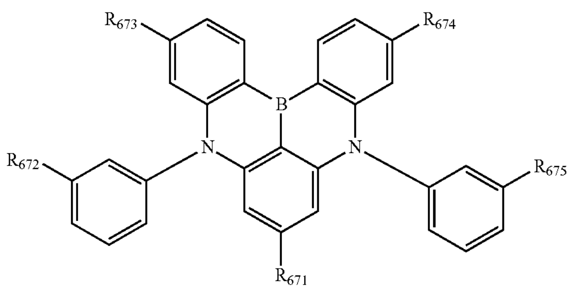

In the formula (63B): $R_{671}$ and $R_{672}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, or a substituted or unsubstituted aryl group having 6 to 50 ring carbon atoms; and $R_{673}$ to $R_{675}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, or a substituted or unsubstituted aryl group having 6 to 50 ring carbon atoms.

In an exemplary embodiment, the compound represented by the formula (63) is a compound represented by a formula (63B') below.

[Formula 191]

(63B')

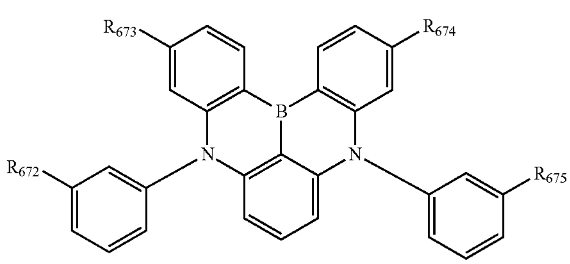

In the formula (63B'), $R_{672}$ to $R_{675}$ each independently represent the same as $R_{672}$ to $R_{675}$ in the formula (63B).

In an exemplary embodiment, at least one of $R_{671}$ to $R_{675}$ is: a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, or a substituted or unsubstituted aryl group having 6 to 50 ring carbon atoms.

In an exemplary embodiment: $R_{672}$ is a hydrogen atom, a substituted or unsubstituted alkyl group having 1 to 50 carbon atoms, a group represented by —$N(R_{906})(R_{907})$, or a substituted or unsubstituted aryl group having 6 to 50 ring carbon atoms; and $R_{671}$, and $R_{673}$ to $R_{675}$ are each independently a substituted or unsubstituted alkyl group having 1 to 50 carbon atoms, a group represented by —$N(R_{906})(R_{907})$, or a substituted or unsubstituted aryl group having 6 to 50 ring carbon atoms.

In an exemplary embodiment, the compound represented by the formula (63) is a compound represented by a formula (63C) below.

[Formula 192]

(63C)

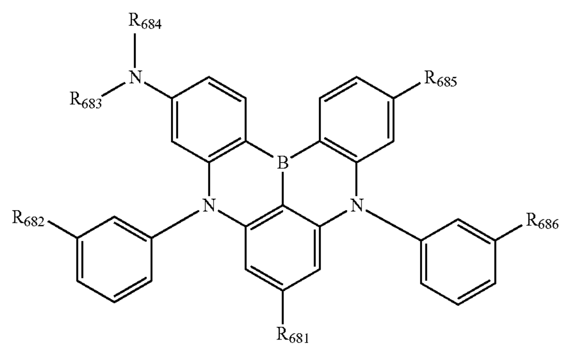

In the formula (63C): $R_{681}$ and $R_{682}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

$R_{683}$ to $R_{686}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, the compound represented by the formula (63) is a compound represented by a formula (63C') below.

[Formula 193]

(63C')

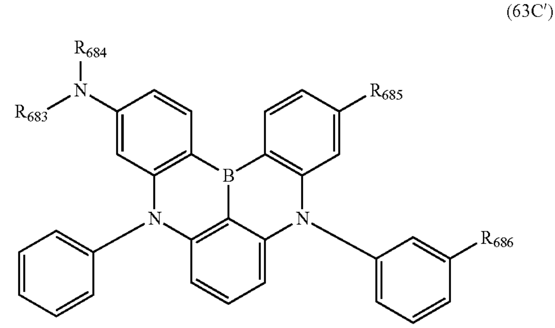

In the formula (63C'), $R_{683}$ to $R_{686}$ each independently represent the same as $R_{683}$ to $R_{686}$ in the formula (63C).

In an exemplary embodiment, $R_{681}$ to $R_{686}$ are each independently a substituted or unsubstituted alkyl group having 1 to 50 carbon atoms, or a substituted or unsubstituted aryl group having 6 to 50 ring carbon atoms.

In an exemplary embodiment, $R_{681}$ to $R_{686}$ are each independently a substituted or unsubstituted aryl group having 6 to 50 ring carbon atoms.

The compound represented by the formula (6) is producible by initially bonding the a ring, b ring and c ring with linking groups (a group including N—$R_{601}$ and a group including N—$R_{602}$) to form an intermediate (first reaction), and bonding the a ring, b ring and c ring with a linking group (a group including a boron atom) to form a final product (second reaction). In the first reaction, an amination reaction (e.g. Buchwald-Hartwig reaction) is applicable. In the second reaction, Tandem Hetero-Friedel-Crafts Reactions or the like is applicable.

Specific Examples of Compound Represented by Formula (6)

Specific examples of the compound represented by the formula (6) are shown below. It should however be noted that these specific examples are merely exemplary and do not limit the compound represented by the formula (6).

[Formula 194]

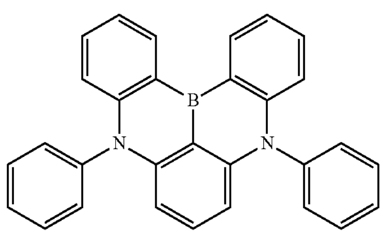

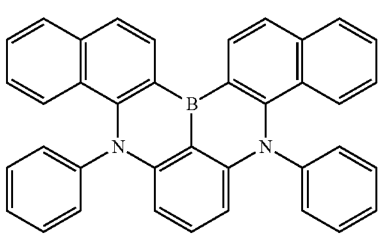

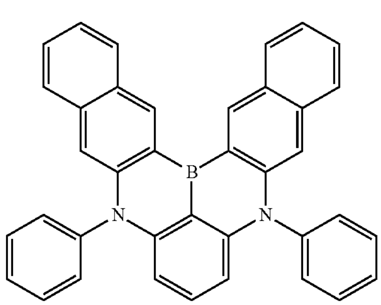

-continued

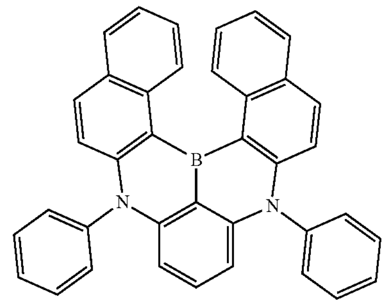

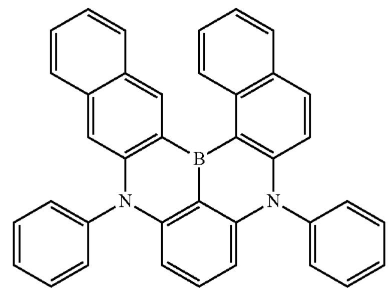

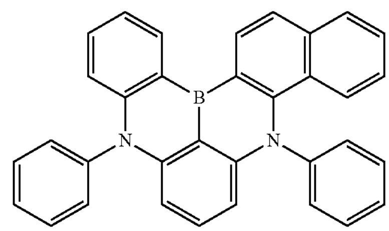

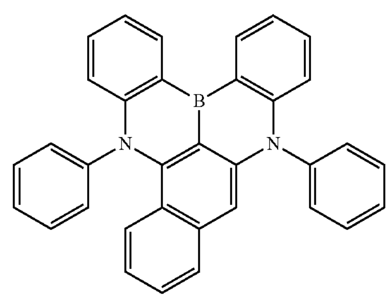

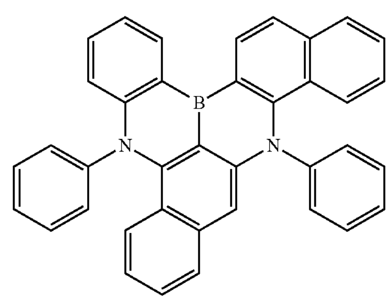

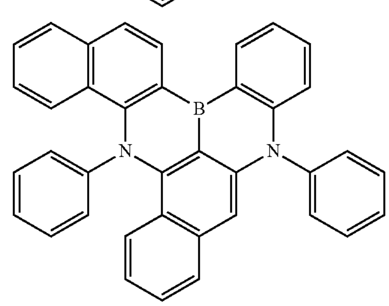

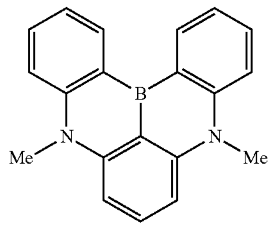
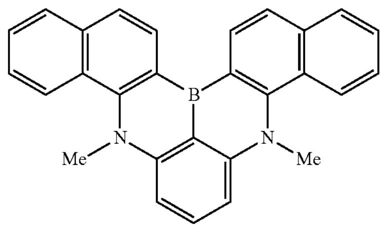
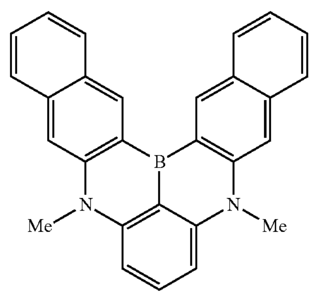
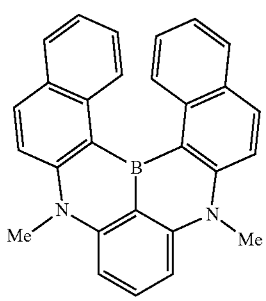
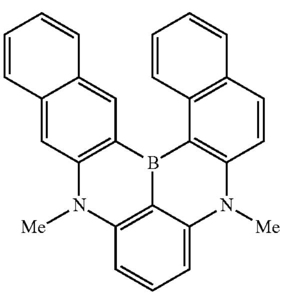
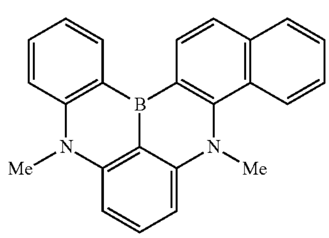
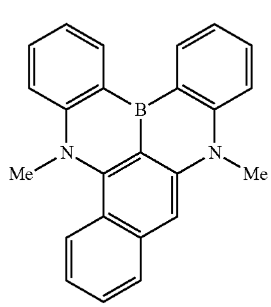
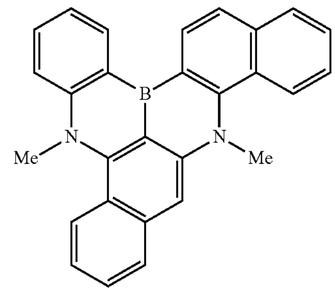
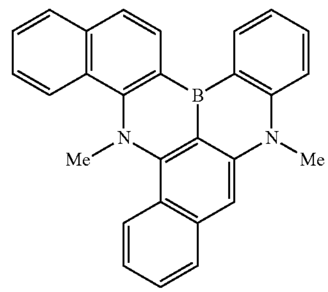
[Formula 195]
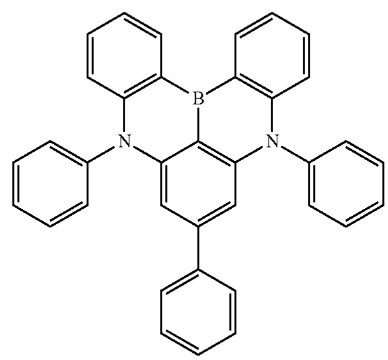
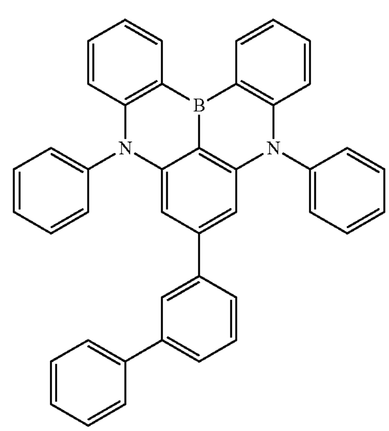

-continued
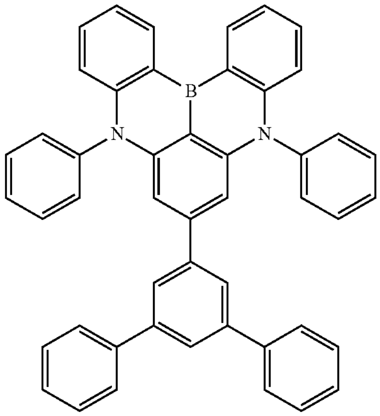
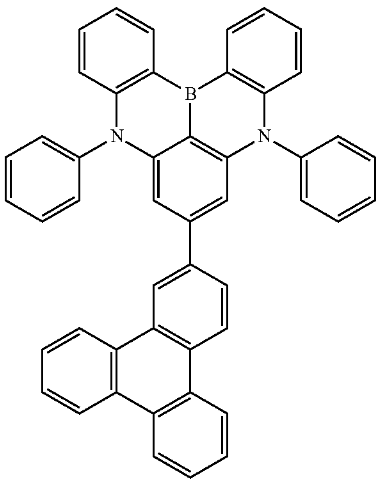
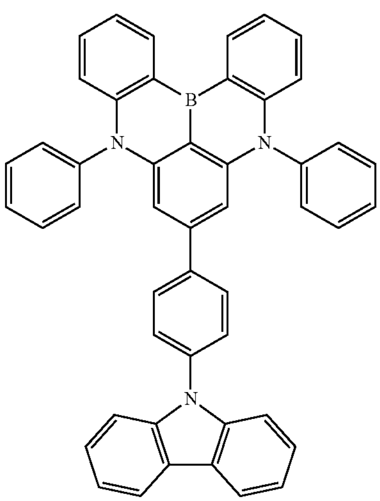
-continued
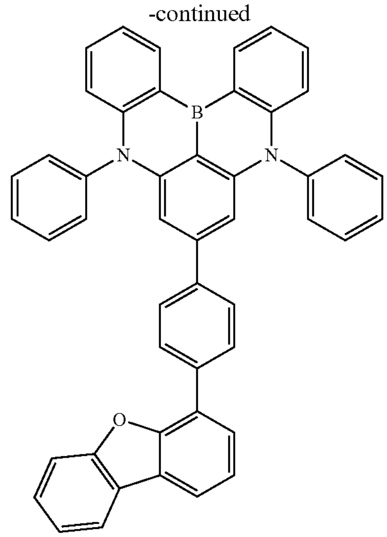
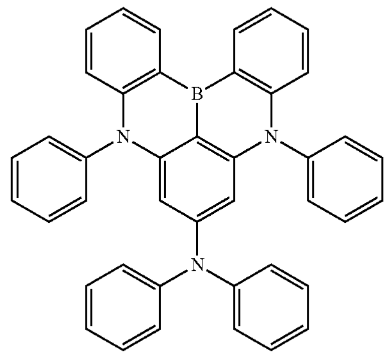
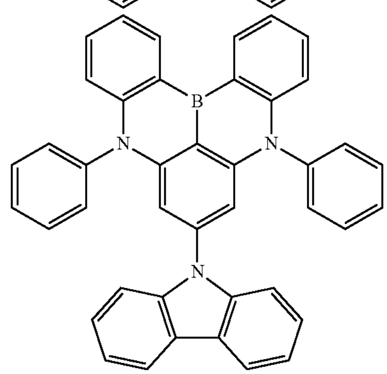
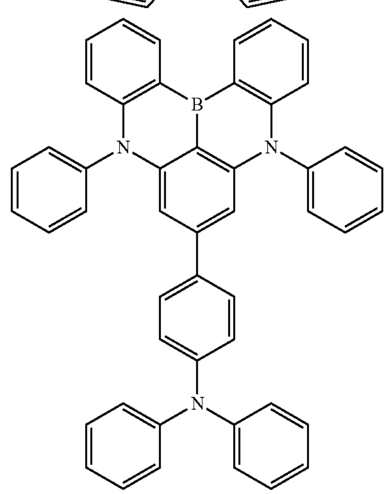

[Formula 196]
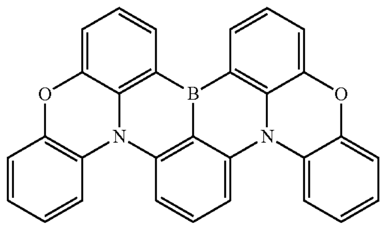
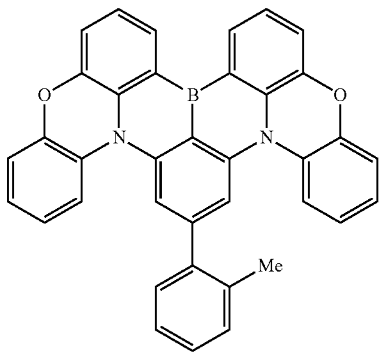
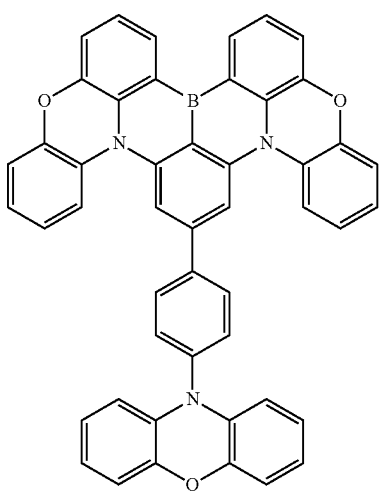
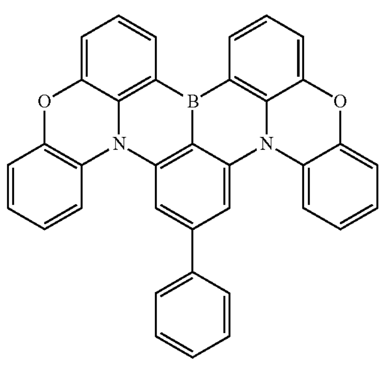
-continued
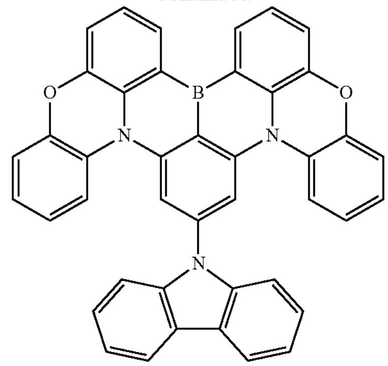
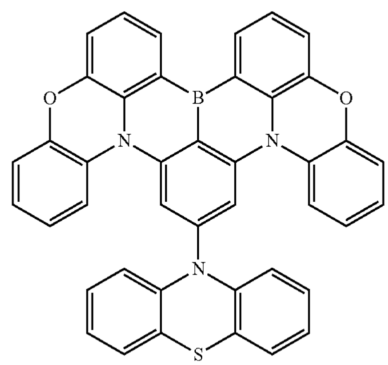
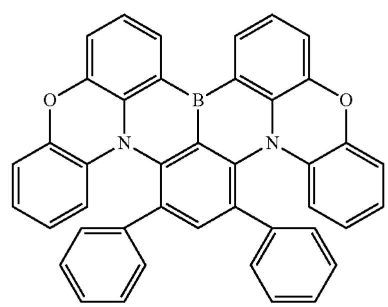
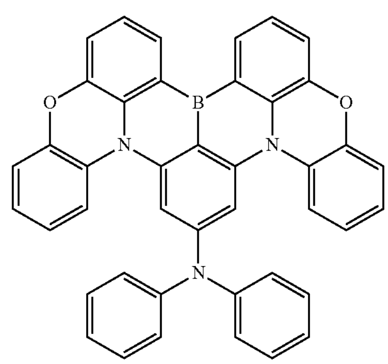

-continued
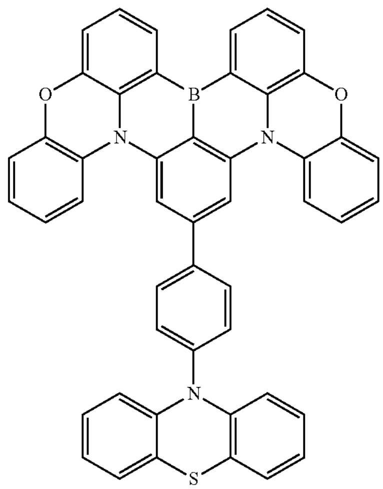
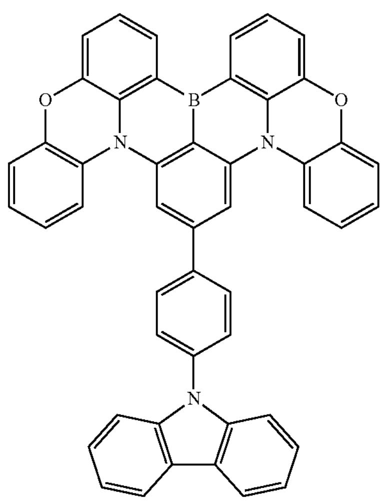
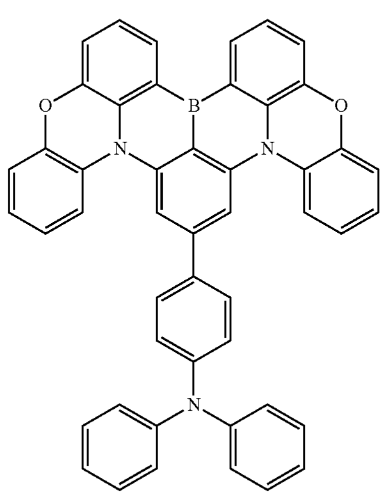 [SMILES: c1ccc(N(c2ccccc2)c2ccc(-c3cc4c5c(c3)N(c3ccccc3)c3ccccc3B5c3ccccc3N4c3ccccc3)cc2)cc1]
-continued
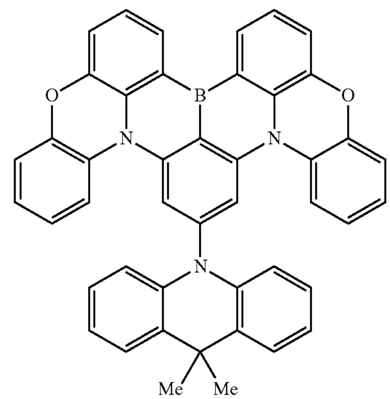
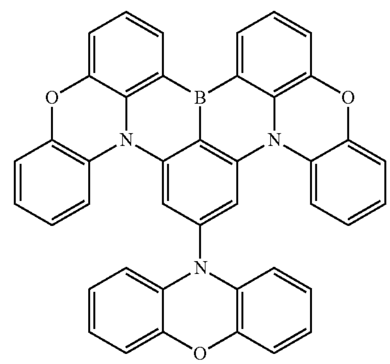
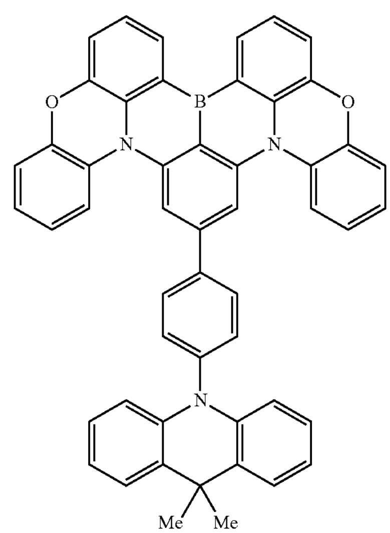 [SMILES: CC1(C)c2ccccc2N(c2ccc(-c3cc4c5c(c3)N3c6ccccc6Oc6cccc(c63)B5c3cccc5c3N4c3ccccc3O5)cc2)c2ccccc21]
[Formula 197]
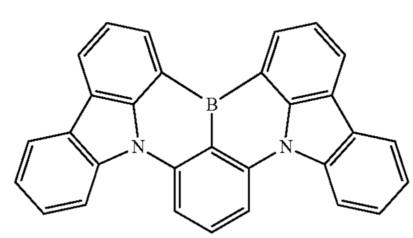

-continued
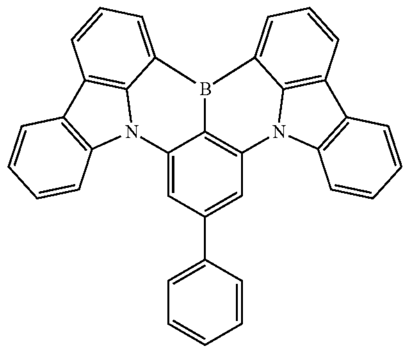
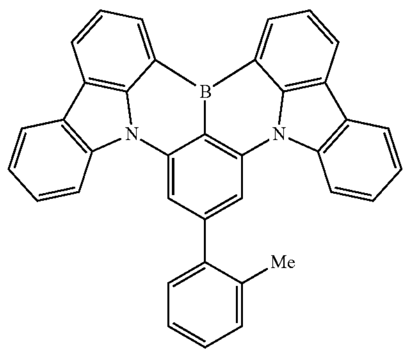
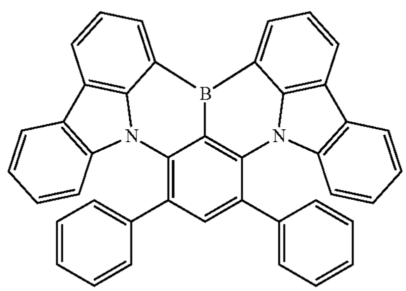
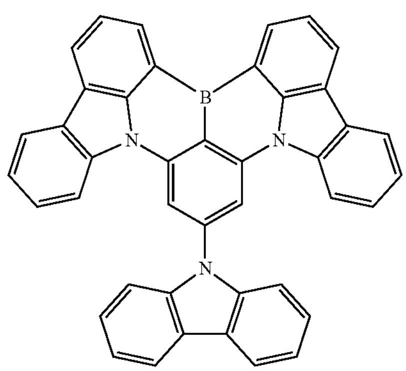
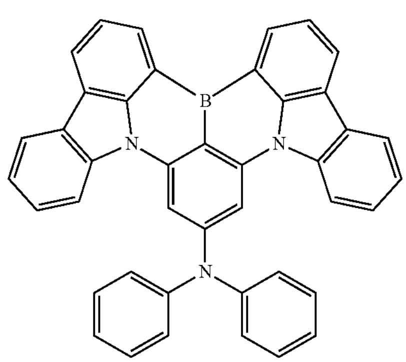
-continued
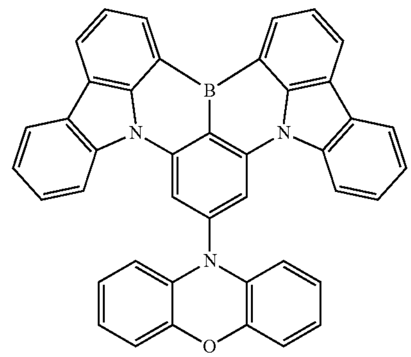
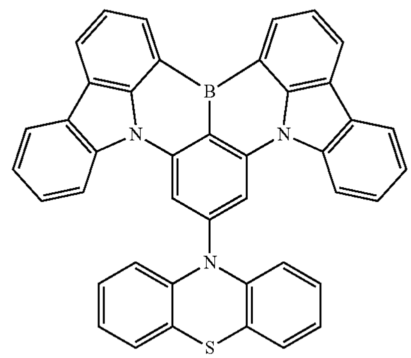
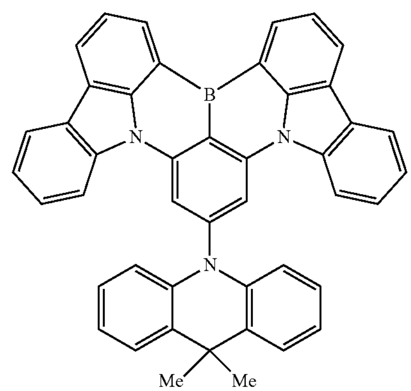
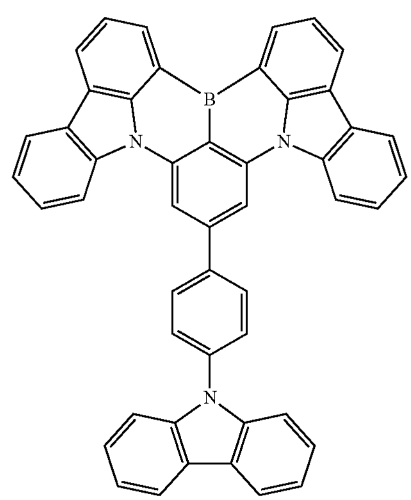

-continued
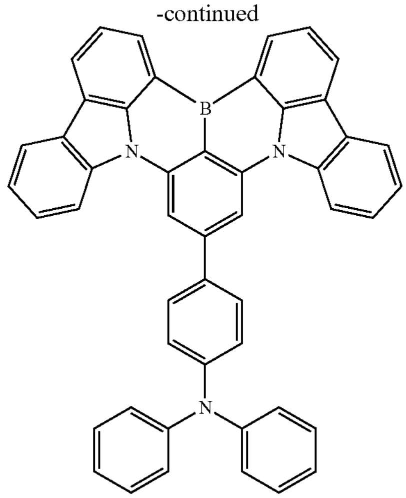
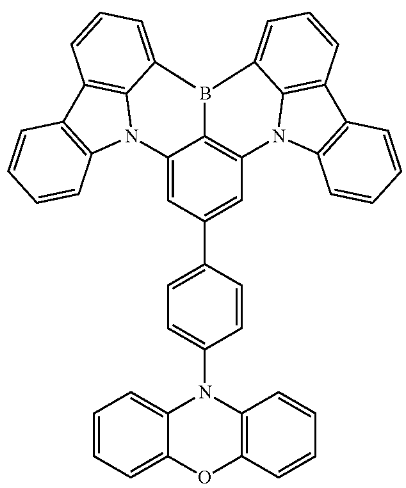
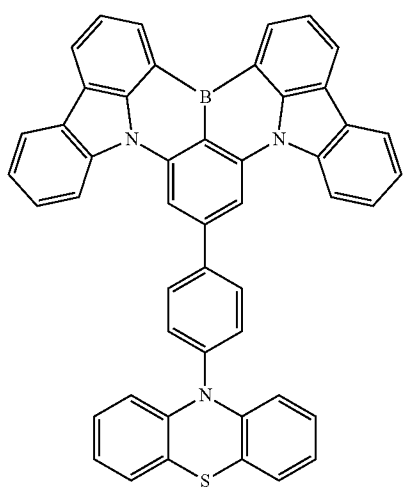
-continued
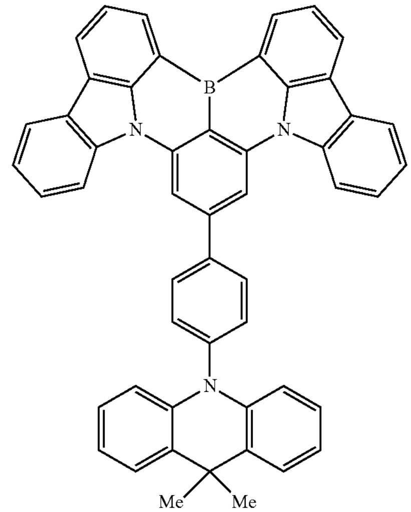 [SMILES: CC1(C)c2ccccc2N(c2ccc(-c3cc4c5c(c3)-n3c6ccccc6c6cccc(c63)B5c3cccc5c6ccccc6n-4c35)cc2)c2ccccc21]
[Formula 198]
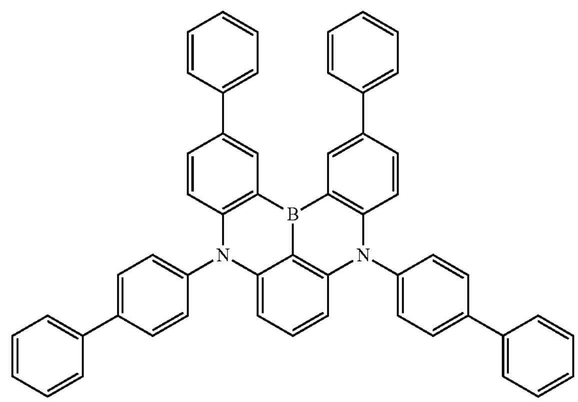
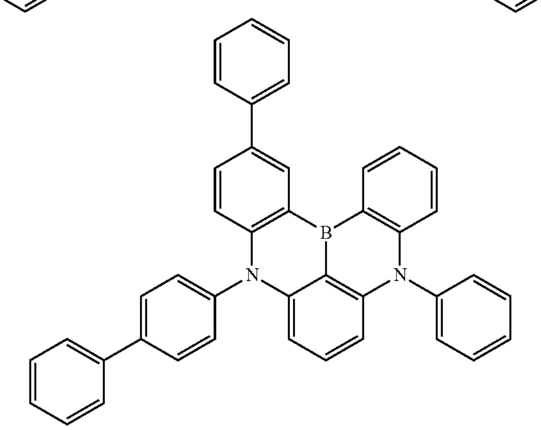
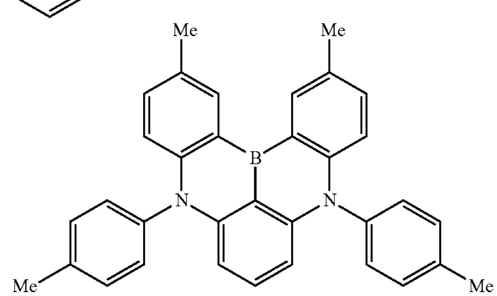

-continued
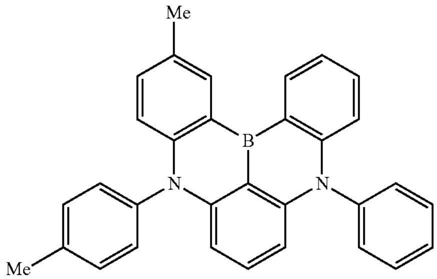
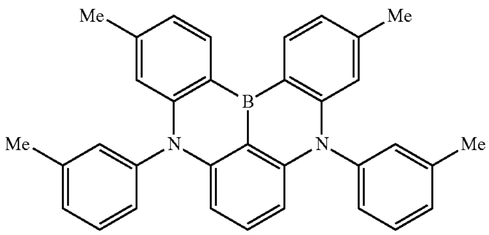
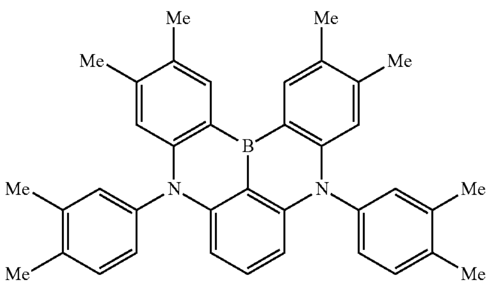
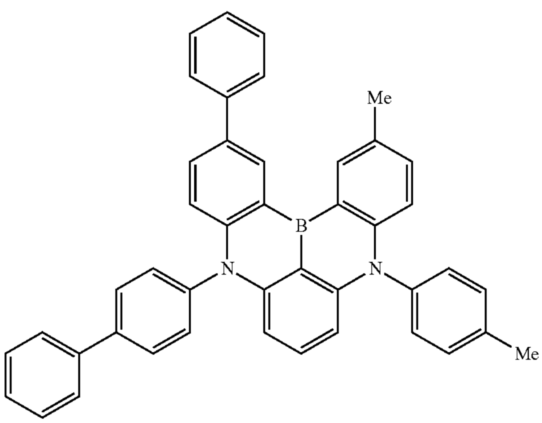
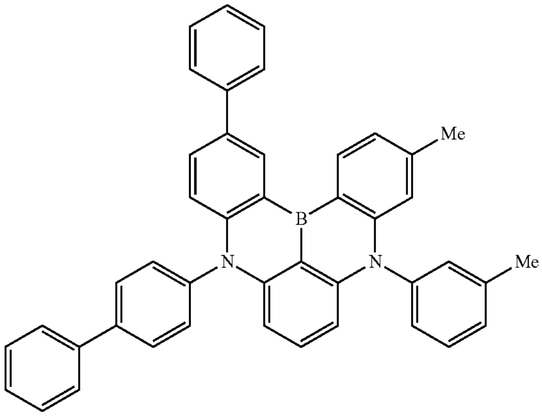
-continued
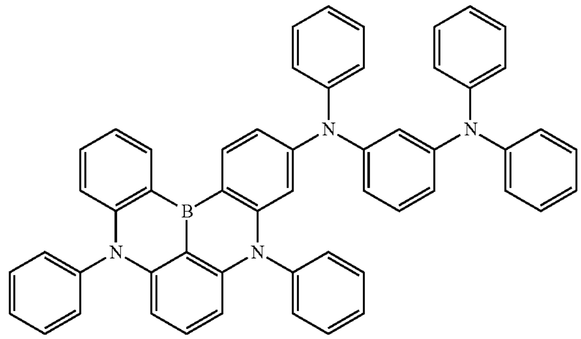
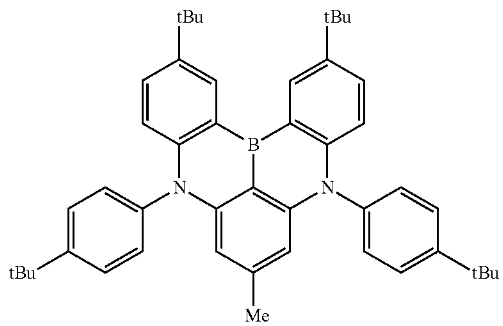
[Formula 199]
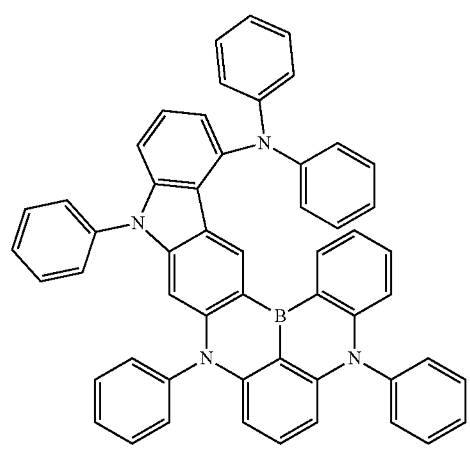
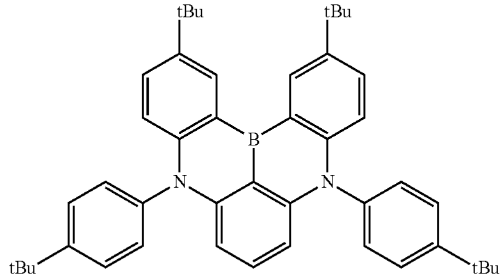

-continued
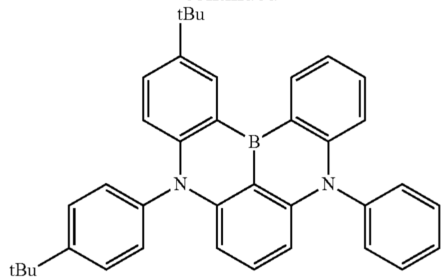
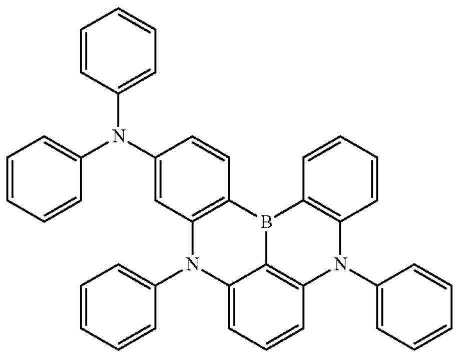
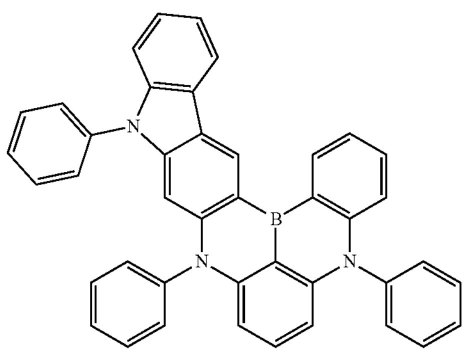
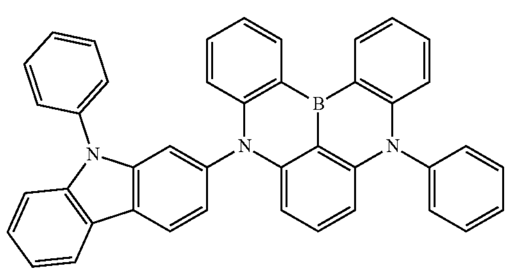
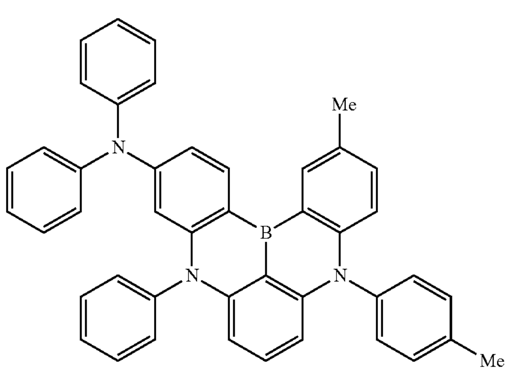
-continued
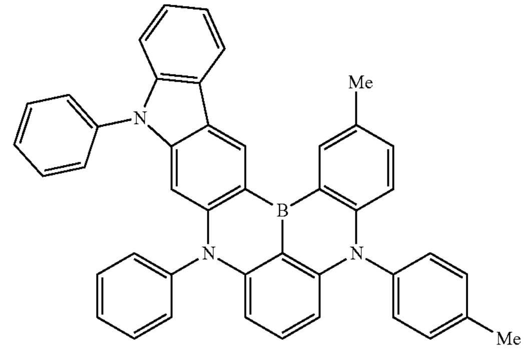
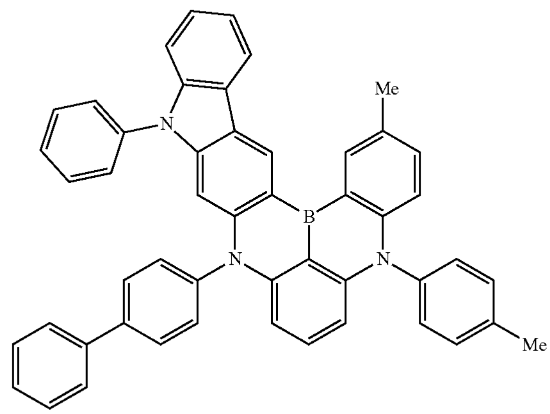
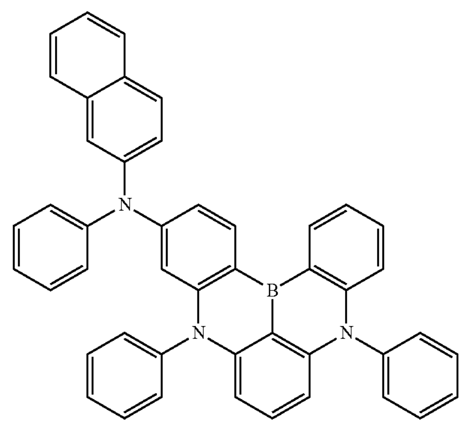
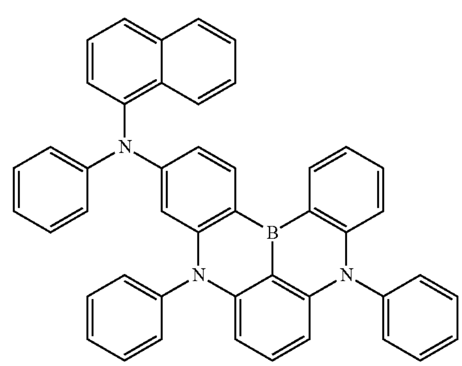

-continued
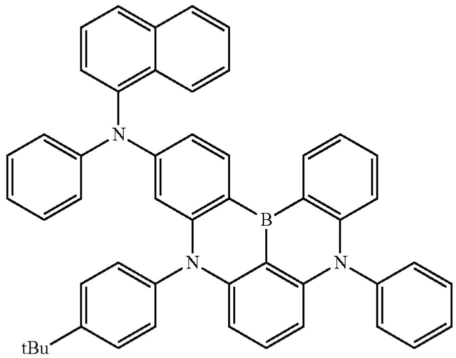
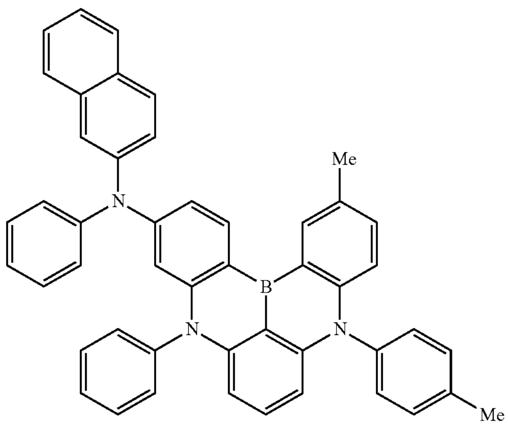
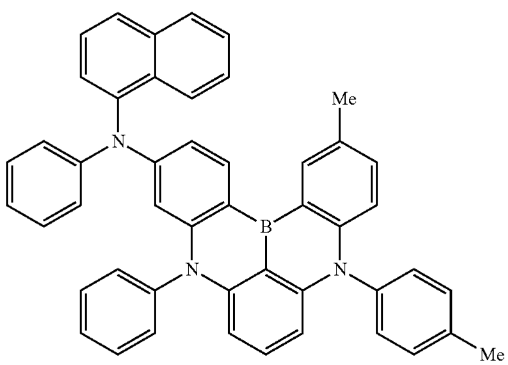
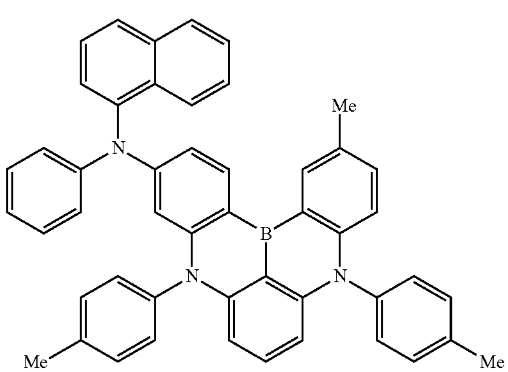
[Formula 200]
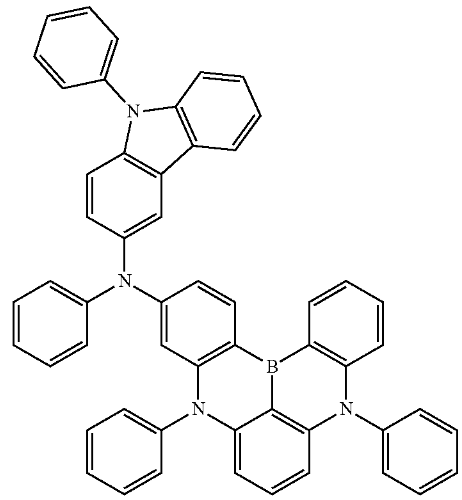
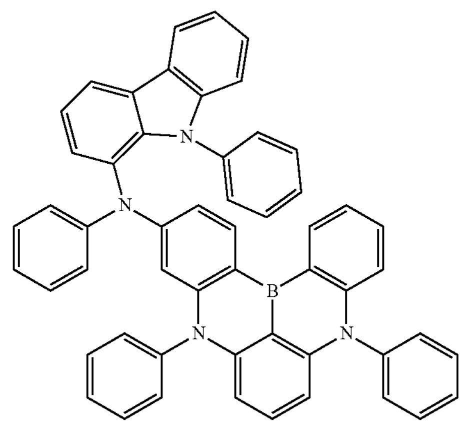
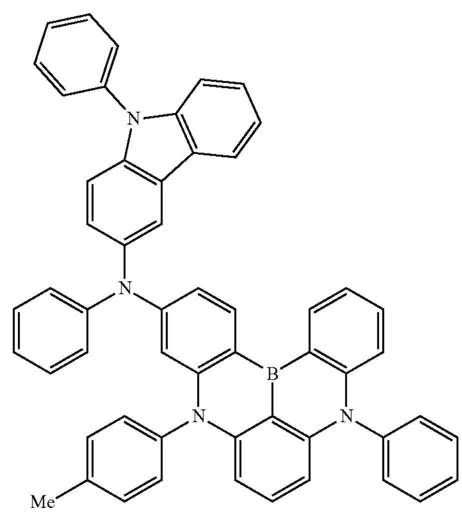

-continued
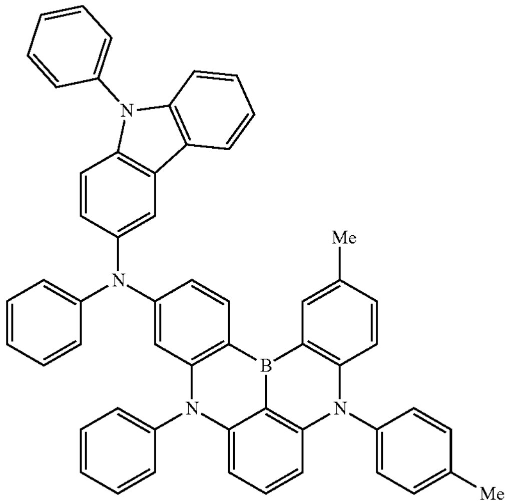
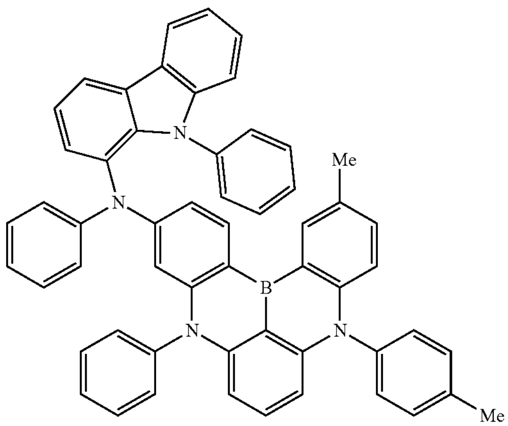
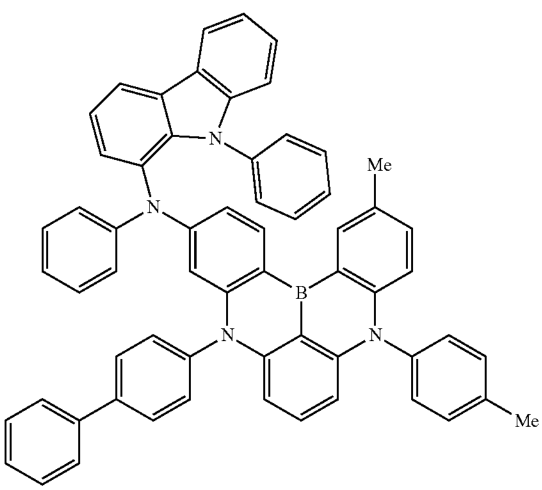
-continued
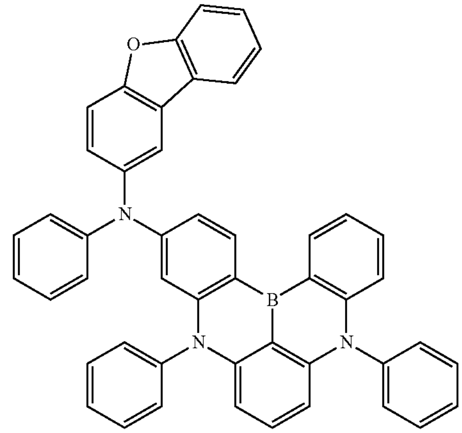
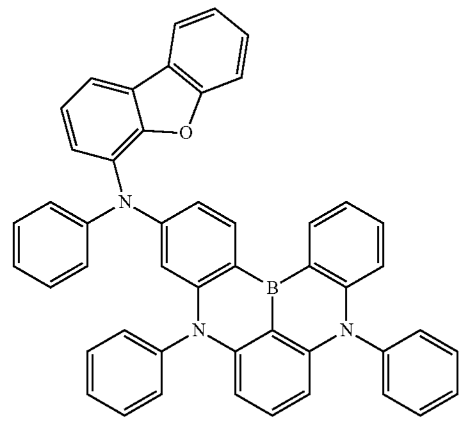
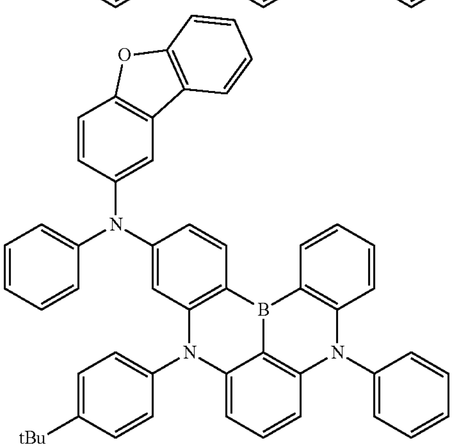
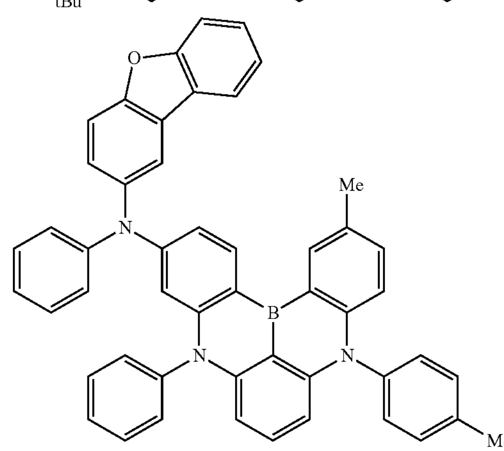

-continued
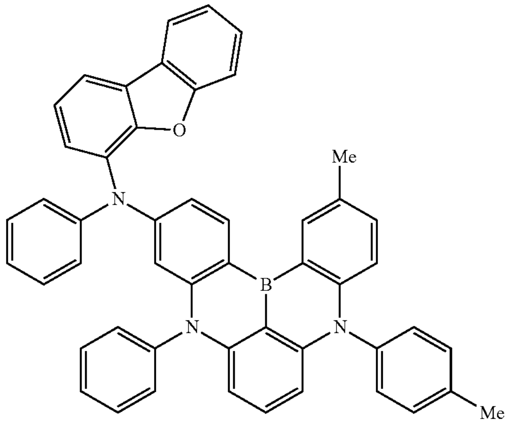
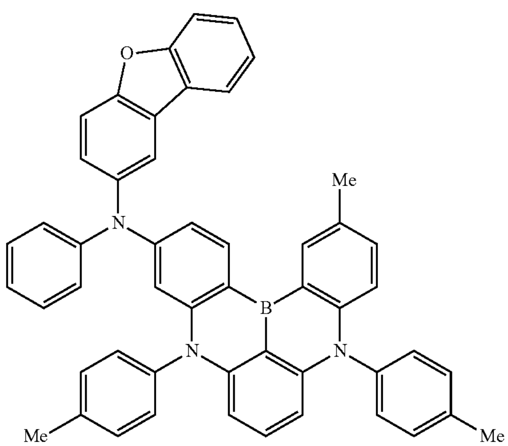
[Formula 201]
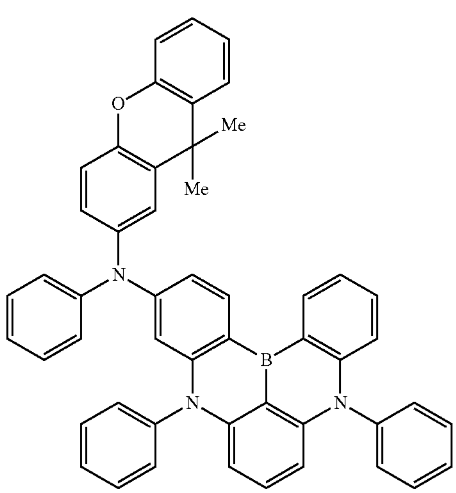
-continued
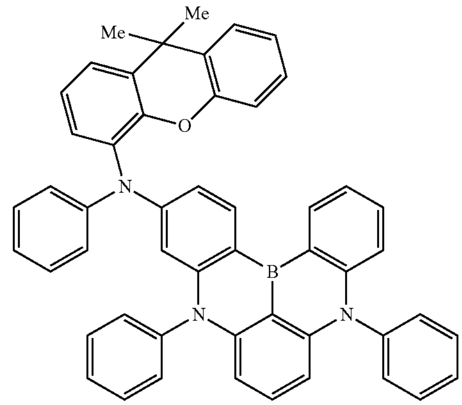
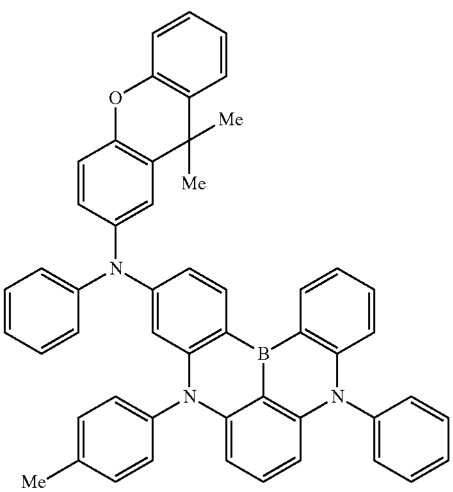
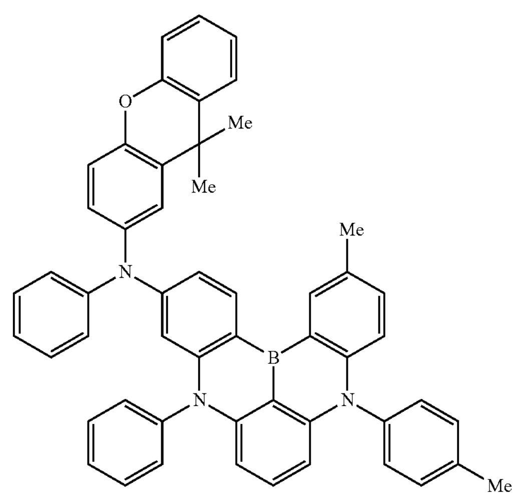

-continued
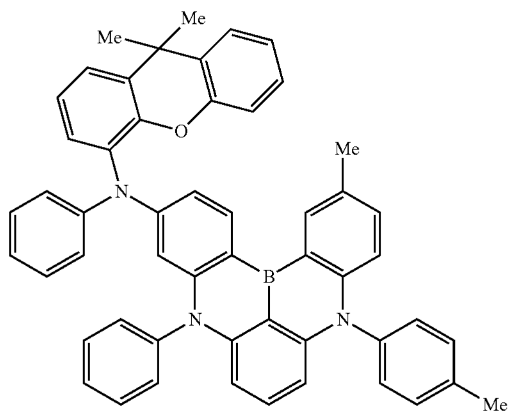
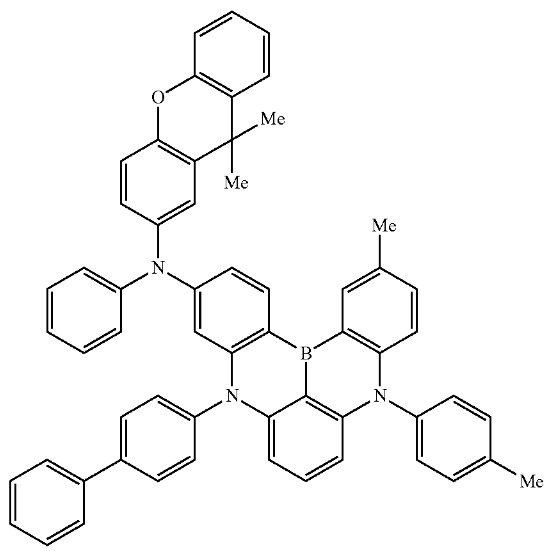
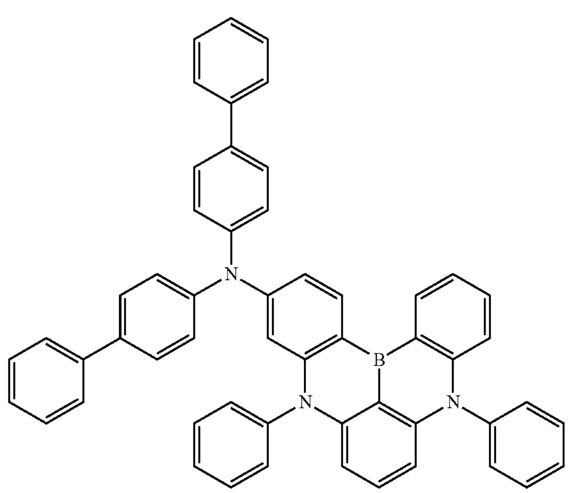
-continued
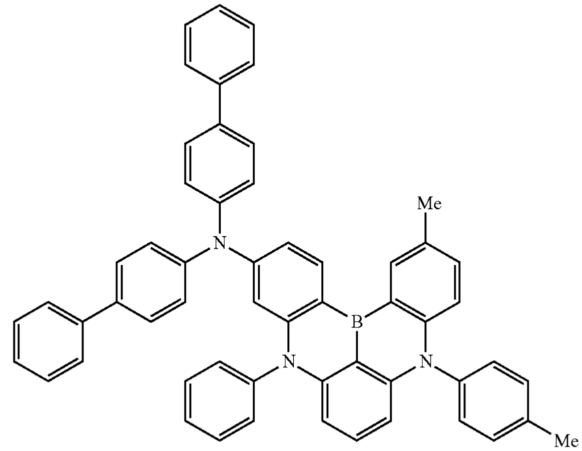
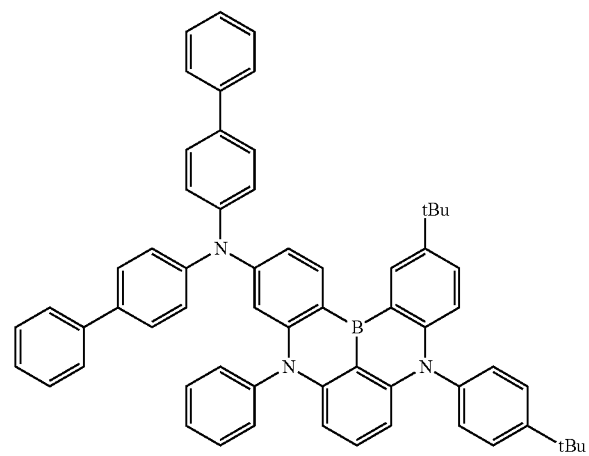
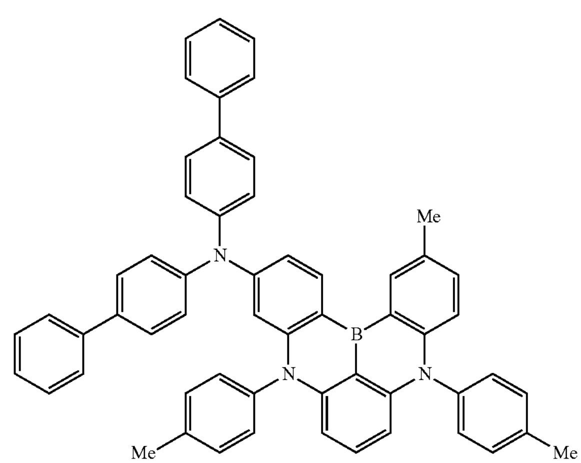

-continued
[Formula 202]
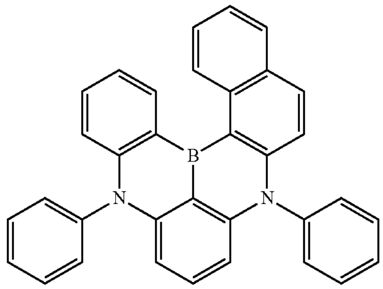
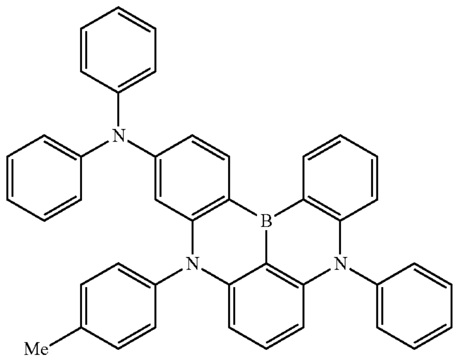
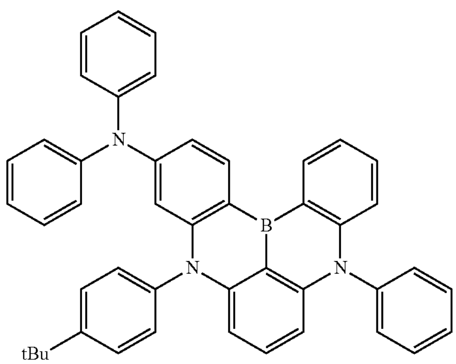
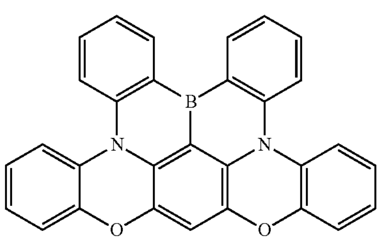
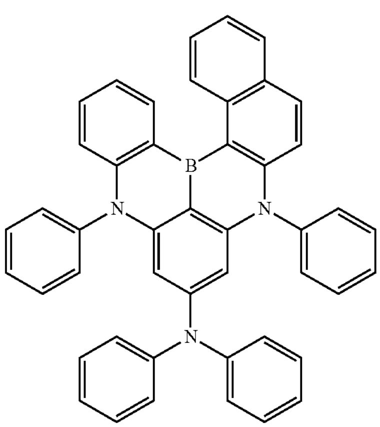
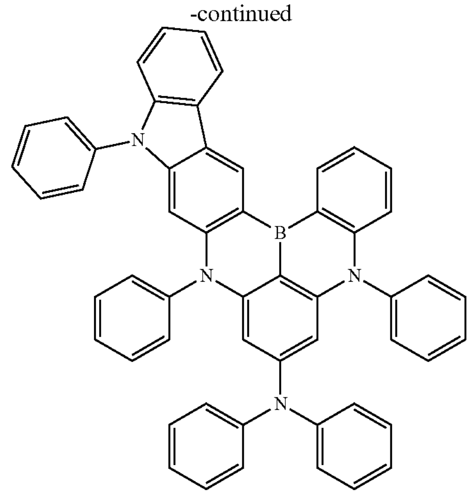
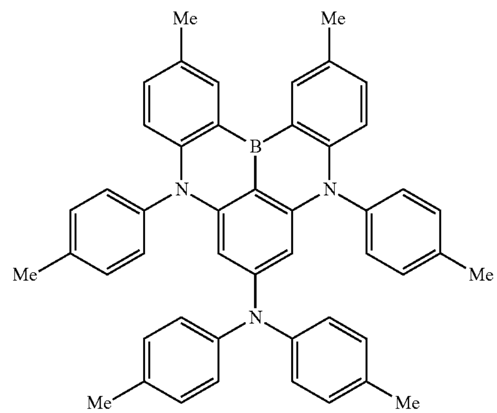
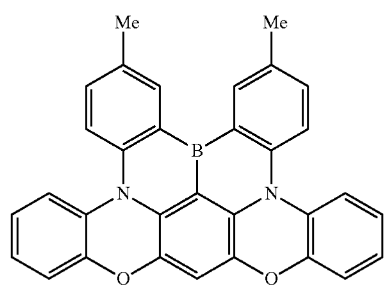
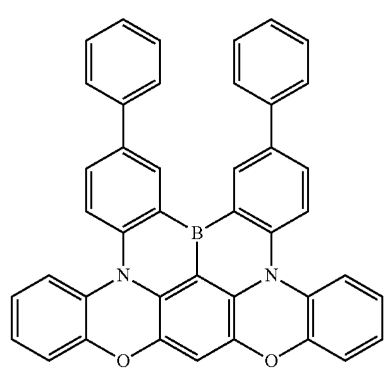

-continued
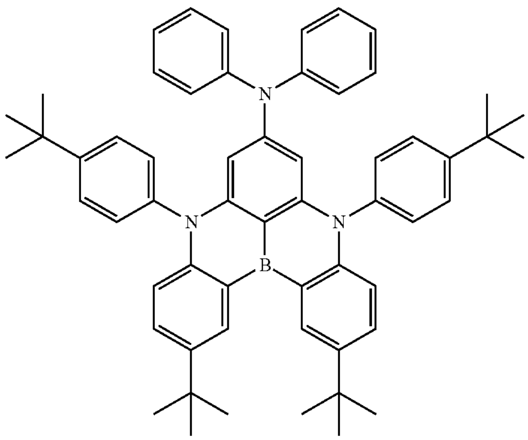 [SMILES: CC(C)(C)c1ccc(N2c3ccc(C(C)(C)C)cc3B3c4cc(C(C)(C)C)ccc4N(c4ccc(C(C)(C)C)cc4)c4cc(N(c5ccccc5)c5ccccc5)cc2c43)cc1]
[Formula 203]
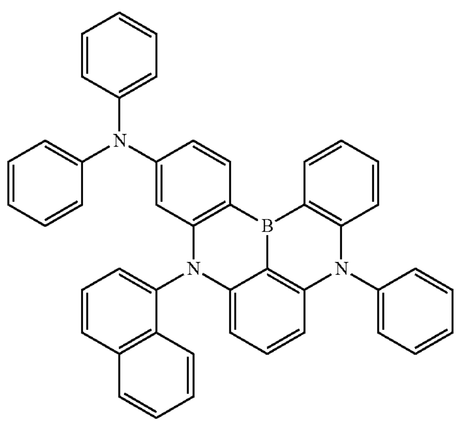
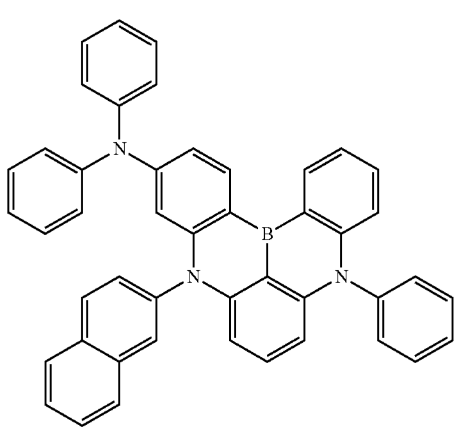
-continued
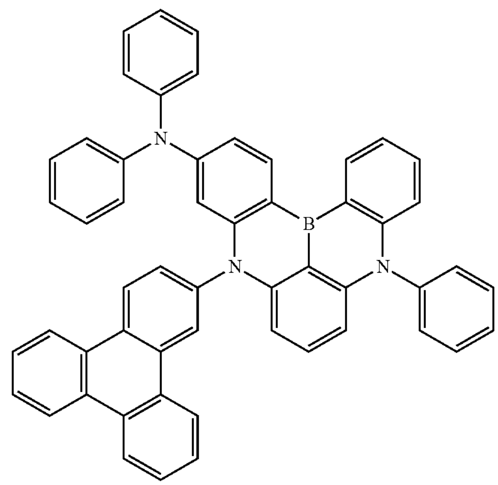
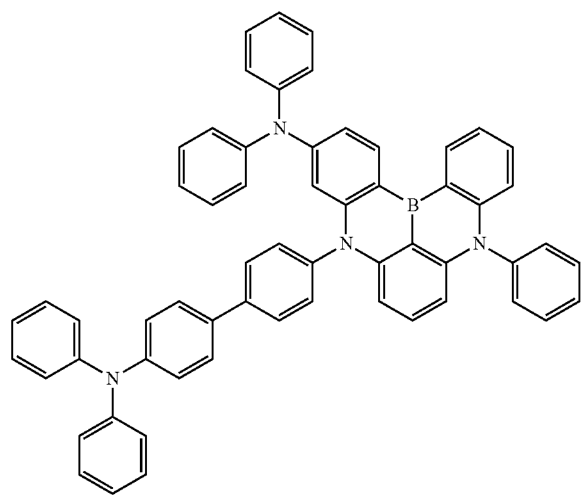
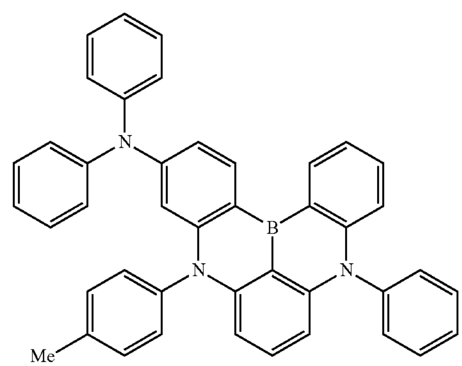
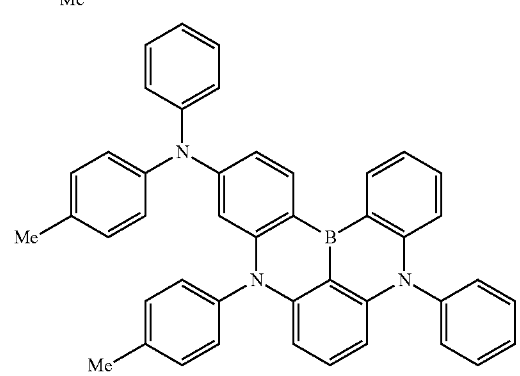

-continued
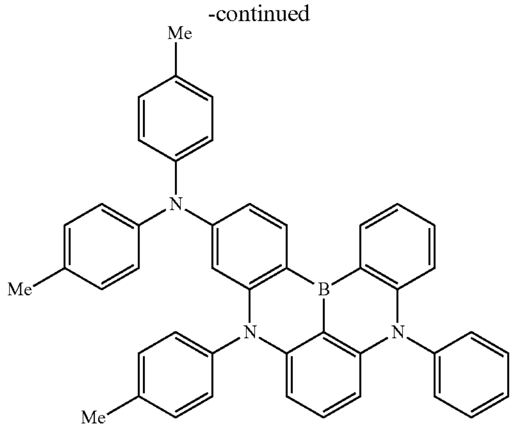
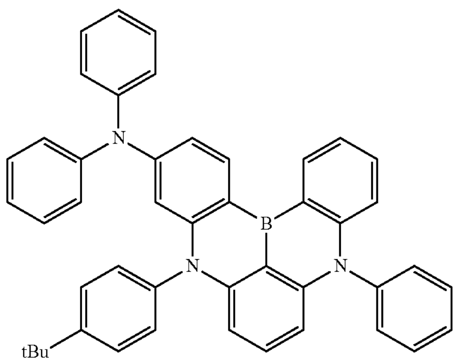
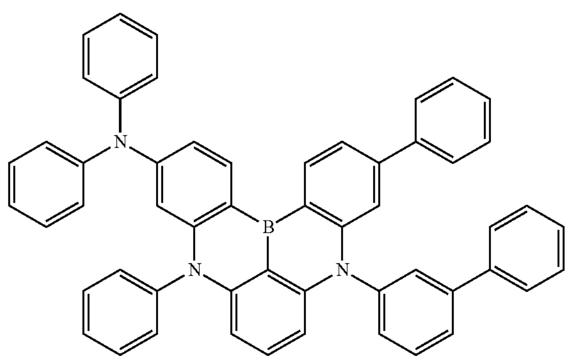
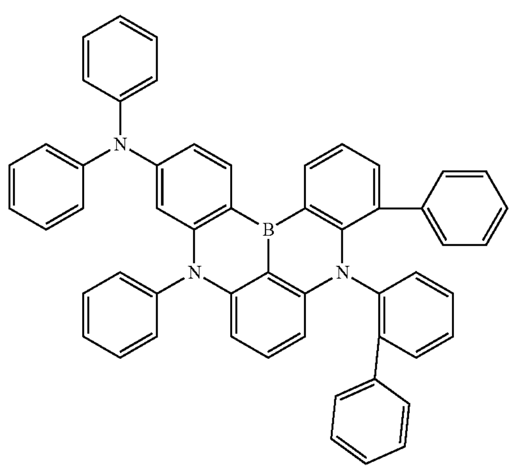
[Formula 204]
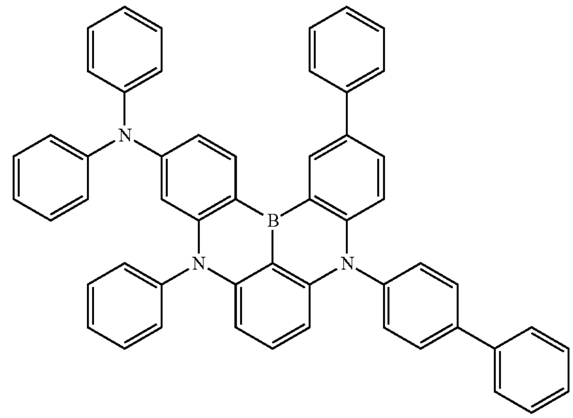
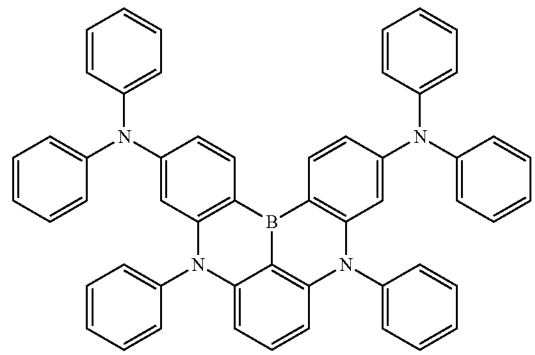
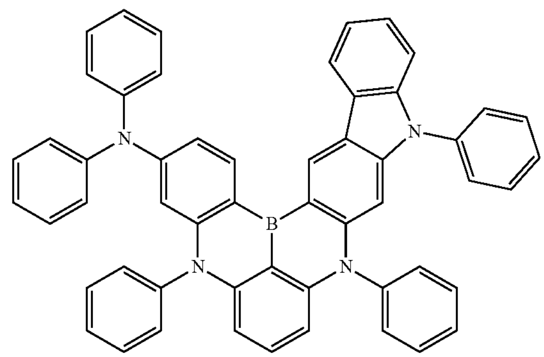
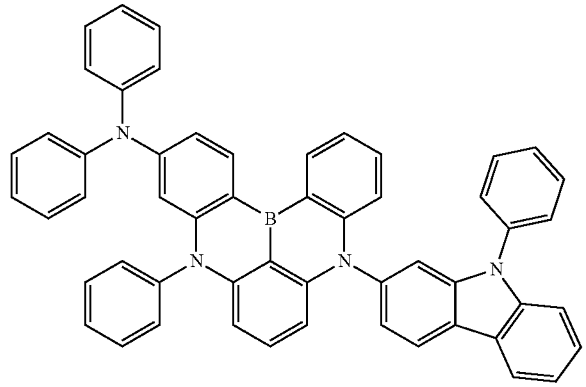

-continued
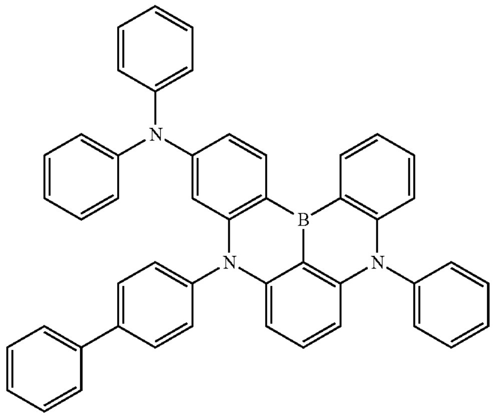
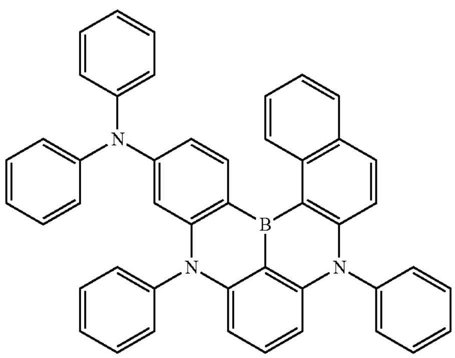
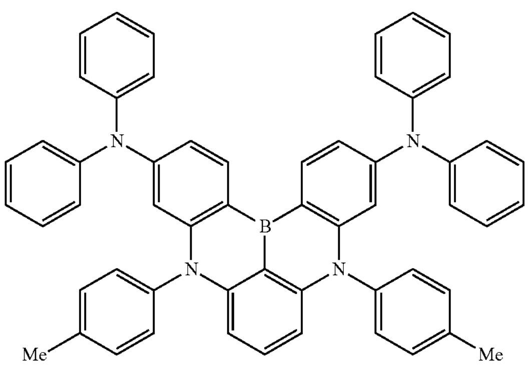
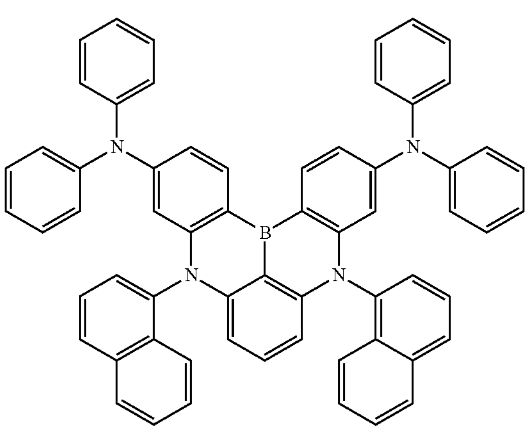
[Formula 205]
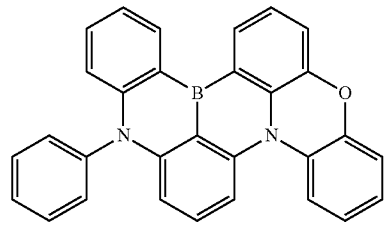
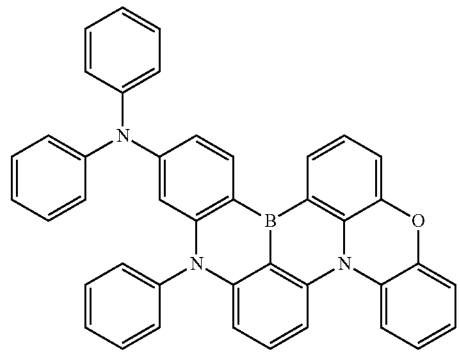
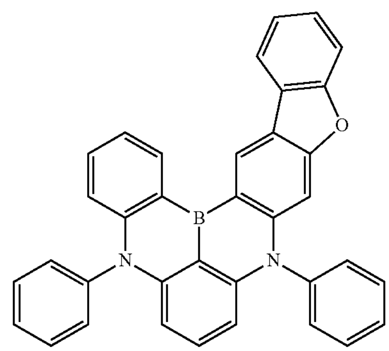
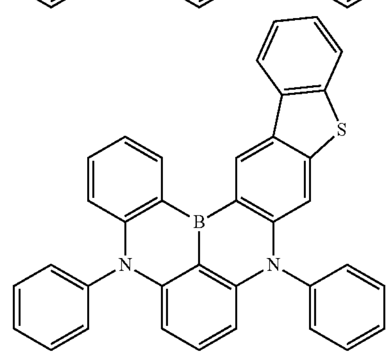
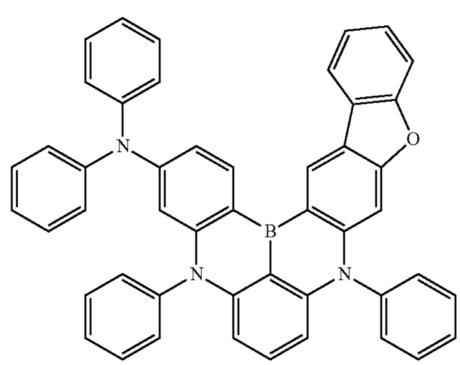

-continued
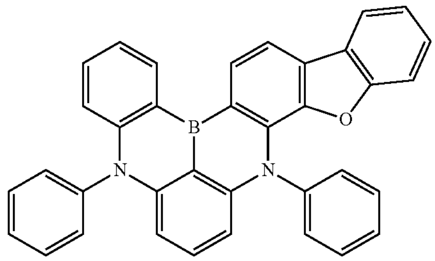
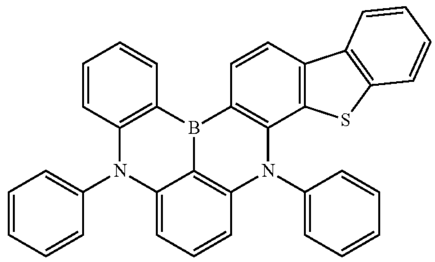
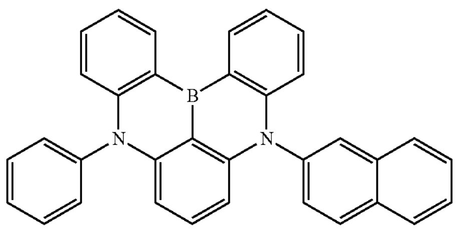
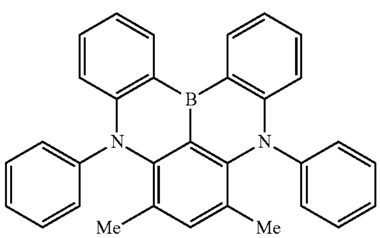
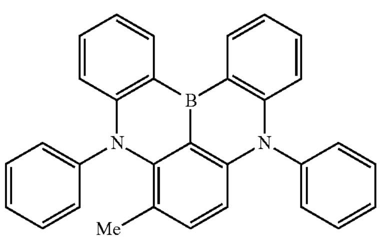
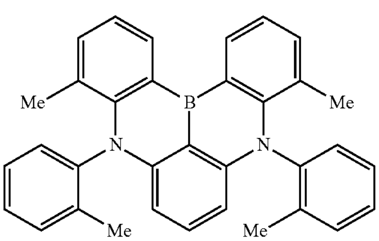
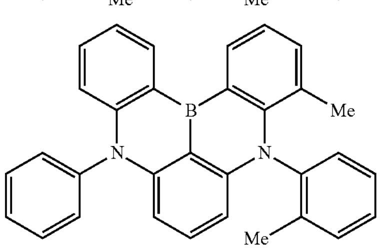
-continued
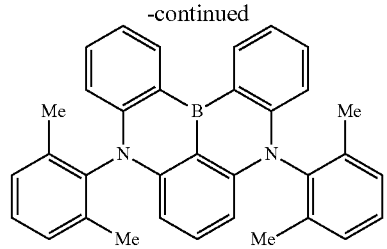
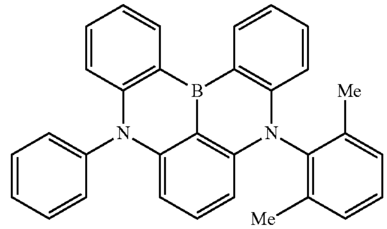
Compound Represented by Formula (7)
The compound represented by the formula (7) will be described below.
[Formula 206]
(7)
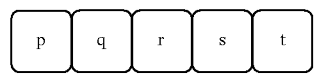
[Formula 207]
(72)
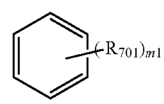
(73)
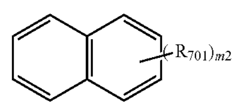
(74)
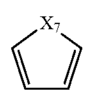
(75)
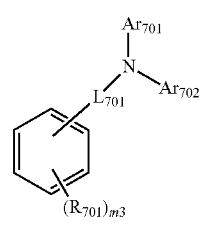
(76)
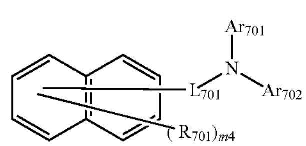
In the formula (7): r ring is a ring represented by the formula (72) or the formula (73), the r ring being fused with at any position(s) of respective adjacent rings;

q ring and s ring are each independently a ring represented by the formula (74) and fused with any position(s) of respective adjacent rings;

p ring and t ring are each independently a moiety represented by the formula (75) or the formula (76) and fused with any position(s) of respective adjacent rings;

$X_7$ is an oxygen atom, a sulfur atom, or $NR_{702}$;

when a plurality of $R_{701}$ are present, adjacent ones of the plurality of $R_{701}$ are mutually bonded to form a substituted or unsubstituted monocyclic ring, mutually bonded to form a substituted or unsubstituted fused ring, or not mutually bonded;

$R_{701}$ and $R_{702}$ not forming the monocyclic ring and not forming the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$Ar_{701}$ and $Ar_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$L_{701}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms;

m1 is 0, 1, or 2;

m2 is 0, 1, 2, 3, or 4;

m3 is each independently 0, 1, 2, 3 or 3;

m4 is each independently 0, 1, 2, 3, 4, or 5;

when a plurality of $R_{701}$ are present, the plurality of $R_{701}$ are mutually the same or different;

when a plurality of $X_7$ are present, the plurality of $X_7$ are mutually the same or different;

when a plurality of $R_{702}$ are present, the plurality of $R_{702}$ are mutually the same or different;

when a plurality of $Ar_{701}$ are present, the plurality of $Ar_{701}$ are mutually the same or different;

when a plurality of $Ar_{702}$ are present, the plurality of $Ar_{702}$ are mutually the same or different; and when a plurality of $L_{701}$ are present, the plurality of $L_{701}$ are mutually the same or different.

In the formula (7), each of the p ring, q ring, r ring, s ring, and t ring is fused with an adjacent ring(s) sharing two carbon atoms. The fused position and orientation are not limited but may be defined as required.

In an exemplary embodiment, in the formula (72) or the formula (73) representing the r ring, m1=0 or m2=0.

In an exemplary embodiment, the compound represented by the formula (7) is represented by any one of formulae (71-1) to (71-6) below.

[Formula 208]

(71-1)

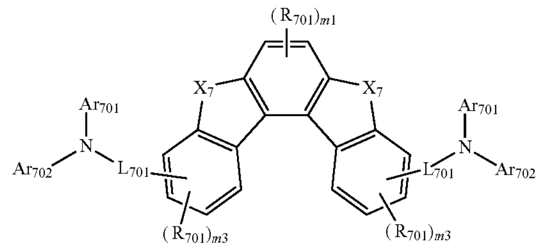

[Formula 209]

(71-2)

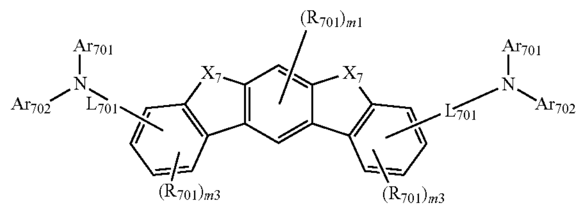

[Formula 210]

(71-3)

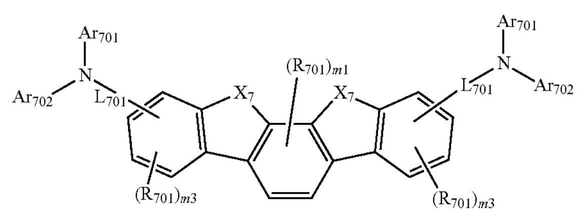

[Formula 211]

(71-4)

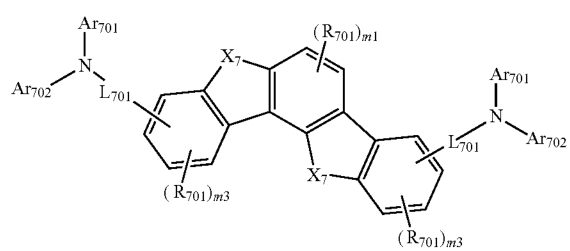

[Formula 212]

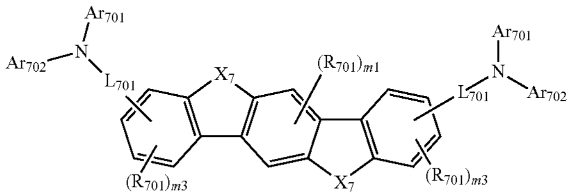

(71-5)

[Formula 213]

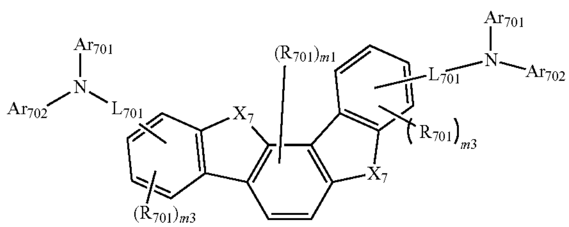

(71-6)

In the formulae (71-1) to (71-6), $R_{701}$, $X_7$, $Ar_{701}$, $Ar_{702}$, $L_{701}$, m1 and m3 respectively represent the same as $R_{701}$, $X_7$, $Ar_{701}$, $Ar_{702}$, $L_{701}$, m1 and m3 in the formula (7).

In an exemplary embodiment, the compound represented by the formula (7) is represented by any one of formulae (71-11) to (71-13) below.

[Formula 214]

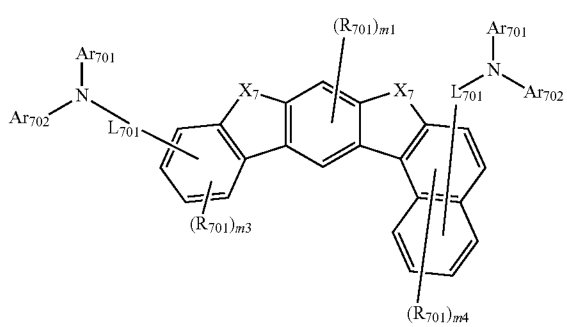

(71-11)

[Formula 215]

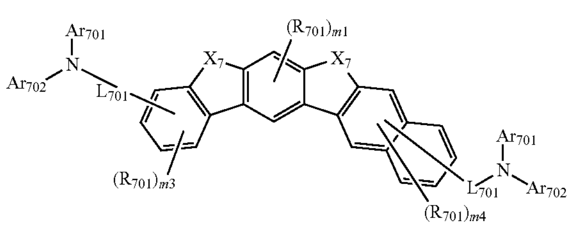

(71-12)

[Formula 216]

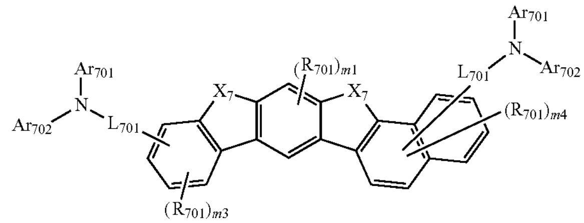

(71-13)

In the formulae (71-11) to (71-13), $R_{701}$, $X_7$, $Ar_{701}$, $Ar_{702}$, $L_{701}$, m1, m3 and m4 respectively represent the same as $R_{701}$, $X_7$, $Ar_{701}$, $Ar_{702}$, $L_{701}$, m1, m3 and m4 in the formula (7).

In an exemplary embodiment, the compound represented by the formula (7) is represented by any one of formulae (71-21) to (71-25) below.

[Formula 217]

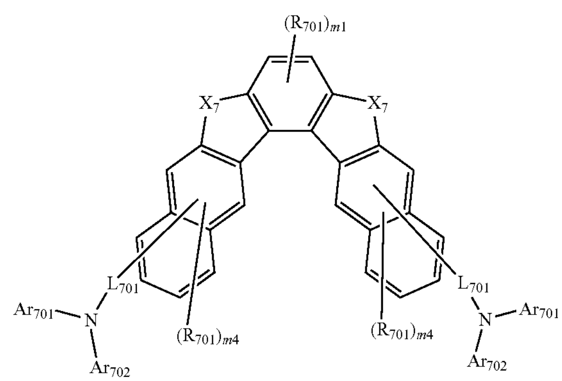

(71-21)

[Formula 218]

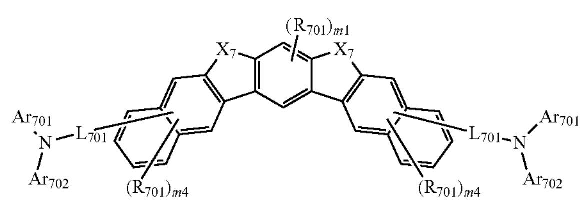

(71-22)

[Formula 219]
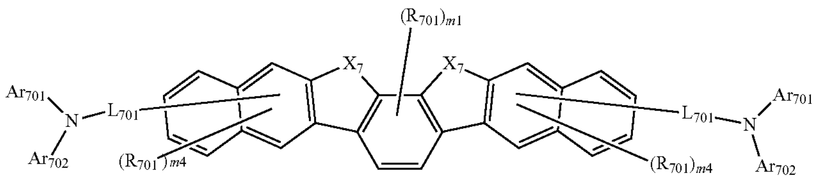
(71-23)
[Formula 220]
(71-24)
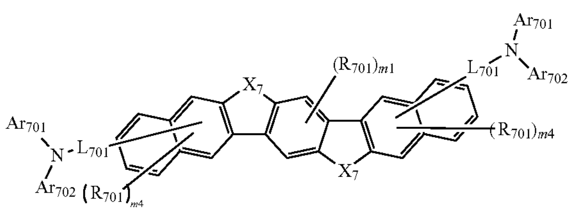
[Formula 221]
(71-25)
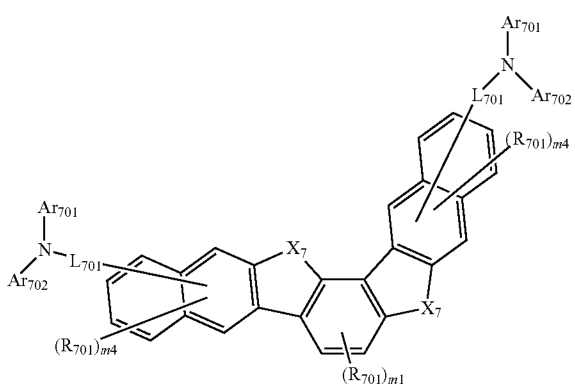
In the formulae (71-21) to (71-25), $R_{701}$, $X_7$, $Ar_{701}$, $Ar_{702}$, $L_{701}$, m1, and m4 respectively represent the same as $R_{701}$, $X_7$, $Ar_{701}$, $Ar_{702}$, $L_{701}$, m1, and m4 in the formula (7).
In an exemplary embodiment, the compound represented by the formula (7) is represented by any one of formulae (71-31) to (71-33) below.
[Formula 222]
(71-31)
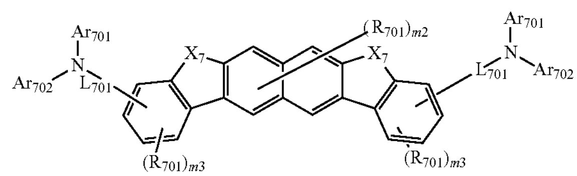
[Formula 223]
(71-32)
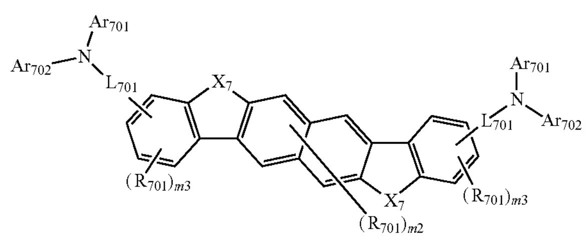
[Formula 224]
(71-33)
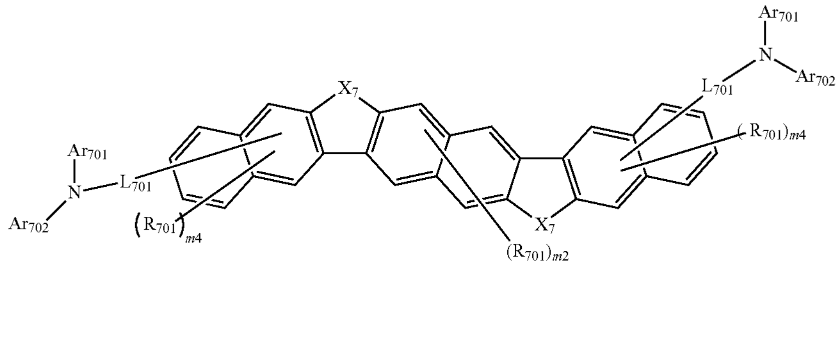

In the formulae (71-31) to (71-33), $R_{701}$, $X_7$, $Ar_{701}$, $Ar_{702}$, $L_{701}$, and m2 to m4 respectively represent the same as $R_{701}$, $X_7$, $Ar_{701}$, $Ar_{702}$, $L_{701}$, and m2 to m4 in the formula (7).

In an exemplary embodiment, $Ar_{701}$ and $Ar_{702}$ are each independently a substituted or unsubstituted aryl group having 6 to 50 ring carbon atoms.

In an exemplary embodiment, one of $Ar_{701}$ and $Ar_{702}$ is a substituted or unsubstituted aryl group having 6 to 50 ring carbon atoms, and the other of $Ar_{701}$ and $Ar_{702}$ is a substituted or unsubstituted heterocyclic group having 5 to 50 ring atoms.

Specific Examples of Compound Represented by Formula (7)

Specific examples of the compound represented by the formula (7) include compounds shown below.

[Formula 225]

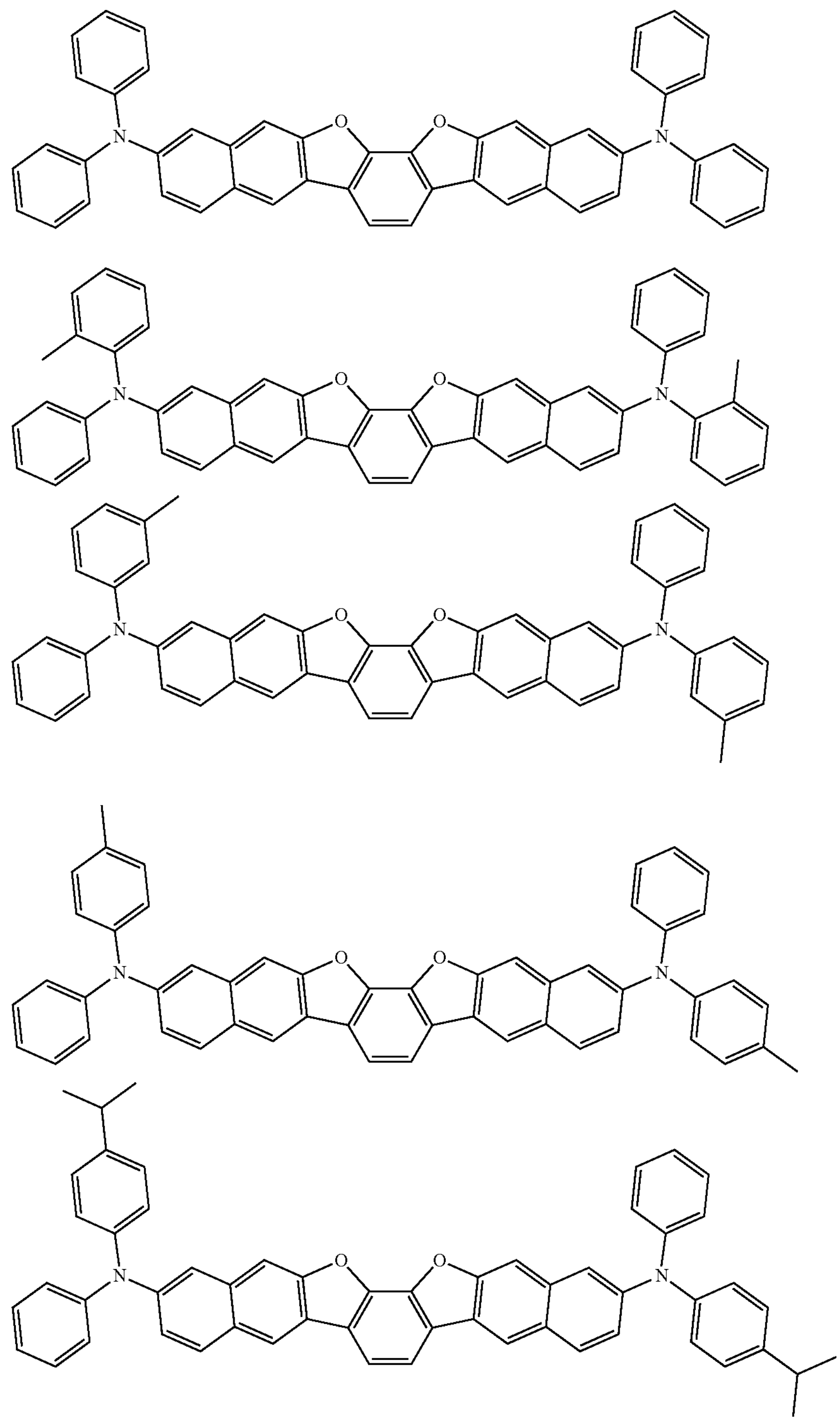

-continued
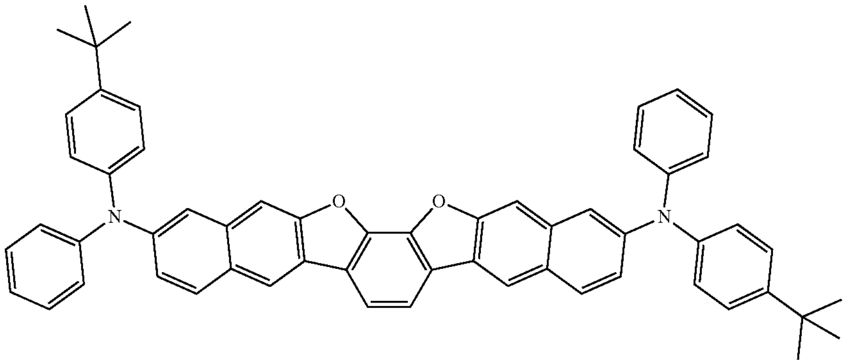
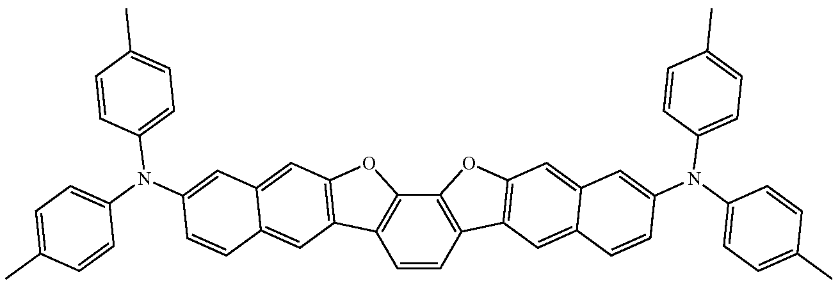
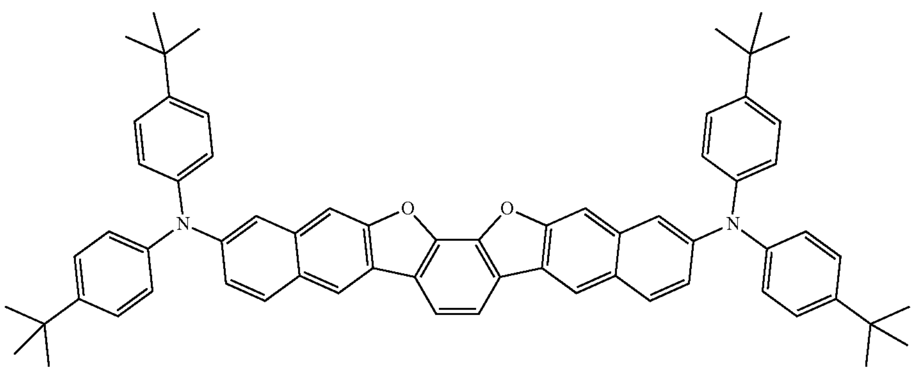
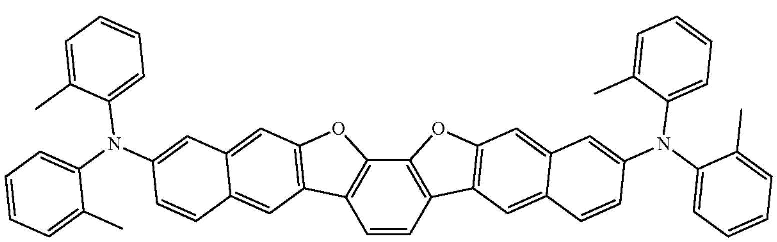
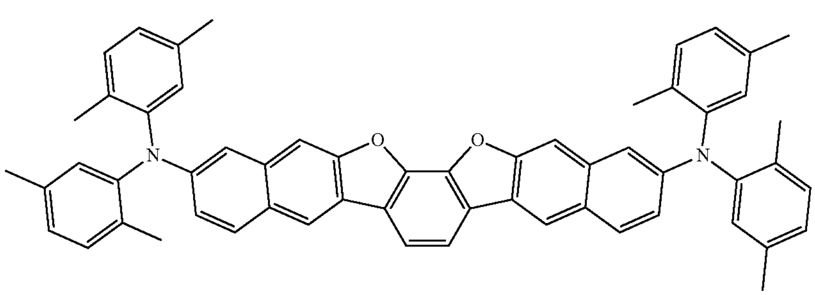

-continued
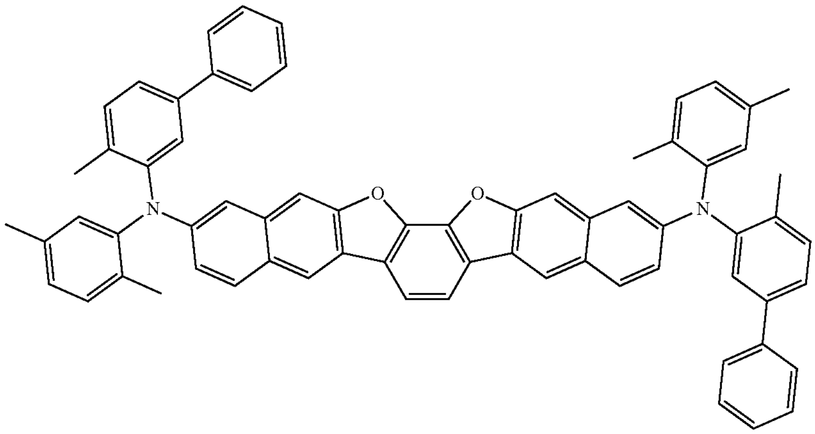
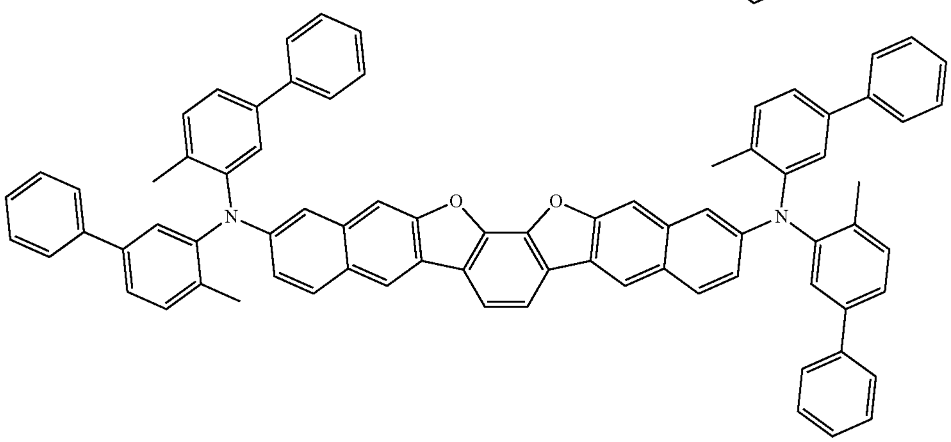
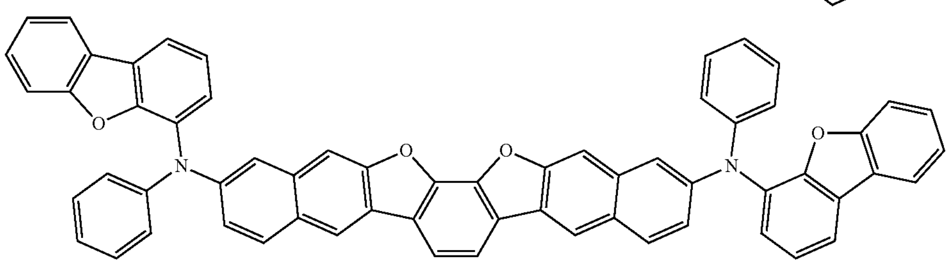
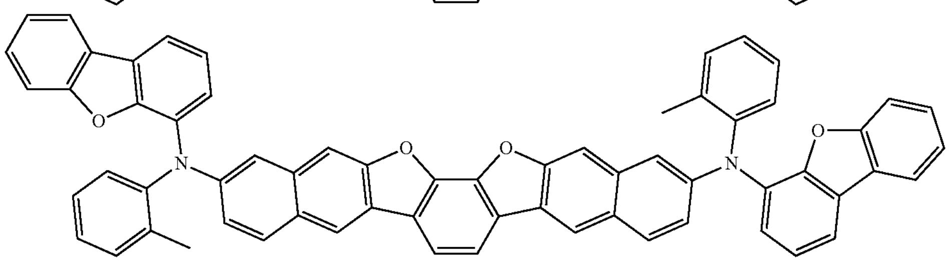
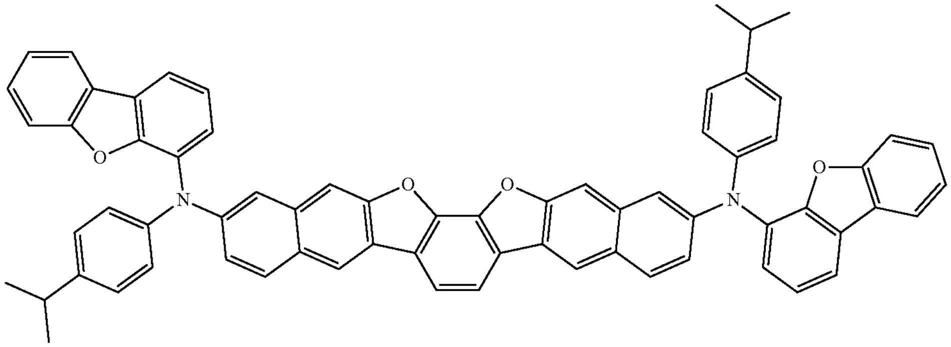

-continued
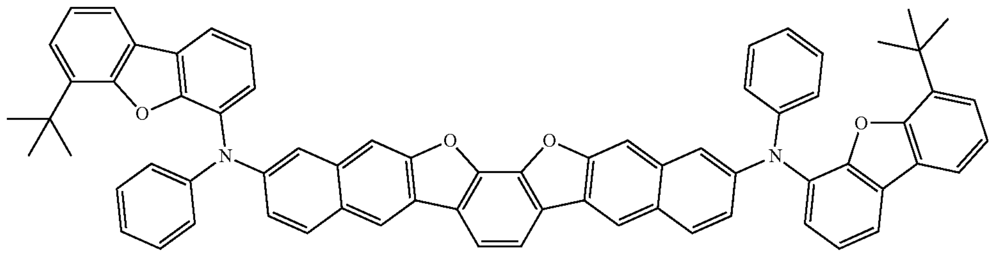
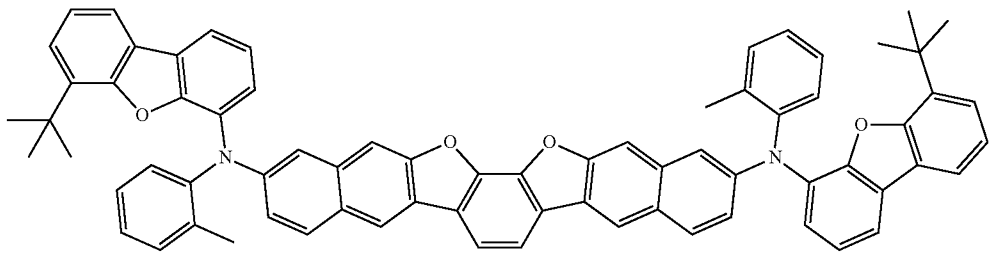
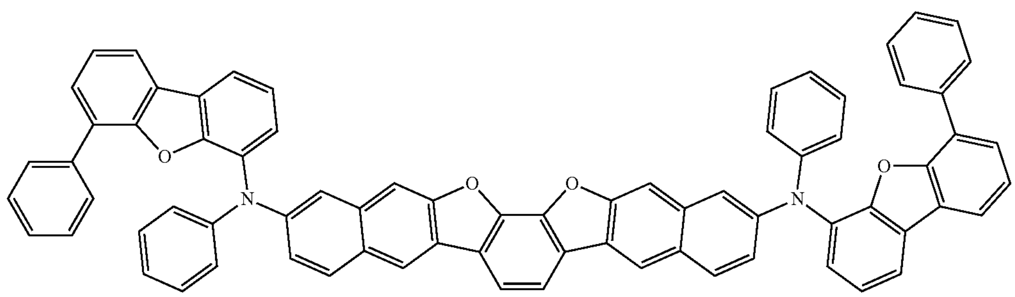
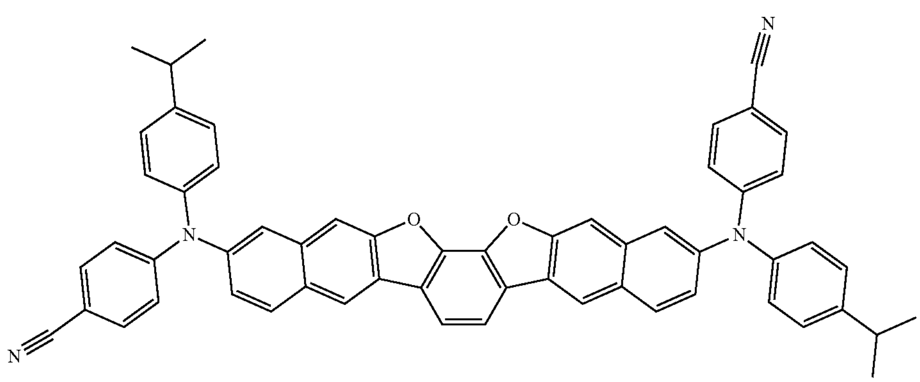
[Formula 226]
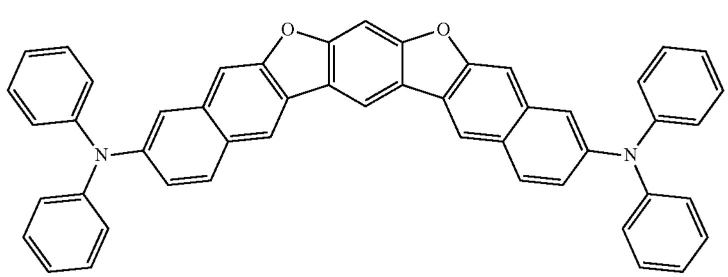

-continued
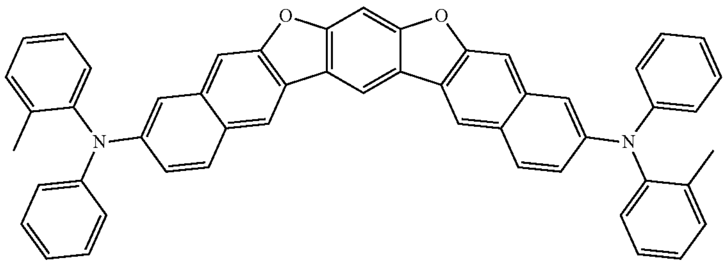
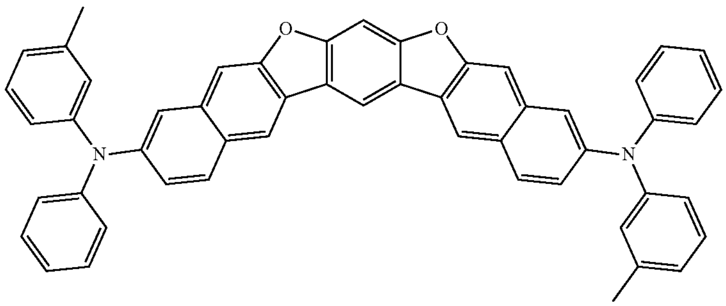
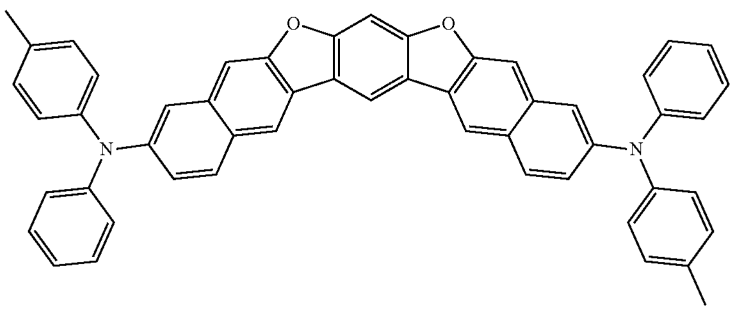
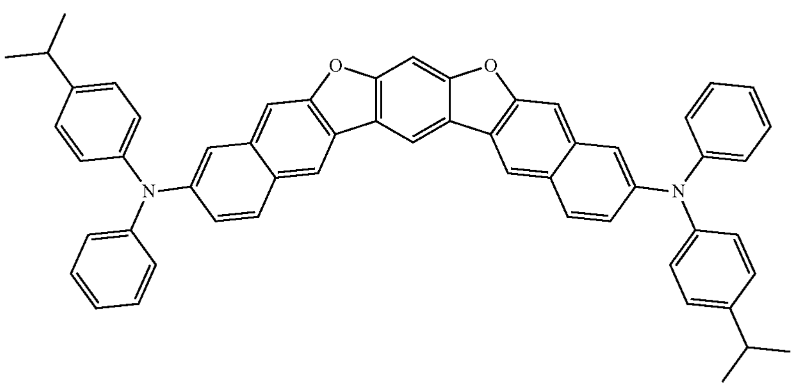
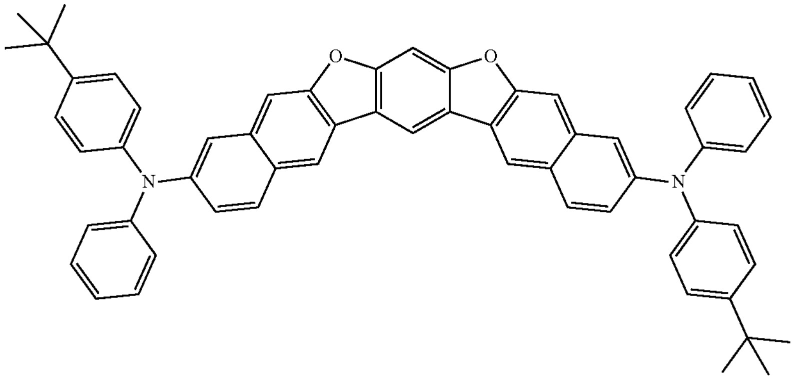

-continued
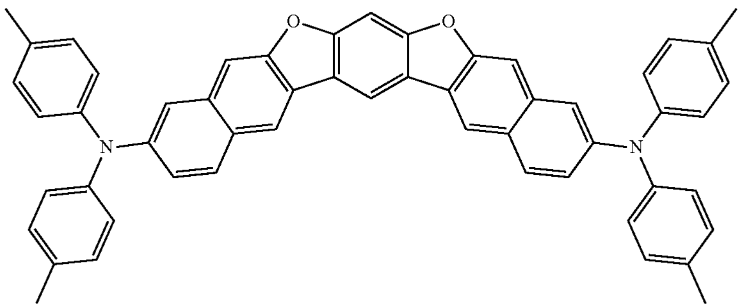
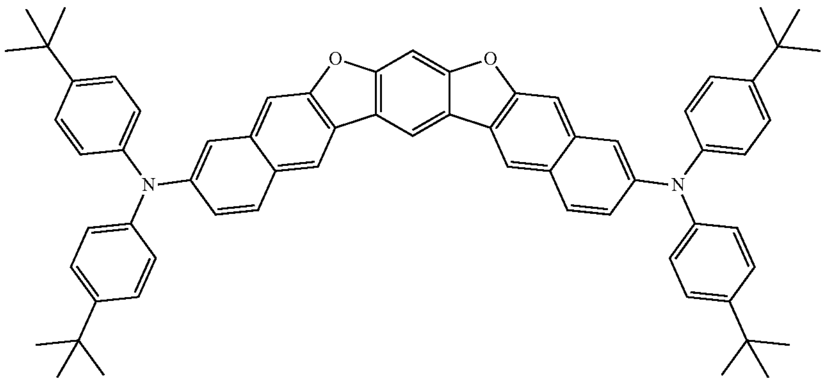
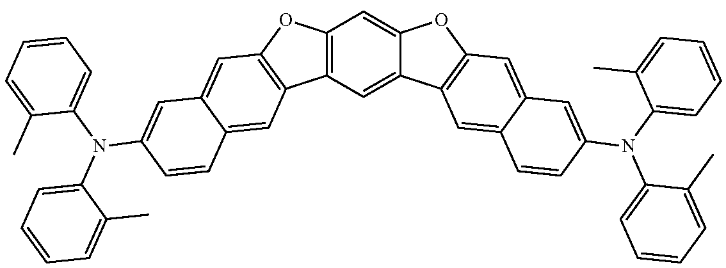
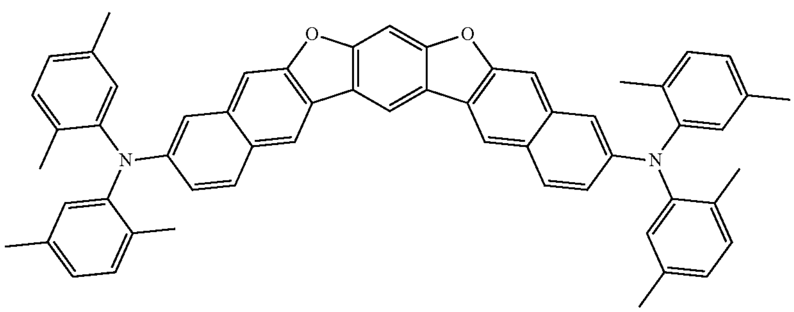
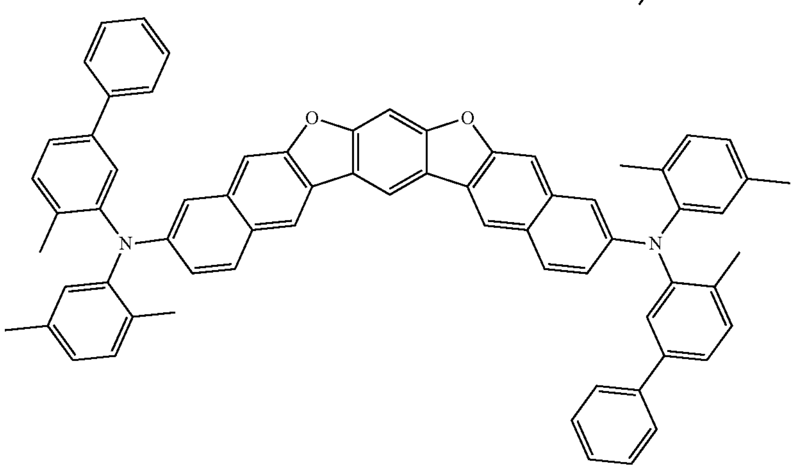

-continued
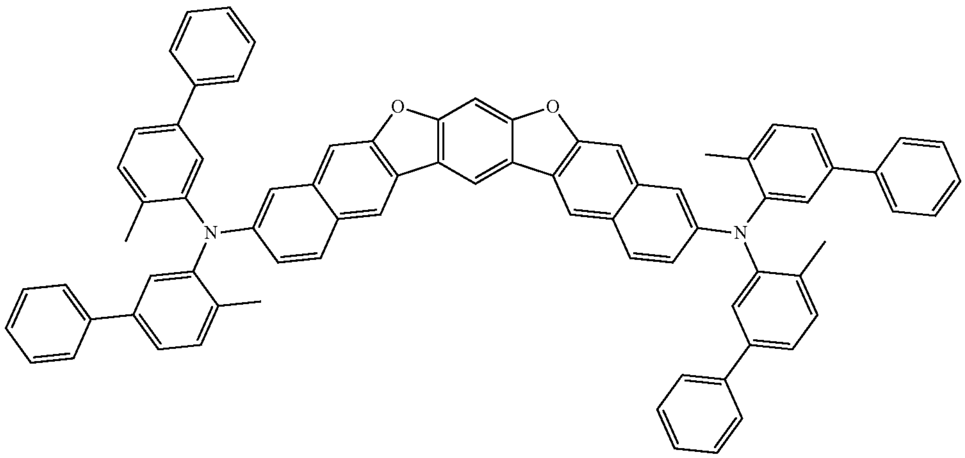
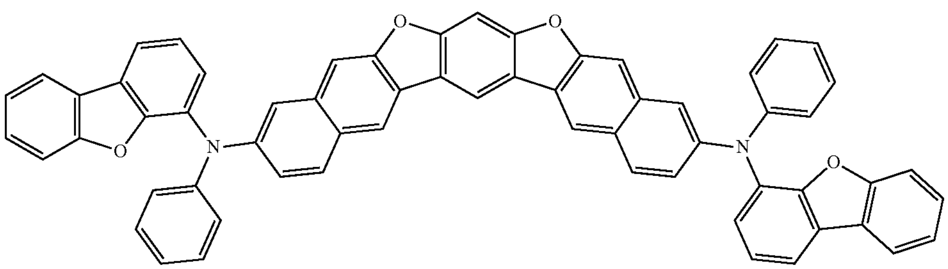
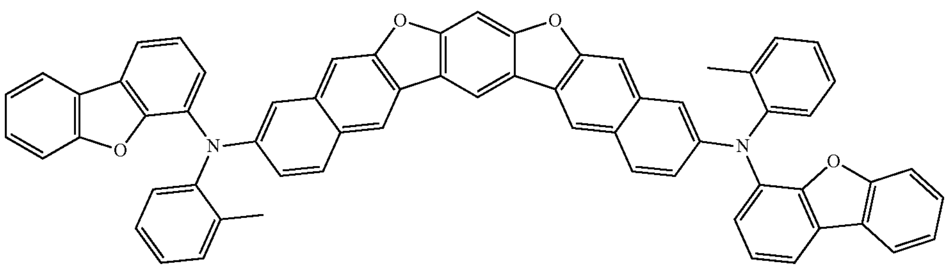
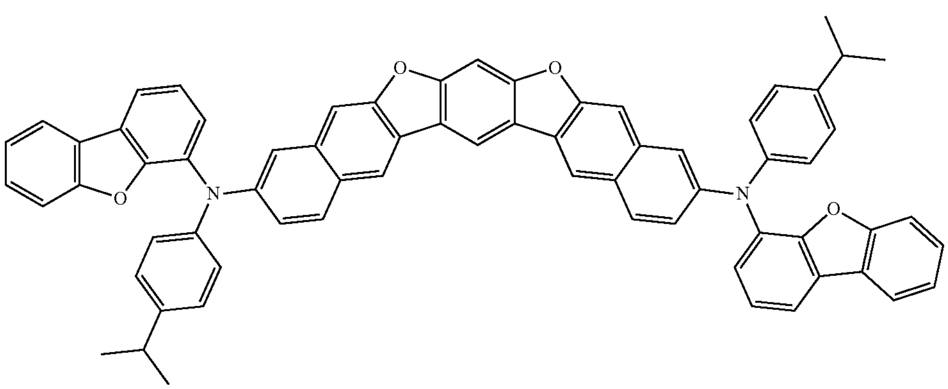
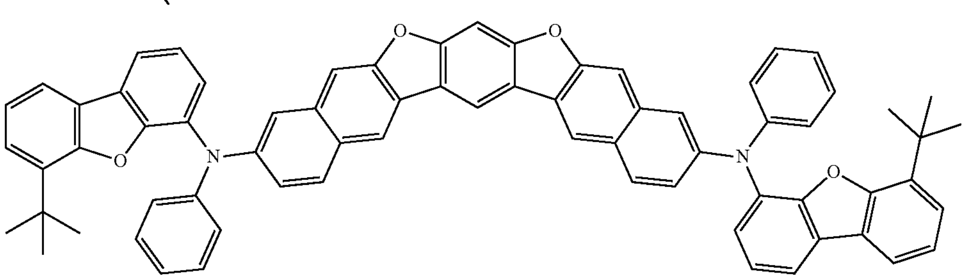

-continued
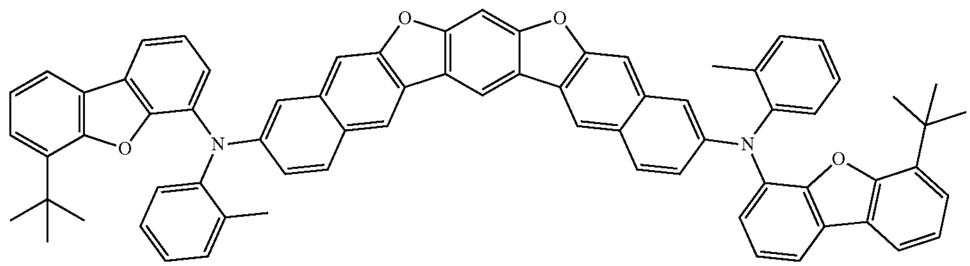
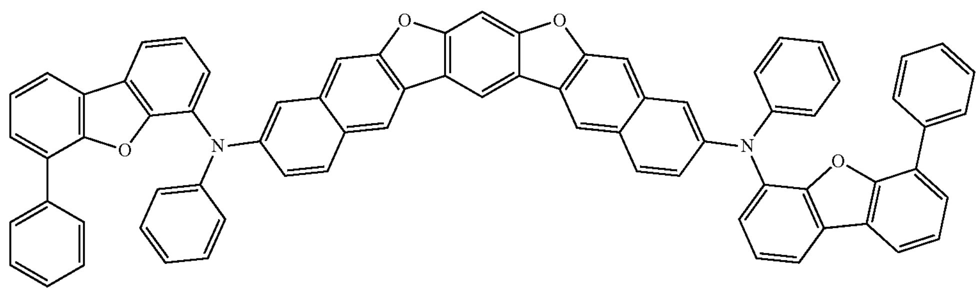
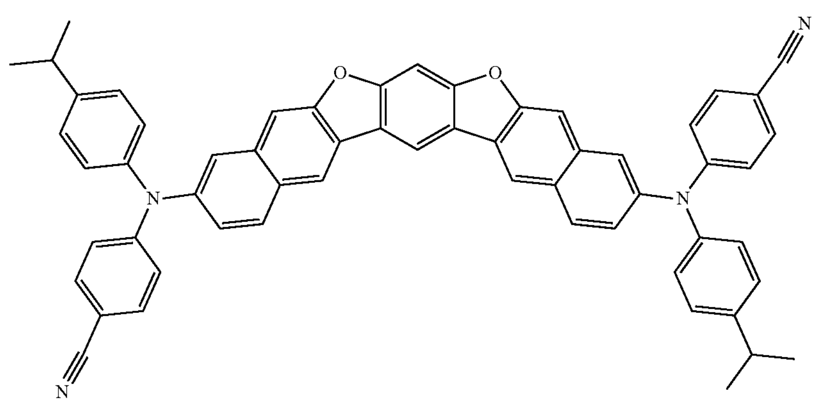
[Formula 227]
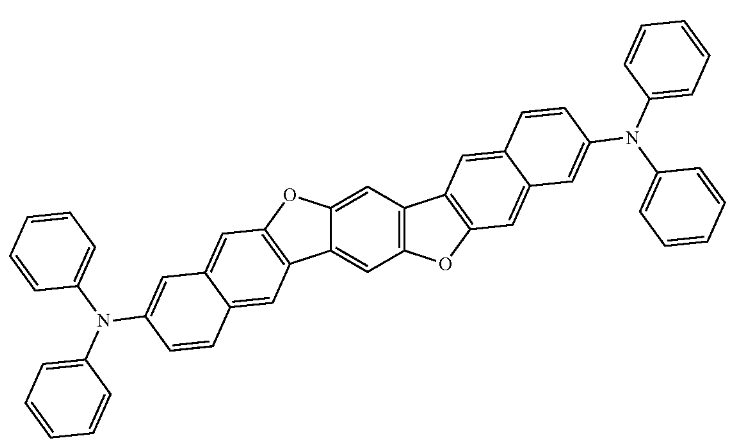

-continued
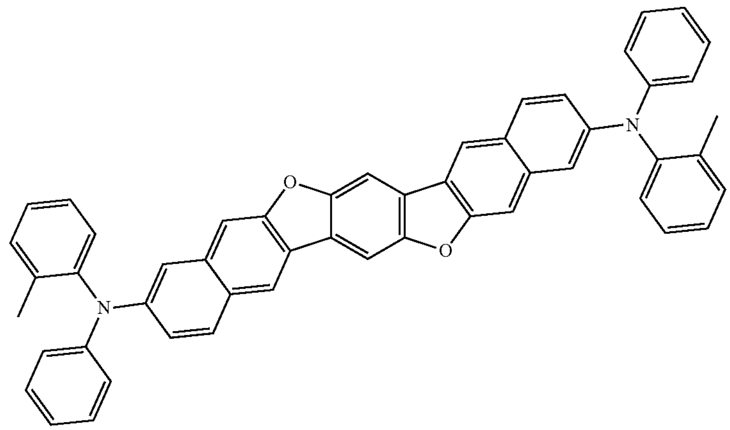
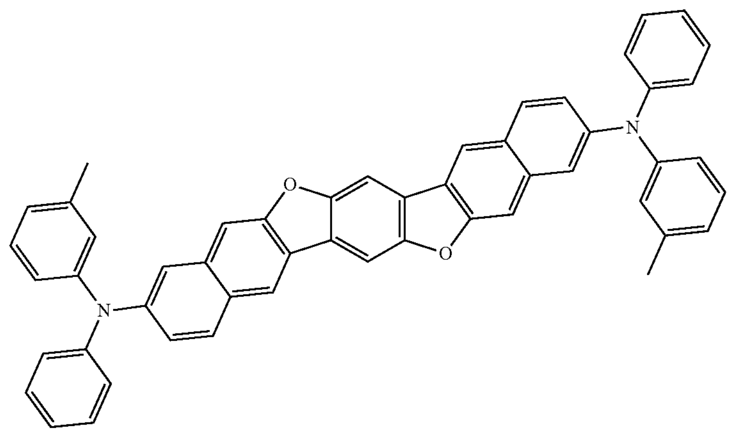
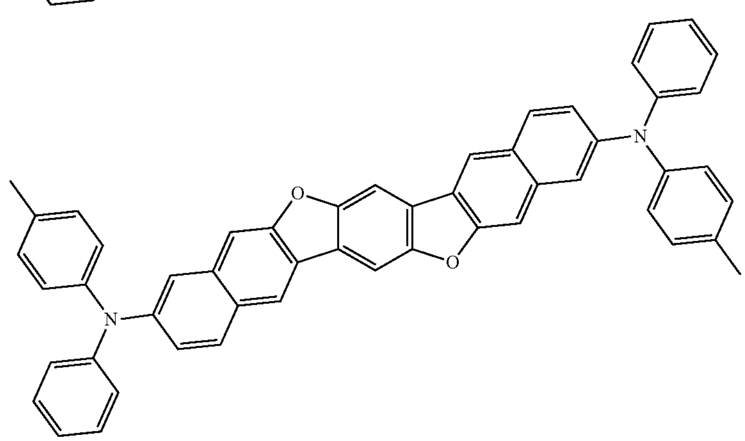
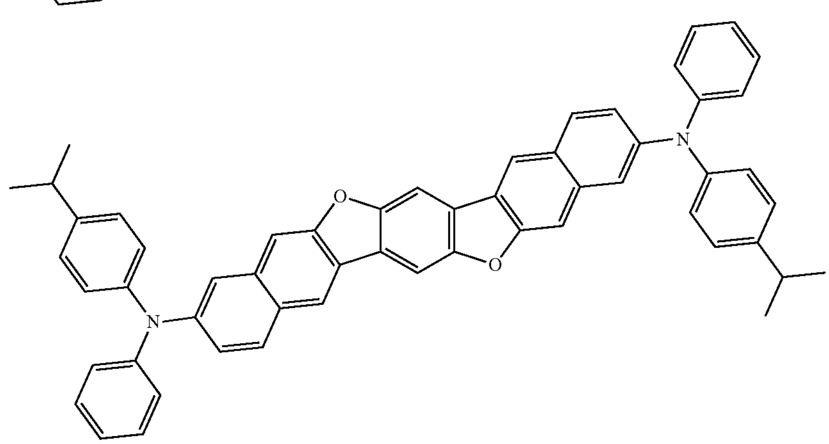

-continued
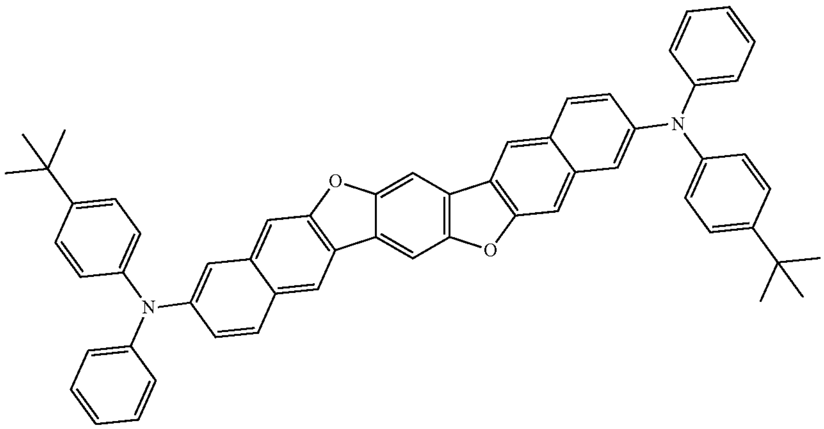
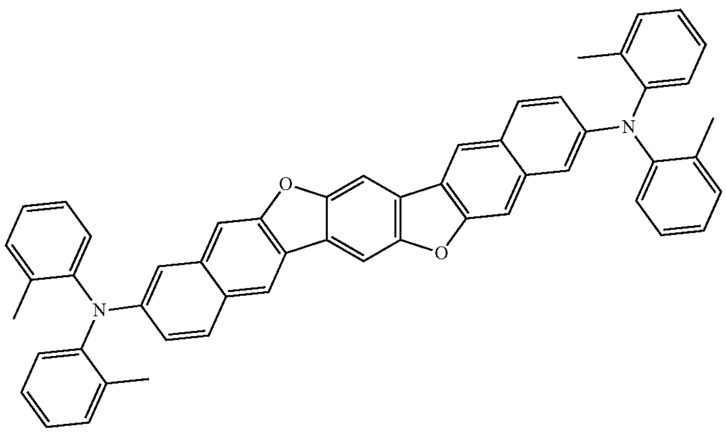
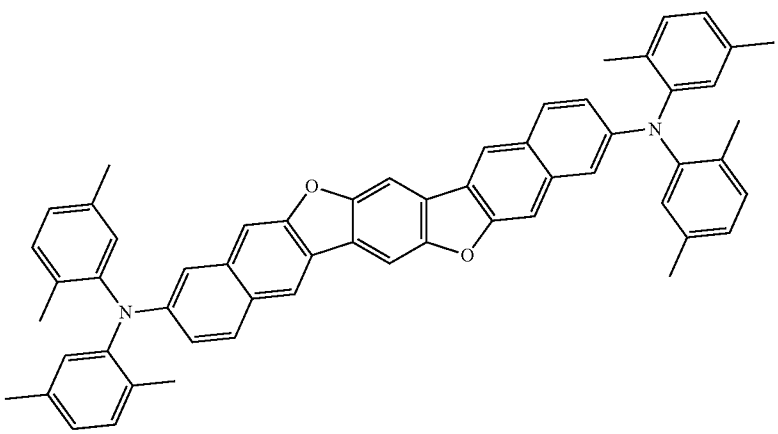
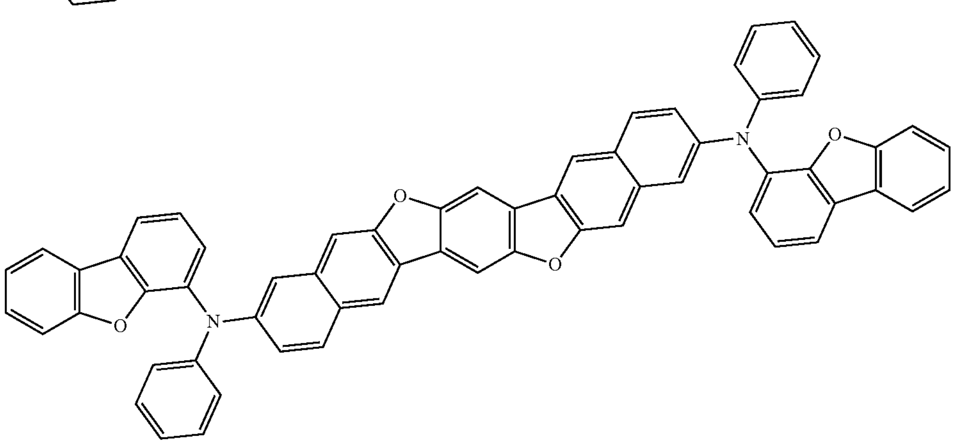

-continued
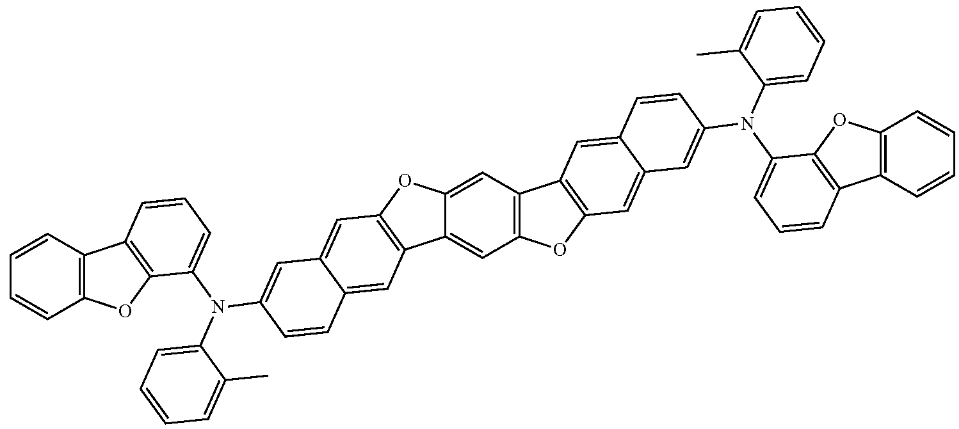
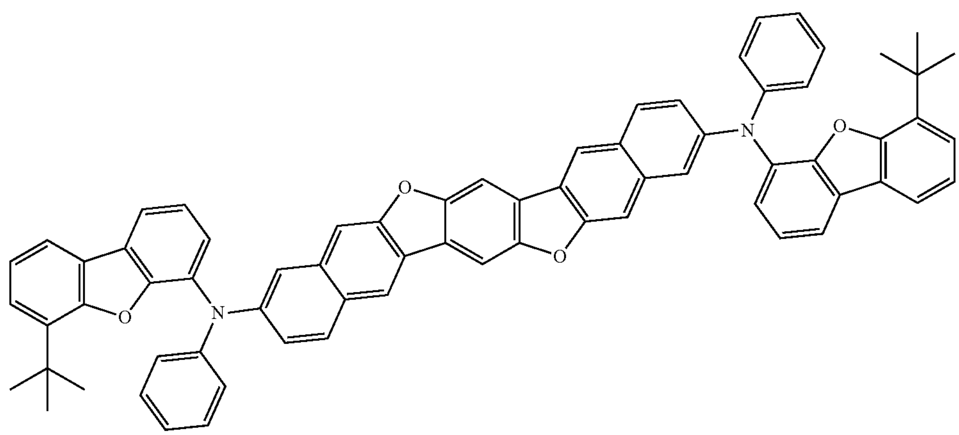
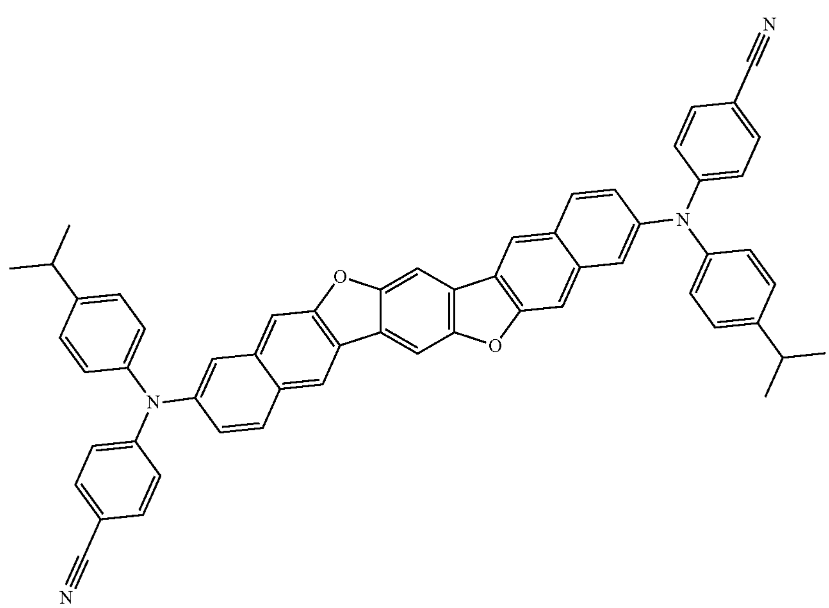

-continued
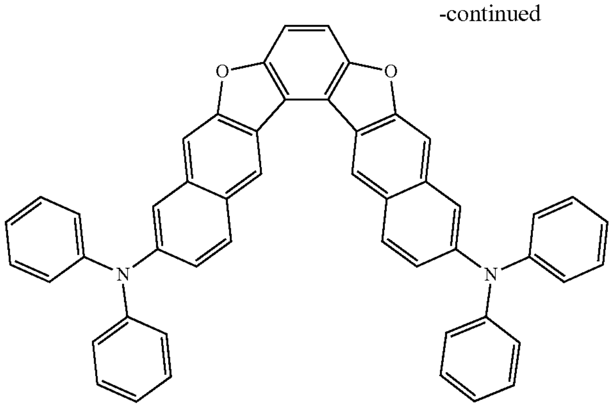
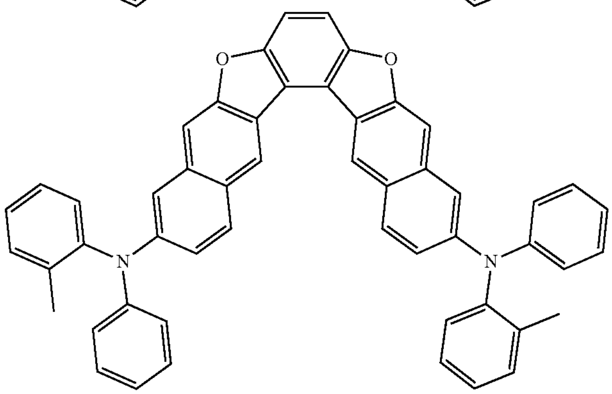
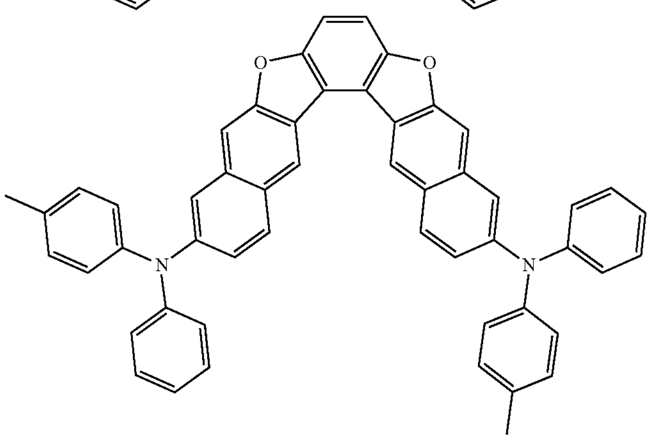
[Formula 228]
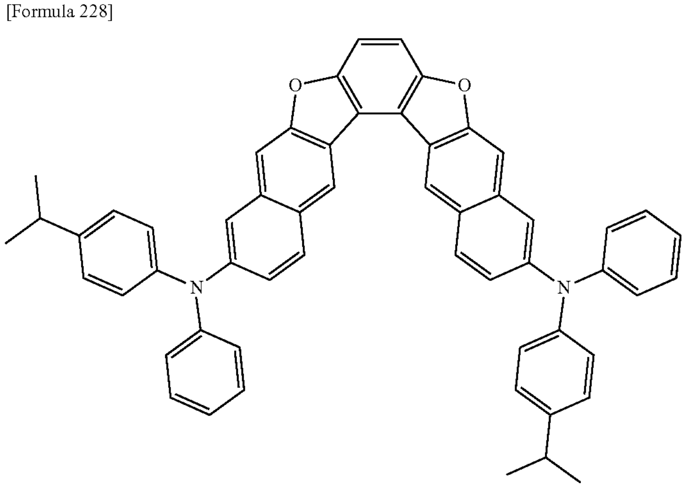

-continued
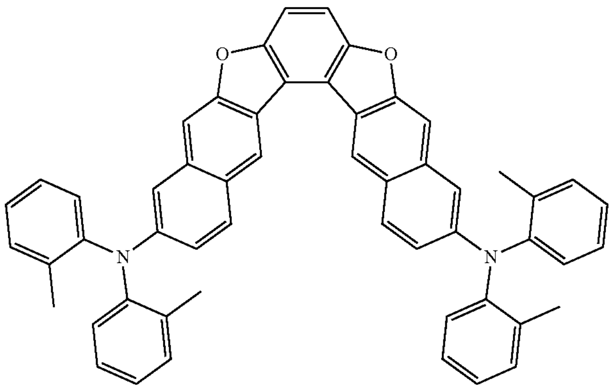
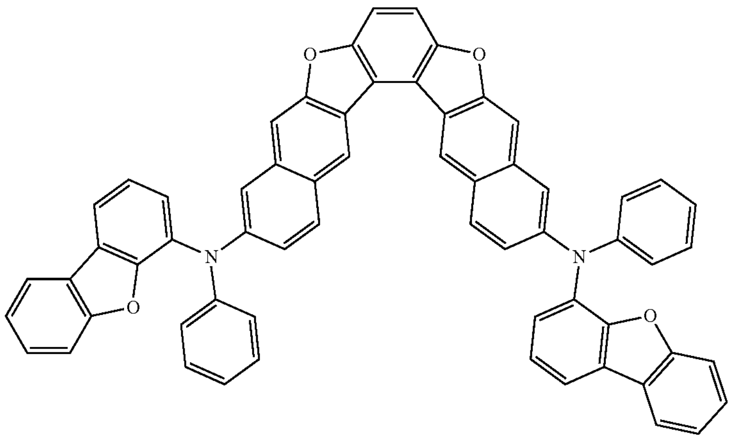
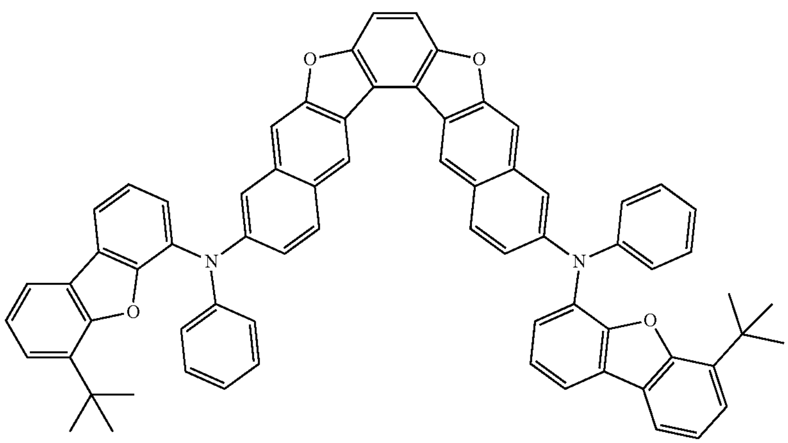
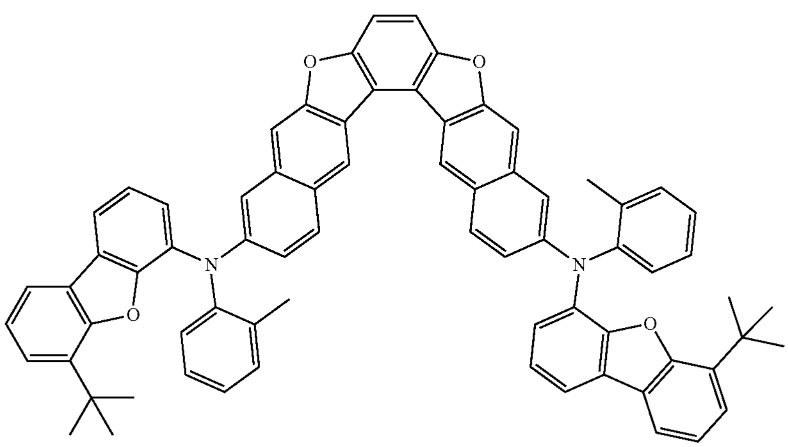

-continued
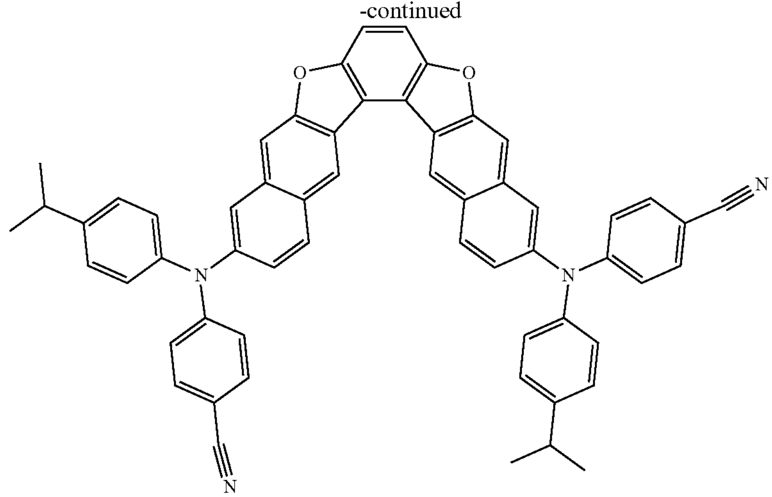
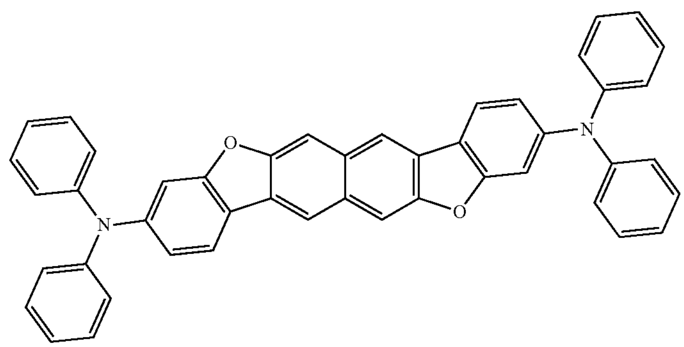
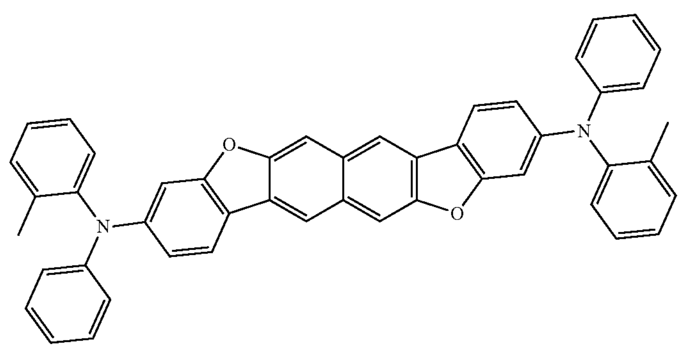
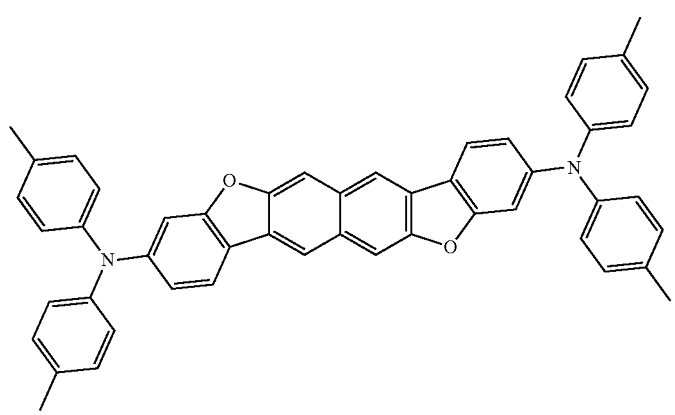

-continued
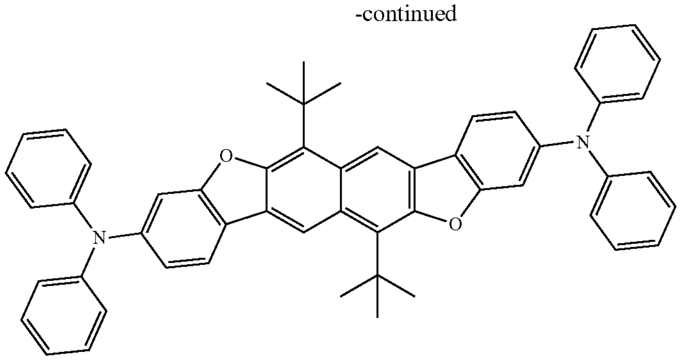
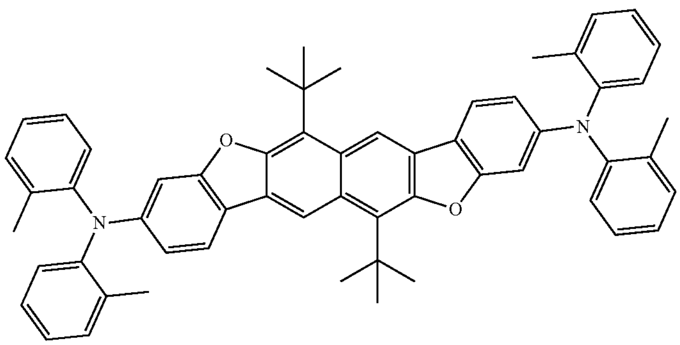
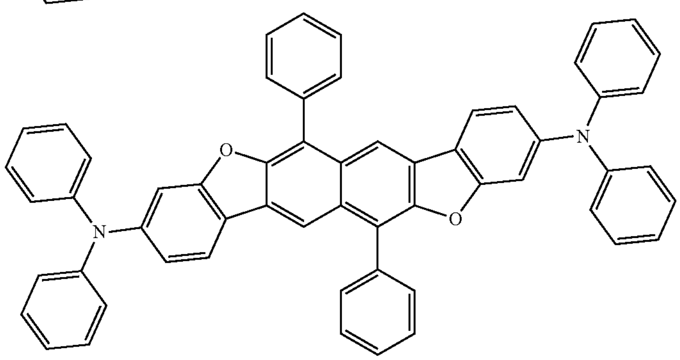
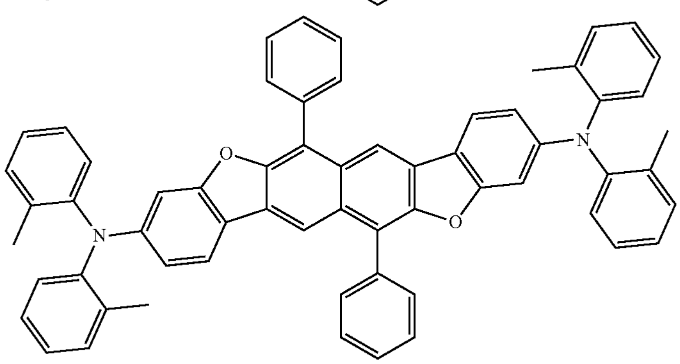
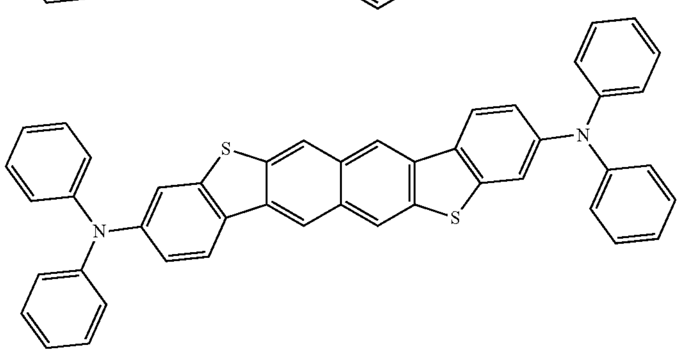

-continued
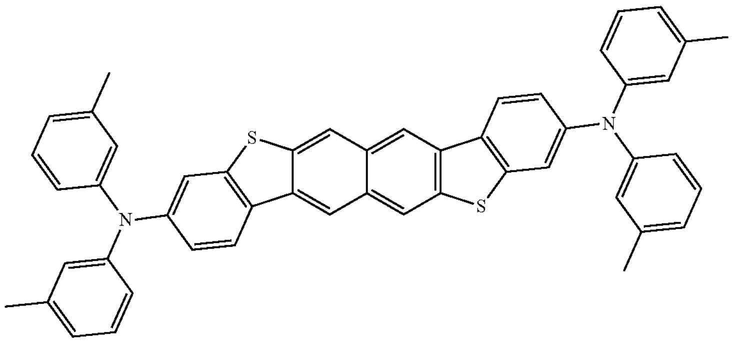
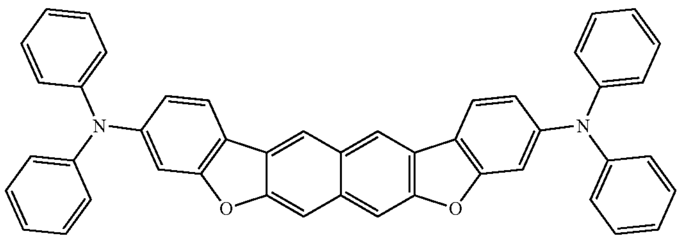
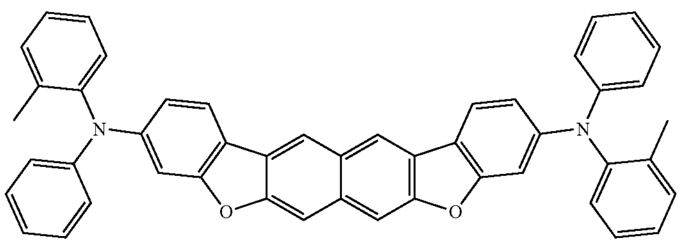
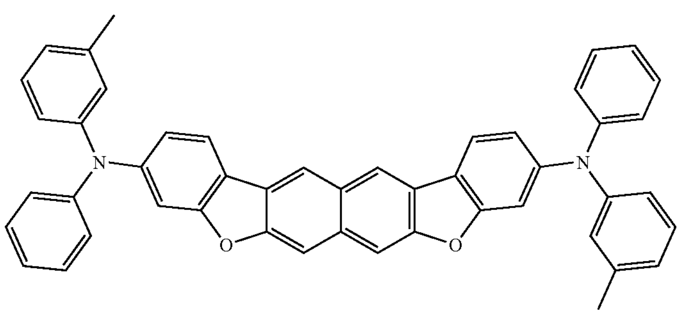
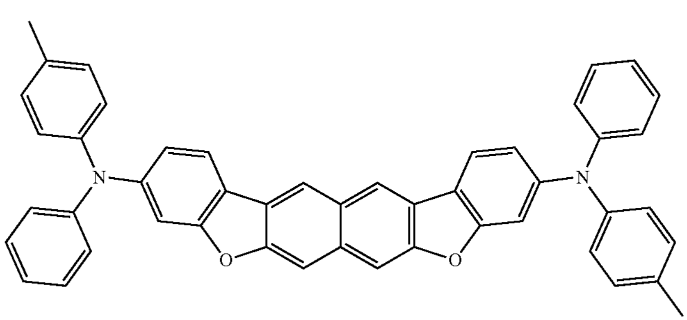

-continued
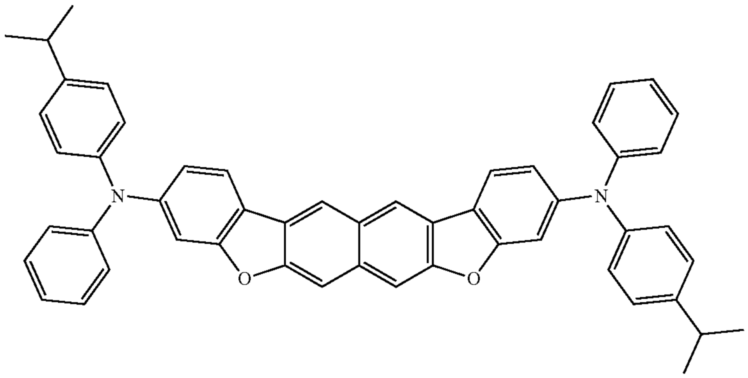
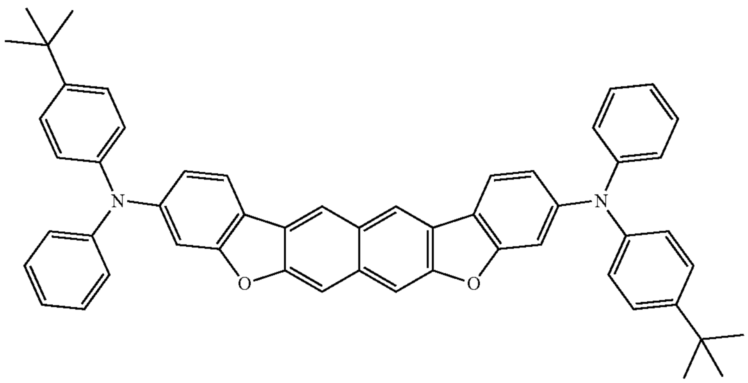
[Formula 229]
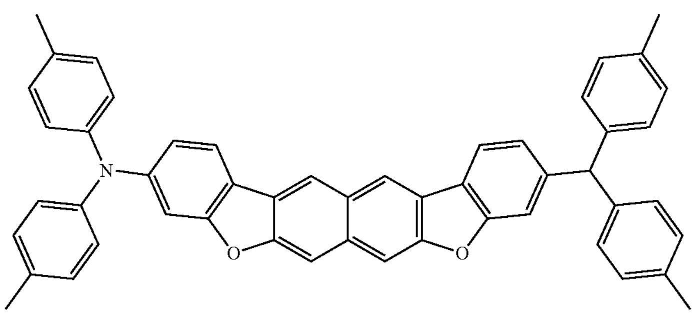
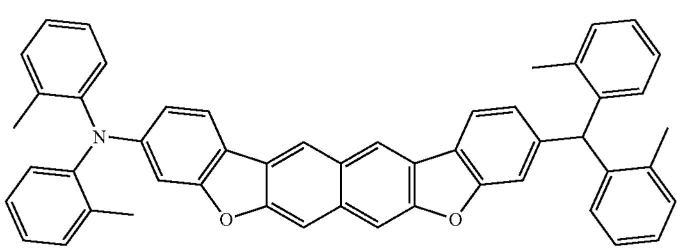

-continued
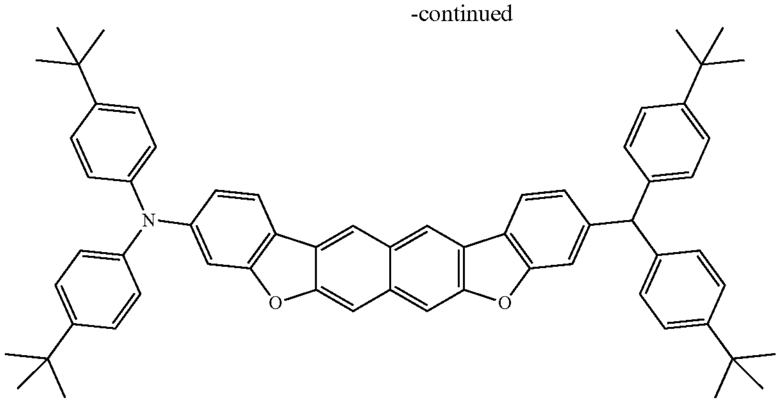
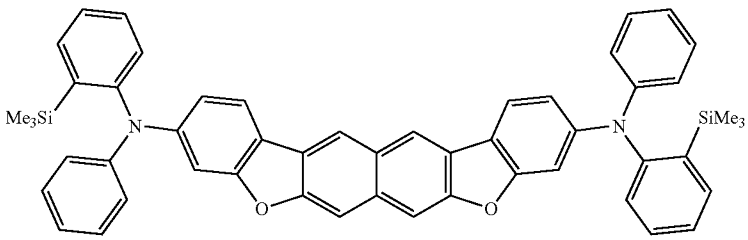
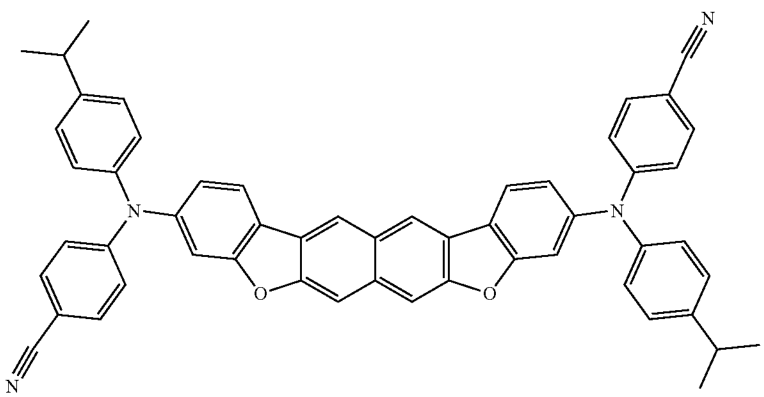
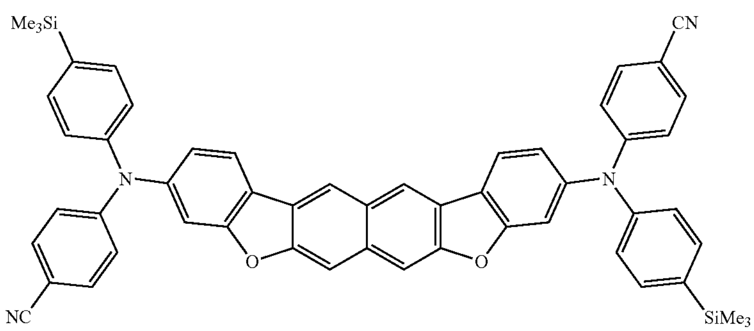
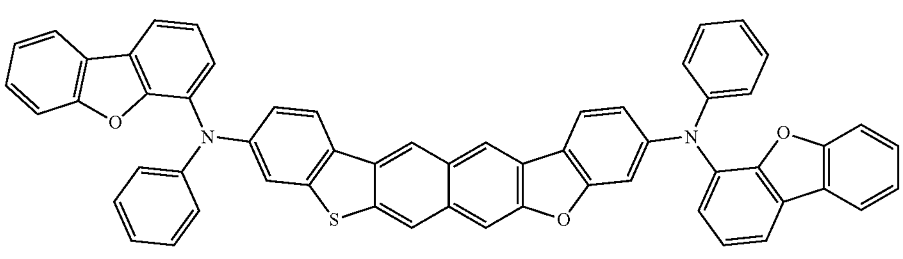

-continued
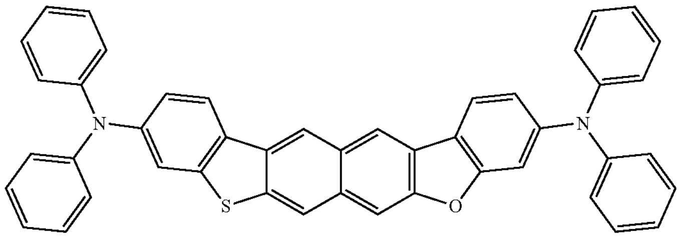
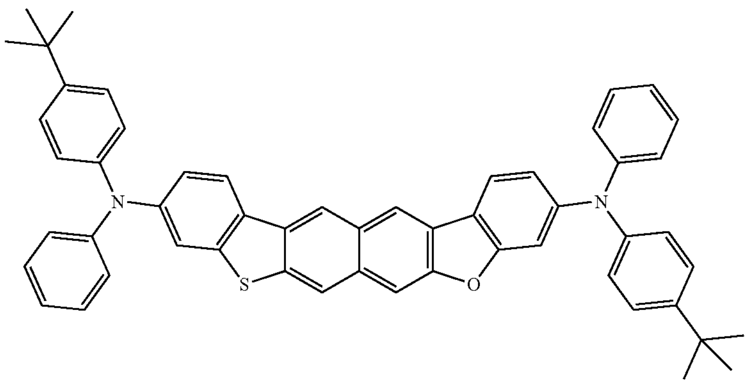
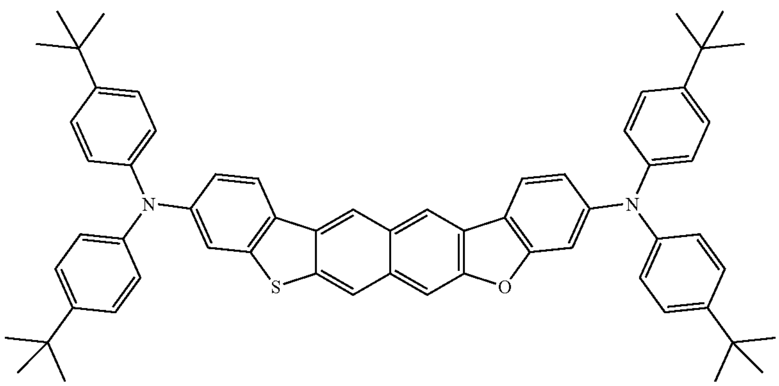
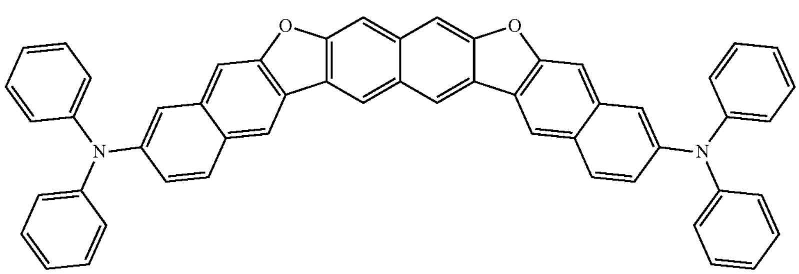
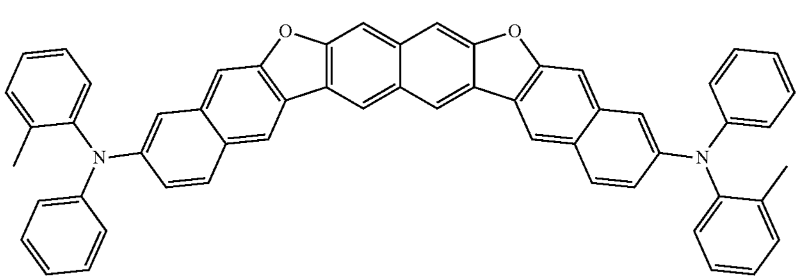

-continued
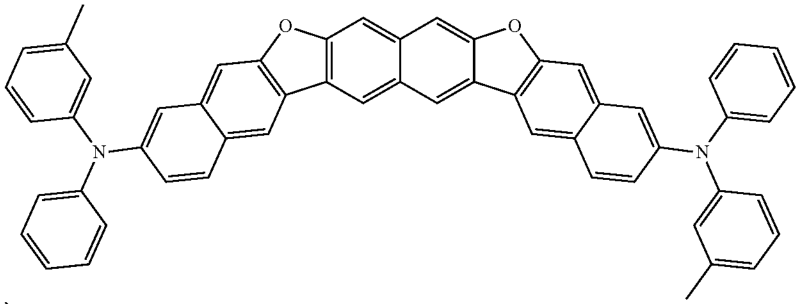
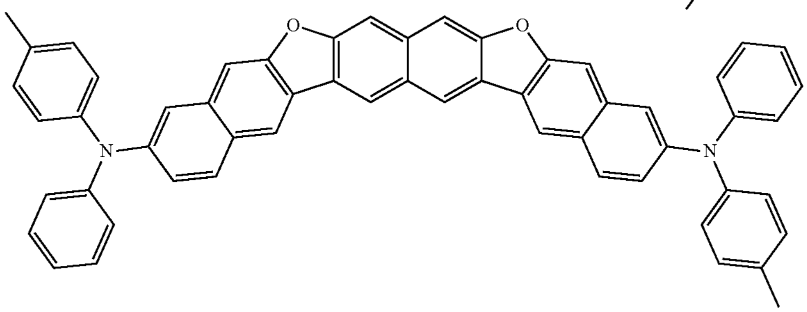
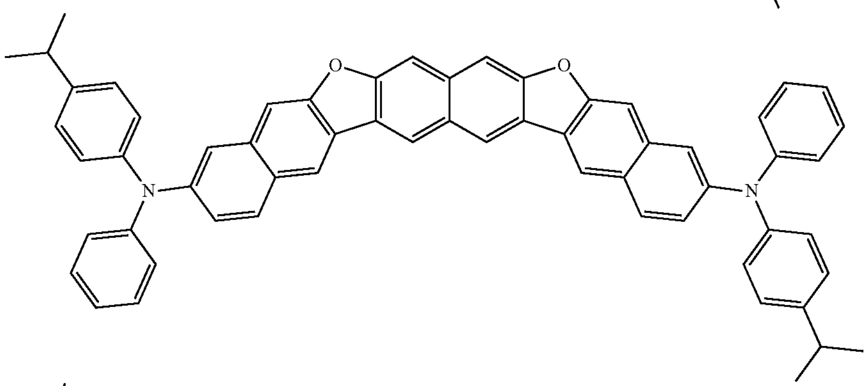
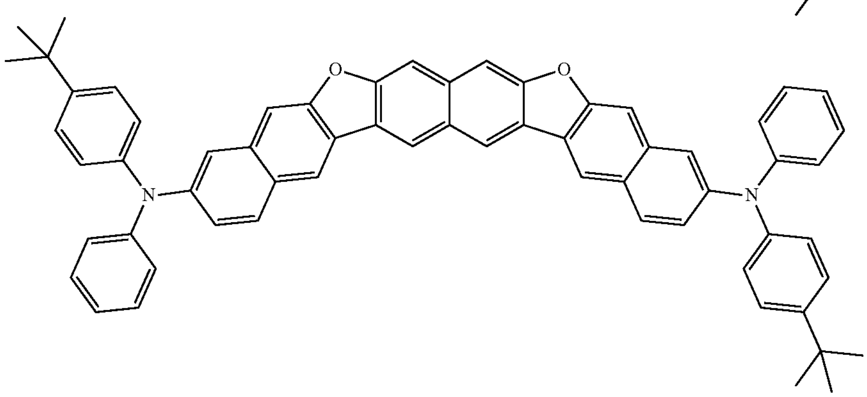
[Formula 230]
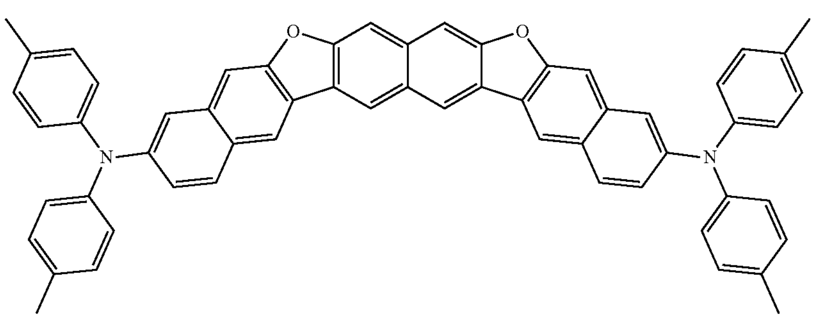

-continued
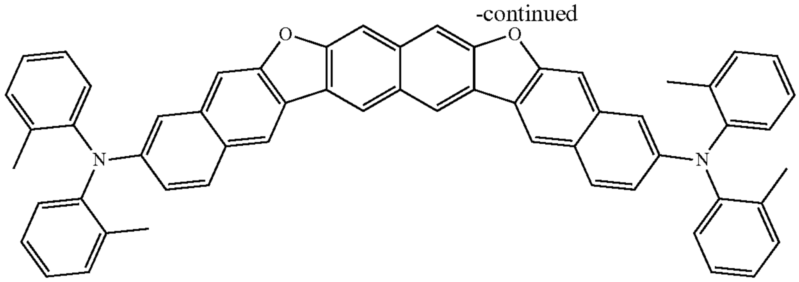
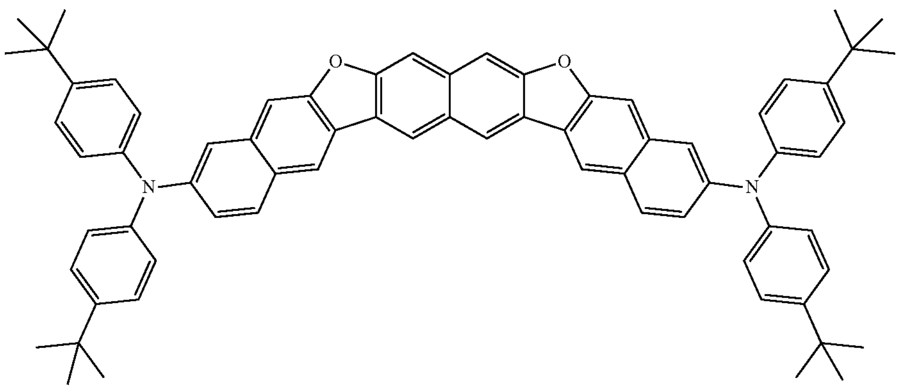
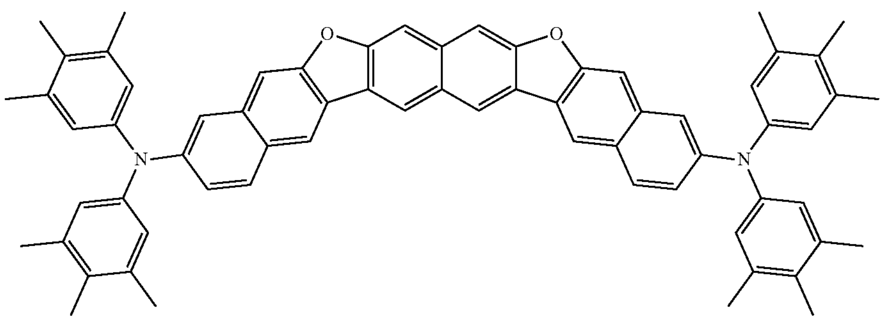
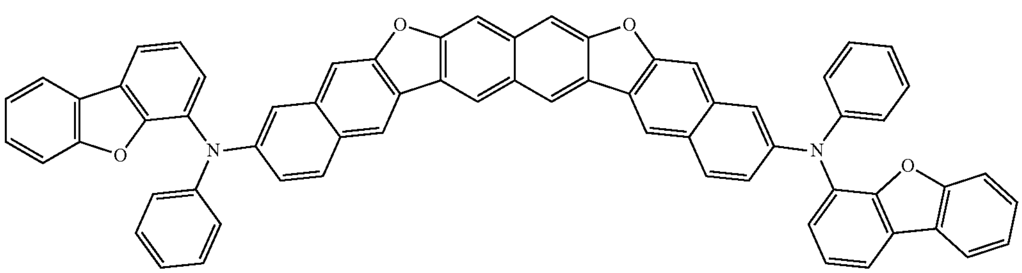
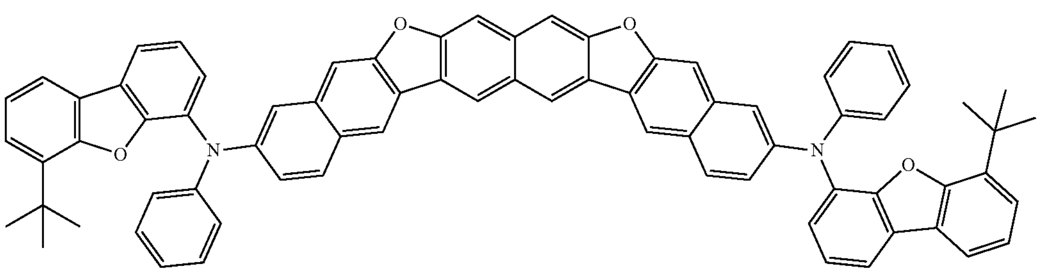

Compound Represented by Formula (8)

The compound represented by the formula (8) will be described below.

[Formula 231]

(8)

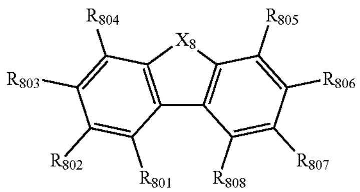

In the formula (8): at least one combination of $R_{801}$ and $R_{802}$, $R_{802}$ and $R_{803}$, or $R_{803}$ and $R_{804}$ are mutually bonded to form a divalent group represented by a formula (82) below, or not mutually bonded; and at least one combination of $R_{805}$ and $R_{806}$, $R_{806}$ and $R_{807}$, or $R_{807}$ and $R_{808}$ are mutually bonded to form a divalent group represented by a formula (83) below, or not mutually bonded.

[Formula 232]

(82)

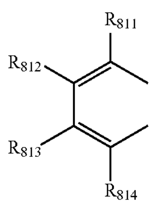

(83)

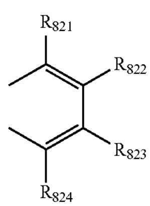

At least one of $R_{801}$ to $R_{804}$ or $R_{811}$ to $R_{814}$ not forming the divalent group represented by the formula (82) is a monovalent group represented by a formula (84) below;

at least one of $R_{805}$ to $R_{808}$ or $R_{821}$ to $R_{824}$ not forming the divalent group represented by the formula (83) is a monovalent group represented by the formula (84);

$X_8$ is $CR_{81}R_{82}$, an oxygen atom, a sulfur atom, or $NR_{809}$;

a pair of $R_{81}$ and $R_{82}$ are mutually bonded to form a substituted or unsubstituted monocyclic ring, mutually bonded to form a substituted or unsubstituted fused ring, or not mutually bonded; and $R_{801}$ to $R_{808}$ not forming the divalent groups represented by the formula (82) and (83) and not being the monovalent group represented by the formula (84), $R_{811}$ to $R_{814}$ and $R_{821}$ to $R_{824}$ not being the monovalent group represented by the formula (84), $R_{81}$ and $R_{82}$ not forming the substituted or unsubstituted monocyclic ring and not forming the substituted or unsubstituted fused ring, and $R_{809}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 233]

(84)

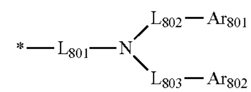

In the formula (84): $Ar_{801}$ and $Ar_{802}$ are each independently a substituted or unsubstituted aryl group having 6 to 50 ring carbon atoms, or a substituted or unsubstituted heterocyclic group having 5 to 50 ring atoms;

$L_{801}$ to $L_{803}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and

* in the formula (84) represents a bonding position to a cyclic structure represented by the formula (8) or a group represented by the formula (82) or the formula (83).

It is also preferable that at least one combination of $R_{801}$ and $R_{802}$, $R_{802}$ and $R_{803}$, or $R_{803}$ and $R_{804}$ are mutually bonded, and $R_{805}$ and $R_{806}$, $R_{806}$ and $R_{807}$, and $R_{807}$ and $R_{808}$ are not mutually bonded.

It is also preferable that $R_{801}$ and $R_{802}$, $R_{802}$ and $R_{803}$, and $R_{803}$ and $R_{804}$ are not mutually bonded, and at least one combination of $R_{805}$ and $R_{806}$, $R_{806}$ and $R_{807}$, or $R_{807}$ and $R_{808}$ are mutually bonded.

It is also preferable that at least one combination of $R_{801}$ and $R_{802}$, $R_{802}$ and $R_{803}$, or $R_{803}$ and $R_{804}$ are mutually bonded to form a divalent group represented by the formula (82), and at least one combination of $R_{805}$ and $R_{806}$, $R_{806}$ and $R_{807}$, or $R_{807}$ and $R_{808}$ are mutually bonded to form a divalent group represented by the formula (83).

In the formula (8), the positions for the divalent group represented by the formula (82) and the divalent group represented by the formula (83) to be formed are not specifically limited but the divalent groups may be formed at any possible positions on $R_{801}$ to Rms.

In an exemplary embodiment, the compound represented by the formula (8) is represented by any one of formulae (81A-1) to (81A-3) below.

[Formula 234]

(81A-1)

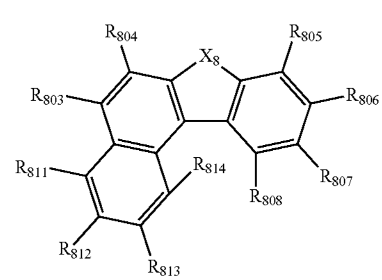

-continued (81A-2)

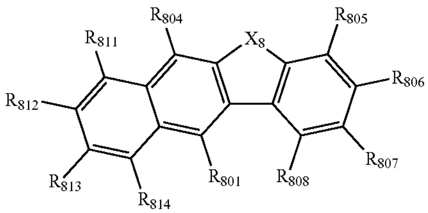

[Formula 235]

(81A-3)

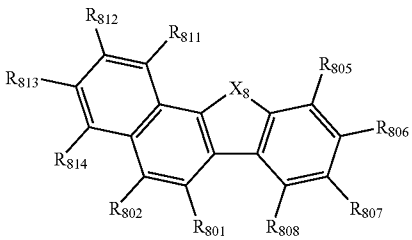

In the formulae (81A-1) to (81A-3):

$X_8$ represents the same as $X_8$ in the formula (8);

at least one of $R_{803}$, $R_{804}$, or $R_{811}$ to $R_{814}$ in the formula (81A-1) is a monovalent group represented by the formula (84);

at least one of $R_{801}$, $R_{804}$, or $R_{811}$ to $R_{814}$ in the formula (81A-2) is a monovalent group represented by the formula (84);

at least one of $R_{801}$, $R_{802}$, or $R_{811}$ to $R_{814}$ in the formula (81A-3) is a monovalent group represented by the formula (84);

at least one of $R_{805}$ to $R_{808}$ in the formulae (81A-1) to (81A-3) is a monovalent group represented by the formula (84); and $R_{801}$ to $R_{808}$ and $R_{811}$ to $R_{814}$ not being the monovalent group represented by the formula (84) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (8) is represented by any one of formulae (81-1) to (81-6) below.

[Formula 236]

(81-1)

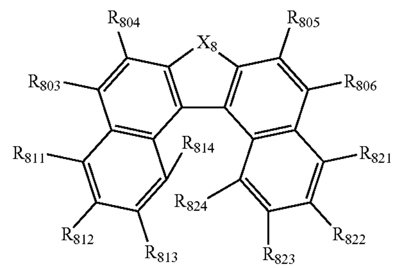

(81-2)

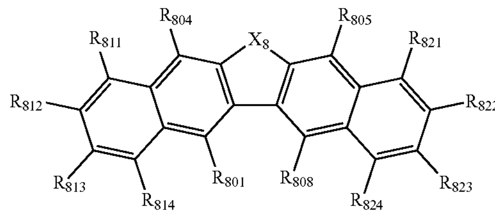

[Formula 237]

(81-3)

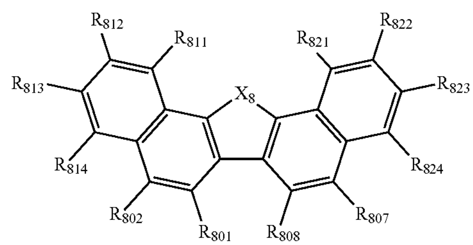

(81-4)

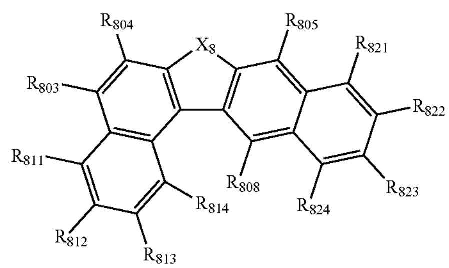

[Formula 238]

(81-5)

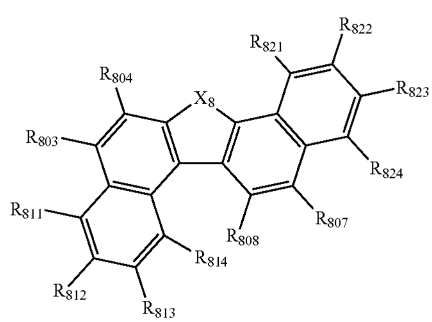

-continued (81-6)

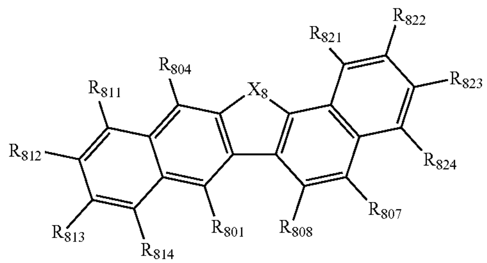

In the formulae (81-1) to (81-6):

$X_8$ represents the same as $X_8$ in the formula (8);

at least two of $R_{801}$ to $R_{824}$ are each a monovalent group represented by the formula (84); and $R_{801}$ to $R_{824}$ that are not the monovalent group represented by the formula (84) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (8) is represented by any one of formulae (81-7) to (81-18) below.

[Formula 239]

(81-7)

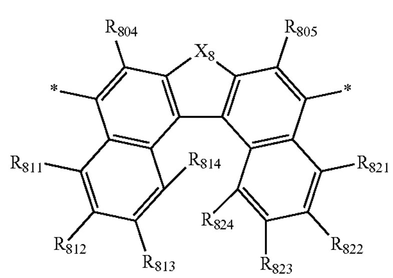

(81-8)

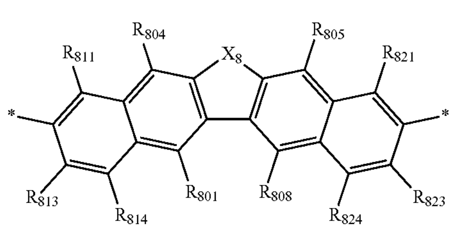

[Formula 240]

(81-9)

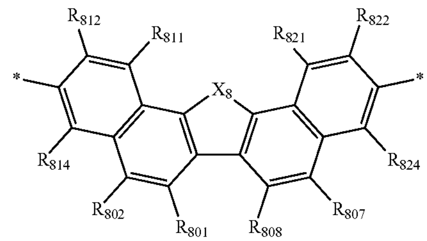

(81-10)

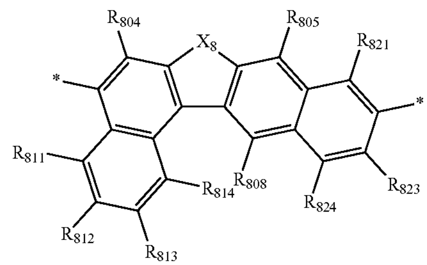

lp;-1p

[Formula 241]

(81-11)

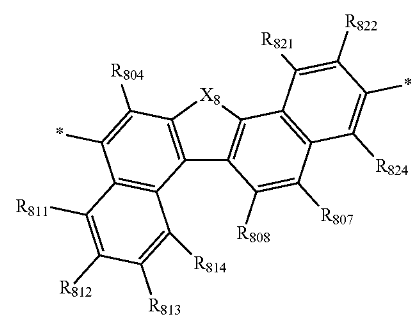

(81-12)

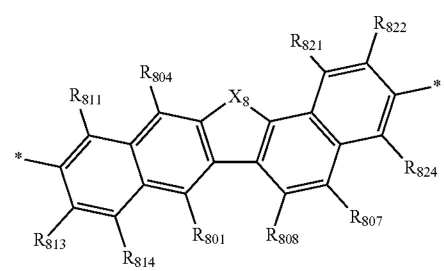

[Formula 242]

(81-13)

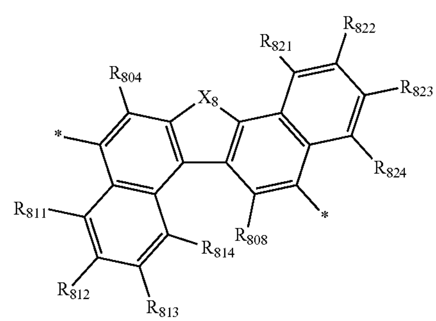

-continued (81-14)

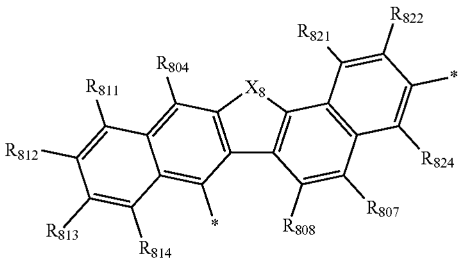

[Formula 243]

(81-15)

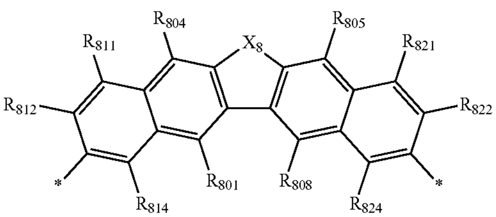

(81-16)

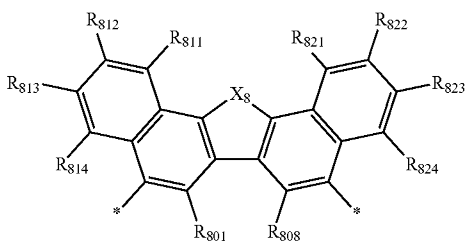

[Formula 244]

(81-17)

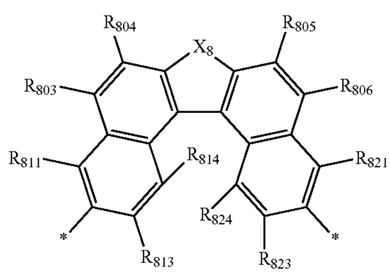

(81-18)

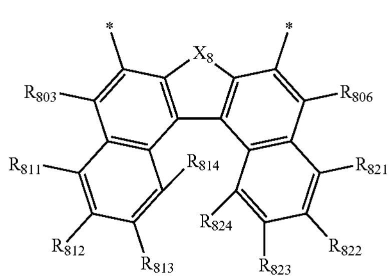

In the formulae (81-7) to (81-18):

$X_8$ represents the same as $X_8$ in the formula (8);

* is a single bond to be bonded with a monovalent group represented by the formula (84); and $R_{801}$ to $R_{824}$ each independently represent the same as $R_{801}$ to $R_{824}$ in the formulae (81-1) to (81-6) that are not a monovalent group represented by the formula (84).

$R_{801}$ to $R_{808}$ not forming the divalent groups represented by the formula (82) 1 5 and (83) and not being the monovalent group represented by the formula (84), and $R_{811}$ to $R_{814}$ and $R_{821}$ to $R_{824}$ not being the monovalent group represented by the formula (84) are preferably each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The monovalent group represented by the formula (84) is preferably represented by a formula (85) or (86) below.

[Formula 245]

(85)

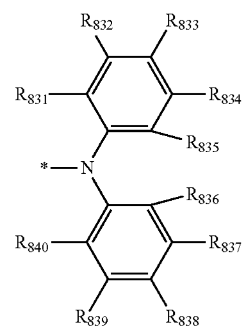

In the formula (85): $R_{831}$ to $R_{840}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formula (85) represents the same as * in the formula (84).

[Formula 246]

(86)

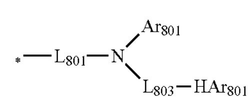

In the formula (86): Arson, $L_{801}$, and $L_{803}$ represent the same as $Ar_{801}$, $L_{801}$, and $L_{803}$ in the formula (84); and $HAr_{801}$ is a moiety represented by a formula (87) below.

[Formula 247]

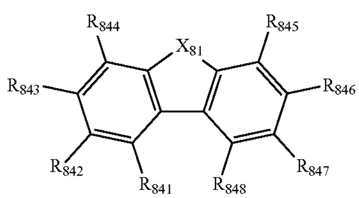

(87)

In the formula (87): $X_{81}$ represents an oxygen atom or a sulfur atom;

one of $R_{841}$ to $R_{848}$ is a single bond with $L_{803}$; and $R_{841}$ to $R_{848}$ not being the single bond are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (8)

Specific examples of the compound represented by the formula (8) include compounds shown below as well as the compounds disclosed in WO 2014/104144.

[Formula 248]

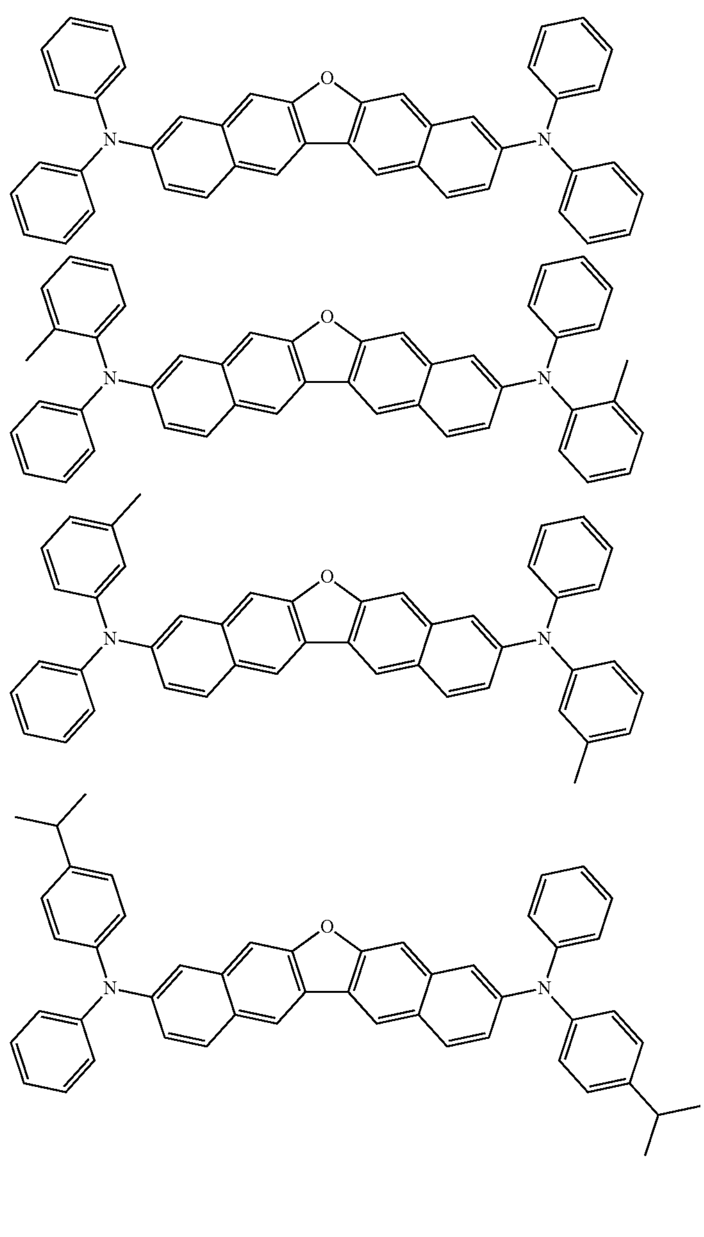

-continued
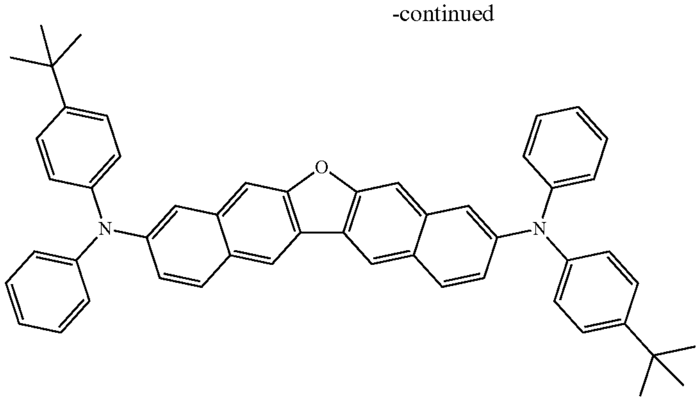
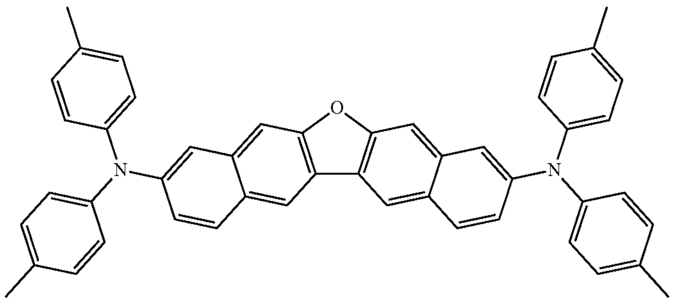
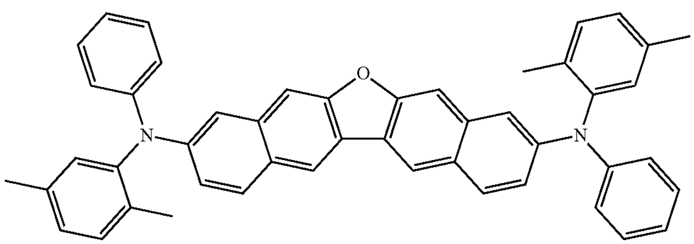
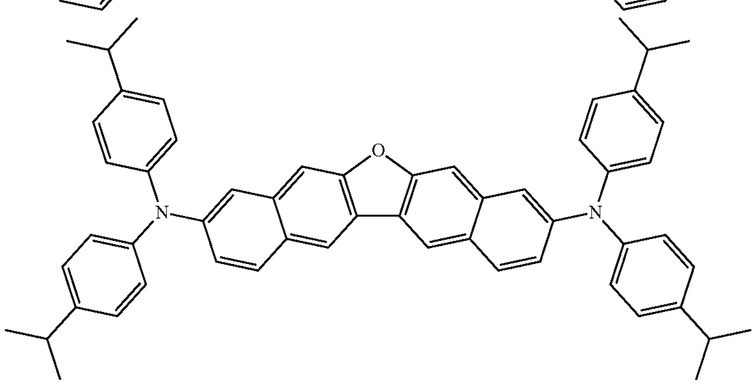
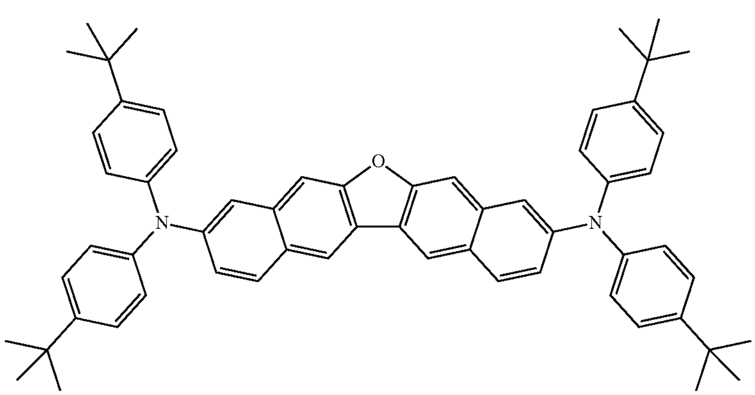

-continued
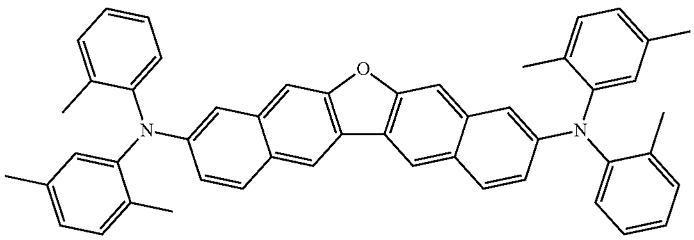
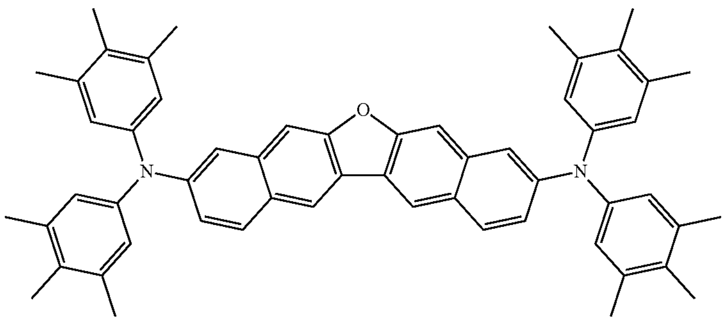
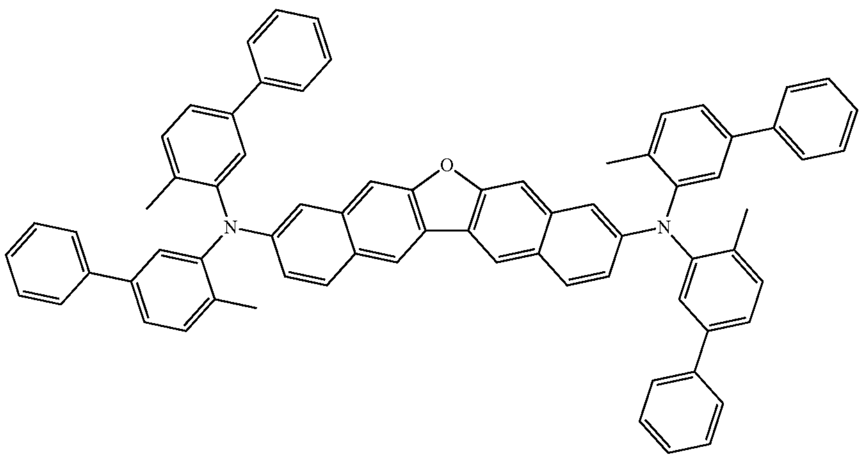
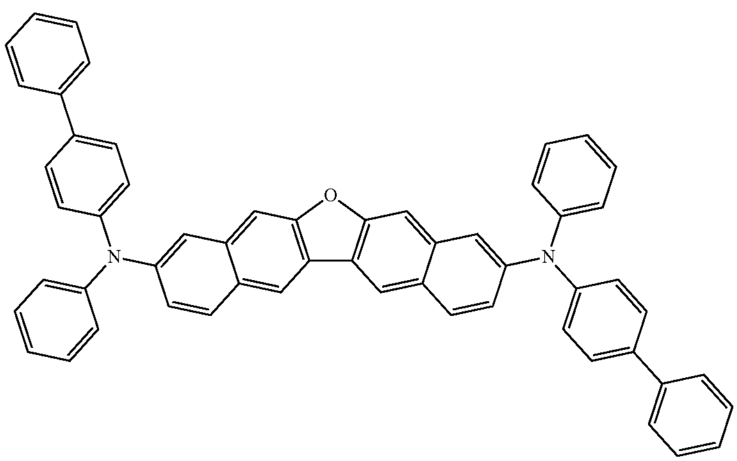
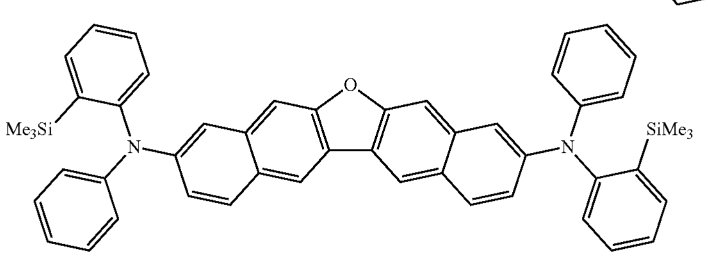

-continued
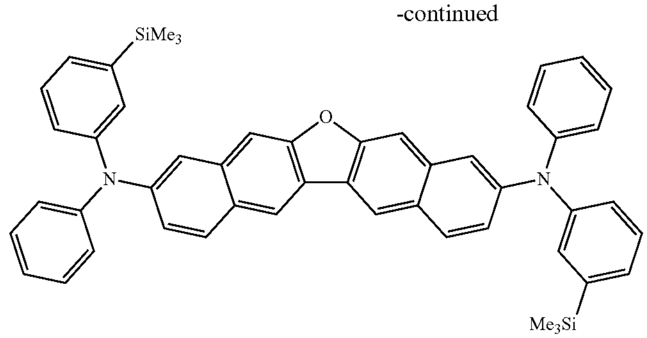
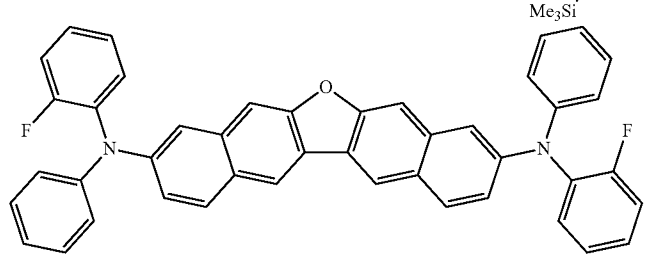
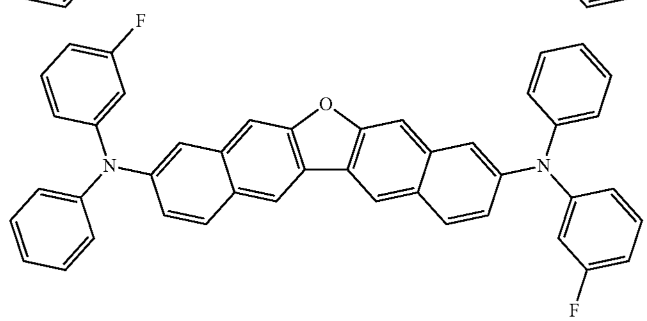
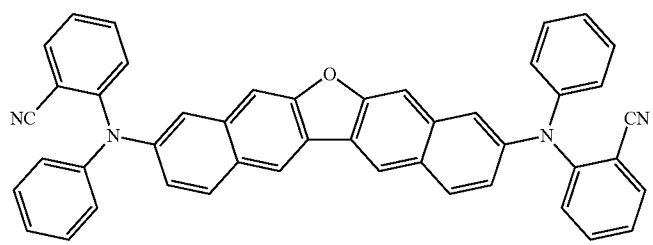
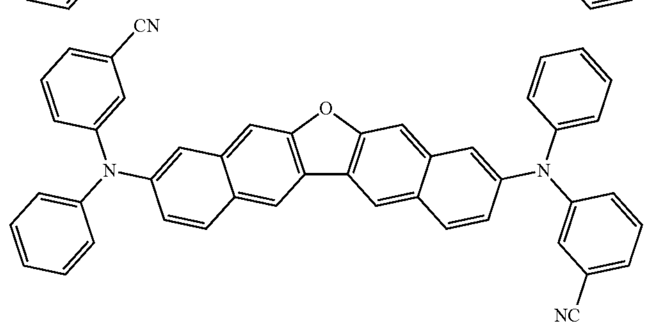
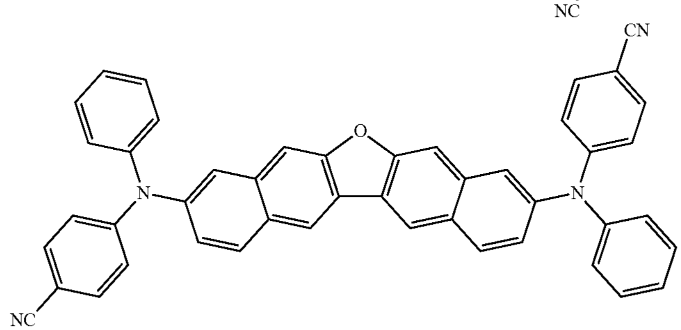

-continued
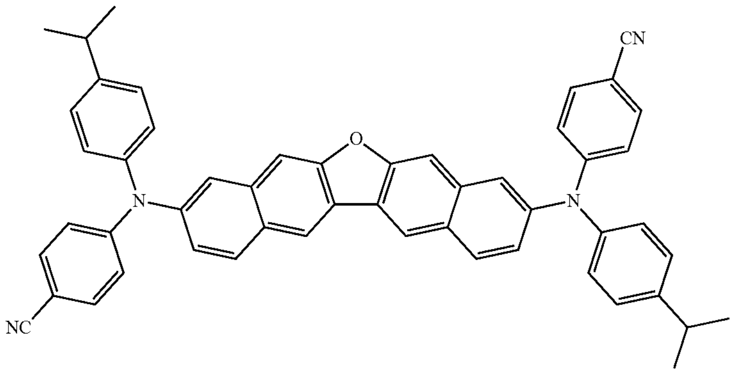
[Formula 249]
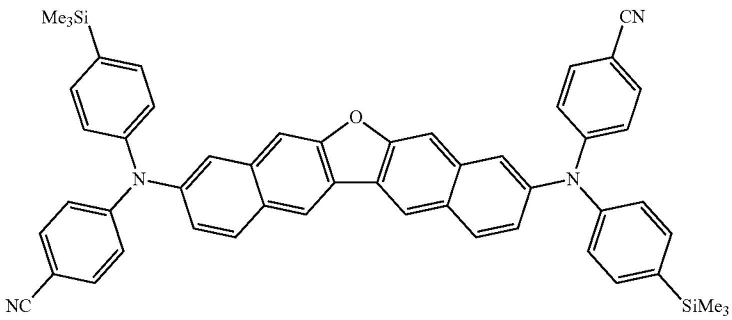
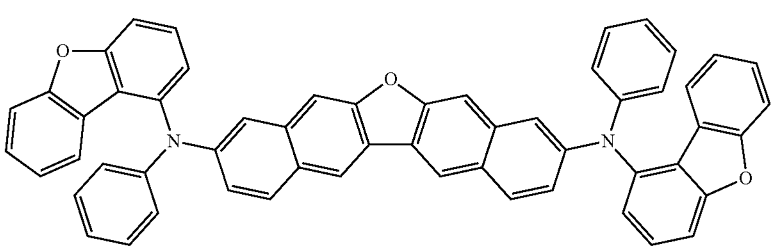
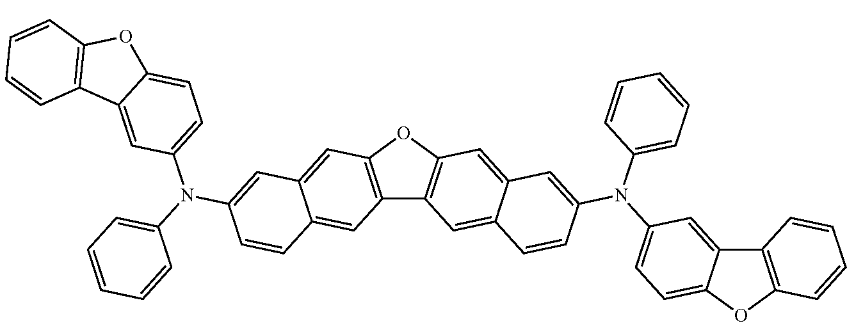

-continued
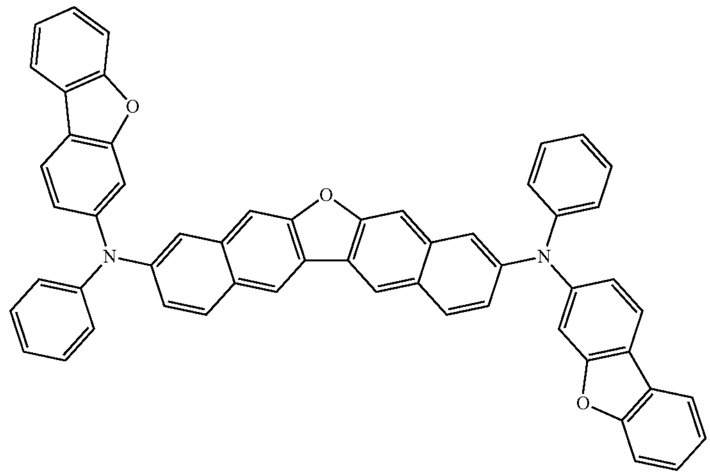
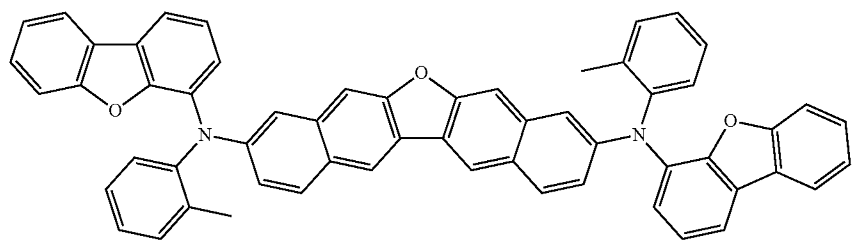
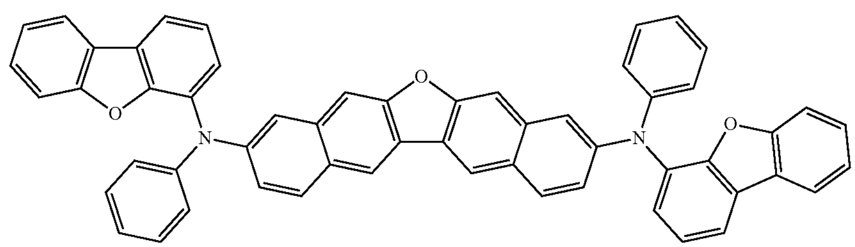
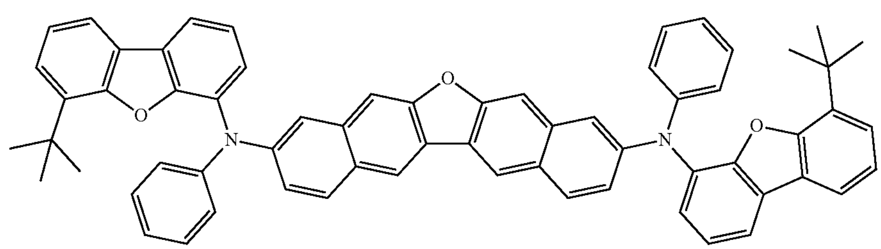
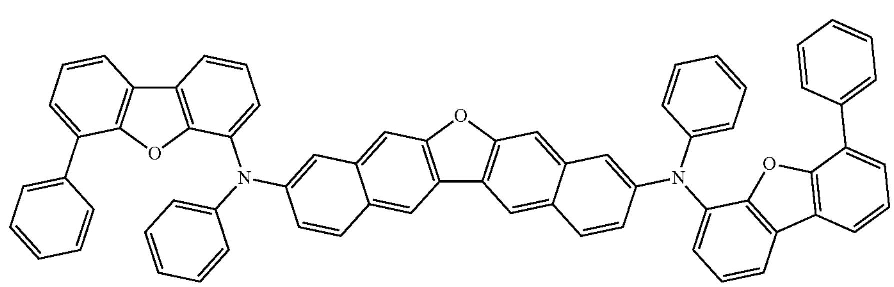

-continued
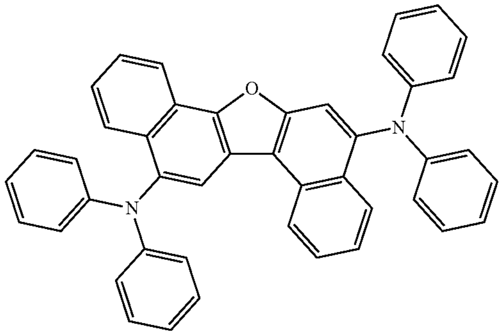
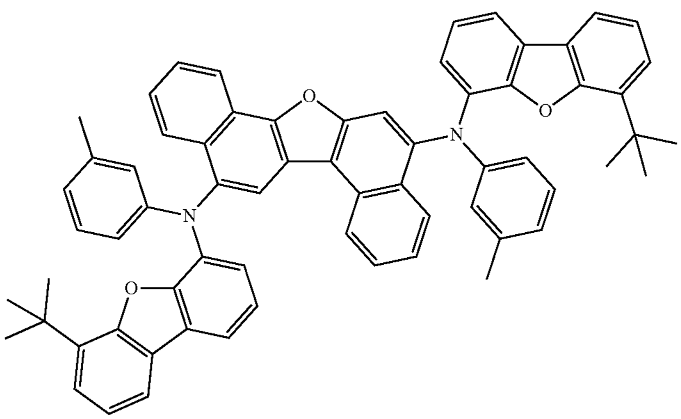
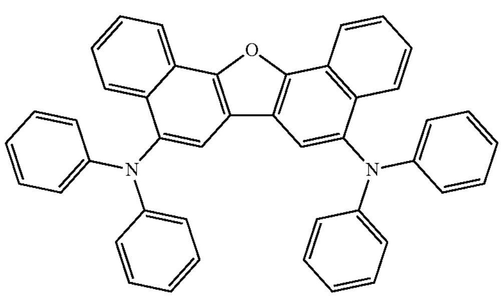
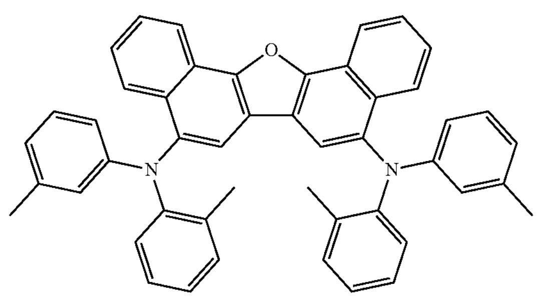
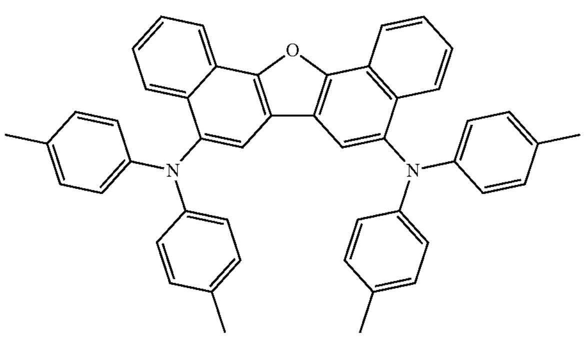

[Formula 250]
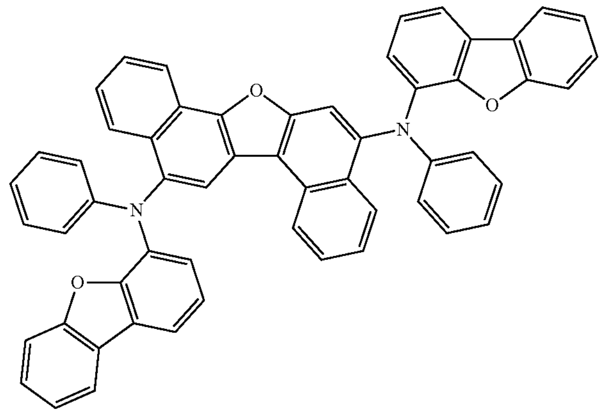
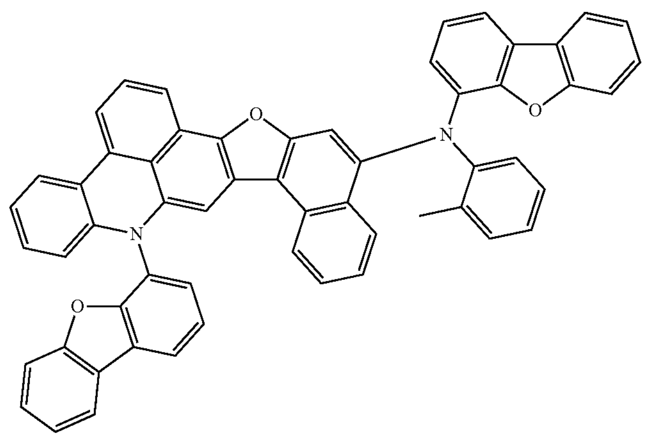
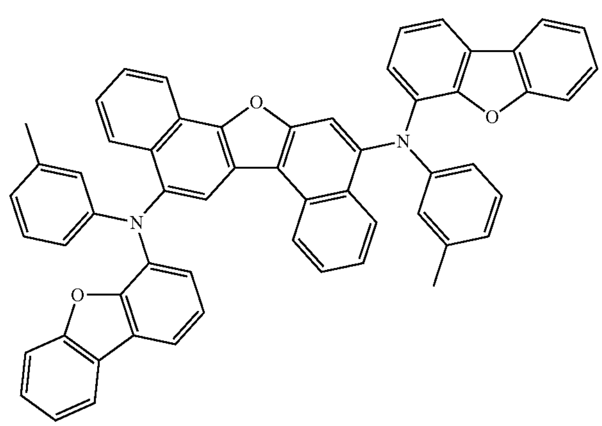

-continued
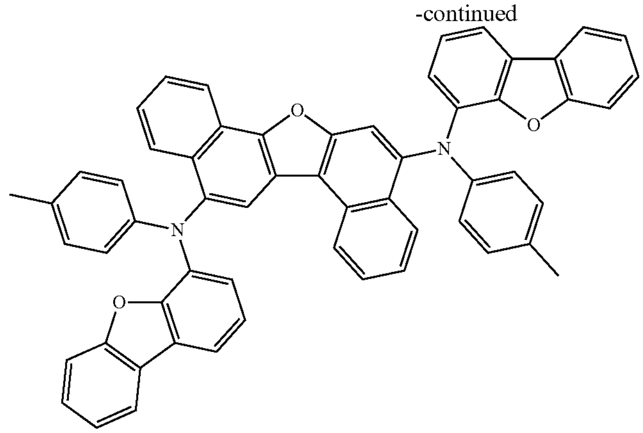
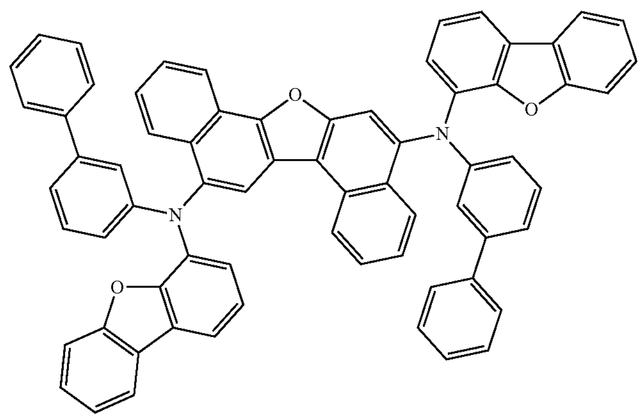
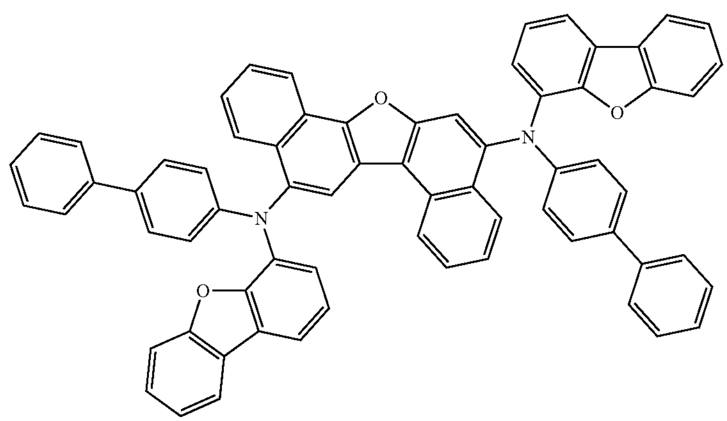
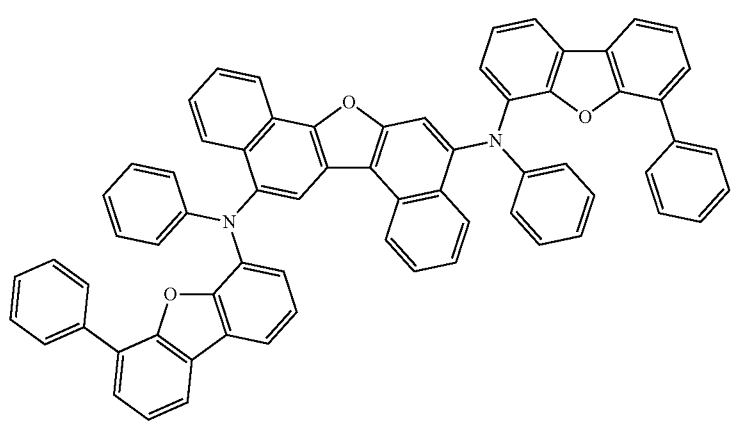

-continued
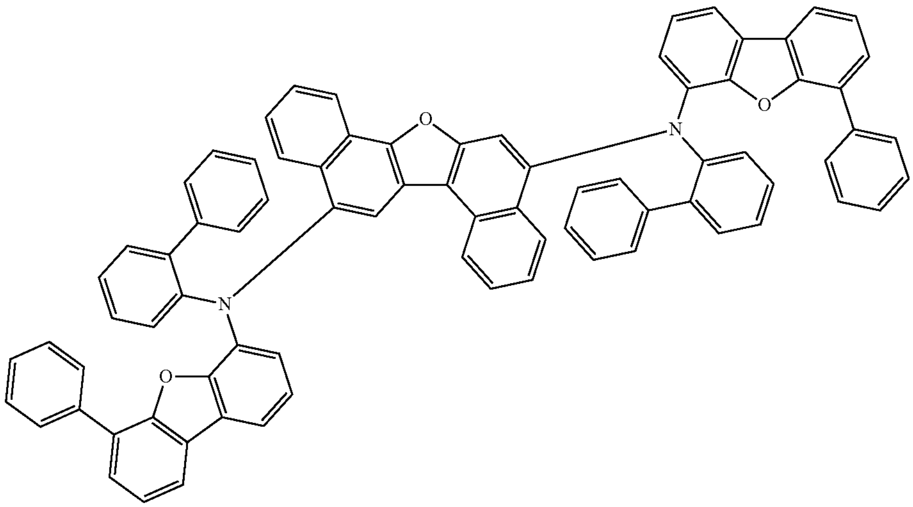
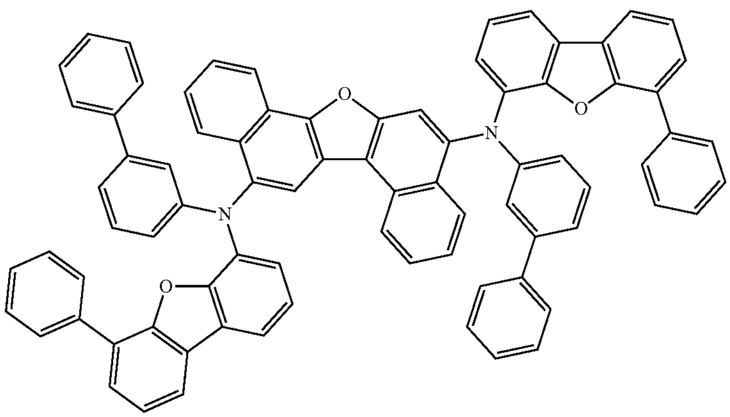
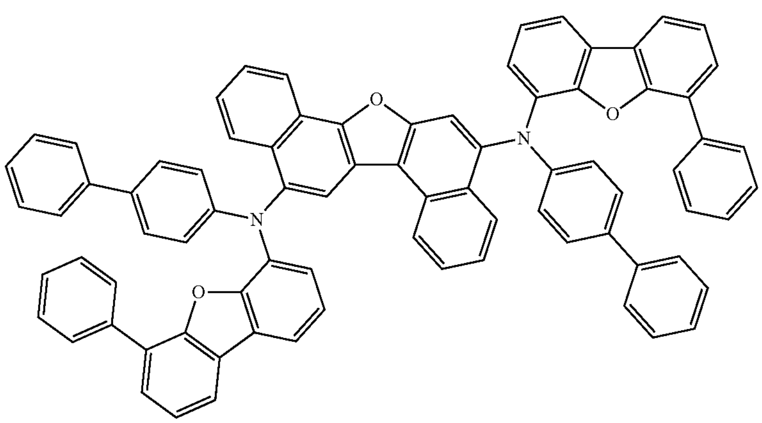

-continued
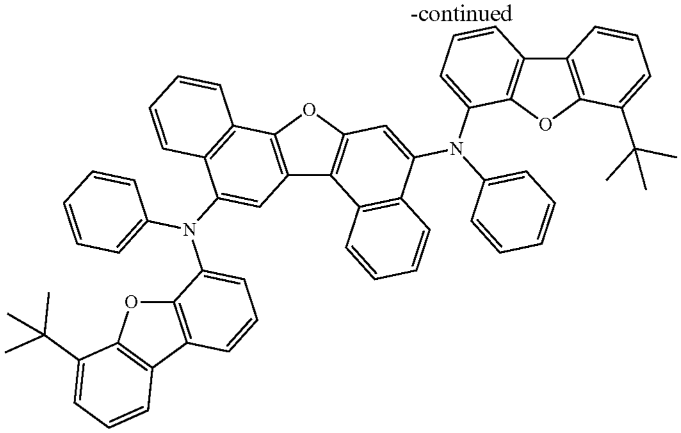
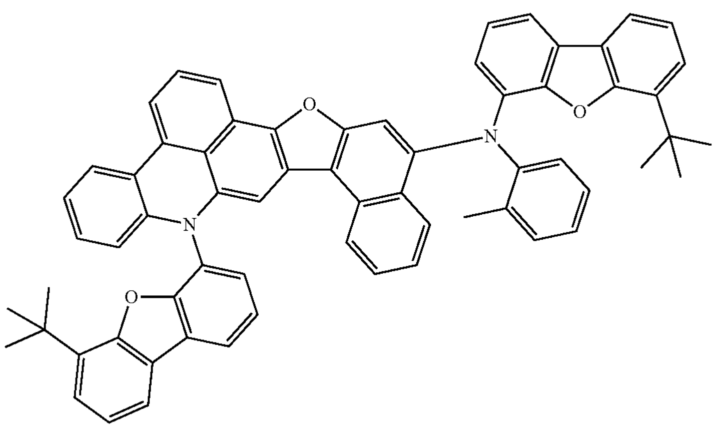
[Formula 251]
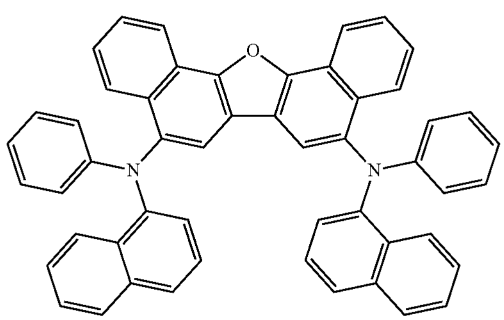
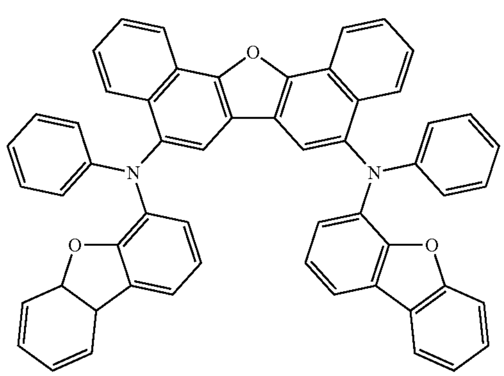
-continued
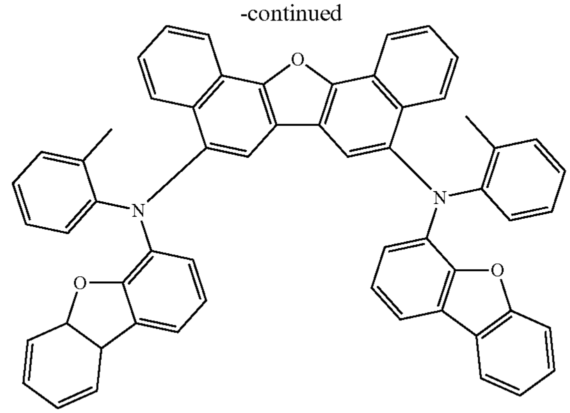
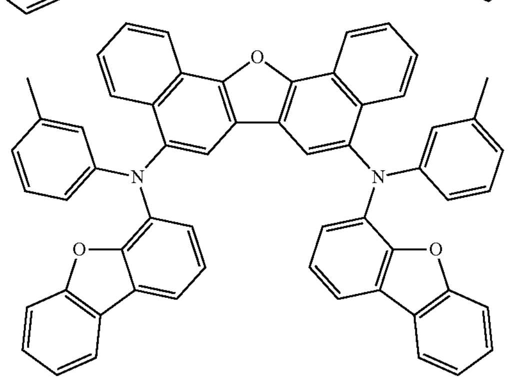

-continued
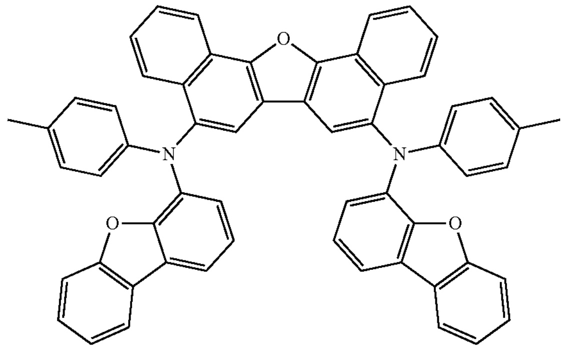
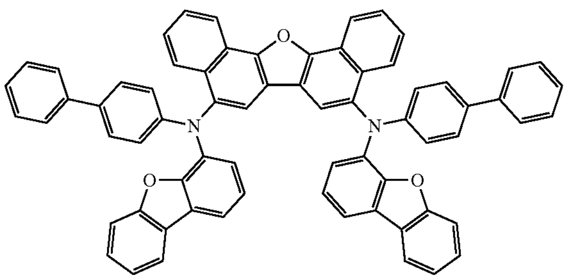
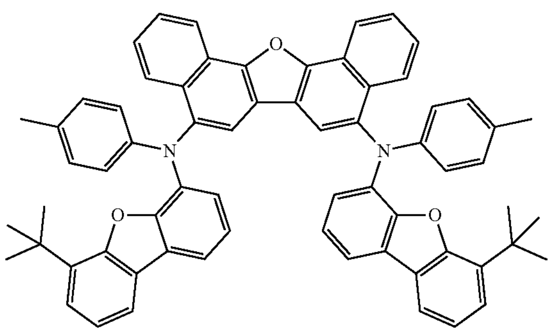
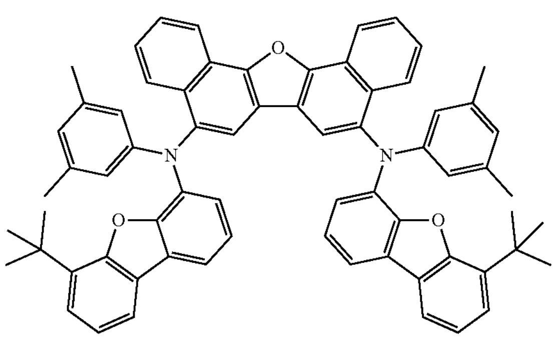
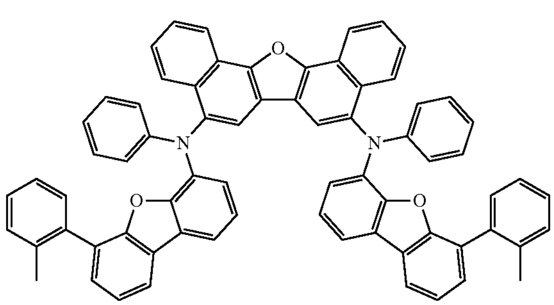
-continued
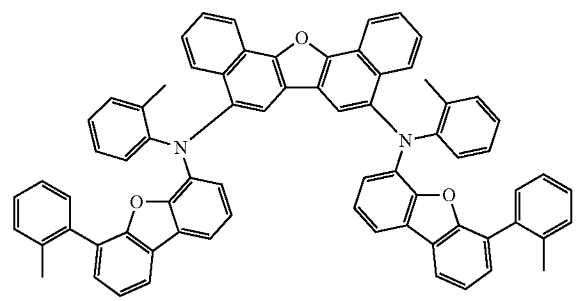
[Formula 252]
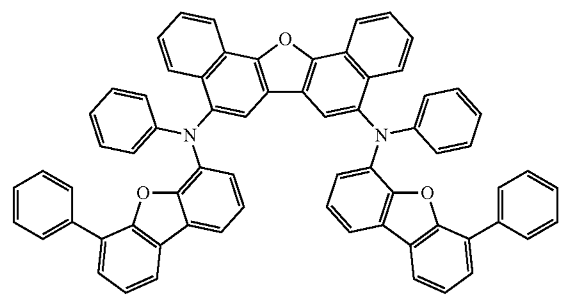
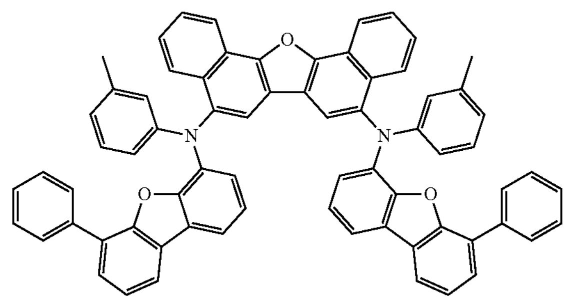
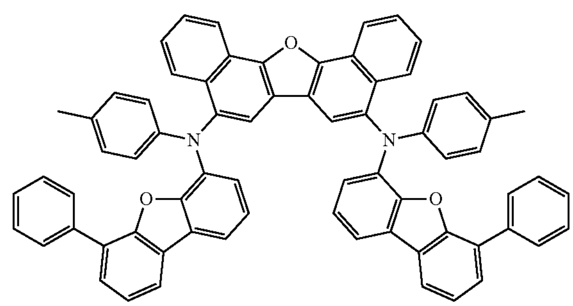
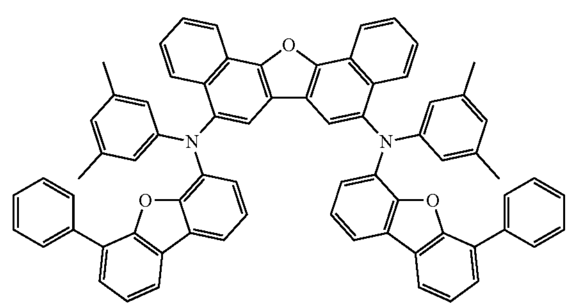

-continued
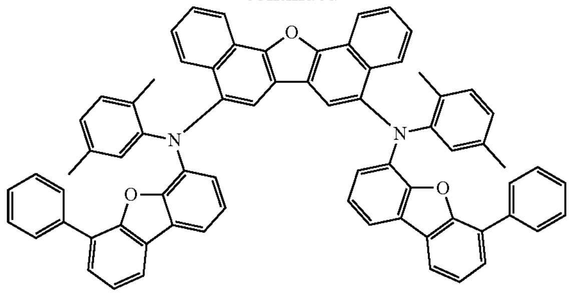
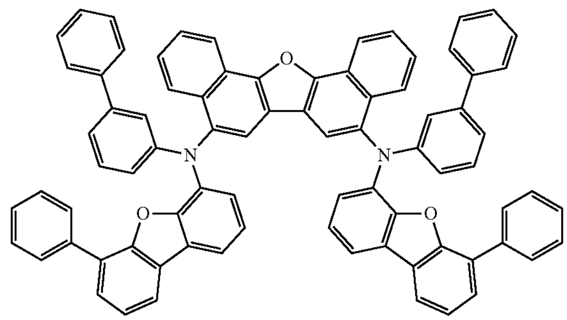
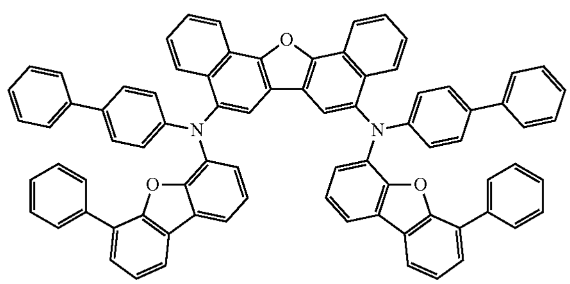
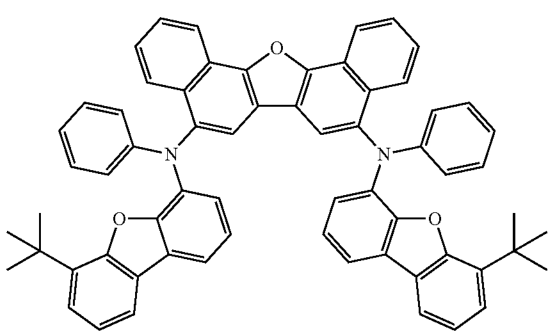 [SMILES: CC(C)(C)c1cccc2c1oc1c(N(c3ccccc3)c3cc4c5cc(N(c6ccccc6)c6cccc7c6oc6c(C(C)(C)C)cccc67)c6ccccc6c5oc4c4ccccc34)cccc12]
[Formula 253]
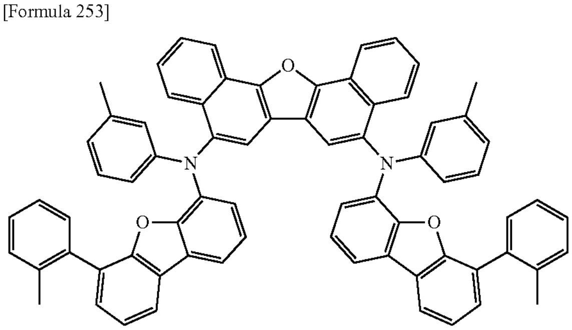
-continued
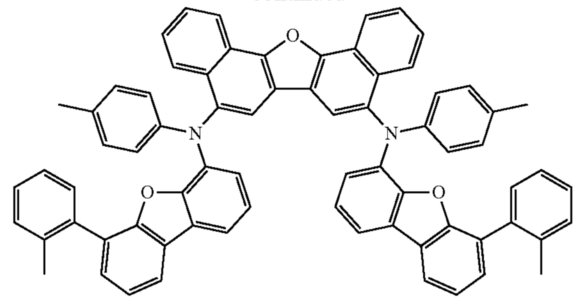
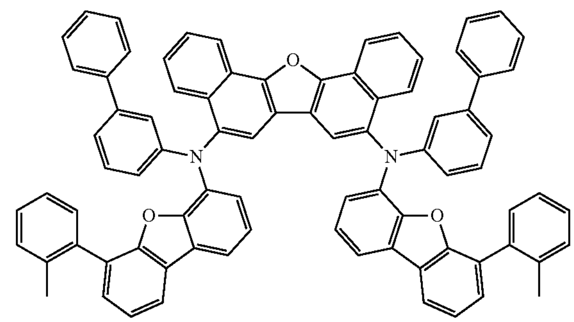
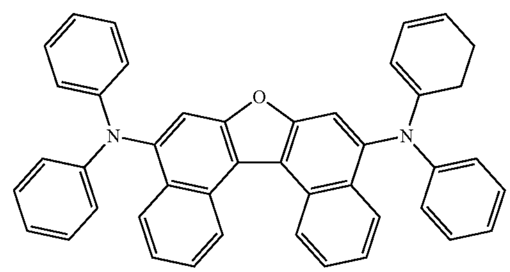
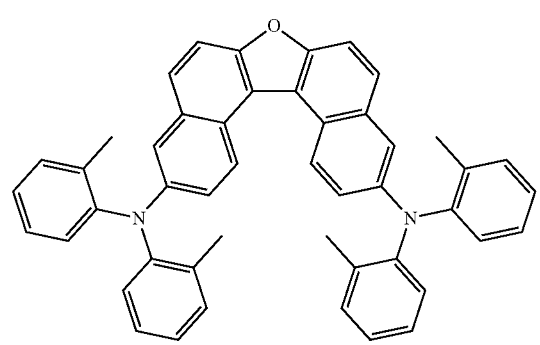
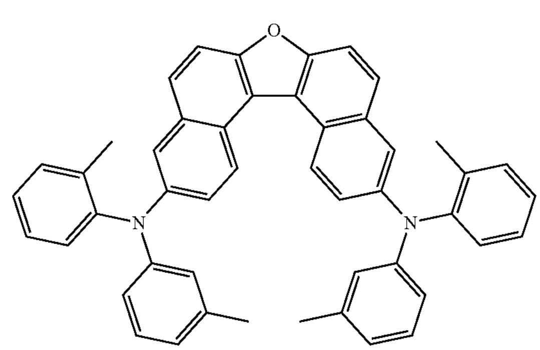

-continued
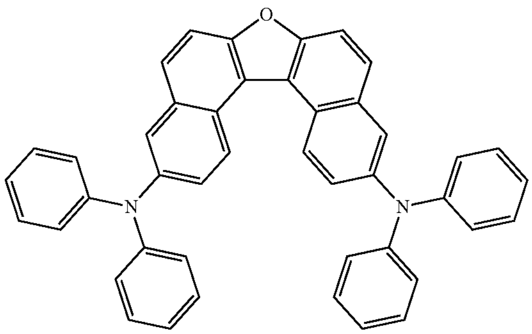
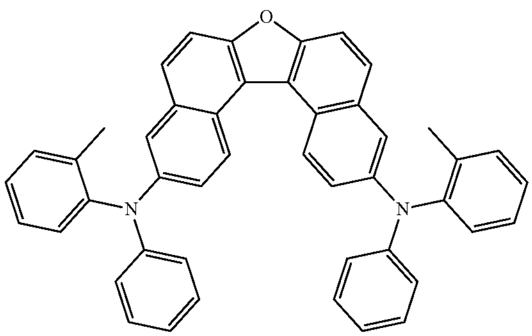
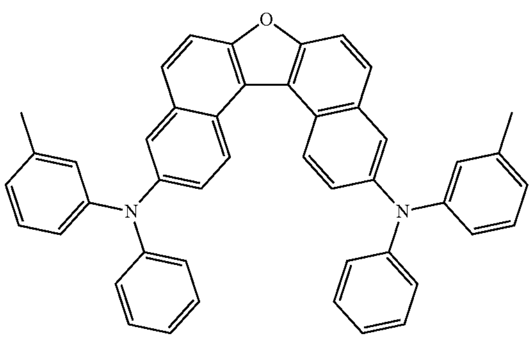
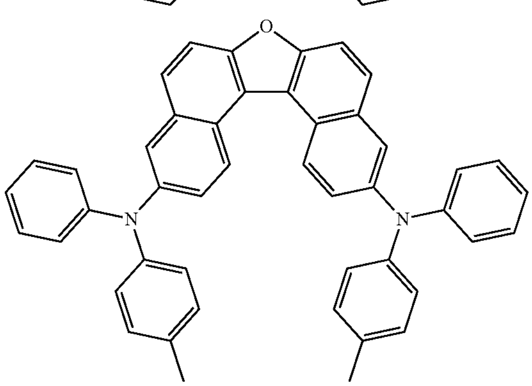
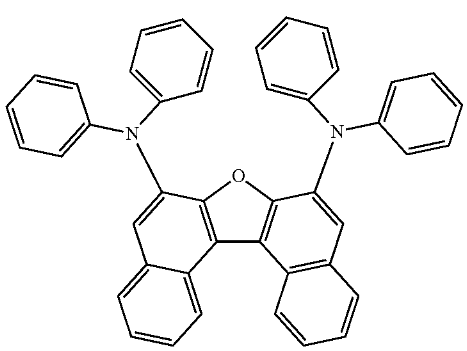
-continued
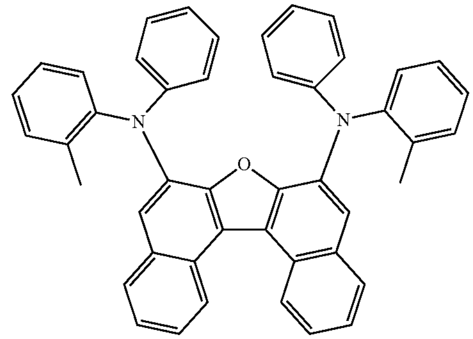
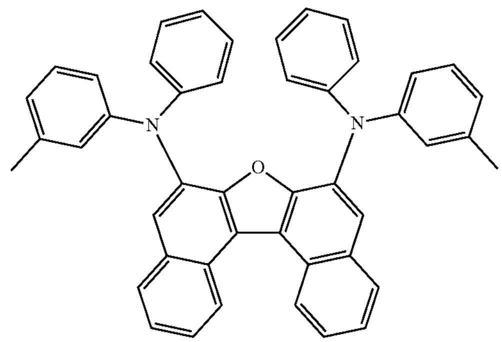
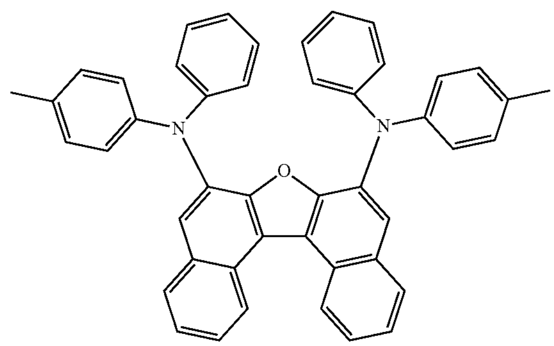
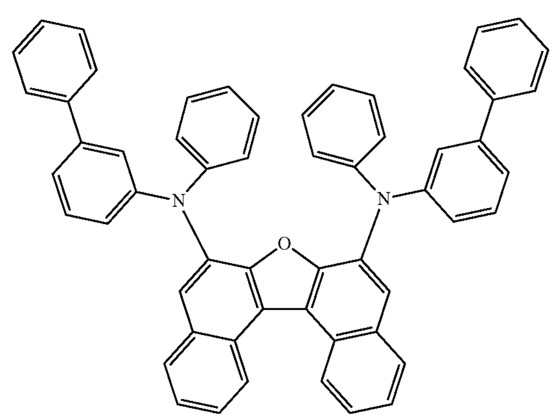

-continued
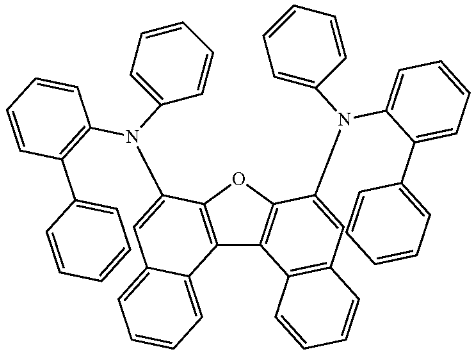
[Formula 254]
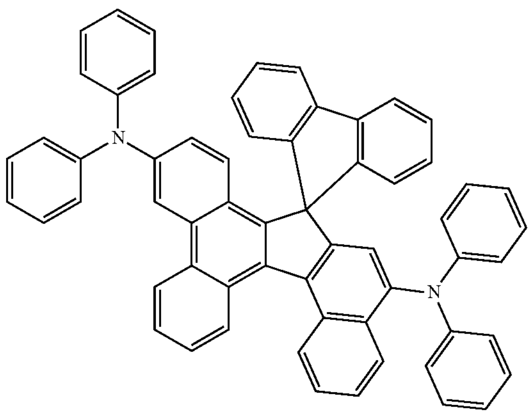
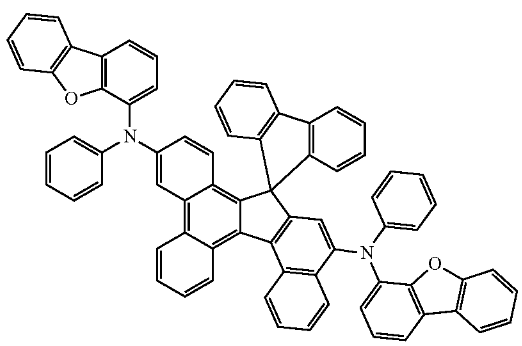
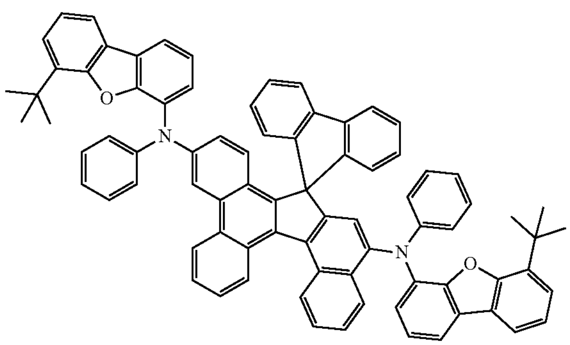
-continued
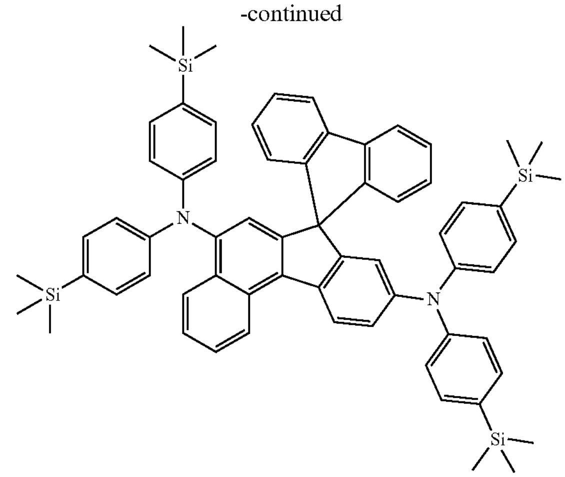
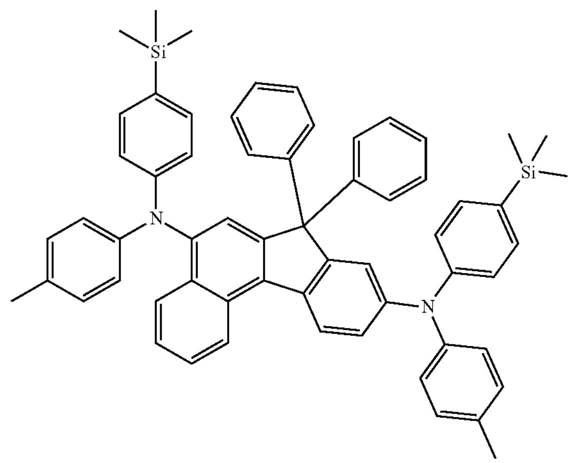
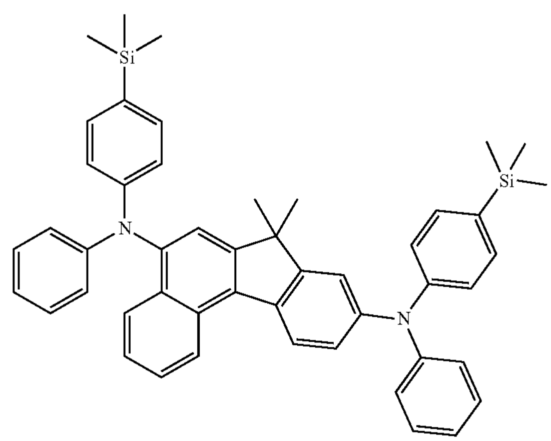
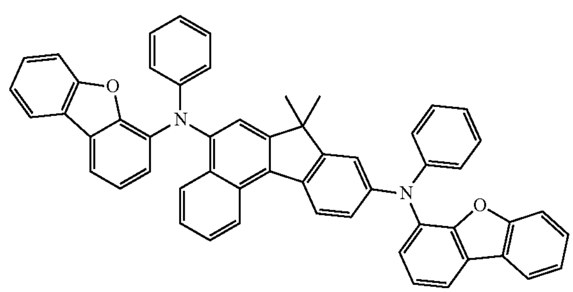

-continued

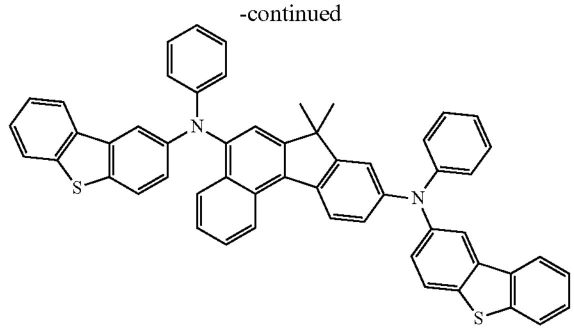

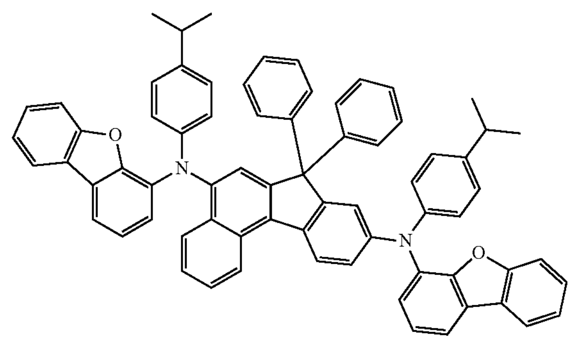

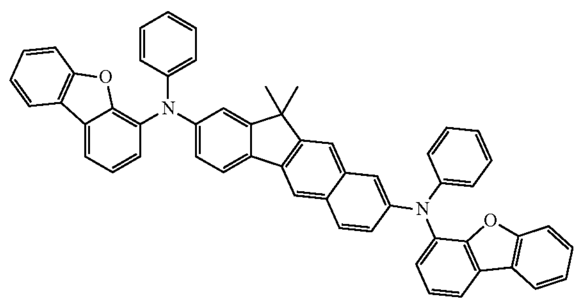

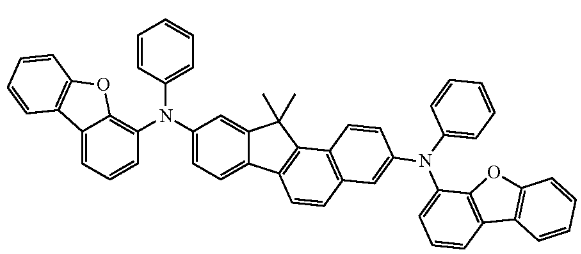

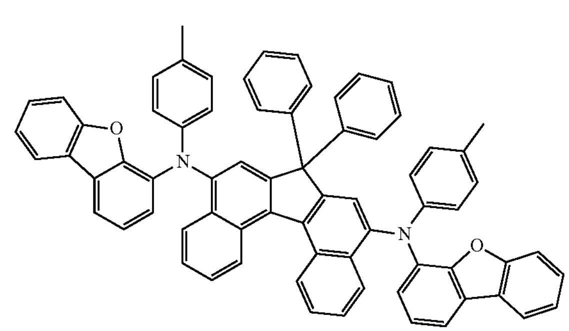

Compound Represented by Formula (9)

The compound represented by the formula (9) will be described below.

[Formula 255]

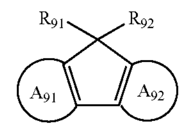

(9)

In the formula (9): $A_{91}$ ring and $A_{92}$ ring are each independently a substituted or unsubstituted aromatic hydrocarbon ring having 6 to 50 ring carbon atoms or a substituted or unsubstituted heterocycle having 5 to 50 ring atoms; and at least one of $A_{91}$ ring or $A_{92}$ ring is bonded with * in a moiety represented by a formula (92) below.

[Formula 256]

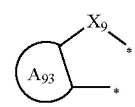

(92)

In the formula (92): $A_{93}$ ring is a substituted or unsubstituted aromatic hydrocarbon ring having 6 to 50 ring carbon atoms or a substituted or unsubstituted heterocycle having 5 to 50 ring atoms;

$X_9$ is $NR_{93}$, $C(R_{94})(R_{95})$, $Si(R_{96})(R_{97})$, $Ge(R_{98})(R_{99})$, an oxygen atom, a sulfur atom, or a selenium atom;

$R_{91}$ and $R_{92}$ are mutually bonded to form a substituted or unsubstituted monocyclic ring, mutually bonded to form a substituted or unsubstituted fused ring, or not mutually bonded; and $R_{91}$ and $R_{92}$, and $R_{93}$ to $R_{99}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one ring selected from the group consisting of $A_{91}$ ring and $A_{92}$ ring is bonded to a bond * of the moiety represented by the formula (92). In other words, the ring-forming carbon atoms of the aromatic hydrocarbon ring or the ring atoms of the heterocycle of the $A_{91}$ ring in an exemplary embodiment are bonded to the bonds * in the moiety represented by the formula (92). Further, the ring-forming carbon atoms of the aromatic hydrocarbon ring or the ring atoms of the heterocycle of the $A_{92}$ ring in an exemplary embodiment are bonded to the bonds * in the moiety represented by the formula (92).

In an exemplary embodiment, the group represented by a formula (93) below is bonded to one or both of the $A_{91}$ ring and $A_{92}$ ring.

[Formula 257]

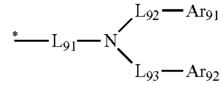

(93)

In the formula (93): $Ar_{91}$ and $Ar_{92}$ are each independently a substituted or unsubstituted aryl group having 6 to 50 ring carbon atoms, or a substituted or unsubstituted heterocyclic group having 5 to 50 ring atoms;

$L_{91}$ to $L_{93}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and

* in the formula (93) represents a bonding position to one of $A_{91}$ ring and $A_{92}$ ring.

In an exemplary embodiment, in addition to the $A_{91}$ ring, the ring-forming carbon atoms of the aromatic hydrocarbon ring or the ring atoms of the heterocycle of the $A_{92}$ ring are bonded to * in the moiety represented by the formula (92). In this case, the moieties represented by the formula (92) are mutually the same or different.

In an exemplary embodiment, $R_{91}$ and $R_{92}$ are each independently a substituted or unsubstituted aryl group having 6 to 50 ring carbon atoms.

In an exemplary embodiment, $R_{91}$ and $R_{92}$ are mutually bonded to form a fluorene structure.

In an exemplary embodiment, the rings $A_{91}$ and $A_{92}$ are each independently a substituted or unsubstituted aromatic hydrocarbon ring having 6 to 50 ring carbon atoms, example of which is a substituted or unsubstituted benzene ring.

In an exemplary embodiment, the ring $A_{93}$ is a substituted or unsubstituted aromatic hydrocarbon ring having 6 to 50 ring carbon atoms, example of which is a substituted or unsubstituted benzene ring.

In an exemplary embodiment, $X_9$ is an oxygen atom or a sulfur atom.

Specific Examples of Compound Represented by Formula (9)

Specific examples of the compound represented by the formula (9) include compounds shown below.

[Formula 258]

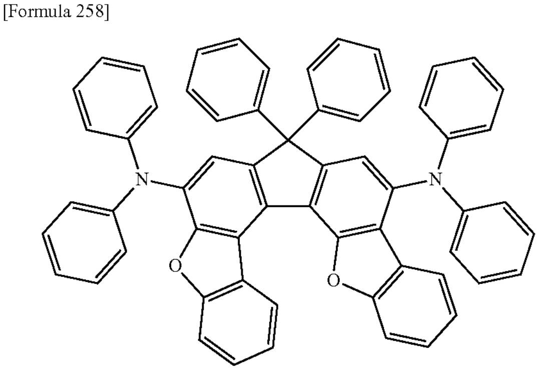

-continued

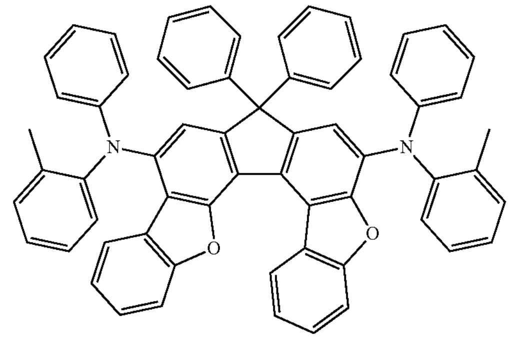

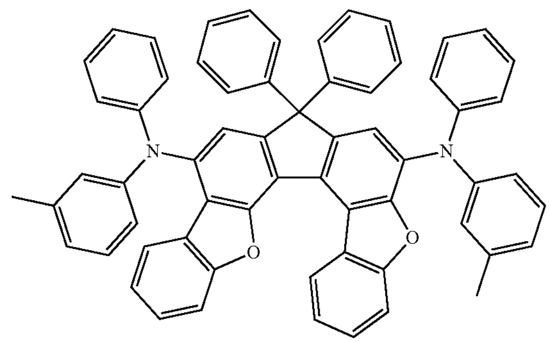

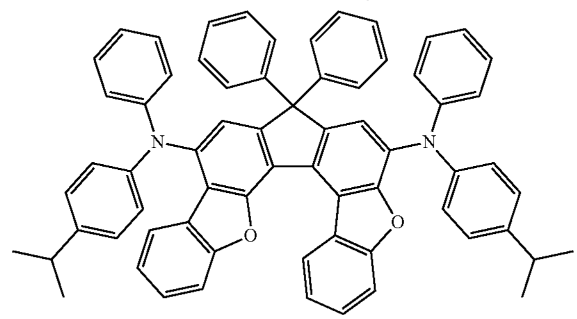

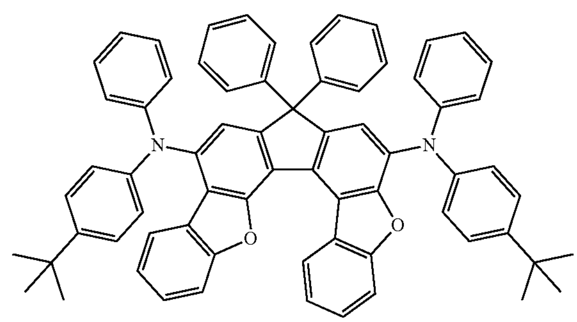

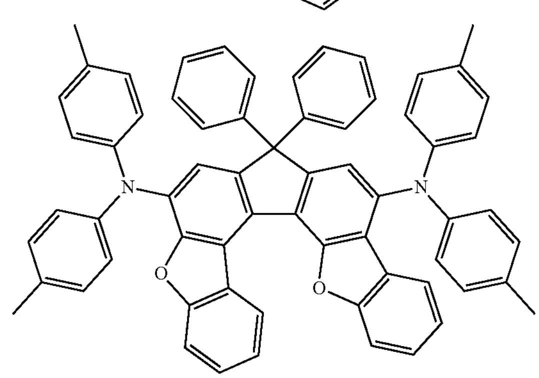

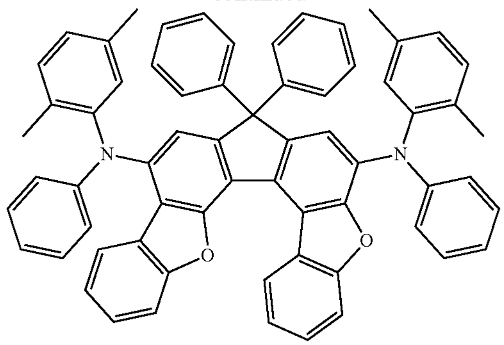
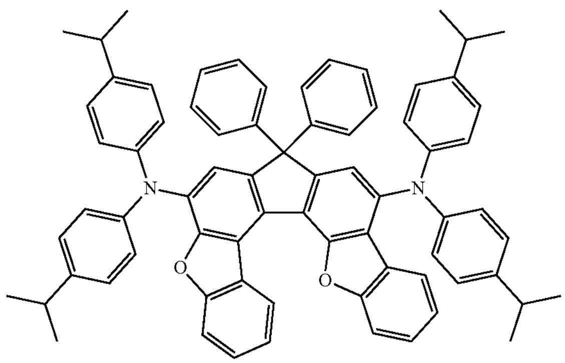
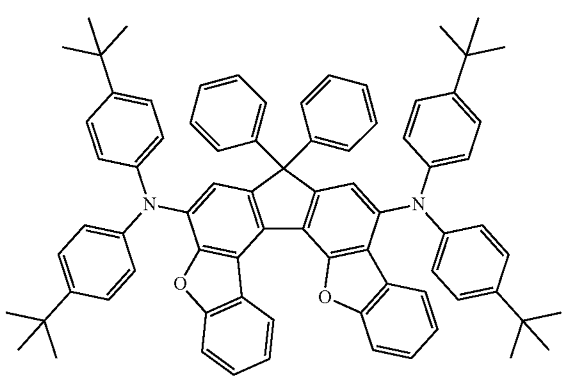
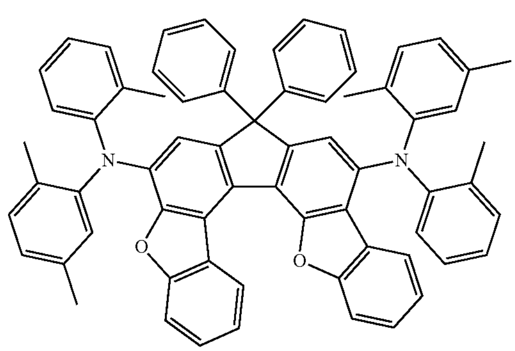
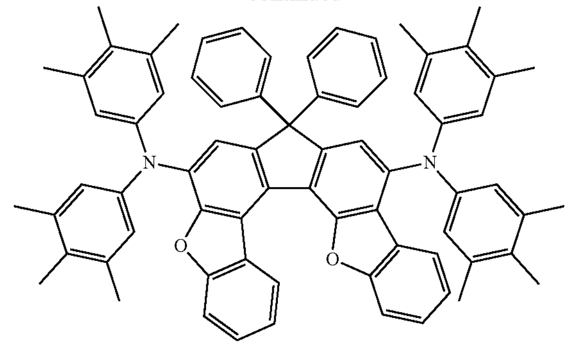
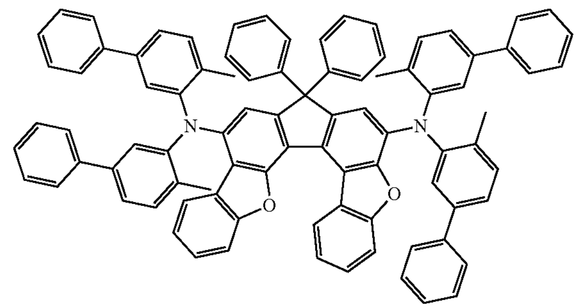
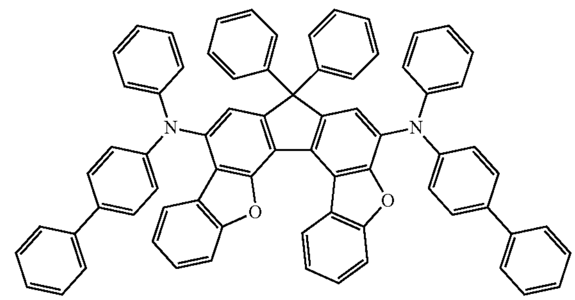
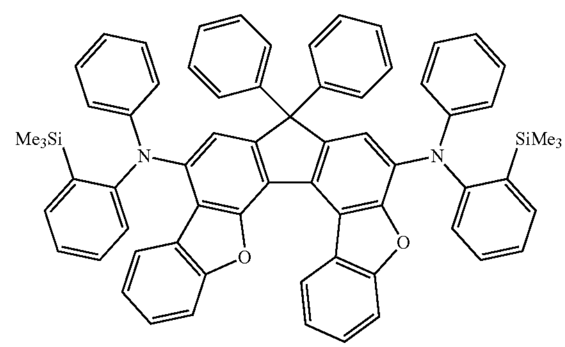
Me3Si
SiMe3
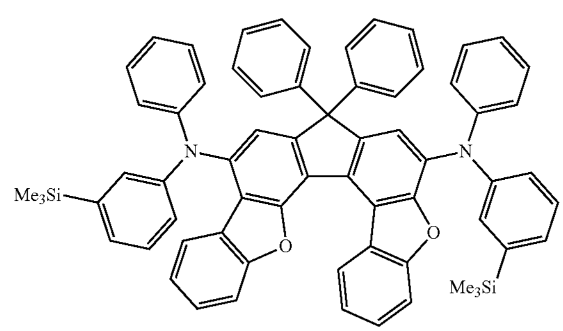
Me3Si
Me3Si -continued
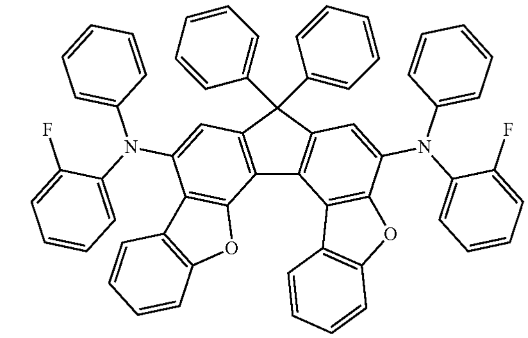
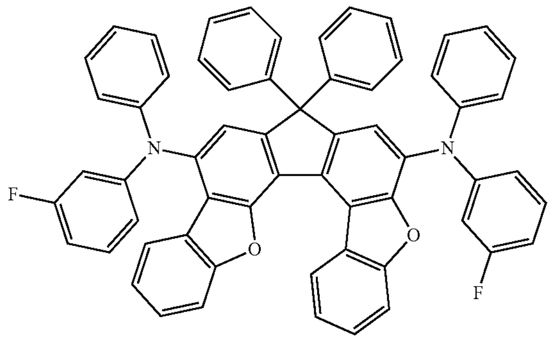
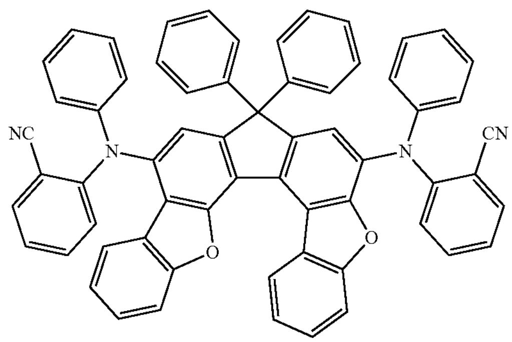
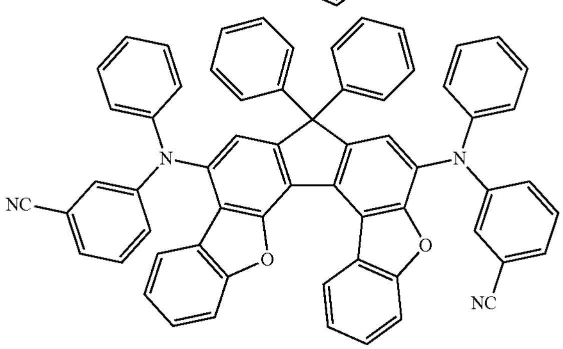
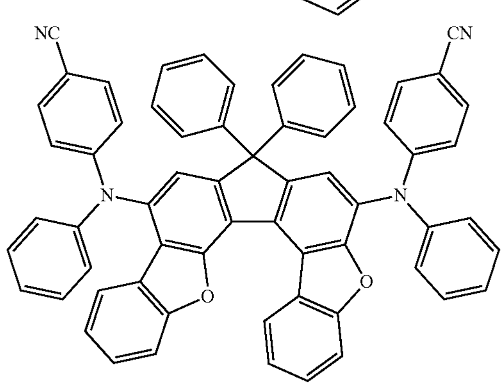
-continued
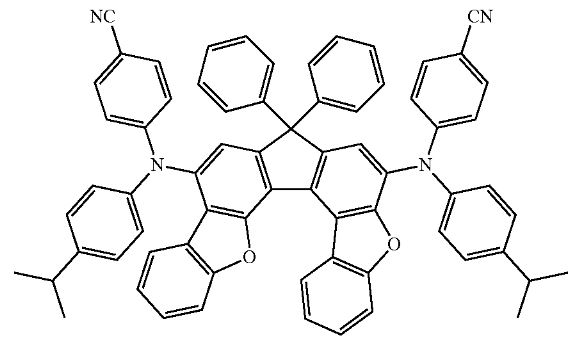
[Formula 259]
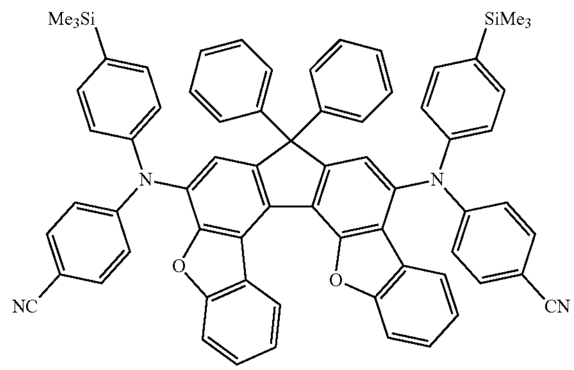
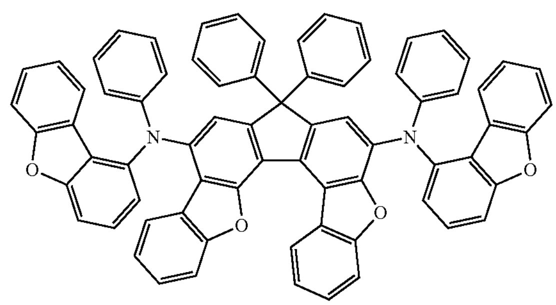
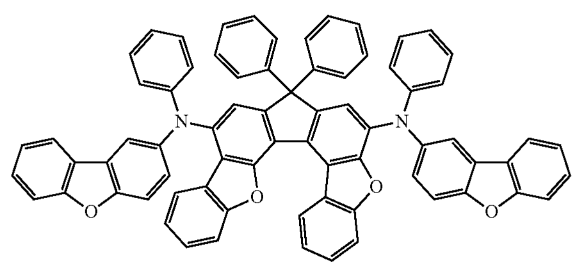
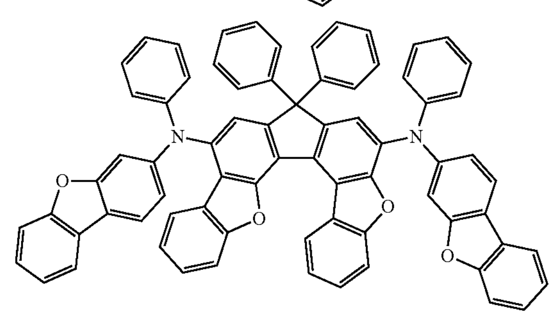

-continued
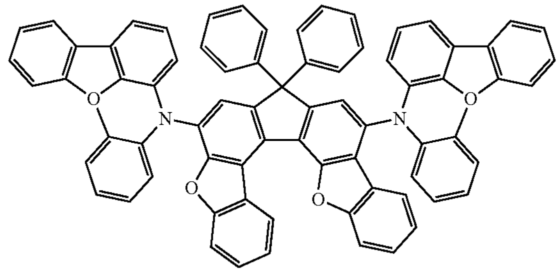
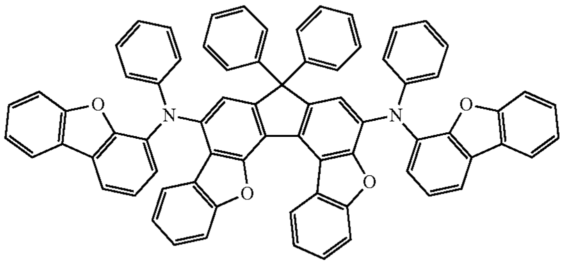
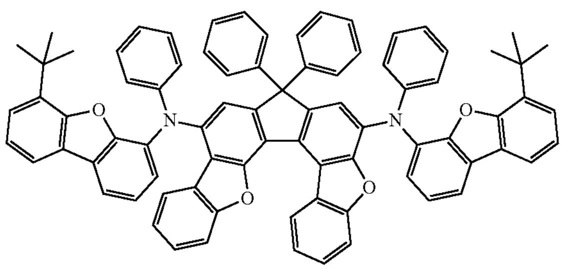
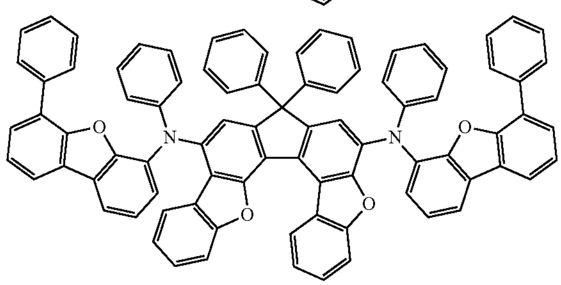
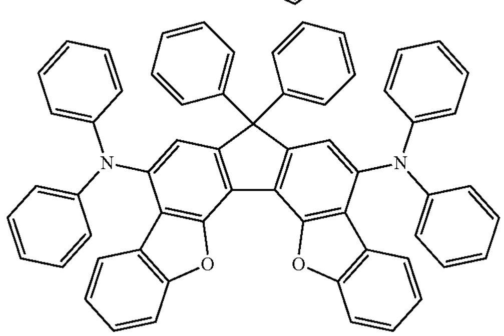
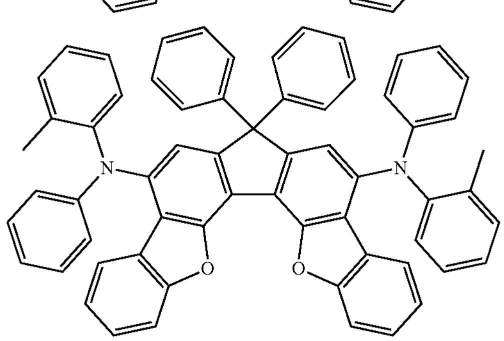
-continued
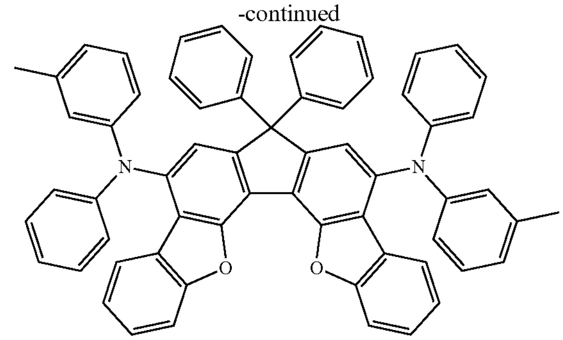
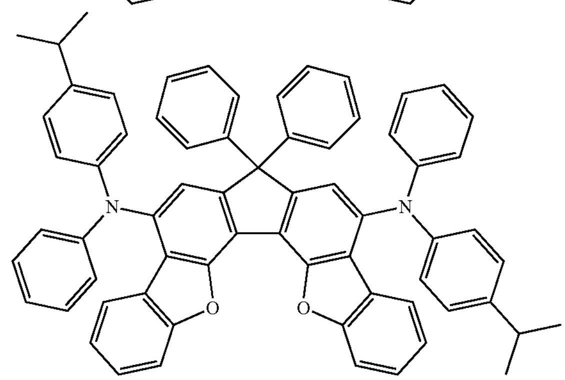
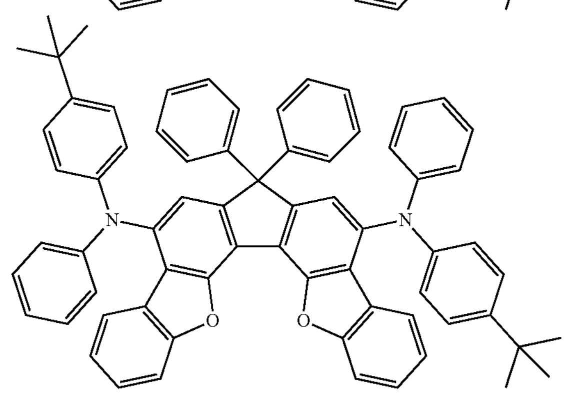
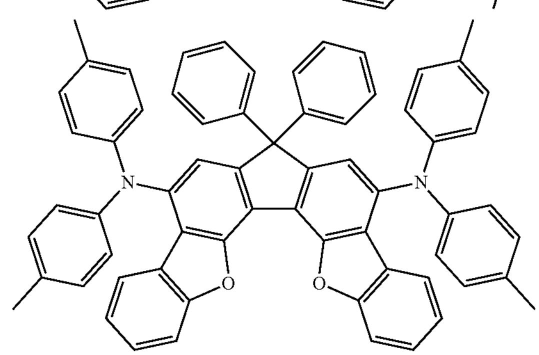
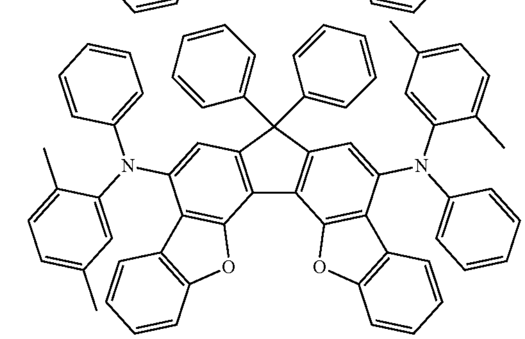

-continued
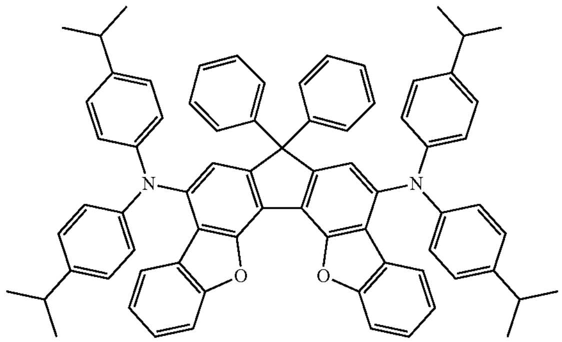
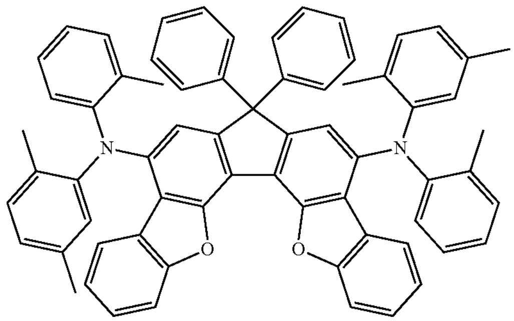
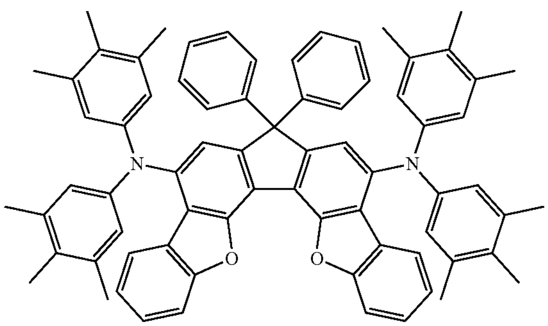
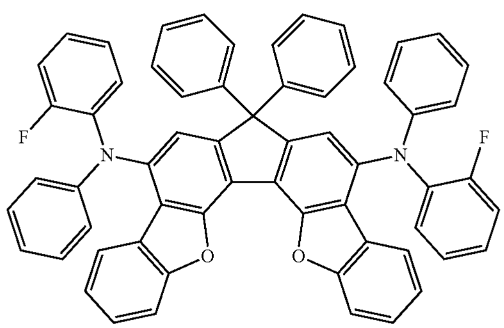
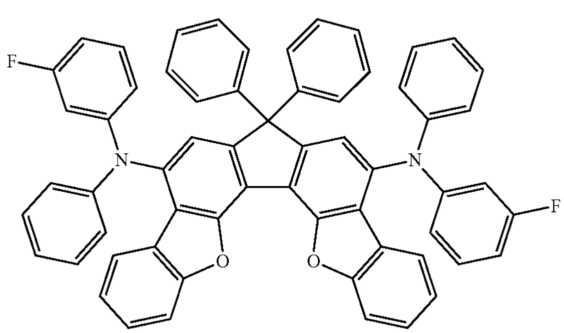
[Formula 260]
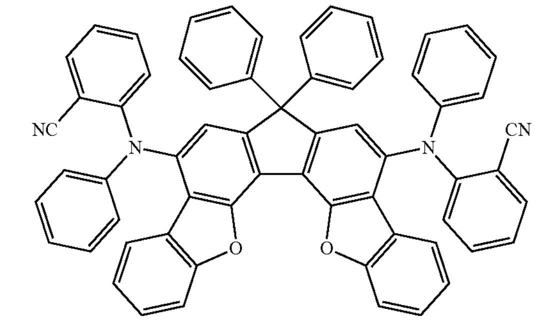
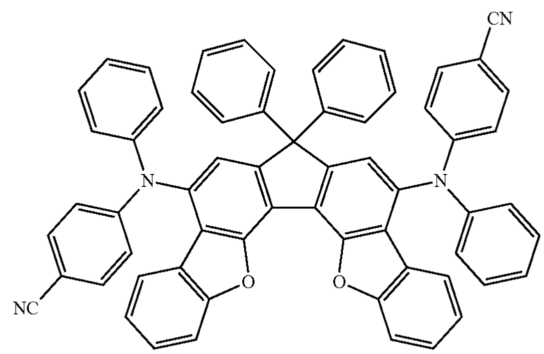
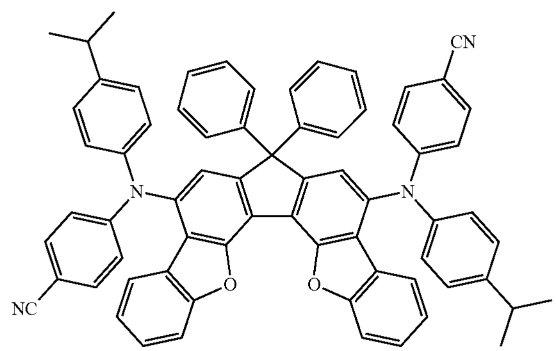
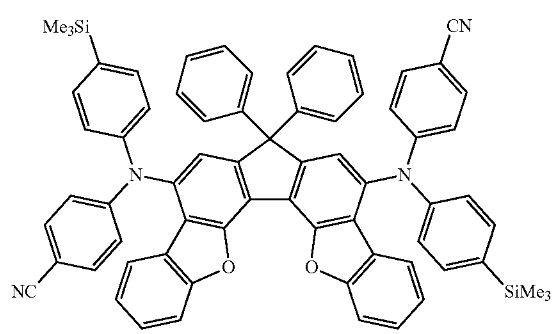
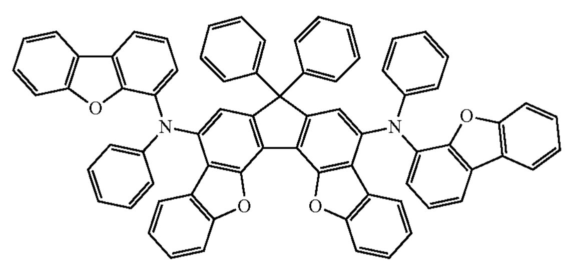

-continued
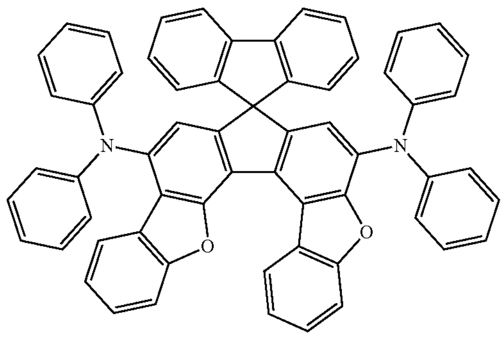
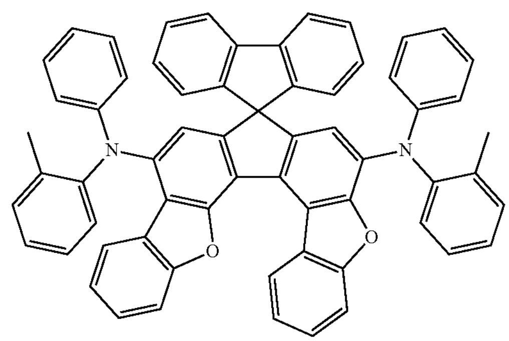
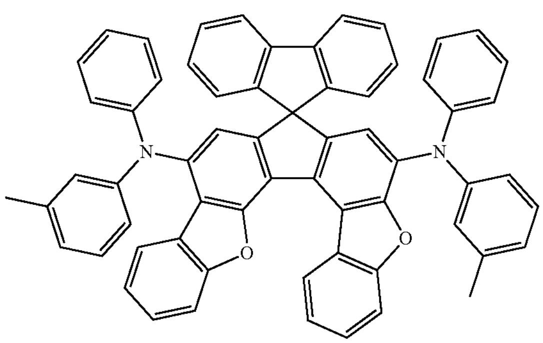
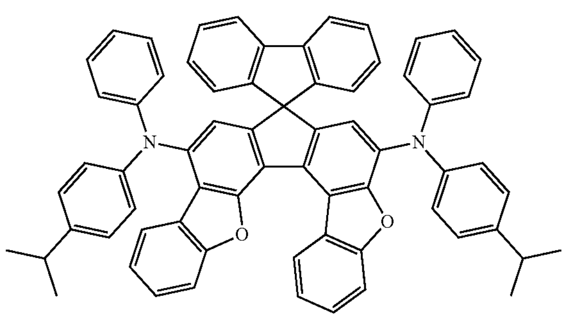
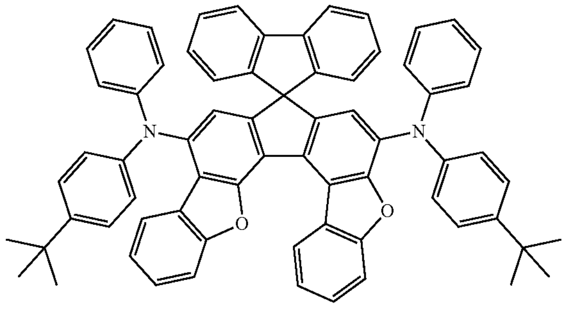
-continued
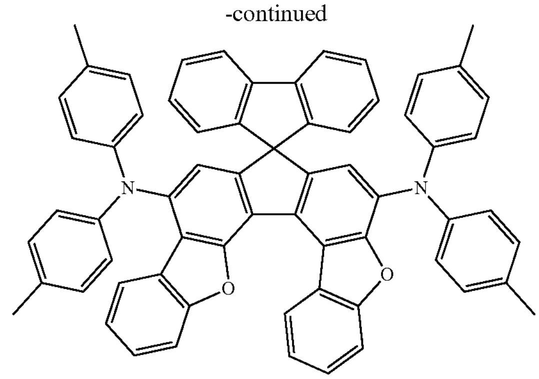
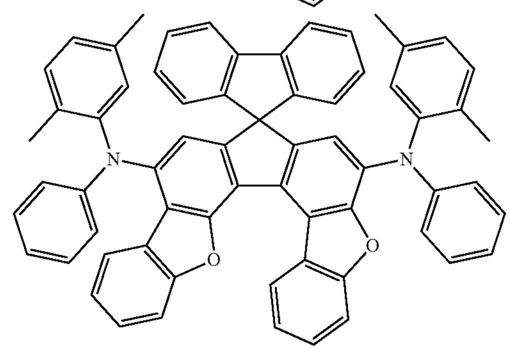
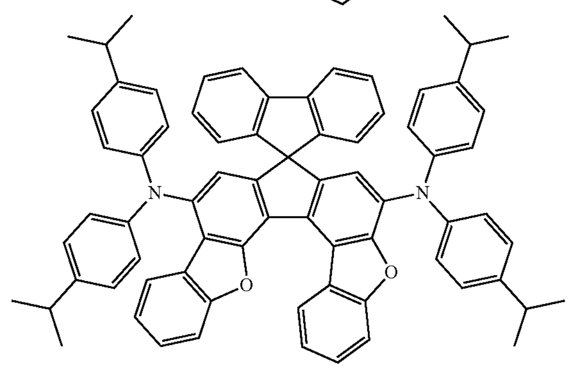
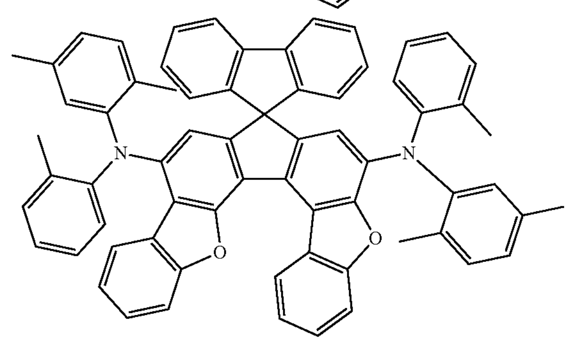
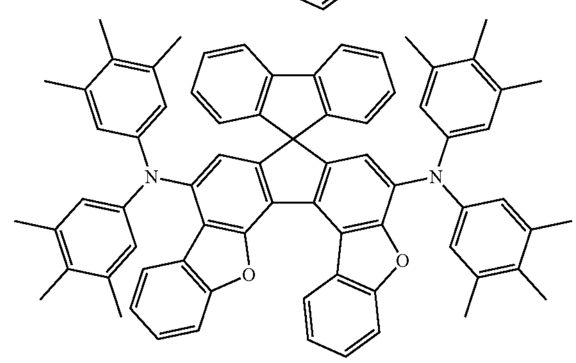

-continued
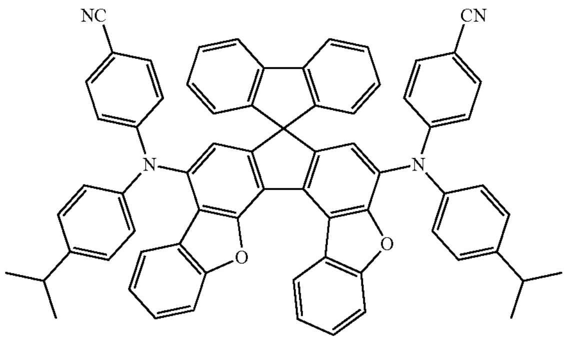
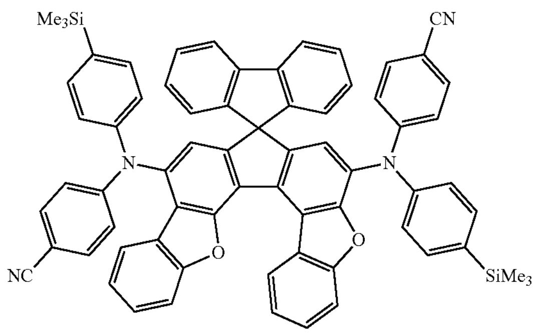
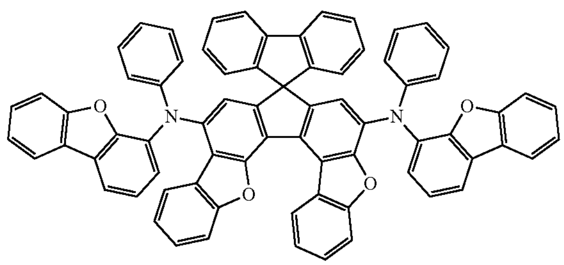
[Formula 261]
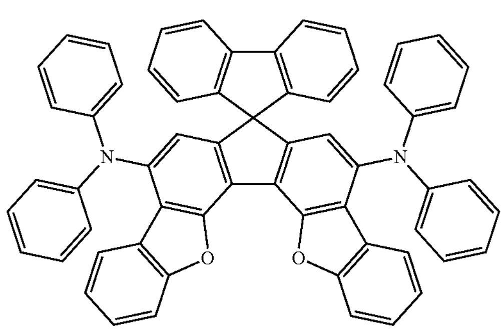
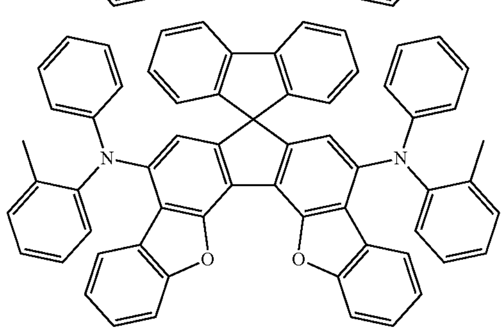
-continued
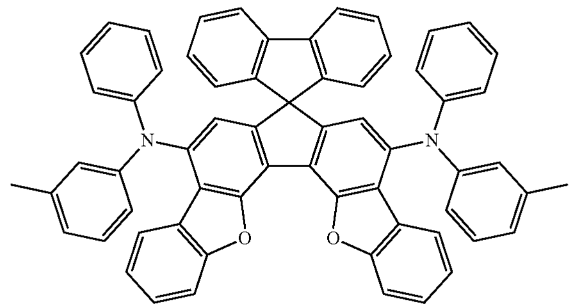
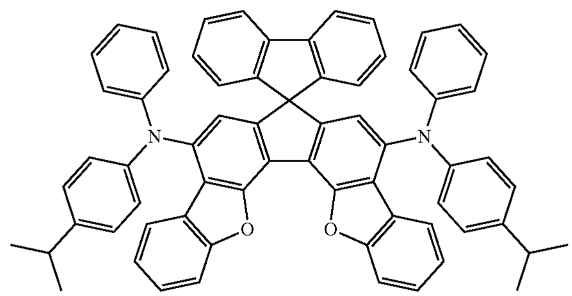
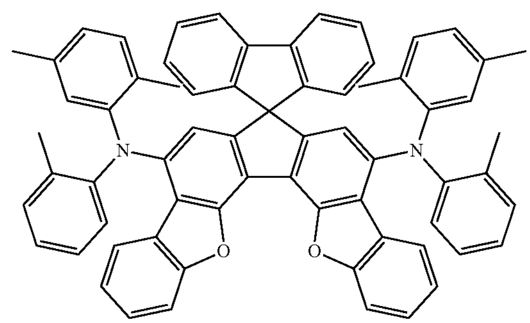
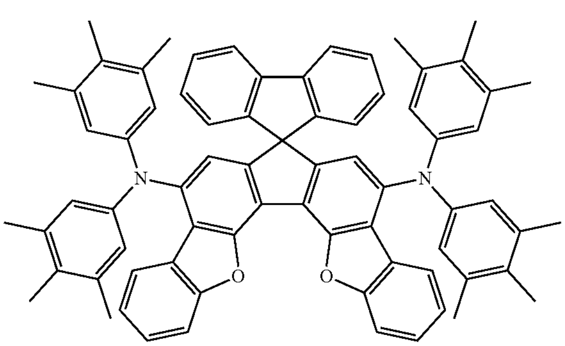
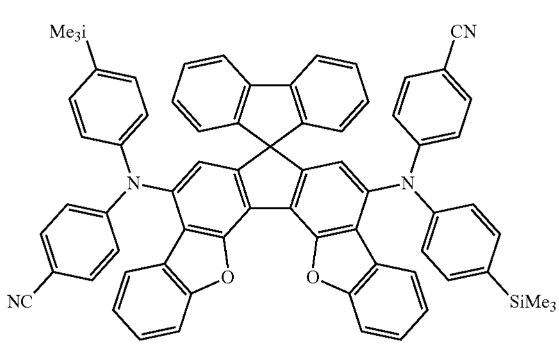

-continued

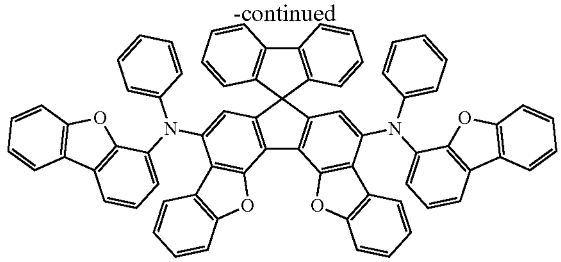

Compound Represented by Formula (10)

The compound represented by the formula (10) will be described below.

[Formula 262]

(10)

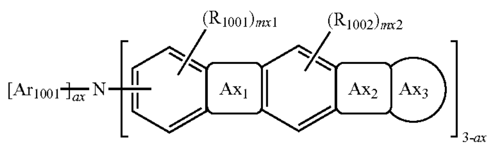

[Formula 263]

(10a)

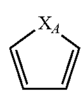

(10b)

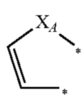

In the formula (10), $Ax_1$ ring is a ring represented by the formula (10a) and fused with any positions of adjacent rings;

$Ax_2$ ring is a ring represented by the formula (10b) and fused with any positions of adjacent rings;

two * in the formula (10b) are bonded to any position of $Ax_3$ ring;

$X_A$ and XB are each independently $C(R_{1003})(R_{1004})$, $Si(R_{1005})(R_{1006})$, an oxygen atom or a sulfur atom;

$Ax_3$ ring is a substituted or unsubstituted aromatic hydrocarbon ring having 6 to 50 ring carbon atoms or a substituted or unsubstituted heterocycle having 5 to 50 ring atoms;

$Ar_{1001}$ is a substituted or unsubstituted aryl group having 6 to 50 ring carbon atoms, or a substituted or unsubstituted heterocyclic group having 5 to 50 ring atoms;

$R_{1001}$ to $R_{1006}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

mx1 is 3, mx2 is 2;

a plurality of $R_{1001}$ are mutually the same or different;

a plurality of $R_{1002}$ are mutually the same or different;

ax is 0, 1, or 2;

when ax is 0 or 1, the structures enclosed by brackets indicated by "3-ax" are mutually the same or different; and when ax is 2, a plurality of $Ar_{1001}$ are mutually the same or different.

In an exemplary embodiment, $Ar_{1001}$ is a substituted or unsubstituted aryl group having 6 to 50 ring carbon atoms.

In an exemplary embodiment, $Ax_3$ ring is a substituted or unsubstituted aromatic hydrocarbon ring having 6 to 50 ring carbon atoms, example of which is a substituted or unsubstituted benzene ring, a substituted or unsubstituted naphthalene ring, or a substituted or unsubstituted anthracene ring.

In an exemplary embodiment, $R_{1003}$ and $R_{1004}$ are each independently a substituted or unsubstituted alkyl group having 1 to 50 carbon atoms.

In an exemplary embodiment, ax is 1.

Specific Examples of Compound Represented by Formula (10)

Specific examples of the compound represented by the formula (10) include compounds shown below.

[Formula 264]

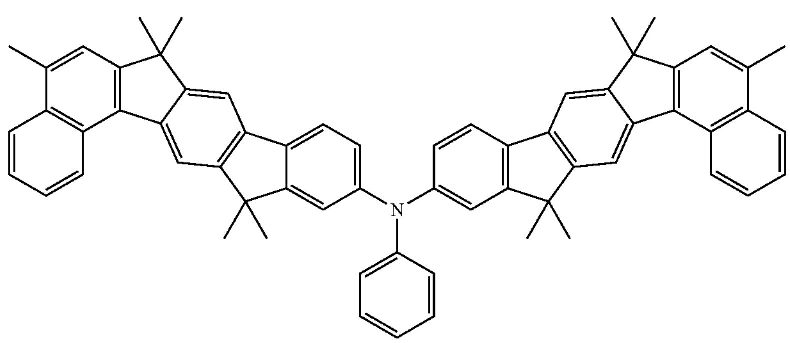

-continued
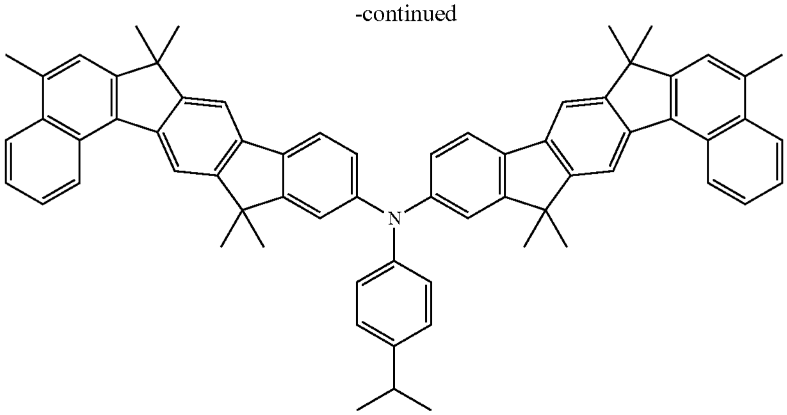
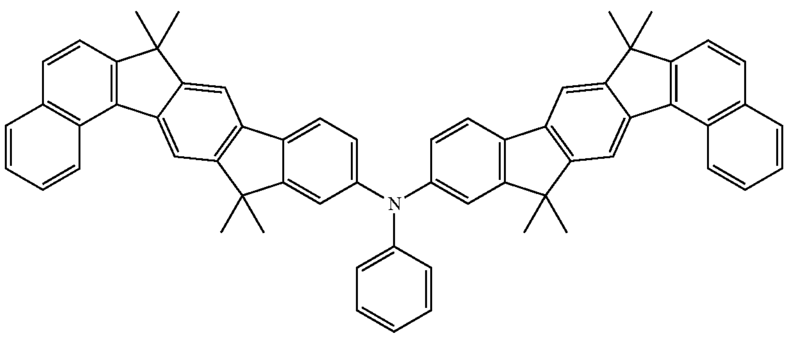
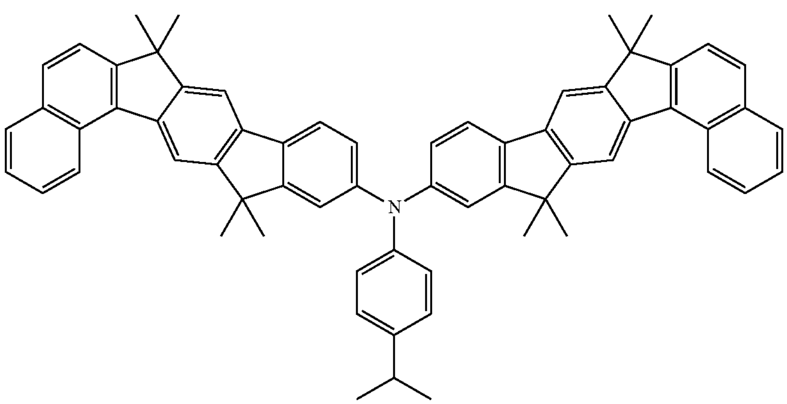
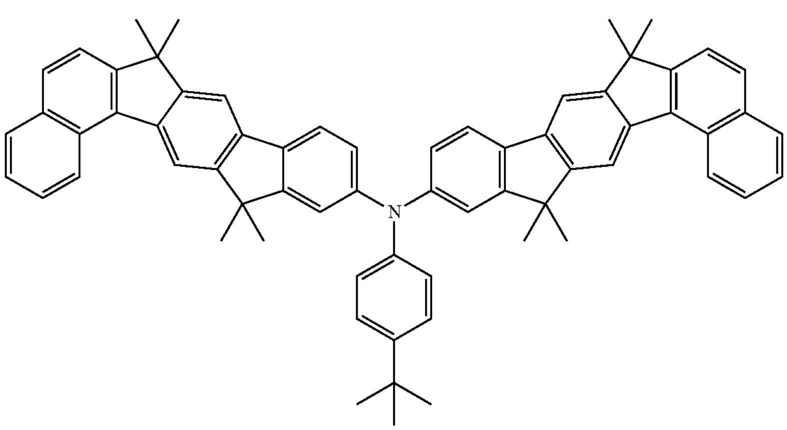

-continued
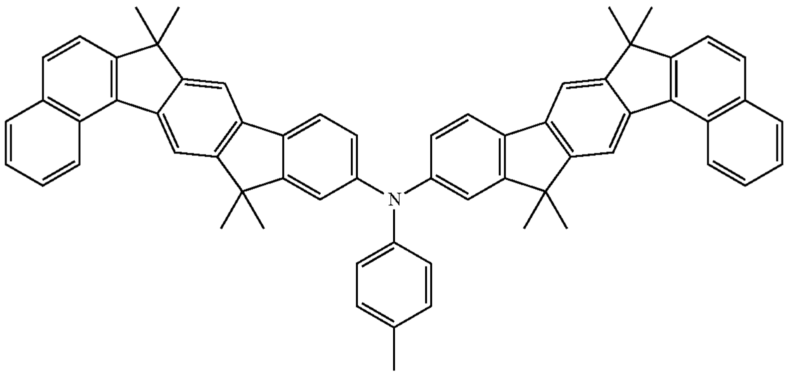
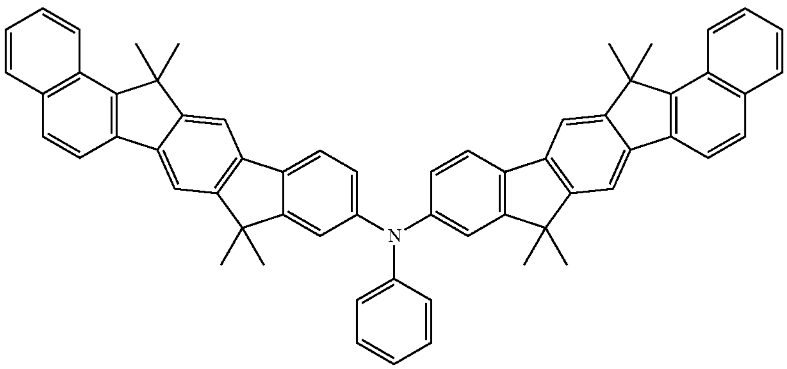
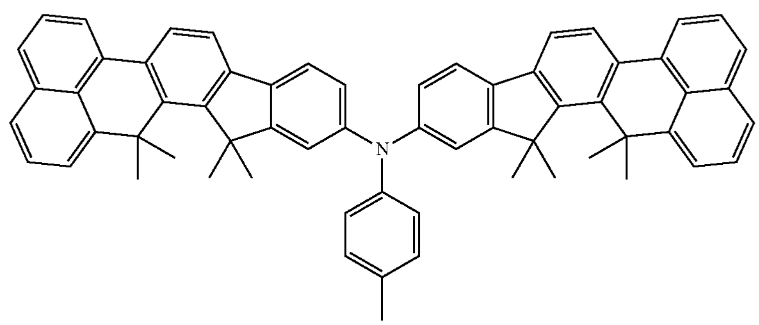
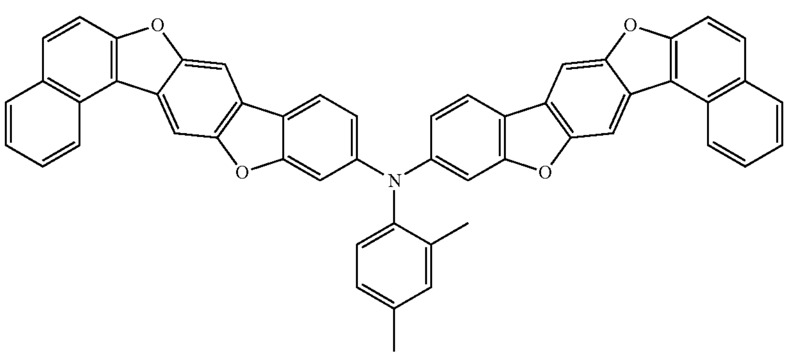

-continued

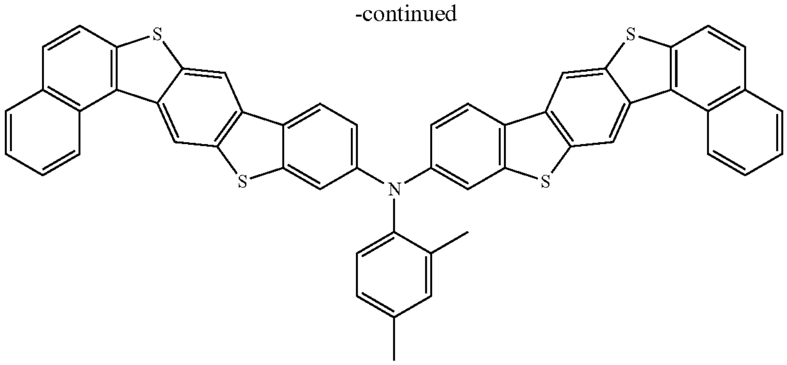

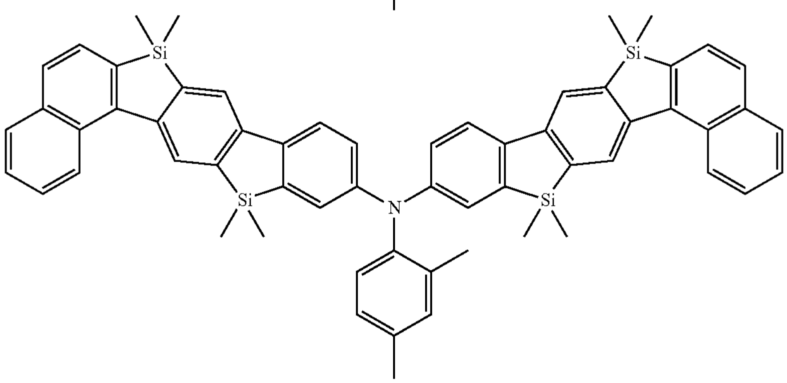

In an exemplary embodiment, the emitting layer contains, as the fourth compound and the fifth compound, at least one compound selected from the group consisting of the compound represented by the formula (4), the compound represented by the formula (5), the compound represented by the formula (7), the compound represented by the formula (8), the compound represented by the formula (9), and a compound represented by a formula (63a) below.

[Formula 265]

(63a)

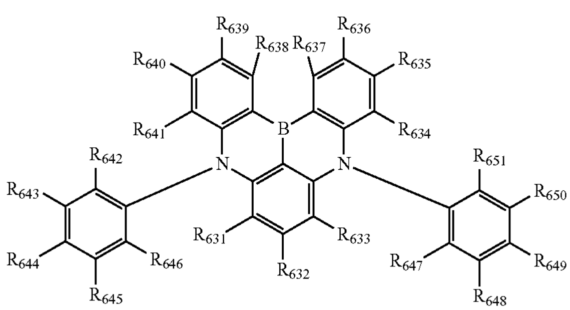

In the formula (63a): $R_{631}$ is bonded with $R_{646}$ to form a substituted or unsubstituted heterocycle or to form no substituted or unsubstituted heterocycle;

$R_{633}$ is bonded with $R_{647}$ to form a substituted or unsubstituted heterocycle or to form no substituted or unsubstituted heterocycle;

$R_{634}$ is bonded with $R_{651}$ to form a substituted or unsubstituted heterocycle or to form no substituted or unsubstituted heterocycle;

$R_{641}$ is bonded with $R_{642}$ to form a substituted or unsubstituted heterocycle or to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded;

$R_{631}$ to $R_{651}$ not forming the substituted or unsubstituted heterocycle, not forming the monocyclic ring and not forming the fused ring are each independently a hydrogen atom, a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms; and at least one of $R_{631}$ to $R_{651}$ not forming the substituted or unsubstituted heterocycle, not forming the monocyclic ring and not forming the fused ring are a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is the compound represented by the formula (41-3), the formula (41-4) or the formula (41-5), the A1 ring in the formula (41-5) being a substituted or unsubstituted fused aromatic hydrocarbon ring having 10 to 50 ring carbon atoms, or a substituted or unsubstituted fused heterocycle having 8 to 50 ring atoms.

In an exemplary embodiment, the substituted or unsubstituted fused aromatic hydrocarbon ring having 10 to 50 ring carbon atoms in the formulae (41-3), (41-4) and (41-5) is a substituted or unsubstituted naphthalene ring, a substituted or unsubstituted anthracene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the substituted or unsubstituted fused aromatic hydrocarbon ring having 10 to 50 ring carbon atoms in the formula (41-3), (41-4) or (41-5) is a substituted or unsubstituted naphthalene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the compound represented by the formula (4) is selected from the group consisting of a compound represented by a formula (461) below, a compound represented by a formula (462) below, a compound represented by a formula (463) below, a compound represented by a formula (464) below, a compound represented by a formula (465) below, a compound represented by a formula (466) below, and a compound represented by a formula (467) below.

[Formula 266]

(461)

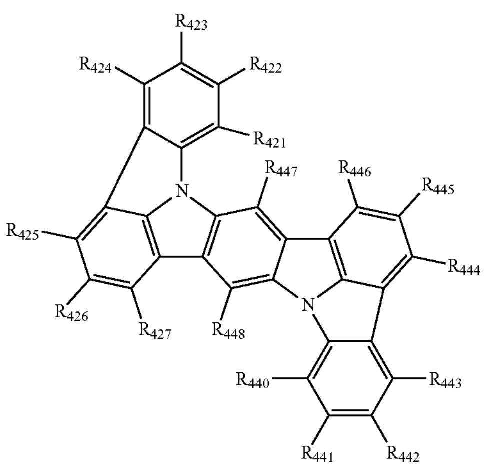

(462)

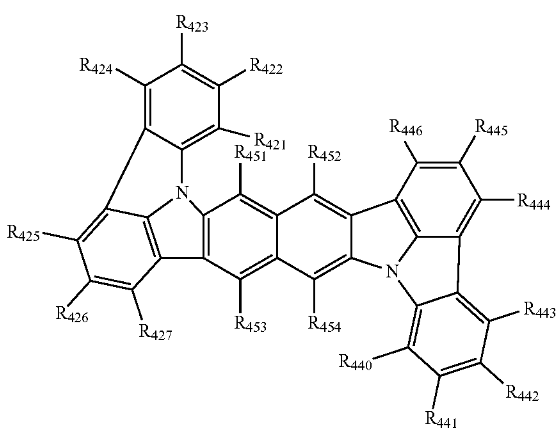

[Formula 267]

(463)

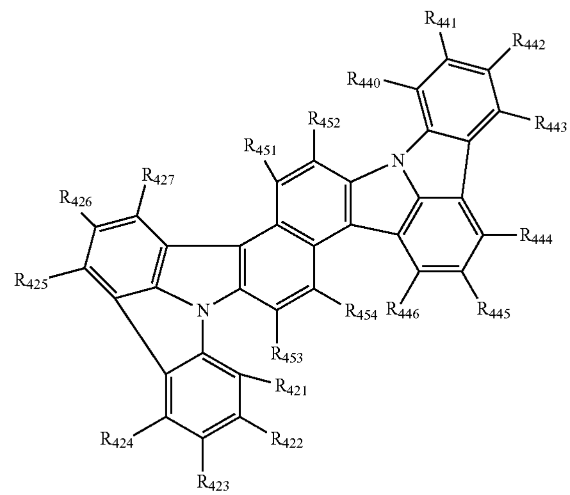

(464)

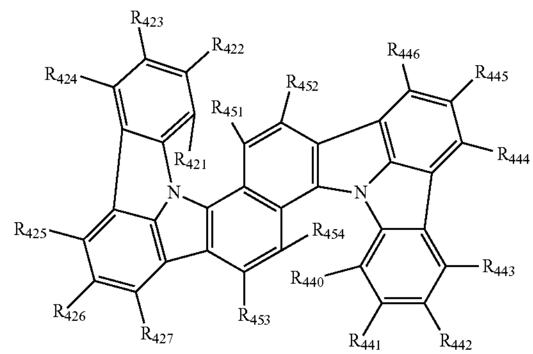

[Formula 268]

(465)

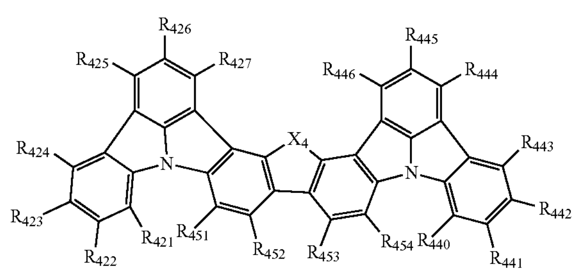

[Formula 269]

(466)

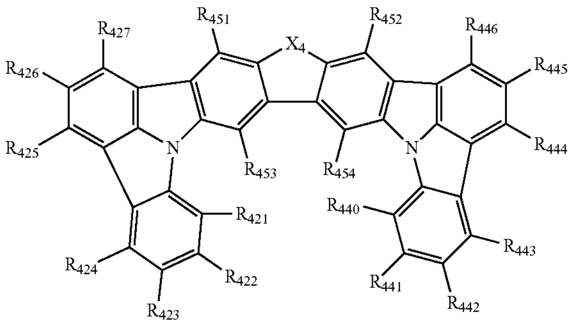

[Formula 270]

(467)

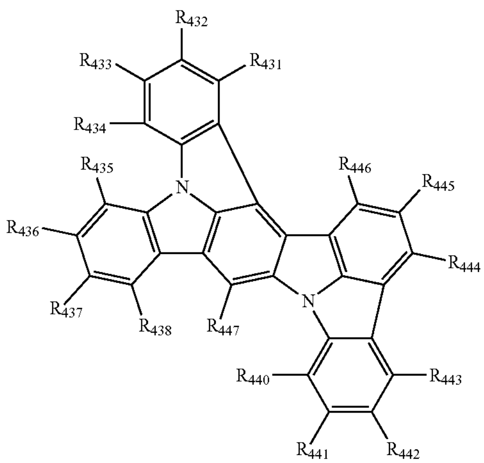

In the formulae (461) to (467): at least one combination of adjacent two or more of moieties selected from $R_{421}$ to $R_{427}$, $R_{431}$ to $R_{436}$, $R_{440}$ to $R_{448}$, and $R_{451}$ to $R_{454}$ are mutually bonded to form a substituted or unsubstituted monocyclic ring, mutually bonded to form a substituted or unsubstituted fused ring, or not mutually bonded;

$R_{437}$, $R_{438}$, and $R_{421}$ to $R_{427}$, $R_{431}$ to $R_{436}$, $R_{440}$ to $R_{448}$, and $R_{451}$ to $R_{454}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_4$ is an oxygen atom, $NR_{801}$, or C($R_{802}$)($R_{803}$);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different, when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, $R_{421}$ to $R_{427}$ and $R_{440}$ to $R_{448}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{421}$ to $R_{427}$ and $R_{440}$ to $R_{447}$ are each independently selected from the group consisting of a hydrogen atom, a substituted or unsubstituted aryl group having 6 to 18 ring carbon atoms, and a substituted or unsubstituted heterocyclic group having 5 to 18 ring atoms.

In an exemplary embodiment, the compound represented by the formula (41-3) is a compound represented by a formula (41-3-1) below.

[Formula 271]

(41-3-1)

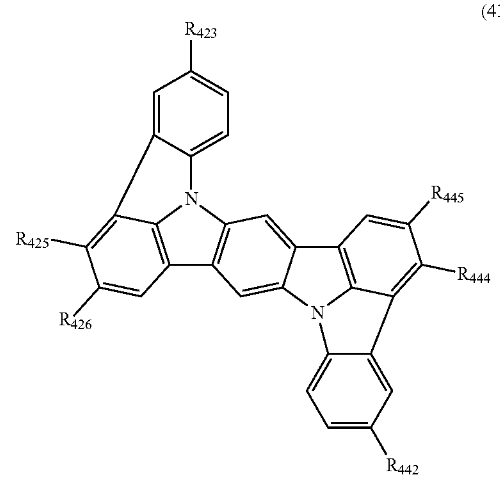

In the formula (41-3-1), $R_{423}$, $R_{425}$, $R_{426}$, $R_{442}$, $R_{444}$ and $R_{445}$ each independently represent the same as $R_{423}$, $R_{425}$, $R_{426}$, $R_{442}$, $R_{444}$ and $R_{445}$ in the formula (41-3).

In an exemplary embodiment, the compound represented by the formula (41-3) is represented by a formula (41-3-2) below.

[Formula 272]

(41-3-2)

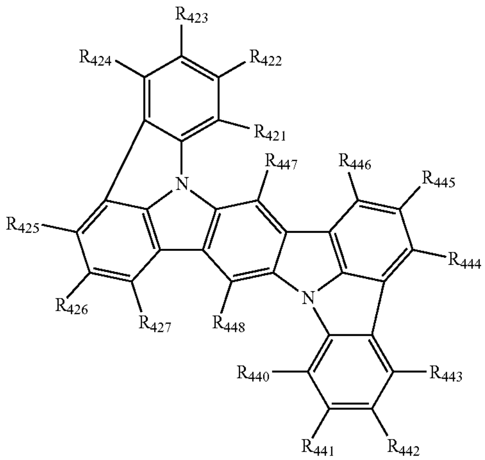

In the formula (41-3-2), $R_{421}$ to $R_{427}$ and $R_{440}$ to $R_{448}$ each independently represent the same as $R_{421}$ to $R_{427}$ and $R_{440}$ to $R_{448}$ in the formula (41-3), at least one of $R_{421}$ to $R_{427}$ or $R_{440}$ to $R_{446}$ is a group represented by —N($R_{906}$)($R_{907}$).

In an exemplary embodiment, two of $R_{421}$ to $R_{427}$ and $R_{440}$ to $R_{446}$ in the formula (41-3-2) are groups represented by —N($R_{906}$)($R_{907}$).

In an exemplary embodiment, the compound represented by the formula (41-3-2) is a compound represented by a formula (41-3-3) below.

[Formula 273]

(41-3-3)

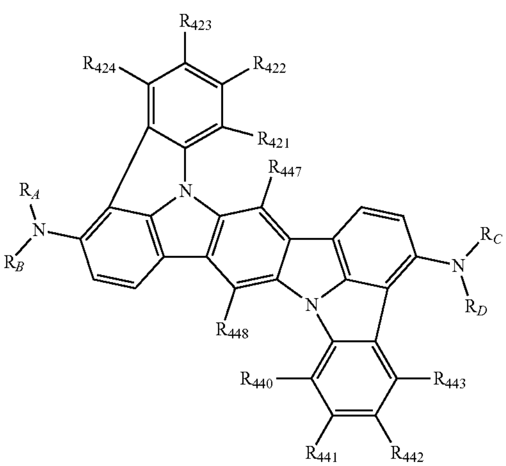

In the formula (41-3-3), $R_{421}$ to $R_{424}$, $R_{440}$ to $R_{443}$, $R_{447}$, and $R_{448}$ each independently represent the same as $R_{421}$ to $R_{424}$, $R_{440}$ to $R_{443}$, $R_{447}$, and $R_{448}$ in the formula (41-3); and $R_A$, $R_B$, $R_C$, and $R_D$ are each independently a substituted or unsubstituted aryl group having 6 to 18 ring carbon atoms, or a substituted or unsubstituted heterocyclic group having 5 to 18 ring atoms.

In an exemplary embodiment, the compound represented by the formula (41-3-3) is a compound represented by a formula (41-3-4) below.

[Formula 274]

(41-3-4)

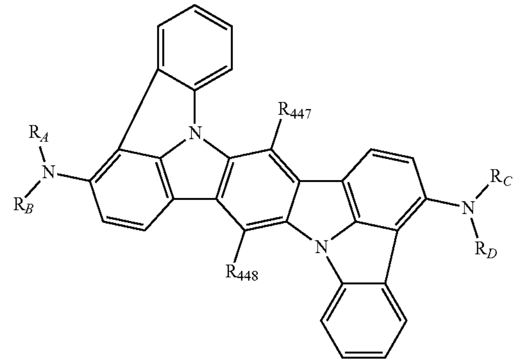

In the formula (41-3-4), $R_{447}$, $R_{448}$, $R_A$, $R_B$, $R_C$ and $R_D$ each independently represent the same as $R_{447}$, $R_{448}$, $R_A$, $R_B$, $R_C$ and $R_D$ in the formula (41-3-3).

In an exemplary embodiment, $R_A$, $R_B$, $R_C$, and $R_D$ are each independently a substituted or unsubstituted aryl group having 6 to 18 ring carbon atoms.

In an exemplary embodiment, $R_A$, $R_B$, $R_C$, and $R_D$ are each independently a substituted or unsubstituted phenyl group.

In an exemplary embodiment, $R_{447}$ and $R_{448}$ are each a hydrogen atom.

In an exemplary embodiment, a substituent "for the substituted or unsubstituted" group in each of the formulae is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), (Raga), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more Raga are present, the two or more Raga are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In an exemplary embodiment, a substituent for the substituted or unsubstituted group in each of the formulae is an unsubstituted alkyl group having 1 to 50 carbon atoms, an unsubstituted aryl group having 6 to 50 ring carbon atoms, or an unsubstituted heterocyclic group having 5 to 50 ring atoms.

In an exemplary embodiment, a substituent for the substituted or unsubstituted group in each of the formulae is an unsubstituted alkyl group having 1 to 18 carbon atoms, an unsubstituted aryl group having 6 to 18 ring carbon atoms, or an unsubstituted heterocyclic group having 5 to 18 ring atoms.

In the fourth and fifth compounds, it is preferable that all groups described as "substituted or unsubstituted" groups are "unsubstituted" groups.

In the organic EL device of the exemplary embodiment, the fourth compound is preferably a compound that emits light having a maximum peak wavelength in a range from 430 nm to 480 nm.

In the organic EL device of the exemplary embodiment, the fifth compound is preferably a compound that emits light having a maximum peak wavelength in a range from 430 nm to 480 nm.

A measurement method of the maximum peak wavelength of a compound is as follows. A toluene solution of a measurement target compound at a concentration ranging from $10^{-6}$ mol/L to $10^{-5}$ mol/L is prepared and put in a quartz cell. An emission spectrum (ordinate axis: luminous intensity, abscissa axis: wavelength) of the thus-obtained sample is measured at a normal temperature (300K). The emission spectrum is measurable using a spectrophotometer (machine name: F-7000) manufactured by Hitachi High-Tech Science Corporation. It should be noted that the machine for measuring the emission spectrum is not limited to the machine used herein.

A peak wavelength of the emission spectrum exhibiting the maximum luminous intensity is defined as the maximum peak wavelength. Herein, the maximum peak wavelength of fluorescence is sometimes referred to as the maximum fluorescence peak wavelength (FL-peak).

In the organic EL device of the exemplary embodiment, when the first emitting layer contains the first compound and the fifth compound, a singlet energy $S_1(H1)$ of the first compound and a singlet energy $S_1(D5)$ of the fifth compound preferably satisfy a relationship of a numerical formula (Numerical Formula 1) below.

$$S_1(H1)>S_1(D5) \quad \text{(Numerical Formula 1)}$$

When the second emitting layer of the organic EL device of the exemplary embodiment contains the second and fourth compounds, a singlet energy $S_1(H2)$ of the second compound and a singlet energy $S_1(D4)$ of the fourth compound preferably satisfy a relationship of a numerical formula (Numerical Formula 2) below.

$$S_1(H2)>S_1(D4) \quad \text{(Numerical Formula 2)}$$

Singlet Energy $S_1$

A method of measuring a singlet energy Si with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value λedge (nm) at an intersection of the tangent and the abscissa axis is assigned to a conversion equation (F2) below to calculate singlet energy.

$$S_1\ [\text{eV}]=1239.85/\lambda\text{edge} \quad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve fell (i.e., a value of the ordinate axis is decreased). A tangent drawn at a point of the local minimum inclination closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Film Thickness of Emitting Layer

A film thickness of each of the first and second emitting layers of the organic EL device in the exemplary embodiment is preferably in a range of 5 nm to 50 nm, more preferably in a range of 7 nm to 50 nm, further preferably in a range of 10 nm to 50 nm. When the film thickness of each of the first and second emitting layers is 5 nm or more, the first and second emitting layers are easily formable and chromaticity is easily adjustable. When the film thickness of each of the first and second emitting layers is 50 nm or less, a rise of the drive voltage is easily suppressible.

Content Ratios of Compounds in Emitting Layer

When the first emitting layer contains the first compound and the fifth compound, a content ratio of each of the first compound and the fifth compound in the first emitting layer preferably falls, for instance, within a range below.

The content ratio of the first compound is preferably in a range from 80 mass % to 99 mass %, more preferably in a range from 90 mass % to 99 mass %, further preferably in a range from 95 mass % to 99 mass %.

The content ratio of the fifth compound is preferably in a range from 1 mass % to 10 mass %, more preferably in a range from 1 mass % to 7 mass %, further preferably in a range from 1 mass % to 5 mass %.

An upper limit of the total of the content ratios of the first compound and the fifth compound in the first emitting layer is 100 mass %.

It is not excluded that the first emitting layer of the exemplary embodiment further contains a material(s) other than the first and fifth compounds.

The first emitting layer may include a single type of the first compound or may include two or more types of the first compound. The first emitting layer may include a single type of the fifth compound or may include two or more types of the fifth compound.

When the second emitting layer contains the second compound and the fourth compound, the content ratios of the second and fourth compounds in the second emitting layer are, for instance, preferably determined as follows.

The content ratio of the second compound is preferably in a range from 80 mass % to 99 mass %, more preferably in a range from 90 mass % to 99 mass %, further preferably in a range from 95 mass % to 99 mass %.

The content ratio of the fourth compound is preferably in a range from 1 mass % to 10 mass %, more preferably in a range from 1 mass % to 7 mass %, further preferably in a range from 1 mass % to 5 mass %.

An upper limit of the total of the respective content ratios of the second and fourth compounds in the second emitting layer is 100 mass %.

It should be noted that the second emitting layer of the exemplary embodiment may further contain material(s) other than the second and fourth compounds.

The second emitting layer may include a single type of the second compound or may include two or more types of the second compound. The second emitting layer may include a single type of the fourth compound or may include two or more types of the fourth compound.

Electron Blocking Layer

In the organic EL device of the exemplary embodiment, the electron blocking layer and the first emitting layer are in direct contact with each other.

At least in the organic EL device according to the first aspect of the exemplary embodiment, the third compound is preferably at least one compound selected from the group consisting of a compound represented by a formula (31X) below and a compound represented by a formula (32) below.

At least in the organic EL device according to the second aspect of the exemplary embodiment, the electron blocking layer includes the third compound, and the third compound is at least one compound selected from the group consisting of a compound represented by a formula (31) below and the compound represented by the formula (32) below. In the organic EL device according to the second aspect, when the third compound is represented by the formula (31) and contains two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms. In the organic EL device according to the second aspect, when the compound represented by the formula (31) as the third compound includes a 4-dibenzofuran structure in a molecule, the number of the 4-dibenzofuran structures is 1.

Third Compound

Third Compound Represented by Formula (31X)

The third compound represented by the formula (31X) will be described.

[Formula 275]

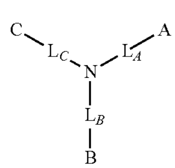

(31X)

In the formula (31X):

$L_A$, $L_B$, and $L_C$ are each independently a single bond, a substituted or unsubstituted arylene group having 6 to 18 ring carbon atoms, or a substituted or unsubstituted divalent heterocyclic group having 5 to 13 ring atoms;

A, B, and C are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)($R'_{903}$);

$R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different; and when a plurality of $R'_{903}$ are present, the plurality of $R'_{903}$ are mutually the same or different.

Third Compound Represented by Formula (31)

The third compound represented by the formula (31) will be described.

[Formula 276]

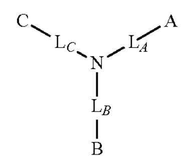

(31)

In the formula (31): $L_A$, $L_B$, and $L_C$ are each independently a single bond, or a substituted or unsubstituted arylene group having 6 to 18 ring carbon atoms;

A, B, and C are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)($R'_{903}$), $R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different; and when a plurality of $R'_{903}$ are present, the plurality of $R'_{903}$ are mutually the same or different; and a substituted or unsubstituted heterocyclic group having 5 to 30 ring atoms as A, B and C is each independently at least one group selected from the group consisting of groups represented by a formula (31A), formula (31B), formula (31C), formula (31 D), formula (31E), and formula (31F) below.

[Formula 277]

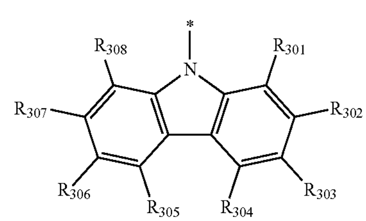

(31A)

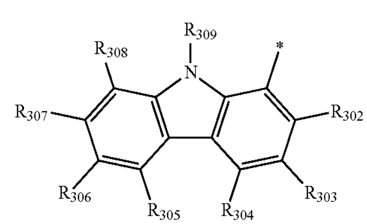

(31B)

-continued (31C)

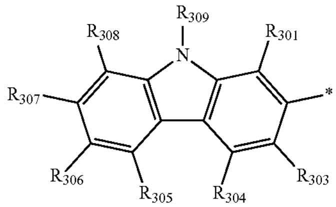

(31D)

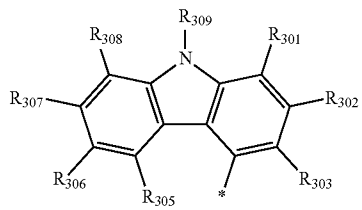

(31E)

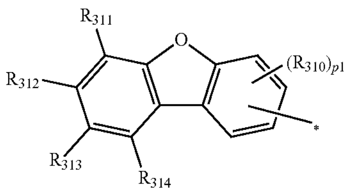

(31F)

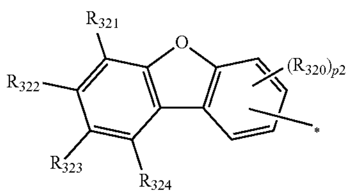

In the formulae (31A), (31B), (31C), (31D), (31E), and (31F):

at least one combination of adjacent two or more of $R_{301}$ to $R_{309}$ are mutually bonded to form a substituted or unsubstituted monocyclic ring, mutually bonded to form a substituted or unsubstituted fused ring, or not mutually bonded;

at least one combination of adjacent two or more of $R_{310}$ to $R_{314}$ are mutually bonded to form a substituted or unsubstituted monocyclic ring, mutually bonded to form a substituted or unsubstituted fused ring, or not mutually bonded;

at least one combination of adjacent two or more of $R_{320}$ to $R_{324}$ are mutually bonded to form a substituted or unsubstituted monocyclic ring, mutually bonded to form a substituted or unsubstituted fused ring, or not mutually bonded;

$R_{301}$ to $R_{309}$, $R_{310}$, $R_{311}$ to $R_{314}$, $R_{320}$ and $R_{321}$ to $R_{324}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

p1 is 3; and a plurality of $R_{310}$ are mutually the same or different;

p2 is 3; and a plurality of $R_{320}$ are mutually the same or different; and

* in the formulae (31A), (31B), (31C), (31D), (31E), and (31F) are each independently bonded to one of $L_A$, $L_B$, and $L_C$.

In the organic EL device according to the exemplary embodiment, in the formula (31), a substituted or unsubstituted heterocyclic group having 5 to 30 ring atoms as A, B and C is preferably each independently at least one group selected from the group consisting of groups represented by the formulae (31A), (31E), and (31F).

In the organic EL device according to the exemplary embodiment, the third compound is preferably a compound having only one amino group.

For example, in the organic EL device according to the exemplary embodiment, it is preferable that the third compound is not a compound having two amino groups such as a compound NPD below.

[Formula 279]

NPD

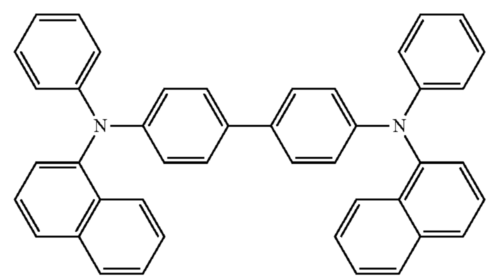

In the organic EL device according to the exemplary embodiment, the third compound is preferably a compound represented by a formula (310) below.

[Formula 280]

(310)

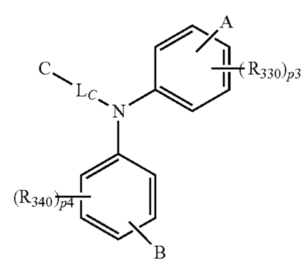

In the formula (310):

$L_C$, A, B and C represent the same as $L_C$, A, B and C defined in the formula (31) or (31X);

p3 is 4; and four $R_{330}$ are mutually the same or different;

at least one combination of adjacent two or more of four $R_{330}$ are mutually bonded to form a substituted or unsubstituted monocyclic ring, mutually bonded to form a substituted or unsubstituted fused ring, or not mutually bonded;

p4 is 4; and four $R_{340}$ are mutually the same or different;

at least one combination of adjacent two or more of four $R_{340}$ are mutually bonded to form a substituted or unsubstituted monocyclic ring, mutually bonded to form a substituted or unsubstituted fused ring, or not mutually bonded;

$R_{330}$ and $R_{340}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (31) or (31X), or $R_{901}$ to $R_{904}$ defined in the formula (32) below.

In the organic EL device according to the exemplary embodiment, it is preferable that two of A, B, and C in the formula (31), (31X), or (310) are groups each represented by a formula (31G) below, and the two groups each represented by the formula (31G) are mutually the same or different.

[Formula 281]

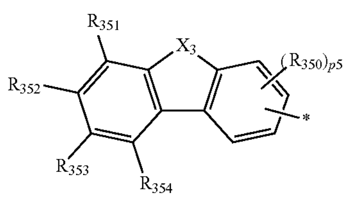

(31G)

In the formula (31G):

$X_3$ is $CR_{31}R_{32}$, $NR_{33}$, an oxygen atom, or a sulfur atom;

when $X_3$ is C $R_{31}R_{32}$, a combination of $R_{31}$ and $R_{32}$ are mutually bonded to form a substituted or unsubstituted monocyclic ring, mutually bonded to form a substituted or unsubstituted fused ring, or not mutually bonded;

at least one combination of adjacent two or more of $R_{350}$ to $R_{354}$ are mutually bonded to form a substituted or unsubstituted monocyclic ring, mutually bonded to form a substituted or unsubstituted fused ring, or not mutually bonded;

$R_{33}$, and $R_{350}$ to $R_{354}$, $R_{31}$ and $R_{32}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

p5 is 3; and three $R_{350}$ are mutually the same or different;

$R_{901}$ to $R_{904}$ represent the same as $R_{901}$ to $R_{904}$ defined in the formula (31) or (31X), or $R_{901}$ to $R_{904}$ defined in the formula (32) below; and

* in the formula (31G) is bonded to $L_A$, $L_B$ or $L_C$; bonded to a benzene ring bonded to A in the formula (310), or bonded to a benzene ring bonded to B in the formula (310).

In the organic EL device according to the exemplary embodiment, the third compound is preferably a compound represented by a formula (311) or (312) below.

[Formula 282]

(311)

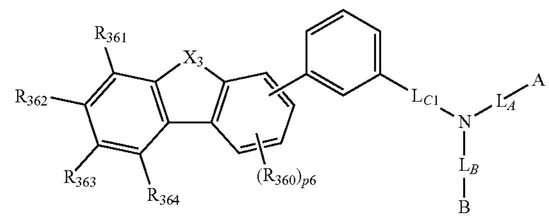

[Formula 300]

(312)

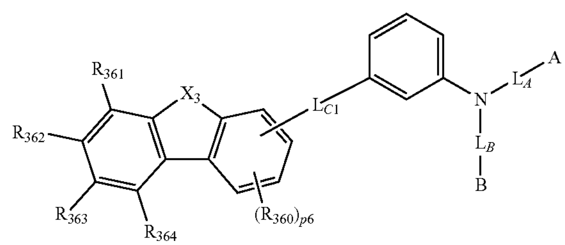

In the formulae (311) and (312):

$L_A$, $L_B$, A, and B represent the same as $L_A$, $L_B$, A and B defined in the formula (31) or (31X);

$L_{C1}$ is a substituted or unsubstituted arylene group having 6 to 12 ring carbon atoms;

$X_3$ is C $R_{31}R_{32}$, $NR_{33}$, an oxygen atom, or a sulfur atom;

when $X_3$ is C $R_{31}R_{32}$, a combination of $R_{31}$ and $R_{32}$ are mutually bonded to form a substituted or unsubstituted monocyclic ring, mutually bonded to form a substituted or unsubstituted fused ring, or not mutually bonded;

at least one combination of adjacent two or more of $R_{360}$ to $R_{364}$ are mutually bonded to form a substituted or unsubstituted monocyclic ring, mutually bonded to form a substituted or unsubstituted fused ring, or not mutually bonded;

$R_{33}$, and $R_{360}$ to $R_{364}$, $R_{31}$ and $R_{32}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

p6 is 3; and three $R_{360}$ are mutually the same or different; and $R_{901}$ to $R_{904}$ represent the same as $R_{901}$ to $R_{904}$ defined in the formula (31) or (31X), or $R_{901}$ to $R_{904}$ defined in the formula (32) below.

In the organic EL device according to the exemplary embodiment, the third compound is preferably a compound represented by a formula (313) or (314) below.

[Formula 284]

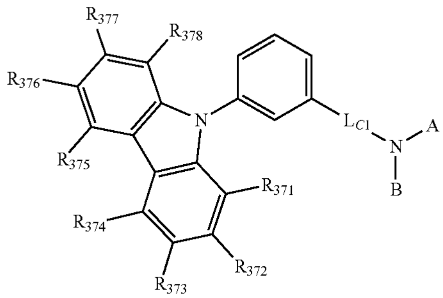

(313)

[Formula 285]

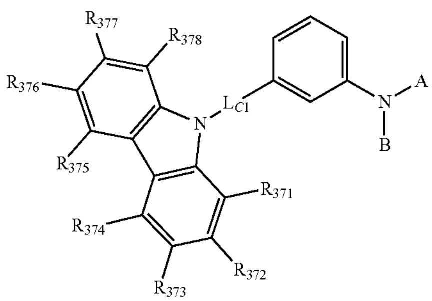

(314)

In the formulae (313) and (314):

A and B are each independently a substituted or unsubstituted aryl group having 6 to 30 ring carbon atoms, a substituted or unsubstituted heterocyclic group having 5 to 30 ring atoms, or a group represented by —Si(R'$_{901}$)(R'$_{902}$)(R'$_{903}$);

R'$_{901}$ to R'$_{903}$ are each independently a substituted or unsubstituted aryl group having 6 to 30 ring carbon atoms;

when a plurality of R'$_{901}$ are present, the plurality of R'$_{901}$ are mutually the same or different;

when a plurality of R'$_{902}$ are present, the plurality of R'$_{902}$ are mutually the same or different; and when a plurality of R'$_{903}$ are present, the plurality of R'$_{903}$ are mutually the same or different;

$L_{C1}$ is a substituted or unsubstituted arylene group having 6 to 12 ring carbon atoms;

at least one combination of adjacent two or more of $R_{371}$ to $R_{378}$ are mutually bonded to form a substituted or unsubstituted monocyclic ring, mutually bonded to form a substituted or unsubstituted fused ring, or not mutually bonded;

$R_{371}$ to $R_{378}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (31) or (31X), or $R_{901}$ to $R_{904}$ defined in the formula below (32).

In the organic EL device of the exemplary embodiment, $L_{C1}$ is preferably a single bond.

In the organic EL device according to the exemplary embodiment, the third compound is preferably a compound represented by a formula (315) or (316) below.

[Formula 286]

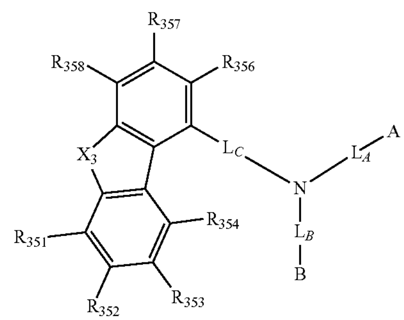

(315)

[Formula 287]

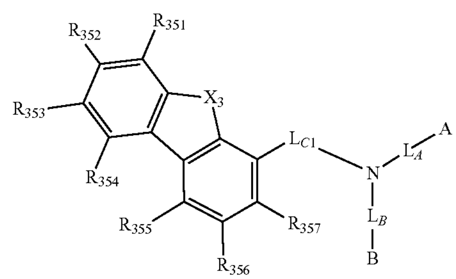

(316)

In the formulae (315) and (316):

$L_A$, $L_B$, $L_C$, A and B represent the same as $L_A$, $L_B$, $L_C$, A and B defined in the formula (31) or (31X), $X_3$ is $CR_{31}R_{32}$, $NR_{33}$, an oxygen atom, or a sulfur atom;

when $X_3$ is $CR_{31}R_{32}$, a combination of $R_{31}$ and $R_{32}$ are mutually bonded to form a substituted or unsubstituted monocyclic ring, mutually bonded to form a substituted or unsubstituted fused ring, or not mutually bonded;

at least one combination of adjacent two or more of $R_{351}$ to $R_{358}$ are mutually bonded to form a substituted or unsubstituted monocyclic ring, mutually bonded to form a substituted or unsubstituted fused ring, or not mutually bonded;

$R_{33}$, and $R_{351}$ to $R_{358}$, $R_{31}$ and $R_{32}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)

($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (31) or (31X).

In the organic EL device according to the exemplary embodiment, the third compound is preferably a compound represented by a formula (317) below.

[Formula 288]

(317)

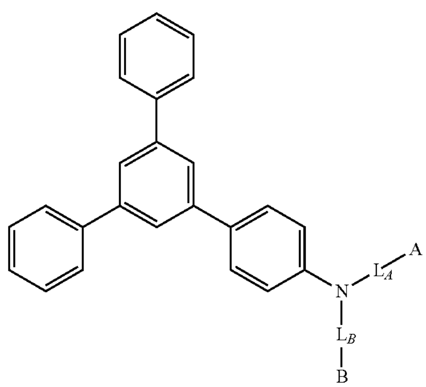

In the formula (317), $L_A$, $L_B$, A, and B represent the same as $L_A$, $L_B$, A and B defined in the formula (31) or (31X).

In the organic EL device according to the exemplary embodiment, the third compound is preferably a compound represented by a formula (318) below.

[Formula 289]

(318)

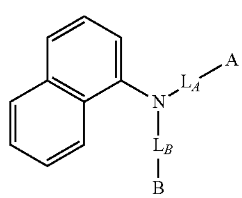

In the formula (318), $L_A$, $L_B$, A, and B represent the same as $L_A$, $L_B$, A and B defined in the formula (31) or (31X).

In the organic EL device according to the exemplary embodiment, it is also preferable that $L_A$, $L_B$, and $L_C$ are each independently a single bond, or a substituted or unsubstituted arylene group having 6 to 12 ring carbon atoms.

In the organic EL device according to the exemplary embodiment, $L_C$ is also preferably a single bond.

In the organic EL device according to the exemplary embodiment, $L_C$ is also preferably a substituted or unsubstituted phenylene group.

In the organic EL device according to the exemplary embodiment, $L_A$, $L_B$, and $L_C$ are also preferably each independently an aromatic hydrocarbon ring group represented by a formula ($L_1$) or a formula ($L_2$) below.

[Formula 290]

(L1)

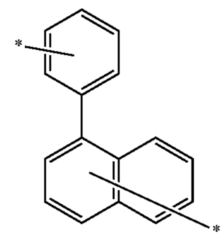

(L2)

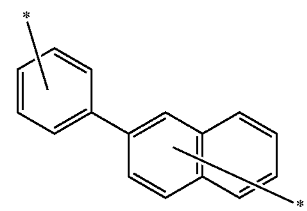

In the formulae ($L_1$) and ($L_2$):

one of two * is bonded to a nitrogen atom shown in the formula (31) or (31X); and the other of two * is bonded to one of A, B, and C.

In the organic EL device according to the exemplary embodiment, A is preferably a substituted or unsubstituted aryl group having 6 to 12 ring carbon atoms.

In the organic EL device according to the exemplary embodiment, A is preferably a substituted or unsubstituted phenyl group, a substituted or unsubstituted biphenyl group, or a substituted or unsubstituted naphthyl group.

In the organic EL device according to the exemplary embodiment, A is preferably a phenyl group, a biphenyl group, or a naphthyl group.

In the organic EL device according to the exemplary embodiment, B is preferably a substituted or unsubstituted aryl group having 6 to 12 ring carbon atoms.

In the organic EL device according to the exemplary embodiment, B is preferably a substituted or unsubstituted phenyl group, a substituted or unsubstituted biphenyl group, or a substituted or unsubstituted naphthyl group.

In the organic EL device according to the exemplary embodiment, B is preferably a phenyl group, a biphenyl group, or a naphthyl group.

In the organic EL device according to the exemplary embodiment, A or B is preferably a substituted or unsubstituted phenyl group, a substituted or unsubstituted biphenyl group, or a substituted or unsubstituted naphthyl group.

In the organic EL device according to the exemplary embodiment, it is preferable that A and B are each independently a substituted or unsubstituted phenyl group, a substituted or unsubstituted biphenyl group, or a substituted or unsubstituted naphthyl group.

Third Compound Represented by Formula (32)

The third compound represented by the formula (32) will be described.

[Formula 291]

(32)

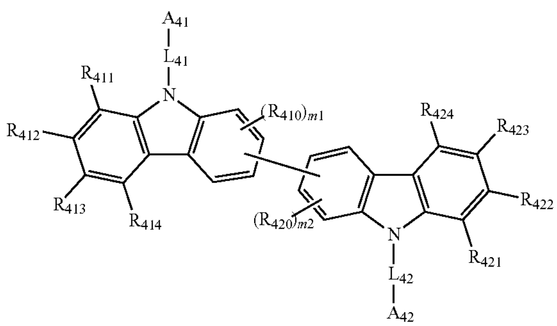

In the formula (32):

$A_{41}$ and $A_{42}$ are each independently a substituted or unsubstituted aryl group having 6 to 30 ring carbon atoms, or a substituted or unsubstituted heterocyclic group having 5 to 30 ring atoms;

at least one combination of adjacent two or more of $R_{410}$ to $R_{414}$ are mutually bonded to form a substituted or unsubstituted monocyclic ring, mutually bonded to form a substituted or unsubstituted fused ring, or not mutually bonded;

at least one combination of adjacent two or more of $R_{420}$ to $R_{424}$ are mutually bonded to form a substituted or unsubstituted monocyclic ring, mutually bonded to form a substituted or unsubstituted fused ring, or not mutually bonded;

$R_{410}$ to $R_{414}$ and $R_{420}$ to $R_{424}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

m1 is 3; and three $R_{410}$ are mutually the same or different;

m2 is 3; and three $R_{420}$ are mutually the same or different; and $L_{41}$ and $L_{42}$ are each independently a single bond, a substituted or unsubstituted arylene group having 6 to 30 ring carbon atoms, or a substituted or unsubstituted divalent heterocyclic group having 5 to 30 ring atoms.

In the organic EL device according to the exemplary embodiment, the third compound is preferably a compound represented by a formula (321), (322), or (323) below.

[Formula 292]

(321)

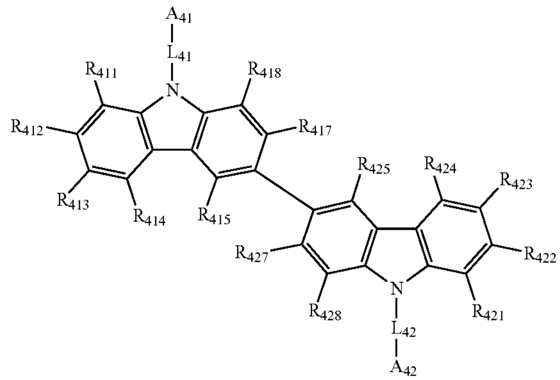

[Formula 293]

(322)

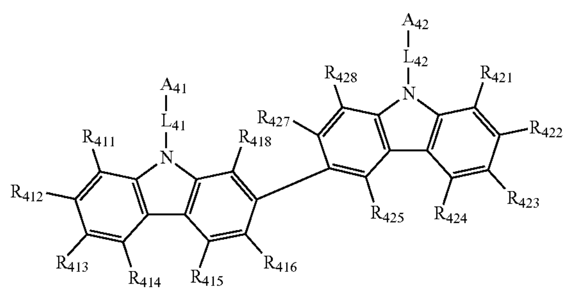

[Formula 294]

(323)

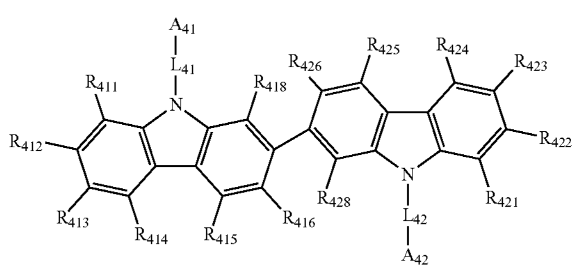

In the formulae (321), (322), and (323):

$A_{41}$, $A_{42}$, $L_{41}$ and $L_{42}$ represent the same as $A_{41}$, $A_{42}$, $L_{41}$ and $L_{42}$ defined in the formula (32);

at least one combination of adjacent two or more of $R_{411}$ to $R_{418}$ are mutually bonded to form a substituted or unsubstituted monocyclic ring, mutually bonded to form a substituted or unsubstituted fused ring, or not mutually bonded;

at least one combination of adjacent two or more of $R_{421}$ to $R_{428}$ are mutually bonded to form a substituted or unsubstituted monocyclic ring, mutually bonded to form a substituted or unsubstituted fused ring, or not mutually bonded;

$R_{411}$ to $R_{418}$ and $R_{421}$ to $R_{428}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (32).

In the organic EL device according to the exemplary embodiment, in the formula (32), (321), (322), or (323), one of $A_{41}$ and $A_{42}$ is preferably a substituted or unsubstituted aryl group having 6 to 30 ring carbon atoms; and the other of $A_{41}$ and $A_{42}$ is preferably a substituted or unsubstituted phenyl group, a substituted or unsubstituted biphenyl group, a substituted or unsubstituted terphenyl group, a substituted or unsubstituted naphthyl group, a naphthylphenyl group, a triphenylenyl group, or a 9,9-biphenylfluorenyl group.

In the organic EL device according to the exemplary embodiment, in the formula (32), (321), (322), or (323):

one of $A_{41}$ and $A_{42}$ is preferably a substituted or unsubstituted aryl group having 6 to 30 ring carbon atoms; and the other of $A_{41}$ and $A_{42}$ is preferably a substituted or unsubstituted phenyl group, a substituted or unsubstituted p-biphenyl group, a substituted or unsubstituted m-biphenyl group, a substituted or unsubstituted o-biphenyl group, a substituted or unsubstitued 3-naphthylphenyl group, a triphenylenyl group, or a 9,9-biphenylfluorenyl group.

In the third compound represented by the formula (31X), (31), or (32), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the third compound, it is preferable that all groups described as "substituted or unsubstituted" groups are "unsubstituted" groups.

Manufacturing Method of Third Compound

The third compound can be manufactured by a known method. Moreover, the third compound can also be manufactured based on a known method through a known alternative reaction using a known material(s) tailored for the target compound.

Specific Examples of Third Compound

Specific examples of the third compound include the following compounds. It should however be noted that the invention is not limited by the specific examples of the third compound.

[Formula 295]

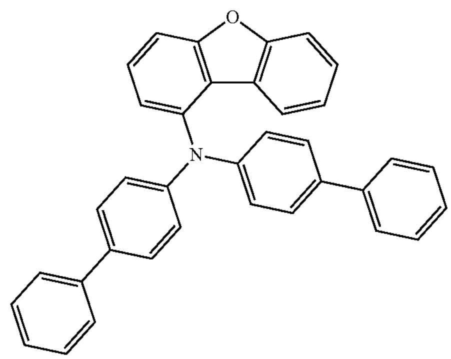

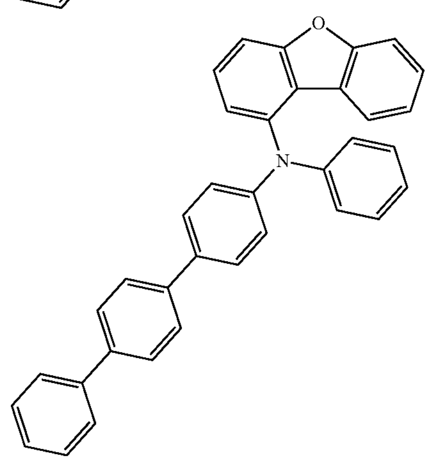

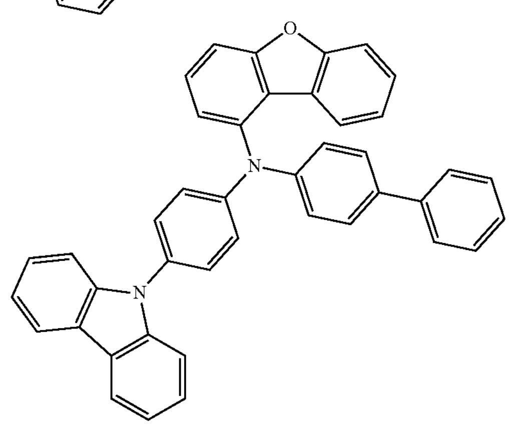

-continued
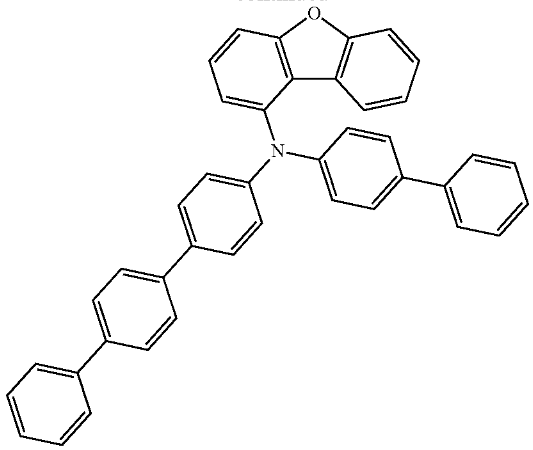
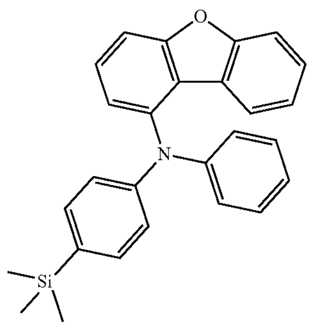
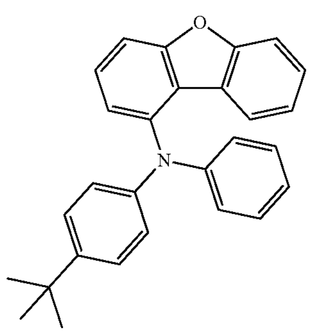
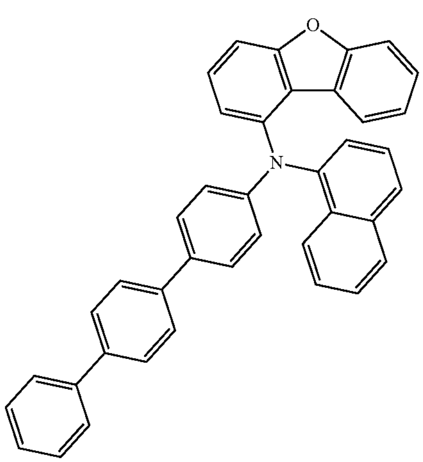
[Formula 296]
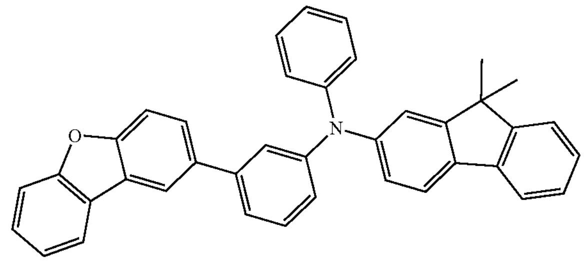
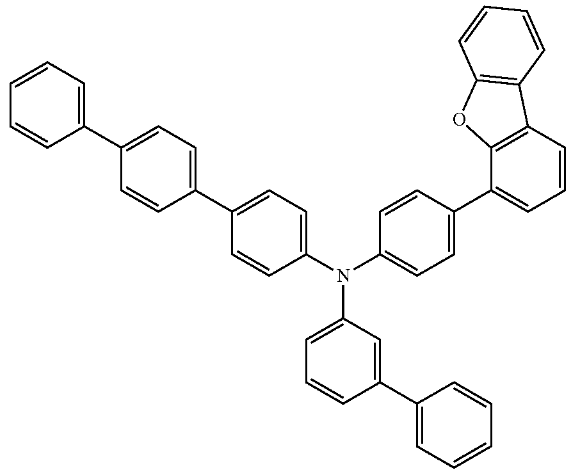
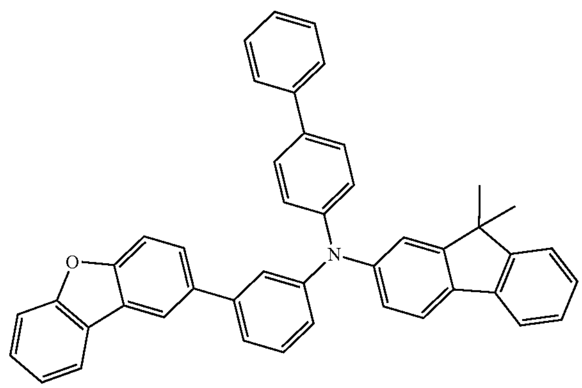
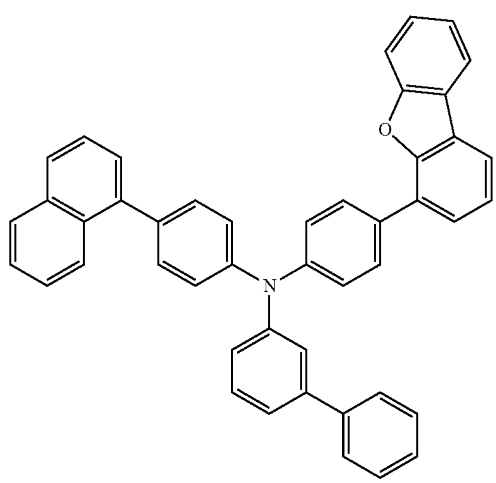

-continued
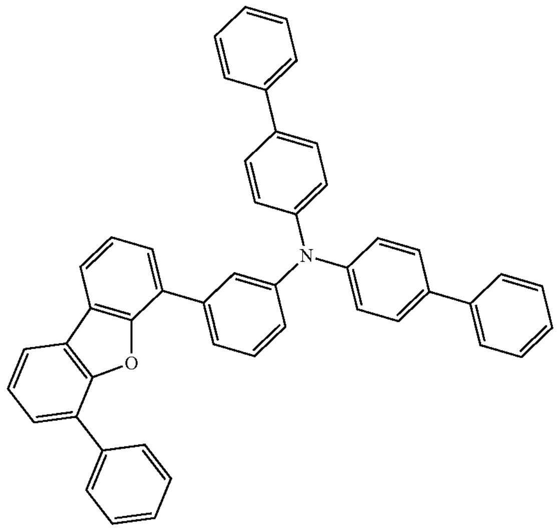
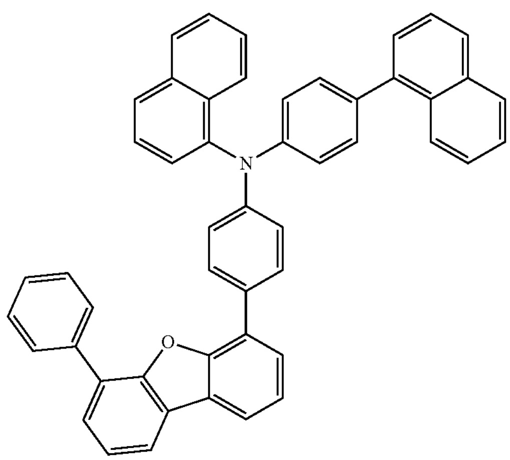
[Formula 297]
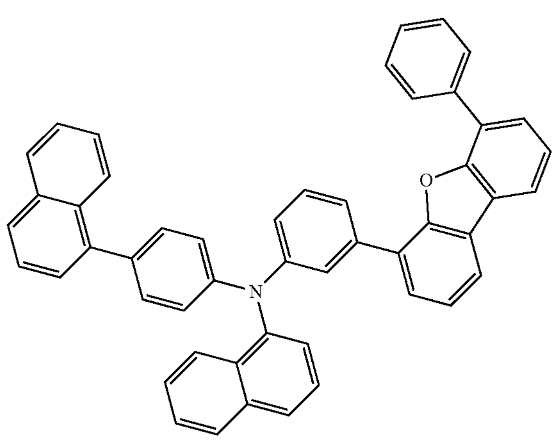
-continued
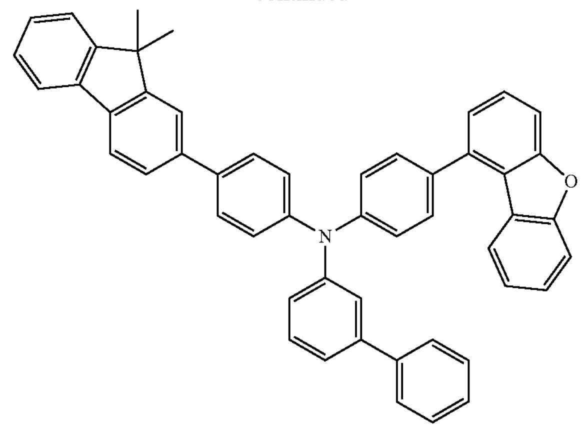
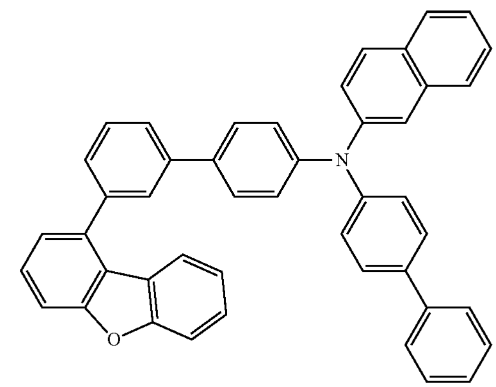
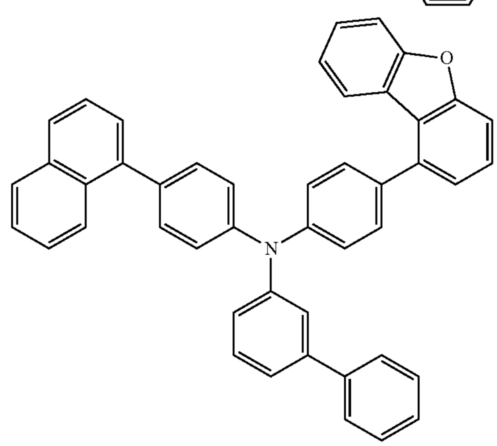
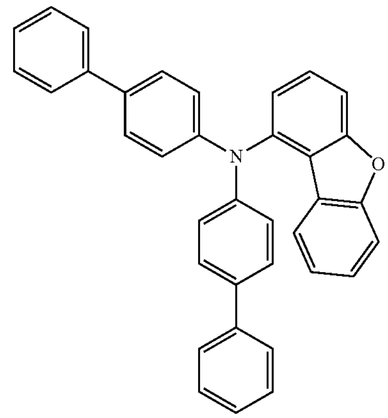

-continued
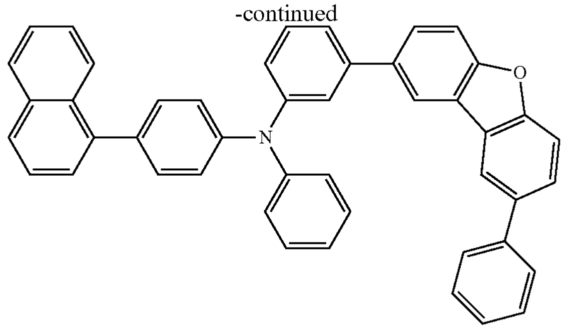
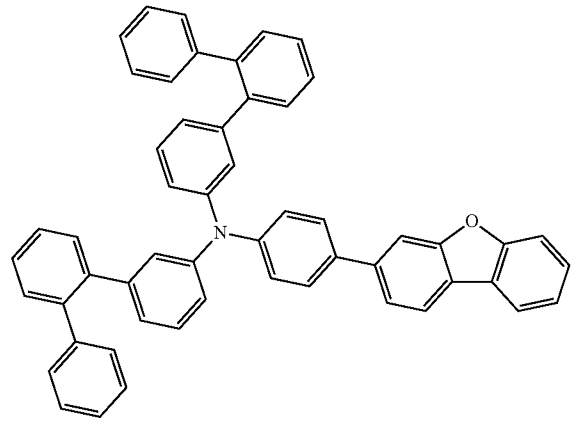
[Formula 298]
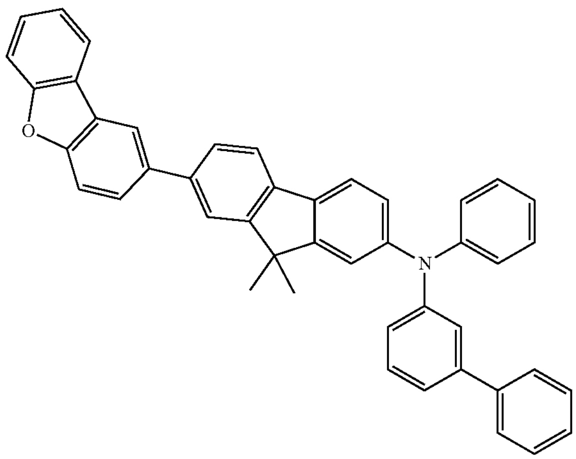
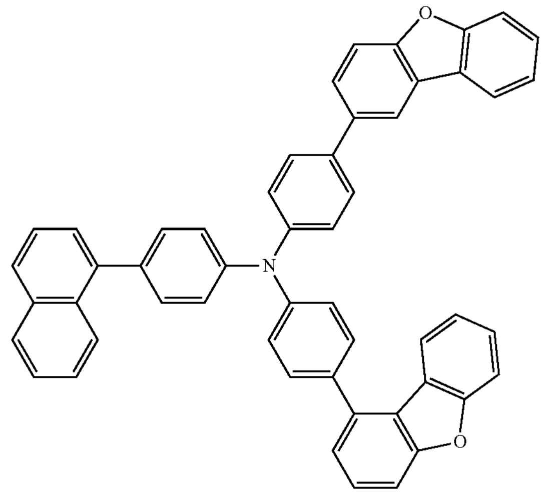
[Formula 299]
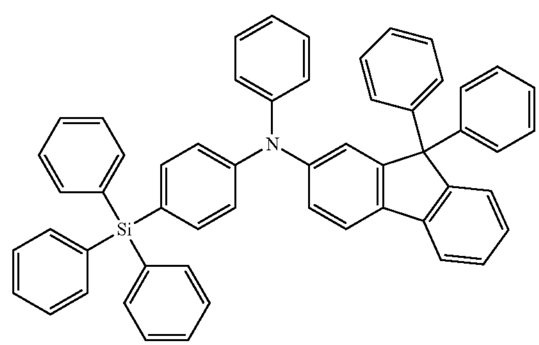
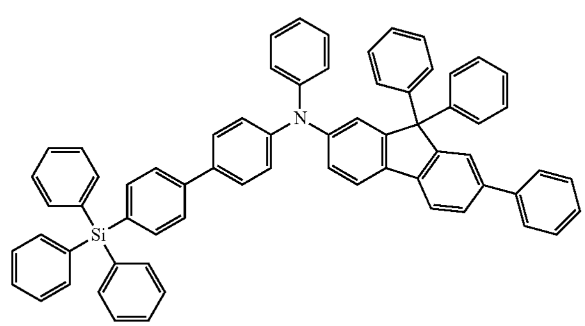

-continued
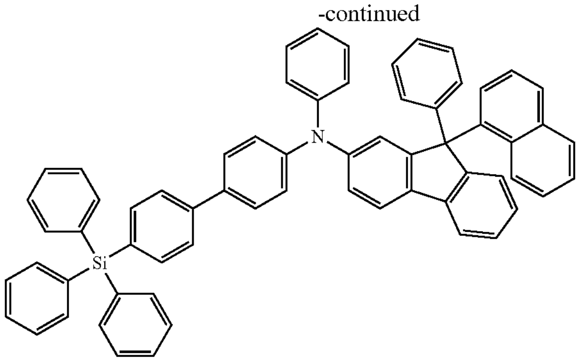
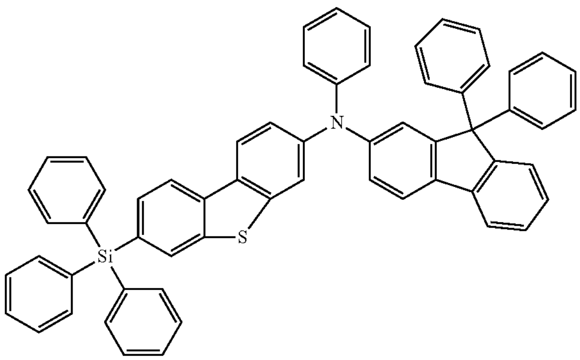
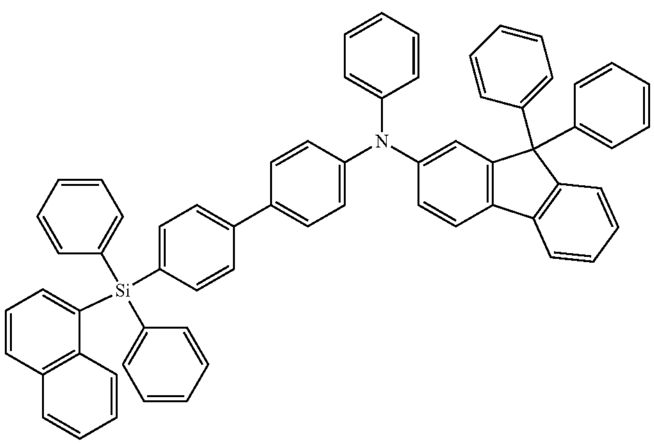
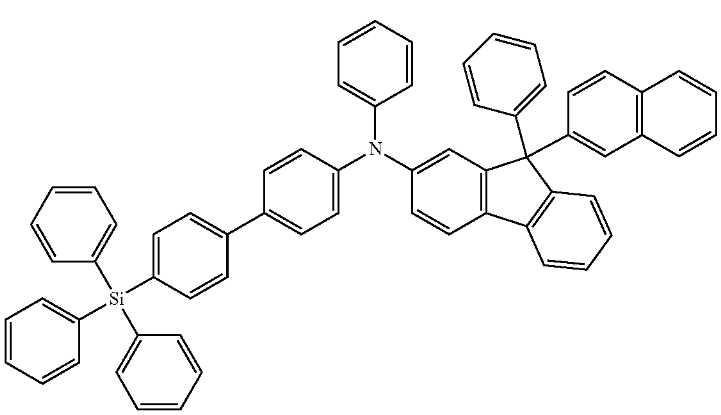

-continued
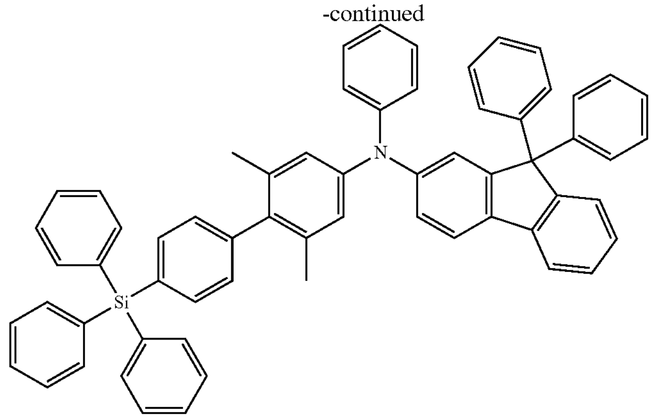
[Formula 300]
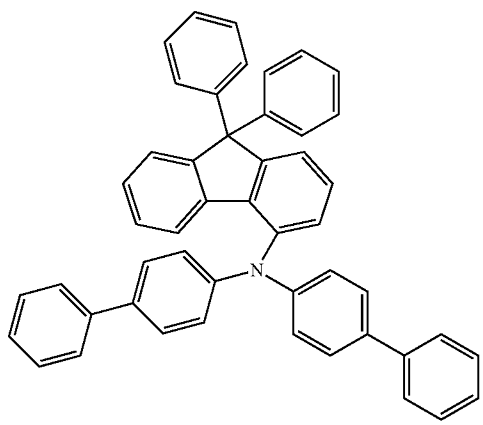
-continued
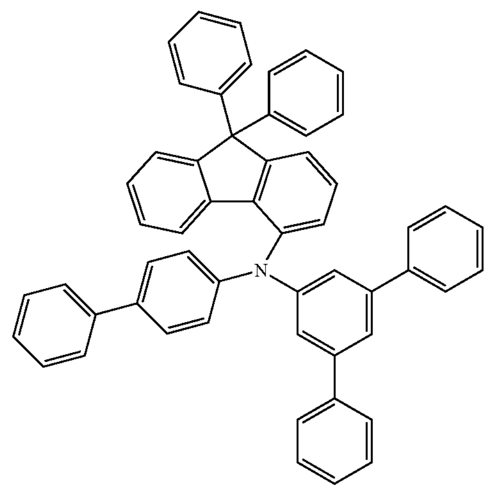
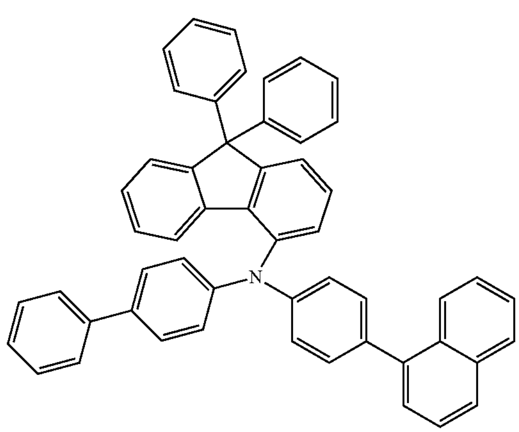
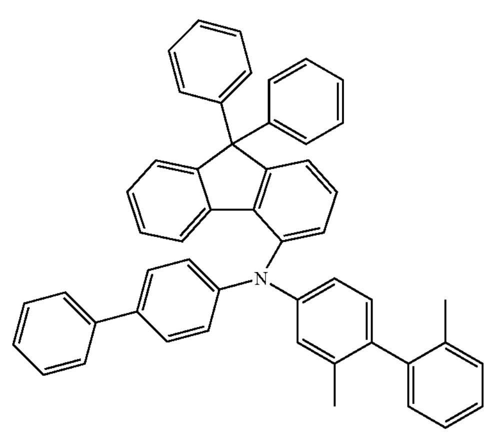

-continued
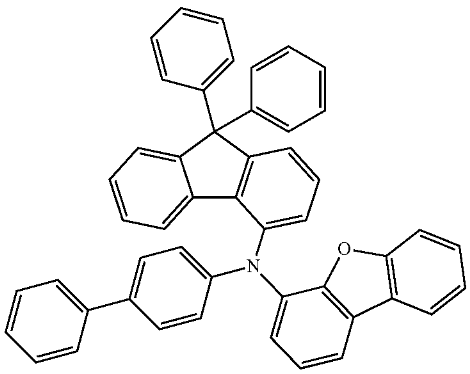
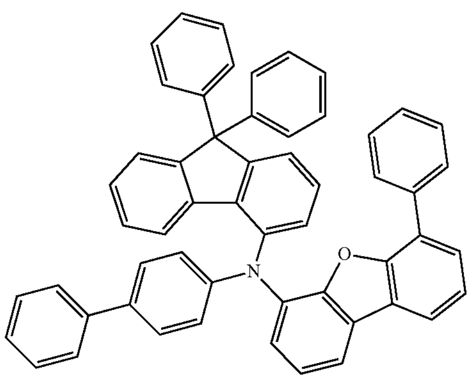
[Formula 301]
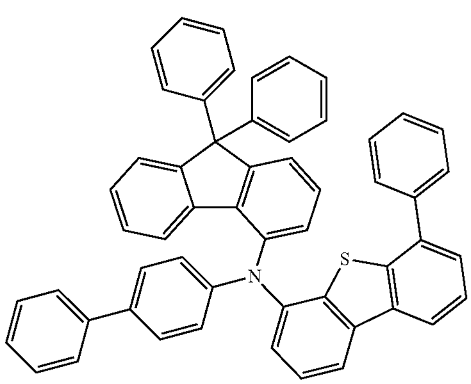
-continued
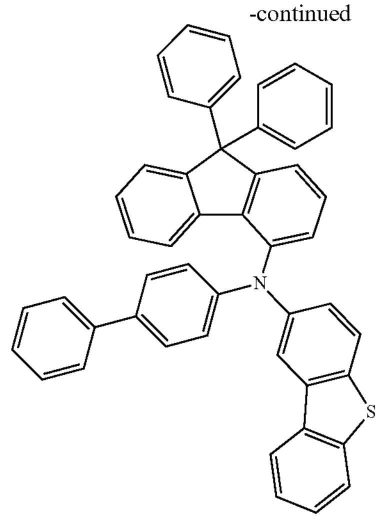
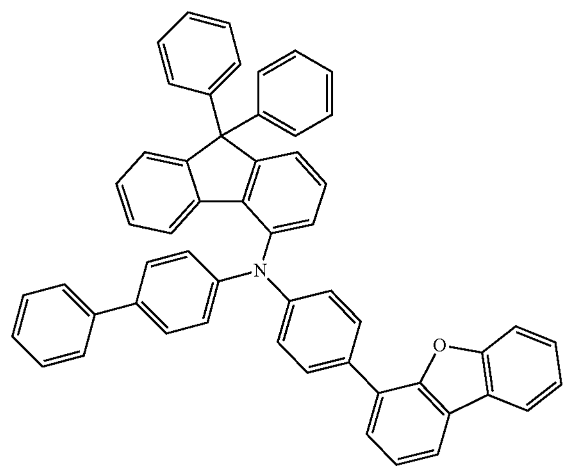
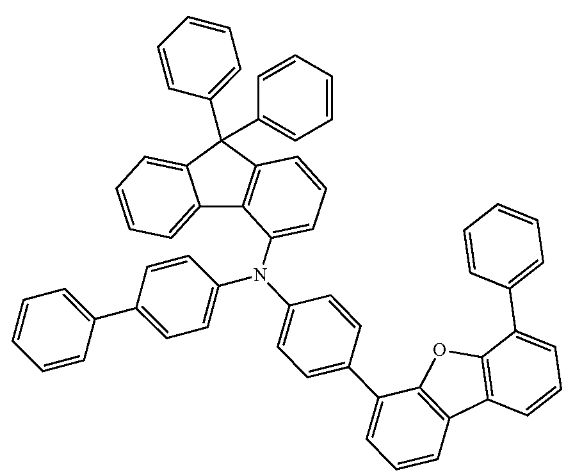

-continued
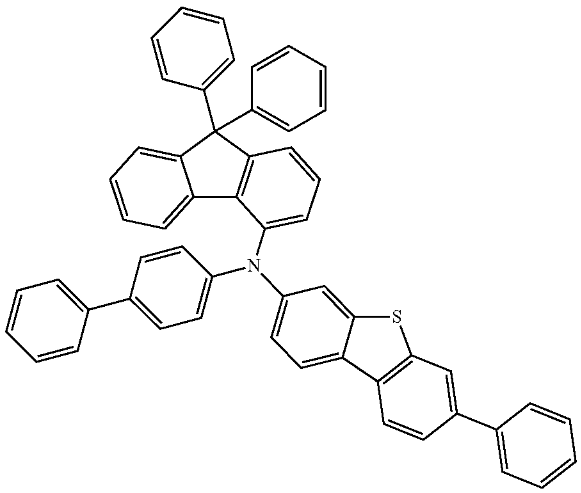
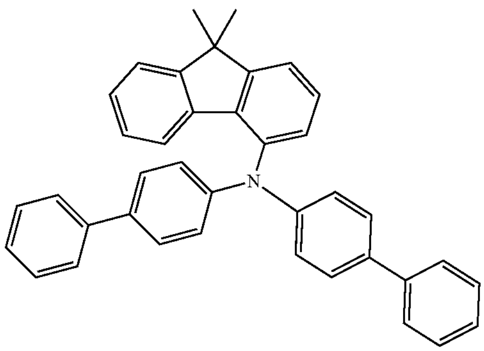
[Formula 302]
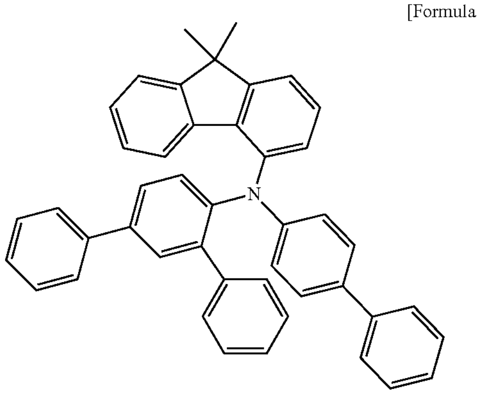
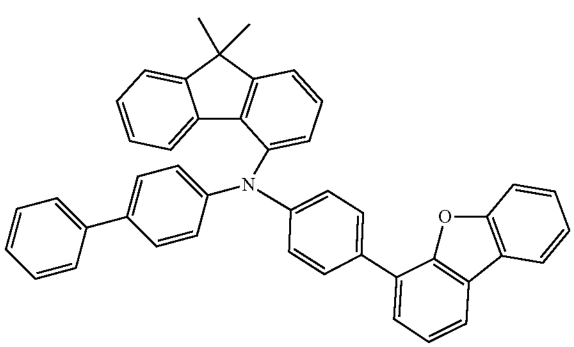
-continued
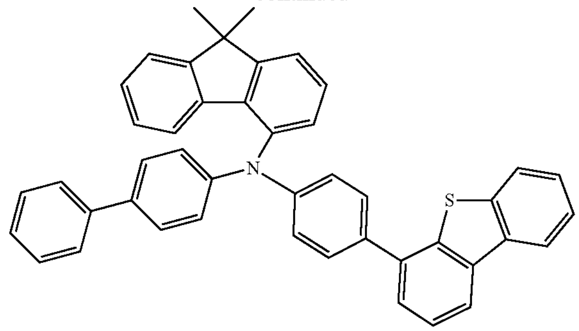
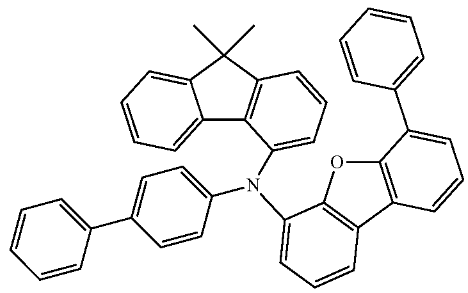
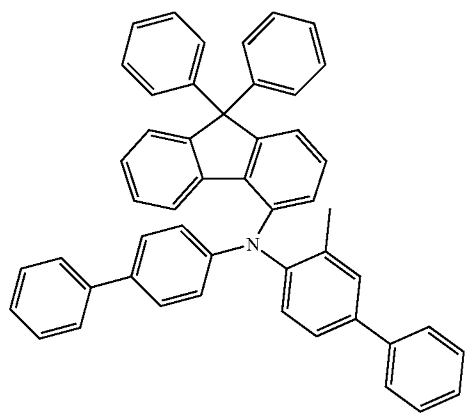
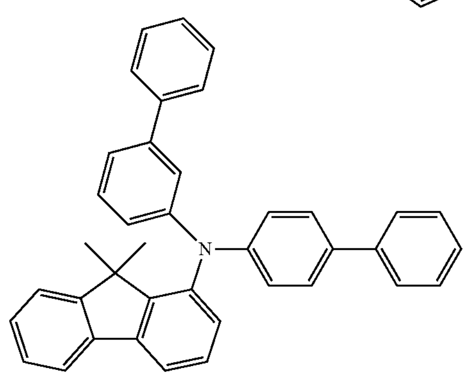
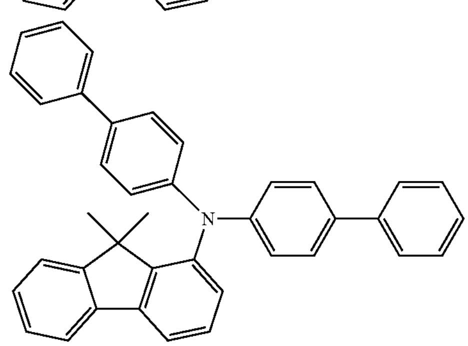

-continued
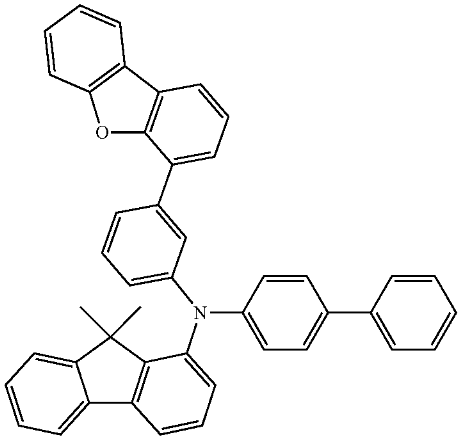
[Formula 303]
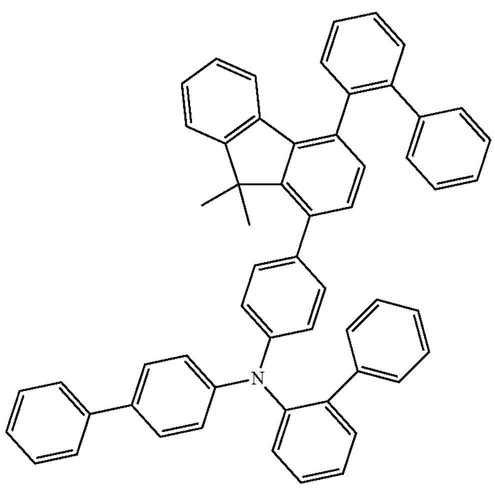
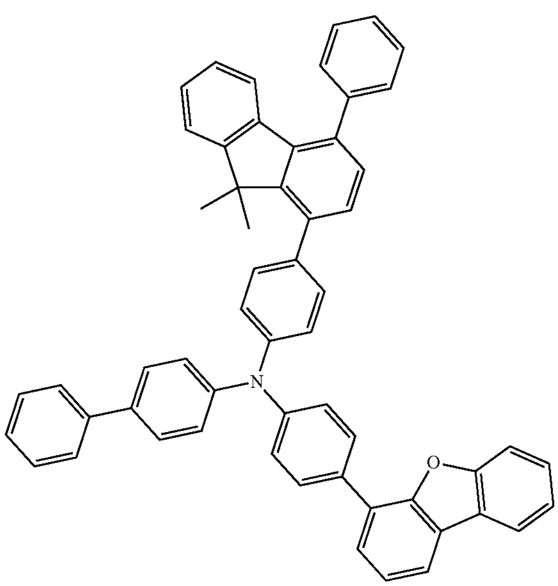
-continued
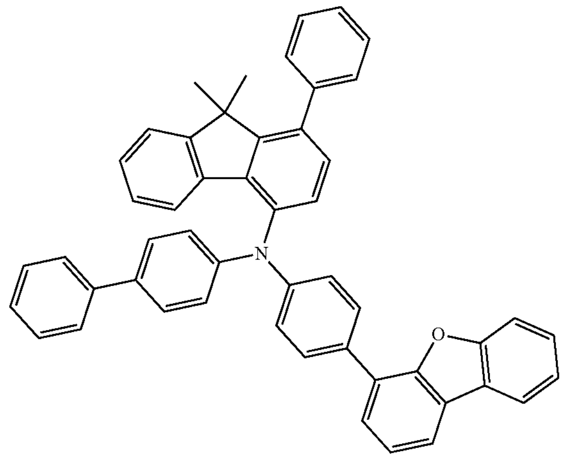
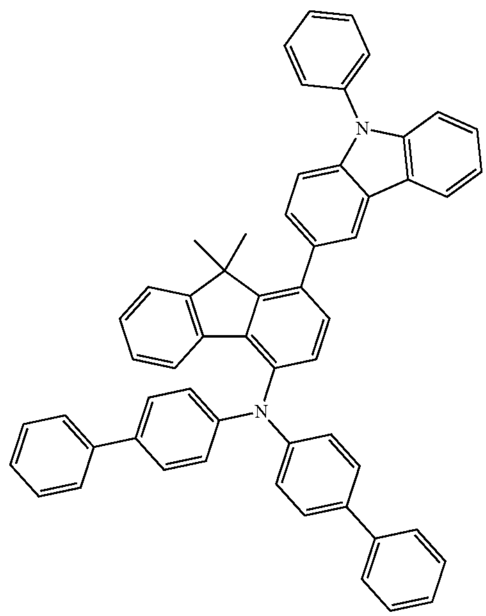
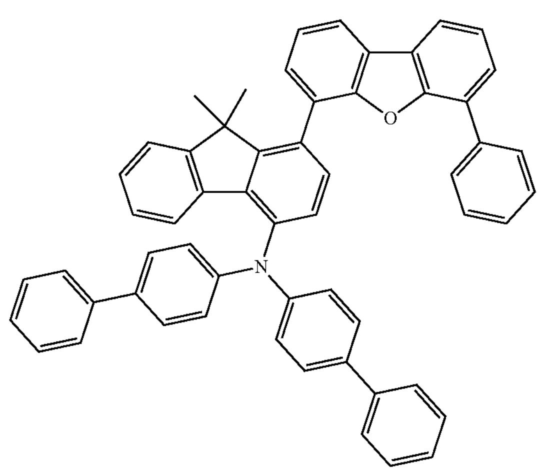

-continued
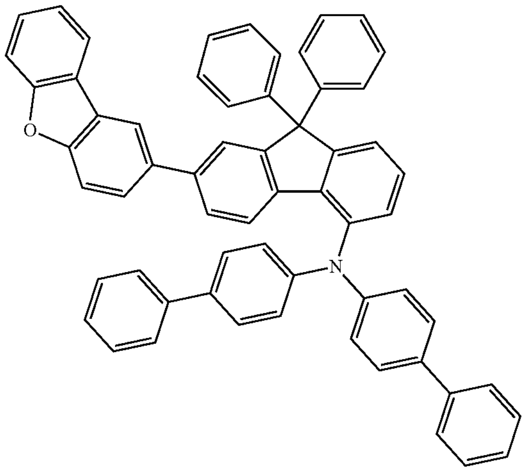
[Formula 304]
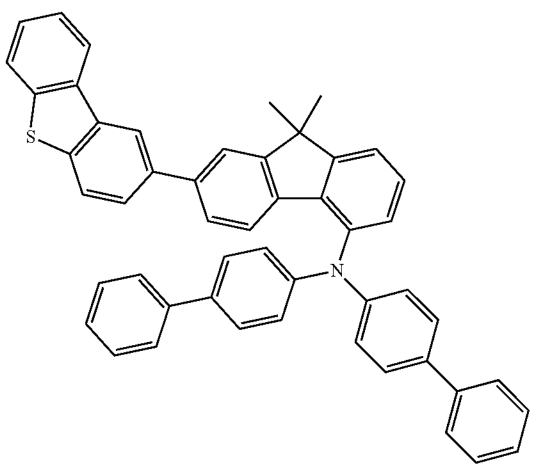
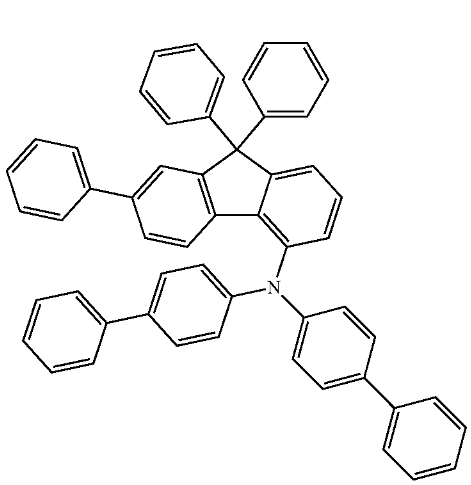
[Formula 305]
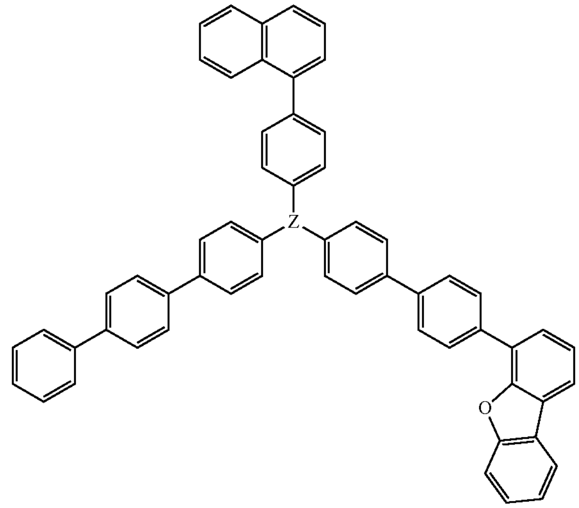
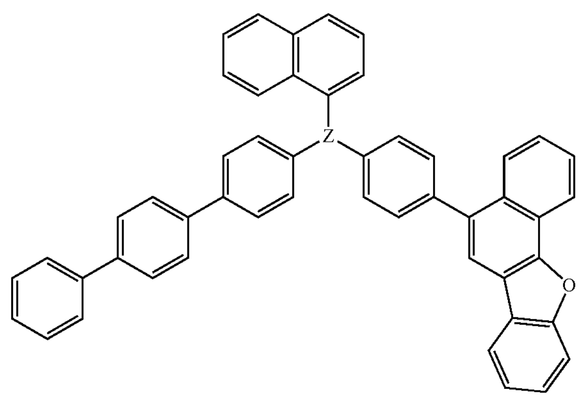
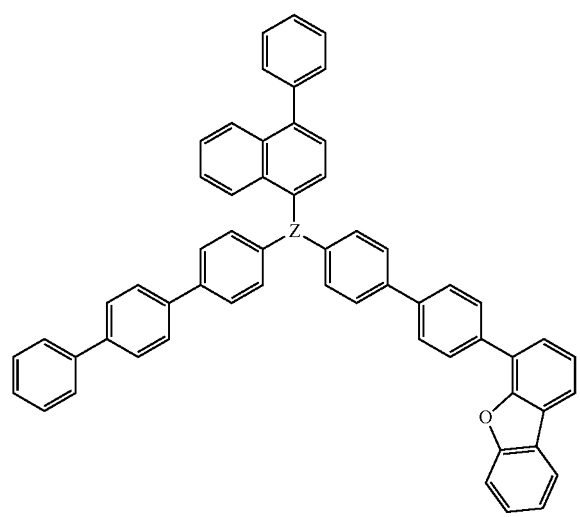

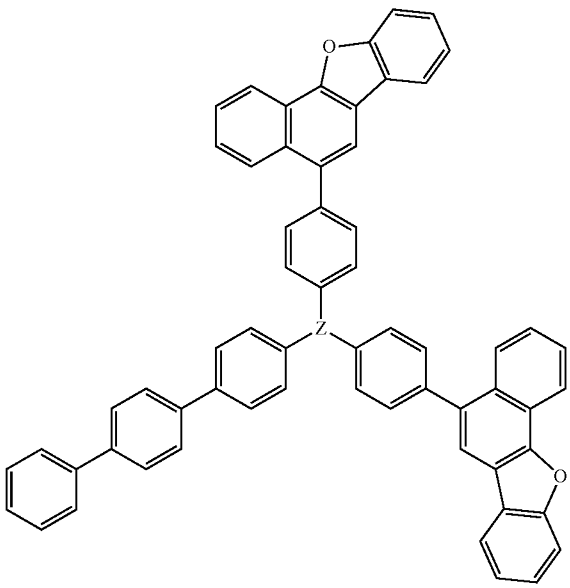
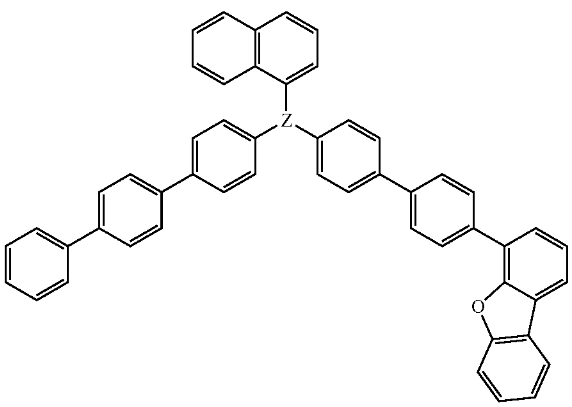
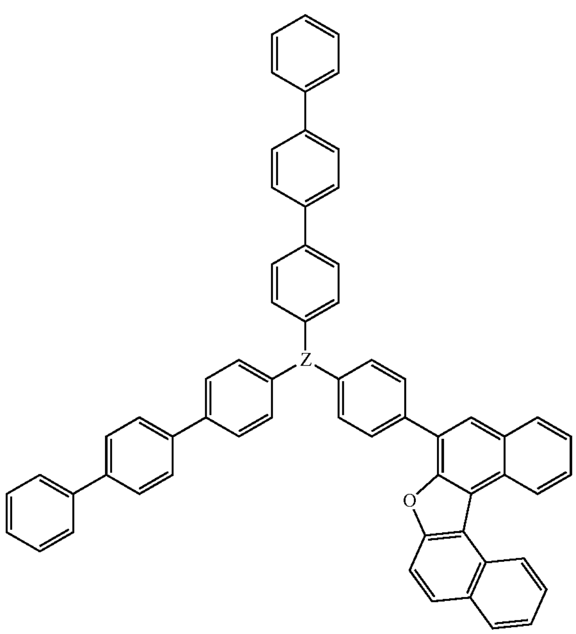
[Formula 306]
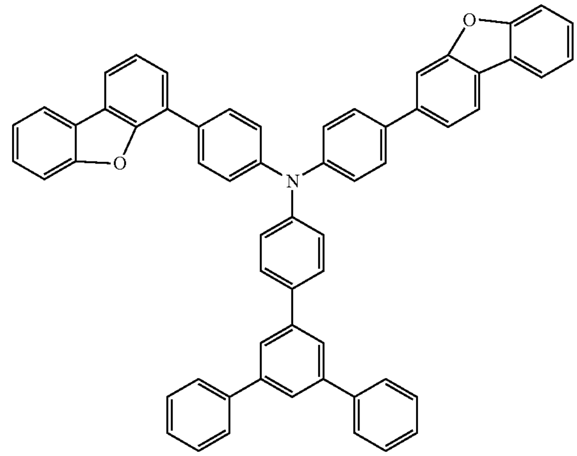
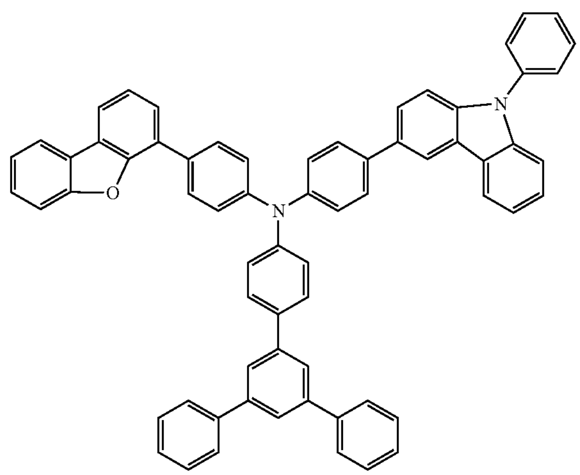
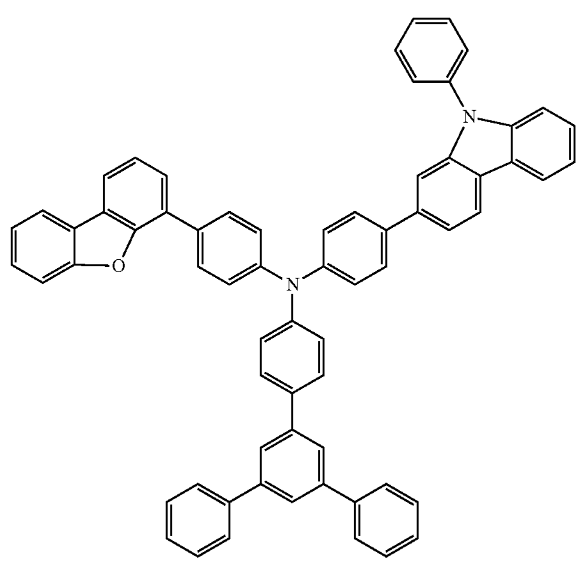

-continued
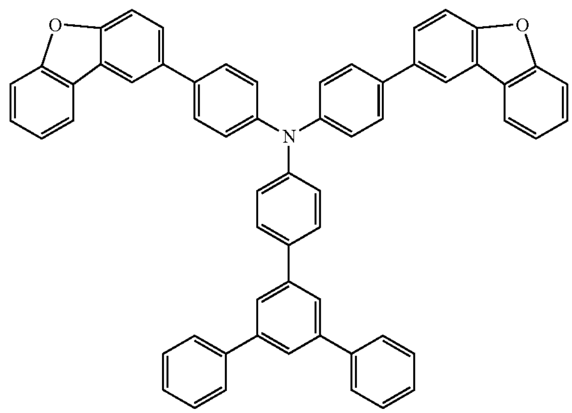
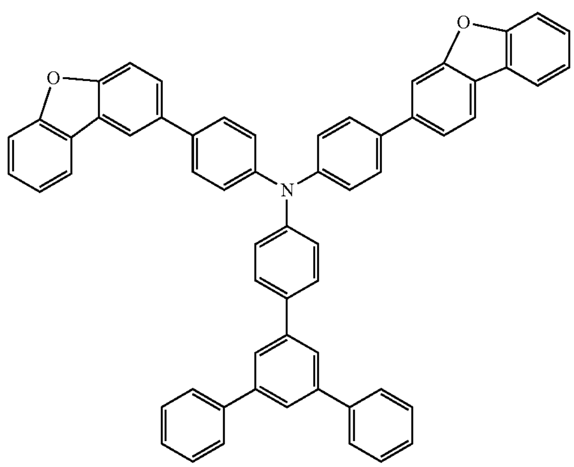
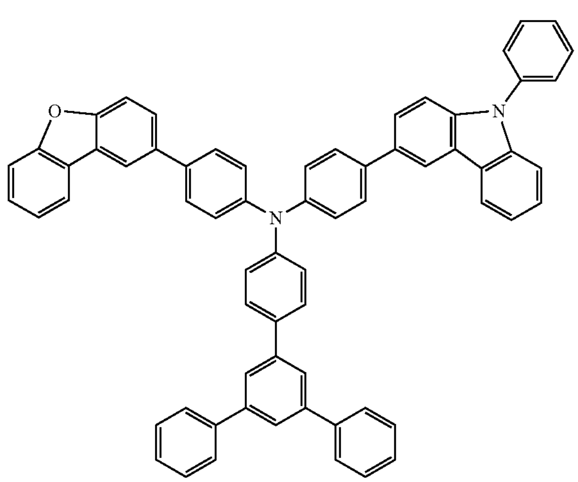
-continued
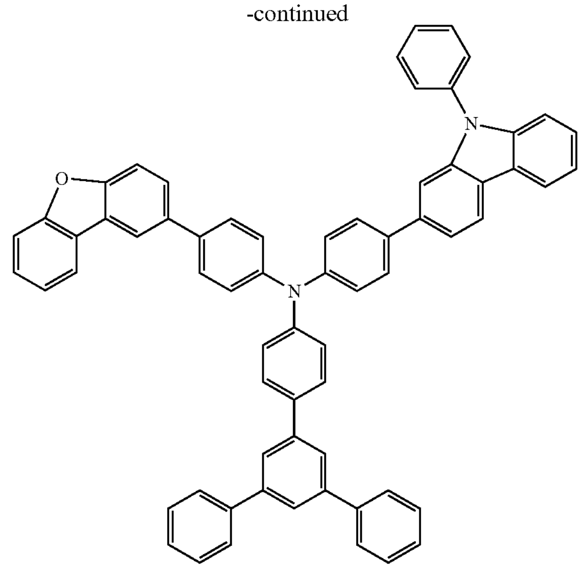
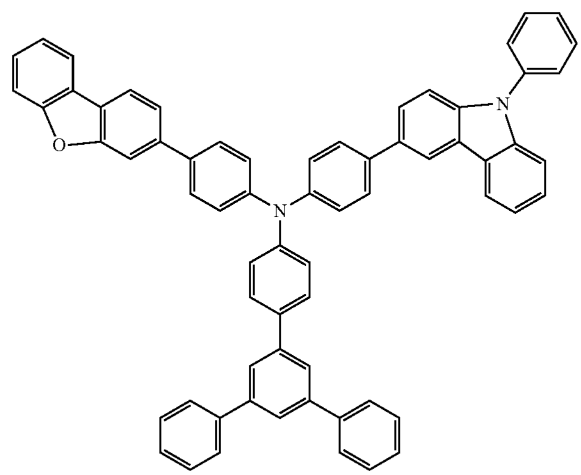
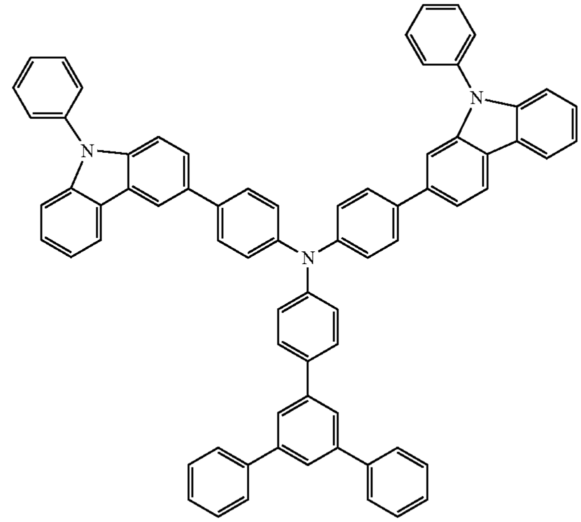

-continued
-continued
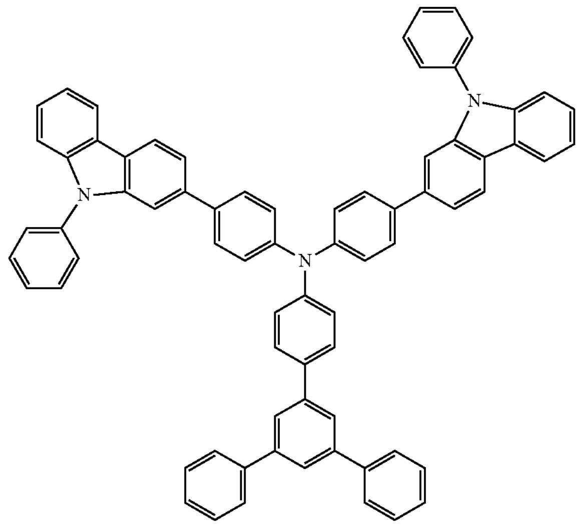
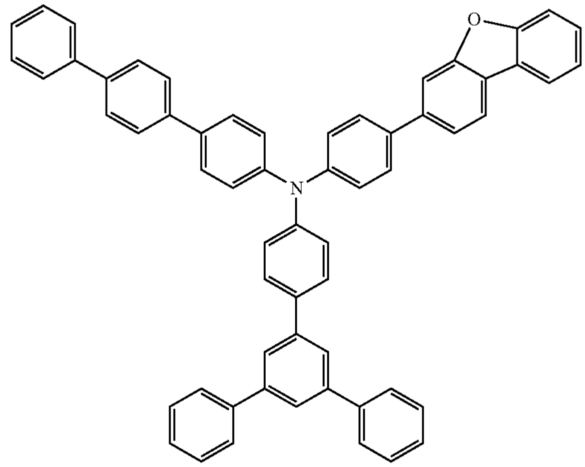
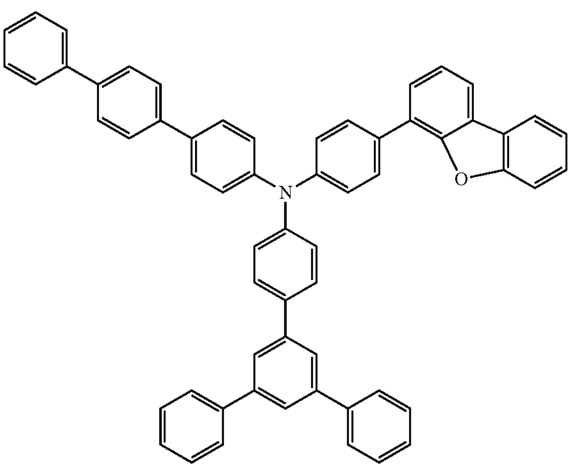
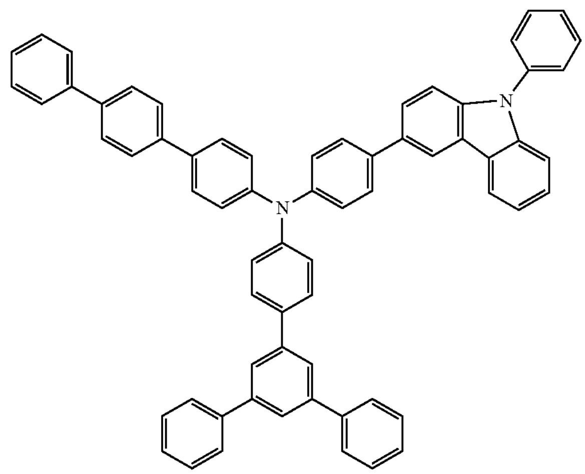
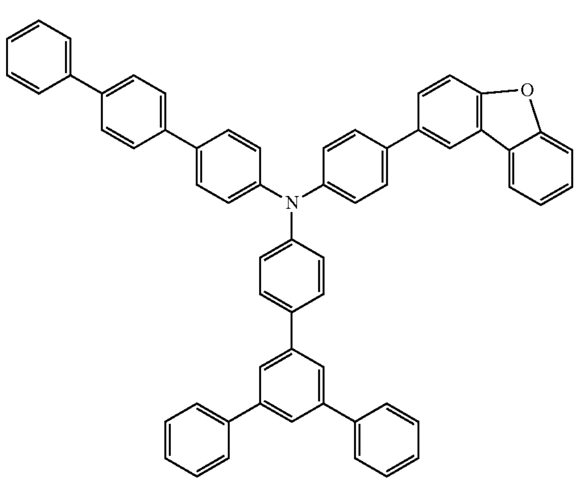
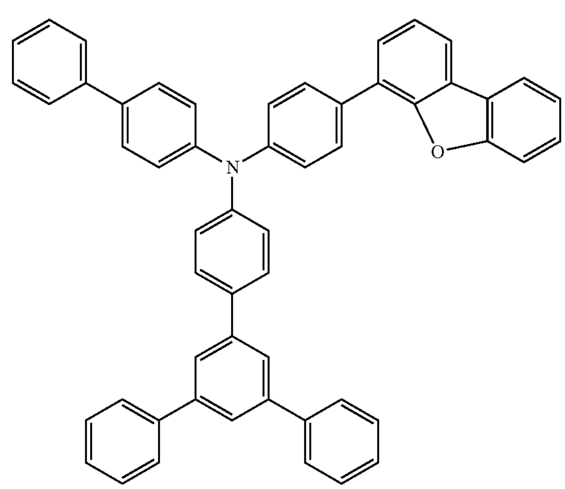

-continued
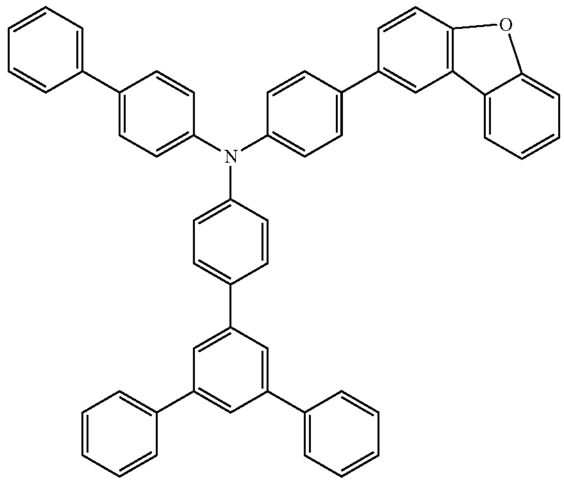
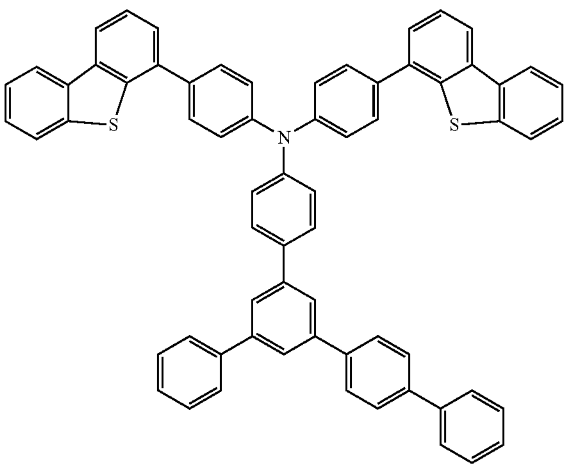
[Formula 307]
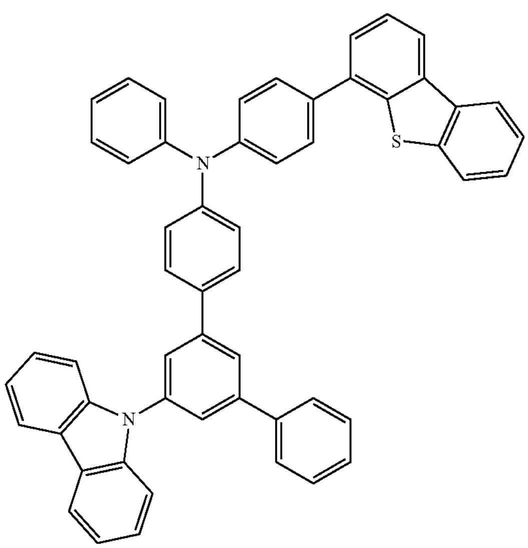
[Formula 308]
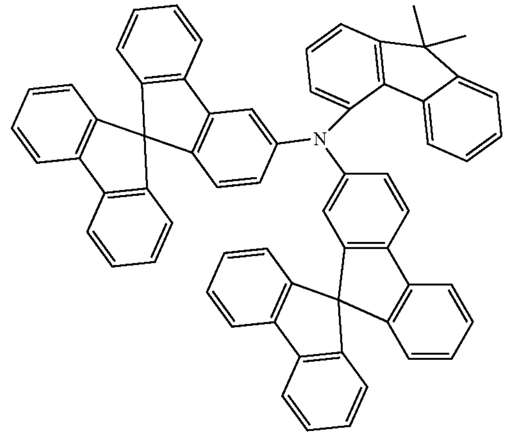
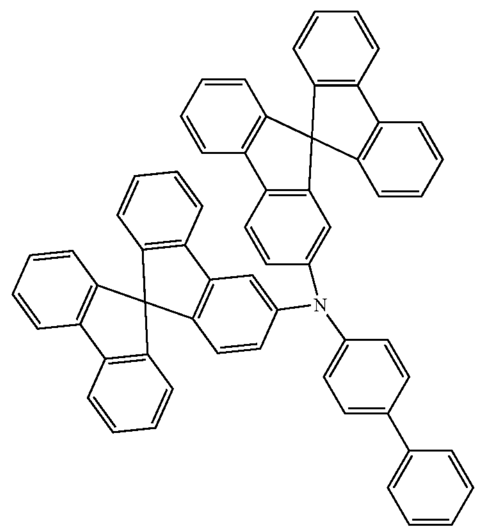
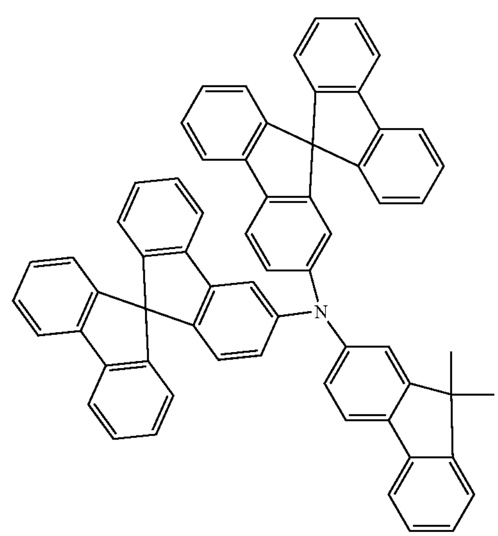

-continued
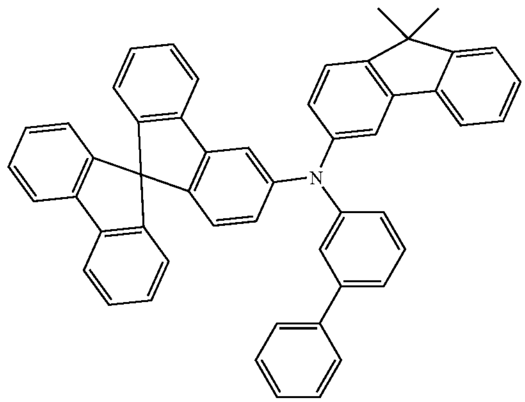
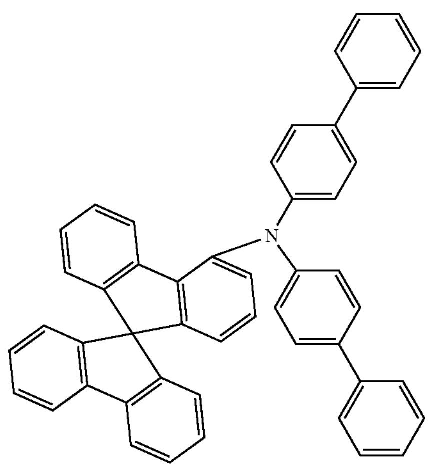
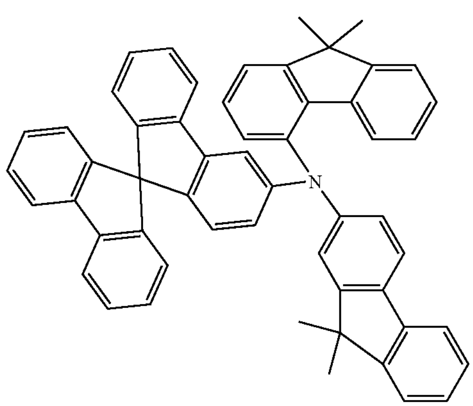
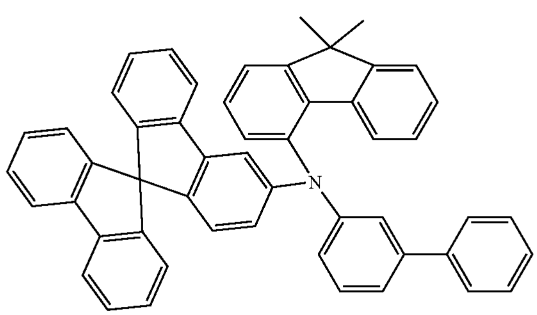
-continued
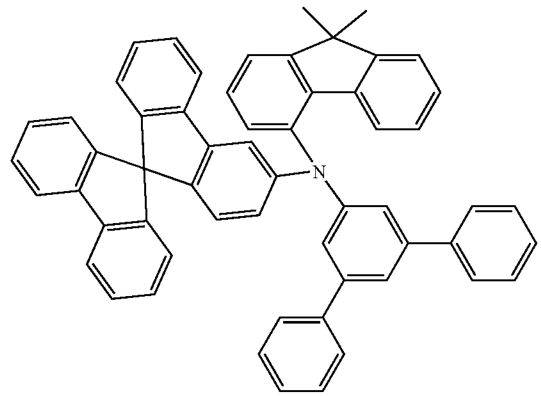
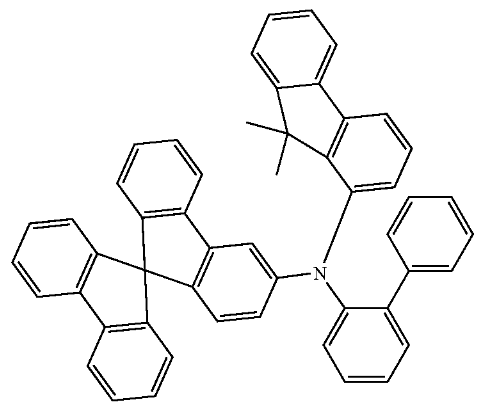
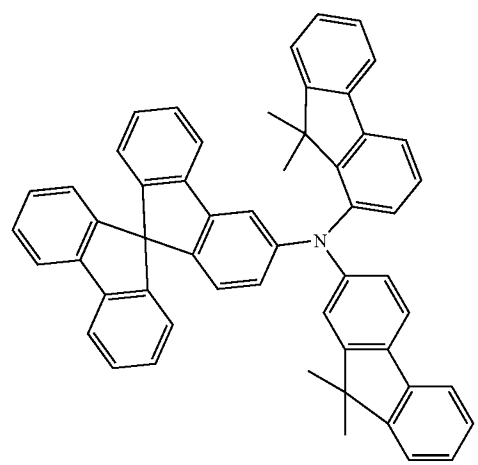
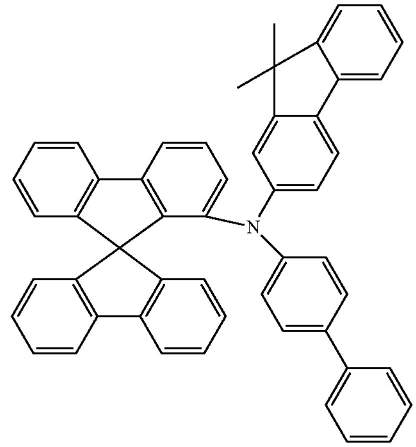

-continued
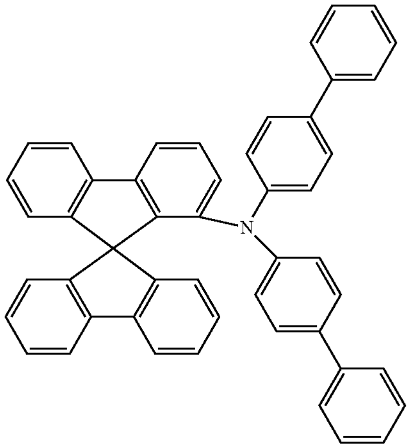
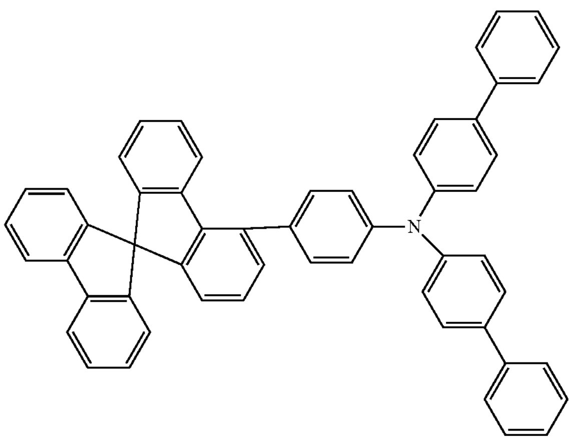
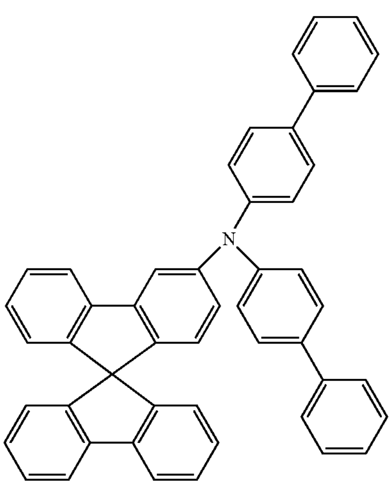
[Formula 309]
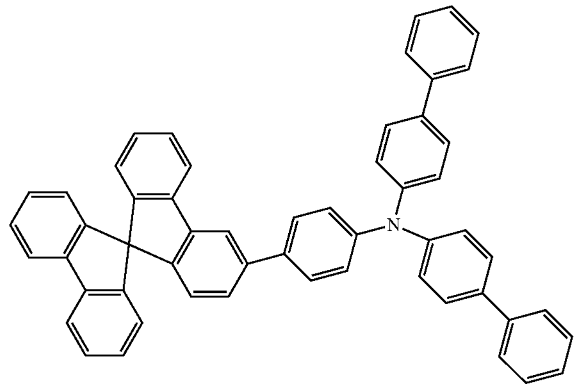
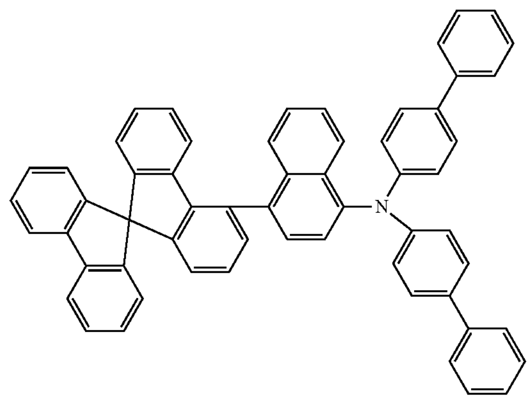
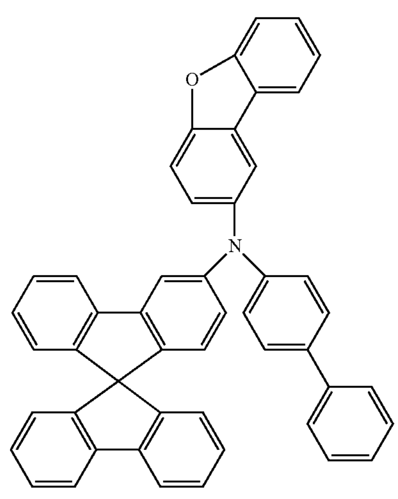

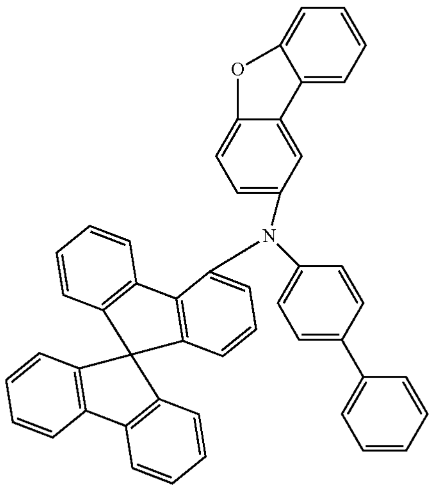
O
N
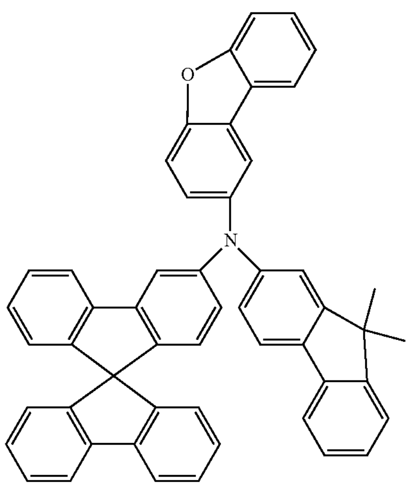
O
N
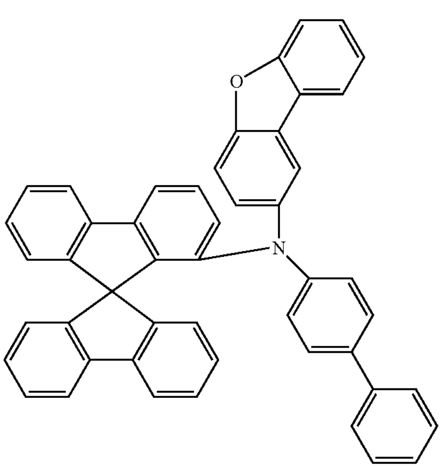
O
N
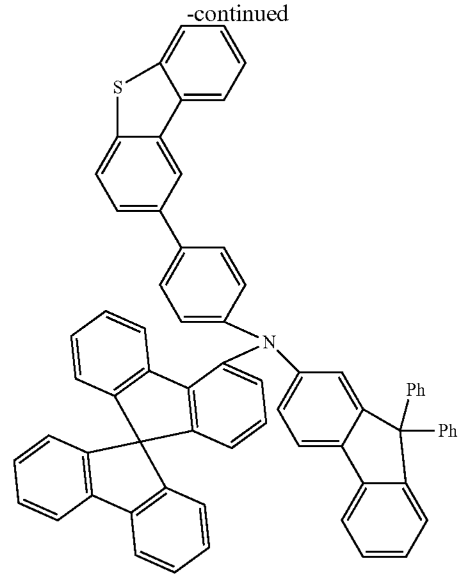
S
N
Ph
Ph
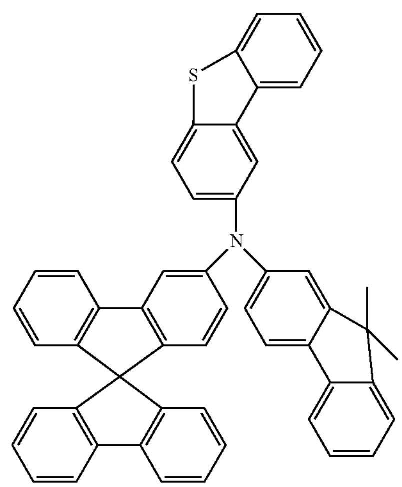
S
N
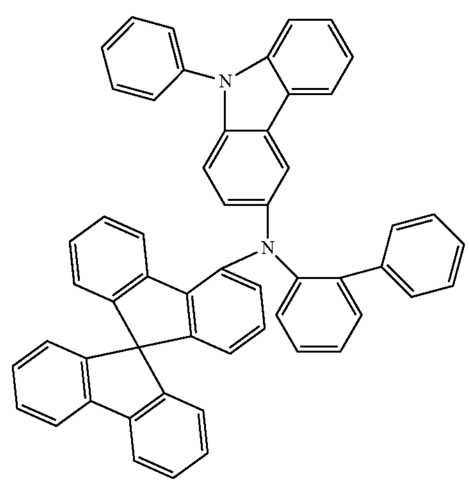
N
N -continued
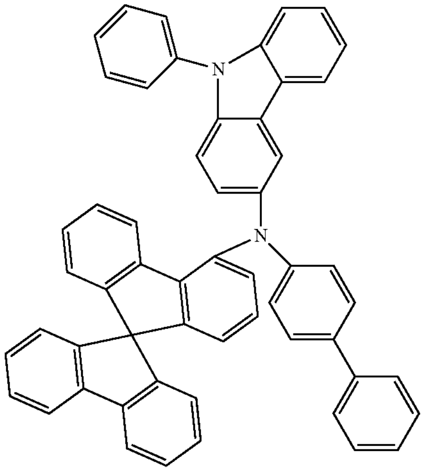
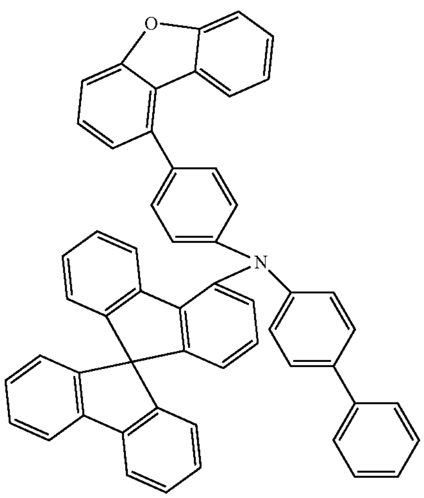
[Formula 310]
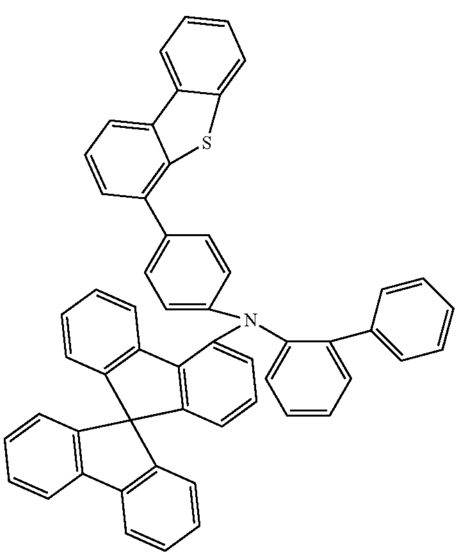
-continued
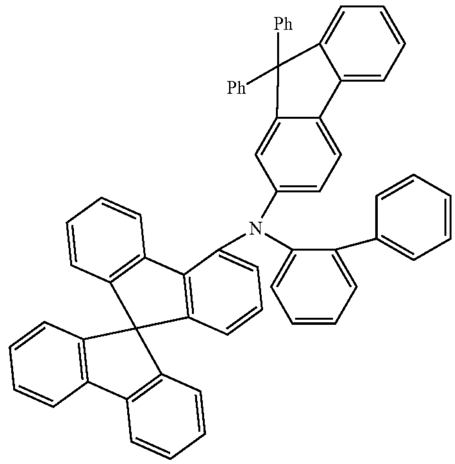
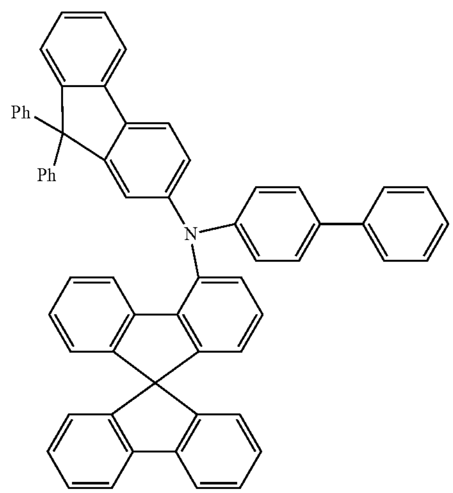
[Formula 311]
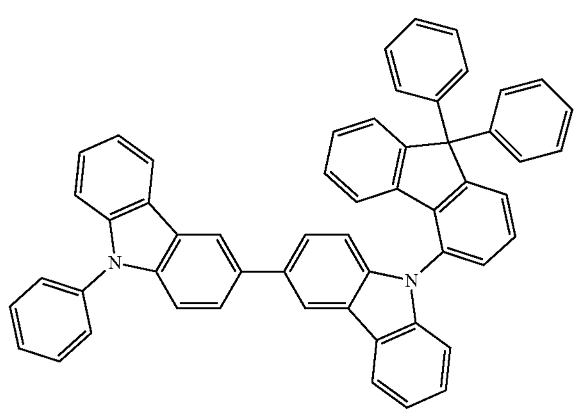

-continued
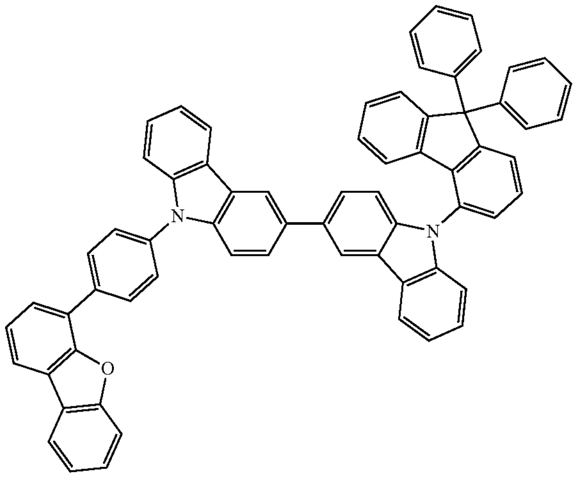
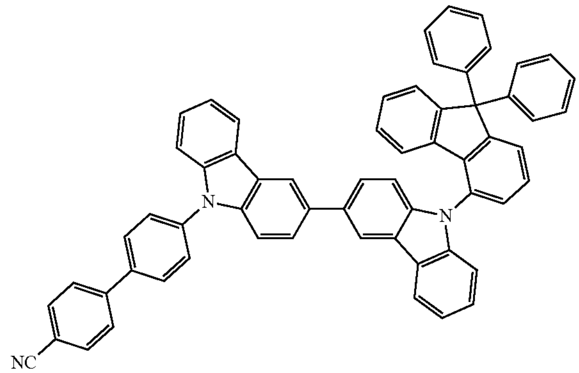
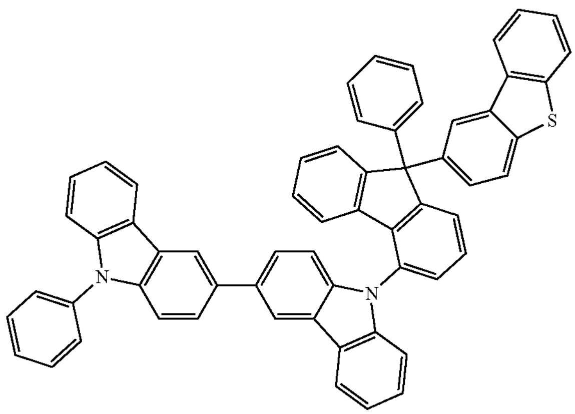
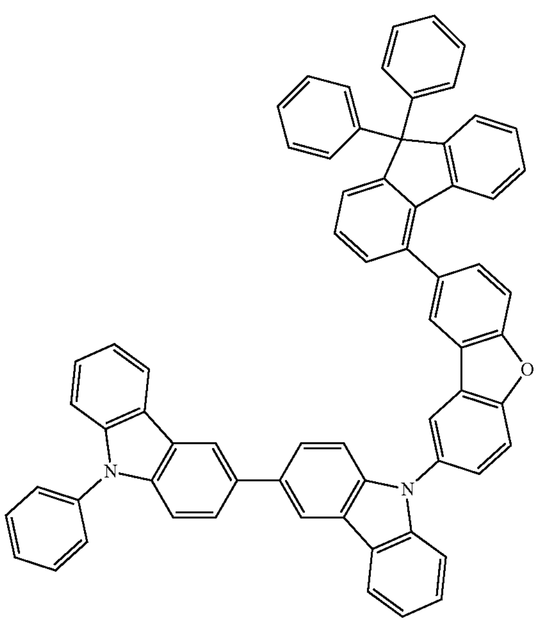
[Formula 312]
HT1
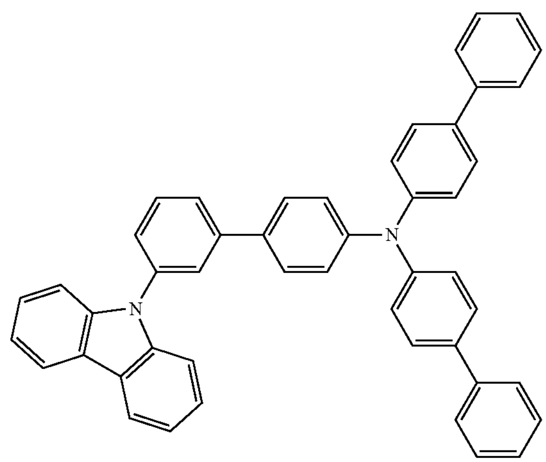
HT2
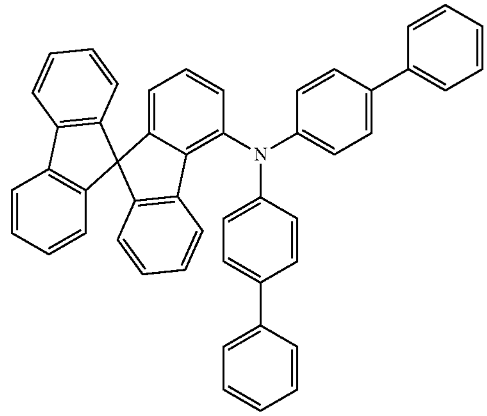

[Formula 313]
HT3
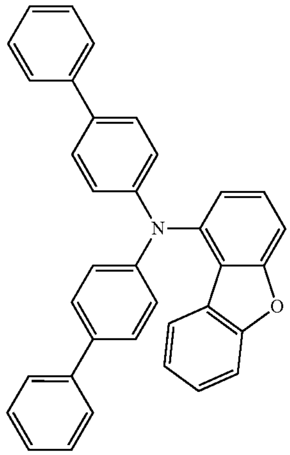
HT4
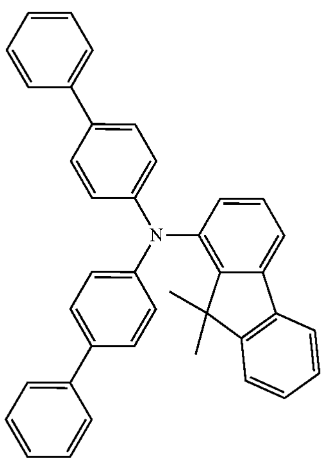
HT5
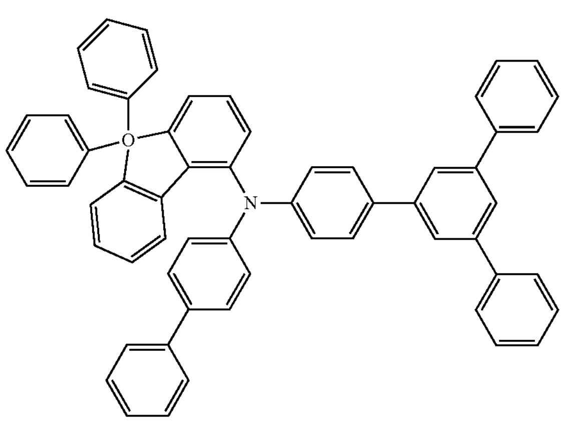
[Formula 314]
HT6
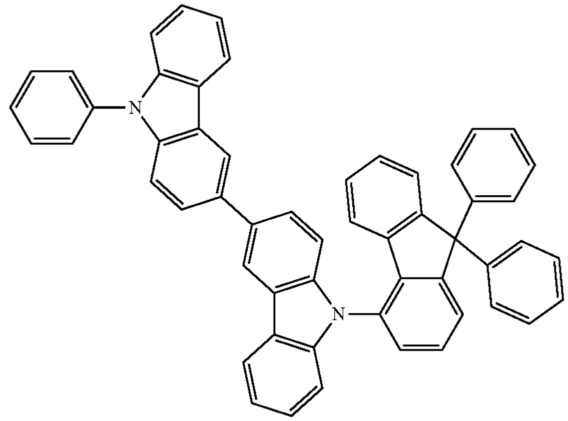
HT7
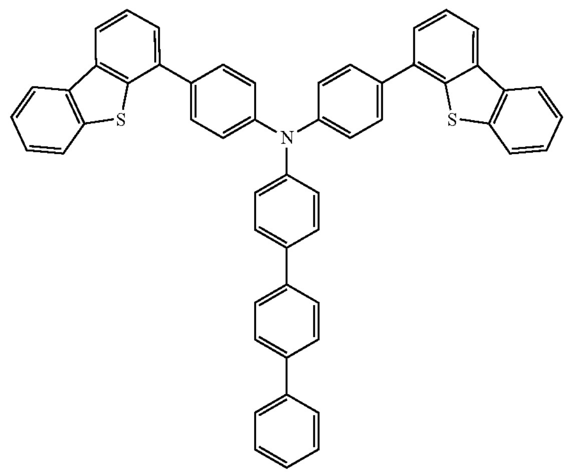
[Formula 315]
HT8
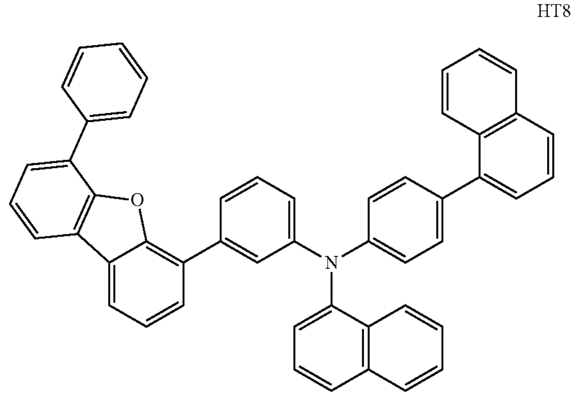

-continued
HT9
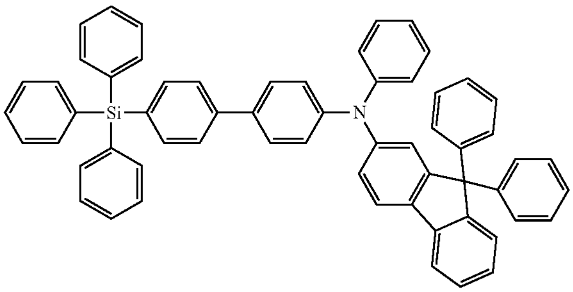
[Formula 316]
HT10
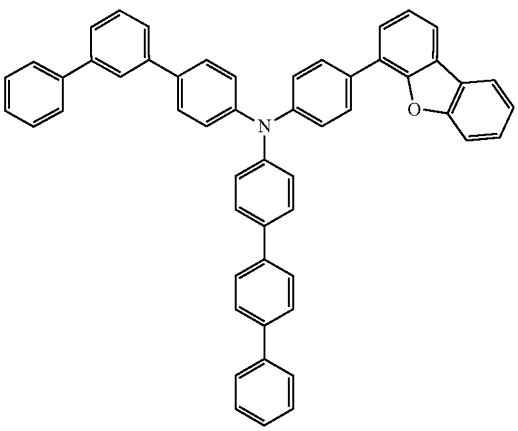
HT11
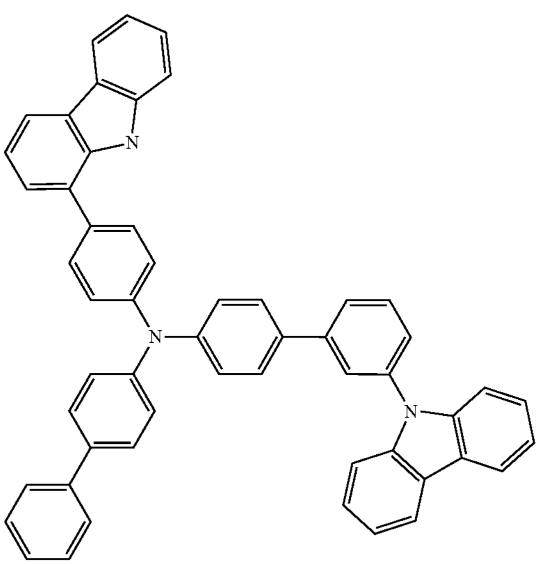
[Formula 317]
HT12
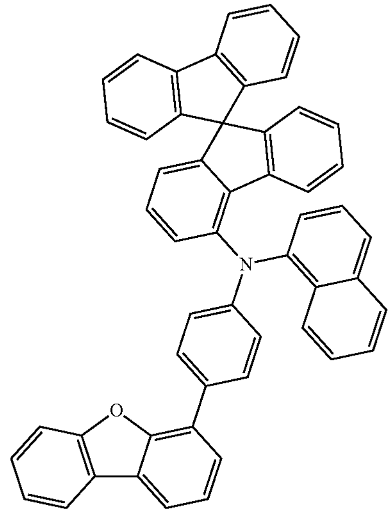
HT13
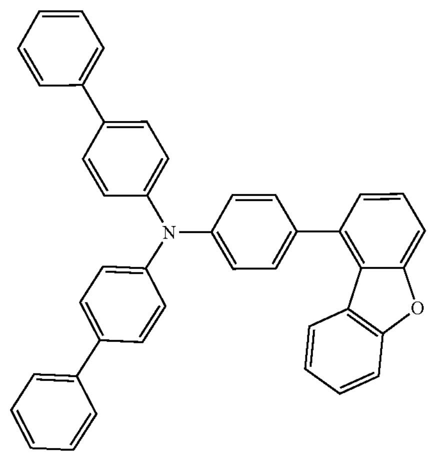
HT14
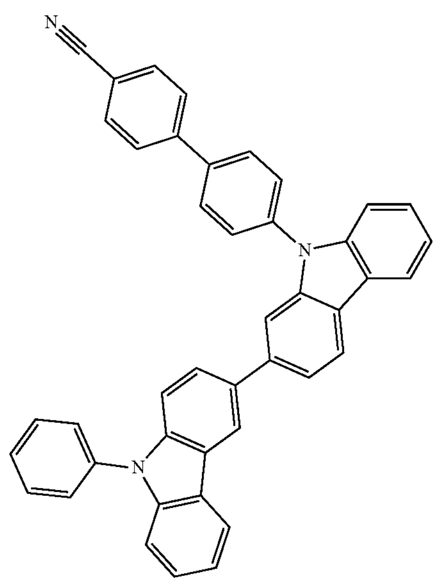

[Formula 318]

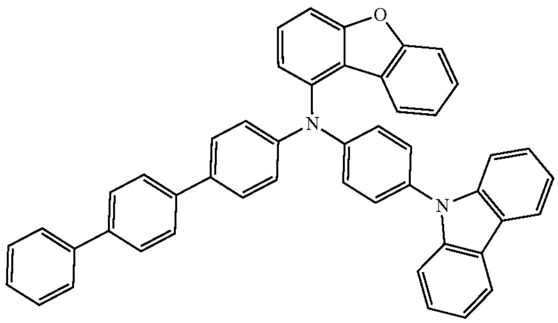

An arrangement of the organic EL device according to the exemplary embodiment will be further described. The description of the reference signs may be omitted.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include indium oxide-tin oxide (ITO: Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having, which have a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high polymer compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'- phenylamino}phenyl)methacrylamido] (abbreviation: PTPDMA), and poly[N, N'-bis(4-butylphenyl)-N, N'-bis (phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly (styrene sulfonic acid)(PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V \cdot s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, for instance, a benzimidazole compound is suitably usable for the electron transporting layer. The above-described substances mostly have an electron mobility of $10^{-6}$ $cm^2/(V \cdot s)$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Moreover, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Compound Represented by Formula (5A)

In the organic EL device according to the exemplary embodiment, it is preferable that the electron transporting layer is disposed between the second emitting layer and the cathode and the electron transporting layer includes a compound represented by a formula (5A) below.

[Formula 319]

(5A)

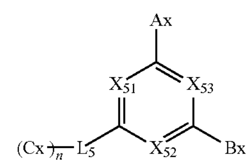

In the formula (5A):

$X_{51}$, $X_{52}$ and $X_{53}$ are each independently a nitrogen atom or $CR_5$, at least one of $X_{51}$, $X_{52}$, and $X_{53}$ is a nitrogen atom;

$R_5$ is a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

$R_{901}$ to $R_{904}$ represent the same as $R_{901}$ to $R_{904}$ defined in the formula (1) or (2);

Ax is a substituted or unsubstituted aryl group having 6 to 18 ring carbon atoms, or a substituted or unsubstituted heterocyclic group having 5 to 13 ring atoms;

Bx is a substituted or unsubstituted aryl group having 6 to 18 ring carbon atoms, or a substituted or unsubstituted heterocyclic group having 5 to 13 ring atoms;

$L_5$ is a single bond, a substituted or unsubstituted (n+1)-valent aromatic hydrocarbon ring group having 6 to 18 ring carbon atoms; or a substituted or unsubstituted (n+1)-valent heterocyclic group having 5 to 13 ring atoms;

n is 1, 2, or 3, when n is 2 or 3, $L_5$ is not a single bond;

Cx is each independently a substituted or unsubstituted aryl group having 6 to 30 ring carbon atoms, or a substituted or unsubstituted heterocyclic group having 5 to 60 ring atoms; and when a plurality of Cx are present, the plurality of Cx are mutually the same or different.

In the organic EL device according to the exemplary embodiment, it is preferable that the compound represented by the formula (5A) is a compound represented by a formula (50A) below.

[Formula 320]

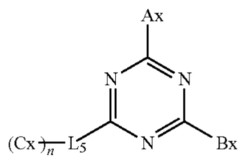

(50A)

In the formula (50A), Ax, Bx, Cx, $L_5$ and n represent the same as Ax, Bx, Cx, $L_5$ and n defined in the formula (5A).

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

In the organic EL device according to the exemplary embodiment, a substituent for the substituted or unsubstituted group is preferably at least one group selected from the group consisting of an alkyl group having 1 to 18 carbon atoms, an aryl group having 6 to 18 ring carbon atoms, and a heterocyclic group having 5 to 18 ring atoms.

In the organic EL device according to the exemplary embodiment, a substituent for the substituted or unsubstituted group is preferably an alkyl group having 1 to 5 carbon atoms.

Layer Formation Method

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Layer Thickness

The film thickness of the organic layers of the organic EL device in the exemplary embodiment is not limited unless otherwise specified in the above. In general, since excessively small film thickness is likely to cause defects (e.g. pin holes) and excessively large thickness leads to the necessity of applying high voltage and consequent reduction in efficiency, the thickness of the organic layer of the organic EL device usually preferably ranges from several nanometers to 1 μm.

Emission Wavelength of Organic EL Device

The organic electroluminescence device according to the exemplary embodiment preferably emits, when being driven, light whose maximum peak wavelength is in a range from 430 nm to 480 nm.

The maximum peak wavelength of the light emitted from the organic EL device when being driven is measured as follows. Voltage is applied on the organic EL devices such that a current density becomes 10 $mA/cm^2$, where spectral radiance spectrum is measured by a spectroradiometer CS-2000 (manufactured by Konica Minolta, Inc.). A peak wavelength of an emission spectrum, at which the luminous intensity of the resultant spectral radiance spectrum is at the maximum, is measured and defined as a maximum peak wavelength (unit: nm).

According to the exemplary embodiment, the organic electroluminescence device that emits light at high luminous efficiency can be provided.

Second Exemplary Embodiment

Organic Electroluminescence Device

An arrangement of an organic EL device according to a second exemplary embodiment will be described below.

An organic EL device according to the second exemplary embodiment is the same as the organic EL device according to the first exemplary embodiment except for a difference in the first emitting layer and the second emitting layer. Accordingly, in the description of the second exemplary embodiment, the same components as those in the first exemplary embodiment are denoted by the same reference signs and names to simplify or omit an explanation of the components. Moreover, as the device arrangement, materials, and compounds unless otherwise specified in the second exemplary embodiment, the same device arrangement, materials, and compounds as described in the first exemplary embodiment are usable.

In the second exemplary embodiment, an "organic EL device according to the exemplary embodiment" at least includes an "organic EL device according to a third aspect" and an "organic EL device according to a fourth aspect" below, and may further include an organic EL device according to any other aspect.

An organic EL device according to the third aspect of the exemplary embodiment includes: an anode; a cathode; a first emitting layer disposed between the anode and the cathode; a second emitting layer disposed between the first emitting layer and the cathode; and an electron blocking layer disposed between the first emitting layer and the anode, in which the first emitting layer and the second emitting layer are in direct contact with each other; the first emitting layer and the electron blocking layer are in direct contact with each other; the first emitting layer contains a first host material; the second emitting layer contains a second host material; the first host material is different from the second host material; the first emitting layer at least contains a compound that emits light having a maximum peak wavelength of 500 nm or less; the second emitting layer at least contains a compound that emits light having a maximum peak wavelength of 500 nm or less; the compound that is contained in the first emitting layer and emits light having the maximum peak wavelength of 500 nm or less and the compound that is contained in the second emitting layer and emits light having the maximum peak wavelength of 500 nm or less are mutually the same or different; a triplet energy $T_1$(H1) of the first host material and a triplet energy $T_1$(H2) of the second host material satisfy a relationship of a numerical formula (Numerical Formula 1A) below; and the electron blocking layer contains a third compound, and an ionization potential Ip(HT) of the third compound satisfies a numerical formula (M1) below.

$$T_1(H1)>T_1(H2) \quad \text{(Numerical Formula 1A)}$$

$$\text{Ip}(HT)\geq 5.67\text{ eV} \quad \text{(M1)}$$

An organic EL device according to the fourth aspect of the exemplary embodiment includes: an anode; a cathode; a first emitting layer disposed between the anode and the cathode; a second emitting layer disposed between the first emitting layer and the cathode; and an electron blocking layer disposed between the first emitting layer and the anode, in which: the first emitting layer and the second emitting layer are in direct contact with each other; the first emitting layer and the electron blocking layer are in direct contact with each other; the first emitting layer contains a first host material; the second emitting layer contains a second host material; the first host material is different from the second host material; the first emitting layer at least contains a compound that emits light having a maximum peak wavelength of 500 nm or less; the second emitting layer at least contains a compound that emits light having a maximum peak wavelength of 500 nm or less; the compound that is contained in the first emitting layer and emits light having the maximum peak wavelength of 500 nm or less and the compound that is contained in the second emitting layer and emits light having the maximum peak wavelength of 500 nm or less are mutually the same or different; a triplet energy $T_1$(H1) of the first host material and a triplet energy $T_1$ (H2) of the second host material satisfy a relationship of a numerical formula (Numerical Formula 1A) below; the electron blocking layer contains a third compound, and the third compound is at least one compound selected from the group consisting of a compound represented by the formula (31) and a compound represented by the formula (32); when the third compound is represented by the formula (31) and has two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms; when the compound represented by the formula (31) includes a 4-dibenzofuran structure in a molecule, the number of the 4-dibenzofuran structures is 1.

The third compound contained in the electron blocking layer of the organic EL device according to the exemplary embodiment is the same as the third compound described in the first exemplary embodiment.

According to the exemplary embodiment, an organic electroluminescence device with enhanced luminous efficiency can be provided.

Conventionally, Triplet-Triplet-Annihilation (sometimes referred to as TTA) is known as a technique for enhancing the luminous efficiency of the organic electroluminescence device. TTA is a mechanism in which triplet excitons collide with one another to generate singlet excitons. It should be noted that the TTA mechanism is also sometimes referred to as a TTF mechanism as described in Patent Literature 4. TTF is an abbreviation for Triplet-Triplet Fusion.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as 3A*) collide with one another with an increase in the density thereof, whereby a reaction shown by the following formula occurs. In the formula, $^1$A represents the ground state and $^1$A* represents the lowest singlet excitons.

$$^3A^*+^3A^*\rightarrow(4/9)^1A+(1/9)^1A^*+(13/9)^3A^*$$

In other words, $5^3A^*\rightarrow4^1A+1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one siglet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

In the organic electroluminescence device of the exemplary embodiment, it is considered that triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

The organic electroluminescence device of the exemplary embodiment includes at least two emitting layers (i.e., the first emitting layer and the second emitting layer) which satisfy a predetermined relationship. A triplet energy $T_1$(H1) of the first host material in the first emitting layer and a triplet energy $T_1$ (H2) of the second host material in the second emitting layer satisfy a relationship of the numerical formula (Numerical Formula 1A).

By including the first emitting layer and the second emitting layer that satisfy the numerical formula (Numerical Formula 1A), triplet excitons generated in the first emitting layer can transfer to the second emitting layer without being quenched by excessive carriers and be prevented from back-transferring from the second emitting layer to the first emitting layer. Consequently, the second emitting layer exhibits the TTF mechanism to effectively generate singlet excitons, thereby improving luminous efficiency.

Accordingly, the organic electroluminescence device includes, as different regions, the first emitting layer mainly generating triplet excitons and the second emitting layer mainly exhibiting the TTF mechanism using triplet excitons having transferred from the first emitting layer, and a difference in triplet energy is provided by using a compound having a smaller triplet energy than that of the first host material in the first emitting layer as the second host material in the second emitting layer, thereby improving the luminous efficiency.

In the organic EL device of the exemplary embodiment, the triplet energy $T_1(H1)$ of the first host material and the triplet energy $T_1(H2)$ of the second host material preferably satisfy a relationship of a numerical formula (Numerical Formula 5) below.

$$T_1(H1)-T_1(H2)>0.03\ \text{eV} \quad \text{(Numerical Formula 5)}$$

Herein, the “host material” refers to, for instance, a material that accounts for “50 mass % or more of the layer.” Accordingly, for instance, the first emitting layer contains 50 mass % or more of the first host material with respect to a total mass of the first emitting layer. For instance, the second emitting layer contains 50 mass % or more of the second host material with respect to a total mass of the second emitting layer.

Emission Wavelength of Organic EL Device

The organic electroluminescence device of the exemplary embodiment preferably emits, when being driven, light whose maximum peak wavelength is 500 nm or less.

The organic electroluminescence device of the exemplary embodiment more preferably emits, when being driven, light whose maximum peak wavelength is in a range from 430 nm to 480 nm.

The maximum peak wavelength of the light emitted from the organic EL device when being driven is measured as follows. Voltage is applied on the organic EL devices such that a current density becomes 10 mA/cm$^2$, where spectral radiance spectrum is measured by a spectroradiometer CS-2000 (manufactured by Konica Minolta, Inc.). A peak wavelength of an emission spectrum, at which the luminous intensity of the resultant spectral radiance spectrum is at the maximum, is measured and defined as a maximum peak wavelength (unit: nm).

First Emitting Layer

The first emitting layer includes the first host material. The first host material is a compound different from the second host material contained in the second emitting layer.

The first emitting layer at least contains a compound that emits light having a maximum peak wavelength of 500 nm or less. This “compound that emits light having a maximum peak wavelength of 500 nm or less” may be the first host material or a compound different from the first host material. The compound that emits light having a maximum peak wavelength of 500 nm or less and is contained in the first emitting layer is preferably a compound that emits fluorescence having a maximum peak wavelength of 500 nm or less.

In the exemplary embodiment, the compound that emits light having a maximum peak wavelength of 500 nm or less is preferably a compound that emits fluorescence having a maximum peak wavelength of 500 nm or less.

In the organic EL device of the exemplary embodiment, it is preferable that the first emitting layer further contains a first dopant material and the first dopant material is a fluorescent compound.

In the organic EL device of the exemplary embodiment, it is preferable that the first dopant material is a compound not having an azine ring structure in a molecule.

In the organic EL device of the exemplary embodiment, the first dopant material is preferably not a boron-containing complex, more preferably not a complex.

In the organic EL device of the exemplary embodiment, it is preferable that the first emitting layer does not contain a metal complex. Moreover, in the organic EL device of the exemplary embodiment, it is also preferable that the first emitting layer does not contain a boron-containing complex.

In the organic EL device of the exemplary embodiment, it is preferable that the first emitting layer does not contain a phosphorescent material (dopant material).

In addition, it is preferable that the first emitting layer does not contain a heavy metal complex and a phosphorescent rare earth metal complex. Examples of the heavy metal complex herein include iridium complex, osmium complex, and platinum complex.

In the organic EL device of the exemplary embodiment, the first dopant material is the compound that emits light having a maximum peak wavelength of 500 nm or less, more preferably the compound that emits fluorescence having a maximum peak wavelength of 500 nm or less. A measurement method of the maximum peak wavelength of a compound is as described above.

In an emission spectrum of the first dopant material, where a peak exhibiting a maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximal values.

Moreover, in the emission spectrum of the first dopant material, the number of peaks is preferably less than three.

In the organic EL device of the exemplary embodiment, the first emitting layer preferably emits light having a maximum peak wavelength of 500 nm or less when the organic EL device is driven.

The maximum peak wavelength of light emitted from the emitting layer when the device is driven can be measured by a method described below.

Maximum Peak Wavelength of Light Emitted from Emitting Layer When Organic EL Device is Driven For a maximum peak wavelength $\lambda p_1$ of light emitted from the first emitting layer when the organic EL device is driven, the organic EL device is manufactured by using the same material for the first emitting layer and the second emitting layer, and voltage is applied on the organic EL device so that a current density becomes 10 mA/cm$^2$, where spectral radiance spectrum is measured by a spectroradiometer CS-2000 (manufactured by Konica Minolta, Inc.). The maximum peak wavelength $\lambda p_1$ (unit: nm) is calculated from the obtained spectral radiance spectrum.

For a maximum peak wavelength $\lambda p_2$ of light emitted from the second emitting layer when the organic EL device is driven, the organic EL device is manufactured by using the same material for the first emitting layer and the second emitting layer, and voltage is applied on the organic EL device so that a current density becomes 10 mA/cm$^2$, where spectral radiance spectrum is measured by a spectroradiometer CS-2000 (manufactured by Konica Minolta, Inc.). The maximum peak wavelength $\lambda p_2$ (unit: nm) is calculated from the obtained spectral radiance spectrum.

In the organic EL device of the exemplary embodiment, the singlet energy $S_1$(H1) of the first host material and the singlet energy $S_1$(D1) of the first dopant material preferably satisfy a relationship of a numerical formula (Numerical Formula 20) below.

$$S_1(H1)>S_1(D1) \quad \text{(Numerical Formula 20)}$$

The singlet energy Si means an energy difference between the lowest singlet state and the ground state.

When the first host material and the first dopant material satisfy the relationship of the numerical formula (Numerical Formula 20), singlet excitons generated on the first host material are easily transferred from the first host material to the first dopant material, thereby contributing to fluorescence of the first dopant material.

In the organic EL device of the exemplary embodiment, the triplet energy $T_1$(H1) of the first host material and the triplet energy $T_1$(D1) of the first dopant material preferably satisfy a relationship of a numerical formula (Numerical Formula 2A) below.

$$T_1(D1)>T_1(H1) \quad \text{(Numerical Formula 2A)}$$

When the first host material and the first dopant material satisfy the relationship of the numerical formula (Numerical Formula 2A), triplet excitons generated in the first emitting layer is transferred not onto the first dopant material having higher triplet energy but onto the first host material, thereby being easily transferred to the second emitting layer.

The organic EL device of the exemplary embodiment preferably satisfies a numerical formula (Numerical Formula 2B) below.

$$T_1(D1)>T_1(H1)>T_1(H2) \quad \text{(Numerical Formula 2B)}$$

Triplet Energy $T_1$

A method of measuring triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescent spectrum (ordinate axis: phosphorescent luminous intensity, abscissa axis: wavelength) of the measurement sample is measured at a low temperature (77K). A tangent is drawn to the rise of the phosphorescent spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $$T_1\ [\text{eV}]=1239.85/\lambda_{edge} \quad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum spectral value closest to the short-wavelength region among the local maximum spectral values, a tangent is checked at each point on the curve toward the long-wavelength region of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring a singlet energy $S_1$ with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value fledge (nm) at an intersection of the tangent and the abscissa axis is assigned to a conversion equation (F2) below to calculate singlet energy.

$$S_1\ [\text{eV}]=1239.85/\lambda_{edge} \quad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve fell (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the organic EL device of the exemplary embodiment, an electron mobility μH1 of the first host material and an electron mobility μH2 of the second host material also preferably satisfy a relationship of a numerical formula (Numerical Formula 6) below.

$$\mu H2>\mu H1 \quad \text{(Numerical Formula 6)}$$

When the first host material and the second host material satisfy the relationship of the numerical formula (Numerical Formula 6), a recombination ability of holes and electrons in the first emitting layer is improved.

The electron mobility can be measured according to impedance spectroscopy.

A measurement target layer having a thickness in a range from 100 nm to 200 nm is held between the anode and the cathode, and a small alternating voltage of 100 mV or less is applied thereto while a bias DC voltage is applied. The value of an alternating current (the absolute value and the phase) which flows at this time is measured. This measurement is performed while changing a frequency of the alternating voltage, and complex impedance (Z) is calculated from the current value and the voltage value. A frequency dependency of the imaginary part (ImM) of the modulus M=iωZ (i: imaginary unit, ω: angular frequency) is obtained. The reciprocal number of a frequency ω at which the ImM becomes the maximum is defined as a response time of electrons carried in the measurement target layer. The electron mobility is calculated by the following equation.

$$\text{Electron Mobility} = (\text{Film Thickness of Measurement Target Layer})^2 / (\text{Response Time} \cdot \text{Voltage})$$

In the organic EL device of the exemplary embodiment, the first dopant material is preferably contained at more than 1.1 mass % in the first emitting layer. Specifically, the first emitting layer preferably contains the first dopant material at more than 1.1 mass % relative to a total mass of the first emitting layer, more preferably at 1.2 mass % or more relative to the total mass of the first emitting layer, further preferably at 1.5 mass % or more relative to the total mass of the first emitting layer.

The first emitting layer preferably contains the first dopant material at 10 mass % or less relative to the total mass of the first emitting layer, more preferably at 7 mass % or less relative to the total mass of the first emitting layer, further preferably at 5 mass % or less relative to the total mass of the first emitting layer.

In the organic EL device of the exemplary embodiment, the first emitting layer preferably contains the first compound as the first host material at 60 mass % or more relative to the total mass of the first emitting layer, more preferably at 70 mass % or more relative to the total mass of the first emitting layer, further preferably at 80 mass % or more relative to the total mass of the first emitting layer, more further preferably at 90 mass % or more relative to the total mass of the first emitting layer, still further more preferably at 95 mass % or more relative to the total mass of the first emitting layer.

The first emitting layer preferably contains the first host material at 99 mass % or less relative to the total mass of the first emitting layer.

It should be noted that when the first emitting layer contains the first host material and the first dopant material, an upper limit of the total of the respective content ratios of the first host material and the first dopant material is 100 mass %.

It is not excluded that the first emitting layer according to the exemplary embodiment further contains a material(s) other than the first host material and the first dopant material.

The first emitting layer may include a single type of the first host material or may include two or more types of the first host material. The first emitting layer may include a single type of the first dopant material or may include two or more types of the first dopant material.

In the organic EL device according to the exemplary embodiment, the film thickness of the first emitting layer is preferably 3 nm or more, more preferably 5 nm or more. A film thickness of the first emitting layer of 3 nm or more is sufficient to cause recombination of holes and electrons in the first emitting layer.

In the organic EL device according to the exemplary embodiment, the film thickness of the first emitting layer is preferably 15 nm or less, more preferably 10 nm or less. A film thickness of the first emitting layer of 15 nm or less is sufficiently thin to allow for transfer of triplet excitons to the second emitting layer.

In the organic EL device according to the exemplary embodiment, the film thickness of the first emitting layer is more preferably in a range from 3 nm to 15 nm.

Second Emitting Layer

The second emitting layer contains the second host material. The second host material is a compound different from the first host material contained in the first emitting layer.

The second emitting layer at least contains a compound that emits light having a maximum peak wavelength of 500 nm or less. This “compound that emits light having a maximum peak wavelength of 500 nm or less” may be the second host material or a compound different from the second host material. The compound that emits light having a maximum peak wavelength of 500 nm or less and is contained in the second emitting layer is preferably a compound that emits fluorescence having a maximum peak wavelength of 500 nm or less.

A measurement method of the maximum peak wavelength of a compound is as described above.

In the organic EL device of the exemplary embodiment, it is preferable that the second emitting layer further contains a second dopant material and the second dopant material is a fluorescent compound.

In the organic EL device of the exemplary embodiment, the second dopant material is preferably a compound that emits light having a maximum peak wavelength of 500 nm or less, more preferably a compound that emits fluorescence having a maximum peak wavelength of 500 nm or less.

In the organic EL device of the exemplary embodiment, the second emitting layer preferably emits light having a maximum peak wavelength of 500 nm or less when the organic EL device is driven.

In the organic EL device according to the exemplary embodiment, a half bandwidth of a maximum peak of the second dopant material is preferably in a range from 1 nm to 20 nm.

In the organic EL device according to the exemplary embodiment, a Stokes shift of the second dopant material preferably exceeds 7 nm.

When the Stokes shift of the second dopant material exceeds 7 nm, a reduction in luminous efficiency due to self-absorption is likely to be inhibited.

The self-absorption is a phenomenon that emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by a method described in Examples.

In the organic EL device of the exemplary embodiment, a triplet energy $T_1(D2)$ of the second dopant material and the triplet energy $T_1$(H2) of the second host material preferably satisfy a relationship of a numerical formula (Numerical Formula 3) below.

$$T_1(D2)>T_1(H2) \quad \text{(Numerical Formula 3)}$$

In the organic EL device according to the exemplary embodiment, when the second dopant material and the second host material satisfy the relationship of the numerical formula (Numerical Formula 3), in transfer of triplet excitons generated in the first emitting layer to the second emitting layer, the triplet excitons energy-transfer not to the second dopant material having higher triplet energy but to molecules of the second host material. In addition, triplet excitons generated by recombination of holes and electrons on the second host material do not transfer to the second dopant material having higher triplet energy. Triplet excitons generated by recombination on molecules of the second dopant material quickly energy-transfer to molecules of the second host material.

Triplet excitons in the second host material do not transfer to the second dopant material but efficiently collide with one another on the second host material to generate singlet excitons by the TTF phenomenon.

In the organic EL device of the exemplary embodiment, a singlet energy $S_1$(H2) of the second host material and a singlet energy $S_1$(D2) of the second dopant material preferably satisfy a relationship of a numerical formula (Numerical Formula 4) below.

$$S_1(H2)>S_1(D2) \quad \text{(Numerical Formula 4)}$$

In the organic EL device according to the exemplary embodiment, when the second dopant material and the second host material satisfy the relationship of the numerical formula (Numerical formula 4), due to the singlet energy of the second dopant material being lower than the singlet energy of the second host material, singlet excitons generated by the TTF phenomenon energy-transfer from the second host material to the second dopant material, thereby contributing to fluorescence of the second dopant material.

In the organic EL device of the exemplary embodiment, it is preferable that the second dopant material is a compound not having an azine ring structure in a molecule.

In the organic EL device of the exemplary embodiment, the second dopant material is preferably not a boron-containing complex, more preferably not a complex.

In the organic EL device of the exemplary embodiment, it is preferable that the second emitting layer does not contain a metal complex. Further, in the organic EL device of the exemplary embodiment, it is also preferable that the second emitting layer does not contain a boron-containing complex.

In the organic EL device of the exemplary embodiment, it is preferable that the second emitting layer does not contain a phosphorescent material (dopant material).

Further, it is preferable that the second emitting layer does not contain a heavy metal complex and a phosphorescent rare earth metal complex. Examples of the heavy metal complex herein include iridium complex, osmium complex, and platinum complex.

In the organic EL device of the exemplary embodiment, the second dopant material is preferably contained at more than 1.1 mass % in the second emitting layer. Specifically, the second emitting layer preferably contains the second dopant material at more than 1.1 mass % relative to a total mass of the second emitting layer, more preferably at more than 1.2 mass % relative to the total mass of the second emitting layer, further preferably at more than 1.5 mass % relative to the total mass of the second emitting layer.

The second emitting layer preferably contains the second dopant material at 10 mass % or less relative to the total mass of the second emitting layer, more preferably at 7 mass % or less relative to the total mass of the second emitting layer, further preferably at 5 mass % or less relative to the total mass of the second emitting layer.

The second emitting layer preferably contains the second compound as the second host material at 60 mass % or more relative to the total mass of the second emitting layer, more preferably at 70 mass % or more relative to the total mass of the second emitting layer, further preferably at 80 mass % or more relative to the total mass of the second emitting layer, more further preferably at 90 mass % or more relative to the total mass of the second emitting layer, still further more preferably at 95 mass % or more relative to the total mass of the second emitting layer.

The second emitting layer preferably contains the second host material at 99 mass % or less relative to the total mass of the second emitting layer.

It should be noted that when the second emitting layer contains the second host material and the second dopant material, an upper limit of the total of the respective content ratios of the second host material and the second dopant material is 100 mass %.

It is not excluded that the second emitting layer according to the exemplary embodiment further contains a material(s) other than the second host material and the second dopant material.

The second emitting layer may include a single type of the second host material or may include two or more types of the second host material. The second emitting layer may include a single type of the second dopant material or may include two or more types of the second dopant material.

In the organic EL device according to the exemplary embodiment, the film thickness of the second emitting layer is preferably 5 nm or more, more preferably 15 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portions in the first emitting layer.

In the organic EL device according to the exemplary embodiment, the film thickness of the second emitting layer is preferably 20 nm or less. When the film thickness of the second emitting layer is 20 nm or less, the density of the triplet excitons in the second emitting layer is improved to cause the TTF phenomenon more easily.

In the organic EL device according to the exemplary embodiment, the film thickness of the second emitting layer is preferably in a range from 5 nm to 20 nm.

In the organic EL device according to the exemplary embodiment, a triplet energy $T_1$(DX) of the compound that is contained in the first emitting layer and emits light having a maximum peak wavelength of 500 nm or less or the compound that is contained in the second emitting layer and emits light having a maximum peak wavelength of 500 nm or less, the triplet energy $T_1$(H1) of the first host material, and the triplet energy $T_1$(H2) of the second host material preferably satisfy a relationship of a numerical formula (Numerical Formula 10) below.

$$2.6\ \text{eV}>T_1(DX)>T_1(H1)>T_1(H2) \quad \text{(Numerical Formula 10)}$$

When the first emitting layer contains the first dopant material, the triplet energy $T_1$(D1) of the first dopant material preferably satisfies a relationship of a numerical formula (Numerical Formula 10A) below.

$$2.6\ \text{eV} > T_1(D1) > T_1(H1) > T_1(H2) \quad \text{(Numerical Formula 10A)}$$

When the second emitting layer contains the second dopant material, the triplet energy $T_1$(D2) of the second dopant material preferably satisfies a relationship of a numerical formula (Numerical Formula 10B) below.

$$2.6\ \text{eV} > T_1(D2) > T_1(H1) > T_1(H2) \quad \text{(Numerical Formula 10B)}$$

In the organic EL device according to the exemplary embodiment, the triplet energy $T_1$(DX) of the compound that is contained in the first emitting layer and emits light having a maximum peak wavelength of 500 nm or less or the compound that is contained in the second emitting layer and emits light having a maximum peak wavelength of 500 nm or less and the triplet energy $T_1$(H1) of the first host material preferably satisfy a relationship of a numerical formula (Numerical Formula 11) below.

$$0\ \text{eV} < T_1(DX) - T_1(H1) < 0.6\ \text{eV} \quad \text{(Numerical Formula 11)}$$

When the first emitting layer contains the first dopant material, the triplet energy $T_1$(D1) of the first dopant material preferably satisfies a relationship of a numerical formula (Numerical Formula 11A) below.

$$0\ \text{eV} < T_1(D1) - T_1(H1) < 0.6\ \text{eV} \quad \text{(Numerical Formula 11A)}$$

When the second emitting layer contains the second dopant material, the triplet energy $T_1$(D2) of the second dopant material preferably satisfies a relationship of a numerical formula (Numerical Formula 11B) below.

$$0\ \text{eV} < T_1(D2) - T_1(H2) < 0.8\ \text{eV} \quad \text{(Numerical Formula 11B)}$$

In the organic EL device according to the exemplary embodiment, the triplet energy $T_1$(H1) of the first host material preferably satisfies a relationship of a numerical formula (Numerical Formula 12) below.

$$T_1(H1) > 2.0\ \text{eV} \quad \text{(Numerical Formula 12)}$$

In the organic EL device according to the exemplary embodiment, the triplet energy $T_1$(H1) of the first host material also preferably satisfies a relationship of a numerical formula (Numerical Formula 12A), or also preferably satisfies a relationship of a numerical formula (Numerical Formula 12B).

$$T_1(H1) > 2.10\ \text{eV} \quad \text{(Numerical Formula 12A)}$$

$$T_1(H1) > 2.15\ \text{eV} \quad \text{(Numerical Formula 12B)}$$

In the organic EL device according to the exemplary embodiment, when the triplet energy $T_1$(H1) of the first host material satisfies the relationship of the numerical formula (Numerical Formula 12A) or the numerical formula (Numerical Formula 12B), triplet excitons generated in the first emitting layer are easily transferred to the second emitting layer as well as easily inhibited from back-transferring from the second emitting layer to the first emtting layer. Consequently, singlet excitons are generated efficiently in the second emitting layer, thereby improving luminous efficiency.

In the organic EL device according to the exemplary embodiment, the triplet energy $T_1$(H1) of the first host material also preferably satisfies a relationship of a numerical formula (Numerical Formula 12C), or also preferably satisfies a relationship of a numerical formula (Numerical Formula 12D).

$$2.08\ \text{eV} > (H1) > 1.87\ \text{eV} \quad \text{(Numerical Formula 12C)}$$

$$2.05\ \text{eV} > T_1(H1) > 1.90\ \text{eV} \quad \text{(Numerical Formula 12D)}$$

In the organic EL device according to the exemplary embodiment, when the triplet energy $T_1$(H1) of the first host material satisfies the relationship of the numerical formula (Numerical Formula 12C) or the numerical formula (Numerical Formula 12D), energy of the triplet excitons generated in the first emitting layer is reduced. This allows the organic EL device to have a longer lifetime.

In the organic EL device according to the exemplary embodiment, a triplet energy $T_1$(F1) of the compound that is contained in the first emitting layer and emits light having a maximum peak wavelength of 500 nm or less also preferably satisfies a relationship of a numerical formula (Numerical Formula 14A) below, or also preferably satisfies a relationship of a numerical formula (Numerical Formula 14B) below.

$$2.60\ \text{eV} > T_1(F1) \quad \text{(Numerical Formula 14A)}$$

$$2.50\ \text{eV} > T_1(F1) \quad \text{(Numerical Formula 14B)}$$

The first emitting layer containing the compound that satisfies the relationship of the numerical formula (Numerical Formula 14A) or the numerical formula (Numerical Formula 14B) results in the organic EL device with a longer lifetime.

In the organic EL device according to the exemplary embodiment, a triplet energy $T_1$(F2) of the compound that is contained in the second emitting layer and emits light having a maximum peak wavelength of 500 nm or less also preferably satisfies a relationship of a numerical formula (Numerical Formula 14C) below, or also preferably satisfies a relationship of a numerical formula (Numerical Formula 14D) below.

$$2.60\ \text{eV} > T_1(F2) \quad \text{(Numerical Formula 14C)}$$

$$2.50\ \text{eV} > T_1(F2) \quad \text{(Numerical Formula 14D)}$$

The second emitting layer containing the compound that satisfies the relationship of the numerical formula (Numerical Formula 14C) or the numerical formula (Numerical Formula 14D) results in the organic EL device with a longer lifetime.

In the organic EL device according to the exemplary embodiment, the triplet energy $T_1$(H2) of the second host material preferably satisfies a relationship of a numerical formula (Numerical Formula 13) below.

$$T_1(H2) \geq 1.9\ \text{eV} \quad \text{(Numerical Formula 13)}$$

Additional Layers of Organic EL Device

The organic EL device according to the exemplary embodiment may include one or more organic layers in addition to the electron blocking layer, the first emitting layer and the second emitting layer. Examples of the additional organic layer include at least one layer selected from the group consisting of a hole injecting layer, a hole transporting layer, an emitting layer, an electron injecting layer, an electron transporting layer, and a hole blocking layer.

In the organic EL device according to the exemplary embodiment, the organic layers may consist of the electron blocking layer, the first emitting layer, and the second emitting layer, but further include, for instance, at least one layer selected from the group consisting of the hole injecting layer, the hole transporting layer, the electron injecting layer, the electron transporting layer, and the hole blocking layer.

The organic electroluminescence device according to the exemplary embodiment also preferably includes the anode, the first emitting layer, the second emitting layer, and the cathode in this order.

Hole Transporting Layer

In the organic EL device of the exemplary embodiment, a hole transporting layer is preferably interposed between the anode and the electron blocking layer.

Electron Transporting Layer

In the organic EL device of the exemplary embodiment, an electron transporting layer is preferably interposed between the second emitting layer and the cathode.

Herein, a layer arrangement that the first emitting layer and the second emitting layer are in direct contact with each other may include one of embodiments ($LS_1$), ($LS_2$) and ($LS_3$) below.

($LS_1$) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

($LS_2$) An embodiment in which in a case of containing an emitting compound in the first emitting layer and the second emitting layer, a region containing all of the first host material, the second host material and the emitting compound is generated in a process of vapor-depositing the compound of the first emitting layer and vapor-depositing the compound of the second emitting layer, and is present on the interface between the first emitting layer and the second emitting layer.

($LS_3$) An embodiment in which in a case of containing an emitting compound in the first emitting layer and the second emitting layer, a region containing the emitting compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

Third Emitting Layer

The organic EL device according to the exemplary embodiment may further include a third emitting layer.

It is preferable that: the third emitting layer contains a third host material; the first host material, the second host material and the third host material are different from one another; the third emitting layer at least contains a compound that emits light having a maximum peak wavelength of 500 nm or less; the compound that emits light having a maximum peak wavelength of 500 nm or less and is contained in the first emitting layer, the compound that emits light having a maximum peak wavelength of 500 nm or less and is contained in the second emitting layer, and the compound that emits light having a maximum peak wavelength of 500 nm or less and is contained in the third emitting layer are the same or different; and the triplet energy $T_1(H1)$ of the first host material and a triplet energy $T_1(H3)$ of the third host material satisfy a relationship of a numerical formula (Numerical Formula 30A) below.

$$T_1(H1)>T_1(H3) \quad \text{(Numerical Formula 30A)}$$

When the organic EL device according to the exemplary embodiment includes the third emitting layer, the triplet energy $T_1(H2)$ of the second host material and the triplet energy $T_1(H3)$ of the third host material preferably satisfy a relationship of a numerical formula (Numerical Formula 30B) below.

$$T_1(H2)>T_1(H3) \quad \text{(Numerical Formula 30B)}$$

When the organic EL device according to the exemplary embodiment includes the third emitting layer, it is preferable that the first emitting layer and the second emitting layer are in direct contact with each other and the second emitting layer and the third emitting layer are in direct contact with each other.

Herein, a layer arrangement that the second emitting layer and the third emitting layer are in direct contact with each other can include one of embodiments (LS4), (LS5) and (LS6) below.

(LS4) An embodiment in which a region containing both the second host material and the third host material is generated in a process of vapor-depositing the compound of the second emitting layer and vapor-depositing the compound of the third emitting layer, and is present on the interface between the second emitting layer and the third emitting layer.

(LS5) An embodiment in which in a case of containing an emitting compound in the second emitting layer and the third emitting layer, a region containing the second host material, the third host material and the emitting compound is generated in a process of vapor-depositing the compound of the second emitting layer and vapor-depositing the compound of the third emitting layer, and is present on the interface between the second emitting layer and the third emitting layer.

(LS6) An embodiment in which in a case of containing an emitting compound in the second emitting layer and the third emitting layer, a region containing the emitting compound, a region containing the second host material or a region containing the third host material is generated in a process of vapor-depositing the compound of the second emitting layer and vapor-depositing the compound of the third emitting layer, and is present on the interface between the second emitting layer and the third emitting layer.

Further, it is also preferable that the organic EL device according to the exemplary embodiment further includes a diffusion layer.

When the organic EL device according to the exemplary embodiment includes the diffusion layer, the diffusion layer is preferably disposed between the first emitting layer and the second emitting layer.

First Host Material, Second Host Material, Third Host Material

In the organic EL device according to the exemplary embodiment, examples of the first host material, the second host material, and the third host material include the first compound represented by the formula (1), a formula (1X), a formula (12X), a formula (13X), a formula (14X), a formula (15X), or a formula (16X) below and the second compound represented by the formula (2). Further, the first compound can be also used as the first host material and the second host material. In this case, the compound represented by the formula (1), (1X), (12X), (13X), (14X), (15X), or (16X) used as the second host material may be referred to as the second compound for convenience.

First Compound

In the organic EL device according to the exemplary embodiment, in addition to the first compound described in the first exemplary embodiment, the compound represented by the formula (1X), (12X), (13X), (14X), (15X), or (16X) can be also used as the first compound.

Compound Represented by Formula (1X)

In the organic EL device of the exemplary embodiment, the first compound is also preferably a compound represented by the formula (1X) below.

[Formula 321]

(1X)

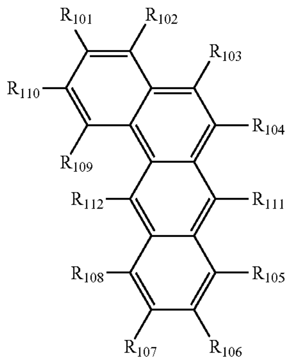

(11X)

$$*\!-\!(L_{101})_{mx}\!-\!Ar_{101}$$

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is the group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms; and $Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11X) represents a bonding position to a benz[a]anthracene ring in the formula (1X).

In the organic EL device of the exemplary embodiment, the group represented by the formula (11X) is preferably a group represented by a formula (111X) below.

[Formula 322]

(111X)

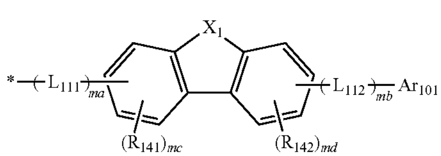

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4; mb is 1, 2, 3, or 4; ma+mb is 2, 3, or 4;

$Ar_{101}$ represents the same as $Ar_{101}$ in the formula (11);

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3; three $R_{141}$ are mutually the same or different; and md is 3; and three $R_{142}$ are mutually the same or different.

Among positions *1 to *8 of carbon atoms in the cyclic structure represented by a formula (111aX) below contained in the group represented by the formula (111X), $L_{111}$ is bonded to one of positions *1 to *4, $R_{141}$ is bonded to each of three positions of the rest of *1 to *4, $L_{112}$ is bonded to one of positions *5 to *8, and $R_{142}$ is bonded to each of three positions of the rest of *5 to *8.

[Formula 323]

(111aX)

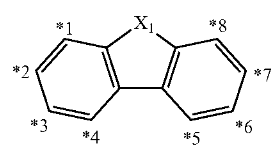

For instance, in the group represented by the formula (111X), when $L_{111}$ is bonded to *2 position of the carbon atom in the cyclic structure represented by the formula (111aX), and when $L_{112}$ is bonded to *7 position of the carbon atom in the cyclic structure represented by the formula (111aX), the group represented by the formula (111X) is represented by a formula (111bX) below.

[Formula 324]

(111bX)

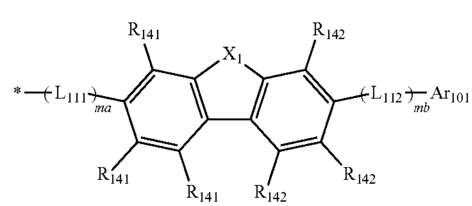

In the formula (111bX):

$X_1$, $L_{111}$, $L_{112}$, ma, mb, $Ar_{101}$, $R_{141}$, $R_{142}$, $R_{143}$, $R_{144}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device of the exemplary embodiment, the group represented by the formula (111X) is preferably a group represented by the formula (111bX).

In the compound represented by the formula (1X), ma is preferably 1 or 2, and mb is preferably 1 or 2.

In the compound represented by the formula (1X), ma is preferably 1, and mb is preferably 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group, a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

[Formula 325]

(101X)

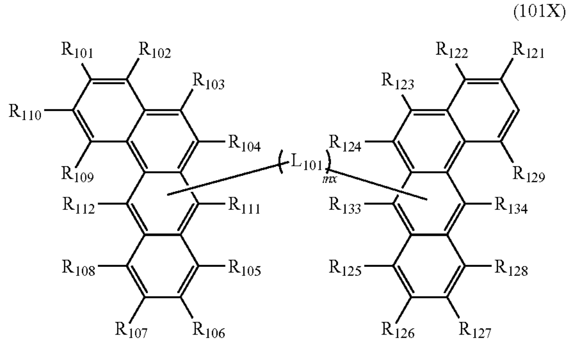

In the formula (101X):

one of $R_{111}$ and $R_{112}$ represents a bonding position to $L_{101}$, and one of $R_{133}$ and $R_{134}$ represents a bonding position to $L_{101}$;

$R_{111}$ or $R_{112}$ that is not a bonding position to Rios to $R_{110}$, $R_{121}$ to $R_{130}$, and $L_{101}$, and $R_{133}$ or $R_{134}$ that is not a bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4, or 5; and when two or more $L_{101}$ are present, the two or more $L_{101}$ are mutually the same or different.

In the compound represented by the formula (1X), $L_{101}$ is preferably a single bond, or a substituted or unsubstituted arylene group having 6 to 50 ring carbon atoms.

The compound represented by the formula (1X) is also preferably represented by a formula (102X) below.

[Formula 326]

(102X)

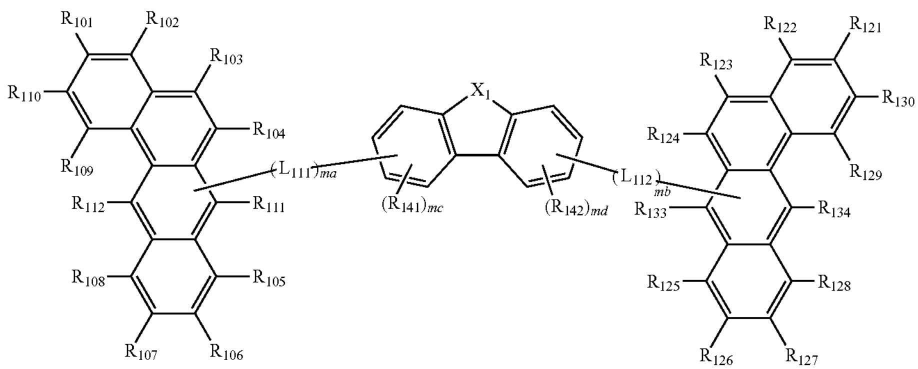

In the formula (102X):

one of $R_{111}$ and $R_{112}$ represents a bonding position to $L_{11}$, and one of $R_{133}$ and $R_{134}$ represents a bonding position to Li 12;

$R_{111}$ or $R_{112}$ that is not a bonding position to $R_{101}$ to $R_{110}$, $R_{121}$ to $R_{130}$, and $L_{111}$, and $R_{133}$ or $R_{134}$ that is not a bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, 4, or 5;

$R_{141}$, $R_{142}$, $R_{143}$, $R_{144}$ and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

and is 3; and three $R_{142}$ are mutually the same or different.

In the compound represented by the formula (1X), ma in the formula (102X) is preferably 1 or 2, and mb in the formula (102X) is preferably 1 or 2.

In the compound represented by the formula (1X), ma in the formula (102X) is preferably 1, and mb in the formula (102X) is preferably 1.

In the compound represented by the formula (1X), the group represented by the formula (11X) is also preferably a group represented by a formula (11AX) below or a group represented by a formula (11BX) below.

[Formula 327]

(11AX)

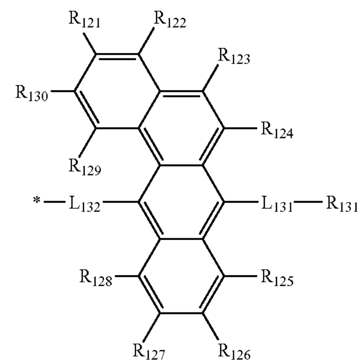

(11BX)

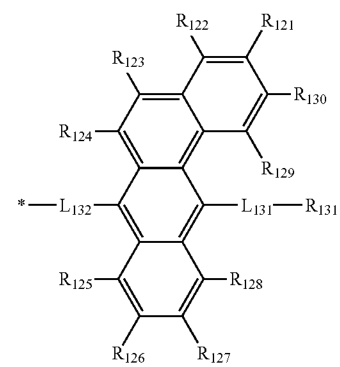

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11BX) are present, the plurality of groups represented by the formula (11BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and

* in the formulae (11AX) and (11BX) each represent a bonding position to a benz[a]anthracene ring in the formula (1X).

The compound represented by the formula (1X) is also preferably represented by a formula (103X) below.

[Formula 328]

(103X)

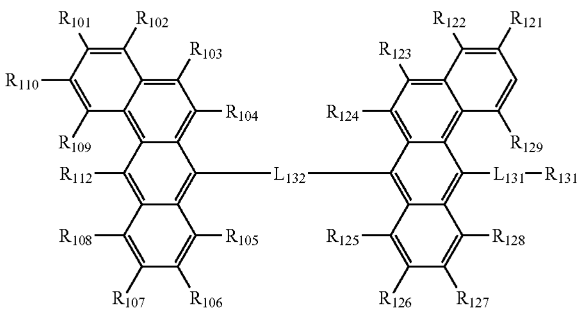

In the formula (103X):

$R_{101}$ to $R_{110}$ and $R_{112}$ respectively represent the same as $R_{101}$ to $R_{110}$ and $R_{112}$ in the formula (1X); and $R_{121}$ to $R_{131}$, $L_{131}$ and $L_{132}$ respectively represent the same as $R_{121}$ to $R_{131}$, $L_{131}$ and $L_{132}$ in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are also preferably the group represented by the formula (11).

In the compound represented by the formula (1X), two or more of $R_{101}$ to $R_{112}$ are preferably the groups represented by the formula (11X), and $Ar_{101}$ in the formula (11X) is preferably a substituted or unsubstituted aryl group having 6 to 50 ring carbon atoms.

In the compound represented by the formula (1X), it is also preferable that:

$Ar_{101}$ is not a substituted or unsubstituted benz[a]anthryl group;

$L_{101}$ is not a substituted or unsubstituted benz[a]anthrylene group; and a substituted or unsubstituted aryl group having 6 to 50 ring carbon atoms as $R_{101}$ to $R_{110}$ that are not the group represented by the formula (11X) is not a substituted or unsubstituted benz[a]anthryl group.

In the compound represented by the formula (1X), it is preferable that $R_{101}$ to $R_{112}$ that are not the group represented by the formula (11X) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ that are not the group represented by the formula (11X) are preferably a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ that are not the group represented by the formula (11X) are preferably a hydrogen atom.

Compound Represented by Formula (12X)

In the organic EL device according to the exemplary embodiment, the first compound is also preferably a compound represented by the formula (12X) below.

[Formula 329]

(12X)

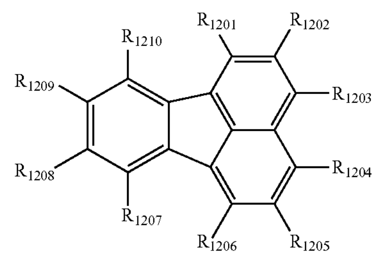

(121)

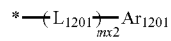

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ neither forming the substituted or unsubstituted monocyclic ring nor forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

a substituent for substituting the substituted or unsubstituted monocyclic ring, a substituent for substituting the substituted or unsubstituted fused ring, and at least one of $R_{1201}$ to $R_{1210}$ are each the group represented by the formula (121);

when a plurality of groups represented by the formula (121) are present, the plurality of group represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to the exemplary embodiment, the first compound is also preferably a compound represented by a formula (13X) below.

[Formula 330]

(13X)

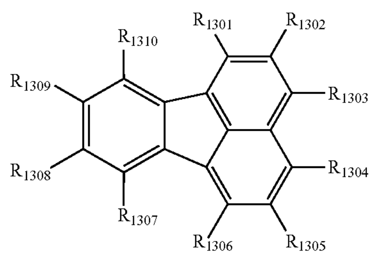

(131)

$$*\!-\!(L_{1301})_{mx3}\!-\!Ar_{1301}$$

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131), at least one of $R_{1301}$ to $R_{1310}$ is the group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and

* in the formula (131) represents a bonding position to a fluoranthene ring represented by the formula (13X).

In the organic EL device of the exemplary embodiment, combinations of adjacent two or more of $R_{1301}$ to $R_{1310}$ that are not the group represented by the formula (131) are not bonded to each other. Combinations of adjacent two of $R_{1301}$ to $R_{1310}$ in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device of the exemplary embodiment, the first compound is also preferably a compound represented by a formula (14X) below.

[Formula 331]

(14X)

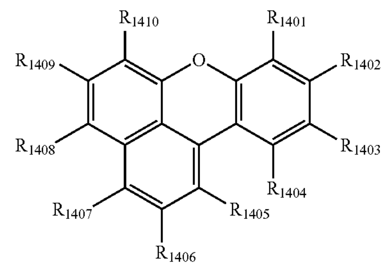

(141)

$$*\!-\!(L_{1401})_{mx4}\!-\!Ar_{1401}$$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is the group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device of the exemplary embodiment, the first compound is also preferably a compound represented by a formula (15X) below.

[Formula 332]

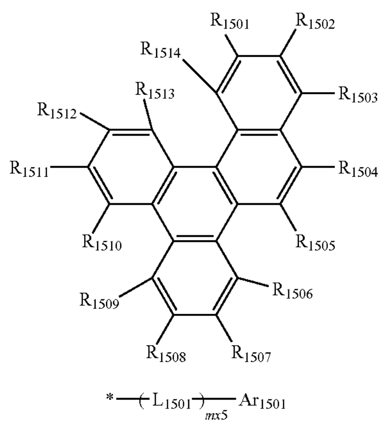

(15X)

(151)

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms; a substituted or unsubstituted heterocyclic group having 5 to 50 ring atoms, or a group represented by the formula (151);

at least one of $R_{1501}$ to $R_{1514}$ is the group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

Compound Represented by Formula (16X)

In the organic EL device according to the exemplary embodiment, the first compound is also preferably a compound represented by a formula (16X) below.

[Formula 333]

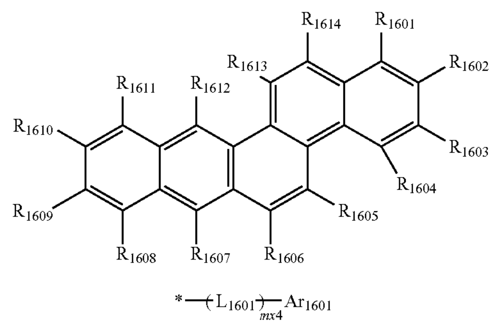

(16X)

(161)

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is the group represented by the formula (161); when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and

* in the formula (161) represents a bonding position to a ring represented by the formula (16X).

In the organic EL device according to the exemplary embodiment, it is also preferable that the first host material has, in a molecule, a linking structure including a benzene ring and a naphthalene ring that are linked with a single bond, in which the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

Since the first host material has the linking structure including such cross-linking, it can be expected to inhibit the deterioration in the chromaticity of the organic EL device.

The first host material in the above case is only required to have a linking structure as the minimum unit in a molecule, the linking structure including a benzene ring and a naphthalene ring linked to each other with a single bond, the linking structure being as represented by a formula (X1) or a formula (X2) below (referred to as a benzene-naphthalene linking structure in some cases). The benzene ring may be fused with a further monocyclic ring or fused ring, and the naphthalene ring may be fused with a further monocyclic ring or fused ring. For example, also in a case where the first host material has a linking structure including a naphthalene ring and a naphthalene ring linked to each other with a single bond (referred to as a naphthalene-naphthalene linking structure in some cases) and being as represented by a formula (X3), a formula (X4), or a formula (X5) below, the naphthalene-naphthalene linking structure is regarded as including the benzene-naphthalene linking structure since one of the naphthalene rings includes a benzene ring.

[Formula 334]

(X1)

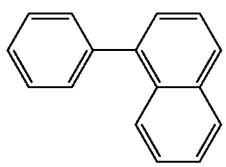

(X2)

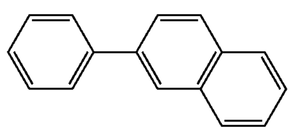

(X3)

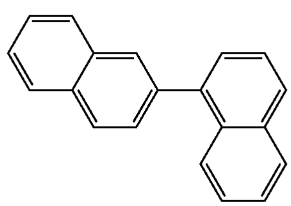

(X4)

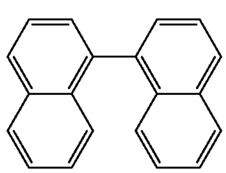

(X5)

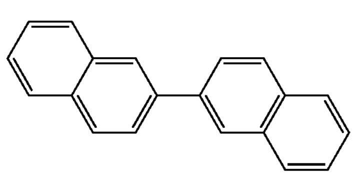

In the organic EL device according to the exemplary embodiment, the cross-linking also preferably includes a double bond. Specifically, the first host material also preferably has a linking structure in which the benzene ring and the naphthalene ring are further linked to each other at any other site than the single bond by a cross-linking structure including a double bond.

Assuming that the benzene ring and the naphthalene ring in the benzene-naphthalene linking structure are further linked to each other at at least one site other than the single bond by crosslinking, for example, a linking structure (fused ring) represented by a formula (X11) below is obtained in a case of the formula (X1), and a linking structure (fused ring) represented by a formula (X31) below is obtained in a case of the formula (X3). Assuming that the benzene ring and the naphthalene ring in the benzene-naphthalene linking structure are further linked to each other at any other site than the single bond by cross-linking including a double bond, for example, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at at least one site other than the single bond by cross-linking including a hetero atom (e.g., an oxygen atom), for example, a linking structure (fused ring) represented by a formula (X13) below is obtained in a case of the formula (X1).

[Formula 335]

(X11)

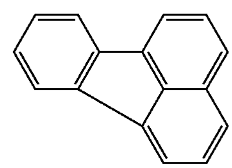

(X12)

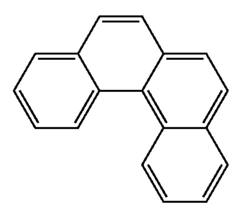

(X13)

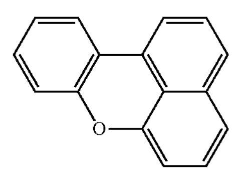

(X21)

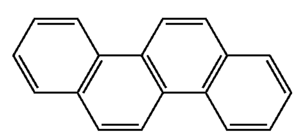

(X22)

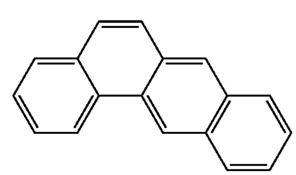

-continued (X31)

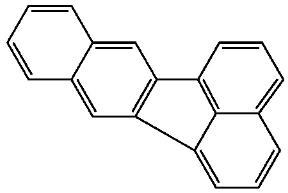

(X41)

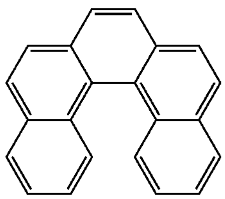

(X51)

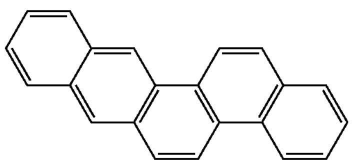

In the organic EL device according to the exemplary embodiment, it is also preferable that: the first host material has, in a molecule, a biphenyl structure in which a first benzene ring and a second benzene ring are linked to each other with a single bond; and the first benzene ring and the second benzene ring in the biphenyl structure are further linked to each other by cross-linking at at least one site other than the single bond.

In the organic EL device according to the exemplary embodiment, it is also preferable that the first benzene ring and the second benzene ring in the biphenyl structure are further linked to each other by the cross-linking at one site other than the single bond. Since the first host material has the biphenyl structure including such cross-linking, it can be expected to inhibit the deterioration in the chromaticity of the organic EL device.

In the organic EL device according to the exemplary embodiment, it is also preferable that the cross-linking includes a double bond.

In the organic EL device according to the exemplary embodiment, it is also preferable that the cross-linking includes no double bond.

It is also preferable that the first benzene ring and the second benzene ring in the biphenyl structure are further linked to each other by the cross-linking at two sites other than the single bond.

In the organic EL device according to the exemplary embodiment, it is also preferable that the first benzene ring and the second benzene ring in the biphenyl structure are further linked to each other by the cross-linking at two sites other than the single bond and the cross-linking includes no double bond. Since the first host material has the biphenyl structure including such cross-linking, it can be expected to inhibit the deterioration in the chromaticity of the organic EL device.

For example, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

[Formula 336]

(BP1)

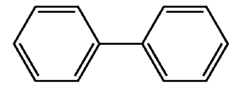

(BP11)

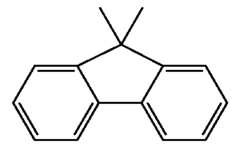

(BP12)

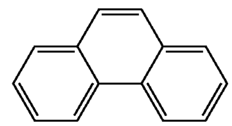

(BP13)

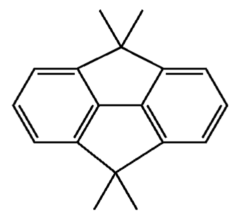

(BP14)

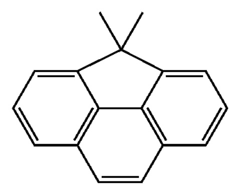

(BP15)

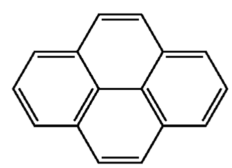

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other at one of two sites other than the single bond by cross-linking including no double bond while being linked to each other at the other of the two sites other than the single bond by cross-linking including a double bond.

The formula (BP15) represents a linking structure in which the first benzene ring and the second benzene ring are linked to each other at two sites other than the single bond by cross-linking including double bonds.

In the first compound and the second compound, it is preferable that all groups described as “substituted or unsubstituted” groups are “unsubstituted” groups.

Manufacturing Method of First Compound

The first compound that is usable in the organic EL device according to the exemplary embodiment can be manufactured by a known method. The first compound can also be manufactured based on a known method through a known alternative reaction using a known material(s) tailored for the target compound.

Specific Examples of First Compound

Specific examples of the first compound usable in the organic EL device according to the exemplary embodiment include, for example, the specific examples of the first compound described in the first exemplary embodiment and the following compounds. It should however be noted that the invention is not limited by the specific examples of the first compound.

A compound(s) included in the specific examples of the first compound shown below and falling within a definition range of the compound represented by the formula (1) according to the first exemplary embodiment is/are also usable in the organic EL device according to the first exemplary embodiment.

In the specific examples of the compound herein, D represents a deuterium atom, Me represents a methyl group, and tBu represents a tert-butyl group.

[Formula 337]

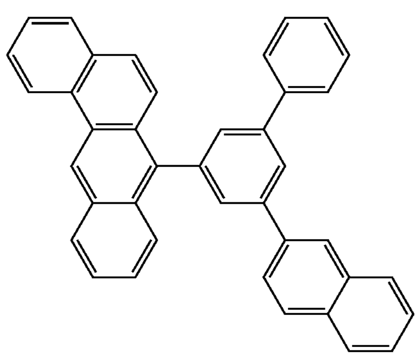

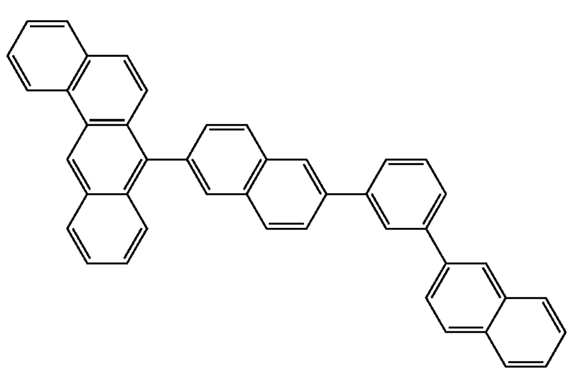

-continued

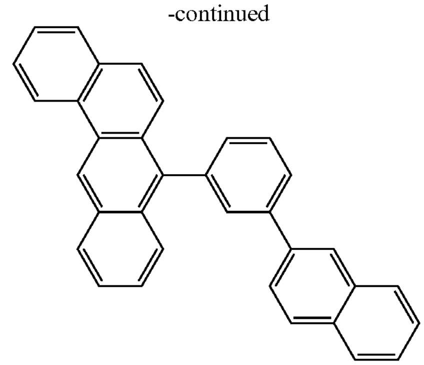

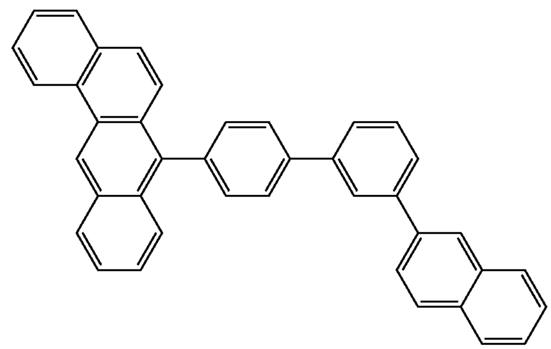

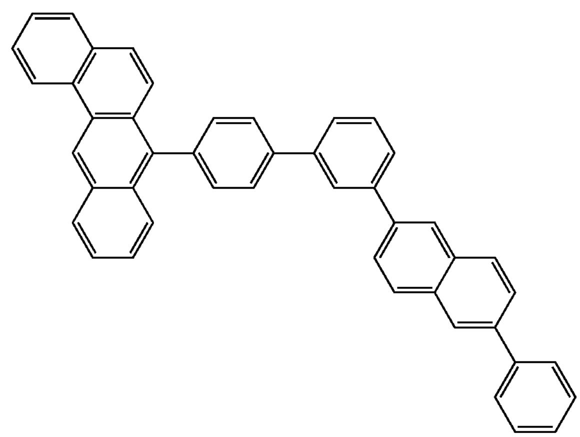

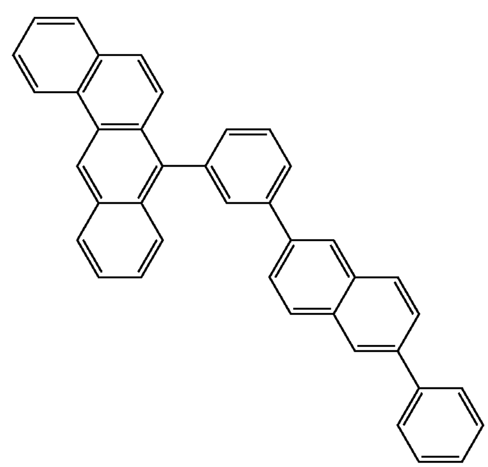

[Formula 338]
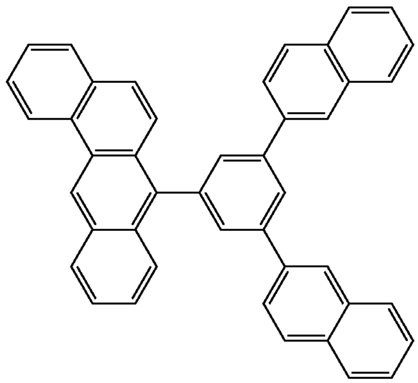
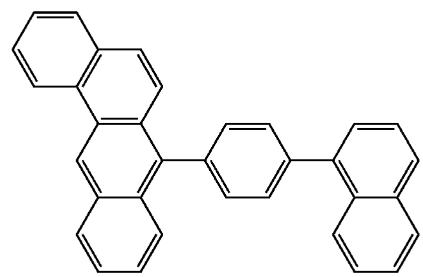
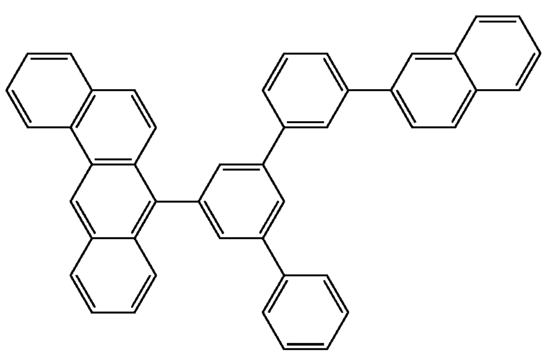
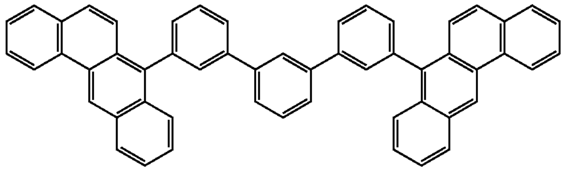
-continued
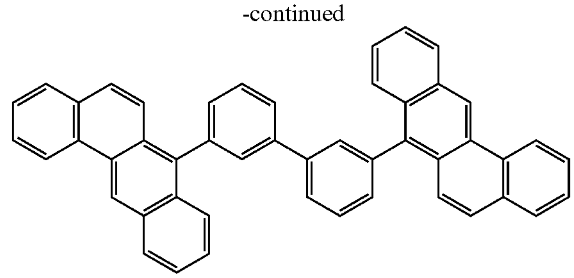
[Formula 339]
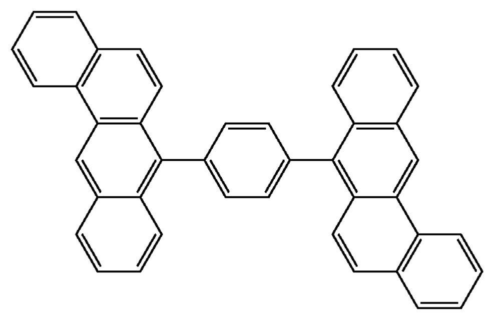
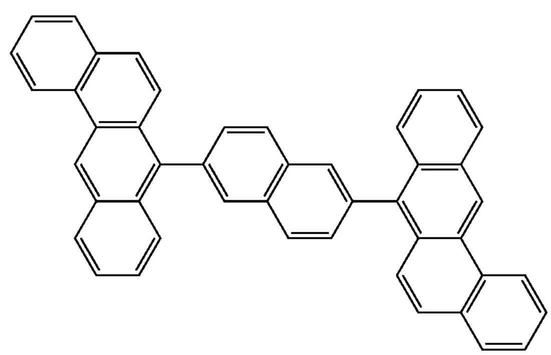
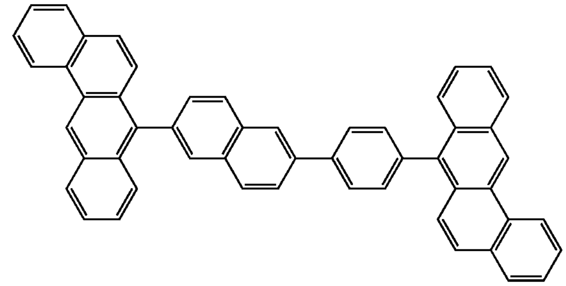

-continued
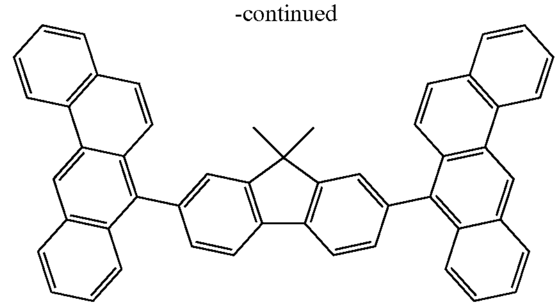
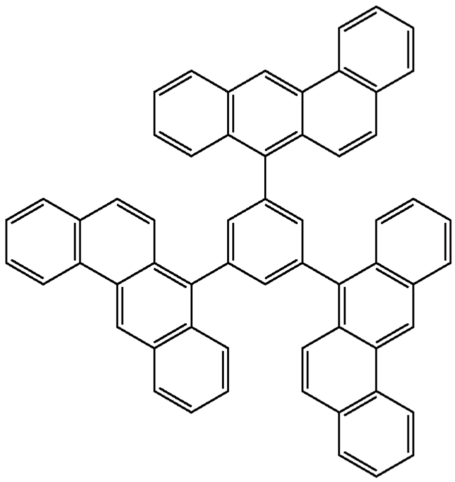
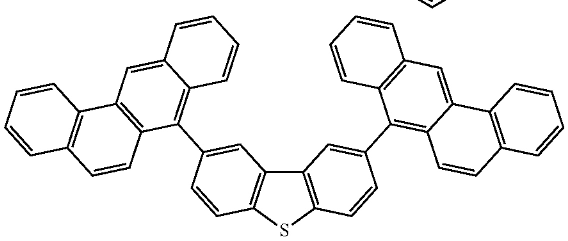
[Formula 340]
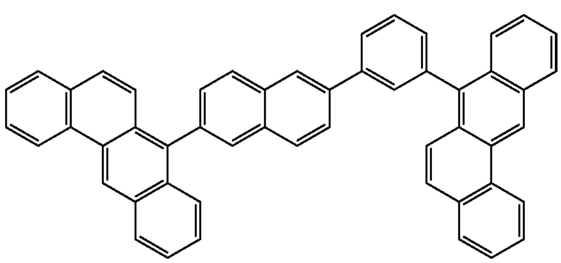
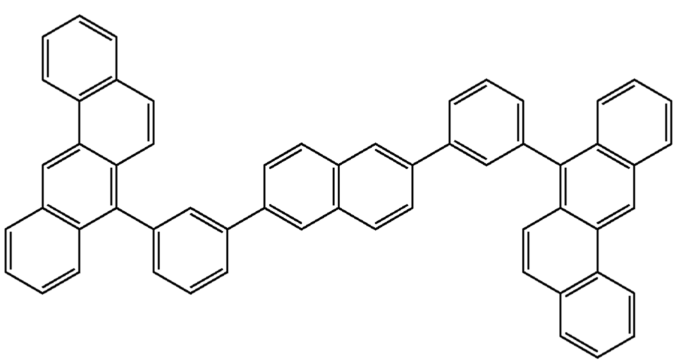

[Formula 341]
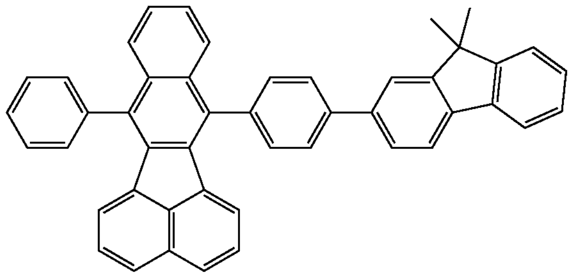
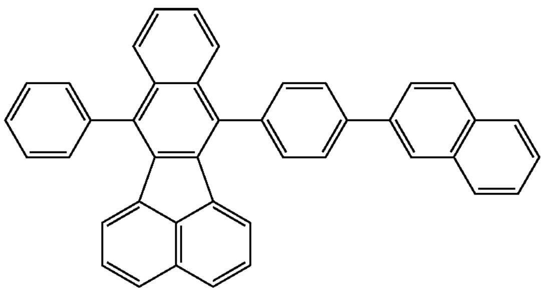
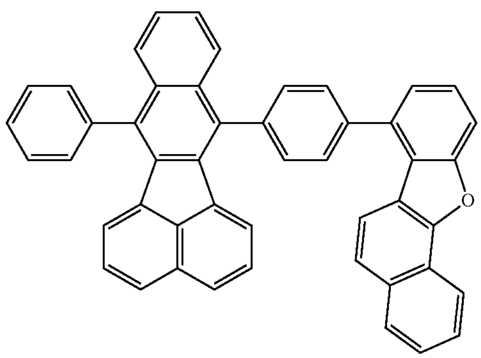
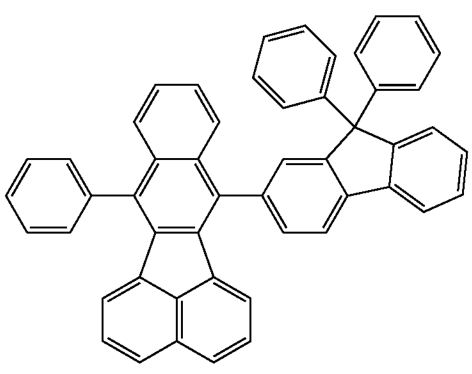
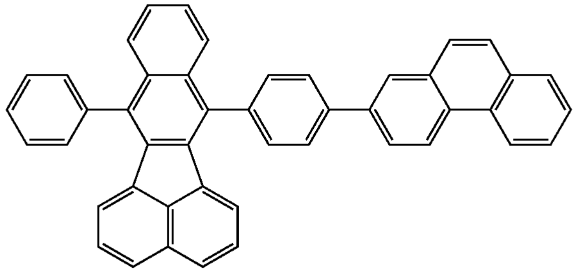
-continued
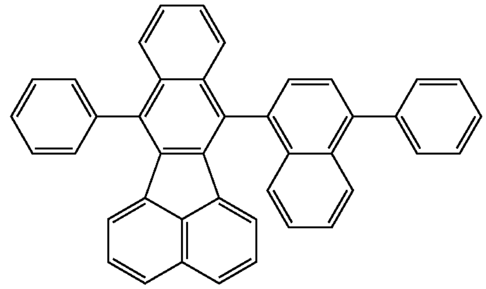
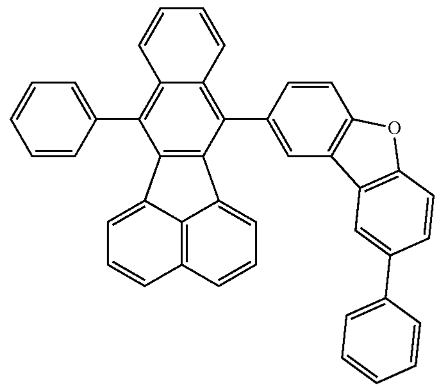
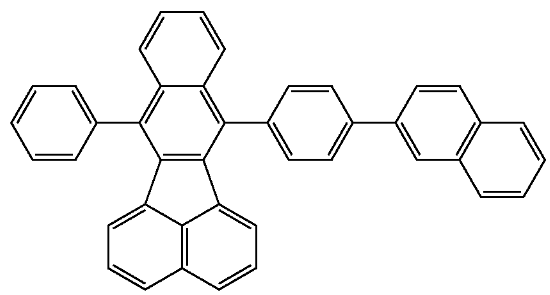
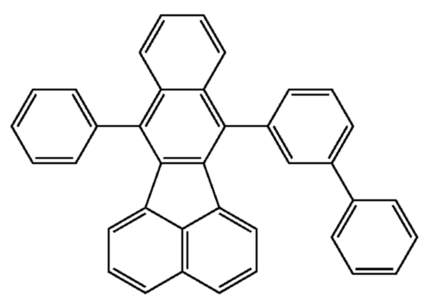
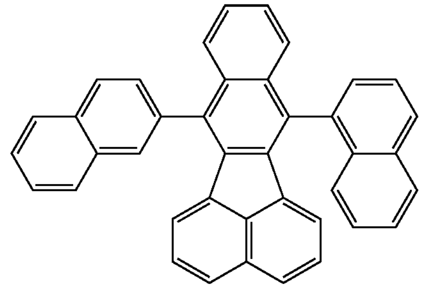

-continued
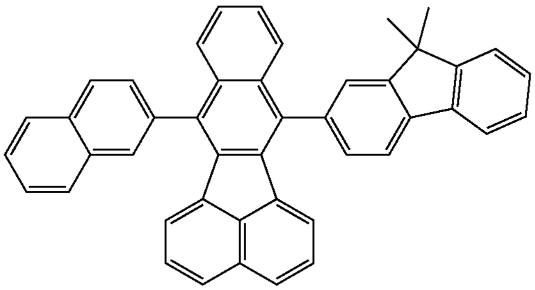
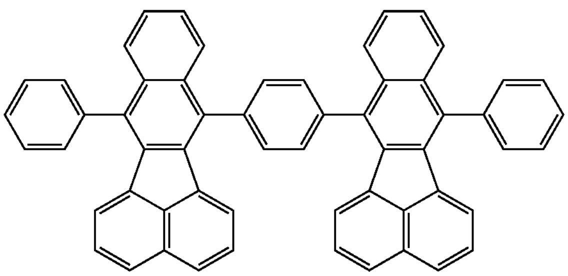
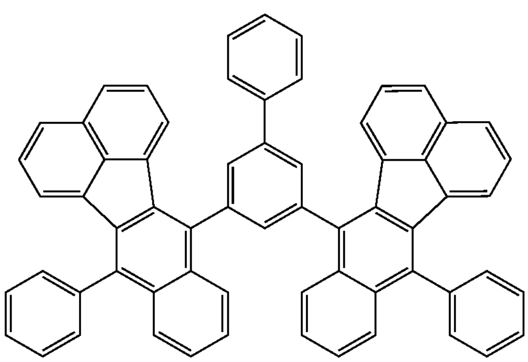
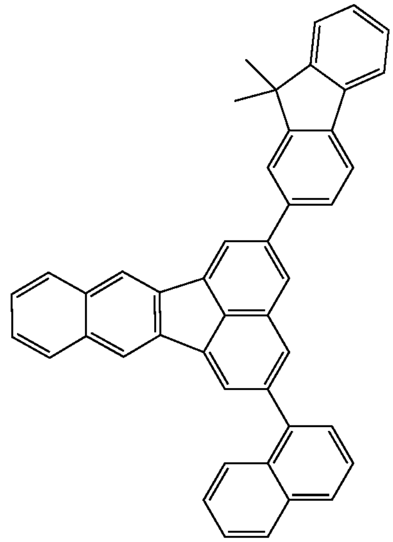
-continued
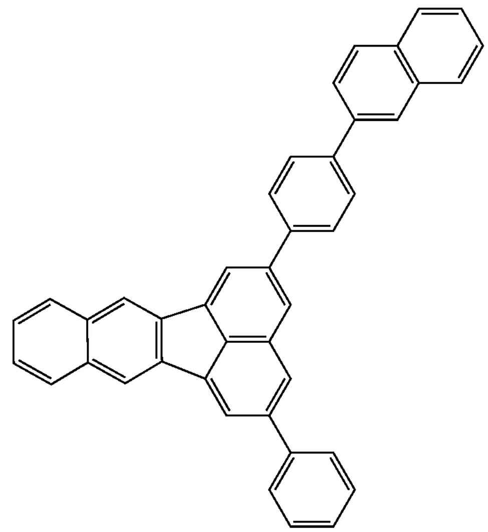
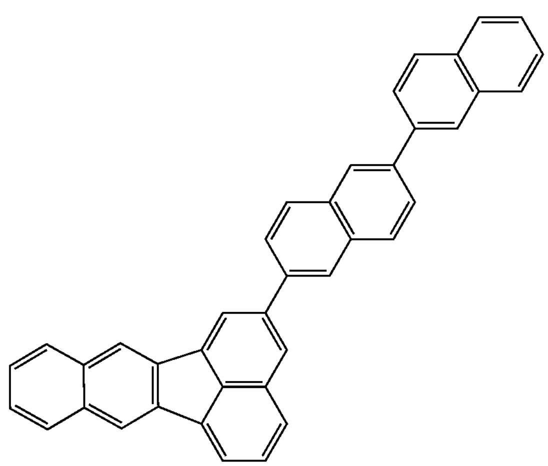
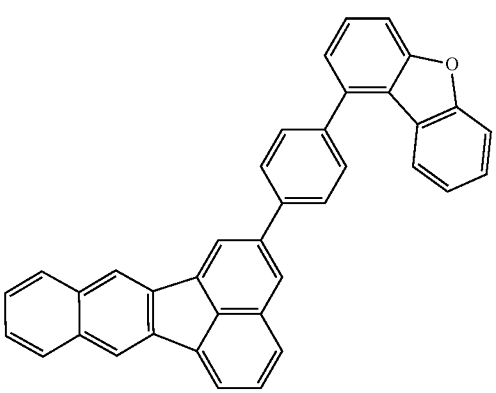

-continued
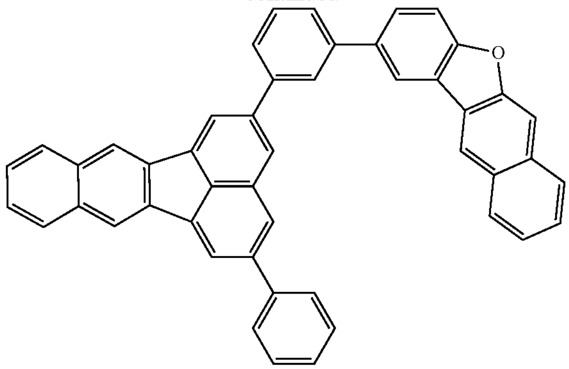
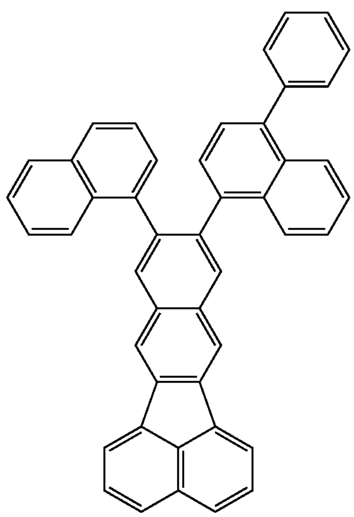
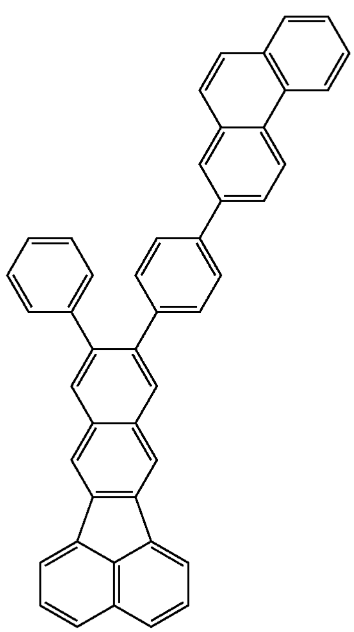
-continued
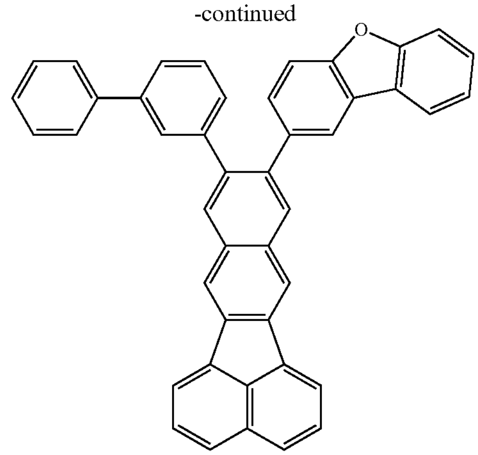
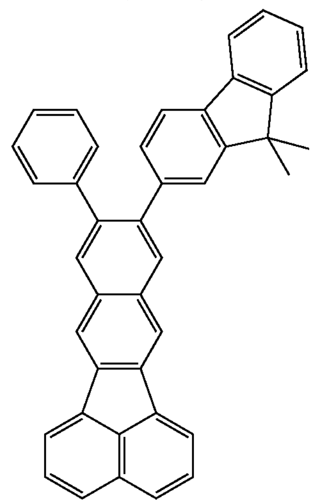
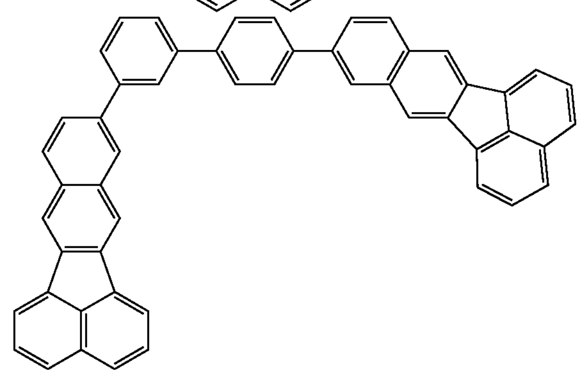
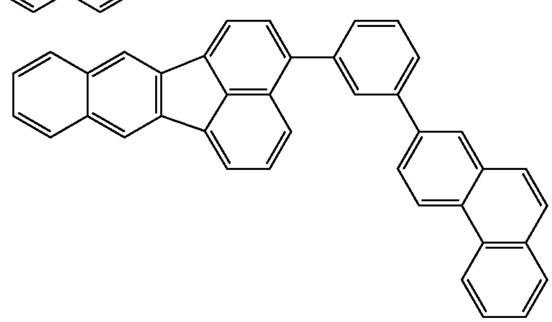
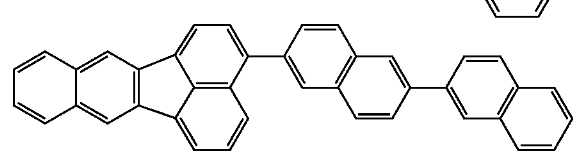

-continued
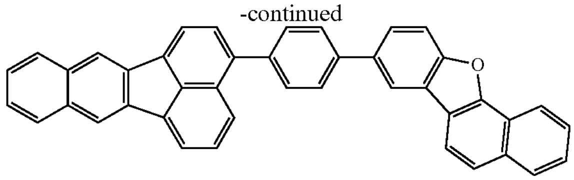
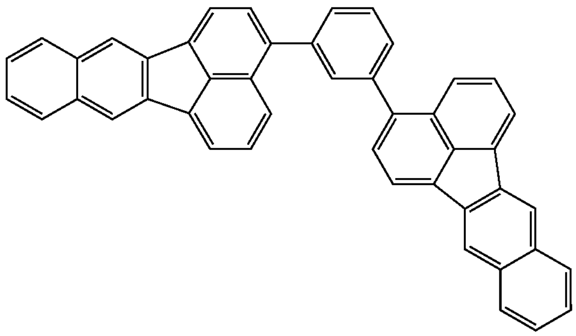
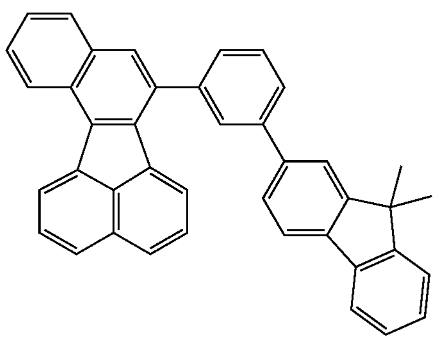
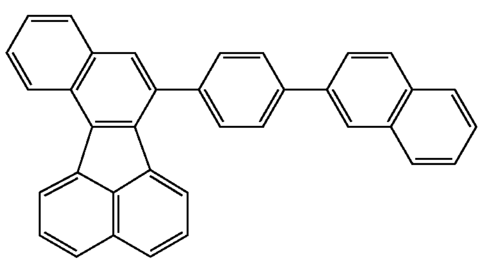
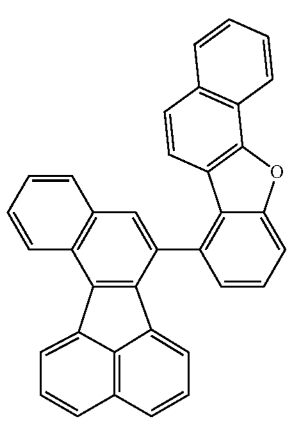
-continued
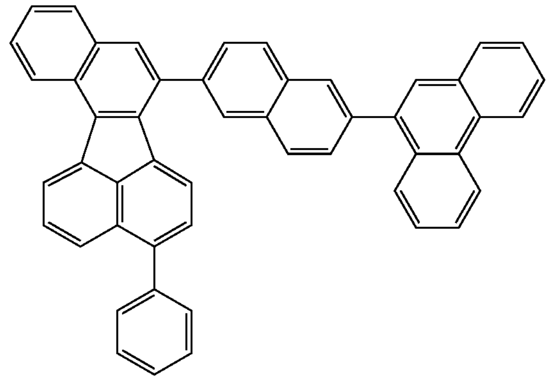
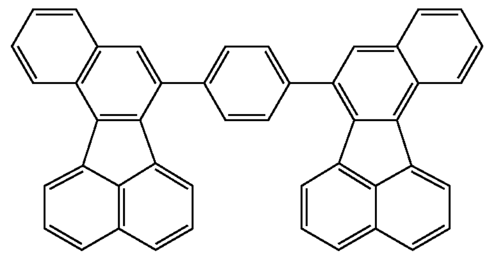
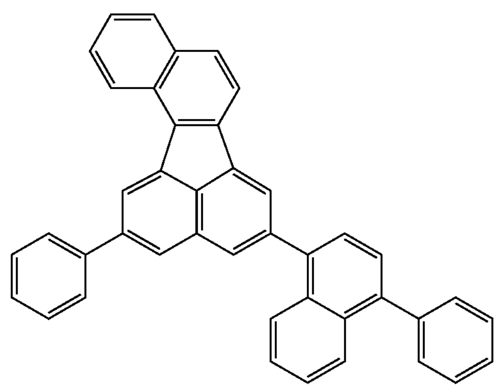
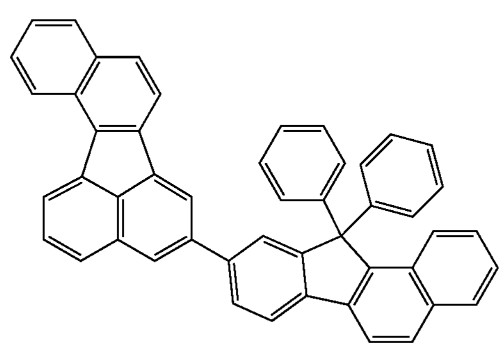

-continued
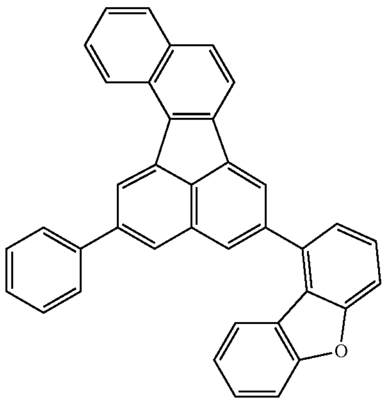
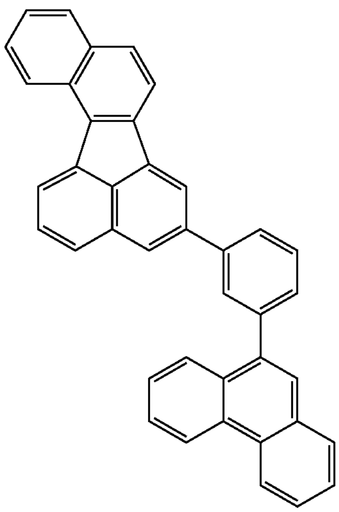
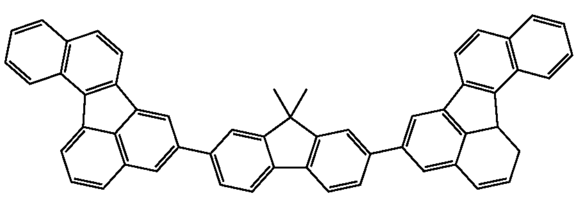
[Formula 342]
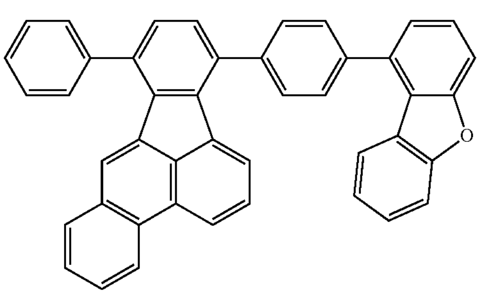
-continued
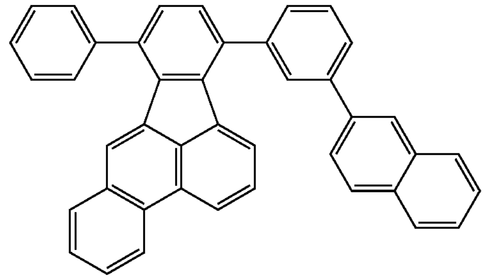
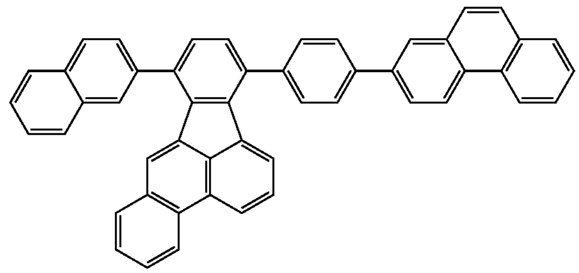
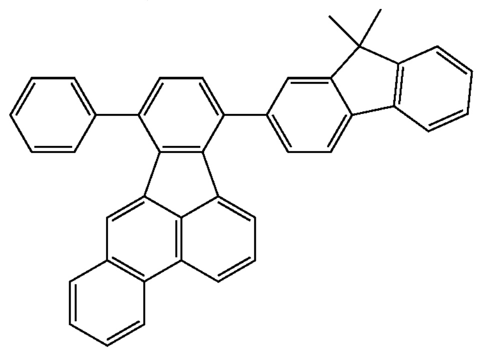
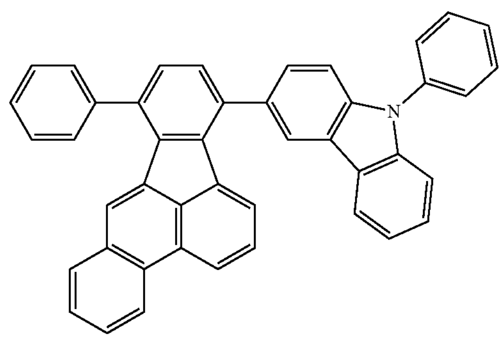
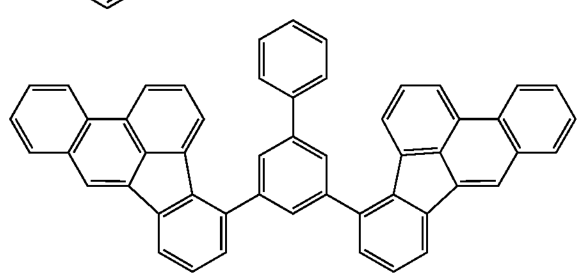
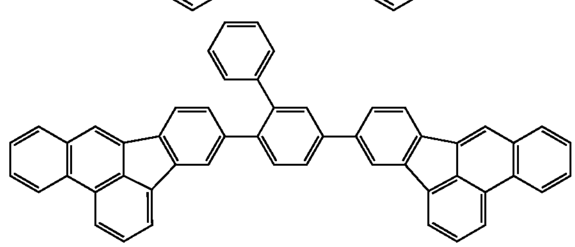

-continued
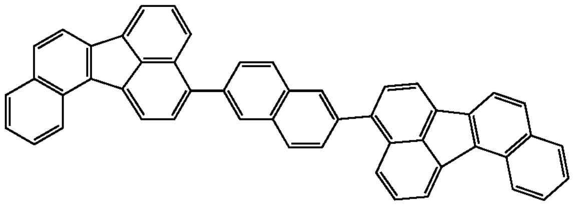
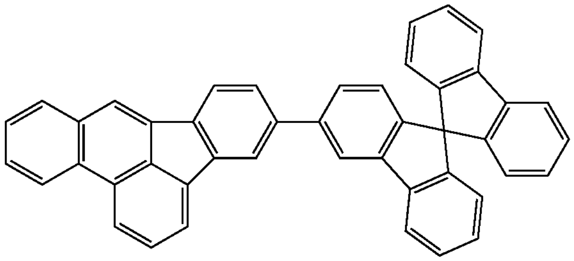
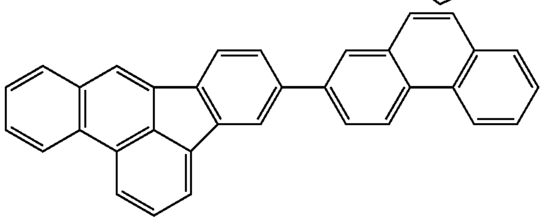
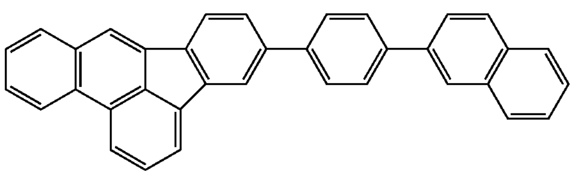
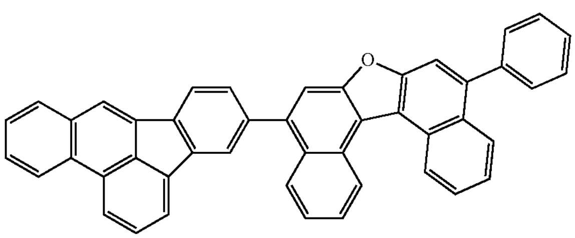
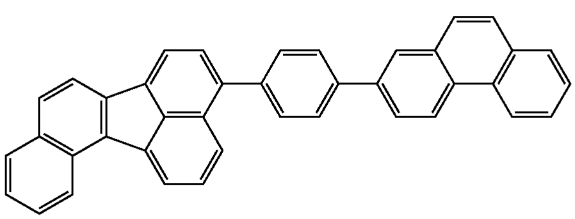
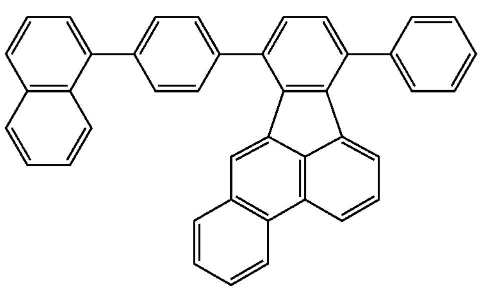
-continued
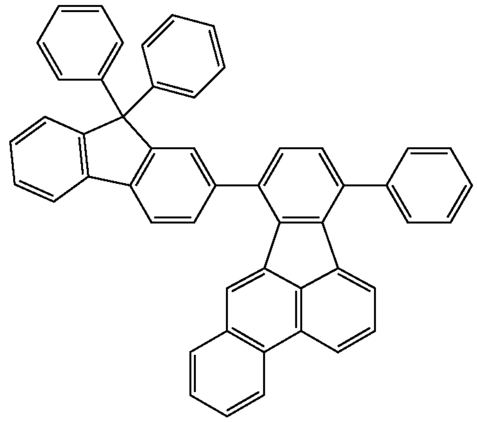
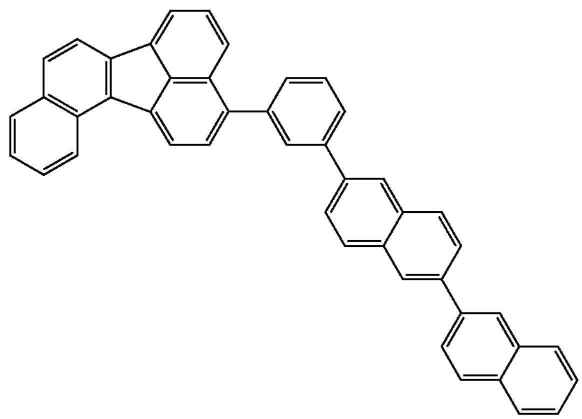
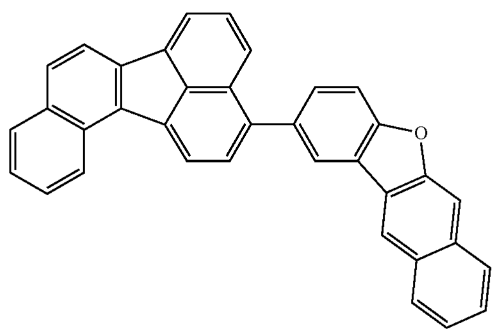
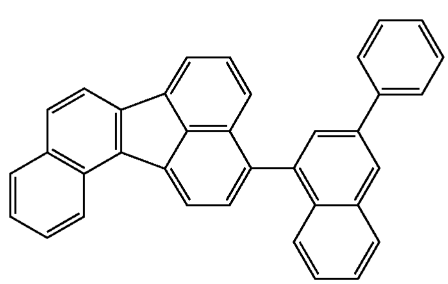

-continued
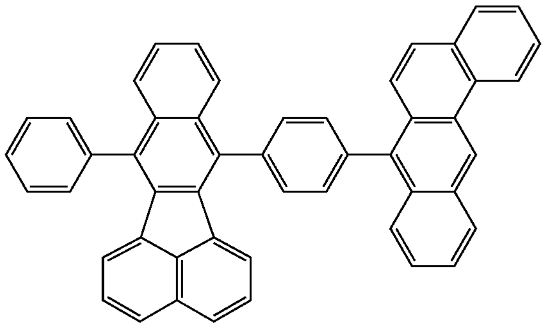
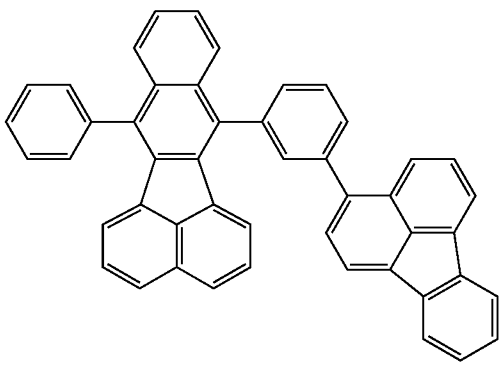
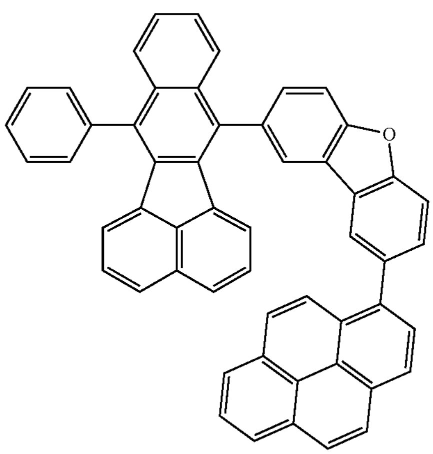
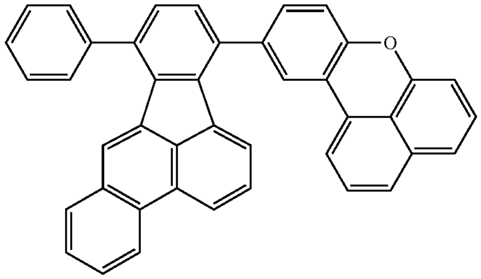
-continued
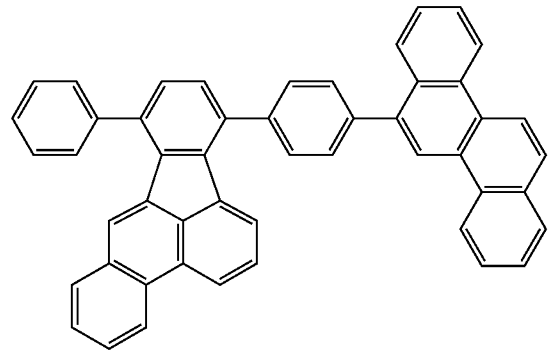
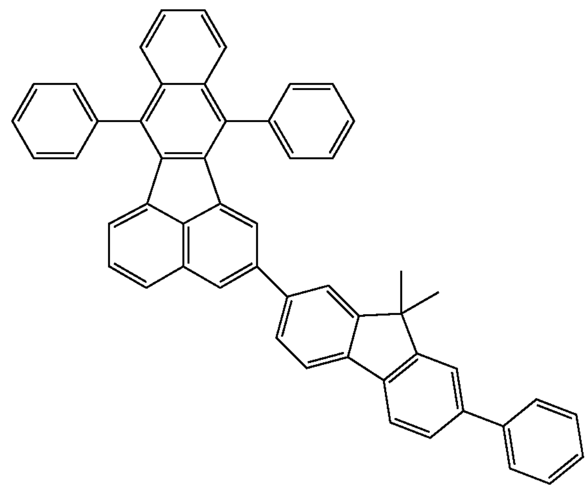
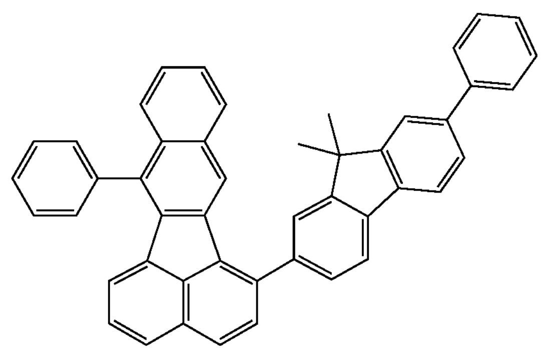
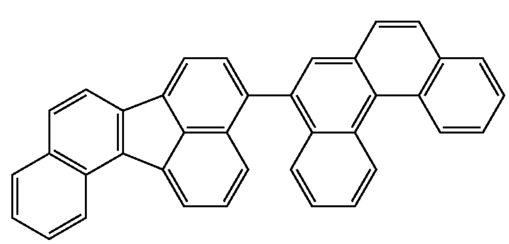

-continued
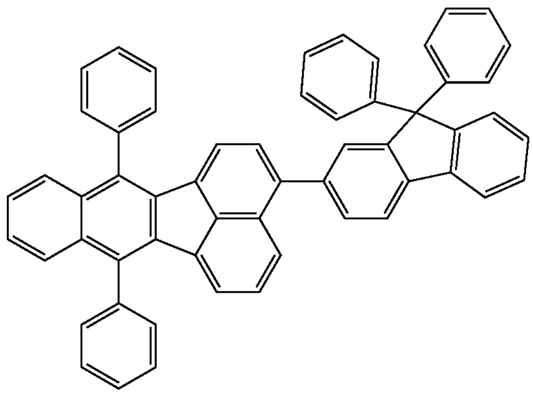
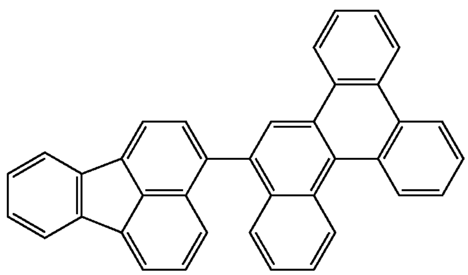
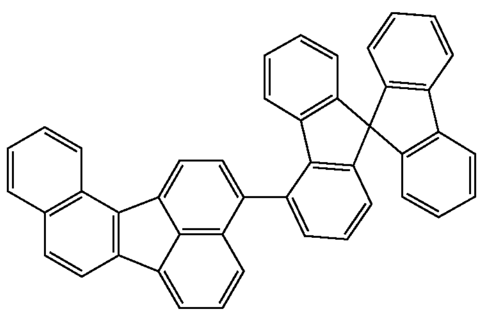
[Formula 343]
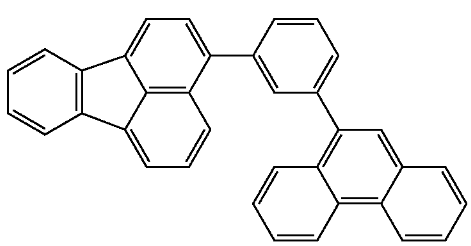
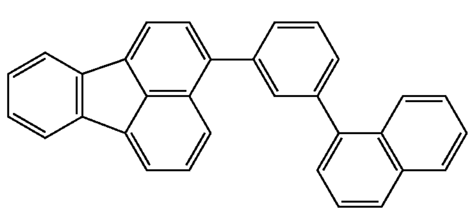
-continued
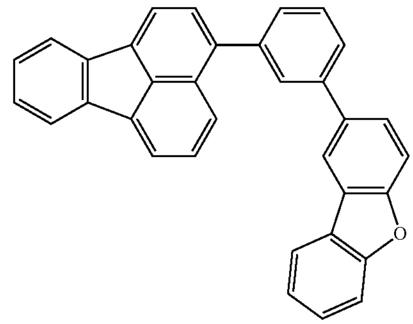
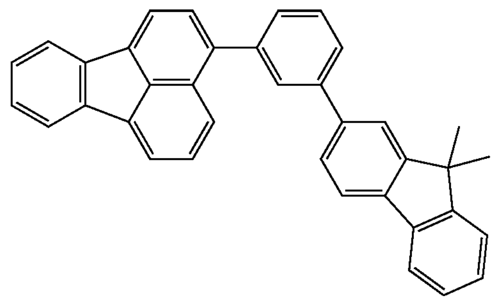
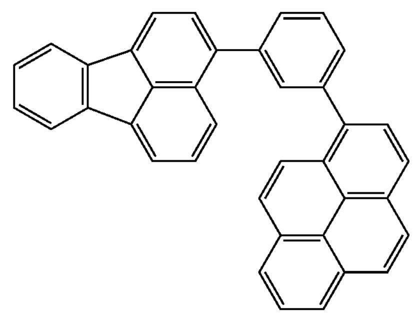
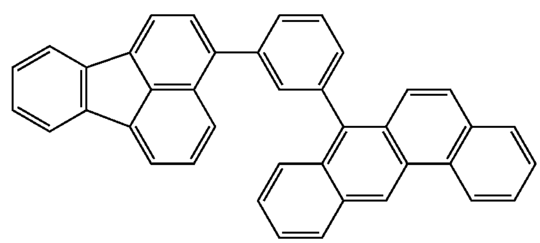
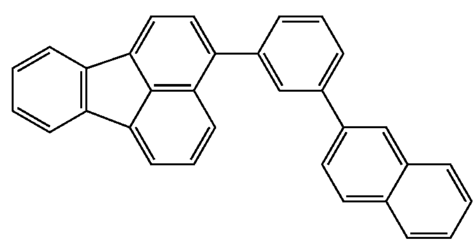
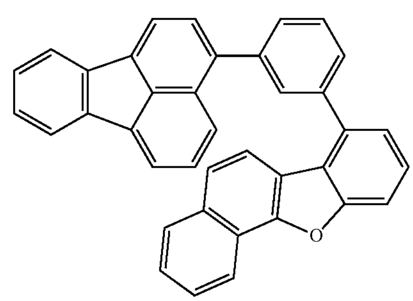

-continued
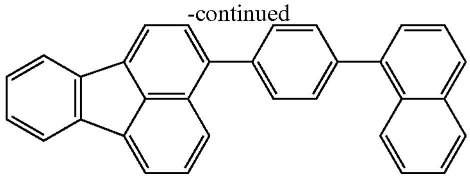
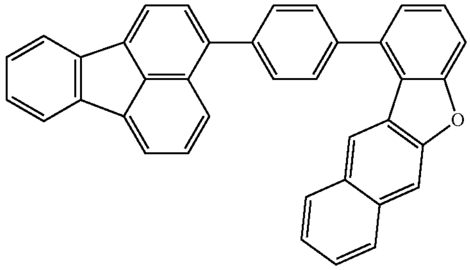
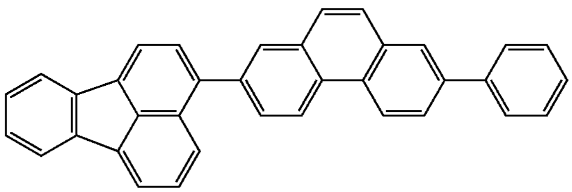
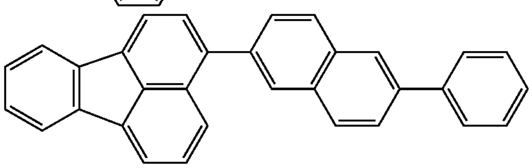
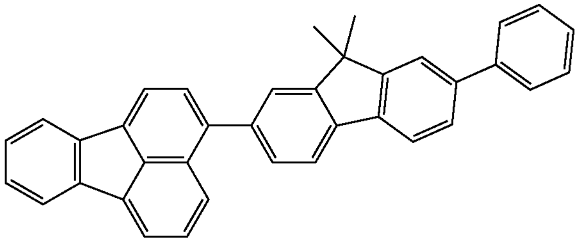
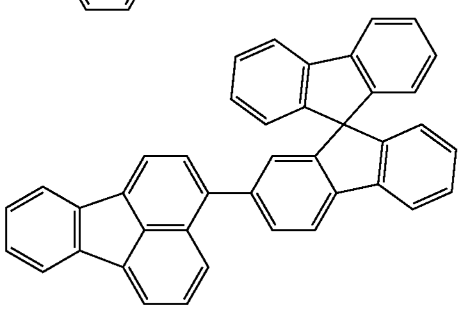
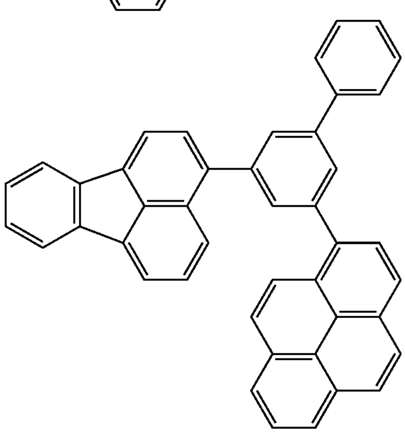
-continued
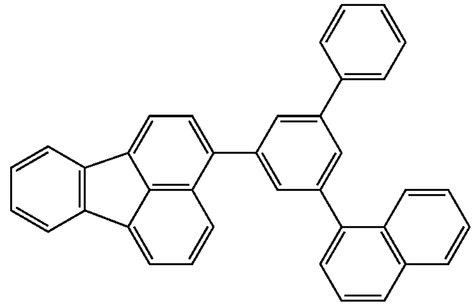
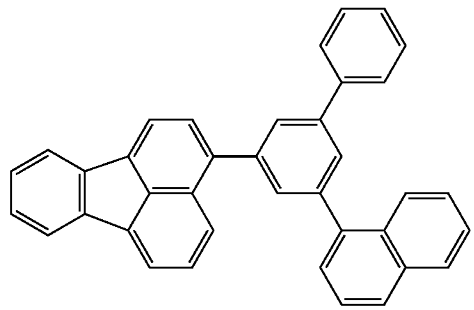
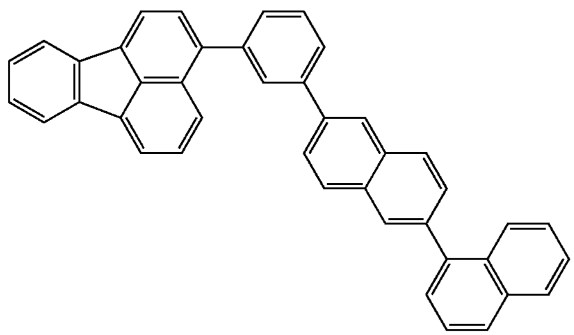
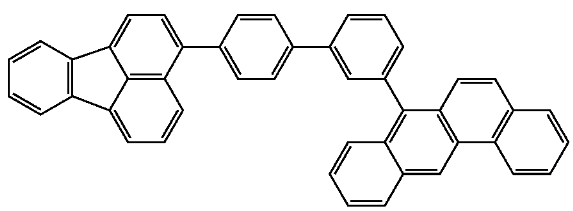
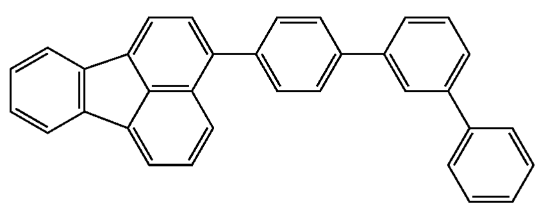
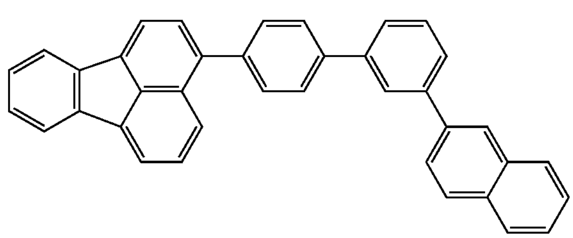

-continued
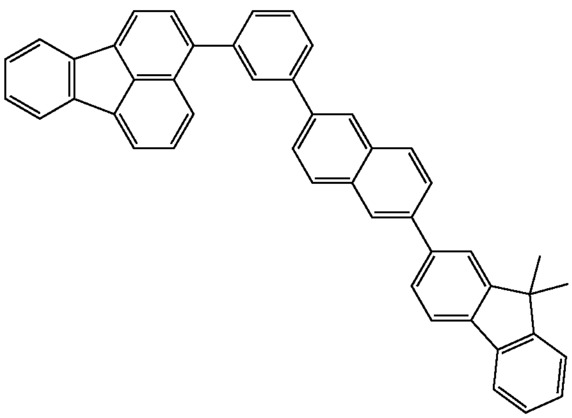
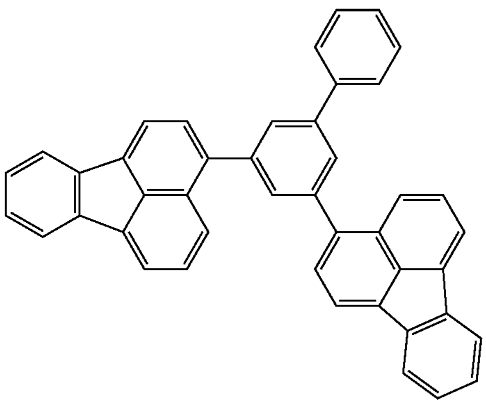
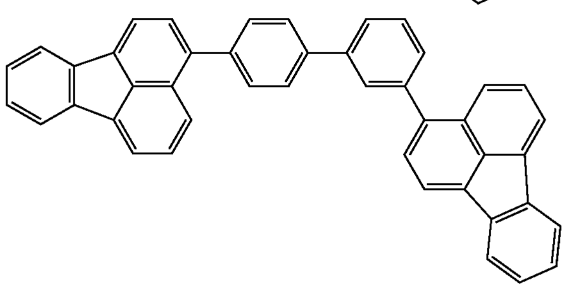
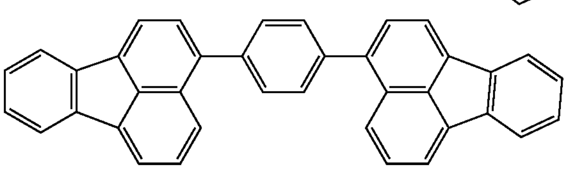
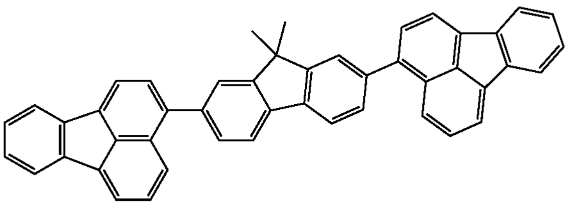
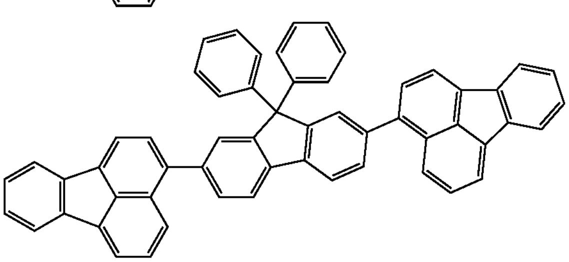
-continued
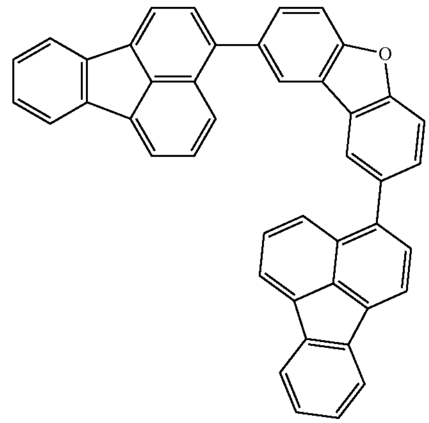
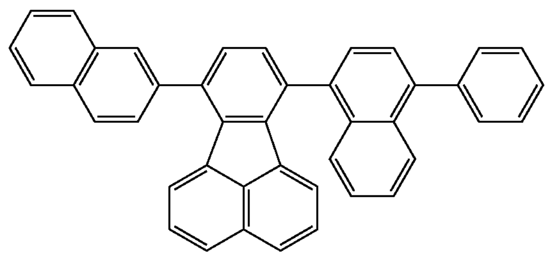
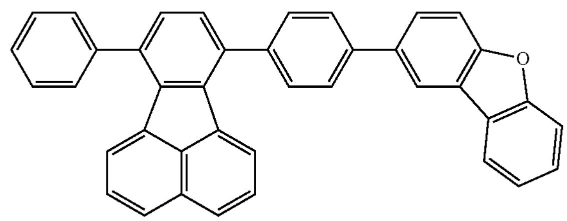
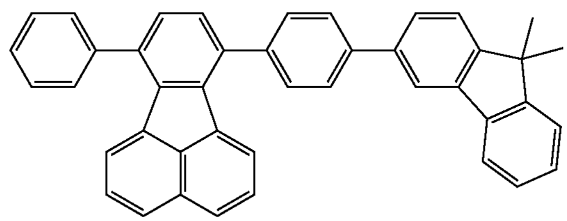
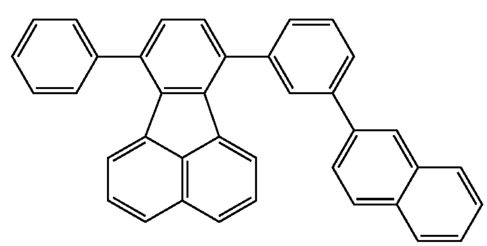
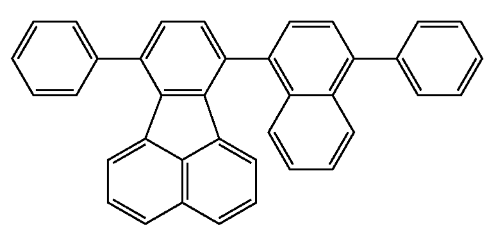

-continued
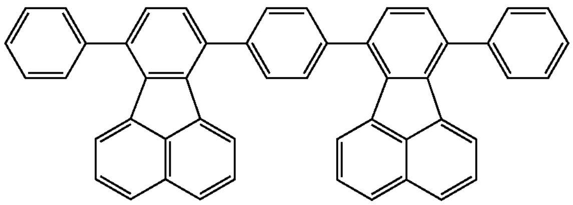
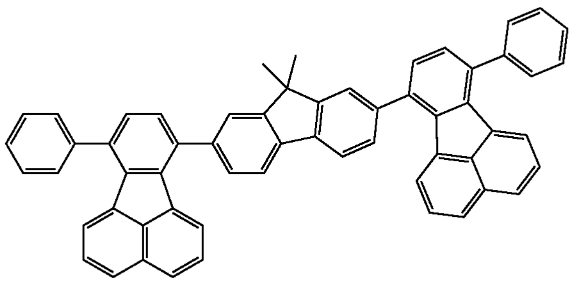
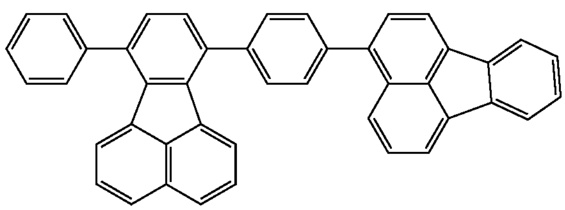
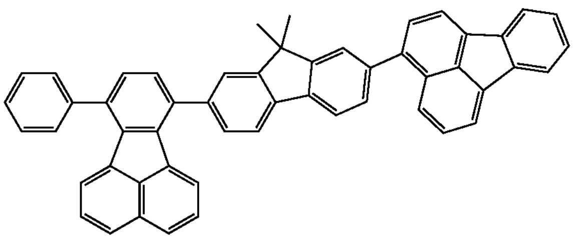
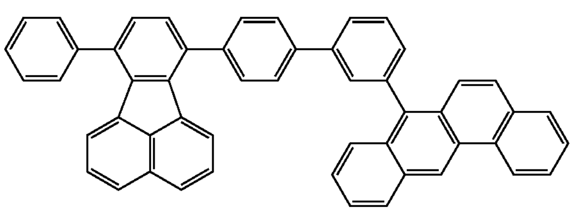
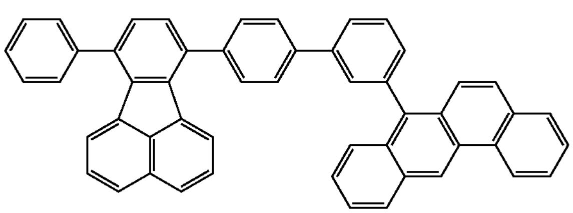
-continued
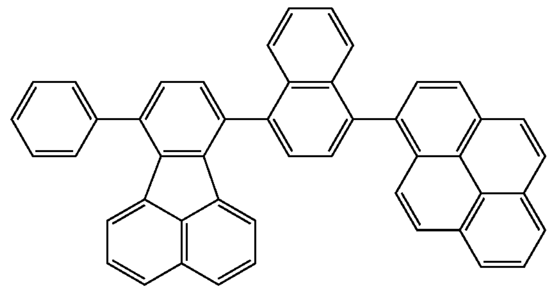
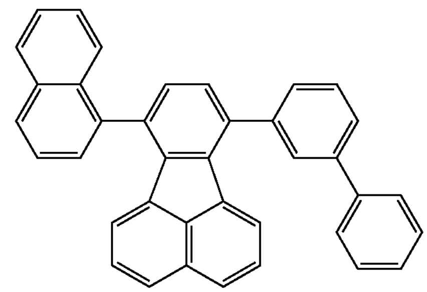
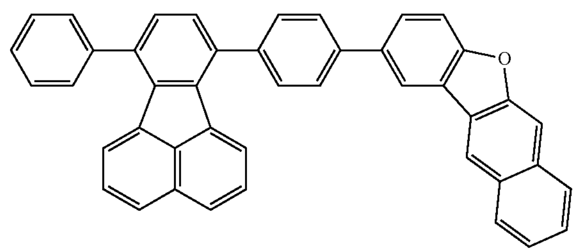
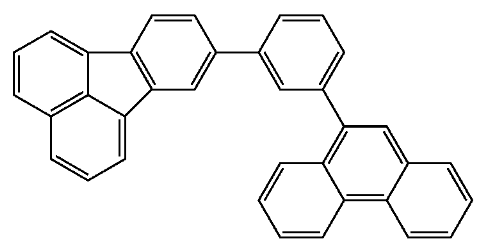
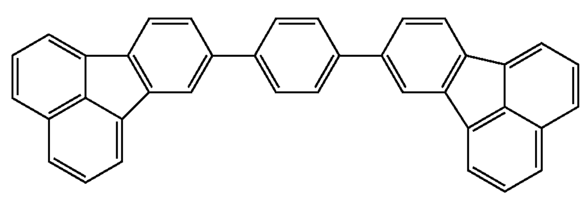
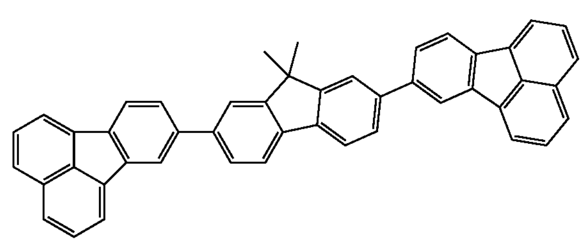

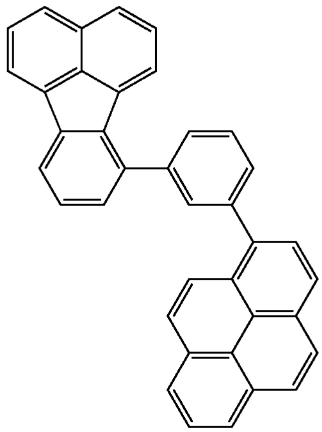
[Formula 344]
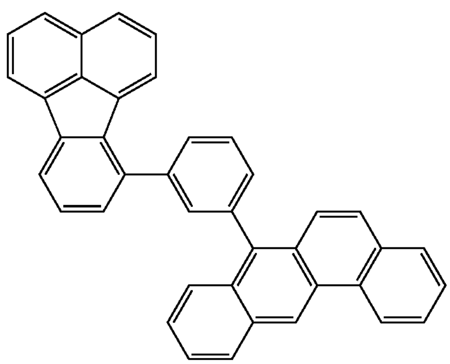
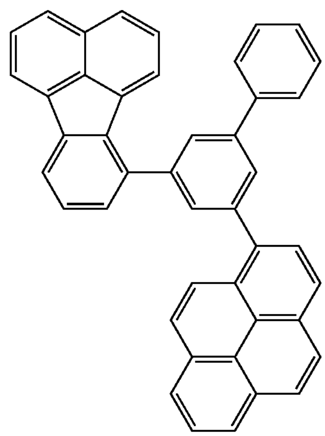
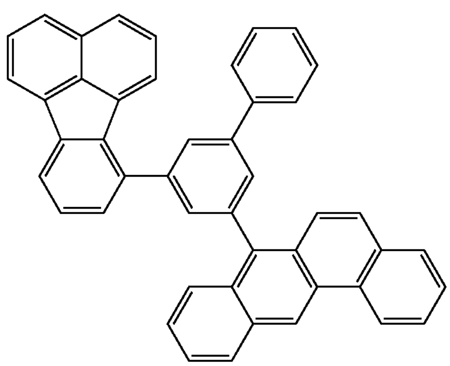
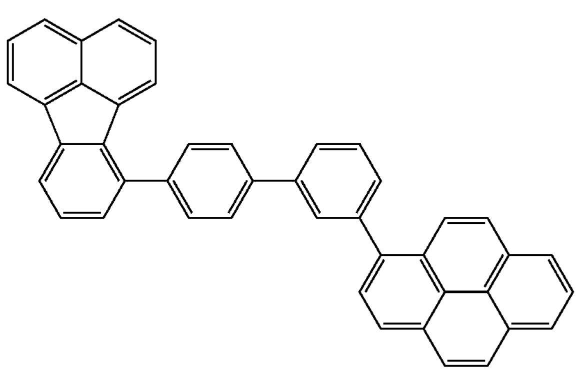
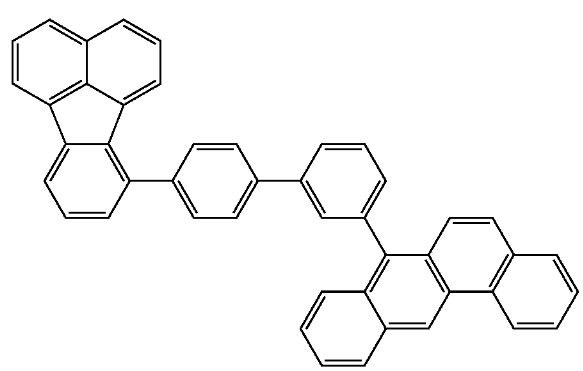

-continued
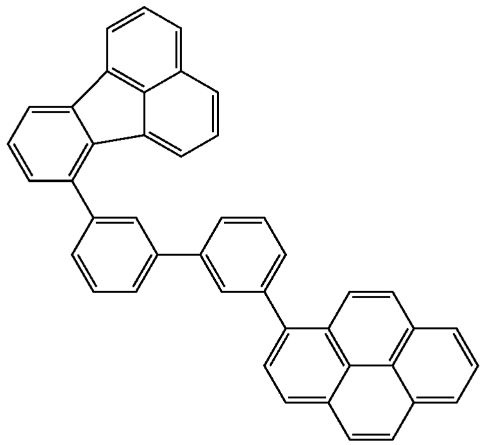
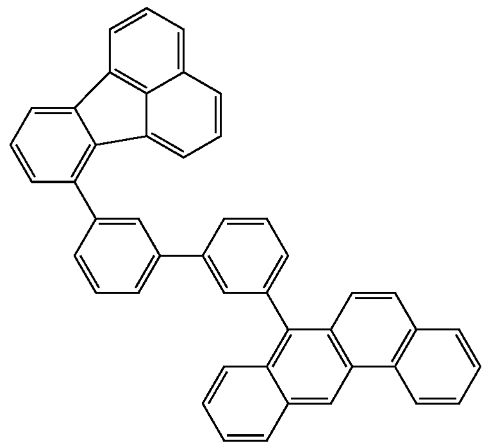
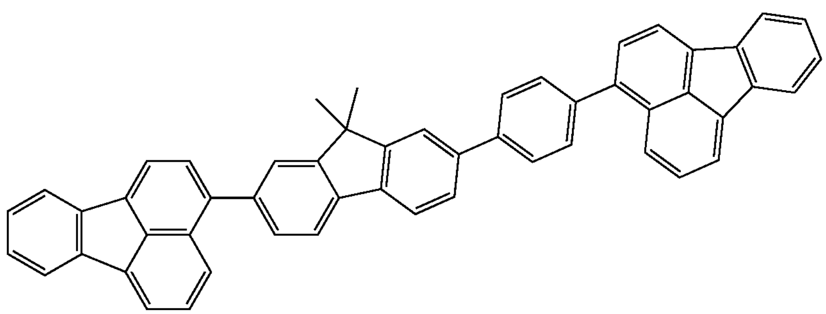
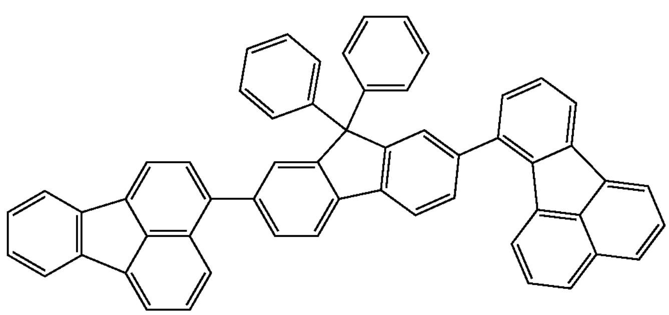
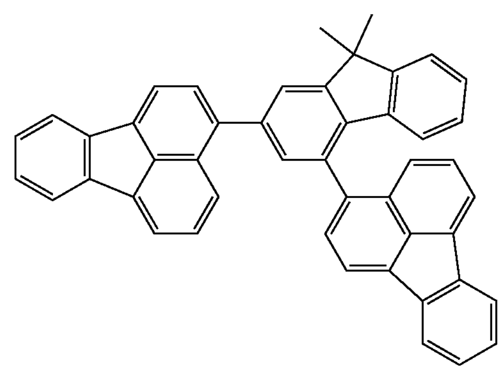
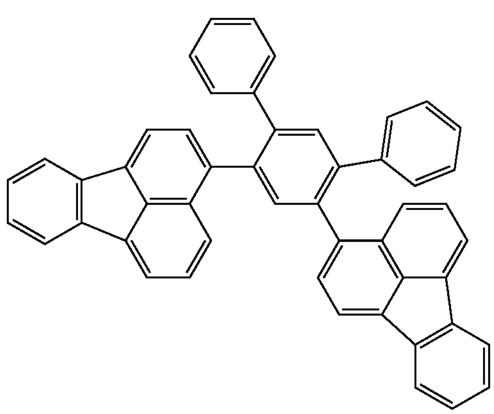
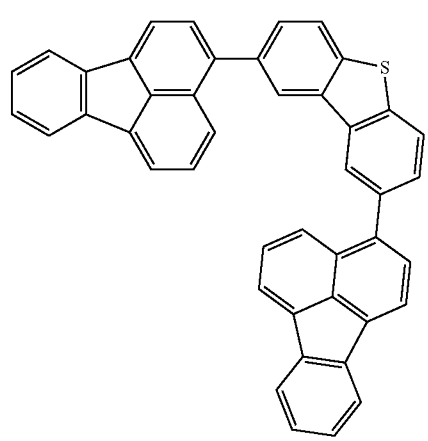

-continued
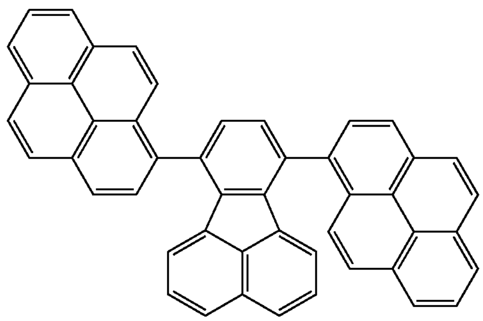
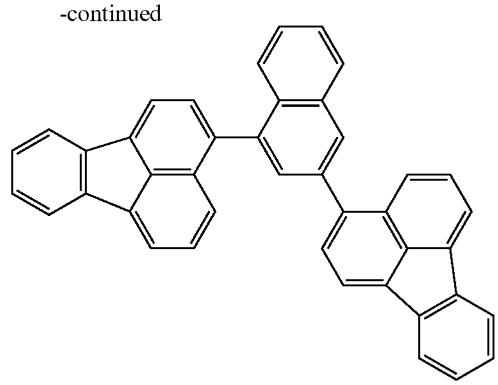
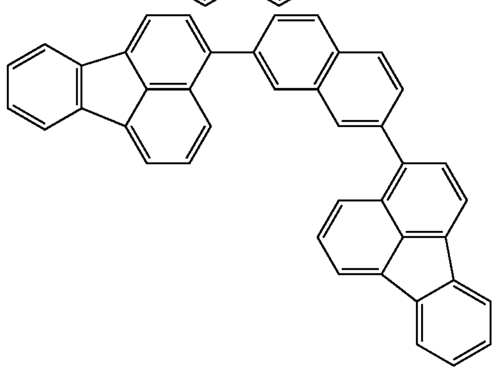
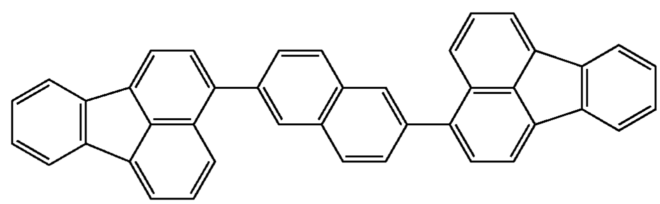
[Formula 345]
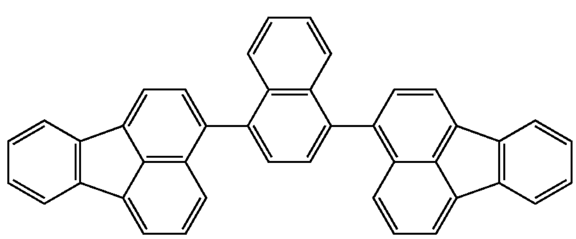
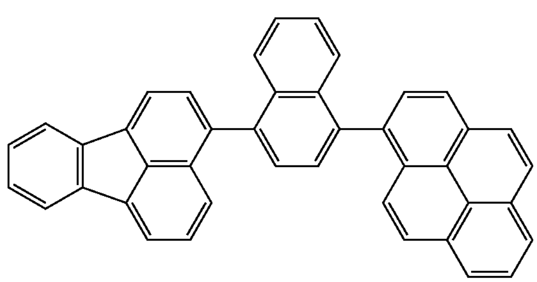
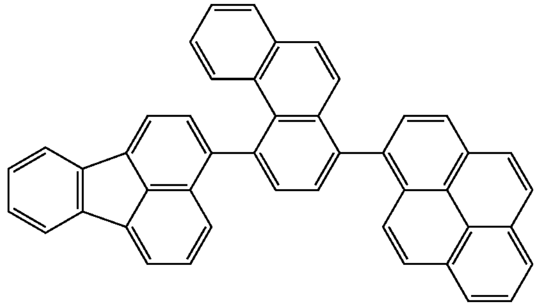
-continued
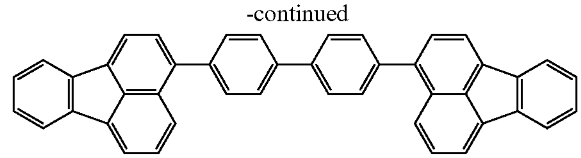
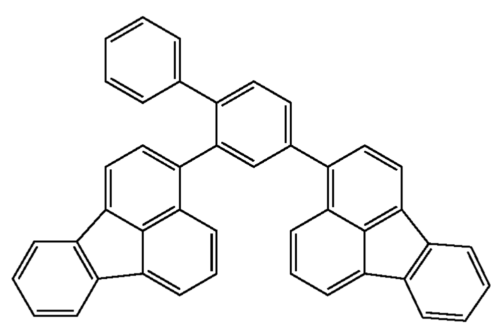
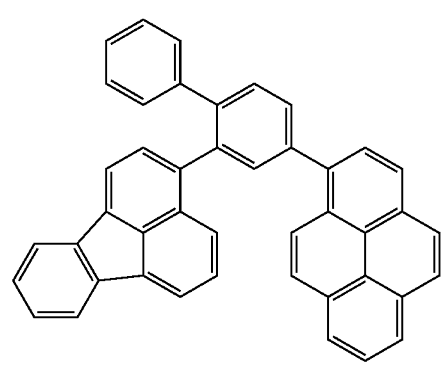

-continued
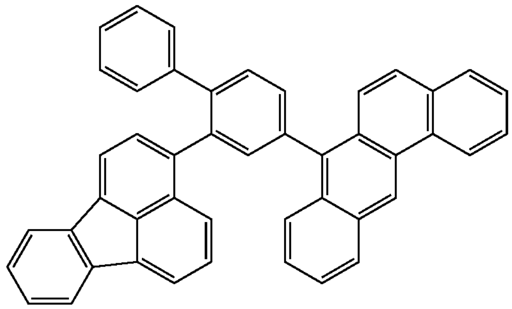
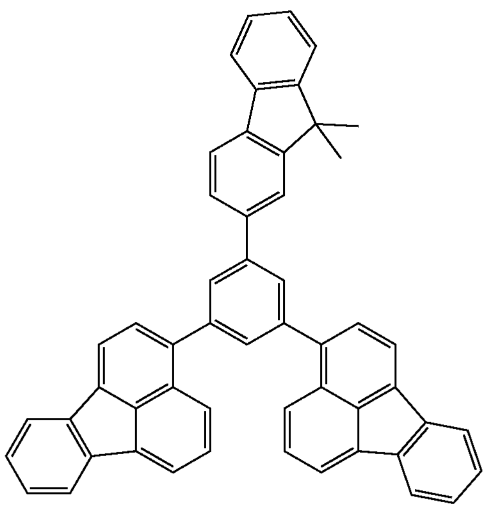
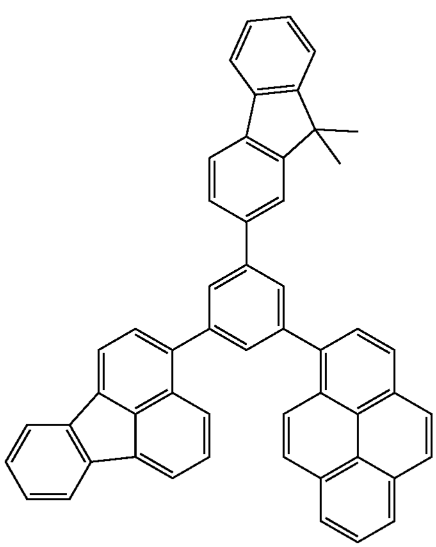
-continued
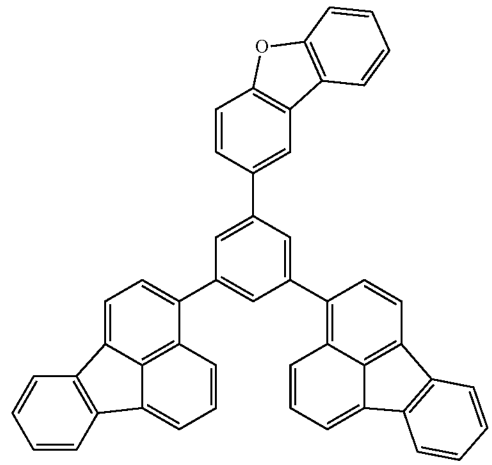
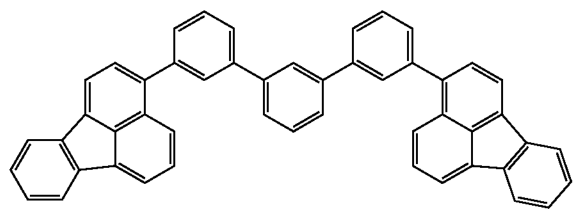
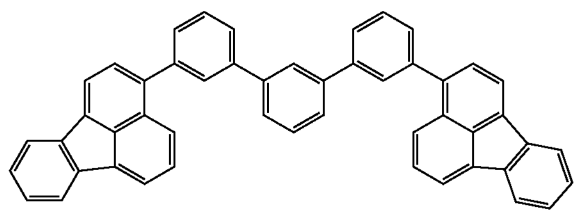
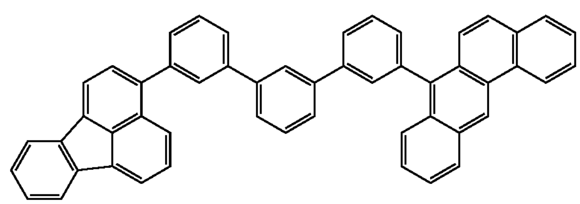
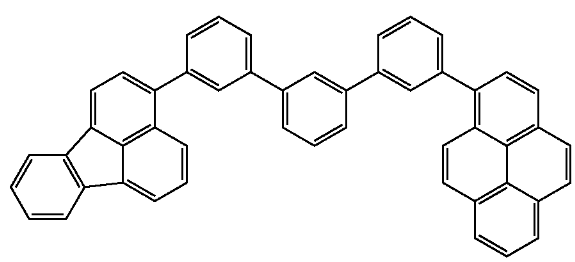
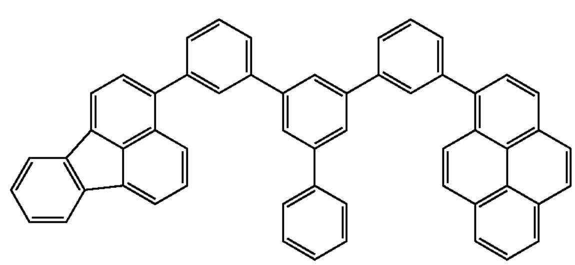

[Formula 346]
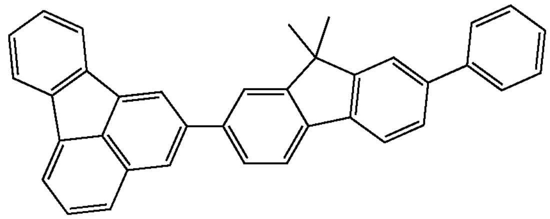
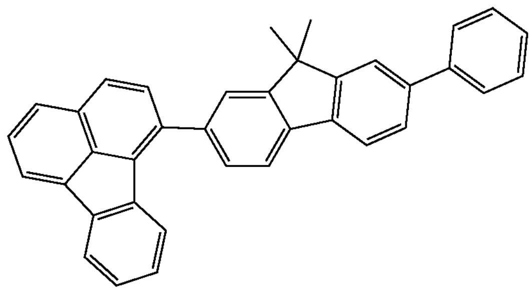
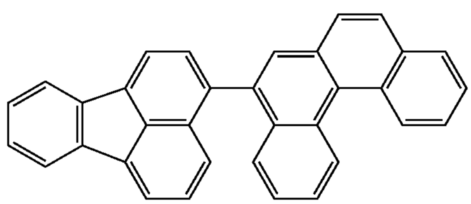
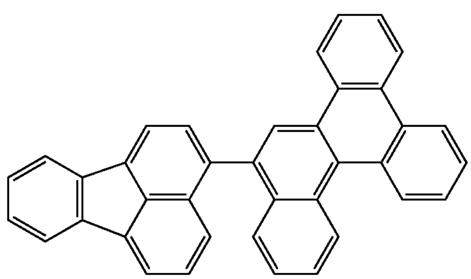
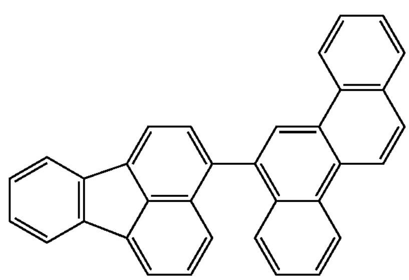
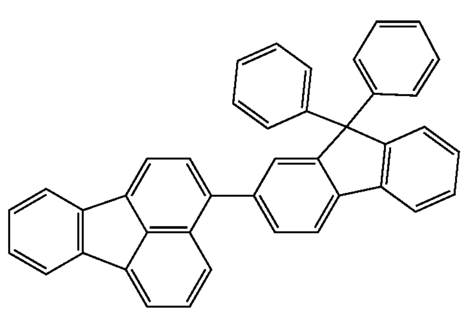
-continued
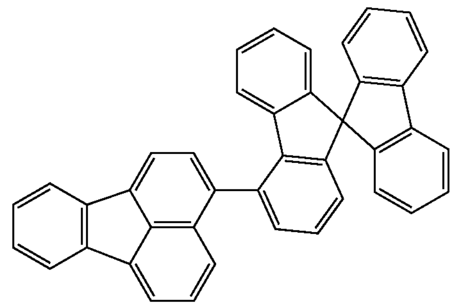
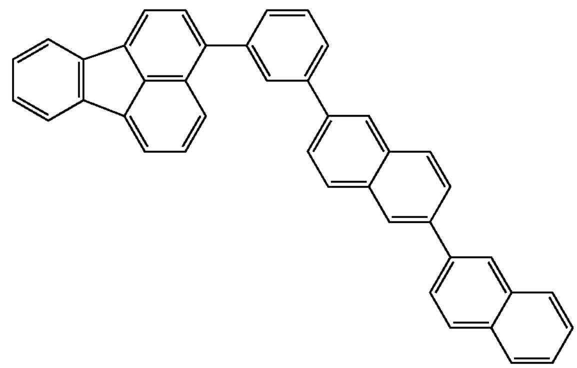
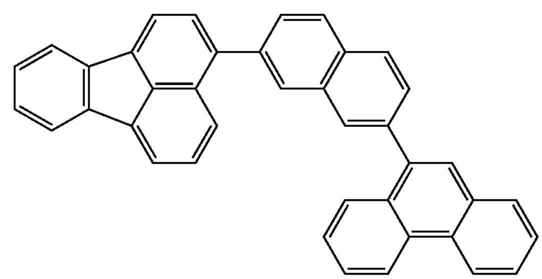
[Formula 347]
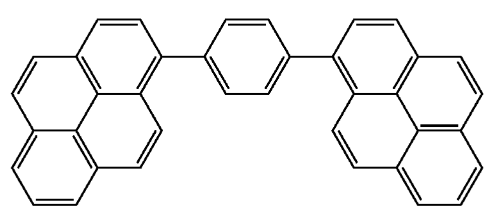
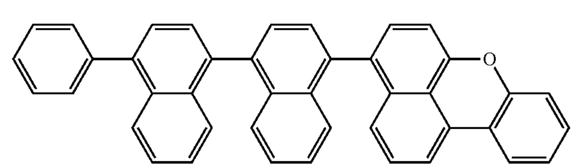

-continued
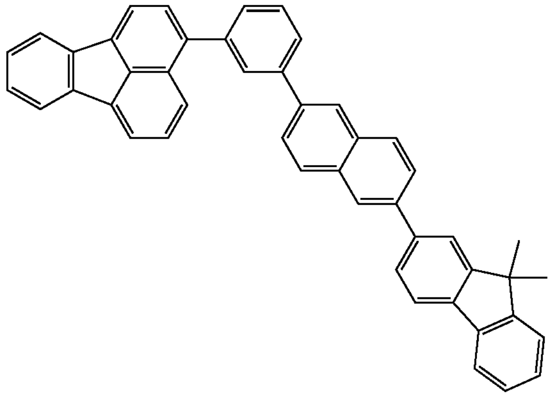
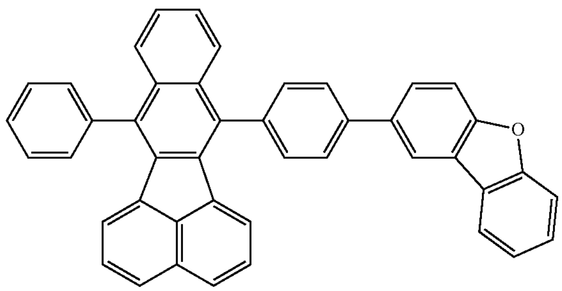
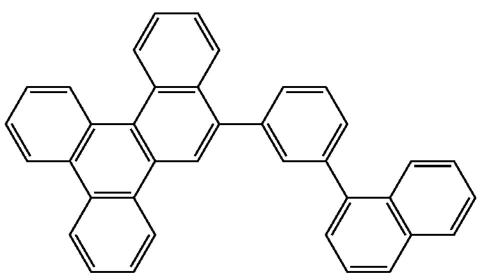
[Formula 348]
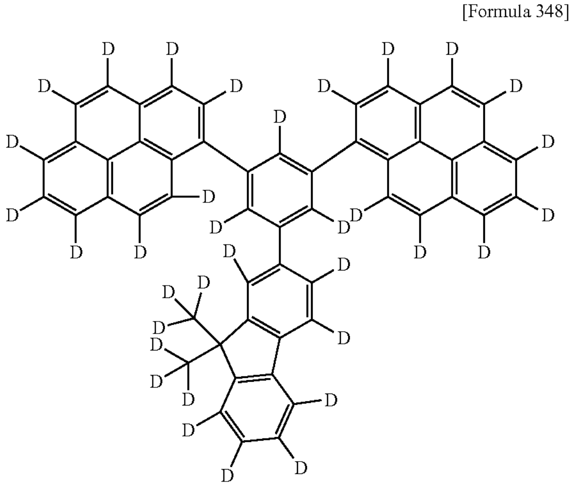
-continued
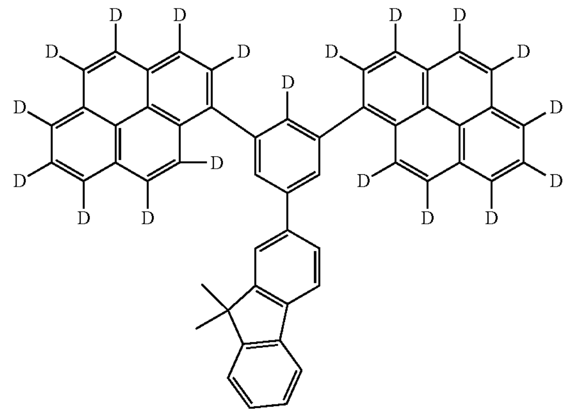
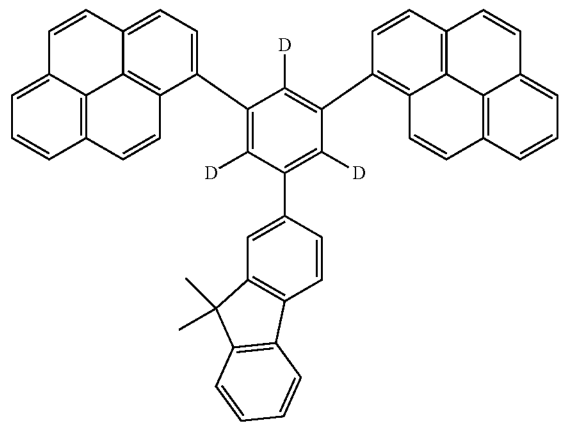
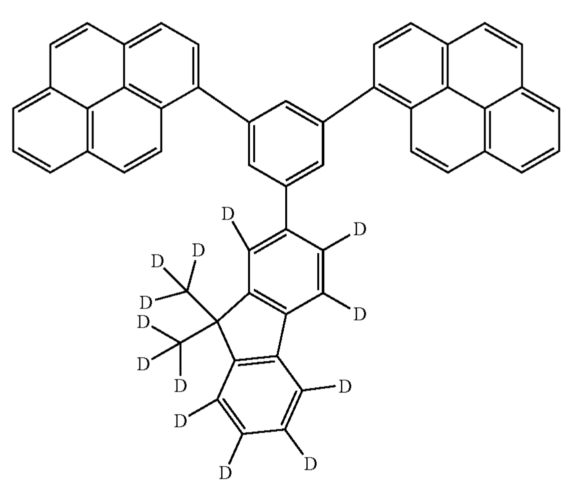

-continued
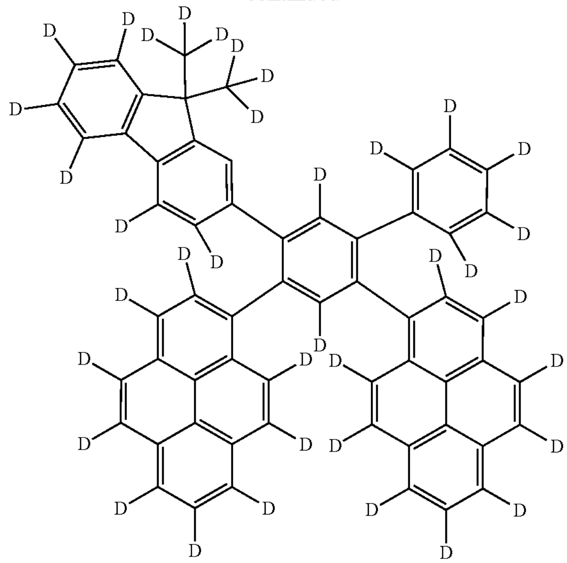
-continued
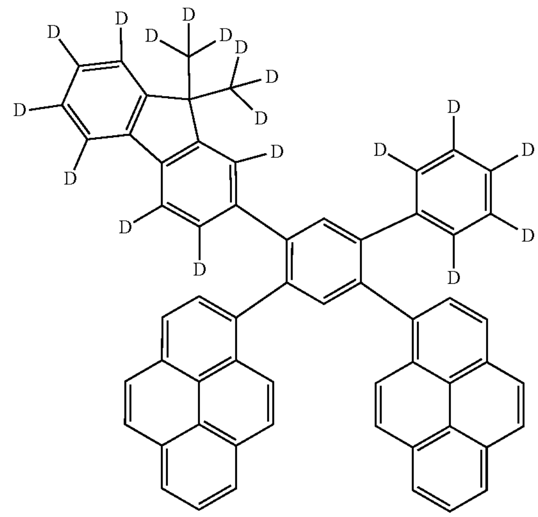
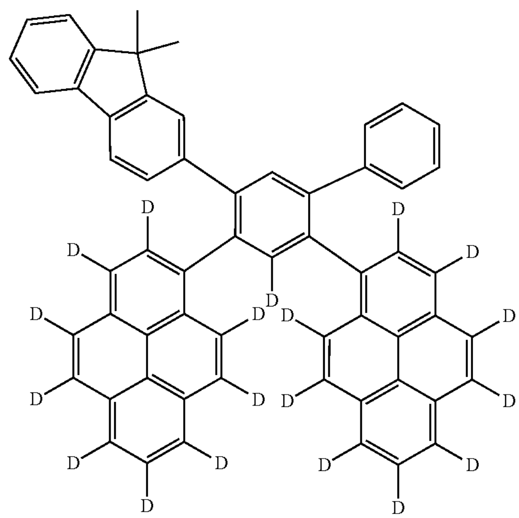
[Formula 349]
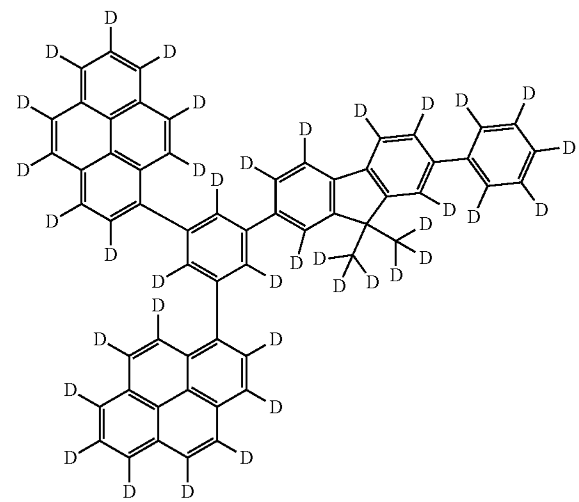
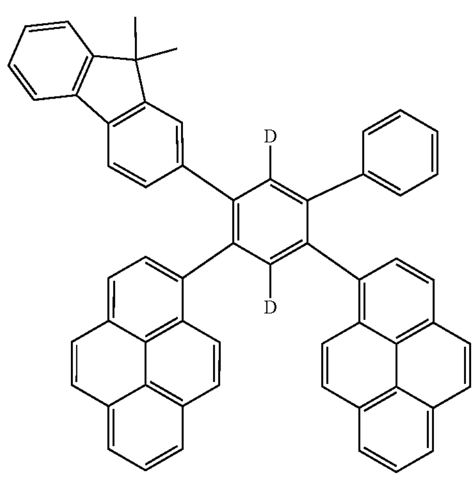
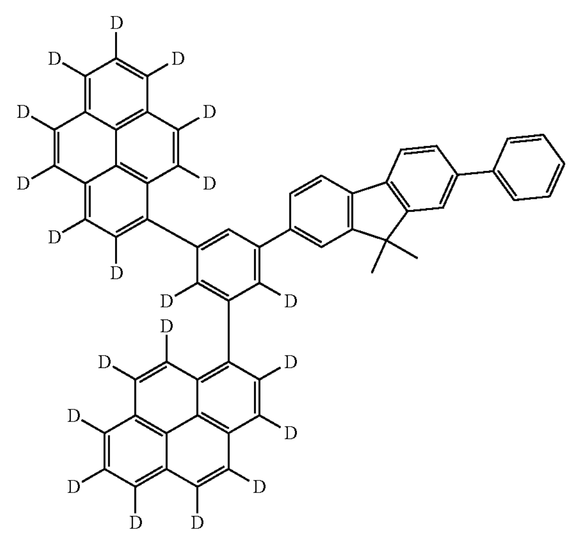

-continued
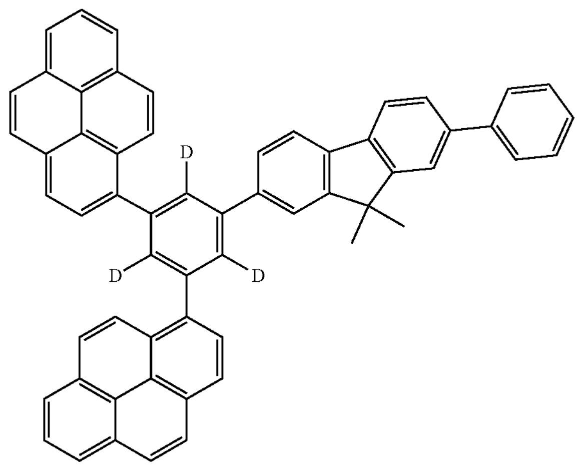
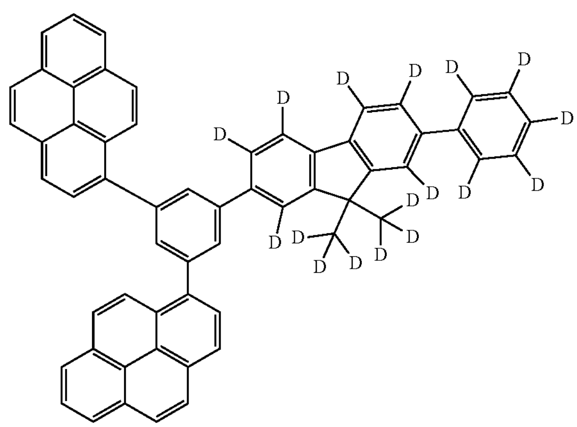
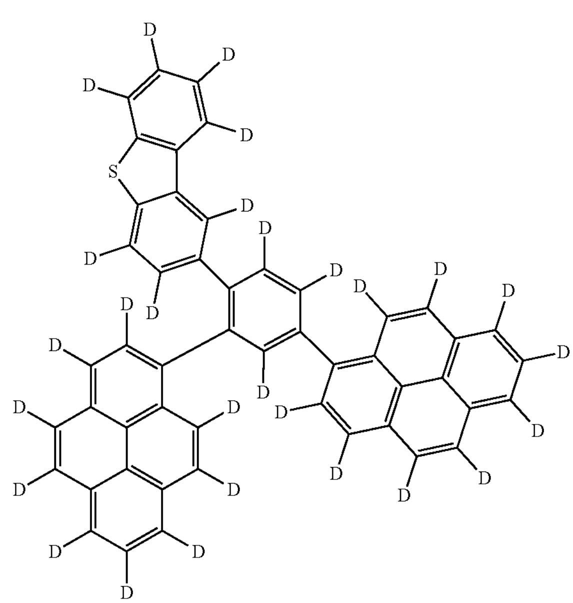
-continued
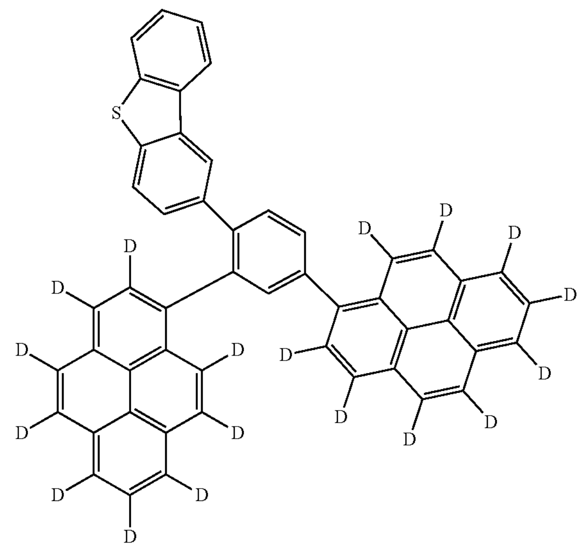
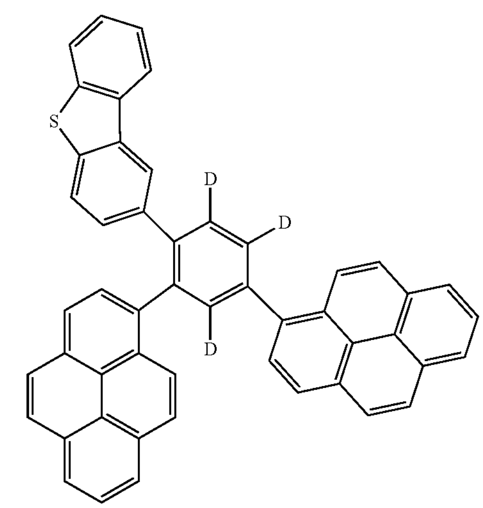
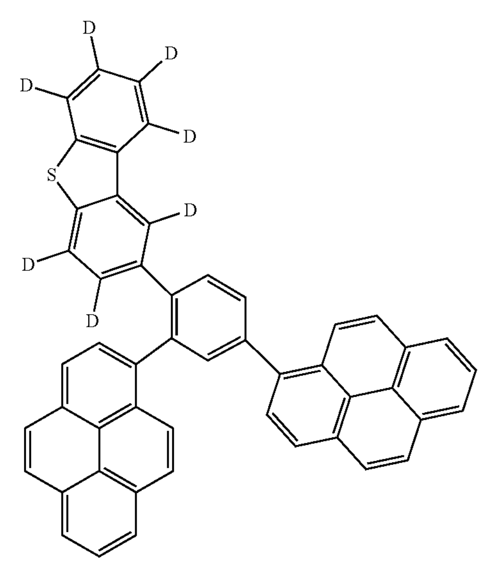

[Formula 350]
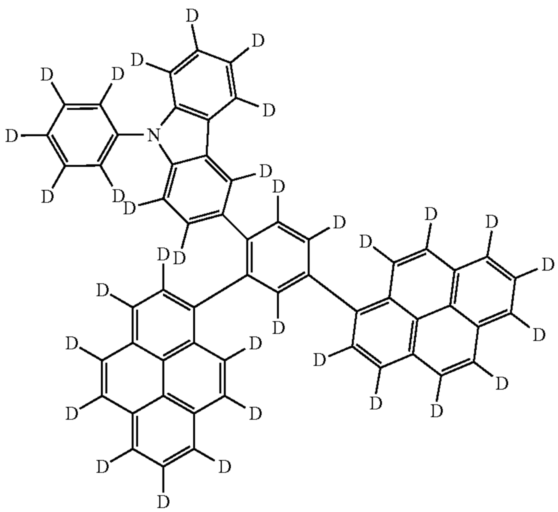
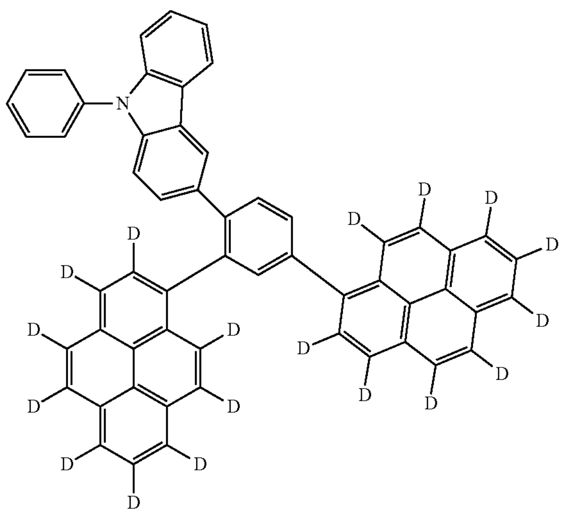
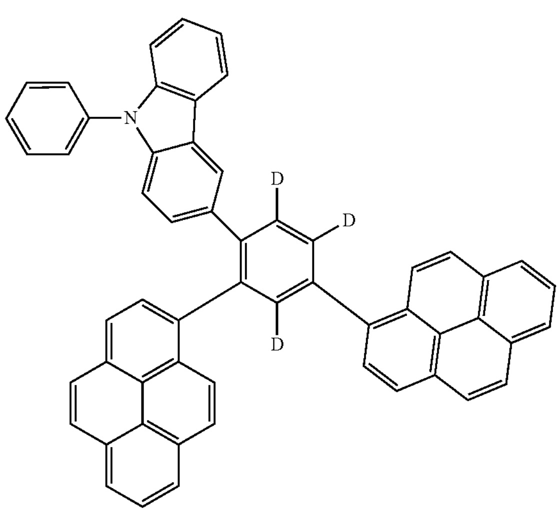
-continued
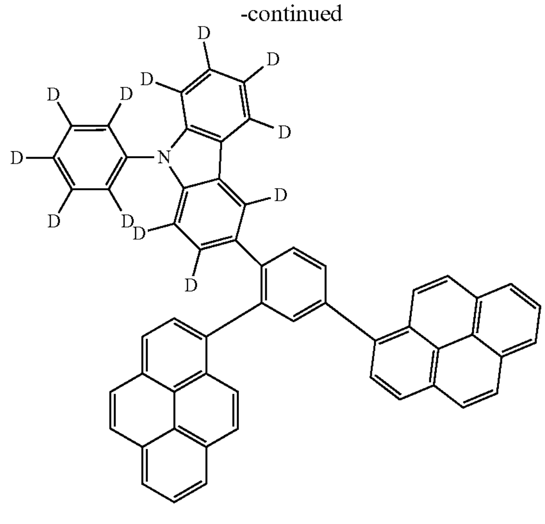
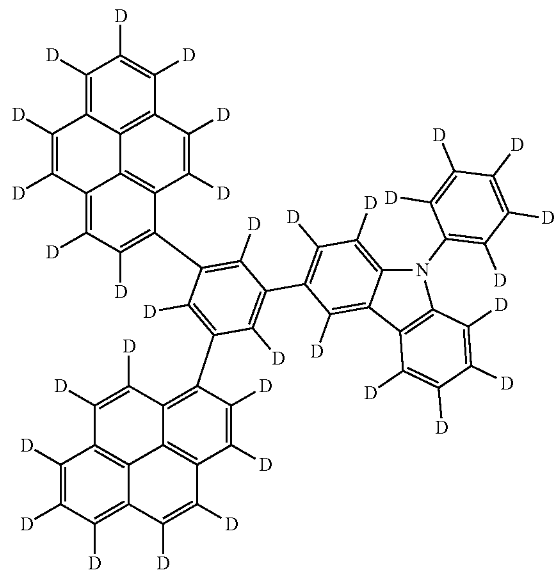
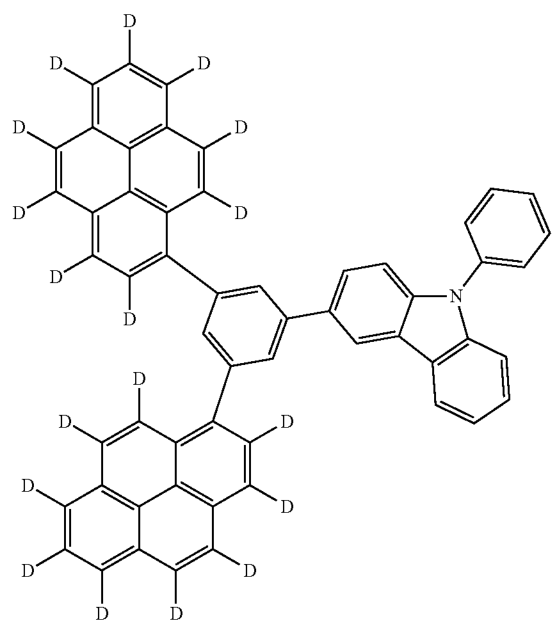

-continued
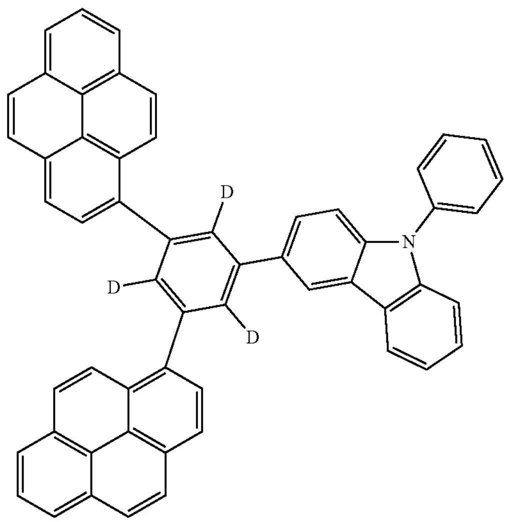
[Formula 351]
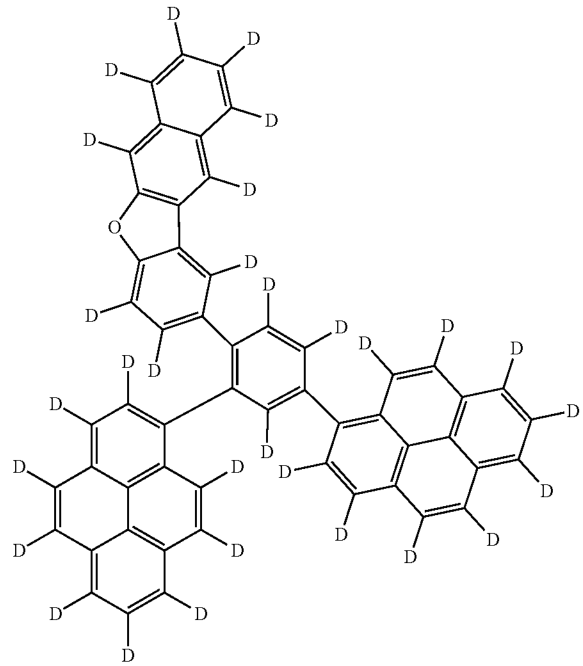
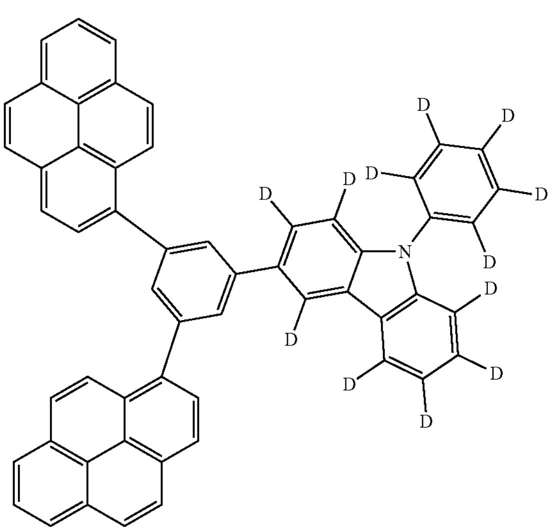
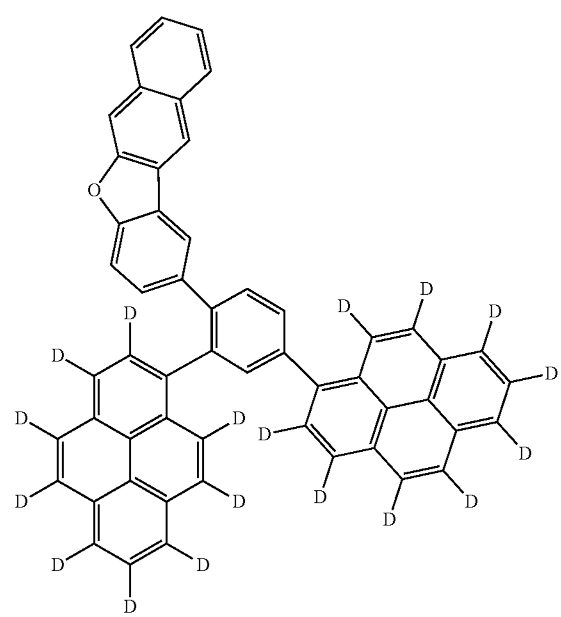

-continued
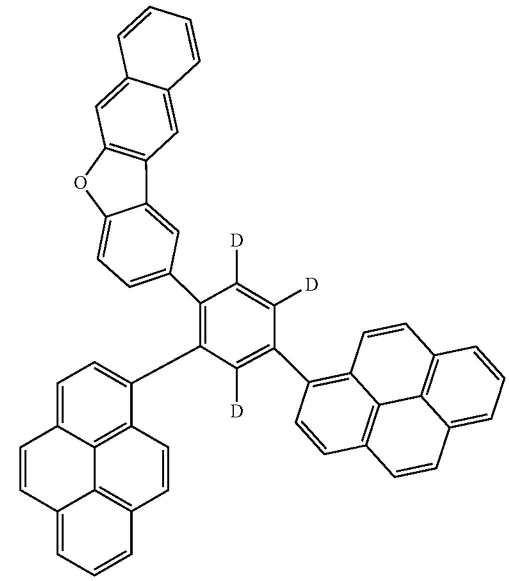
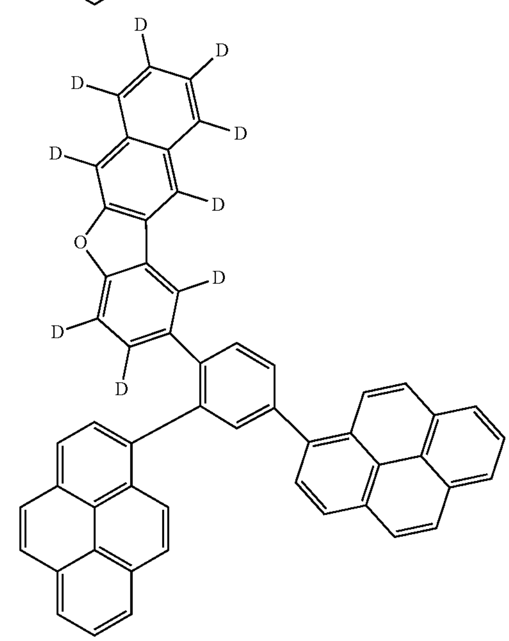
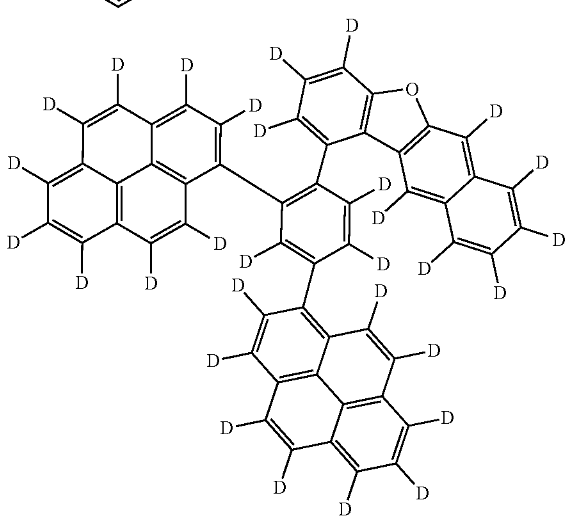
-continued
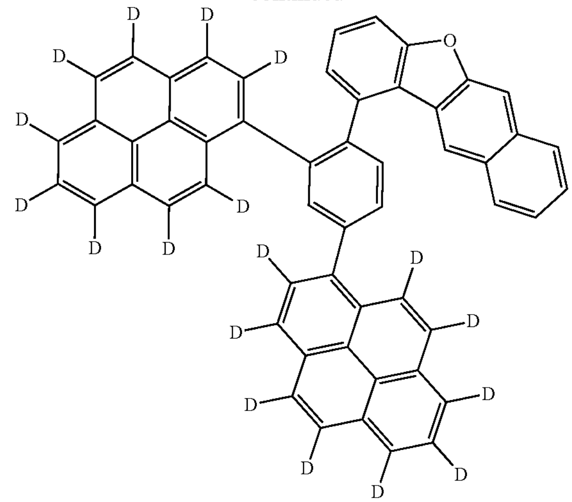
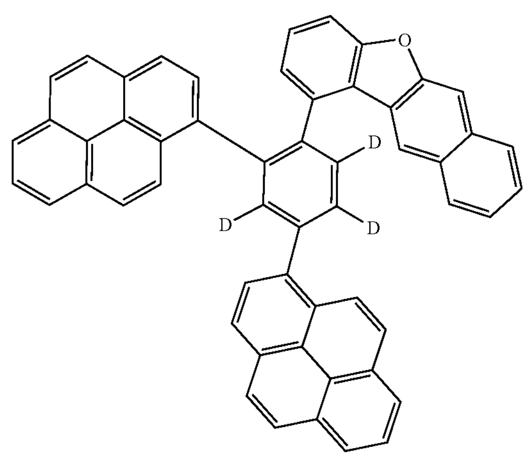
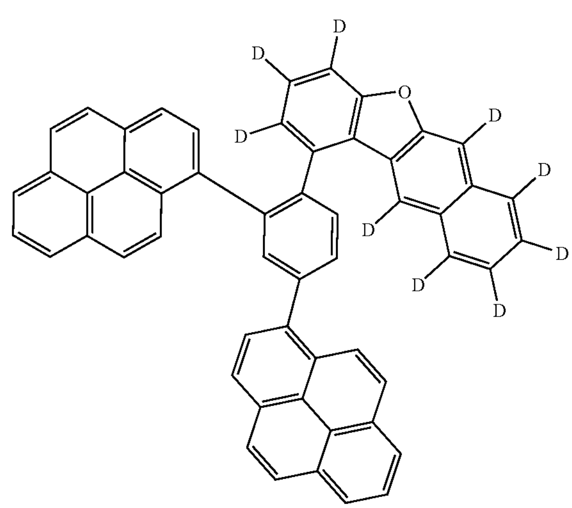

-continued
[Formula 352]
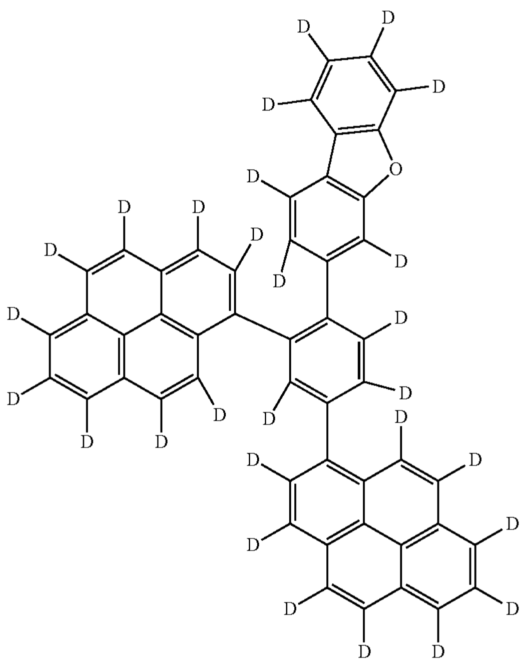
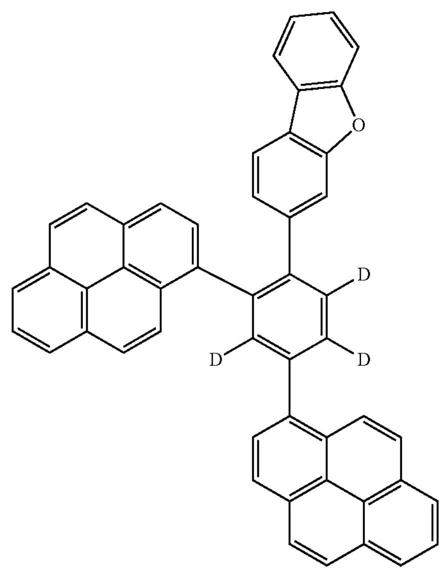
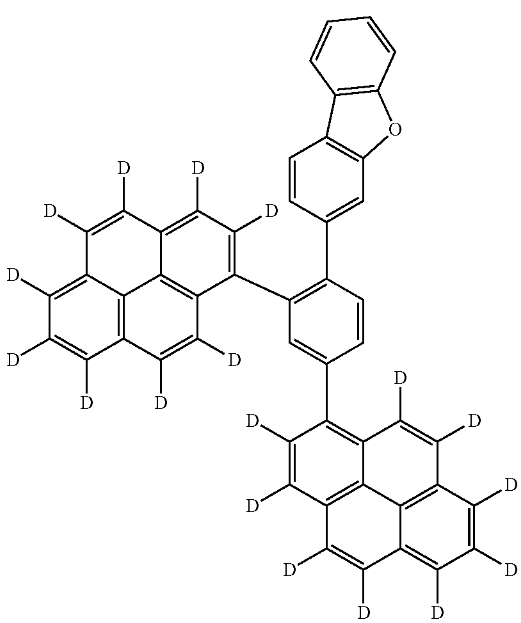
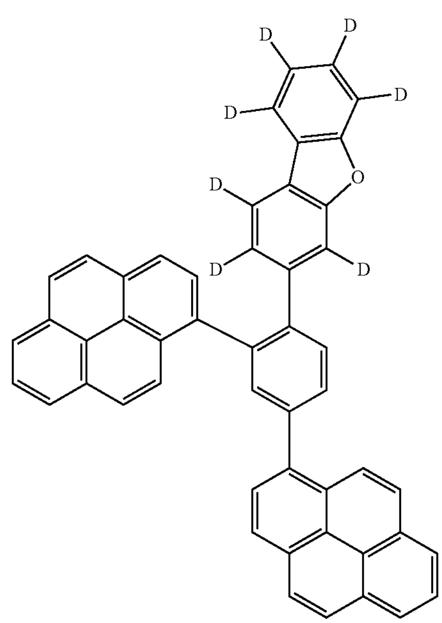

-continued
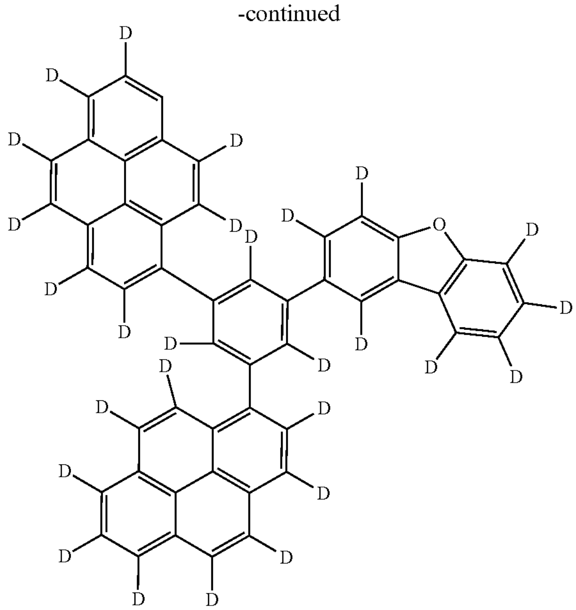
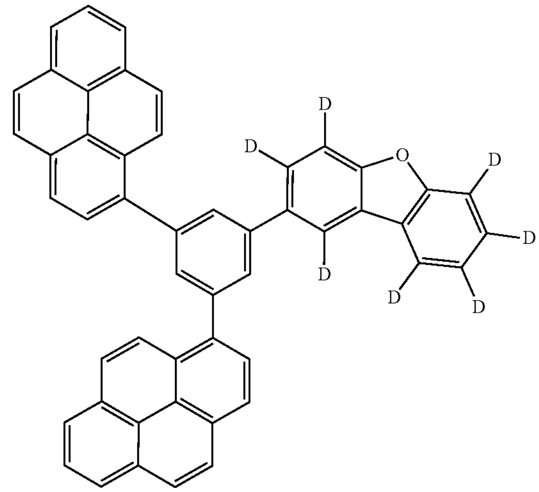
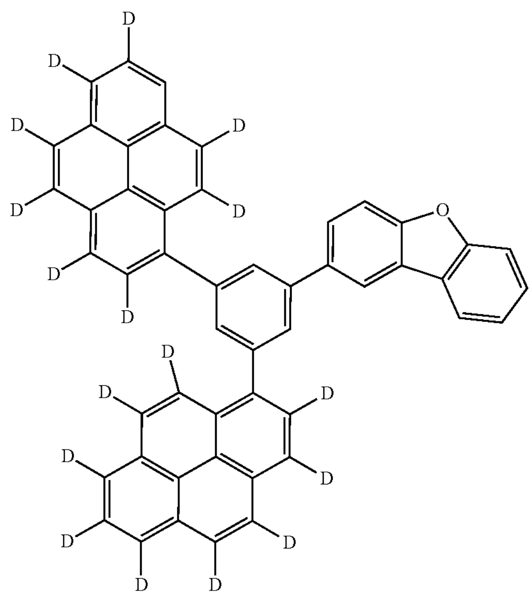
-continued
[Formula 353]
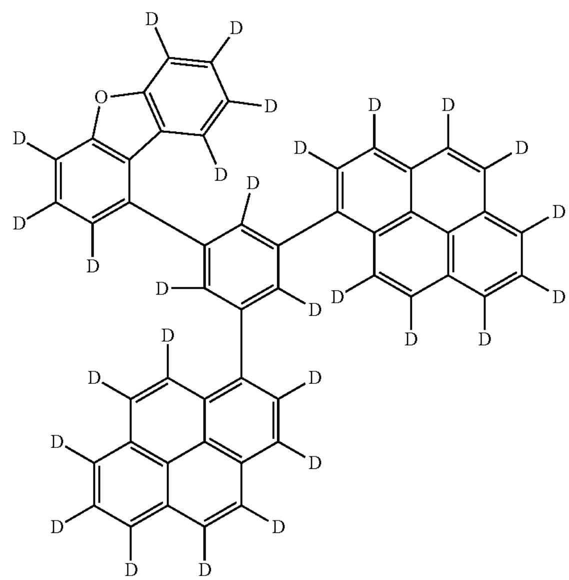
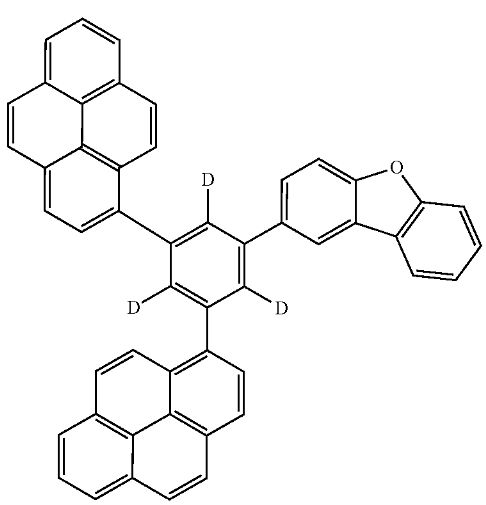
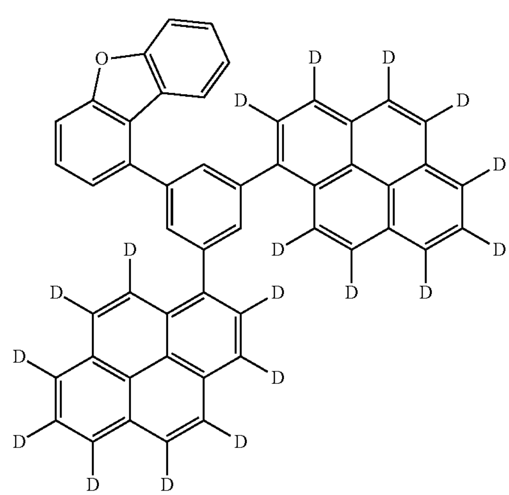

-continued
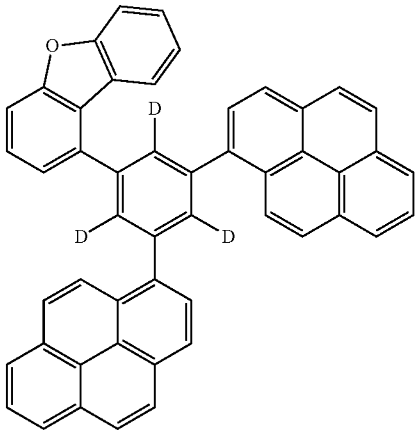
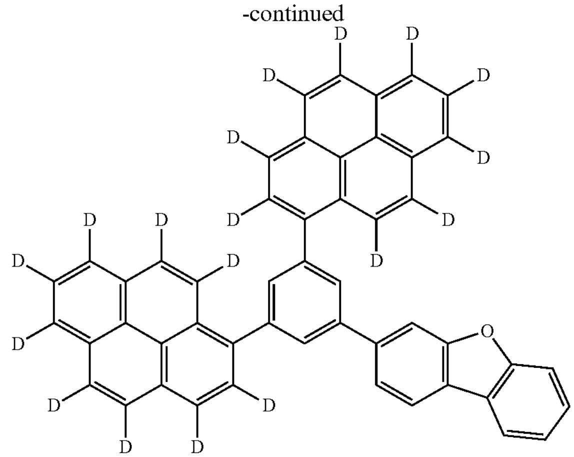
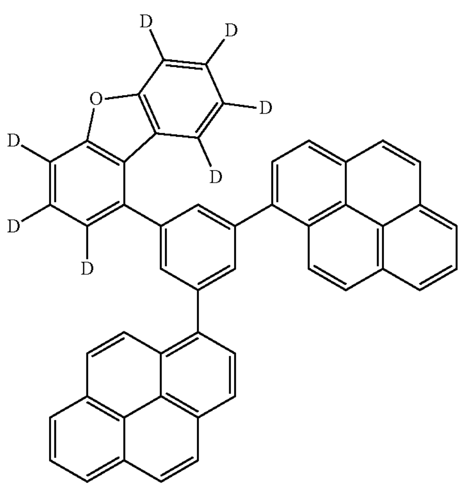
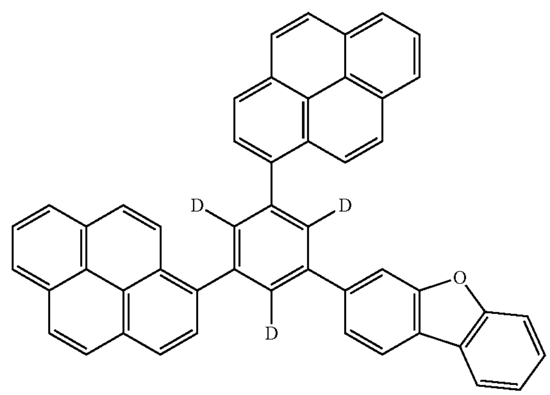
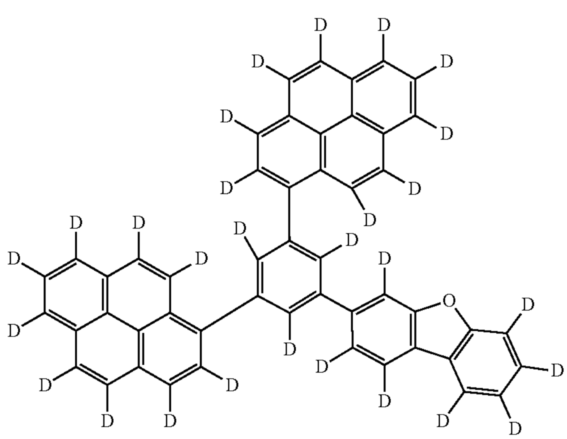
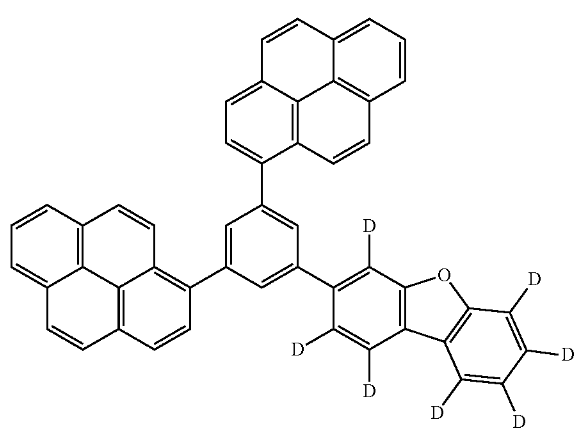

-continued
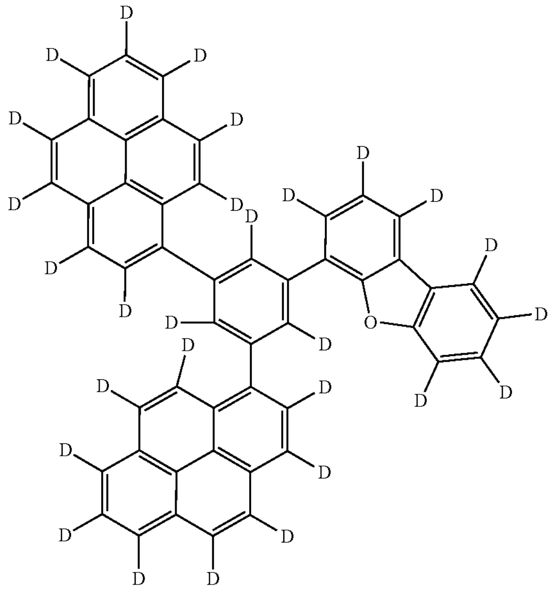
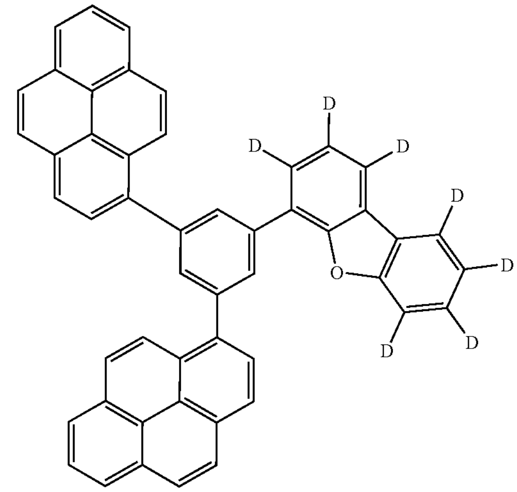
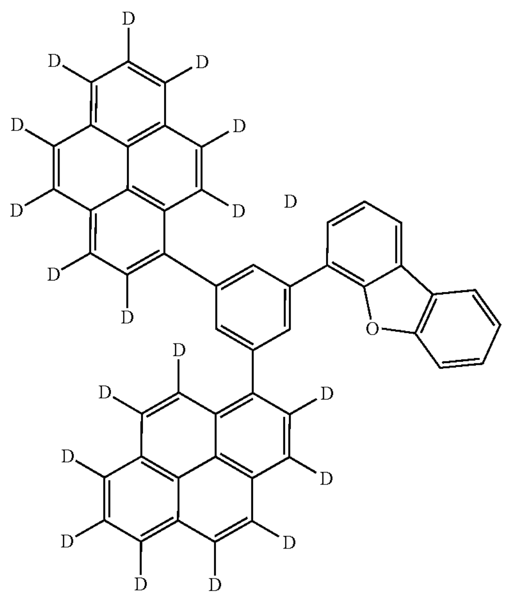
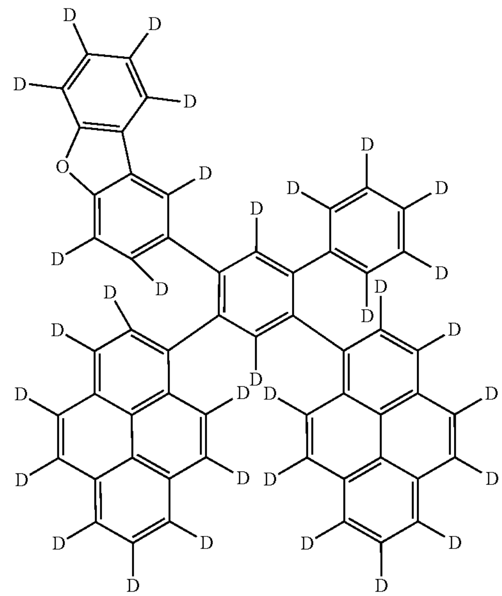
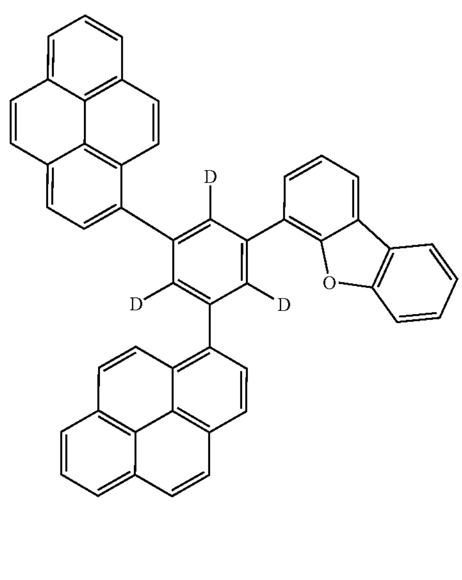
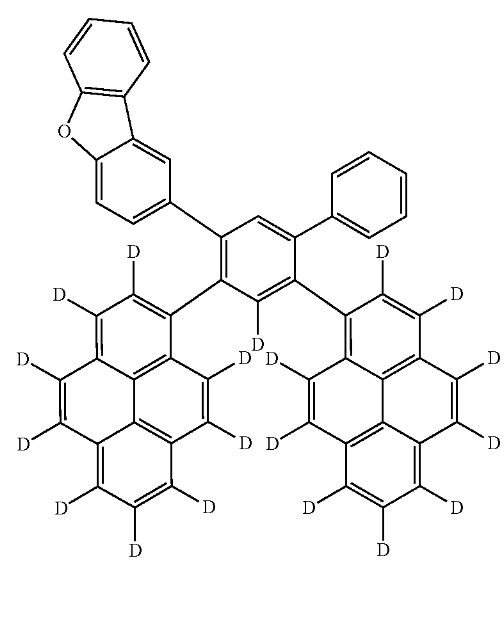

-continued
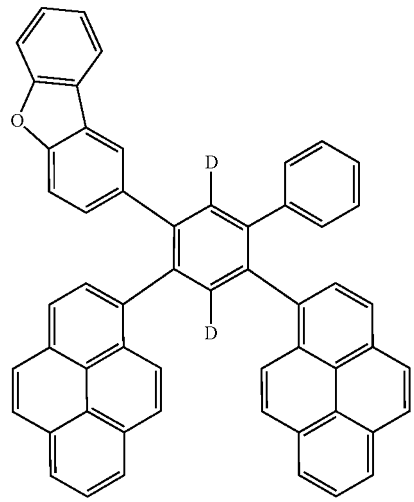
[Formula 355]
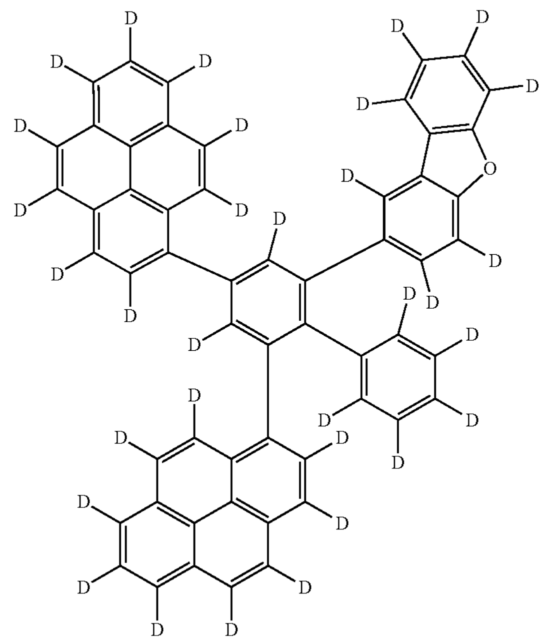
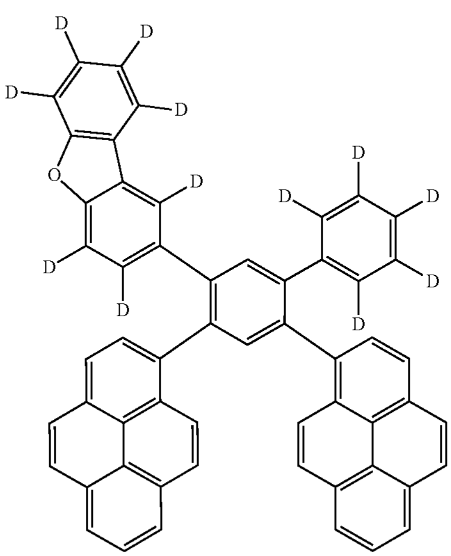
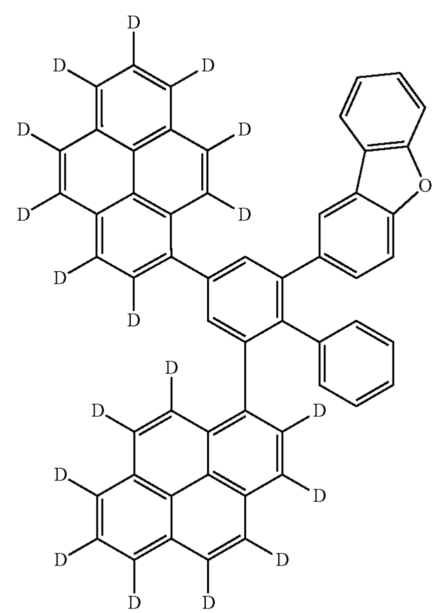

-continued
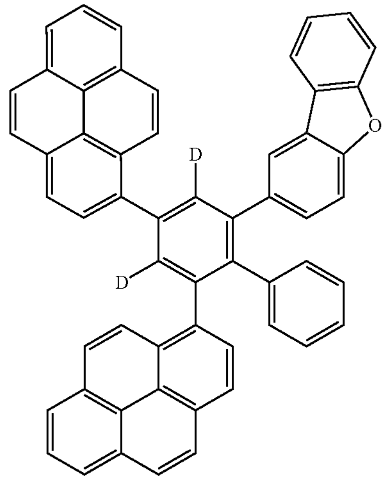
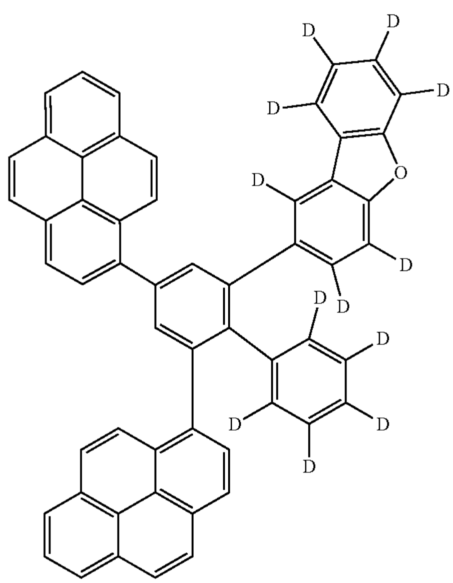
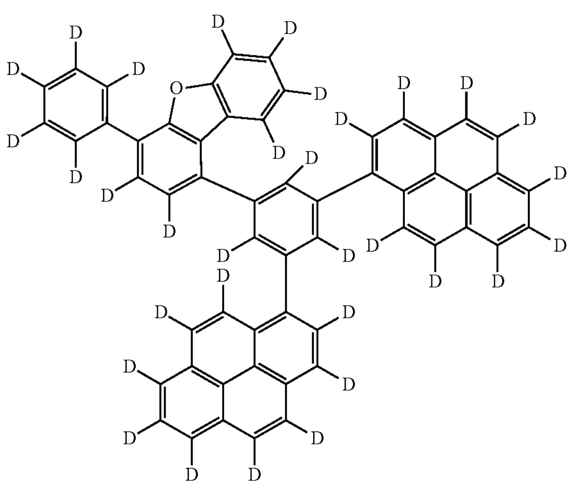
-continued
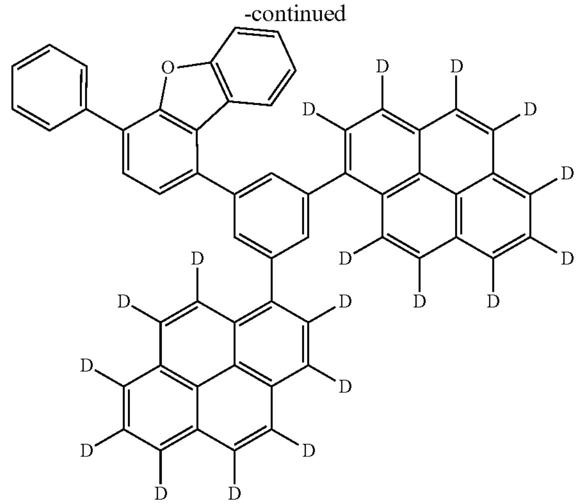
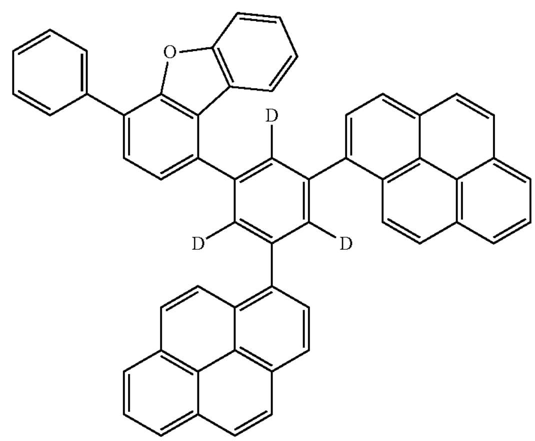
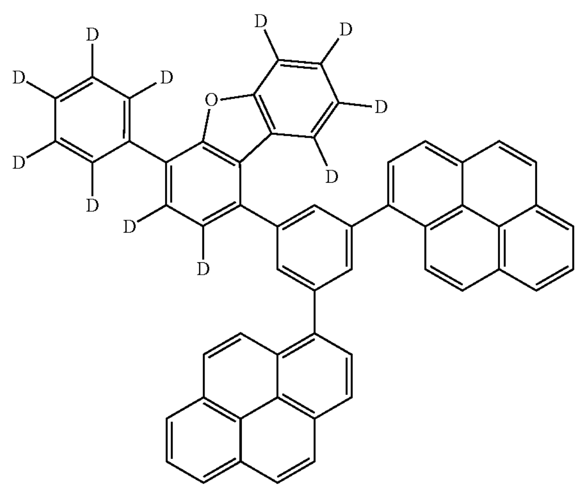

[Formula 356]
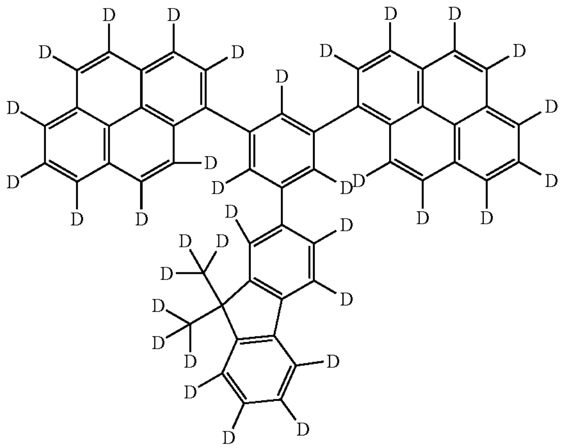
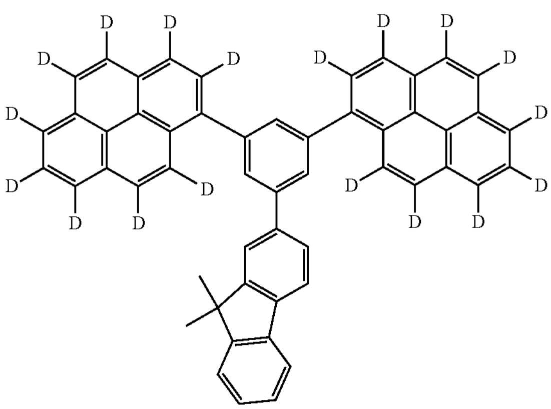
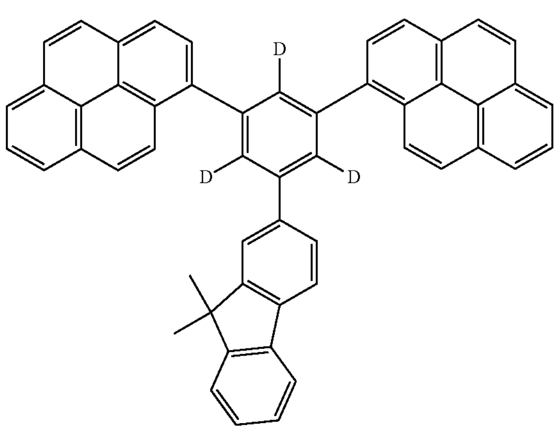
-continued
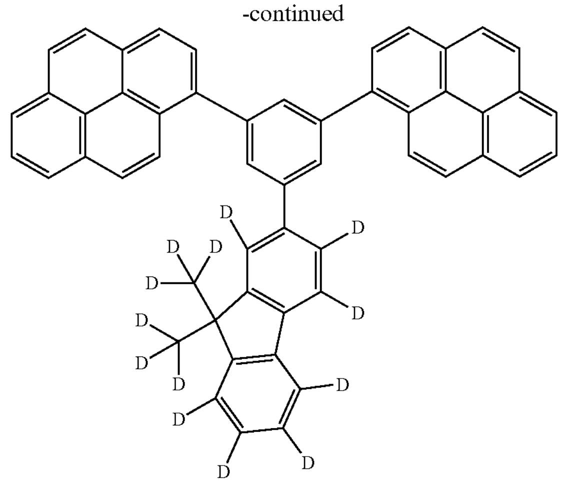
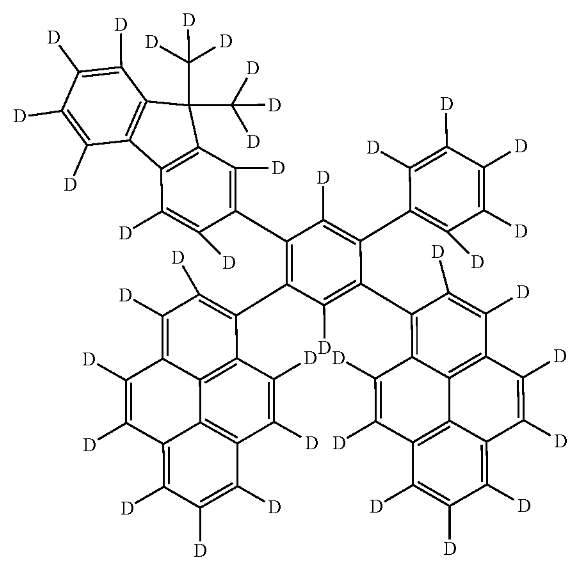
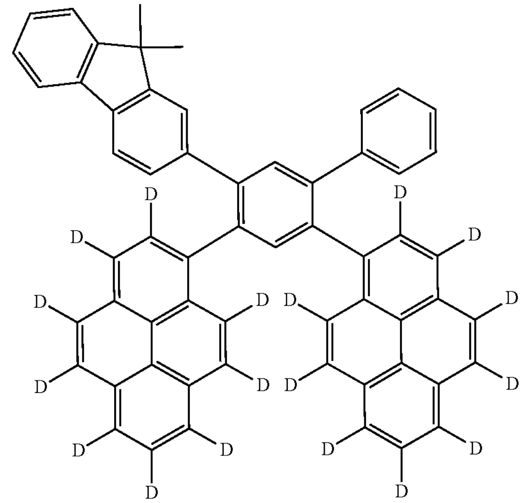

-continued
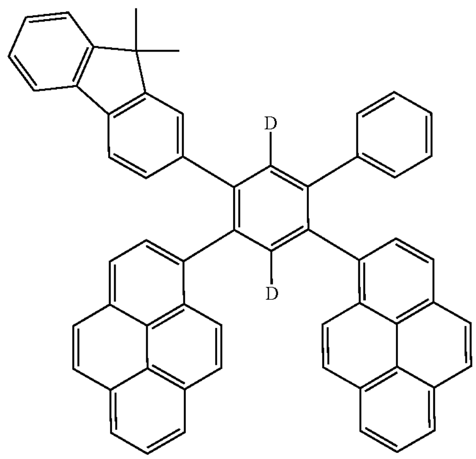
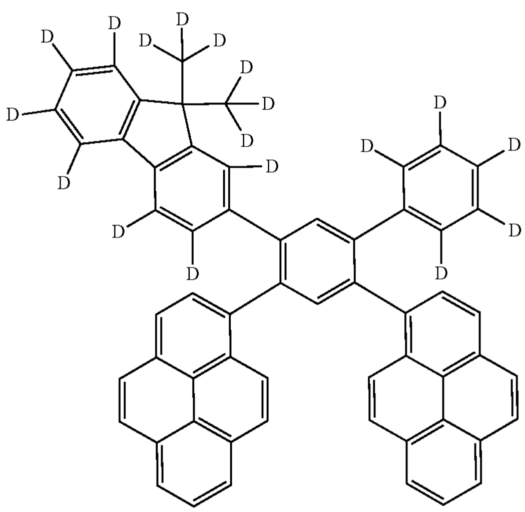
[Formula 357]
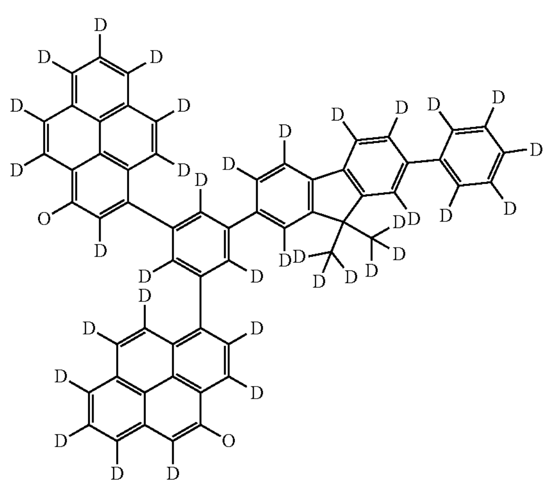
-continued
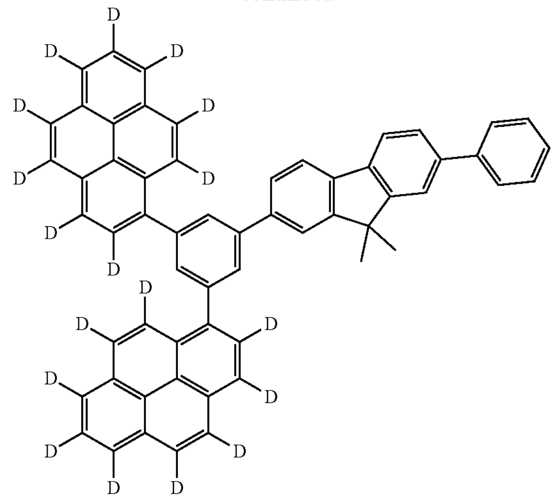
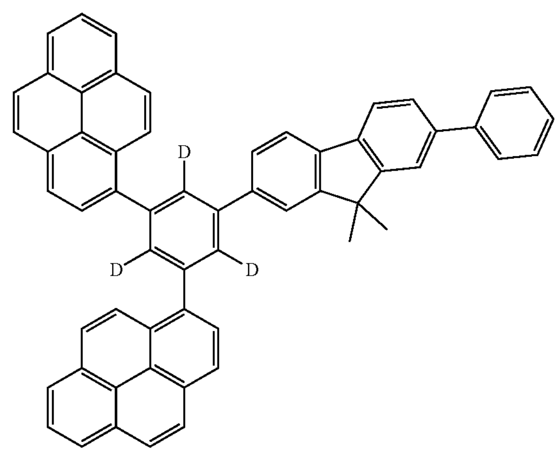
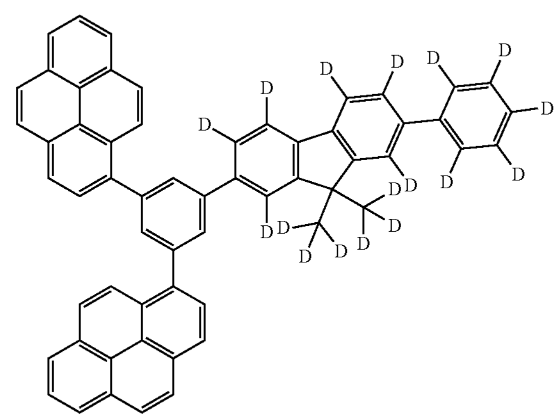

-continued
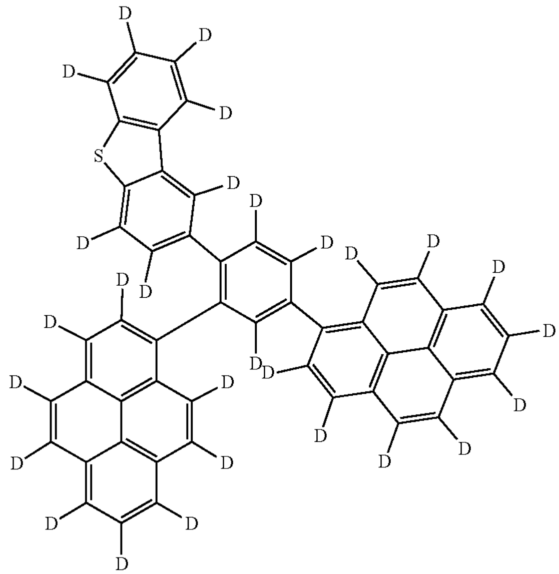
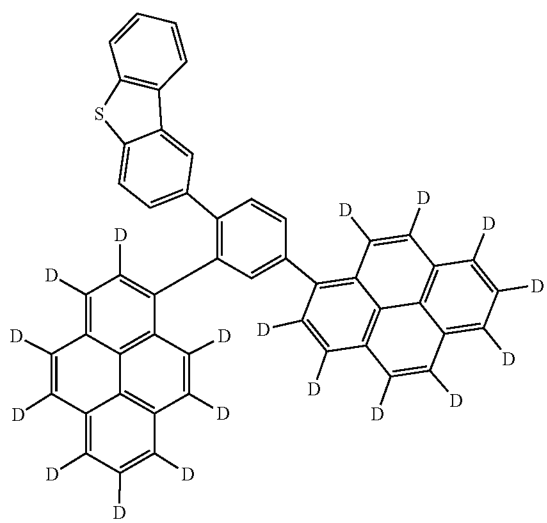
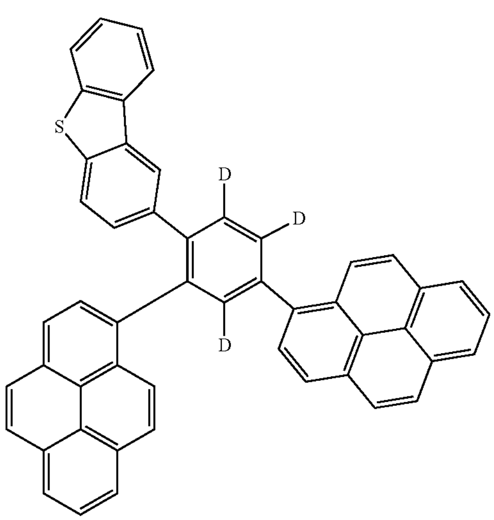
-continued
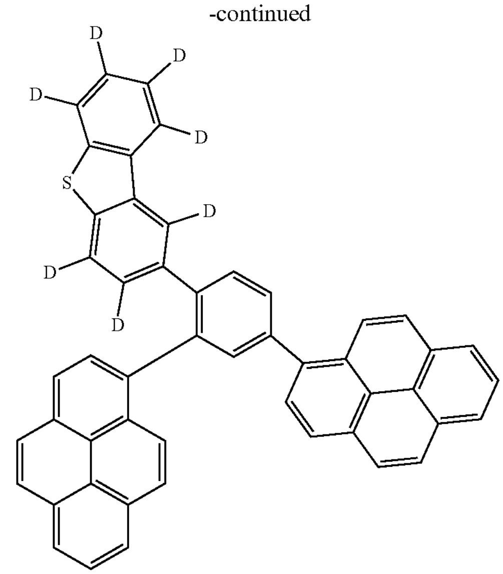
[Formula 358]
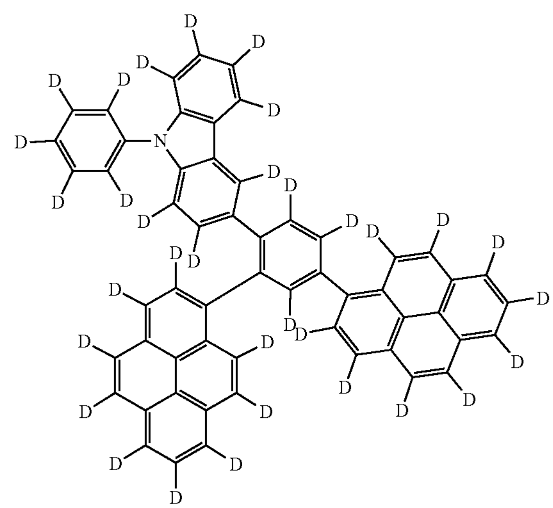
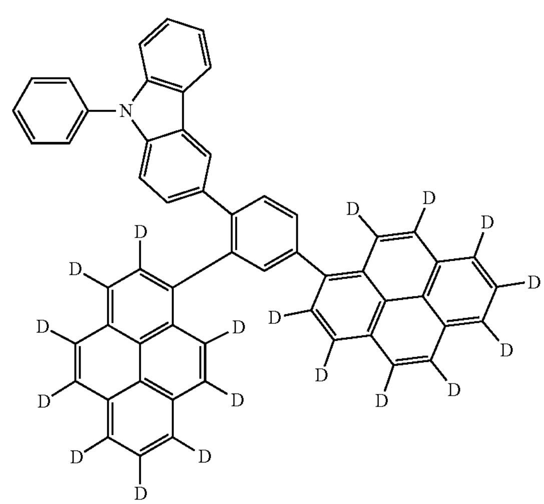

-continued
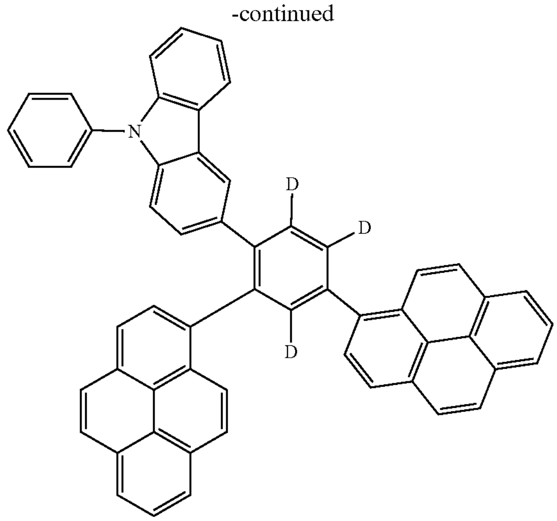
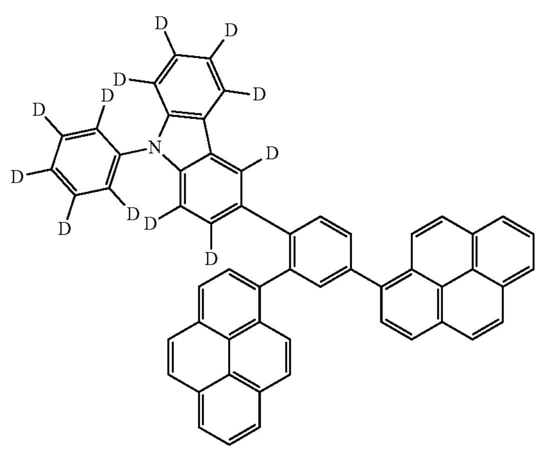
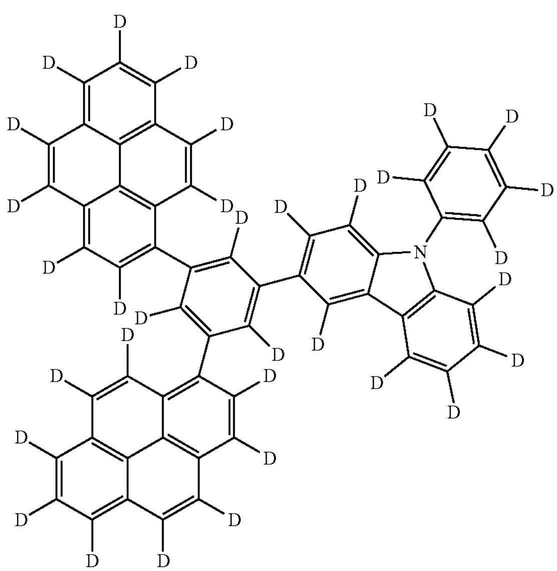
-continued
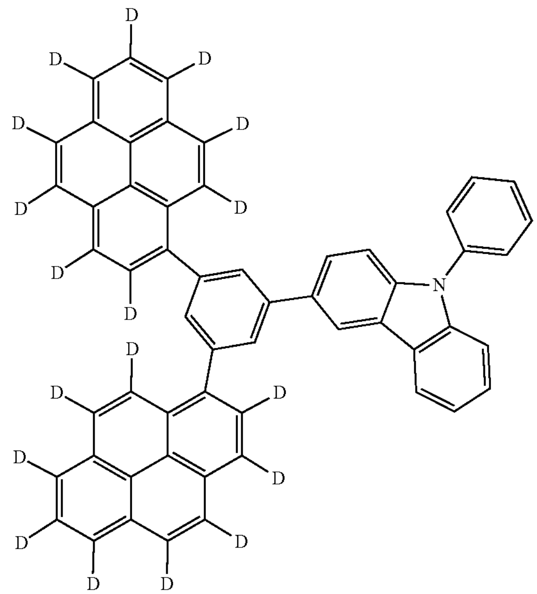
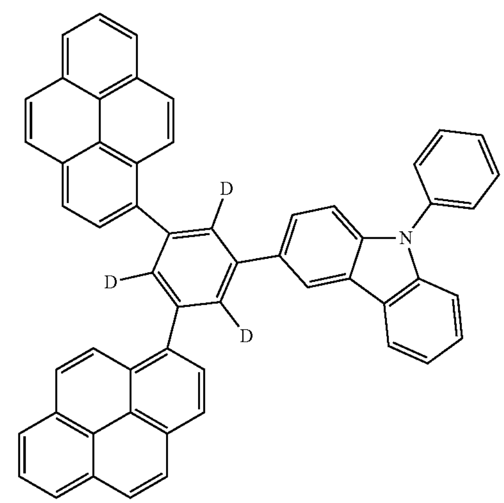
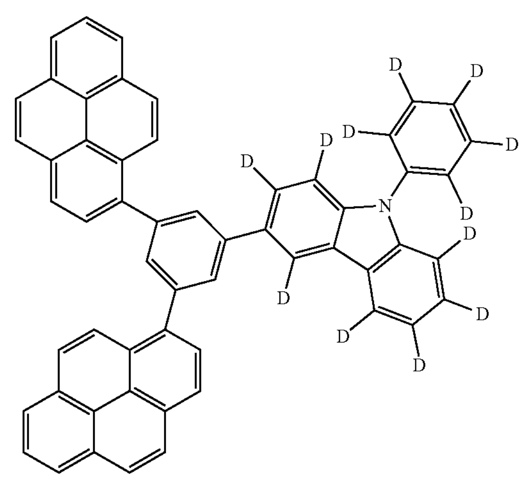

[Formula 359]
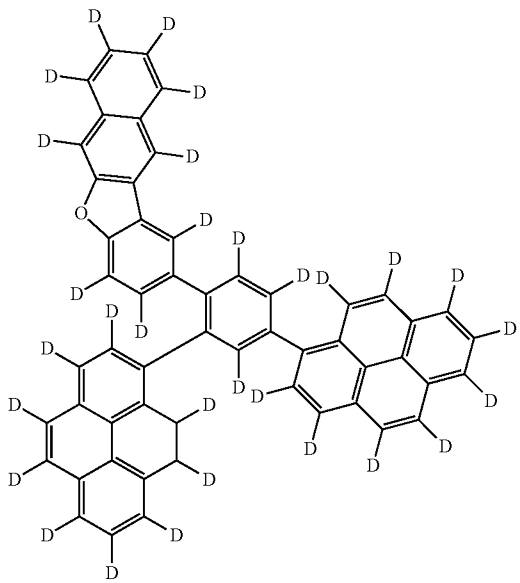
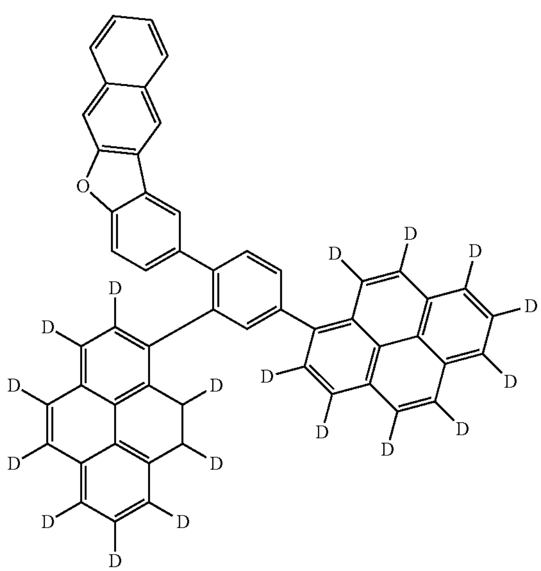
-continued
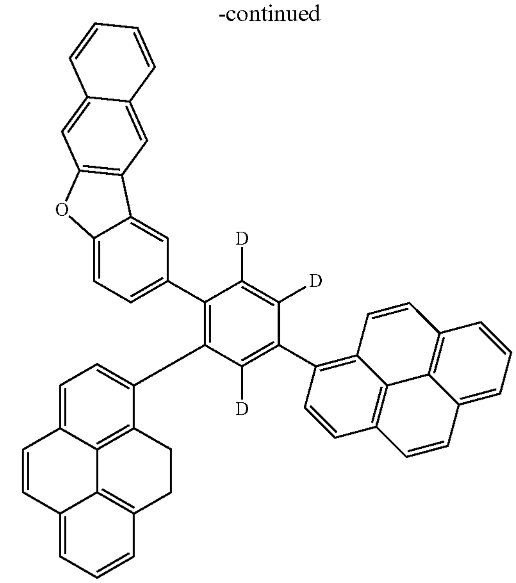
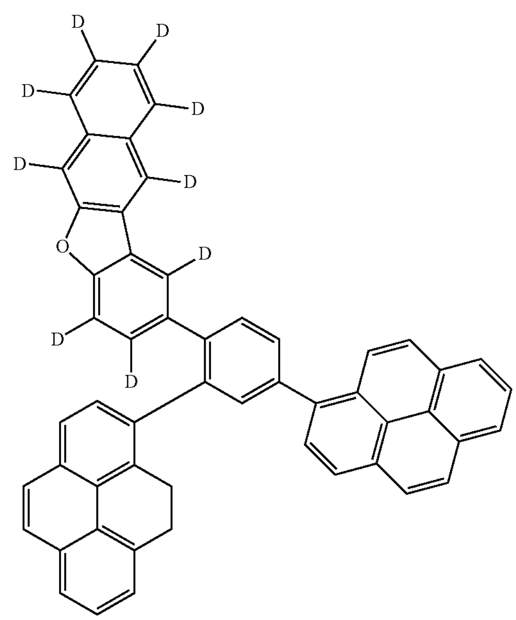
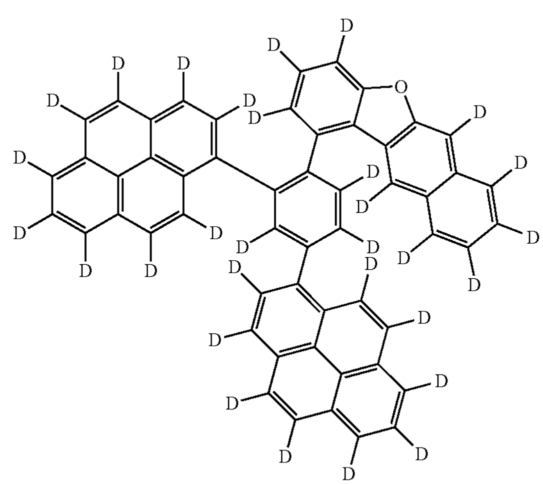

-continued
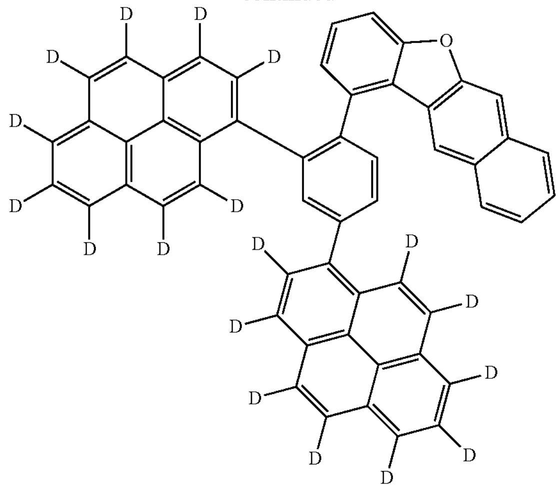
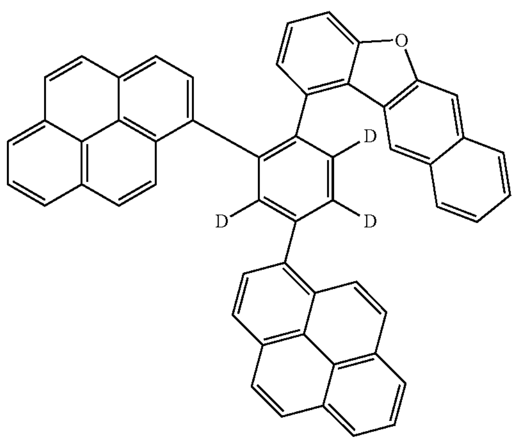
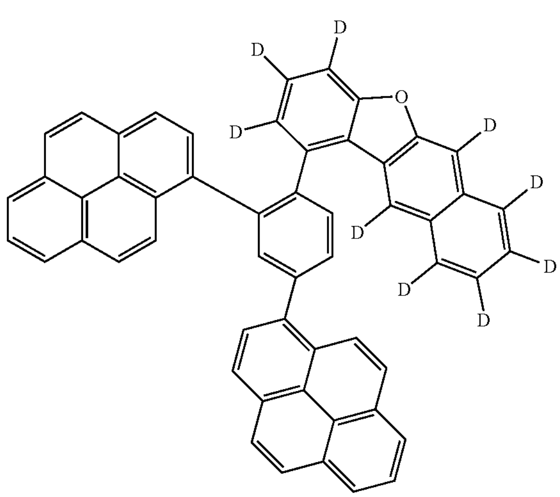
[Formula 360]
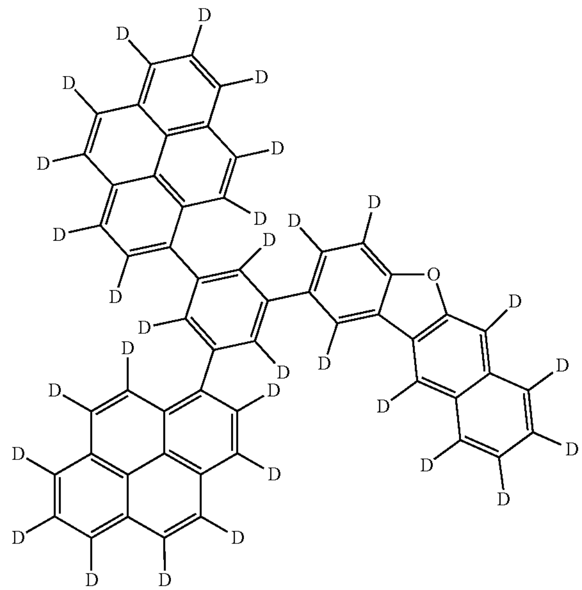
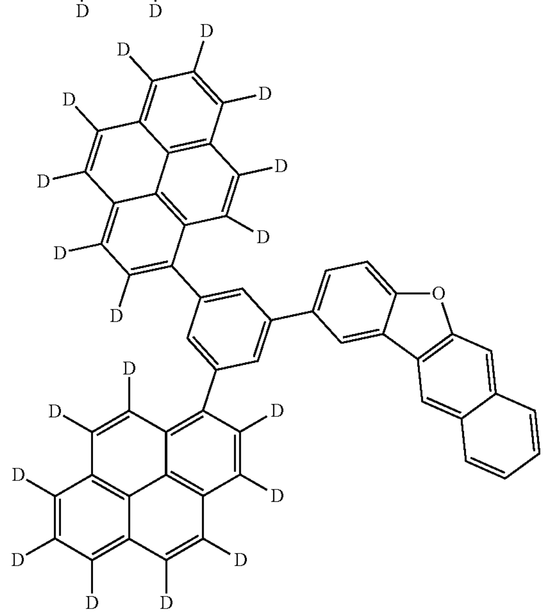
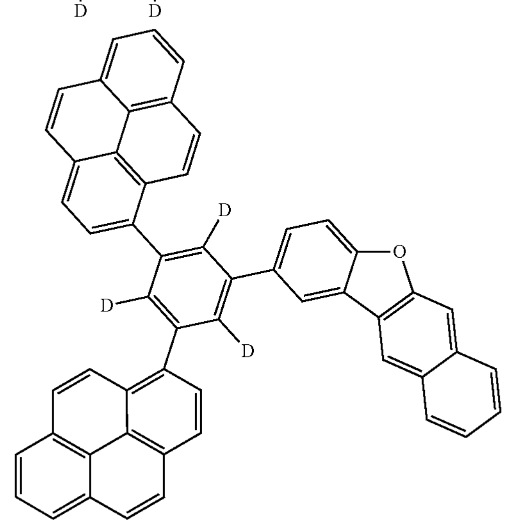

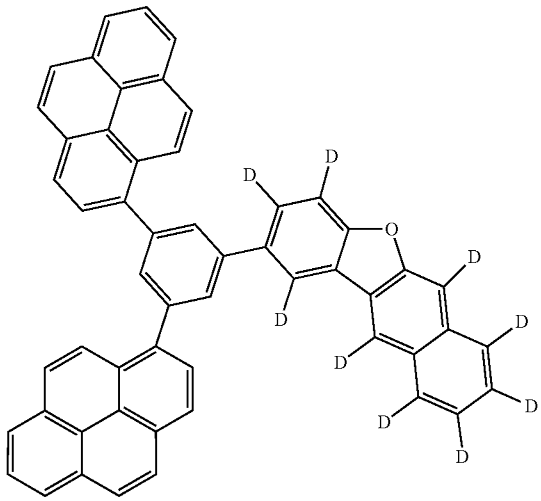
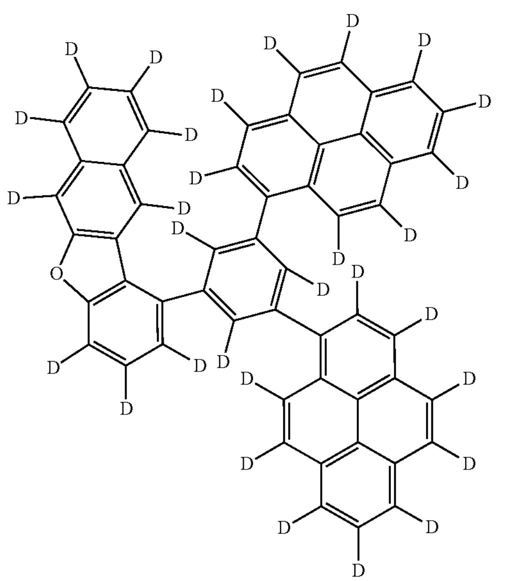
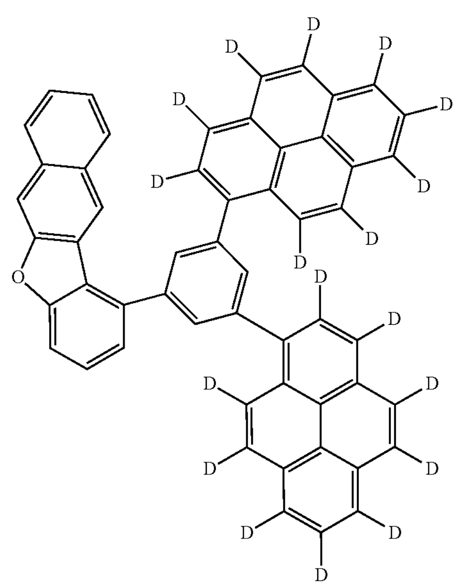
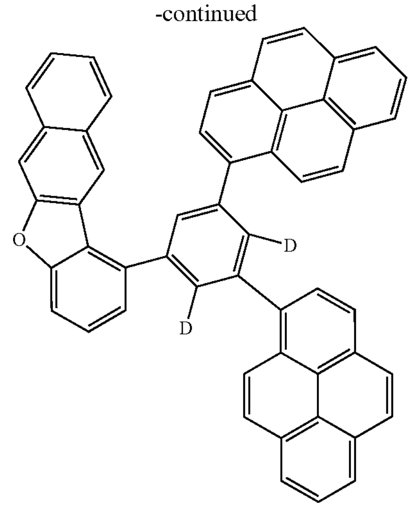
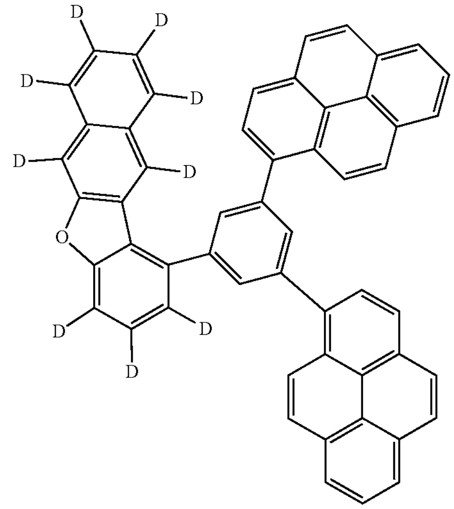
[Formula 361]
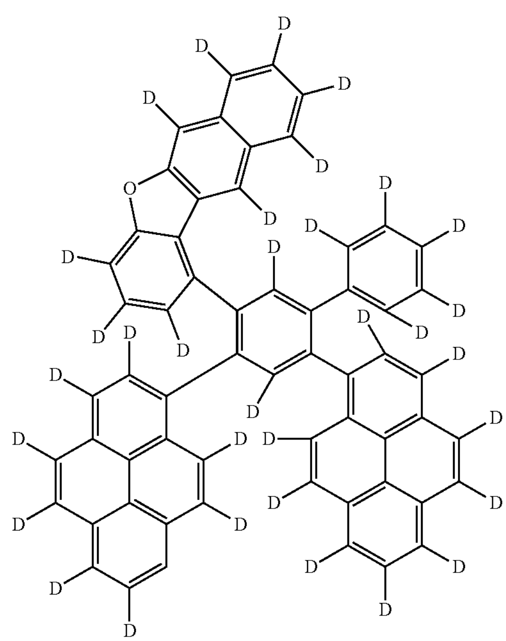

-continued
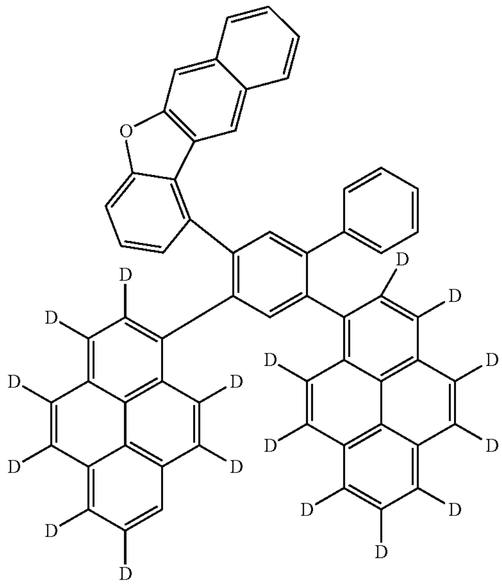
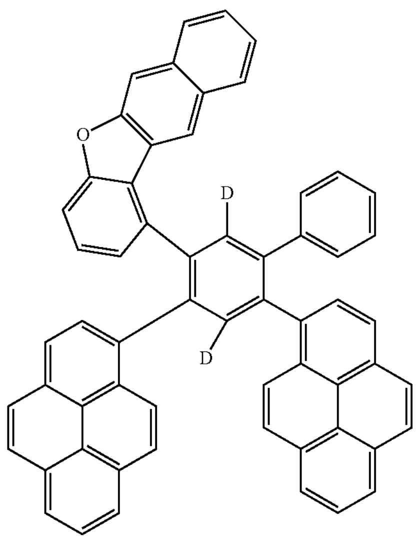
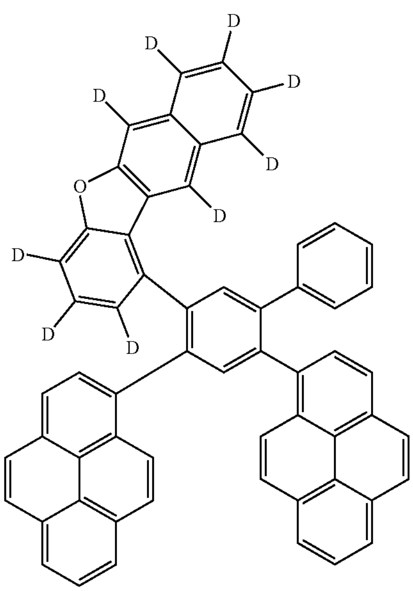
-continued
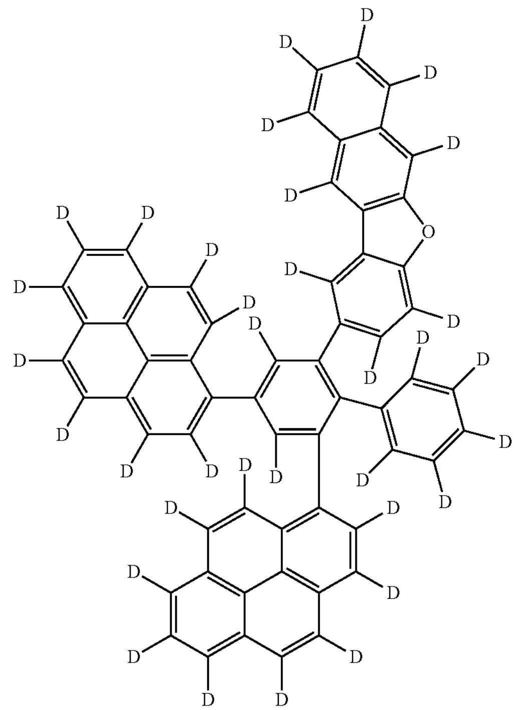
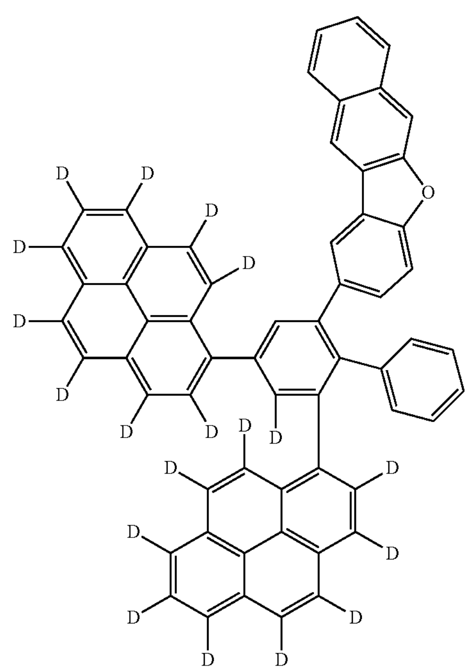

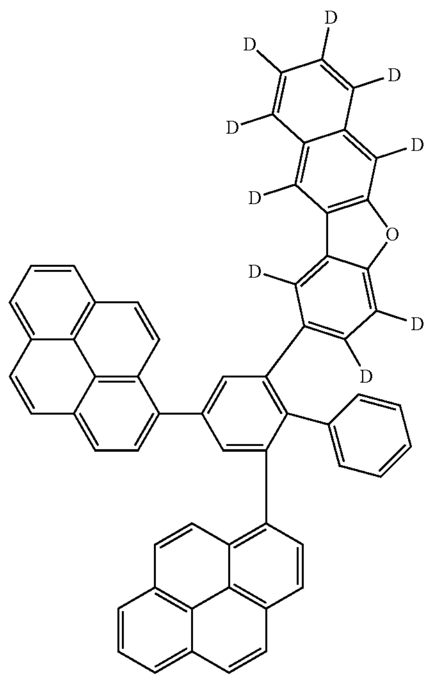
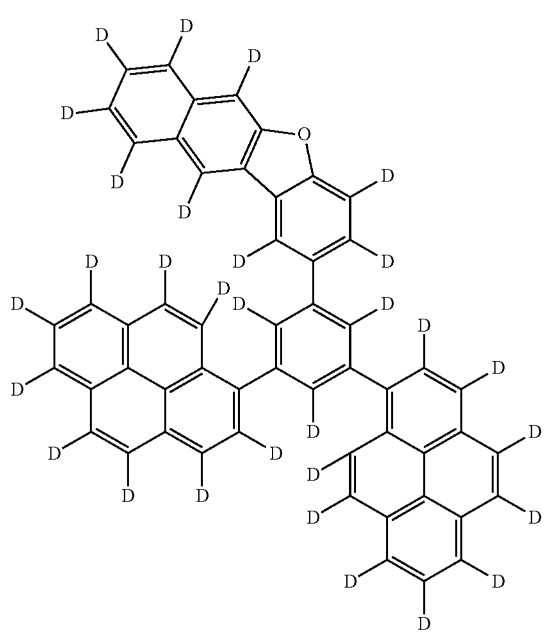
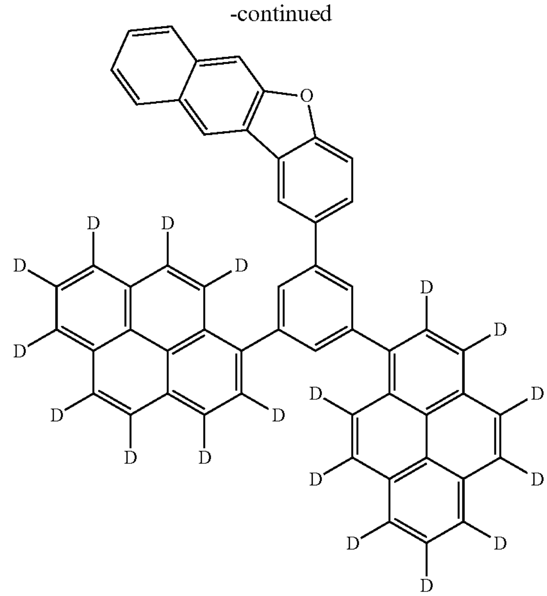
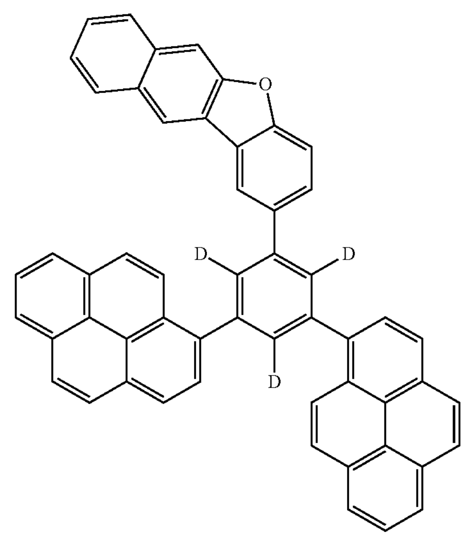
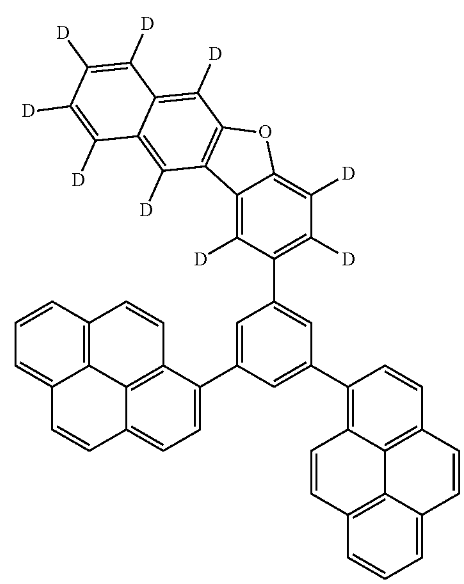

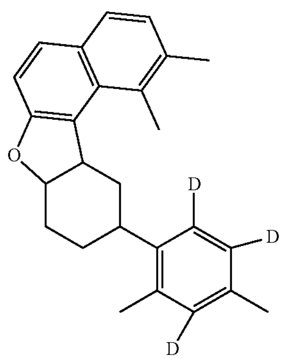 [SMILES: [2H]c1c([2H])c(C2CCC3Oc4ccc5ccc(C)c(C)c5c4C3C2)c(C)c([2H])c1C]
[Formula 363]
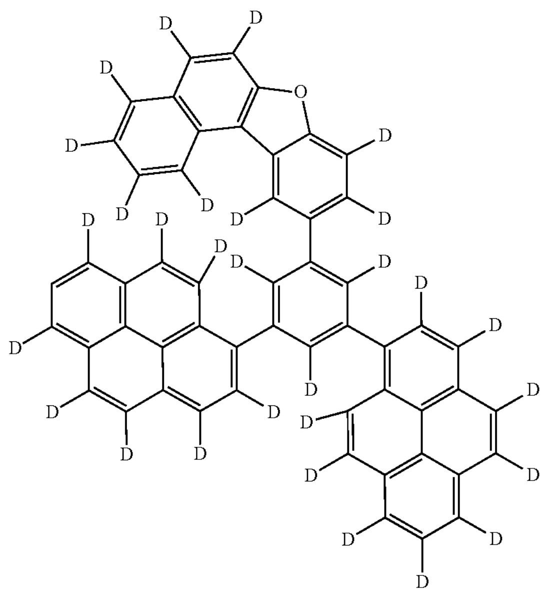
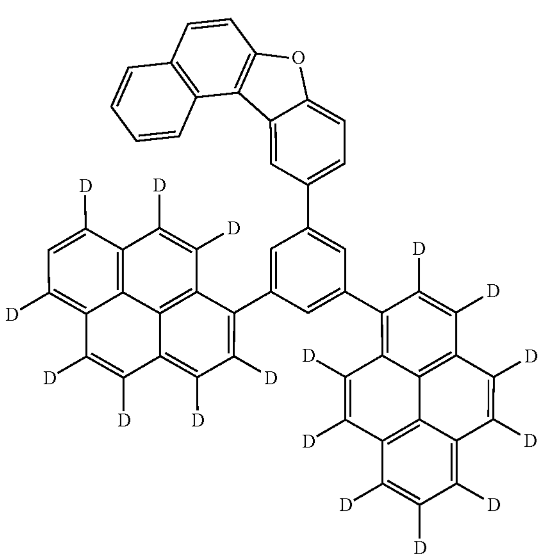
-continued
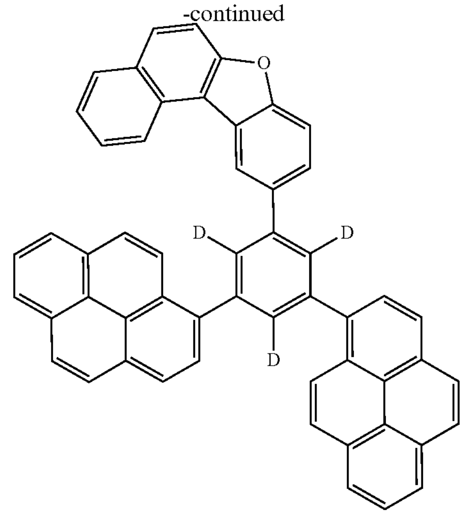
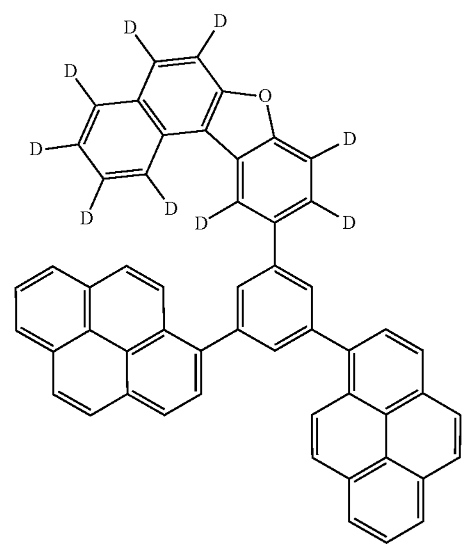 [SMILES: [2H]c1c(-c2cc(-c3ccc4ccc5cccc6ccc3c4c56)cc(-c3ccc4ccc5cccc6ccc3c4c56)c2)c([2H])c2c(oc3c([2H])c([2H])c4c([2H])c([2H])c([2H])c([2H])c4c32)c1[2H]]
[Formula 364]
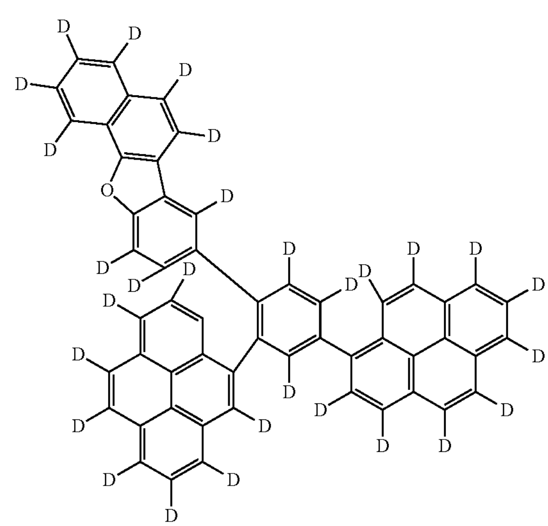

-continued
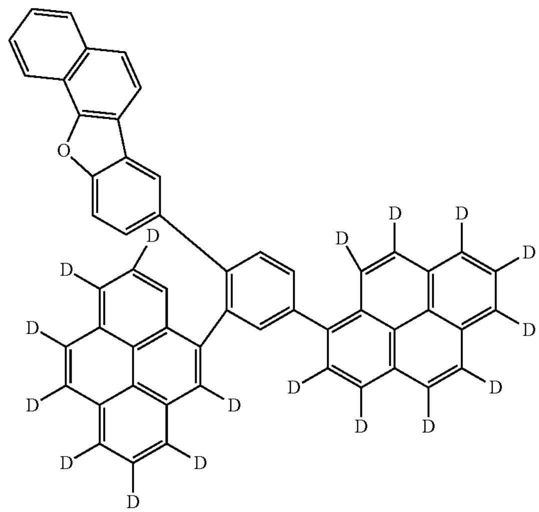
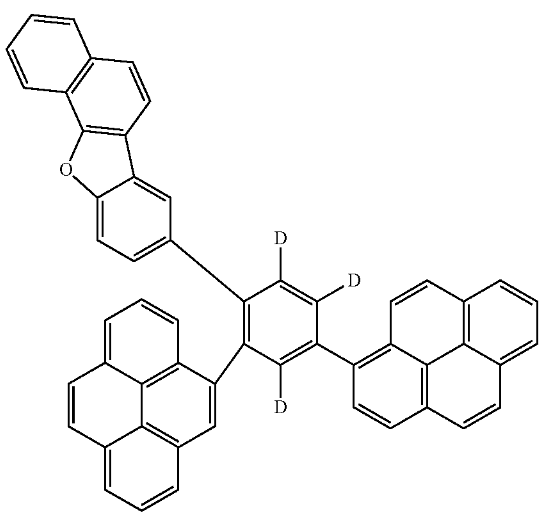
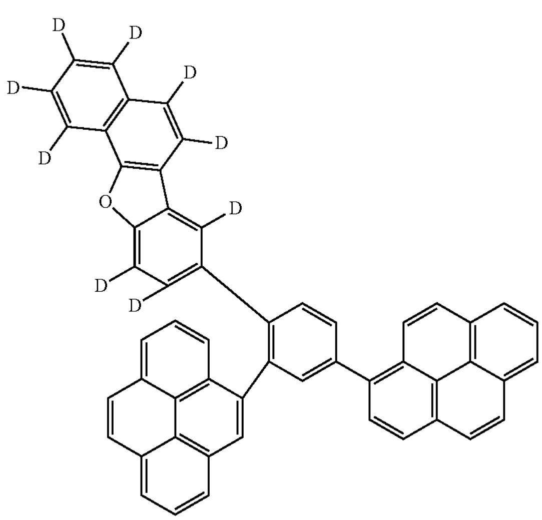
-continued
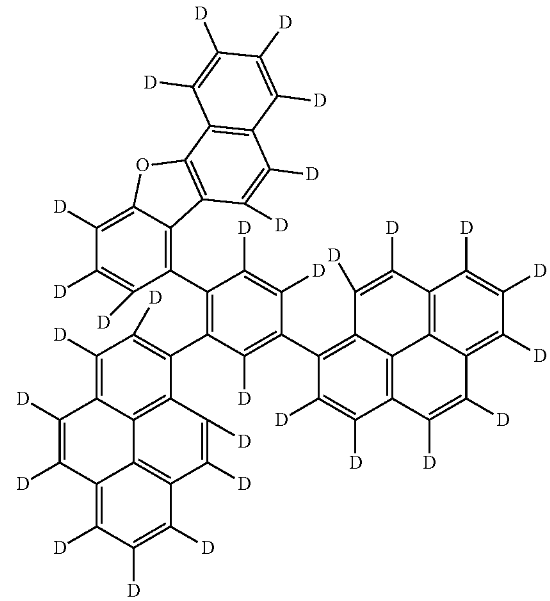
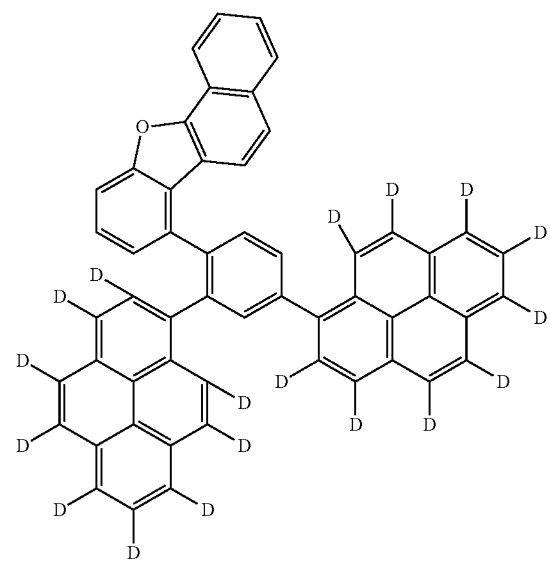
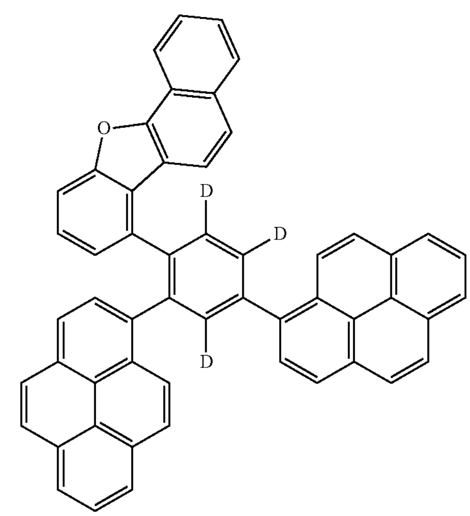

-continued
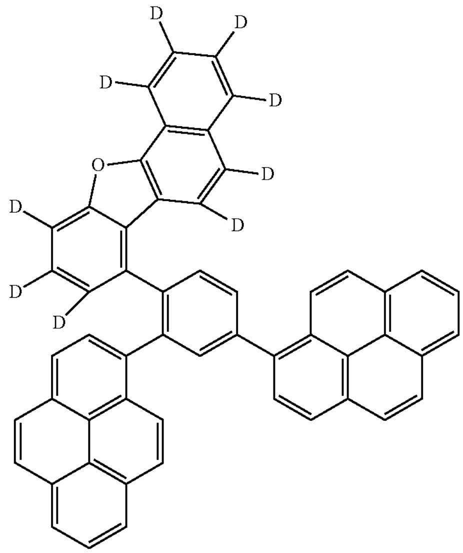
-continued
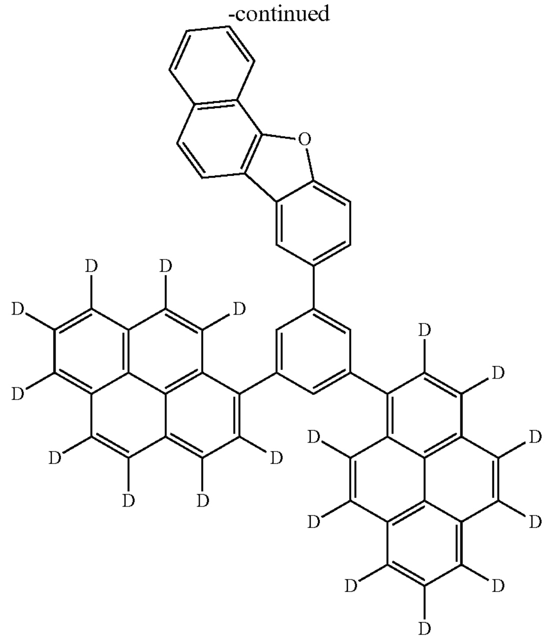
[Formula 365]
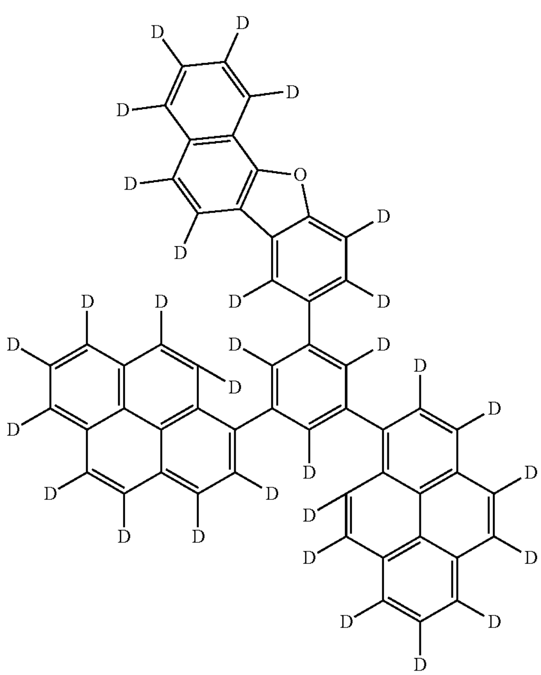
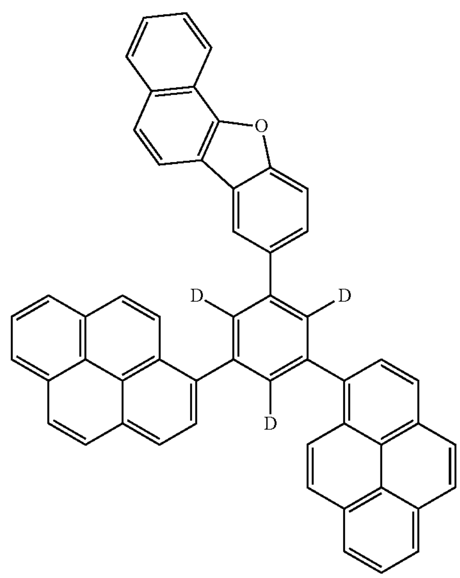

-continued
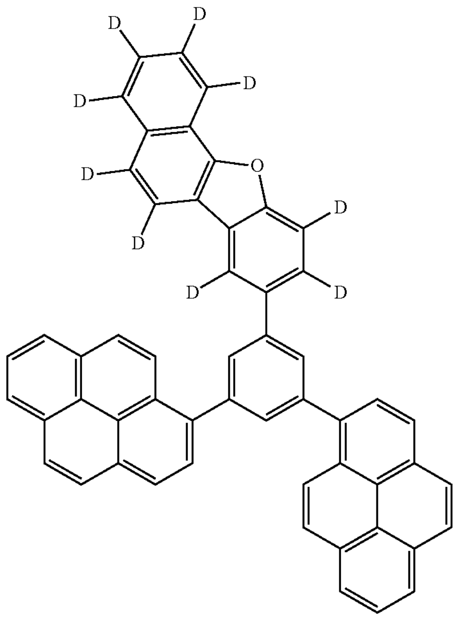
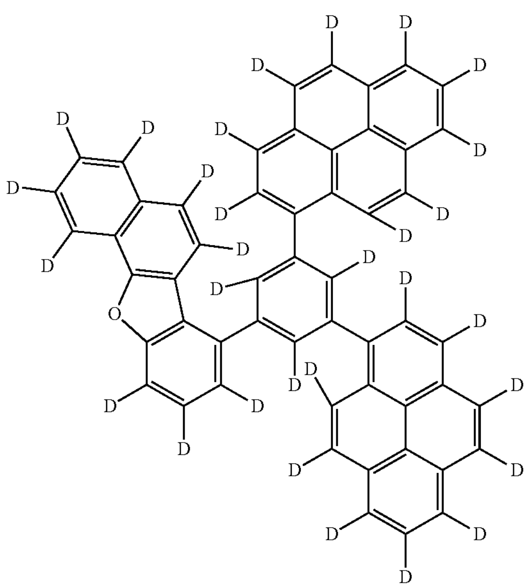
-continued
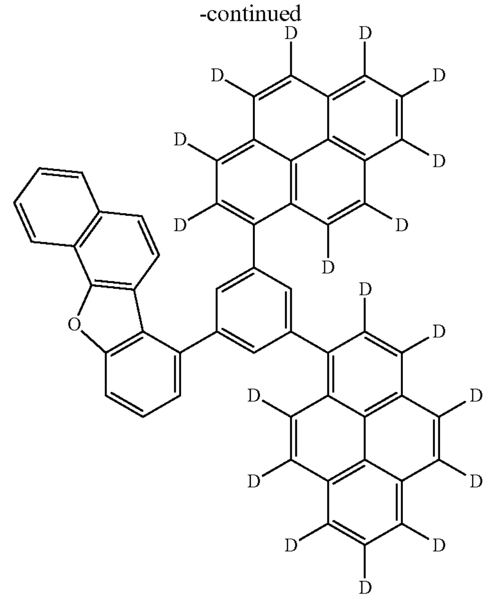
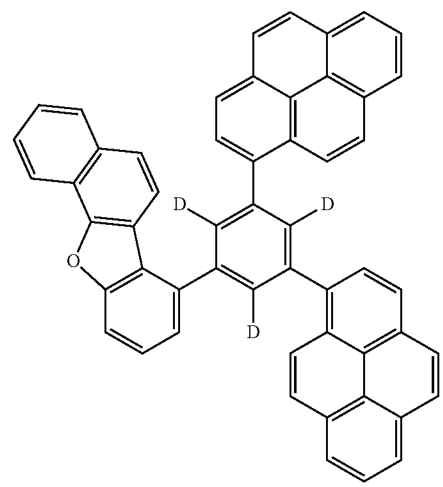
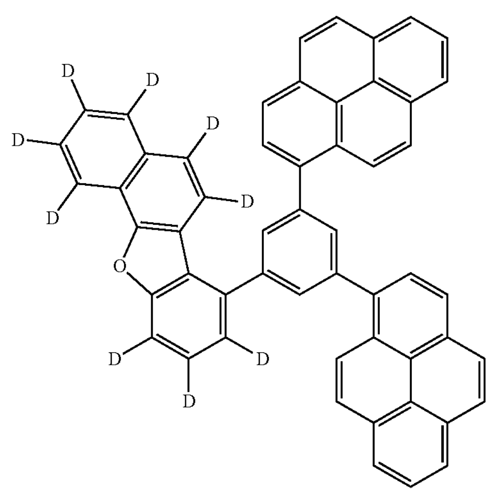

-continued
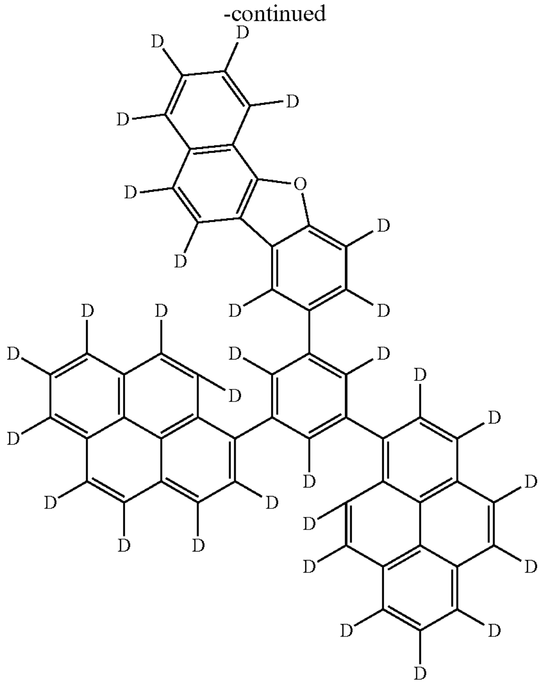
-continued
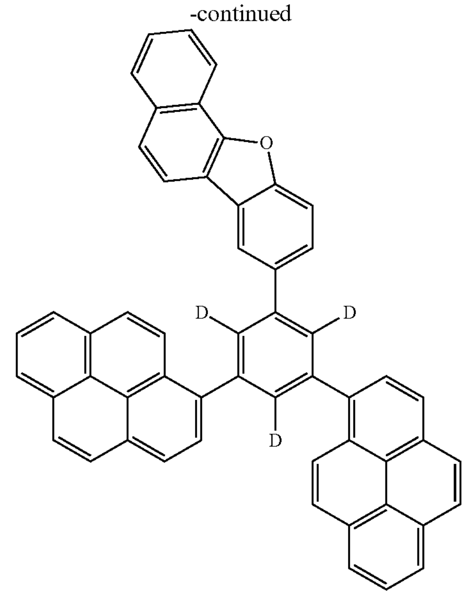
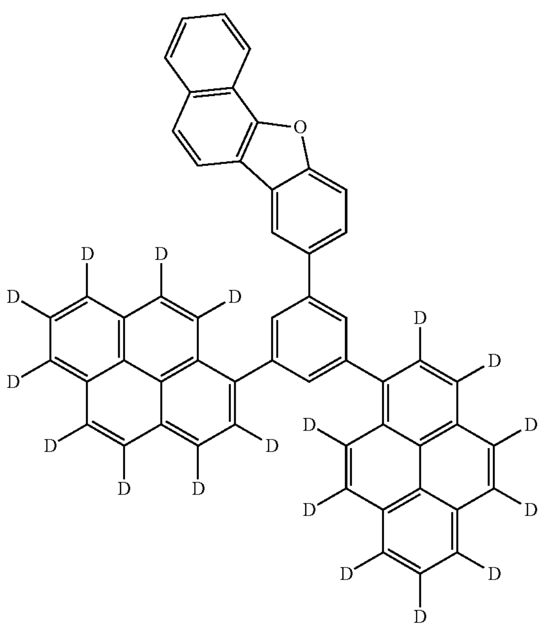
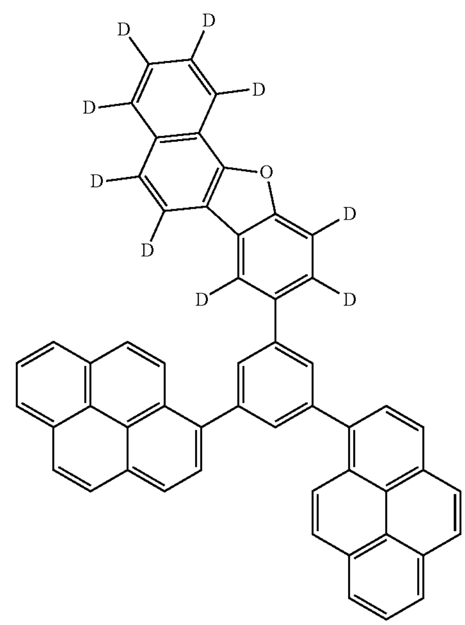

-continued
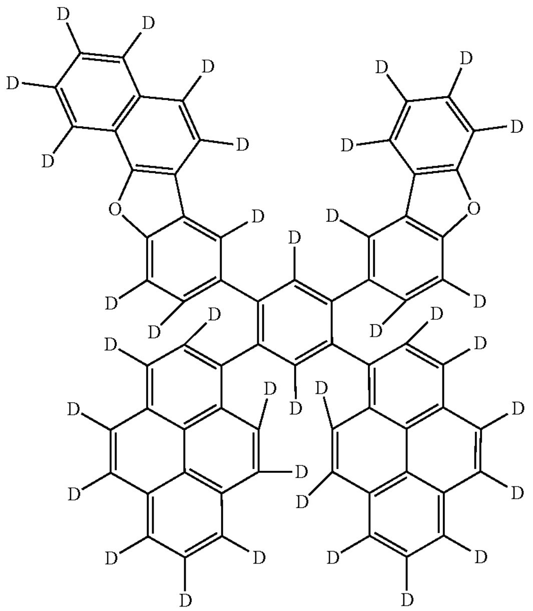
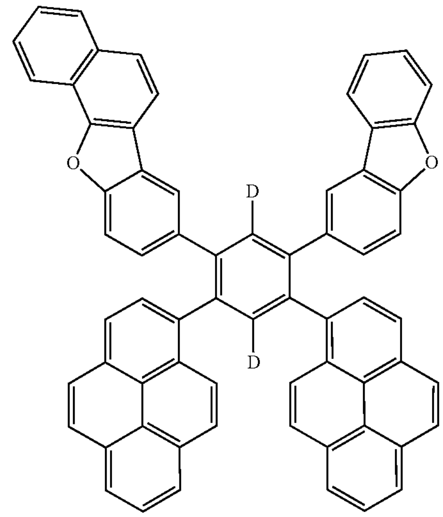
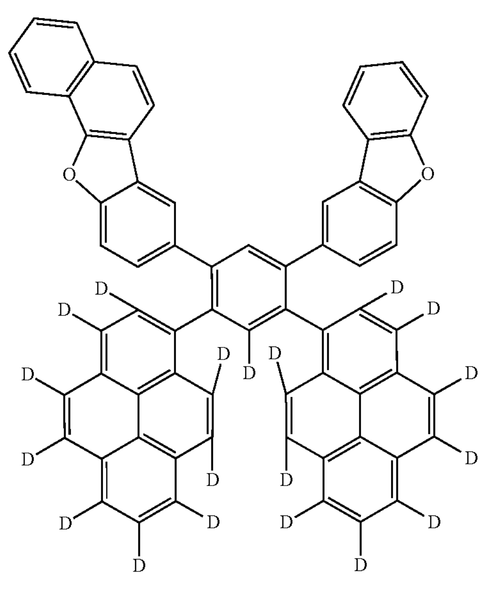
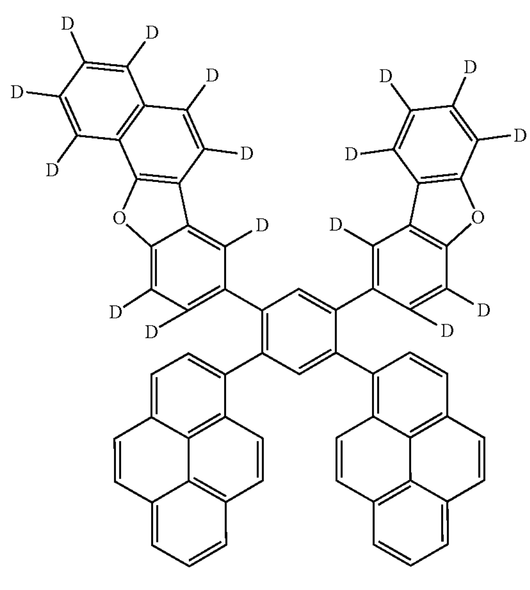 [SMILES: [2H]c1c([2H])c([2H])c2c(oc3c([2H])c([2H])c(-c4cc(-c5c([2H])c([2H])c6oc7c8c([2H])c([2H])c([2H])c([2H])c8c([2H])c([2H])c7c6c5[2H])c(-c5ccc6ccc7cccc8ccc5c6c78)cc4-c4ccc5ccc6cccc7ccc4c5c67)c([2H])c32)c1[2H]]

[Formula 367]
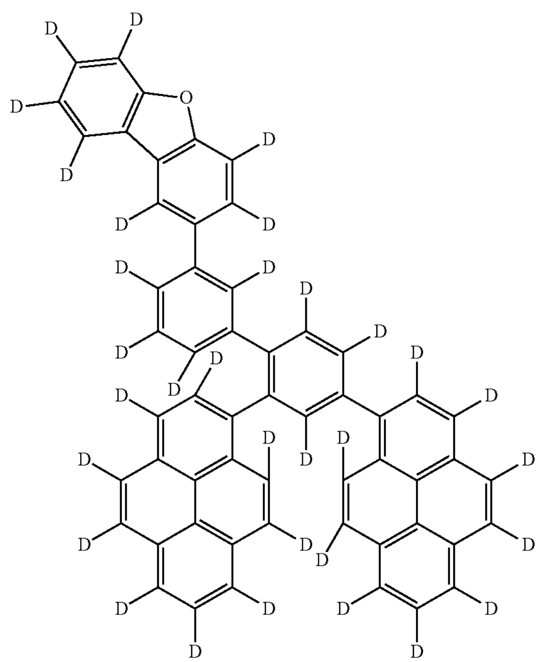
-continued
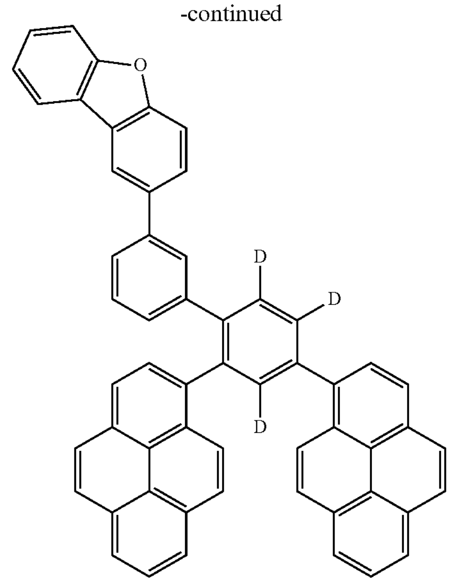
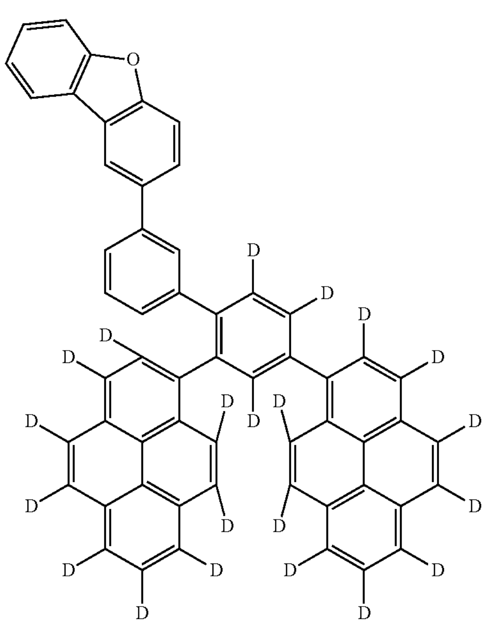
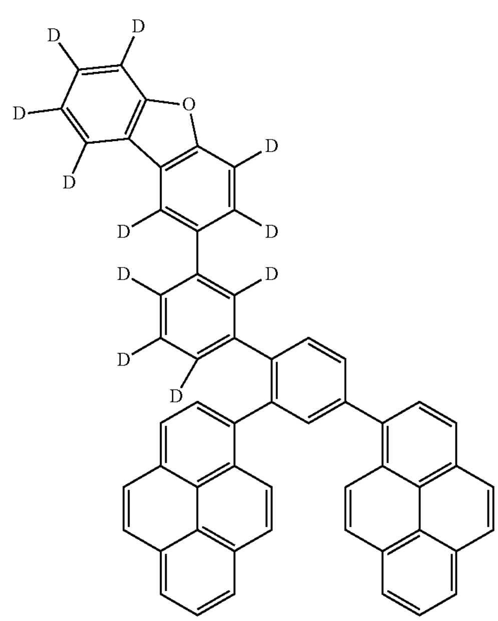

[Formula 368]
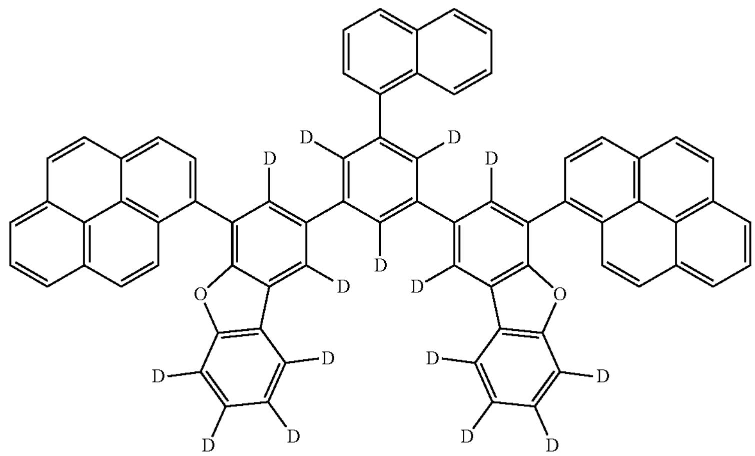
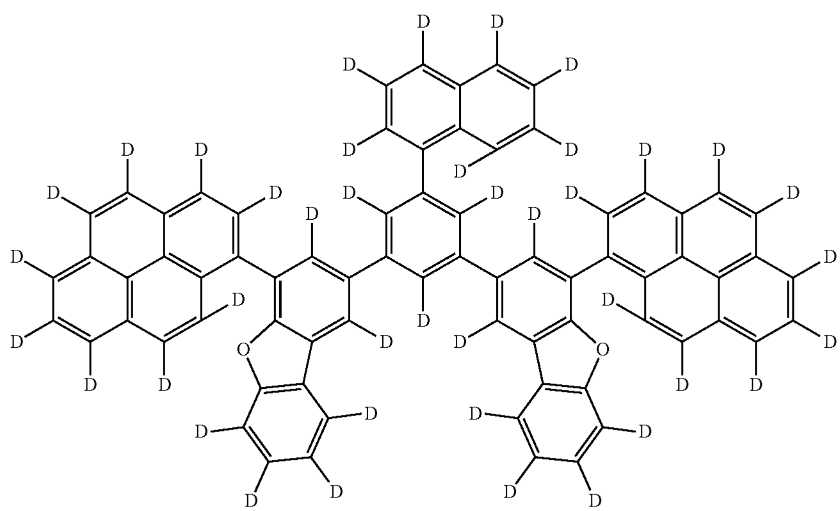
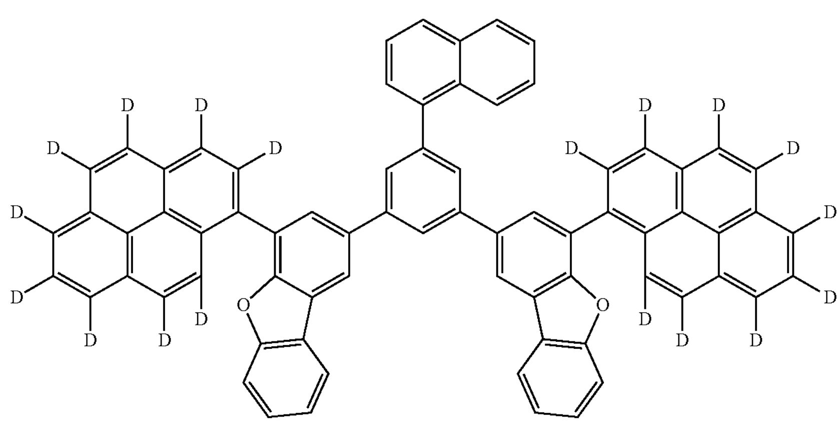

-continued
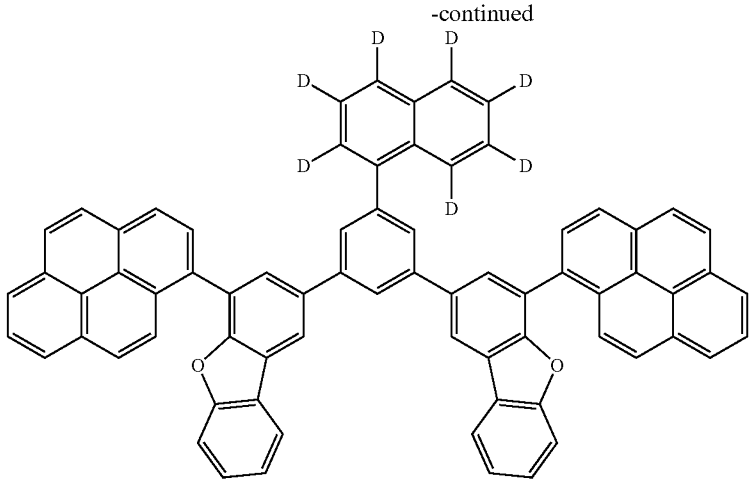
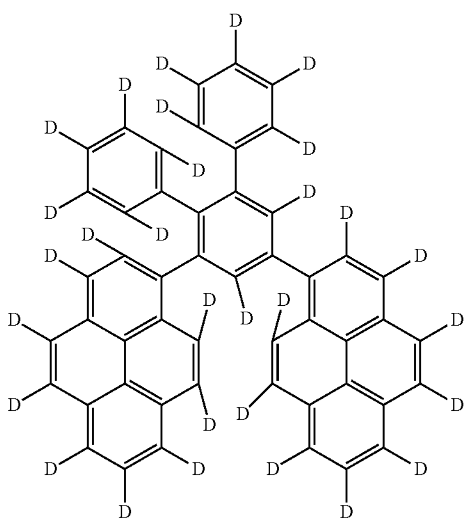
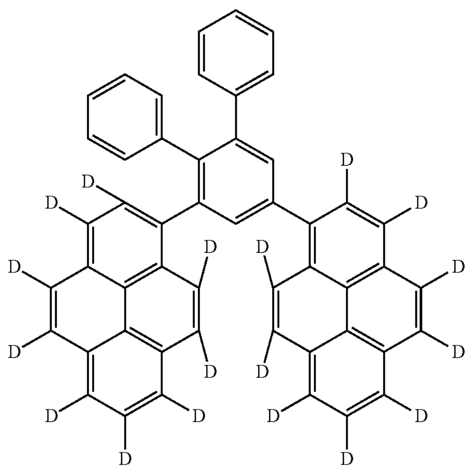
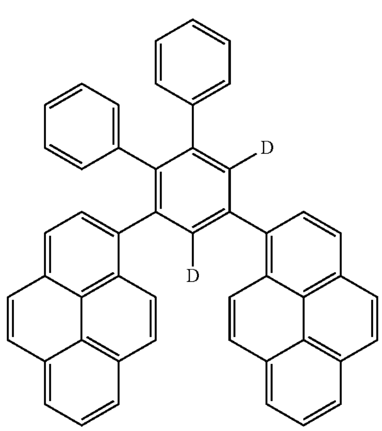
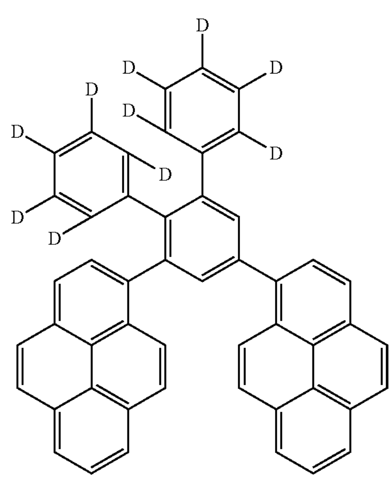

-continued
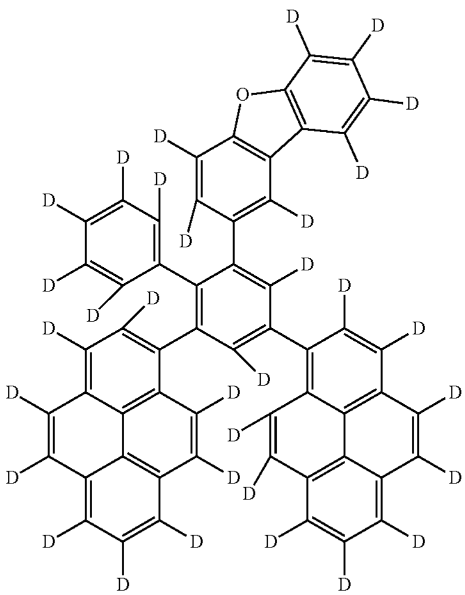
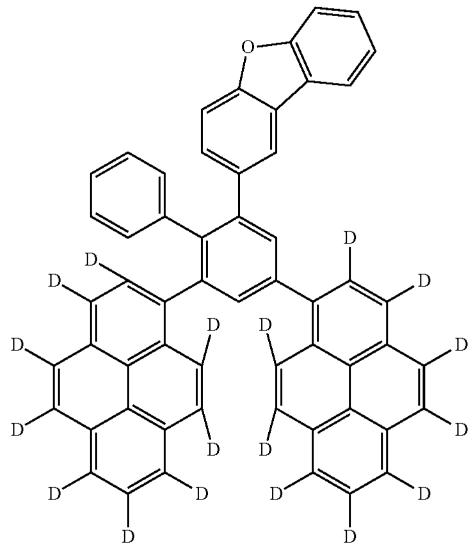
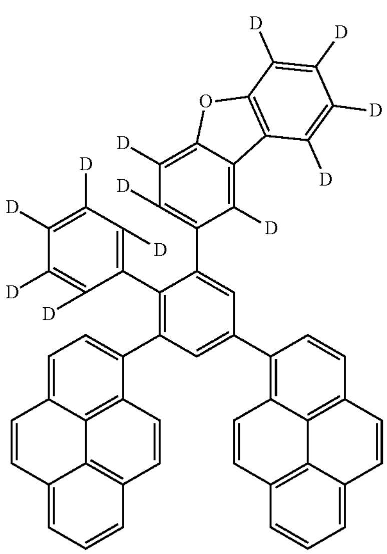

[Formula 369]
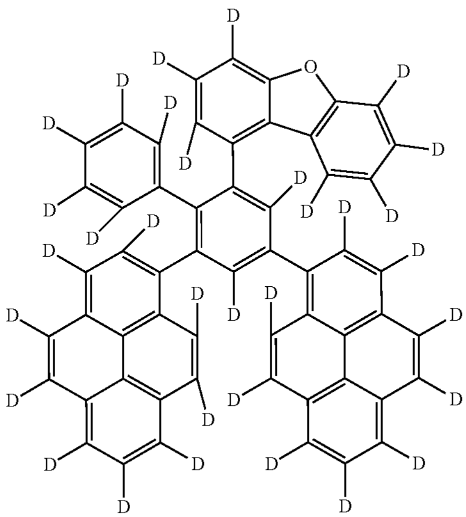
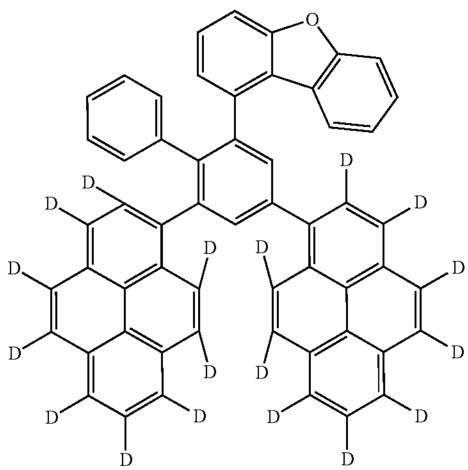
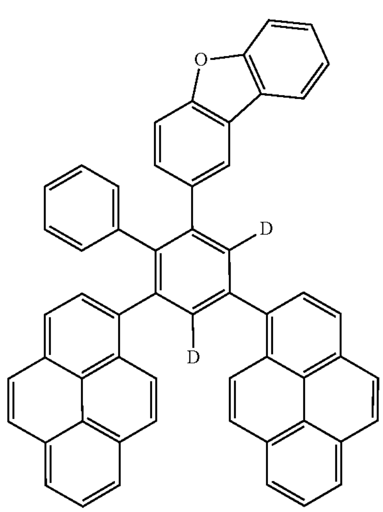
-continued
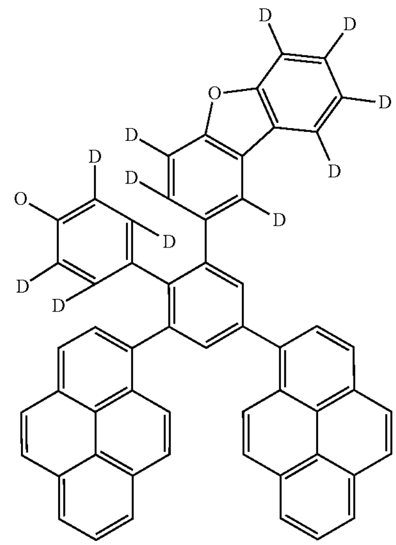 [SMILES: [2H]c1c([2H])c(-c2c(-c3c([2H])c([2H])c4oc5c([2H])c([2H])c([2H])c([2H])c5c4c3[2H])cc(-c3ccc4ccc5cccc6ccc3c4c56)cc2-c2ccc3ccc4cccc5ccc2c3c45)c([2H])c([2H])c1O]
[Formula 370]
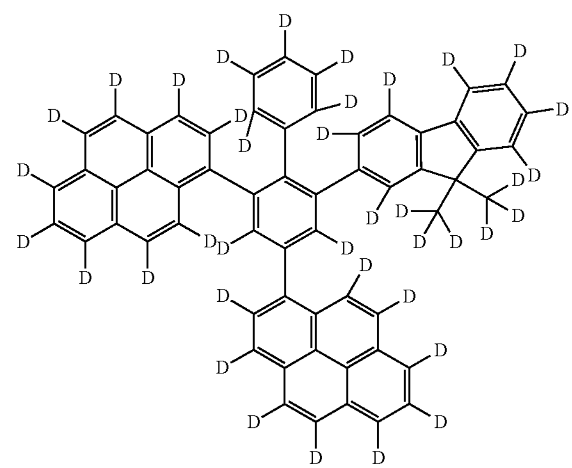
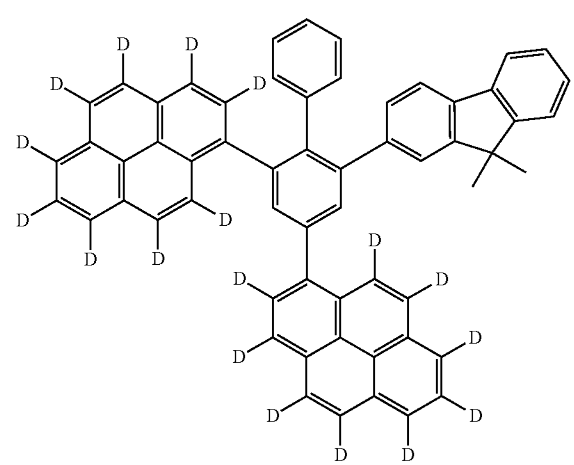

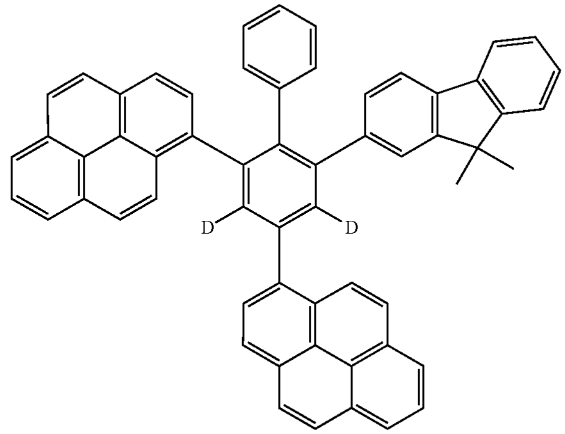
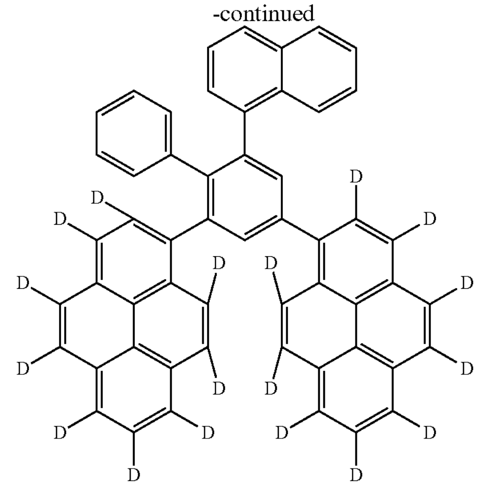
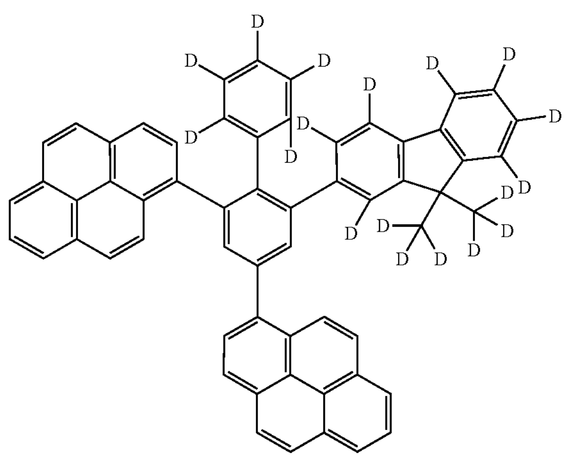
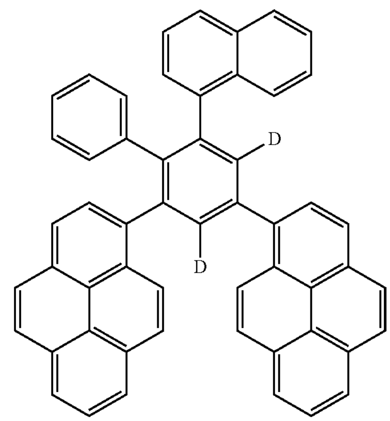 [SMILES: [2H]c1c(-c2ccc3ccc4cccc5ccc2c3c45)c([2H])c(-c2ccc3ccc4cccc5ccc2c3c45)c(-c2ccccc2)c1-c1cccc2ccccc12]
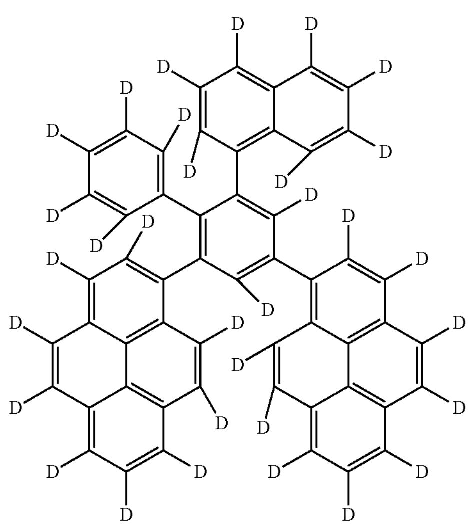
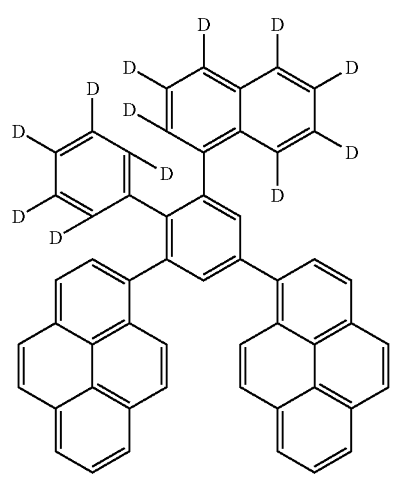

-continued
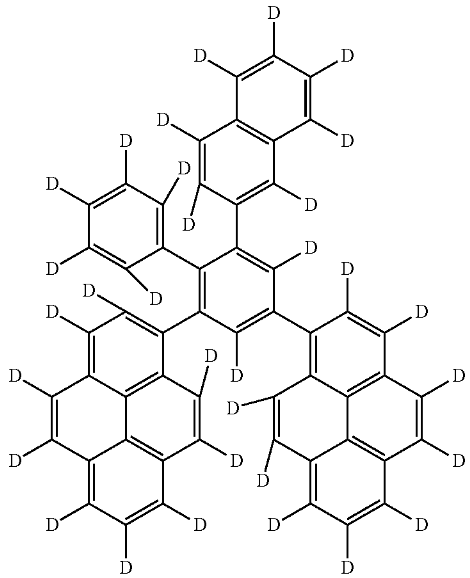
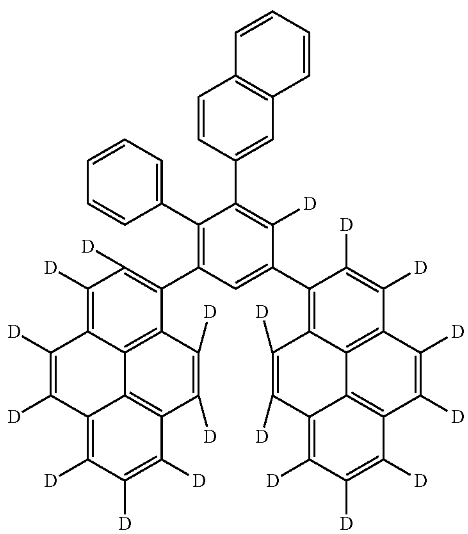
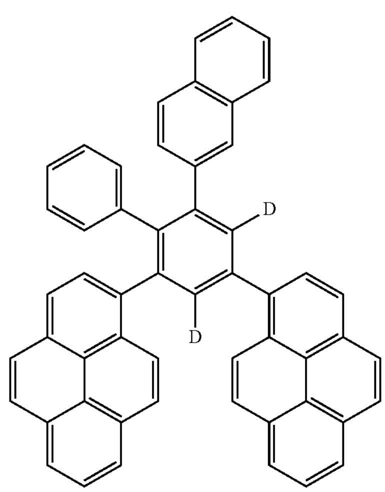
-continued
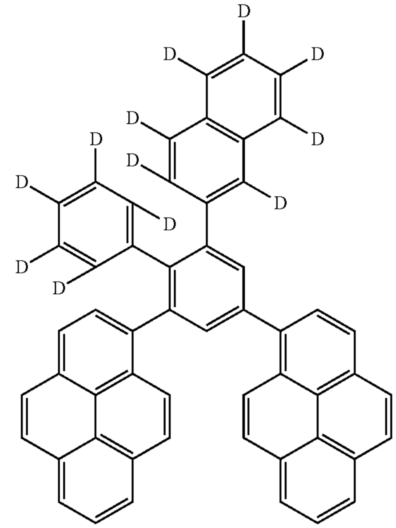
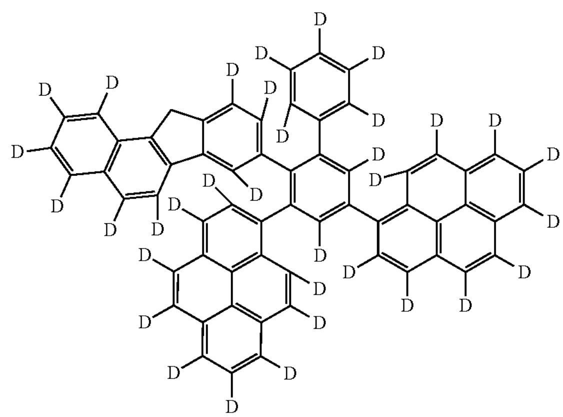
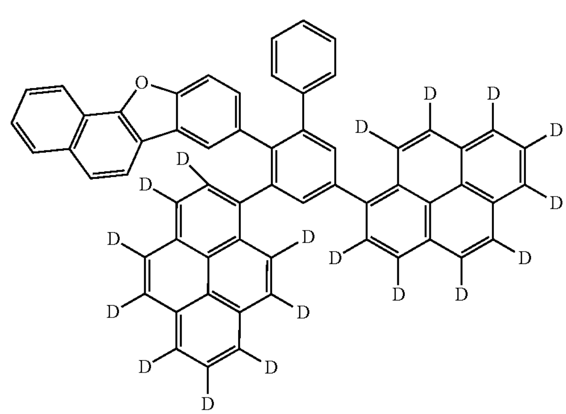

-continued
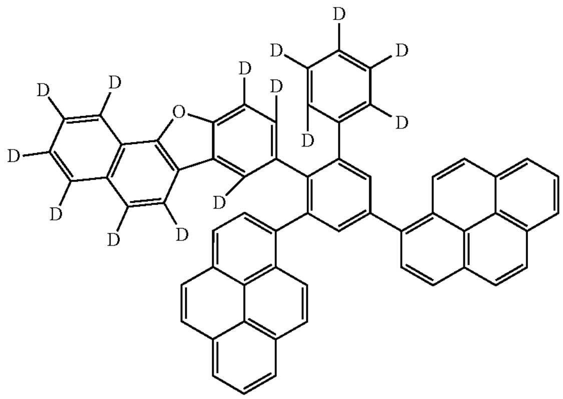
[Formula 372]
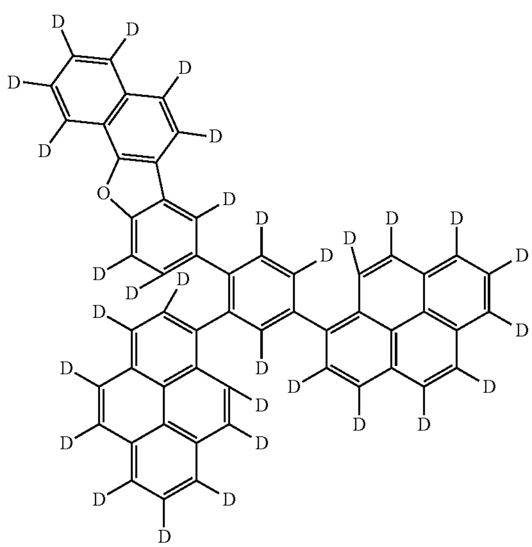
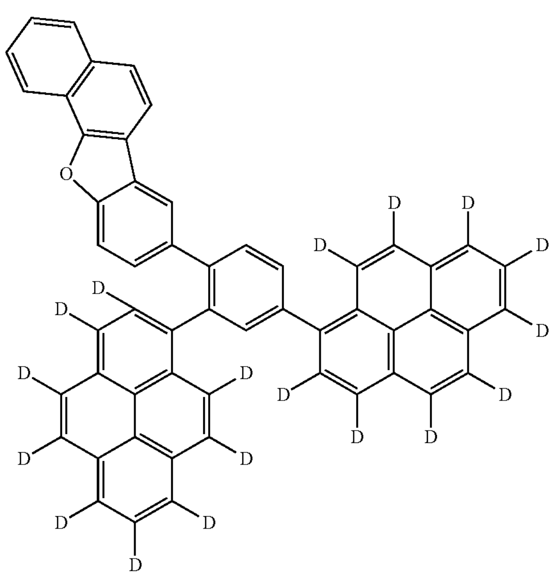
-continued
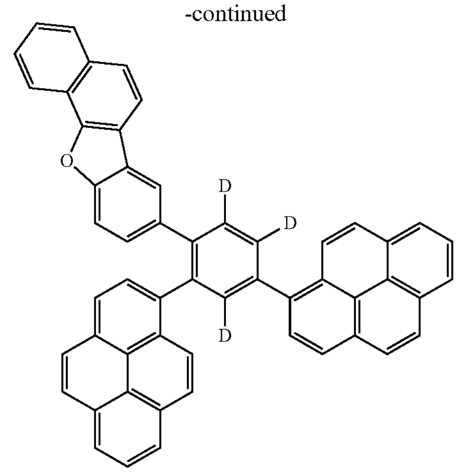
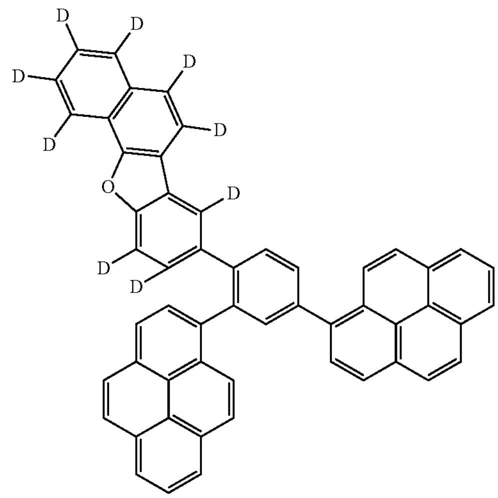 [SMILES: [2H]c1c(-c2ccc(-c3ccc4ccc5cccc6ccc3c4c56)cc2-c2ccc3ccc4cccc5ccc2c3c45)c([2H])c2c(oc3c4c([2H])c([2H])c([2H])c([2H])c4c([2H])c([2H])c32)c1[2H]]
[Formula 373]
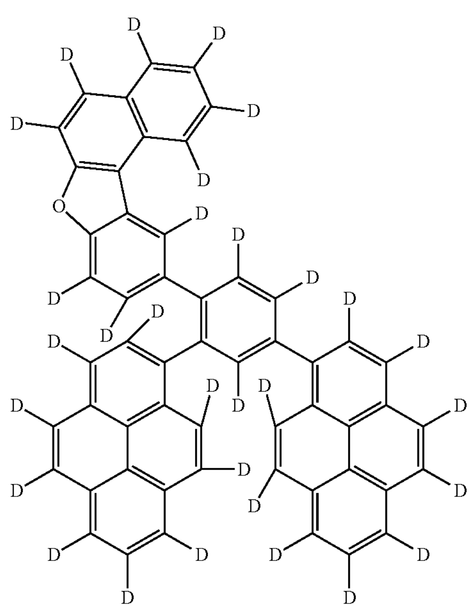

-continued
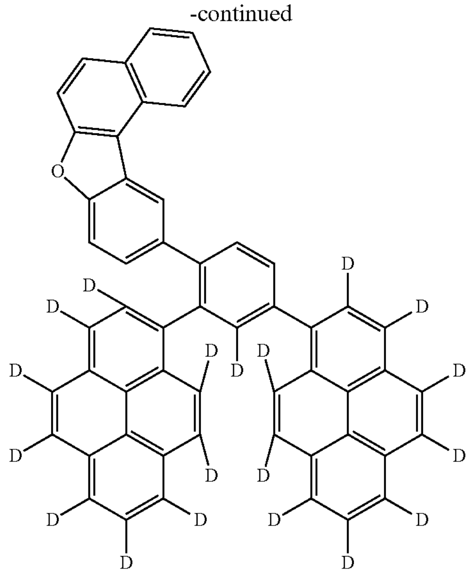
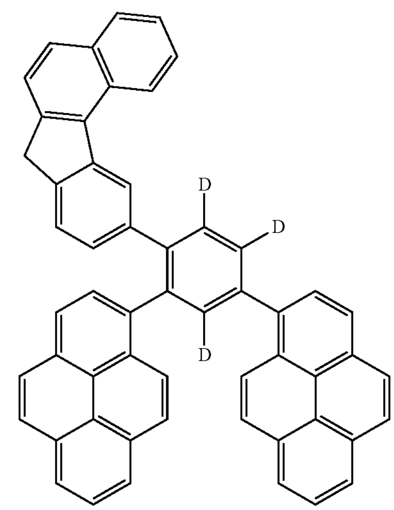
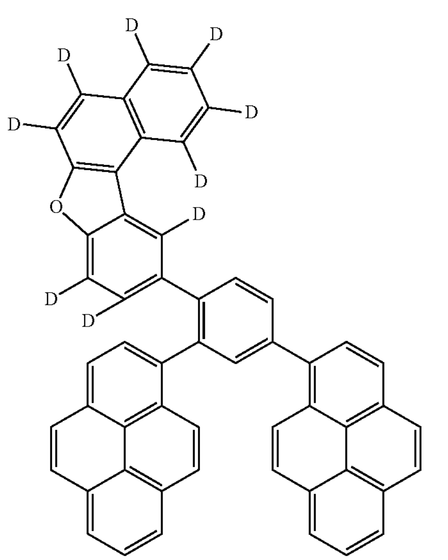
-continued
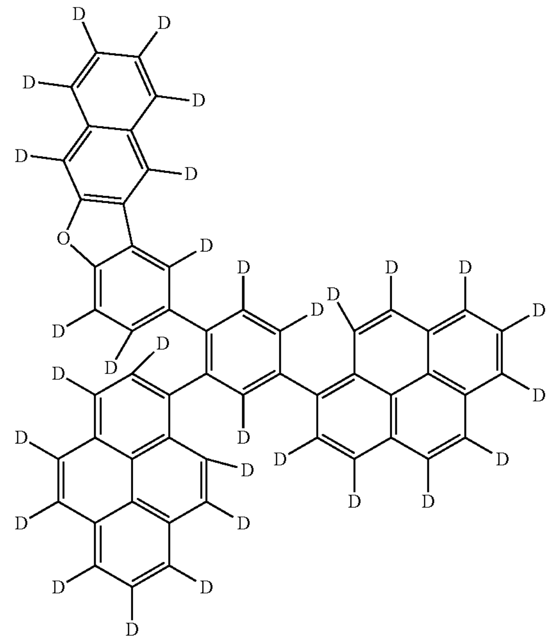
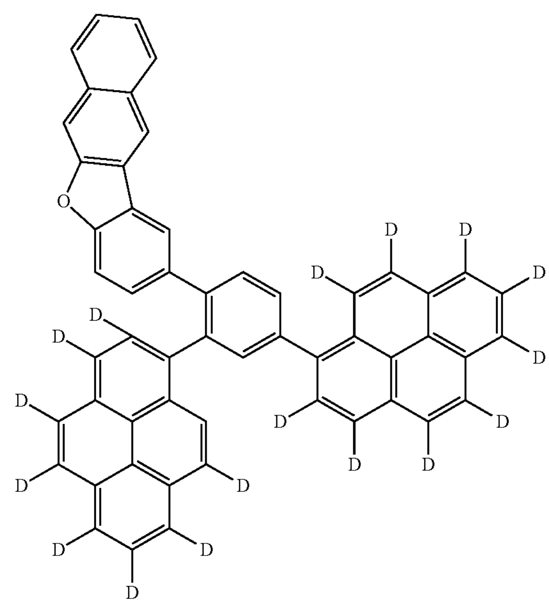

-continued
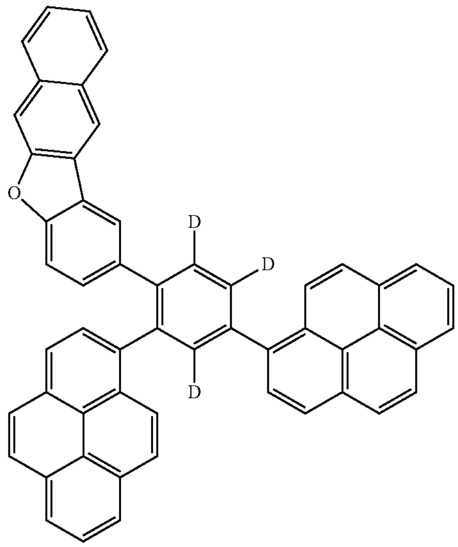
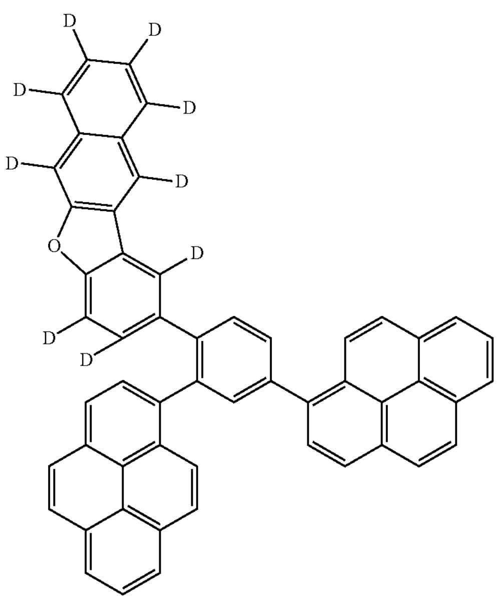 [SMILES: [2H]c1c(-c2ccc(-c3ccc4ccc5cccc6ccc3c4c56)cc2-c2ccc3ccc4cccc5ccc2c3c45)c([2H])c2c(oc3c([2H])c4c([2H])c([2H])c([2H])c([2H])c4c([2H])c32)c1[2H]]
[Formula 374]
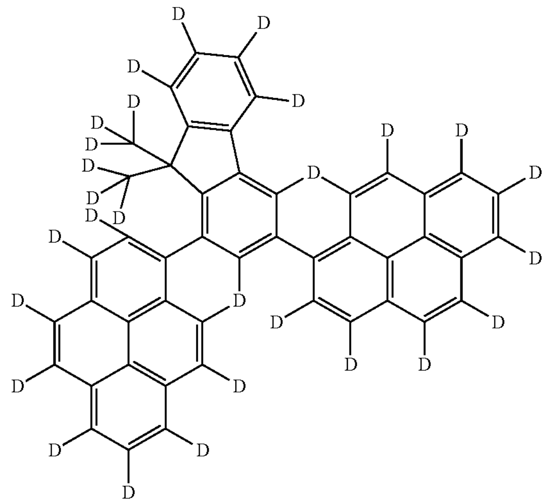
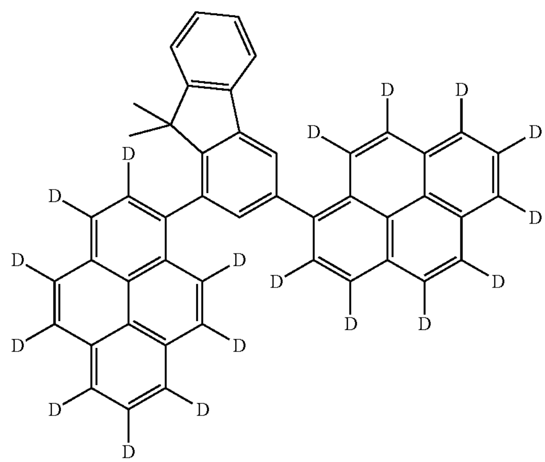
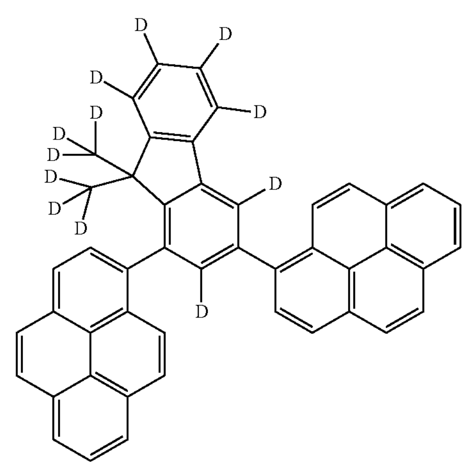

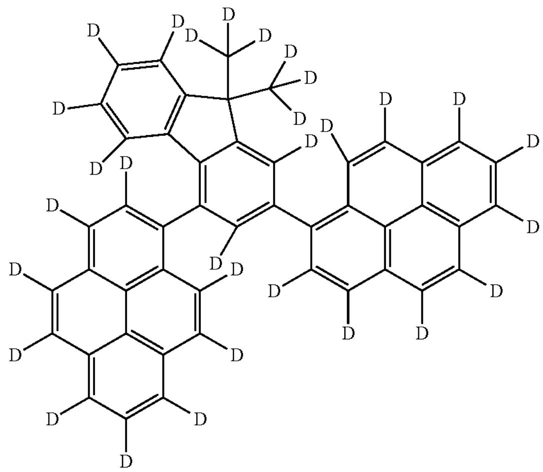
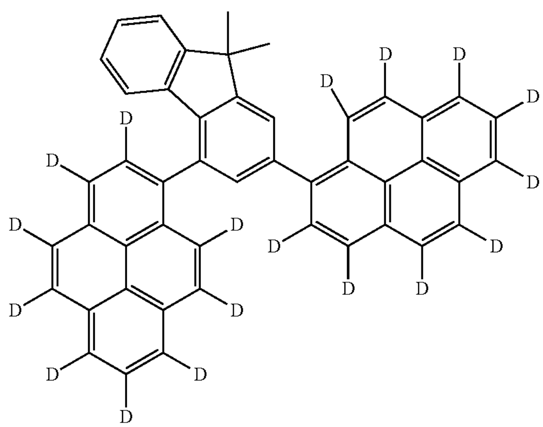
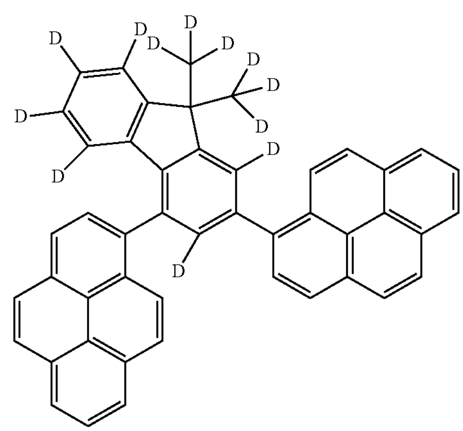
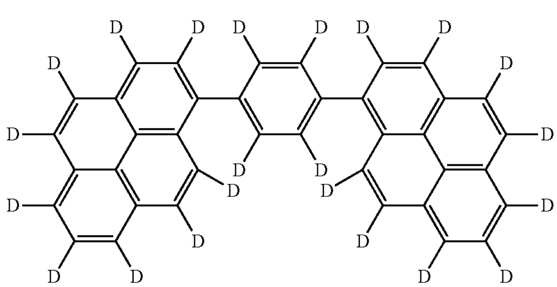
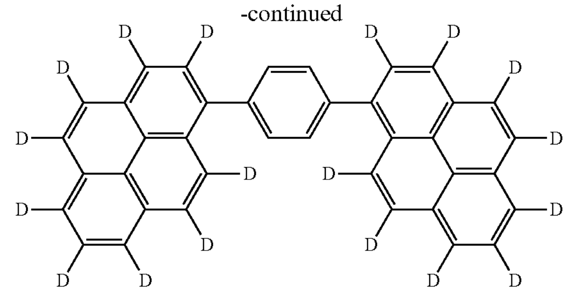
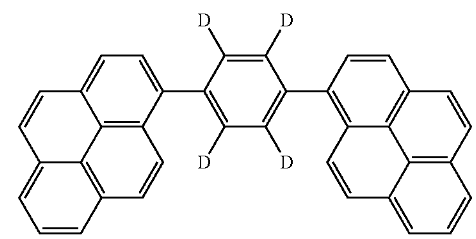
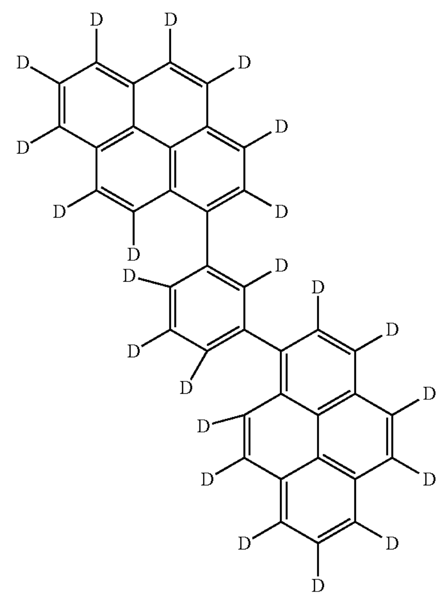
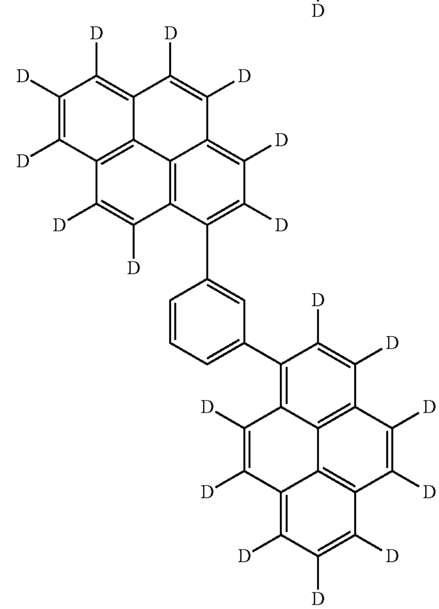

-continued
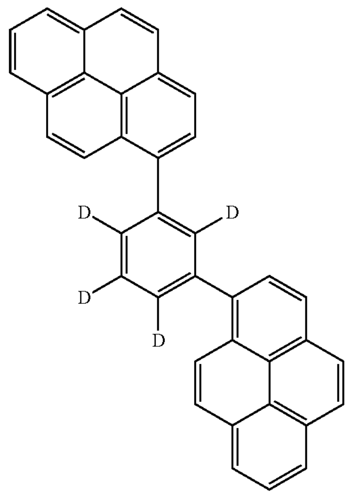
[Formula 375]
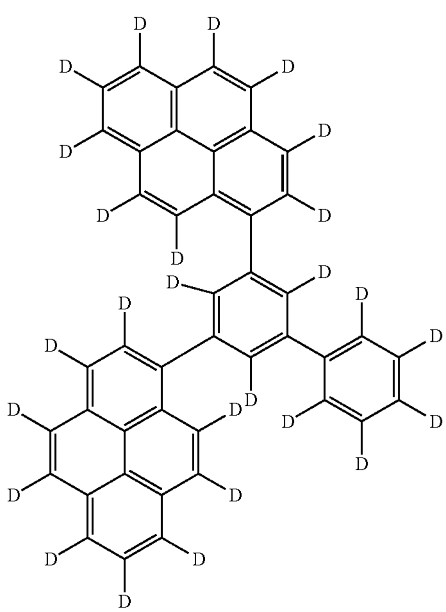
-continued
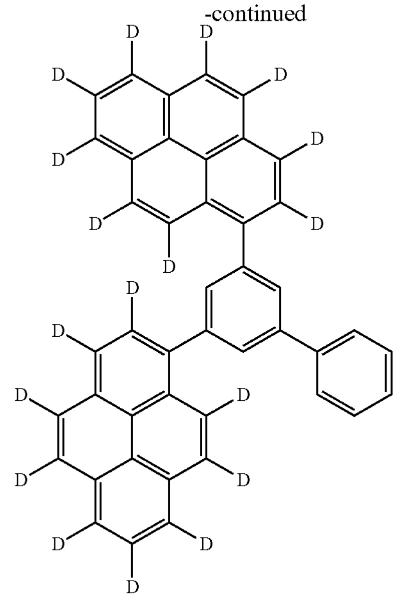
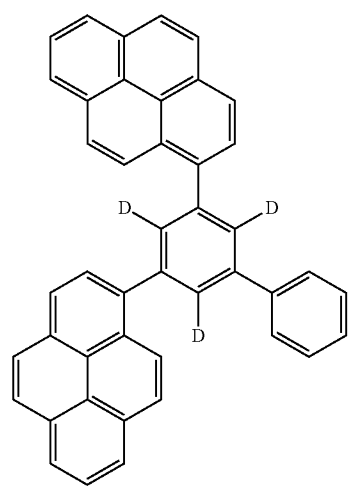
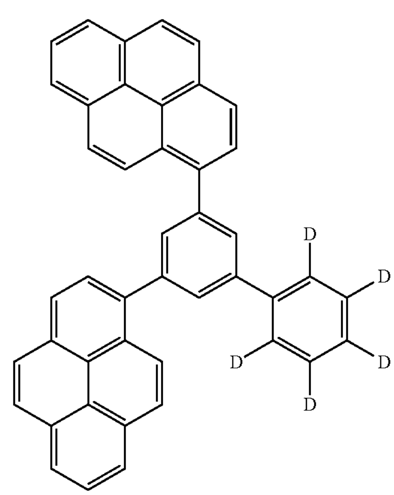

-continued
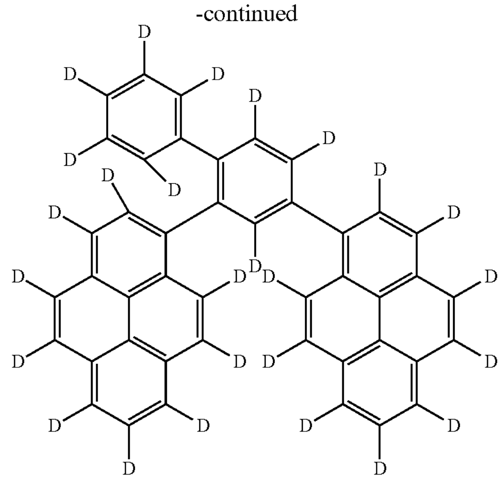
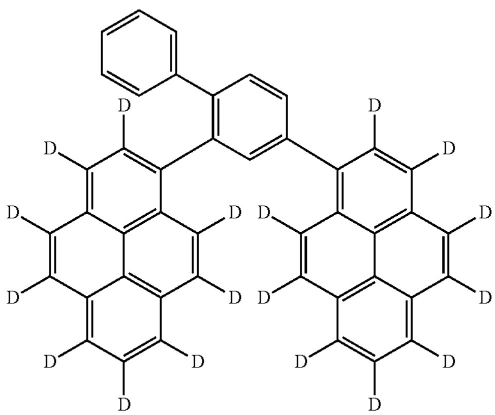
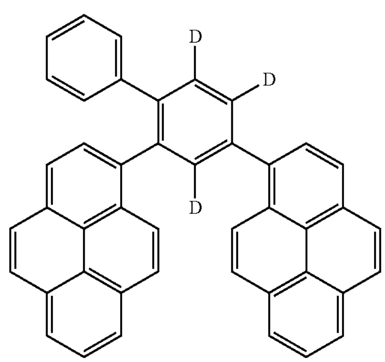
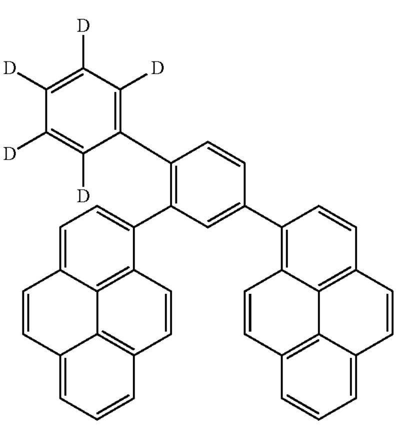
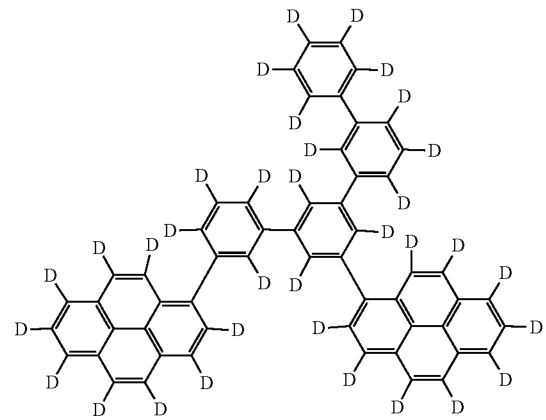
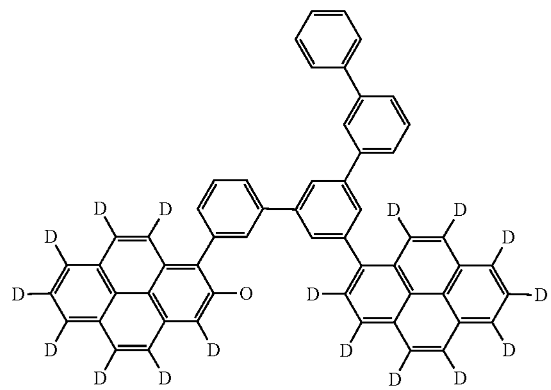
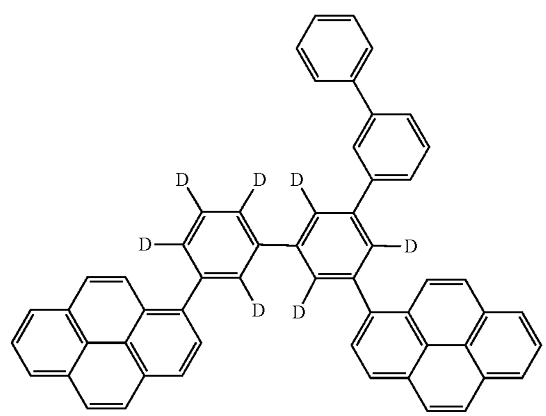
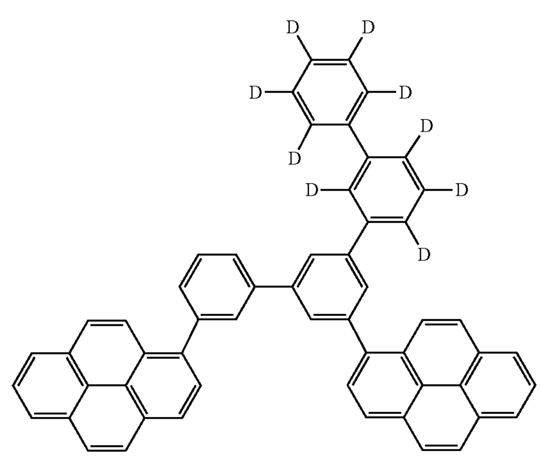

-continued
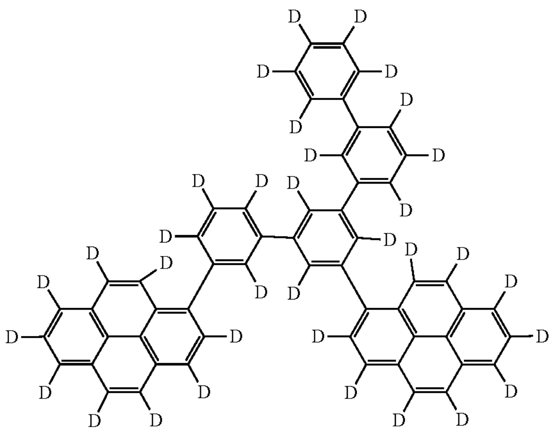
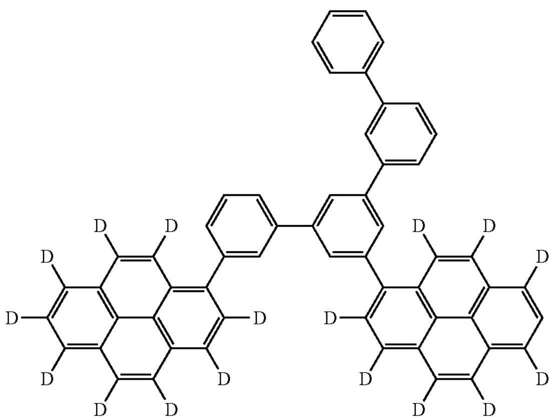
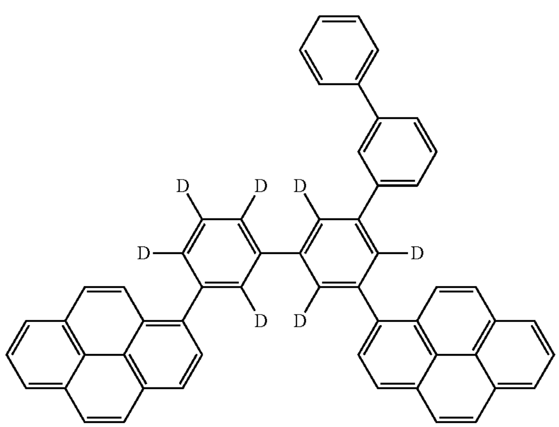
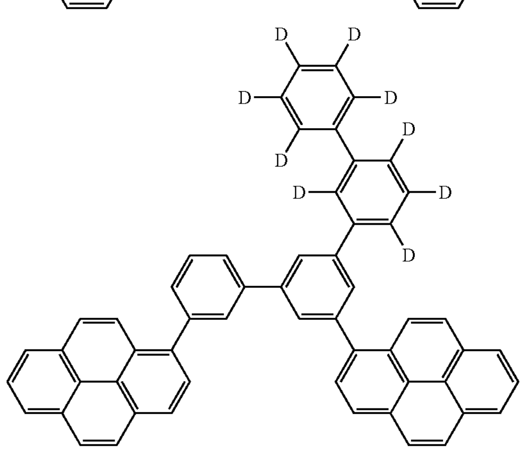
-continued
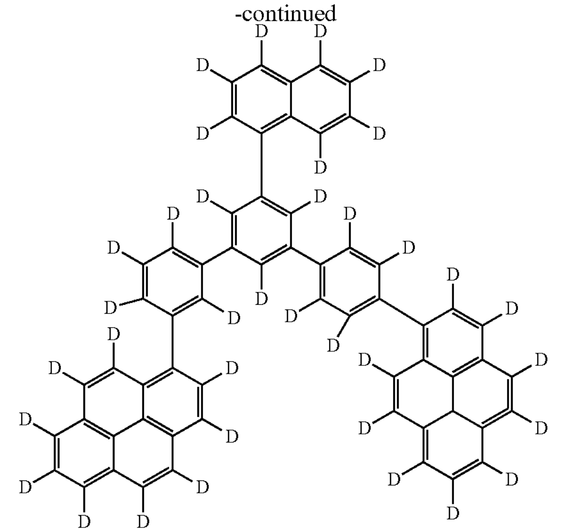
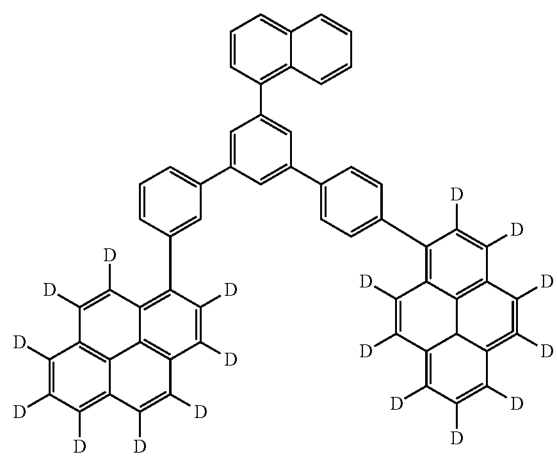
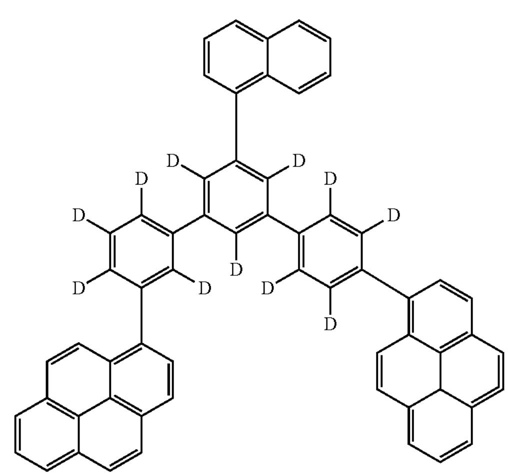

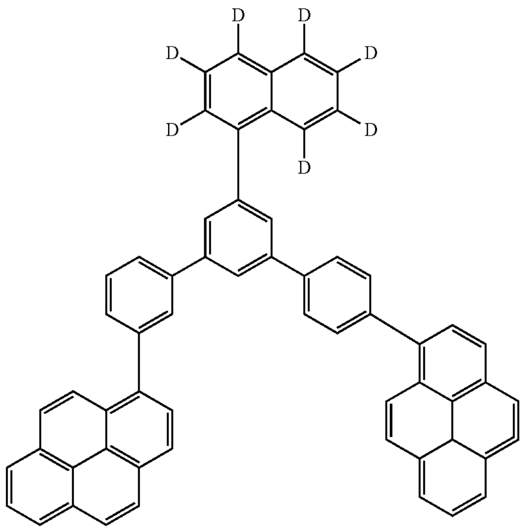
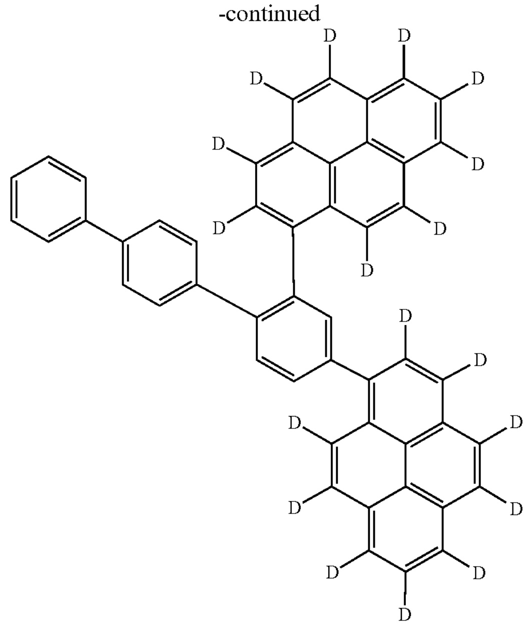
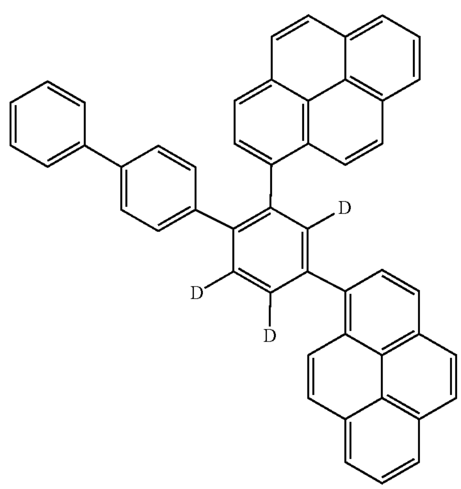
[Formula 377]
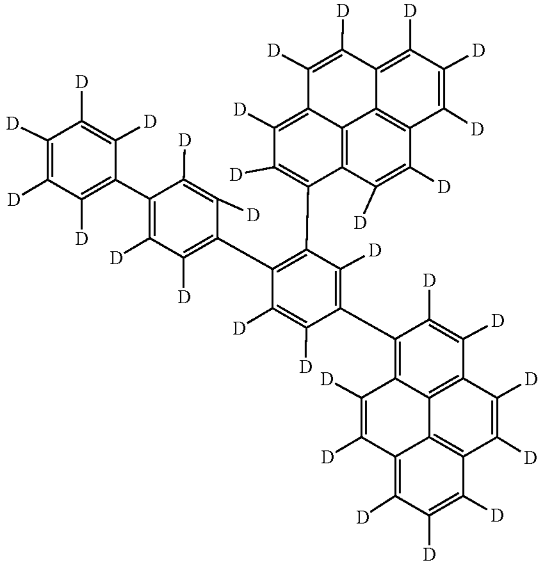
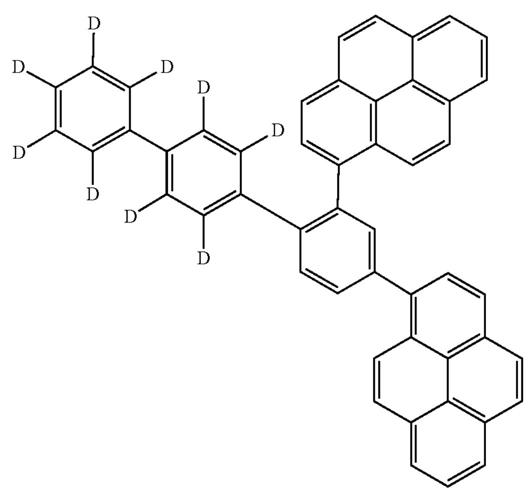

-continued
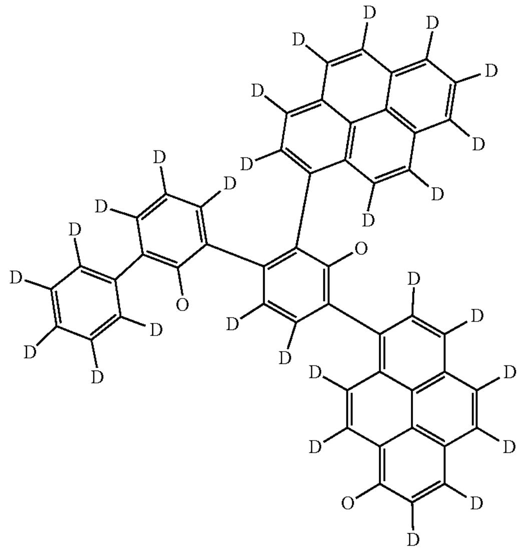
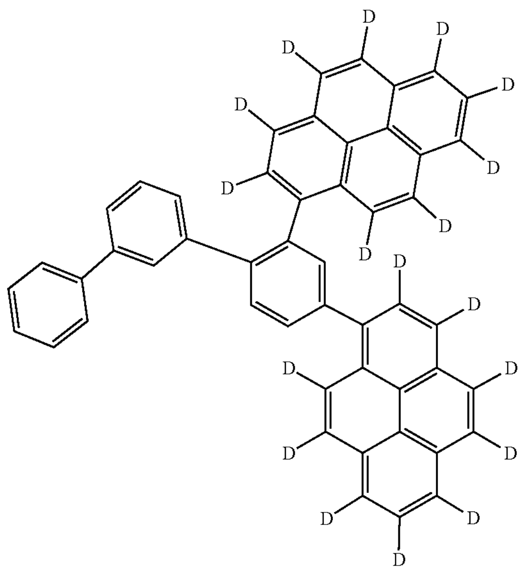
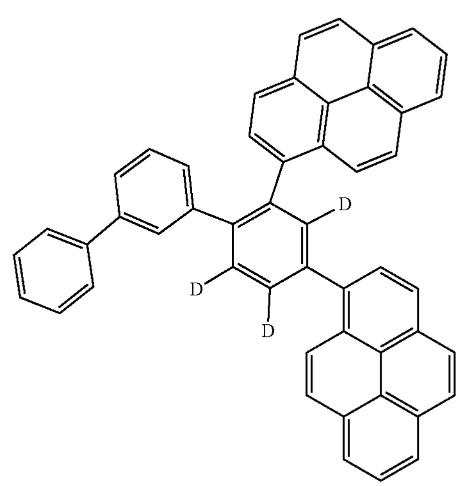
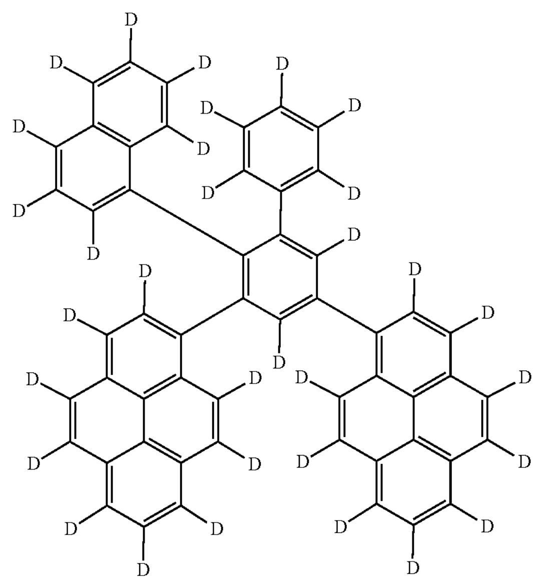
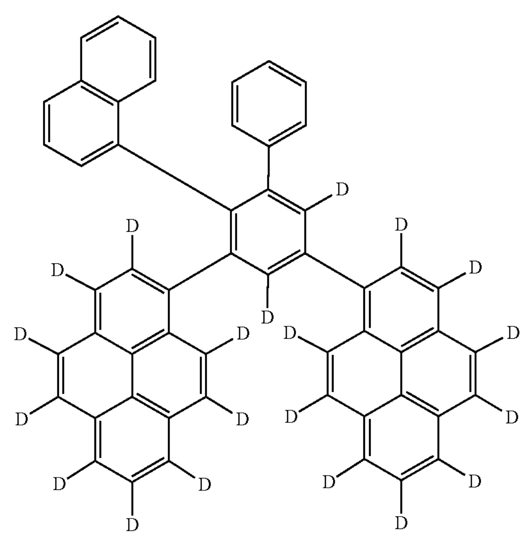
-continued
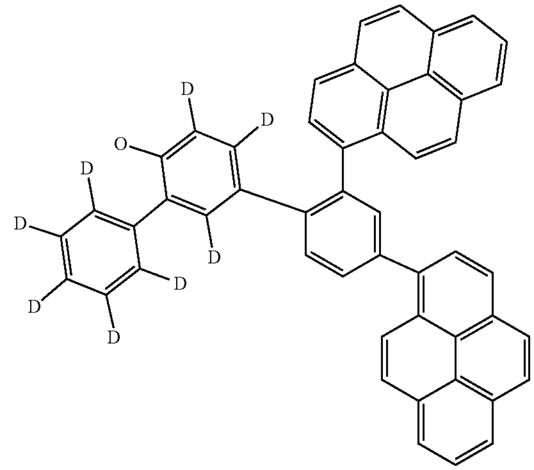

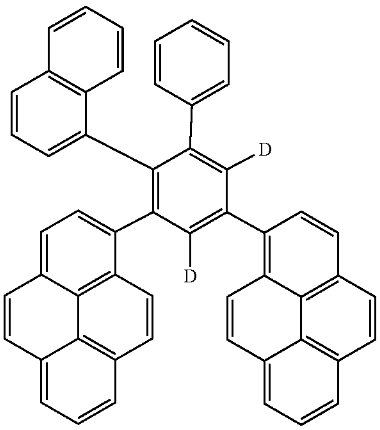
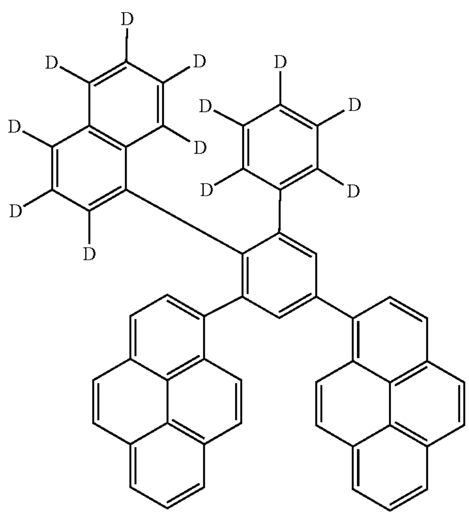
[Formula 378]
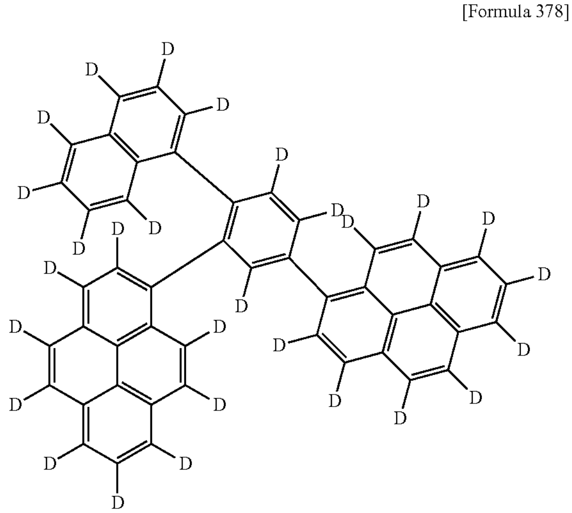
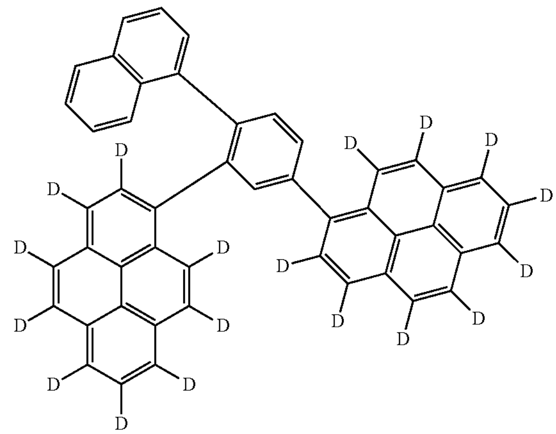
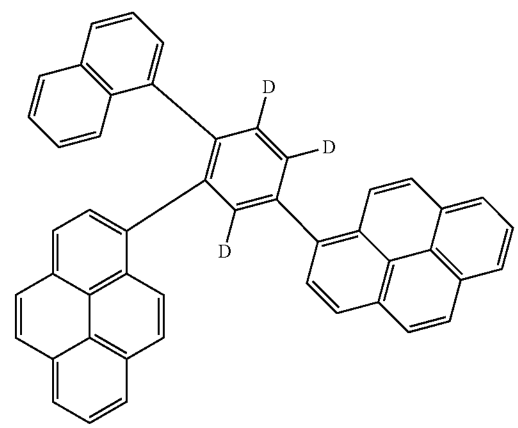
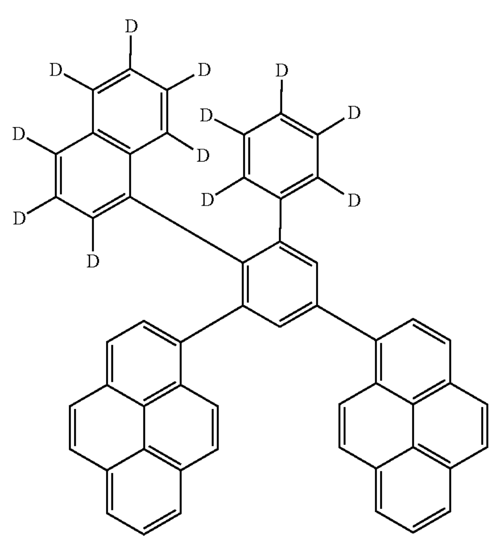

-continued
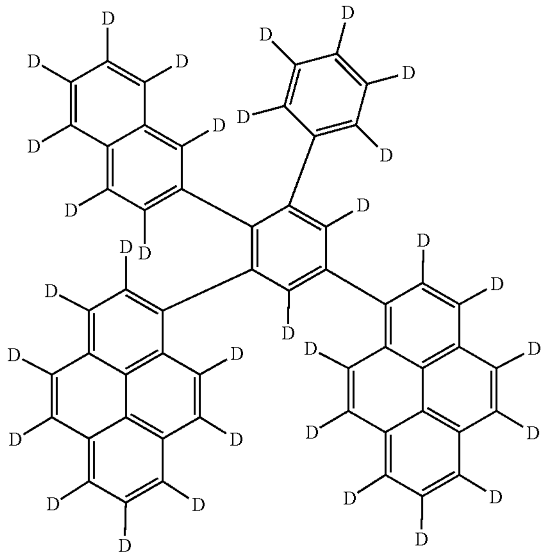
-continued
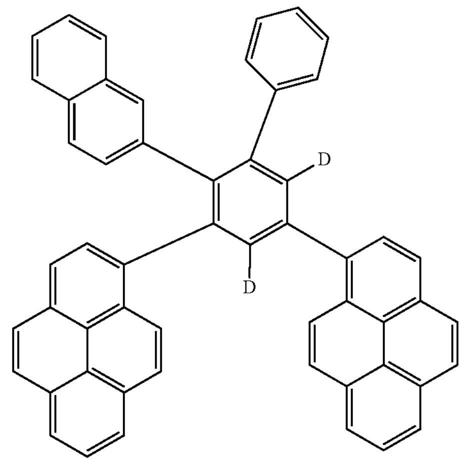
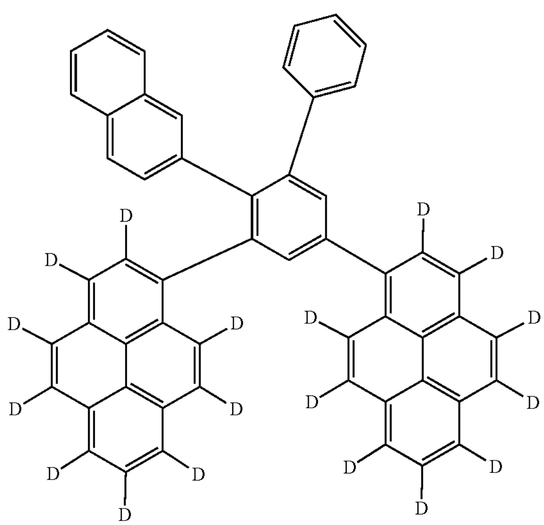
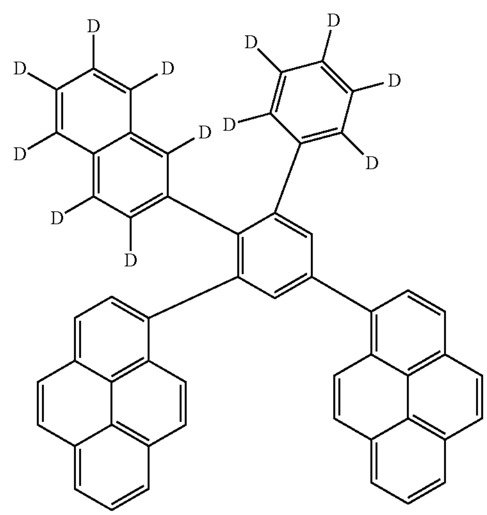

-continued
[Formula 379]
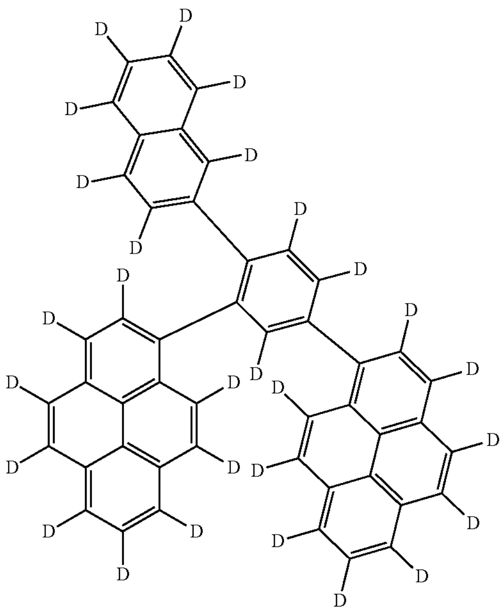
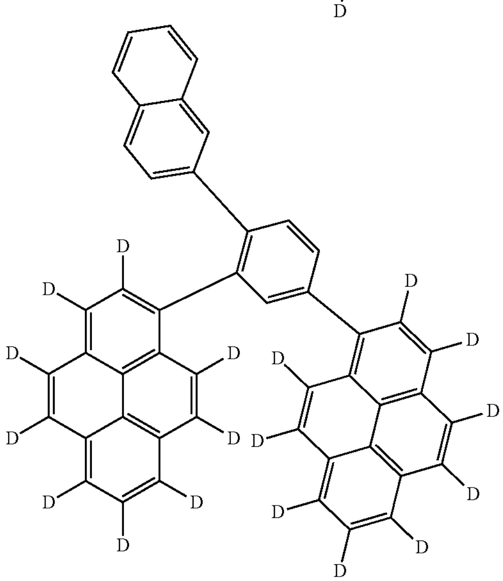
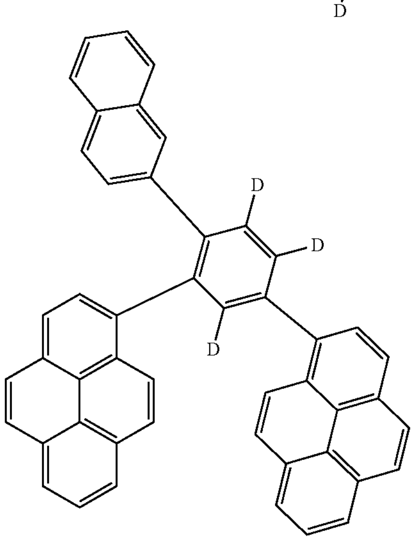
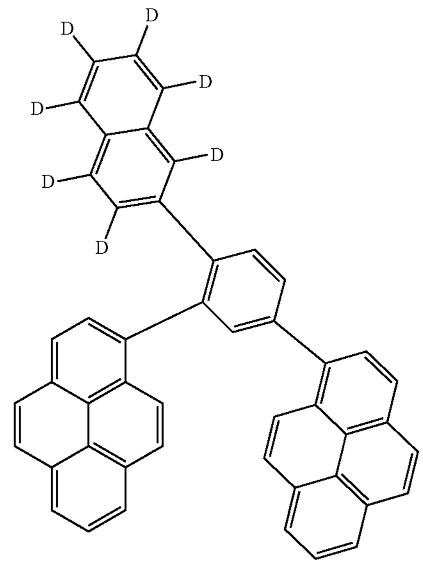
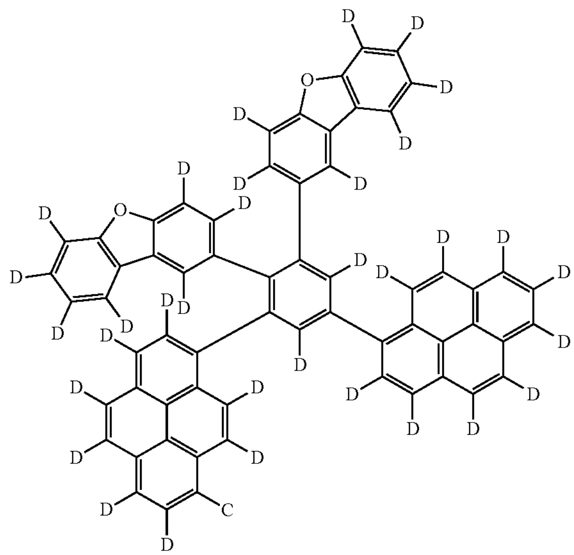
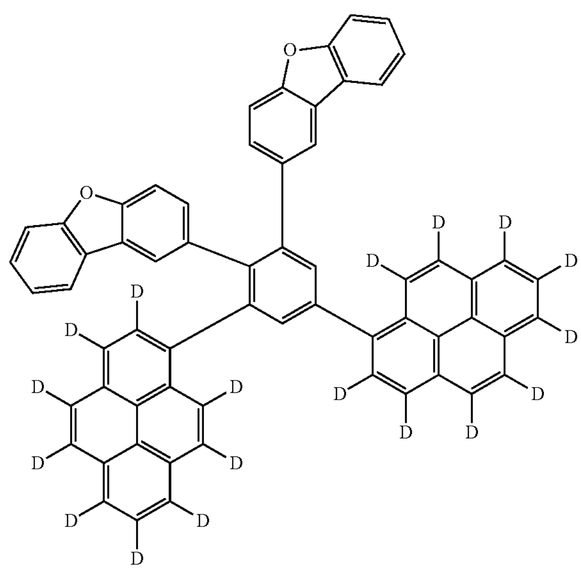

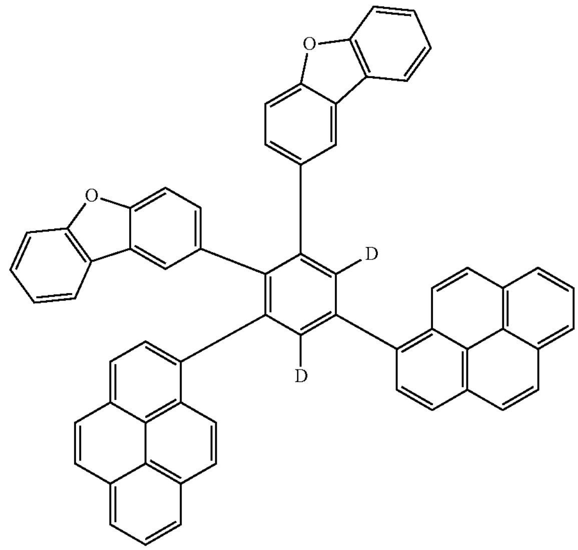
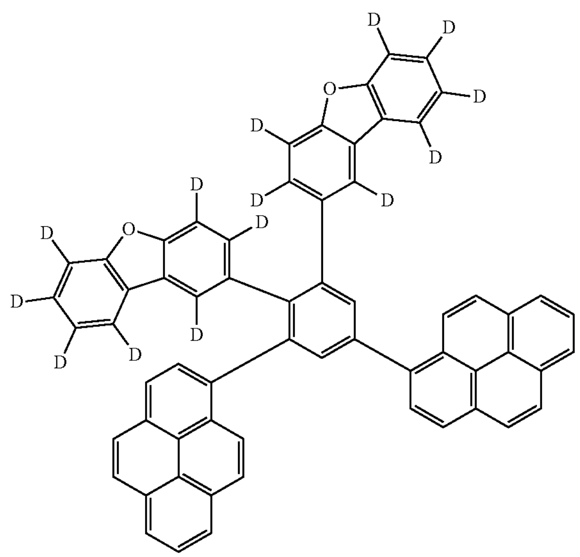
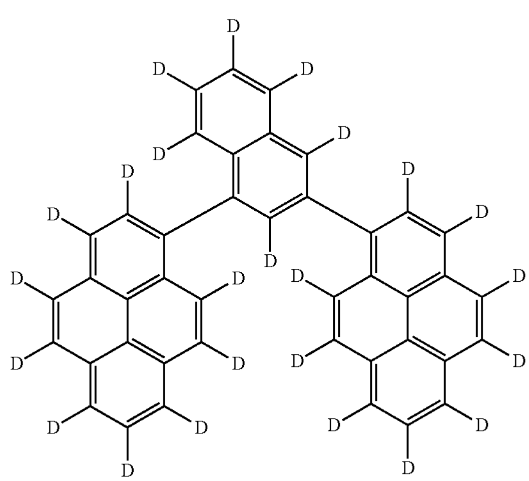
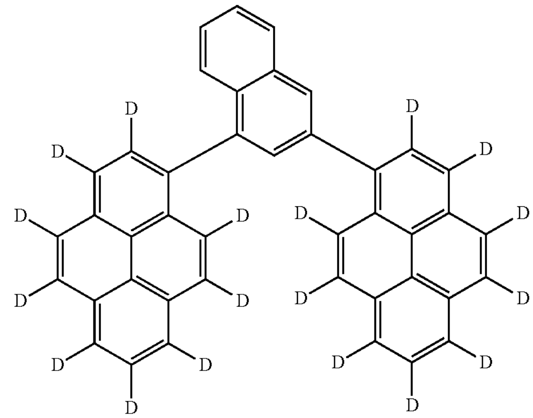
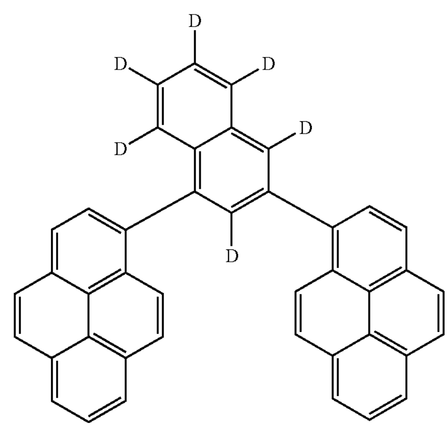
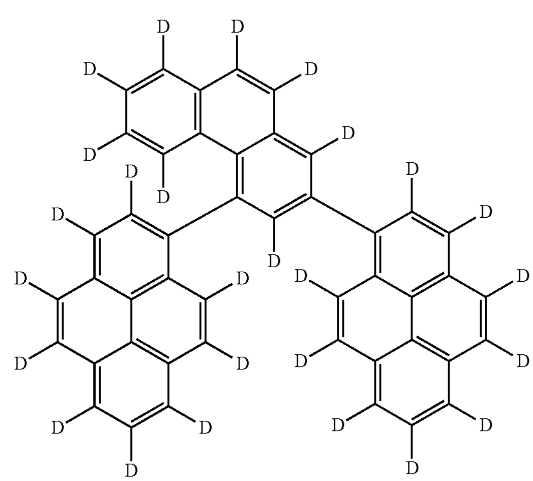 [SMILES: [2H]c1c([2H])c([2H])c2c(c1[2H])c([2H])c([2H])c1c([2H])c(-c3c([2H])c([2H])c4c([2H])c([2H])c5c([2H])c([2H])c([2H])c6c([2H])c([2H])c3c4c56)c([2H])c(-c3c([2H])c([2H])c4c([2H])c([2H])c5c([2H])c([2H])c([2H])c6c([2H])c([2H])c3c4c56)c12]

[Formula 380]
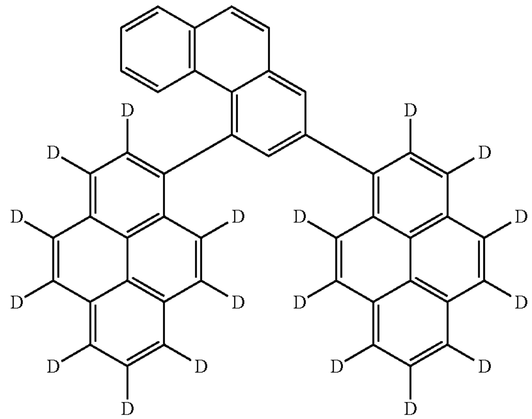
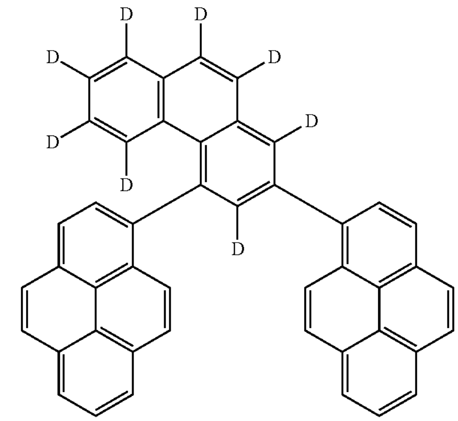
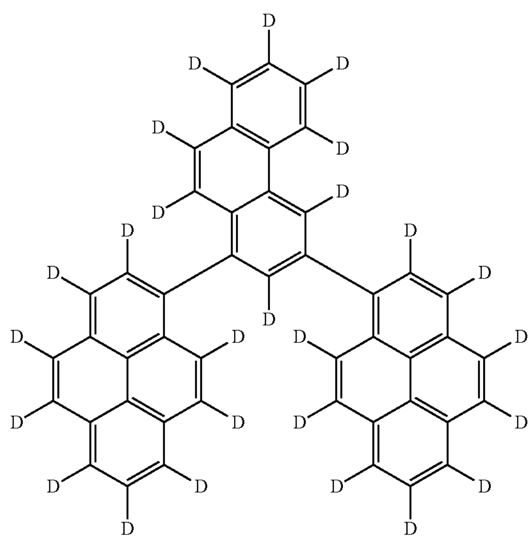
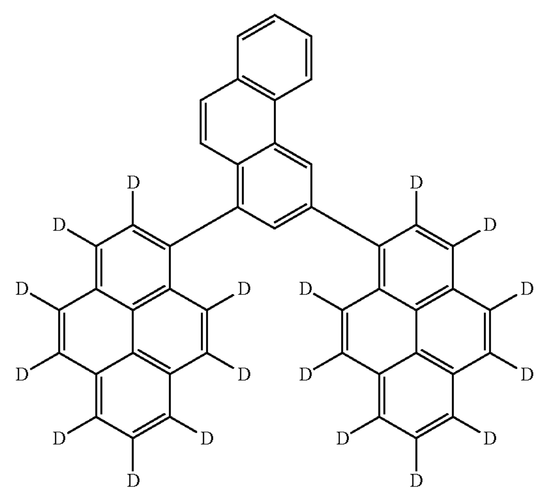
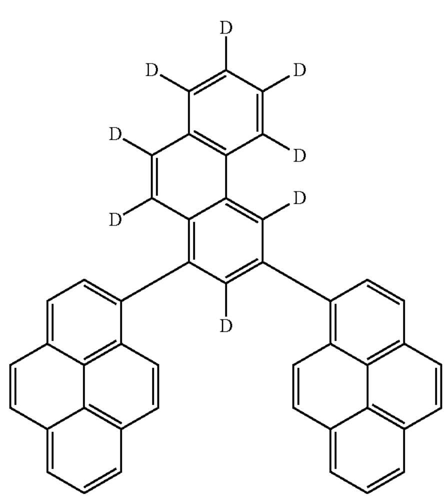
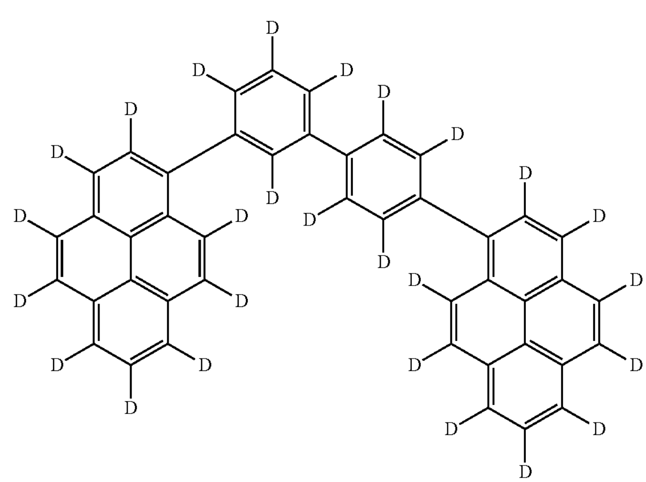

-continued
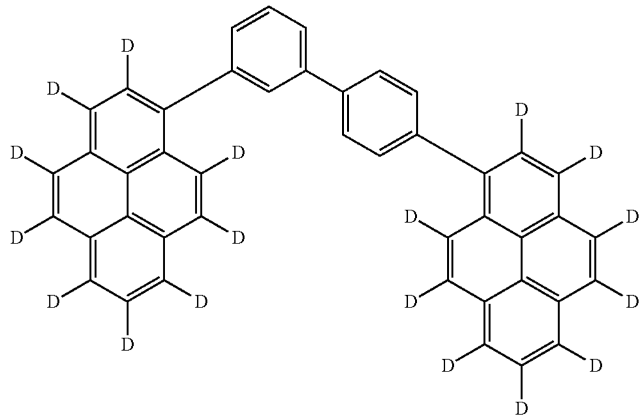
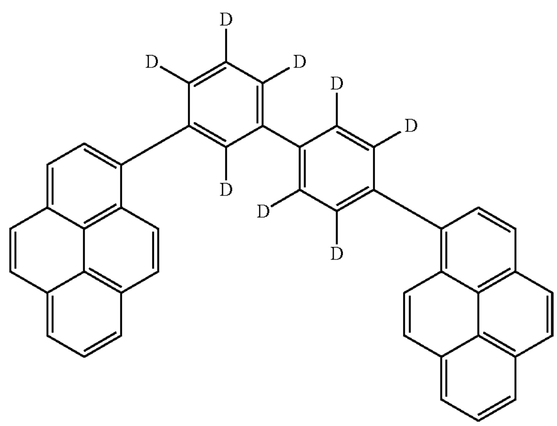
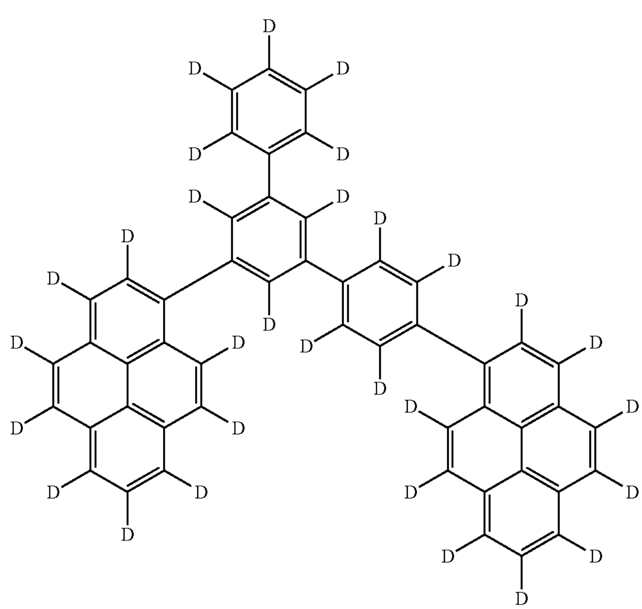

-continued
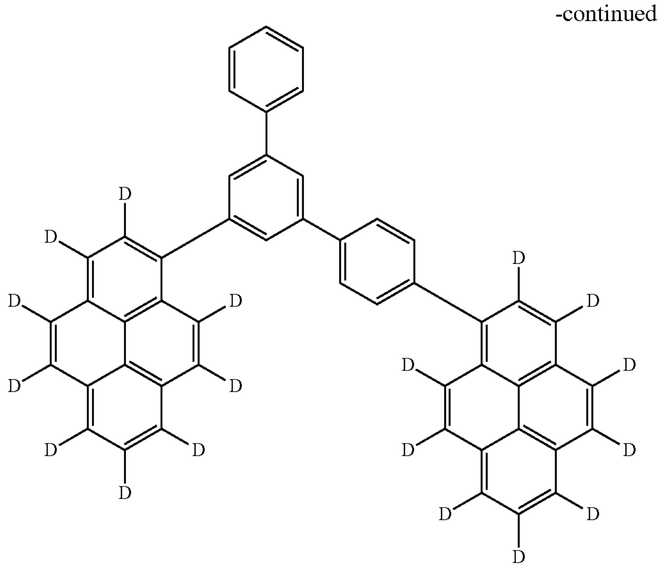
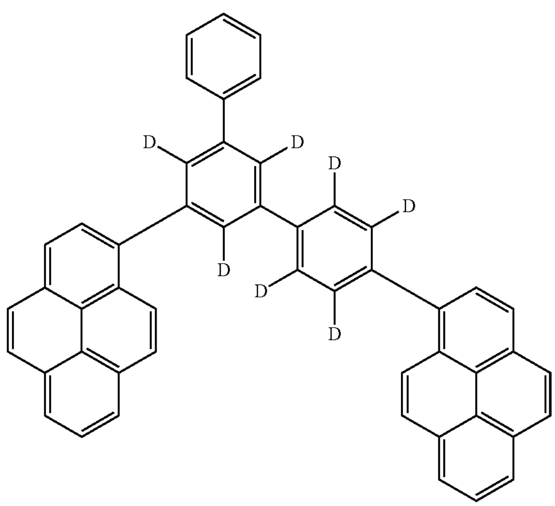
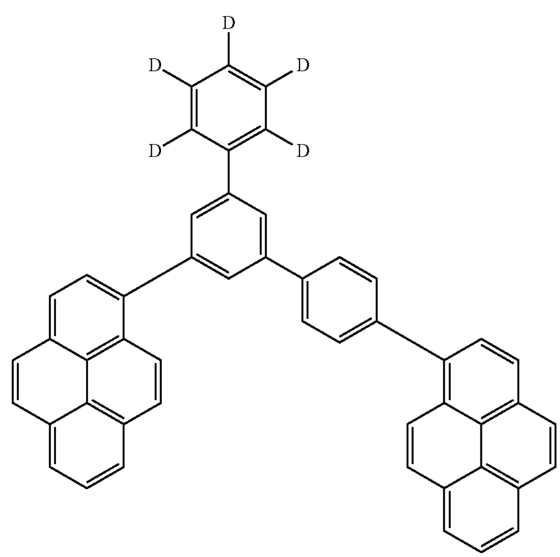
[Formula 381]
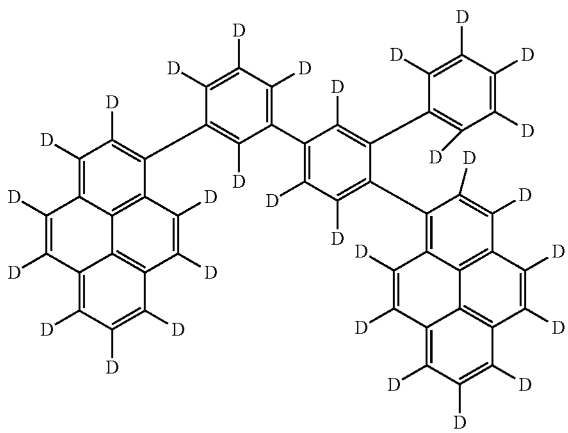
-continued
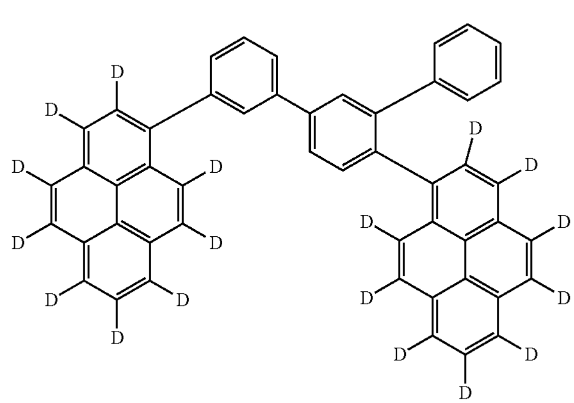

-continued
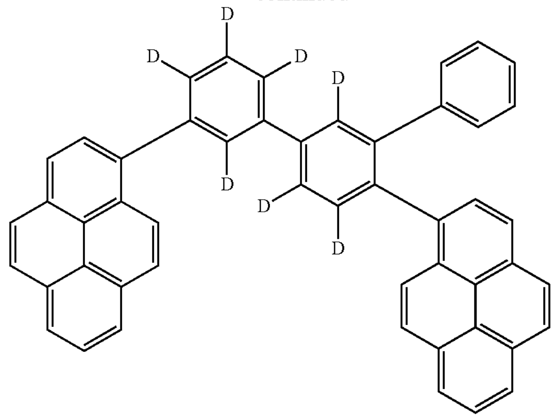
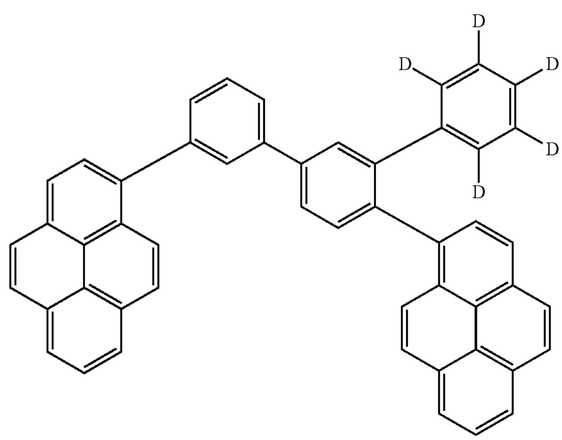
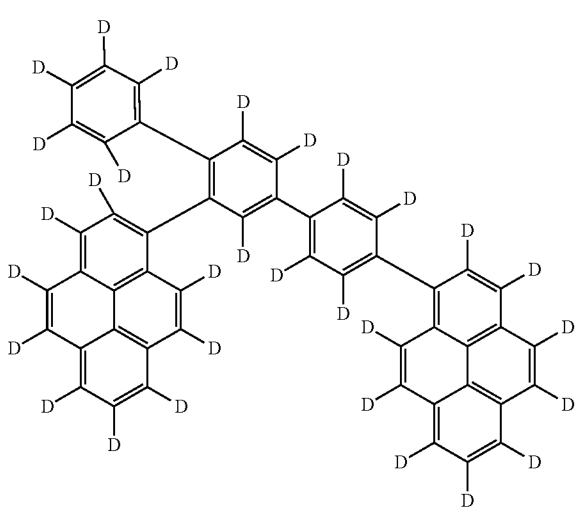
-continued
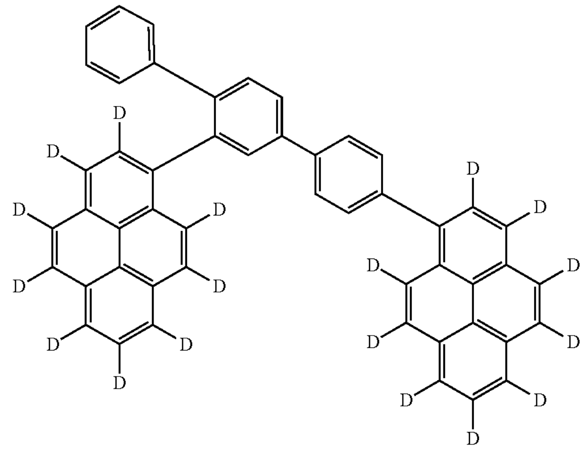
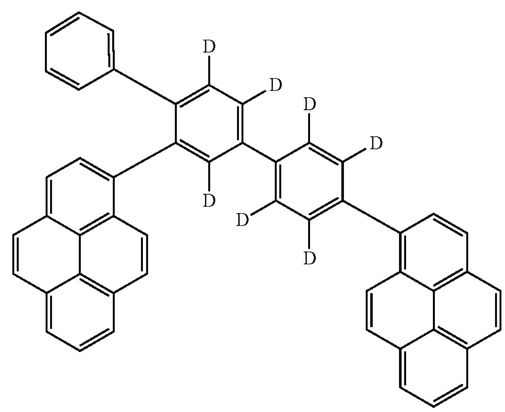
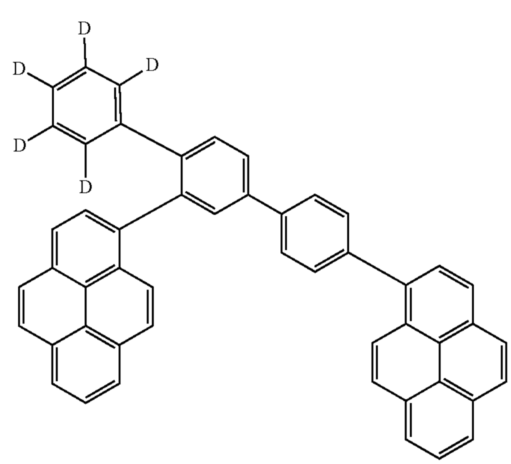

-continued
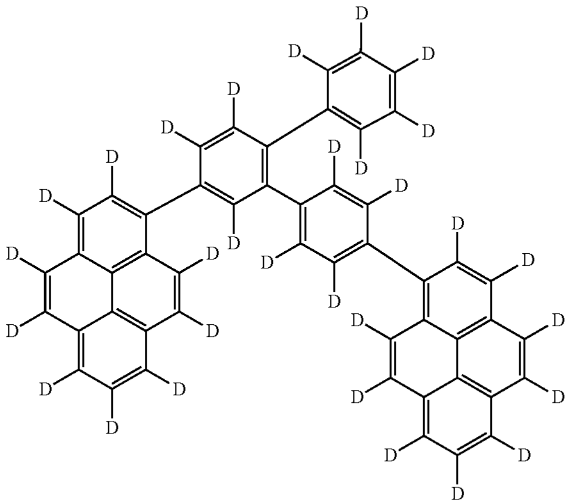
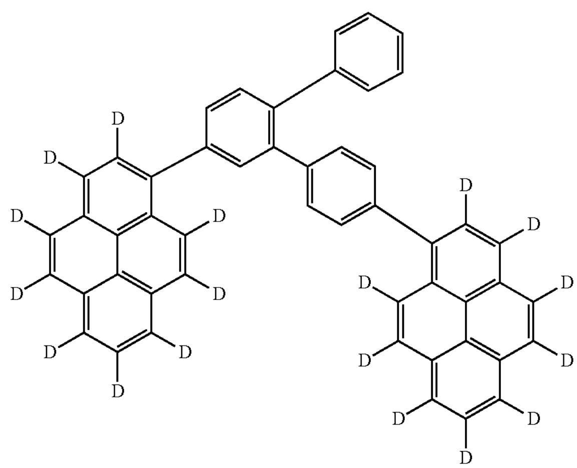
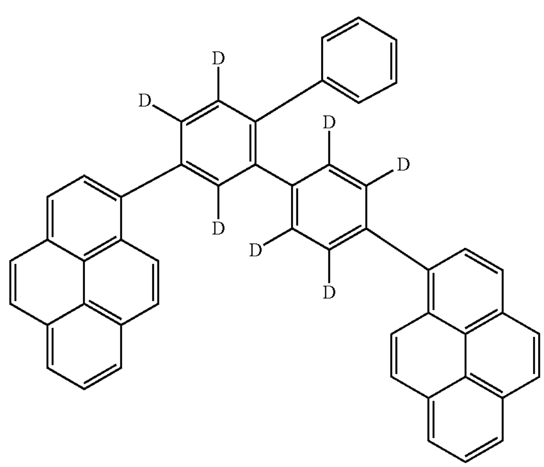
-continued
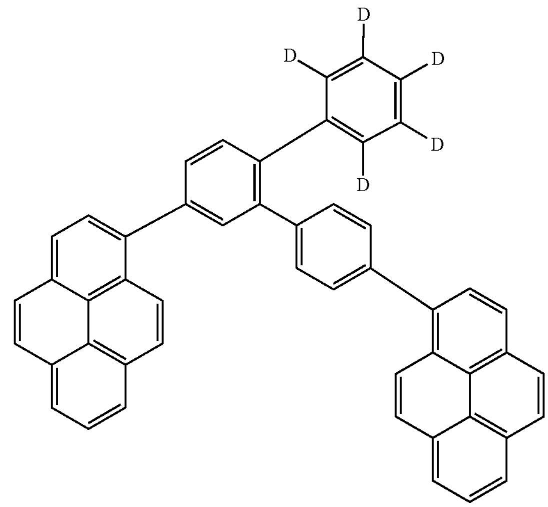
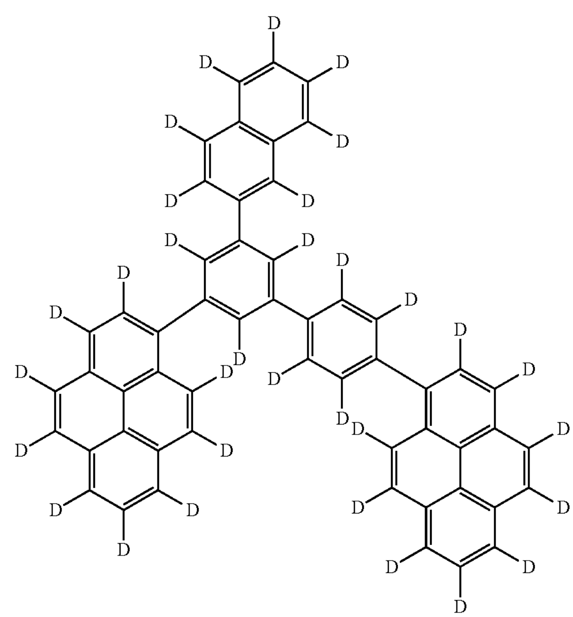

-continued
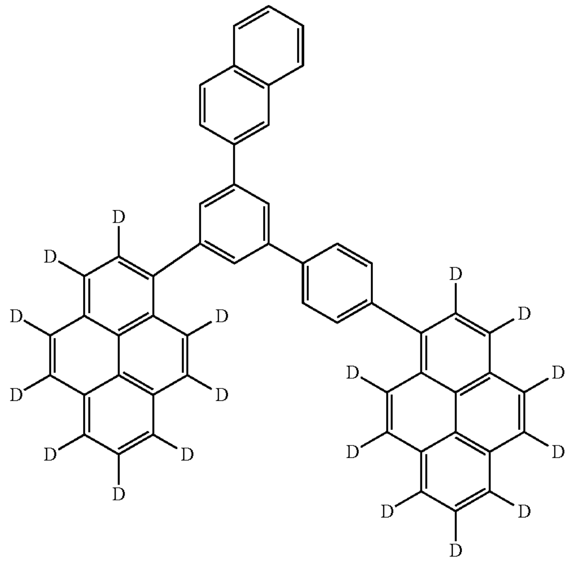
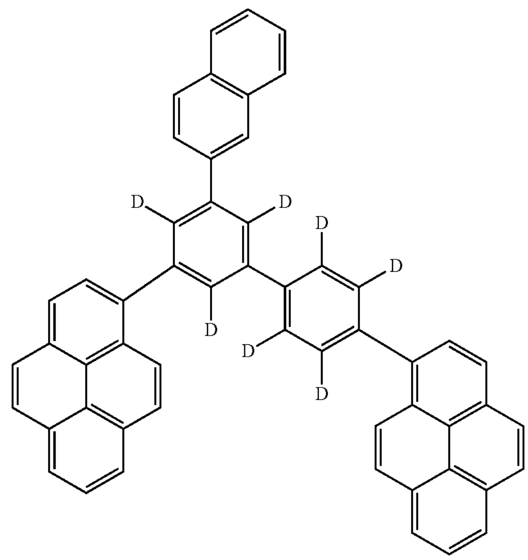
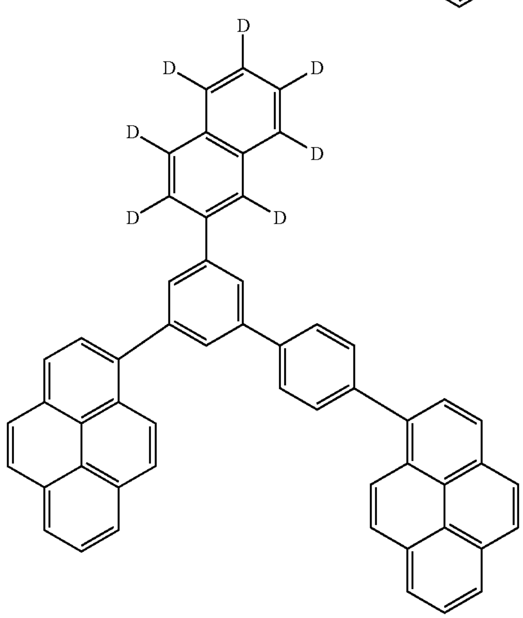
-continued
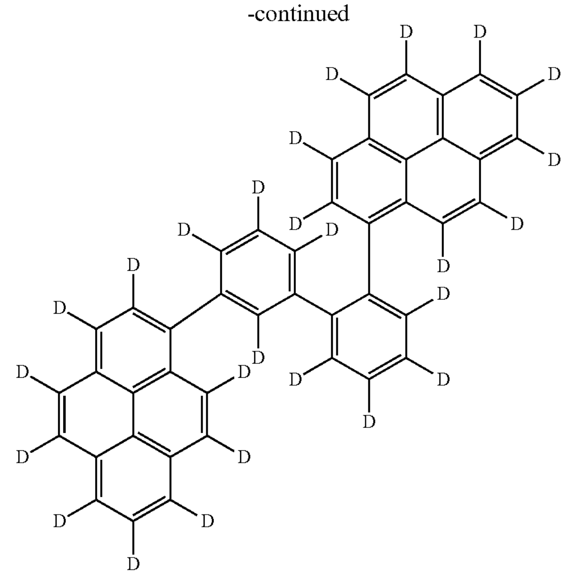
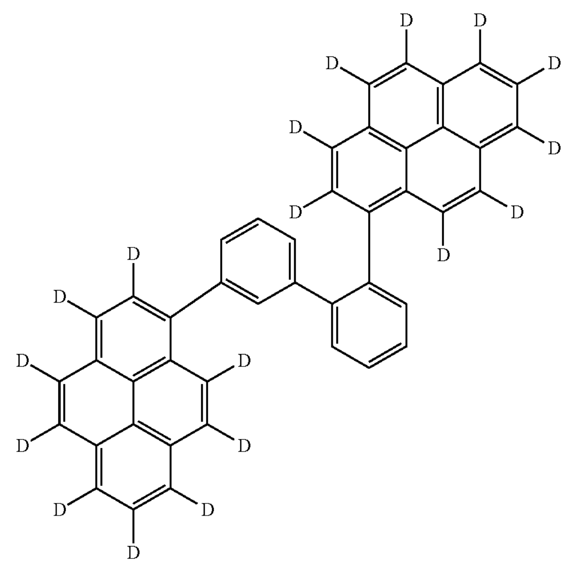
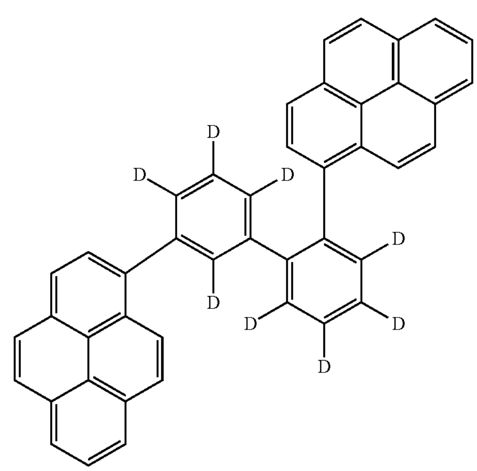

-continued
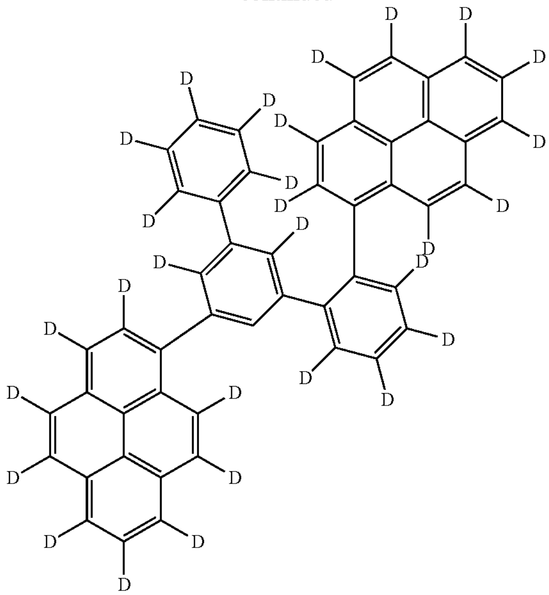
[Formula 383]
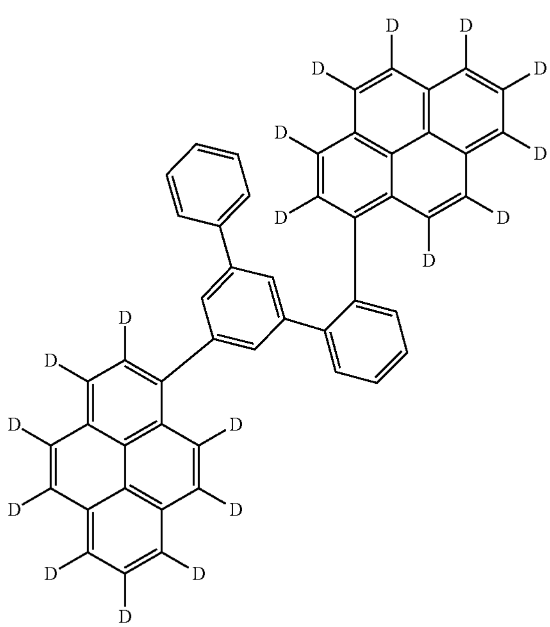
-continued
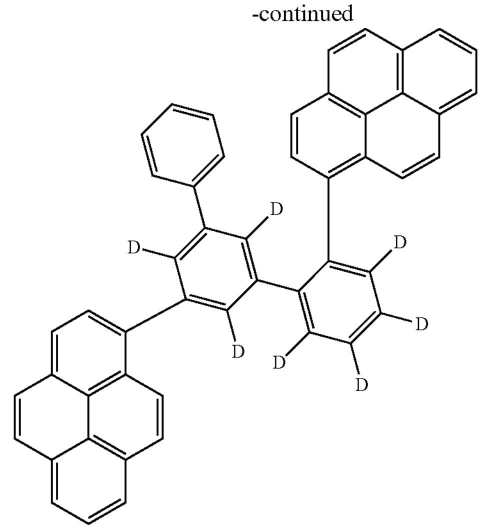
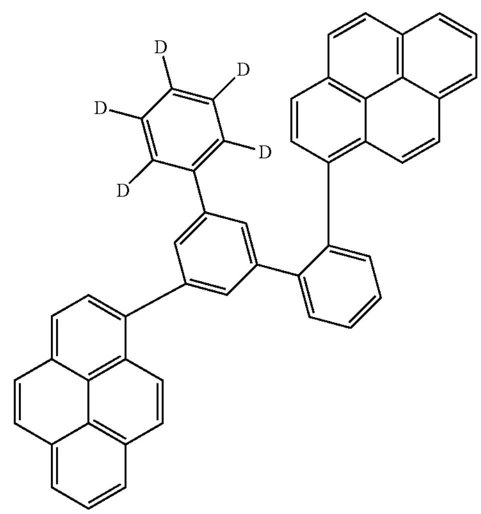
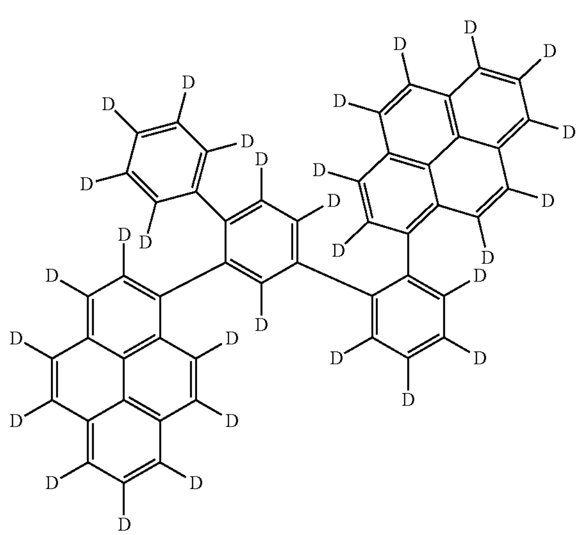

-continued
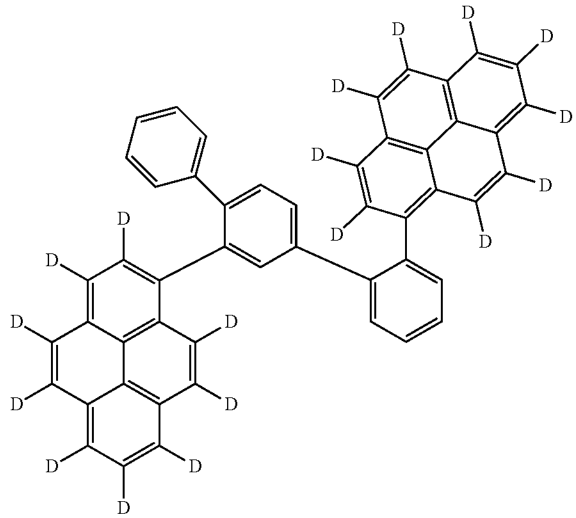
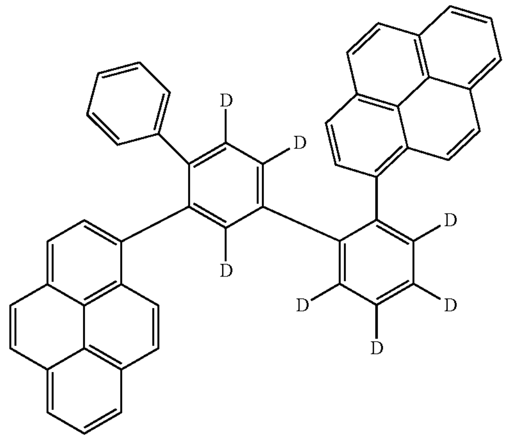
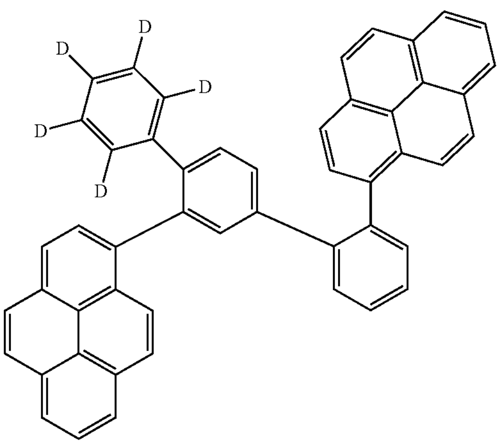
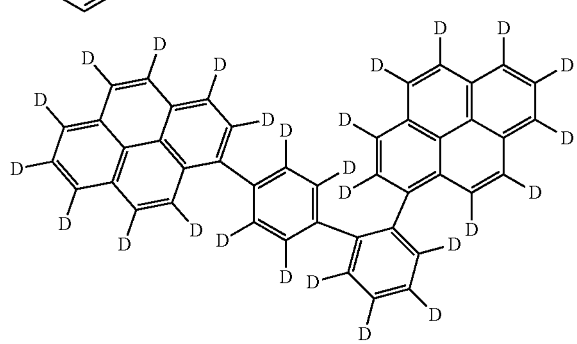
-continued
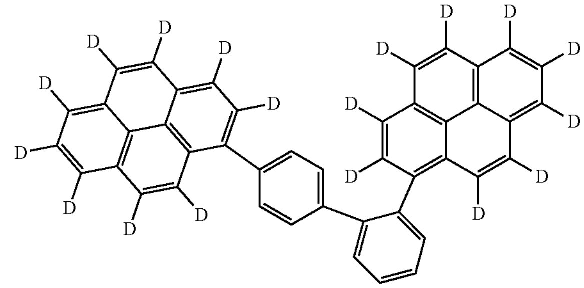
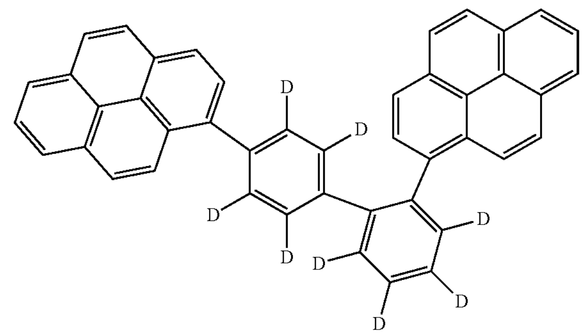
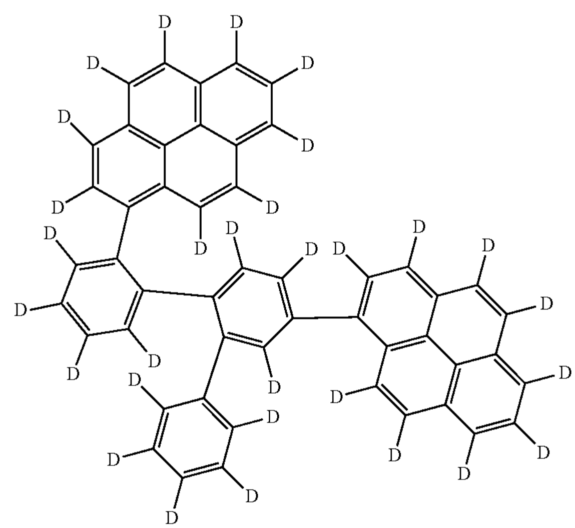
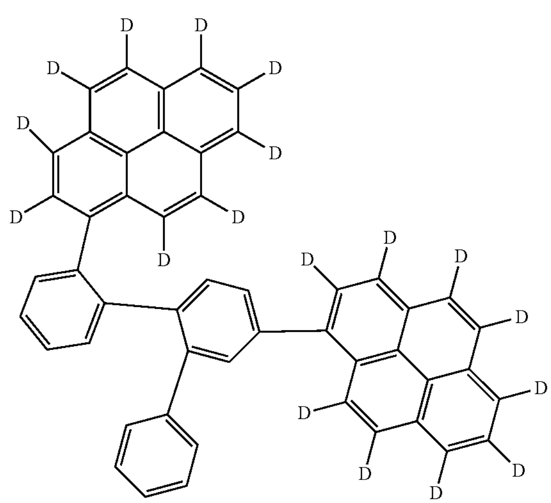

[Formula 384]
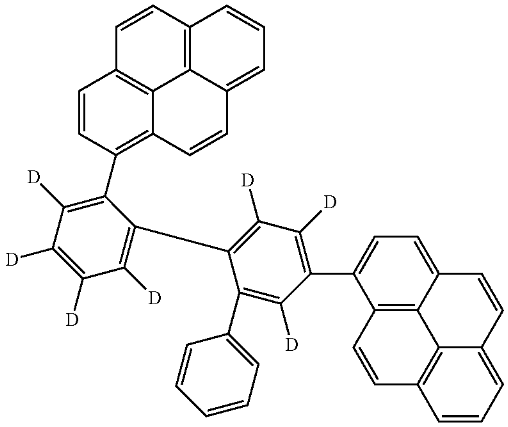
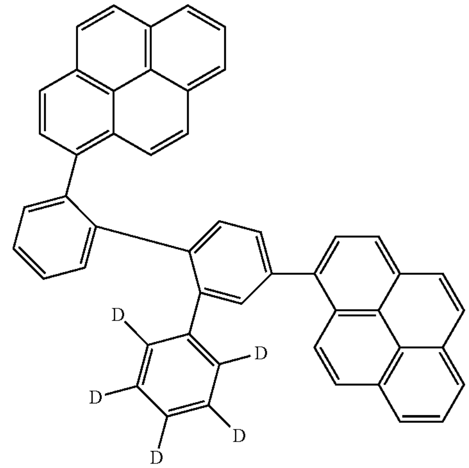
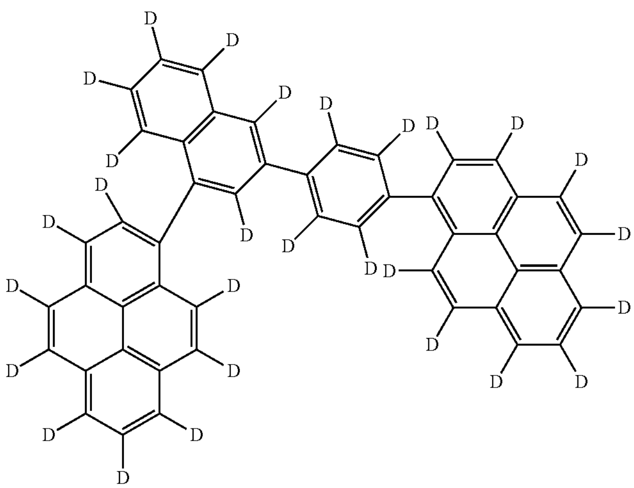
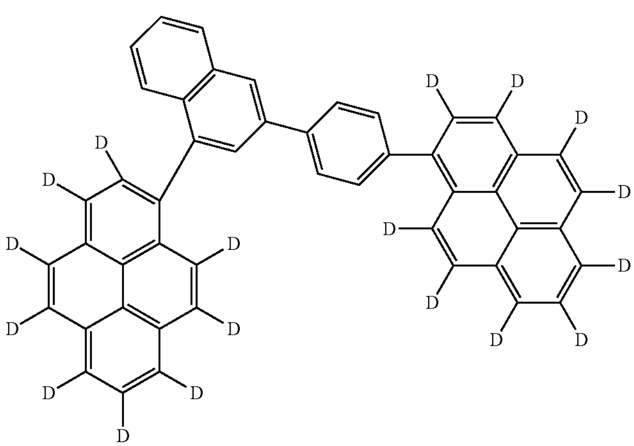

-continued
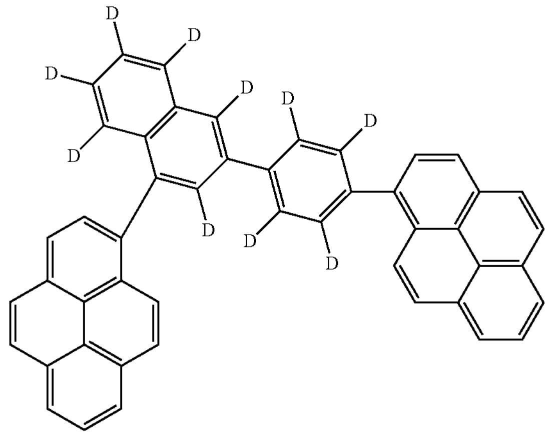
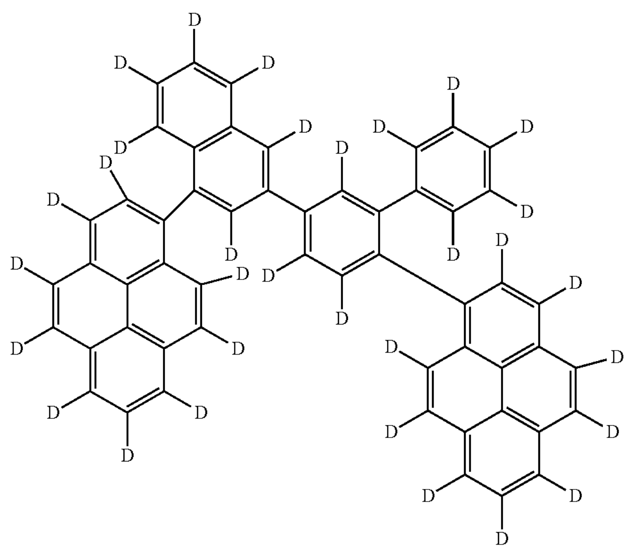
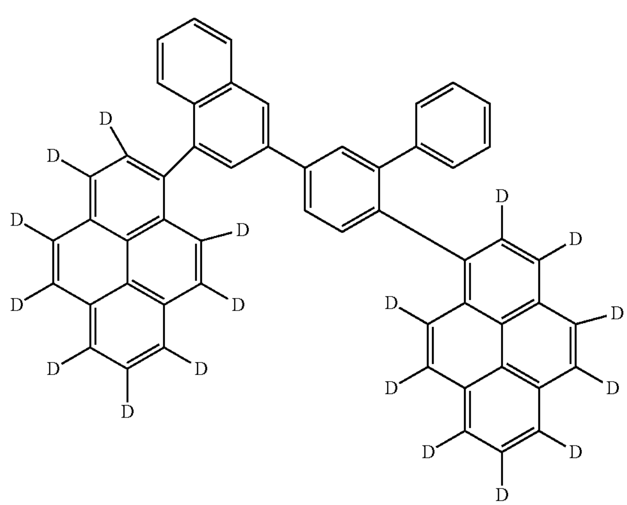

-continued
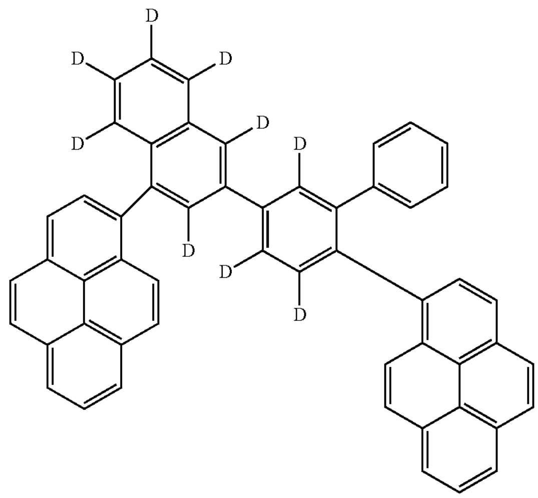
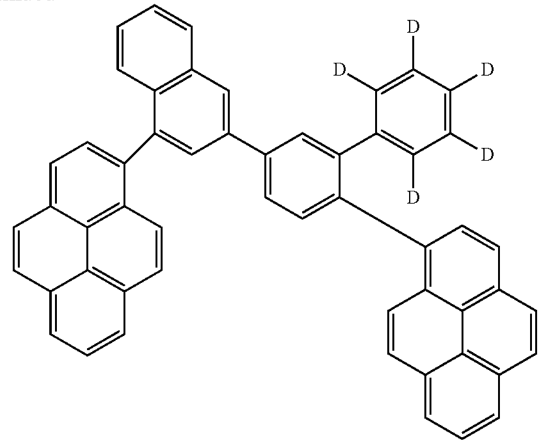
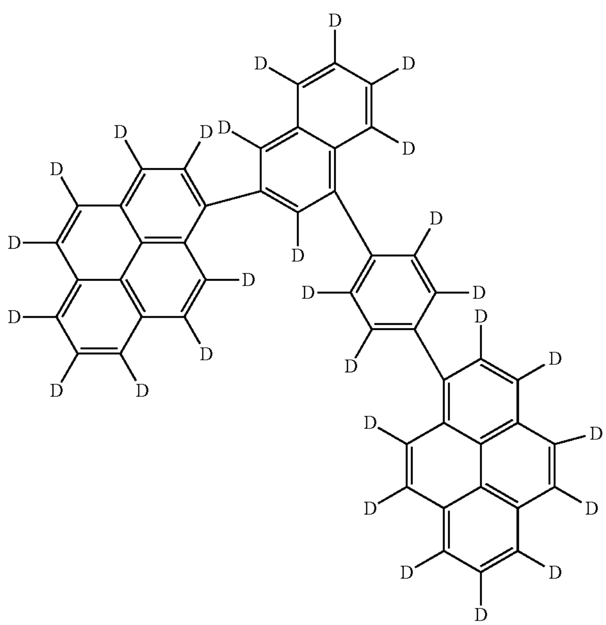
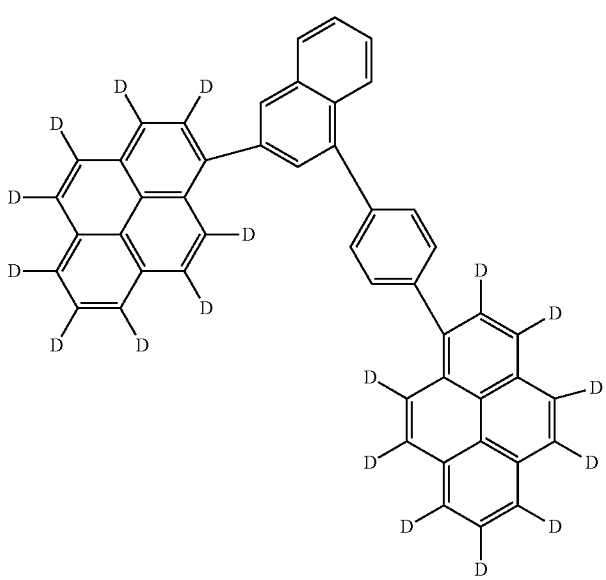
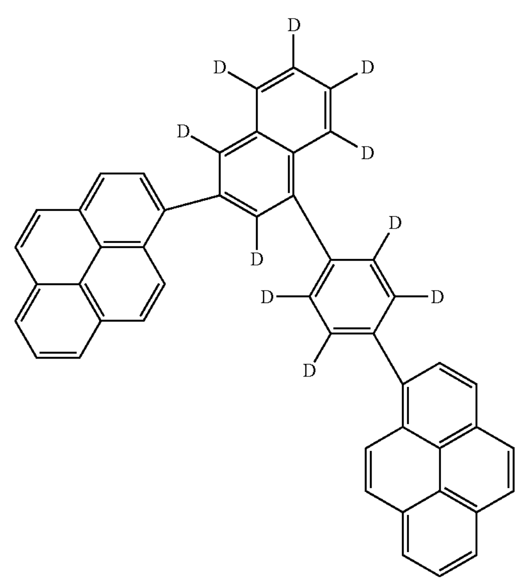

[Formula 385]
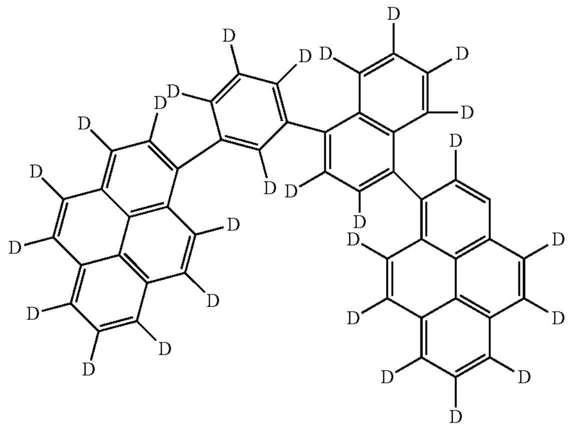
-continued
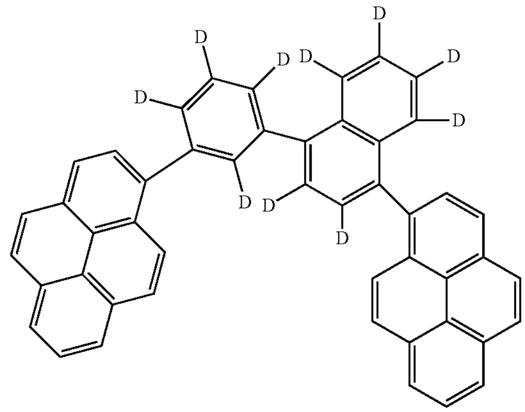
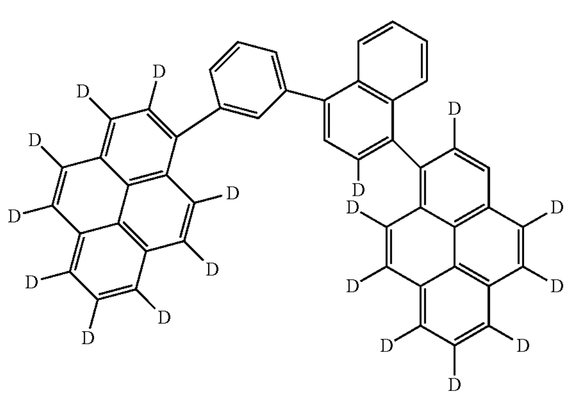
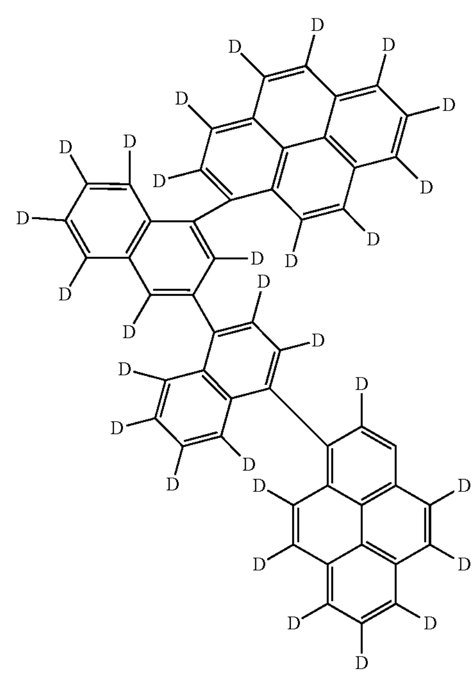 [SMILES: [2H]c1cc2c([2H])c([2H])c3c([2H])c([2H])c([2H])c4c([2H])c([2H])c(c1-c1c([2H])c([2H])c(-c5c([2H])c(-c6c([2H])c([2H])c7c([2H])c([2H])c8c([2H])c([2H])c([2H])c9c([2H])c([2H])c6c7c89)c6c([2H])c([2H])c([2H])c([2H])c6c5[2H])c5c([2H])c([2H])c([2H])c([2H])c15)c2c34]

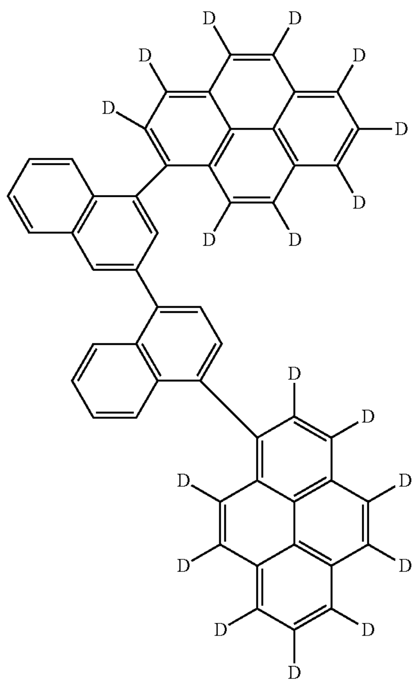
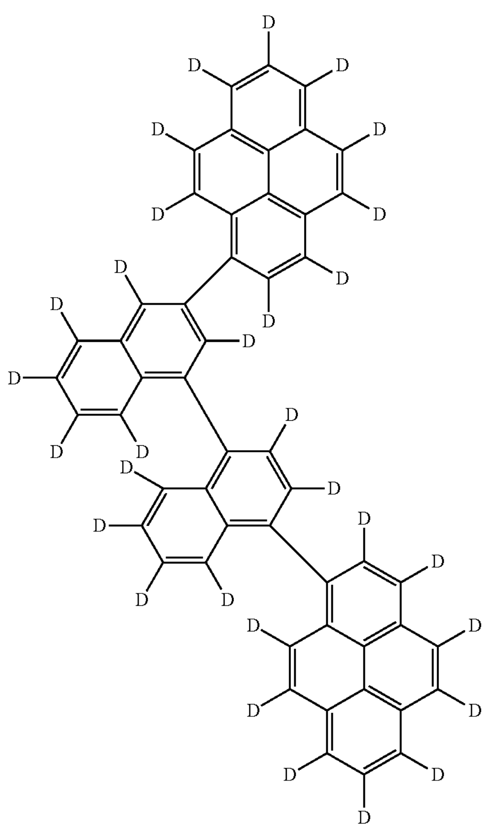
[Formula 386]
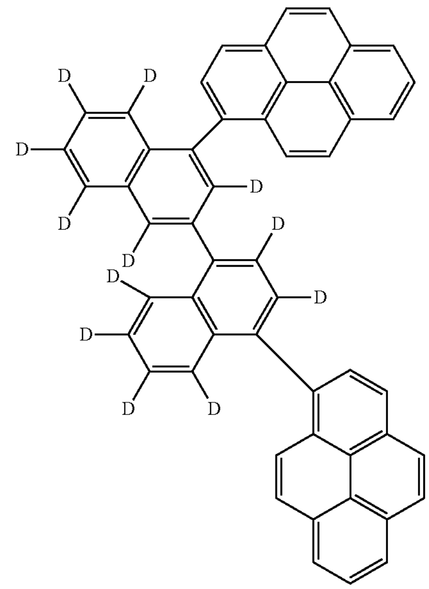
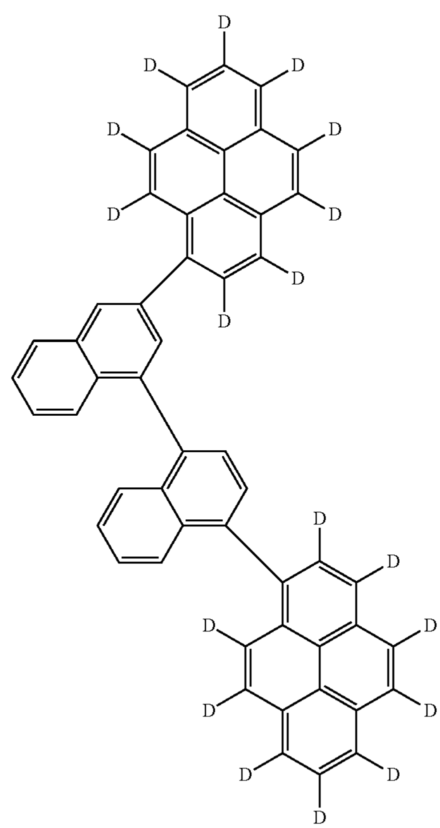

-continued
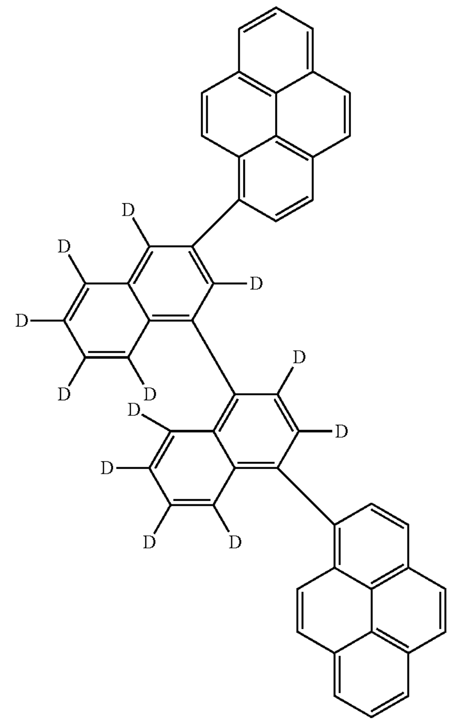
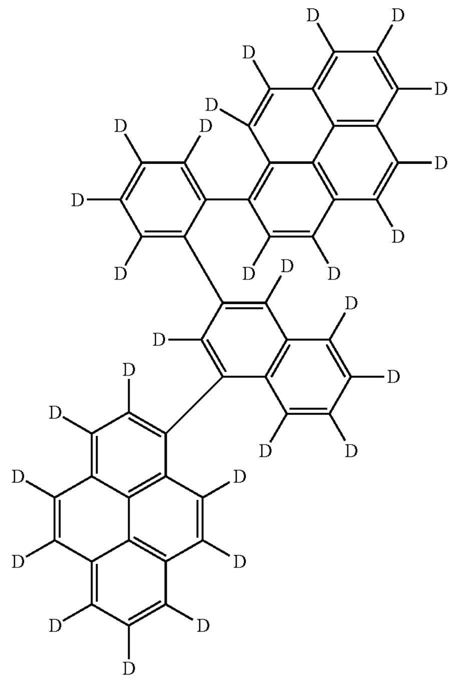
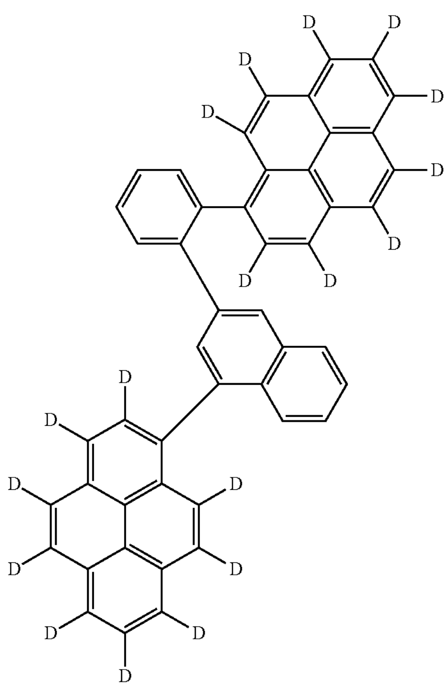
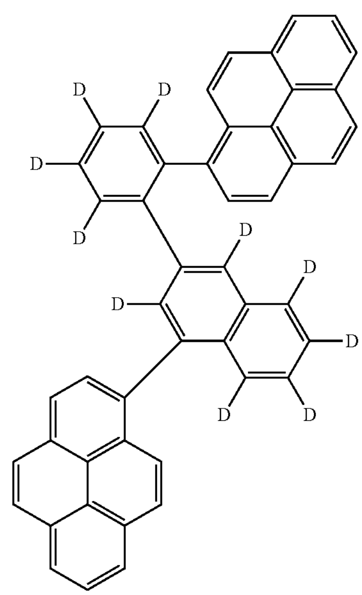

-continued
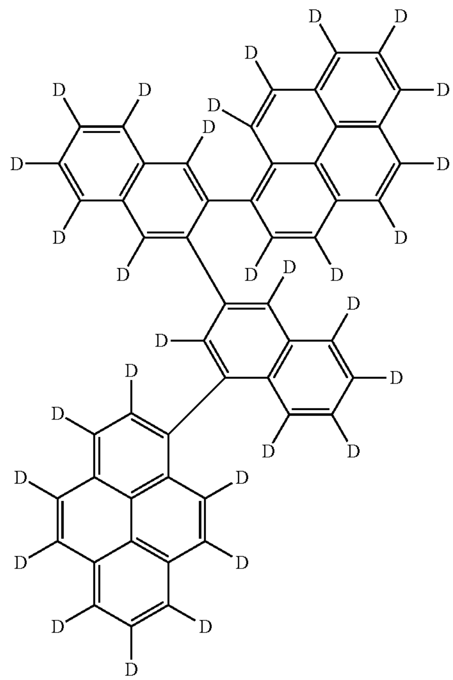
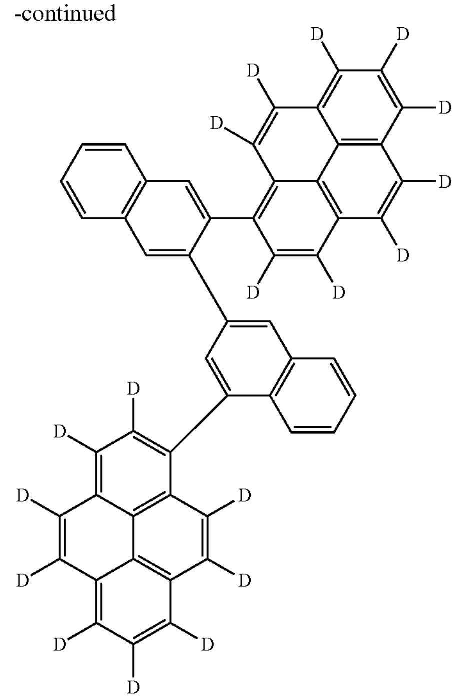
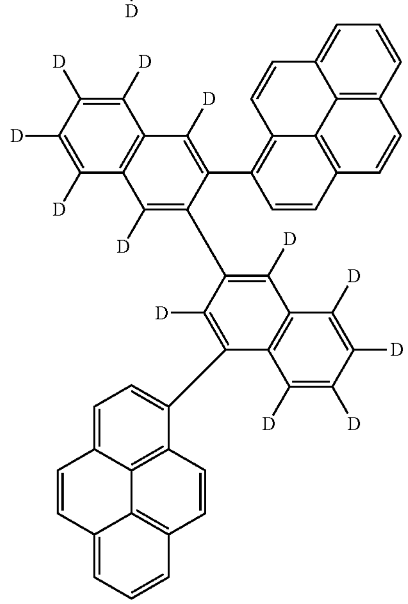
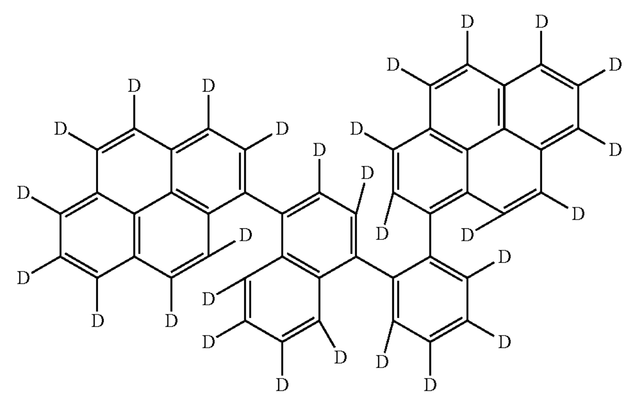
[Formula 387]
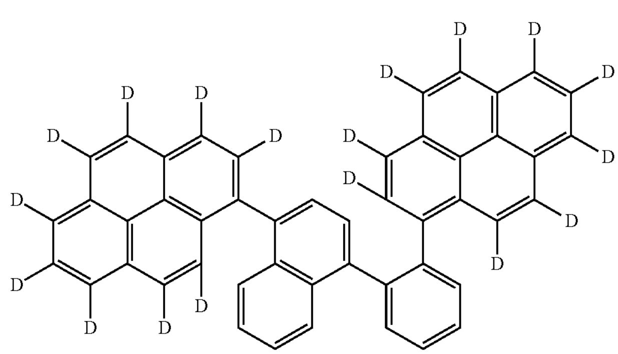
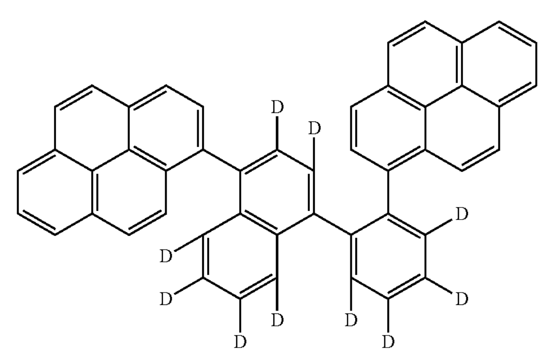

-continued
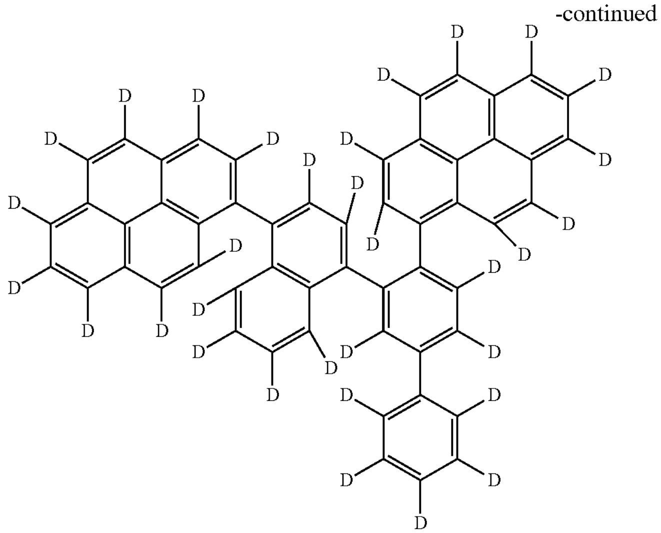
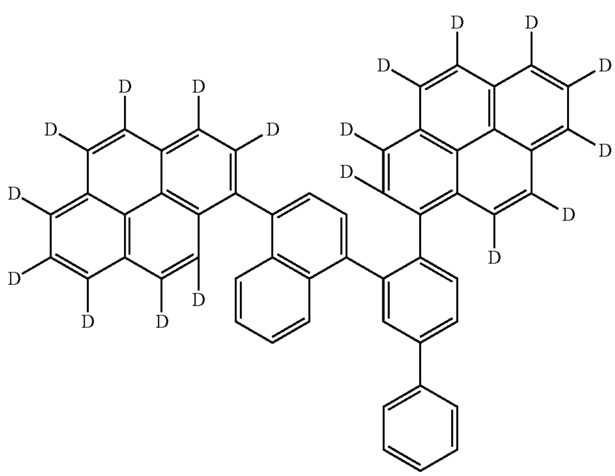
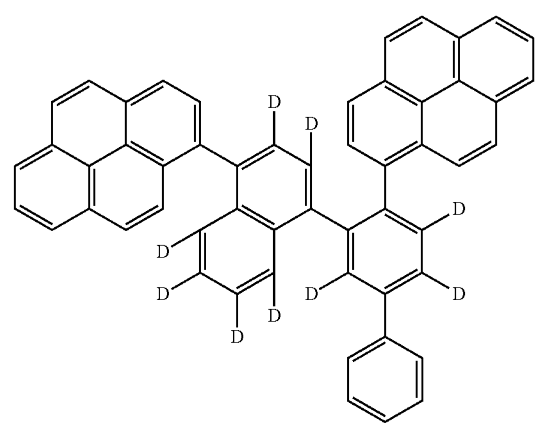
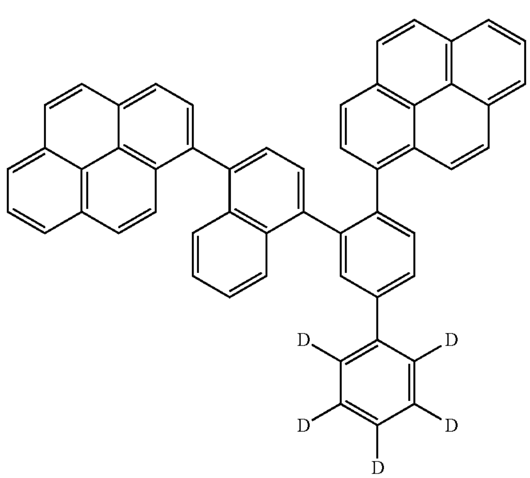
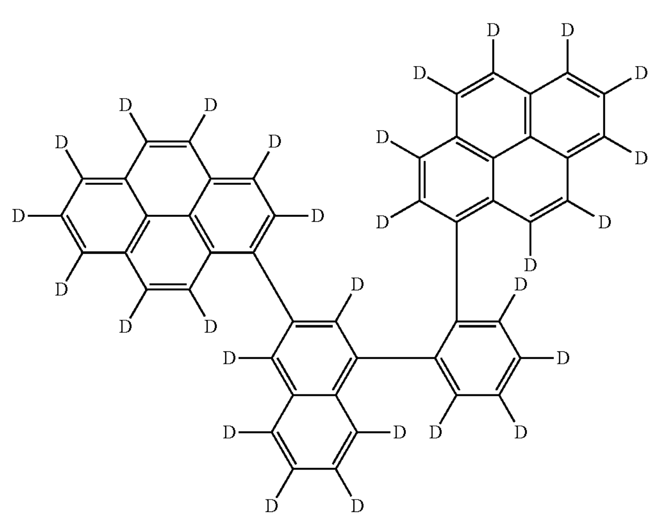

-continued
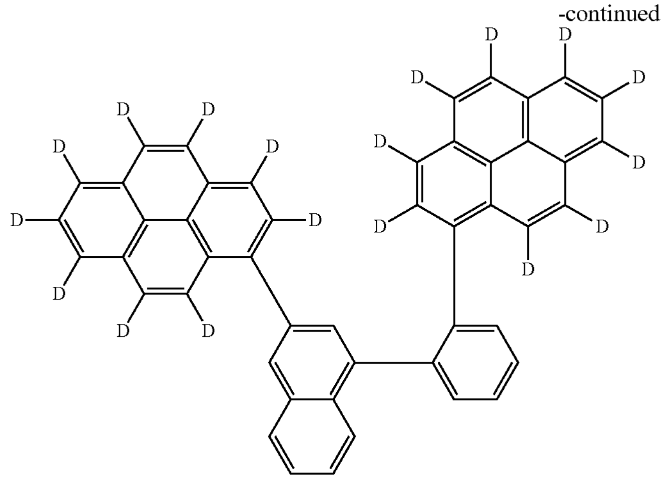
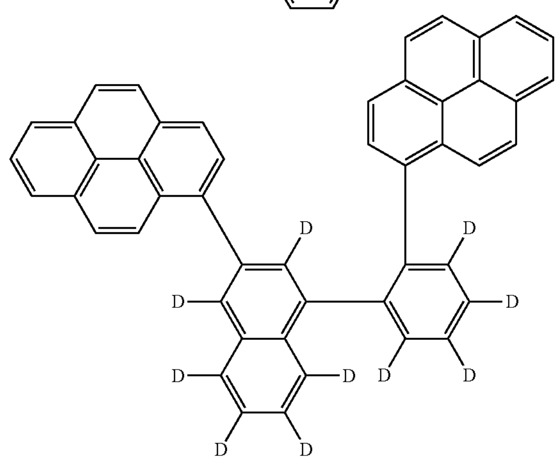
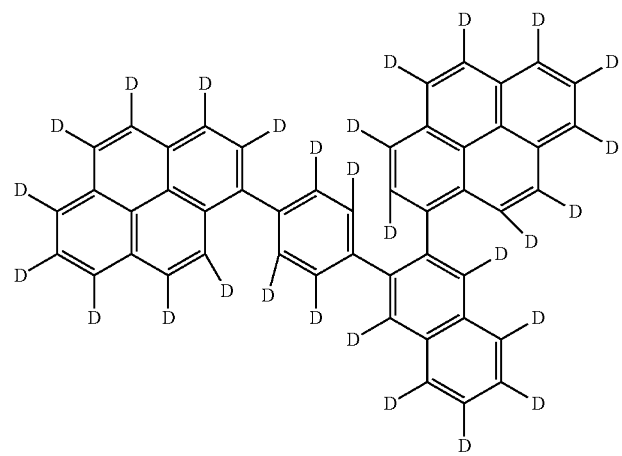
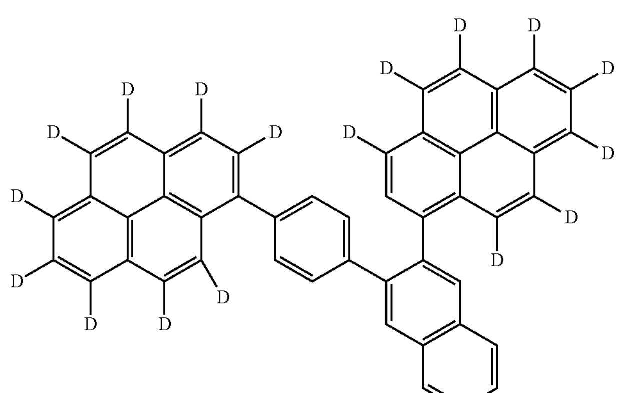
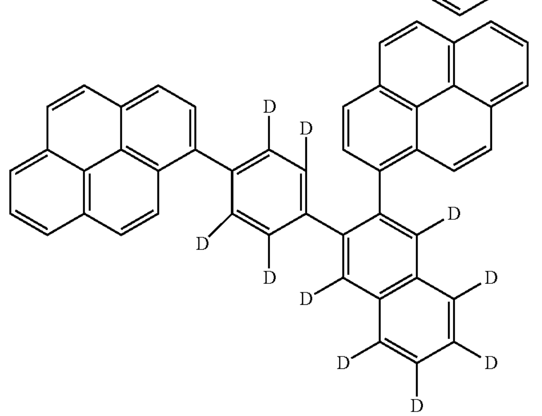

[Formula 388]
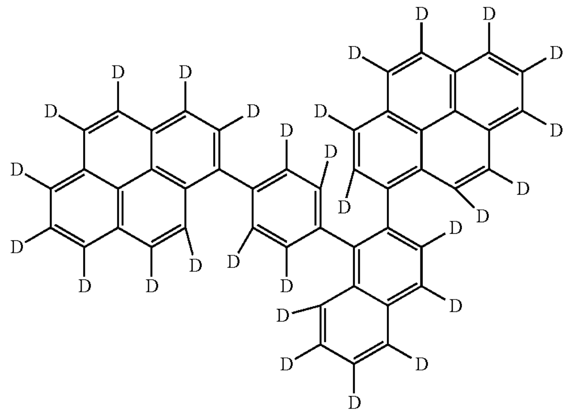
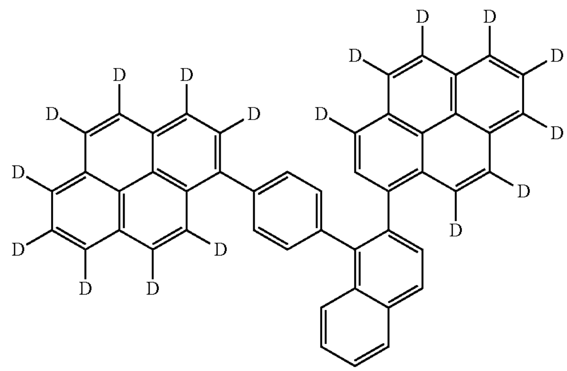
-continued
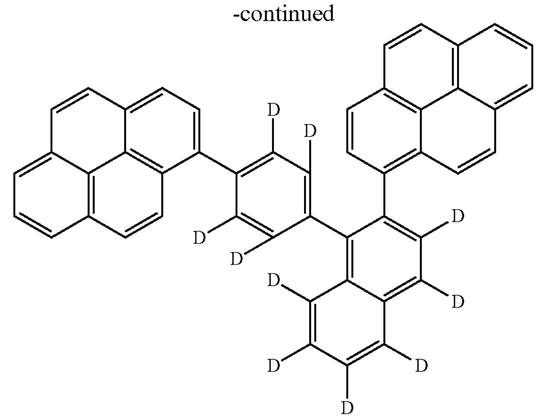
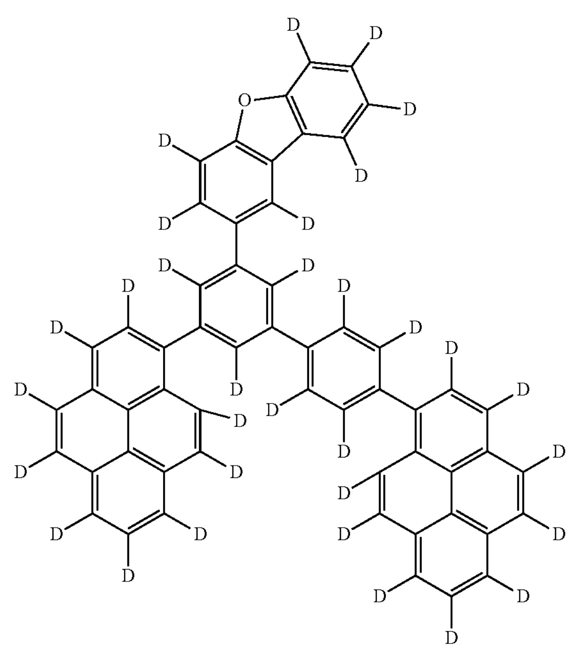

-continued
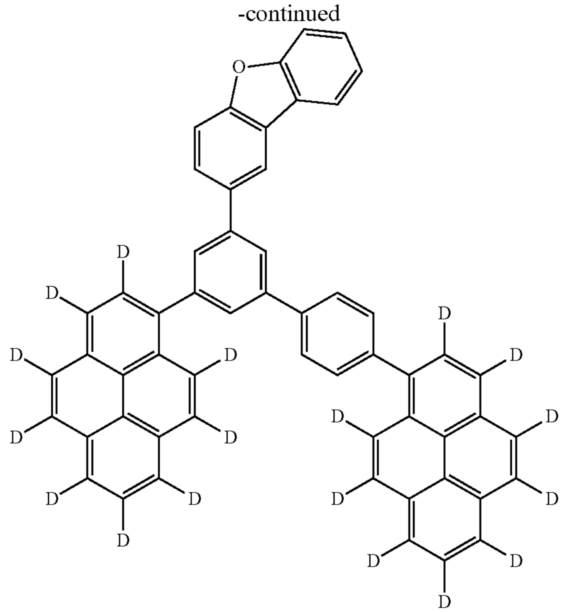
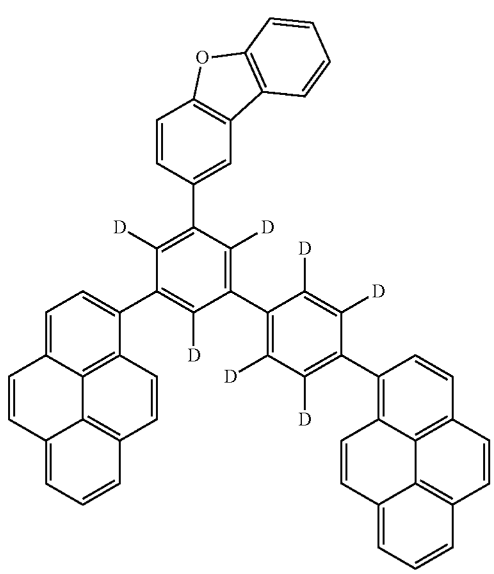
-continued
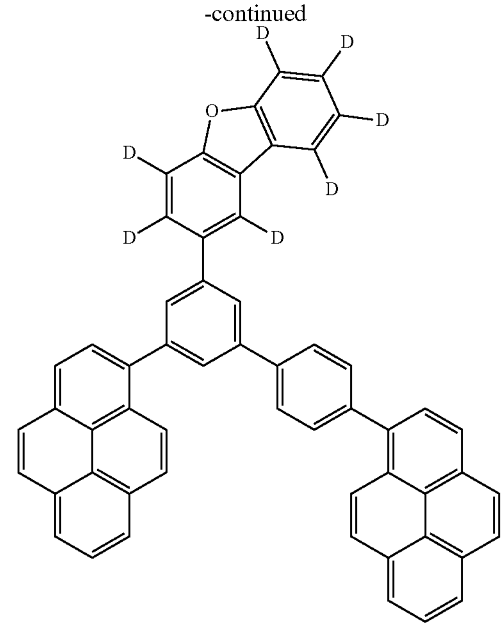
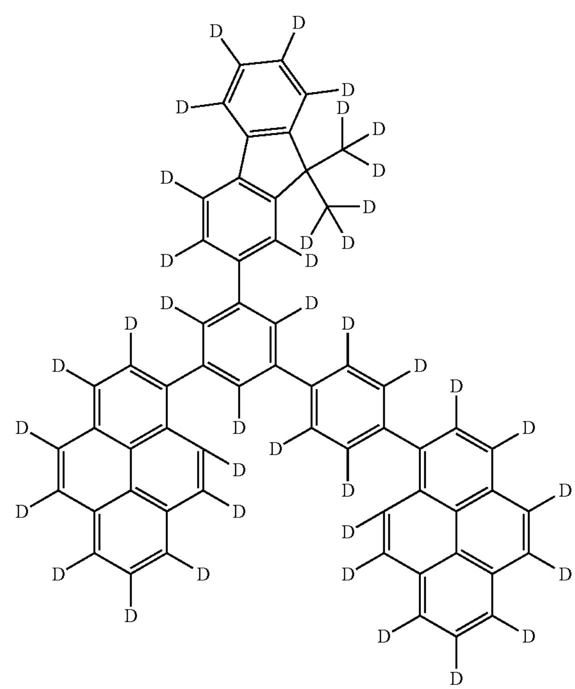 [SMILES: [2H]c1c([2H])c([2H])c2c(c1[2H])-c1c([2H])c([2H])c(-c3c([2H])c(-c4c([2H])c([2H])c(-c5c([2H])c([2H])c6c([2H])c([2H])c7c([2H])c([2H])c([2H])c8c([2H])c([2H])c5c6c78)c([2H])c4[2H])c([2H])c(-c4c([2H])c([2H])c5c([2H])c([2H])c6c([2H])c([2H])c([2H])c7c([2H])c([2H])c4c5c67)c3[2H])c([2H])c1C2(C([2H])([2H])[2H])C([2H])([2H])[2H]]

[Formula 389]
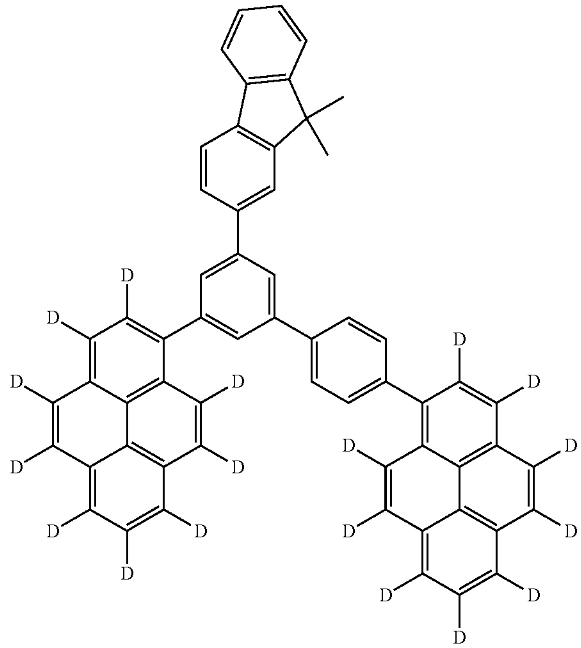
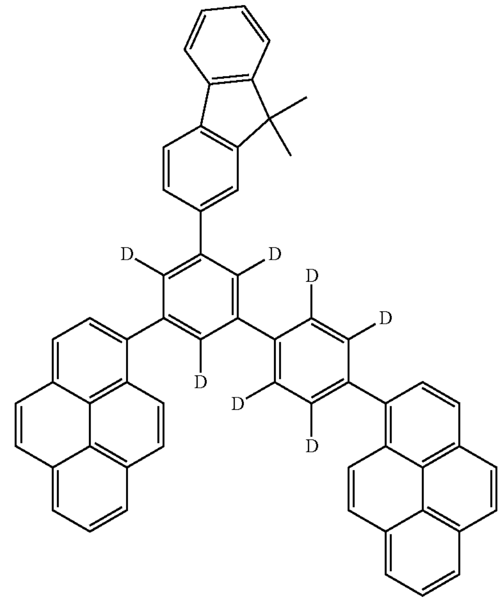
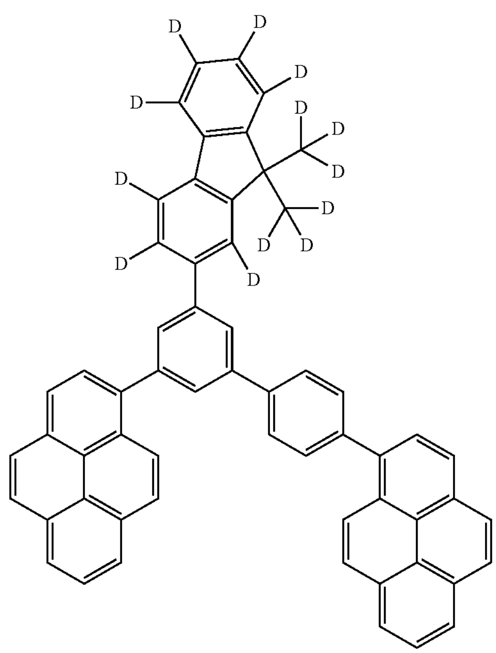 [SMILES: [2H]c1c([2H])c([2H])c2c(c1[2H])-c1c([2H])c([2H])c(-c3cc(-c4ccc(-c5ccc6ccc7cccc8ccc5c6c78)cc4)cc(-c4ccc5ccc6cccc7ccc4c5c67)c3)c([2H])c1C2(C([2H])([2H])[2H])C([2H])([2H])[2H]]
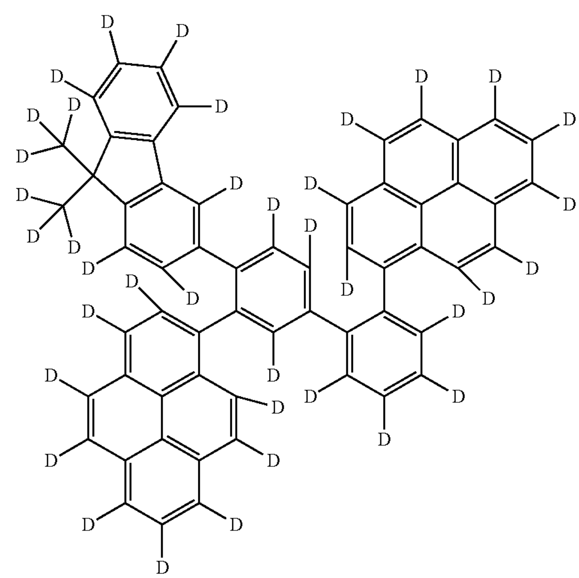

-continued
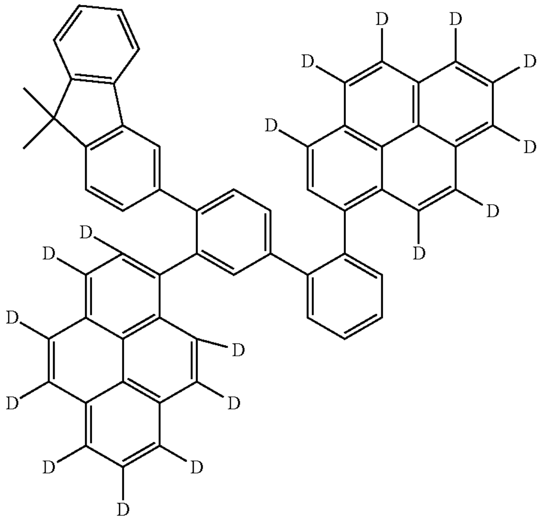
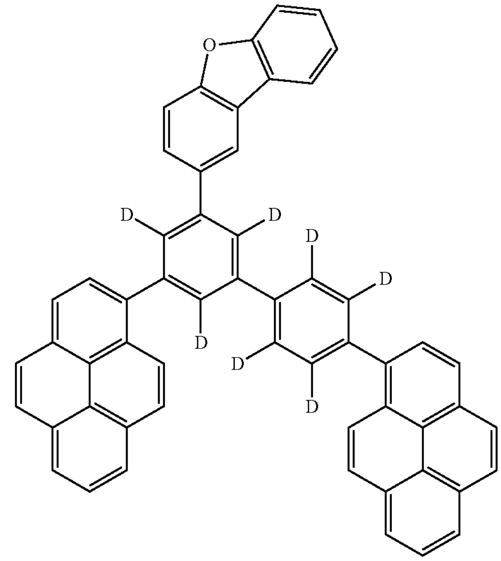
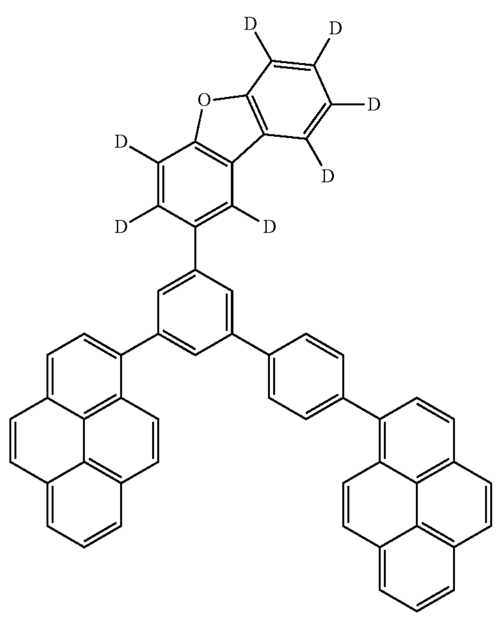
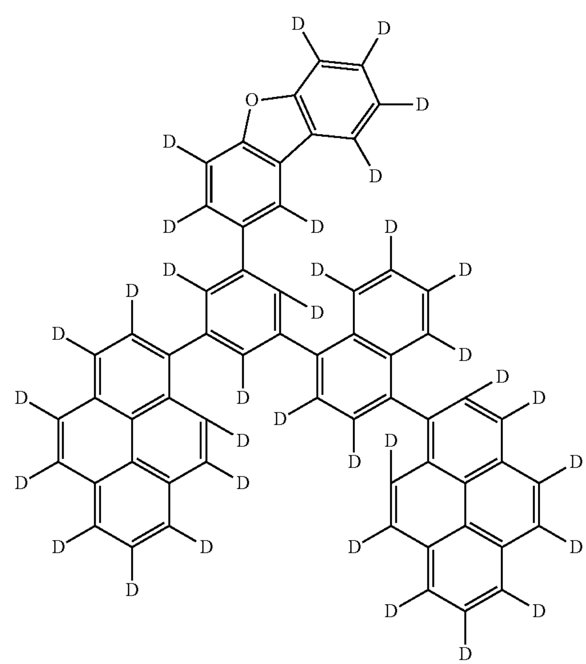

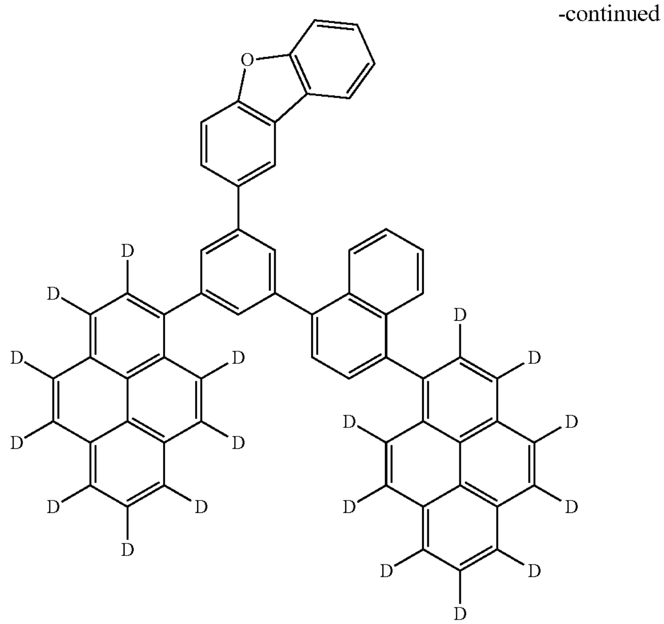
O
D
D
D
D
D
D
D
D
D
D
D
D
D
D
D
D
D
D
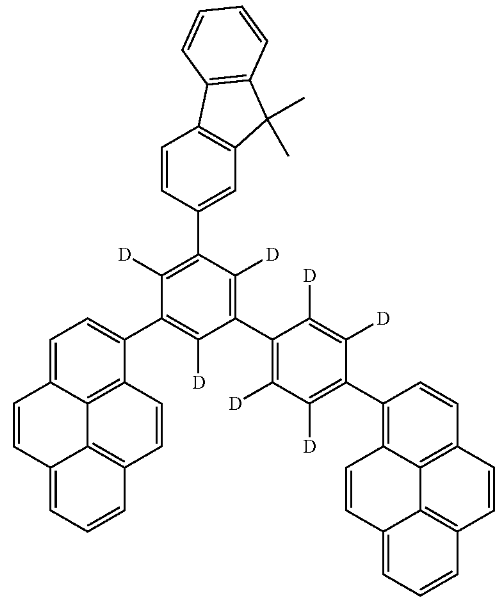
D
D
D
D
D
D
D
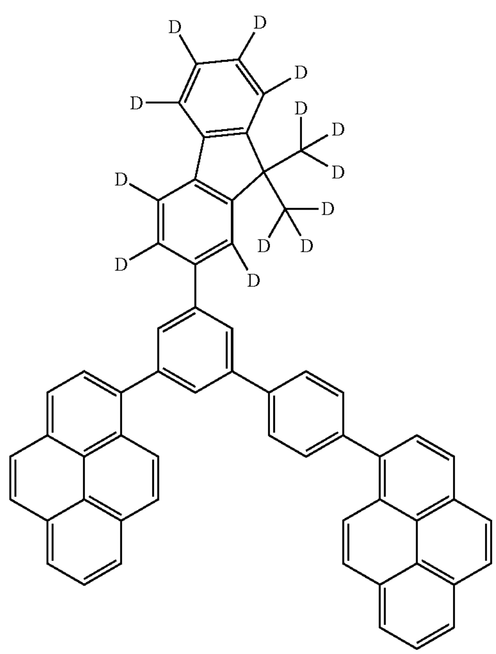
D
D
D
D
D
D
D
D
D
D
D
D
D
D

[Formula 390]
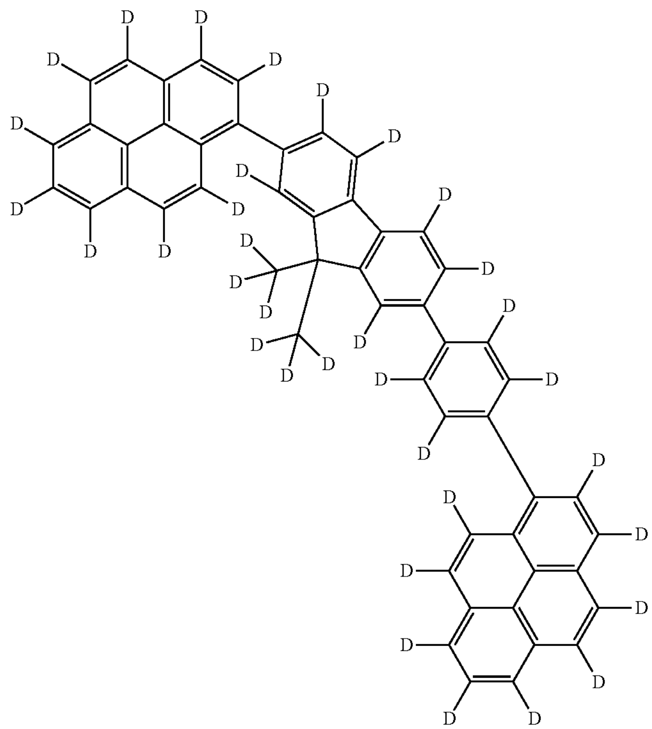
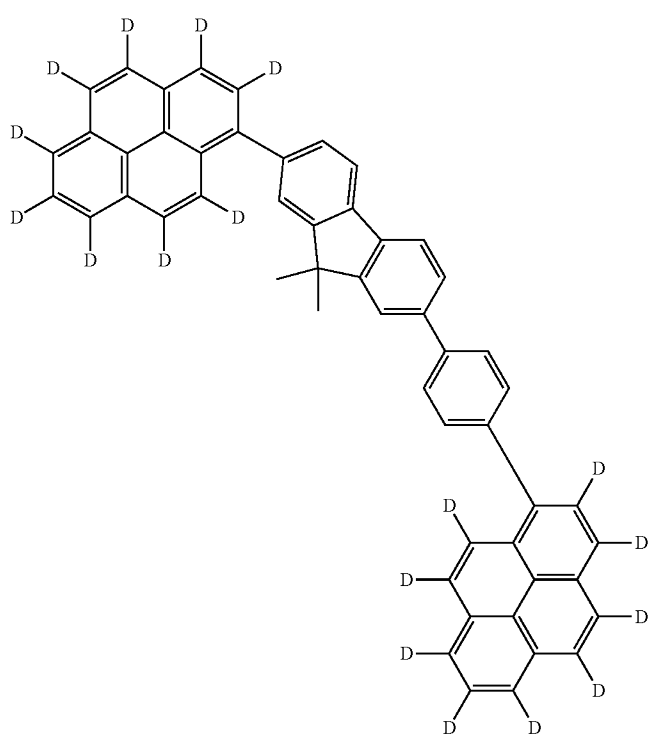

-continued
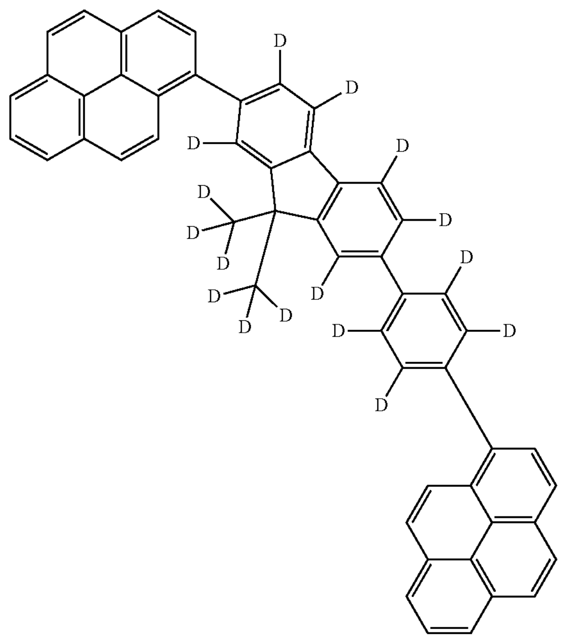
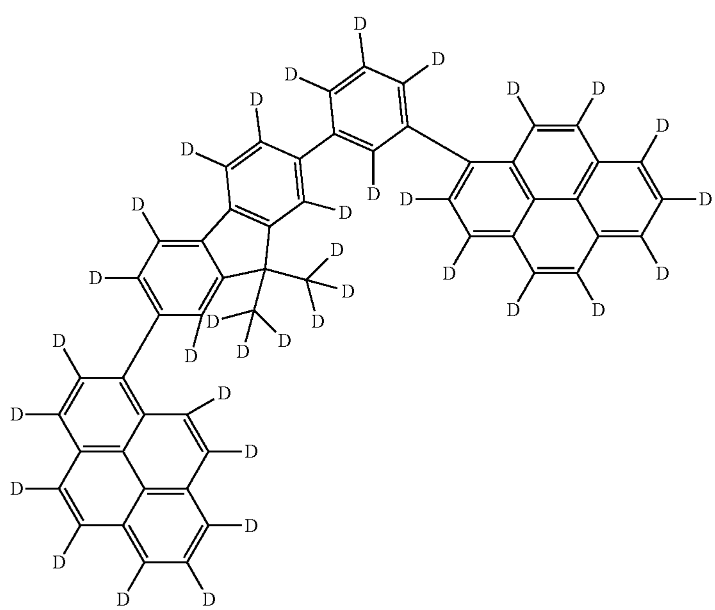

-continued
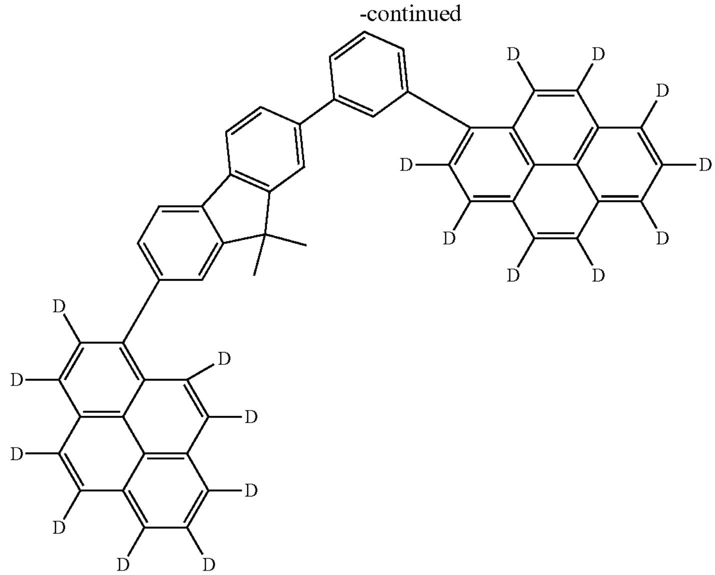
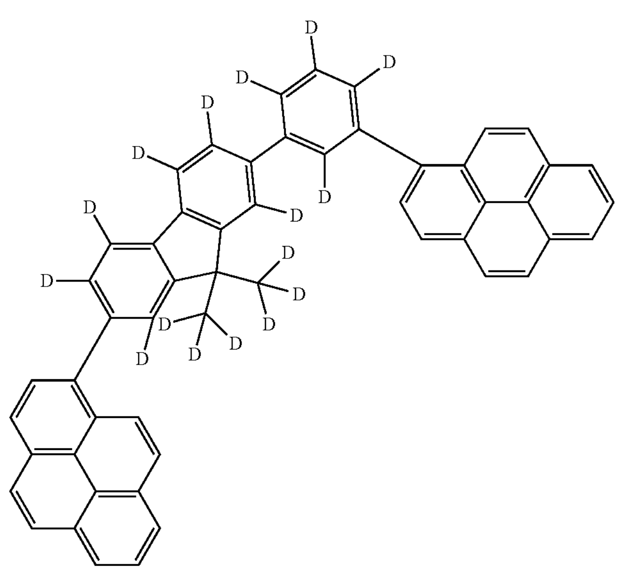

-continued
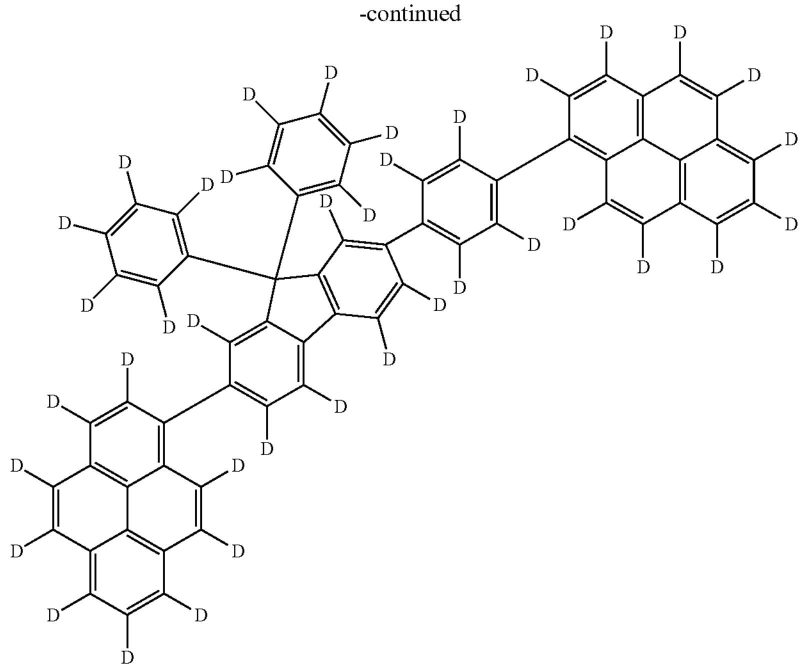
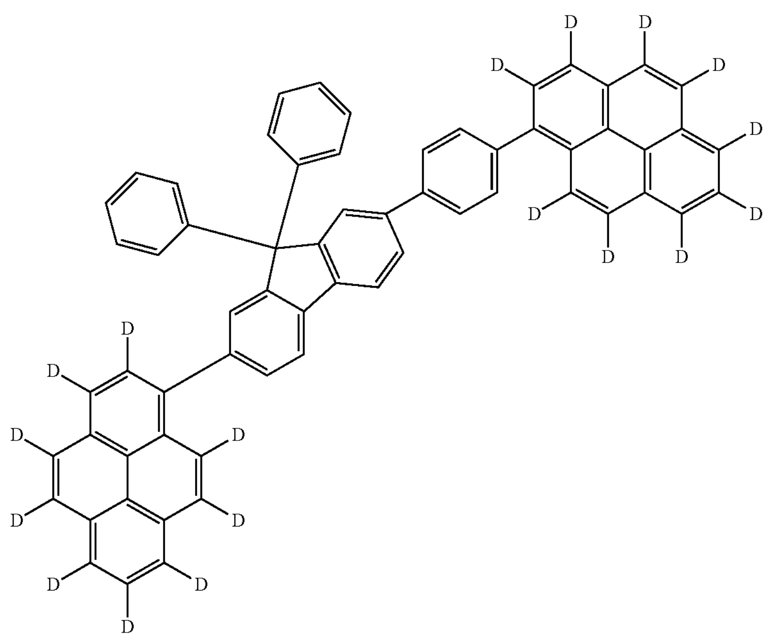

[Formula 391]
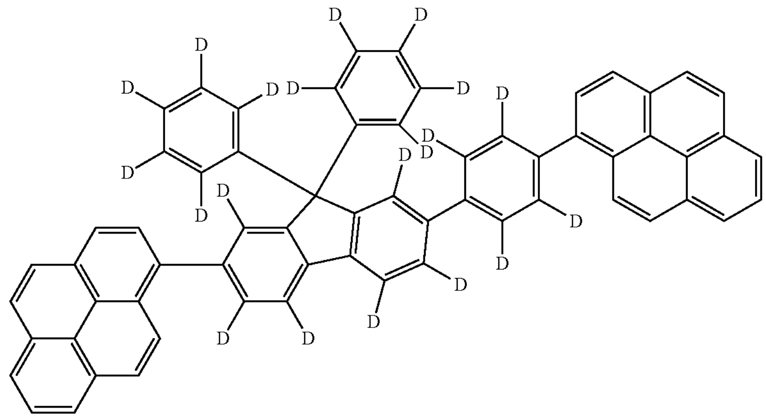
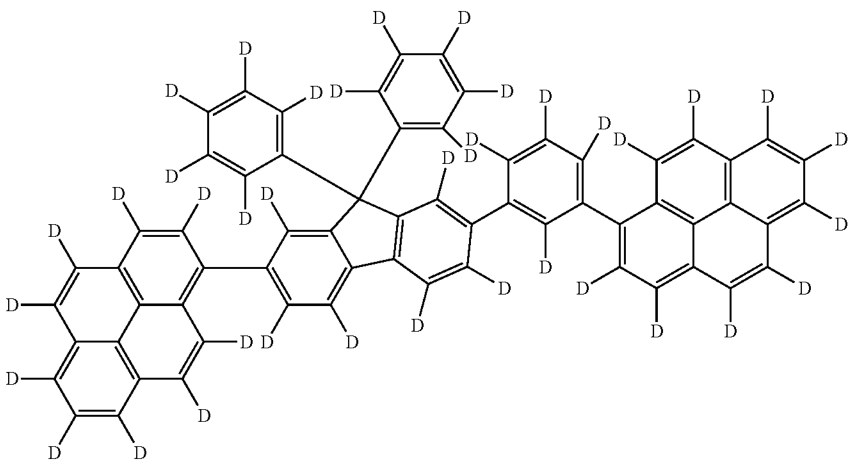
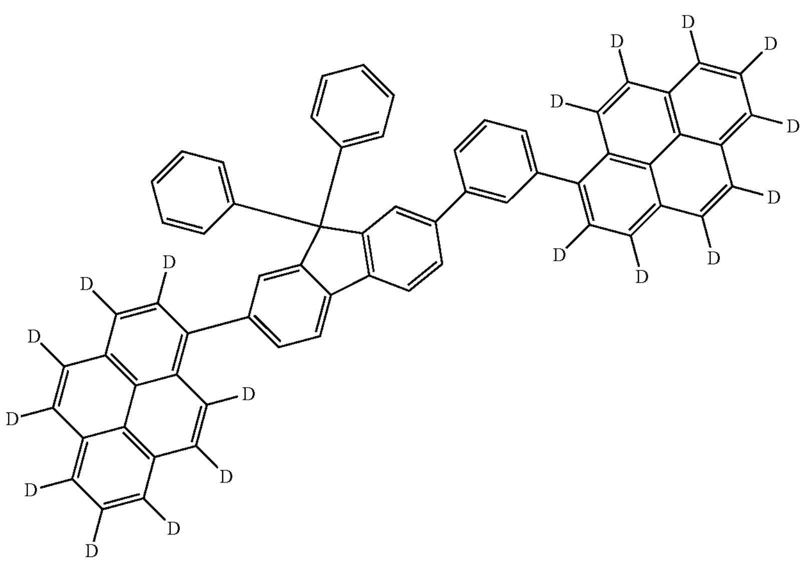

-continued
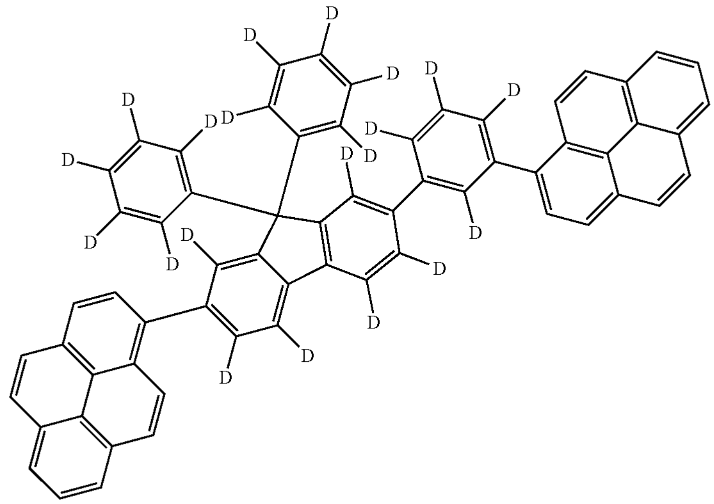
[Formula 392]
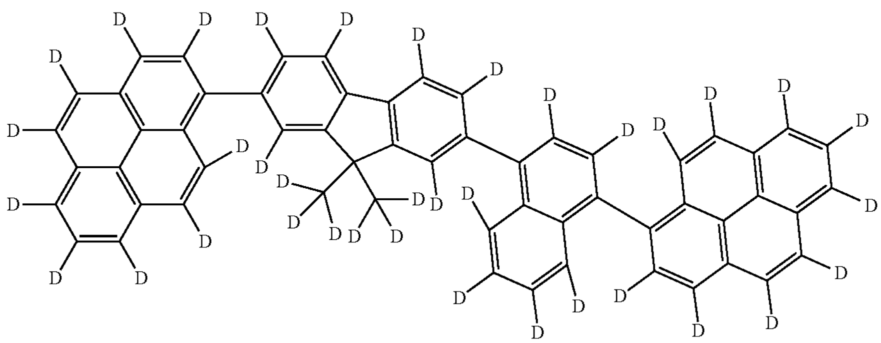
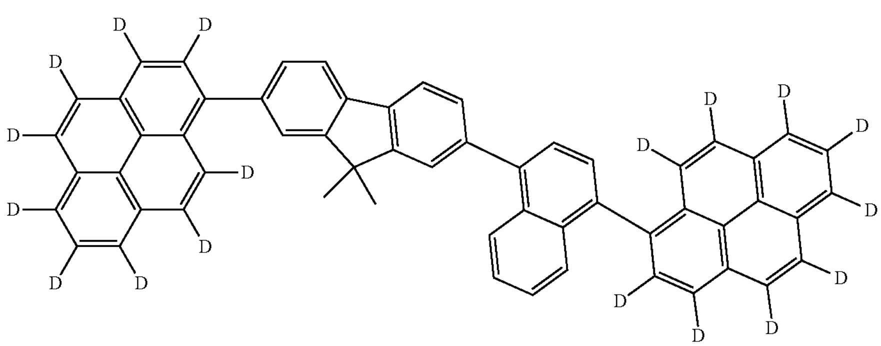

-continued
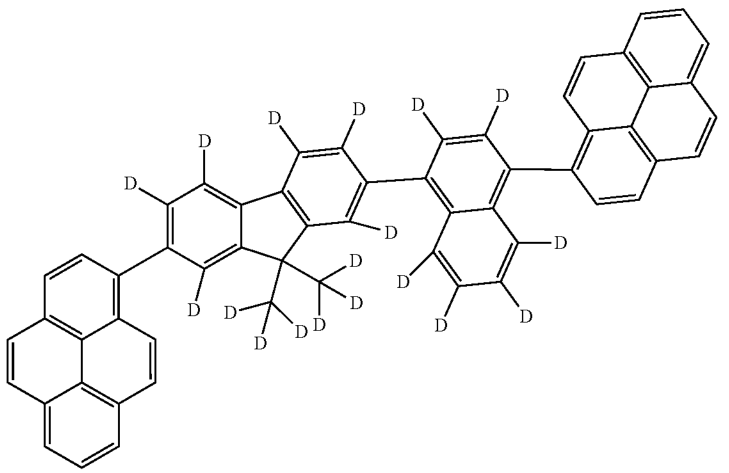
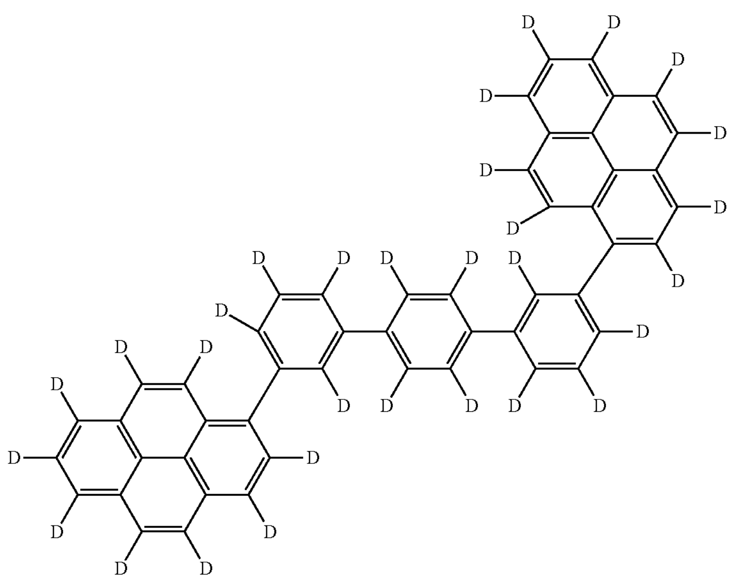
[Formula 393]
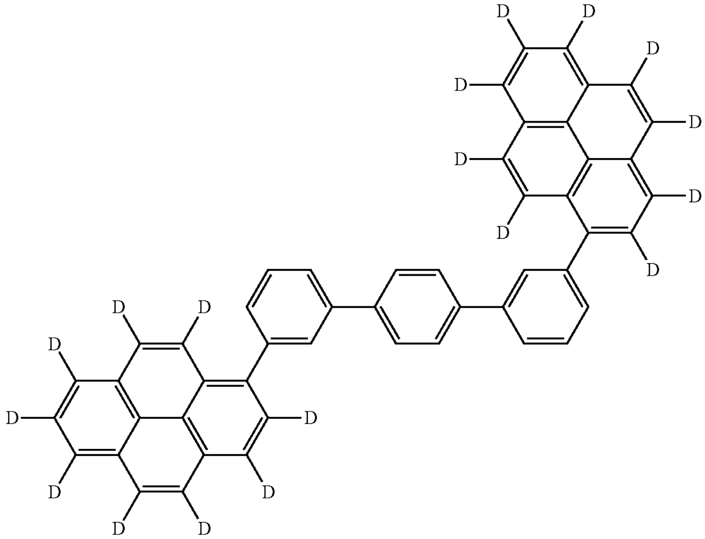

-continued
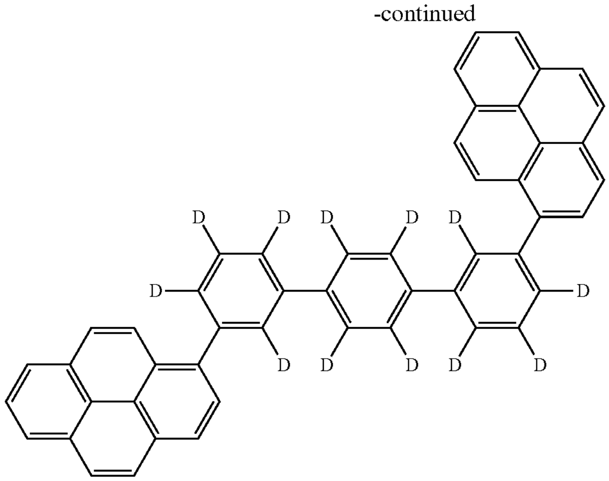
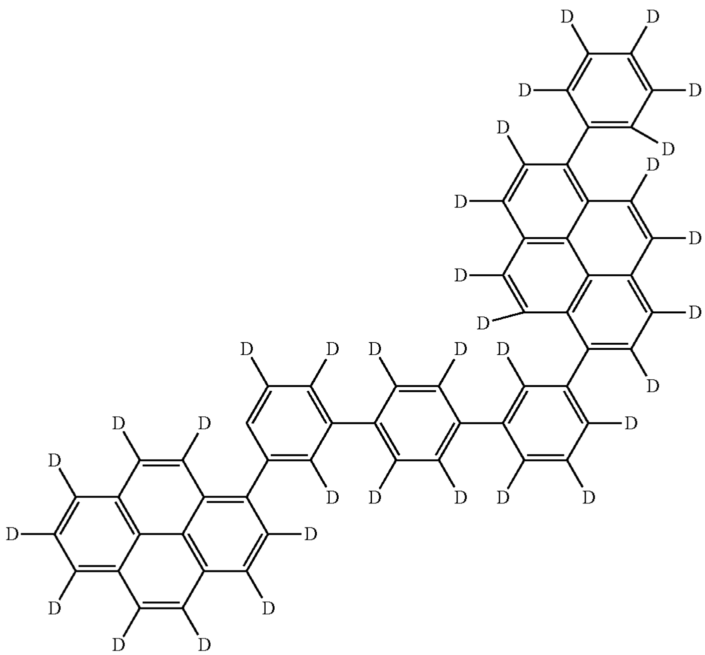
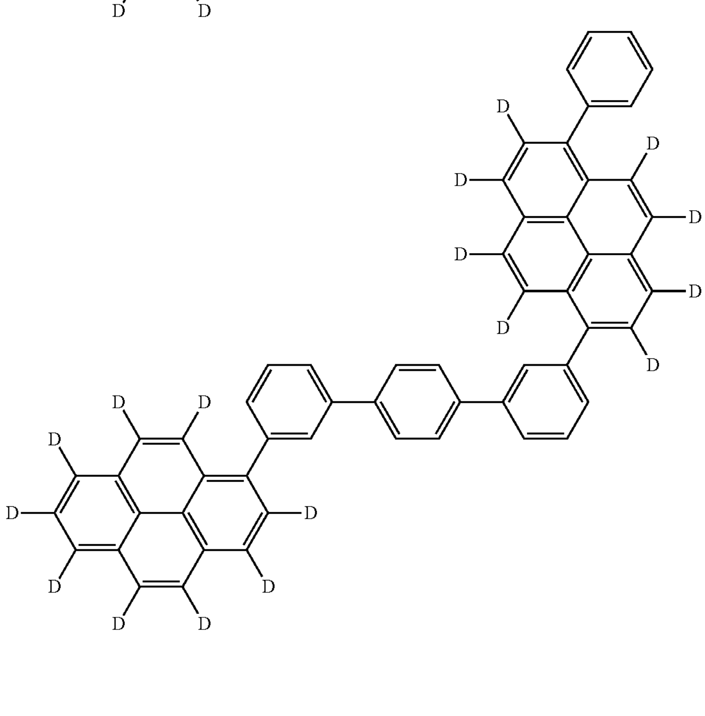

[Formula 394]
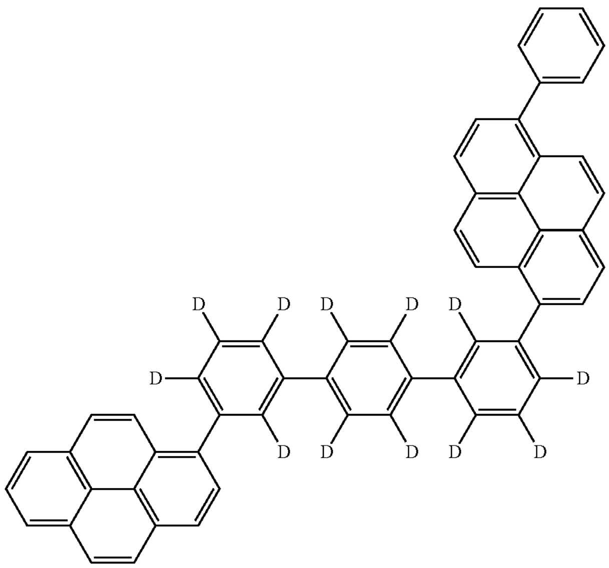
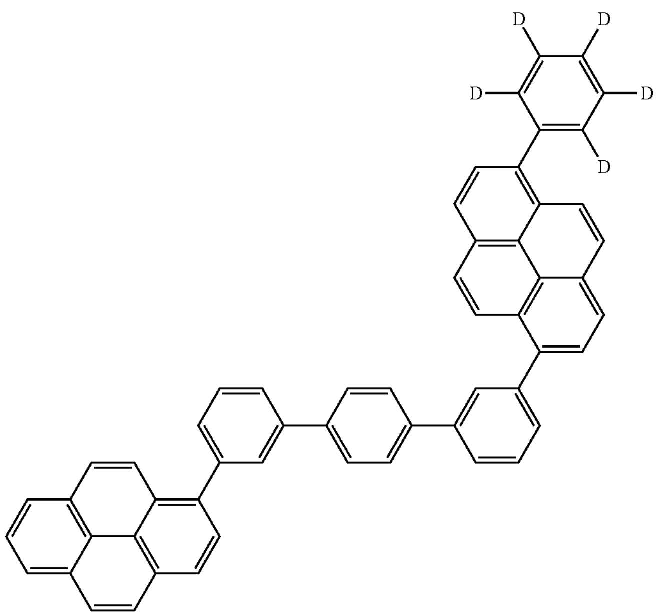
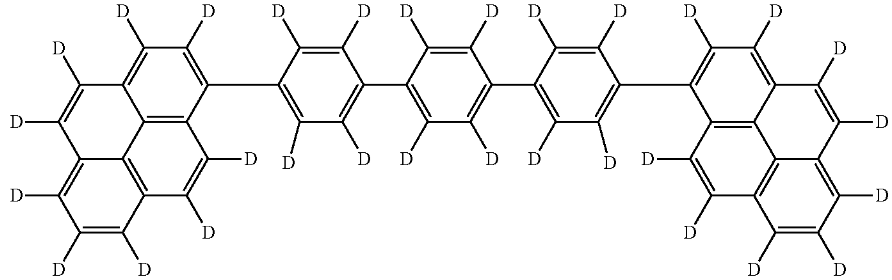

-continued
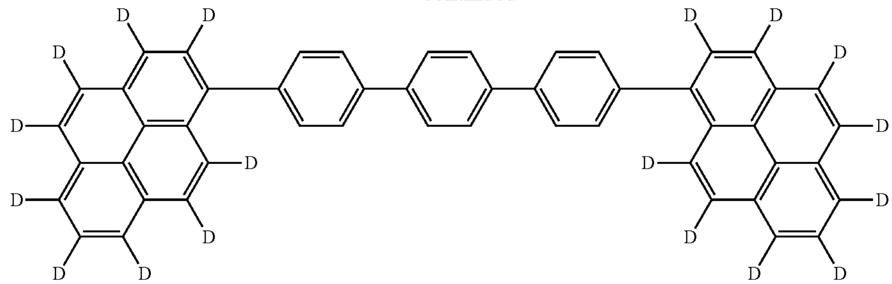 [SMILES: [2H]c1c([2H])c2c([2H])c([2H])c3c([2H])c([2H])c(-c4ccc(-c5ccc(-c6ccc(-c7c([2H])c([2H])c8c([2H])c([2H])c9c([2H])c([2H])c([2H])c%10c([2H])c([2H])c7c8c9%10)cc6)cc5)cc4)c4c([2H])c([2H])c(c1[2H])c2c34]
[Formula 395]
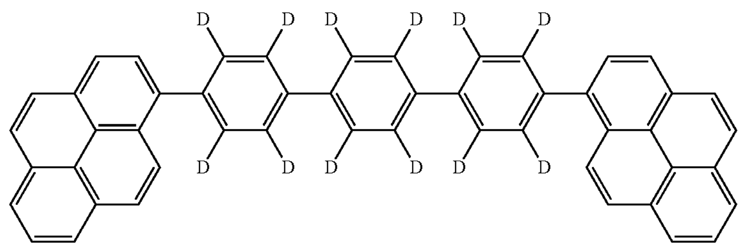
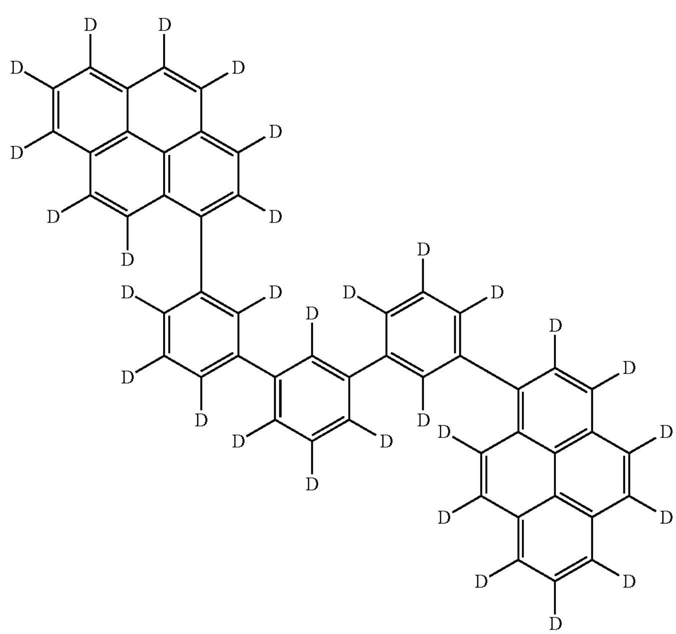

-continued
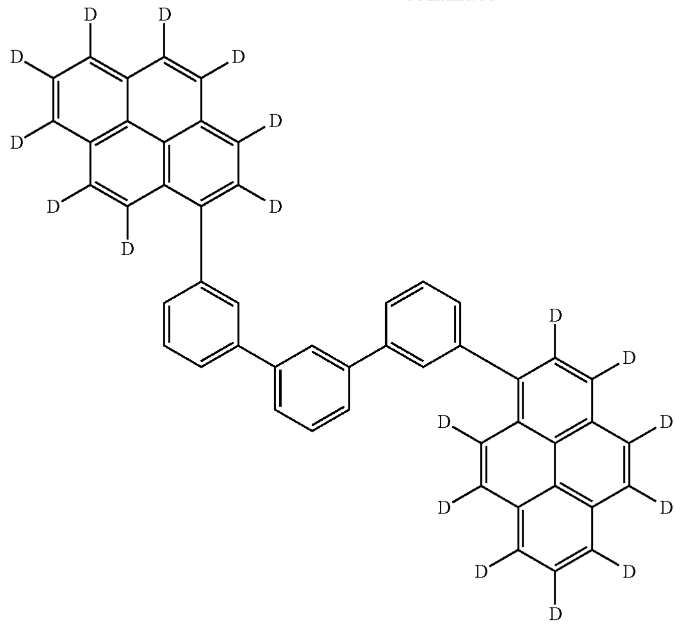
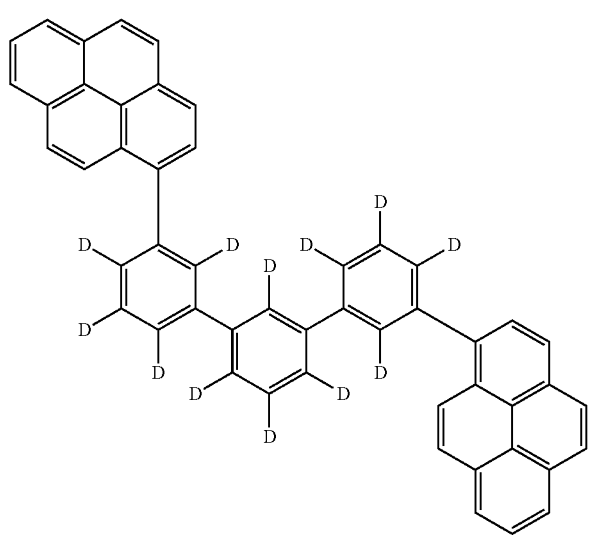

[Formula 396]
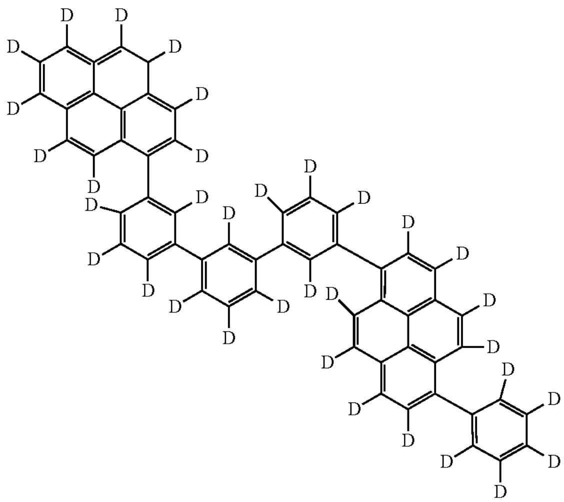
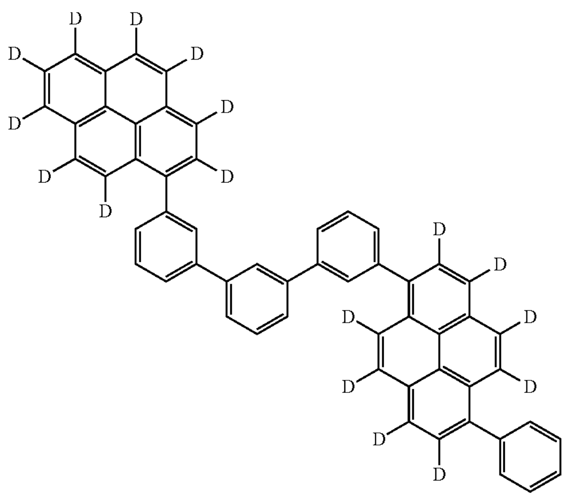
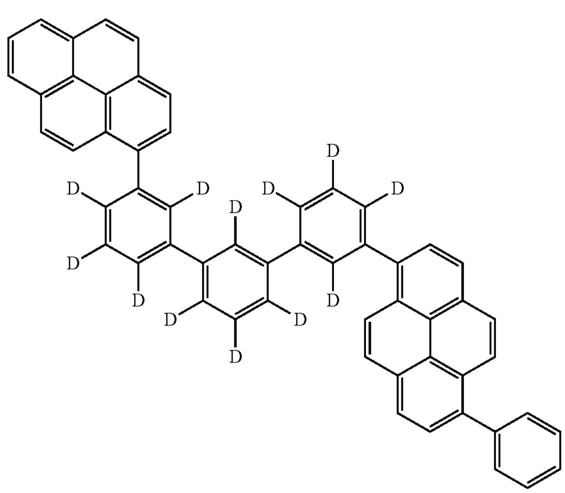
-continued
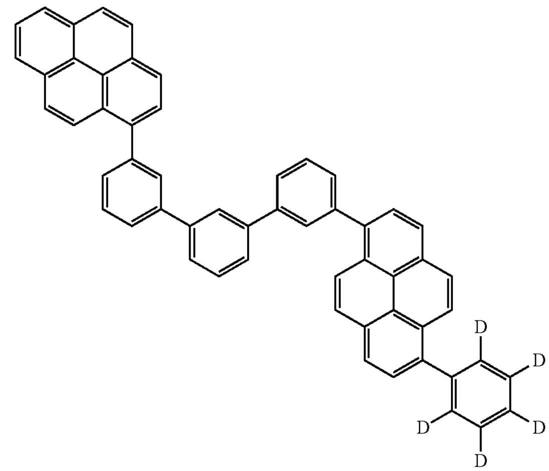
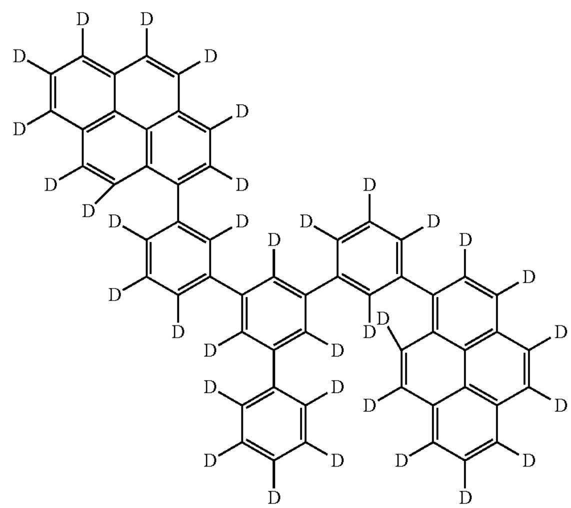
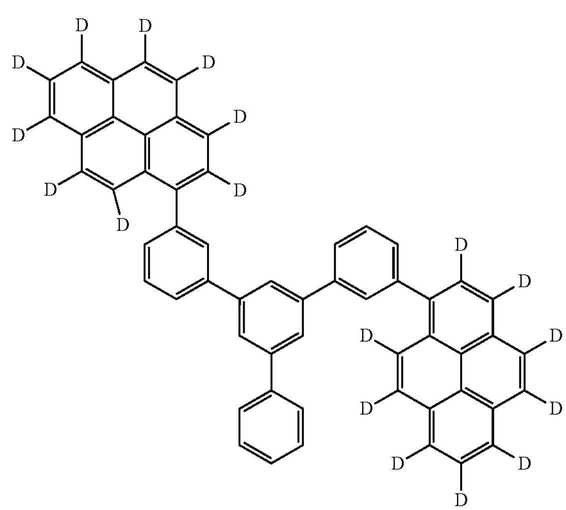

-continued
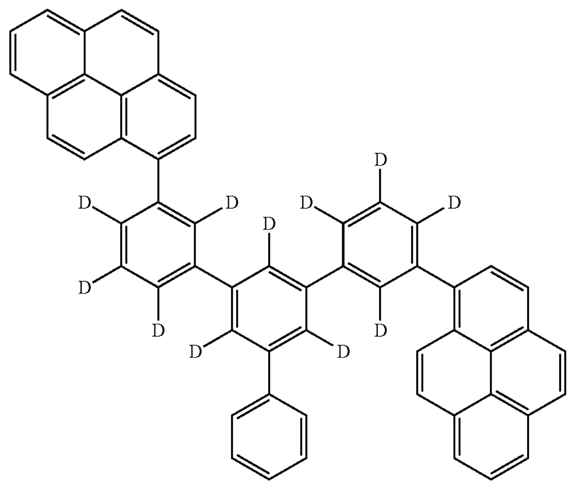
-continued
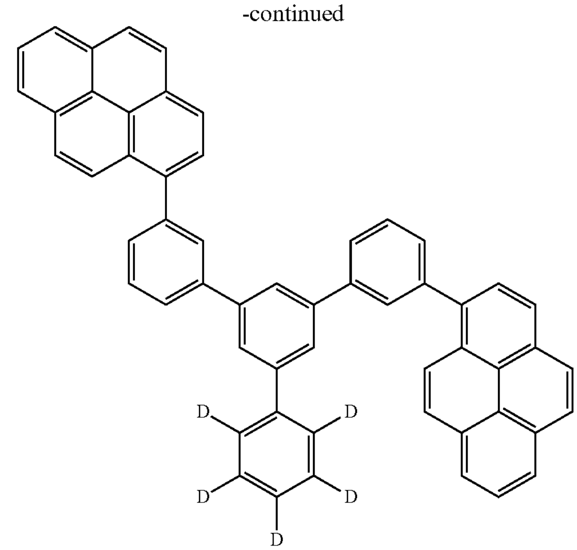
[Formula 397]
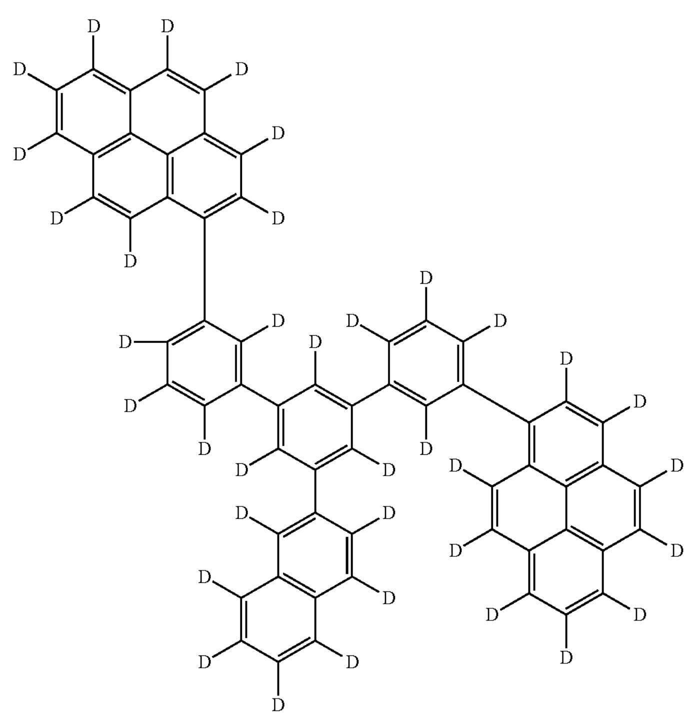

-continued
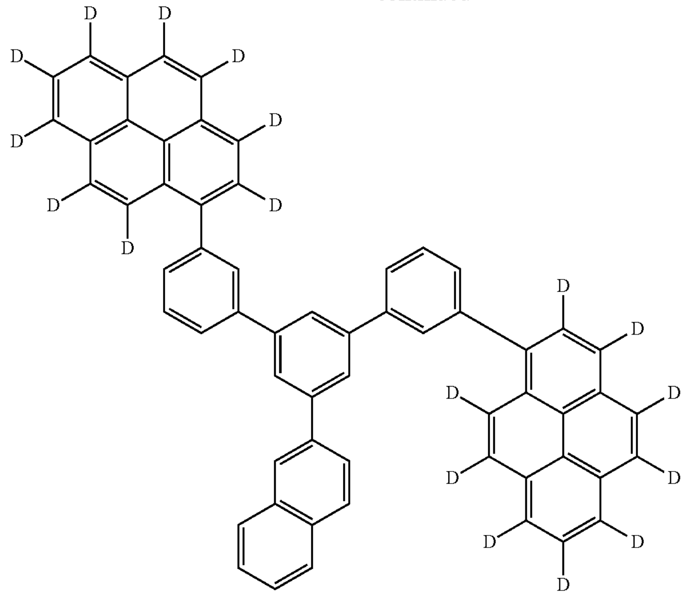
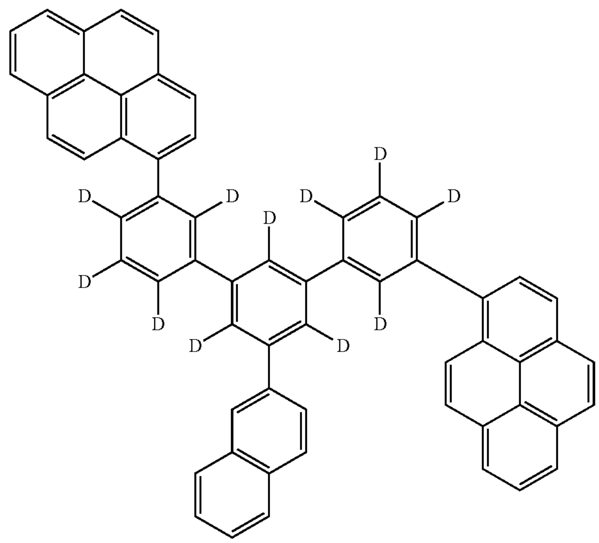
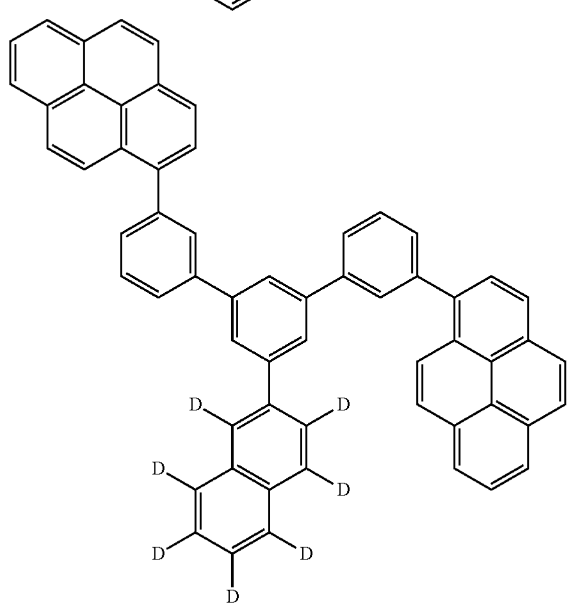

-continued
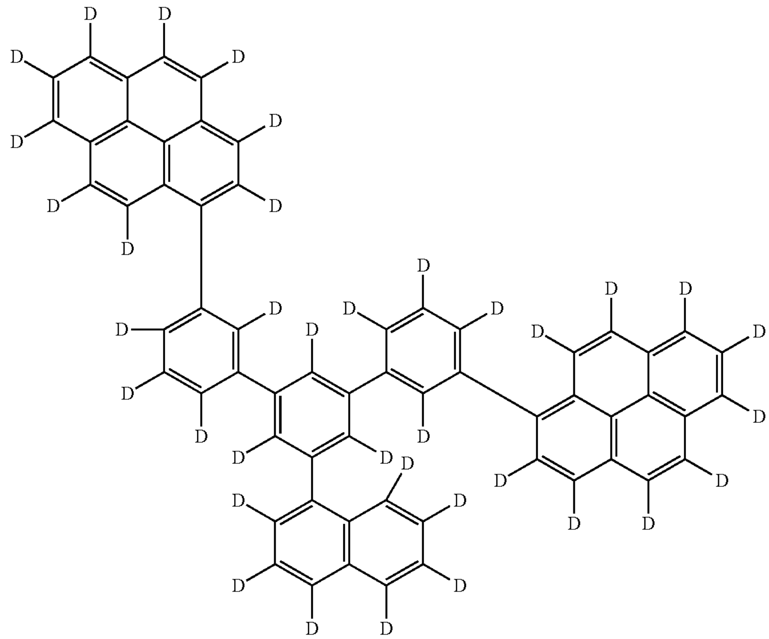
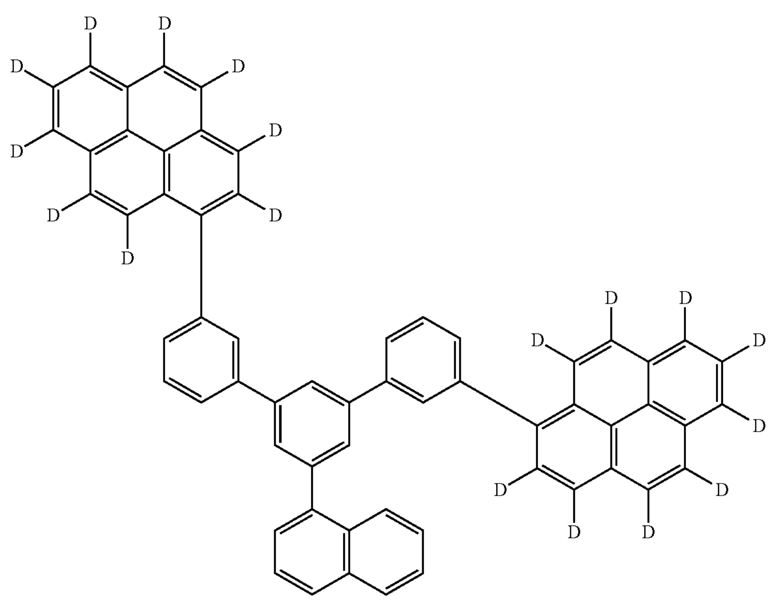

-continued
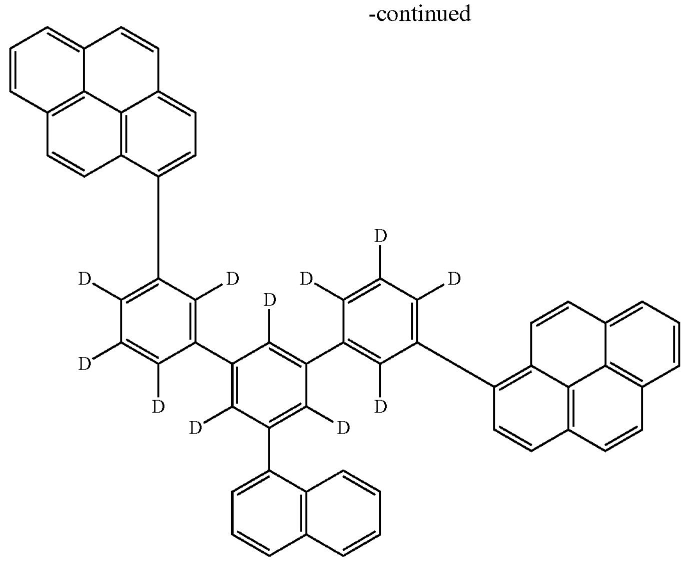
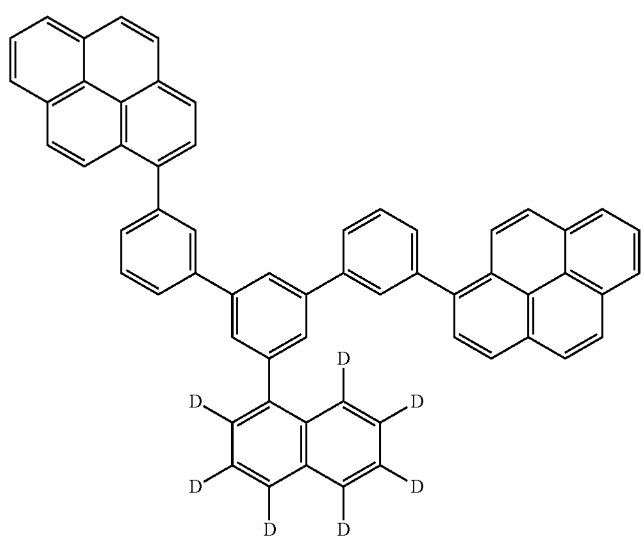
[Formula 399]
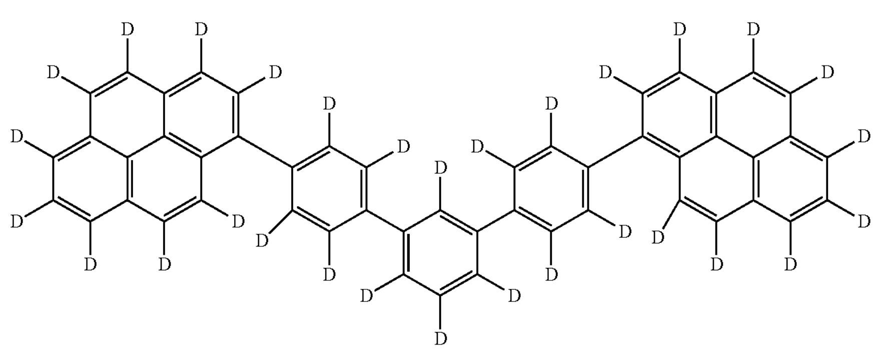

-continued
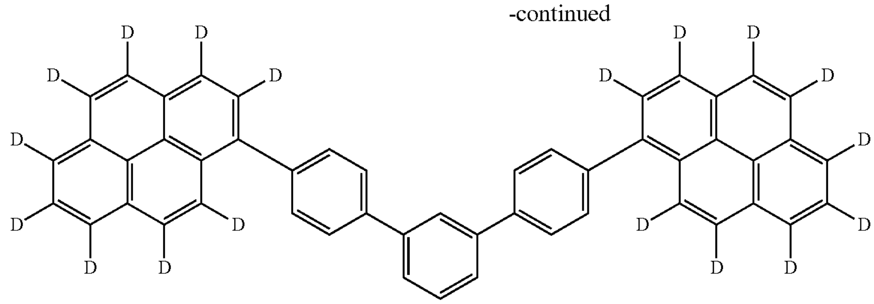
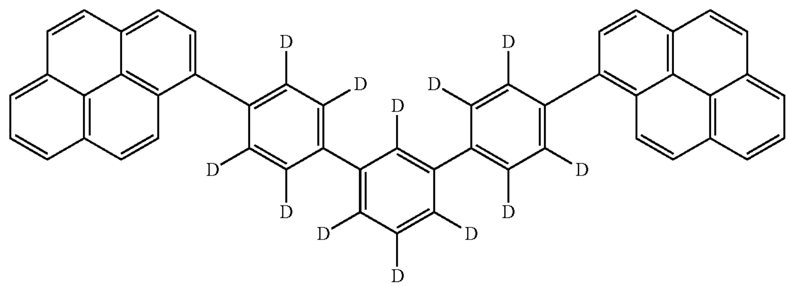
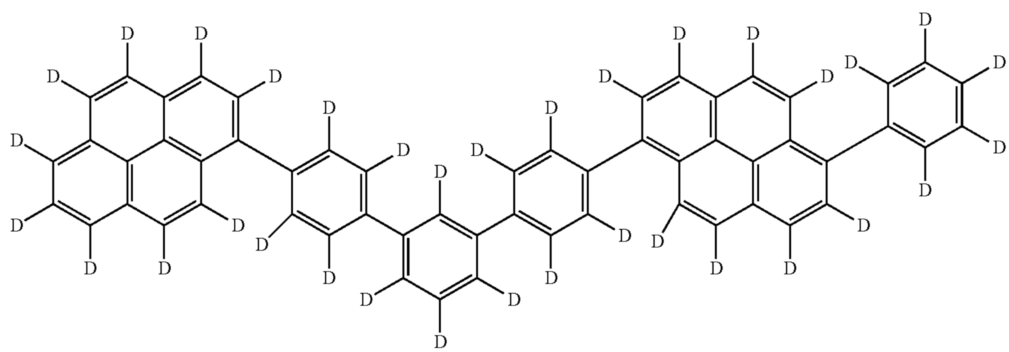
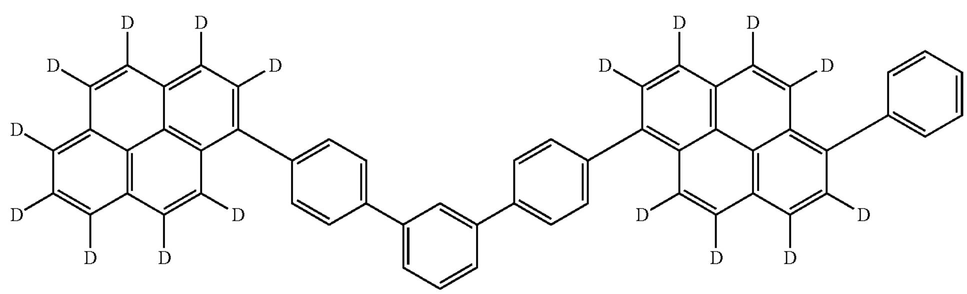
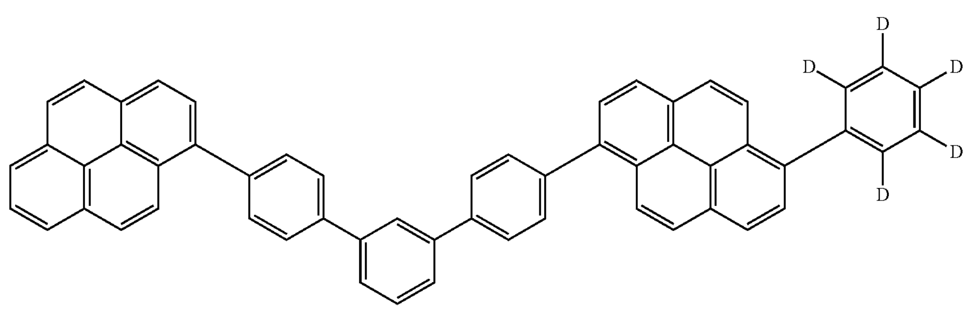

[Formula 399]
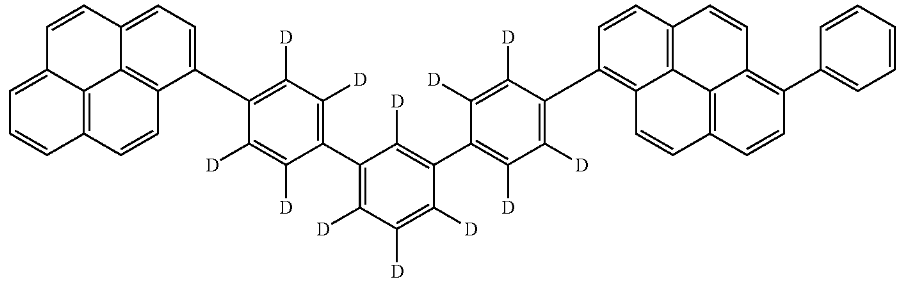
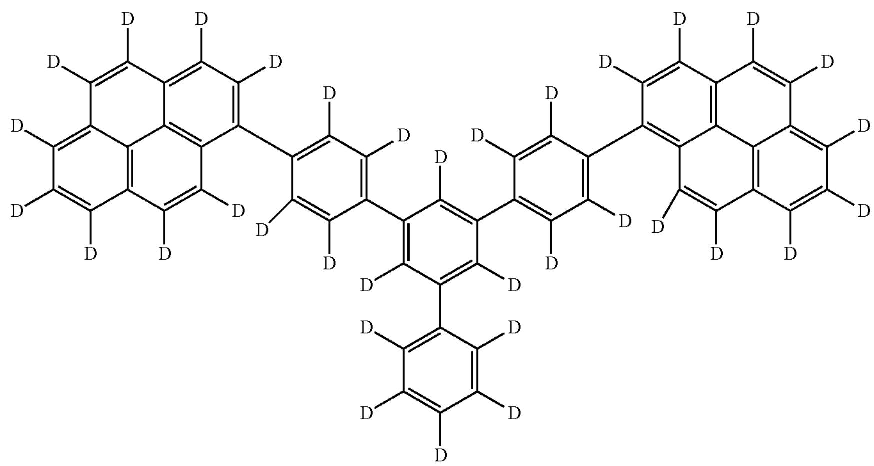
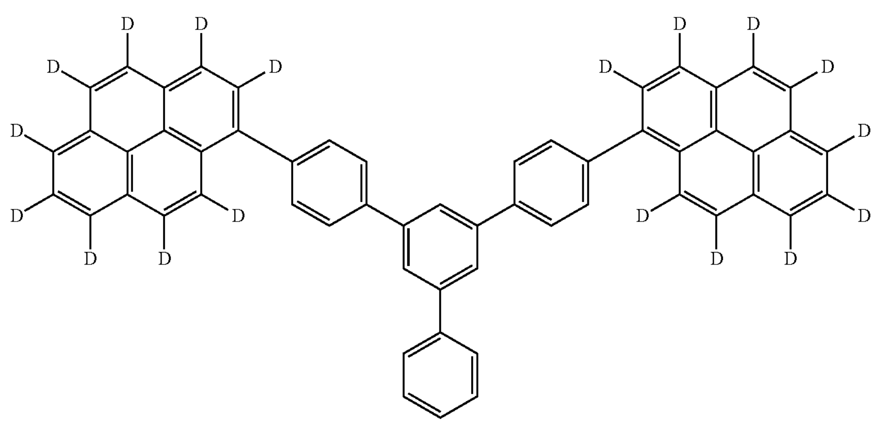
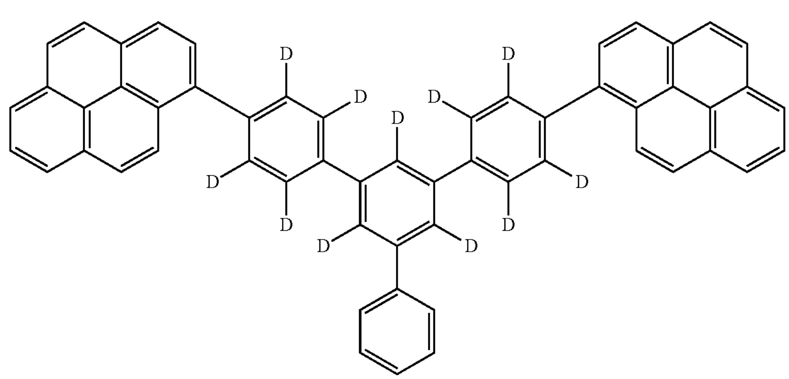

-continued
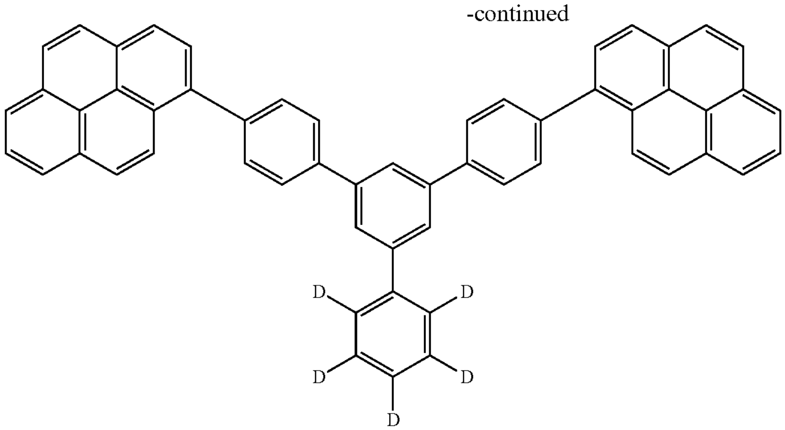
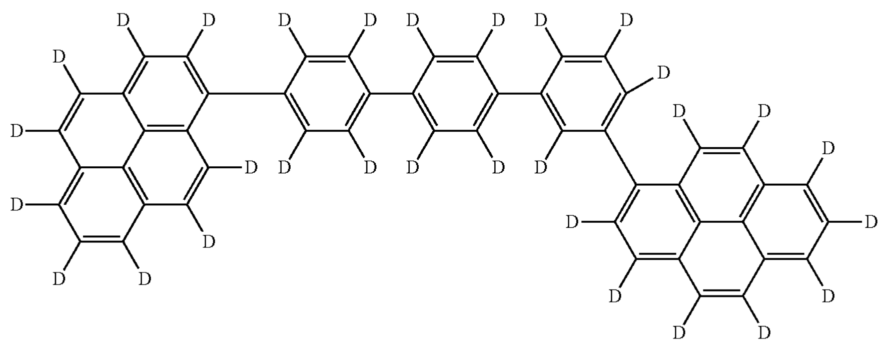
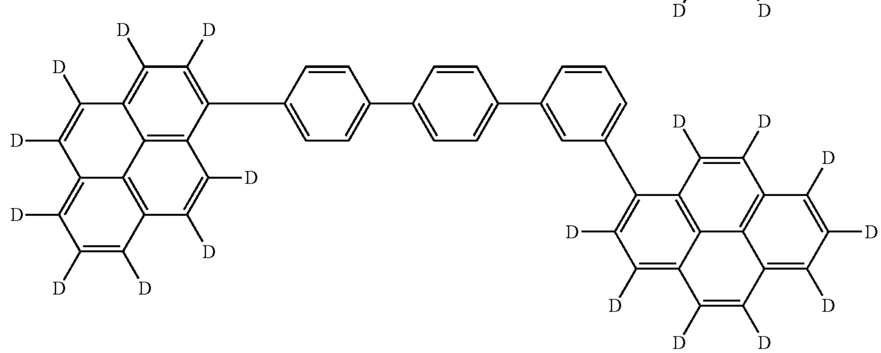
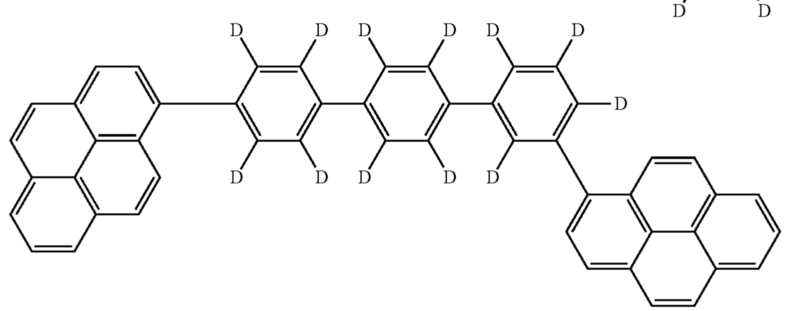
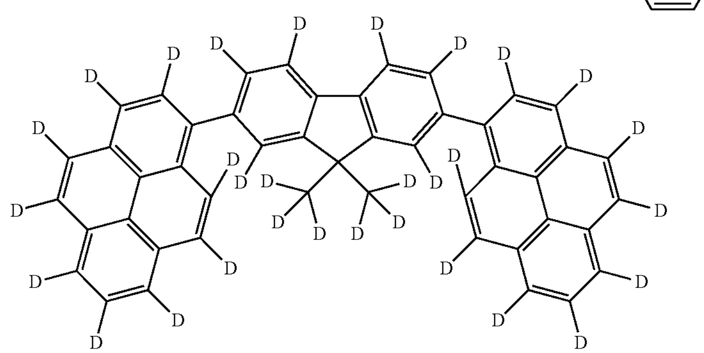

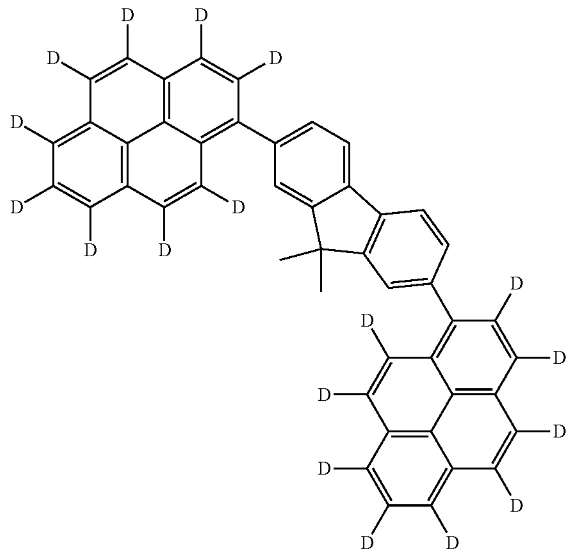
[Formula 400]
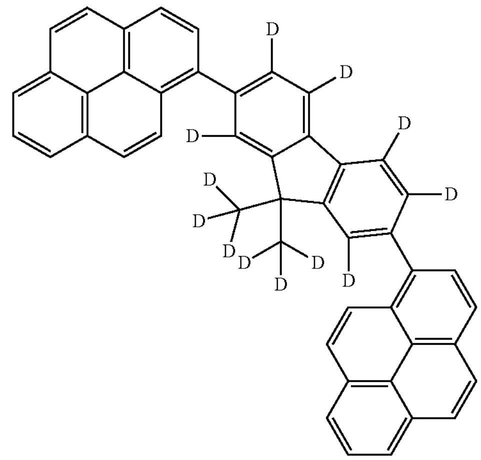
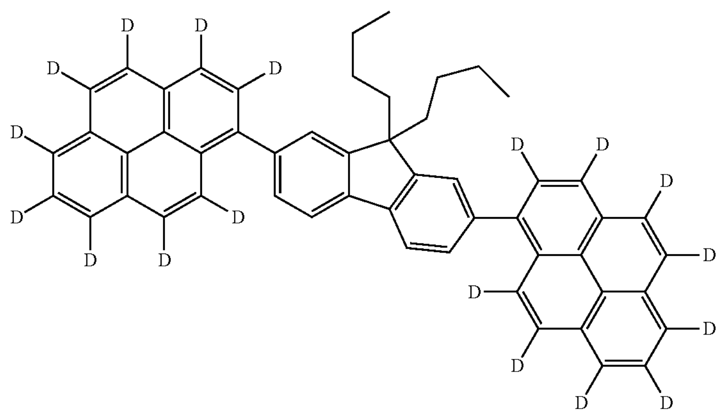
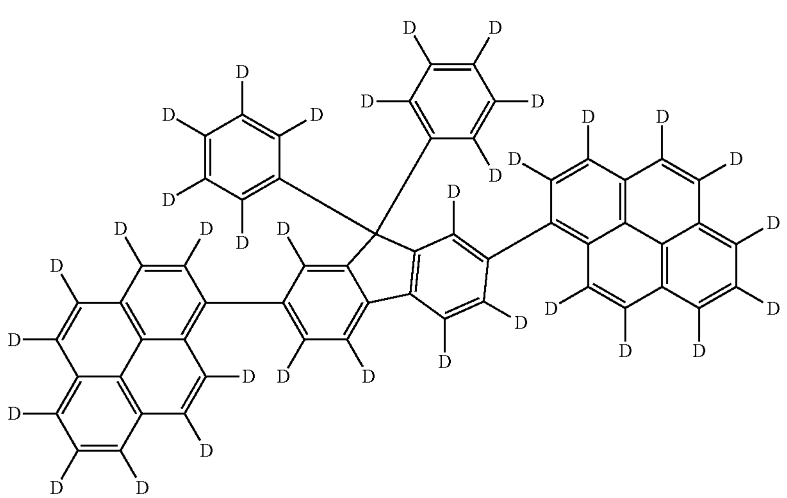

-continued
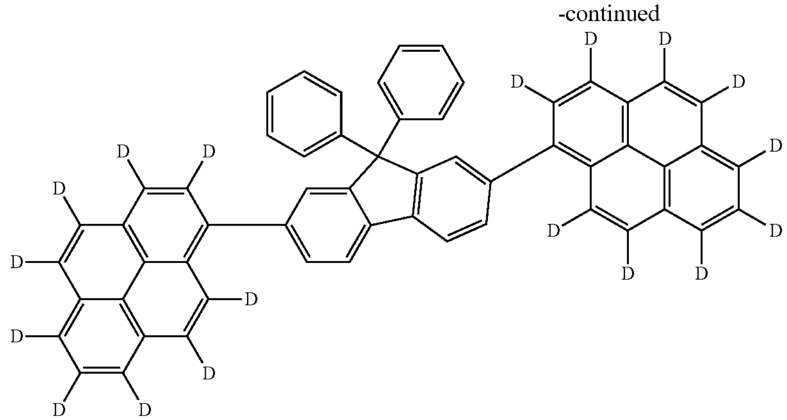
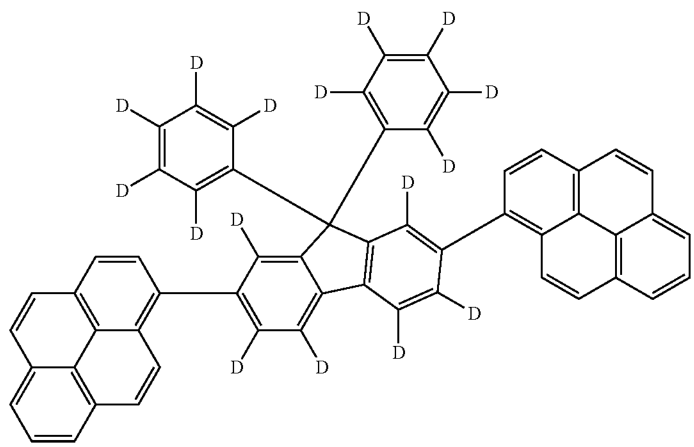
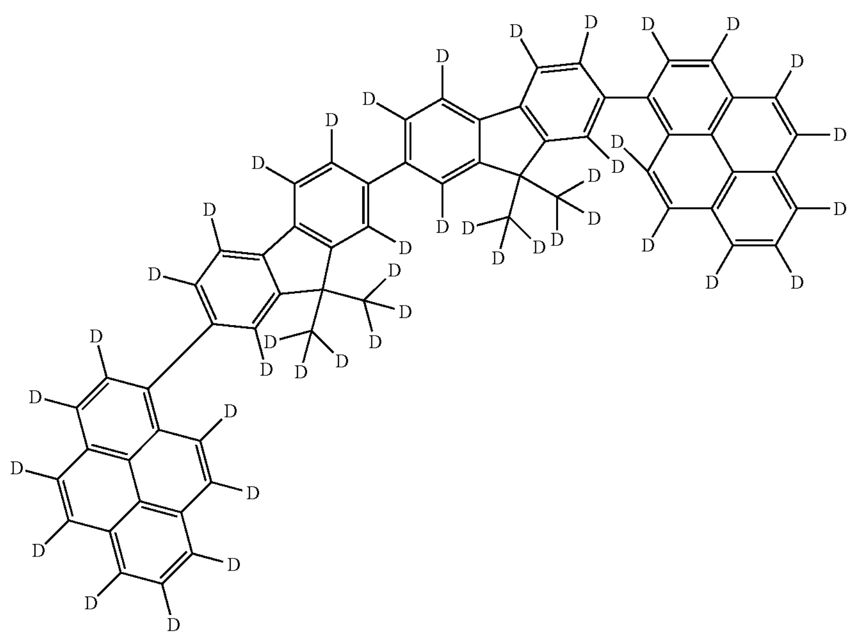

[Formula 401]
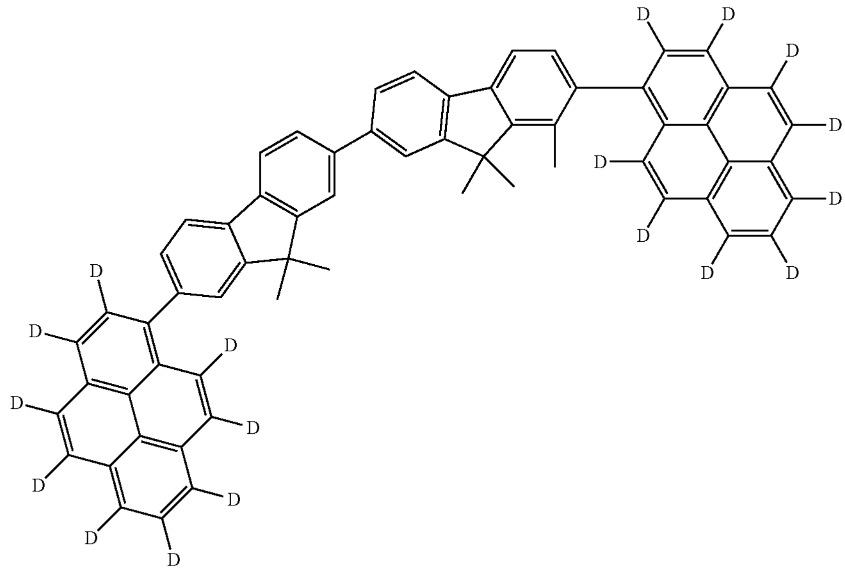
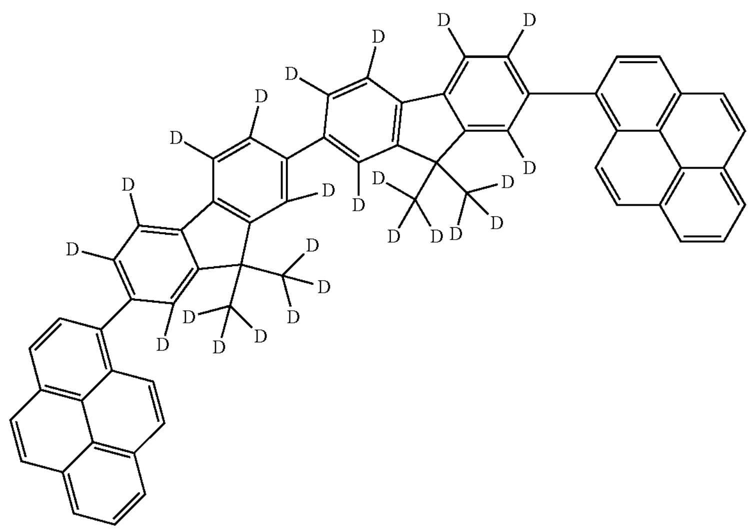
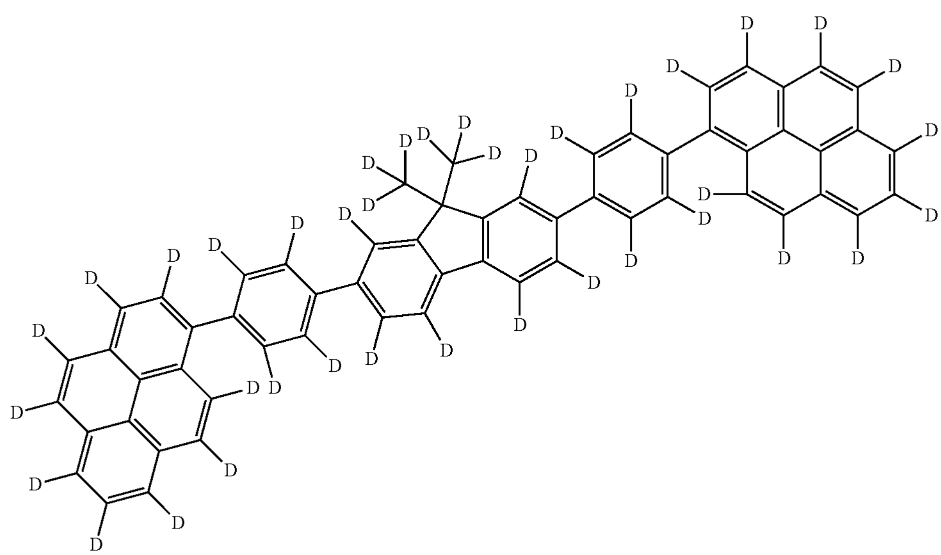

-continued
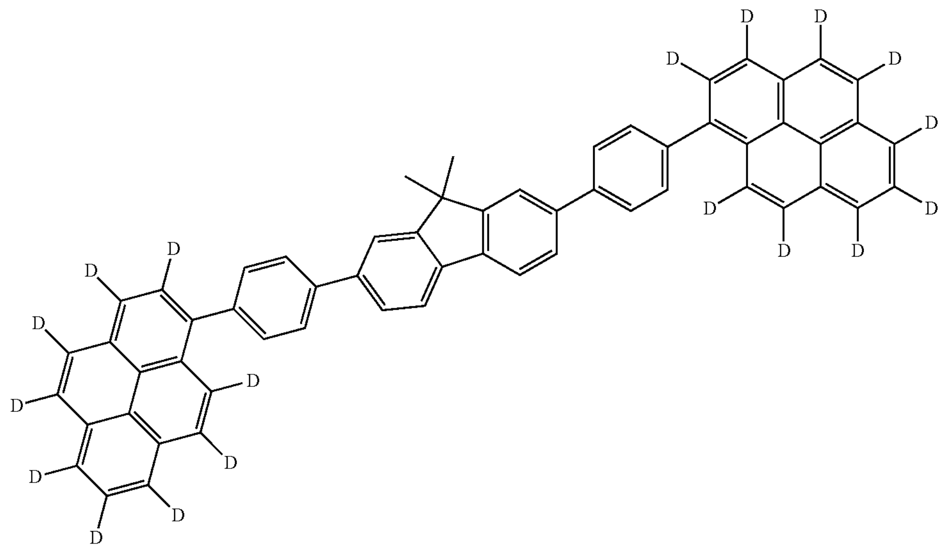
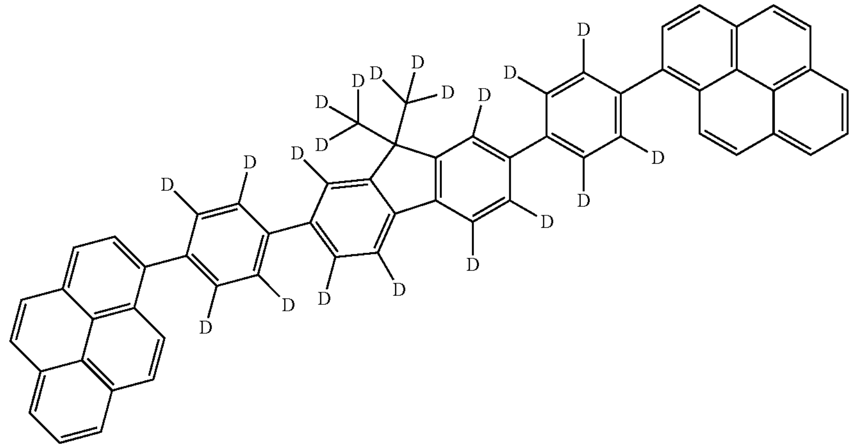
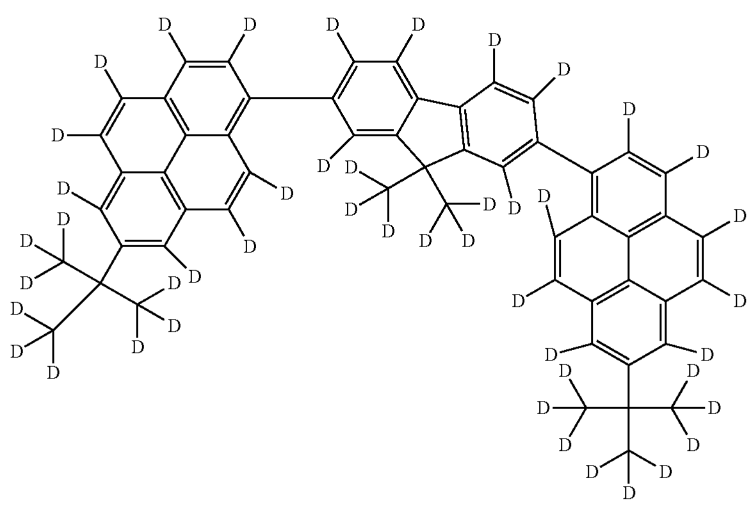

[Formula 402]
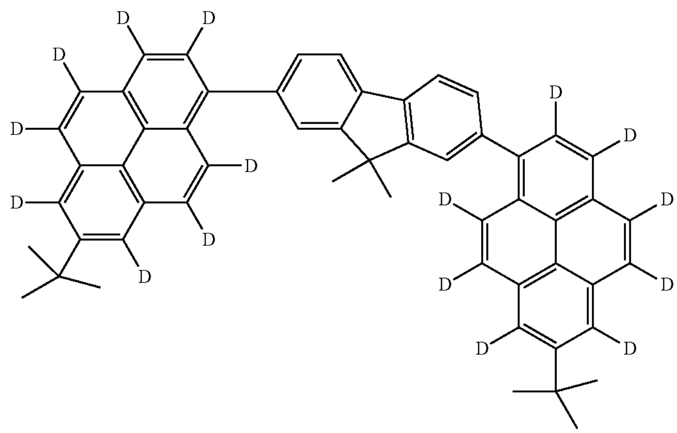
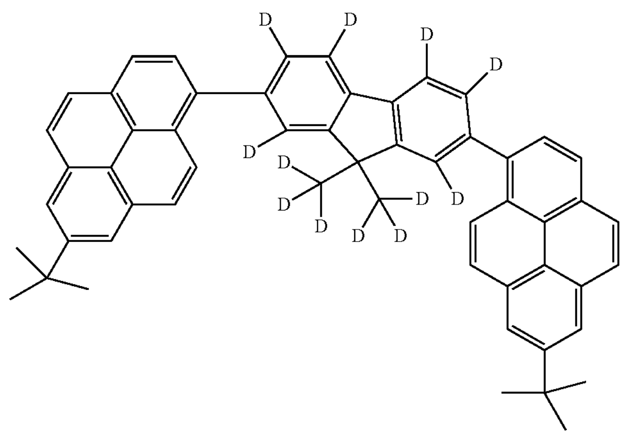
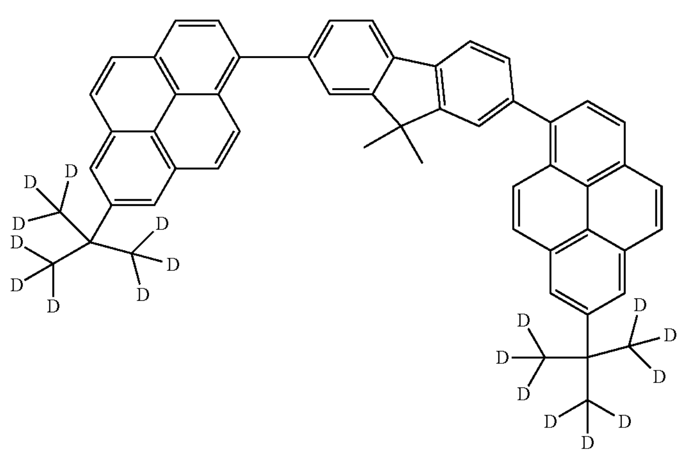

-continued
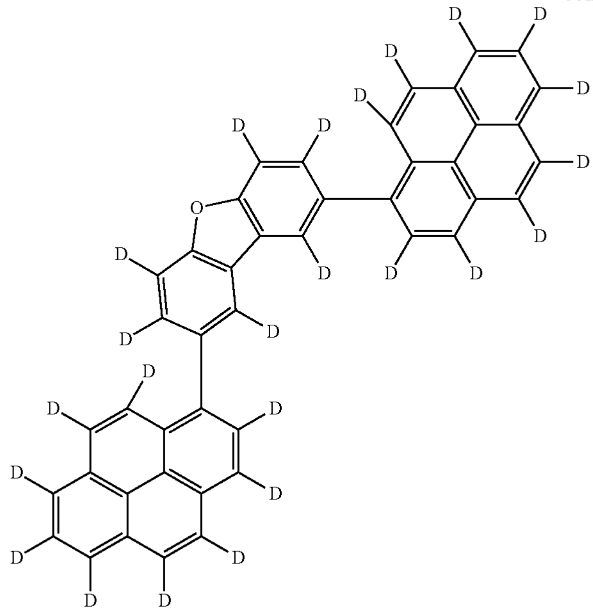
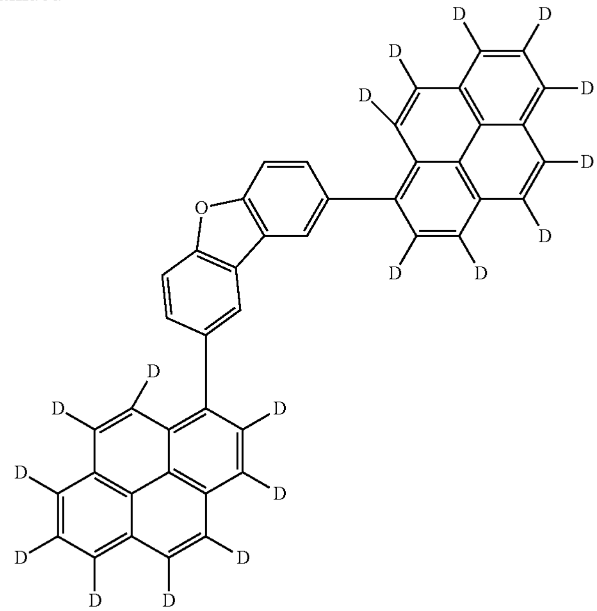
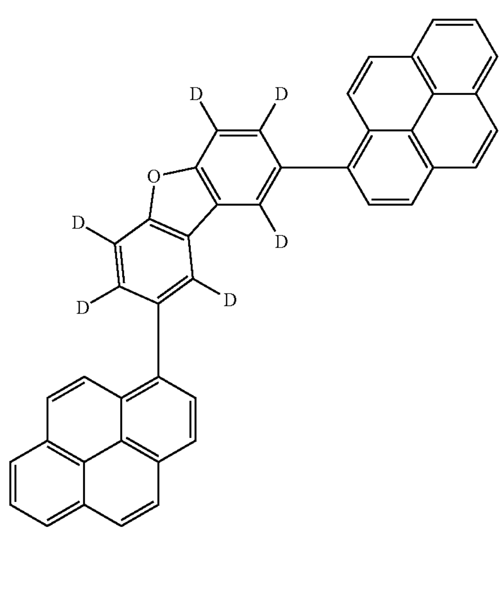
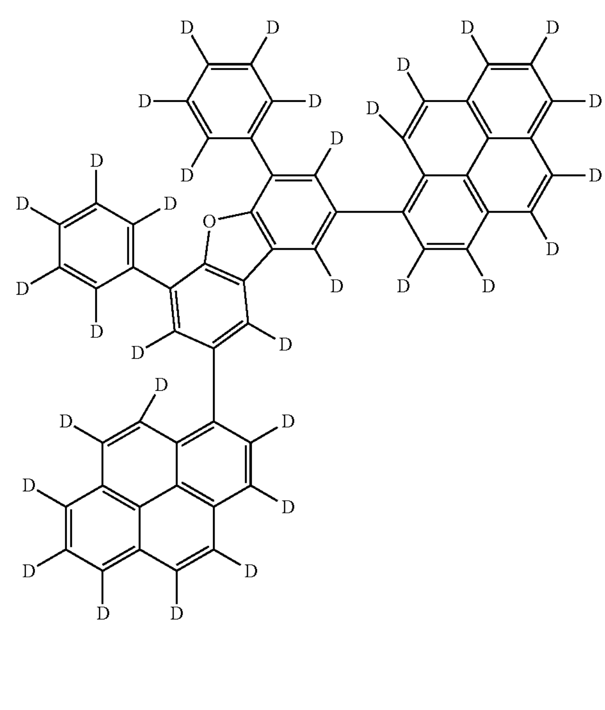

-continued
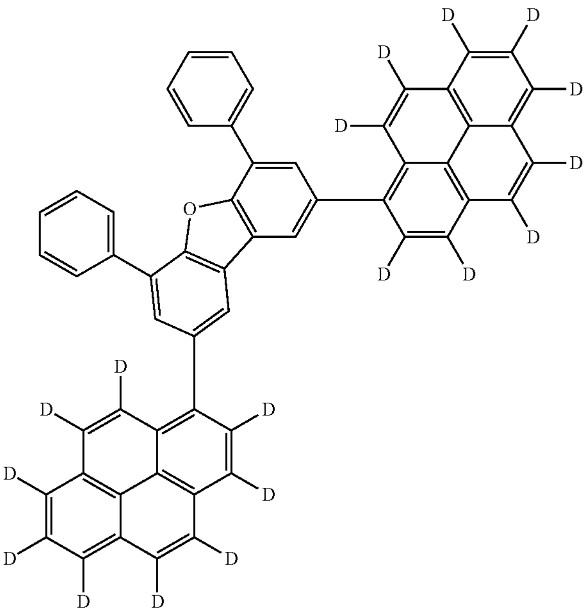
[Formula 403]
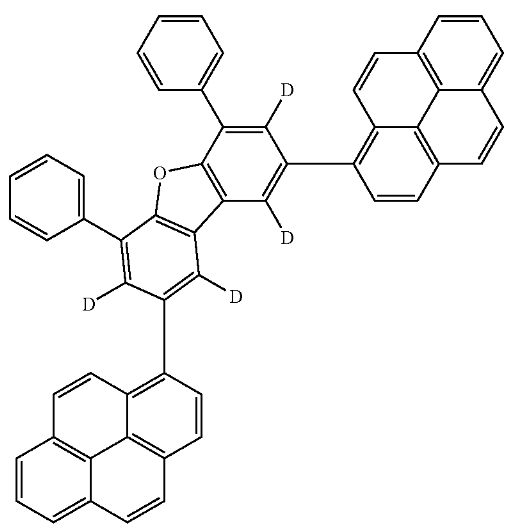
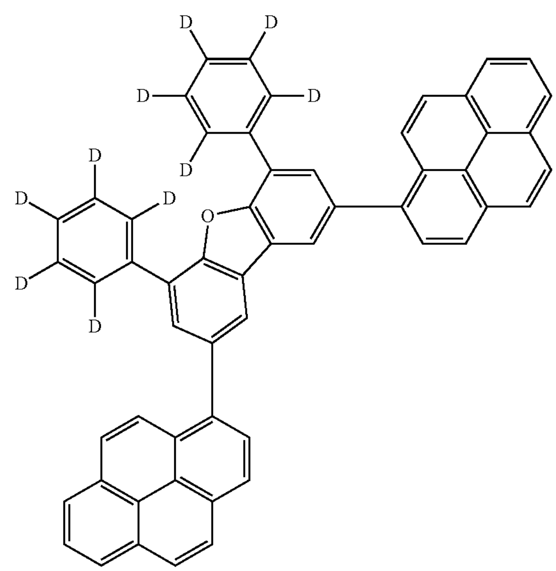
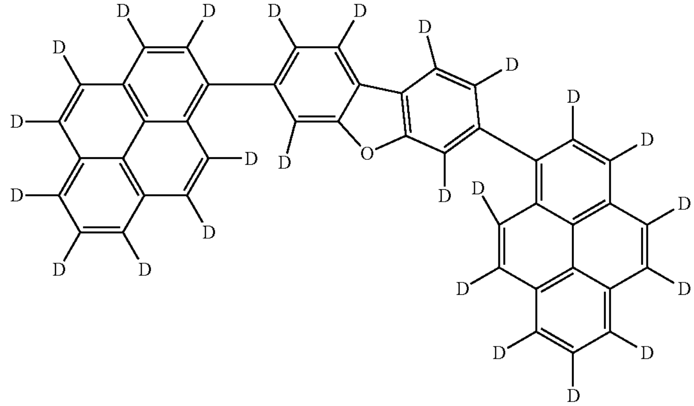

-continued
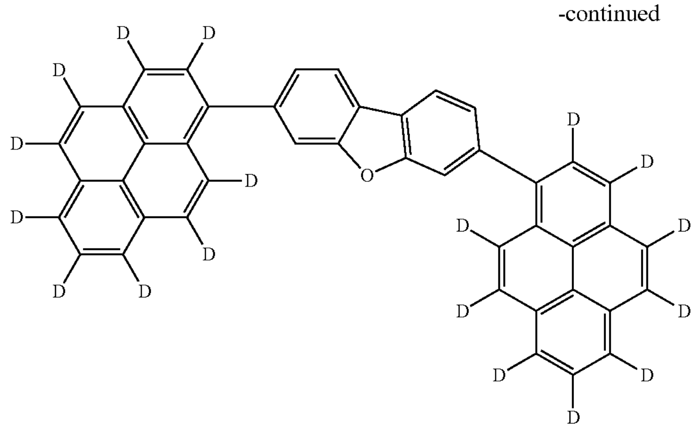
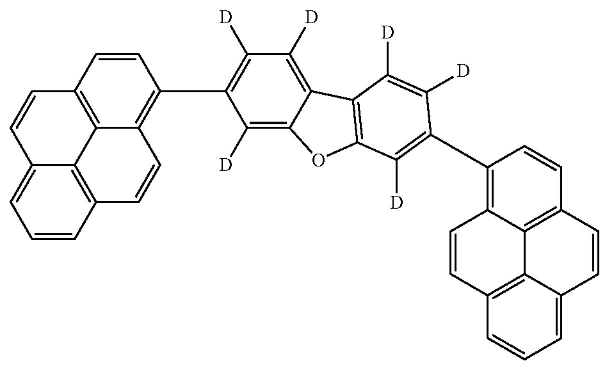
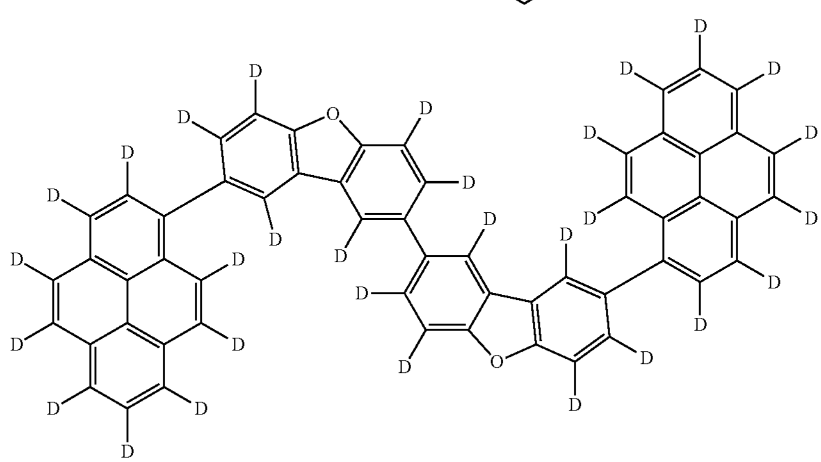
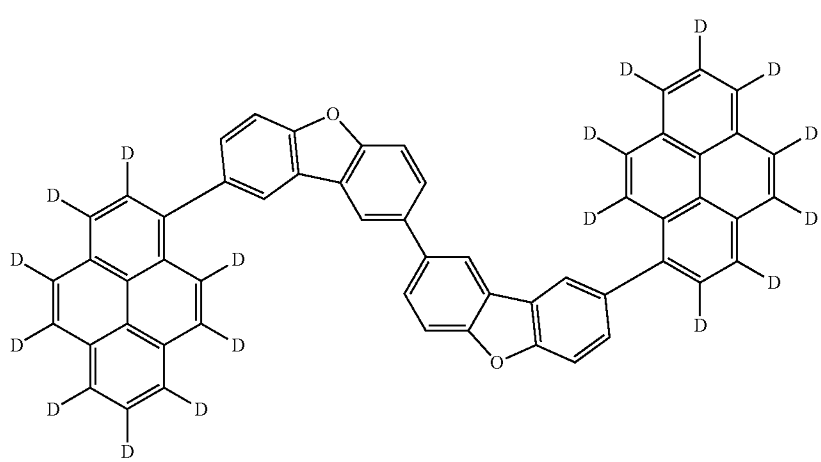

-continued
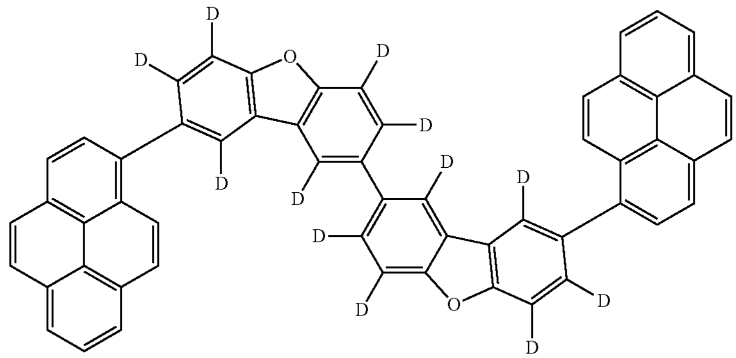
[Formula 404]
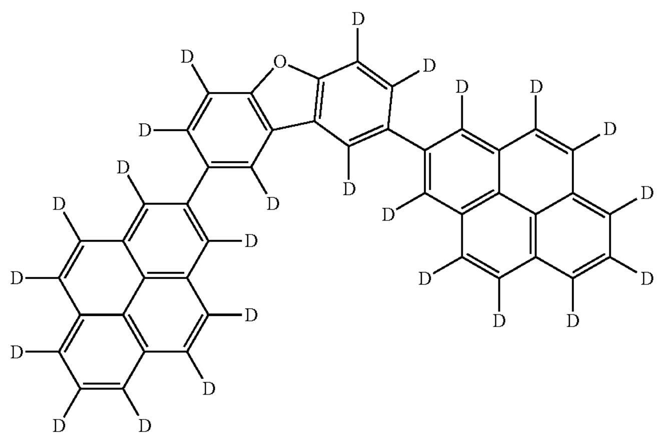
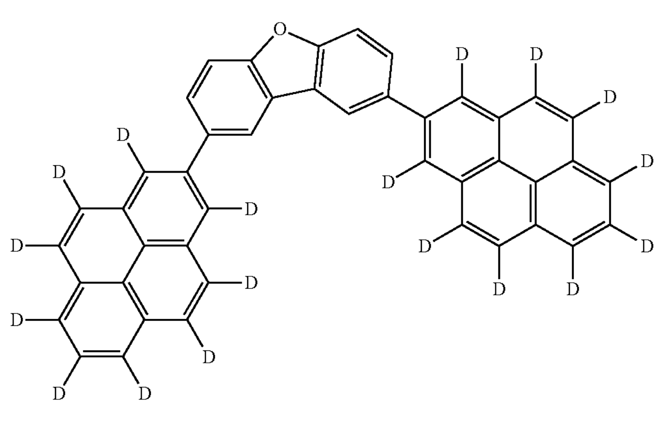
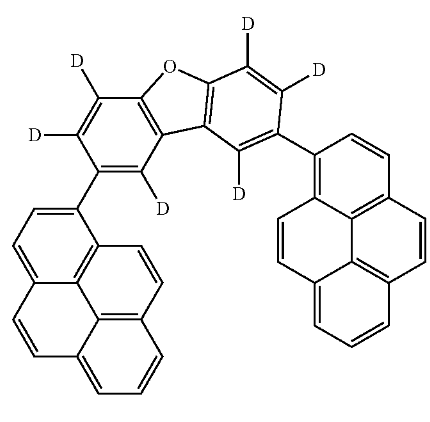

-continued
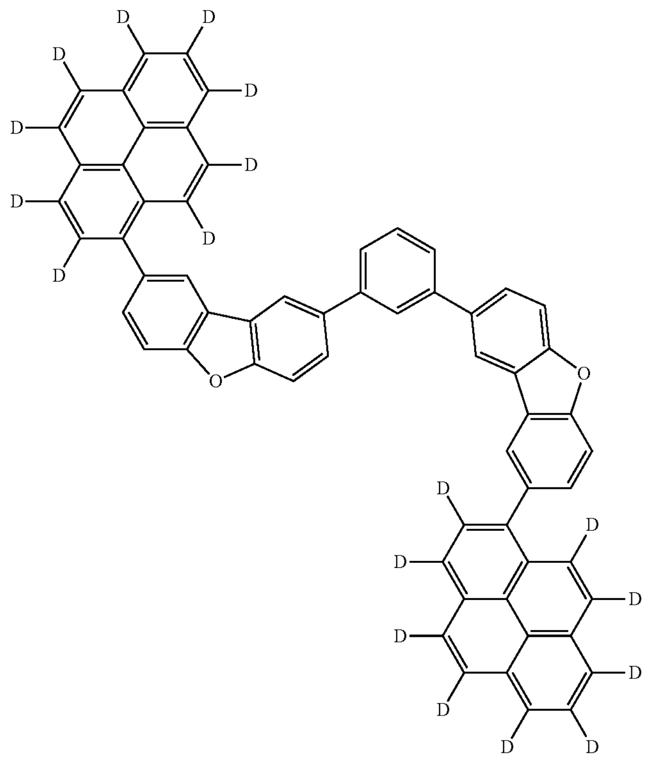
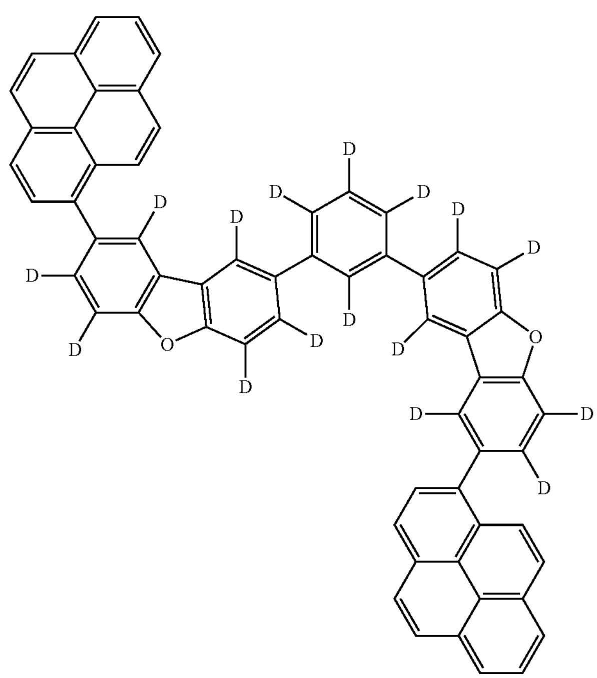

-continued
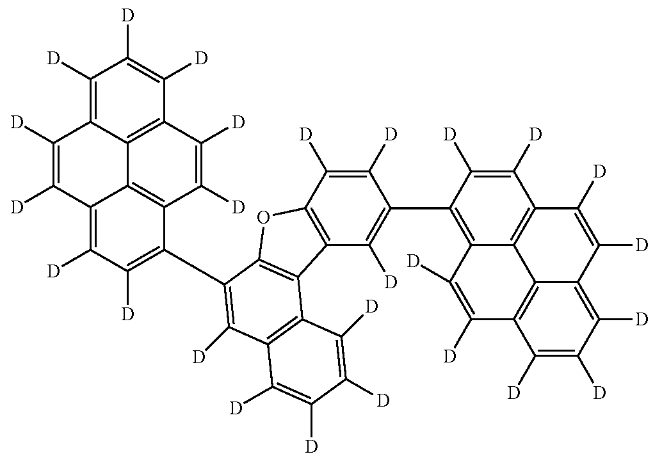
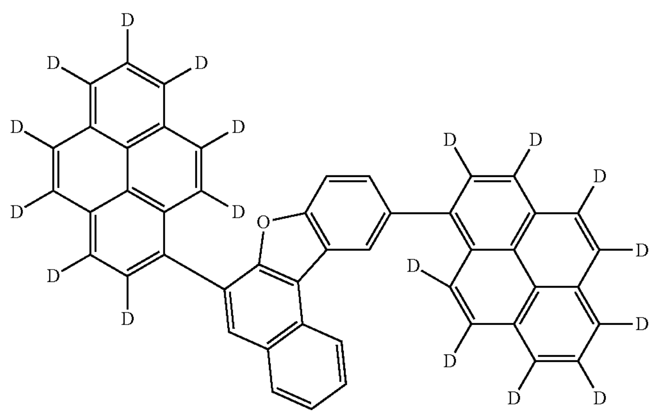
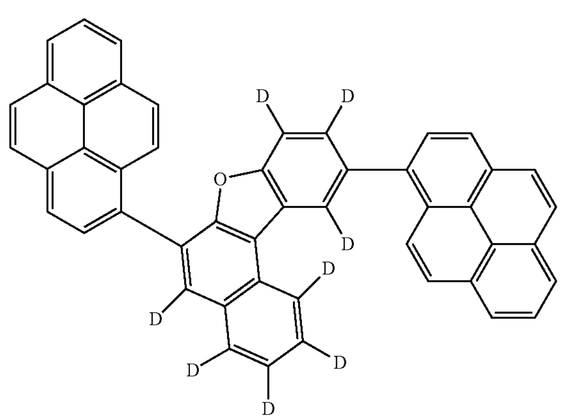 [SMILES: [2H]c1c(-c2ccc3ccc4cccc5ccc2c3c45)c([2H])c2c(oc3c(-c4ccc5ccc6cccc7ccc4c5c67)c([2H])c4c([2H])c([2H])c([2H])c([2H])c4c32)c1[2H]]

[Formula 405]
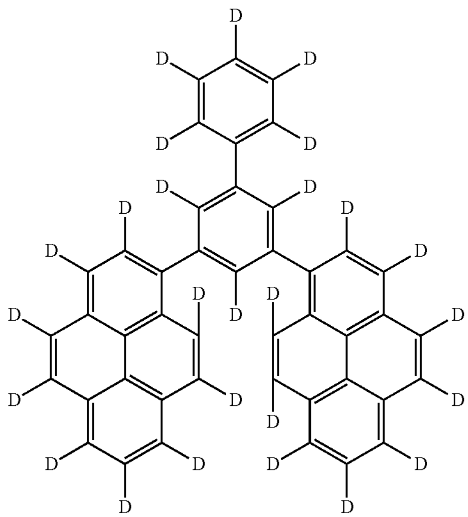
-continued
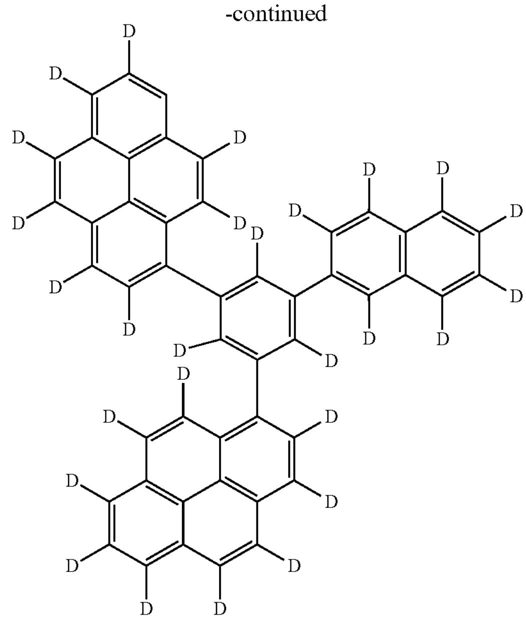
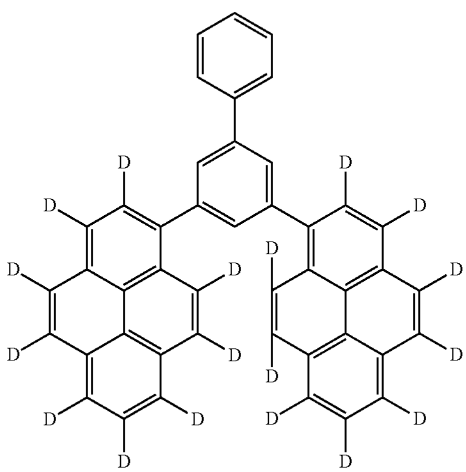
[Formula 406]
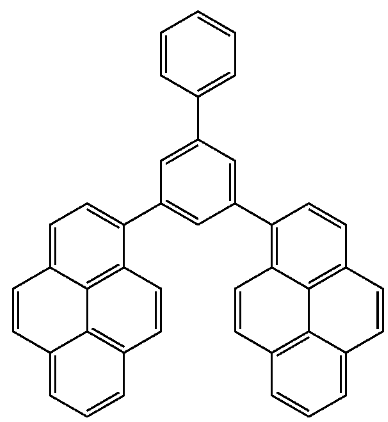
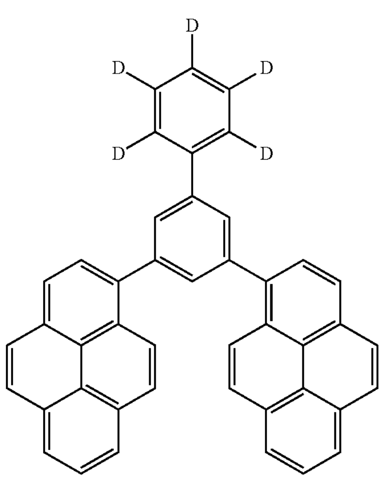
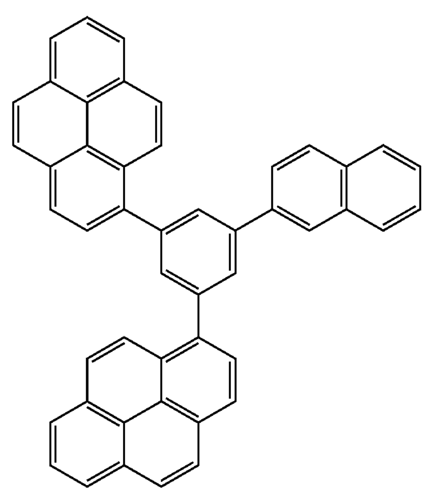

[Formula 407]

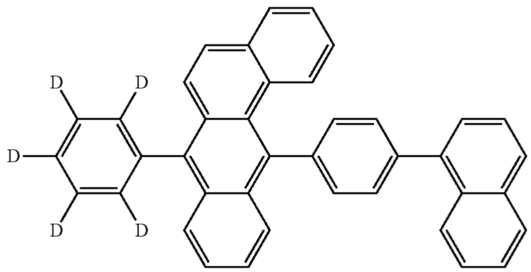

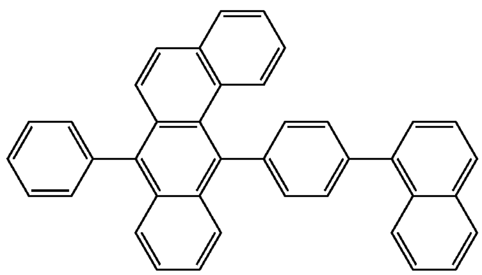

[Formula 408]

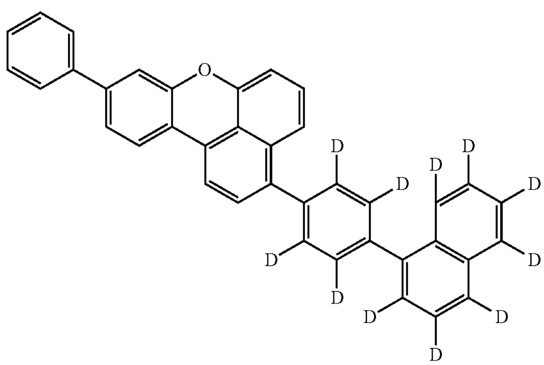

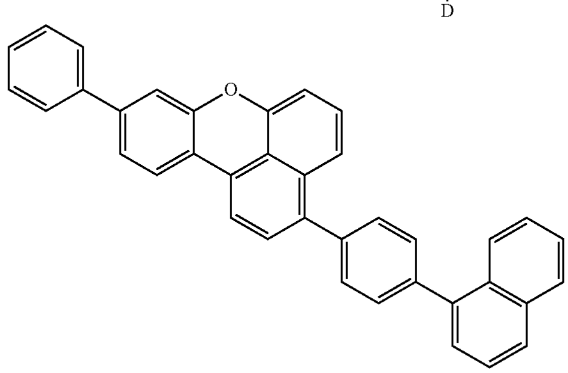

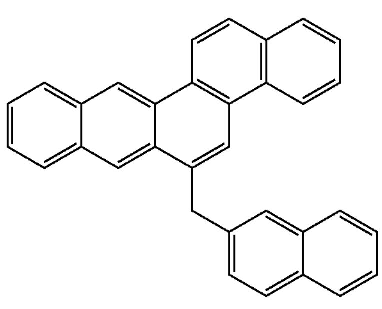

Second Compound

The second compound described in the first exemplary embodiment is usable also in the organic EL device according to the second exemplary embodiment.

$R_{201}$ to $R_{208}$ that are substituents of an anthracene skeleton in the second compound represented by the formula (2) are preferably hydrogen atoms in terms of preventing inhibition of intermolecular interaction and inhibiting decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that a relationship of μH2>μH1 shown by the numerical formula (Numerical Formula 6) may not be satisfied. When the second compound is used in the second emitting layer, it can be expected that satisfying the relationship of μH2>μH1 inhibits a decrease in a recombination ability between holes and electrons in the first emitting layer and a decrease in a luminous efficiency.

It should be noted that substituents, namely, a haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COOR$_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COOR$_{802}$, halogen atom, cyano group, and nitro group.

In the second compound, examples of the substituent for a "substituted or unsubstituted group" on $R_{201}$ to $R_{208}$ also preferably do not icnclude the above-described substituent that is likely to be bulky, especially a substituted or unsubstituted alkyl group and a substituted or unsubstituted cycloalkyl group. Since examples of the substituent for a "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

It is more preferable that $R_{201}$ to $R_{208}$, which are the substituents on the anthracene skeleton, are not bulky substituents, and $R_{201}$ to $R_{208}$ as substituents are unsubstituted. Assuming that $R_{201}$ to $R_{208}$, which are the substituents on the anthracene skeleton, are not bulky substituents and substituents are bonded to $R_{201}$ to $R_{208}$ which are the not-bulky substituents, the substituents bonded to $R_{201}$ to $R_{208}$ are preferably not the bulky substituents; the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

Method of Manufacturing Second Compound

The second compound usable in the organic EL device according to the exemplary embodiment can be manufactured by a known method. The second compound can also be manufactured based on a known method through a known alternative reaction using a known material(s) tailored for the target compound.

Specific Examples of Second Compound

Specific examples of the second compound usable in the organic EL device according to the exemplary embodiment include the specific examples of the second compound described in the first exemplary embodiment. It should however be noted that the invention is not limited by the specific examples of the second compound.

First Dopant Material, Second Dopant Material, and Third Dopant Material

In the organic EL device according to the exemplary embodiment, specific examples of the first, second, and third dopant materials include the fourth compound, the fifth compound, and the like described in the first exemplary embodiment.

According to the exemplary embodiment, the organic electroluminescence device that emits light at high luminous efficiency can be provided.

Third Exemplary Embodiment

Electronic Device

An electronic device according to the exemplary embodiment is installed with any one of the organic EL devices according to the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Exemplary Embodiment(s)

The scope of the invention is not limited by the above-described exemplary embodiments but includes any modification and improvement as long as such modification and improvement are compatible with the invention.

For instance, the emitting layer is not limited to two layers, but may be provided by laminating three or more of emitting layers. When the organic EL device has three or more emitting layers, it is only required that at least two of the emitting layers satisfy the conditions described in the above exemplary embodiments. The rest of the emitting layers is, for instance, a fluorescent emitting layer or a phosphorescent emitting layer with use of emission caused by electron transfer from the triplet excited state directly to the ground state, in an exemplary embodiment.

When the organic EL device includes a plurality of emitting layers, these emitting layers may be mutually adjacently provided, or may form a so-called tandem organic EL device, in which a plurality of emitting units are layered via an intermediate layer.

For instance, a blocking layer is optionally provided adjacent to the emitting layer closer to the cathode. The blocking layer is preferably provided in contact with the emitting layer to block at least any of holes, electrons, and excitons.

For instance, when the blocking layer is provided in contact with the cathode-side of the emitting layer, the blocking layer permits transport of electrons, and blocks holes from reaching a layer provided near the cathode (e.g., the electron transporting layer) beyond the blocking layer. When the organic EL device includes the electron transporting layer, the blocking layer is preferably disposed between the emitting layer and the electron transporting layer.

When the blocking layer is provided in contact with the anode-side of the emitting layer, the blocking layer permits transport of holes, but blocks electrons from reaching a layer provided near the anode (e.g., the hole transporting layer) beyond the blocking layer. When the organic EL device includes the hole transporting layer, the blocking layer is disposed between the emitting layer and the hole transporting layer.

Alternatively, the blocking layer may be provided adjacent to the emitting layer so that the excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The invention will be described in further detail with reference to Example(s). It should be noted that the scope of the invention is by no means limited by Examples.

Compounds

Structures of a compound represented by a formula (1) and used for manufacturing organic EL devices according to Examples 1 to 14 and 21 are shown below.

[Formula 409]

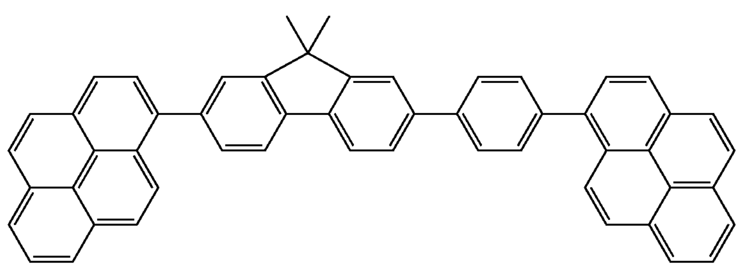

BH1

-continued

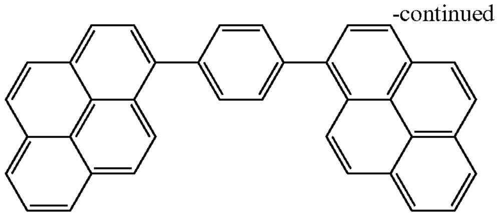

BH3

[Formula 410]

BH5

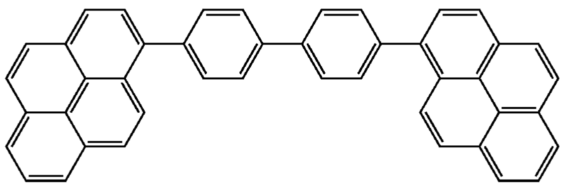

BH7

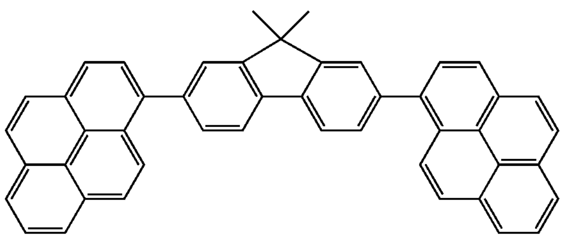

[Formula 411]

BH1-5

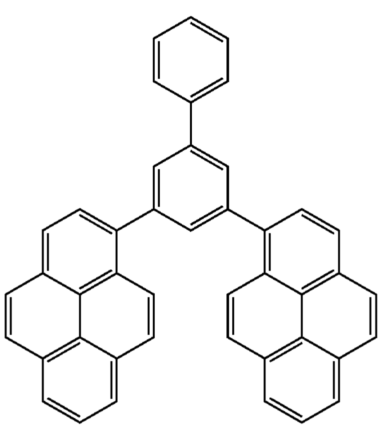

A structure of a compound represented by a formula (1X) and used for manufacturing an organic EL device in Example 15 is shown below.

[Formula 412]

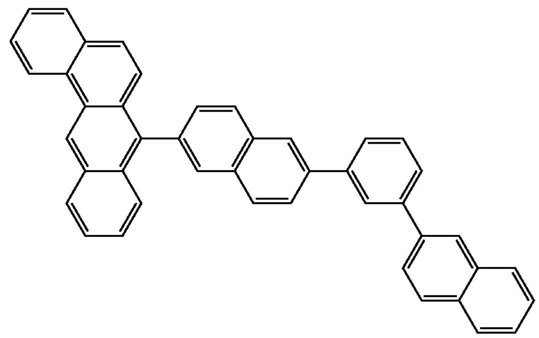

BH1-1

A structure of a compound represented by a formula (12X) and used for manufacturing organic EL devices in Examples 16, 18, and 20 is shown below.

[Formula 413]

BH1-2

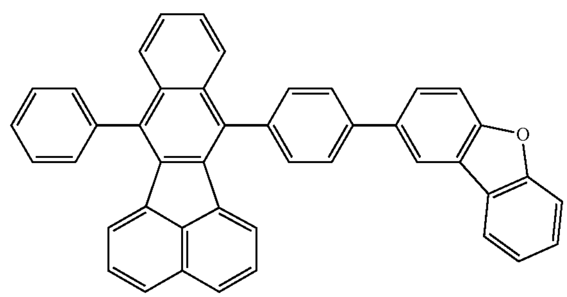

A structure of a compound represented by a formula (14X) and used for manufacturing organic EL devices in Examples 17 and 18 is shown below.

[Formula 414]

BH1-3

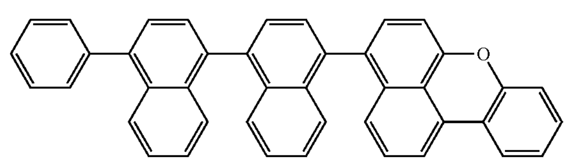

A structure of a compound represented by a formula (15X) and used for manufacturing organic EL devices in Examples 19 and 20 is shown below.

[Formula 415]
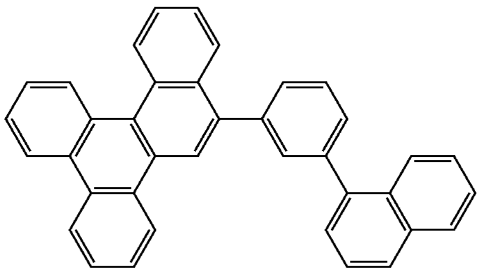
BH1-4
Structures of a compound represented by a formula (2) and used for manufacturing organic EL devices in Examples 1 to 21 are shown below.
[Formula 416]
BH2
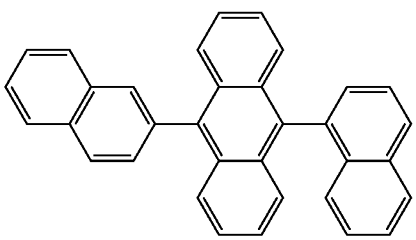
BH4
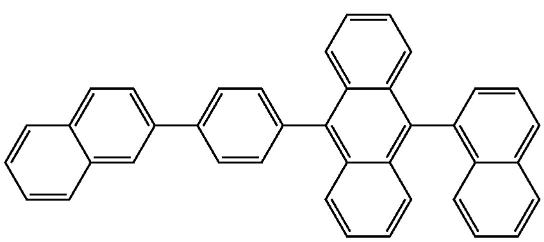
[Formula 417]
BH6
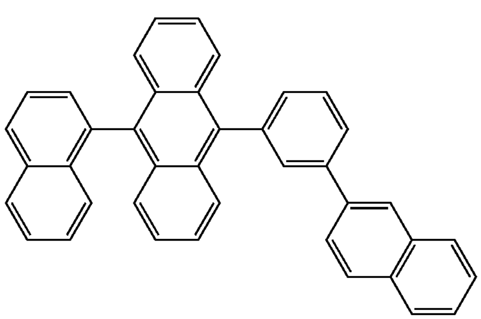
-continued
BH8
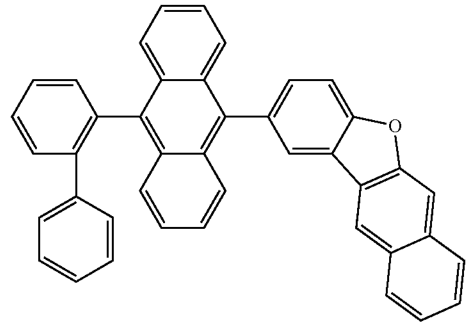
[Formula 418]
BH2-1
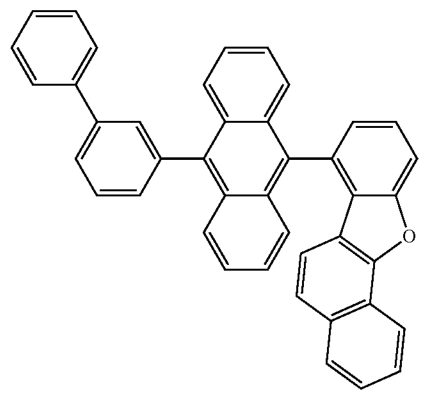
Structures of a compound represented by a formula (31), (32), or (31X) and used for manufacturing organic EL devices in Examples 1 to 21 are shown below.
[Formula 419]
HT1
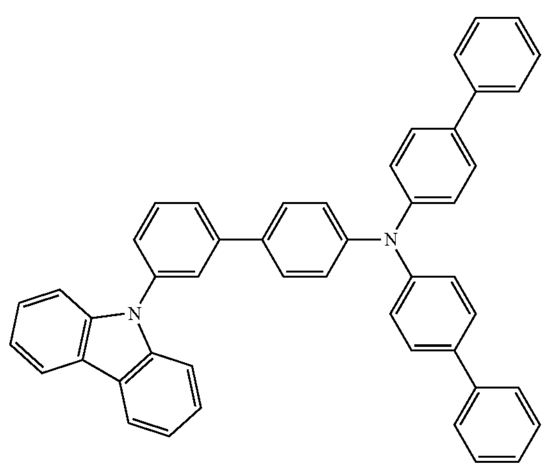

-continued
HT2
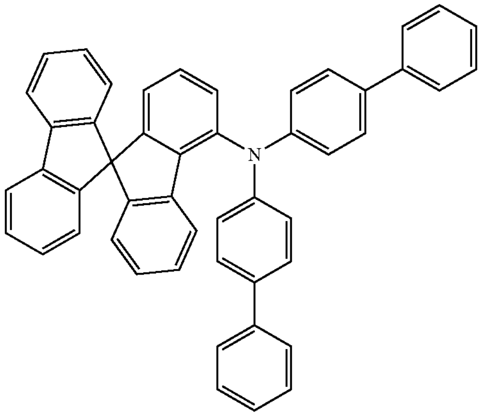
[Formula 420]
HT3
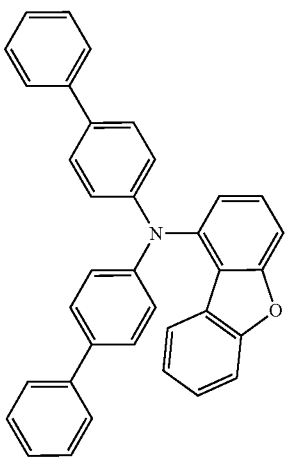
HT4
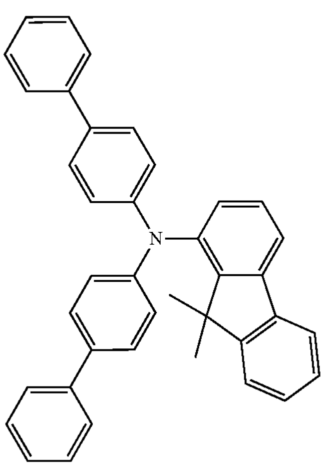
-continued
HT5
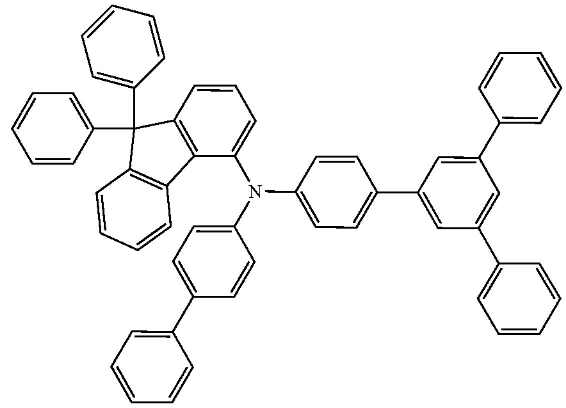
[Formula 421]
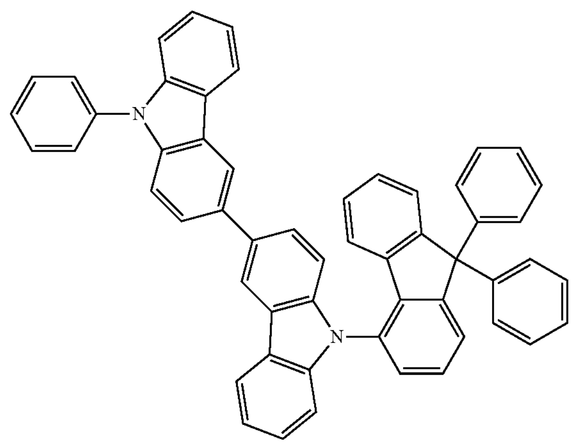
HT6
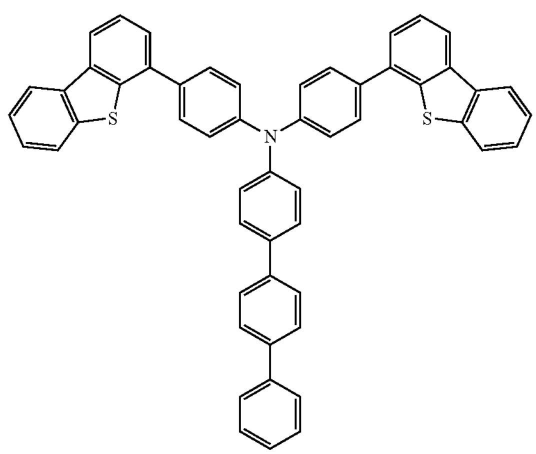
HT7

[Formula 422]
HT8
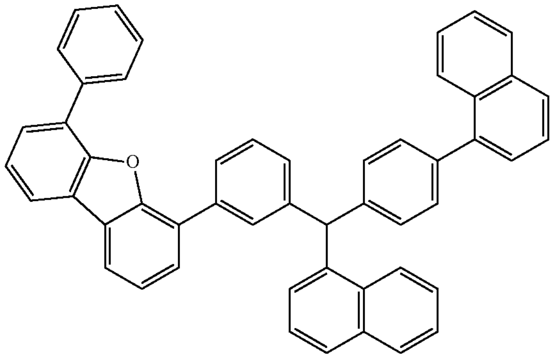
HT9
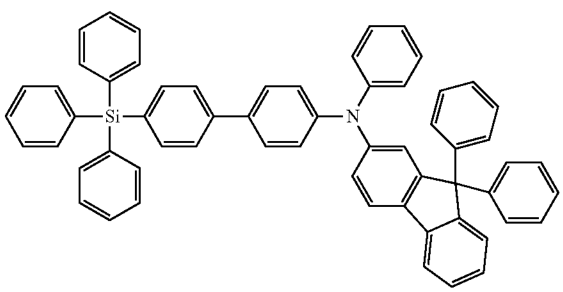
[Formula 422]
HT10
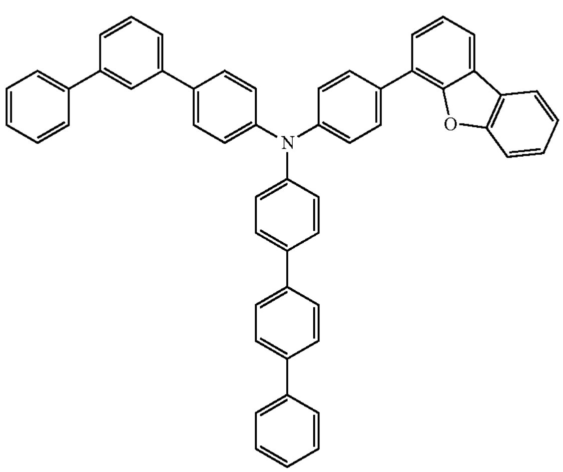
-continued
HT11
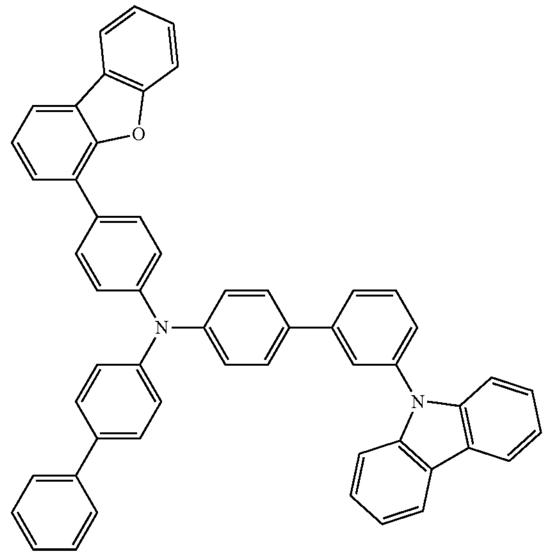
[Formula 424]
HT12
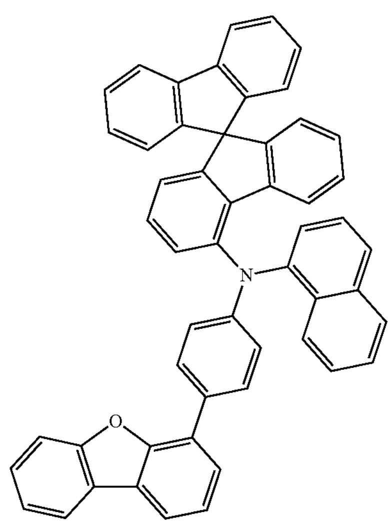

-continued
HT13
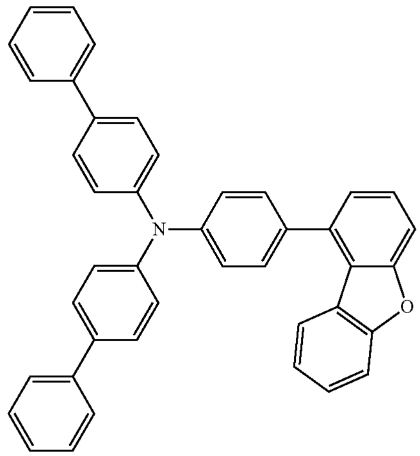
HT14
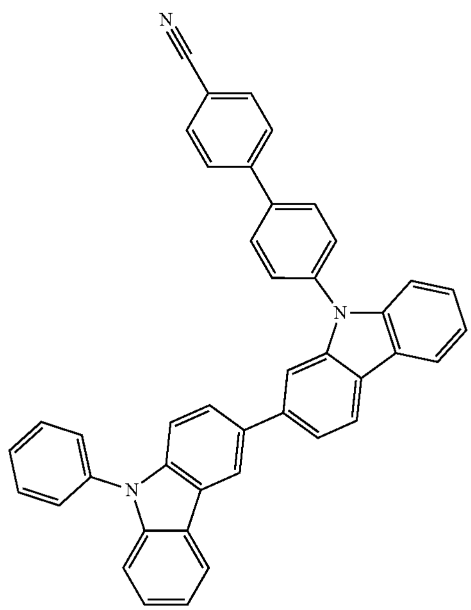
[Formula 425]
HT15
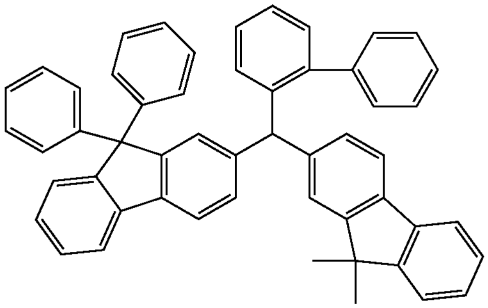
A structure of a compound used for manufacturing the organic EL devices in Comparatives 1 to 5 is shown below.
[Formula 426]
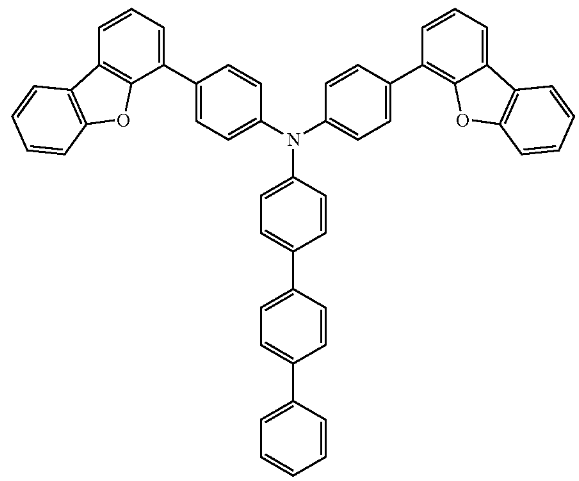
Ref-HT-A
Structures of other compounds used for manufacturing the organic EL devices in Examples 1 to 21 and Comparatives 1 to 5 are shown below.
[Formula 427]
pdope
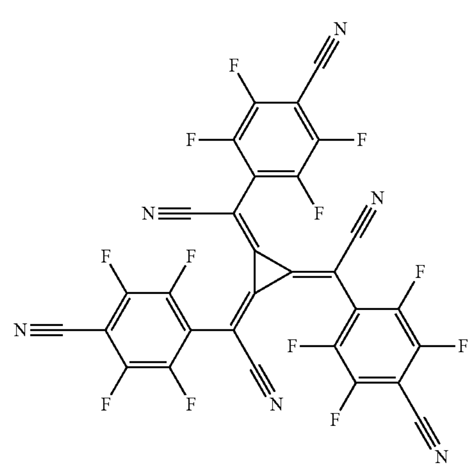

-continued
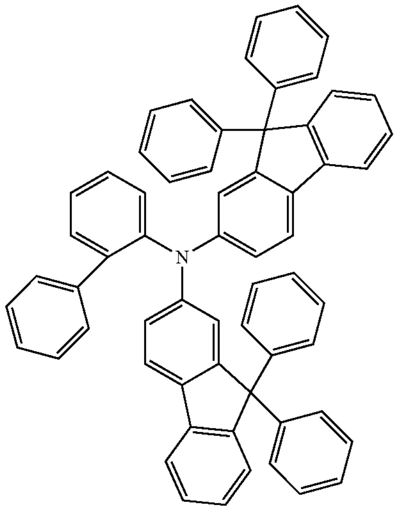
HT-B
[Formula 428]
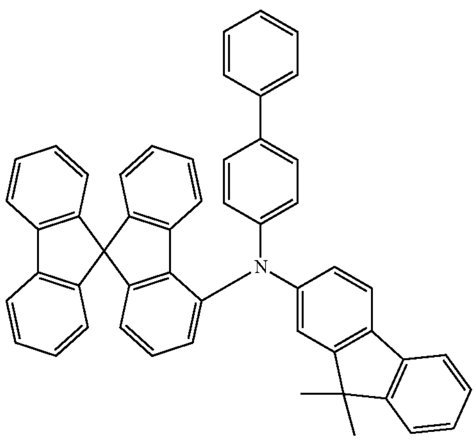
HT-C
[Formula 429]
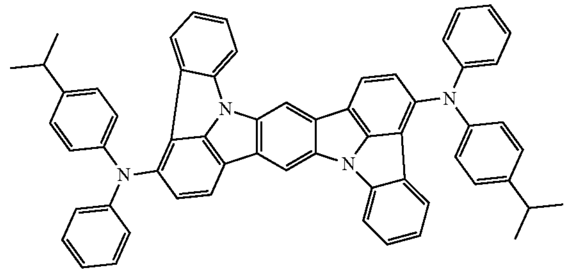
BD1
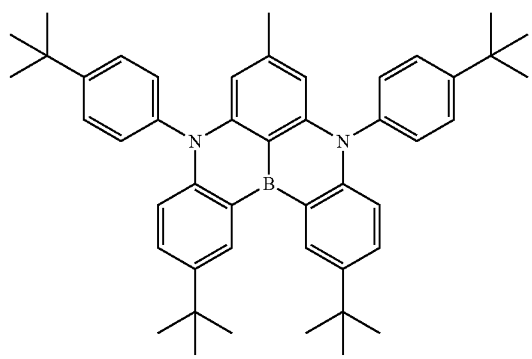
BD2
[Formula 430]
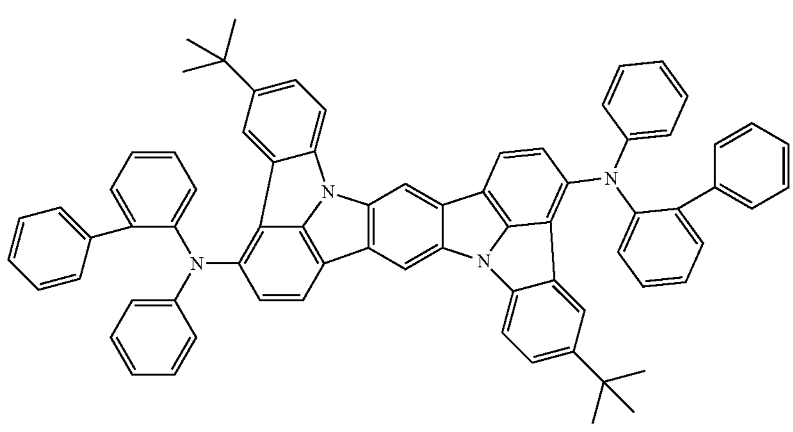
BD3

[Formula 431]
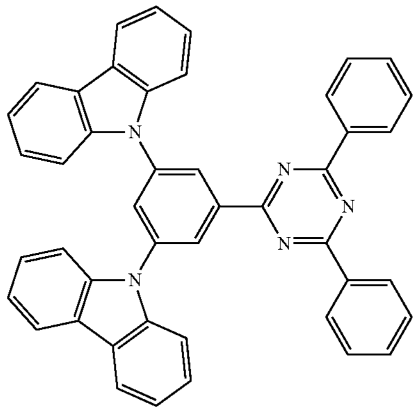
ET1
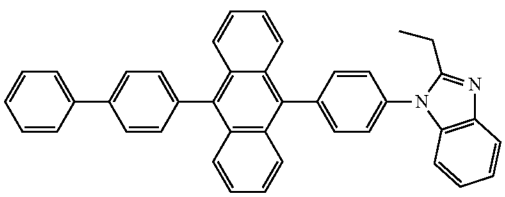
ET2
[Formula 432]
ET3
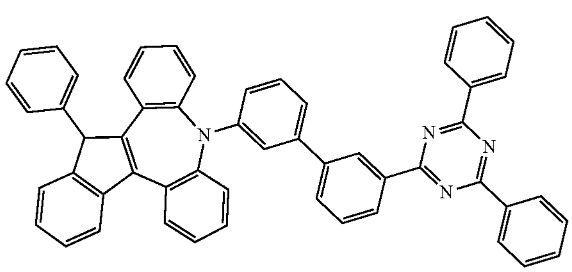
ET4
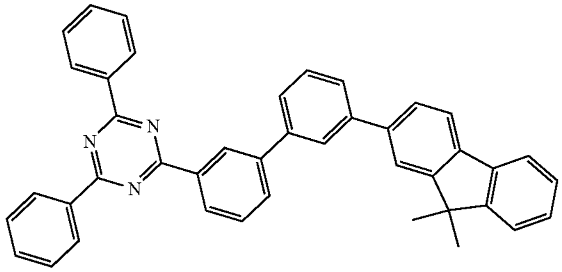
-continued
ET5
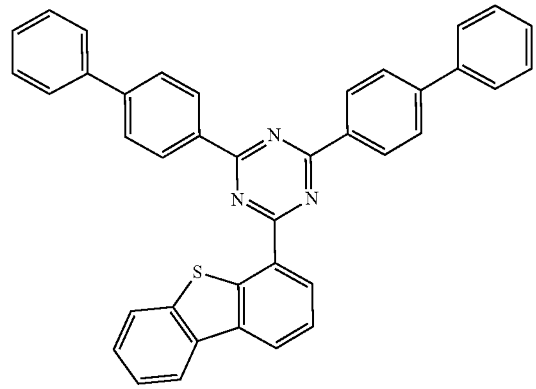
ET6
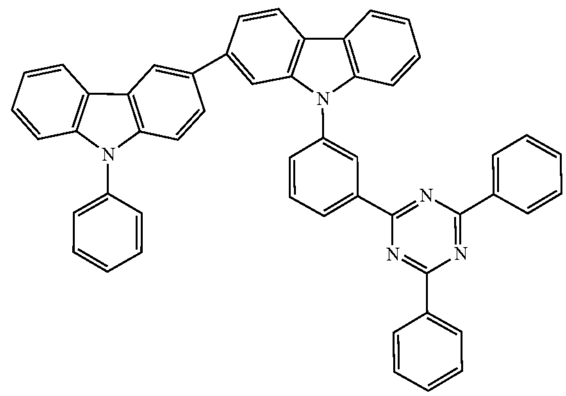
[Formula 433]
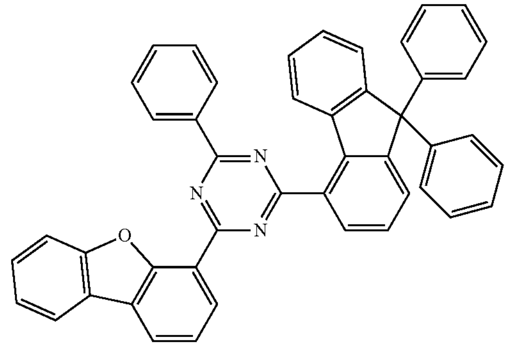
ET7

-continued

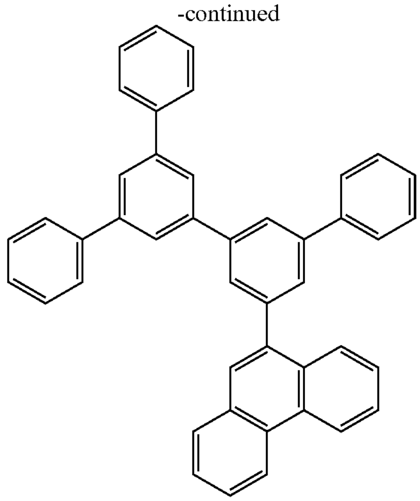

ET8

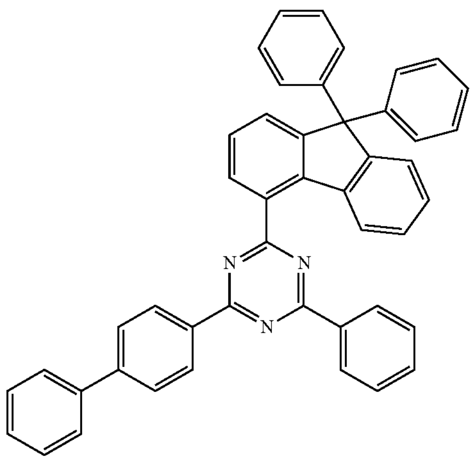

ET9

Preparation of Organic EL Device

The organic EL devices were prepared and evaluated as follows.

Example 1

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

The cleaned glass substrate having the transparent electrode line was attached to a substrate holder of a vacuum deposition apparatus. Initially, a compound HT-B and a compound pdope were co-deposited on a surface provided with the transparent electrode line to cover the transparent electrode, thereby forming a 5-nm-thick hole injecting layer. The ratios of the compound HT-B and the compound pdope in the hole injecting layer were 97 mass % and 3 mass %, respectively.

After the formation of the hole injecting layer, the compound HT-B was vapor-deposited to form an 85-nm-thick hole transporting layer.

After the formation of the hole transporting layer, the compound HT1 was vapor-deposited to form a 5-nm-thick electron blocking layer.

A compound BH1 (host material) and a compound BD1 (dopant material) were co-deposited on the electron blocking layer such that the ratio of the compound BD1 accounted for 2 mass %, thereby forming a 5-nm-thick first emitting layer.

A compound BH2 (host material) and the compound BD1 (dopant material) were co-deposited on the first emitting layer such that the ratio of the compound BD1 accounted for 2 mass %, thereby forming a 20-nm-thick second emitting layer.

A compound ET1 was vapor-deposited on the second emitting layer to form a 5-nm-thick first electron transporting layer (also referred to as a hole blocking layer (HBL)).

A compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal Al was vapor-deposited on the electron injecting layer to form an 80-nm-thick cathode.

The device arrangement of the organic EL device in Example 1 is roughly shown as follows.

*ITO*(130)/*HT-B*:pdope(5.97%:3%)/*HT-B*(85)/*HT*1(5)/*BH*1:*BD*1(5.98%:2%)/*BH*2:*BD*1(20.98%:2%)/*ET*1(5)/*ET*2(20)/LiF(1)/Al(80)

The numerals in parentheses represent film thickness (unit: nm).

The numerals (97%:3%) represented by percentage in the same parentheses indicate a ratio (mass %) between the compound HT-B and the compound pdope in the hole injecting layer, and the numerals (98%:2%) represented by percentage in the same parentheses indicate a ratio (mass %) between the host material (compound BH1 or BH2) and the dopant material (compound BD1) in the first emitting layer or the second emitting layer. Similar notations apply to the description below.

Examples 2 and 3

The organic EL devices in Examples 2 and 3 were manufactured in the same manner as in Example 1 except that the respective electron blocking layers were formed by using compounds shown in Table 1 in place of the compound used for forming the electron blocking layer in Example 1.

Comparative 1

The organic EL device in Comparative 1 was manufactured in the same manner as in Example 1 except that the electron blocking layer was formed by using a compound shown in Table 1 in place of the compound used for forming the electron blocking layer in Example 1.

TABLE 1

| | Electron Blocking Layer | | | Second | |
|---|---|---|---|---|---|
| | Compound | Ip of Compound [eV] | First Emitting Layer Compound | Emitting Layer Compound | EQE [%] |
| Example 1 | HT1 | 5.72 | BH1 and BD1 | BH2 and BD1 | 11.1 |
| Example 2 | H12 | 5.82 | BH1 and BD1 | BH2 and BD1 | 11.7 |
| Example 3 | H13 | 5.79 | BH1 and BD1 | BH2 and BD1 | 11.3 |
| Comparative 1 | Ref-HT-A | 5.66 | BH1 and BD1 | BH2 and BD1 | 10.5 |

Example 4

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

The cleaned glass substrate having the transparent electrode line was attached to a substrate holder of a vacuum deposition apparatus. Initially, the compound HT-B and the compound pdope were co-deposited on a surface provided with the transparent electrode line to cover the transparent electrode, thereby forming a 5-nm-thick hole injecting layer. The ratios of the compound HT-B and the compound pdope in the hole injecting layer were 97 mass % and 3 mass %, respectively.

After the formation of the hole injecting layer, the compound HT-B was vapor-deposited to form an 80-nm-thick hole transporting layer.

After the formation of the hole transporting layer, the compound HT4 was vapor-deposited to form a 10-nm-thick electron blocking layer.

A compound BH3 (host material) and the compound BD1 (dopant material) were co-deposited on the electron blocking layer such that the ratio of the compound BD1 accounted for 2 mass %, thereby forming a 5-nm-thick first emitting layer.

A compound BH4 (host material) and the compound BD1 (dopant material) were co-deposited on the first emitting layer such that the ratio of the compound BD1 accounted for 2 mass %, thereby forming a 20-nm-thick second emitting layer.

The compound ET1 was vapor-deposited on the second emitting layer to form a 5-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal Al was vapor-deposited on the electron injecting layer to form an 80-nm-thick cathode.

The device arrangement of the organic EL device in Example 4 is roughly shown as follows.

*ITO*(130)/*HT-B*:pdope(5,97%:3%)/*HT-B*(80)/*HT*4 (10)/*BH*3: *BD*1(5.98%:2%)/*BH*4:*BD*1(20.98%: 2%)/*ET*1(5)/*ET*2(20)/LiF(1)/Al(80)

The numerals in parentheses represent film thickness (unit: nm).

The numerals (97%:3%) represented by percentage in the same parentheses indicate a ratio (mass %) between the compound HT-B and the compound pdope in the hole injecting layer, and the numerals (98%:2%) represented by percentage in the same parentheses indicate a ratio (mass %) between the host material (compound BH3 or BH4) and the dopant material (compound BD1) in the first emitting layer or the second emitting layer. Similar notations apply to the description below.

Examples 5 to 7

The organic EL devices in Examples 5 to 7 were manufactured in the same manner as in Example 4 except that the respective electron blocking layers were formed by using compounds shown in Table 2 in place of the compound used for forming the electron blocking layer in Example 4.

Comparative 2

The organic EL device in Comparative 2 was manufactured in the same manner as in Example 4 except that the electron blocking layer was formed by using a compound shown in Table 2 in place of the compound used for forming the electron blocking layer in Example 4.

TABLE 2

| | Electron Blocking Layer | | | Second | |
|---|---|---|---|---|---|
| | Compound | Ip of Compound [eV] | First Emitting Layer Compound | Emitting Layer Compound | EQE [%] |
| Example 4 | HT4 | 5.77 | BH3 and BD1 | BH4 and BD1 | 11.5 |
| Example 5 | HTS | 5.77 | BH3 and BD1 | BH4 and BD1 | 11.3 |
| Example 6 | HT6 | 5.74 | BH3 and BD1 | BH4 and BD1 | 11.6 |
| Example 7 | HT7 | 5.72 | BH3 and BD1 | BH4 and BD1 | 11.0 |
| Comparative 2 | Ref-HT-A | 5.66 | BH3 and BD1 | BH4 and BD1 | 10.6 |

Example 8

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

The cleaned glass substrate having the transparent electrode line was attached to a substrate holder of a vacuum deposition apparatus. Initially, the compound HT-B and the compound pdope were co-deposited on a surface provided with the transparent electrode line to cover the transparent electrode, thereby forming a 5-nm-thick hole injecting layer. The ratios of the compound HT-B and the compound pdope in the hole injecting layer were 97 mass % and 3 mass %, respectively.

After the formation of the hole injecting layer, the compound HT-B was vapor-deposited to form an 80-nm-thick hole transporting layer.

After the formation of the hole transporting layer, a compound HT8 was vapor-deposited to form a 10-nm-thick electron blocking layer.

A compound BH5 (host material) and a compound BD2 (dopant material) were co-deposited on the electron blocking layer such that the ratio of the compound BD2 accounted for 2 mass %, thereby forming a 5-nm-thick first emitting layer.

A compound BH6 (host material) and the compound BD2 (dopant material) were co-deposited on the first emitting layer such that the ratio of the compound BD2 accounted for 2 mass %, thereby forming a 20-nm-thick second emitting layer.

The compound ET1 was vapor-deposited on the second emitting layer to form a 5-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal Al was vapor-deposited on the electron injecting layer to form an 80-nm-thick cathode.

The device arrangement of the organic EL device in Example 8 is roughly shown as follows.

*ITO*(130)/*HT-B*:pdope(5,97%:3%)/*HT-B*(80)/*HT*8 (10)/*BH*5:*BD*2(5.98%:2%)/*BH*6: *BD*2(20.98%: 2%)/*ET*1(5)/*ET*2(20)/LiF(1)/Al(80)

The numerals in parentheses represent film thickness (unit: nm).

The numerals (97%:3%) represented by percentage in the same parentheses indicate a ratio (mass %) between the compound HT-B and the compound pdope in the hole injecting layer, and the numerals (98%:2%) represented by percentage in the same parentheses indicate a ratio (mass %) between the host material (compound BH5 or BH6) and the dopant material (compound BD2) in the first emitting layer or the second emitting layer. Similar notations apply to the description below.

Examples 9 to 11

The organic EL devices in Examples 9 to 11 were manufactured in the same manner as in Example 8 except that the respective electron blocking layers were formed by using compounds shown in Table 3 in place of the compound used for forming the electron blocking layer in Example 8.

Comparative 3

The organic EL device in Comparative 3 was manufactured in the same manner as in Example 8 except that the electron blocking layer was formed by using a compound shown in Table 3 in place of the compound used for forming the electorn blocking layer in Example 8.

TABLE 3

| | Electron Blocking Layer | | | Second | |
|---|---|---|---|---|---|
| | Compound | Ip of Compound [eV] | First Emitting Layer Compound | Emitting Layer Compound | EQE [%] |
| Example 8 | HT8 | 5.78 | BH5 and BD2 | BH6 and BD2 | 11.5 |
| Example 9 | HT9 | 5.70 | BH5 and BD2 | BH6 and BD2 | 11.5 |
| Example 10 | HT10 | 5.70 | BH5 and BD2 | BH6 and BD2 | 11.1 |
| Example 11 | HT11 | 5.74 | BH5 and BD2 | BH6 and BD2 | 11.0 |
| Comparative 3 | Ref-HT-A | 5.66 | BH5 and BD2 | BH6 and BD2 | 10.0 |

Example 12

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

The cleaned glass substrate having the transparent electrode line was attached to a substrate holder of a vacuum deposition apparatus. Initially, the compound HT-B and the compound pdope were co-deposited on a surface provided with the transparent electrode line to cover the transparent electrode, thereby forming a 5-nm-thick hole injecting layer. The ratios of the compound HT-B and the compound pdope in the hole injecting layer were 97 mass % and 3 mass %, respectively.

After the formation of the hole injecting layer, the compound HT-B was vapor-deposited to form an 85-nm-thick hole transporting layer.

After the formation of the hole transporting layer, a compound HT12 was vapor-deposited to form a 5-nm-thick electron blocking layer.

A compound BH7 (host material) and the compound BD2 (dopant material) were co-deposited on the electron blocking layer such that the ratio of the compound BD2 accounted for 2 mass %, thereby forming a 5-nm-thick first emitting layer.

A compound BH8 (host material) and the compound BD2 (dopant material) were co-deposited on the first emitting layer such that the ratio of the compound BD2 accounted for 2 mass %, thereby forming a 20-nm-thick second emitting layer.

The compound ET1 was vapor-deposited on the second emitting layer to form a 5-nm-thick first electron transporting layer (also referred to as a hole blocking layer (HBL)).

The compound ET2 was vapor-deposited on the first electron transporting layer to form a 20-nm-thick second electron transporting layer (ET).

LiF was vapor-deposited on the second electron transporting layer to form a 1-nm-thick electron injecting layer.

Metal Al was vapor-deposited on the electron injecting layer to form an 80-nm-thick cathode.

The device arrangement of the organic EL device in Example 12 is roughly shown as follows.

*ITO*(130)/*HT-B*:pdope(5.97%:3%)/*HT-B*(85)/*HT*12 (5)/*BH*7:*BD*2(5.98%:2%)/*BH*8:*BD*2(20.98%: 2%)/*ET*1(5)/*ET*2(20)/LiF(1)/Al(80)

The numerals in parentheses represent film thickness (unit: nm).

The numerals (97%:3%) represented by percentage in the same parentheses indicate a ratio (mass %) between the compound HT-B and the compound pdope in the hole injecting layer, and the numerals (98%:2%) represented by percentage in the same parentheses indicate a ratio (mass %) between the host material (compound BH7 or BH8) and the dopant material (compound BD2) in the first emitting layer or the second emitting layer. Similar notations apply to the description below.

Examples 13 to 14

The organic EL devices in Examples 13 to 14 were manufactured in the same manner as in Example 12 except that the respective electron blocking layers were formed by using compounds shown in Table 4 in place of the compound used for forming the electron blocking layer in Example 12.

Comparative 4

The organic EL device in Comparative 4 was manufactured in the same manner as in Example 12 except that the electron blocking layer was formed by using a compound shown in Table 4 in place of the compound used for forming the electron blocking layer in Example 12.

TABLE 4

| | Electron Blocking Layer | | First | Second | |
|---|---|---|---|---|---|
| | Compound | Ip of Compound [eV] | Emitting Layer Compound | Emitting Layer Compound | EQE [%] |
| Example 12 | HT12 | 5.83 | BH7 and BD2 | BH8 and BD2 | 11.5 |
| Example 13 | HT13 | 5.74 | BH7 and BD2 | BH8 and BD2 | 11.2 |
| Example 14 | HT14 | 5.97 | BH7 and BD2 | BH8 and BD2 | 11.7 |
| Comparative 4 | Ref-HT-A | 5.66 | BH7 and BD2 | BH8 and BD2 | 10.1 |

Example 15

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

The cleaned glass substrate having the transparent electrode line was attached to a substrate holder of a vacuum deposition apparatus. Initially, a compound HT-C and the compound pdope were co-deposited on a surface provided with the transparent electrode line to cover the transparent electrode, thereby forming a 10-nm-thick hole injecting layer. The ratios of the compound HT-C and the compound pdope in the hole injecting layer were 90 mass % and 10 mass %, respectively.

After the formation of the hole injecting layer, the compound HT-C was vapor-deposited to form an 80-nm-thick hole transporting layer.

After the formation of the hole transporting layer, a compound HT2 was vapor-deposited to form a 10-nm-thick electron blocking layer.

A compound BH1-1 (host material) and the compound BD2 (dopant material) were co-deposited on the electron blocking layer such that the ratio of the compound BD2 accounted for 2 mass %, thereby forming a 5-nm-thick first emitting layer.

The compound BH4 (host material) and the compound BD2 (dopant material) were co-deposited on the first emitting layer such that the ratio of the compound BD2 accounted for 2 mass %, thereby forming a 20-nm-thick second emitting layer.

A compound ET3 was vapor-deposited on the second emitting layer to form an 8-nm-thick hole blocking layer (also referred to as a first electron transporting layer (HBL)).

The compound ET2 was vapor-deposited on the first electron transporting layer to form a 22-nm-thick second electron transporting layer (ET).

LiF was vapor-deposited on the second electron transporting layer to form a 1-nm-thick electron injecting layer.

Metal Al was vapor-deposited on the electron injecting layer to form an 80-nm-thick cathode.

The device arrangement of the organic EL device in Example 15 is roughly shown as follows.

*ITO*(130)/*HT-C*:pdope(10.90%: 10%)/*HT-C*(80)/*HT*2(10)/*BH*1-1:*BD*2(5.98%:2%)/*BH*4:*BD*2(20.98%: 2%)/*ET*3(8)/*ET*2(22)/LiF(1)/Al(80)

The numerals in parentheses represent film thickness (unit: nm).

The numerals (90%:10%) represented by percentage in the same parentheses indicate a ratio (mass %) between the compound HT-C and the compound pdope in the hole injecting layer, and the numerals (98%:2%) represented by percentage in the same parentheses indicate a ratio (mass %) between the host material (compound BH1-1 or BH4) and the dopant material (compound BD2) in the first emitting layer or the second emitting layer. Similar notations apply to the description below.

Examples 16 to 20

The organic EL devices in Examples 16 to 20 were manufactured in the same manner as in Example 15 except that the compounds used for forming the electron blocking layer, the first emitting layer, the second emitting layer, and the hole blocking layer were changed to those shown in Table 5.

Comparative 5

The organic EL device in Comparative 5 was manufactured in the same manner as in Example 18 except that the compound used for forming the electron blocking layer was changed to a compound shown in Table 5.

TABLE 5

| | Electron Blocking Layer | | | | | | |
|---|---|---|---|---|---|---|---|
| | Compound | Ip of Compound [eV] | First Emitting Layer Compound | Second Emitting Layer Compound | Hole Blocking Layer Compound | EQE [%] | LT90 [hr] |
| Example 15 | HT2 | 5.82 | BH1-1 and BD2 | BH4 and BD2 | ET3 | 9.8 | 150 |
| Example 16 | HT3 | 5.79 | BH1-2 and BD2 | BH4 and BD2 | ET4 | 9.7 | 180 |
| Example 17 | HT4 | 5.77 | BH1-3 and BD2 | BH4 and BD2 | ET5 | 10.3 | 100 |
| Example 18 | HT1 | 5.72 | BH1-3 and BD2 | BH1-2 and BD2 | ET6 | 9.5 | 220 |
| Example 19 | HT12 | 5.83 | BH1-4 and BD2 | BH4 and BD2 | ET7 | 10.3 | 90 |
| Example 20 | HT9 | 5.70 | BH1-4 and BD2 | BH1-2 and BD2 | ET8 | 10.1 | 95 |
| Comparative 5 | Ref-HT-A | 5.66 | BH1-3 and BD2 | BH1-2 and BD2 | ET6 | 8.8 | 230 |

Example 21

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

The cleaned glass substrate having the transparent electrode line was attached to a substrate holder of a vacuum deposition apparatus. Initially, a compound HT15 and the compound pdope were co-deposited on a surface provided with the transparent electrode line to cover the transparent electrode, thereby forming a 10-nm-thick hole injecting layer. The ratios of the compound HT15 and the compound pdope in the hole injecting layer were 90 mass % and 10 mass %, respectively.

After the formation of the hole injecting layer, the compound HT15 was vapor-deposited to form an 85-nm-thick hole transporting layer.

After the formation of the hole transporting layer, a compound HT9 was vapor-deposited to form a 5-nm-thick electron blocking layer.

A compound BH1-5 (host material) and a compound BD3 (dopant material) were co-deposited on the electron blocking layer such that the ratio of the compound BD3 accounted for 2 mass %, thereby forming a 5-nm-thick first emitting layer.

A compound BH2-1 (host material) and the compound BD3 (dopant material) were co-deposited on the first emitting layer such that the ratio of the compound BD3 accounted for 2 mass %, thereby forming a 15-nm-thick second emitting layer.

A compound ET4 was vapor-deposited on the second emitting layer to form a 5-nm-thick hole blocking layer (also referred to as a first electron transporting layer (HBL)).

A compound ET9 and a compound Liq were co-deposited on the hole blocking layer (HBL) to form a 25-nm-thick second electron transporting layer (ET). The ratios of the compound ET9 and the compound Liq in the second electron transporting layer (ET) were 50 mass % and 50 mass %, respectively.

LiF was vapor-deposited on the second electron transporting layer (ET) to form a 1-nm-thick electron injecting layer.

Metal Al was vapor-deposited on the electron injecting layer to form an 80-nm-thick cathode.

The device arrangement of the organic EL device in Example 21 is roughly shown as follows.

*ITO*(130)/*HT*15:pdope(10.90%:10%)/*HT*15(85)/*HT*9(5)/*BH*1-5:*BD*3(5.98%:2%)/*BH*2-1:*BD*3(15.98%:2%)/*ET*4(5)/*ET*9:*Liq*(25.50%:50%)/LiF(1)/Al(80)

The numerals in parentheses represent film thickness (unit: nm).

The numerals (90%:10%) represented by percentage in the same parentheses indicate a ratio (mass %) between the compound HT15 and the compound pdope in the hole injecting layer, the numerals (98%:2%) represented by percentage in the same parentheses indicate a ratio (mass %) between the host material (compound BH1-5 or BH2-1) and the dopant material (compound BD3) in the first emitting layer or the second emitting layer, and the numerals (50%:50%) represented by percentage in the same parentheses indicate a ratio (mass %) between the compound ET9 and the compound Liq in the electron transporting layer (ET). Similar notations apply to the description below.

TABLE 6

| | Electron Blocking Layer Compound | Electron Blocking Layer Ip of Compound [eV] | First Emitting Layer Compound | Second Emitting Layer Compound | Hole Blocking Layer Compound | EQE [%] | LT90 [hr] |
|---|---|---|---|---|---|---|---|
| Example 21 | HT9 | 5.70 | BH1-5 and BD3 | BH2-1 and BD3 | ET4 | 10.9 | 106 |

Evaluation of Organic EL Devices

The organic EL devices manufactured in Examples 1 to 21 and Comparatives 1 to 5 were evaluated as follows. Evaluation results are shown in Tables 1 to 6.

External Quantum Efficiency EQE

Voltage was applied on the organic EL devices such that a current density was 10 mA/cm$^2$, where spectral radiance spectrum was measured by a spectroradiometer (CS-2000 manufactured by Konica Minolta, Inc.). The external quantum efficiency EQE (unit: %) was calculated based on the obtained spectral-radiance spectra, assuming that the spectra was provided under a Lambertian radiation.

Lifetime LT90

Voltage was applied on the resultant organic EL devices such that a current density was 50 mA/cm$^2$, where a time (LT90 (unit: hr)) elapsed before a luminance intensity was reduced to 90% of the initial luminance intensity was measured.

As shown in Tables 1 to 6, the organic EL devices according to Examples 1 to 21, in which the electron blocking layer containing the third compound was disposed close to the anode with respect to the first emitting layer, emitted light at a high luminous efficiency.

Evaluation of Compounds

Ionization Potential Ip

The ionization potential of the compound was measured under atmosphere using a photoelectron spectroscope ("AC-3" manufactured by RIKEN KEIKI Co., Ltd.). Specifically, the material was irradiated with light and the amount of electrons generated by charge separation was measured to measure the ionization potential of the compound. Measurement results are shown in Tables 1 to 6. Ip in Tables is an abbreviation for the ionization potential. The ionization potential of the compound HT-B was 5.61 eV. The ionization potential of the compound HT-C was 5.69 eV.

Preparation of Toluene Solution

The compound BD1 was dissolved in toluene at a concentration of $4.9\times10^{-6}$ mol/L to prepare a toluene solution of the compound BD1.

A toluene solution of the compound BD2 was prepared in the same manner as the compound BD1.

A toluene solution of the compound BD3 was prepared in the same manner as the compound BD1.

Measurement of Maximum Fluorescence Peak Wavelength (FL-peak)

A maximum fluorescence peak wavelength of the toluene solution of the compound BD1, the toluene solution of the compound BD2, or the toluene solution of the compound BD3 excited at 390 nm was measured using a fluorescence spectrometer (spectrophotofluorometer F-7000 (manufactured by Hitachi High-Tech Science Corporation).

The maximum fluorescence peak wavelength of the compound BD1 was 453 nm.

The maximum fluorescence peak wavelength of the compound BD2 was 455 nm.

The maximum fluorescence peak wavelength of the compound BD3 was 444 nm.

Triplet Energy $T_1$

The measurement target compound was dissolved in EPA (diethylether:isopentane:ethanol=5:5:2 in volume ratio) at a concentration of 10 μmol/L, and the obtained solution was encapsulated in a quartz cell to provide a measurement sample. A phosphorescent spectrum (ordinate axis: phosphorescent luminous intensity, abscissa axis: wavelength) of the sample was measured at a low temperature (77K). A tangent was drawn to the rise of the phosphorescent spectrum close to the short-wavelength region. An energy amount was calculated by a conversion equation (F1) below based on a wavelength value $\lambda_{edge}$ [nm] at an intersection of the tangent and the abscissa axis and was defined as a triplet energy $T_1$.

$$T_1 \text{ [eV]}=1239.85/\lambda_{edge} \qquad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

The local maximum point where a peak intensity is 15% or less of the maximum peak intensity of the spectrum is not counted as the above-mentioned local maximum intensity closest to the short-wavelength region. The tangent drawn at a point that is closest to the local maximum intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) was used.

Singlet Energy $S_1$

A toluene solution in which a measurement target compound was dissolved at a concentration of 10 μmol/L was prepared and was encapsulated in a quartz cell to provide a measurement sample. Absorption spectrum (ordinate axis: absorption intensity, abscissa axis: wavelength) of the sample was measured at the normal temperature (300K). A tangent was drawn to the fall of the absorption spectrum close to the long-wavelength region, and a wavelength value fledge (nm) at an intersection of the tangent and the abscissa axis was assigned to a conversion equation (F2) below to calculate the singlet energy.

$$S_1 \text{ [eV]}=1239.85/\lambda_{edge} \qquad \text{Conversion Equation (F2):}$$

A spectrophotometer (U3310 manufactured by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength resion, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not couted as the above-mentioned local maximum absorbance close to the long-wavelength region.

The singlet Energy Si and the triplet energy $T_1$ of each compound are shown in Table 7.

TABLE 7

| | $S_1$ [eV] | $T_1$ [eV] |
|---|---|---|
| BH1 | 3.12 | 2.10 |
| BH2 | 2.97 | 1.80 |
| BH3 | 3.19 | 2.08 |
| BH4 | 3.01 | 1.87 |
| BH5 | 3.19 | 2.08 |
| BH6 | 3.04 | 1.86 |
| BH7 | 3.11 | 2.09 |
| BH8 | 2.98 | 1.87 |
| BH1-1 | 3.11 | 2.11 |
| BH1-2 | 2.95 | 2.20 |
| BH1-3 | 3.22 | 2.27 |
| BH1-4 | 3.31 | 2.35 |
| BH1-5 | 3.31 | 2.09 |
| BH2-1 | 3.01 | 1.82 |
| BD1 | 2.73 | 2.29 |
| BD2 | 2.71 | 2.60 |
| BD3 | 2.78 | 2.32 |

What is claimed is:

1. An organic electroluminescence device comprising:

an anode;

a cathode;

a first emitting layer and a second emitting layer disposed between the anode and the cathode; and an electron blocking layer disposed between the anode and the first and second emitting layers, wherein the first emitting layer comprises a first host material, the second emitting layer comprises a second host material, the first host material is different from the second host material, the first emitting layer at least comprises a fifth compound that emits light having a maximum peak wavelength of less than 480 nm, the second emitting layer at least comprises a fourth compound that emits light having a maximum peak wavelength of less than 480 nm, the fifth compound and the fourth compound are mutually the same or different, a triplet energy $T_1(H1)$ of the first host material and a triplet energy $T_1(H2)$ of the second host material satisfy a relationship of a numerical formula (Numerical Formula 1A) below, the electron blocking layer comprises a third compound, and an ionization potential Ip(HT) of the third compound satisfies a numerical formula (M1) below, $$T_1(H1)>T_1(H2) \quad \text{(Numerical Formula 1A)}$$

$$Ip(HT)\geq 5.67\ \text{eV} \quad \text{(M1)}.$$

2. The organic electroluminescence device according to claim 1, wherein the first emitting layer and the second emitting layer are in direct contact with each other.

3. The organic electroluminescence device according to claim 1, wherein the second emitting layer is disposed between the first emitting layer and the cathode.

4. The organic electroluminescence device according to claim 1, wherein the first emitting layer or the second emitting layer and the electron blocking layer are in direct contact with each other.

5. The organic electroluminescence device according to claim 1, wherein the first host material comprises, in a molecule, a linking structure comprising a benzene ring and a naphthalene ring linked to each other with a single bond, the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

6. The organic electroluminescence device according to claim 5, wherein the cross-linking comprises a double bond.

7. The organic electroluminescence device according to claim 1, wherein the first host material comprises, in a molecule, a biphenyl structure in which a first benzene ring and a second benzene ring are linked to each other with a single bond, and the first benzene ring and the second benzene ring in the biphenyl structure are further linked to each other by cross-linking at at least one site other than the single bond.

8. The organic electroluminescence device according to claim 7, wherein the first benzene ring and the second benzene ring in the biphenyl structure are further linked to each other by the cross-linking at at least one site other than the single bond.

9. The organic electroluminescence device according to claim 7, wherein the cross-linking comprises a double bond.

10. The organic electroluminescence device according to claim 7, wherein the first benzene ring and the second benzene ring in the biphenyl structure are further linked to each other by the cross-linking at two sites other than the single bond, and the cross-linking comprises no double bond.

11. The organic electroluminescence device according to claim 1, further comprising an electron transporting layer disposed between the cathode and the first and second emitting layers, wherein the electron transporting layer comprises a compound represented by a formula (5A) below,

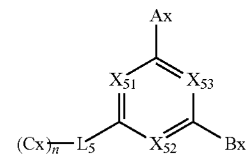

(5A)

where, in the formula (5A):

$X_{51}$, $X_{52}$ and $X_{53}$ are each independently a nitrogen atom or $CR_5$;

at least one of $X_{51}$, $X_{52}$, and $X_{53}$ is a nitrogen atom;

$R_5$ is a hydrogen atom, a cyano group, a substituted or unsubstituted alkyl group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a substituted or unsubstituted aryl group having 6 to 50 ring carbon atoms, or a substituted or unsubstituted heterocyclic group having 5 to 50 ring atoms;

$R_{901}$ to $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different;

Ax is a substituted or unsubstituted aryl group having 6 to 18 ring carbon atoms, or a substituted or unsubstituted heterocyclic group having 5 to 13 ring atoms;

Bx is a substituted or unsubstituted aryl group having 6 to 18 ring carbon atoms, or a substituted or unsubstituted heterocyclic group having 5 to 13 ring atoms;

$L_5$ is a single bond, a substituted or unsubstituted (n+1)-valent aromatic hydrocarbon ring group having 6 to 18 ring carbon atoms; or a substituted or unsubstituted (n+1)-valent heterocyclic group having 5 to 13 ring atoms;

n is 1, 2, or 3, when n is 2 or 3, $L_5$ is not a single bond;

Cx is each independently a substituted or unsubstituted aryl group having 6 to 30 ring carbon atoms, or a substituted or unsubstituted heterocyclic group having 5 to 60 ring atoms; and when a plurality of Cx are present, the plurality of Cx are mutually the same or different.

12. The organic electroluminescence device according to claim 11, wherein the compound represented by the formula (5A) is a compound represented by a formula (50A) below, (50A)

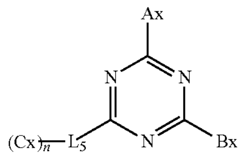

where, in the formula (50A), Ax, Bx, Cx, $L_5$ and n represent the same as Ax, Bx, Cx, $L_5$ and n defined in the formula (5A).

13. An electronic device comprising the organic electroluminescence device according to claim 1.

14. The organic electroluminescence device according to claim 1, wherein neither the first emitting layer, nor the second emitting layer contains a phosphorescent material as a dopant material.

15. The organic electroluminescence device according to claim 1, wherein the fourth compound is identical to the fifth compound.

16. An organic electroluminescence device comprising:

an anode;

a cathode;

a first emitting layer and a second emitting layer disposed between the anode and the cathode; and an electron blocking layer disposed between the anode and the first and second emitting layers, wherein the first emitting layer comprises a first host material, the second emitting layer comprises a second host material, the first host material is different from the second host material, the first emitting layer at least comprises a compound that emits light having a maximum peak wavelength of 500 nm or less, the second emitting layer at least comprises a compound that emits light having a maximum peak wavelength of 500 nm or less, the compound that emits light having the maximum peak wavelength of 500 nm or less and is contained in the first emitting layer and the compound that emits light having the maximum peak wavelength of 500 nm or less and is contained in the second emitting layer are mutually the same or different, a triplet energy $T_1(H1)$ of the first host material and a triplet energy $T_1(H2)$ of the second host material satisfy a relationship of a numerical formula (Numerical Formula 1A) below, the electron blocking layer comprises a third compound, the third compound is at least one compound selected from the group consisting of a compound represented by a formula (31) below and a compound represented by a formula (32) below, when the third compound is represented by the formula (31) and comprises two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms, and when the compound represented by the formula (31) comprises a 4-dibenzofuran structure in a molecule, the 4-dibenzofuran structure is one in number, an ionization potential Ip(HT) of the third compound satisfies a numerical formula (M1) below, $$T_1(H1)>T_1(H2) \quad \text{(Numerical Formula 1A)}$$

$$Ip(HT)\geq 5.67\text{ eV} \quad \text{(M1)}$$

(31)

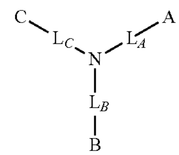

where, in the formula (31):

$L_A$, $L_B$, and $L_C$ are each independently a single bond, or a substituted or unsubstituted arylene group having 6 to 18 ring carbon atoms;

A, B, and C are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)($R'_{903}$);

$R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different; and a substituted or unsubstituted heterocyclic group having 5 to 30 ring atoms as A, B and C is each independently at least one group selected from the group consisting of groups represented by the formula (31A), (31B), (31C), (31D), (31E) and (31F);

(31A)

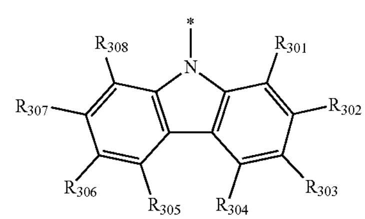

(31B)

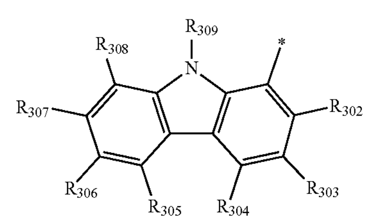

(31C)

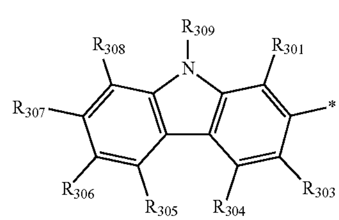

-continued (31D)

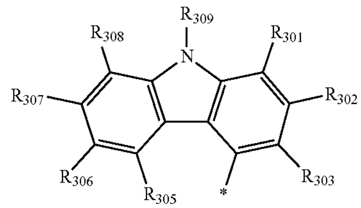

(31E)

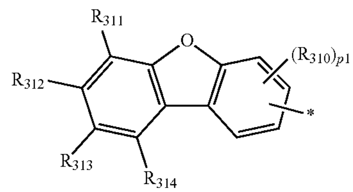

(31F)

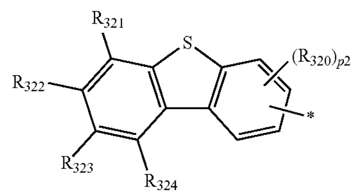

where, in the formula (31A), (31B), (31C), (31D), (31E) and (31F):

at least one combination of adjacent two or more of $R_{301}$ to $R_{309}$ are mutually bonded to form a substituted or unsubstituted monocyclic ring, mutually bonded to form a substituted or unsubstituted fused ring, or not mutually bonded;

at least one combination of adjacent two or more of $R_{310}$ to $R_{314}$ are mutually bonded to form a substituted or unsubstituted monocyclic ring, mutually bonded to form a substituted or unsubstituted fused ring, or not mutually bonded;

at least one combination of adjacent two or more of $R_{320}$ to $R_{324}$ are mutually bonded to form a substituted or unsubstituted monocyclic ring, mutually bonded to form a substituted or unsubstituted fused ring, or not mutually bonded;

$R_{301}$ to $R_{309}$, $R_{310}$, $R_{311}$ to $R_{314}$, $R_{320}$ and $R_{321}$ to $R_{324}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a halogen atom, a nitro group, a substituted or unsubstituted aryl group having 6 to 50 ring carbon atoms, or a substituted or unsubstituted heterocyclic group having 5 to 50 ring atoms;

p1 is 3, and a plurality of $R_{310}$ are mutually the same or different;

p2 is 3; and a plurality of $R_{320}$ are mutually the same or different; and

* in the formula (31A), (31B), (31C), (31D), (31E) and (31F) is each independently bonded to any of $L_A$, $L_B$, and $L_C$;

(32)

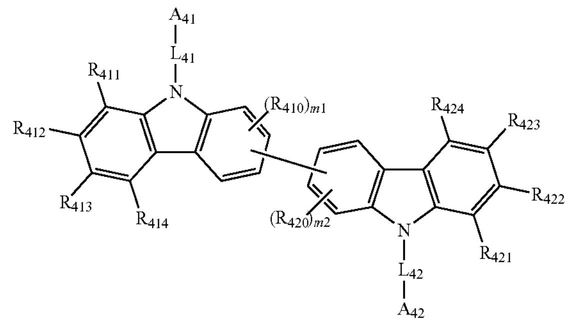

where, in the formula (32):

$A_{41}$ and $A_{42}$ are each independently a substituted or unsubstituted aryl group having 6 to 30 ring carbon atoms, or a substituted or unsubstituted heterocyclic group having 5 to 30 ring atoms;

at least one combination of adjacent two or more of $R_{410}$ to $R_{414}$ are mutually bonded to form a substituted or unsubstituted monocyclic ring, mutually bonded to form a substituted or unsubstituted fused ring, or not mutually bonded;

at least one combination of adjacent two or more of $R_{420}$ to $R_{424}$ are mutually bonded to form a substituted or unsubstituted monocyclic ring, mutually bonded to form a substituted or unsubstituted fused ring, or not mutually bonded;

$R_{410}$ to $R_{414}$ and $R_{420}$ to $R_{424}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a halogen atom, a nitro group, a substituted or unsubstituted aryl group having 6 to 50 ring carbon atoms, or a substituted or unsubstituted heterocyclic group having 5 to 50 ring atoms;

m1 is 3, and three $R_{410}$ are mutually the same or different;

m2 is 3, and three $R_{420}$ are mutually the same or different;

$L_{41}$ and $L_{42}$ are each independently a single bond, a substituted or unsubstituted arylene group having 6 to 30 ring carbon atoms, or a substituted or unsubstituted divalent heterocyclic group having 5 to 30 ring atoms;

in the third compound represented by the formula (31) or (32), $R_{901}$, $R_{902}$, $R_{903}$, and $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

17. The organic electroluminescence device according to claim 16, wherein the first emitting layer and the second emitting layer are in direct contact with each other.

18. The organic electroluminescence device according to claim 16, wherein the second emitting layer is disposed between the first emitting layer and the cathode.

19. The organic electroluminescence device according to claim 16, wherein the first emitting layer or the second emitting layer and the electron blocking layer are in direct contact with each other.

20. The organic electroluminescence device according to claim 16, wherein a substituent for a substituted or unsubstituted group is at least one group selected from the group consisting of an alkyl group having 1 to 18 carbon atoms, an aryl group having 6 to 18 ring carbon atoms, and a heterocyclic group having 5 to 18 ring atoms.

21. The organic electroluminescence device according to claim 16, wherein a substituent for a substituted or unsubstituted group is an alkyl group having 1 to 5 carbon atoms.

22. An organic electroluminescence device comprising:

an anode;

a cathode;

a first emitting layer and a second emitting layer disposed between the anode and the cathode; and an electron blocking layer disposed between the anode and the first and second emitting layers, wherein the first emitting layer comprises a first host material in a form of a first compound represented by a formula (1) below, the first compound comprises at least one group represented by a formula (11) below, the second emitting layer comprises a second host material in a form of a second compound represented by a formula (2) below, the electron blocking layer comprises a third compound, and an ionization potential Ip(HT) of the third compound satisfies a numerical formula (M1) below, $$Ip(HT) \geq 5.67\ \text{eV} \quad (M1)$$

(1)

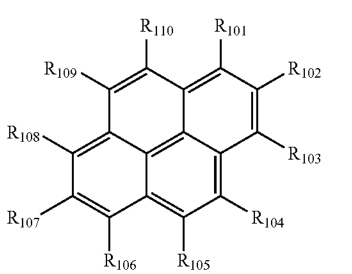

(11)

$$*\!-\!(L_{101})_{mx}\!-\!Ar_{101}$$

where, in the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by the formula (11);

at least one of $R_{101}$ to $R_{110}$ is the group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring represented by the formula (1);

(2)

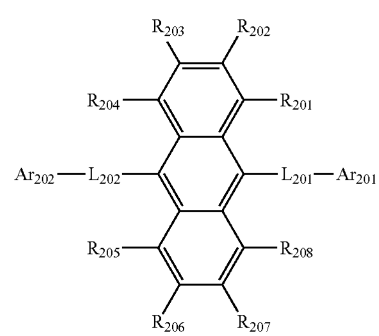

where, in the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ to $L_{202}$ are each independently a single bond, a substituted or unsubstituted arylene group having 6 to 50 ring carbon atoms, or a substituted or unsubstituted divalent heterocyclic group having 5 to 50 ring atoms;

$Ar_{201}$ and $Ar_{202}$ are each independently a substituted or unsubstituted aryl group having 6 to 50 ring carbon atoms, or a substituted or unsubstituted heterocyclic group having 5 to 50 ring atoms;

in the first compound represented by the formula (1) and the second compound represented by the formula (2), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

23. The organic electroluminescence device according to claim 22, wherein the third compound is at least one compound selected from the group consisting of a compound represented by a formula (31X) below and a compound represented by a formula (32) below,

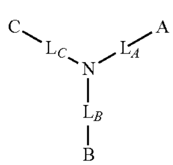

(31X)

where, in the formula (31X):

$L_A$, $L_B$, and $L_C$ are each independently a single bond, a substituted or unsubstituted arylene group having 6 to 18 ring carbon atoms, or a substituted or unsubstituted divalent heterocyclic group having 5 to 13 ring atoms;

A, B, and C are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)(R'903);

$R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different; and when a plurality of $R'_{903}$ are present, the plurality of $R'_{903}$ are mutually the same or different;

(32)

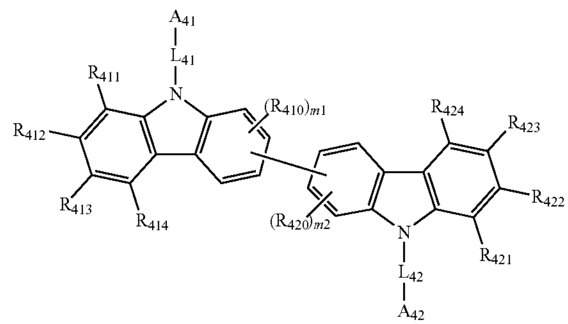

where, in the formula (32):

$A_{41}$ and $A_{42}$ are each independently a substituted or unsubstituted aryl group having 6 to 30 ring carbon atoms, or a substituted or unsubstituted heterocyclic group having 5 to 30 ring atoms;

at least one combination of adjacent two or more of $R_{410}$ to $R_{414}$ are mutually bonded to form a substituted or unsubstituted monocyclic ring, mutually bonded to form a substituted or unsubstituted fused ring, or not mutually bonded;

at least one combination of adjacent two or more of $R_{420}$ to $R_{424}$ are mutually bonded to form a substituted or unsubstituted monocyclic ring, mutually bonded to form a substituted or unsubstituted fused ring, or not mutually bonded;

$R_{410}$ to $R_{414}$ and $R_{420}$ to $R_{424}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

m1 is 3; and three $R_{410}$ are mutually the same or different;

m2 is 3; and three $R_{420}$ are mutually the same or different;

$L_{41}$ and $L_{42}$ are each independently a single bond, a substituted or unsubstituted arylene group having 6 to 30 ring carbon atoms, or a substituted or unsubstituted divalent heterocyclic group having 5 to 30 ring atoms;

in the first compound represented by the formula (1), the second compound represented by the formula (2), and the third compound represented by the formula (31X) or (32), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

24. The organic electroluminescence device according to claim 23, wherein the third compound is a compound represented by a formula (310) below, (310)

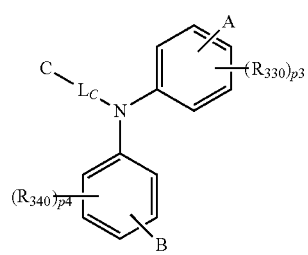

where, in the formula (310):

$L_C$, A, B and C represent the same as $L_C$, A, B and C defined in the formula (31X);

p3 is 4, and four $R_{330}$ are mutually the same or different;

at least one combination of adjacent two or more of four $R_{330}$ are mutually bonded to form a substituted or unsubstituted monocyclic ring, mutually bonded to form a substituted or unsubstituted fused ring, or not mutually bonded;

p4 is 4, and four $R_{340}$ are mutually the same or different;

at least one combination of adjacent two or more of four $R_{340}$ are mutually bonded to form a substituted or unsubstituted monocyclic ring, mutually bonded to form a substituted or unsubstituted fused ring, or not mutually bonded;

$R_{330}$ and $R_{340}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (31X) or (32).

25. The organic electroluminescence device according to claim 23, wherein two of A, B, and C in the formula (31X) are groups each represented by a formula (31G) below, and the two groups each represented by the formula (31G) are mutually the same or different;

(31G)

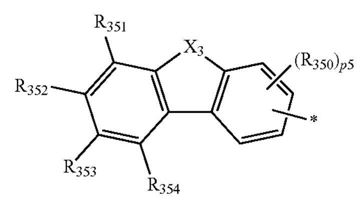

where, in the formula (31G):

$X_3$ is $CR_{31}R_{32}$, $NR_{33}$, an oxygen atom, or a sulfur atom;

when $X_3$ is $CR_{31}R_{32}$, a combination of $R_{31}$ and $R_{32}$ are mutually bonded to form a substituted or unsubstituted monocyclic ring, mutually bonded to form a substituted or unsubstituted fused ring, or not mutually bonded;

at least one combination of adjacent two or more of $R_{350}$ to $R_{354}$ are mutually bonded to form a substituted or unsubstituted monocyclic ring, mutually bonded to form a substituted or unsubstituted fused ring, or not mutually bonded;

$R_{33}$, and $R_{350}$ to $R_{354}$, $R_{31}$ and $R_{32}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

p5 is 3, and three $R_{350}$ are mutually the same or different;

$R_{901}$ to $R_{904}$ represent the same as $R_{901}$ to $R_{904}$ defined in the formula (31X) or (32); and

* in the formula (31G) is bonded to $L_A$, $L_B$ or $L_C$.

26. The organic electroluminescence device according to claim 23, wherein the third compound is a compound represented by a formula (311) or a formula (312);

(311)

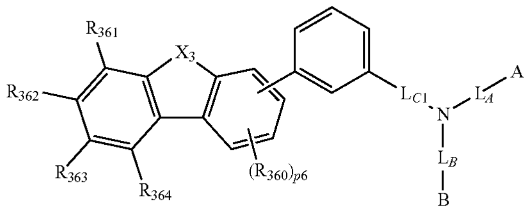

(312)

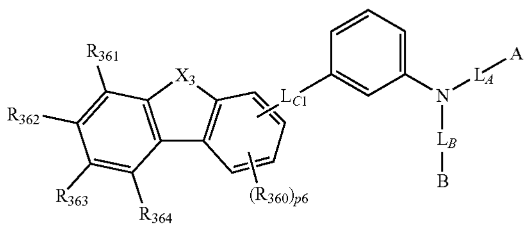

where, in the formula (311) and (312):

$L_A$, $L_B$, A, and B represent the same as $L_A$, $L_B$, A and B defined in the formula (31X);

$L_{C1}$ is a substituted or unsubstituted arylene group having 6 to 12 ring carbon atoms;

$X_3$ is $CR_{31}R_{32}$, $NR_{33}$, an oxygen atom, or a sulfur atom;

when $X_3$ is $CR_{31}R_{32}$, a combination of $R_{31}$ and $R_{32}$ are mutually bonded to form a substituted or unsubstituted monocyclic ring, mutually bonded to form a substituted or unsubstituted fused ring, or not mutually bonded;

at least one combination of adjacent two or more of $R_{360}$ to $R_{364}$ are mutually bonded to form a substituted or unsubstituted monocyclic ring, mutually bonded to form a substituted or unsubstituted fused ring, or not mutually bonded;

$R_{33}$, and $R_{360}$ to $R_{364}$, $R_{31}$ and $R_{32}$ neither forming the substituted or unsubstituted monocyclic ring nor forming the substituted or unsubstituted fused ring each independently represent a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

p6 is 3, and three $R_{360}$ are mutually the same or different; and $R_{901}$ to $R_{904}$ represent the same as $R_{901}$ to $R_{904}$ defined in the formula (31X) or (32).

27. The organic electroluminescence device according to claim 23, wherein the third compound is a compound represented by a formula (313) or a formula (314), (313)

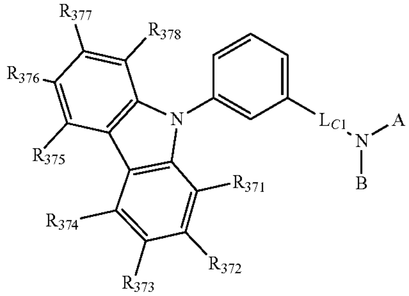

-continued (314)

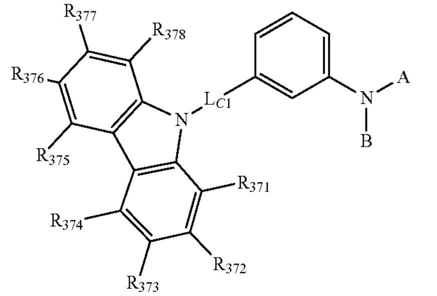

where, in the formula (313) or (314):

A and B are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)($R'_{903}$);

$R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different;

Lc1 is a substituted or unsubstituted arylene group having 6 to 12 ring carbon atoms;

at least one combination of adjacent two or more of $R_{371}$ to $R_{378}$ are mutually bonded to form a substituted or unsubstituted monocyclic ring, mutually bonded to form a substituted or unsubstituted fused ring, or not mutually bonded;

$R_{371}$ to $R_{378}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (31X) or (32).

28. The organic electroluminescence device according to claim 23, wherein the third compound is a compound represented by a formula (315) or a formula (316) below, (315)

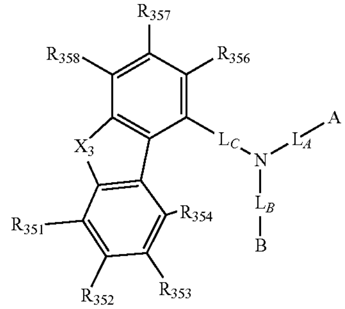

-continued (316)

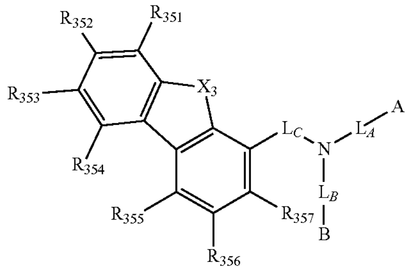

where, in the formula (315) or (316):

$L_A$, $L_B$, $L_C$, A and B represent the same as $L_A$, $L_B$, $L_C$, A and B defined in the formula (31X);

$X_3$ is $CR_{31}R_{32}$, $NR_{33}$, an oxygen atom, or a sulfur atom;

when $X_3$ is $CR_{31}R_{32}$, a combination of $R_{31}$ and $R_{32}$ are mutually bonded to form a substituted or unsubstituted monocyclic ring, mutually bonded to form a substituted or unsubstituted fused ring, or not mutually bonded;

at least one combination of adjacent two or more of $R_{351}$ to $R_{358}$ are mutually bonded to form a substituted or unsubstituted monocyclic ring, mutually bonded to form a substituted or unsubstituted fused ring, or not mutually bonded;

$R_{33}$, and $R_{351}$ to $R_{358}$, $R_{31}$ and $R_{32}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and $R_{901}$ to $R_{904}$ represent the same as $R_{901}$ to $R_{904}$ defined in the formula (31X).

29. The organic electroluminescence device according to claim 26, wherein $L_{C1}$ is a single bond.

30. The organic electroluminescence device according to claim 22, wherein in the first compound and the second compound, the groups specified to be "substituted or unsubstituted" are each an "unsubstituted" group.

31. An organic electroluminescence device comprising:

an anode;

a cathode;

a first emitting layer and a second emitting layer disposed between the anode and the cathode; and an electron blocking layer disposed between the anode and the first and second emitting layers, wherein the first emitting layer comprises a first host material in a form of a first compound represented by a formula (1), the first compound comprises at least one group represented by a formula (11), the second emitting layer comprises a second host material in a form of a second compound represented by a formula (2) below, the electron blocking layer comprises a third compound, the third compound is at least one compound selected from the group consisting of a compound represented by a formula (31) below and a compound represented by a formula (32) below, when the third compound is represented by the formula (31) and comprises two substituted or unsubstituted amino groups, nitrogen atoms of the two substituted or unsubstituted amino groups are linked to each other by a substituted or unsubstituted arylene group having 13 to 50 ring carbon atoms or a substituted or unsubstituted divalent heterocyclic group having 13 to 50 ring atoms, and when the compound represented by the formula (31) comprises a 4-dibenzofuran structure in a molecule, the 4-dibenzofuran structure is one in number, and an ionization potential Ip(HT) of the third compound satisfies a numerical formula (M1) below, $$Ip(HT) \geq 5.67\ \text{eV} \qquad (M1)$$

(1)

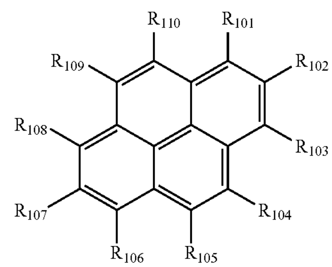

(11)

$$*\!-\!(L_{101})_{mx}\!-\!Ar_{101}$$

where, in the formula (1):

$R_{101}$ to Rim are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or the group represented by the formula (11);

at least one of $R_{101}$ to $R_{110}$ is the group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring represented by the formula (1);

(2)

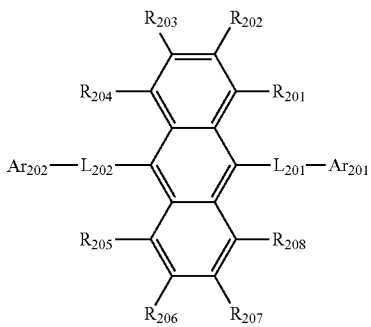

where, in the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ to $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms;

(31)

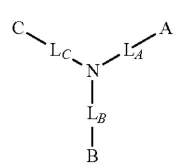

where, in the formula (31):

$L_A$, $L_B$, and $L_C$ are each independently a single bond, or a substituted or unsubstituted arylene group having 6 to 18 ring carbon atoms;

A, B, and C are each independently a substituted or unsubstituted aryl group having 6 to 30 ring carbon atoms, a substituted or unsubstituted heterocyclic group having 5 to 30 ring atoms, or a group represented by —Si($R'_{901}$)($R'_{902}$)($R'_{903}$);

$R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different;

when a plurality of $R'_{903}$ are present, the plurality of $R'_{903}$ are mutually the same or different; and a substituted or unsubstituted heterocyclic group having 5 to 30 ring atoms as A, B and C is each independently at least one group selected from the group consisting of groups represented by the formula (31A), (31B), (31C), (31D), (31E) and (31F);

(31A)

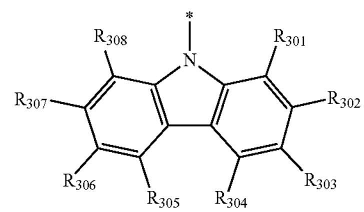

(31B)

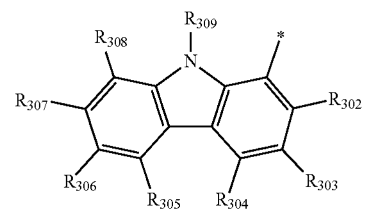

(31C)

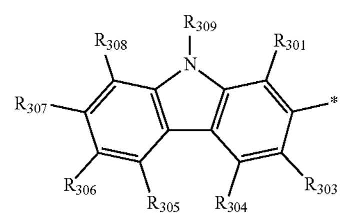

(31D)

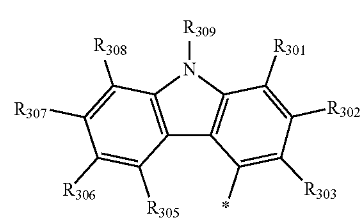

(31E)

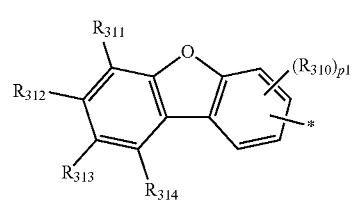

-continued (31F)

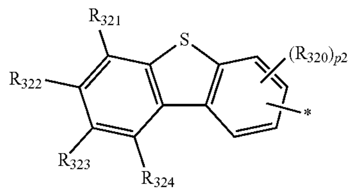

where, in the formula (31A), (31B), (31C), (31D), (31E) and (31F):

at least one combination of adjacent two or more of $R_{301}$ to $R_{309}$ are mutually bonded to form a substituted or unsubstituted monocyclic ring, mutually bonded to form a substituted or unsubstituted fused ring, or not mutually bonded;

at least one combination of adjacent two or more of $R_{310}$ to $R_{314}$ are mutually bonded to form a substituted or unsubstituted monocyclic ring, mutually bonded to form a substituted or unsubstituted fused ring, or not mutually bonded;

at least one combination of adjacent two or more of $R_{320}$ to $R_{324}$ are mutually bonded to form a substituted or unsubstituted monocyclic ring, mutually bonded to form a substituted or unsubstituted fused ring, or not mutually bonded;

$R_{301}$ to $R_{309}$, $R_{310}$, $R_{311}$ to $R_{314}$, $R_{320}$ and $R_{321}$ to $R_{324}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

p1 is 3, and a plurality of $R_{310}$ are mutually the same or different;

p2 is 3, and a plurality of $R_{320}$ are mutually the same or different; and

* in the formulae formula (31A), (31B), (31C), (31D), (31E) and (31F) is each independently bonded to any of $L_A$, $L_B$, and $L_C$;

(32)

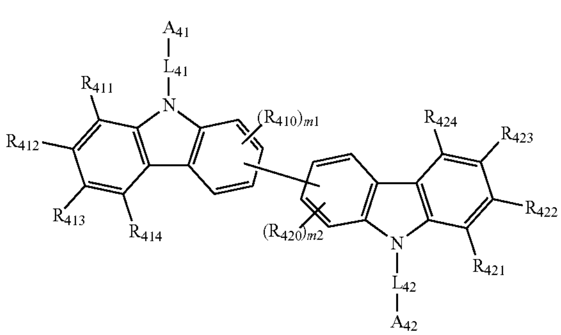

where, in the formula (32):

$A_{41}$ and $A_{42}$ are each independently a substituted or unsubstituted aryl group having 6 to 30 ring carbon atoms, or a substituted or unsubstituted heterocyclic group having 5 to 30 ring atoms;

at least one combination of adjacent two or more of $R_{410}$ to $R_{414}$ are mutually bonded to form a substituted or unsubstituted monocyclic ring, mutually bonded to form a substituted or unsubstituted fused ring, or not mutually bonded;

at least one combination of adjacent two or more of $R_{420}$ to $R_{424}$ are mutually bonded to form a substituted or unsubstituted monocyclic ring, mutually bonded to form a substituted or unsubstituted fused ring, or not mutually bonded;

$R_{410}$ to $R_{414}$ and $R_{420}$ to $R_{424}$ neither forming the substituted or unsubstituted monocyclic ring nor forming the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

m1 is 3, and three $R_{410}$ are mutually the same or different;

m2 is 3, and three $R_{420}$ are mutually the same or different;

$L_{41}$ and $L_{42}$ are each independently a single bond, a substituted or unsubstituted arylene group having 6 to 30 ring carbon atoms, or a substituted or unsubstituted divalent heterocyclic group having 5 to 30 ring atoms;

in the first compound represented by the formula (1), the second compound represented by the formula (2), and the third compound represented by the formula (31) or (32), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

32. The organic electroluminescence device according to claim 31, wherein the third compound is a compound having only one amino group.

* * * * *

UNITED STATES PATENT AND TRADEMARK OFFICE

CERTIFICATE OF CORRECTION

PATENT NO. : 11,489,128 B1
APPLICATION NO. : 17/461842
DATED : November 1, 2022
INVENTOR(S) : Satomi Tasaki et al.

It is certified that error appears in the above-identified patent and that said Letters Patent is hereby corrected as shown below:

In the Claims

Claim 23, Column 1040, Lines 4-5:
Please delete:
"group having 5 to 30 ring atoms, or a group represented by —Si($R'_{901}$)($R'_{902}$)(R'903);"

Please replace with:
group having 5 to 30 ring atoms, or a group represented by -Si($R'_{901}$)($R'_{902}$)($R'_{903}$);

Claim 31, Column 1046, Line 34:
Please delete:
"$R_{101}$ to Rim are each independently a hydrogen atom,"

Please replace with:
$R_{101}$ to $R_{110}$ are each independently a hydrogen atom, Claim 31, Column 1049, Line 46:
Please delete:
"* in the formulae formula (31A), (31B), (31C), (31D),"

Please replace with:
* in the formula (31A), (31B), (31C), (31D),

Signed and Sealed this
Fourth Day of April, 2023

Katherine Kelly Vidal
*Director of the United States Patent and Trademark Office*